US012102003B2

(12) United States Patent
Ma et al.

(10) Patent No.: US 12,102,003 B2
(45) Date of Patent: Sep. 24, 2024

(54) ORGANIC ELECTROLUMINESCENT DEVICES AND ELECTRONIC APPARATUS

(71) Applicant: Shaanxi Lighte Optoelectronics Material Co., Ltd., Xi'an (CN)

(72) Inventors: Tiantian Ma, Xi'an (CN); Kongyan Zhang, Xi'an (CN); Heming Zhang, Xi'an (CN)

(73) Assignee: Shaanxi Lighte Optoelectronics Material Co., Ltd., Xi'an (CN)

( * ) Notice: Subject to any disclaimer, the term of this patent is extended or adjusted under 35 U.S.C. 154(b) by 0 days.

(21) Appl. No.: 18/039,931

(22) PCT Filed: Feb. 14, 2022

(86) PCT No.: PCT/CN2022/076245
§ 371 (c)(1),
(2) Date: Jun. 1, 2023

(87) PCT Pub. No.: WO2023/087557
PCT Pub. Date: May 25, 2023

(65) Prior Publication Data

US 2023/0397493 A1 Dec. 7, 2023

(30) Foreign Application Priority Data

Nov. 18, 2021 (CN) ......................... 202111367390.2
Dec. 7, 2021 (CN) ......................... 202111486171.6

(51) Int. Cl.
*H10K 85/60* (2023.01)
*H10K 50/11* (2023.01)

(52) U.S. Cl.
CPC ......... *H10K 85/6572* (2023.02); *H10K 50/11* (2023.02); *H10K 85/615* (2023.02);
(Continued)

(58) Field of Classification Search
CPC ........... H10K 85/6572; H10K 85/6574; H10K 85/6576; H10K 50/11
See application file for complete search history.

(56) References Cited

U.S. PATENT DOCUMENTS

2021/0047306 A1 2/2021 Jung

FOREIGN PATENT DOCUMENTS

| | | | |
|---|---|---|---|
| CN | 103502243 A | | 1/2014 |
| CN | 110088926 A | | 8/2019 |
| CN | 110294703 A | | 10/2019 |
| CN | 112802969 A | | 5/2021 |
| CN | 113501823 A | | 10/2021 |
| KR | 102193015 B1 | | 12/2020 |
| WO | 2018061446 A1 | | 4/2018 |
| WO | 2018198844 A1 | | 11/2018 |
| WO | 2021101117 A1 | | 5/2021 |
| WO | WO-2022211594 A1 | * | 10/2022 |
| WO | WO-2023282603 A1 | * | 1/2023 |
| WO | WO-2023282617 A2 | * | 1/2023 |

* cited by examiner

*Primary Examiner* — Vu A Nguyen
(74) *Attorney, Agent, or Firm* — TUCKER ELLIS LLP

(57) ABSTRACT

The present disclosure provides an organic electroluminescent device and an electronic apparatus. The organic electroluminescent device includes a cathode, an anode, and an organic layer. The organic layer includes an organic luminescent layer including a first compound and a second compound; the first compound is selected from compounds represented by a formula 1; and the second compound is selected from compounds represented by a formula 2.

Formula 1

(Continued)

-continued
Formula 2
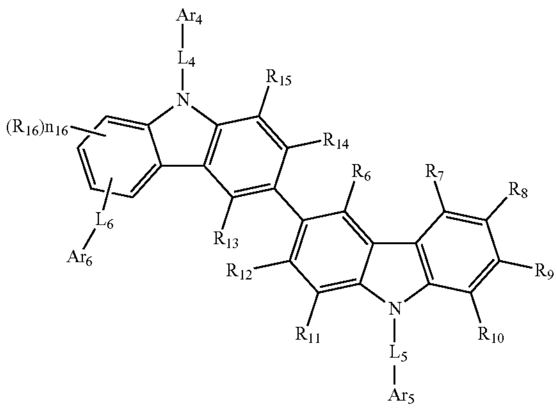
7 Claims, 1 Drawing Sheet
(52) U.S. Cl.
CPC ....... *H10K 85/654* (2023.02); *H10K 85/6574* (2023.02); *H10K 85/6576* (2023.02)

ORGANIC ELECTROLUMINESCENT DEVICES AND ELECTRONIC APPARATUS

CROSS REFERENCE TO RELATED APPLICATIONS

This disclosure claims the priority of Chinese patent application No. CN202111367390.2, filed on Nov. 18, 2021, and Chinese patent application No. CN202111486171.6, filed on Dec. 7, 2021, the contents of which are incorporated herein by reference in their entirety as part of the disclosure.

FIELD

The present disclosure belongs to the field of organic electroluminescence, and in particular provides an organic electroluminescent devices and an electronic apparatus.

BACKGROUND

In recent years, an organic electroluminescent device (OLED) has become a very popular emerging flat panel display product at home and abroad because OLED displays have the characteristics of self-luminescence, wide viewing angle, short response time, high efficiency, wide color gamut, and the like.

The organic electroluminescent device (OLED) typically includes an anode, a cathode and an organic layer disposed between the anode and the cathode. The organic layer may include a hole injection layer, a hole transport layer, a hole auxiliary layer, an electron blocking layer, a luminescent layer (containing a host material and a dopant material), a hole blocking layer, an electron transport layer, an electron injection layer, and the like. When a voltage is applied to the organic electroluminescent device, holes and electrons are injected into the luminescent layer from the anode and the cathode, respectively, and the injected holes and electrons combine in the luminescent layer to form excitons in an excited state, and the excitons release energy outwards, causing the luminescent layer to emit light outwards.

Currently, there is still a problem of poor performance during use of the organic electroluminescent device, there are, for example, problems such as too high driving voltage, too low luminous efficiency, or shorter service life, which affect the field of use of the organic electroluminescent device, and thus, it is still necessary to carry out further research in this field to improve the performance of the organic electroluminescent device.

SUMMARY

The present disclosure provides an organic electroluminescent device and an electronic apparatus to solve the problems of lower luminous efficiency and shorter service life of the organic electroluminescent device in the prior art.

In order to realize the above inventive purpose, the present disclosure adopts the following technical solution:

According to a first aspect of the present disclosure, the present disclosure provides an organic electroluminescent device, including a cathode, an anode and an organic layer;

wherein, the cathode and the anode are oppositely disposed;

the organic layer is disposed between the cathode and the anode;

the organic layer includes an organic luminescent layer;

the organic luminescent layer includes a first compound and a second compound;

the first compound is selected from compounds represented by a formula 1:

Formula 1

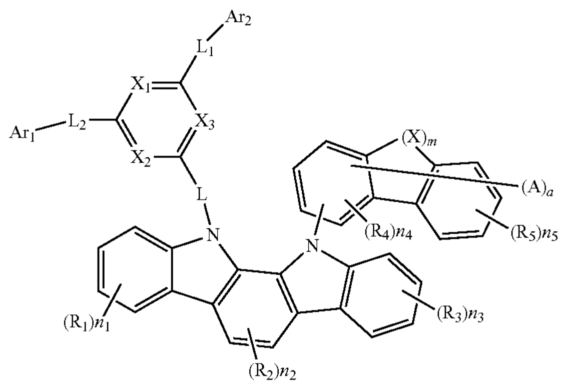

Formula 1-A

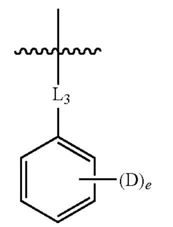

$X_1$, $X_2$ and $X_3$ are each independently selected from C(H) or N, and at least one is selected from N;

each group A is independently selected from hydrogen or a formula 1-A, e is the number of D, and is selected from 0, 1, 2, 3, 4 or 5; and at least one group A is selected from the formula 1-A;

a is the number of the group A, and is selected from 1, 2, 3, 4, 5, 6 or 7;

each $R_1$, each $R_2$, each $R_3$, each $R_4$, and each $R_5$ are each independently selected from deuterium, a halogen group, cyano, and alkyl with 1 to 10 carbon atoms;

$n_1$ represents the number of $R_1$, and is selected from 0, 1, 2, 3 or 4, and when $n_1$ is greater than 1, any two $R_1$ are the same or different;

$n_2$ represents the number of $R_2$, and is selected from 0, 1 or 2, and when $n_2$ is greater than 1, any two $R_2$ are the same or different;

$n_3$ represents the number of $R_3$, and is selected from 0, 1, 2, 3 or 4, and when $n_3$ is greater than 1, any two $R_3$ are the same or different;

$n_4$ represents the number of $R_4$, and is selected from 0, 1, 2, 3 or 4, and when $n_4$ is greater than 1, any two $R_4$ are the same or different;

$n_5$ represents the number of $R_5$, and is selected from 0, 1, 2, 3 or 4, and when $n_5$ is greater than 1, any two $R_5$ are the same or different;

each $L_3$, L, $L_1$, and $L_2$ are each independently selected from a single bond, substituted or unsubstituted arylene with 6 to 30 carbon atoms, and substituted or unsubstituted heteroarylene with 3 to 30 carbon atoms;

$Ar_1$ and $Ar_2$ are each independently selected from substituted or unsubstituted aryl with 6 to 30 carbon atoms, and substituted or unsubstituted heteroaryl with 3 to 30 carbon atoms;

X is selected from 0 or S;

m is selected from 0 or 1;

the second compound is selected from compounds represented by a formula 2:

Formula 2

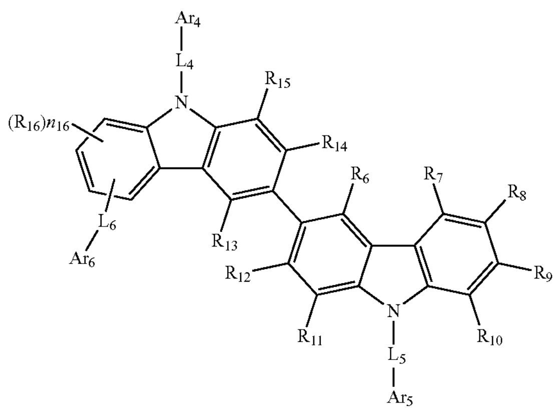

wherein, $L_4$ and $L_5$ are each independently selected from a single bond, substituted or unsubstituted arylene with 6 to 30 carbon atoms, and substituted or unsubstituted heteroarylene with 3 to 30 carbon atoms;

$L_6$ is selected from a single bond, and substituted or unsubstituted arylene with 6 to 30 carbon atoms;

$Ar_4$ and $Ar_5$ are each independently selected from substituted or unsubstituted aryl with 6 to 30 carbon atoms, and substituted or unsubstituted heteroaryl with 3 to 30 carbon atoms;

$Ar_6$ is substituted or unsubstituted aryl with 6 to 30 carbon atoms;

$R_6$, $R_7$, $R_5$, $R_9$, $R_{10}$, $R_{11}$, $R_{12}$, $R_{13}$, $R_{14}$, and $R_{15}$ are each independently selected from hydrogen or deuterium, and at least two of $R_6$, $R_{12}$, $R_{13}$, and $R_{14}$ are deuterium;

each $R_{16}$ is independently selected from hydrogen or deuterium;

$n_{16}$ is the number of $R_{16}$, and is selected from 1, 2 or 3, and when $n_{16}$ is greater than 1, any two $R_{16}$ are the same or different;

substituents in the L, the $L_1$, the $L_2$, each $L_3$, the $L_4$, the $L_5$, the $L_6$, the $Ar_1$, the $Ar_2$, the $Ar_4$, the $Ar_5$ and the $Ar_6$ are each independently selected from deuterium, a halogen group, cyano, heteroaryl with 3 to 12 carbon atoms, aryl with 6 to 12 carbon atoms, trialkylsilyl with 3 to 12 carbon atoms, triarylsilyl with 18 to 24 carbon atoms, alkyl with 1 to 10 carbon atoms, haloalkyl with 1 to 10 carbon atoms, cycloalkyl with 3 to 10 carbon atoms, heterocycloalkyl with 2 to 10 carbon atoms, or alkoxy with 1 to 10 carbon atoms; and optionally, in $Ar_4$, $Ar_5$, and $Ar_6$, any two adjacent substituents form a ring.

The present disclosure aims to provide an organic electroluminescent device comprising a specific luminescent layer host material, and the luminescent layer host material comprises the first compound having strong electron properties and the second compound having relatively strong hole properties to adjust charge balance so that the organic electroluminescent device has excellent properties.

BRIEF DESCRIPTION OF THE DRAWINGS

The drawings herein are incorporated into and constitute part of the description, illustrating the embodiments conforming to the present disclosure, and are used together with the description to interpret the principles of the present disclosure.

DESCRIPTION OF REFERENCE SIGNS

Figure 1:
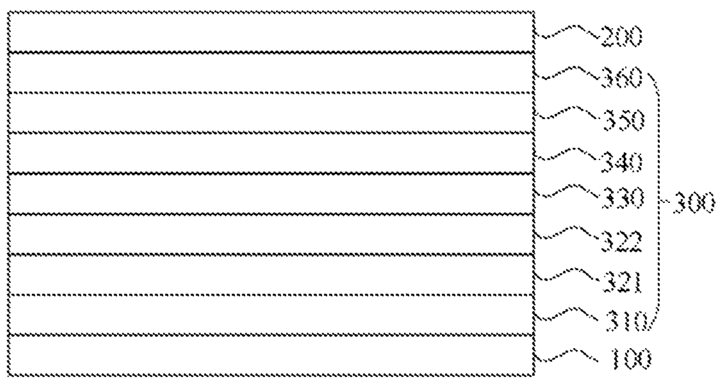
FIG. 1 is a structural schematic diagram of an organic electroluminescent device according to one embodiment of the present disclosure.

100, anode; 200, cathode; 300, organic layer; 310, hole injection layer; 321, hole transport layer; 322, hole auxiliary layer; 330, organic luminescent layer; 340, hole blocking layer; 350, electron transport layer; 360, electron injection layer; and 400, electronic apparatus.

By the above drawings, specific examples of the present disclosure have been shown and will hereinafter be described in more detail. These drawings and written descriptions are not intended to limit the scope of the concept of the present disclosure in any way, but rather to illustrate the concept of the present disclosure by reference to specific embodiments for those skilled in the art.

DETAILED DESCRIPTION

Embodiments will now be described more comprehensively with reference to the drawings. However, the embodiments can be implemented in various forms, and should not be understood as limited to the instances set forth herein; and on the contrary, these embodiments are provided such that the present disclosure will be more comprehensive and complete, and the concepts of the embodiments are comprehensively conveyed to those skilled in the art. The described features, structures, or characteristics may be incorporated in one or more embodiments in any suitable manner. In the following description, many specific details are provided to give a sufficient understanding of the embodiments of the present disclosure.

In the drawings, for clearness, the thickness of regions and layers may be exaggerated. The same reference signs in the drawings represent the same or similar structure, so that detailed description thereof will be omitted.

The described features, structures, or characteristics may be incorporated in one or more embodiments in any suitable manner. In the following description, many specific details are provided to give a sufficient understanding of the embodiments of the present disclosure. However, those skilled in the art will realize that the technical solution of the present disclosure may be practiced without one or more of the specific details, or other methods, components, materials, etc. may be employed. In other cases, well-known structures, materials, or operations are not shown or described in detail to avoid obscuring the primary technical ideas of the present disclosure.

The present disclosure provides an organic electroluminescent device, including a cathode, an anode and an organic layer;

wherein, the cathode and the anode are oppositely disposed;

the organic layer is located between the cathode and the anode;

the organic layer includes an organic luminescent layer;

the organic luminescent layer includes a first compound and a second compound;

the first compound is selected from compounds represented by a formula 1:

Formula 1

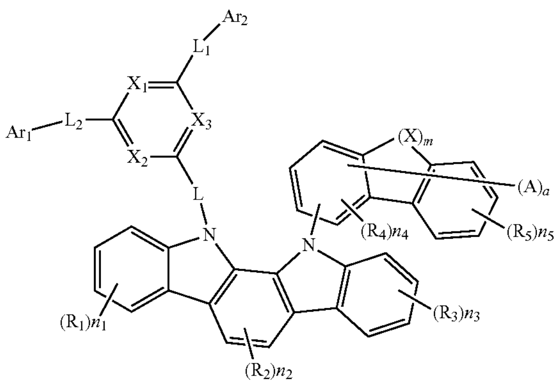

Formula 1-A

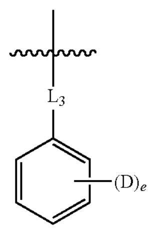

$X_1$, $X_2$ and $X_3$ are each independently selected from C(H) or N, and at least one is selected from N;

each group A is independently selected from hydrogen or a formula 1-A, e is the number of D, and is selected from 0, 1, 2, 3, 4 or 5; and at least one group A is selected from the formula 1-A;

a is the number of the group A, and is selected from 1, 2, 3, 4, 5, 6 or 7;

each $R_1$, each $R_2$, each $R_3$, each $R_4$, and each $R_5$ are each independently selected from deuterium, a halogen group, cyano, and alkyl with 1 to 10 carbon atoms;

$n_1$ represents the number of $R_1$, and is selected from 0, 1, 2, 3 or 4, and when $n_1$ is greater than 1, any two $R_1$ are the same or different;

$n_2$ represents the number of $R_2$, and is selected from 0, 1 or 2, and when $n_2$ is greater than 1, any two $R_2$ are the same or different;

$n_3$ represents the number of $R_3$, and is selected from 0, 1, 2, 3 or 4, and when $n_3$ is greater than 1, any two $R_3$ are the same or different;

$n_4$ represents the number of $R_4$, and is selected from 0, 1, 2, 3 or 4, and when $n_4$ is greater than 1, any two $R_4$ are the same or different;

$n_5$ represents the number of $R_5$, and is selected from 0, 1, 2, 3 or 4, and when $n_5$ is greater than 1, any two $R_5$ are the same or different;

each $L_3$, L, $L_1$, and $L_2$ are each independently selected from a single bond, substituted or unsubstituted arylene with 6 to 30 carbon atoms, and substituted or unsubstituted heteroarylene with 3 to 30 carbon atoms;

$Ar_1$ and $Ar_2$ are each independently selected from substituted or unsubstituted aryl with 6 to 30 carbon atoms, and substituted or unsubstituted heteroaryl with 3 to 30 carbon atoms;

X is selected from O or S;

m is selected from 0 or 1;

the second compound is selected from compounds represented by a formula 2:

Formula 2

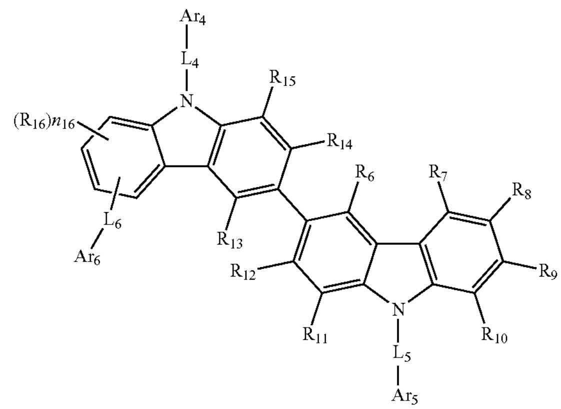

wherein, $L_4$ and $L_5$ are each independently selected from a single bond, substituted or unsubstituted arylene with 6 to 30 carbon atoms, and substituted or unsubstituted heteroarylene with 3 to 30 carbon atoms;

$L_6$ is selected from a single bond, and substituted or unsubstituted arylene with 6 to 30 carbon atoms;

$Ar_4$ and $Ar_5$ are each independently selected from substituted or unsubstituted aryl with 6 to 30 carbon atoms, and substituted or unsubstituted heteroaryl with 3 to 30 carbon atoms;

$Ar_6$ is substituted or unsubstituted aryl with 6 to 30 carbon atoms;

$R_6$, $R_7$, $R_5$, $R_9$, $R_{10}$, $R_{11}$, $R_{12}$, $R_{13}$, $R_{14}$, and $R_{15}$ are each independently selected from hydrogen or deuterium, and at least two of $R_6$, $R_{12}$, $R_{13}$, and $R_{14}$ are deuterium;

each $R_{16}$ is independently selected from hydrogen or deuterium;

$n_{16}$ is the number of $R_{16}$, and is selected from 1, 2 or 3, and when $n_{16}$ is greater than 1, any two $R_{16}$ are the same or different;

substituents in the L, the $L_1$, the $L_2$, each $L_3$, the $L_4$, the $L_5$, the $L_6$, the $Ar_1$, the $Ar_2$, the $Ar_4$, the $Ar_5$ and the $Ar_6$ are each independently selected from deuterium, a halogen group, cyano, heteroaryl with 3 to 12 carbon atoms, aryl with 6 to 12 carbon atoms, trialkylsilyl with 3 to 12 carbon atoms, triarylsilyl with 18 to 24 carbon atoms, alkyl with 1 to 10 carbon atoms, haloalkyl with 1 to 10 carbon atoms, cycloalkyl with 3 to 10 carbon atoms, heterocycloalkyl with 2 to 10 carbon atoms, or alkoxy with 1 to 10 carbon atoms; and optionally, in $Ar_4$, $Ar_5$, and $Ar_6$, any two adjacent substituents form a ring.

In the present disclosure, at least one group A of the all group A is selected from the formula 1-A, for example, among the group A, one group A is of the formula 1-A, or two group A are selected from the formula 1-A; or three group A are selected from the formula 1-A. In the group A, when two or more group A are of the formula 1-A, each formula 1-A may be the same or different.

In the present disclosure, for

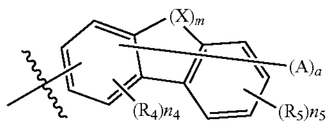

in the formula 1 ("a structure 1-B" for short), m is equal to 0, indicating that X is absent, i.e. the structure 1-B is

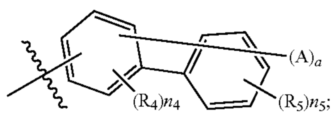

and when m is equal to 1, the structure 1-B is

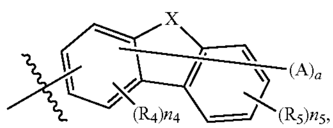

and X is O or S.

In the present disclosure, the structure 1-B is selected from the group consisting of:

1-B-1

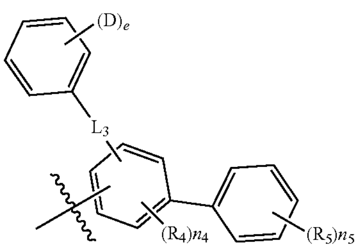

1-B-2

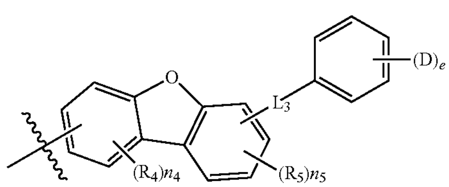

1-B-3

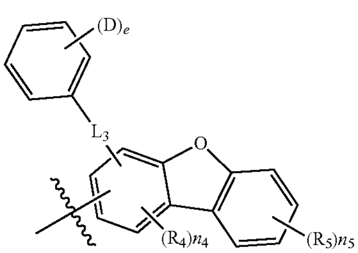

1-B-4

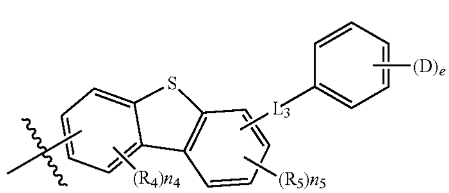

-continued

1-B-5

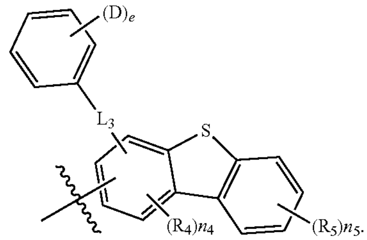

In the present disclosure, the adopted description modes " . . . are each independently selected from", and " . . . are respectively and independently selected from" can be interchanged, and should be understood in a broad sense, which means that in different groups, specific options expressed between the same symbols do not influence each other, or in a same group, specific options expressed between the same symbols do not influence each other. For example, the meaning of

Q-1

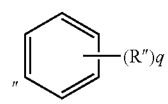

Q-2

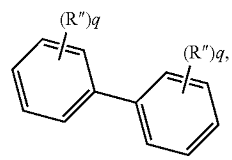

where each q is independently 0, 1, 2 or 3, and each R" is independently selected from hydrogen, deuterium, fluorine and chlorine" is as follows: a formula Q-1 represents that q substituents R" exist on a benzene ring, each R" can be the same or different, and options of each R" do not influence each other; and a formula Q-2 represents that each benzene ring of biphenyl has q substituents R", the number q of the substituents R" on the two benzene rings can be the same or different, each R" can be the same or different, and options of each R" do not influence each other.

In the present disclosure, the term such as "substituted or unsubstituted" means that a functional group described behind the term may have or may not have a substituent (hereinafter, the substituent is collectively referred to as Rc in order to facilitate description). For example, the "substituted or unsubstituted aryl" refers to aryl having the substituent Rc or unsubstituted aryl. The above substituent, i.e. Rc, may be, for example, deuterium, a halogen group, cyano, heteroaryl with 3 to 12 carbon atoms, aryl with 6 to 12 carbon atoms, trialkylsilyl with 3 to 12 carbon atoms, triarylsilyl with 18 to 24 carbon atoms, alkyl with 1 to 10 carbon atoms, haloalkyl with 1 to 10 carbon atoms, cycloalkyl with 3 to 10 carbon atoms, heterocycloalkyl with 2 to 10 carbon atoms, or alkoxy with 1 to 10 carbon atoms.

In the present disclosure, a "substituted" functional group can be substituted by one or two or more substituents in the Rc; when two substituents Rc are connected to a same atom, the two substituents Rc may independently exist or may be connected to each other to form a spirocyclic ring with the atom which they are connected with jointly; and when one substituent Rc is present on each of two adjacent carbon atoms in the functional group, two adjacent substituents Rc may independently exist or may be fused with the functional group to which they are connected to form a ring.

In the present disclosure, D in the compound is deuterium.

In the present disclosure, the terms "optional" and "optionally" mean that the subsequently described event may but don't have to occur, and that the description includes instances where the event occurs or does not occur. For example, "optionally, two adjacent substituents xx form a ring", which means that the two substituents can, but don't have to, form a ring, including scenarios in which two adjacent substituents form a ring and scenarios in which two adjacent substituents do not form a ring.

In the present disclosure, in the condition that "any two adjacent substituents form a ring", "any two adjacent" can include the condition that a same atom has two substituents, and can also include the condition that two adjacent atoms each have one substituent; when the same atom has two substituents, the two substituents may form a saturated or unsaturated ring with the atom to which they are connected; and when two adjacent atoms each have one substituent, the two substituents may be fused to form a ring.

In the present disclosure, "optionally, in $Ar_4$, $Ar_5$, and $Ar_6$, any two adjacent substituents form a ring", which means that in $Ar_4$, $Ar_5$ or $Ar_6$, any two adjacent substituents may or may not form a ring. For example, when two adjacent substituents in $Ar_4$ form a ring, the number of carbon atoms of the ring may be 5 to 13, and the ring may be saturated or unsaturated; and the ring is, for example, cyclohexane, cyclopentane, adamantane, benzene ring, naphthalene ring, fluorene ring and the like, but is not limited thereto.

In the present disclosure, the number of carbon atoms in the substituted or unsubstituted functional group refers to the number of all carbon atoms. For example, if L is selected from substituted arylene with 12 carbon atoms, the number of all carbon atoms of the arylene and substituents on the arylene is 12. For example: if $Ar_1$ is

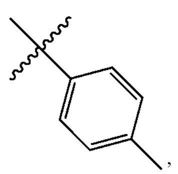 [SMILES: *c1ccc(C)cc1]

then the number of carbon atoms is 7; and if L is

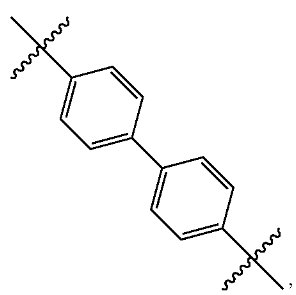 [SMILES: *c1ccc(-c2ccc(*)cc2)cc1]

the number of carbon atoms is 12.

In the present disclosure, the "alkyl" may include linear alkyl or branched alkyl. The alkyl may have 1 to 10 carbon atoms, and in the present disclosure, the range of values such as "1 to 10" refers to each integer in a given range; for example, "alkyl with 1 to 10 carbon atoms" refers to alkyl that may include 1, 2, 3, 4, 5, 6, 7, 8, 9 or 10 carbon atoms. In addition, the alkyl may be substituted or unsubstituted.

Optionally, the alkyl is selected from alkyl with 1 to 5 carbon atoms, and specific examples include, but are not limited to, methyl, ethyl, propyl, isopropyl, n-butyl, isobutyl, sec-butyl, tert-butyl, and pentyl.

In the present disclosure, cycloalkyl refers to saturated hydrocarbon containing an alicyclic structure, including monocyclic structure and fused structure. The cycloalkyl can have 3 to 10 carbon atoms, and the range of values such as "3 to 10" refers to each integer in a given range; for example, "cycloalkyl with 3 to 10 carbon atoms" refers to cycloalkyl that may include 3, 4, 5, 6, 7, 8, 9, or 10 carbon atoms. The cycloalkyl may be substituted or unsubstituted. Examples of the cycloalkyl include, for example, cyclopentyl, cyclohexyl, and adamantyl.

In the present disclosure, aryl refers to an optional functional group or substituent derived from an aromatic carbocyclic ring. The aryl may be monocyclic aryl (e.g., phenyl) or polycyclic aryl, in other words, the aryl can be monocyclic aryl, fused aryl, two or more monocyclic aryl conjugatedly connected through carbon-carbon bonds, monocyclic aryl and fused aryl which are conjugatedly connected through a carbon-carbon bond, or two or more fused aryl conjugatedly connected through carbon-carbon bonds. That is, unless otherwise noted, two or more aromatic groups conjugatedly connected through carbon-carbon bonds can also be regarded as the aryl of the present disclosure. The fused aryl may include, for example, bicyclic fused aryl (e.g., naphthyl), tricyclic fused aryl (e.g., phenanthryl, fluorenyl, and anthryl), and the like. The aryl does not contain heteroatoms such as B, N, O, S, P, Se, Si and the like. Examples of the aryl include, but are not limited to, phenyl, naphthyl, fluorenyl, anthryl, phenanthryl, biphenyl, terphenyl, quaterphenyl, triphenylene, pyrenyl, benzofluoranthenyl, chrysenyl, and the like.

In the present disclosure, "substituted or unsubstituted aryl" can contain 6 to 30 carbon atoms, in some embodiments, the number of carbon atoms in the substituted or unsubstituted aryl may be 6 to 25; in some embodiments, the number of carbon atoms in the substituted or unsubstituted aryl is 6 to 20; in other embodiments, the number of carbon atoms in the substituted or unsubstituted aryl is 6 to 18; and in other embodiments, the number of carbon atoms in the substituted or unsubstituted aryl is 6 to 12. For example, in the present disclosure, the number of carbon atoms in the substituted or unsubstituted aryl may be 6, 12, 13, 14, 15, 18, 20, 24, 25, 28, 29 or 30. Of course, the number of carbon atoms can also be other numbers, which will not be listed here. In the present disclosure, biphenyl can be understood as phenyl-substituted aryl or as unsubstituted aryl.

In the present disclosure, the arylene involved refers to a divalent group formed by further loss of one hydrogen atom from aryl.

In the present disclosure, the substituted aryl can be that one or two or more hydrogen atoms in the aryl are substituted by groups such as a deuterium atom, a halogen group, cyano, aryl, heteroaryl, trialkylsilyl, triarylsilyl, alkyl, haloalkyl, cycloalkyl, heterocycloalkyl, alkoxy, and the like. It should be understood that the number of carbon atoms in the substituted aryl refers to the total number of carbon atoms of the aryl and substituents on the aryl, for example, substituted aryl with 18 carbon atoms means that the total number of carbon atoms of the aryl and its substituents is 18.

In the present disclosure, specific examples of aryl as a substituent in L, $L_1$, $L_2$, each of $L_3$, $L_4$, $L_5$, $L_6$, $Ar_1$, $Ar_2$, $Ar_4$, $Ar_5$, and $Ar_6$ include, but are not limited to, phenyl, naphthyl, anthryl, phenanthryl, dimethylfluorenyl, biphenyl, and the like.

In the present disclosure, heteroaryl refers to a monovalent aromatic ring including 1, 2, 3, 4, 5, or 6 heteroatoms in the ring or a derivative thereof, and the heteroatom may be at least one of B, O, N, P, Si, Se, and S. The heteroaryl may be monocyclic heteroaryl or polycyclic heteroaryl, in other words, the heteroaryl may be a single aromatic ring system or a plurality of aromatic ring systems conjugatedly connected through carbon-carbon bonds, and any one aromatic ring system is one aromatic monocyclic ring or one aromatic fused ring. For example, the heteroaryl may include thienyl, furyl, pyrrolyl, imidazolyl, thiazolyl, oxazolyl, oxadiazolyl, triazolyl, pyridyl, bipyridyl, pyrimidinyl, triazinyl, acridinyl, pyridazinyl, pyrazinyl, quinolyl, quinazolinyl, quinoxalinyl, phenoxazinyl, phthalazinyl, pyridinopyrimidyl, pyridinopyrazinyl, pyrazinopyrazinyl, isoquinolyl, indolyl, carbazolyl, benzoxazolyl, benzimidazolyl, benzothiazolyl, benzocarbazolyl, benzothienyl, dibenzothienyl, thienothienyl, benzofuryl, phenanthrolinyl, isoxazolyl, thiadiazolyl, benzothiazolyl, phenothiazinyl, silafluorenyl, dibenzofuryl and N-arylcarbazolyl (e.g., N-phenylcarbazolyl), N-heteroarylcarbazolyl (e.g., N-pyridylcarbazolyl), N-alkylcarbazolyl (e.g., N-methylcarbazolyl), and the like, but is not limited thereto. The thienyl, furyl, phenanthrolinyl and the like are heteroaryl of the single aromatic ring system, and N-phenylcarbazolyl and N-pyridylcarbazolyl are heteroaryl of the plurality of aromatic ring systems conjugatedly connected through carbon-carbon bonds. For example, in the present disclosure, the number of carbon atoms in the substituted or unsubstituted heteroaryl can be 3, 4, 5, 6, 10, 12, 18, 20, 24, 25, 28, 29 or 30, and of course, the number of carbon atoms can also be other numbers, which will not be listed here.

In the present disclosure, the heteroarylene involved refers to a divalent group formed by further loss of one hydrogen atom from heteroaryl.

In the present disclosure, substituted heteroaryl may be that one or two or more hydrogen atoms in the heteroaryl are substituted by groups such as a deuterium atom, a halogen group, cyano, aryl, heteroaryl, trialkylsilyl, triarylsilyl, alkyl, haloalkyl, cycloalkyl, heterocycloalkyl, alkoxy, and the like. It should be understood that the number of carbon atoms of the substituted heteroaryl refers to the total number of carbon atoms of heteroaryl and substituents on the heteroaryl.

In the present disclosure, specific examples of heteroaryl as a substituent in each of L, $L_1$, $L_2$, $L_3$, $L_4$, $L_5$, $L_6$, $Ar_1$, $Ar_2$, $Ar_4$, $Ar_5$ and $Ar_6$ include, but are not limited to, pyridyl, carbazolyl, dibenzofuranyl, and dibenzothienyl.

In the present disclosure, the halogen group may include fluorine, iodine, bromine, chlorine, and the like.

In the present disclosure, specific examples of the trialkylsilyl with 3 to 12 carbon atoms include, but are not limited to, trimethylsilyl, triethylsilyl, and the like.

In the present disclosure, specific examples of the triarylsilyl with 18 to 24 carbon atoms include, but are not limited to, triphenylsilyl.

In the present disclosure, specific examples of the haloalkyl with 1 to 10 carbon atoms include, but are not limited to, trifluoromethyl.

In the present disclosure, an unpositioned connecting bond is a single bond “ ” extending from a ring system, which means that one end of the connecting bond can be connected with any position in the ring system through which the bond penetrates, and the other end of the connecting bond is connected with the remaining part of a compound molecule.

For example, as shown in the following formula (f), naphthyl represented by the formula (f) is connected to other positions of a molecule through two unpositioned connecting bonds penetrating a dicyclic ring, and its meaning includes any one possible connecting mode represented by formulae (f-1) to (f-10):

(f)

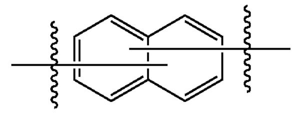

(f-1)

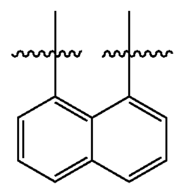

(f-2)

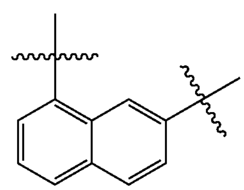

(f-3)

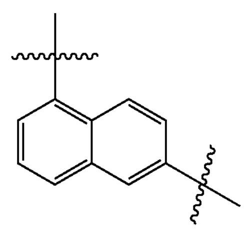

(f-4)

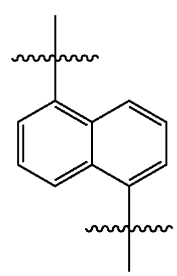

(f-5)

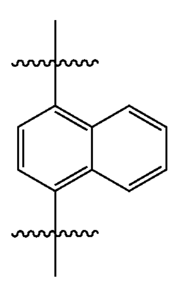

-continued (f-6)

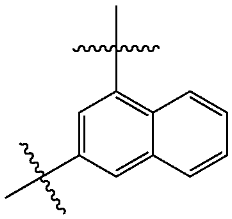

(f-7)

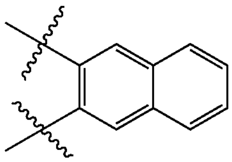

(f-8)

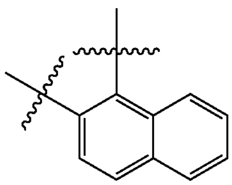

(f-9)

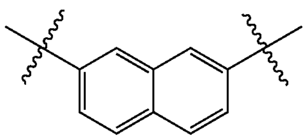

(f-10)

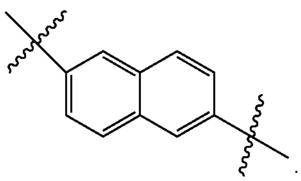

For example, as shown in the following formula (X'), dibenzofuranyl represented by the formula (X') is connected with other positions of a molecule through one unpositioned connecting bond extending from the middle of a benzene ring on one side, and its meaning includes any one possible connecting mode represented by formulae (X'-1) to (X'-4):

(X')

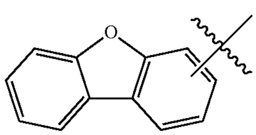

(X'-1)

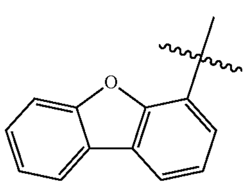

(X'-2)

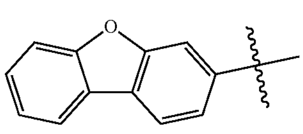

-continued (X'-3)

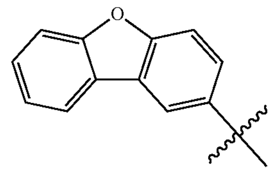

(X'-4)

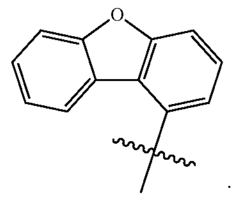

Hereinafter, the meaning for unpositioned connection or unpositioned substitution is the same as that here, which will not be repeated later.

In some embodiments of the present disclosure, the first compound is selected from compounds represented by the following chemical formulae:

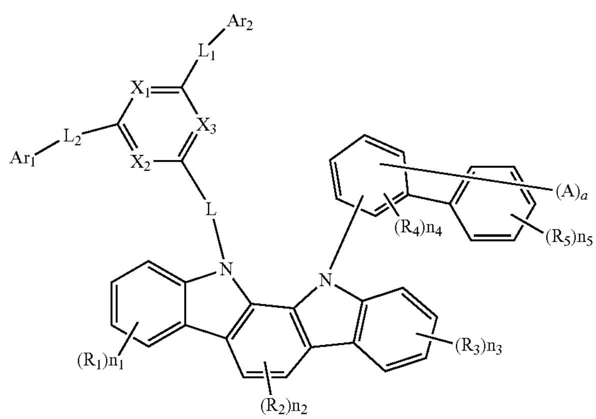

Formula 1-1, i.e., m = 0

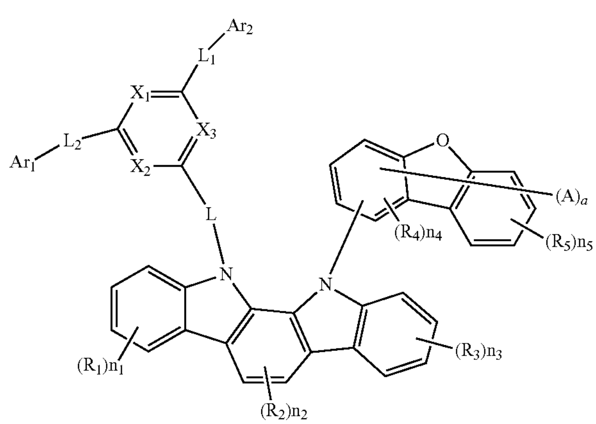

Formula 1-2, i.e., m = 1, and X is O

-continued

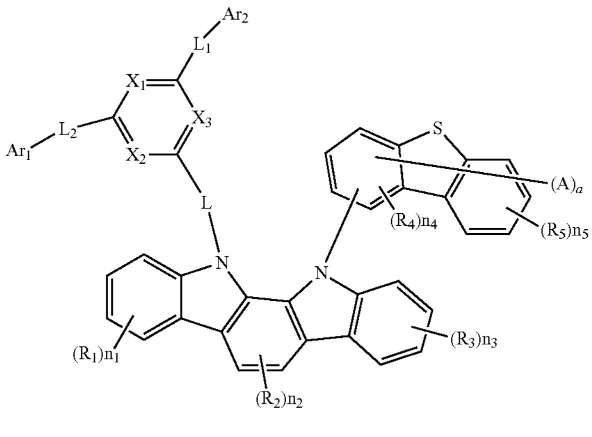

Formula 1-3, i.e., m = 1, and X is S

In some embodiments of the present disclosure, the first compound is selected from compounds represented by the following chemical formulae:

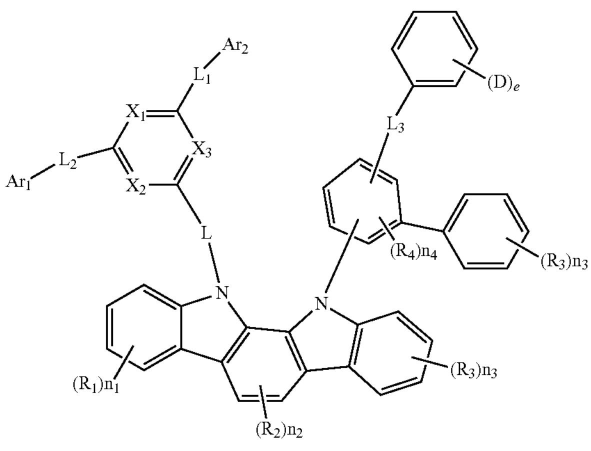

Formula 1-1-1

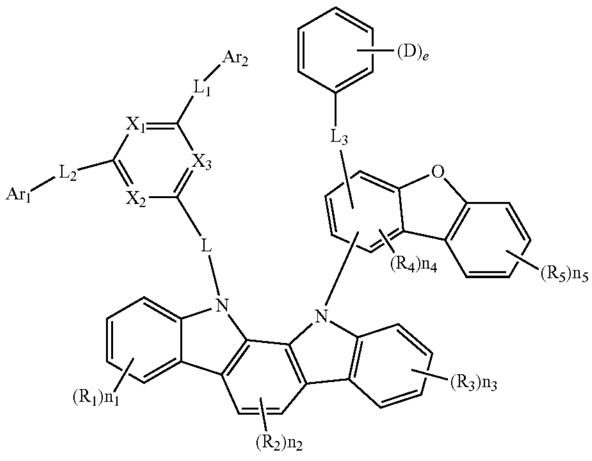

Formula 1-2-1

-continued

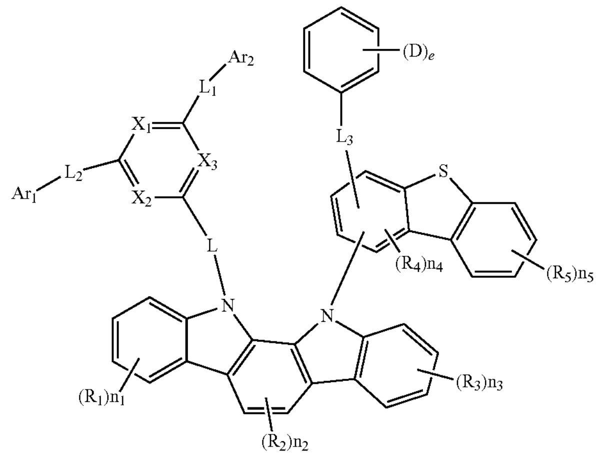

Formula 1-3-1

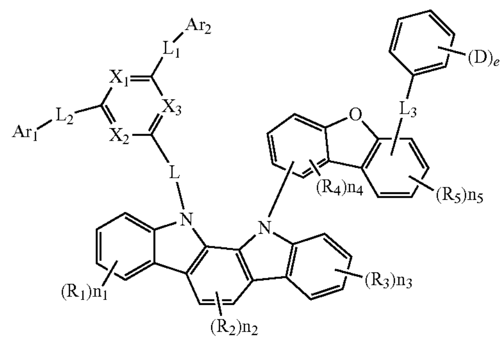

Formula 1-2-2

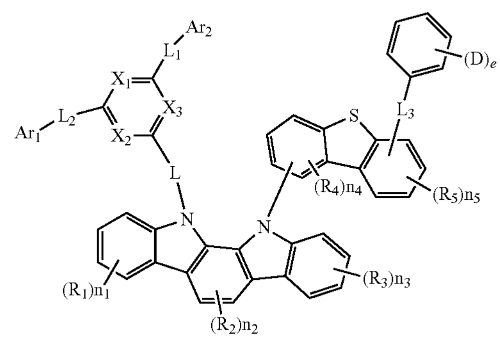

Formula 1-3-2

In some embodiments of the present disclosure, in the first compound, $X_1$ and $X_2$ are both C(H), and $X_3$ is N.

In some embodiments of the present disclosure, in the first compound, $X_2$ and $X_3$ are both C(H), and $X_1$ is N.

In some embodiments of the present disclosure, in the first compound, $X_1$ and $X_3$ are both C(H), and $X_2$ is N.

In some embodiments of the present disclosure, in the first compound, $X_1$ and $X_2$ are both N, and $X_3$ is C(H).

In some embodiments of the present disclosure, in the first compound, $X_1$ and $X_3$ are both N, and $X_2$ is C(H).

In some embodiments of the present disclosure, in the first compound, $X_2$ and $X_3$ are both N, and $X_1$ is C(H).

In some embodiments of the present disclosure, in the first compound, $X_1$, $X_2$, and $X_3$ are all N.

In some embodiments of the present disclosure, in the first compound,

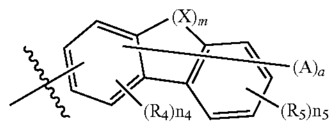

contains at least one deuterium.

In some embodiments of the present disclosure, a is selected from 1 or 2.

In some embodiments of the present disclosure, $n_1$, $n_2$, and $n_3$ are all 0.

In some embodiments of the present disclosure, in the first compound, L is selected from a single bond or phenylene.

In some embodiments of the present disclosure, in the first compound, L is selected from a single bond or

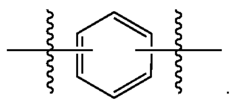

Optionally, in the first compound, L is selected from a single bond or the group consisting of:

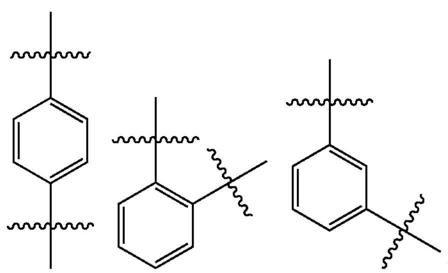

In some embodiments of the present disclosure, in the first compound, each $L_3$, $L_1$, and $L_2$ are each independently selected from a single bond, substituted or unsubstituted arylene with 6 to 20 carbon atoms, and substituted or unsubstituted heteroarylene with 12 to 20 carbon atoms.

Optionally, substituents in each $L_3$, $L_1$, and $L_2$ are each independently selected from deuterium, a halogen group, cyano, alkyl with 1 to 5 carbon atoms, and phenyl.

Optionally, $L_1$ and $L_2$ are each independently selected from a single bond, substituted or unsubstituted arylene with 6 to 12 carbon atoms, and substituted or unsubstituted heteroarylene with 12 to 18 carbon atoms.

Optionally, each $L_3$ is selected from a single bond, and substituted or unsubstituted arylene with 6 to 12 carbon atoms.

In other embodiments of the present disclosure, in the first compound, each $L_3$, $L_1$, and $L_2$ are each independently selected from a single bond, substituted or unsubstituted phenylene, substituted or unsubstituted naphthylene, substituted or unsubstituted biphenylene, substituted or unsubstituted carbazolylene, substituted or unsubstituted dibenzothienylene, and substituted or unsubstituted dibenzofurylene.

Optionally, substituents in each $L_3$, the $L_1$ and the $L_2$ are each independently selected from deuterium, fluorine, cyano, methyl, ethyl, n-propyl, isopropyl, tert-butyl, and phenyl.

Optionally, $L_1$ and $L_2$ are each independently selected from a single bond, substituted or unsubstituted phenylene, substituted or unsubstituted naphthylene, substituted or unsubstituted biphenylene, substituted or unsubstituted carbazolylene, substituted or unsubstituted dibenzothienylene, and substituted or unsubstituted dibenzofurylene.

Optionally, each $L_3$ is independently selected from a single bond, substituted or unsubstituted phenylene, substituted or unsubstituted naphthylene, and substituted or unsubstituted biphenylene.

In some embodiments of the present disclosure, each $L_3$ is independently selected from a single bond or the group consisting of:

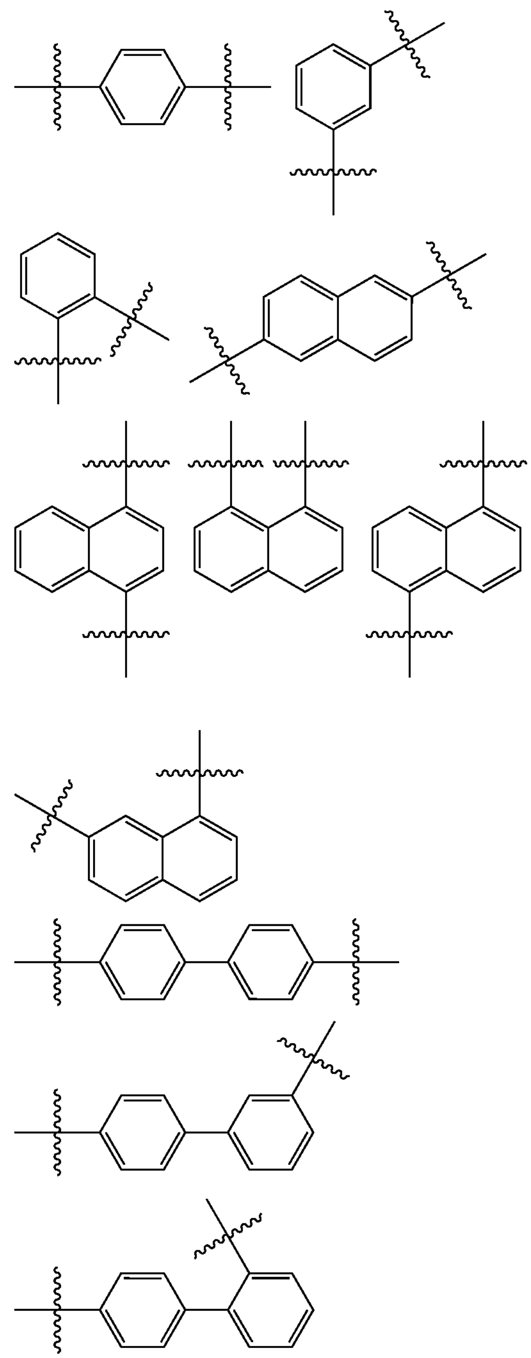

-continued

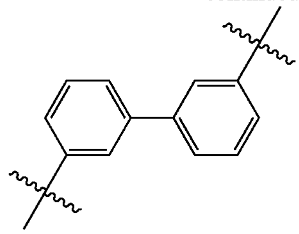
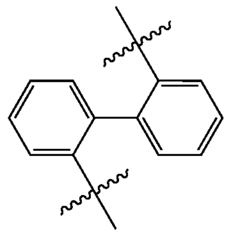
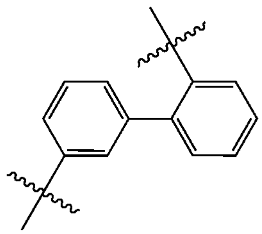
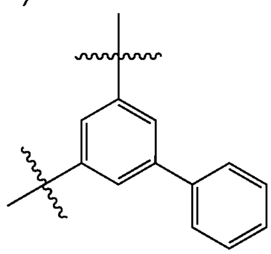
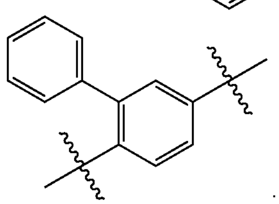

In some embodiments of the present disclosure, $L_1$ and $L_2$ are each independently selected from a single bond, and a substituted or unsubstituted group G, where the unsubstituted group G is selected from the group consisting of:

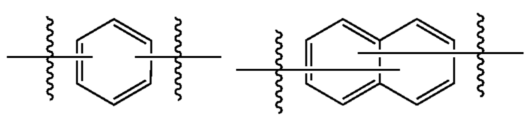
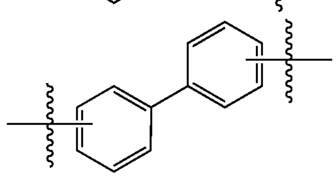
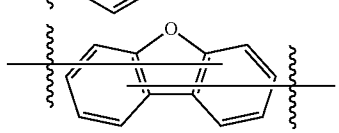

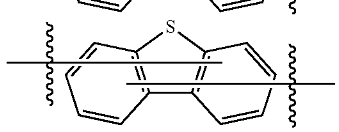

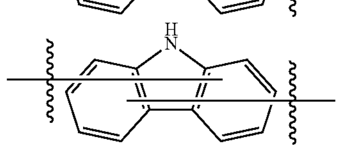

-continued

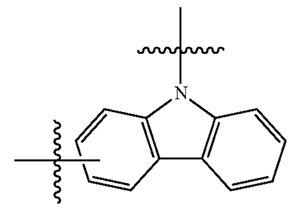

wherein,  represents a chemical bond; the substituted group G contains one or more substituents each independently selected from deuterium, fluorine, cyano, methyl, ethyl, n-propyl, isopropyl, tert-butyl or phenyl; and when the substituted group G contains a plurality of substituents, the substituents are the same or different.

Optionally, $L_1$ and $L_2$ are each independently selected from a single bond or the group consisting of:

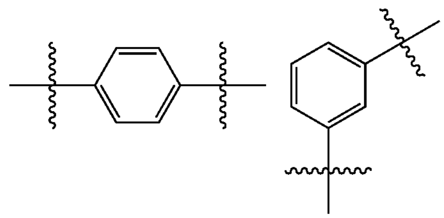
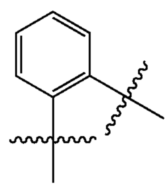
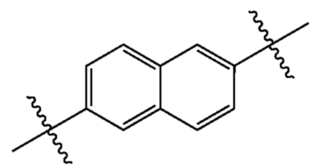
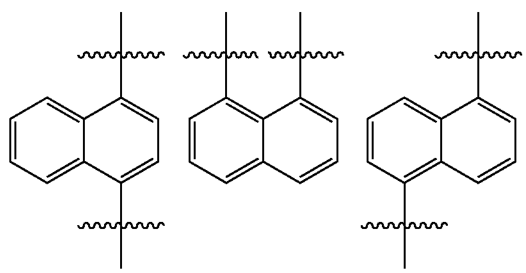
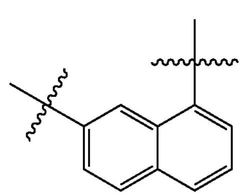
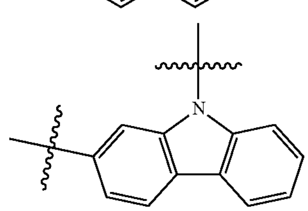

-continued

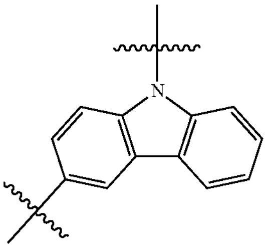
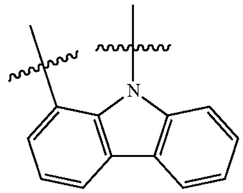
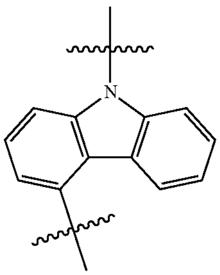
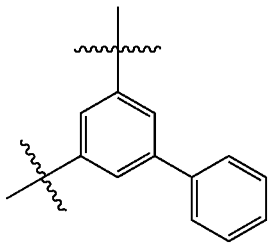
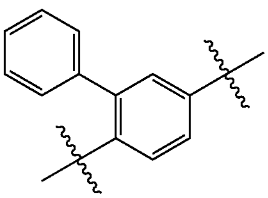
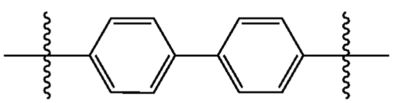
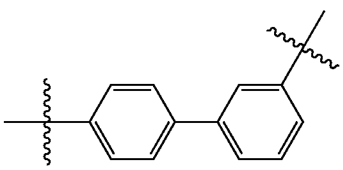
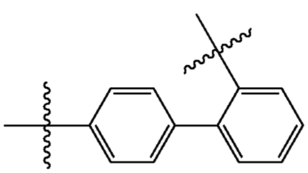
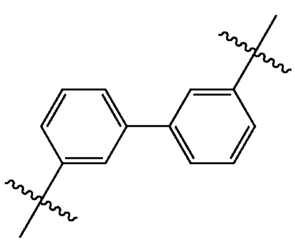
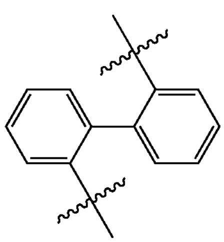
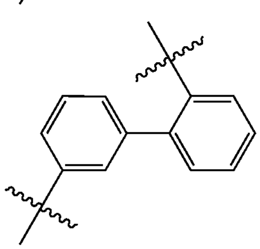

-continued

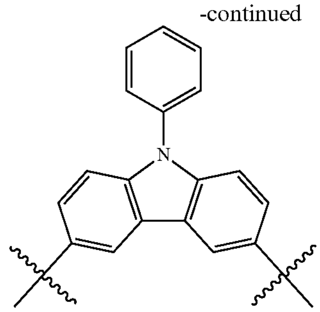
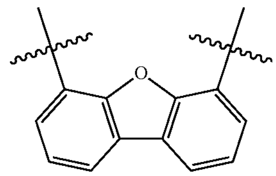

In some embodiments of the present disclosure, in the first compound, $Ar_1$ and $Ar_2$ are each independently selected from aryl with 6 to 25 carbon atoms and substituted or unsubstituted heteroaryl with 5 to 20 carbon atoms.

Optionally, substituents in the $Ar_1$ and the $Ar_2$ are each independently selected from deuterium, a halogen group, cyano, alkyl with 1 to 5 carbon atoms, cycloalkyl with 5 to 10 carbon atoms, aryl with 6 to 12 carbon atoms, or triarylsilyl with 18 carbon atoms.

In other embodiments of the present disclosure, in the first compound, $Ar_1$ and $Ar_2$ are each independently selected from substituted or unsubstituted phenyl, substituted or unsubstituted naphthyl, substituted or unsubstituted phenanthryl, substituted or unsubstituted biphenyl, substituted or unsubstituted fluorenyl, substituted or unsubstituted terphenyl, substituted or unsubstituted pyridyl, substituted or unsubstituted carbazolyl, substituted or unsubstituted dibenzofuranyl, and substituted or unsubstituted dibenzothienyl.

Optionally, substituents in the $Ar_1$ and the $Ar_2$ are each independently selected from deuterium, fluorine, cyano, methyl, ethyl, n-propyl, isopropyl, tert-butyl, phenyl, naphthyl, biphenyl, triphenylsilyl, cyclohexyl, or adamantyl.

In some embodiments of the present disclosure, in the first compound, $Ar_1$ and $Ar_2$ are each independently selected from a substituted or unsubstituted group $G_1$, where the unsubstituted group $G_1$ is selected from the group consisting of:

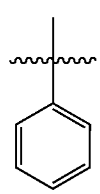
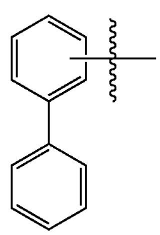
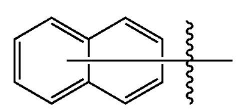
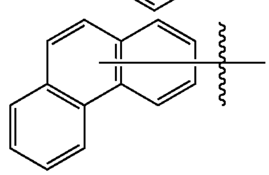

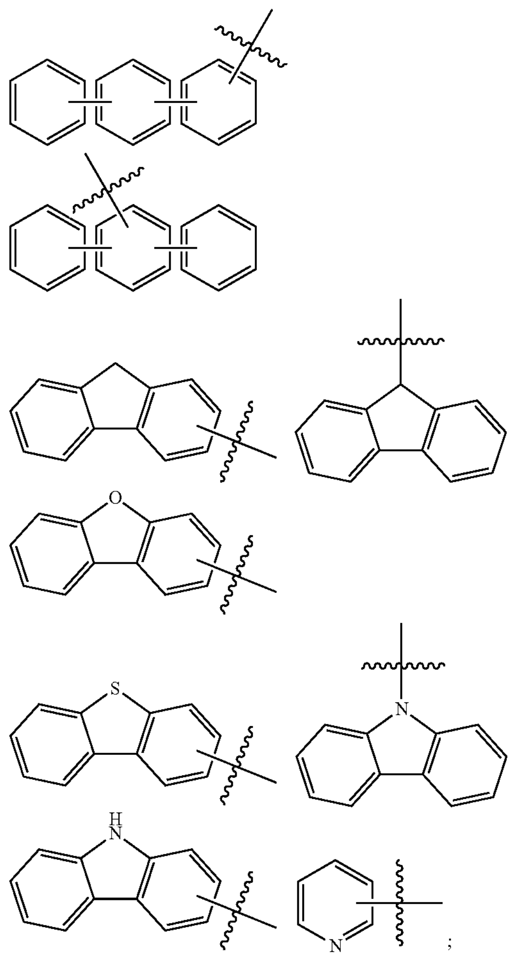

wherein, ⌇ represents a chemical bond; the substituted group $G_1$ contains one or more substituents each independently selected from deuterium, fluorine, cyano, methyl, ethyl, n-propyl, isopropyl, tert-butyl, phenyl, naphthyl, biphenyl, triphenylsilyl, cyclohexyl or adamantyl; and when the substituted group $G_1$ contains a plurality of substituents, the substituents are the same or different.

Optionally, $Ar_1$ and $Ar_2$ are each independently selected from the group consisting of:

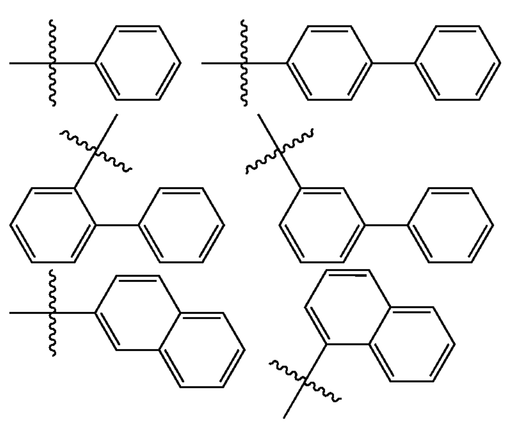

-continued

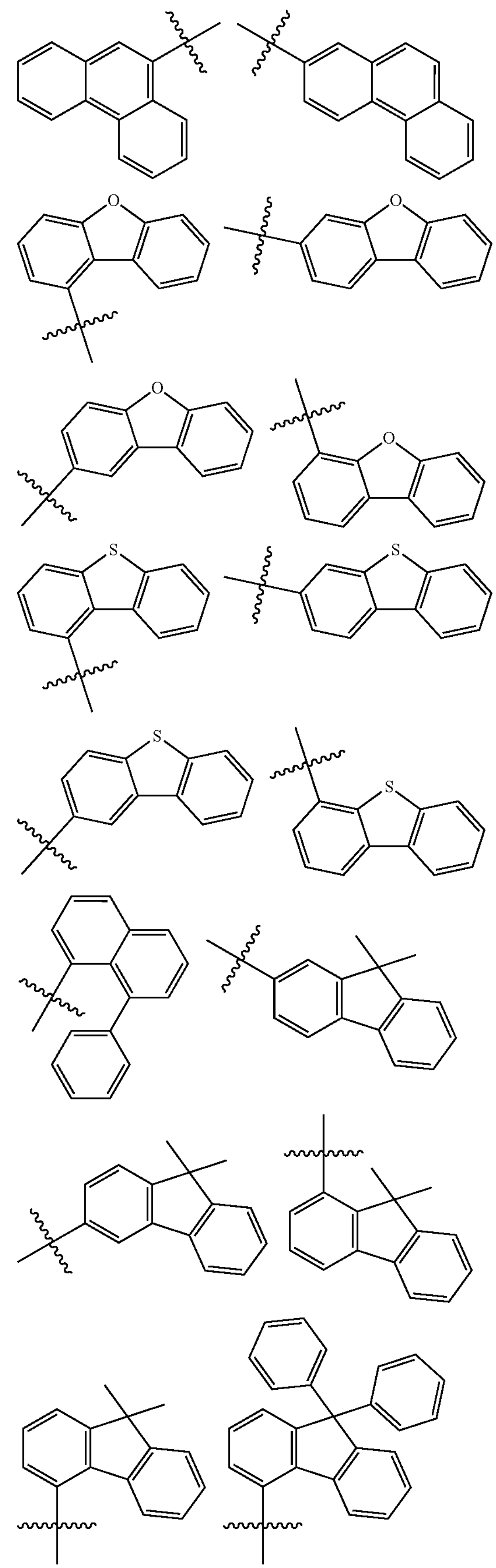

-continued
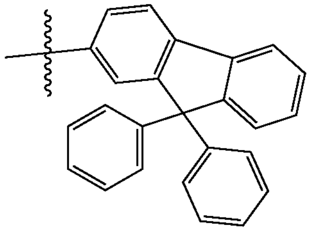
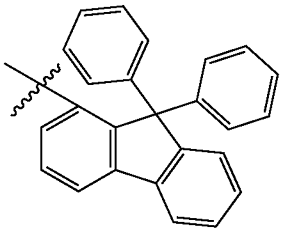
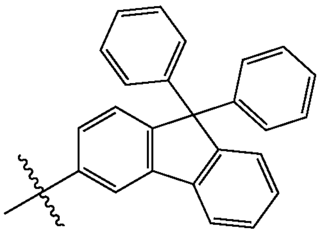
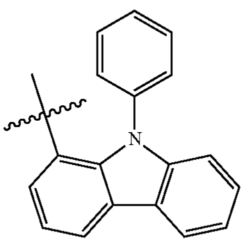
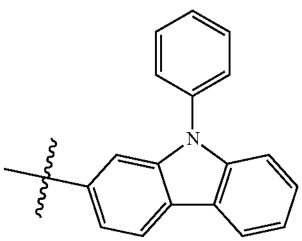
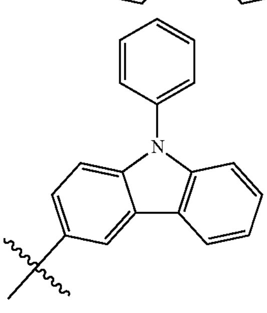
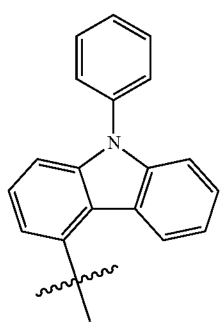
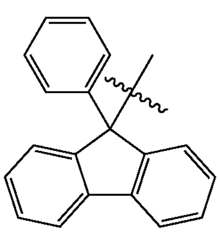
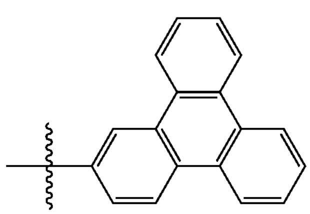
-continued
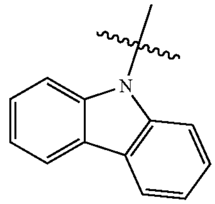
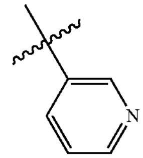
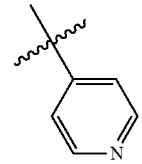
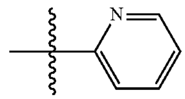
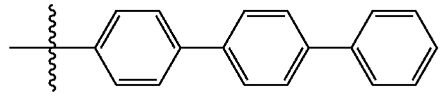
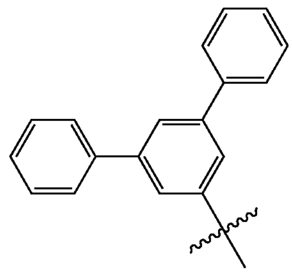
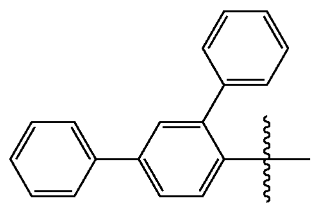
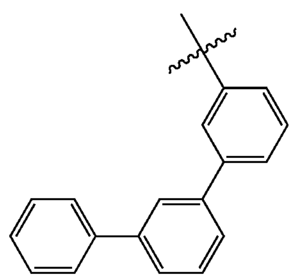
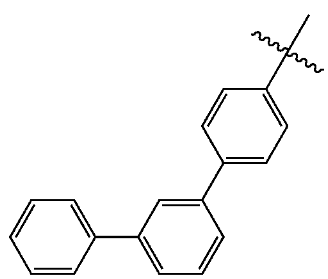
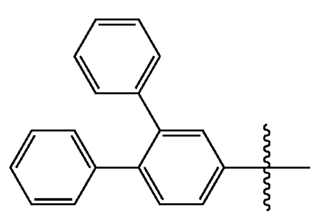

-continued
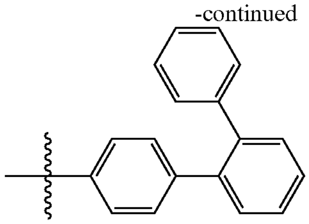
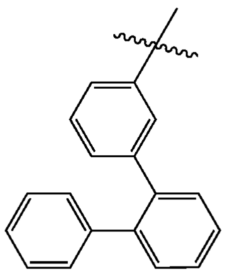
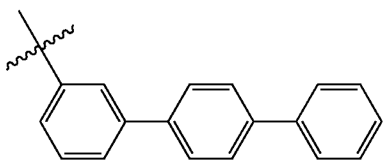
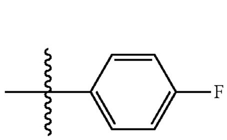
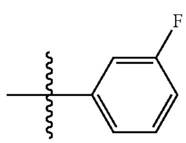
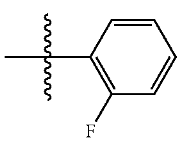
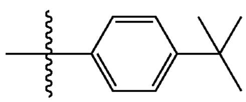
-continued
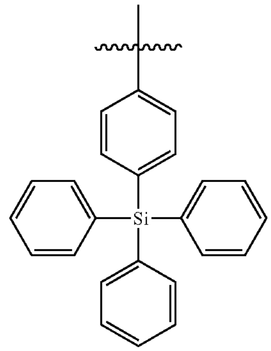
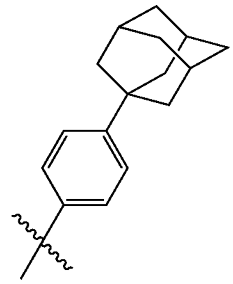
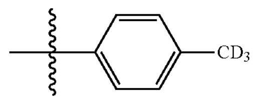
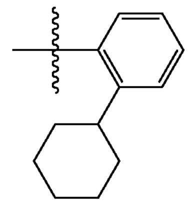
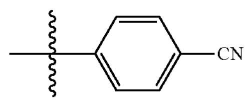
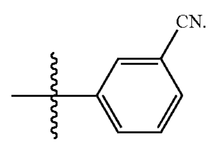
In some embodiments of the present disclosure, the first compound is selected from the group consisting of:
A1
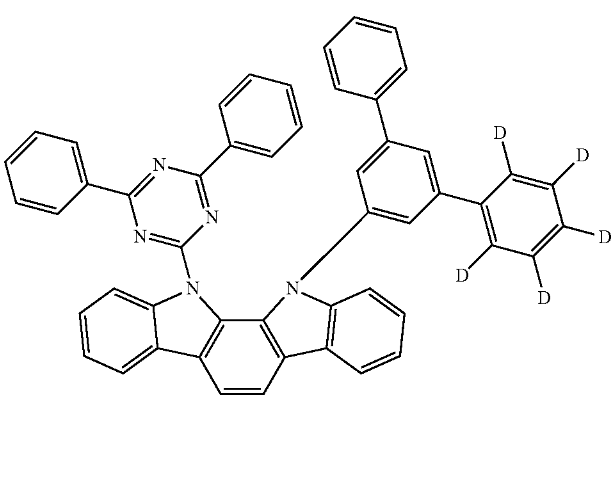

-continued
A2
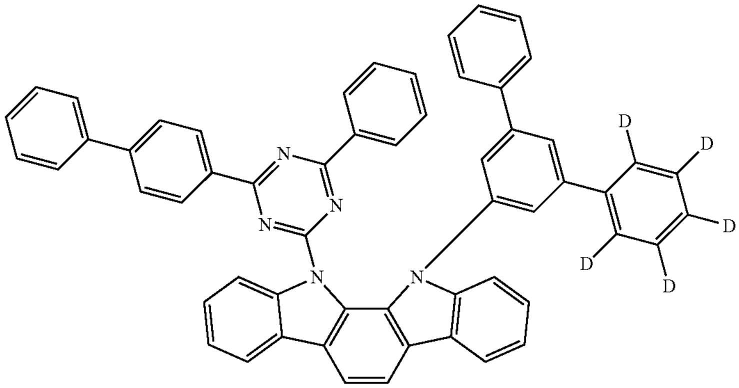
A3
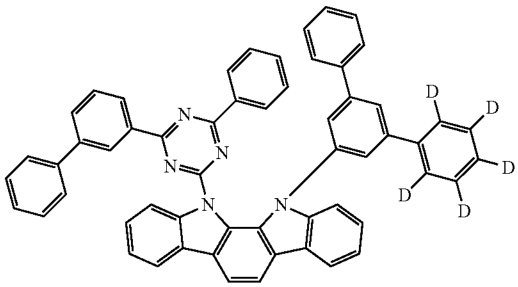
A4
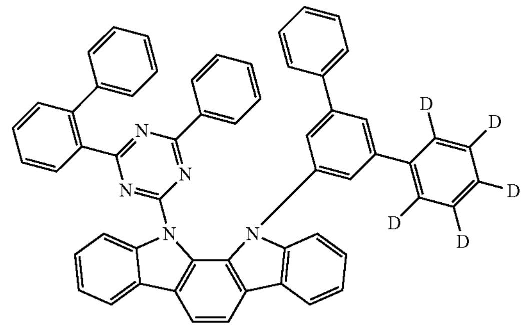
A5
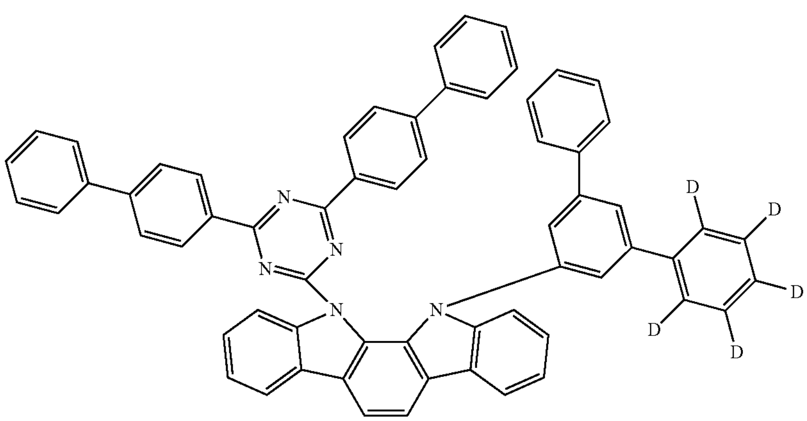
A6
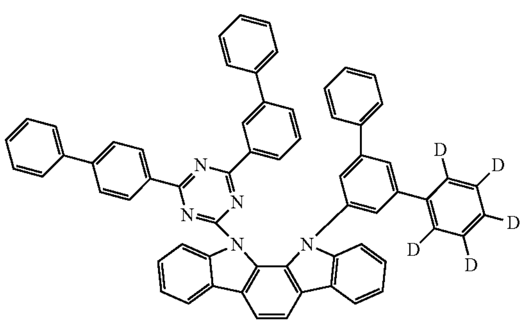
A7
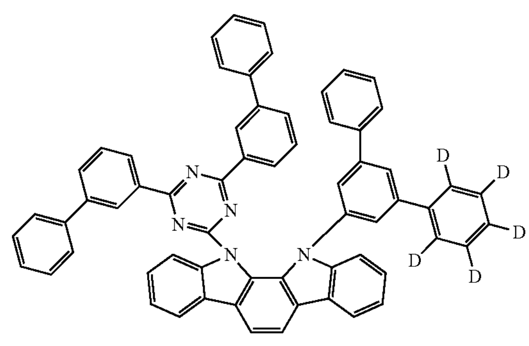

-continued
A8
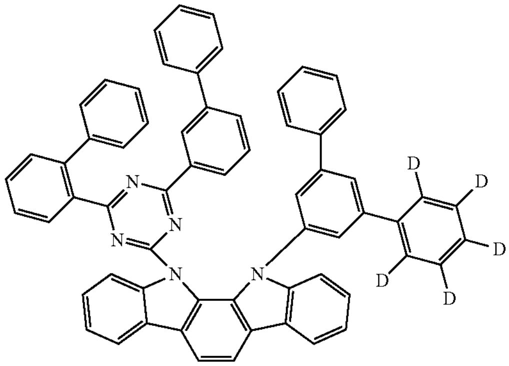
A9
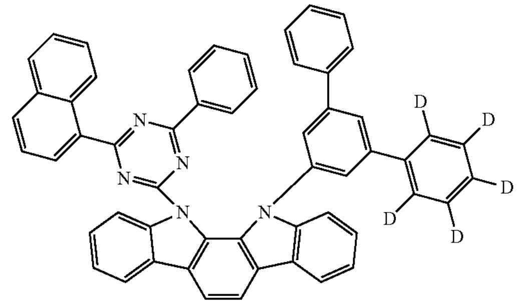
A10
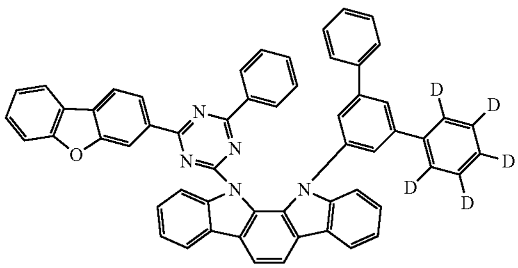
A11
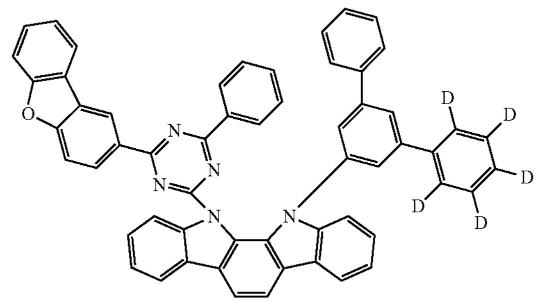
A12
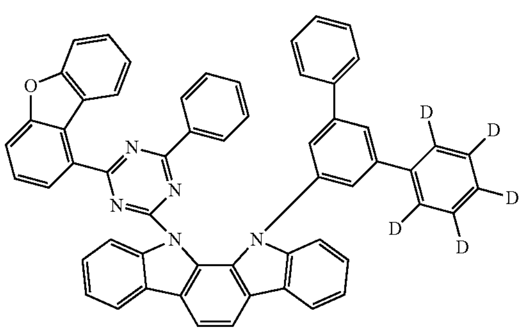
A13
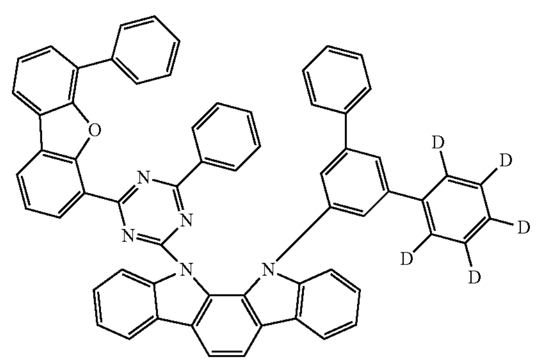
A14
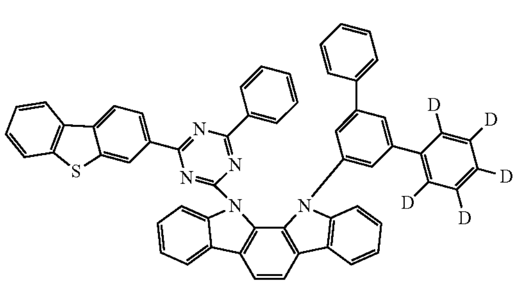
A15
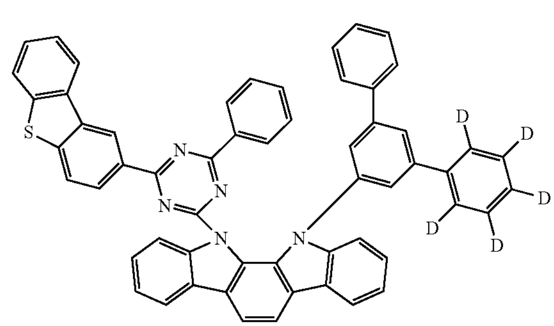

-continued
A16
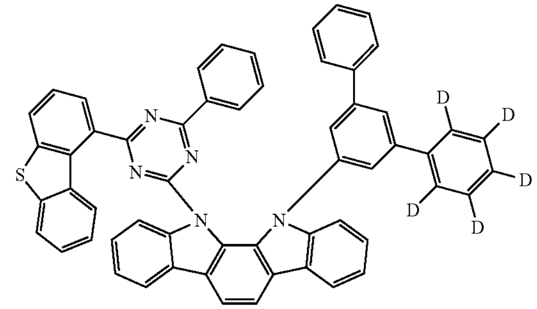
A17
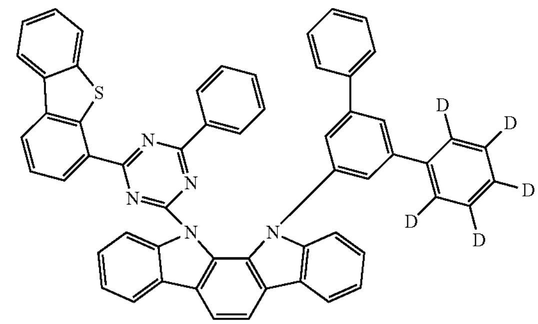
A18
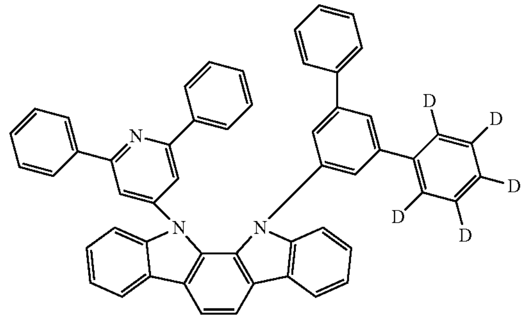
A19
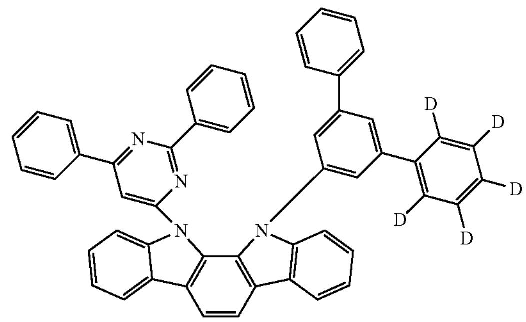
A20
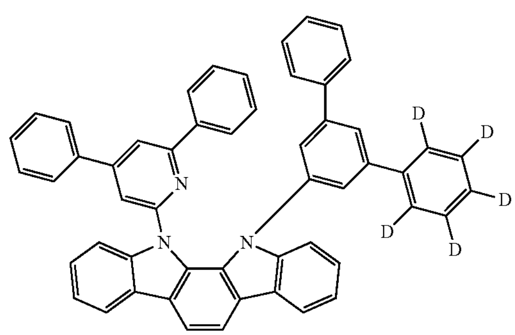
A21
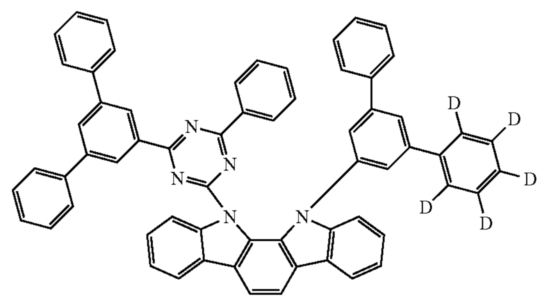
A22
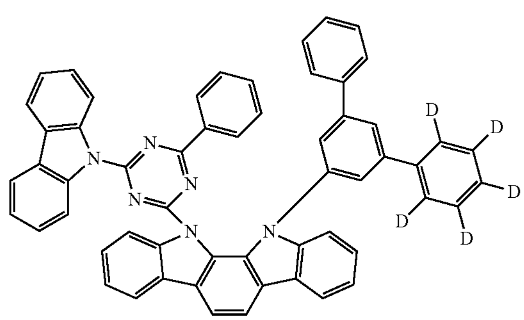
A23
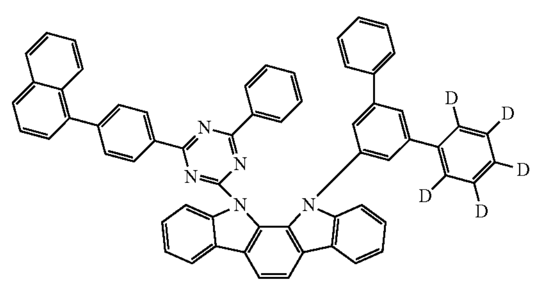

-continued
A24
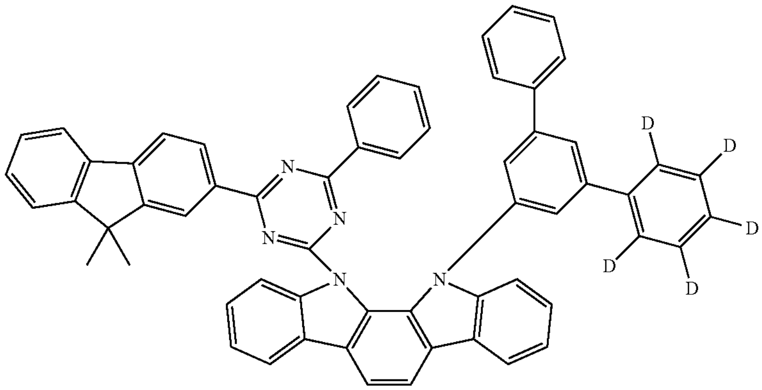
A25
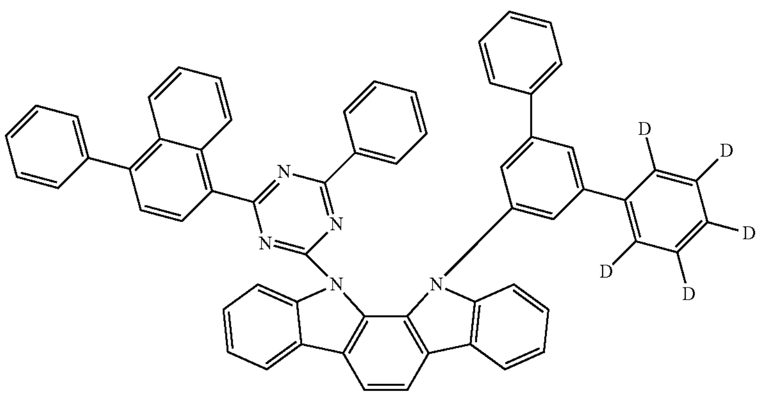
A26
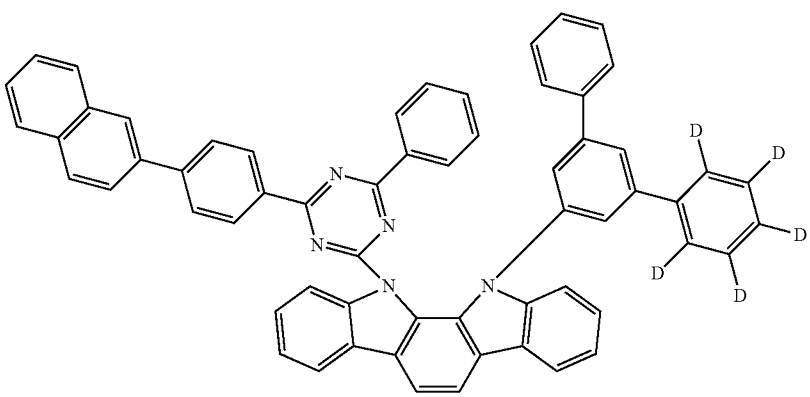
A27
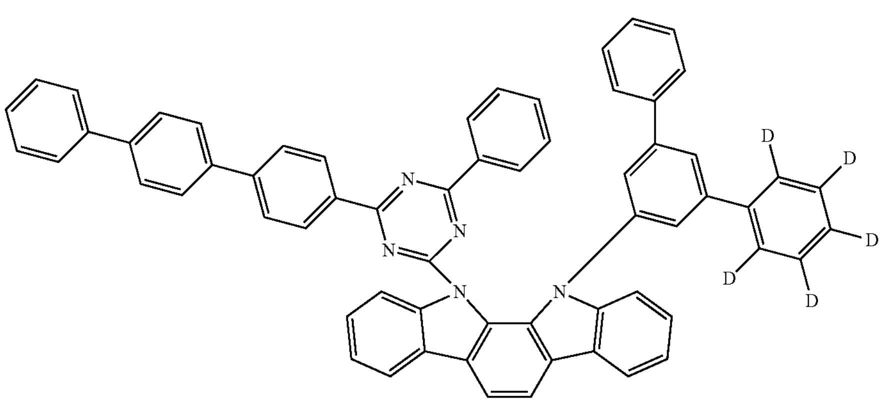

-continued
A28
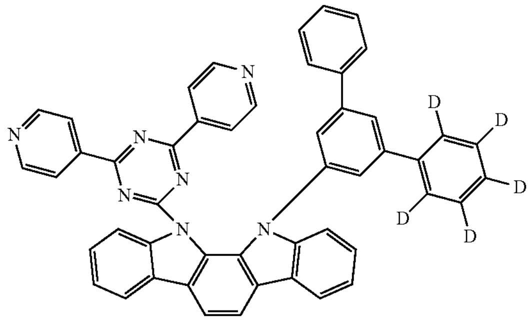
A29
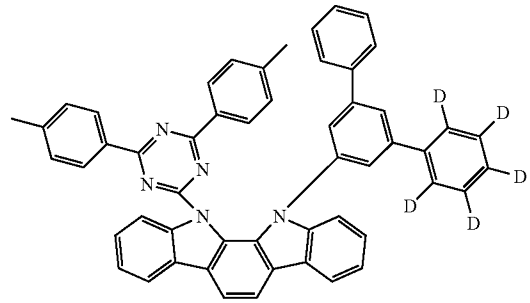
A30
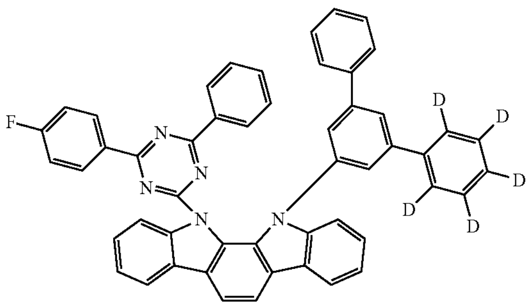
A31
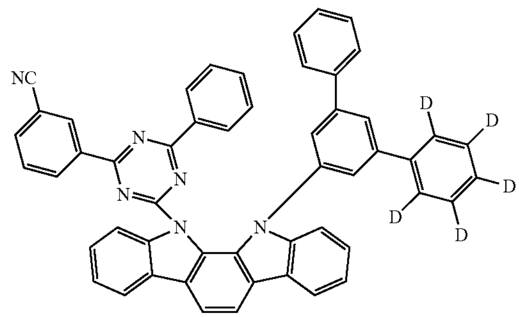
A32
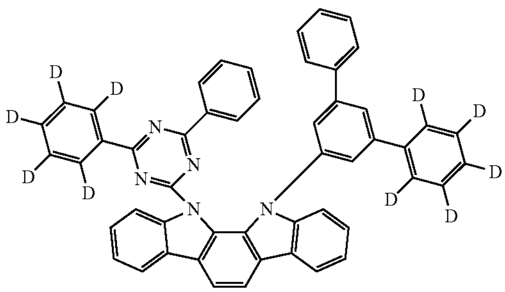
A33
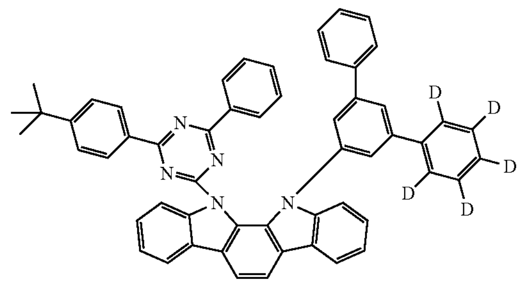
A34
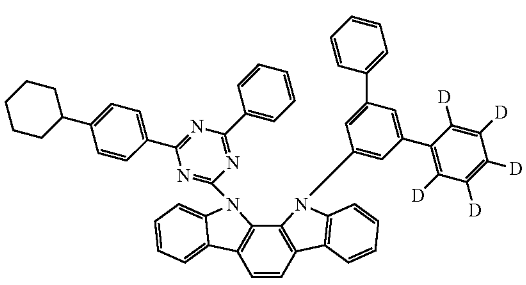
A35
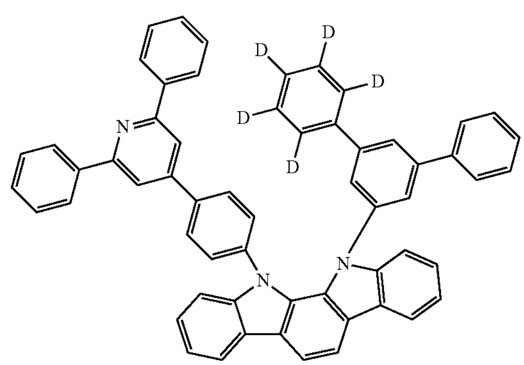

-continued
A36
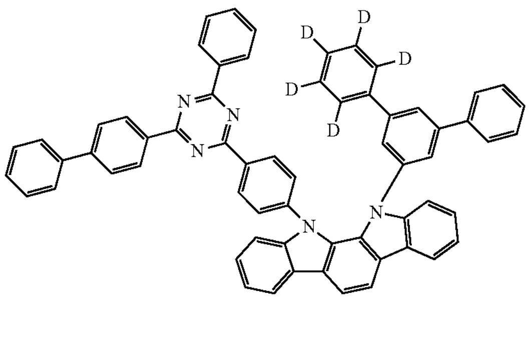
A37
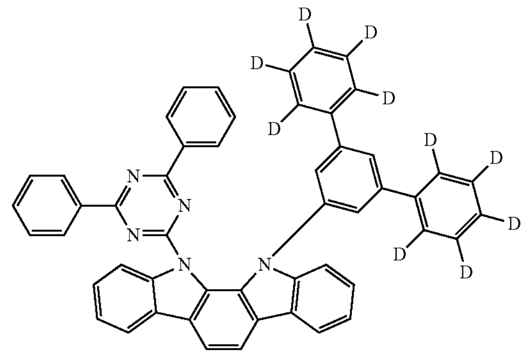
A38
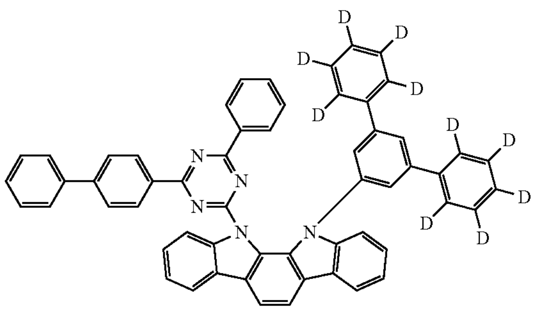
A39
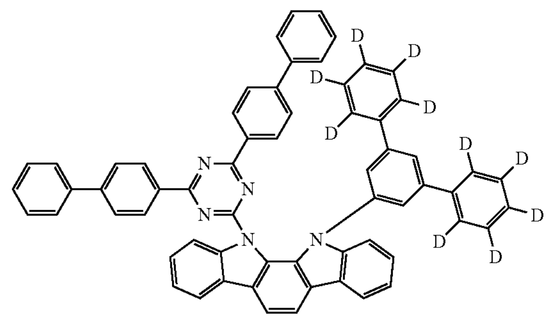
A40
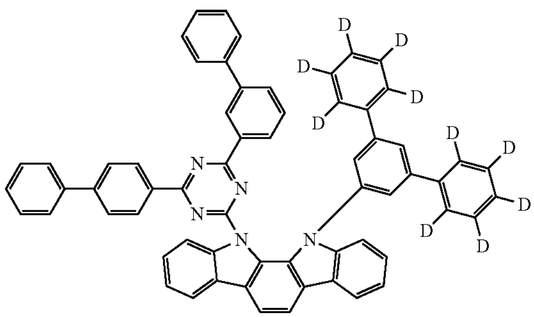
A41
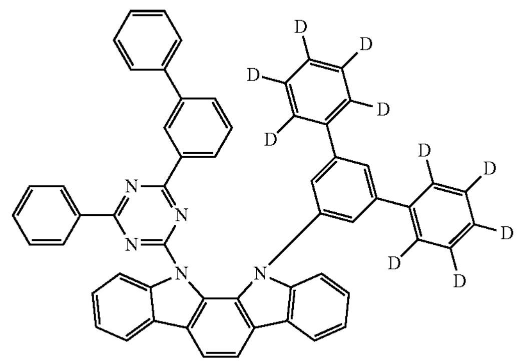
A42
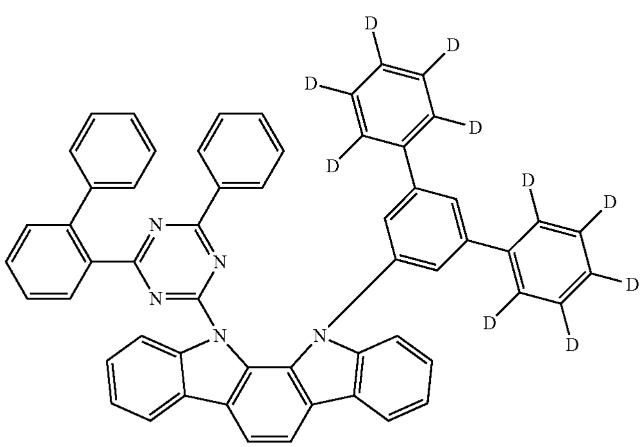

-continued
A43
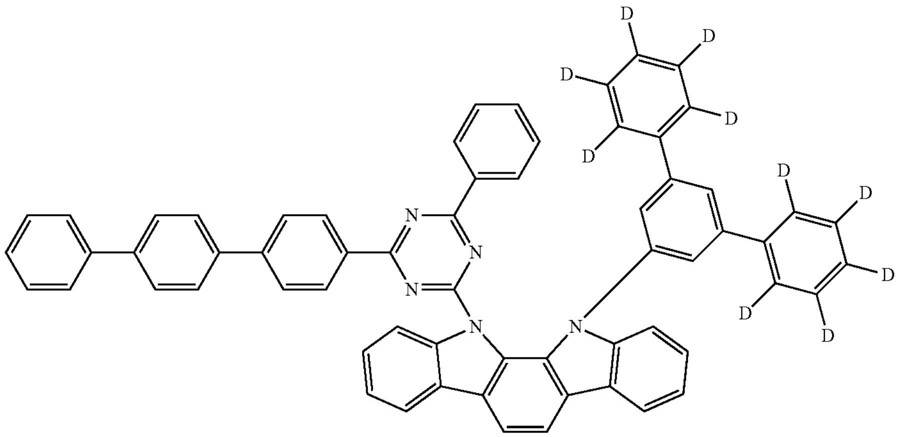
A44
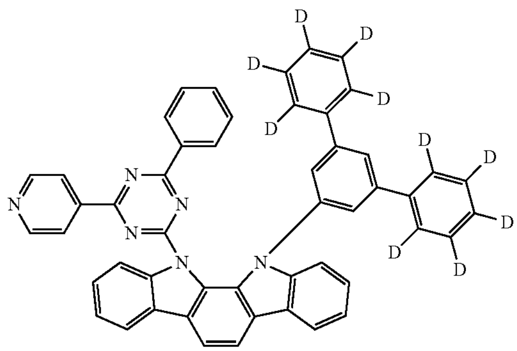
A45
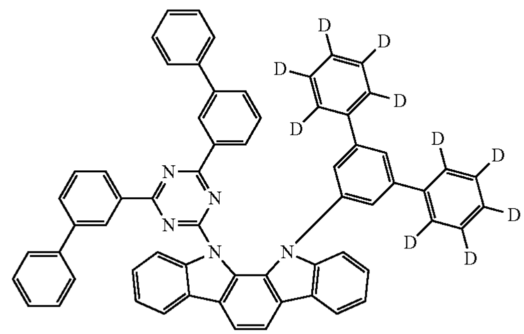
A46
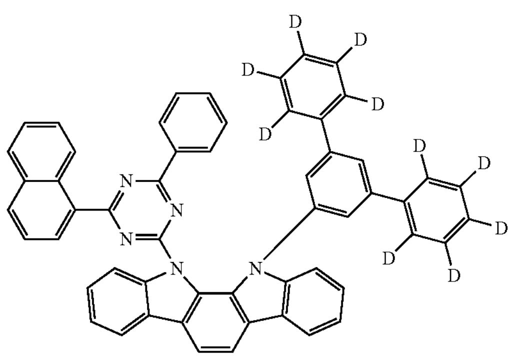
A47
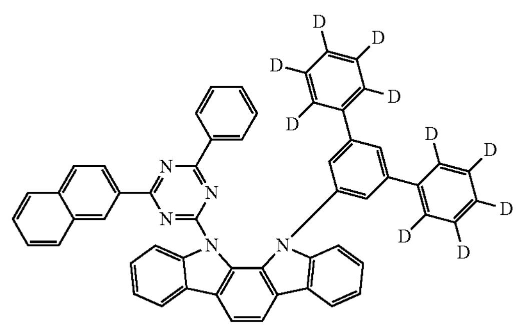
A48
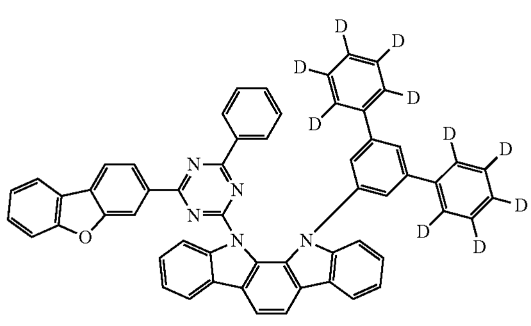
A49
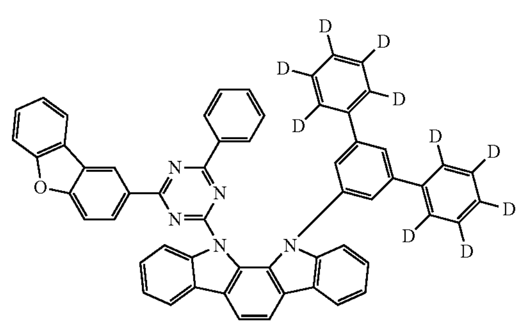

-continued
A50
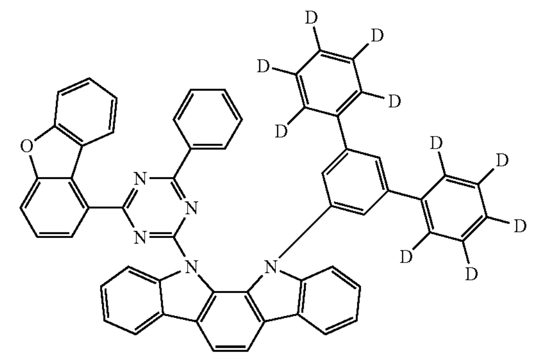
A51
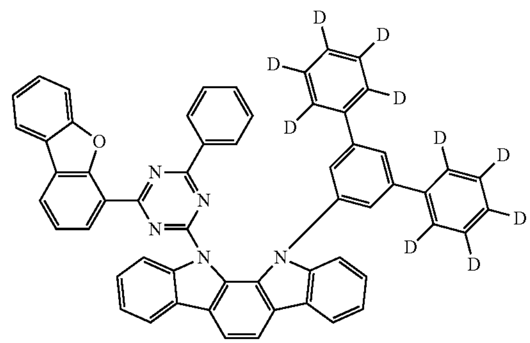
A52
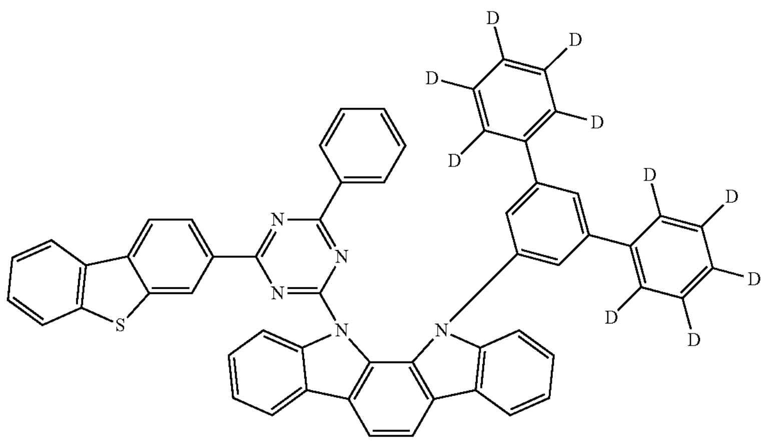
A53
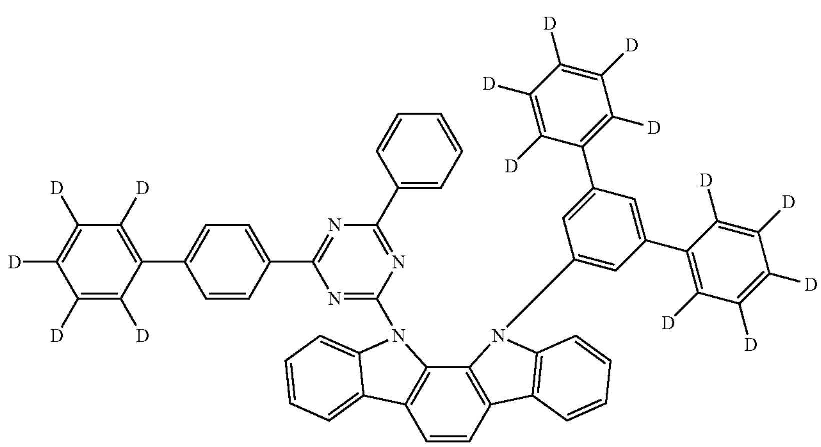
A54
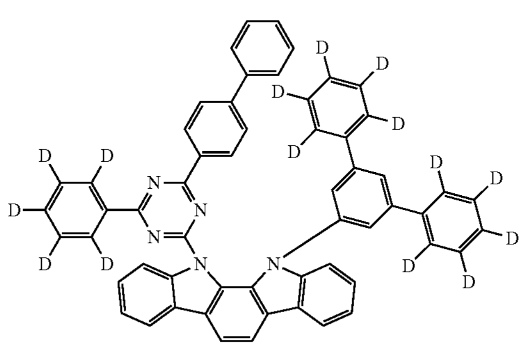
A55
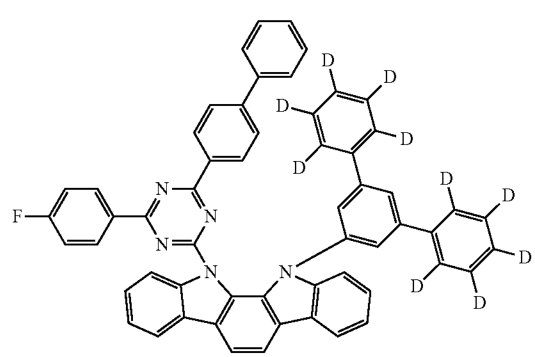

-continued
A56
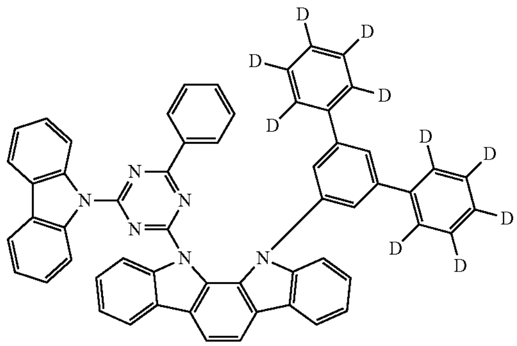
A57
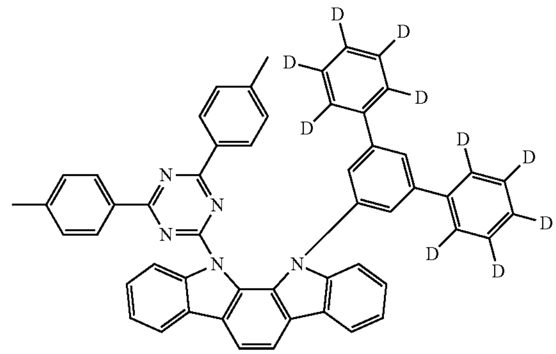
A58
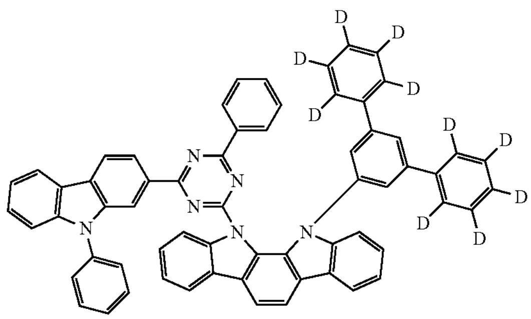
A59
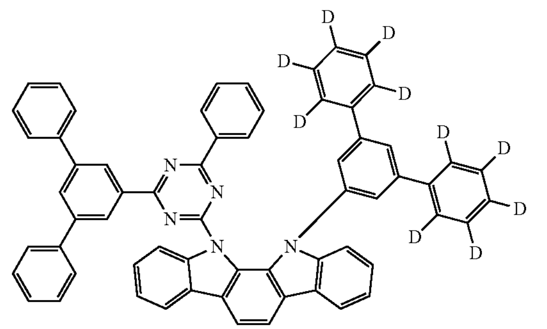
A60
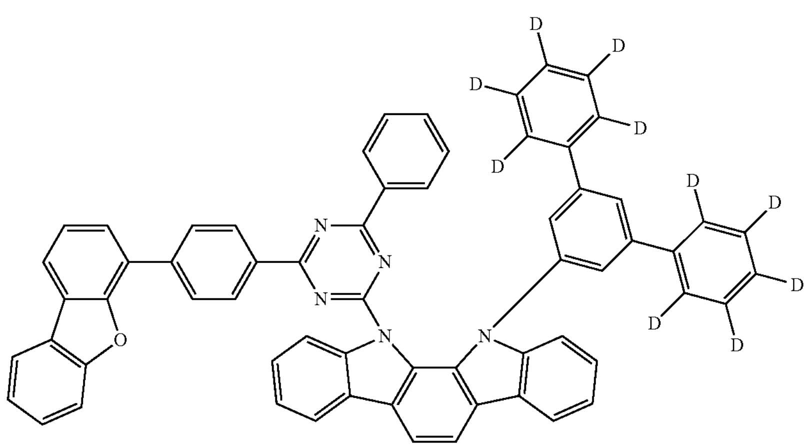
A61
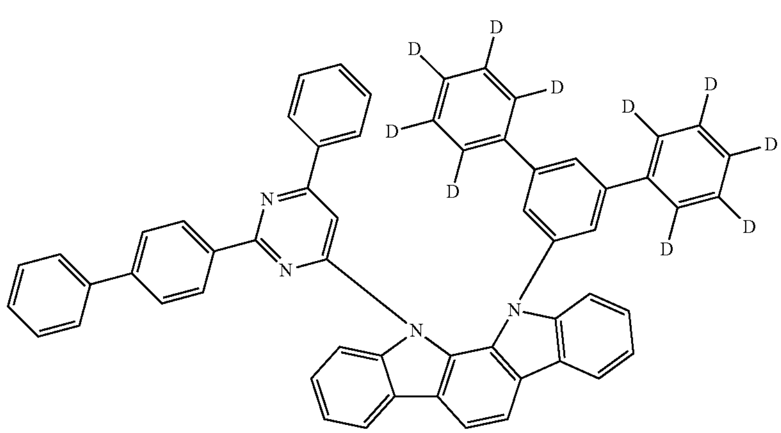

-continued
A62
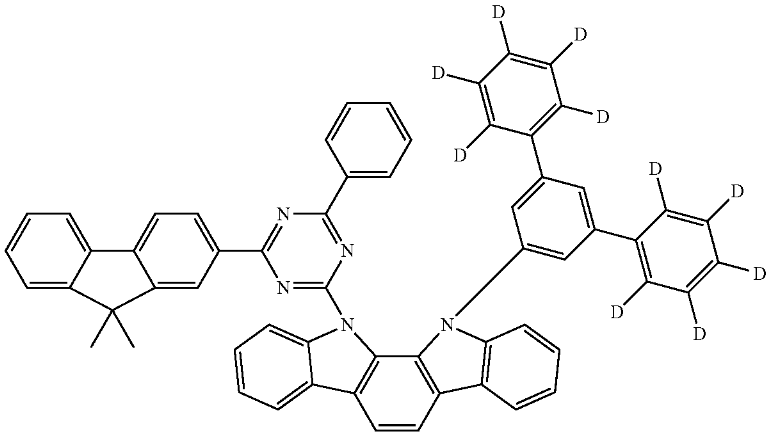
A63
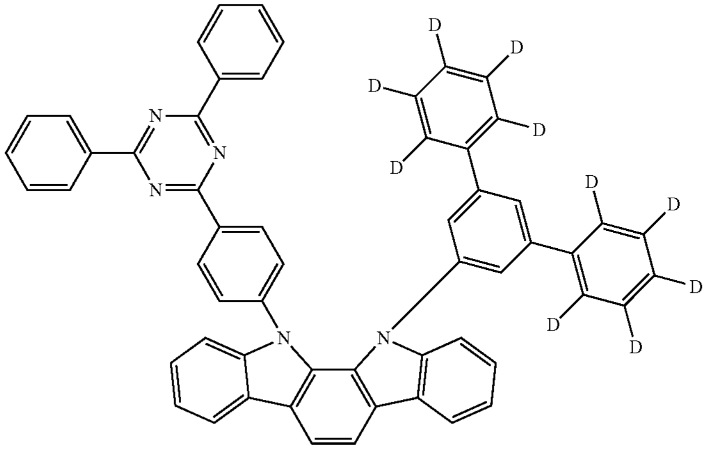
A64
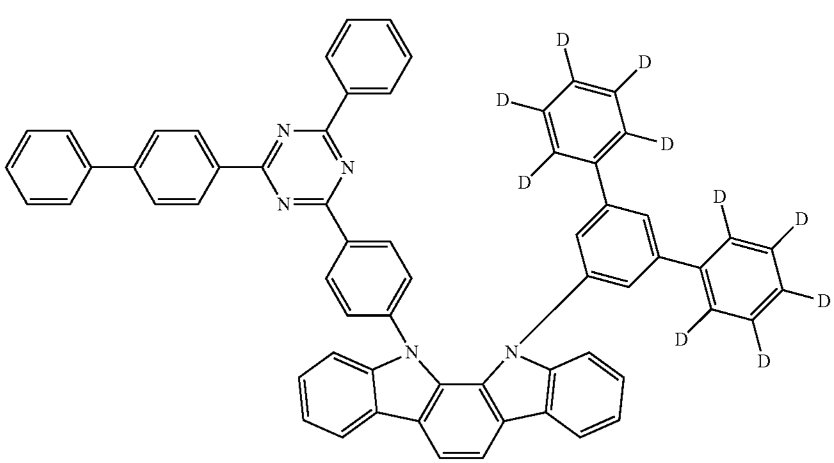

-continued
A65
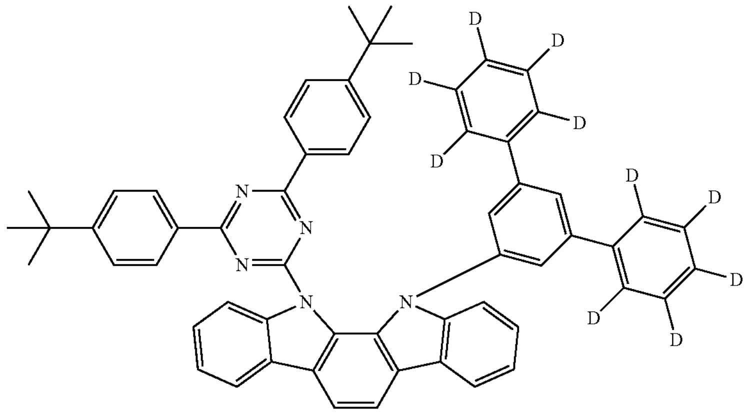
A66
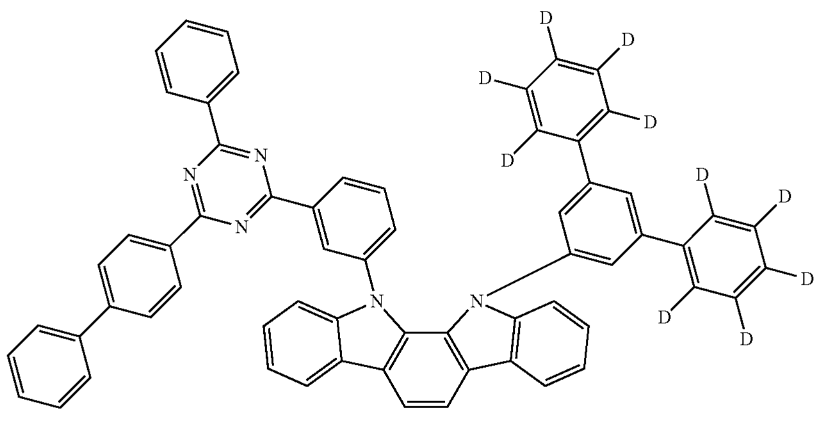
A67
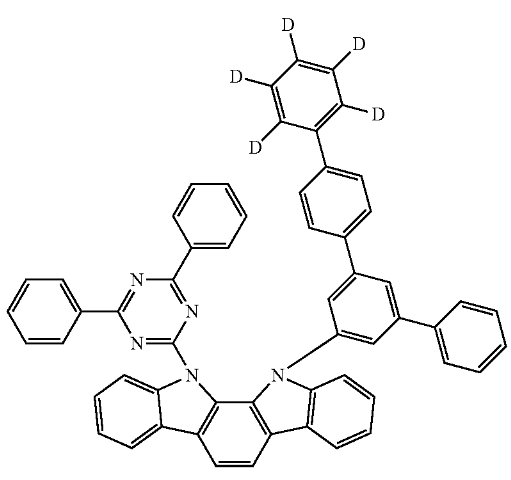
A68
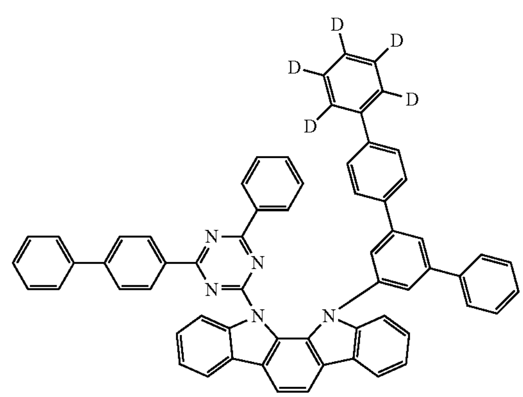

-continued
A69
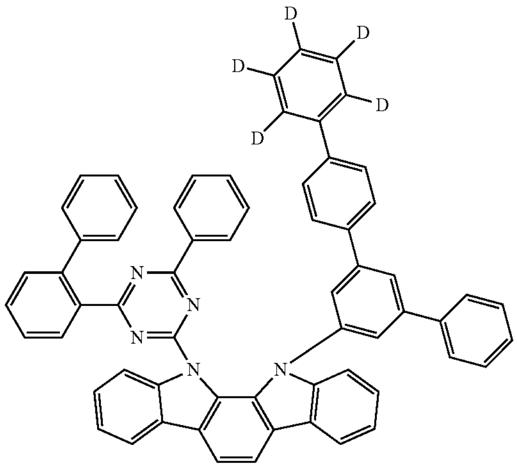
A70
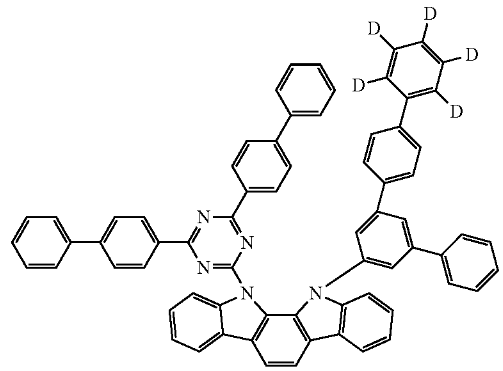
A71
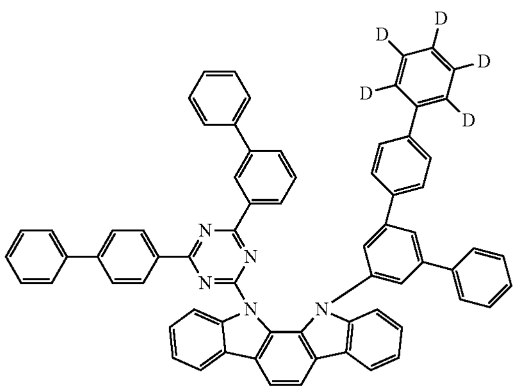
A72
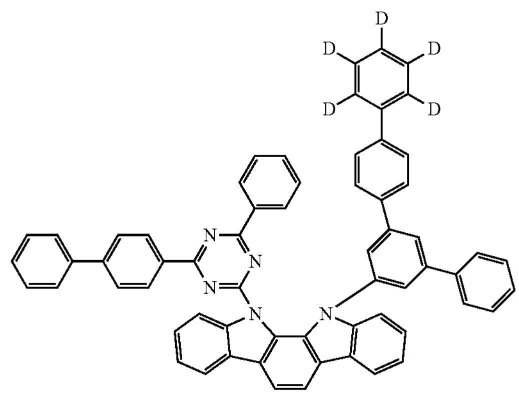
A73
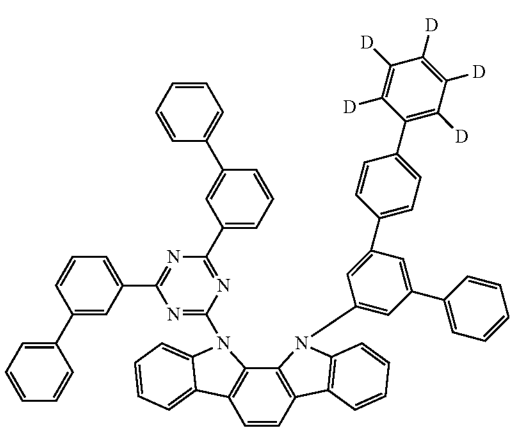
A74
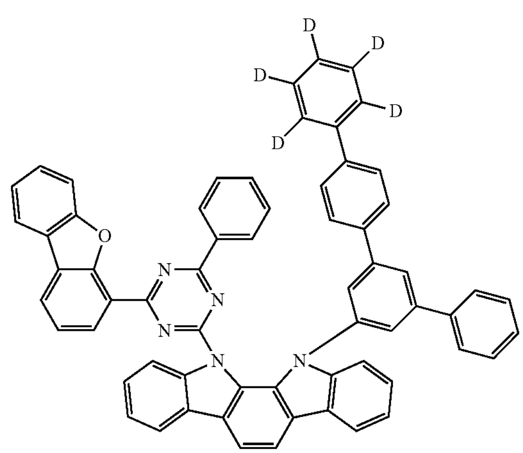

-continued
A75
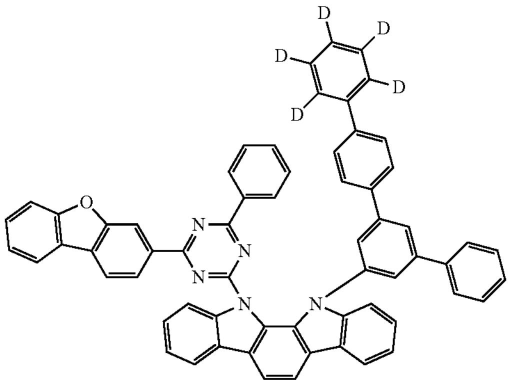
A76
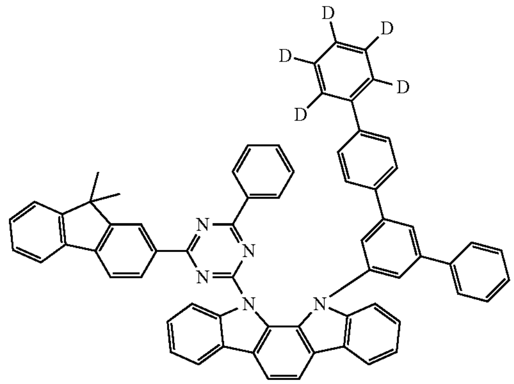
A77
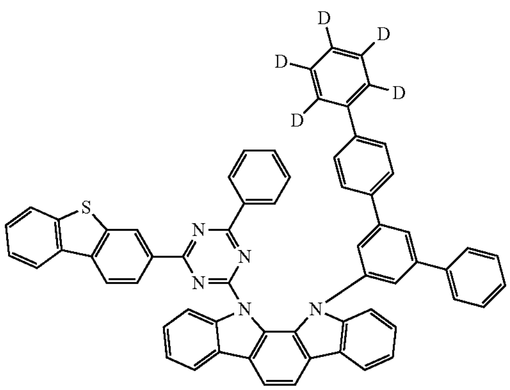
A78
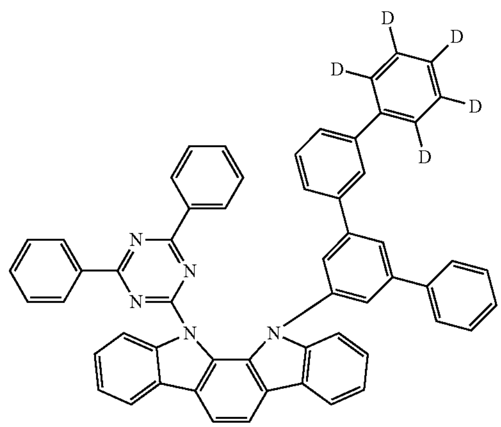
A79
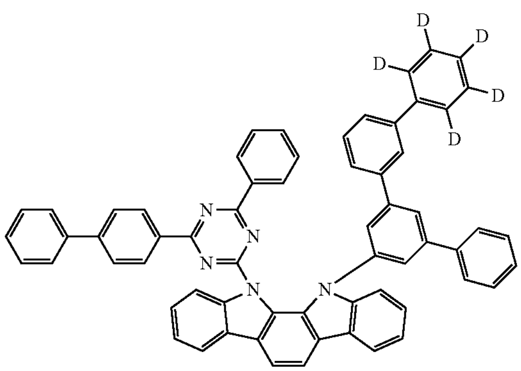
A80
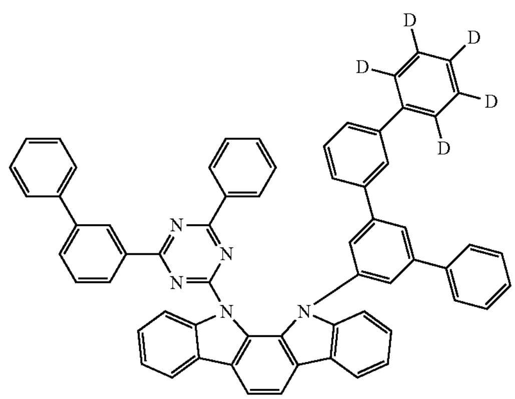
A81
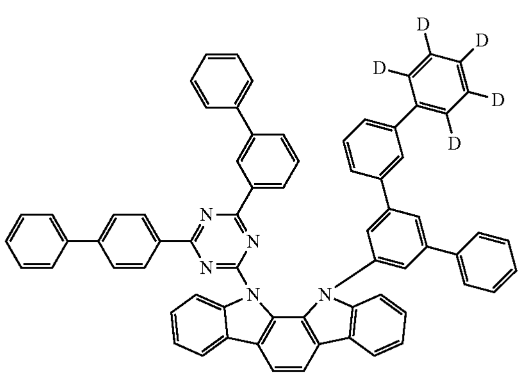
A82
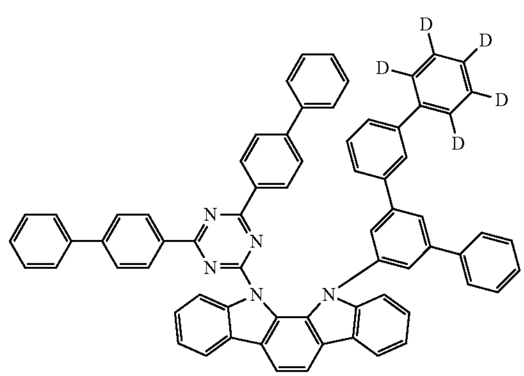

-continued
A83
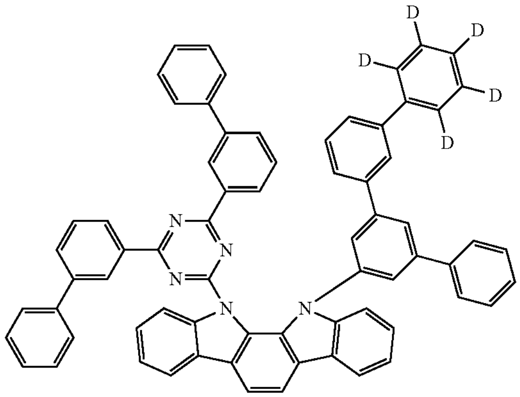
A84
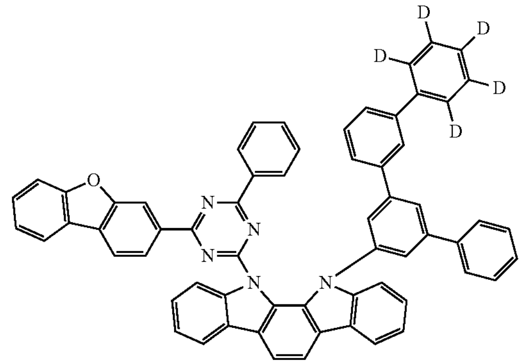
A85
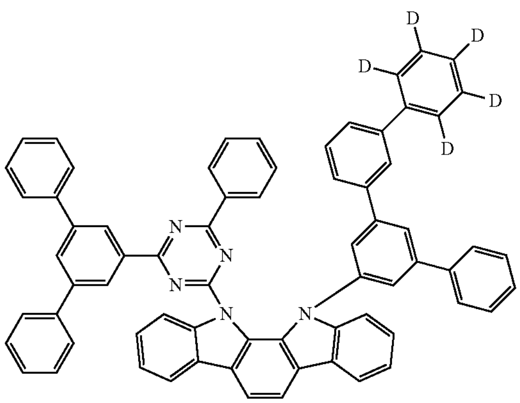
A86
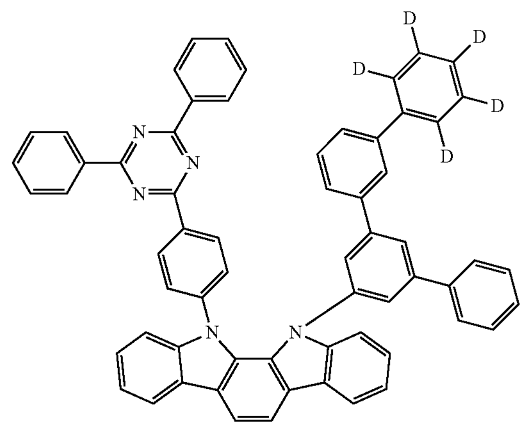
A87
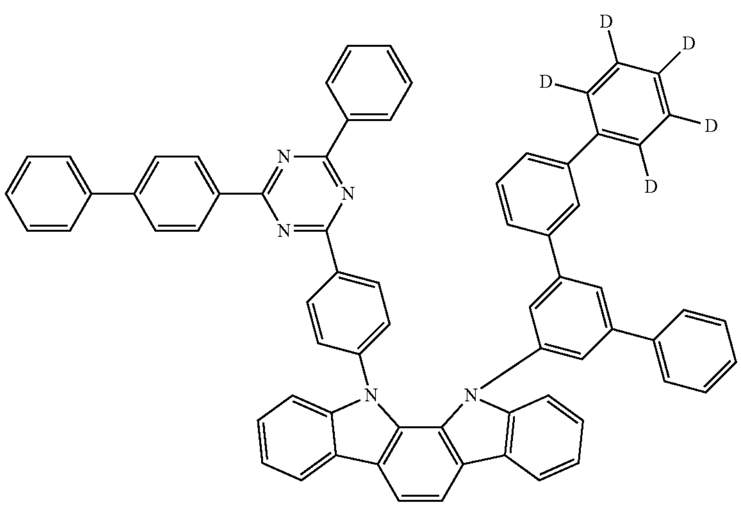

-continued
A88
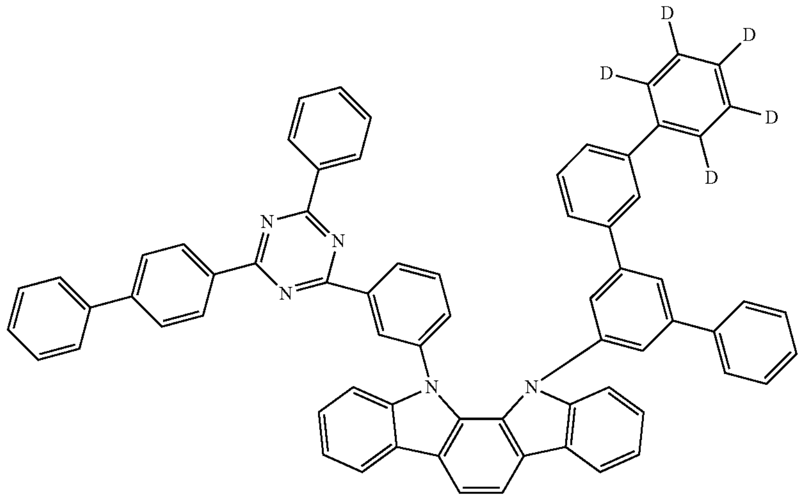
A89
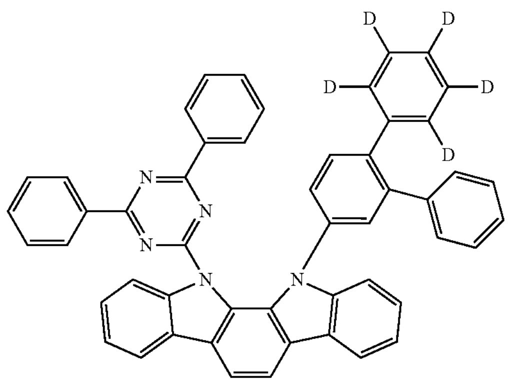
A90
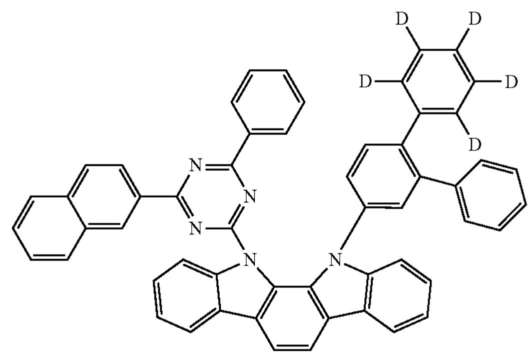
A91
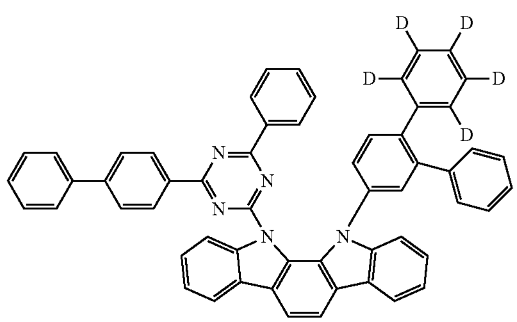
A92
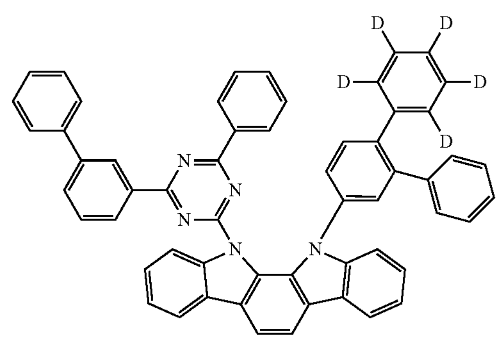
A93
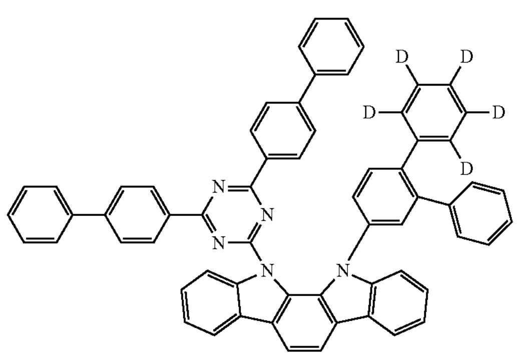
A94
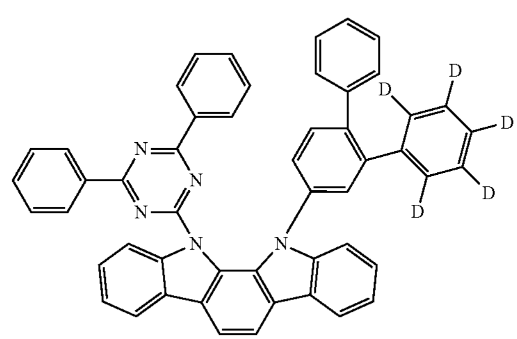

-continued
A95
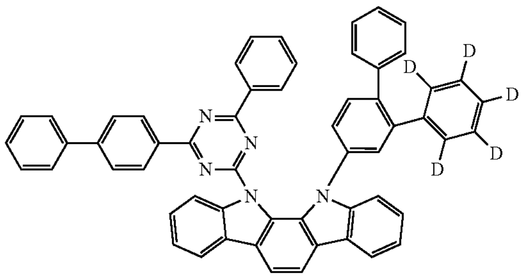
A96
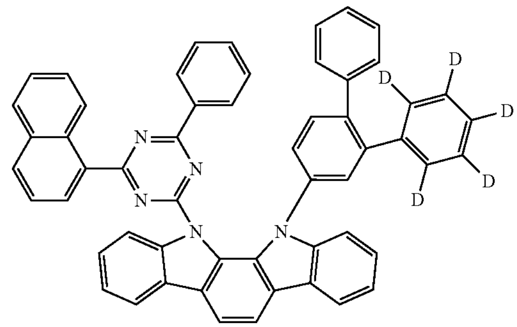
A97
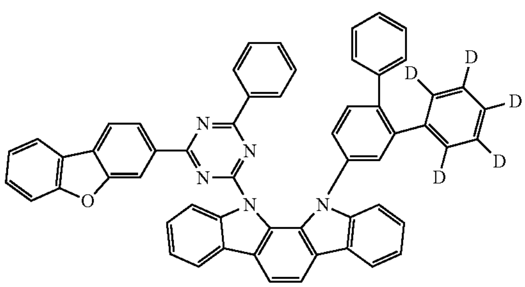
A98
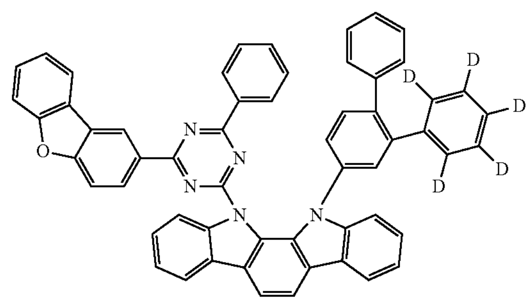
A99
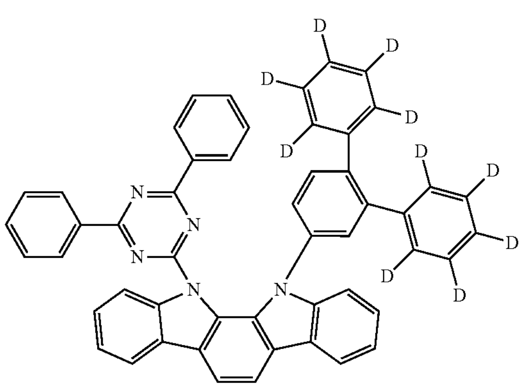
A100
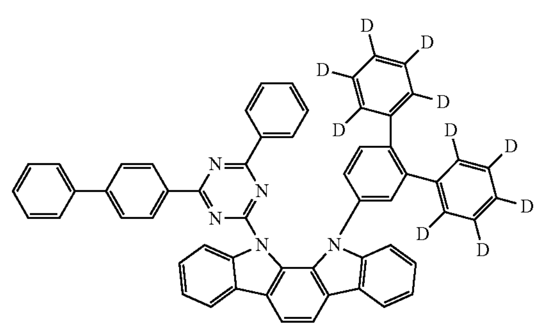
A101
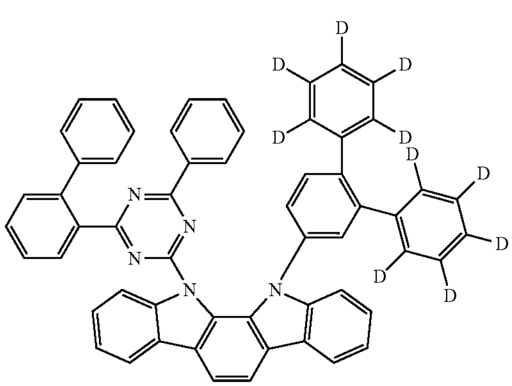
A102
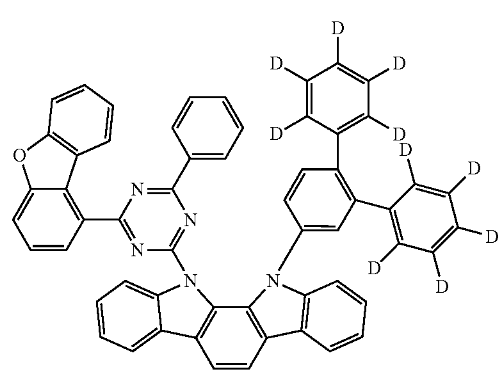

-continued
A103
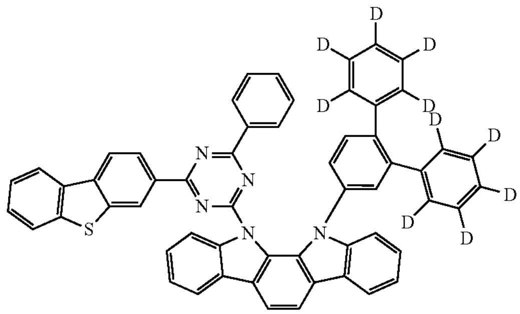
A104
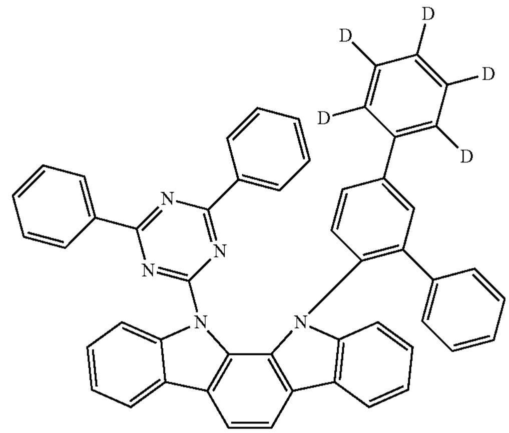
A105
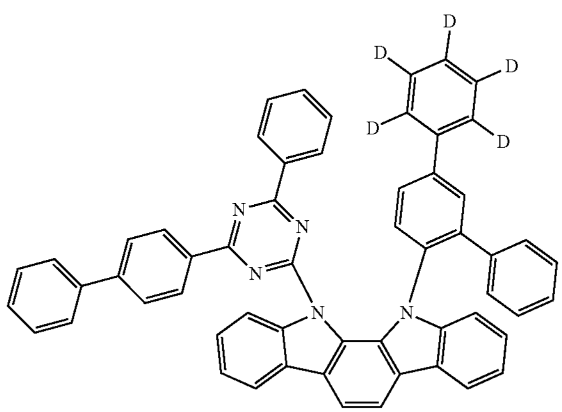
A106
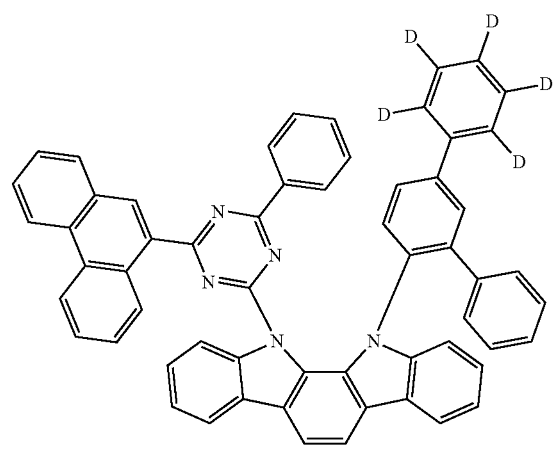
A107
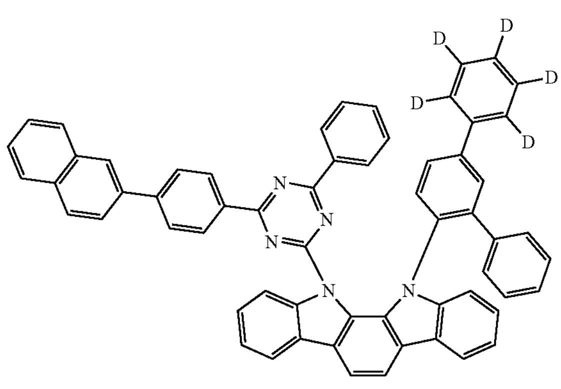
A108
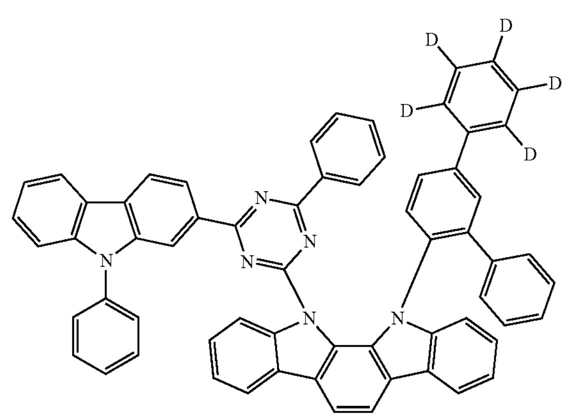

-continued
A109
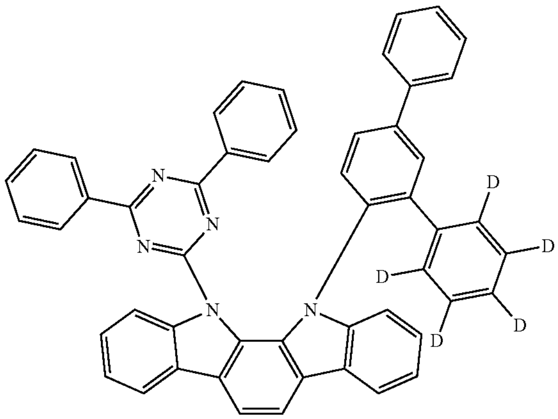
A110
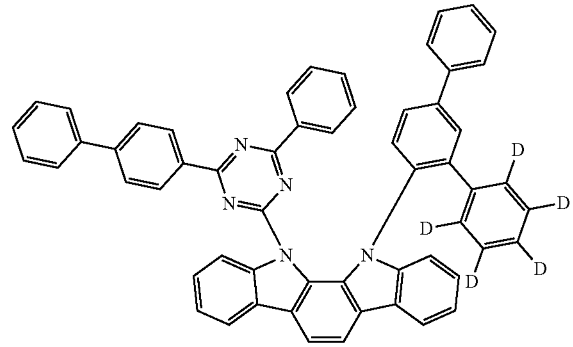
A111
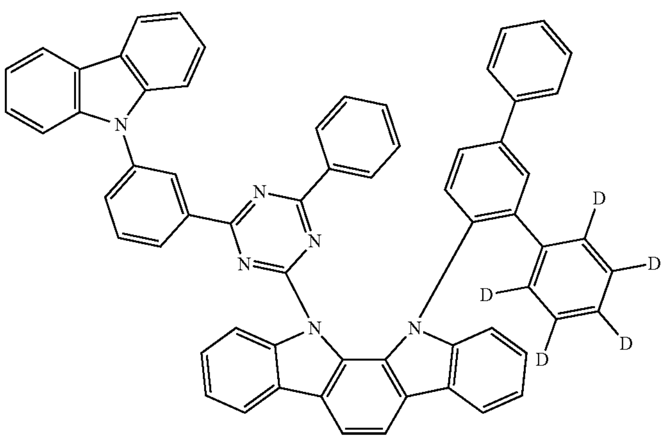
A112
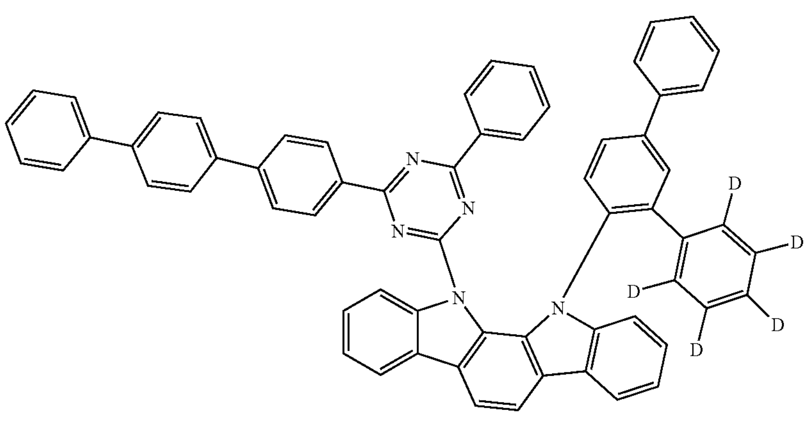

-continued
A113
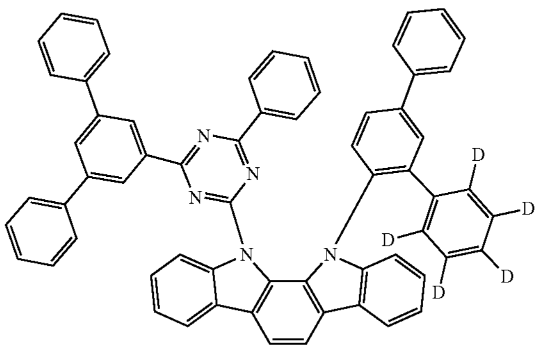
A114
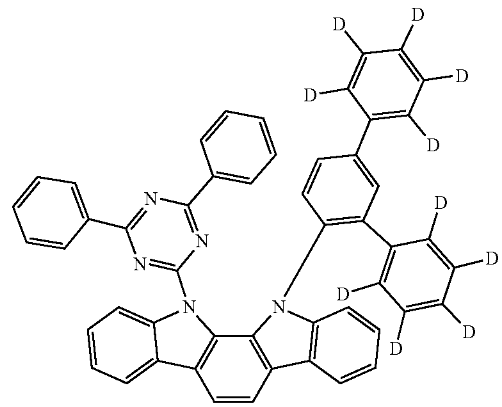
A115
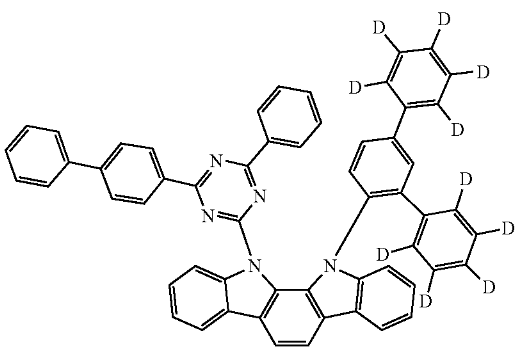
A116
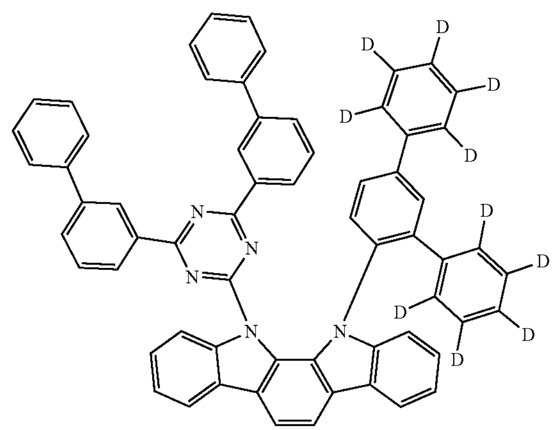
A117
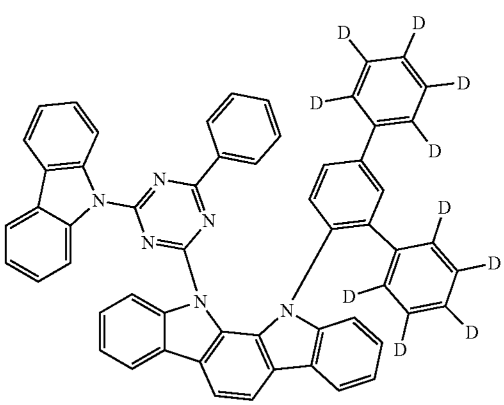
A118
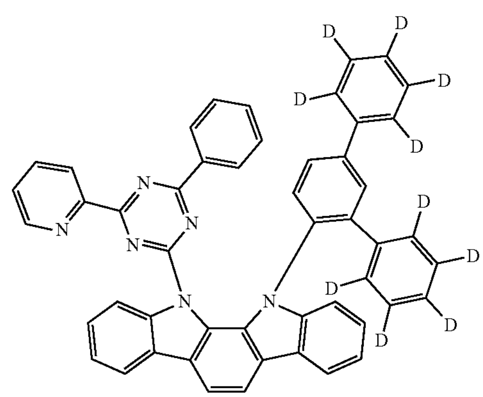

-continued
A119
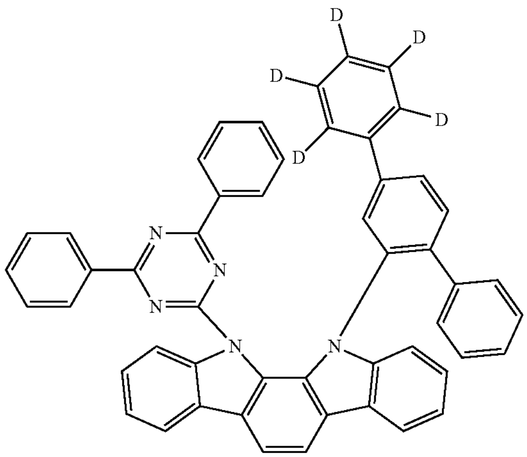
A120
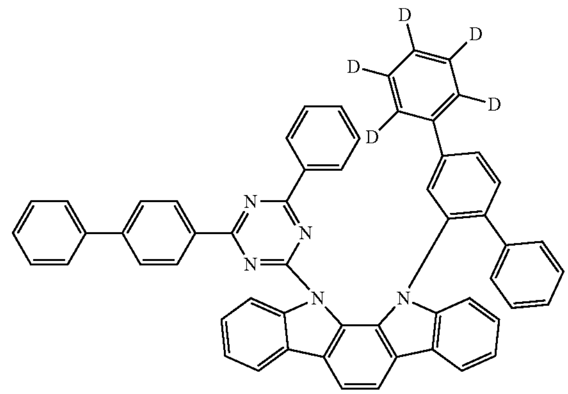
A121
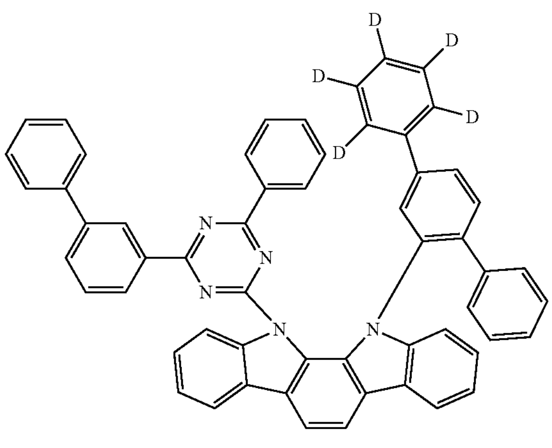
A122
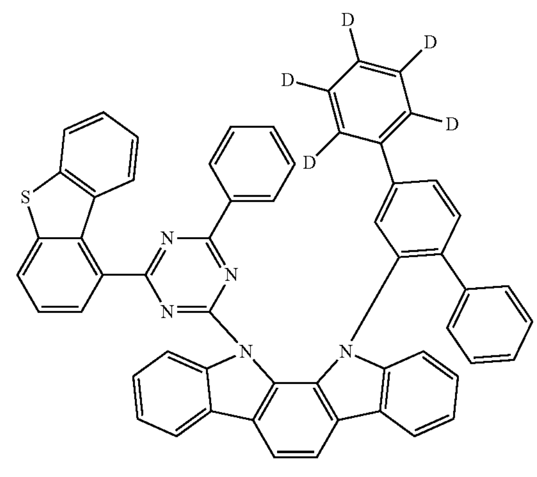
A123
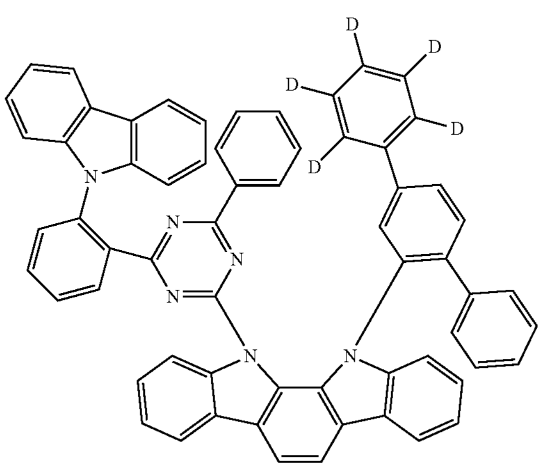
A124
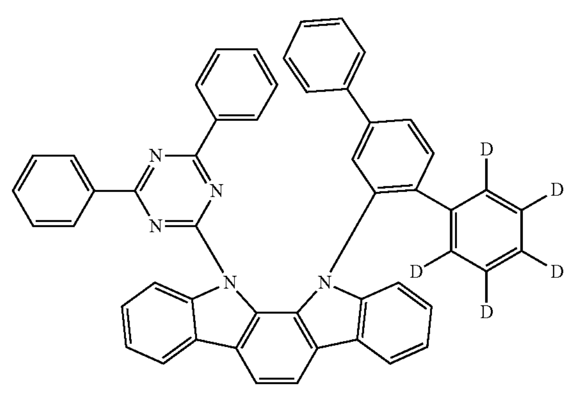

-continued
A125
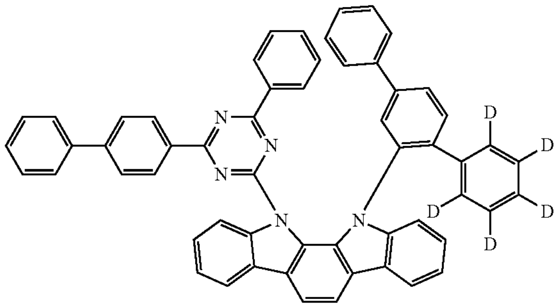
A126
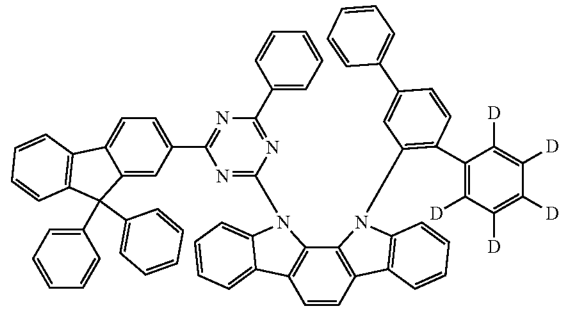
A127
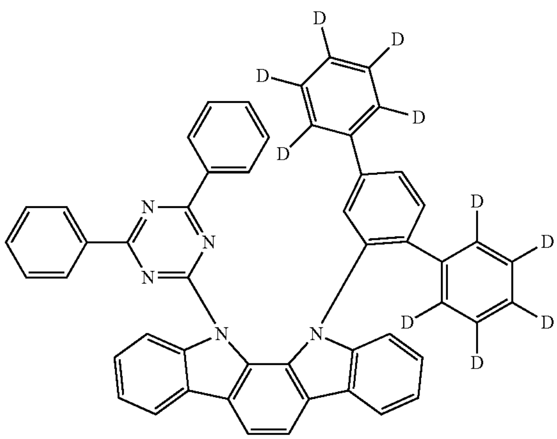
A128
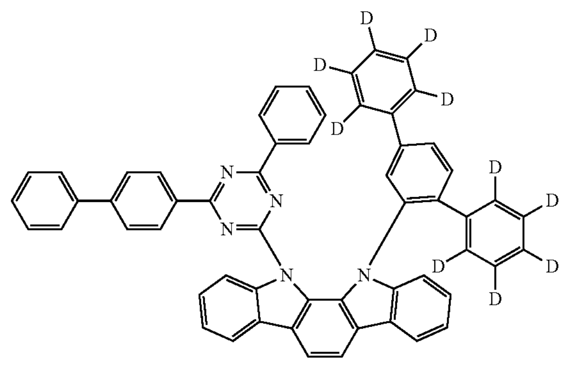
A129
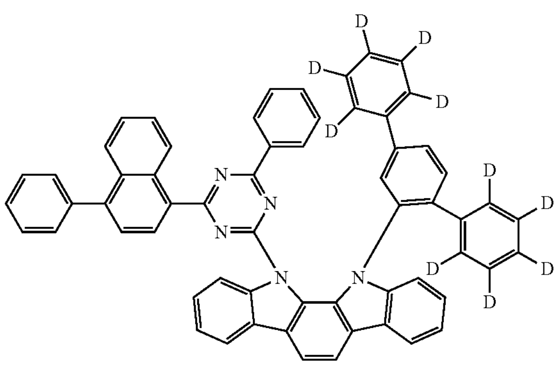
A130
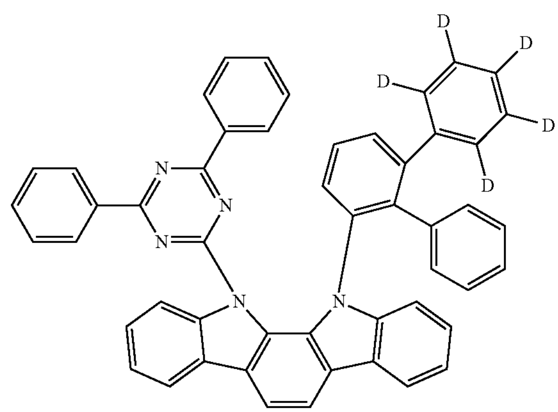
A131
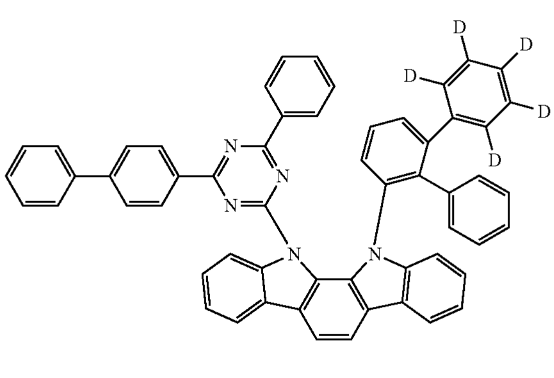
A132
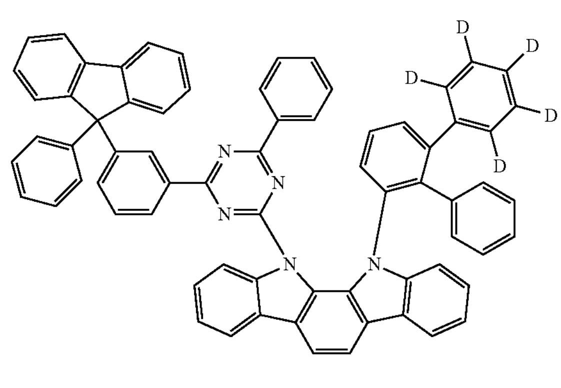

-continued
A133
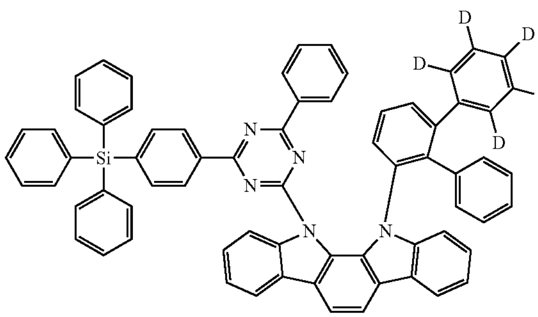
A134
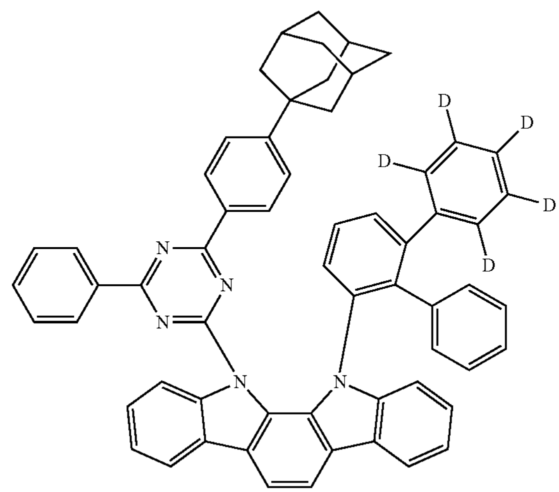
A135
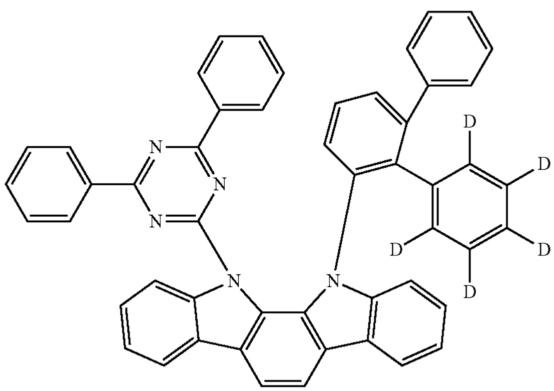
A136
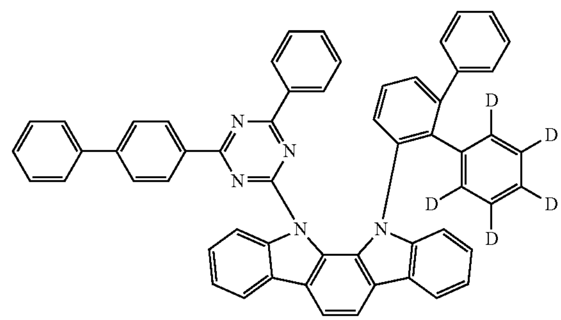
A137
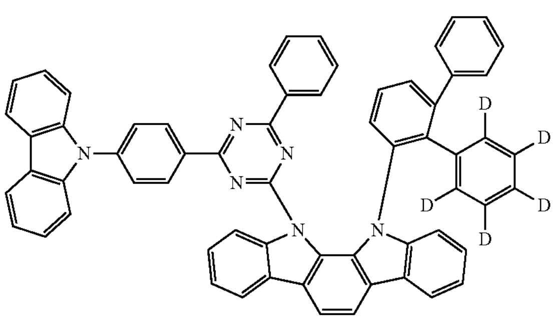
A138
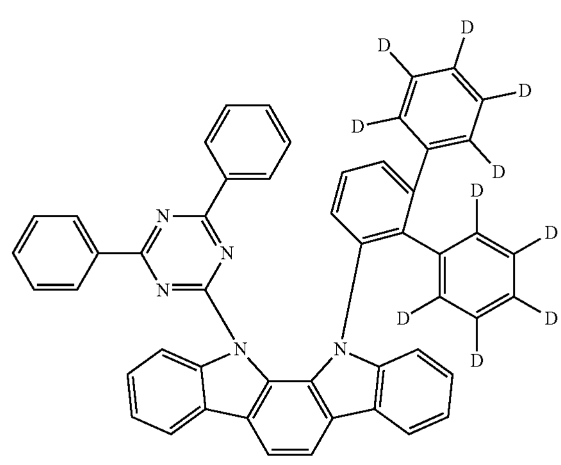

-continued
A139
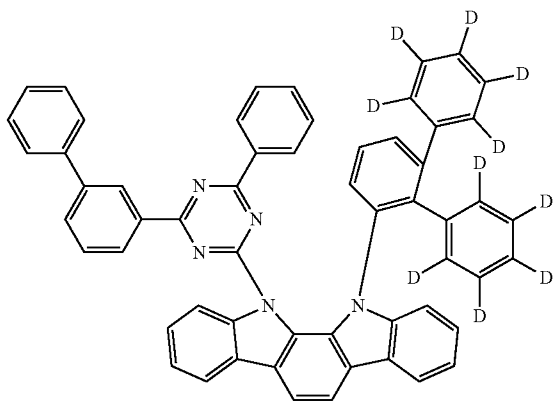
A140
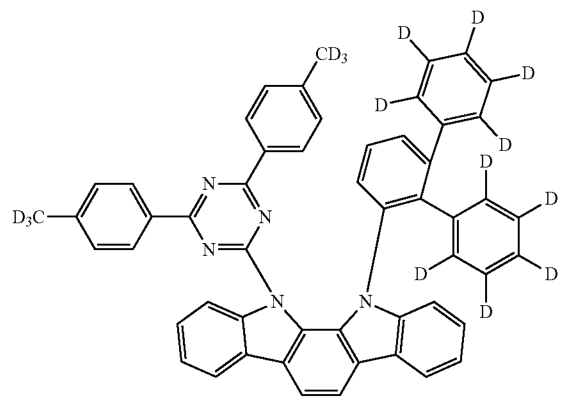
A141
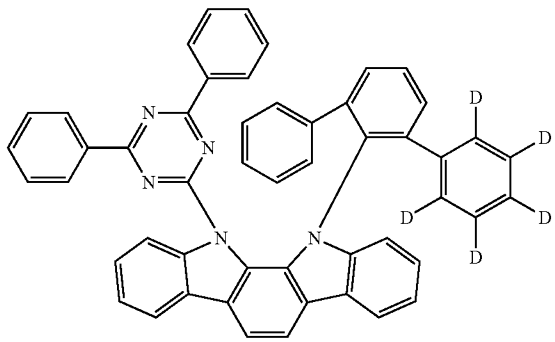
A142
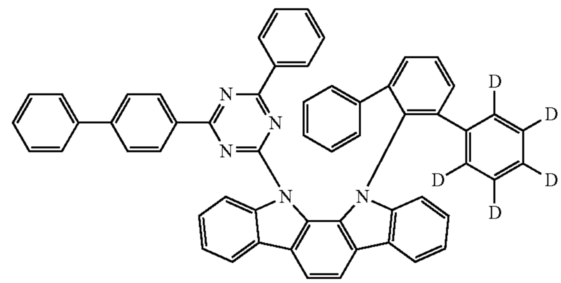
A143
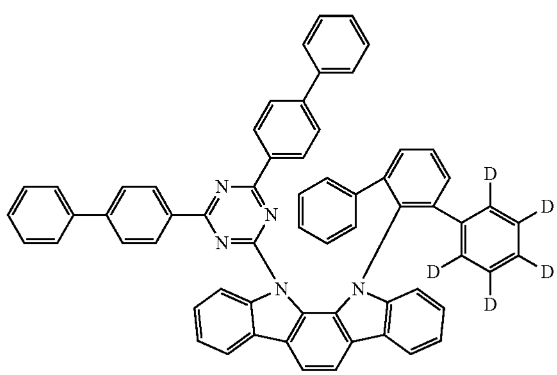
A144
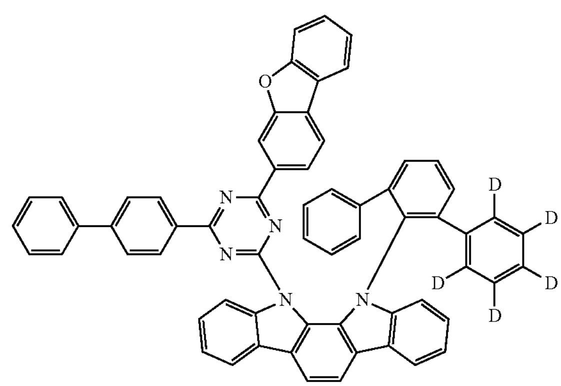
A145
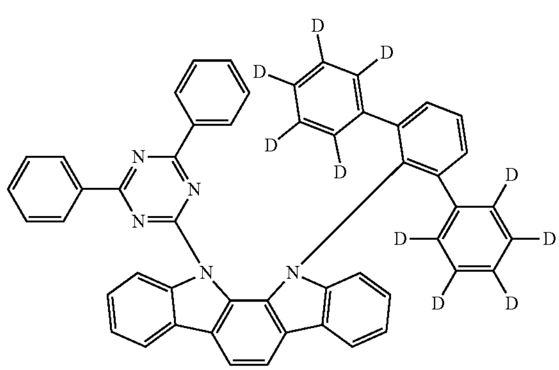
A146
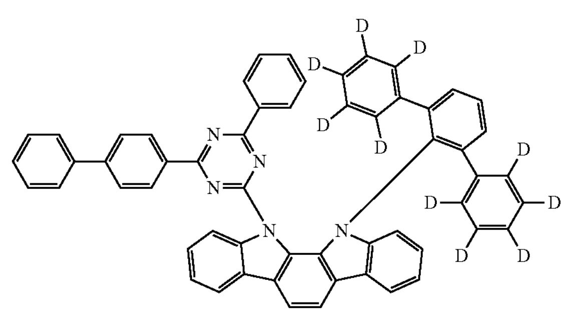

-continued
A147
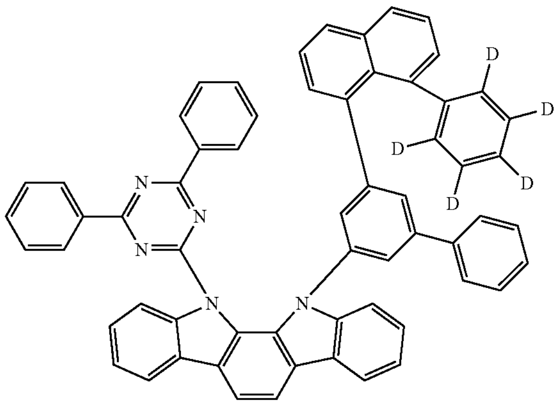
A148
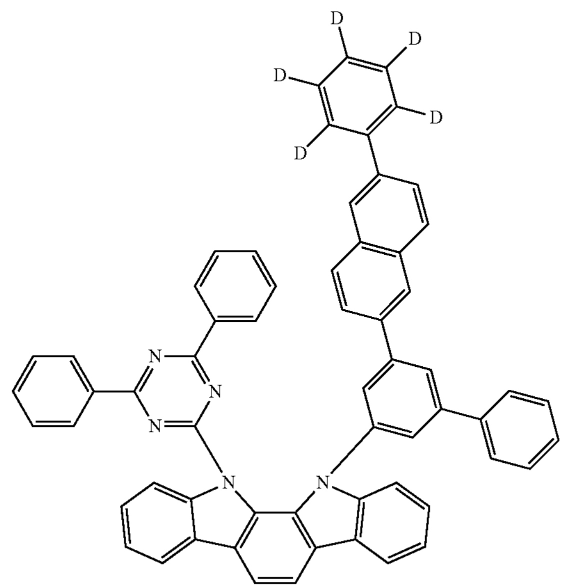
A149
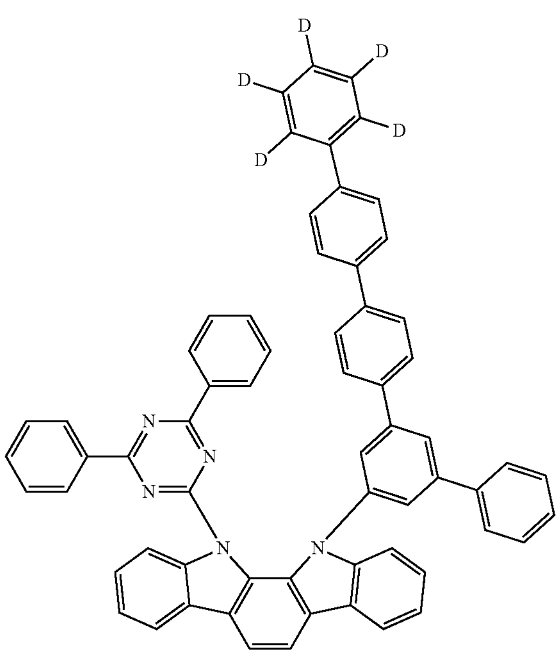
A150
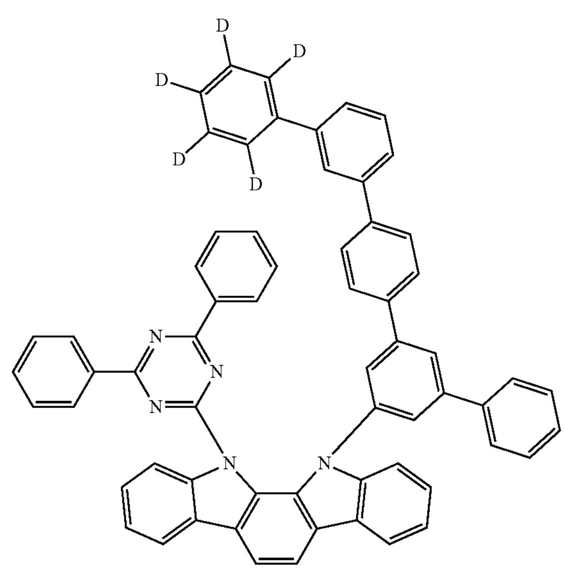

-continued
A151
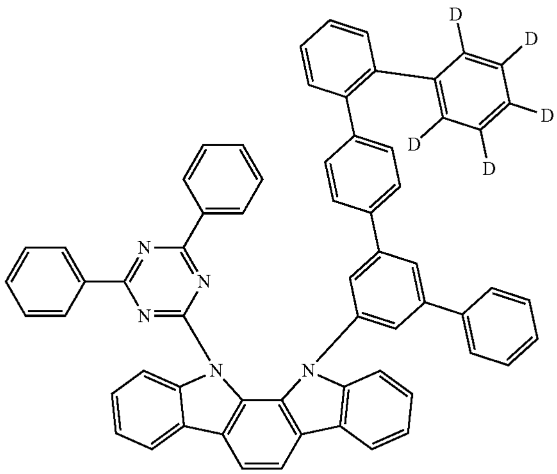
B1
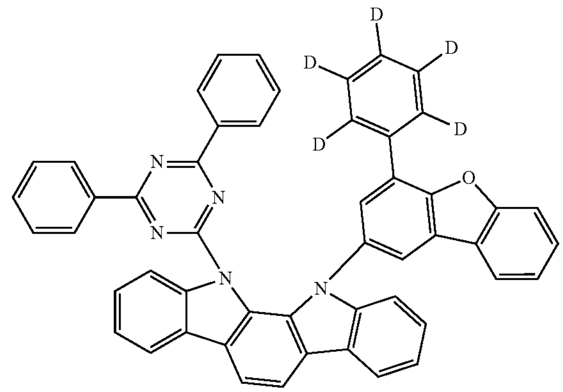
B2
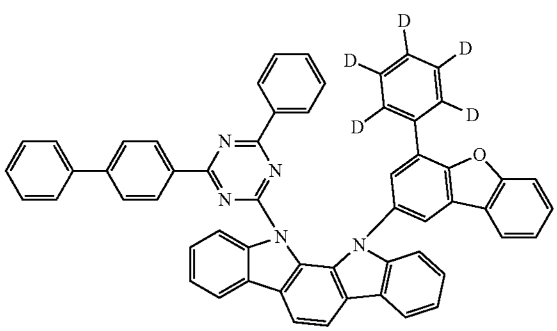
B3
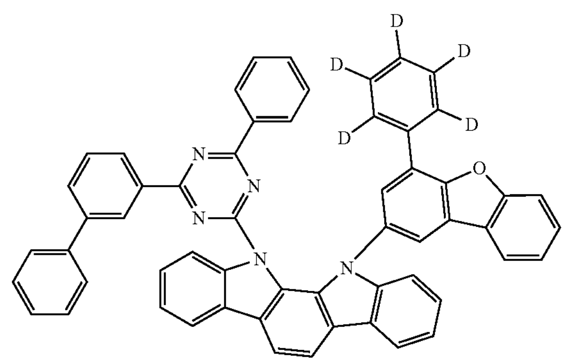
B4
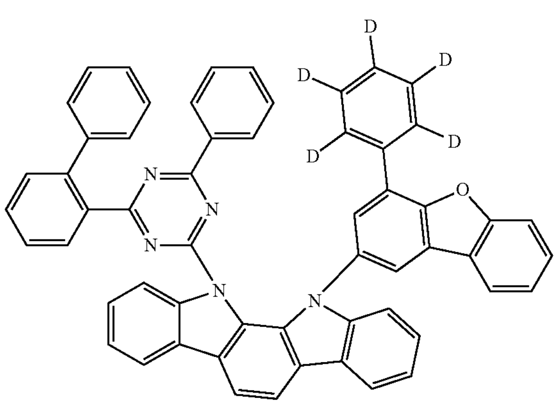
B5
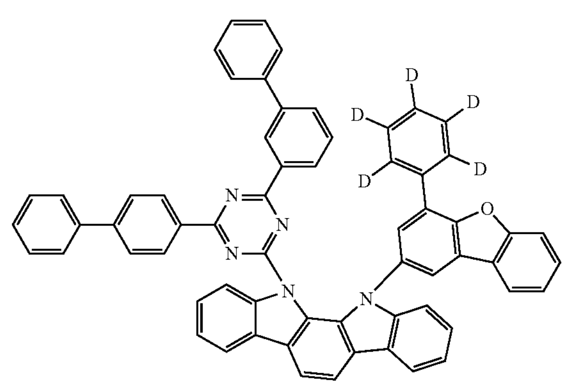

-continued
B6
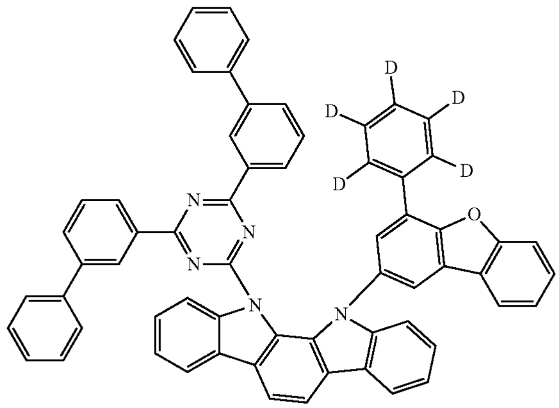
B7
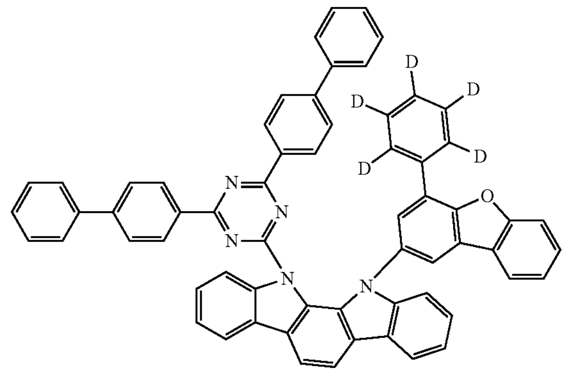
B8
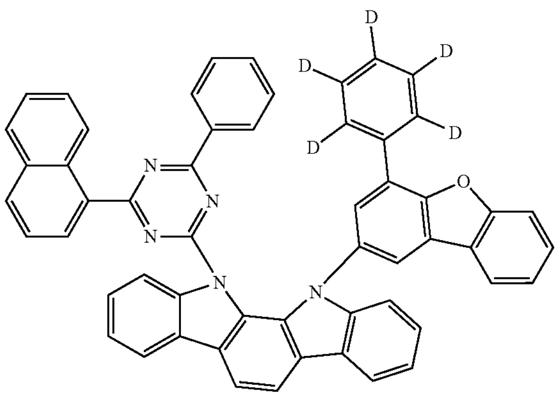
B9
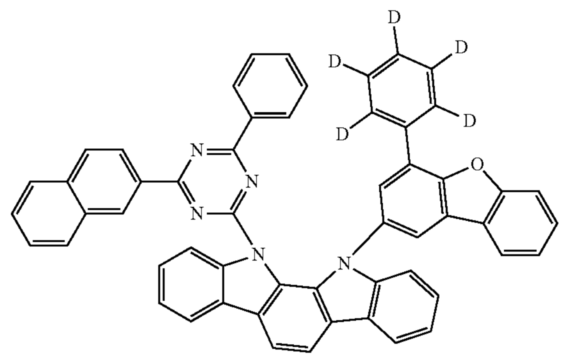
B10
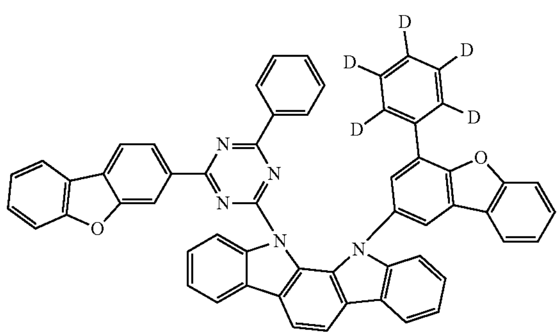
B11
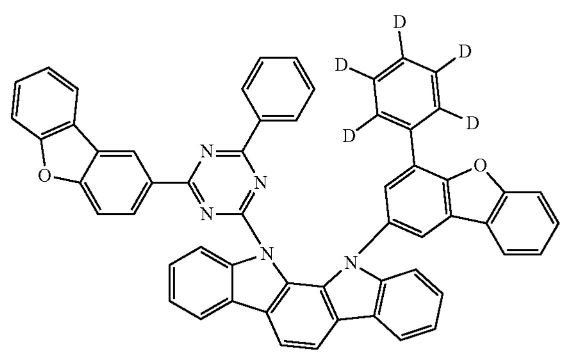
B12
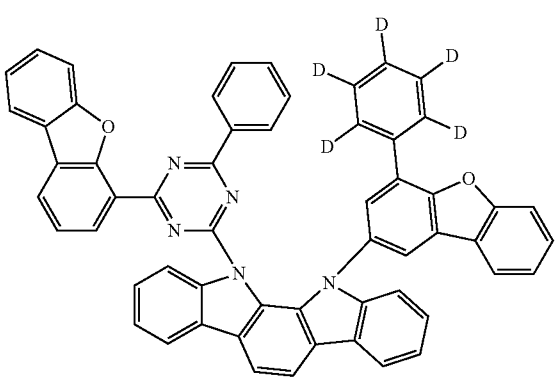
B13
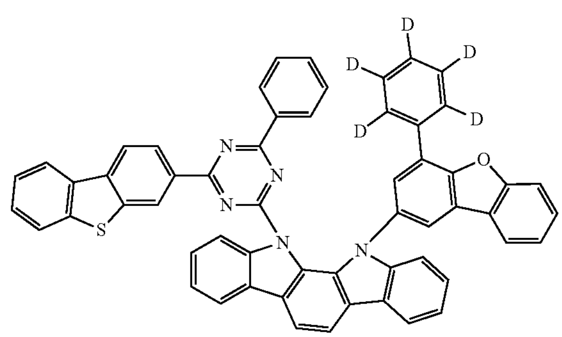

-continued
B14
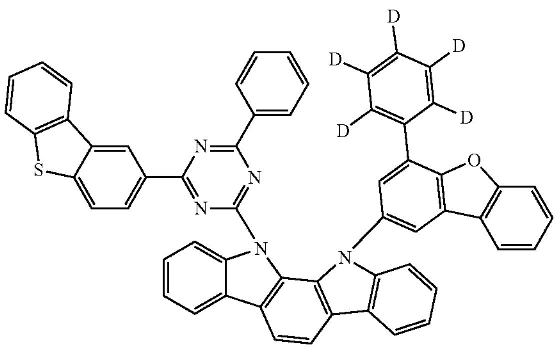
B15
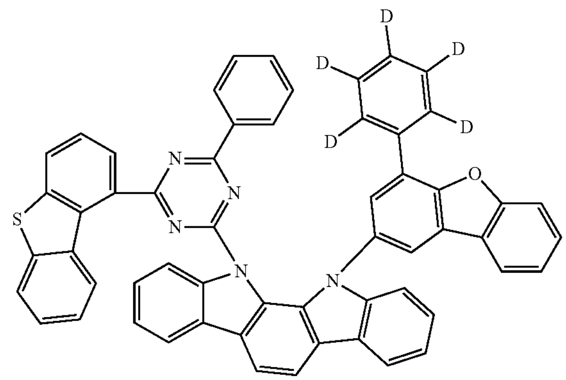
B16
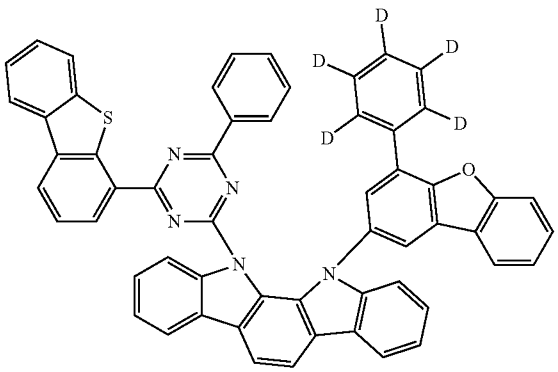
B17
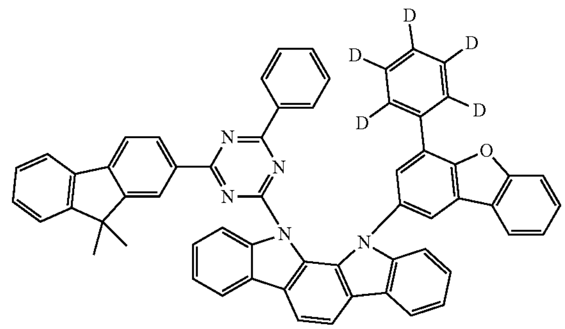
B18
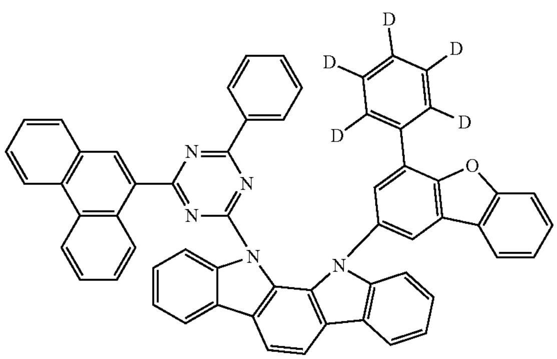
B19
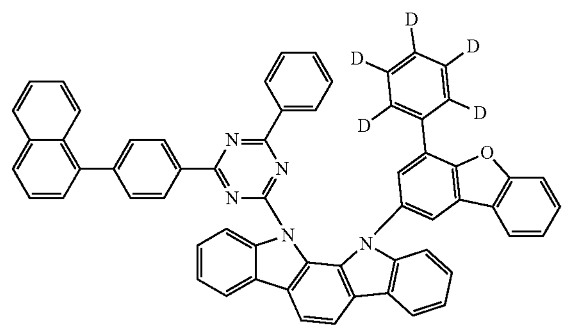
B20
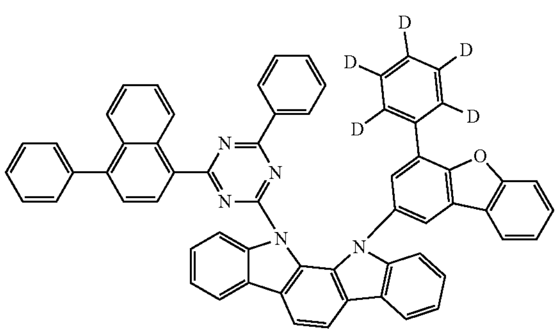
B21
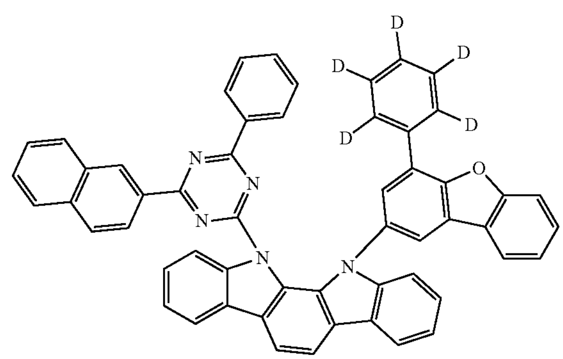

-continued
B22
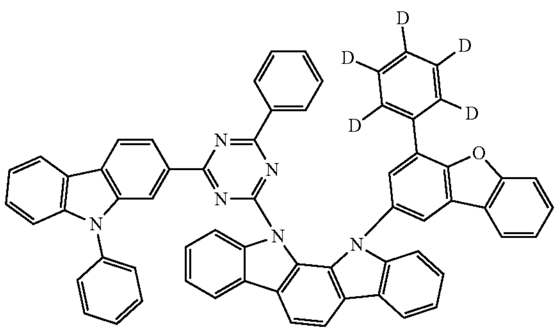
B23
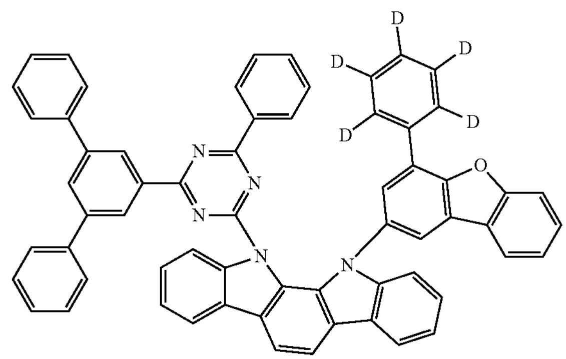
B24
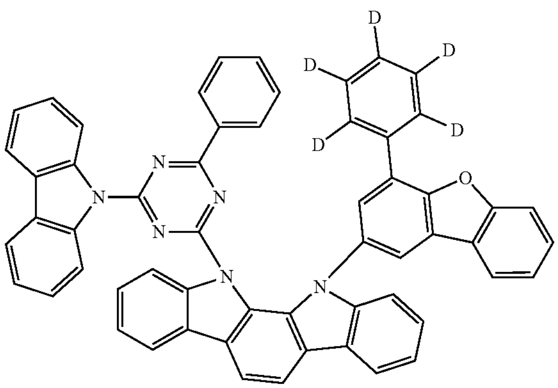
B25
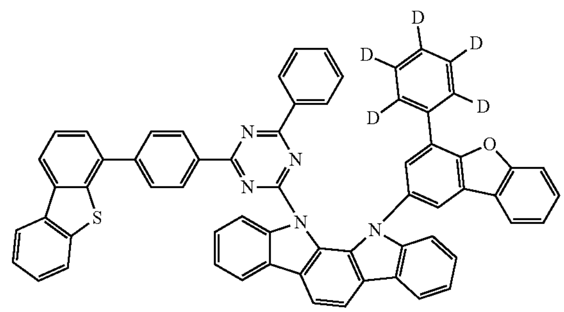
B26
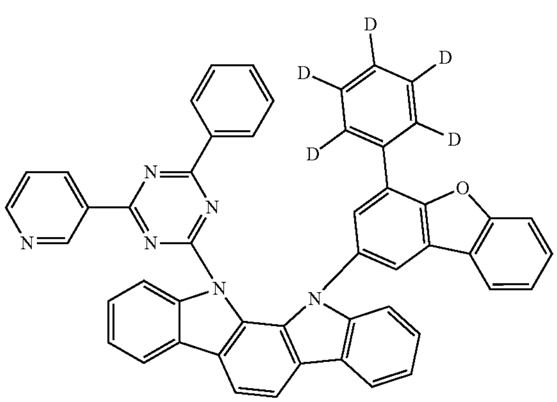
B27
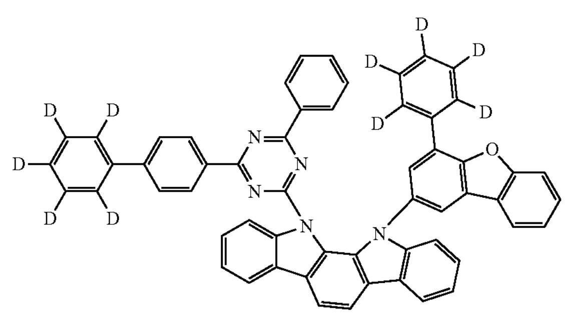
B28
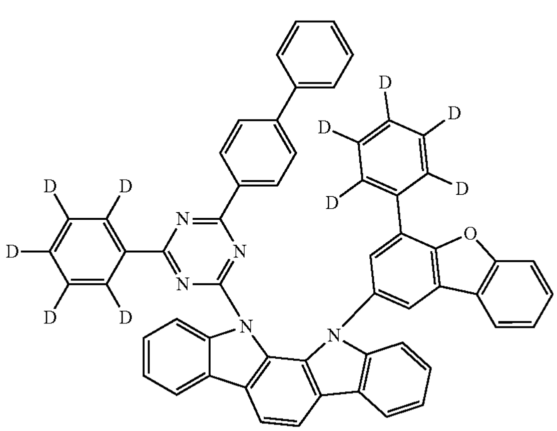
B29
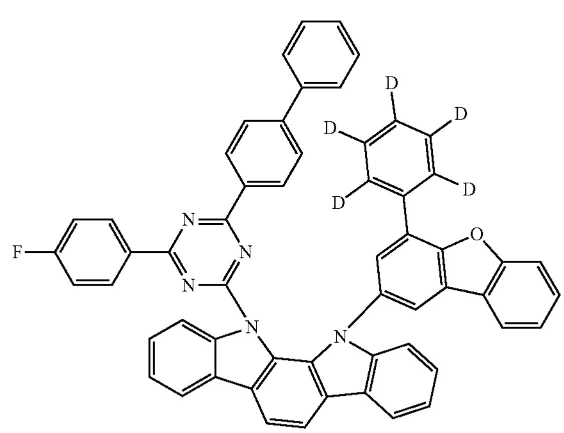

-continued
B30
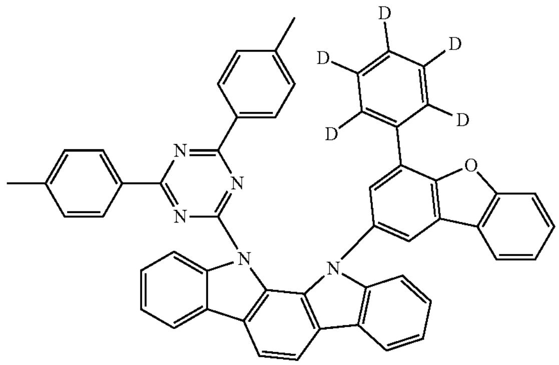
B31
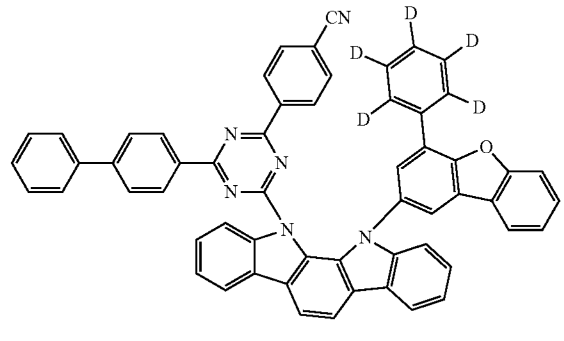
B32
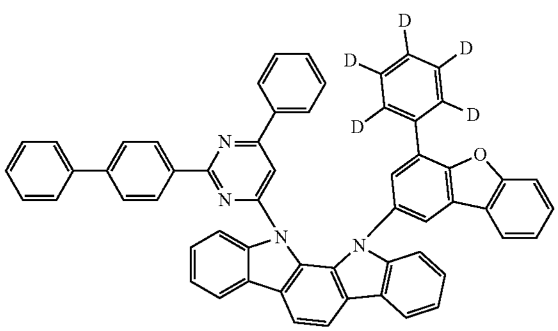
B33
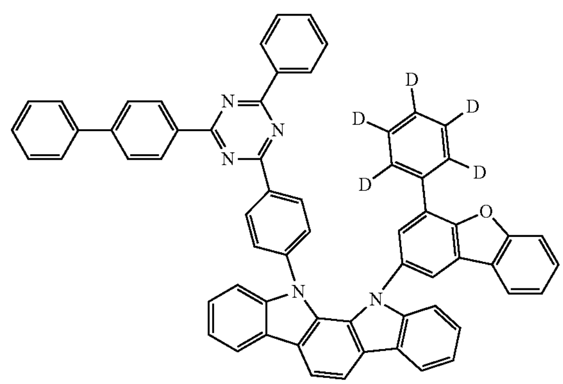
B34
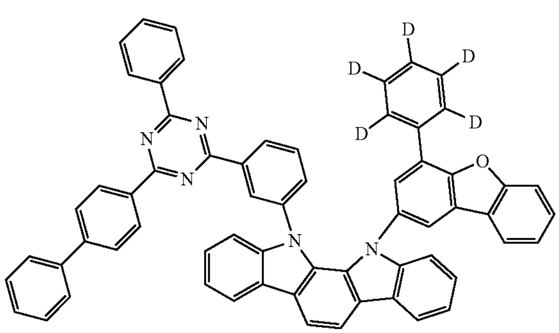
B35
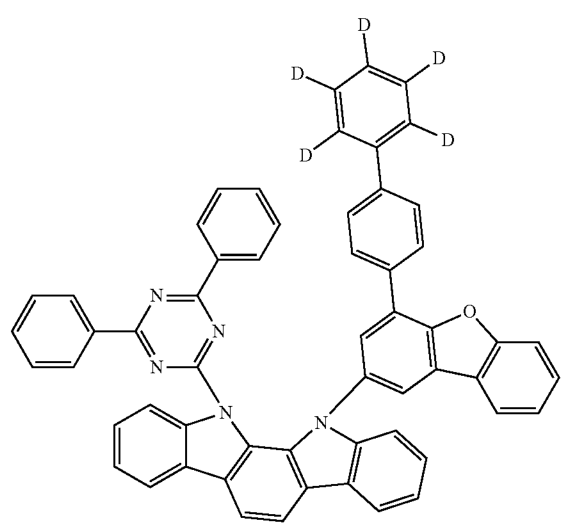

-continued
B36
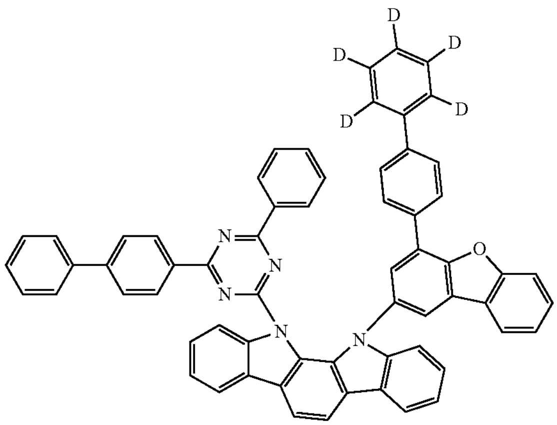
B37
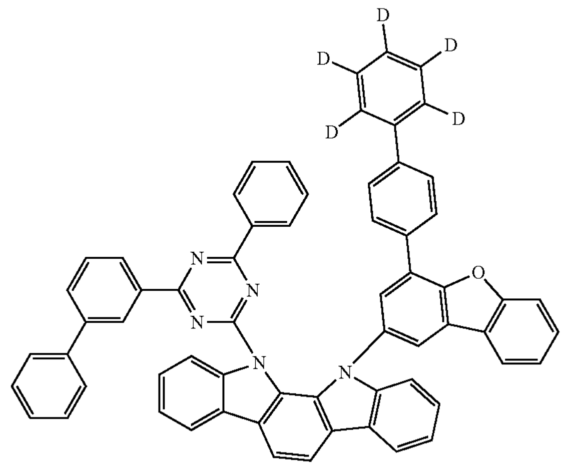
B38
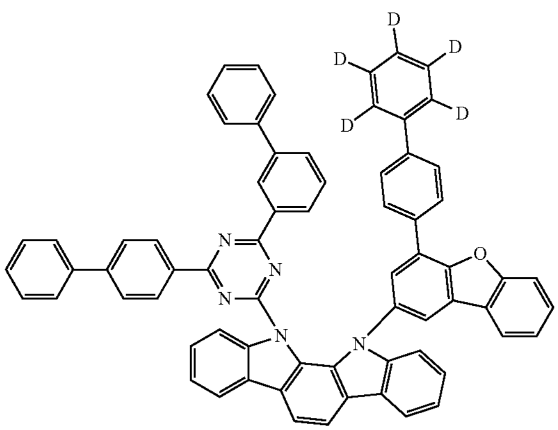
B39
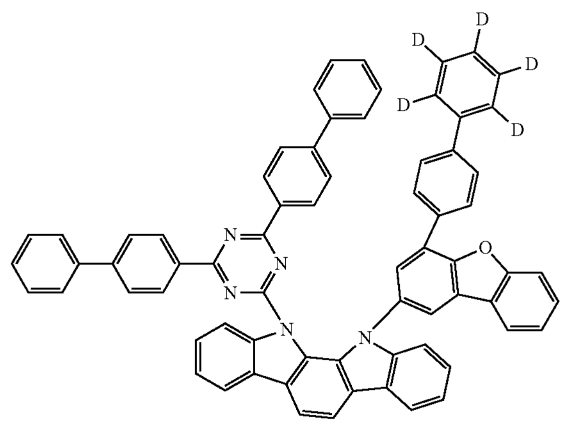
B40
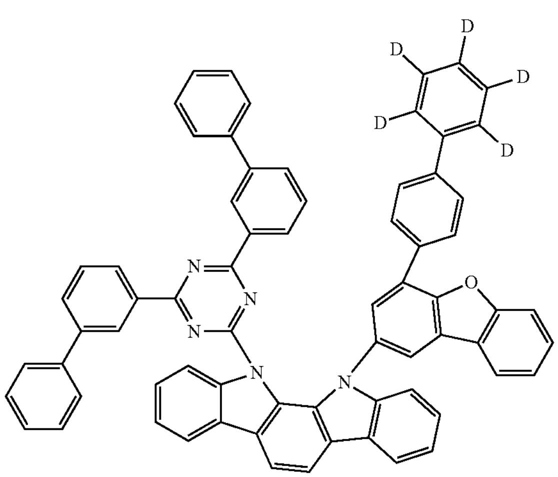
B41
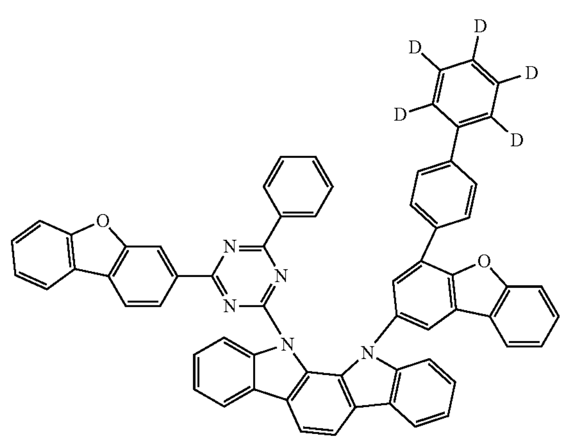

-continued
B42
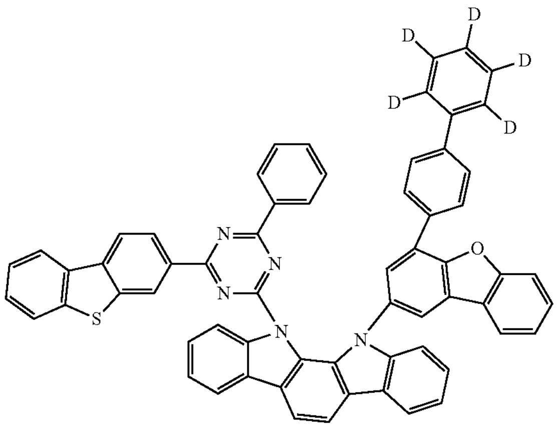
B43
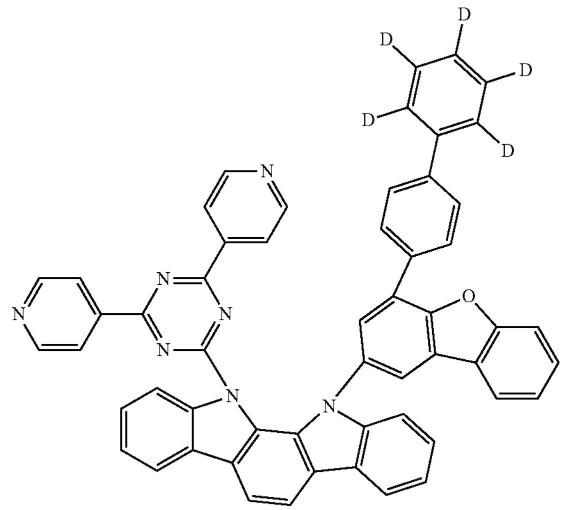
B44
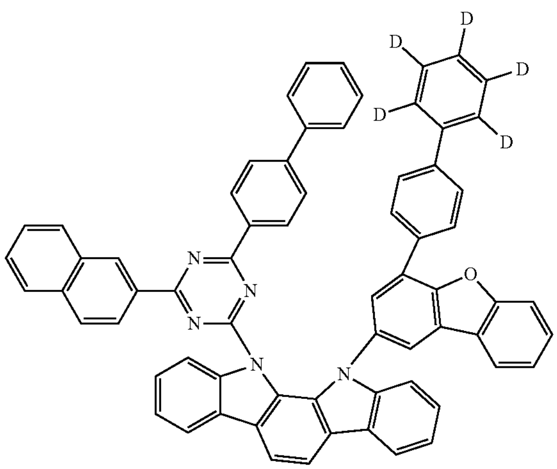
B45
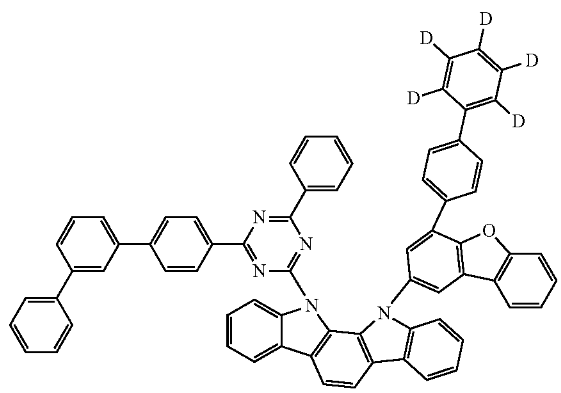
B46
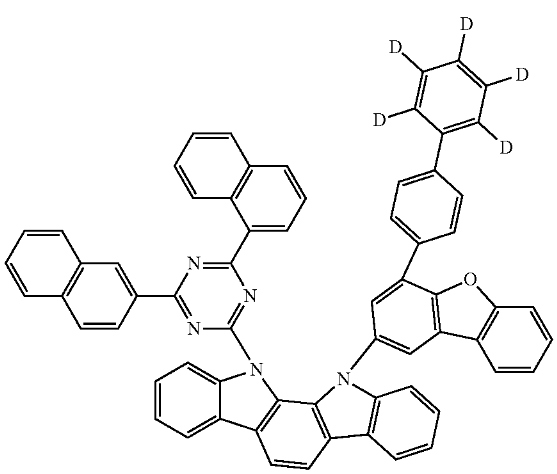
B47
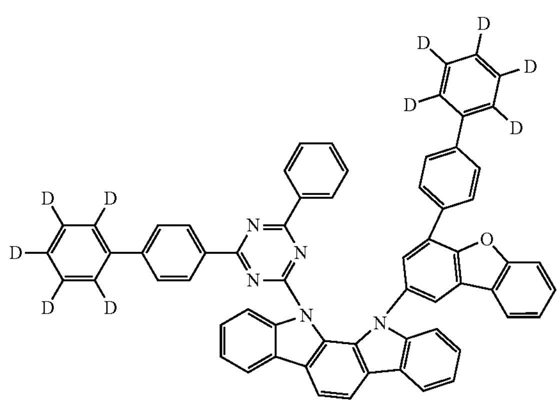

-continued
B48
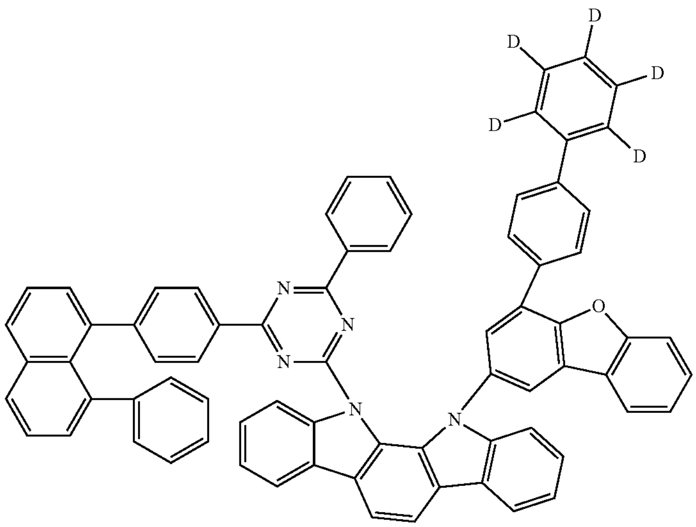
B49
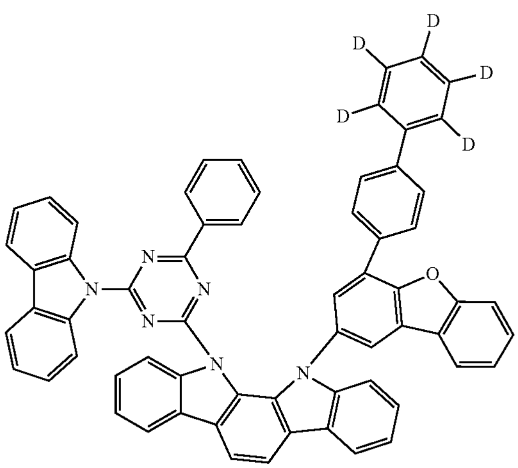
B50
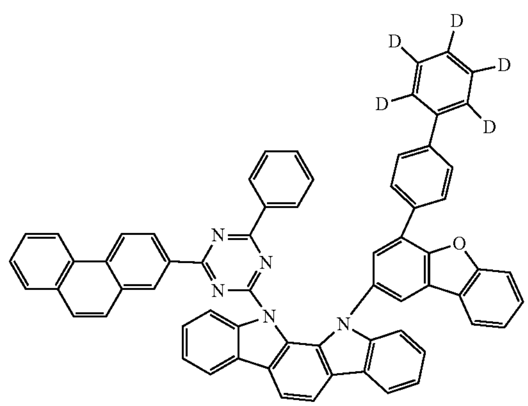
B51
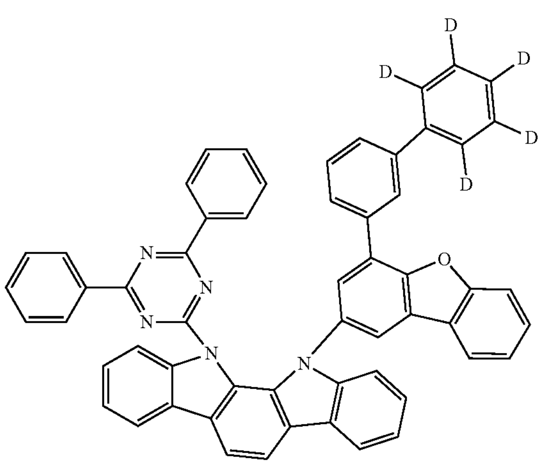
B52
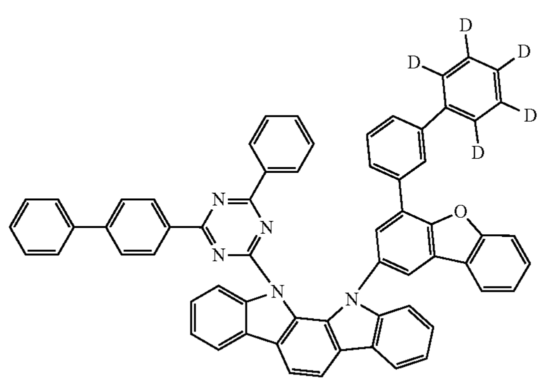

-continued
B53
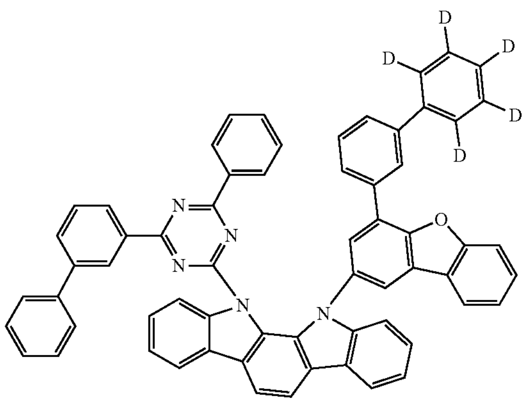
B54
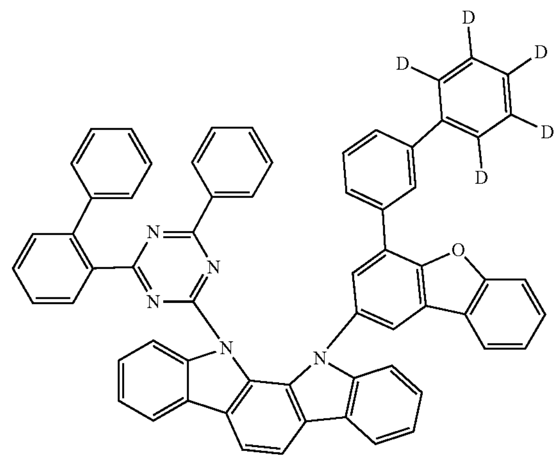
B55
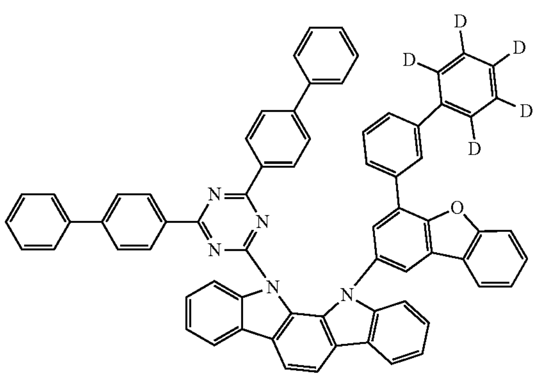
B56
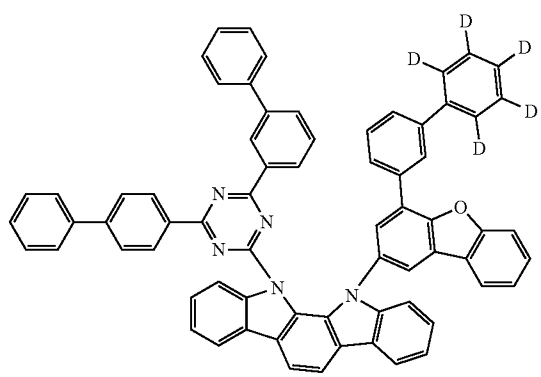
B57
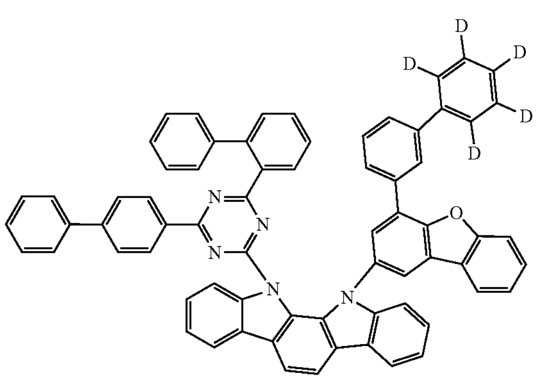
B58
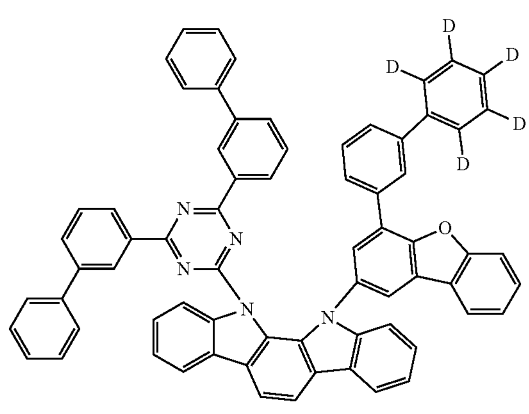

-continued
B59
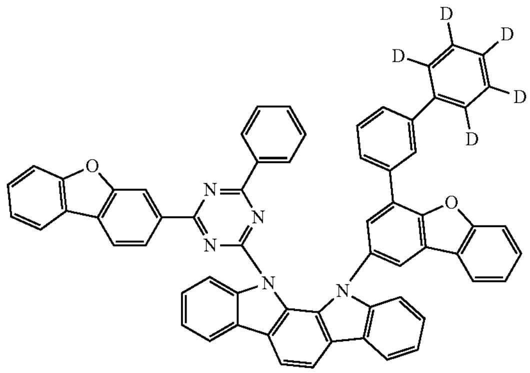
B60
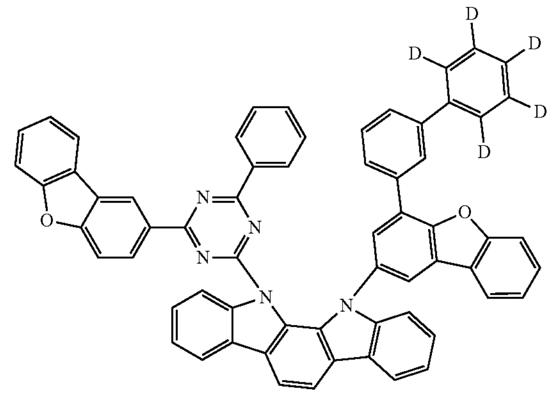
B61
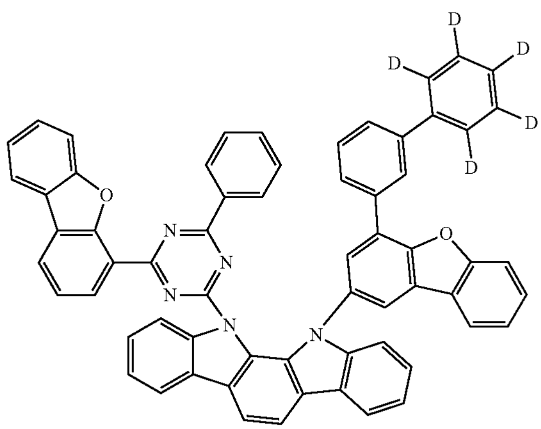
B62
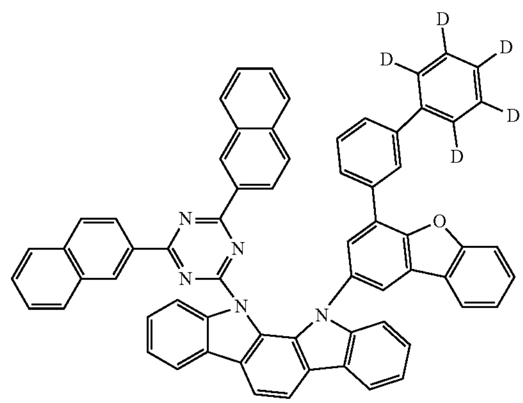
B63
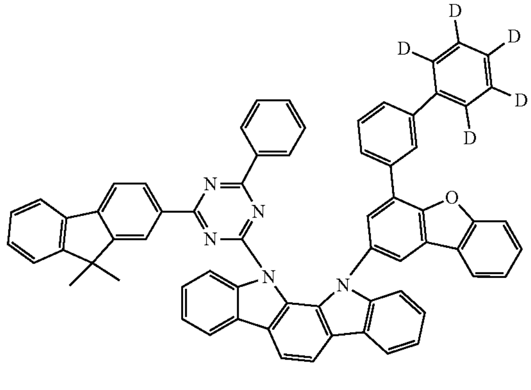
B64
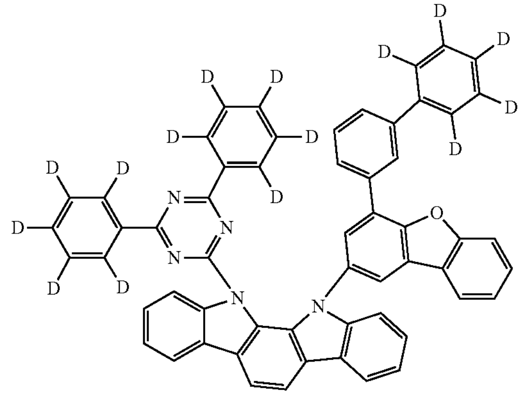

-continued
B65
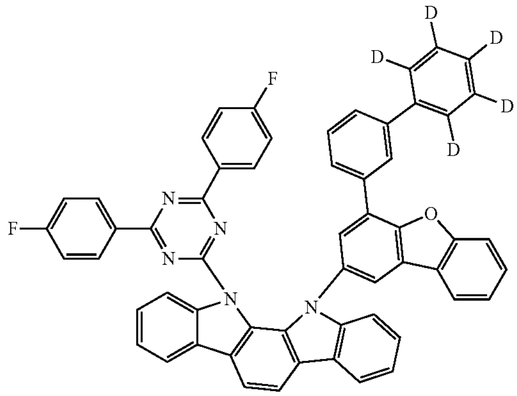
B66
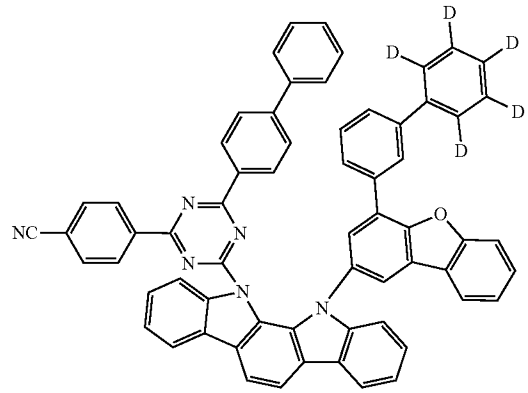
B67
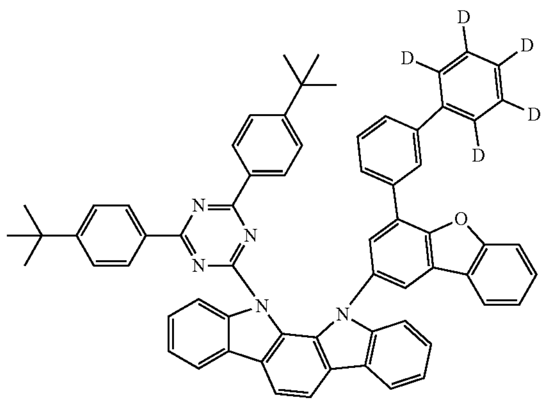
B68
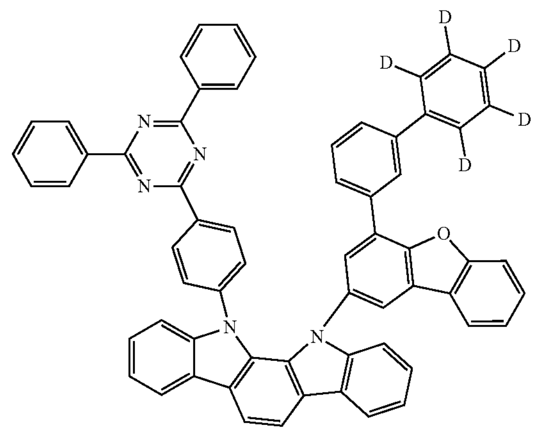
B69
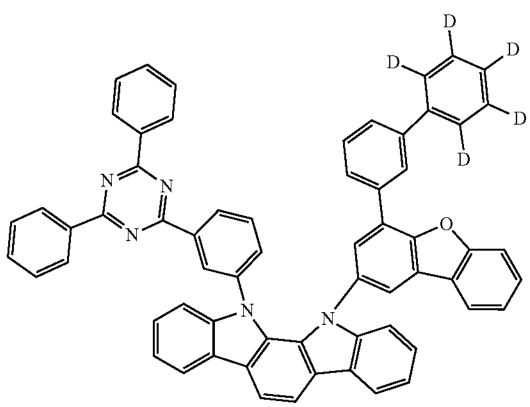
B70
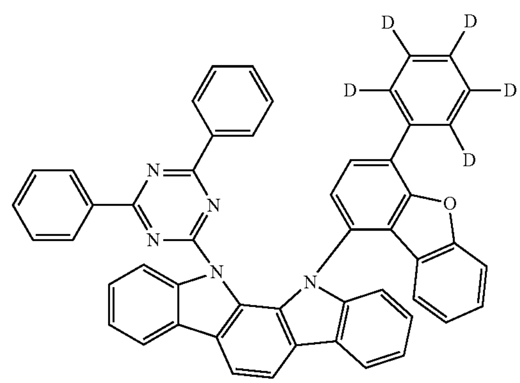
B71
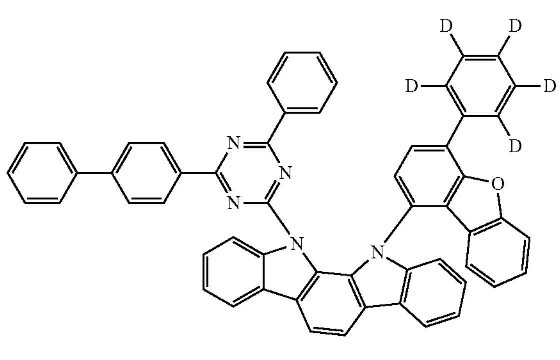
B72
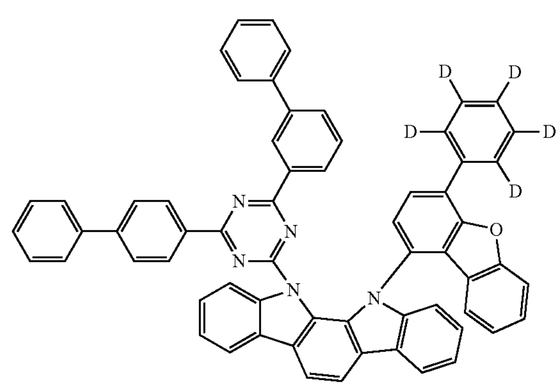

-continued
B73
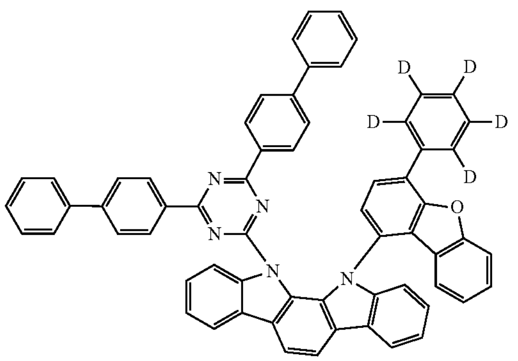
B74
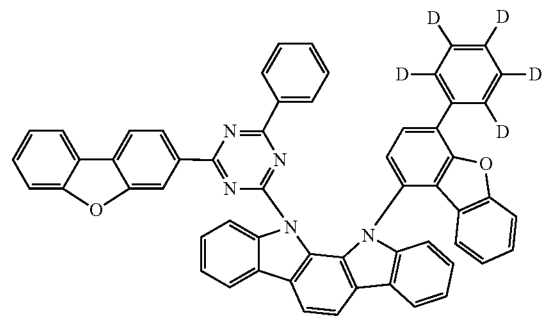
B75
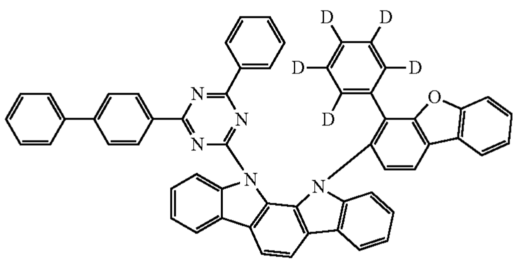
B76
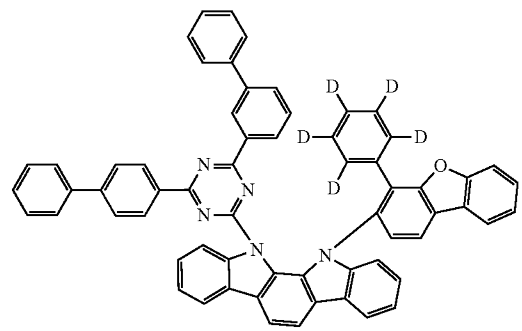
B77
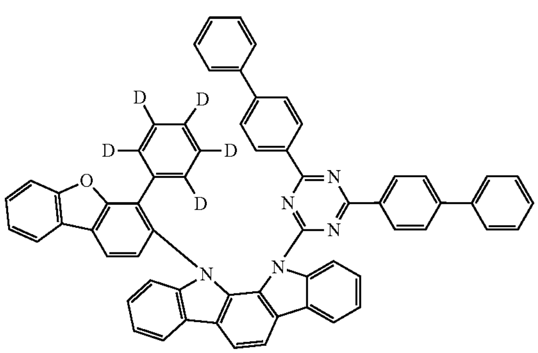
B78
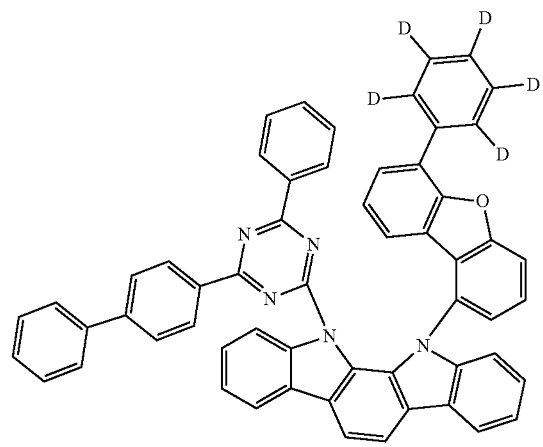
B79
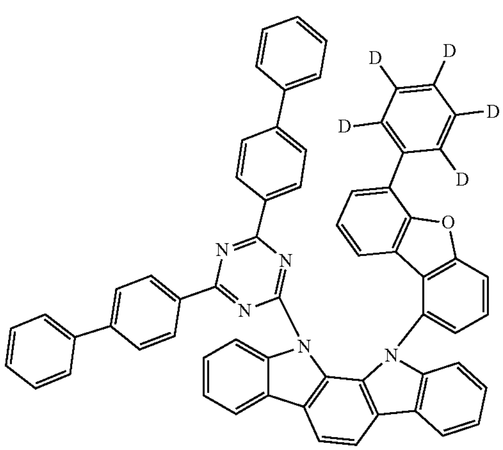
B80
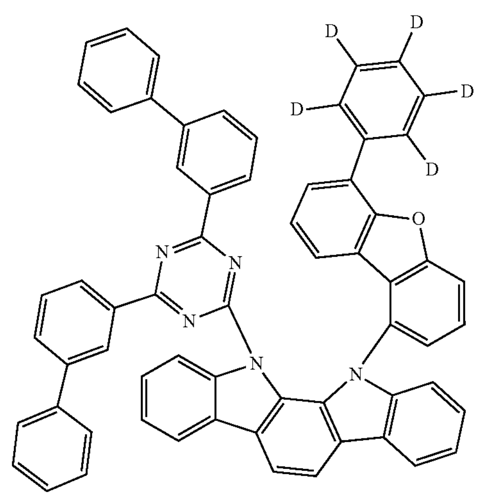

-continued
B81
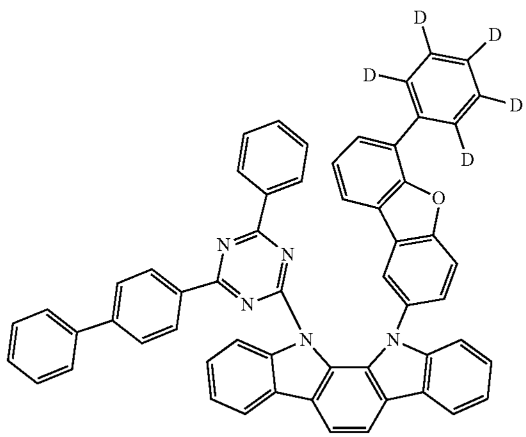
B82
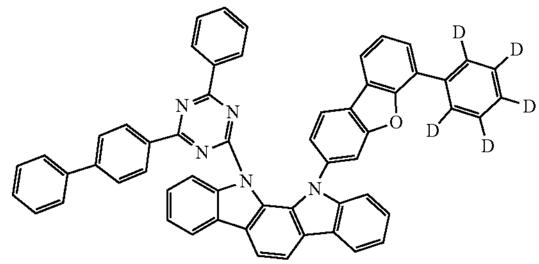
B83
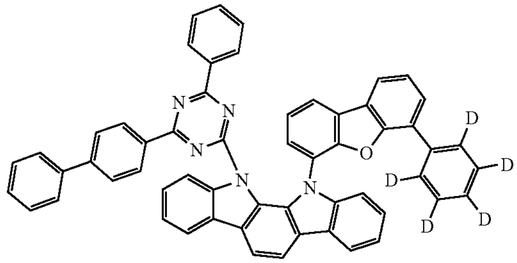
B84
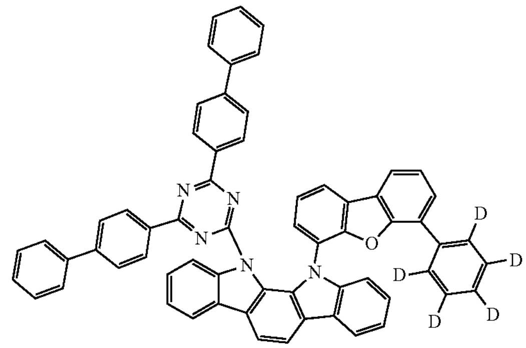
B85
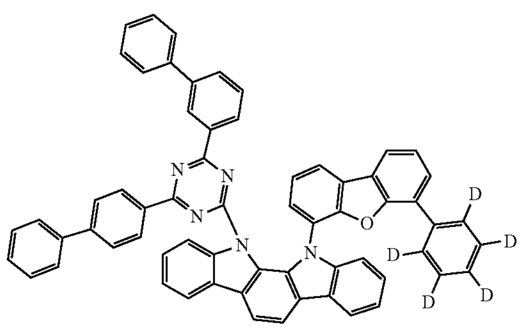
B86
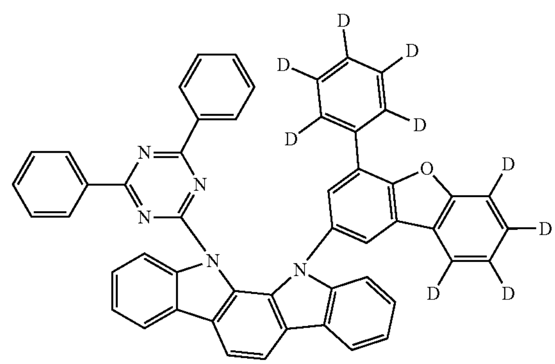
B87
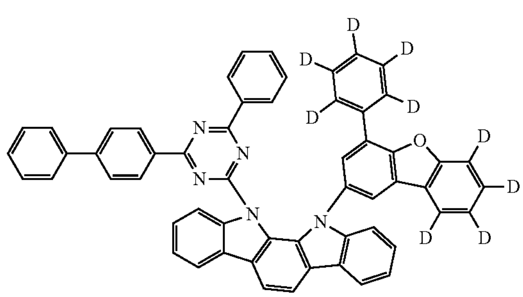
B88
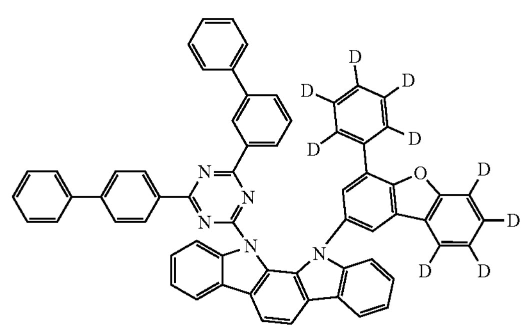

-continued
B89
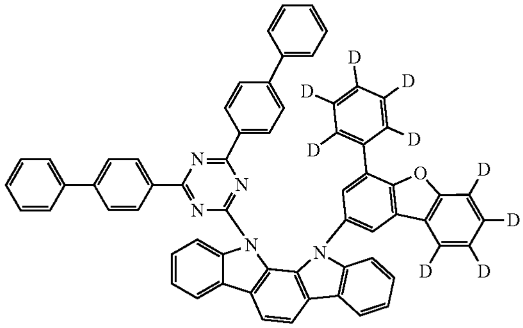
B90
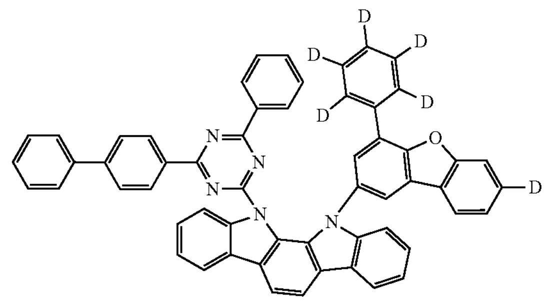
B91
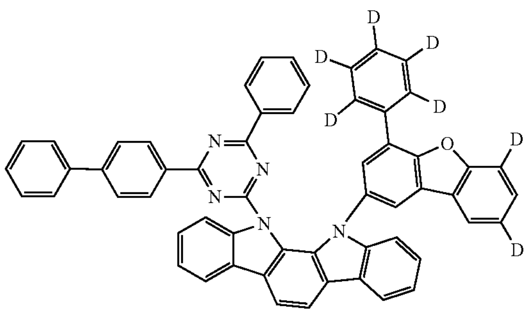
B92
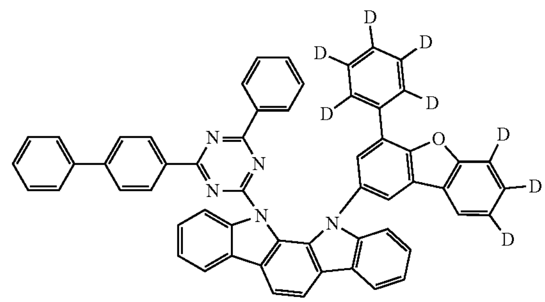
B93
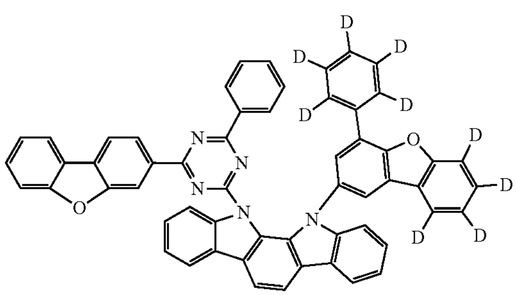
B94
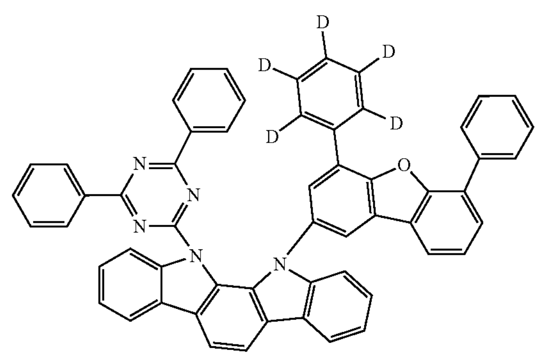
B95
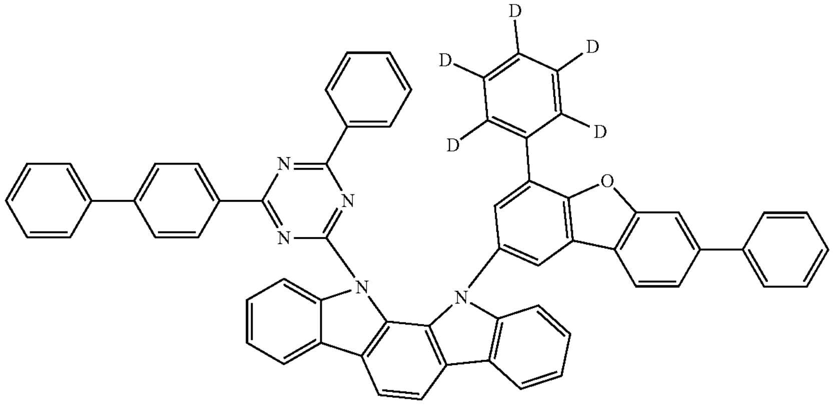

-continued
B96
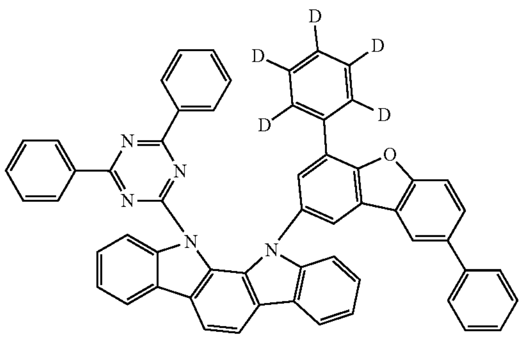
B97
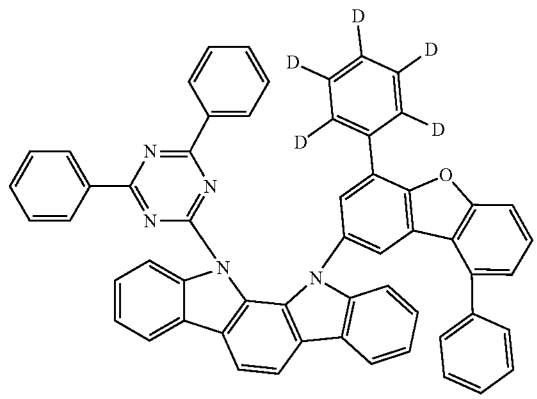
B98
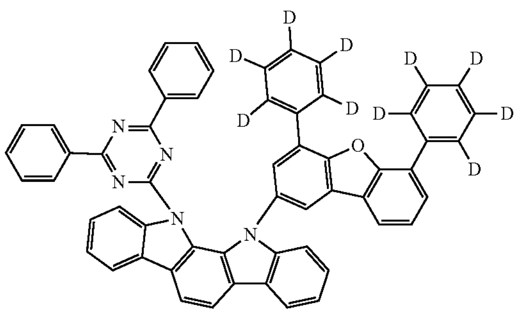
B99
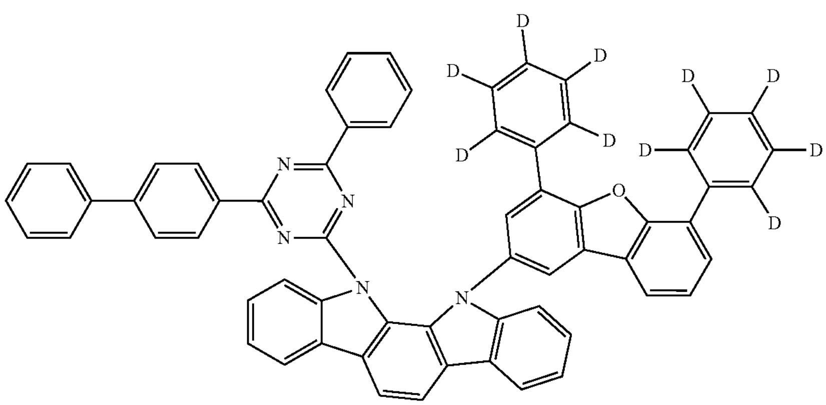
B100
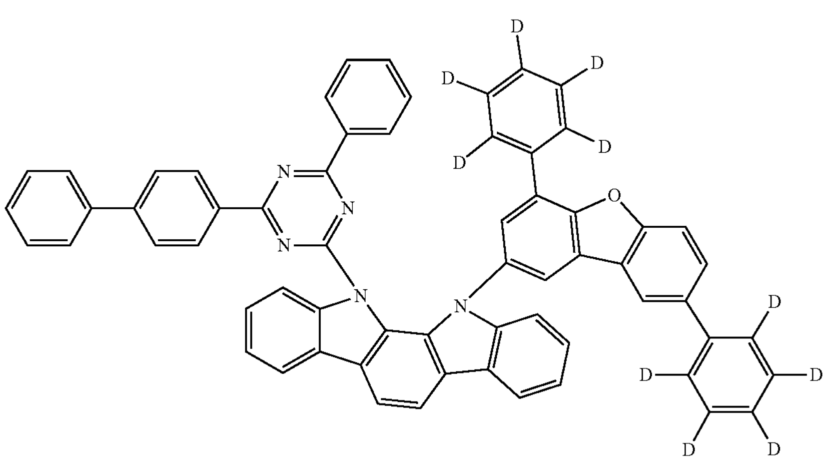

-continued
B101
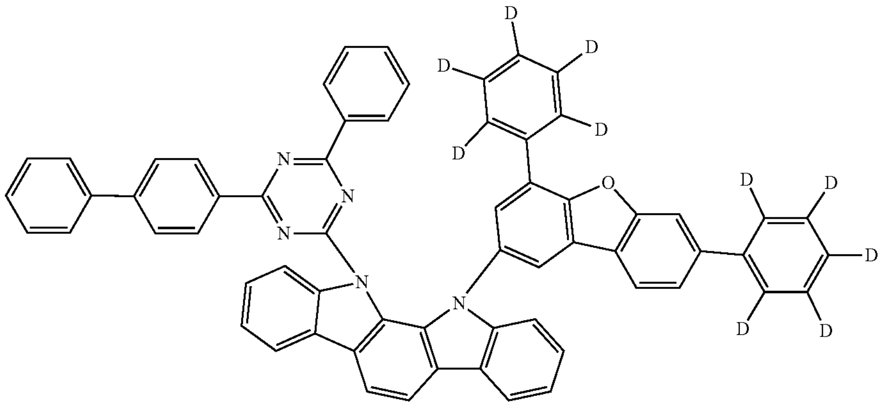
B102
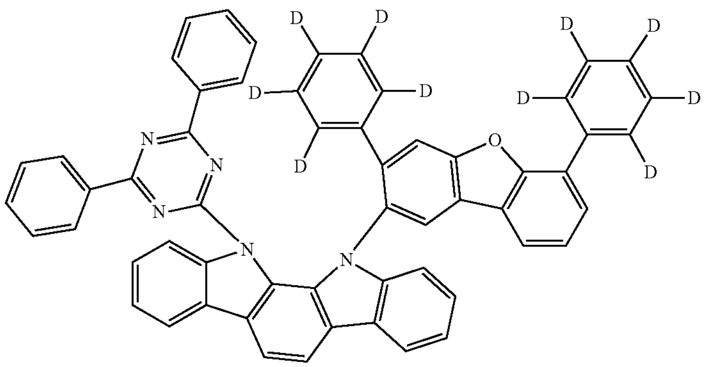
B103
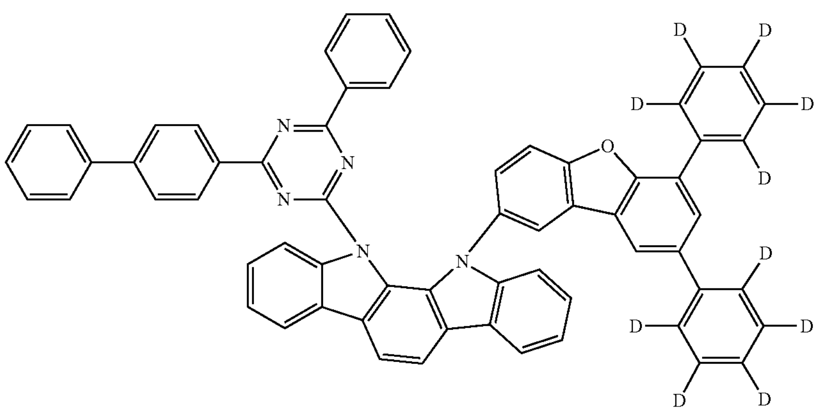
B104
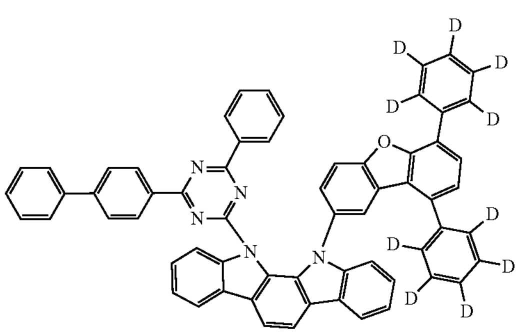
B105
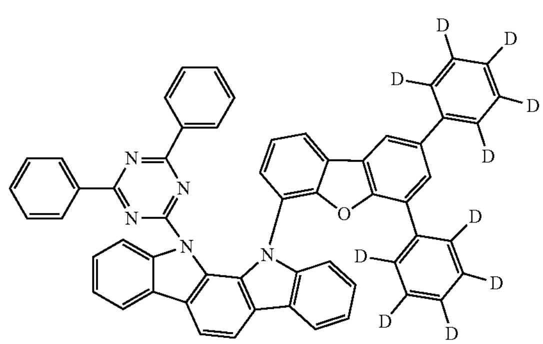

-continued
B106
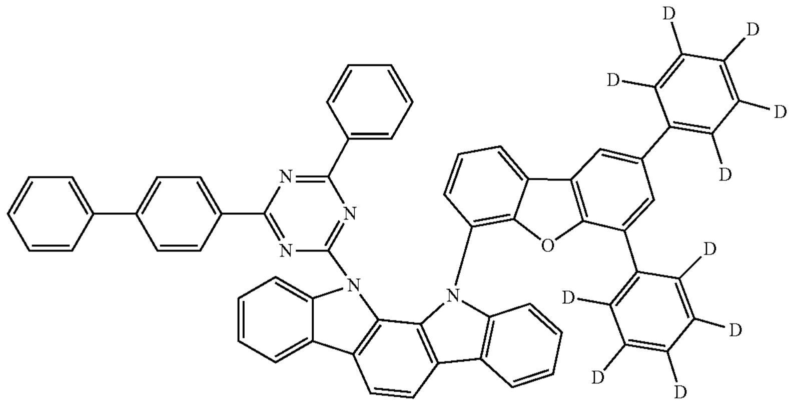
B107
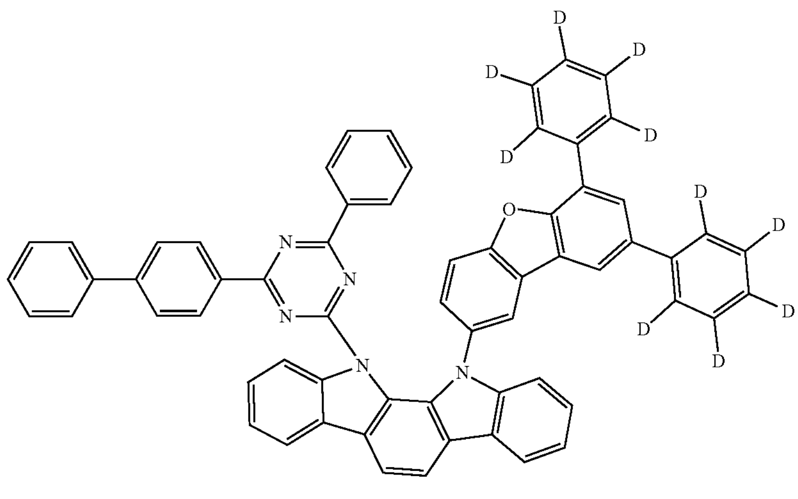
B108
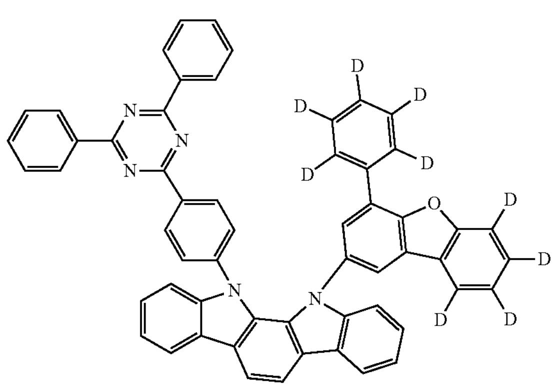
B109
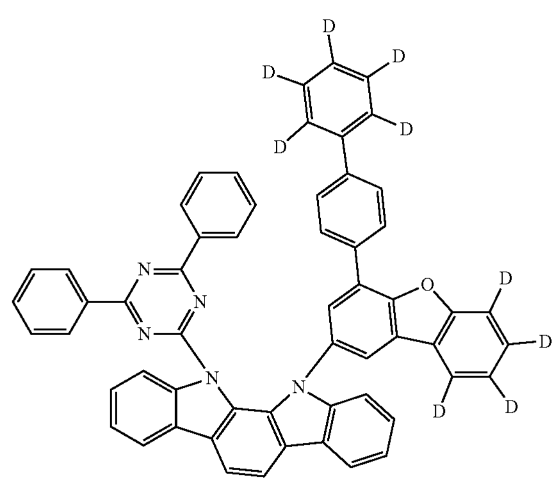

-continued
B110
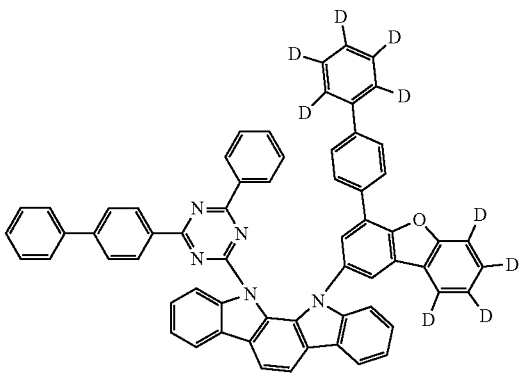
B111
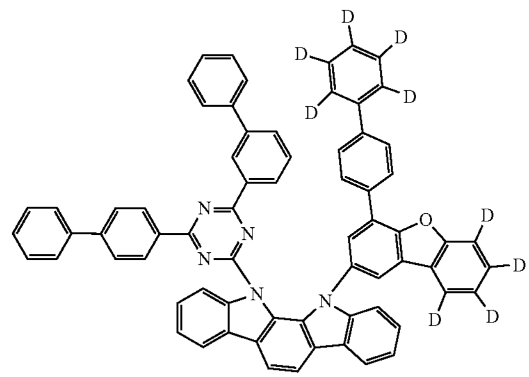
B112
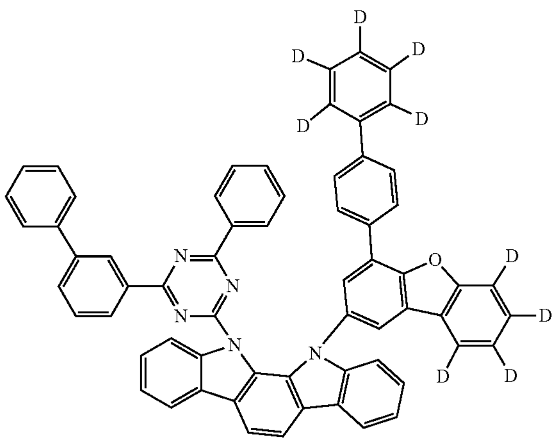
B113
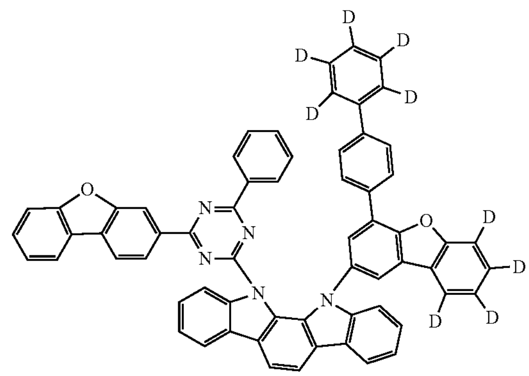
B114
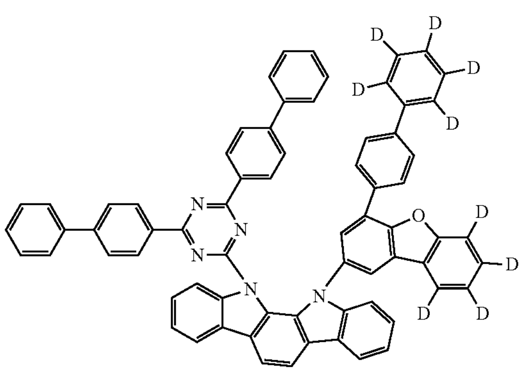
B115
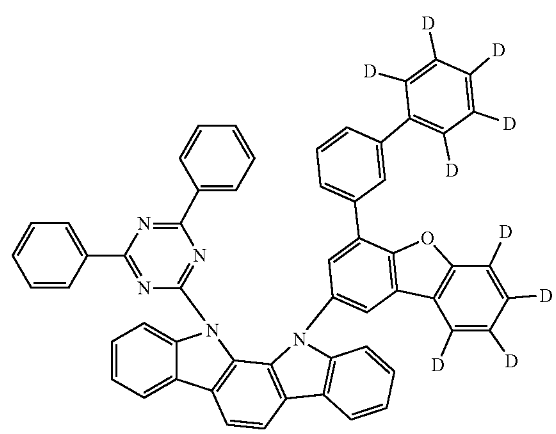
B116
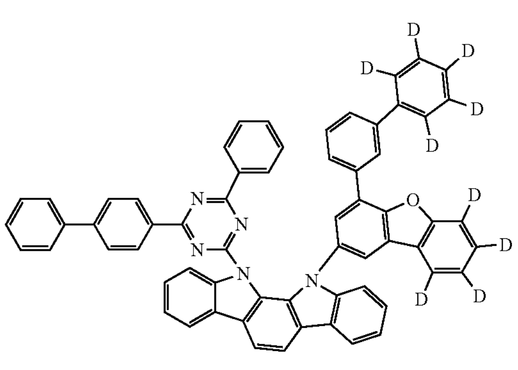
B117
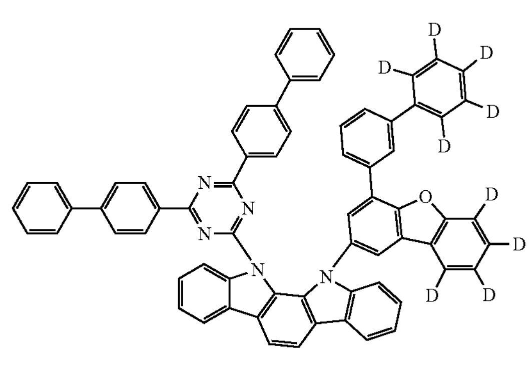

-continued
B118
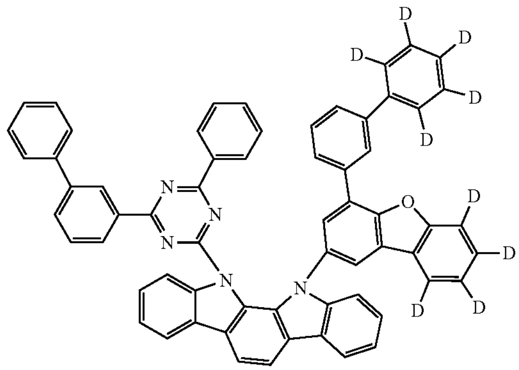
B119
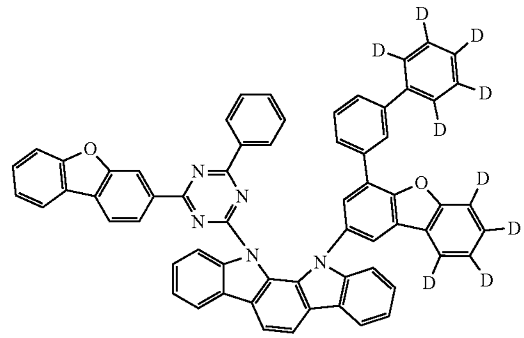
B120
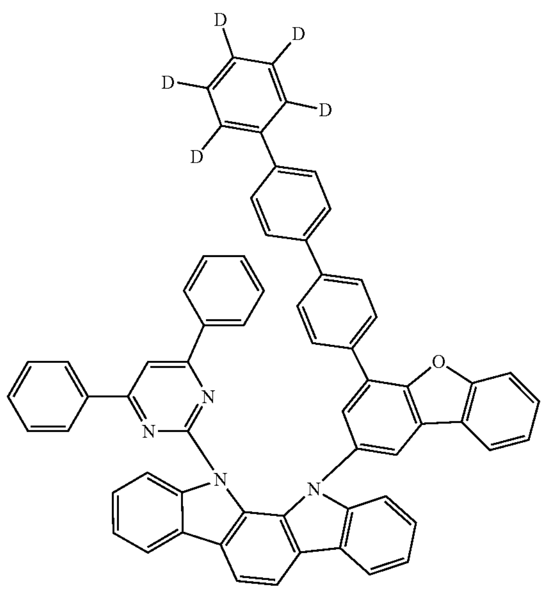
B121
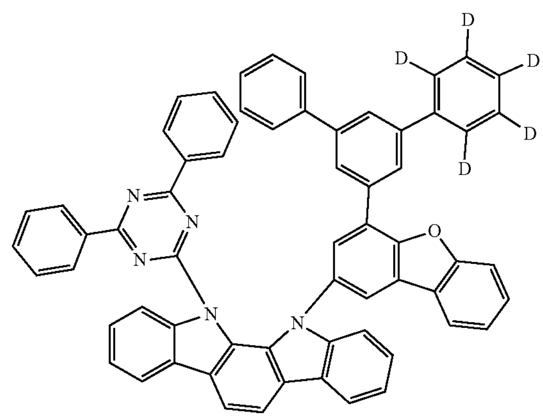
B122
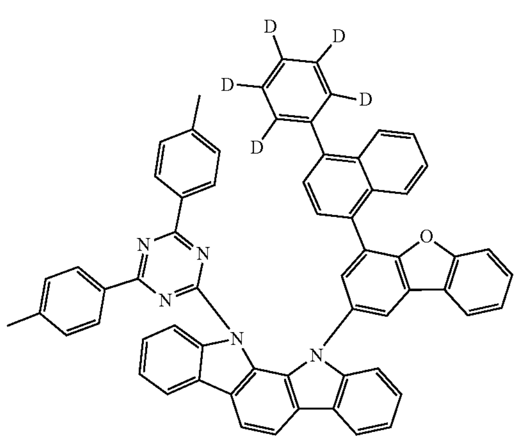
B123
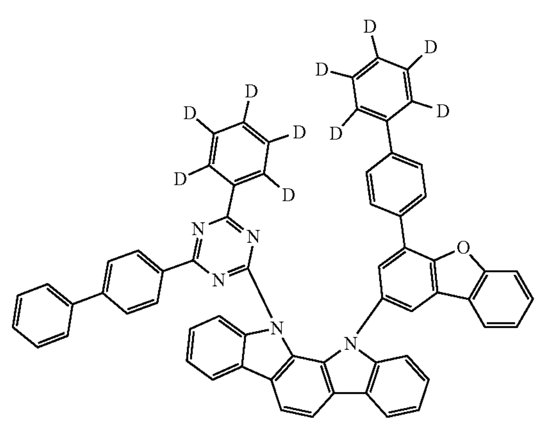

-continued
B124
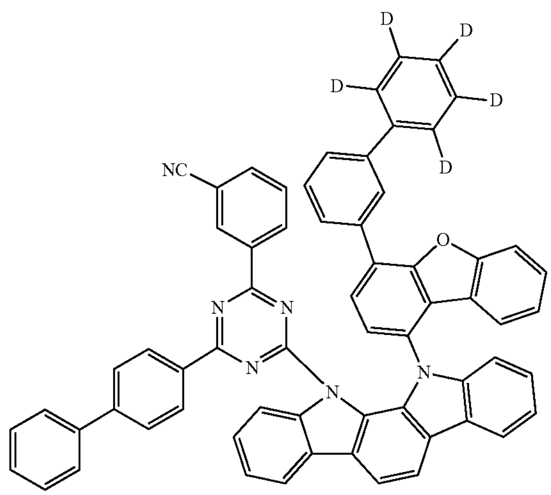
C1
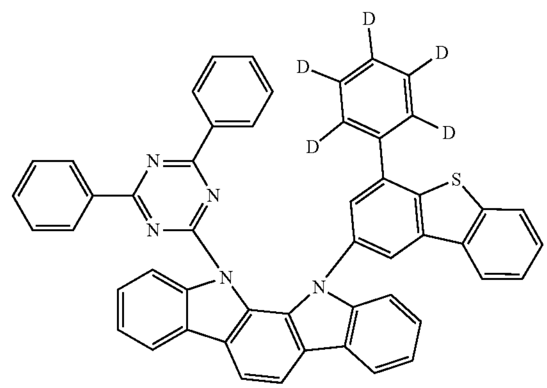
C2
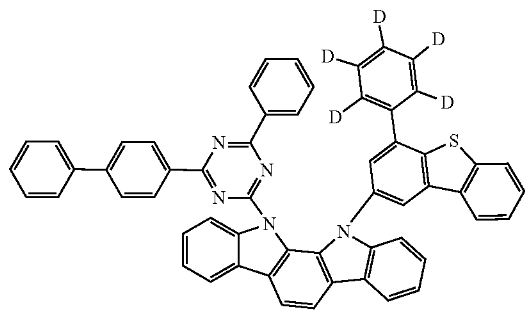
C3
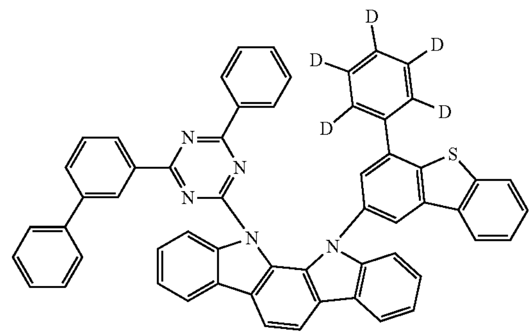
C4
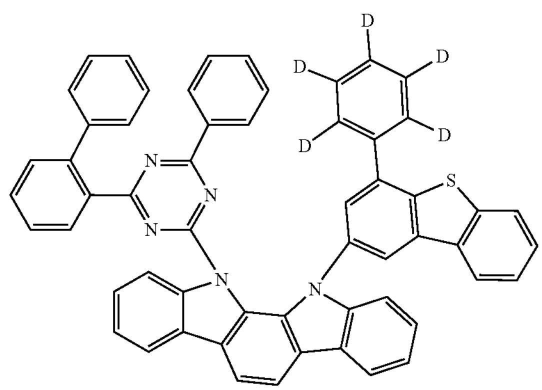
C5
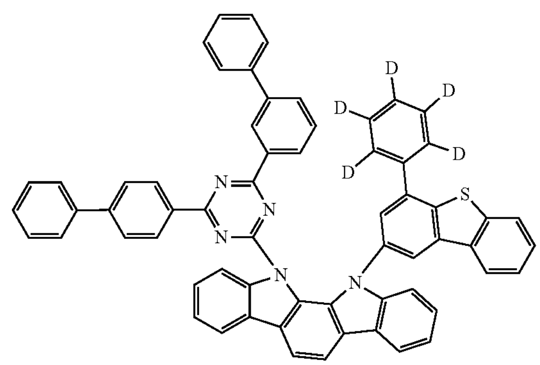
C6
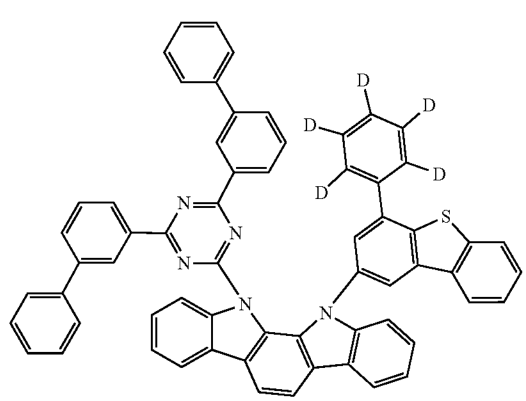
C7
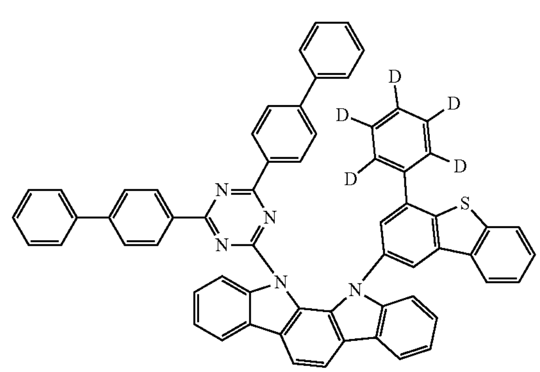

-continued
C8
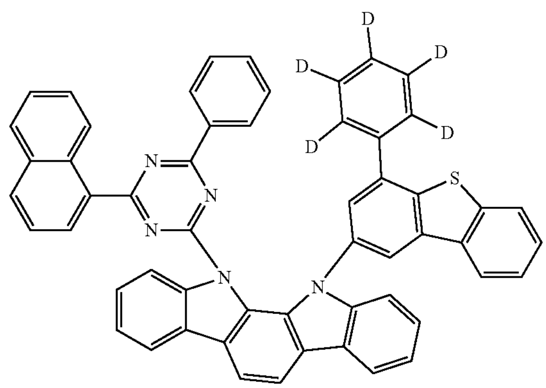
C9
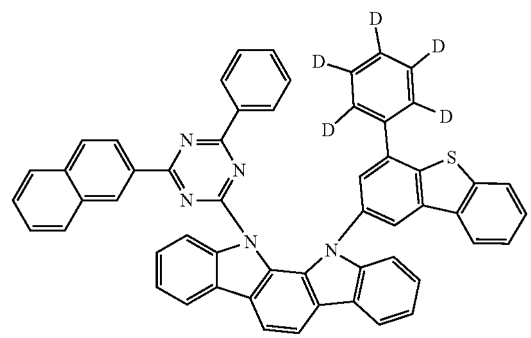
C10
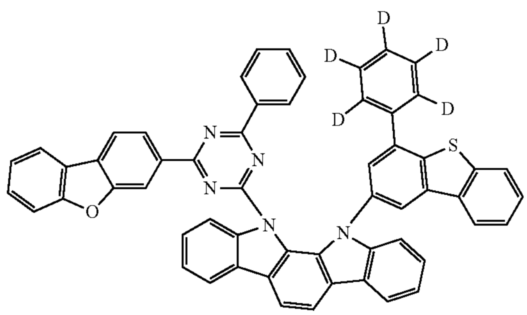
C11
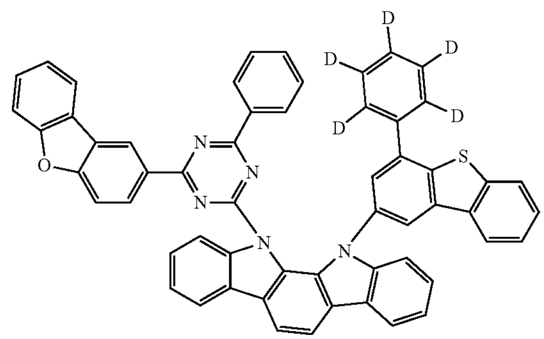
C12
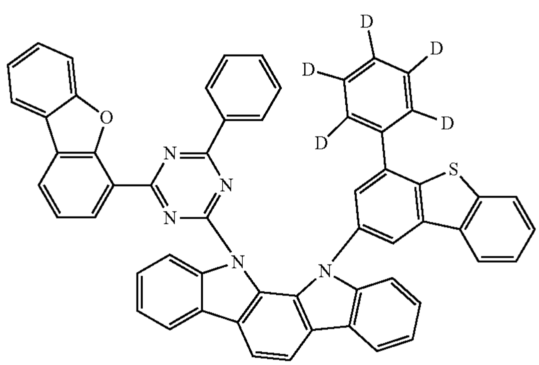
C13
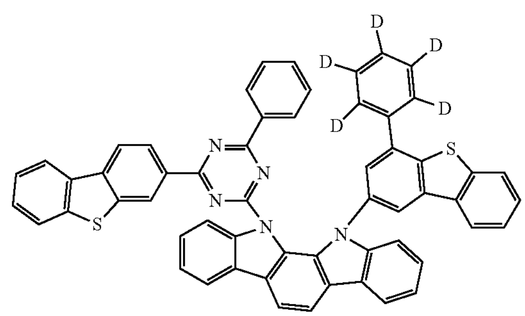
C14
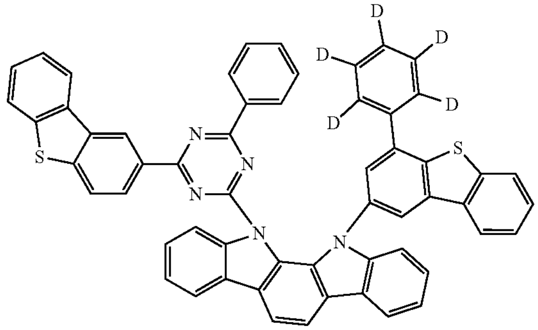
C15
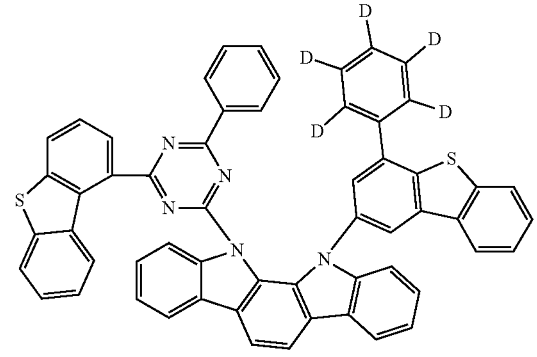

-continued
C16
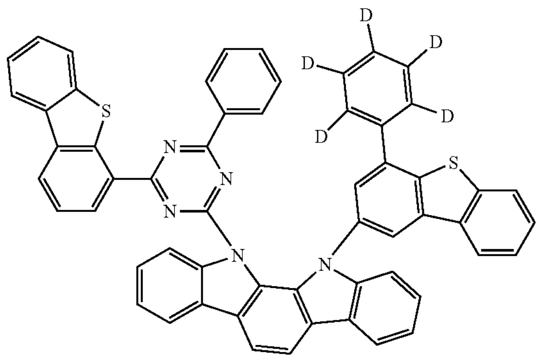
C17
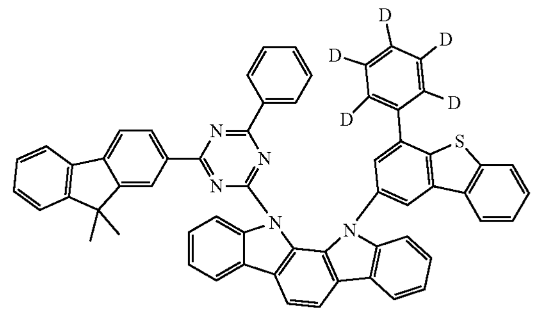
C18
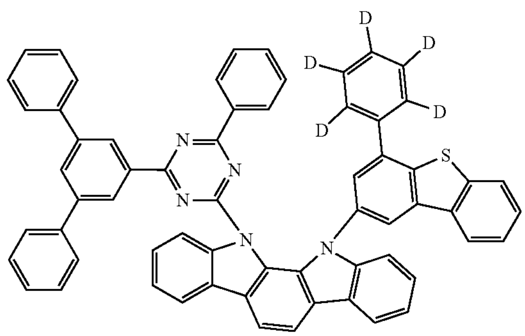
C19
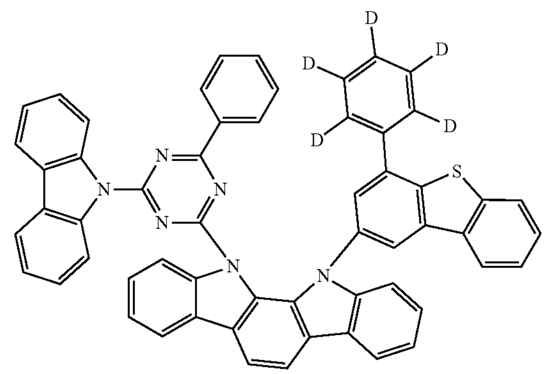
C20
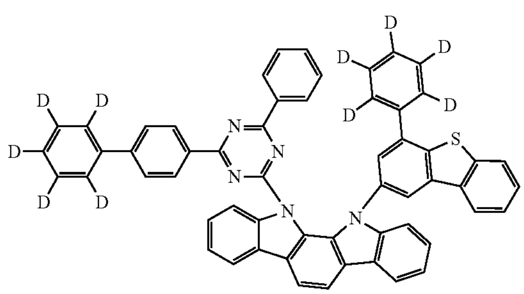
C21
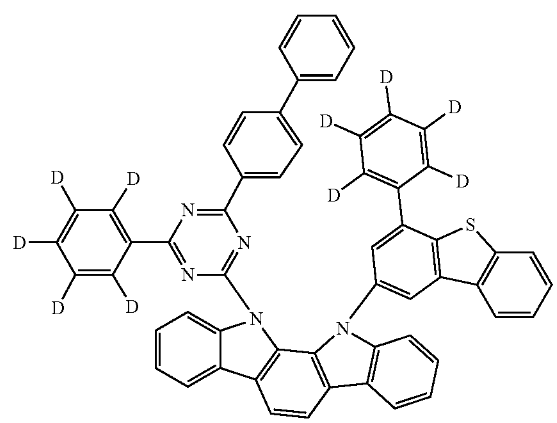
C22
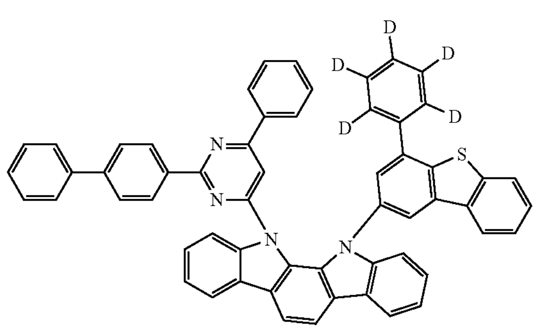
C23
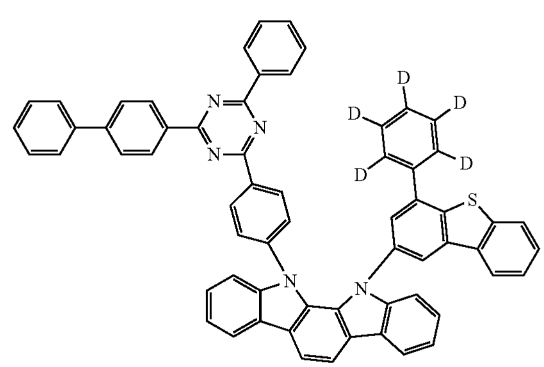

-continued
C24
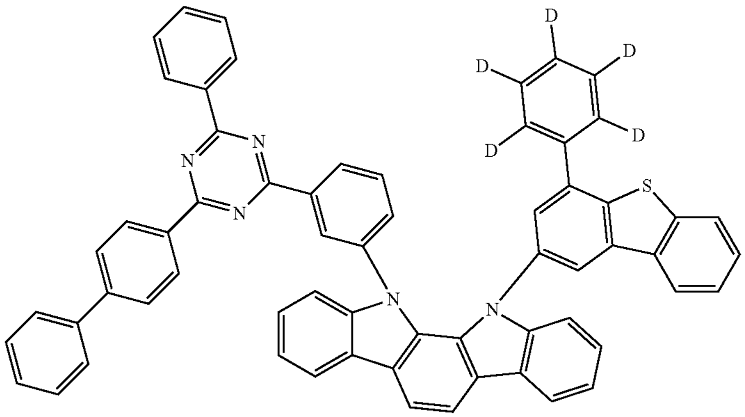
C25
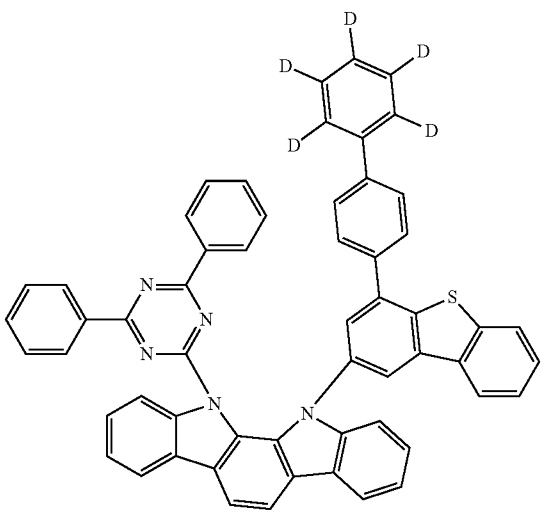
C26
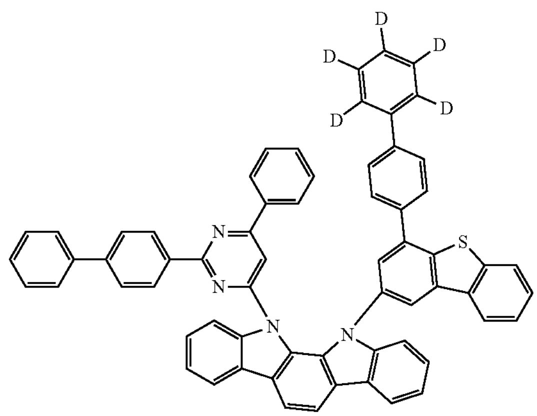
C27
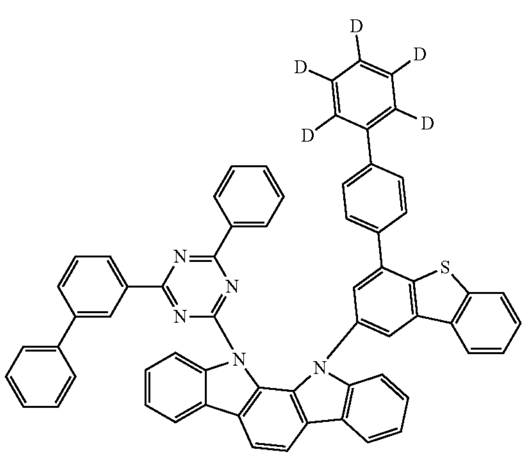
C28
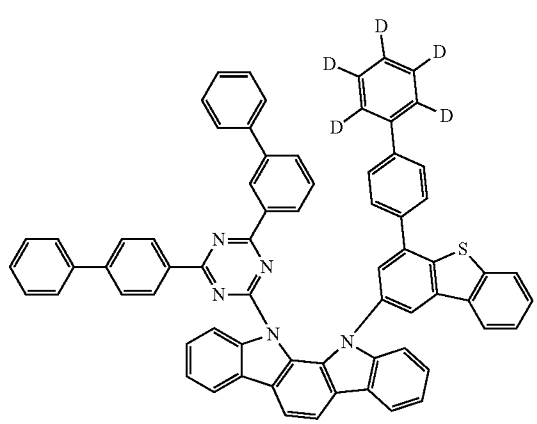

-continued
C29
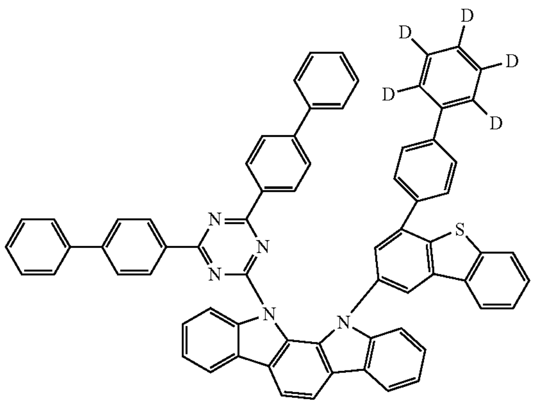
C30
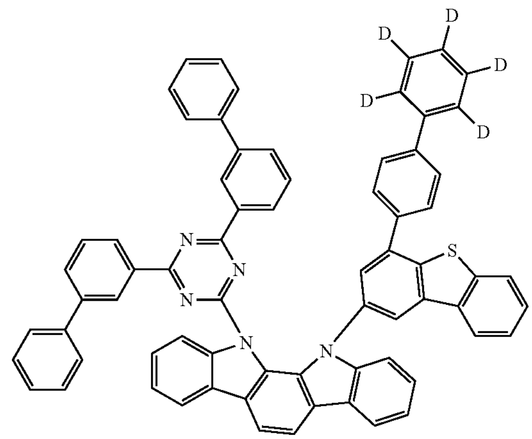
C31
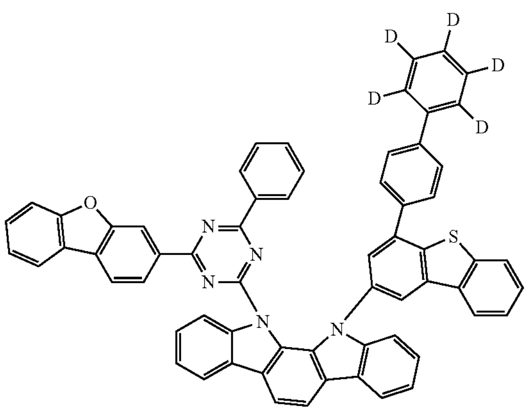
C32
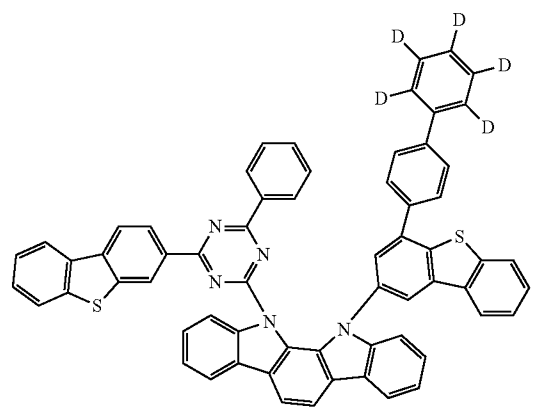
C33
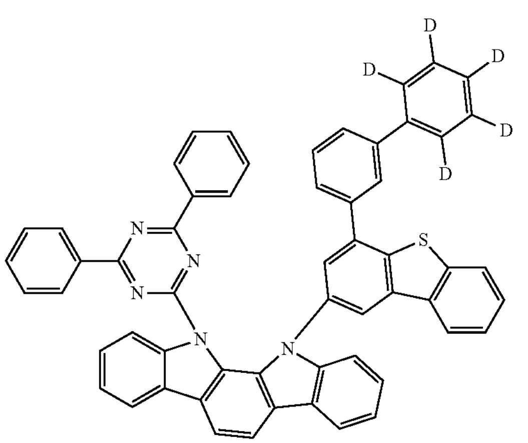
C34
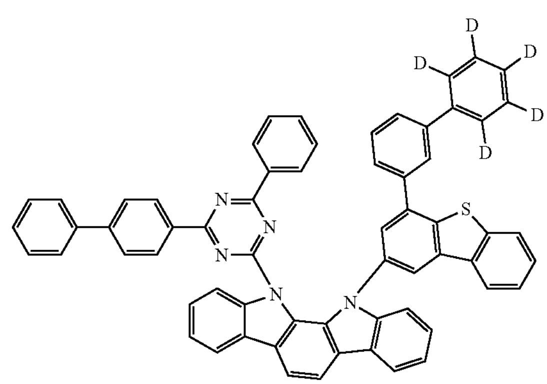

-continued
C35
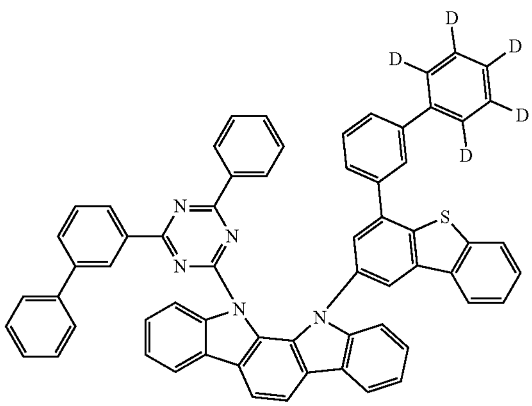
C36
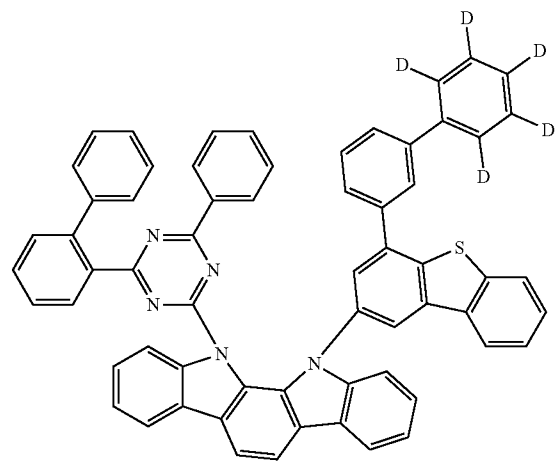
C37
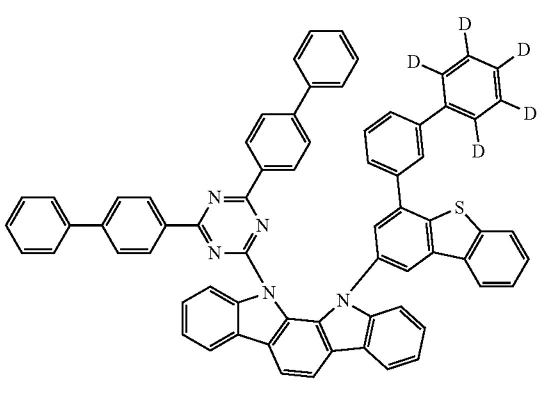
C38
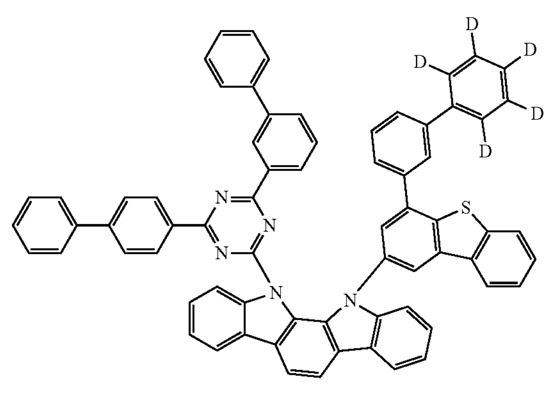
C39
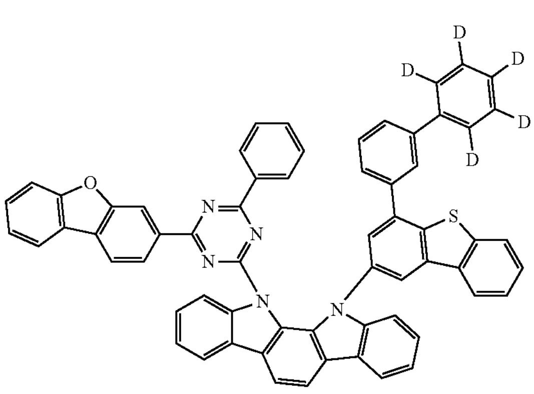
C40
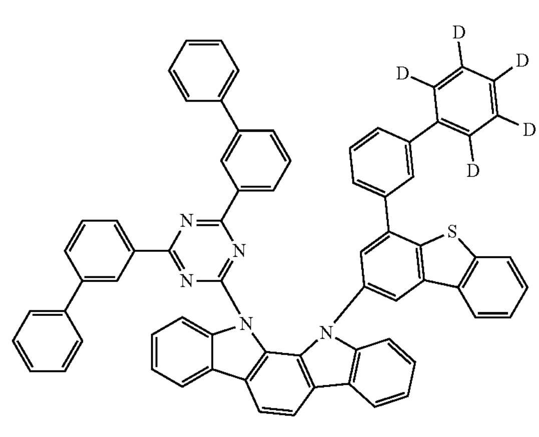

-continued
C41
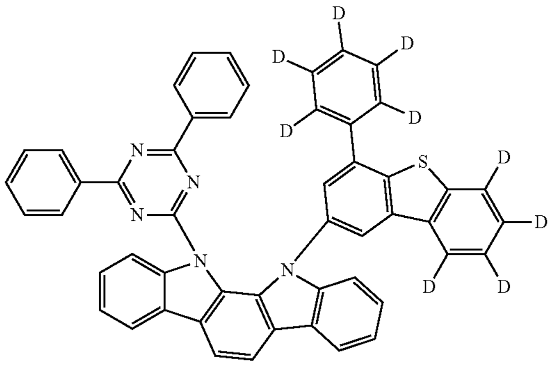
C42
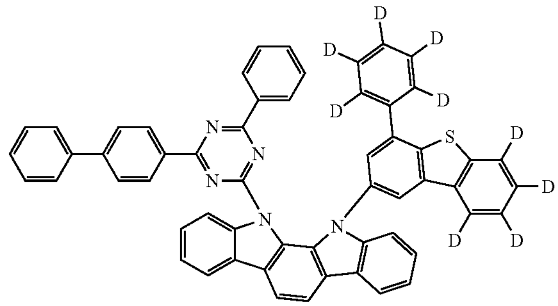
C43
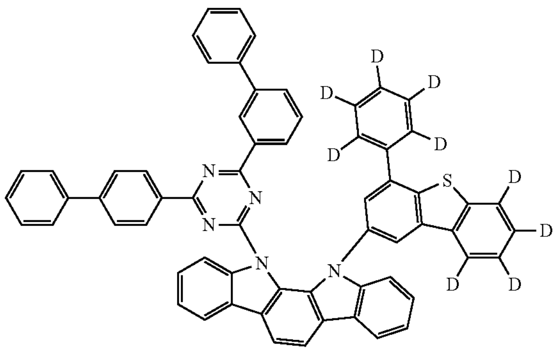
C44
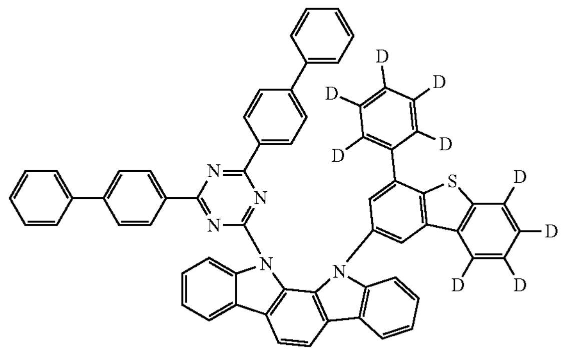
C45
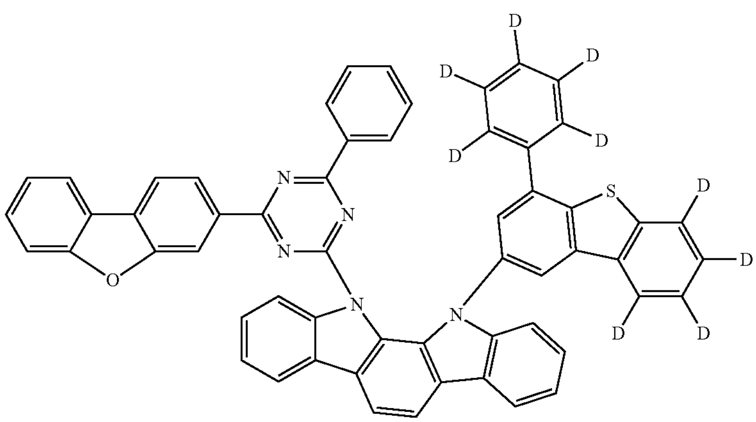
C46
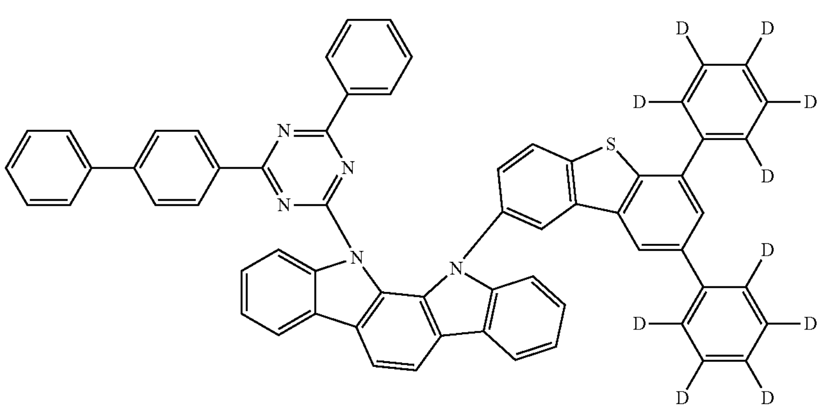

-continued
C47
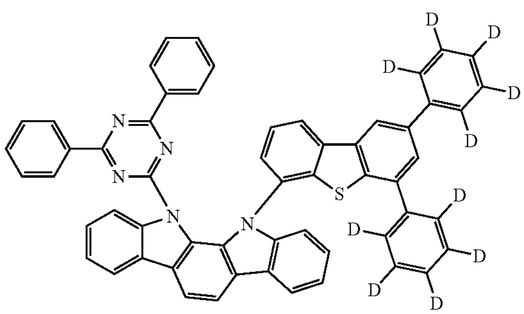
C48
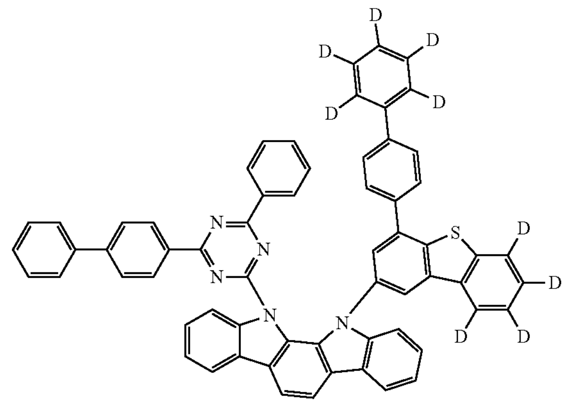
C49
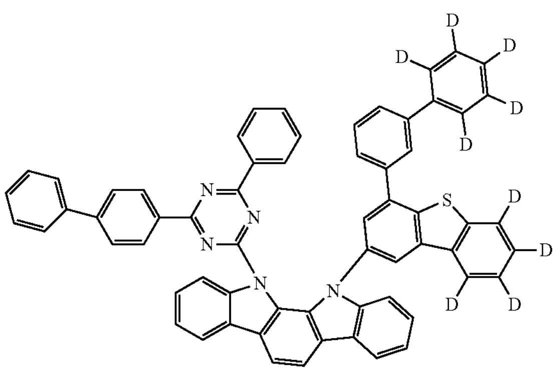
C50
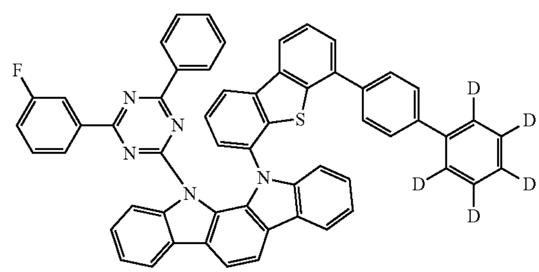
C51
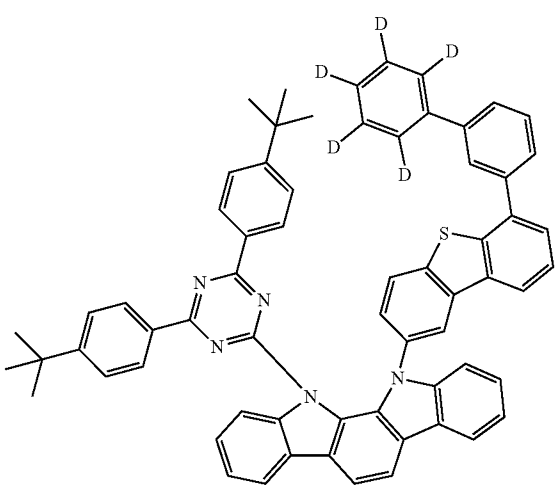
C52
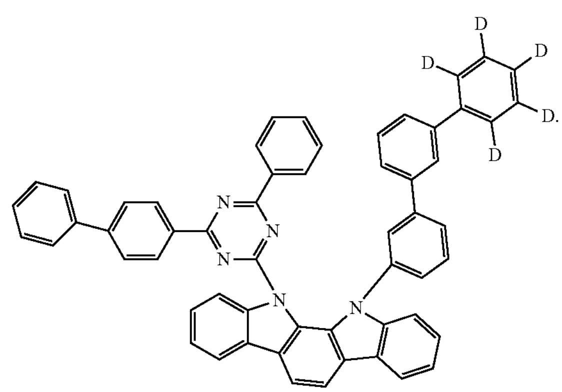

In some embodiments, the second compound is selected from compounds represented by a formula 3:

Formula 3

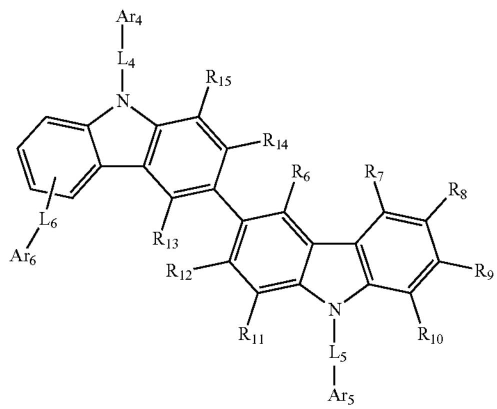

wherein, $L_4$ and $L_5$ are each independently selected from a single bond, substituted or unsubstituted arylene with 6 to 30 carbon atoms, and substituted or unsubstituted heteroarylene with 3 to 30 carbon atoms;

$L_6$ is selected from a single bond, and substituted or unsubstituted arylene with 6 to 30 carbon atoms;

$Ar_4$ and $Ar_5$ are each independently selected from substituted or unsubstituted aryl with 6 to 30 carbon atoms, and substituted or unsubstituted heteroaryl with 3 to 30 carbon atoms;

$Ar_6$ is substituted or unsubstituted aryl with 6 to 30 carbon atoms;

$R_6$, $R_7$, $R_5$, $R_9$, $R_{10}$, $R_{11}$, $R_{12}$, $R_{13}$, $R_{14}$, and $R_{15}$ are each independently selected from hydrogen or deuterium, and at least two of $R_6$, $R_{12}$, $R_{13}$, and $R_{14}$ are deuterium;

substituents in the $L_4$, $L_5$, $L_6$, $Ar_1$, $Ar_2$, $Ar_4$, $Ar_5$ and $Ar_6$ are each independently selected from deuterium, a halogen group, cyano, heteroaryl with 3 to 12 carbon atoms, aryl with 6 to 12 carbon atoms, trialkylsilyl with 3 to 12 carbon atoms, triarylsilyl with 18 to 24 carbon atoms, alkyl with 1 to 10 carbon atoms, haloalkyl with 1 to 10 carbon atoms, cycloalkyl with 3 to 10 carbon atoms, heterocycloalkyl with 2 to 10 carbon atoms, or alkoxy with 1 to 10 carbon atoms; and optionally, in $Ar_4$, $Ar_5$, and $Ar_6$, any two adjacent substituents form a ring.

In some embodiments of the present disclosure, the second compound is selected from compounds represented by the following chemical formulae:

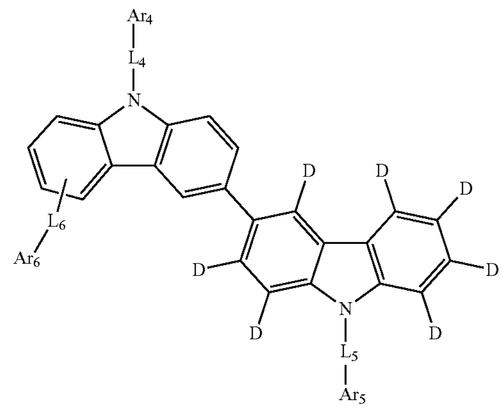

Formula 2-1

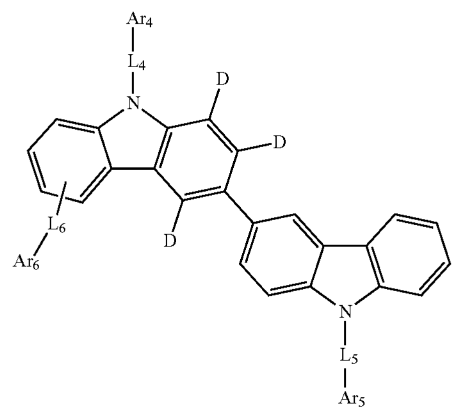

Formula 2-2

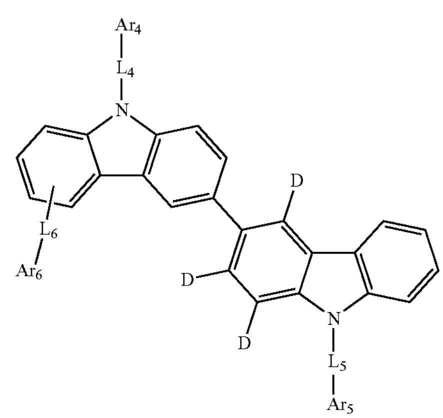

Formula 2-3

-continued

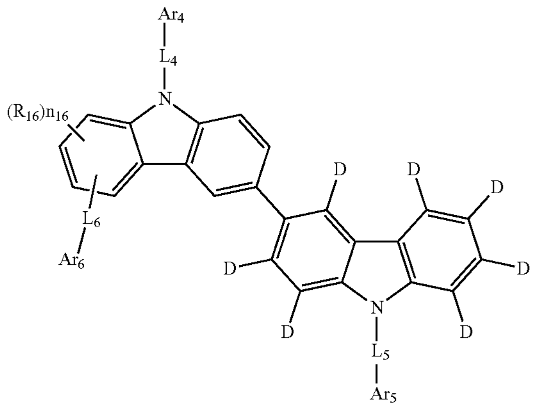

Formula 2-4

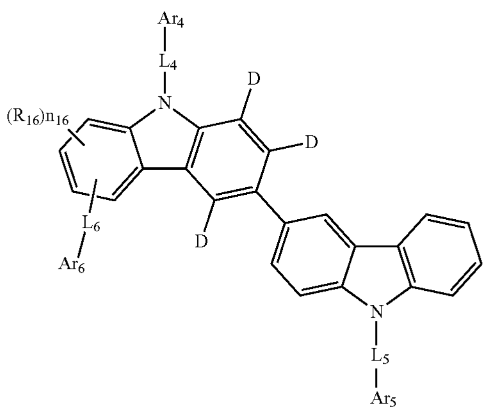

Formula 2-5

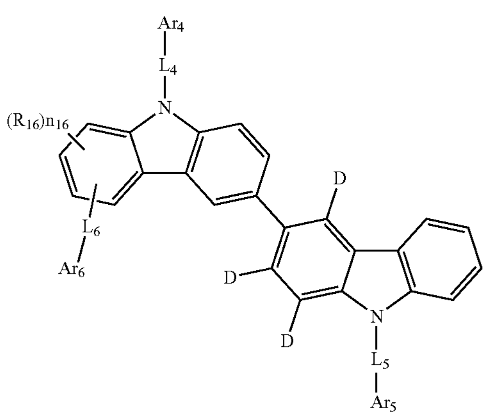

Formula 2-6 wherein, in the formulas 2-4 to 2-6, $R_{16}$ is deuterium, and $n_{16}$ is selected from 1, 2, or 3.

Preferably, in the formulas 2-4 to 2-6, $R_{16}$ is deuterium, and $n_{16}$ is selected from 3.

In some embodiments of the present disclosure, in the second compound, $L_4$ and $L_5$ are each independently selected from a single bond, substituted or unsubstituted arylene with 6 to 12 carbon atoms, and substituted or unsubstituted heteroarylene with 12 to 18 carbon atoms.

Optionally, substituents in $L_4$ and $L_5$ are the same or different, and are each independently selected from deuterium, a halogen group, cyano, alkyl with 1 to 5 carbon atoms, or phenyl.

In other embodiments of the present disclosure, $L_4$ and $L_5$ are each independently selected from a single bond, substituted or unsubstituted phenylene, substituted or unsubstituted naphthylene, substituted or unsubstituted biphenylene, substituted or unsubstituted carbazolylene, substituted or unsubstituted dibenzofurylene, and substituted or unsubstituted dibenzothienylene.

Optionally, substituents in $L_4$ and $L_5$ are the same or different, and are each independently selected from deuterium, fluorine, cyano, methyl, ethyl, n-propyl, isopropyl, tert-butyl or phenyl.

In other embodiments of the present disclosure, $L_4$ and $L_5$ are each independently selected from a single bond, and a substituted or unsubstituted group V, where the unsubstituted group V is selected from the group consisting of:

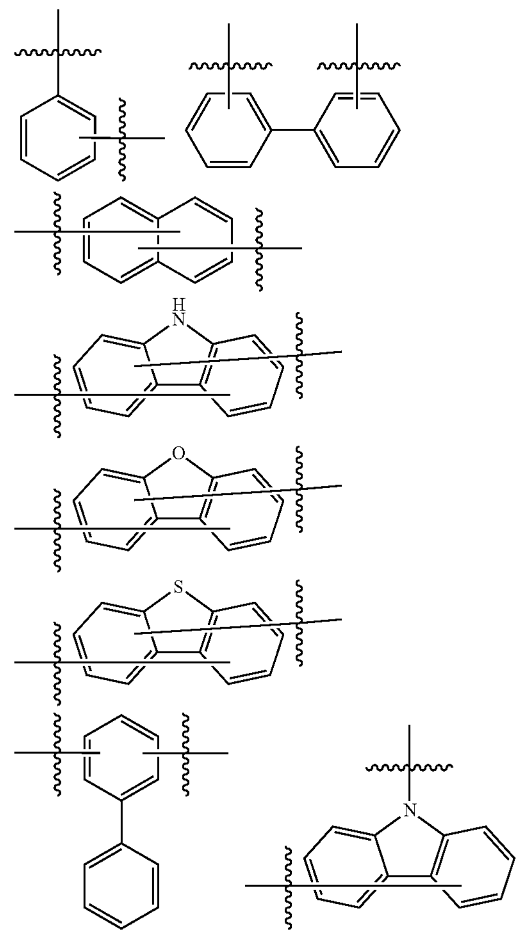

;

wherein, ⌇ represents a chemical bond; the substituted group V contains one or more substituents each independently selected from deuterium, fluorine, cyano, methyl, ethyl, n-propyl, isopropyl, tert-butyl or phenyl; and when the substituted group V contains a plurality of substituents, the substituents are the same or different.

Optionally, $L_4$ and $L_5$ are each independently selected from a single bond or the group consisting of:
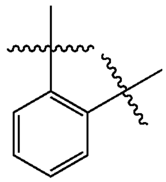
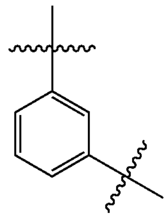
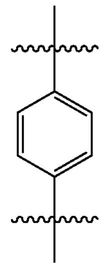
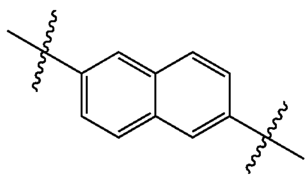
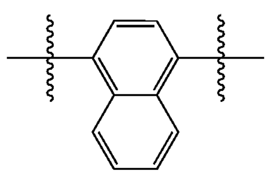
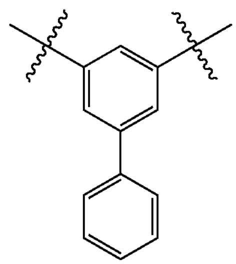
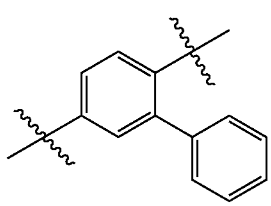
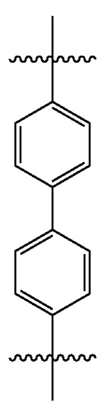
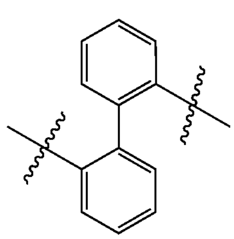
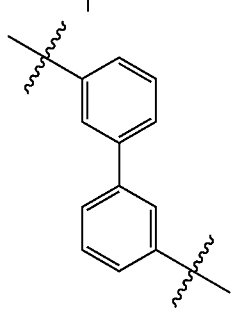
-continued
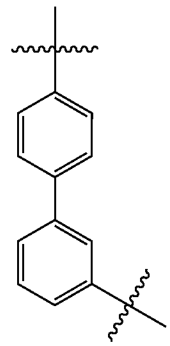
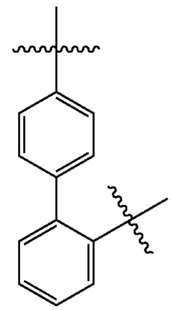
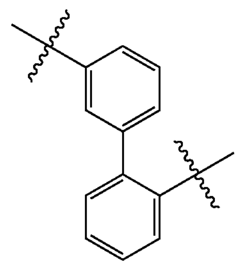
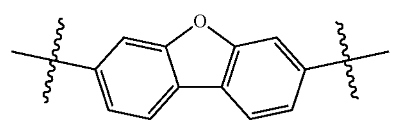
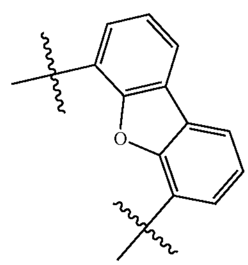
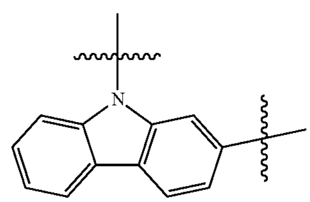
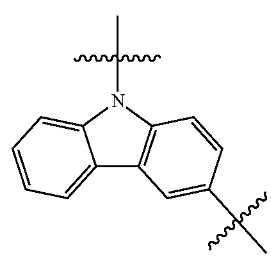
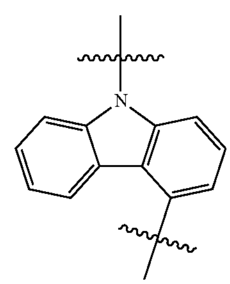
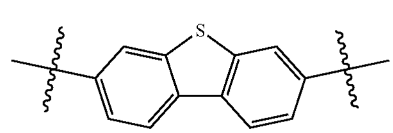

-continued

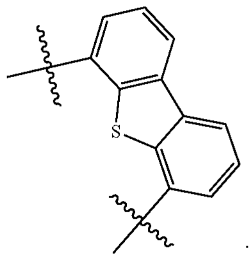

In some embodiments of the present disclosure, $L_6$ is selected from a single bond or phenylene.

In some embodiments of the present disclosure, $L_6$ is selected from a single bond or the group consisting of:

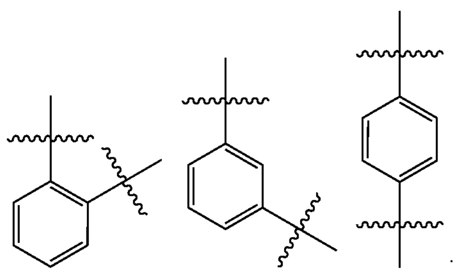 [SMILES: *c1ccccc1* ; *c1cccc(*)c1 ; *c1ccc(*)cc1]

In some embodiments of the present disclosure, $Ar_4$ and $Ar_5$ are each independently selected from substituted or unsubstituted aryl with 6 to 25 carbon atoms and substituted or unsubstituted heteroaryl with 12 to 20 carbon atoms.

Optionally, substituents in $Ar_4$ and $Ar_5$ are the same or different, and are each independently selected from deuterium, a halogen group, cyano, alkyl with 1 to 5 carbon atoms, or aryl with 6 to 12 carbon atoms.

Optionally, in $Ar_4$ and $Ar_5$, any two adjacent substituents form a saturated or unsaturated ring having 5 to 13 carbon atoms.

Optionally, in $Ar_4$ and $Ar_5$, any two adjacent substituents may form cyclohexane

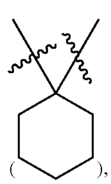

cyclopentane

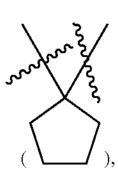

a benzene ring, a naphthalene ring, or a fluorene ring

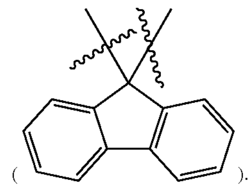 [SMILES: *C1(*)c2ccccc2-c2ccccc21]

Specifically, specific examples of the substituents in $Ar_4$ and $Ar_5$ include, but are not limited to, deuterium, fluorine, cyano, methyl, ethyl, n-propyl, isopropyl, tert-butyl, phenyl, naphthyl, or biphenyl.

In other embodiments of the present disclosure, $Ar_4$ and $Ar_5$ are each independently selected from substituted or unsubstituted phenyl, substituted or unsubstituted naphthyl, substituted or unsubstituted biphenyl, substituted or unsubstituted terphenyl, substituted or unsubstituted phenanthryl, substituted or unsubstituted fluorenyl, substituted or unsubstituted dibenzofuranyl, substituted or unsubstituted carbazolyl, and substituted or unsubstituted dibenzothienyl.

Optionally, substituents in $Ar_4$ and $Ar_5$ are the same or different, and are each independently selected from deuterium, fluorine, cyano, methyl, ethyl, n-propyl, isopropyl, tert-butyl, phenyl or naphthyl.

Optionally, in $Ar_4$ and $Ar_5$, any two adjacent substituents form a fluorene ring.

In some embodiments of the present disclosure, $Ar_4$ and $Ar_5$ are each independently selected from a substituted or unsubstituted group W, where the unsubstituted group W is selected from the group consisting of:

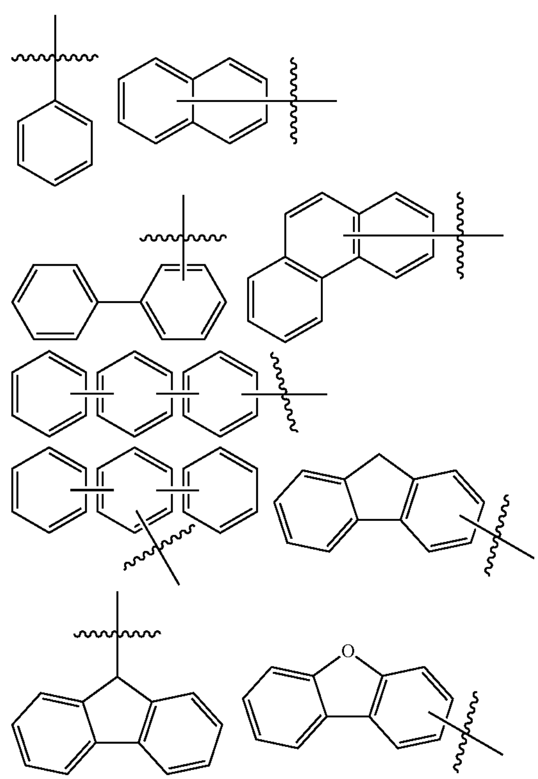

-continued

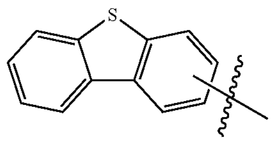

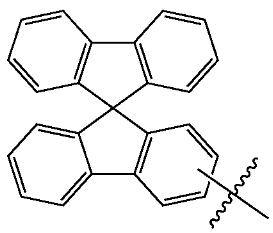

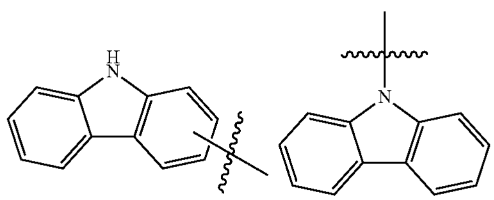

;

wherein, ⸾ represents a chemical bond; the substituted group W contains one or more substituents each independently selected from deuterium, fluorine, cyano, methyl, ethyl, n-propyl, isopropyl, tert-butyl, phenyl, or naphthyl; and when the substituted group W contains a plurality of substituents, the substituents are the same or different.

Optionally, $Ar_4$ and $Ar_5$ are each independently selected from the group consisting of:

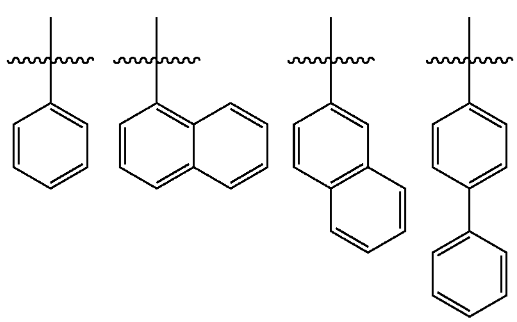

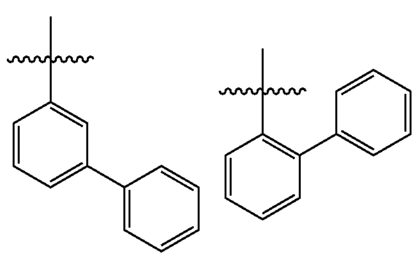

-continued

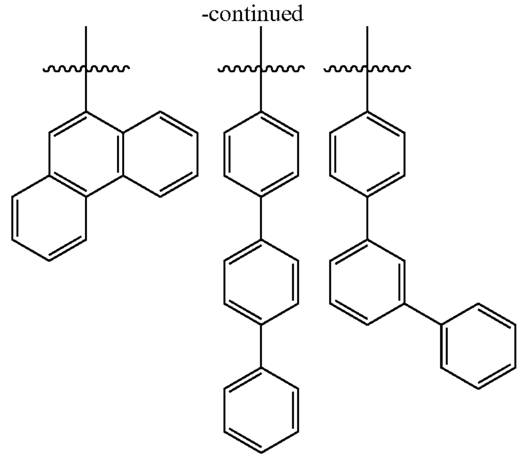

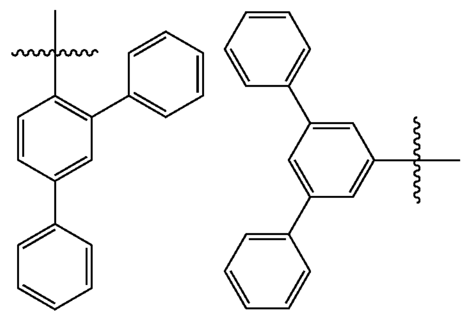

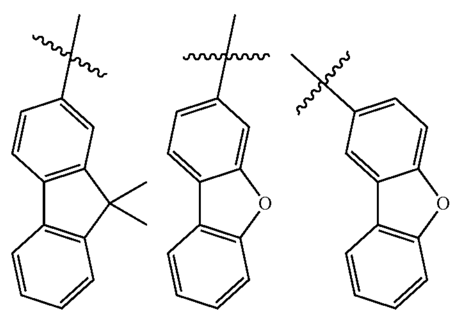

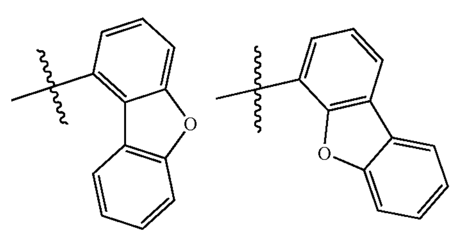

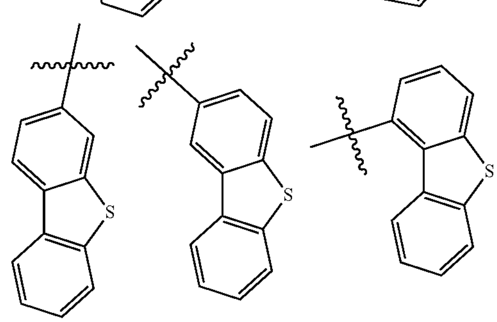

-continued

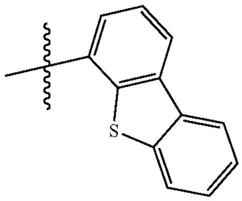

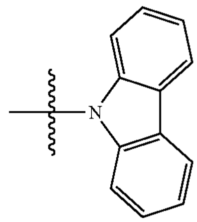

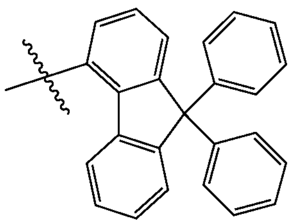

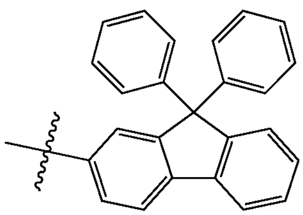

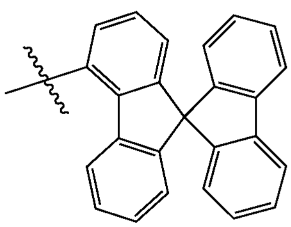

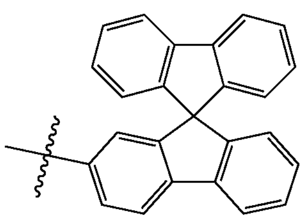

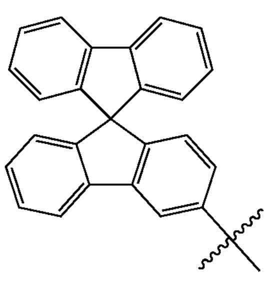

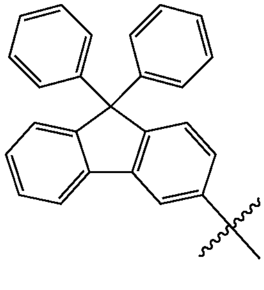

-continued

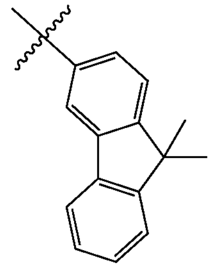

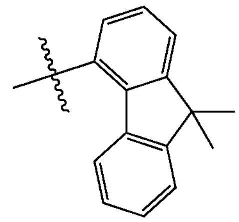

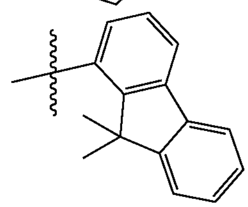

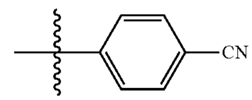

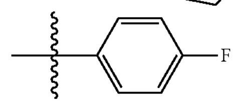

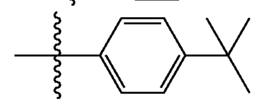

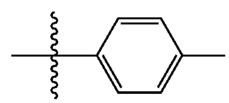

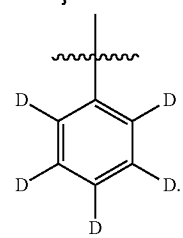

In some embodiments of the present disclosure, $Ar_6$ is substituted or unsubstituted aryl with 6 to 20 carbon atoms.

Optionally, $Ar_6$ is substituted or unsubstituted aryl with 6 to 15 carbon atoms.

Optionally, $Ar_6$ is substituted or unsubstituted aryl with 6 to 12 carbon atoms.

Optionally, substituents in $Ar_6$ are the same or different, and are each independently selected from deuterium, a halogen group, cyano, alkyl with 1 to 5 carbon atoms, or phenyl.

Specifically, specific examples of the substituents in $Ar_6$ include, but are not limited to: deuterium, fluorine, cyano, methyl, ethyl, n-propyl, isopropyl, tert-butyl or phenyl.

In other embodiments of the present disclosure, $Ar_6$ is selected from substituted or unsubstituted phenyl, substituted or unsubstituted naphthyl, and substituted or unsubstituted biphenyl.

Optionally, substituents in $Ar_6$ are the same or different, and are each independently selected from deuterium, fluorine, cyano, methyl, ethyl, n-propyl, isopropyl, tert-butyl or phenyl.

In some embodiments of the present disclosure, $Ar_6$ is selected from the group consisting of:

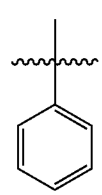

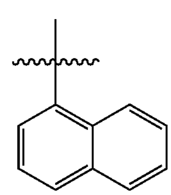

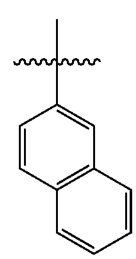

-continued

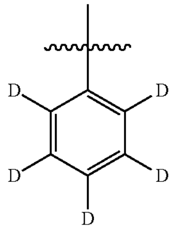

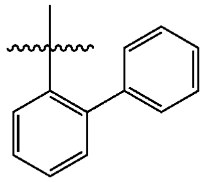

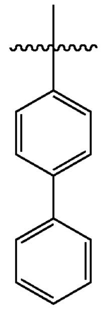

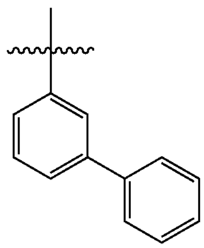

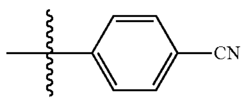

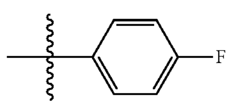

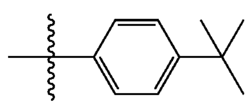

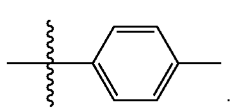

In some embodiments of the present disclosure, in the second compound, $R_{13}$, $R_{14}$, and $R_{15}$ are all deuterium, or $R_6$, $R_{11}$, and $R_{12}$ are all deuterium.

When $R_{13}$, $R_{14}$, and $R_{15}$ are all deuterium or $R_6$, $R_{11}$, and $R_{12}$ are all deuterium in the second compound described in the present disclosure, the device performance is significantly improved when the second compound is used in a host material for an organic electroluminescent device.

In some embodiments of the present disclosure, in the second compound, $R_6$, $R_7$, $R_5$, $R_9$, $R_{10}$, $R_{11}$, and $R_{12}$ are all deuterium.

In some specific embodiments of the present disclosure, when $R_6$, $R_7$, $R_5$, $R_9$, $R_{10}$, $R_{11}$, and $R_{12}$ in the second compound described in the present disclosure are all deuterium, the device has lower operating voltage, higher luminous efficiency, and longer service life.

Optionally, the second compound is selected from the group consisting of:

1

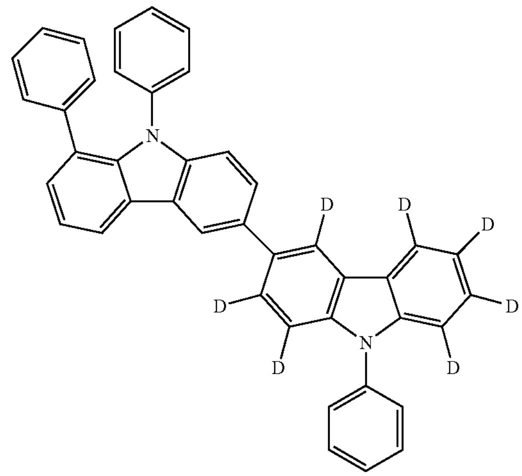

2

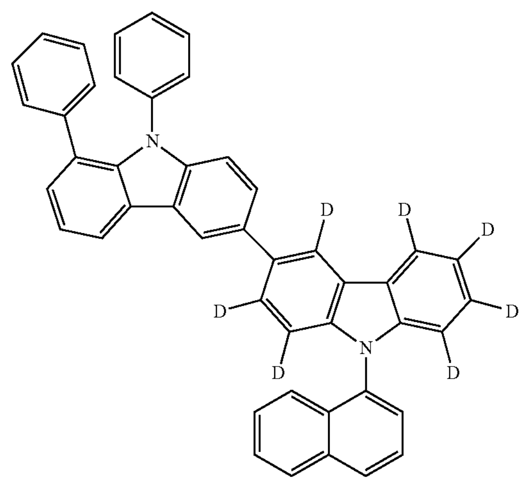

3

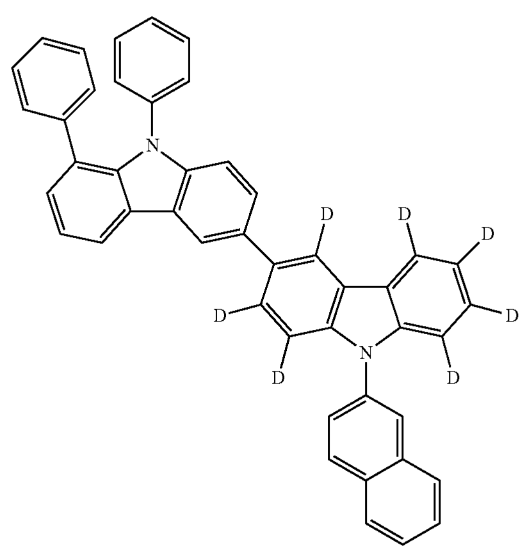

-continued
4
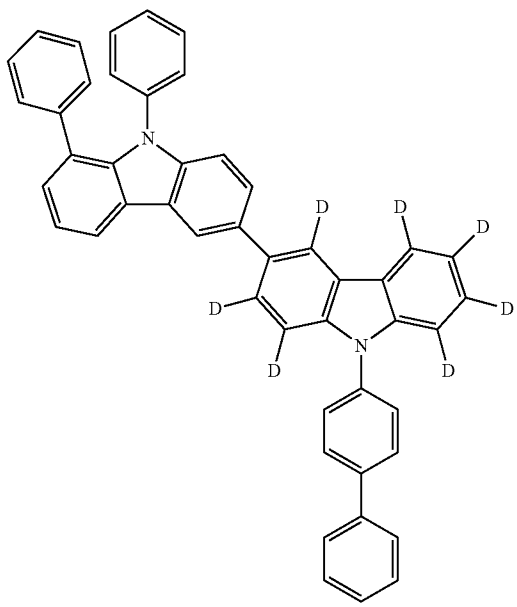
5
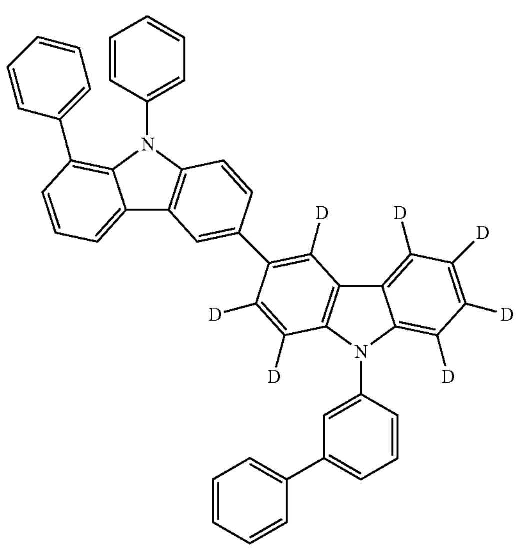
-continued
6
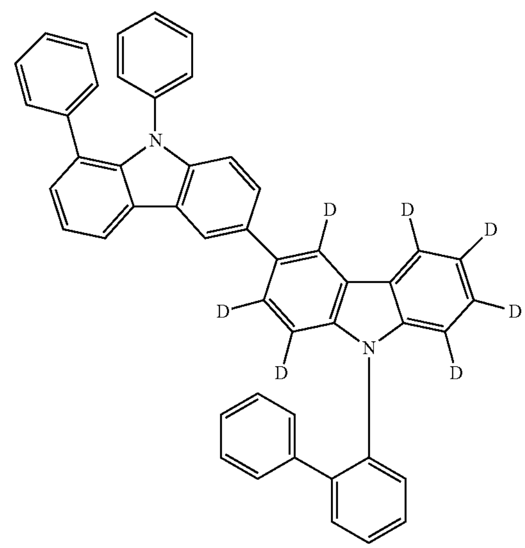
7
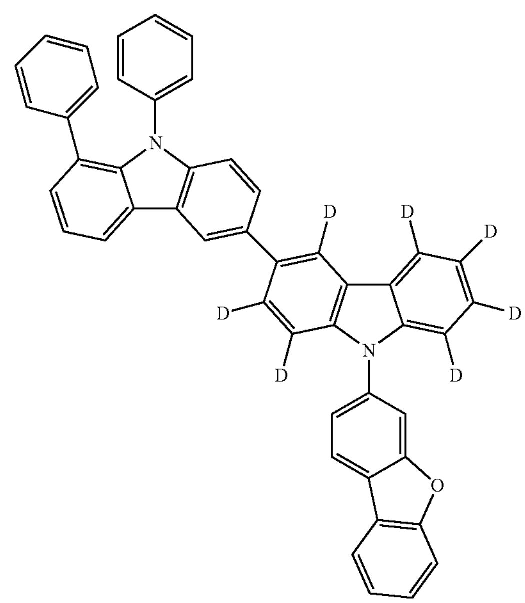

-continued
8
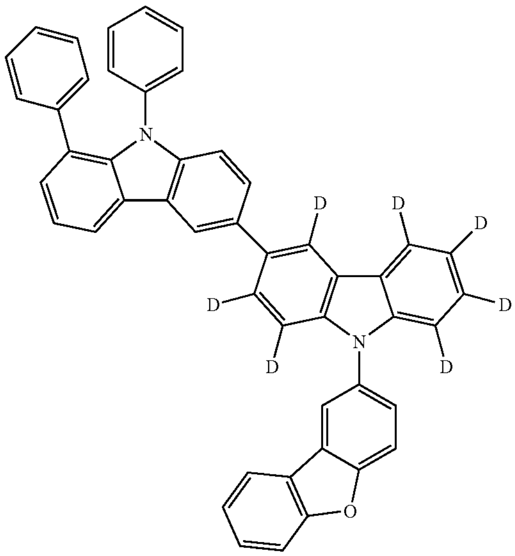
9
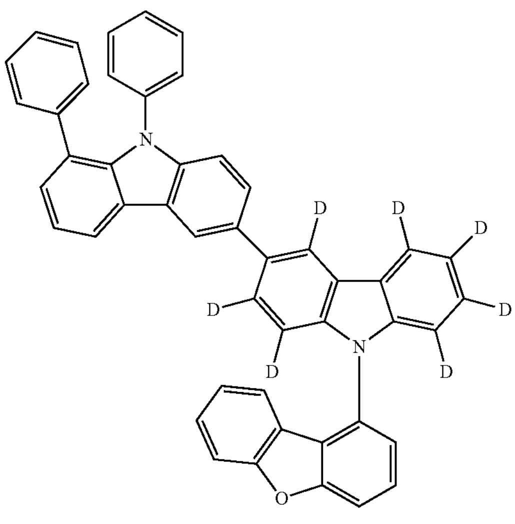
10
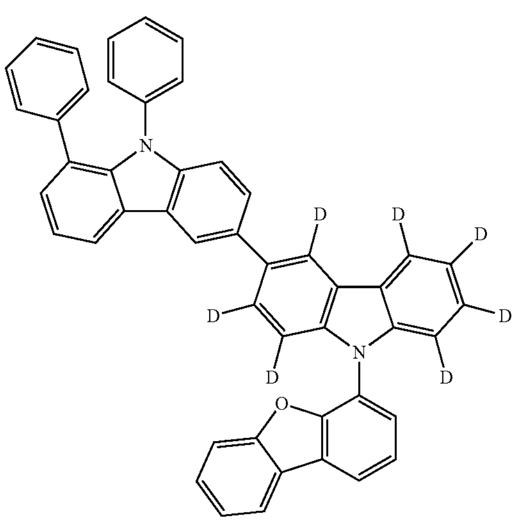
-continued
11
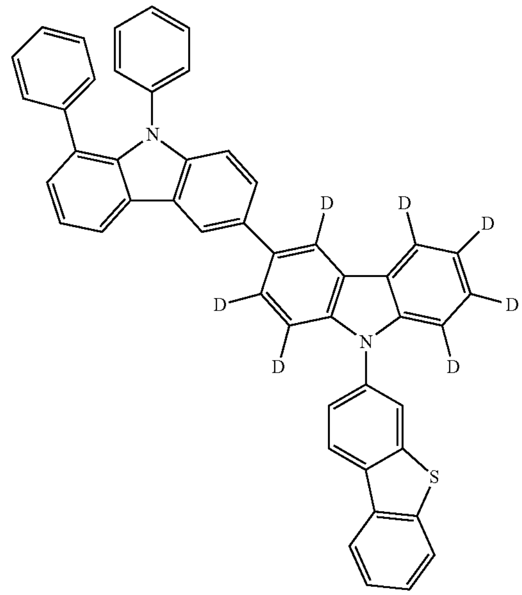
12
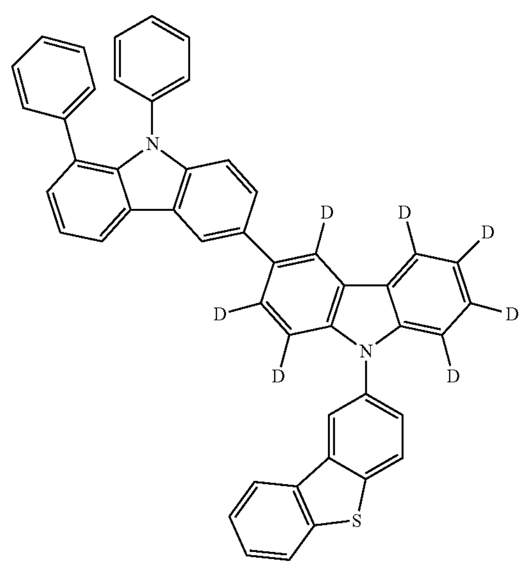

-continued
13
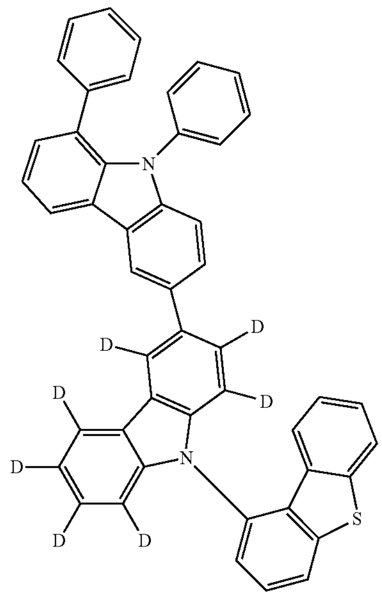
-continued
15
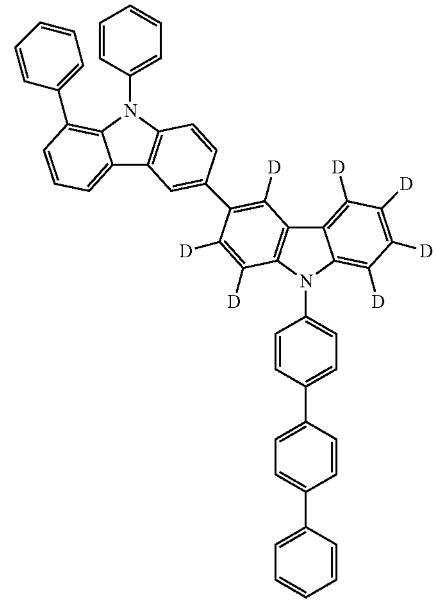
14
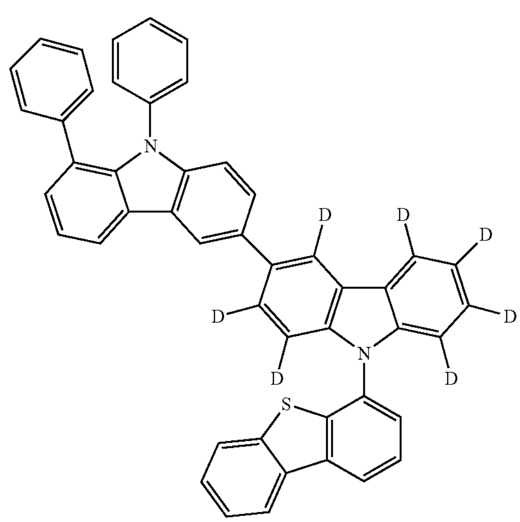
16
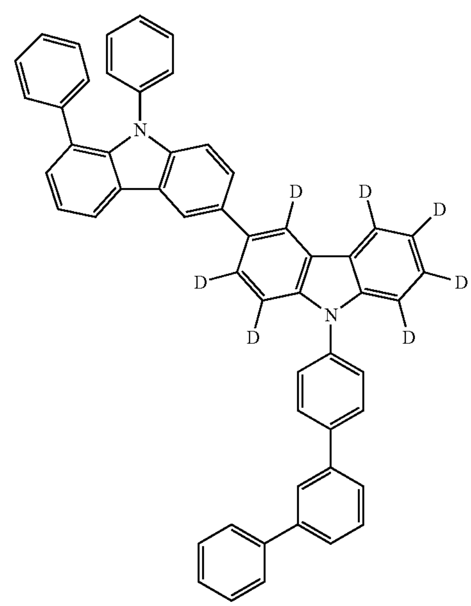

-continued
17
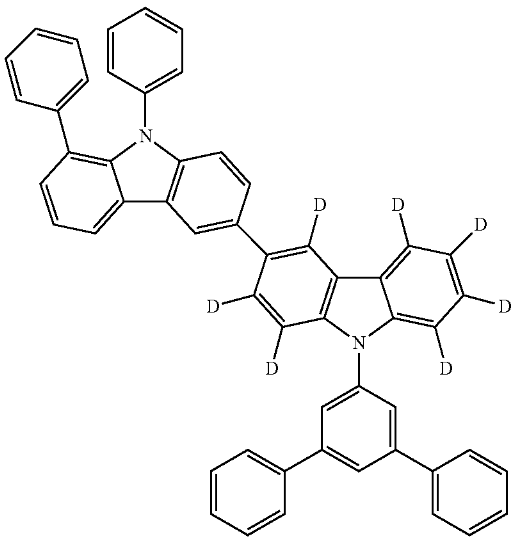
18
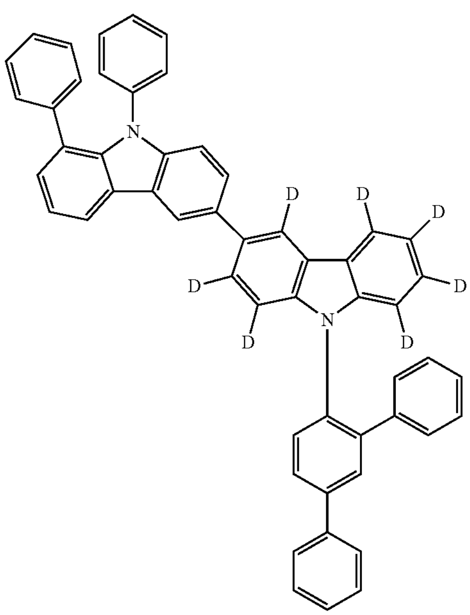
-continued
19
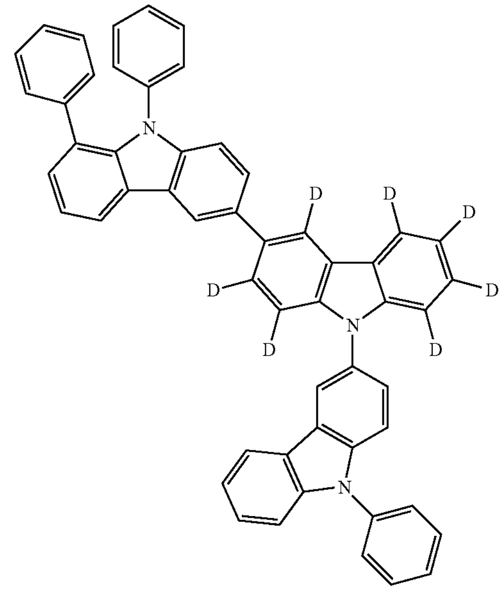
20
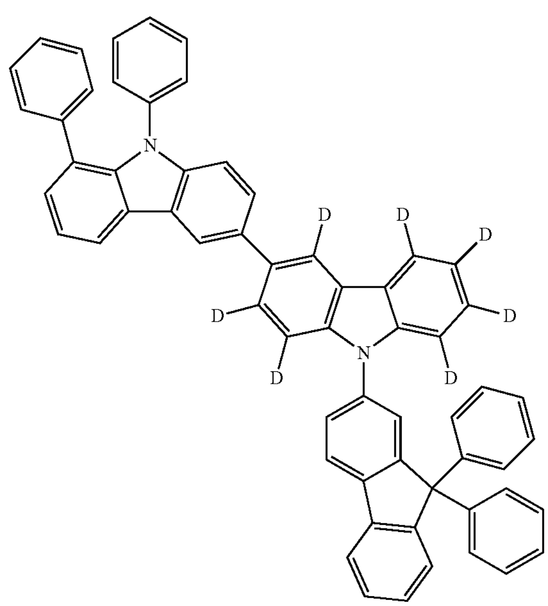

-continued
21
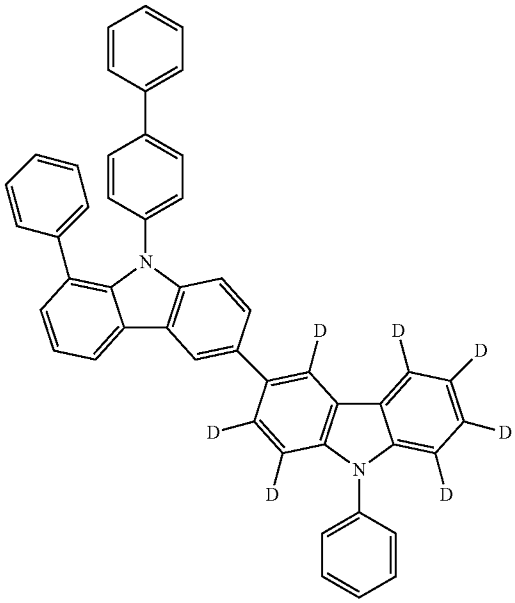
22
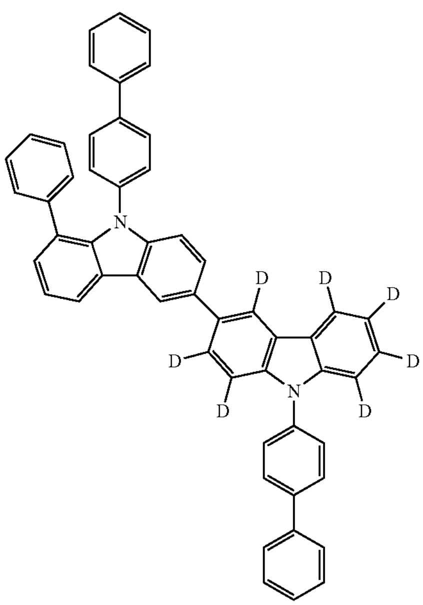
-continued
23
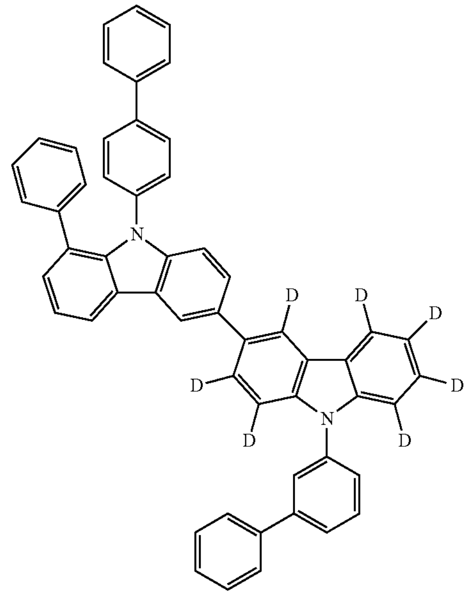
24
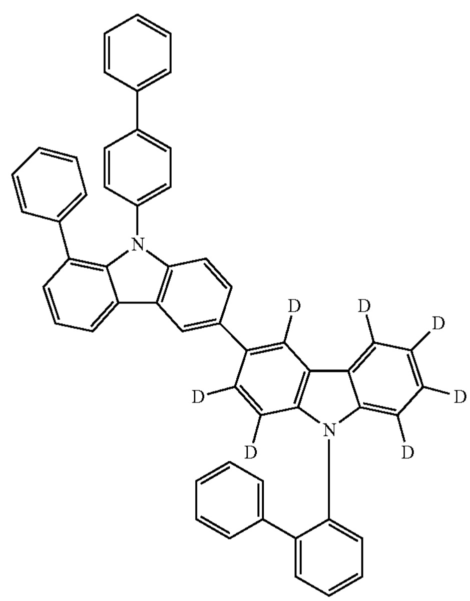

-continued
25
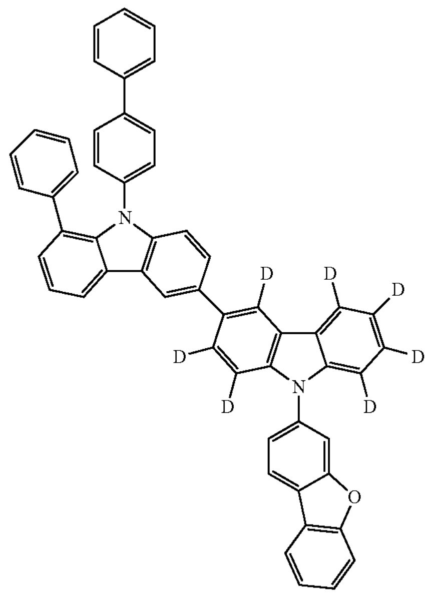
26
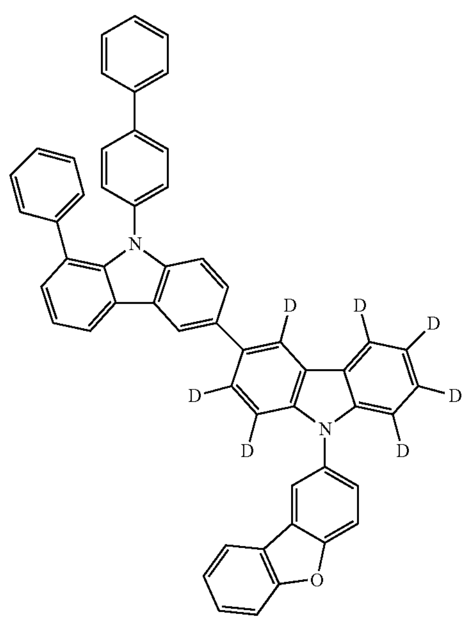
-continued
27
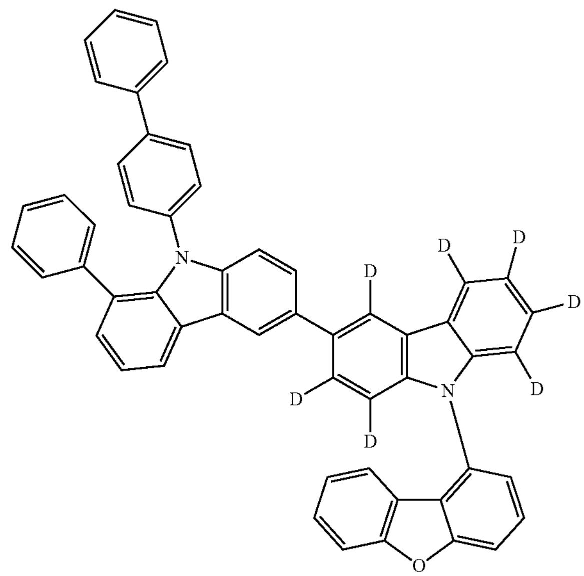
28
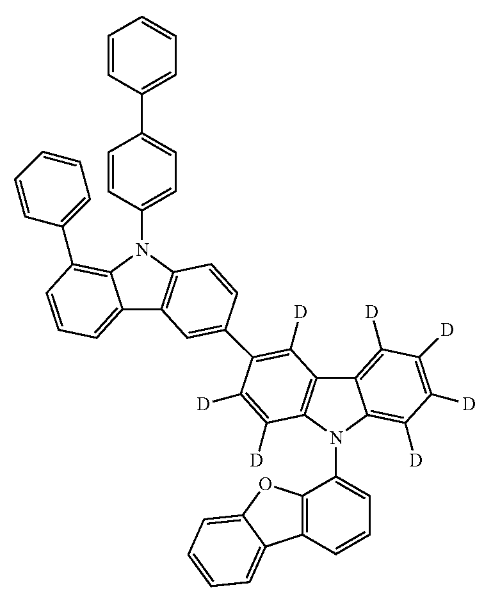

-continued
29
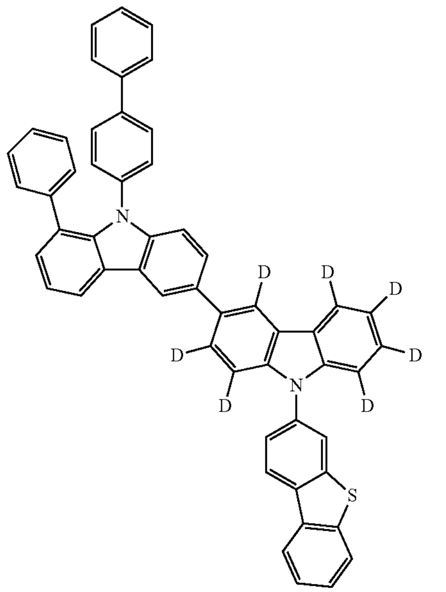
31
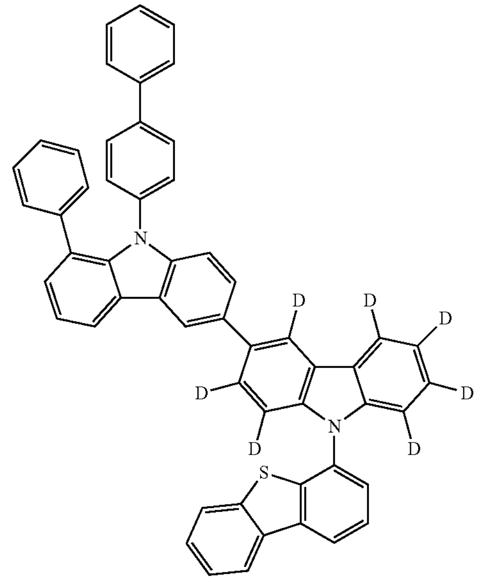
30
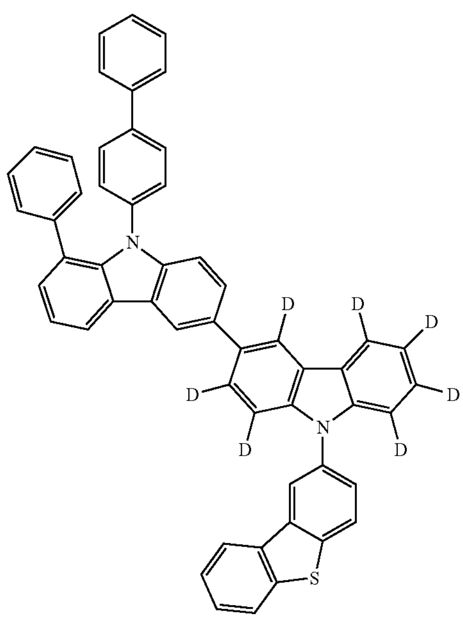
32
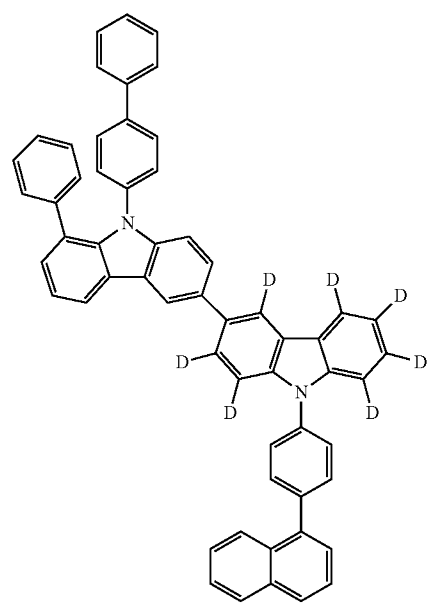

33
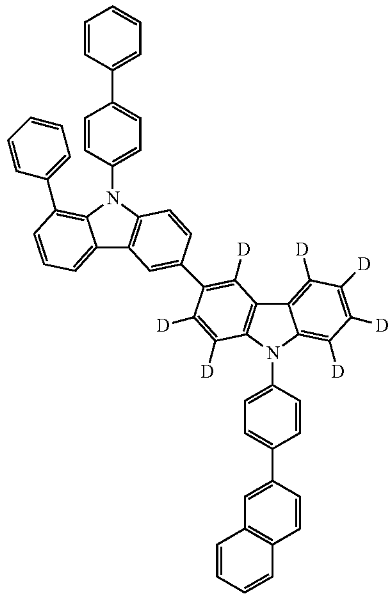
34
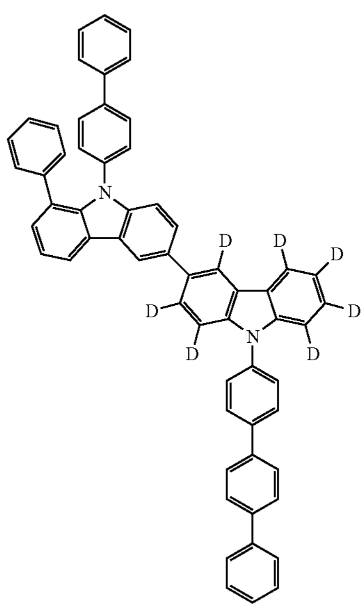
35
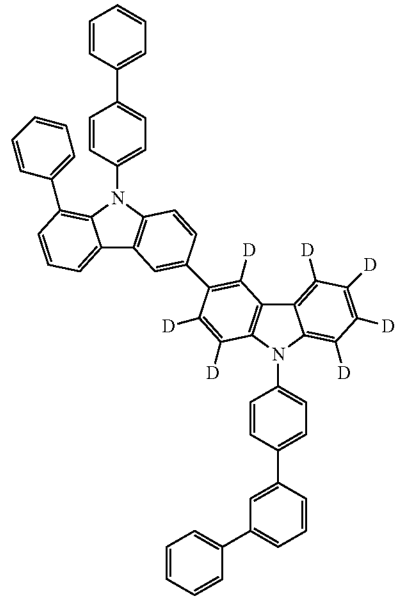
36
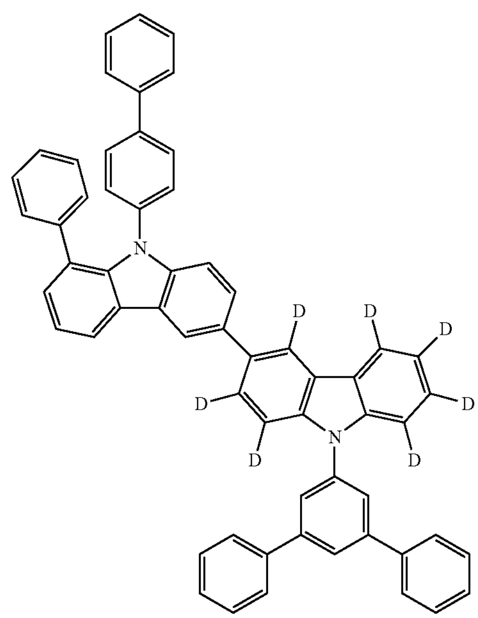

37
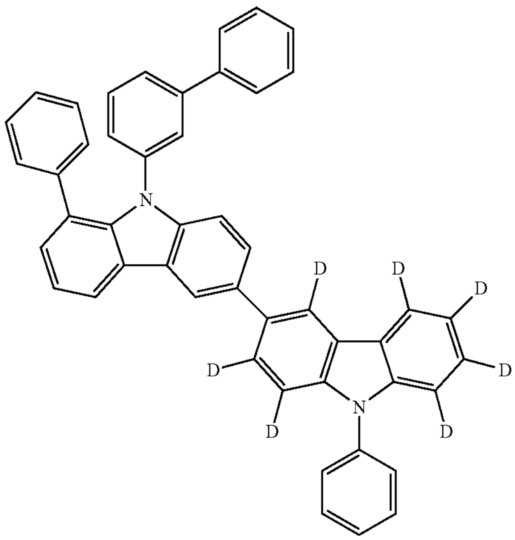
38
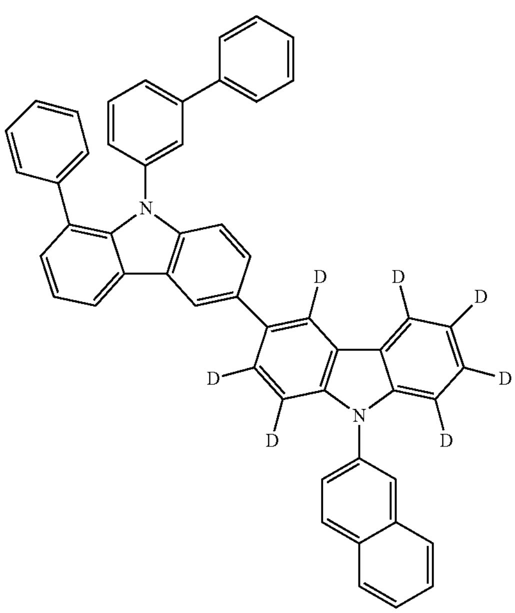
39
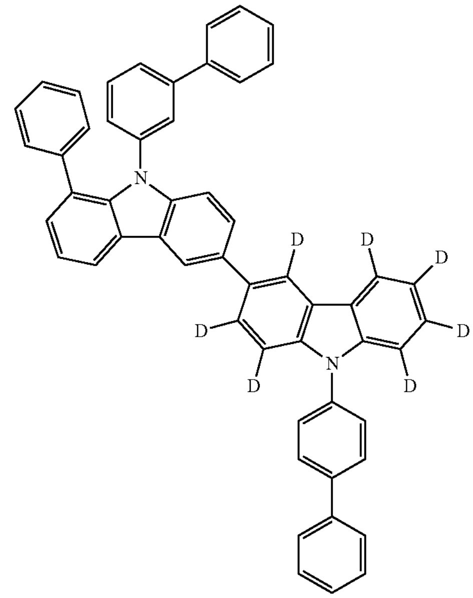
40
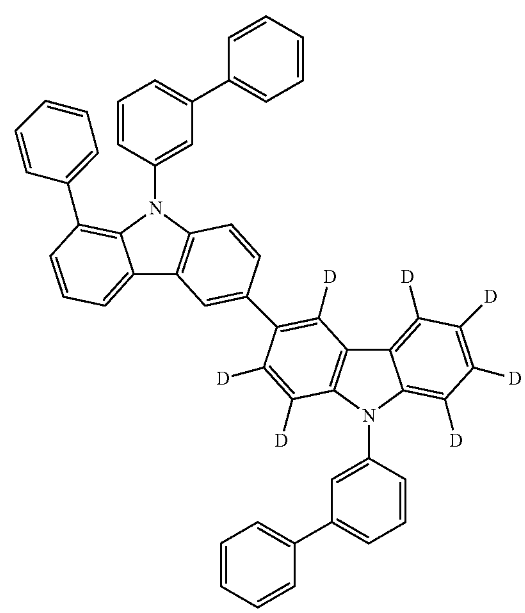

-continued
41
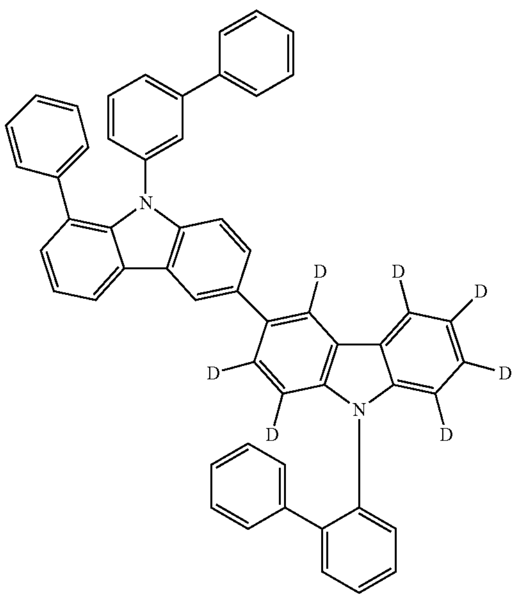
42
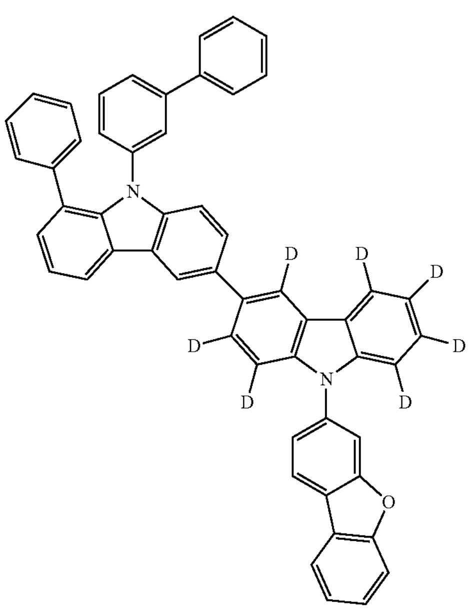
-continued
43
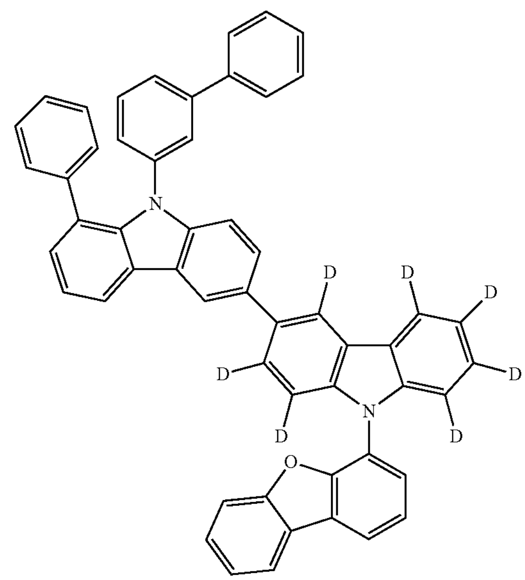
44
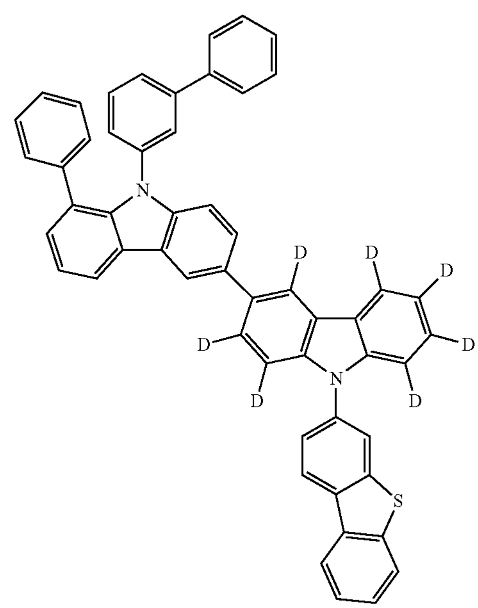

45
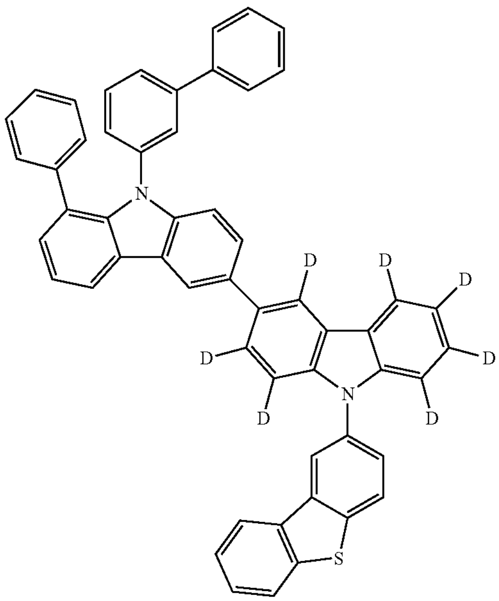
47
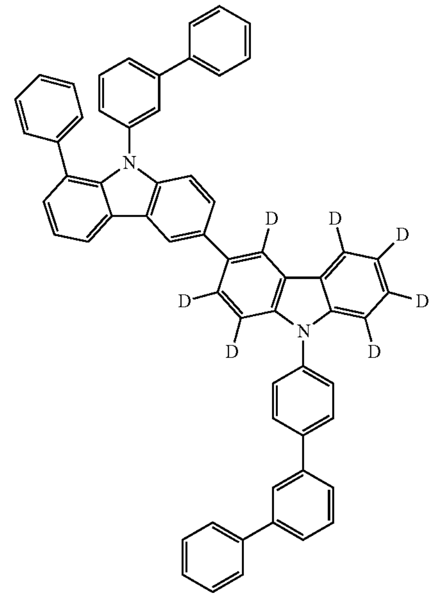
46
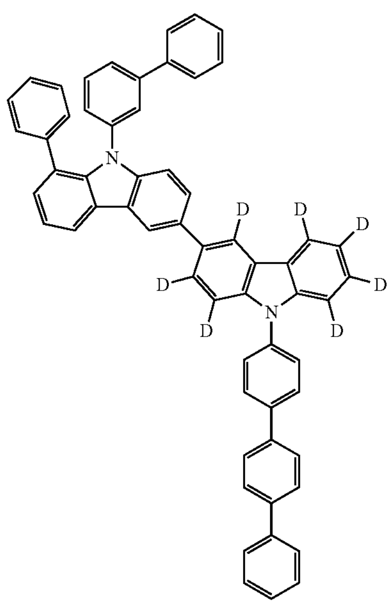
48
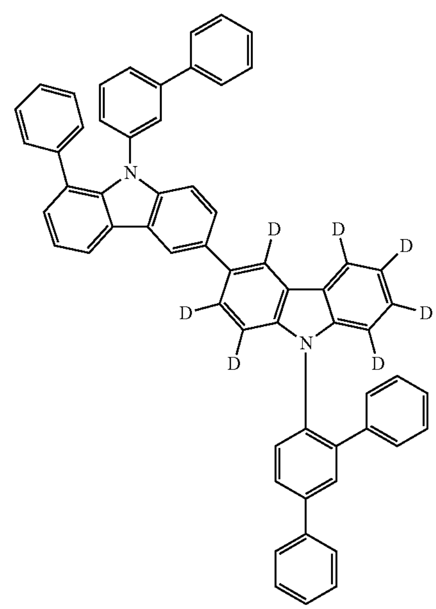

-continued
49
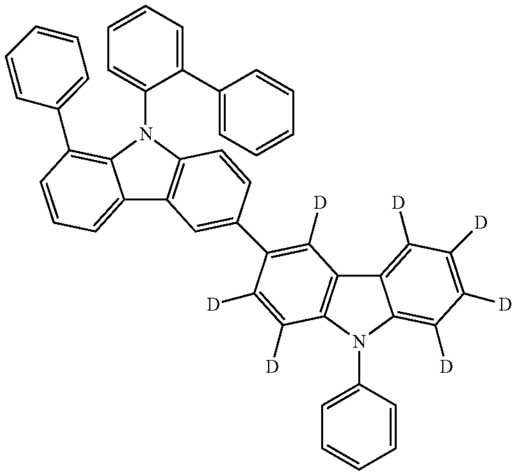
50
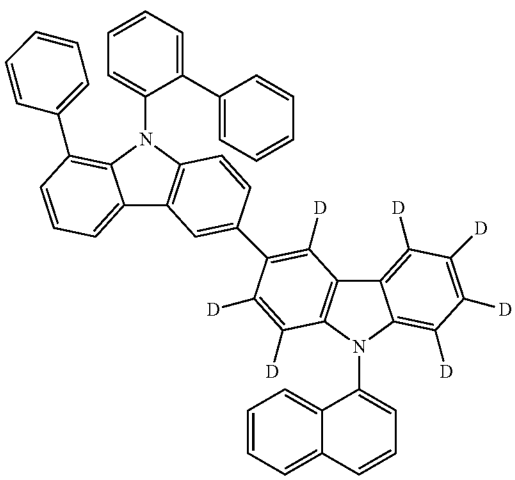
51
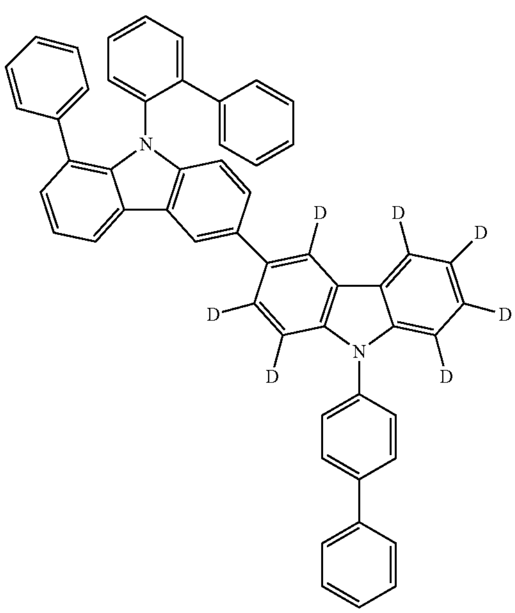
-continued
52
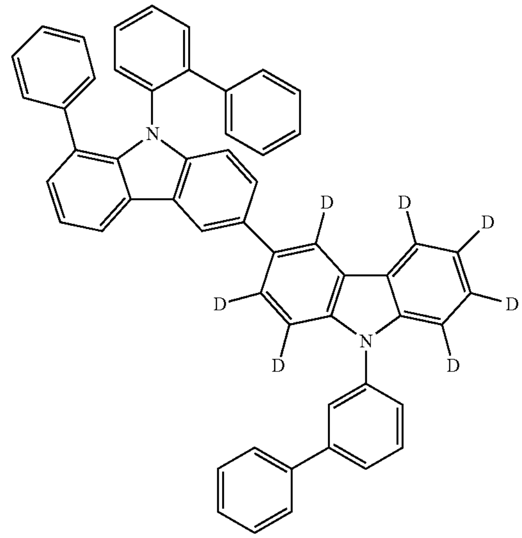
53
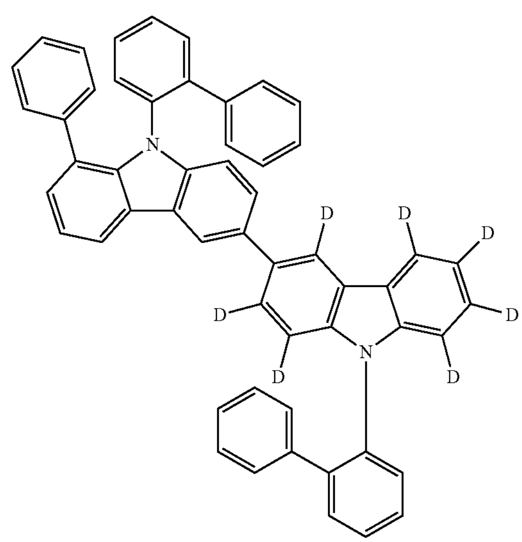

-continued
54
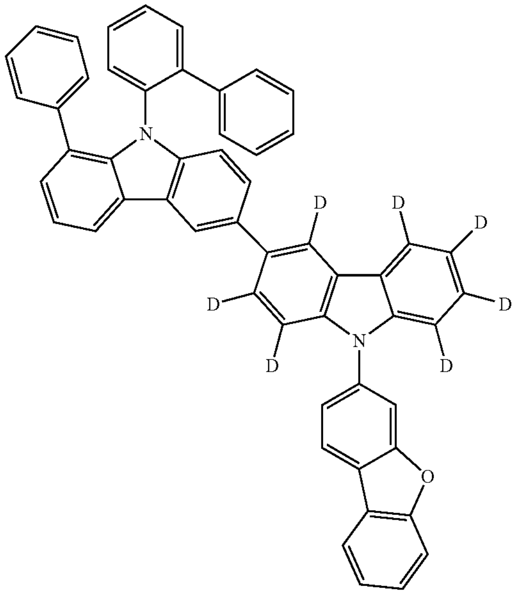
55
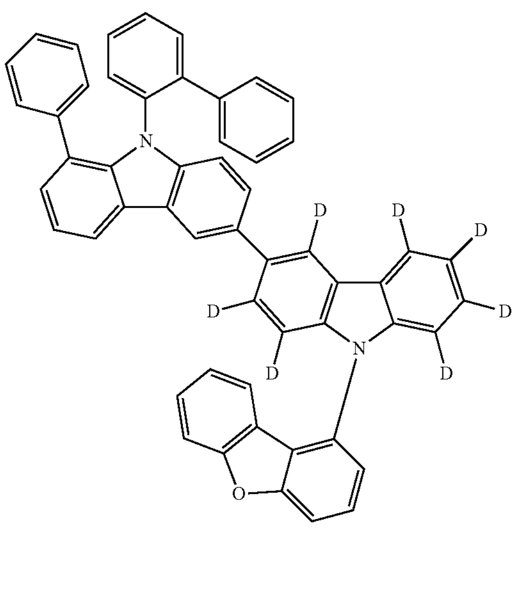
-continued
56
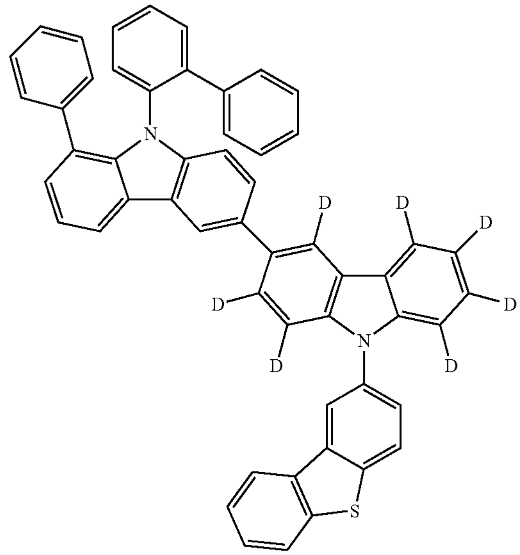
57
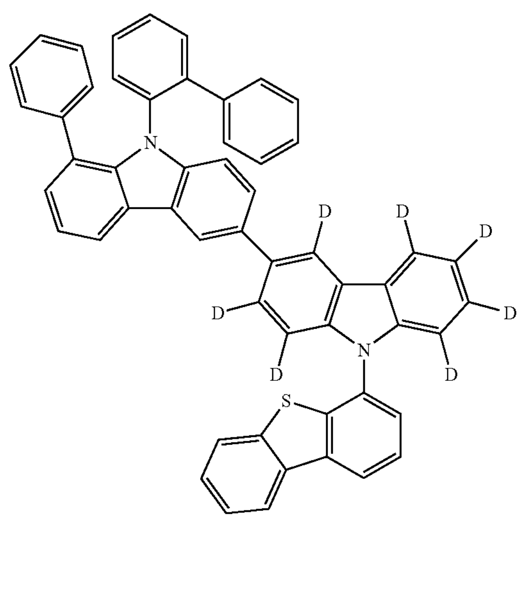

-continued
58
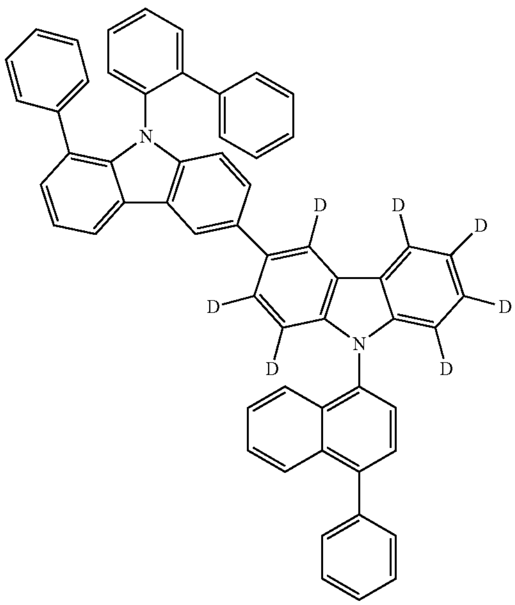
59
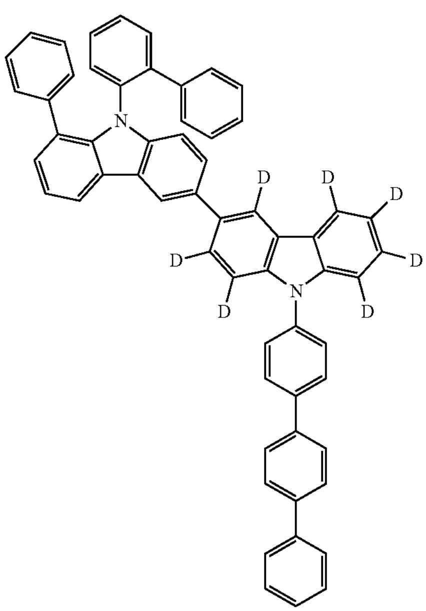
-continued
60
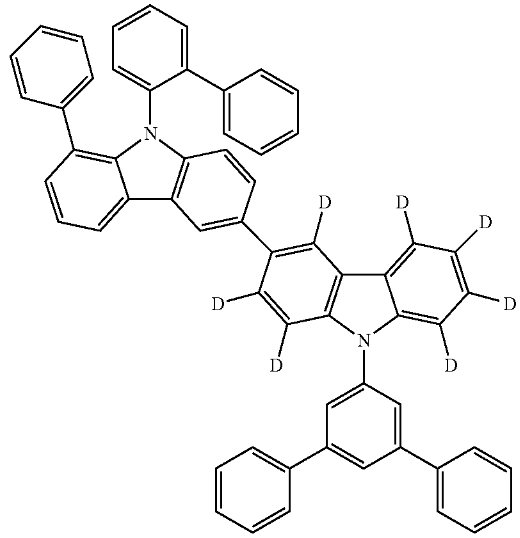
61
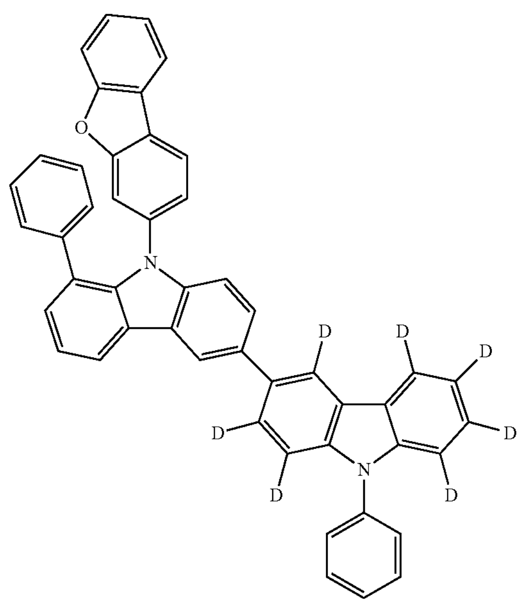

-continued
62
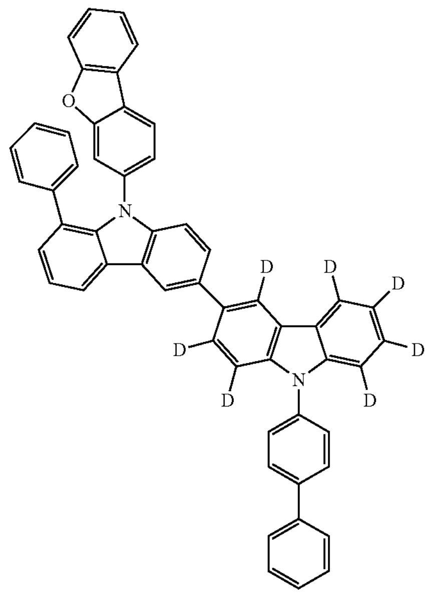
63
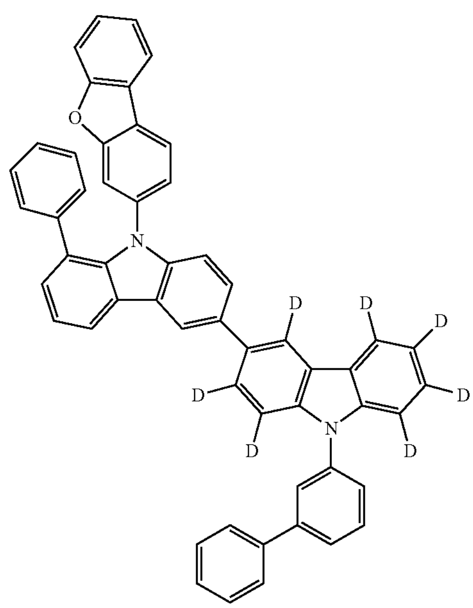
-continued
64
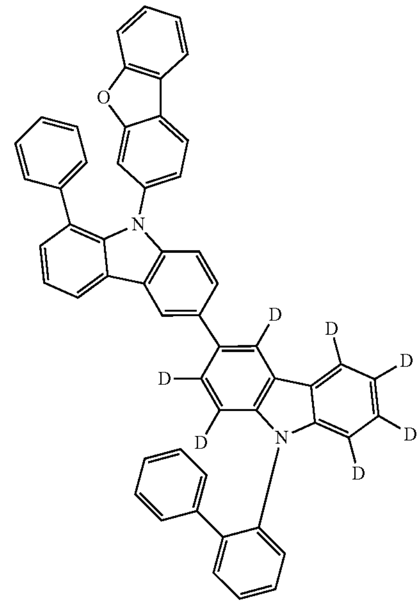
65
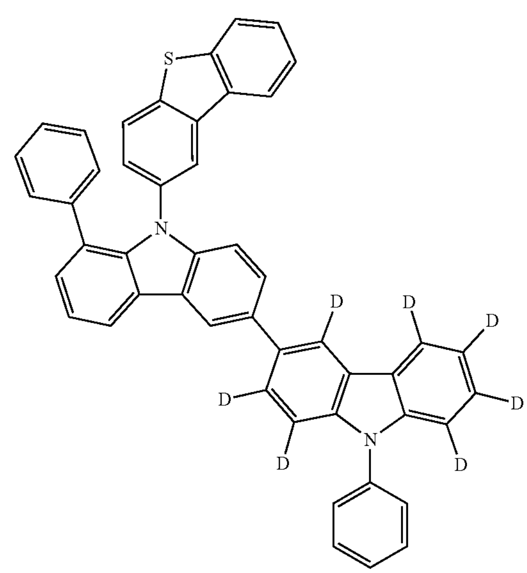

-continued
66
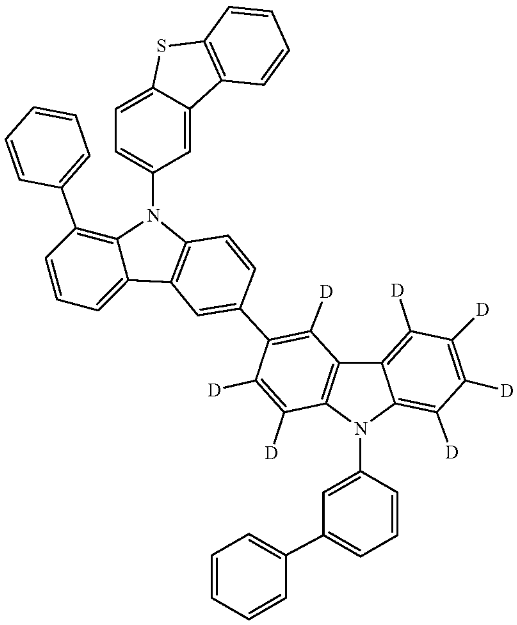
68
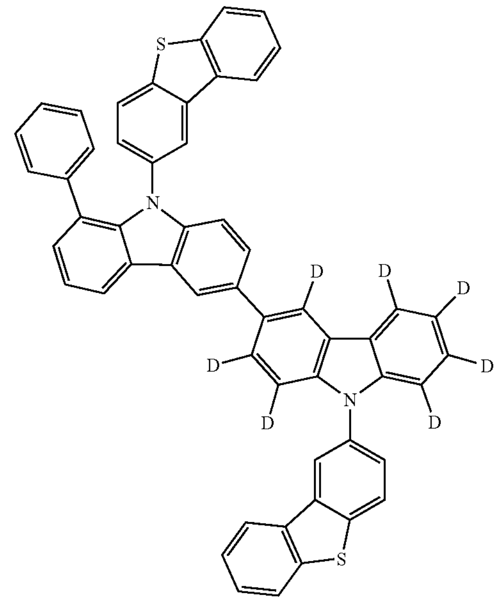
67
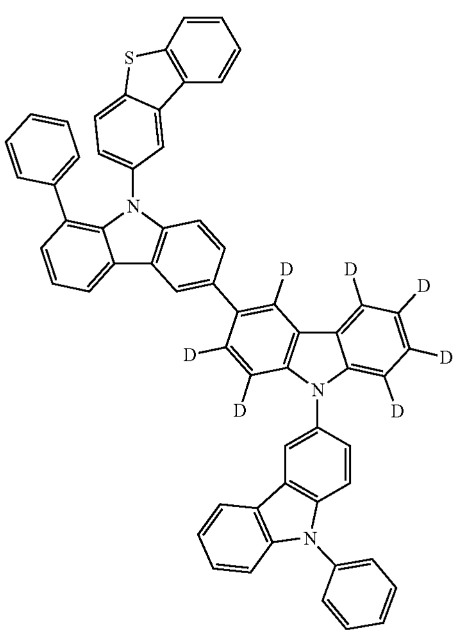
69
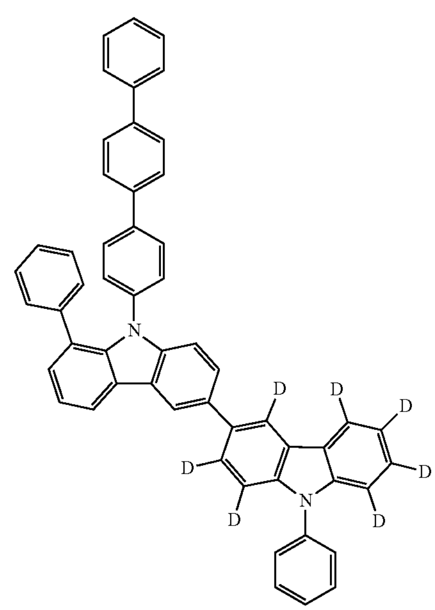

-continued
70
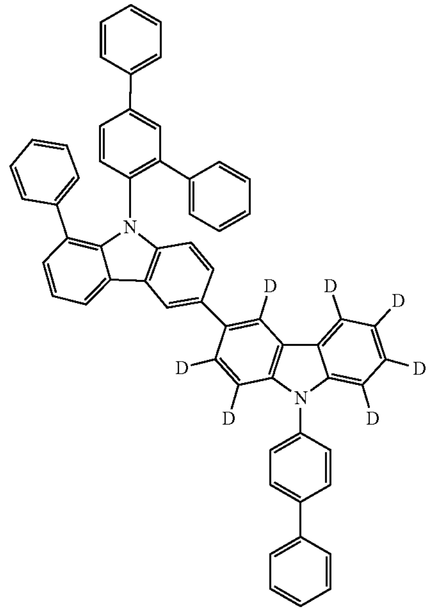
71
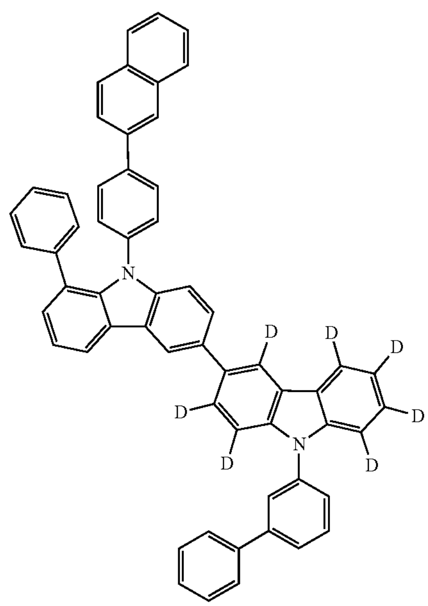
-continued
72
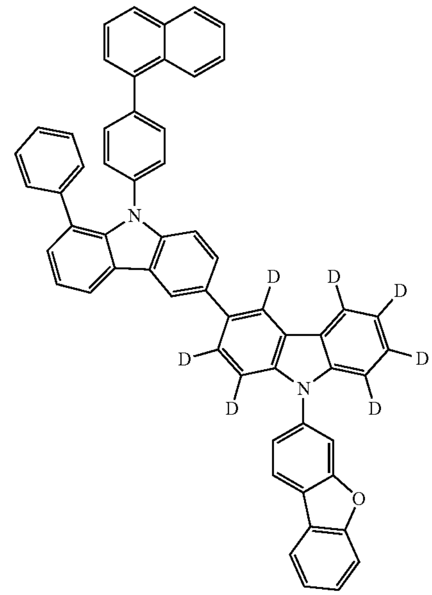
73
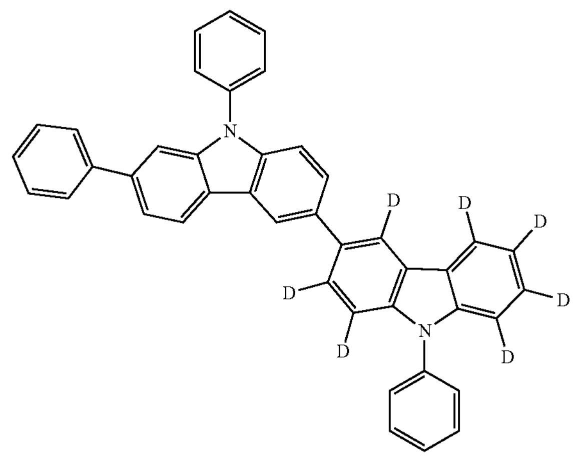
74
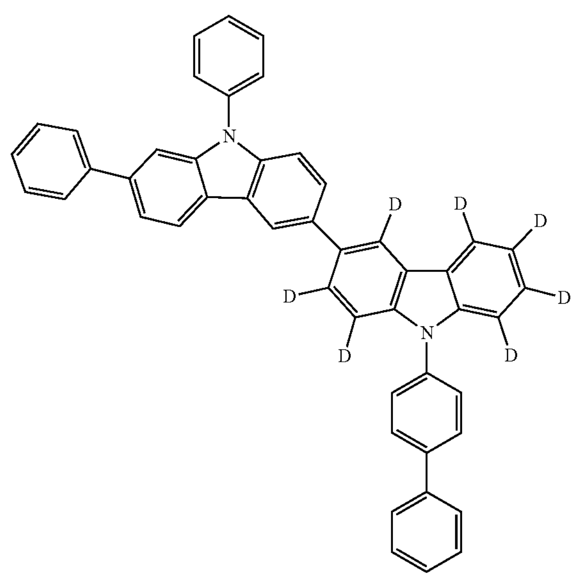

-continued
75
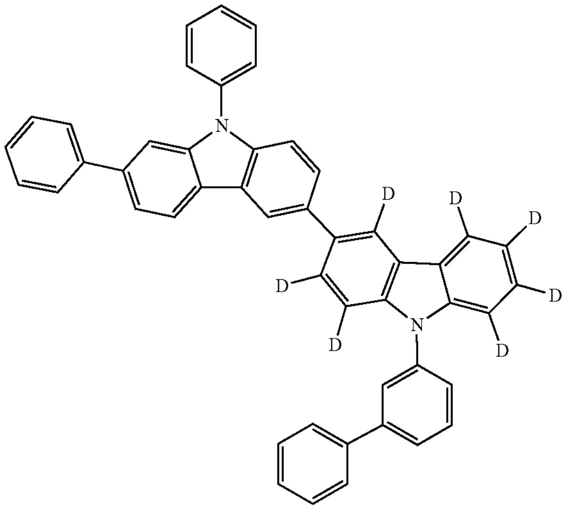
76
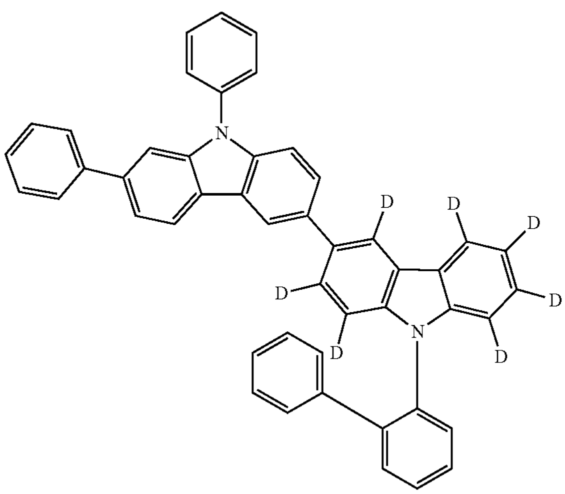
77
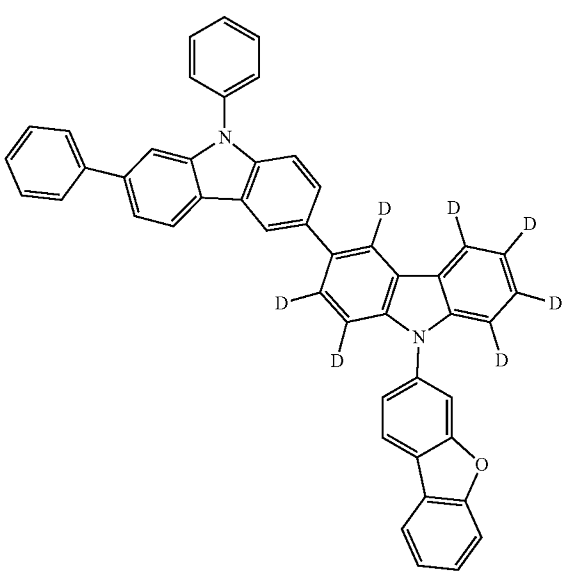
-continued
78
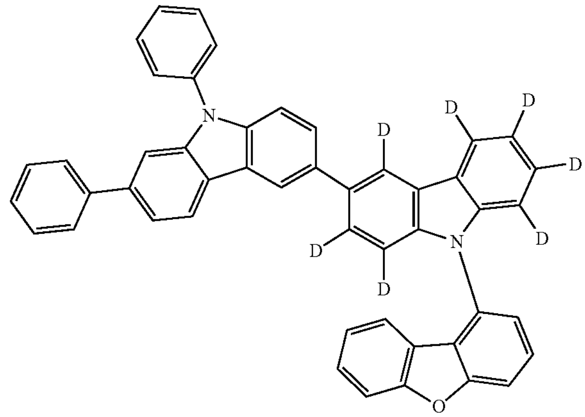
79
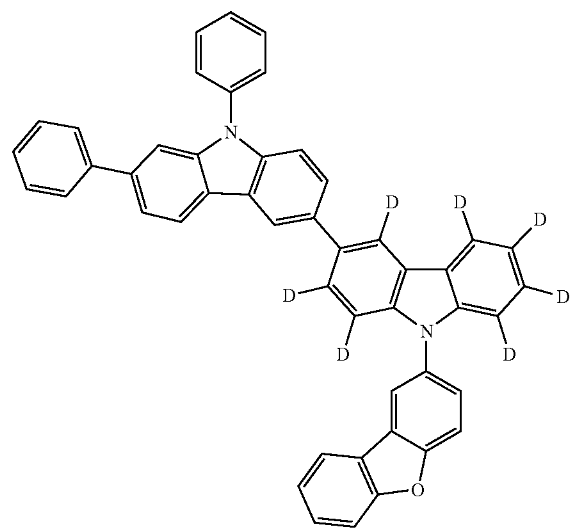
80
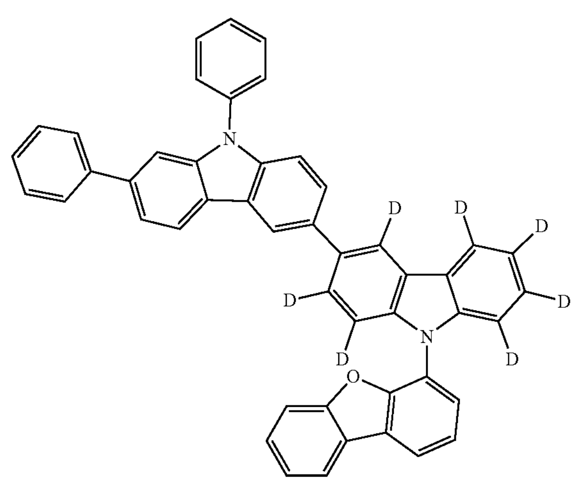

81
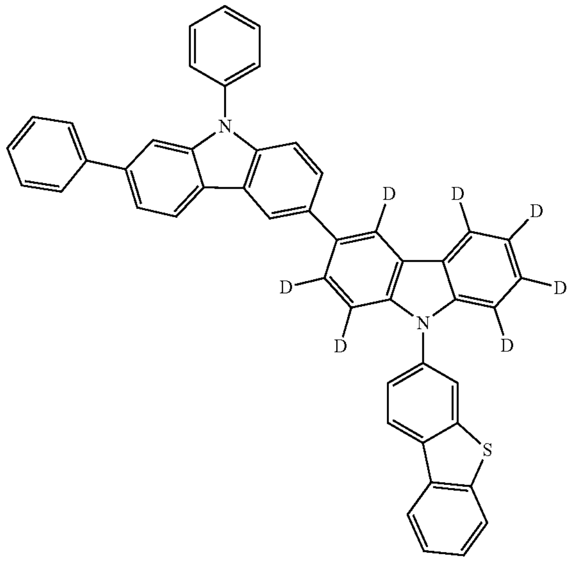
82
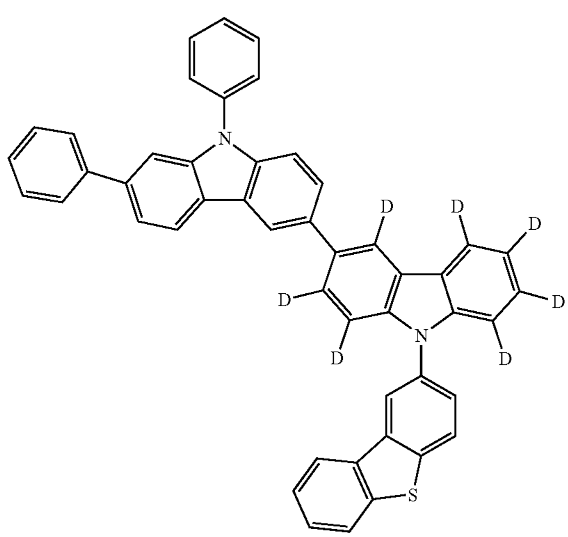
83
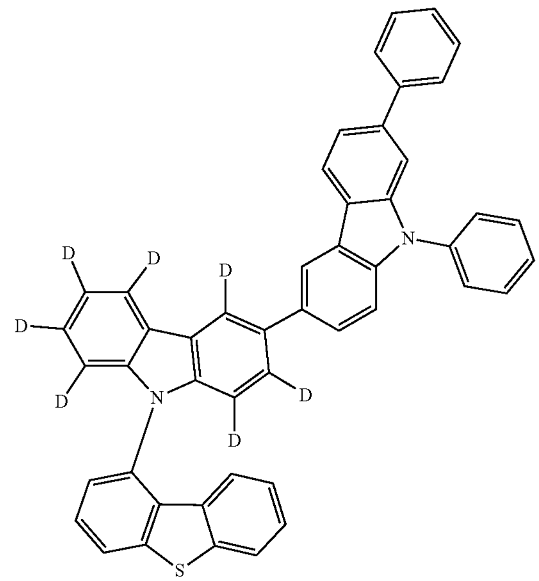
84
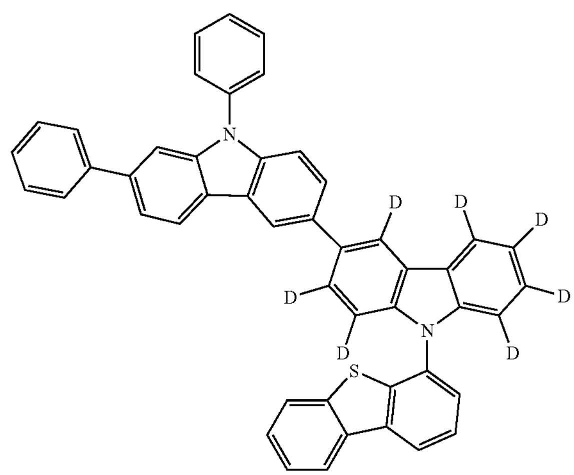
85
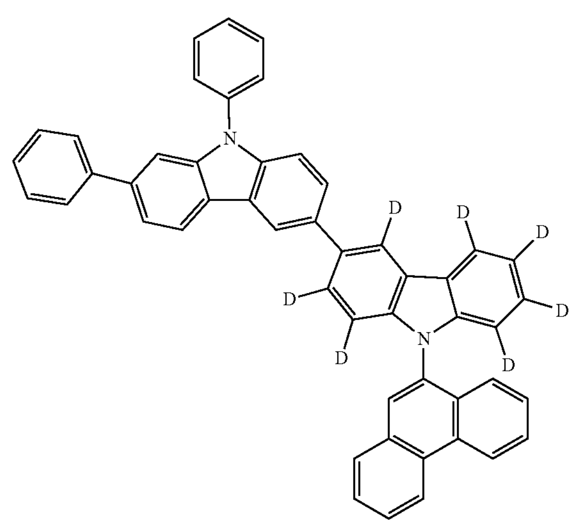

-continued
86
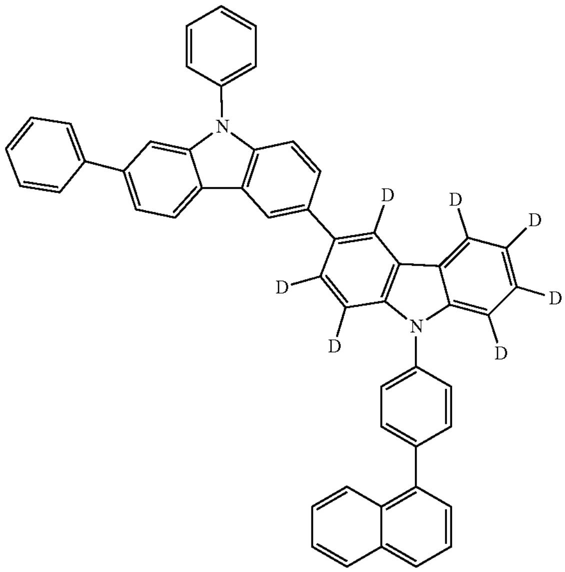
87
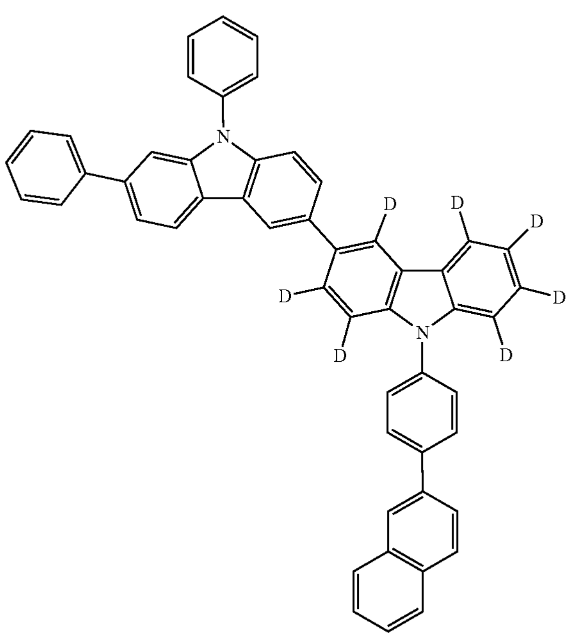
-continued
88
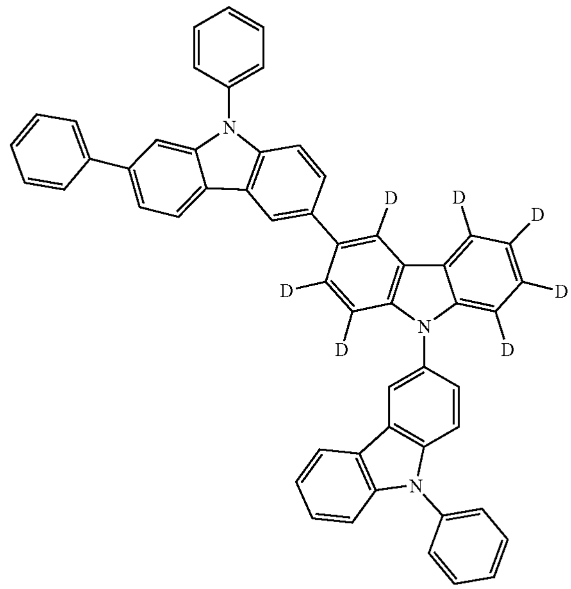
89
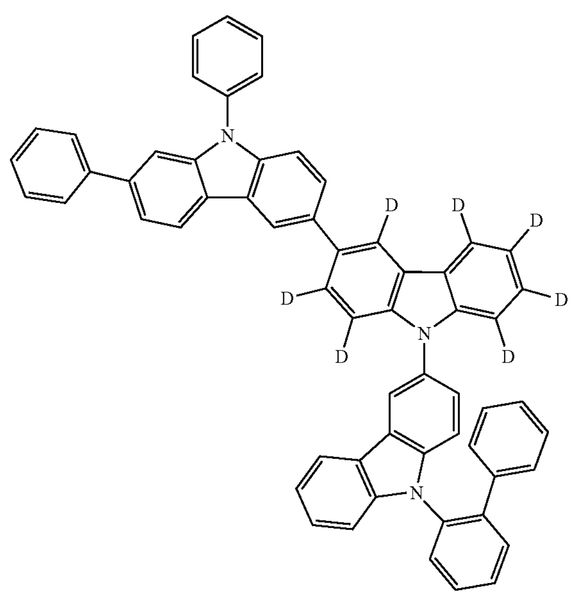

-continued
90
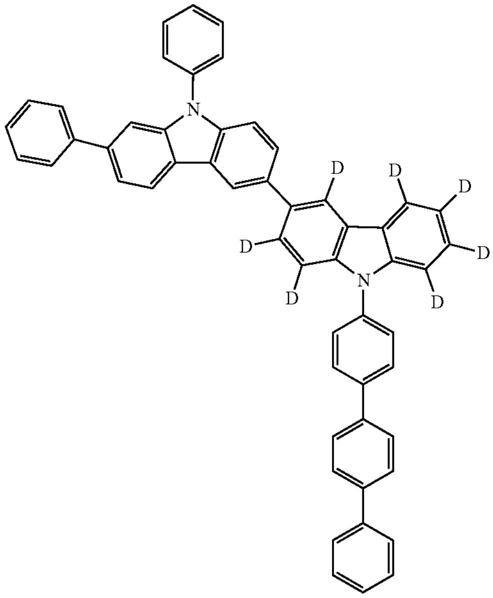
91
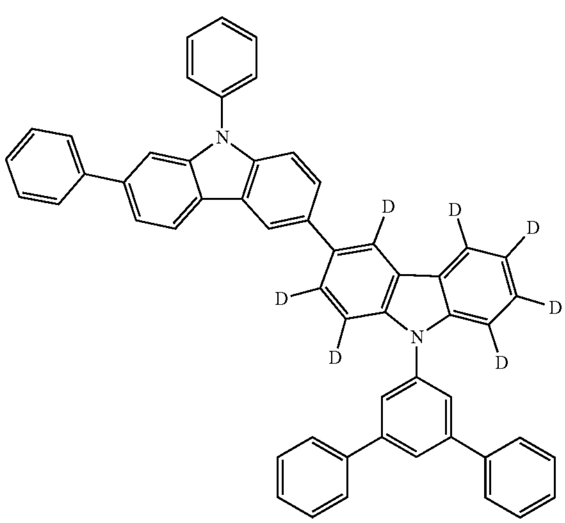
-continued
92
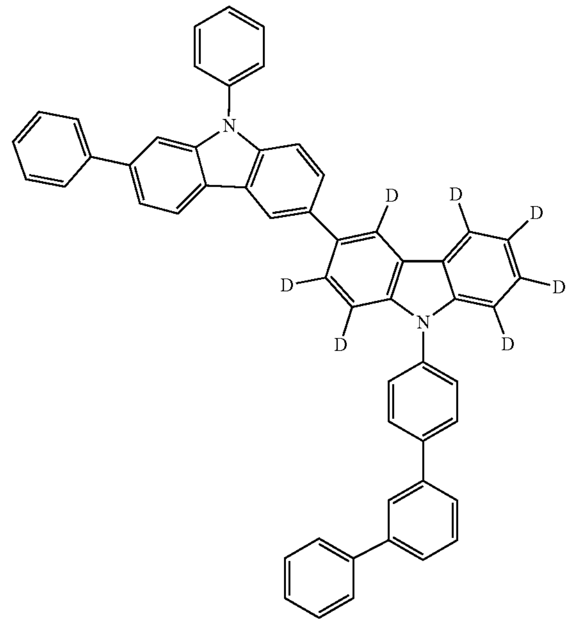
93
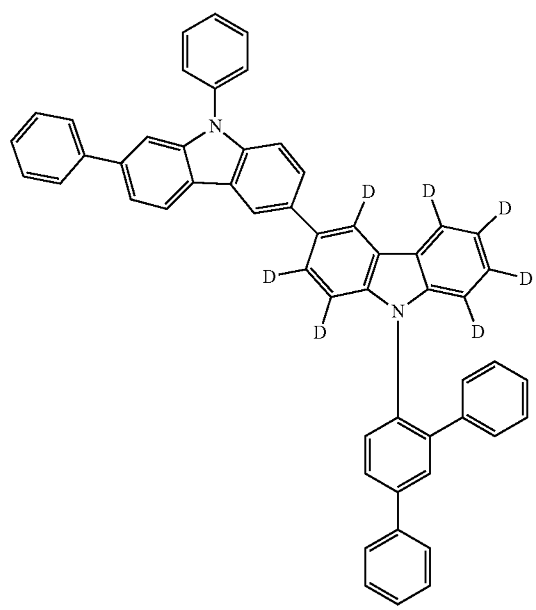

-continued
94
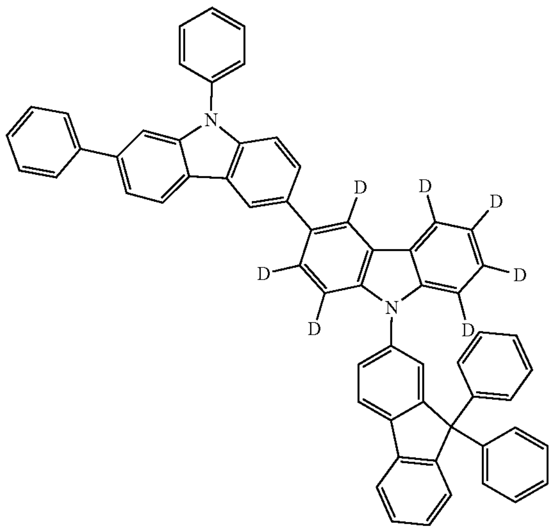
95
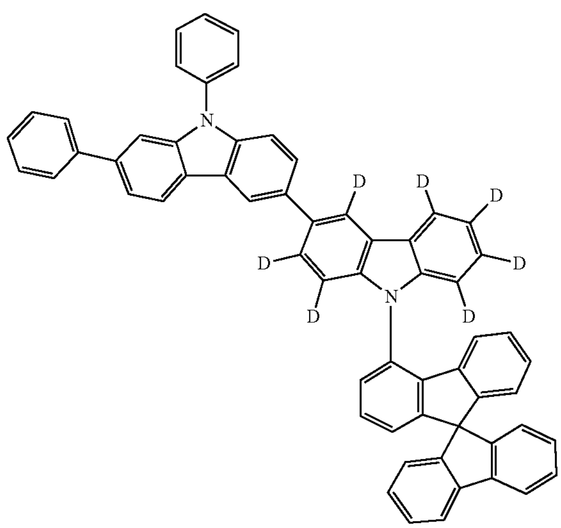
96
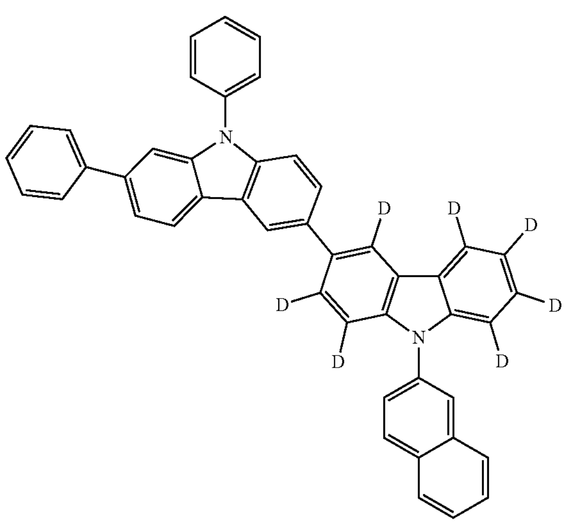
-continued
97
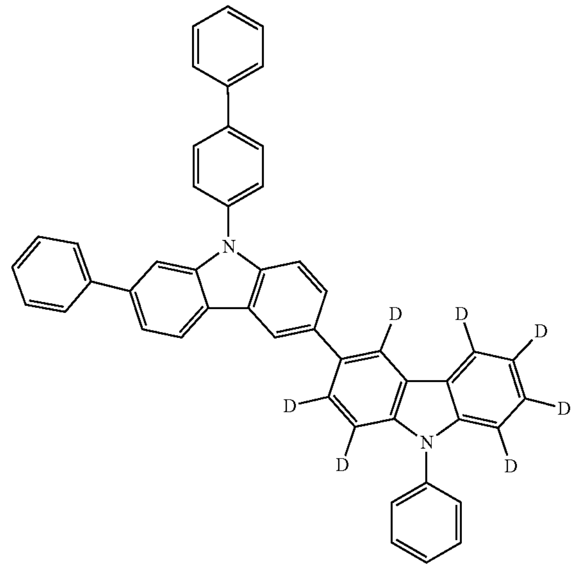
98
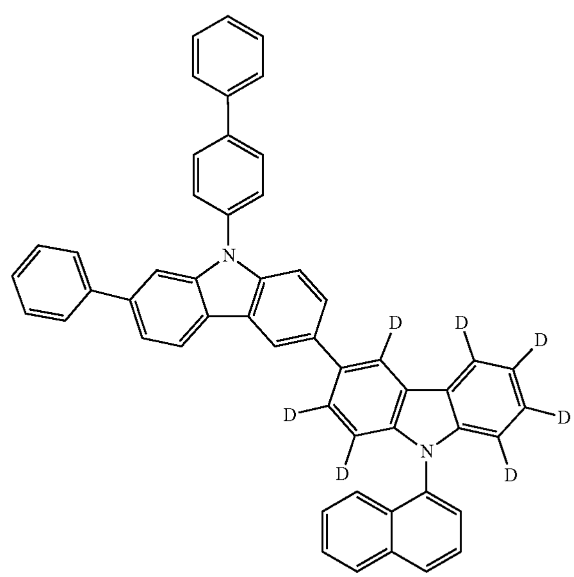

-continued
99
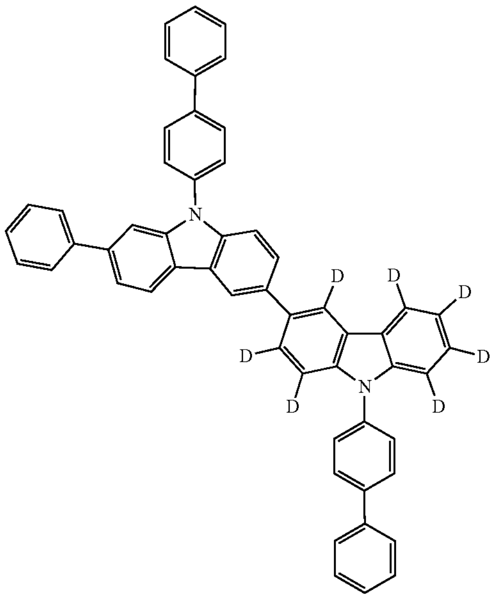
100
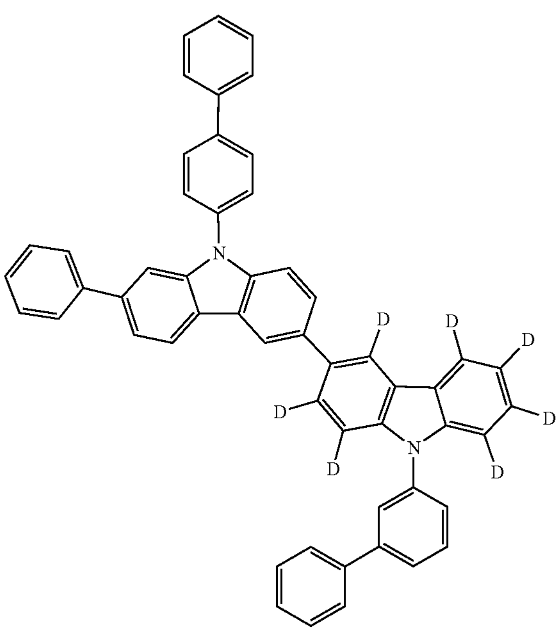
-continued
101
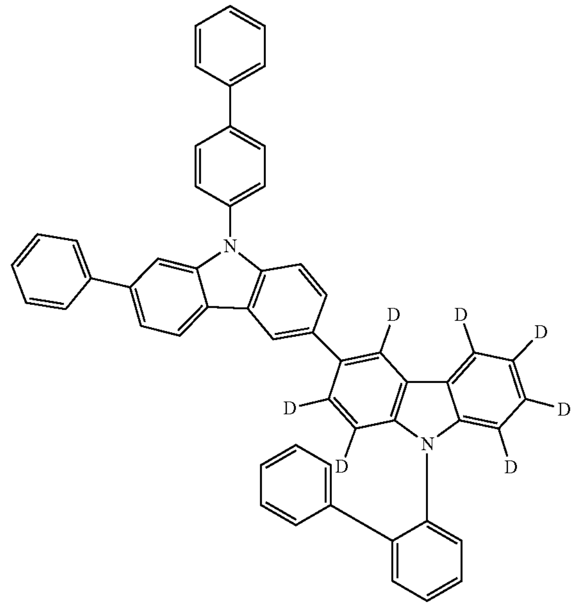
102
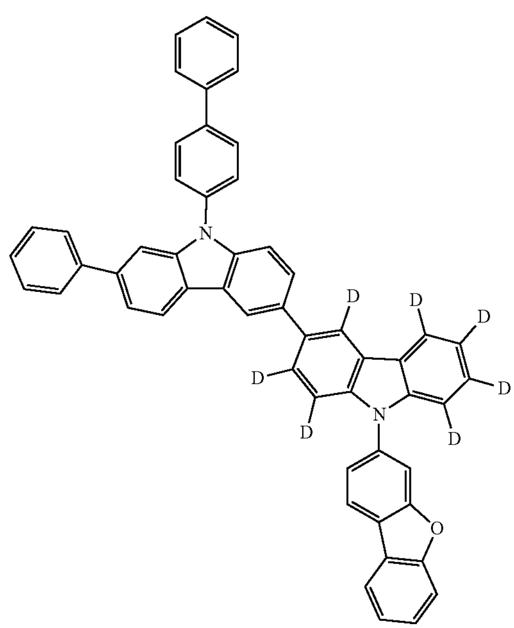

-continued
103
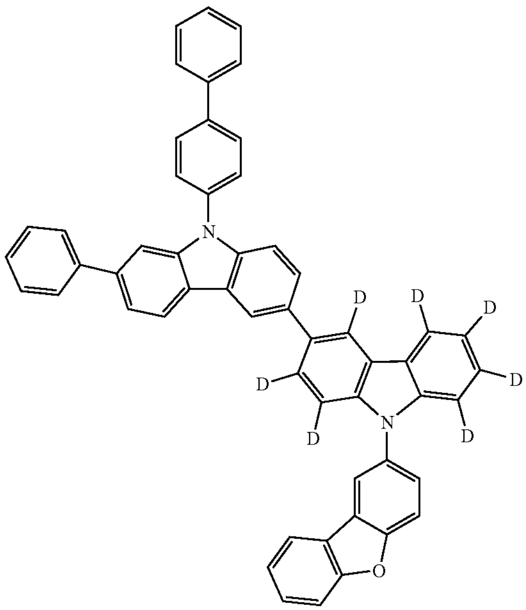
104
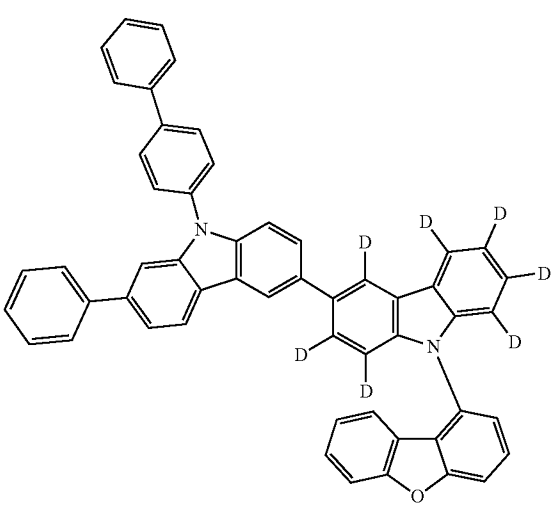
-continued
105
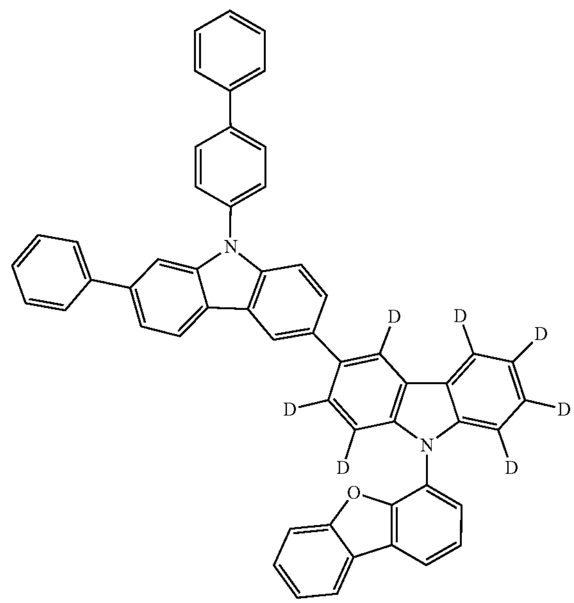
106
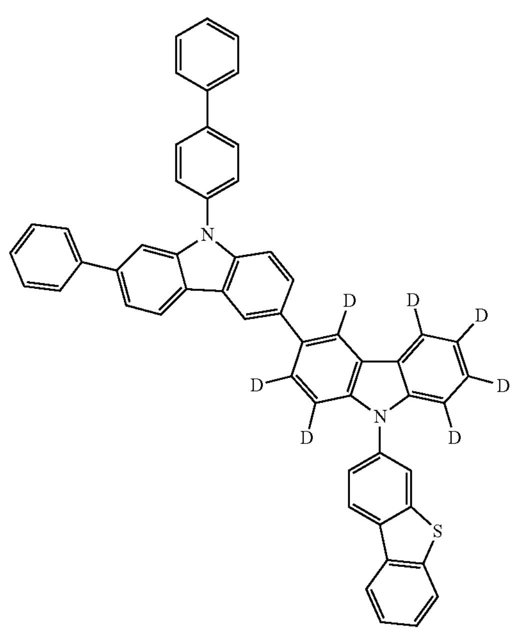

107
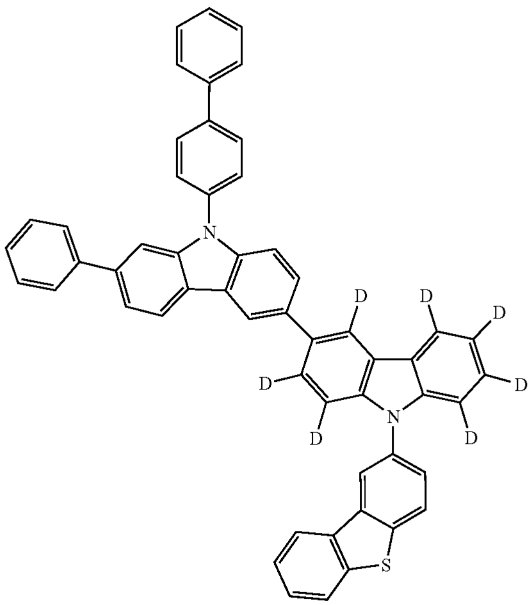
108
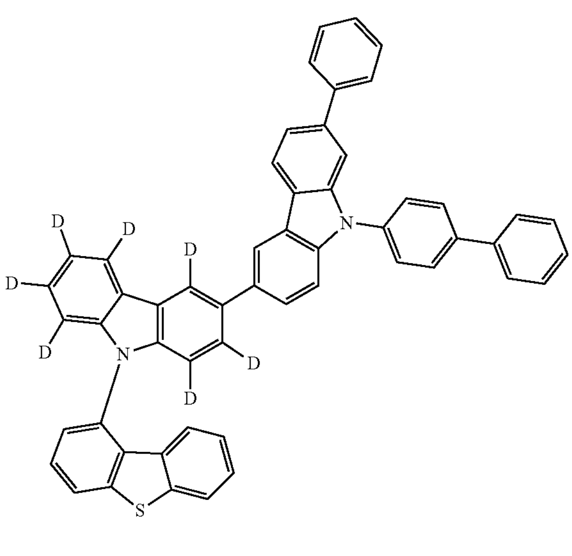
109
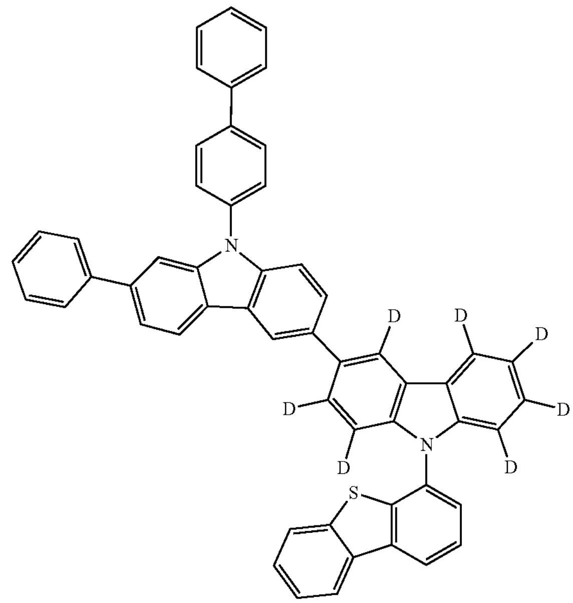
110
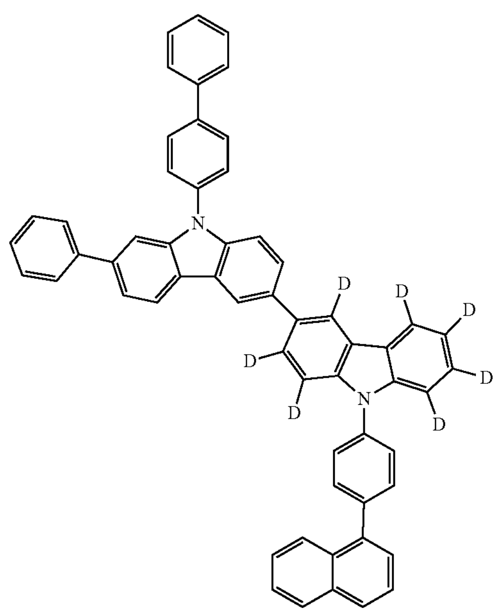

-continued
111
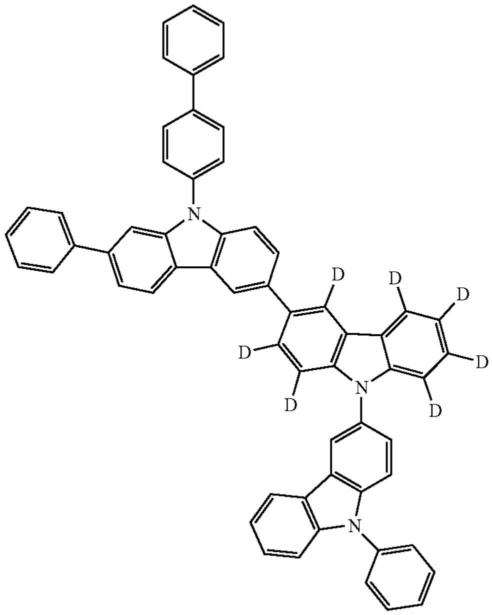
112
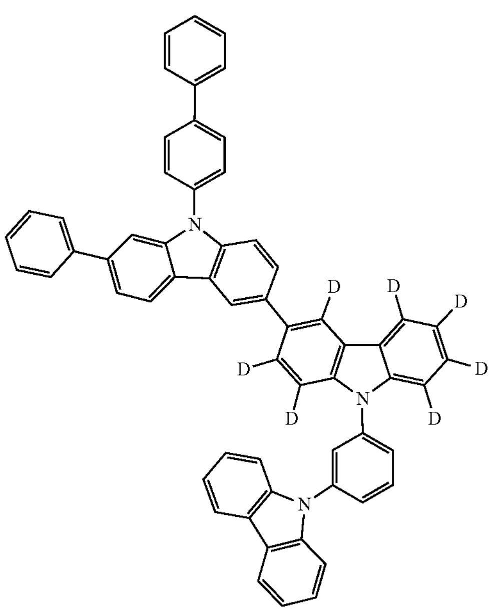
-continued
113
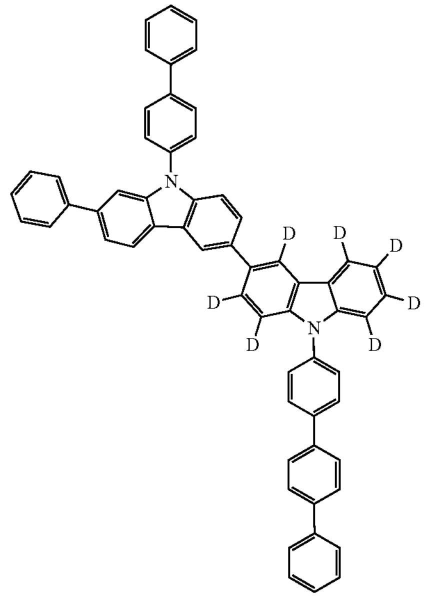
114
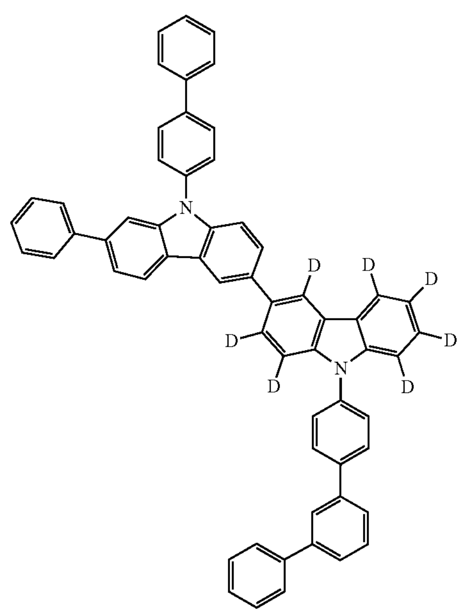

115
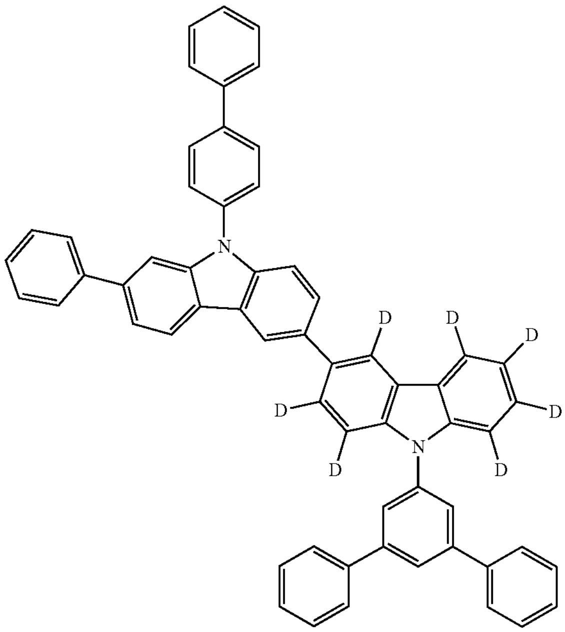
116
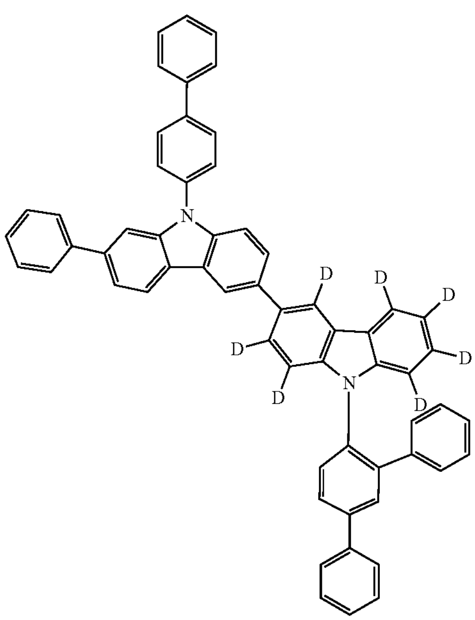
117
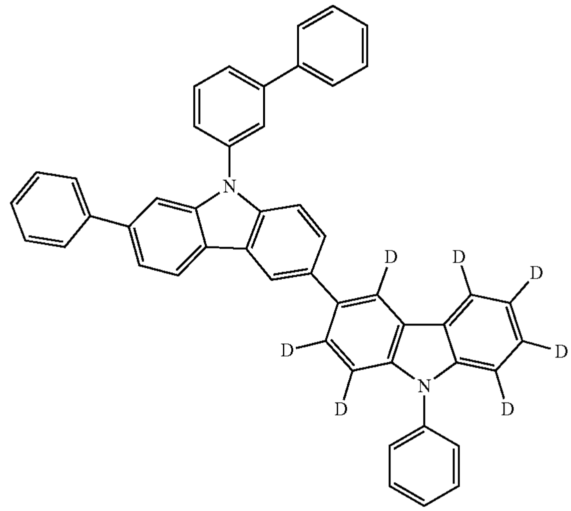
118
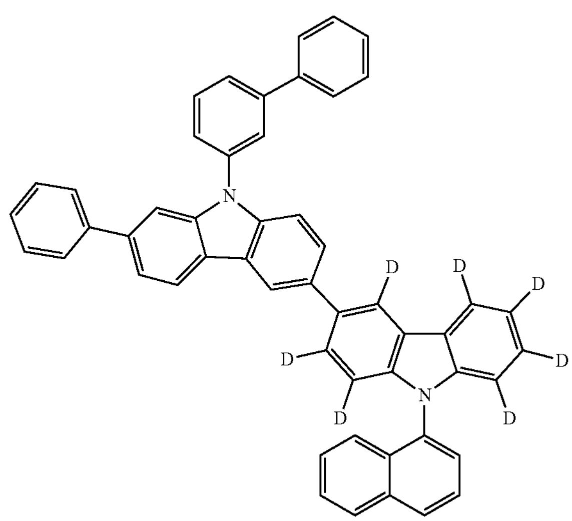

-continued
119
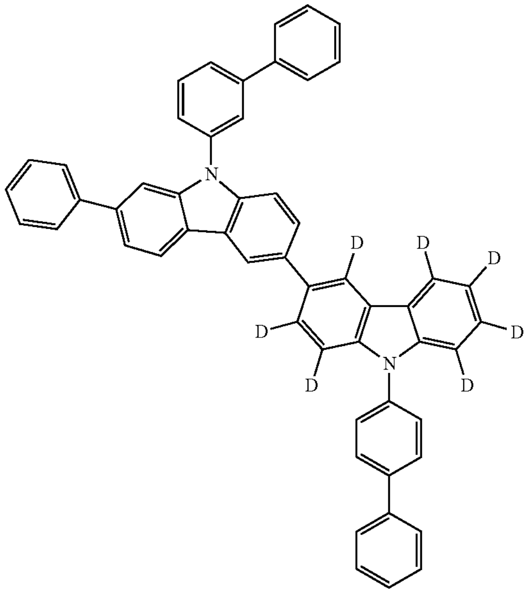
120
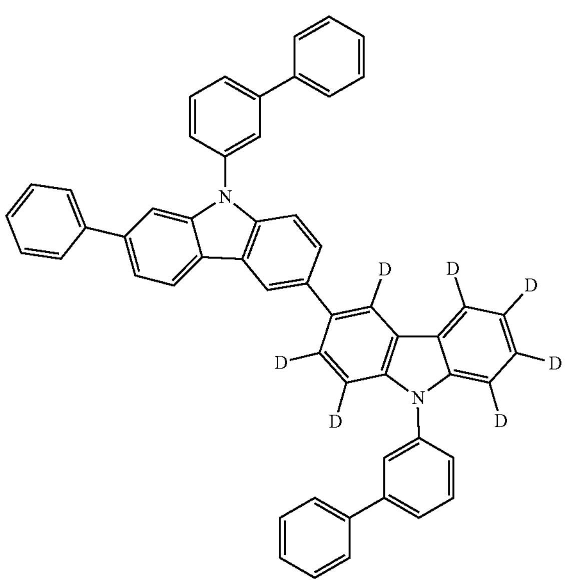
-continued
121
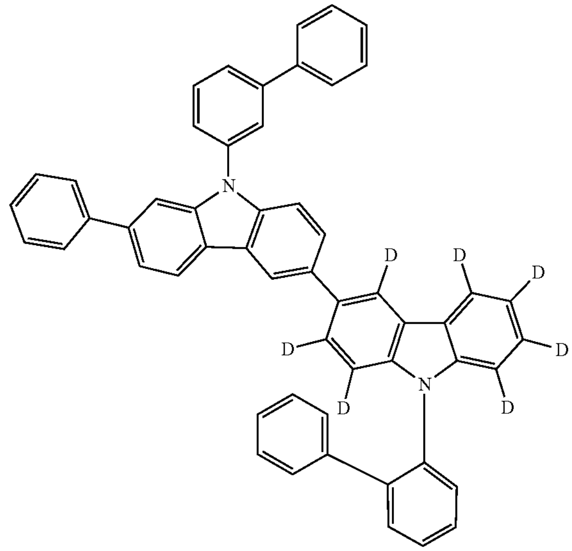
122
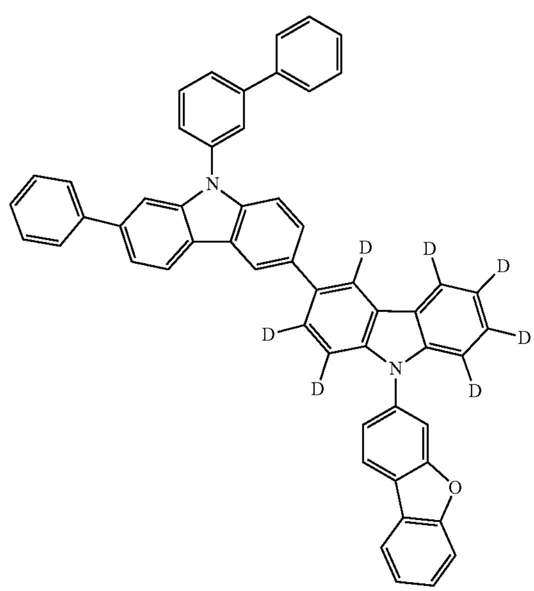

123
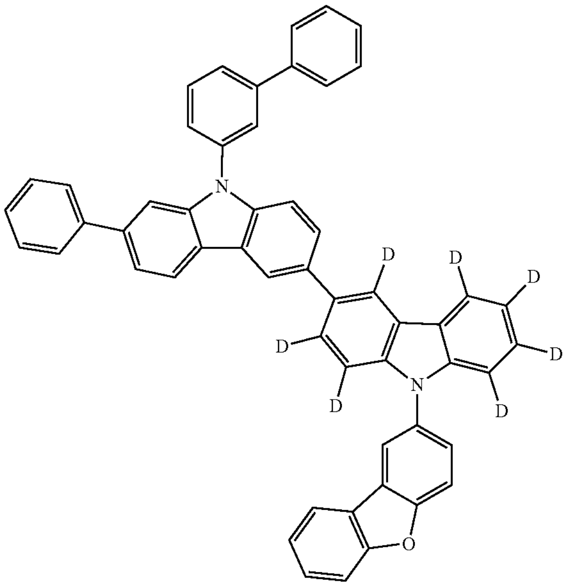
124
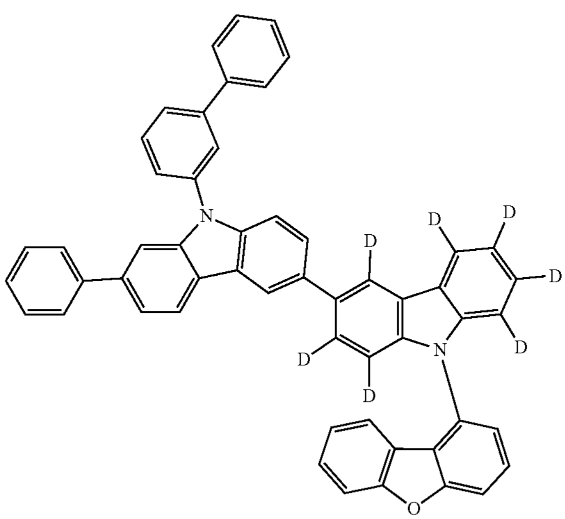
125
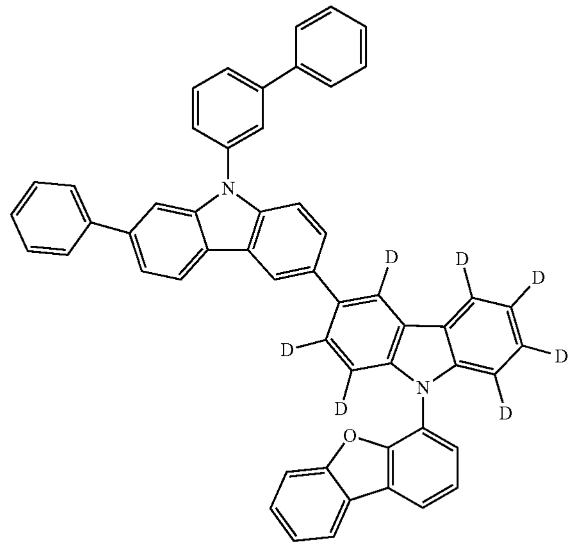
126
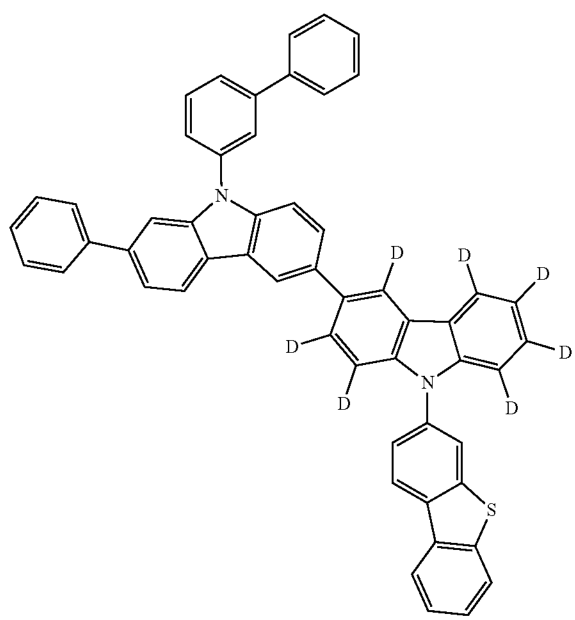

-continued
127
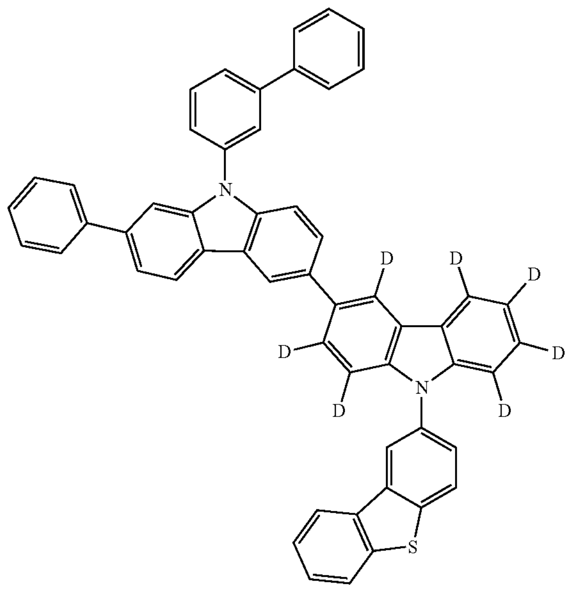
128
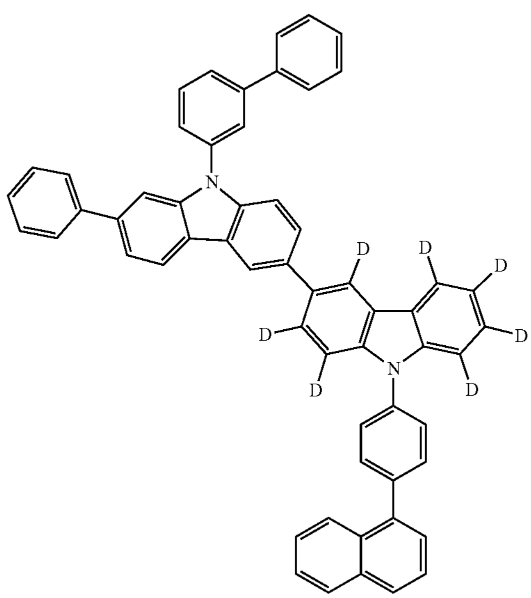
-continued
129
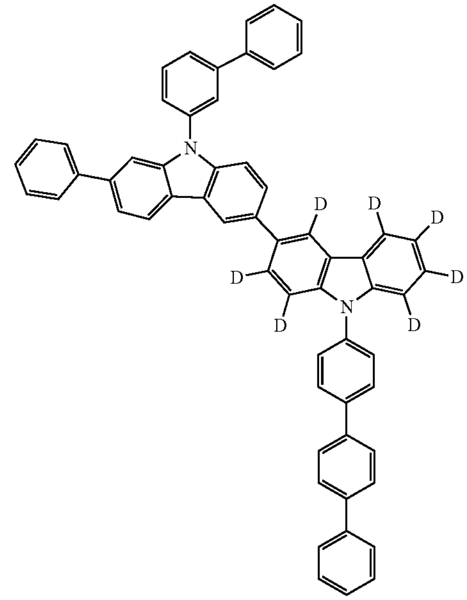
130
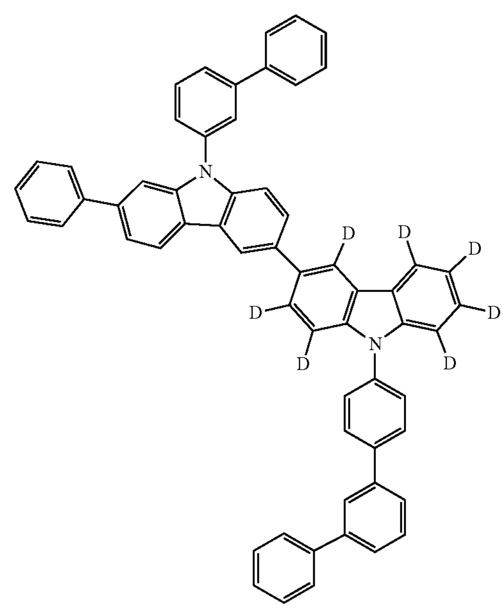

-continued
131
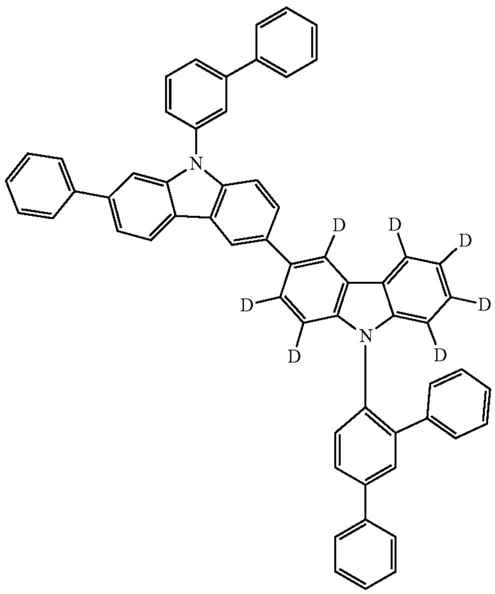
132
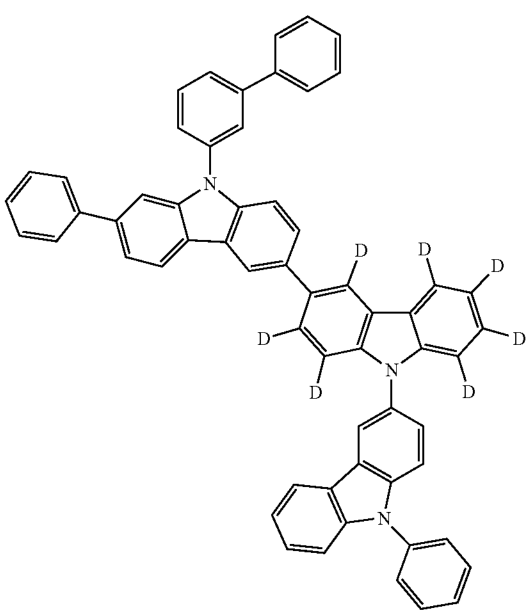
-continued
133
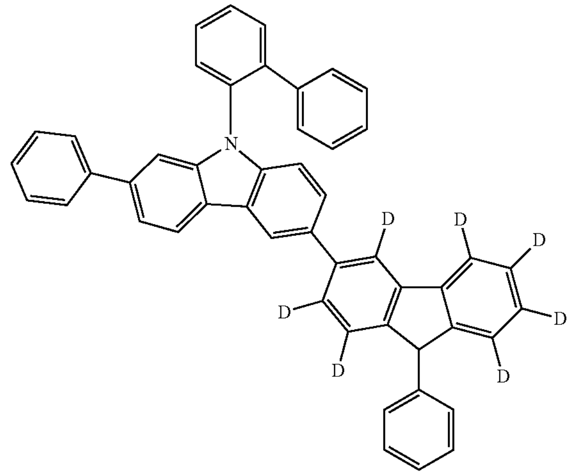
134
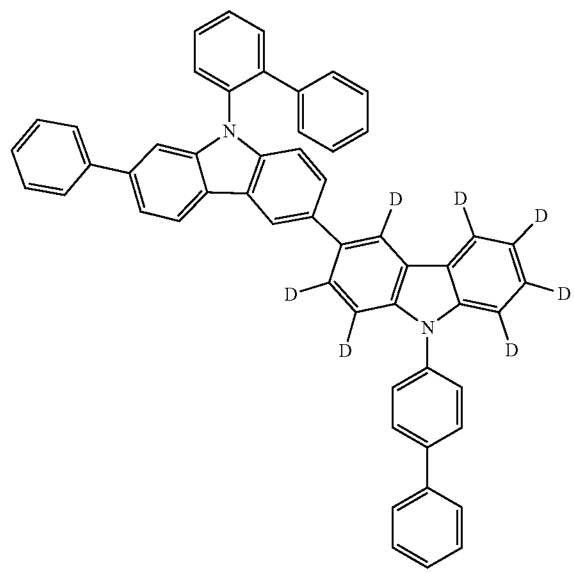
135
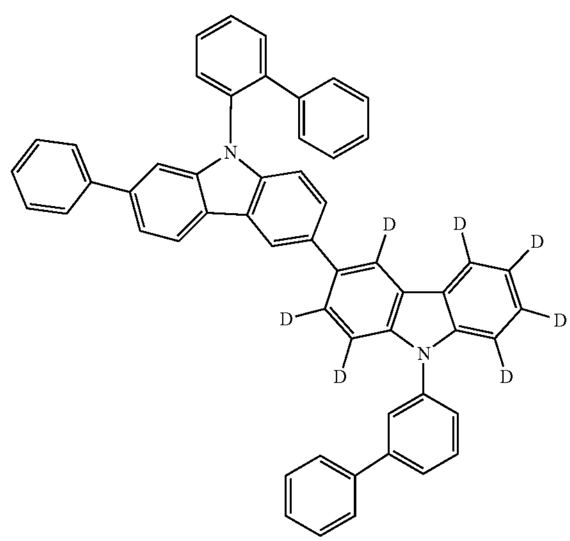

-continued
136
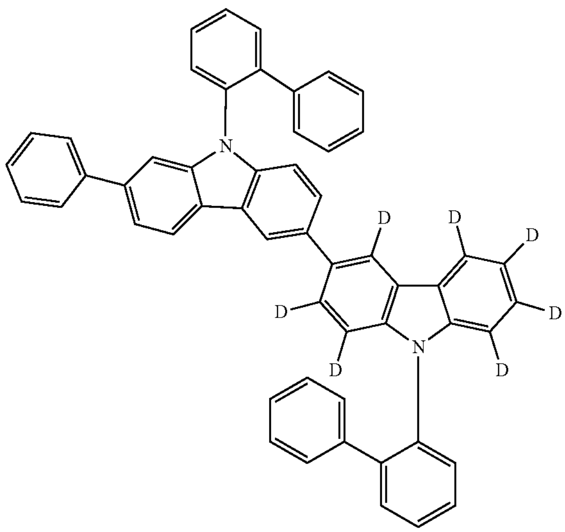
137
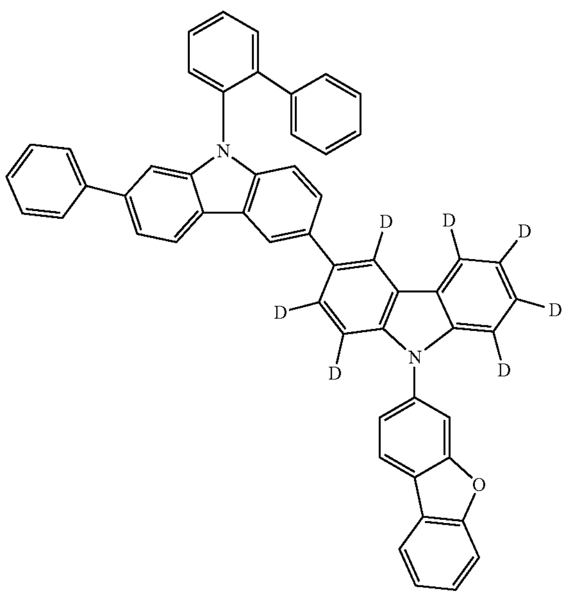
138
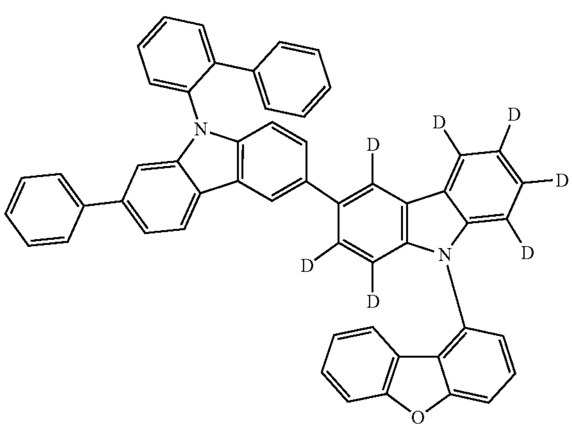
-continued
139
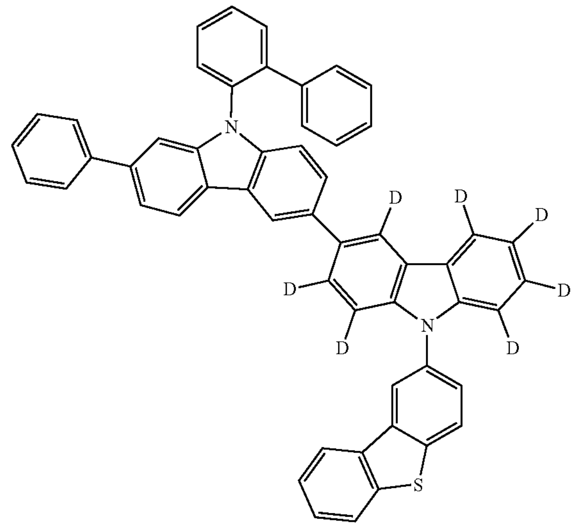
140
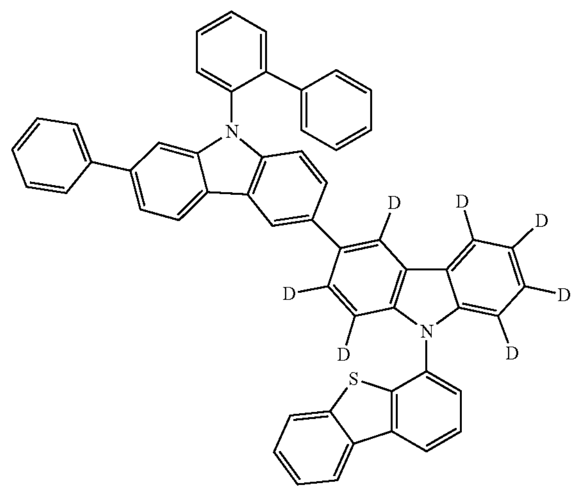
141
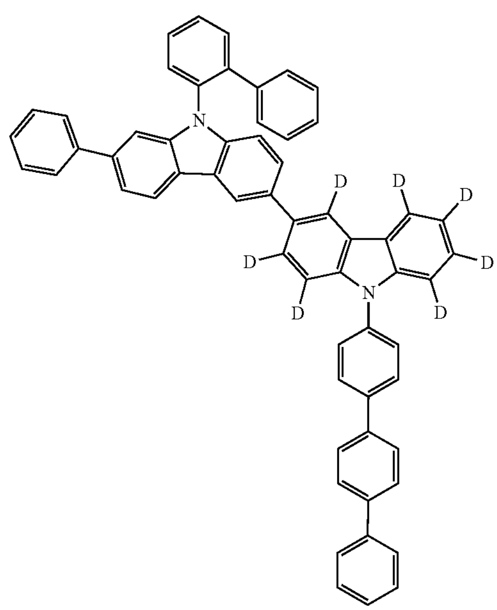

-continued
142
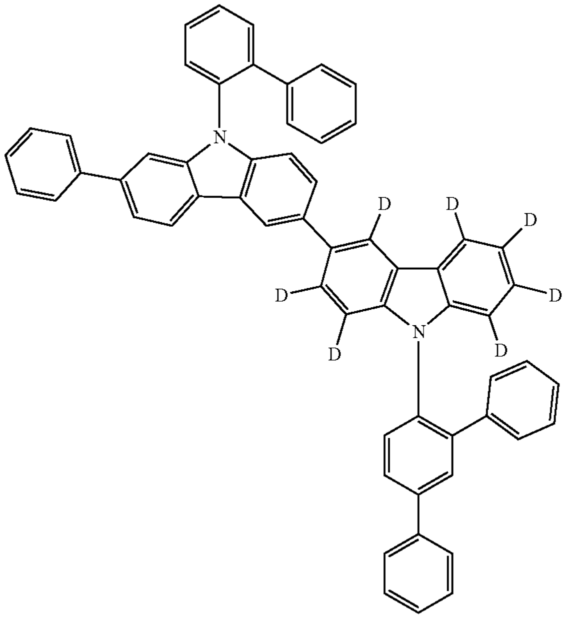
144
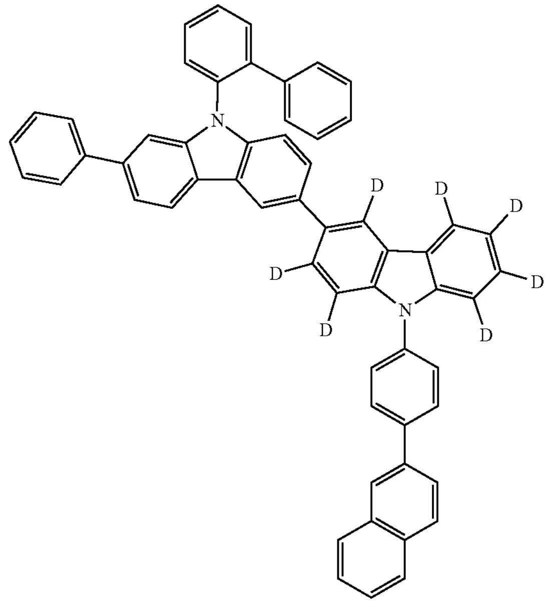
143
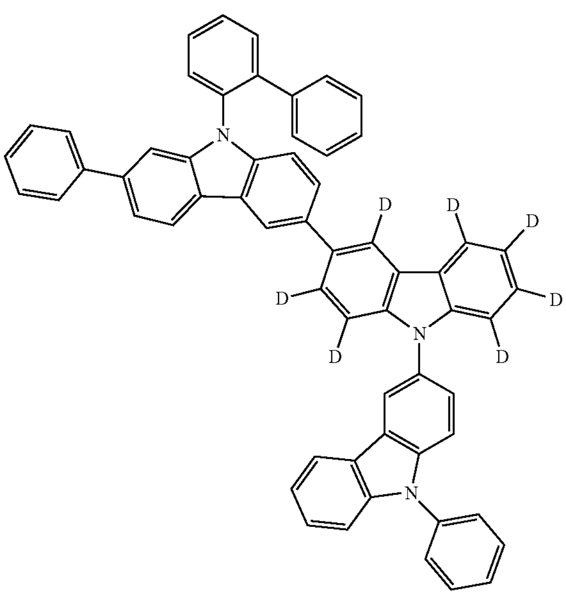
145
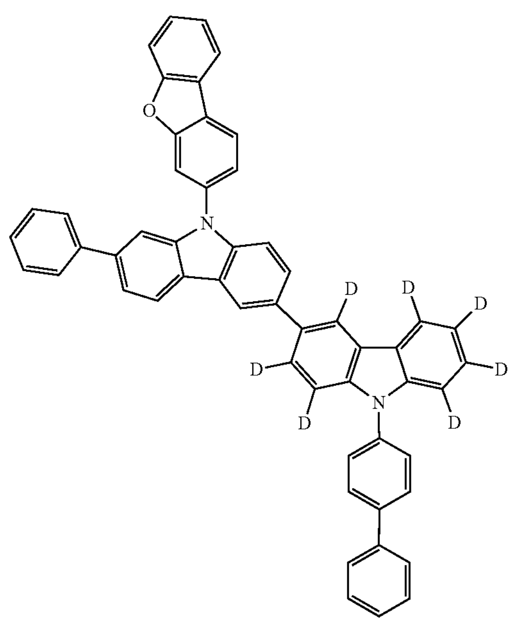

-continued
146
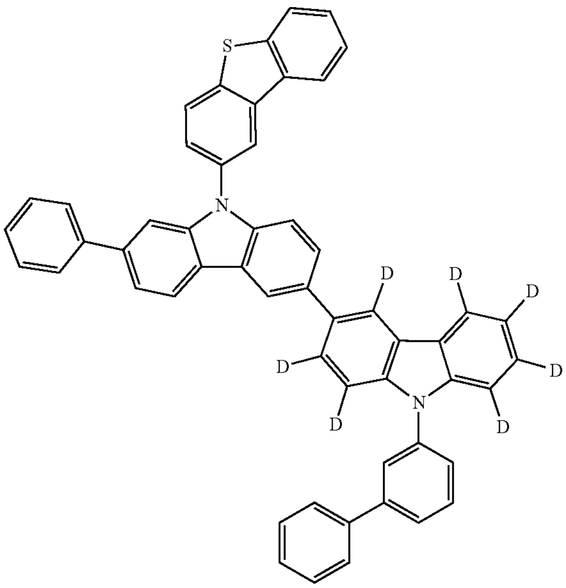
147
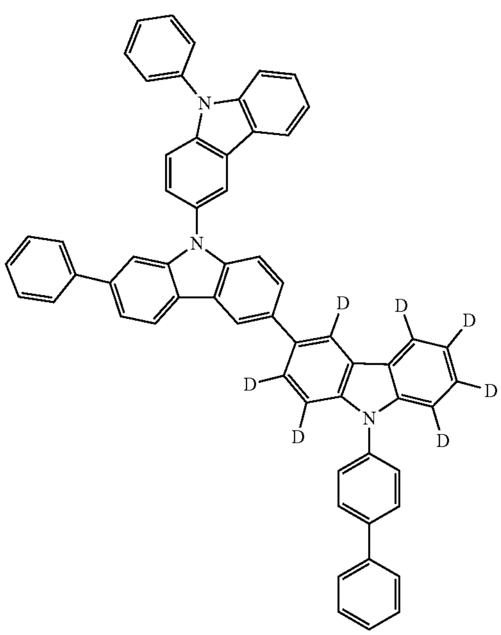
-continued
148
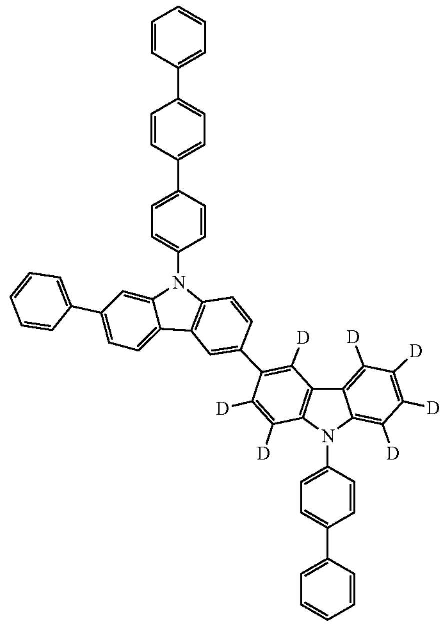
149
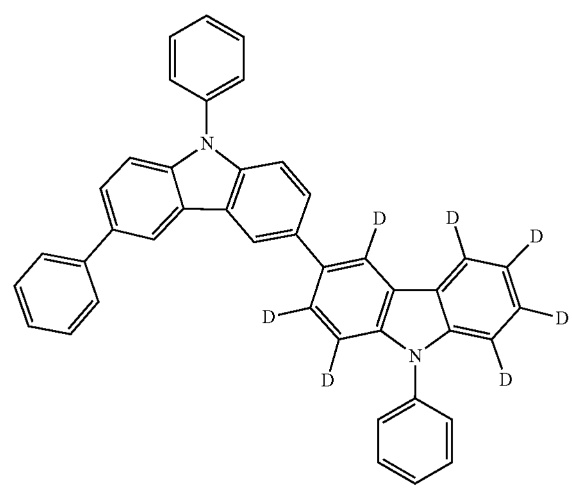

-continued
150
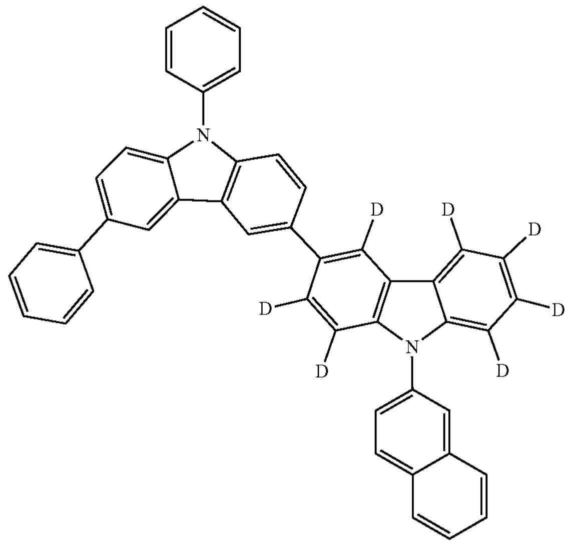
151
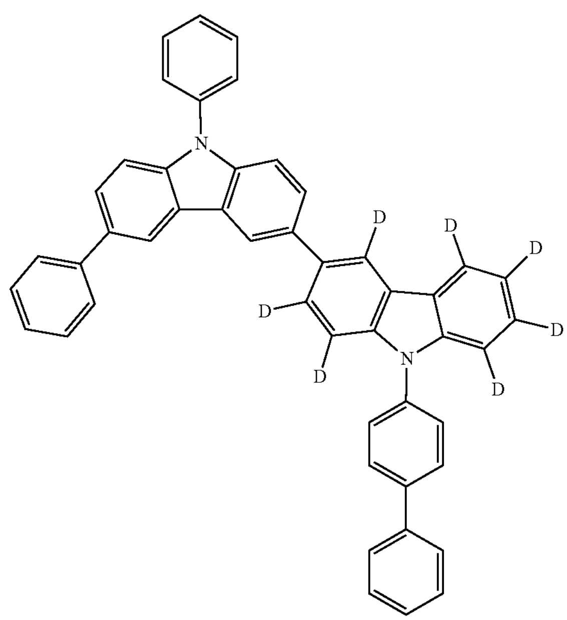
-continued
152
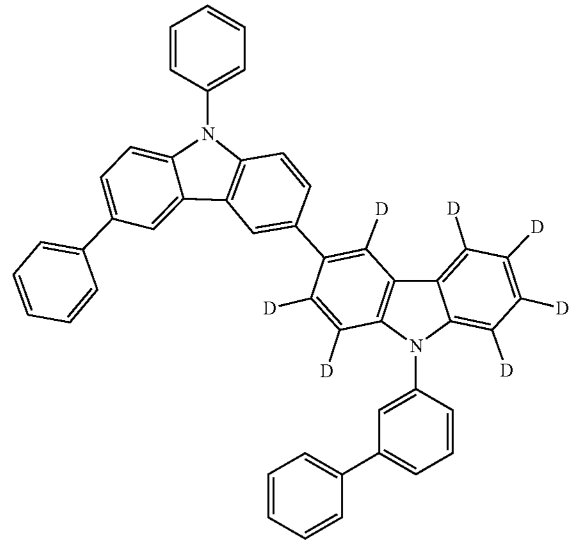
153
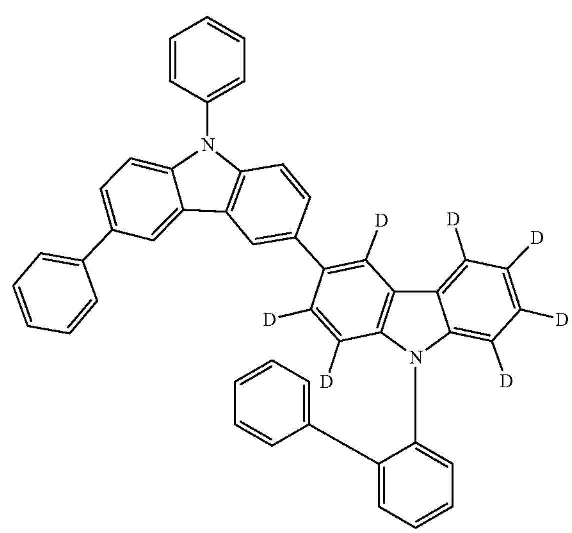

-continued
154
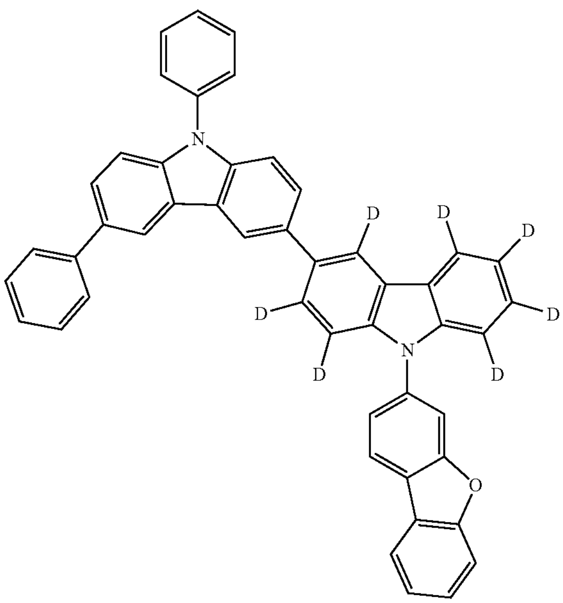
155
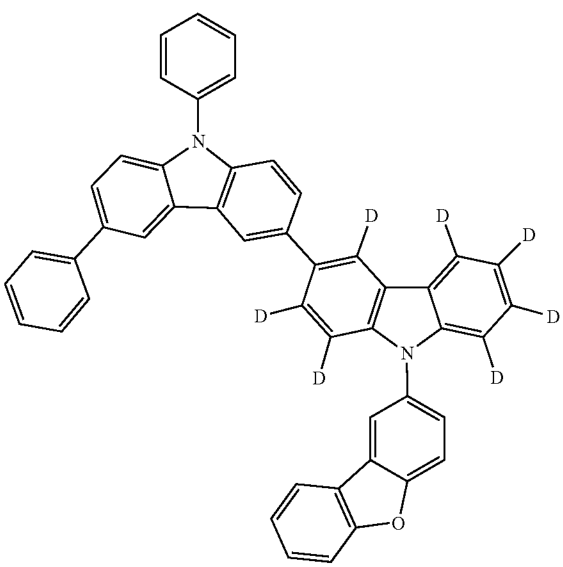
156
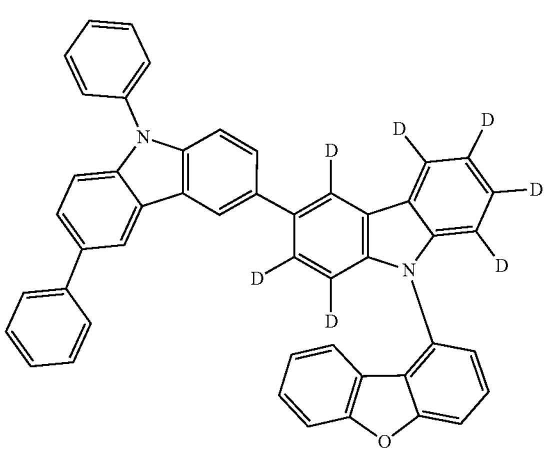
-continued
157
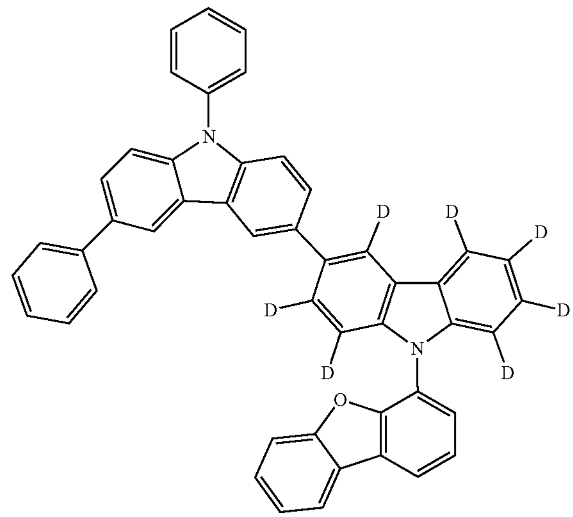
158
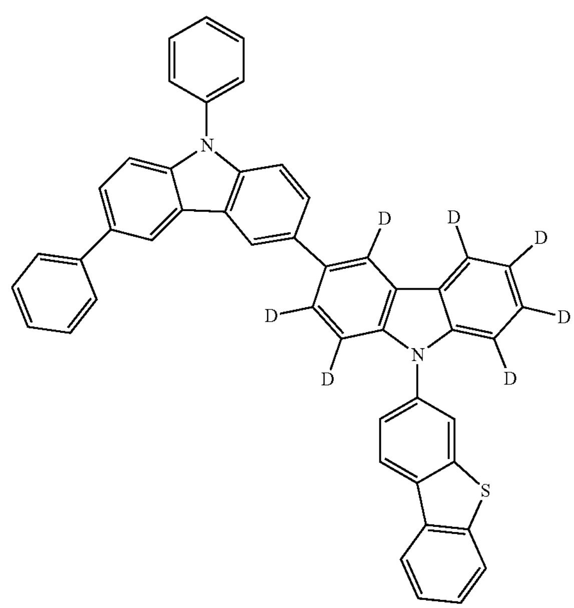

-continued
159
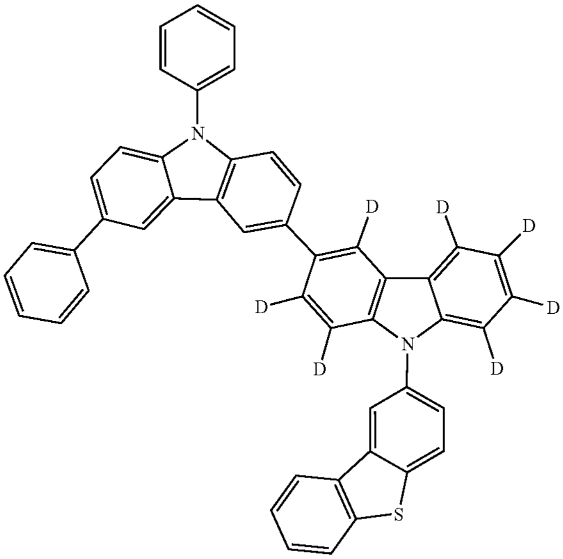
160
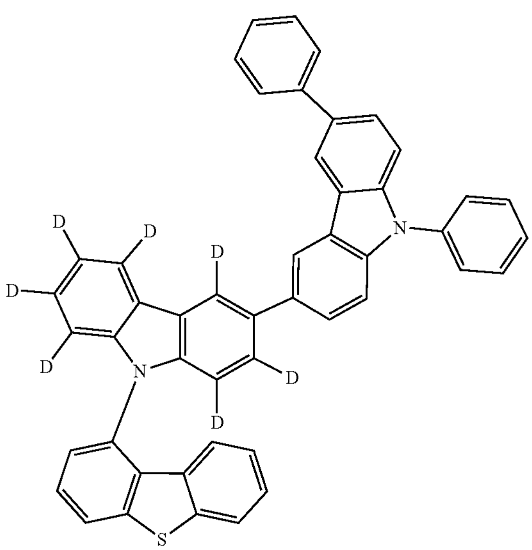
-continued
161
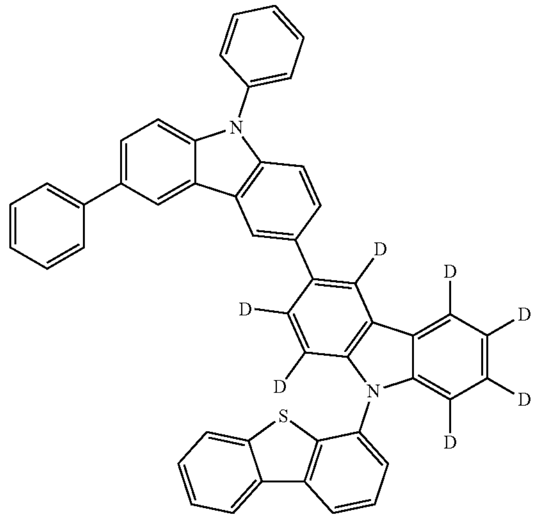
162
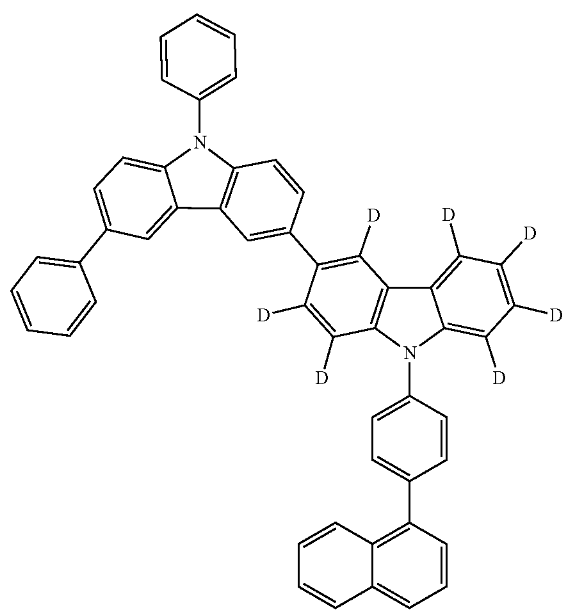

-continued
163
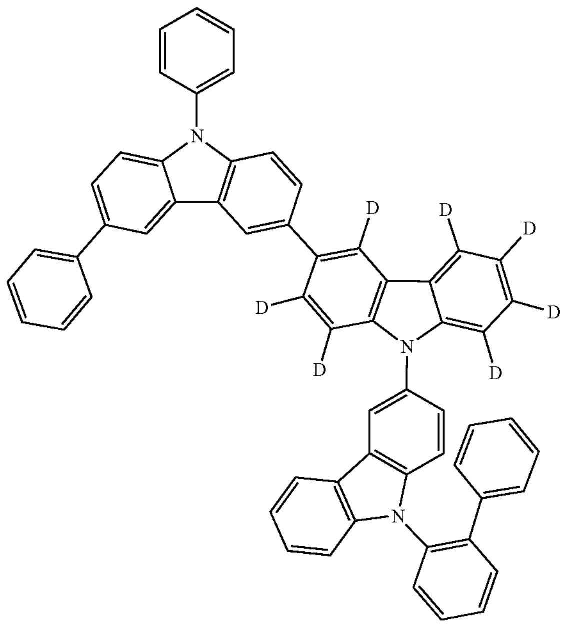
164
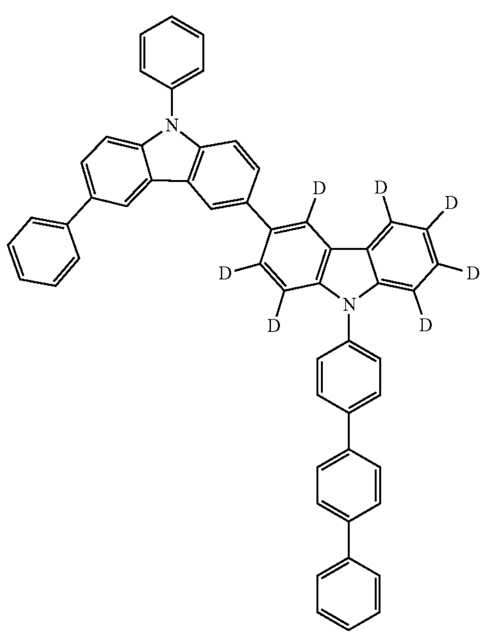
-continued
165
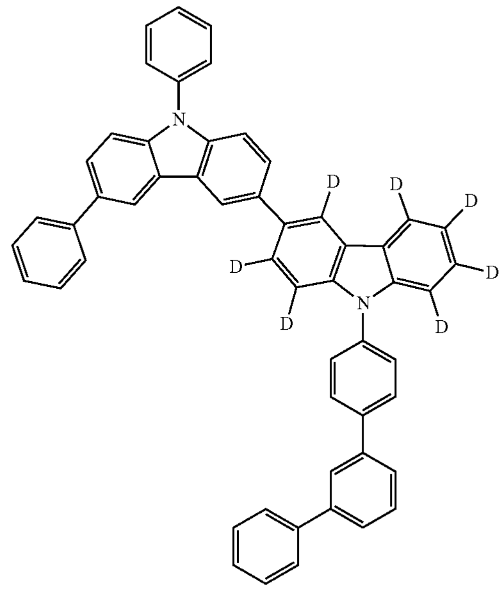
166
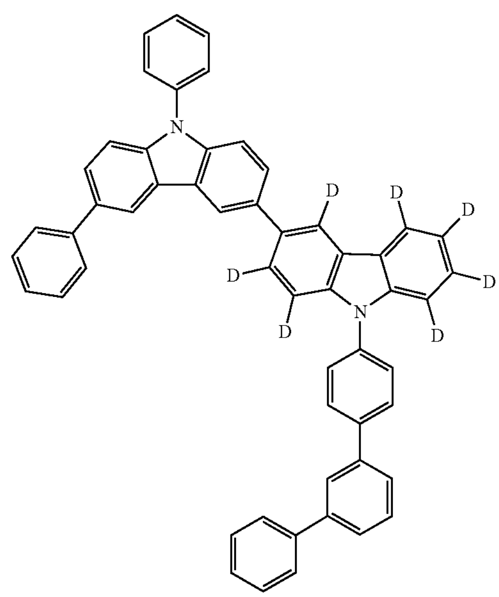

-continued
167
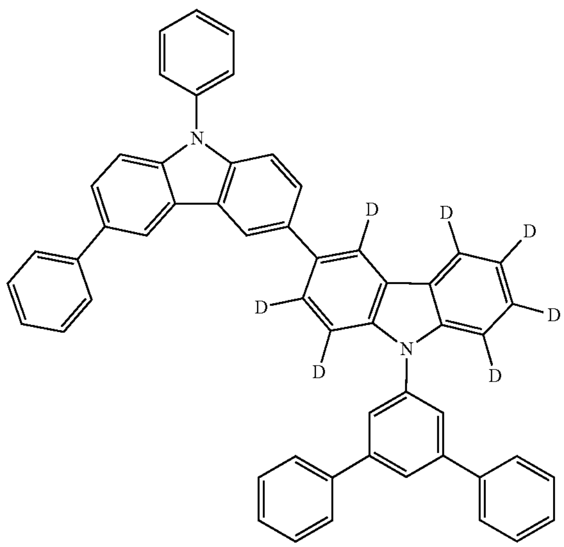
167′
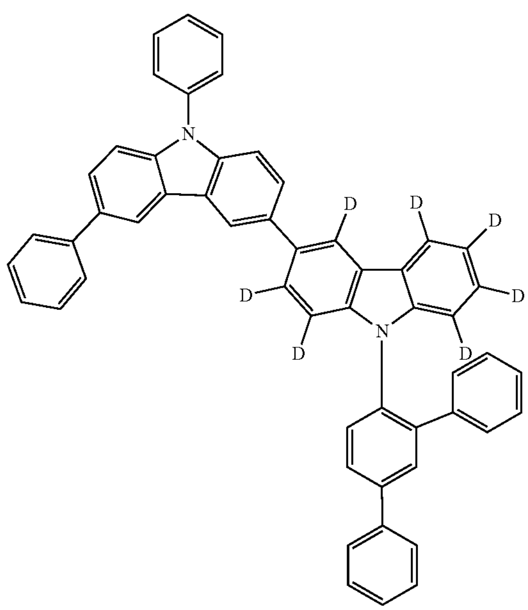
-continued
168
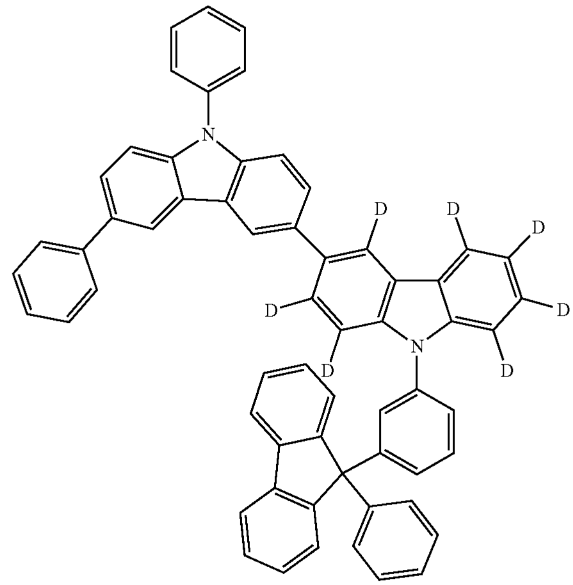
169
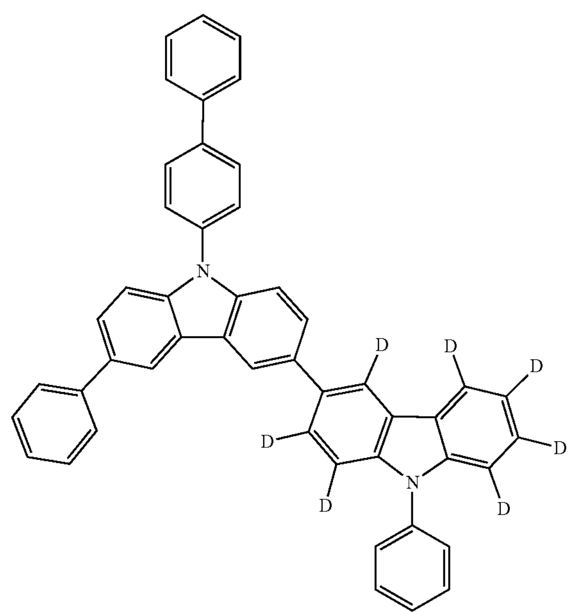

-continued
170
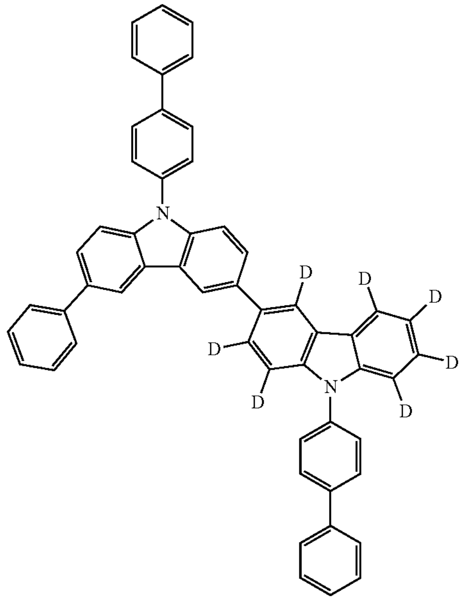
171
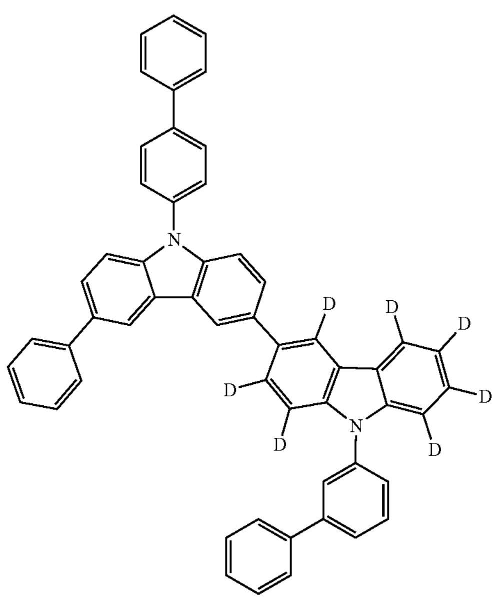
-continued
172
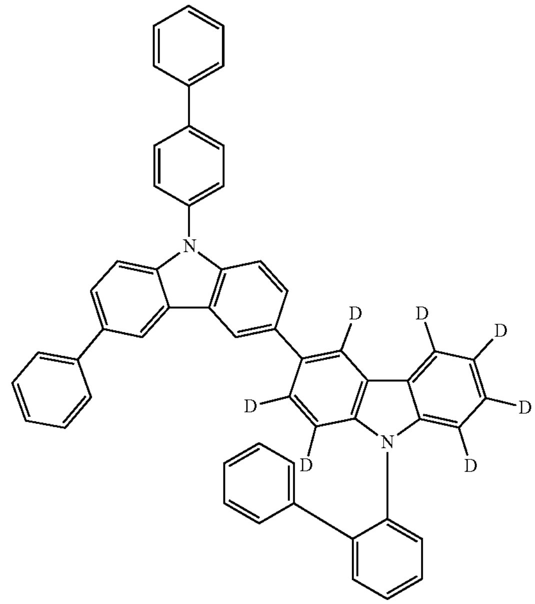
173
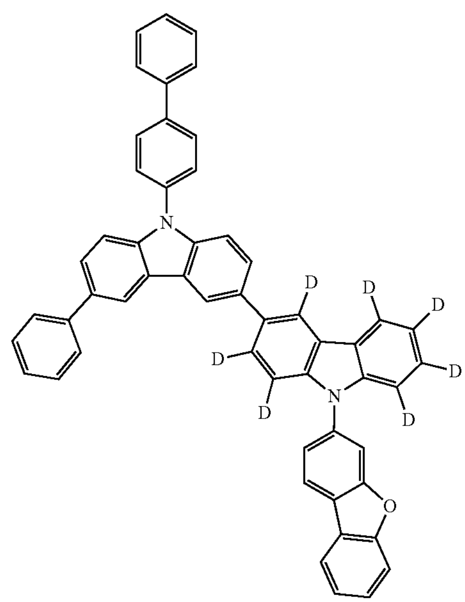

174
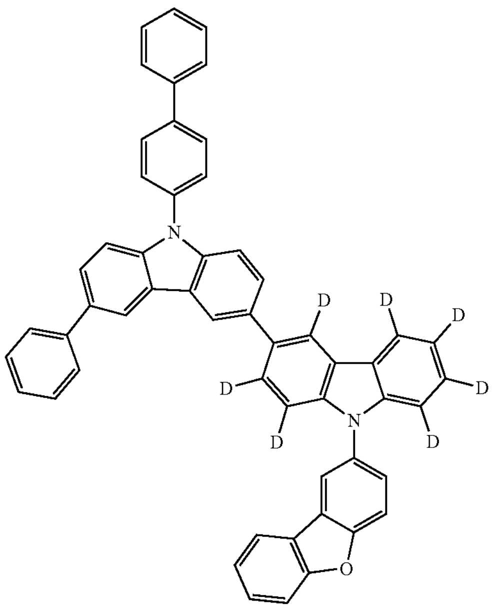
176
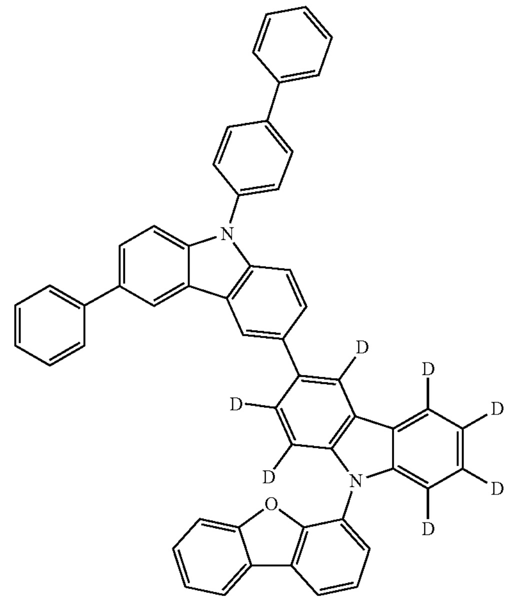
175
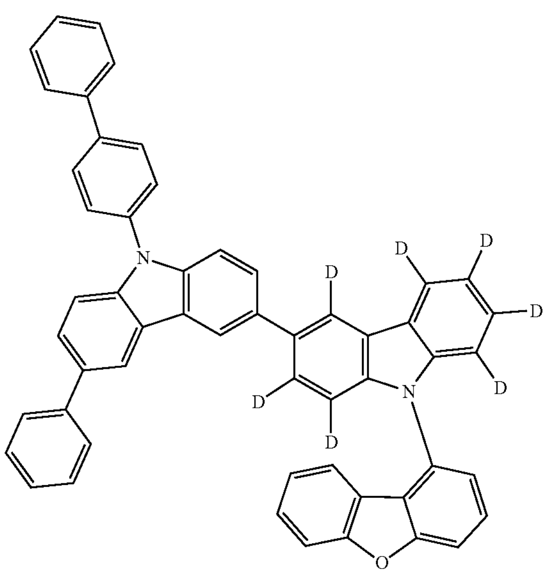
177
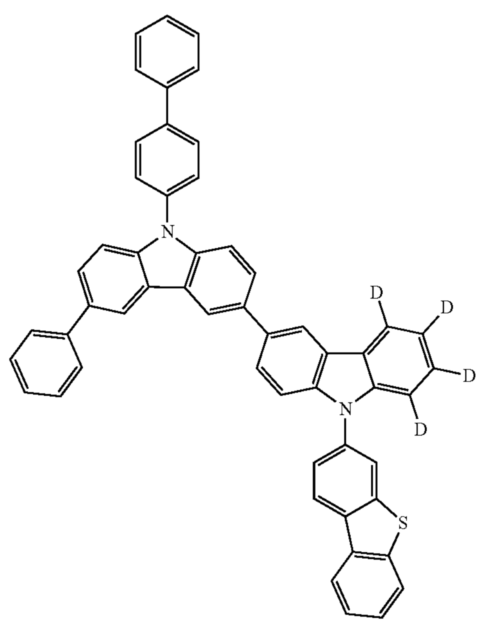

-continued
178
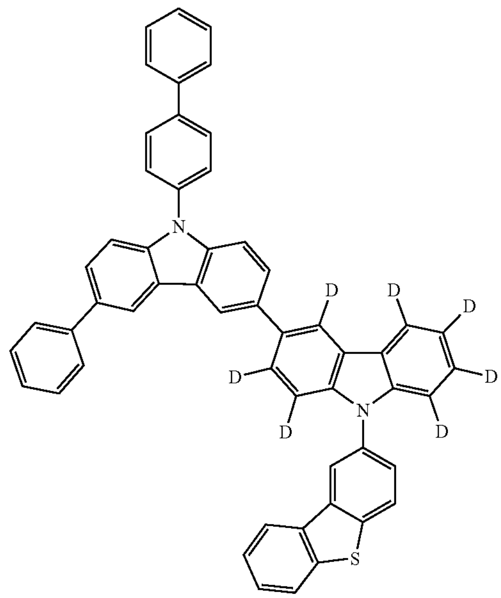
180
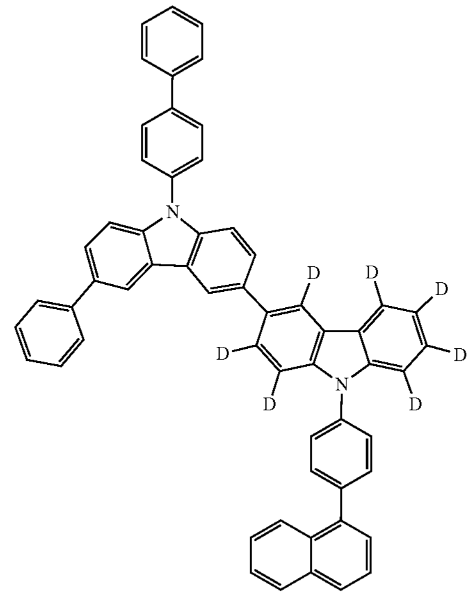
179
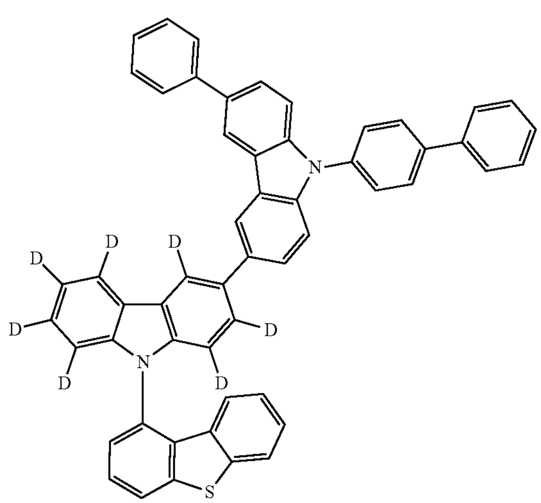
181
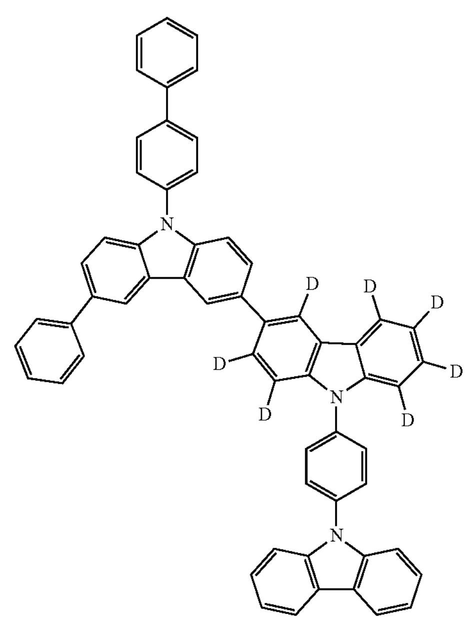

-continued
182
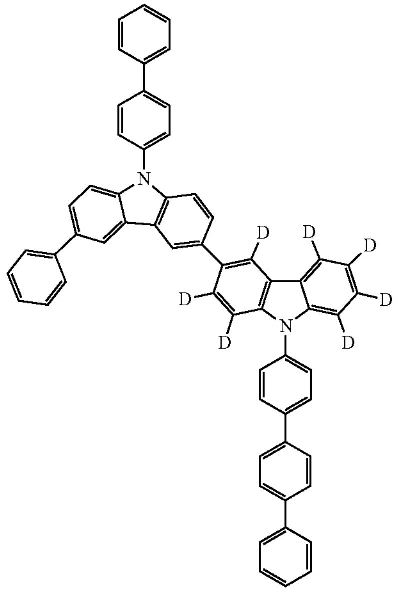
183
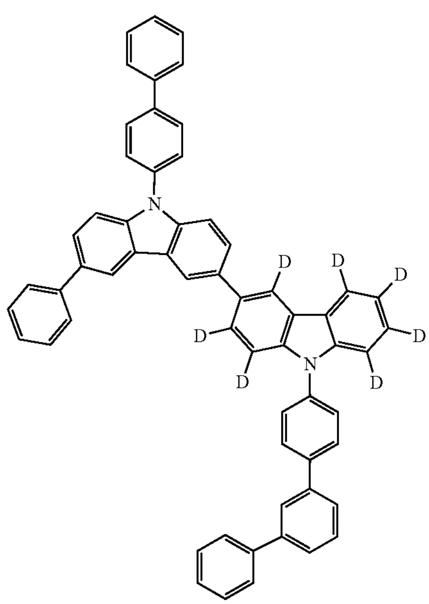
-continued
184
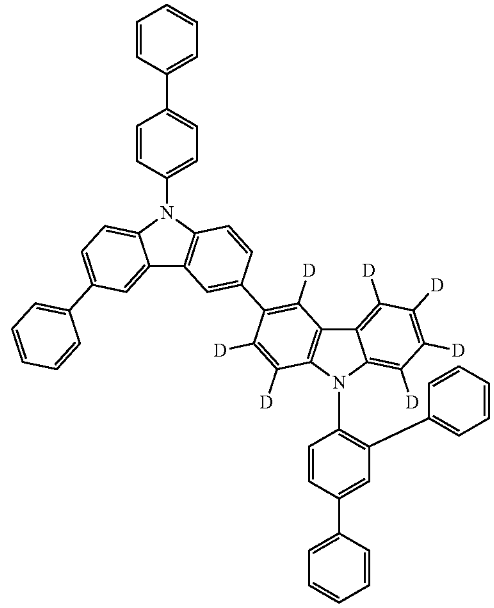
185
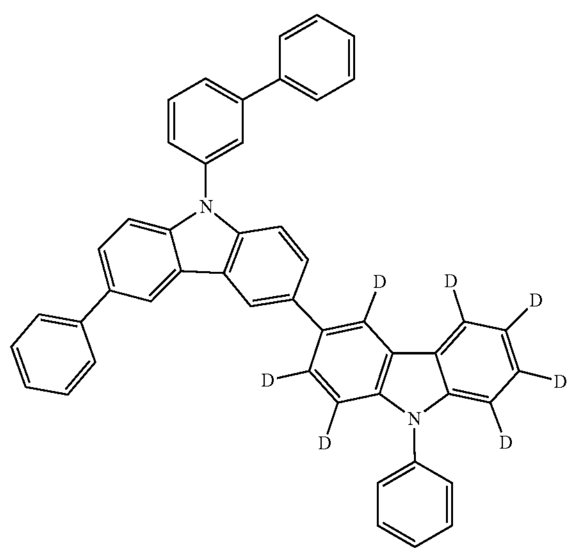

-continued
186
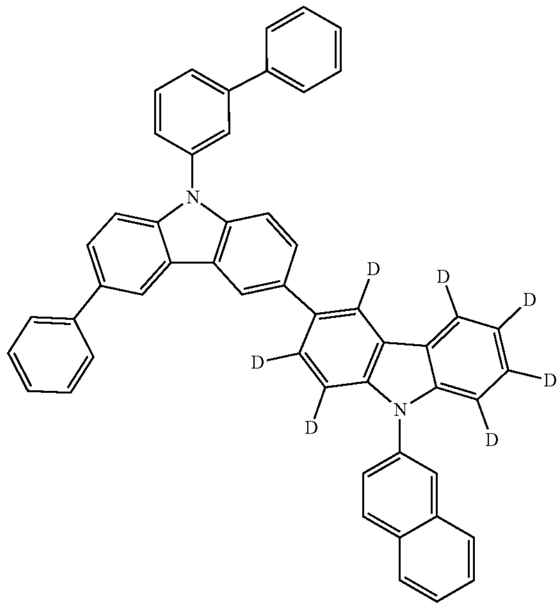
187
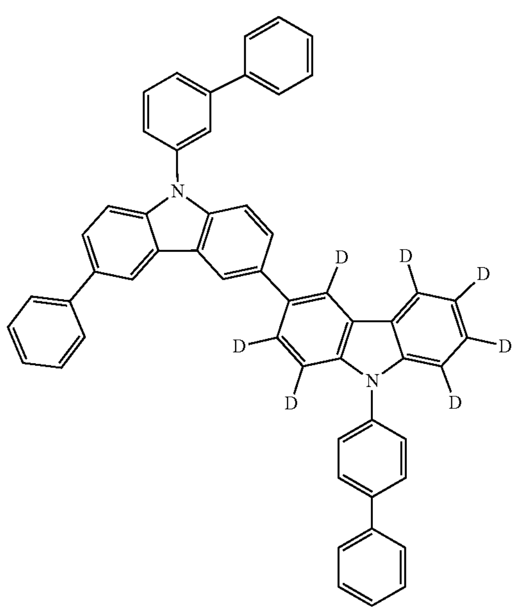
-continued
188
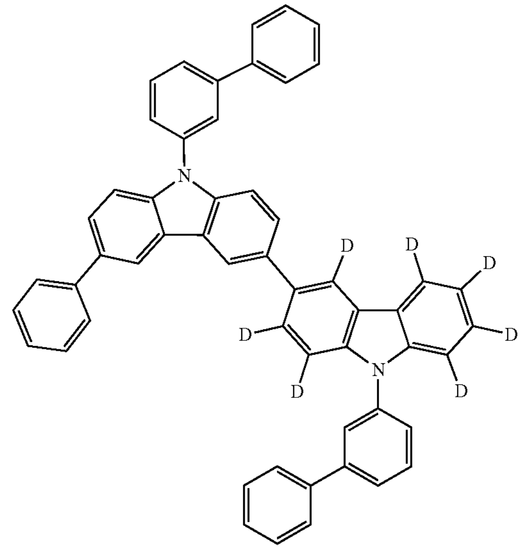
189
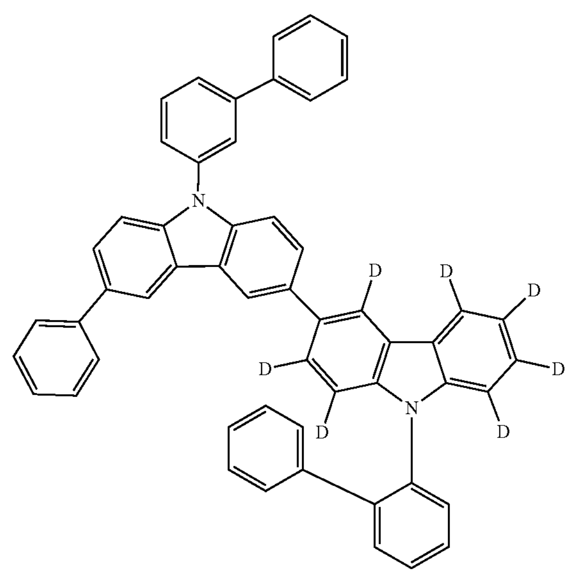

190
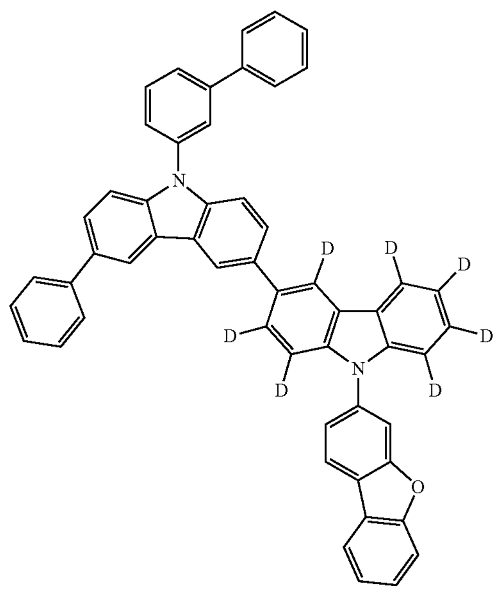
192
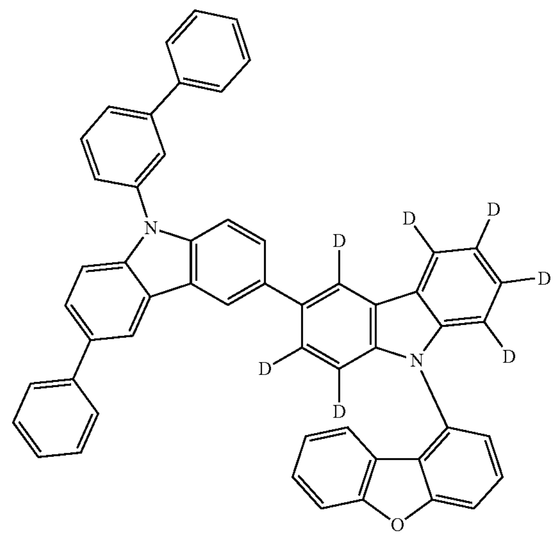
191
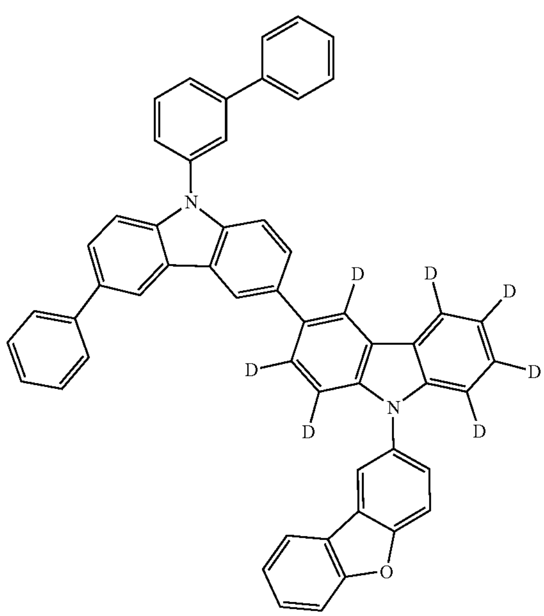
193
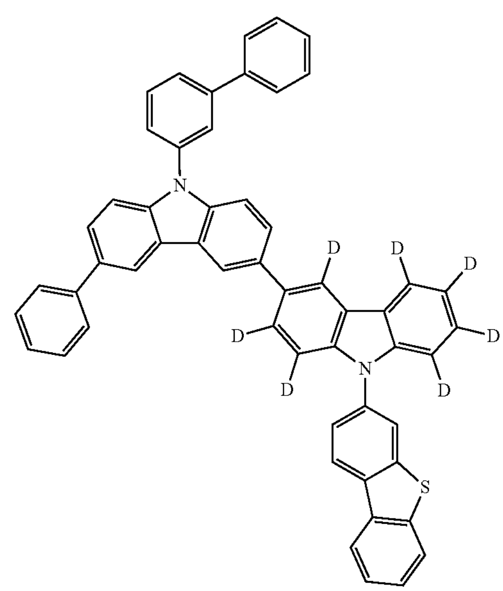

-continued
194
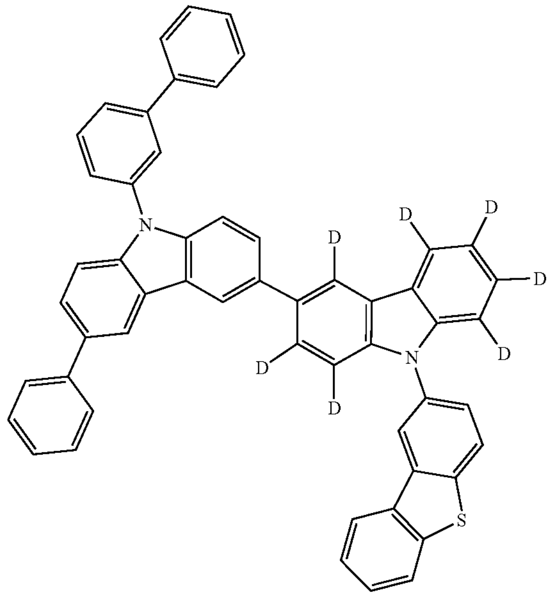
195
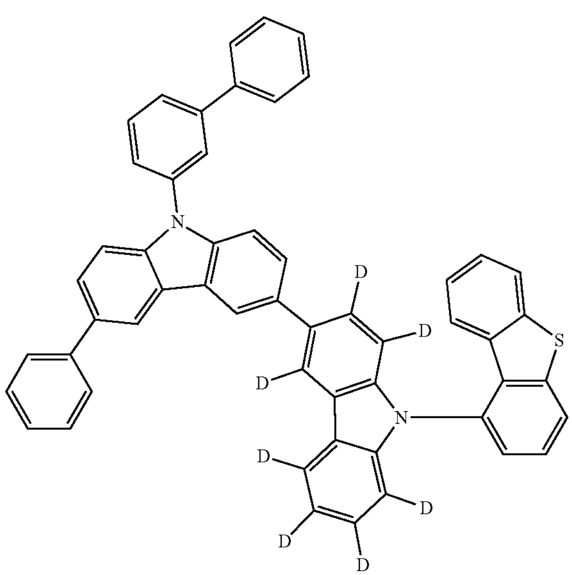
-continued
196
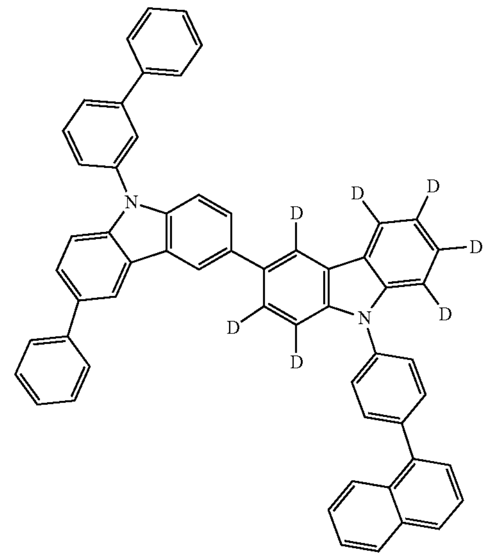
197
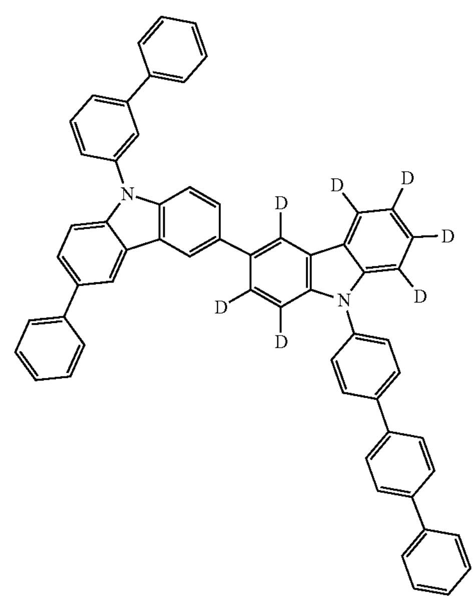

-continued
198
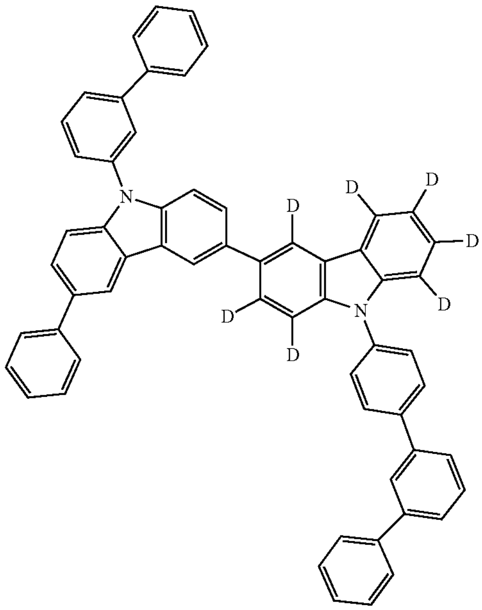
199
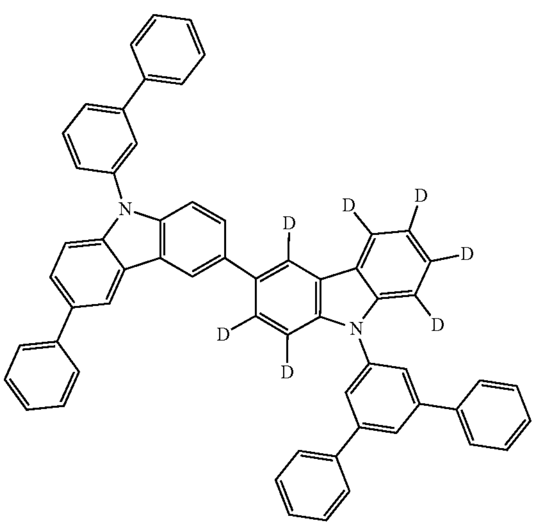
-continued
200
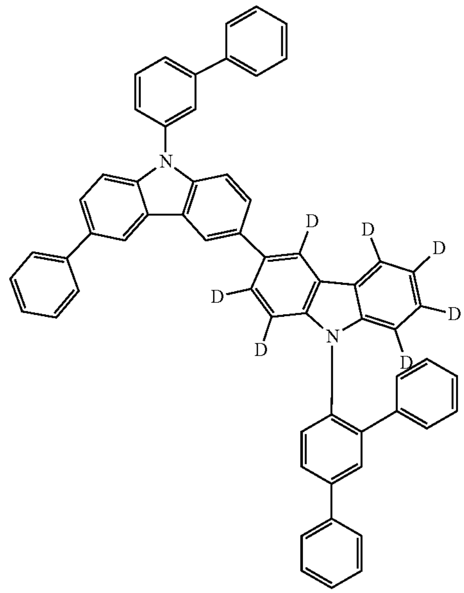
201
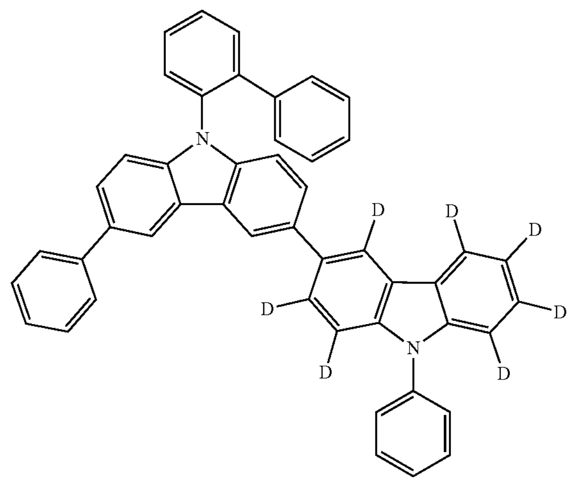
202
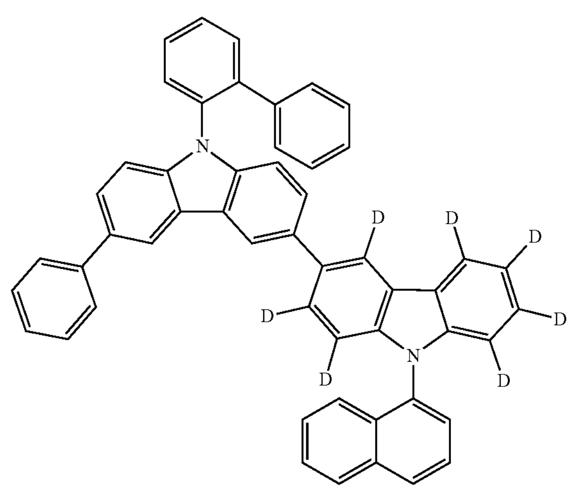

-continued
203
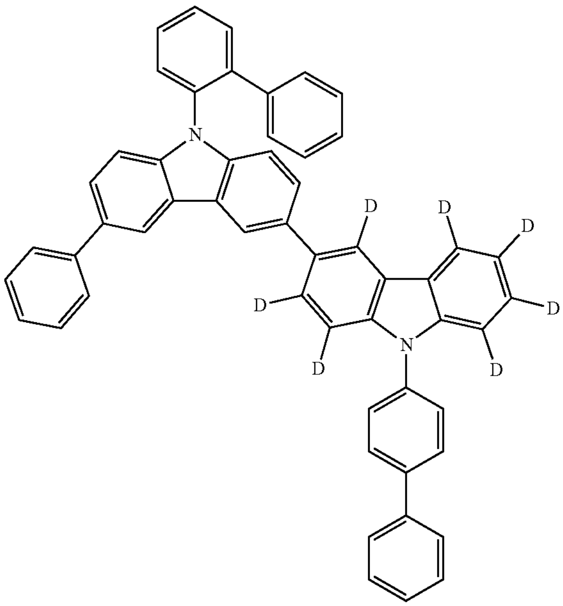
204
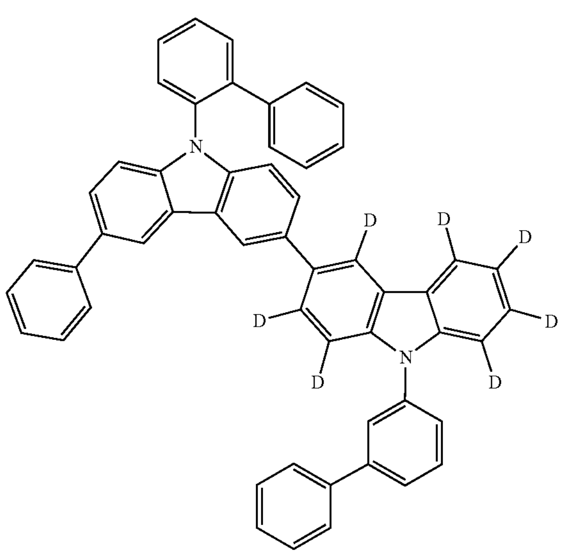
-continued
205
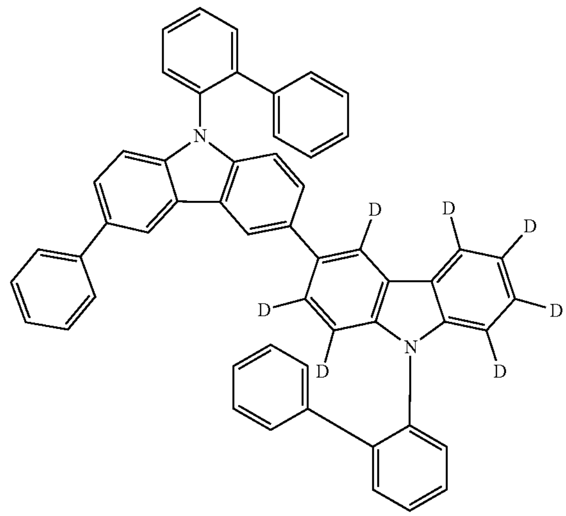
206
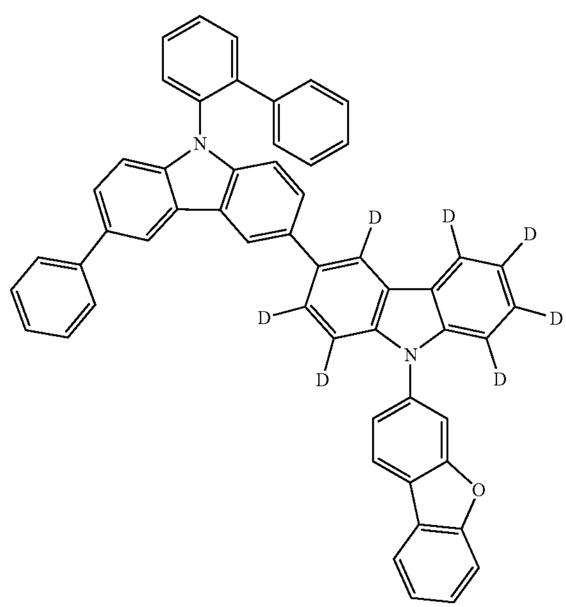

-continued
207
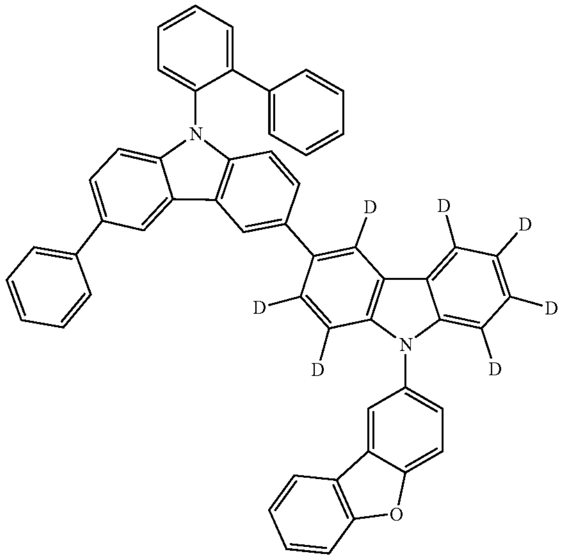
208
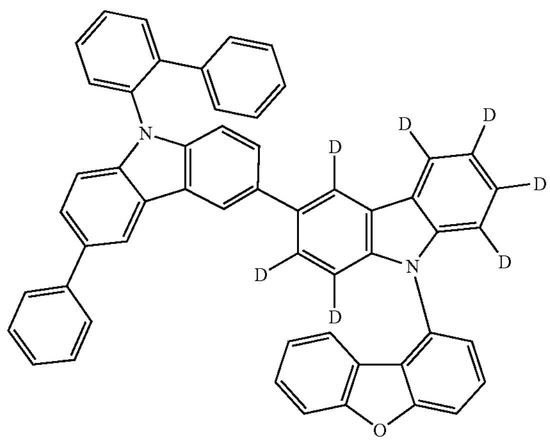
209
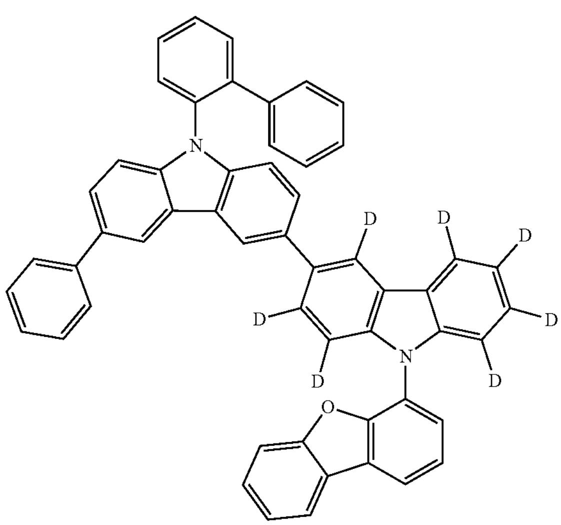
-continued
210
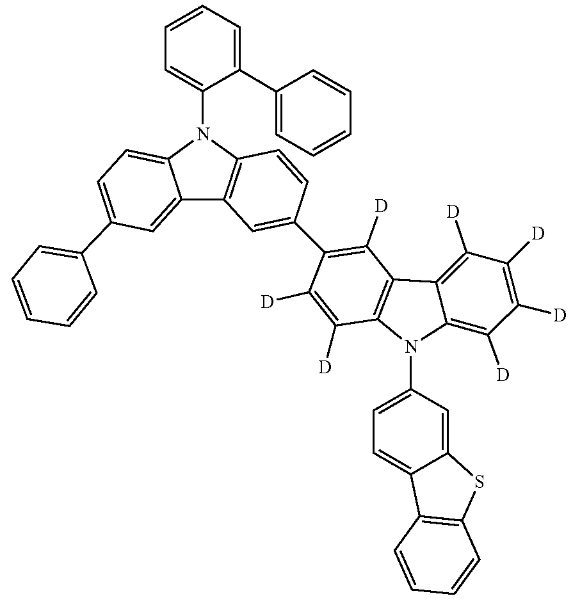
211
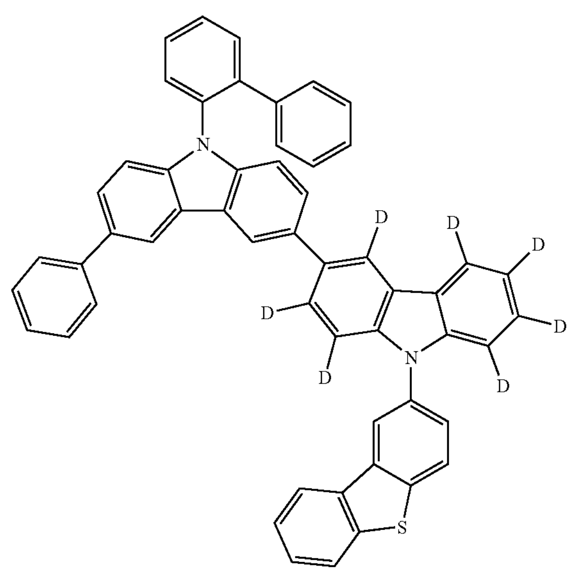

-continued
212
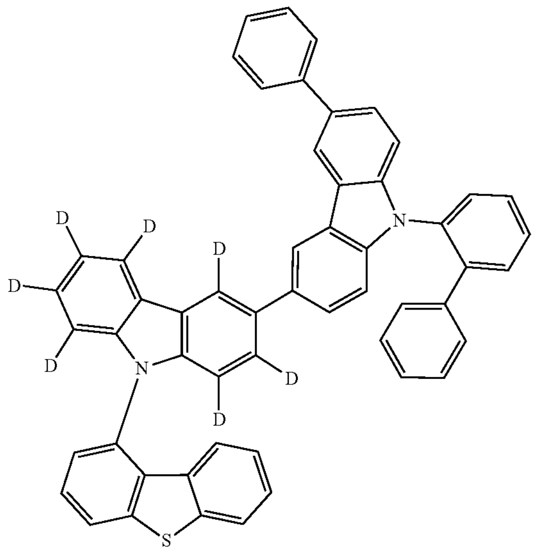
213
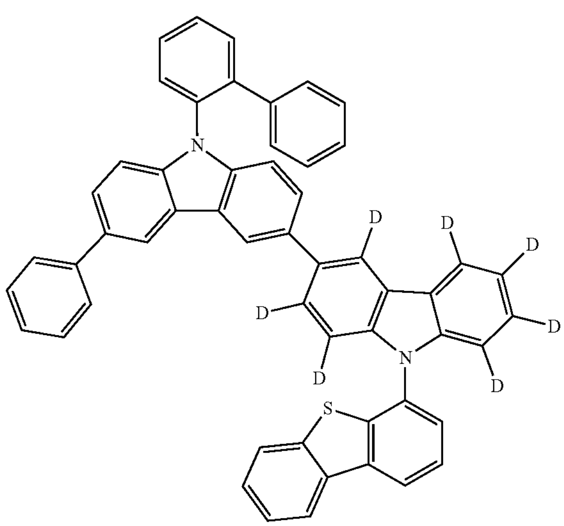
-continued
214
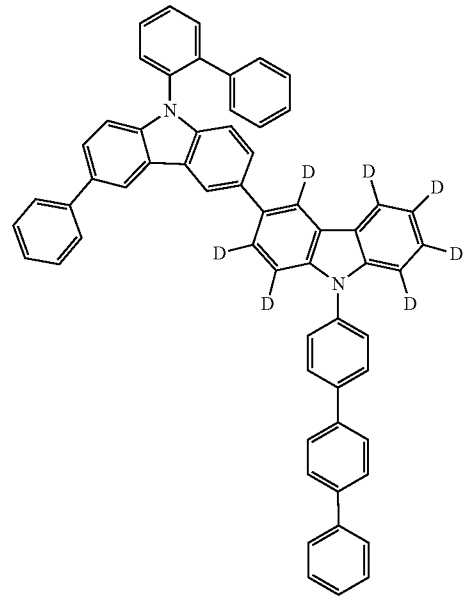
215
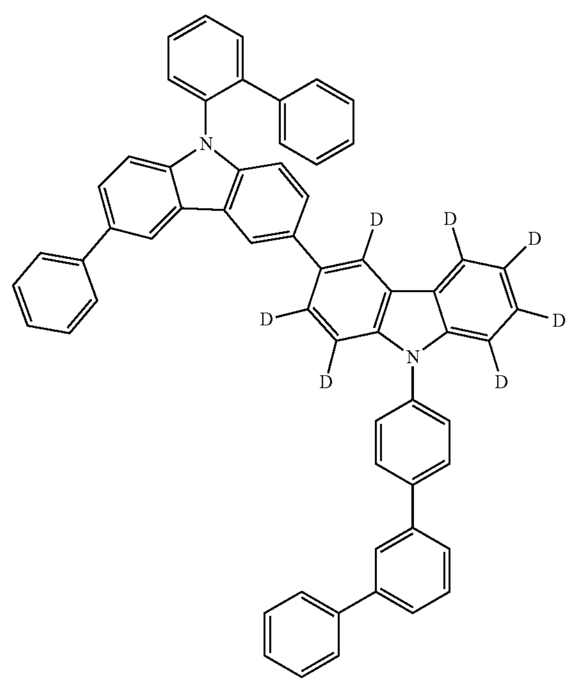

-continued
216
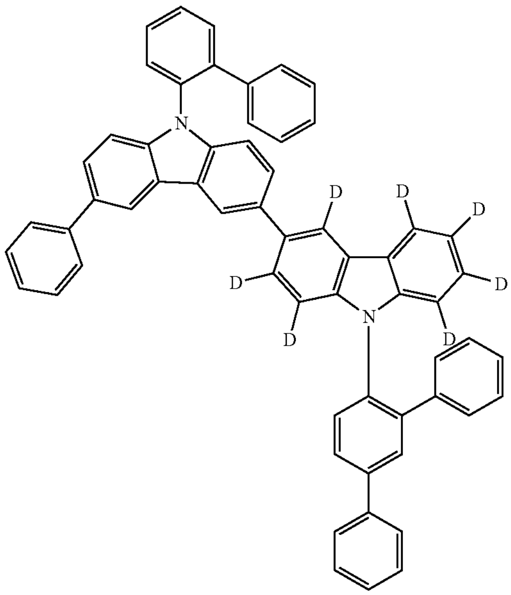
217
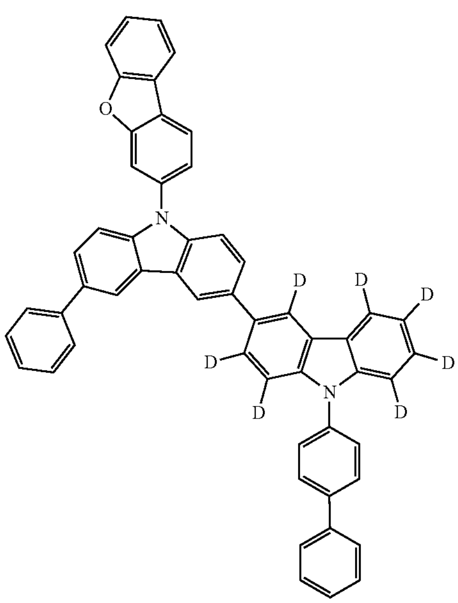
-continued
218
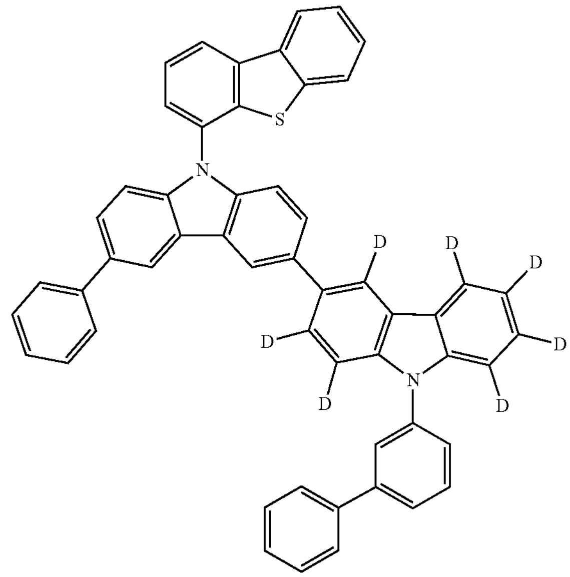
219
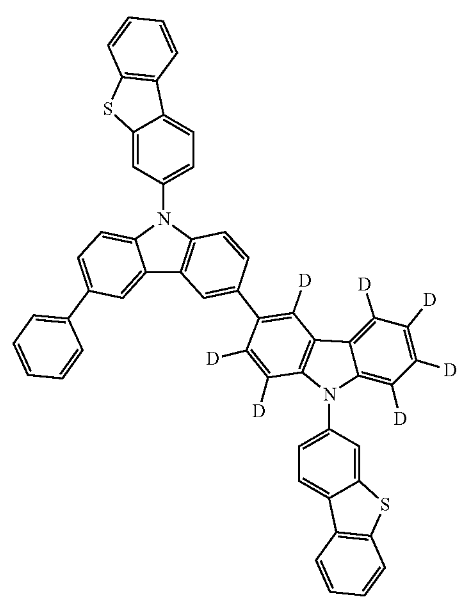

-continued
220
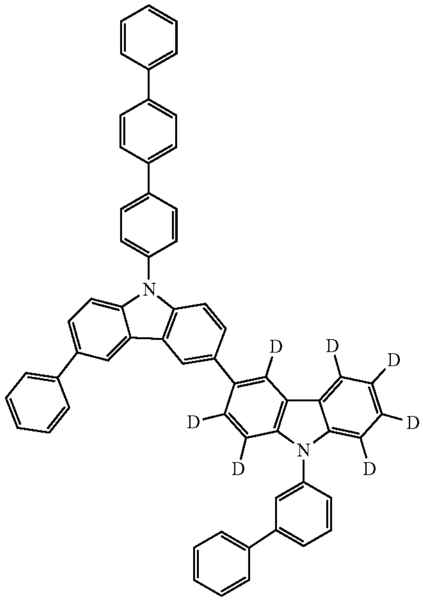
221
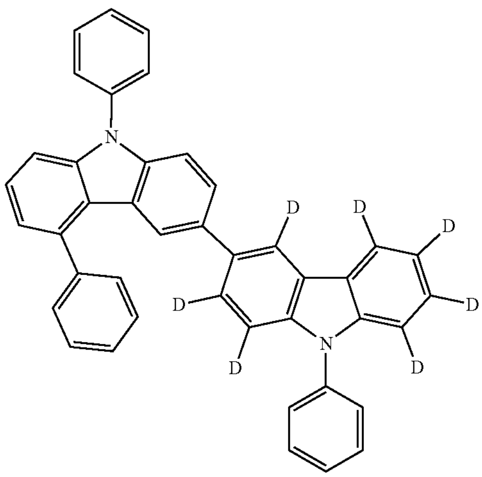
222
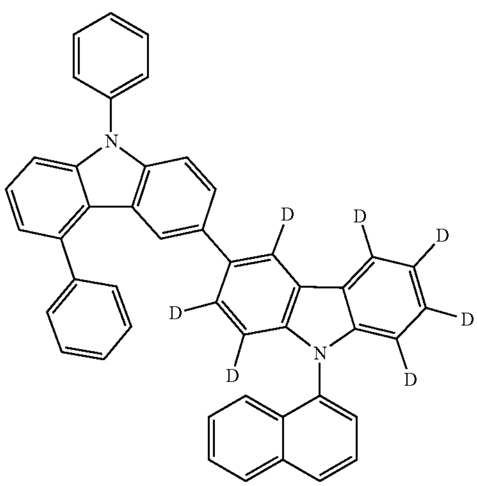
-continued
223
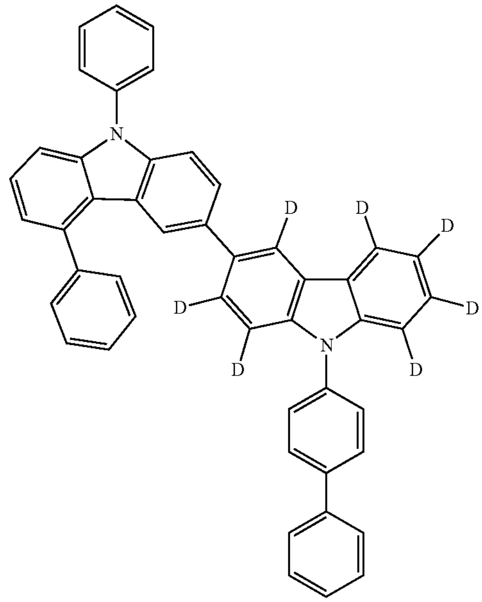
224
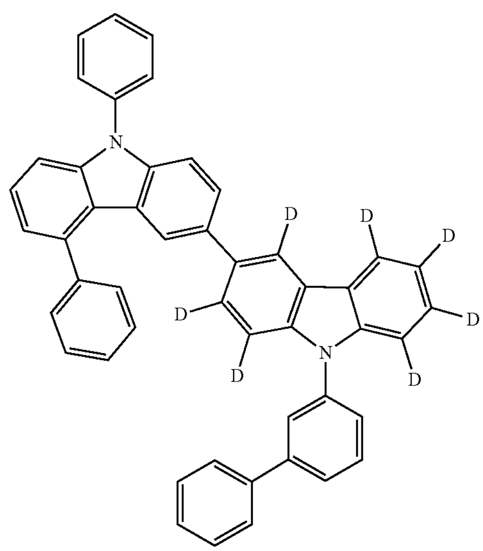

225
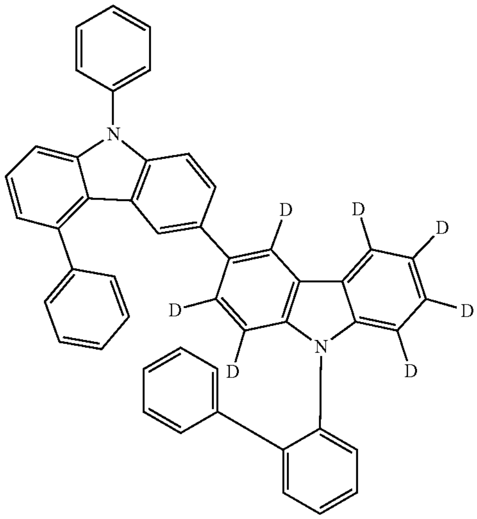
226
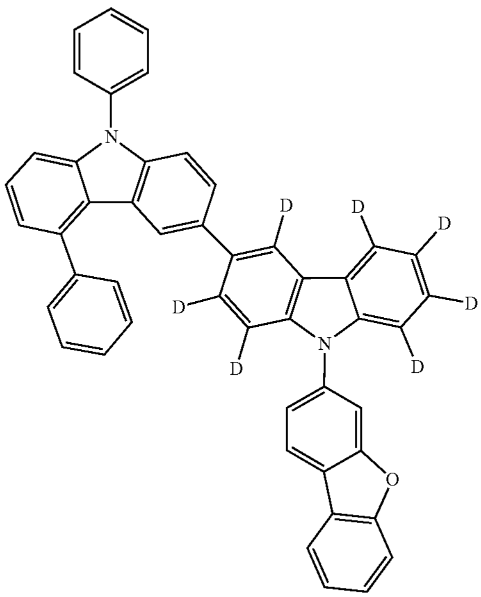
227
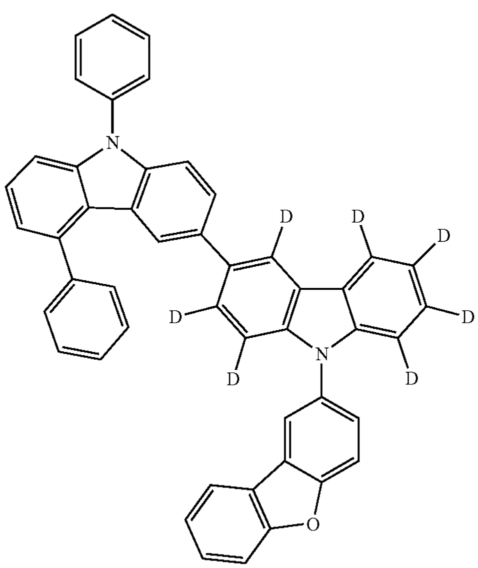
228
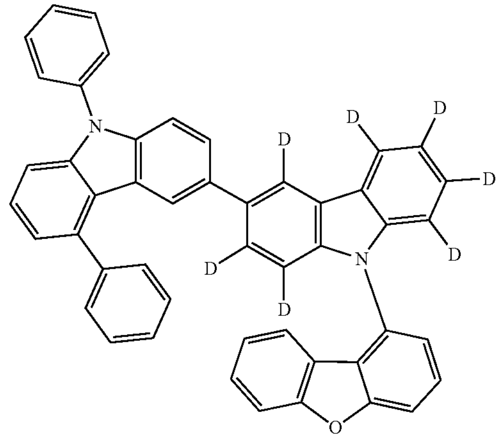
229
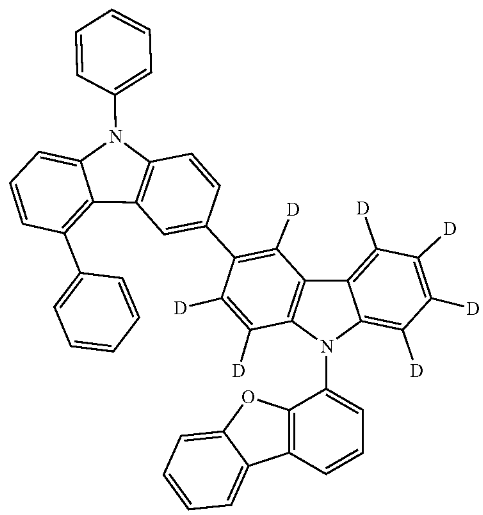
230
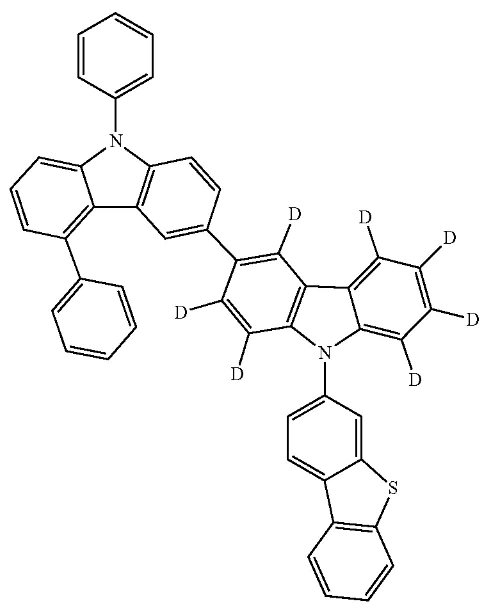

-continued
231
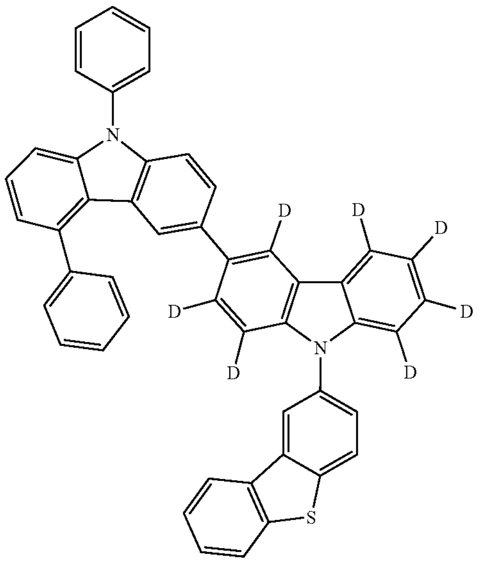
232
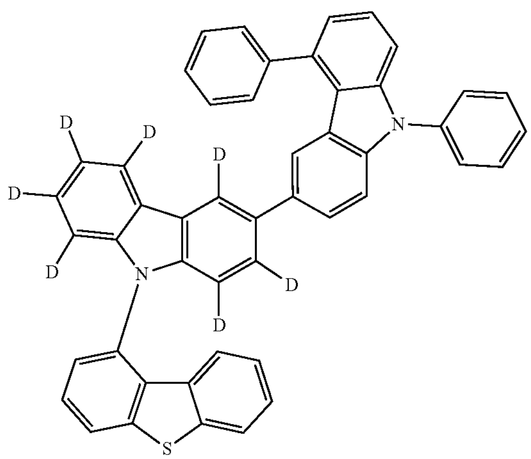
233
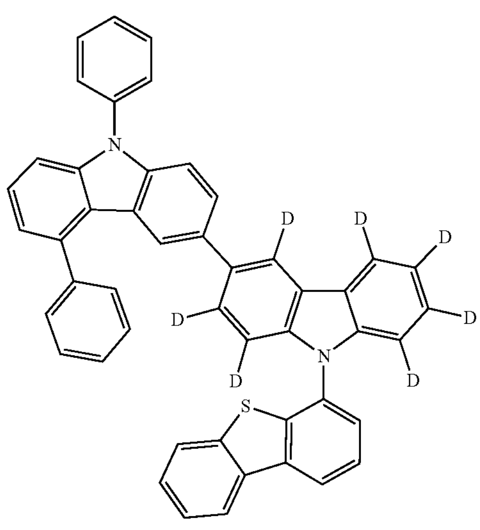
-continued
234
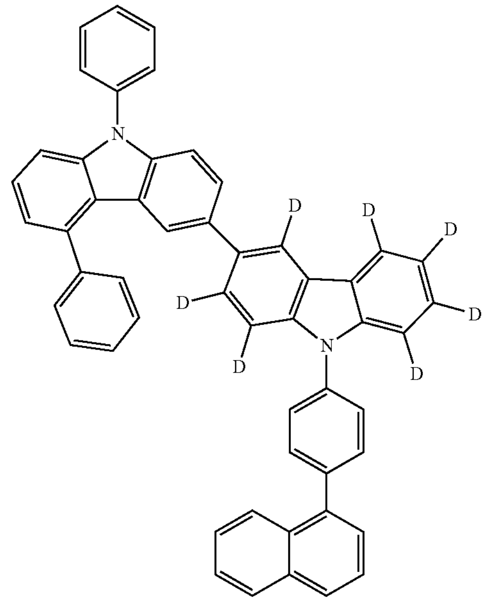
235
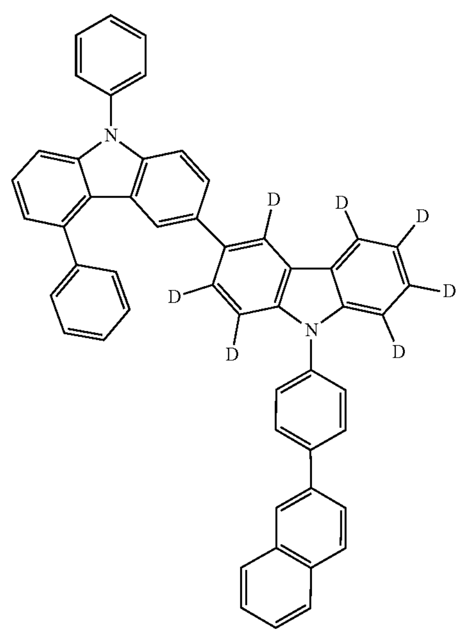

-continued
236
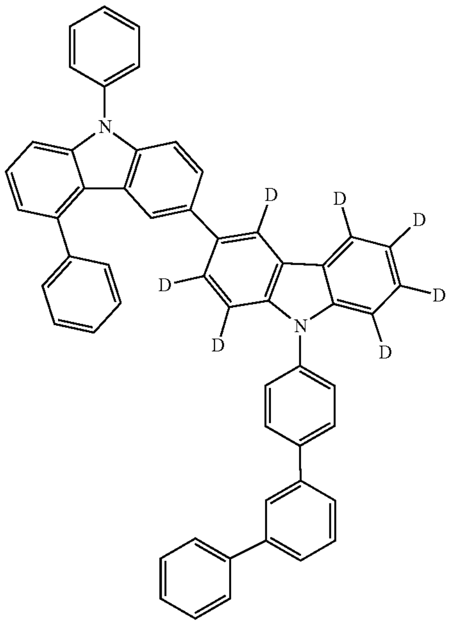
237
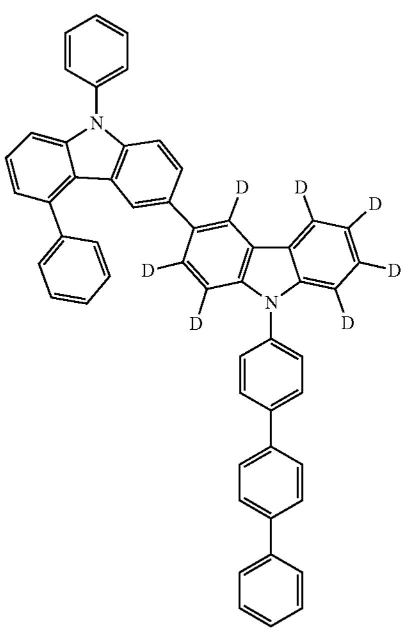
-continued
238
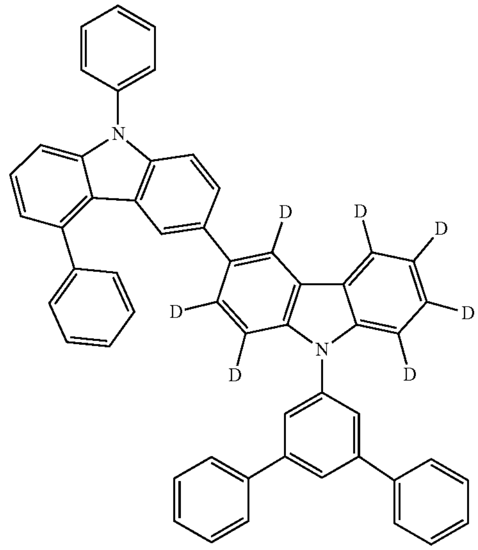
239
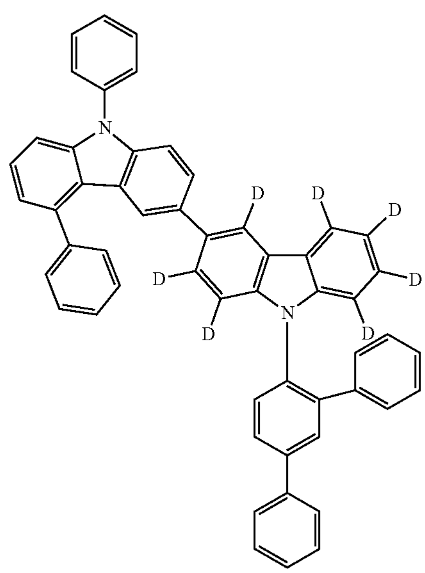

-continued
240
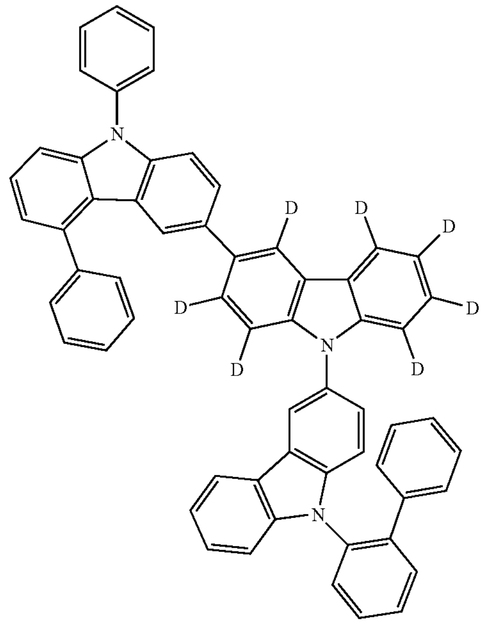
241
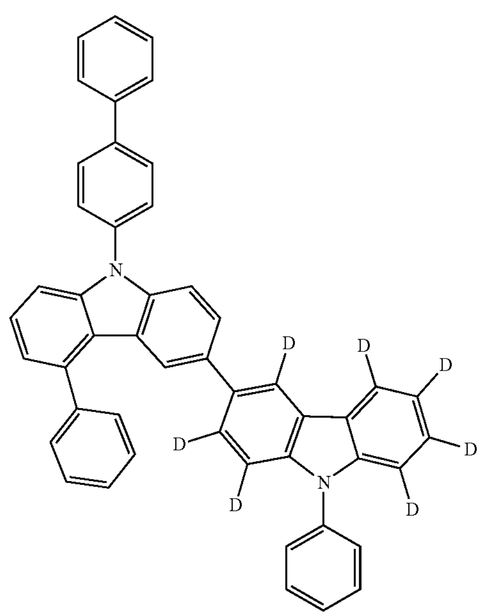
-continued
242
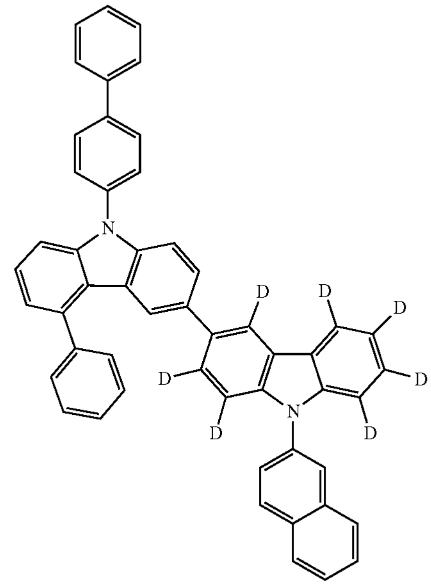
243
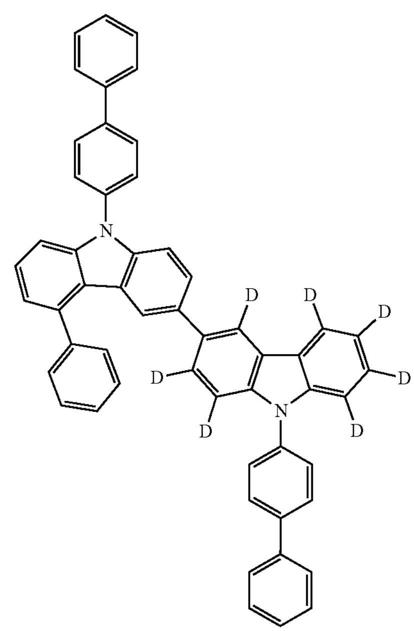

-continued
244
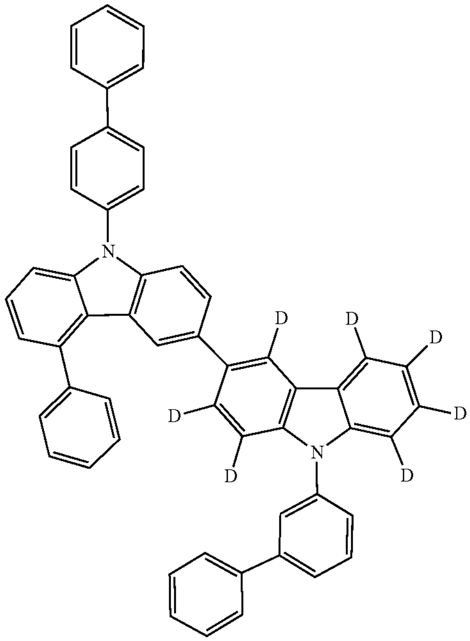
245
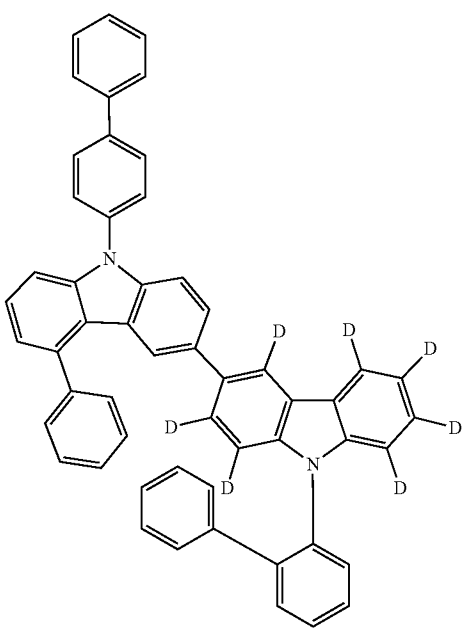
-continued
246
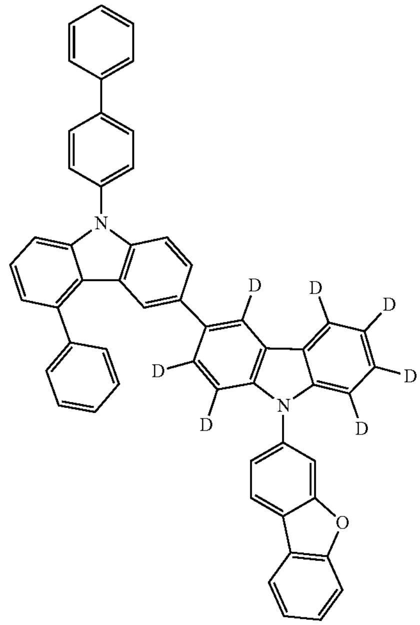
247
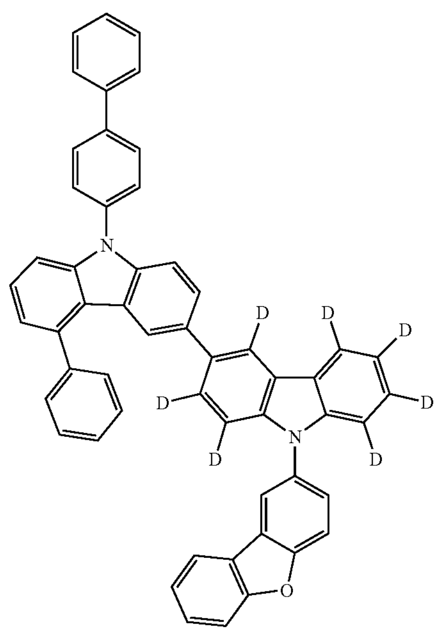

-continued
248
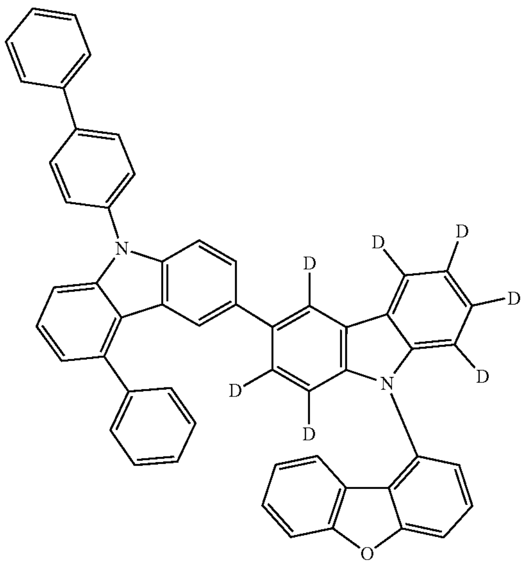
249
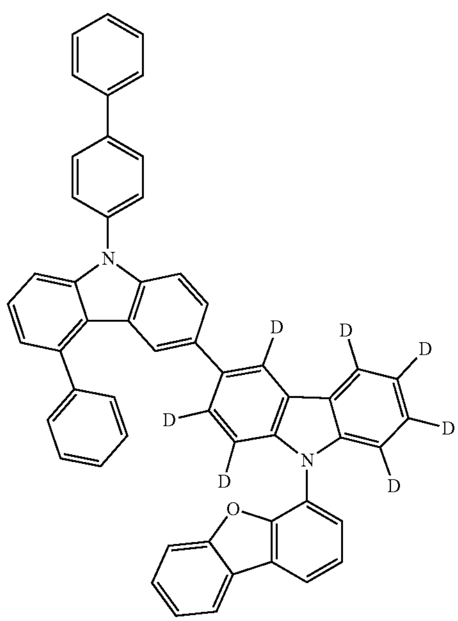
-continued
250
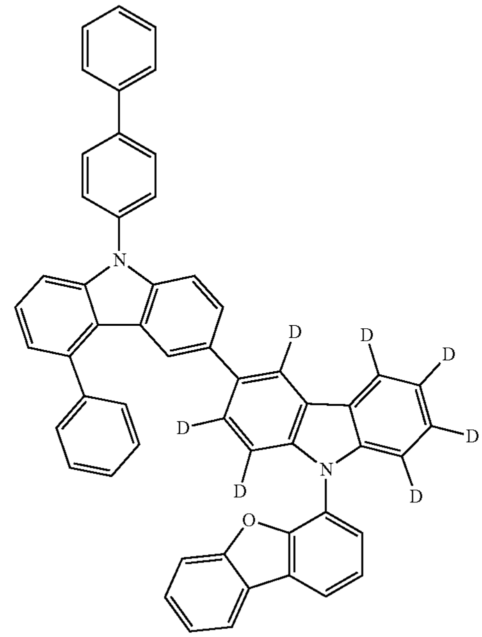
250
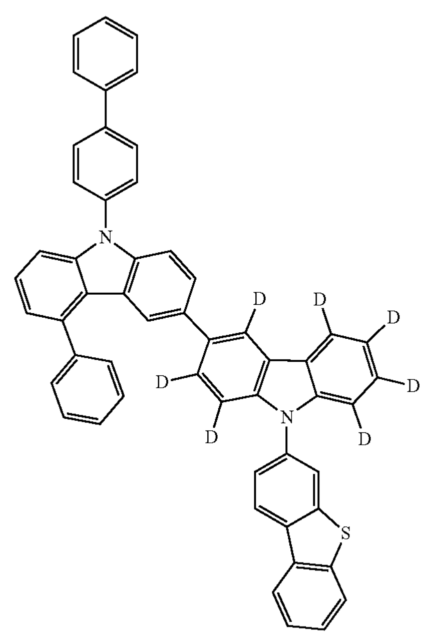

251
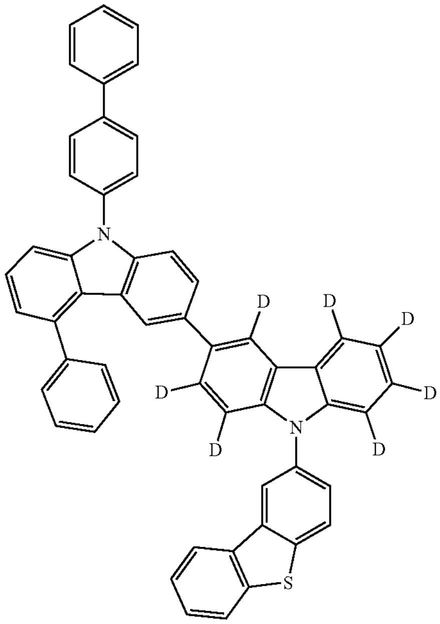
252
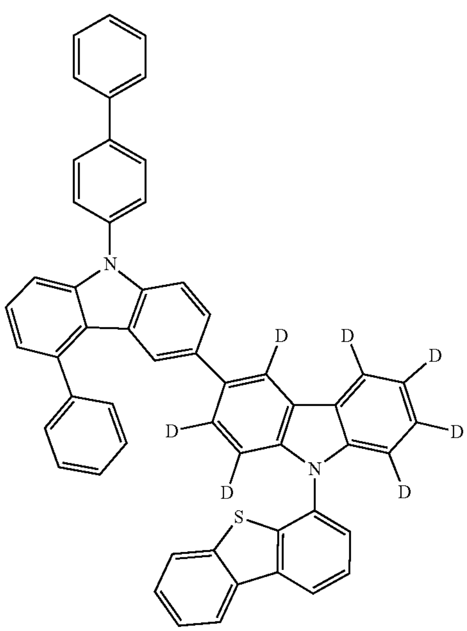
253
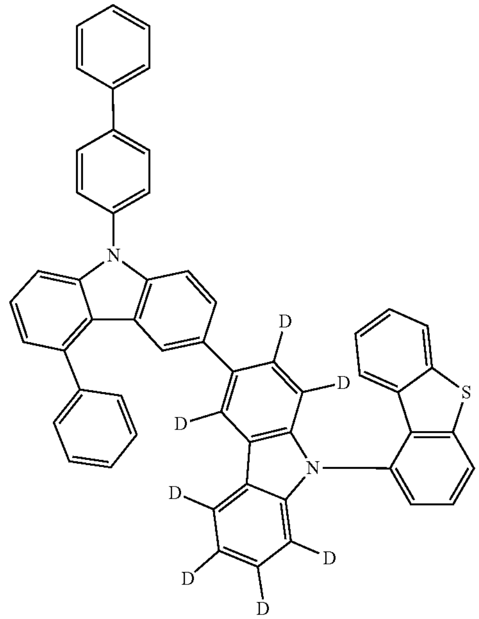
254
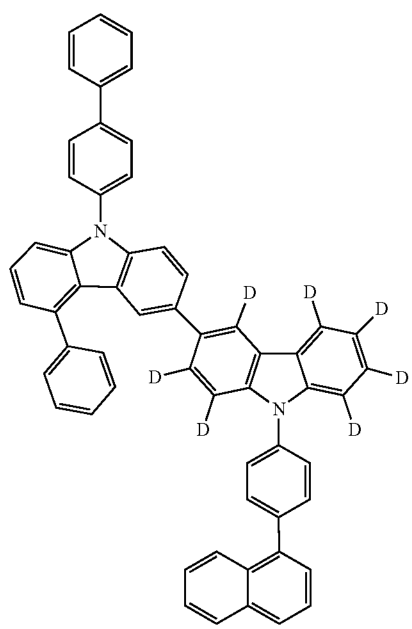

255
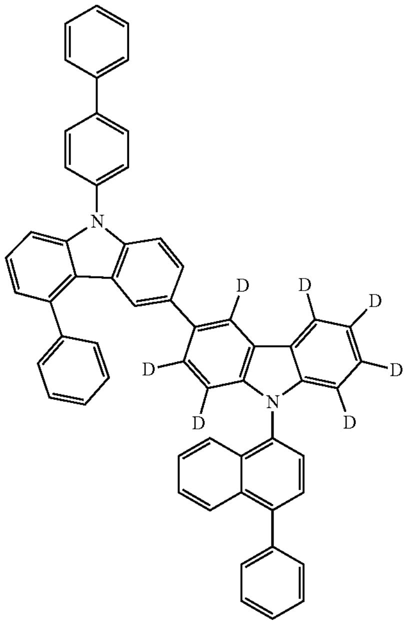
256
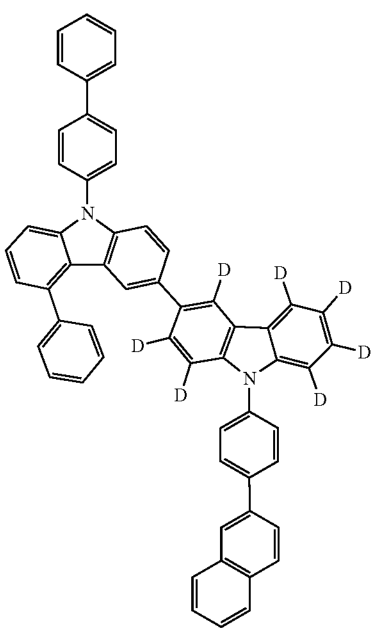
257
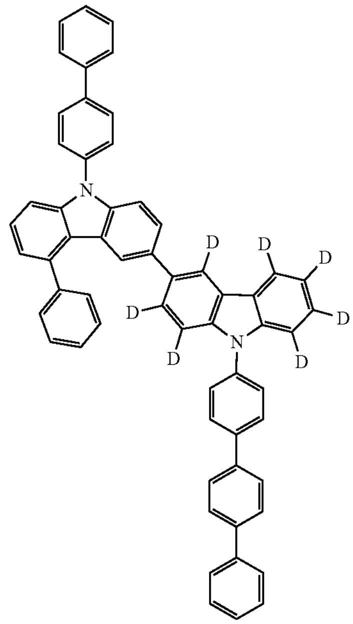
258
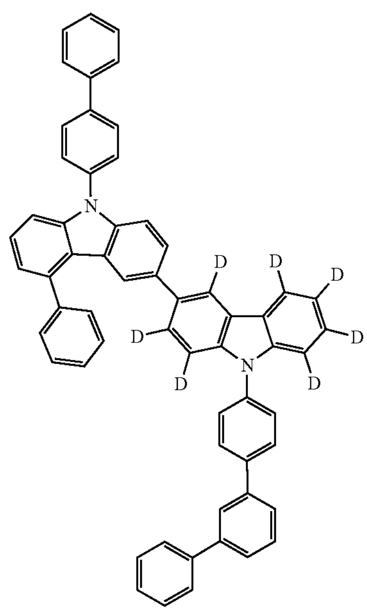

-continued
259
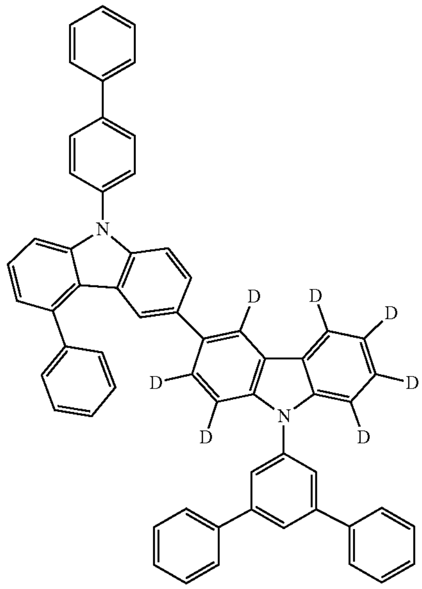
260
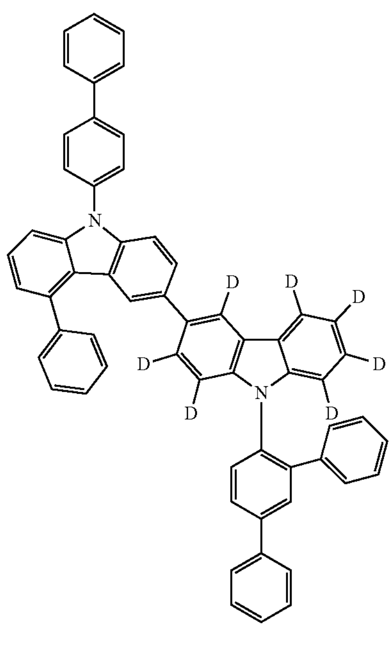
-continued
261
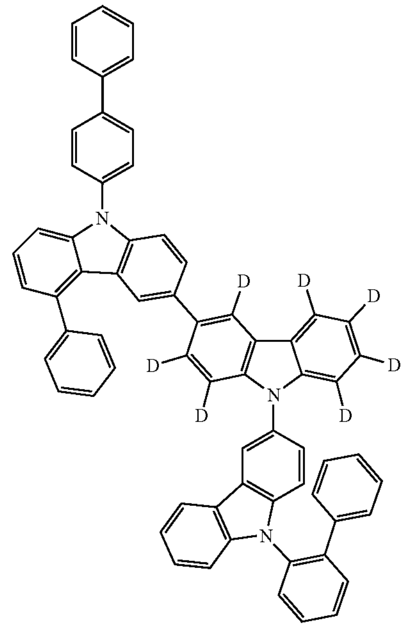
262
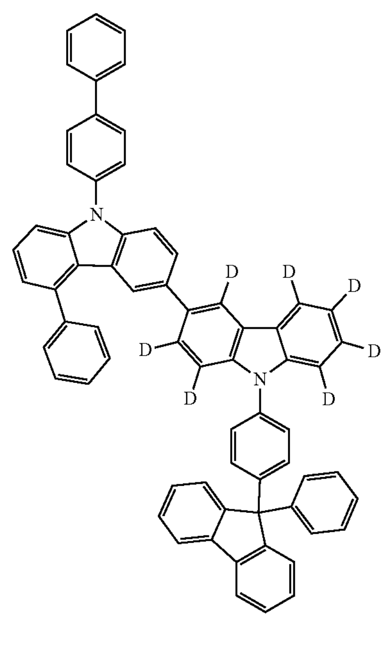

-continued
263
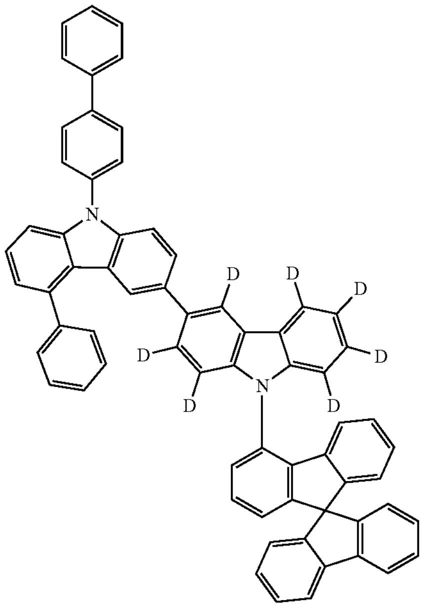
264
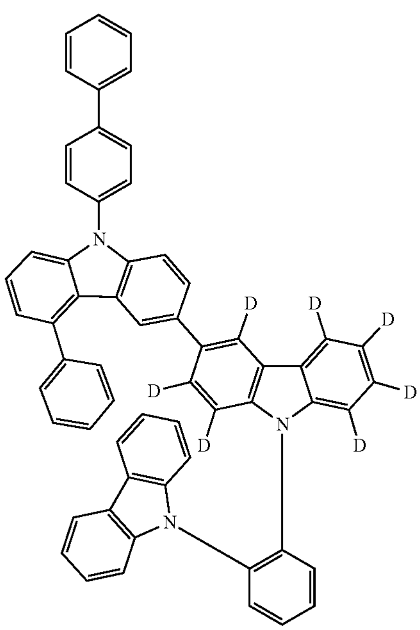
-continued
265
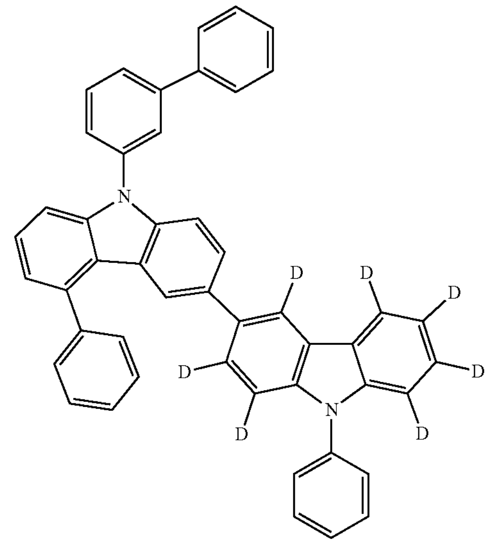
266
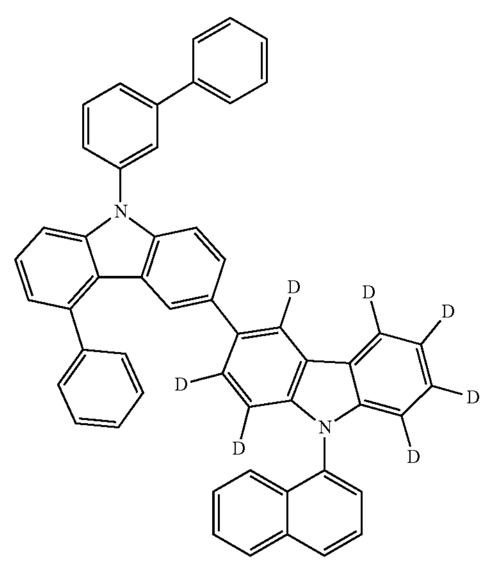

-continued
267
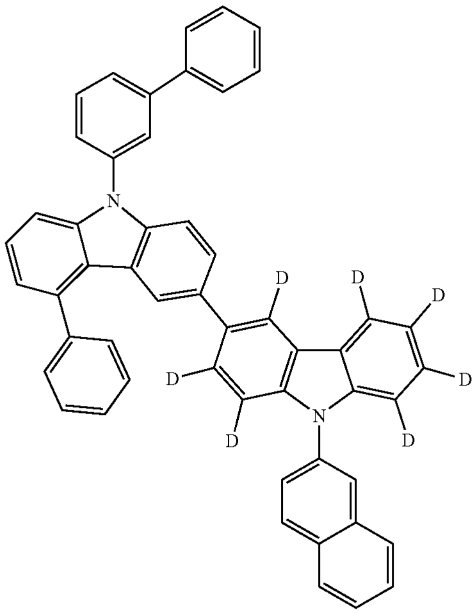
268
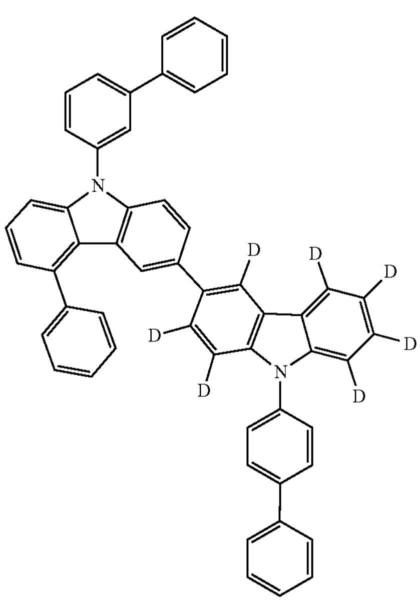
-continued
269
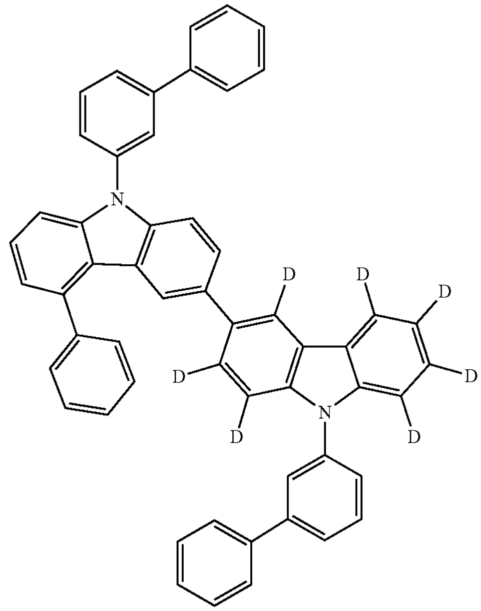
270
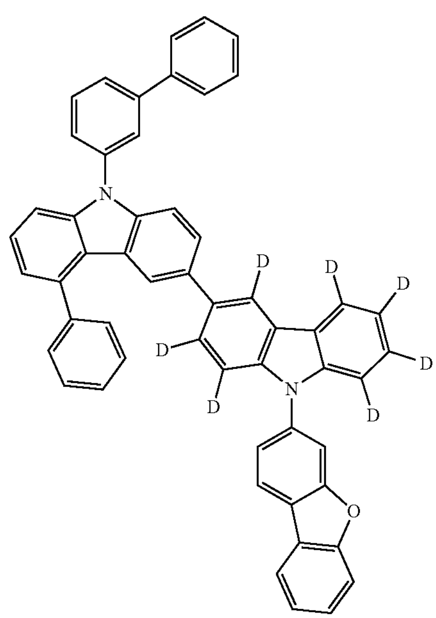

-continued
271
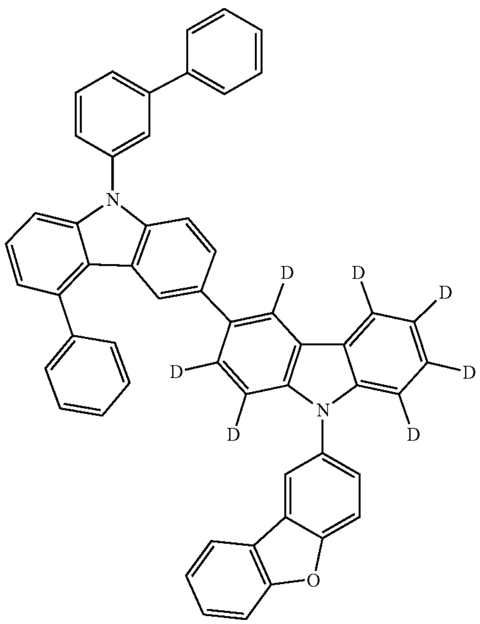
272
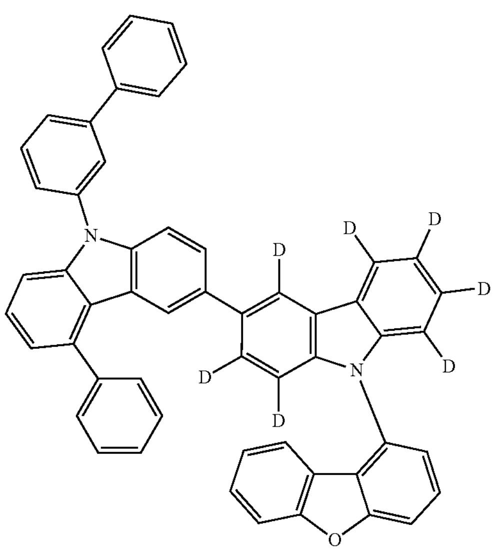
-continued
273
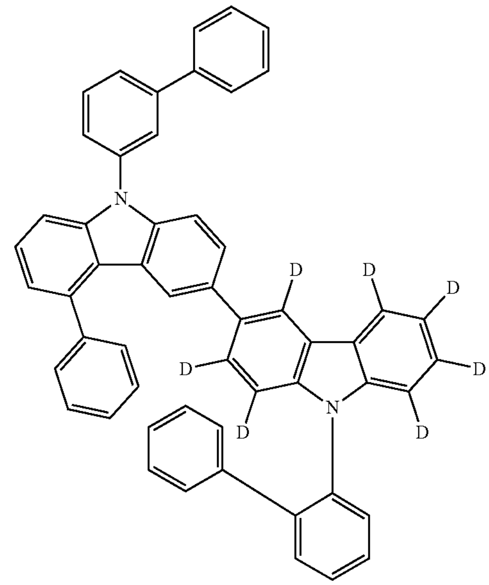
274
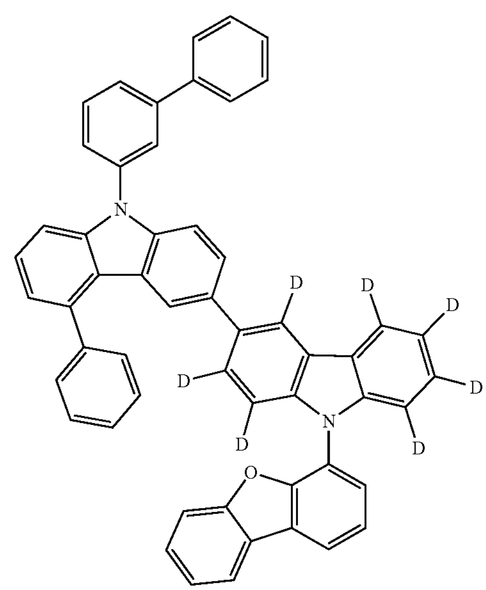

-continued
275
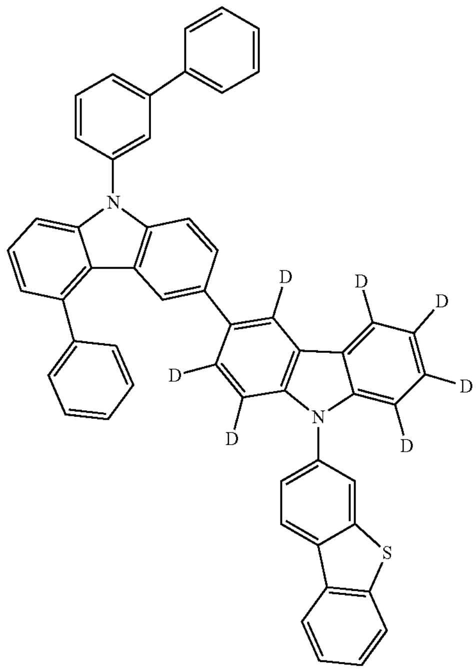
276
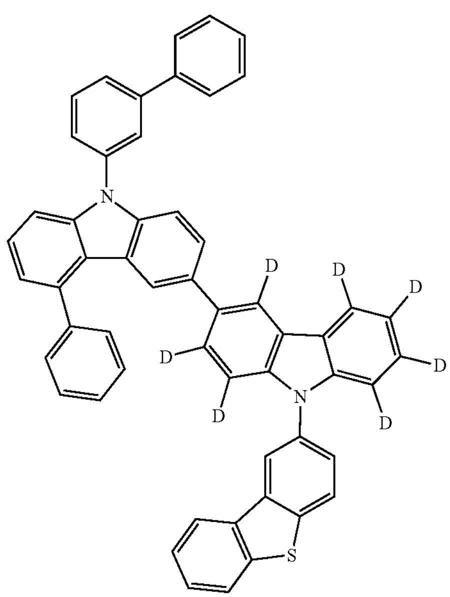
-continued
277
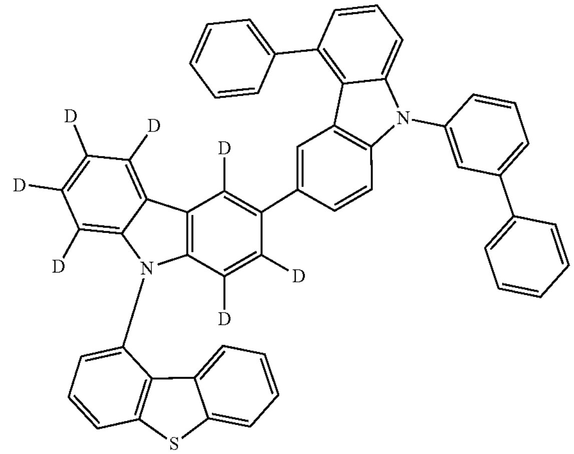
278
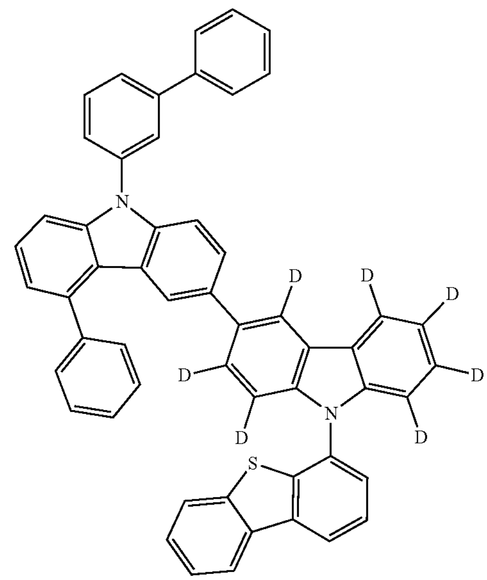
279
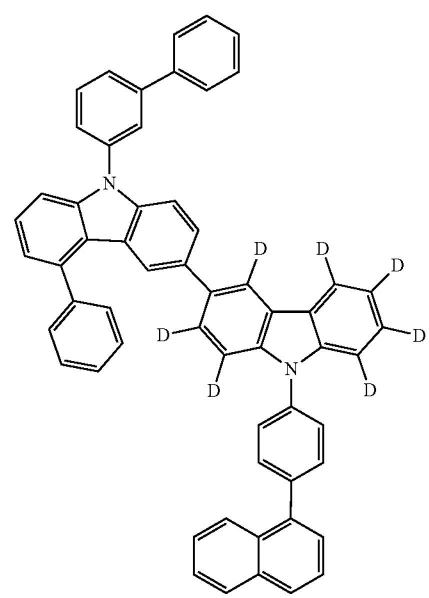

-continued
280
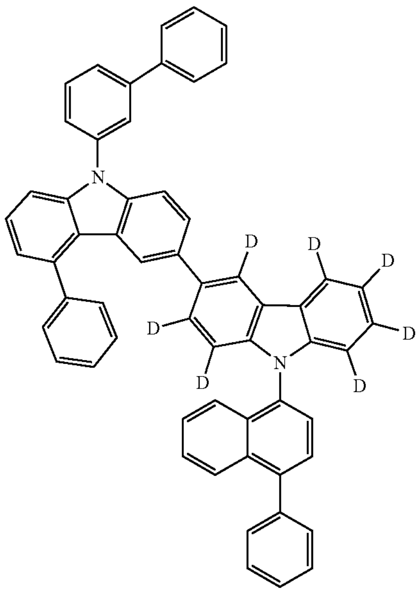
281
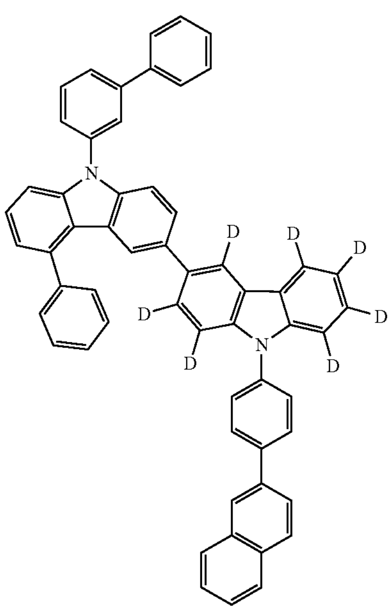
-continued
282
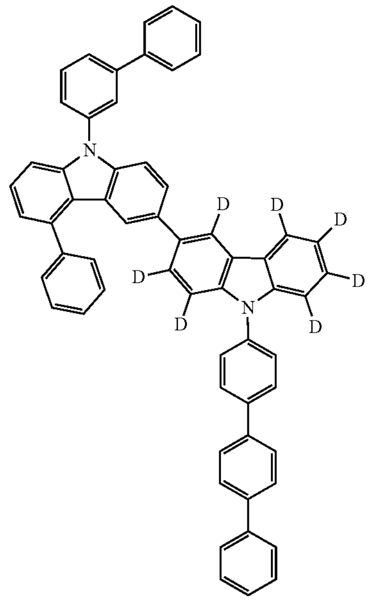
283
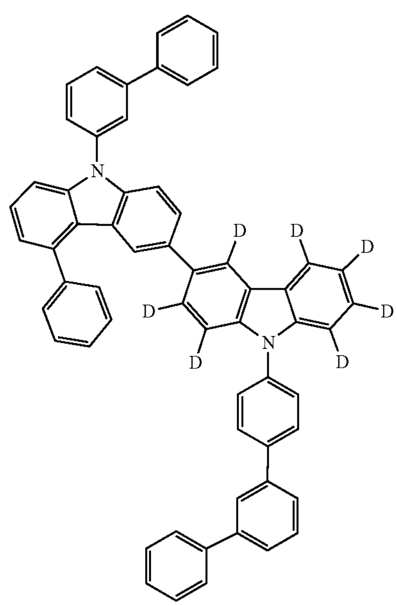

-continued
284
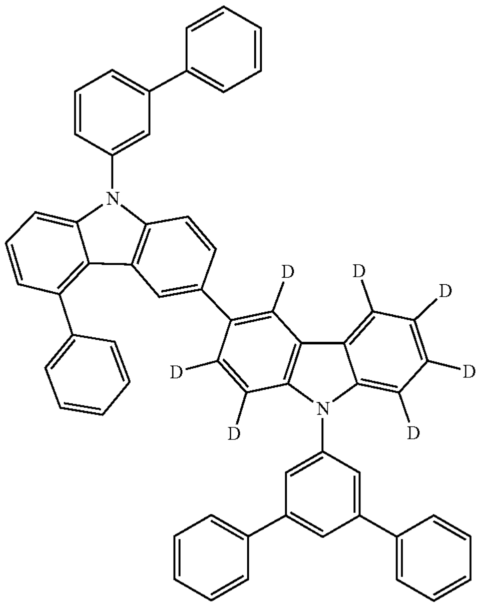
285
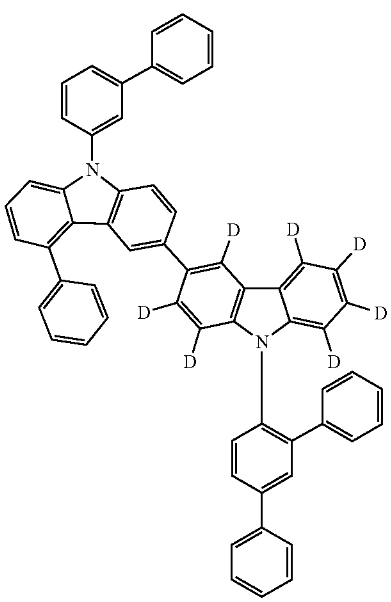
-continued
286
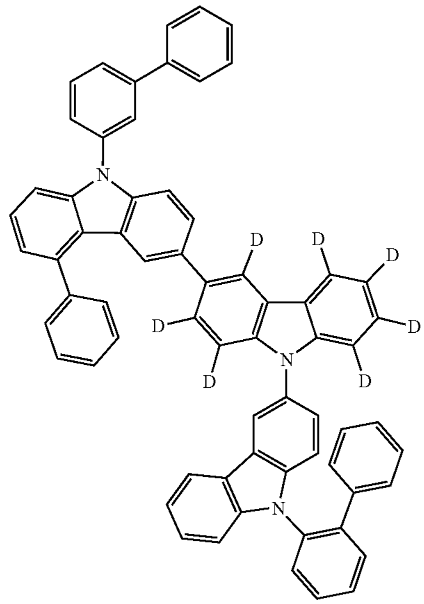
287
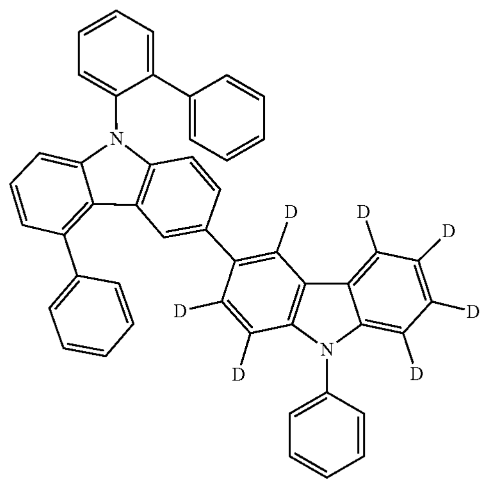
288
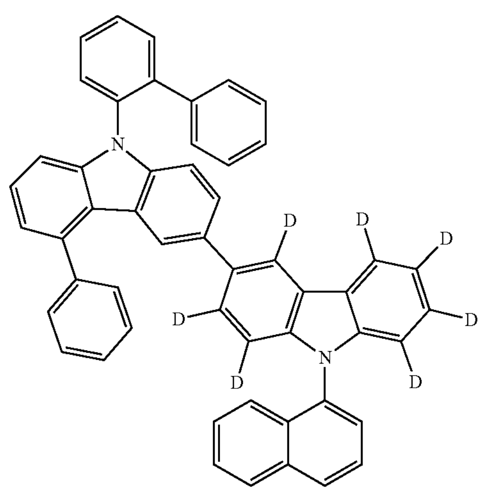

-continued
289
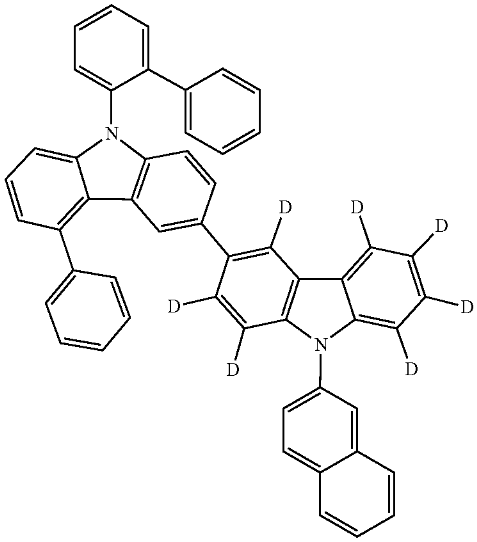
290
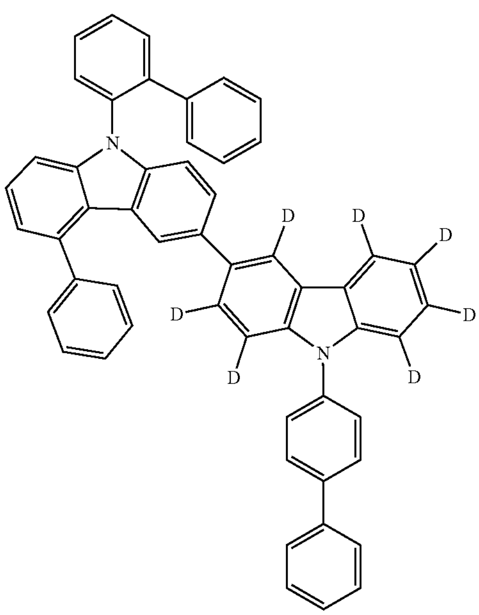
-continued
291
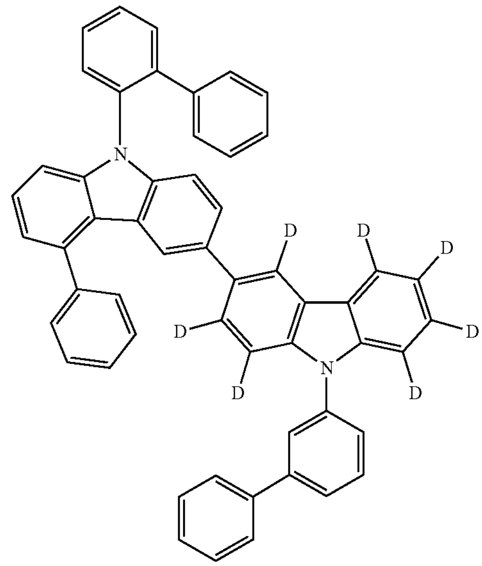
292
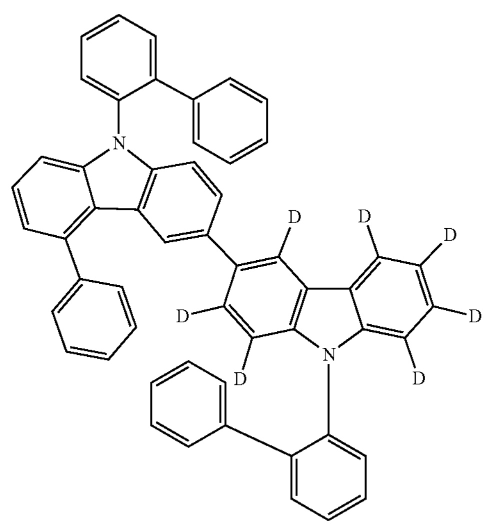

-continued
293
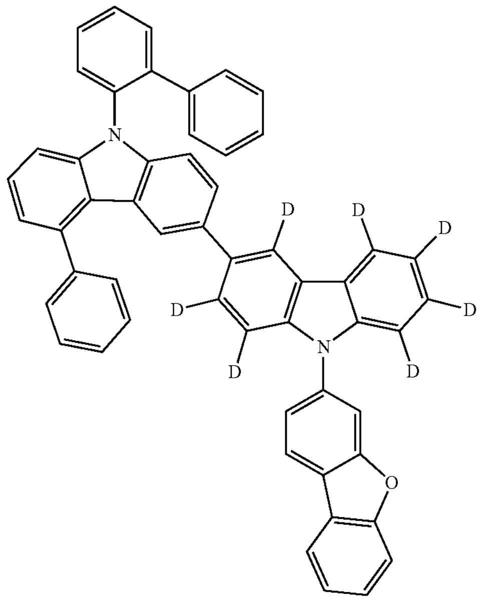
294
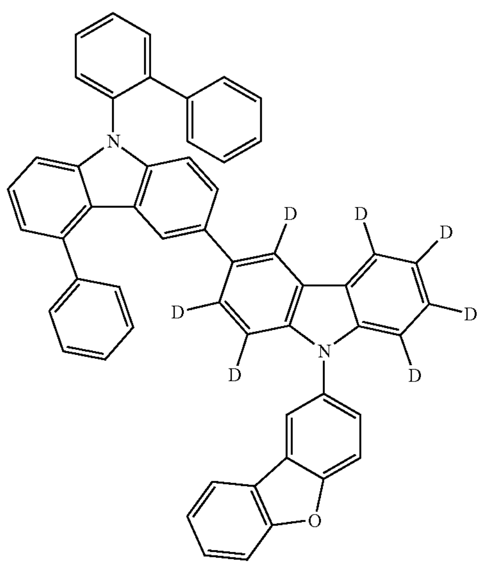
295
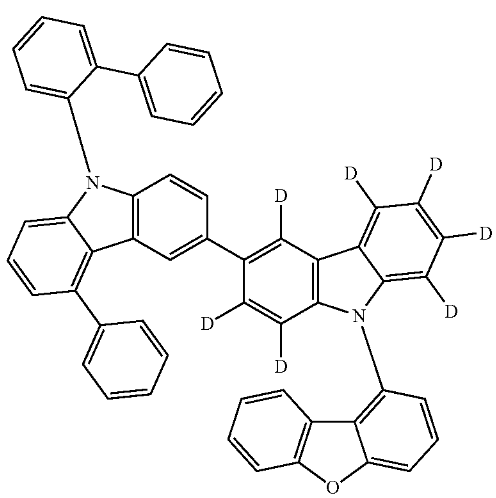
-continued
296
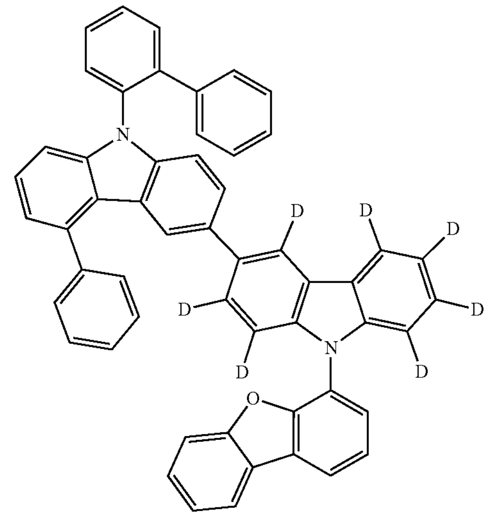
297
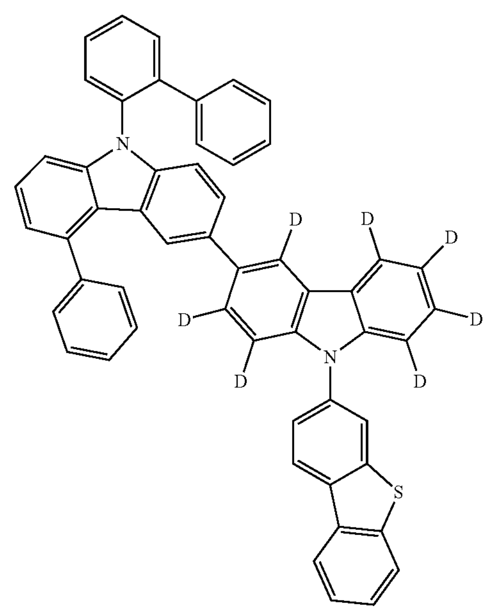

-continued
298
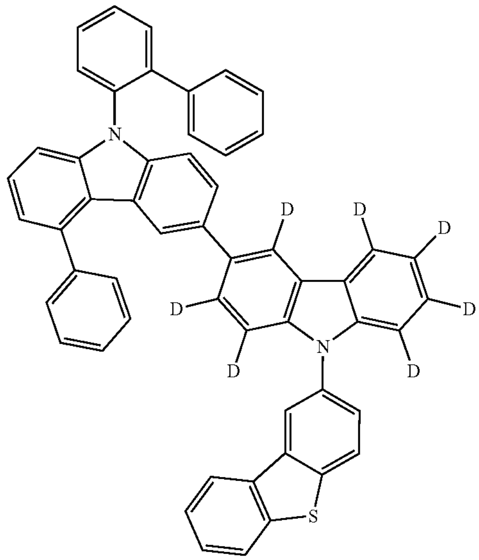
299
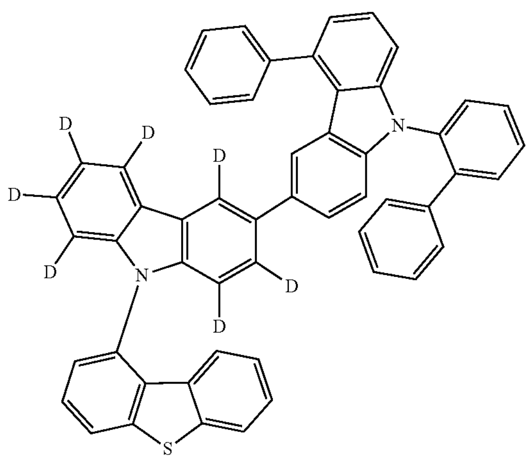
300
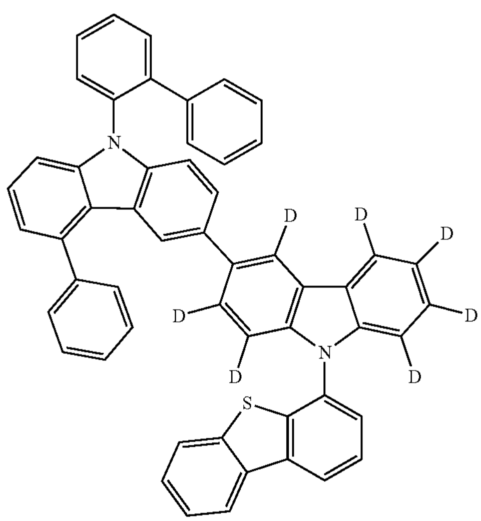
-continued
301
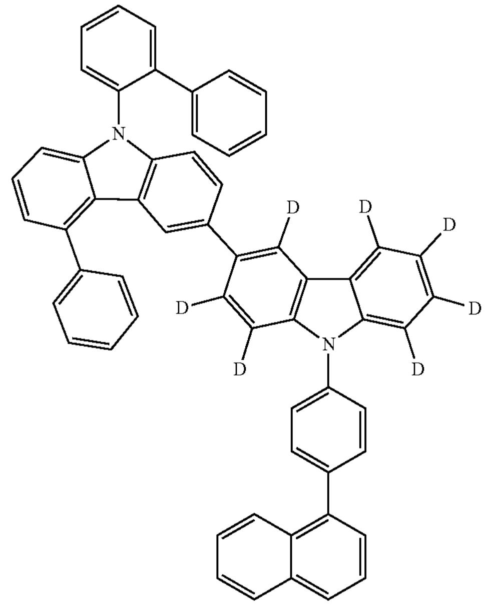
302
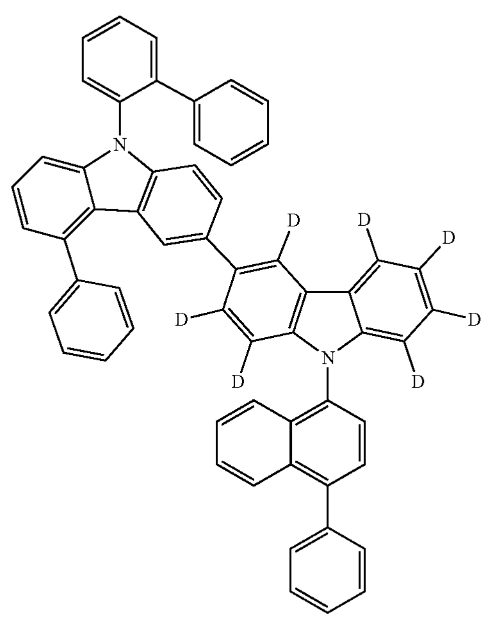

-continued
303
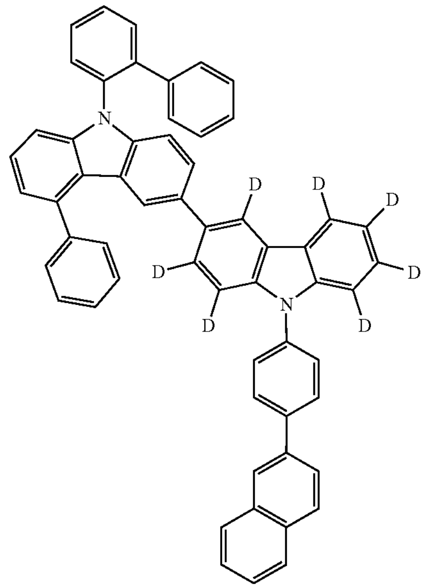
305
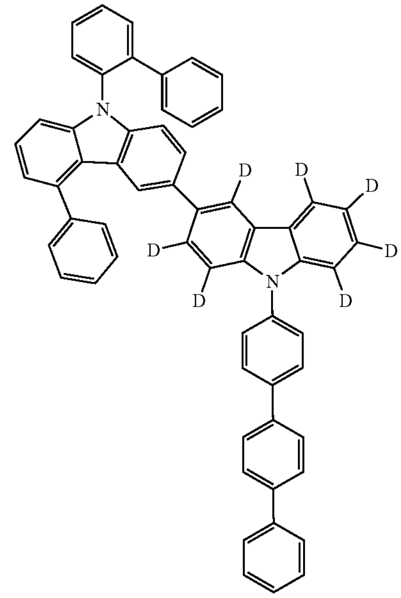
304
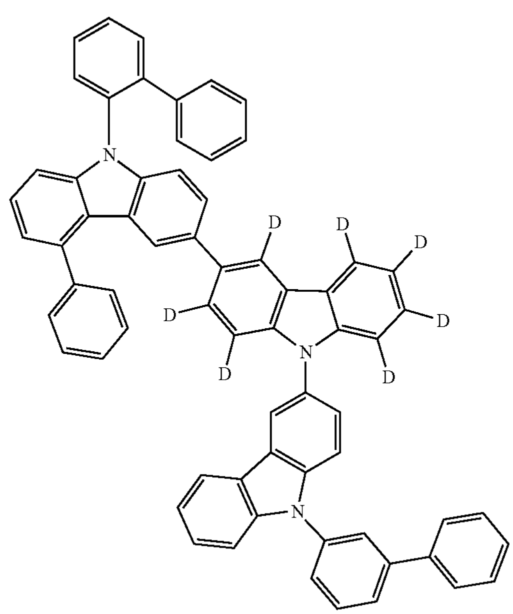
306
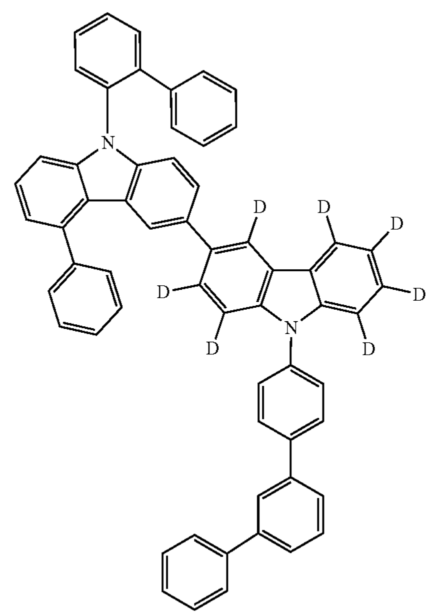

307
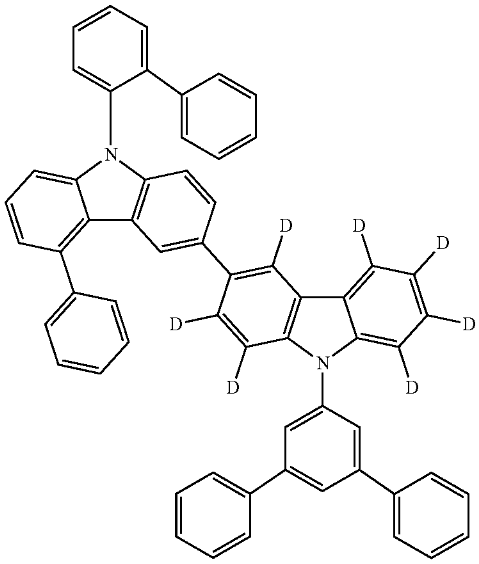
308
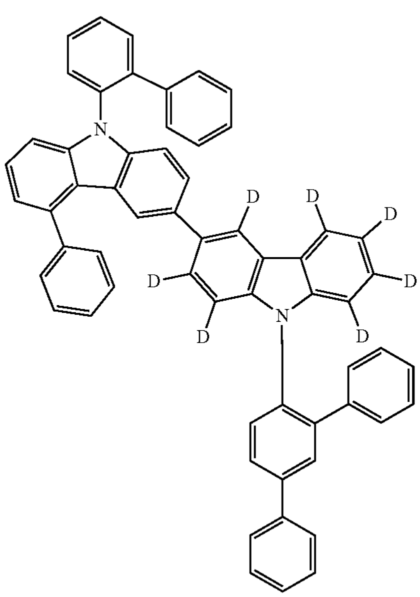
309
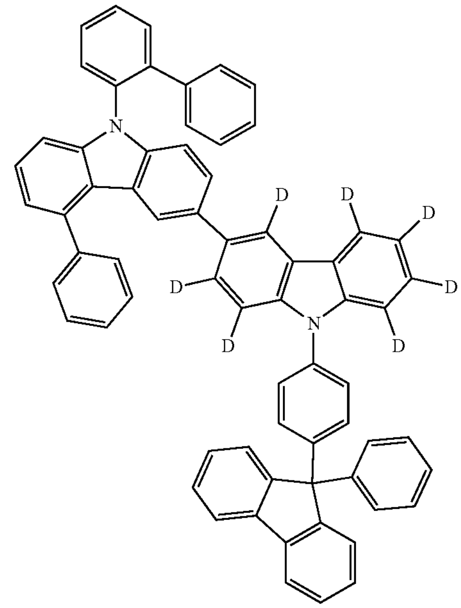
310
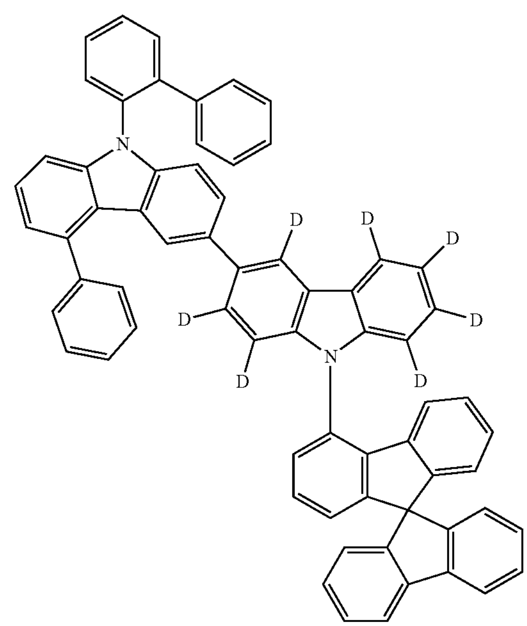

-continued
311
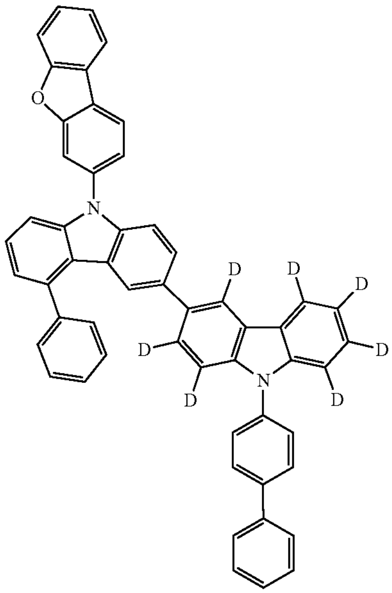
312
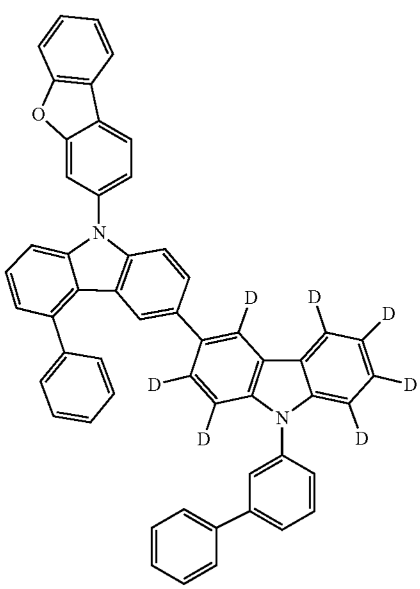
-continued
313
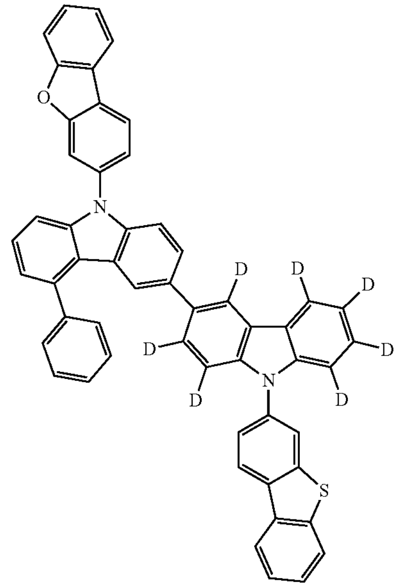
314
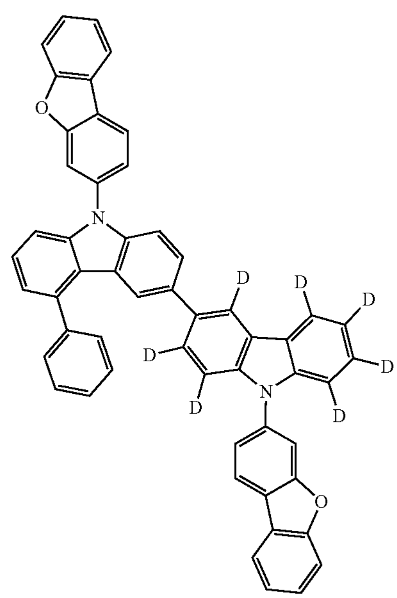

-continued
315
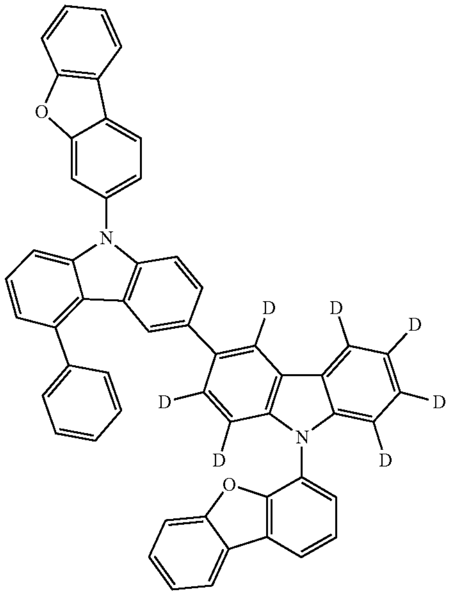
316
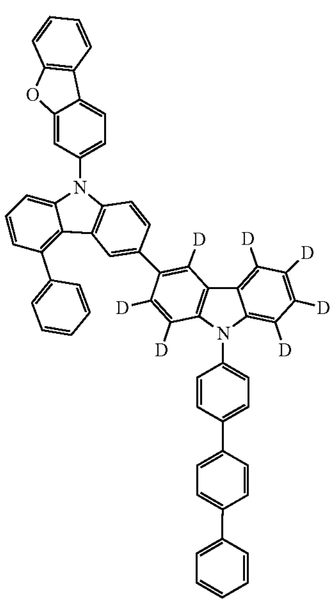
-continued
317
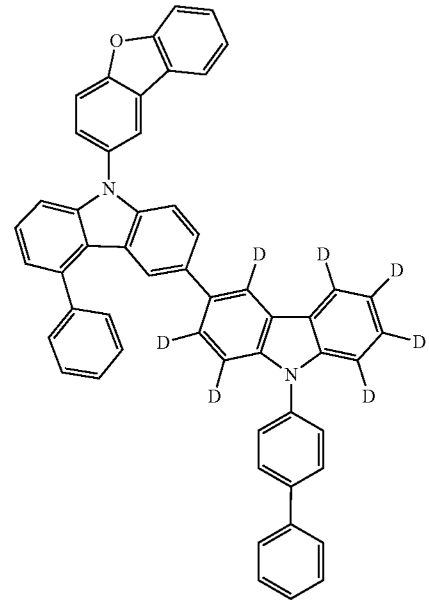
318
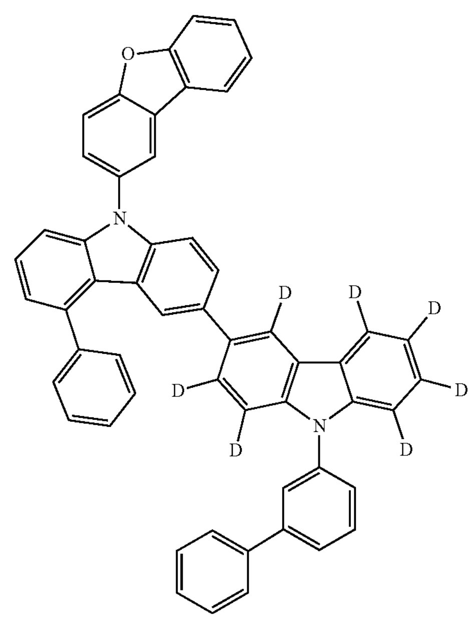

-continued
319
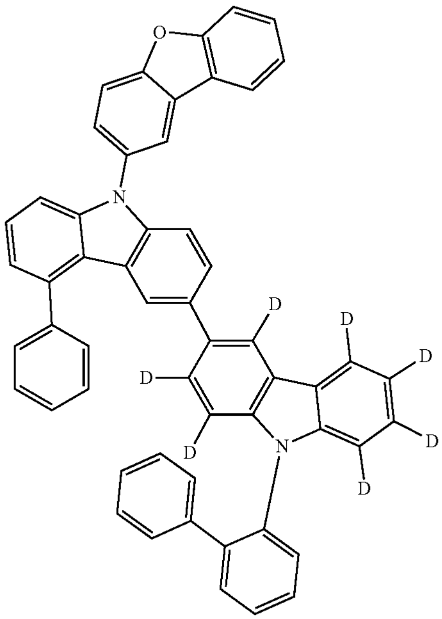
-continued
321
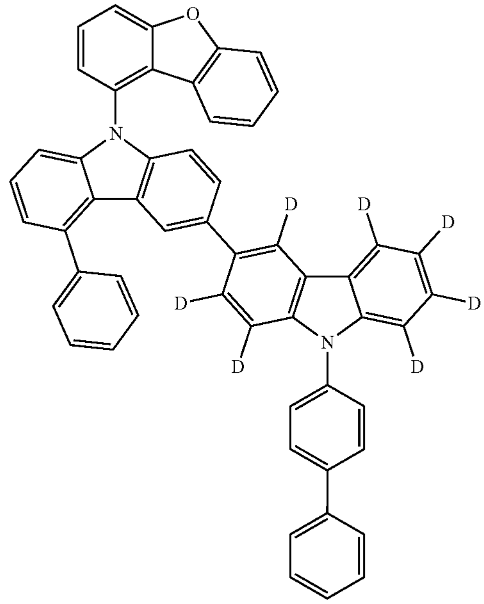
320
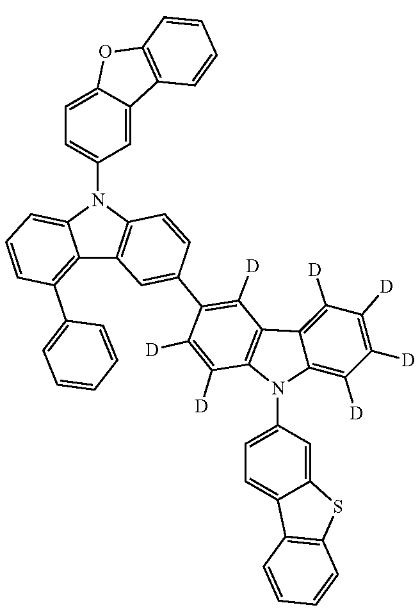
322
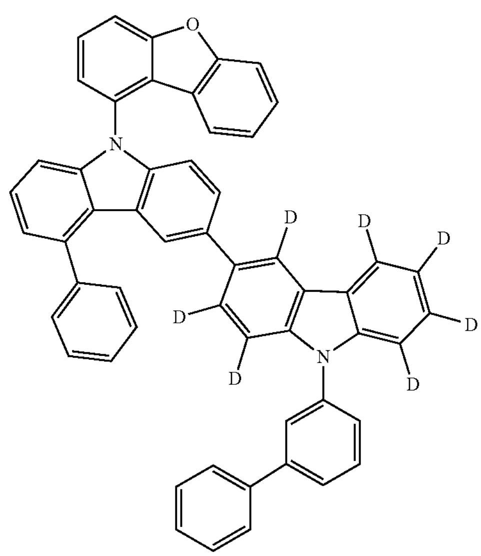

-continued
323
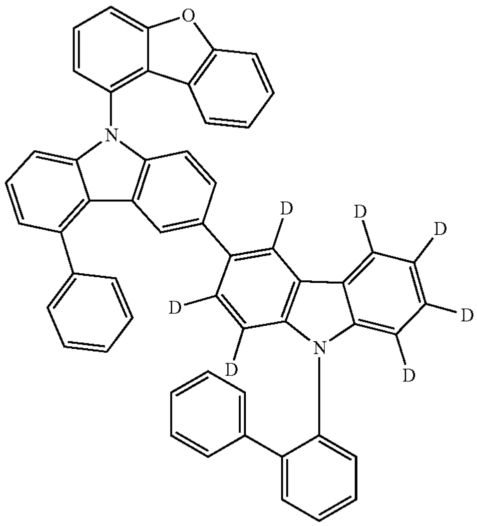
324
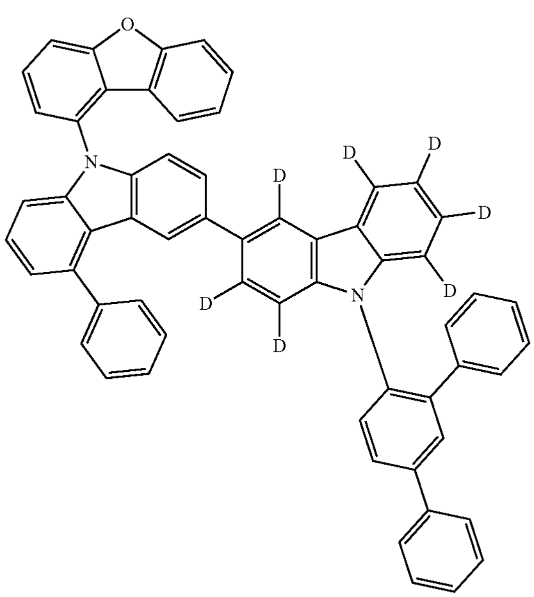
-continued
325
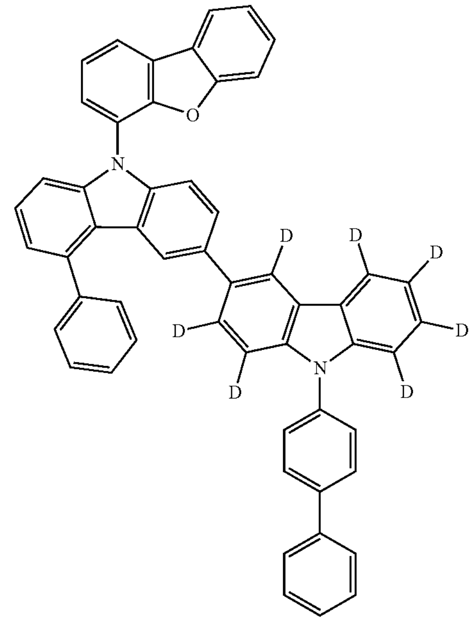
326
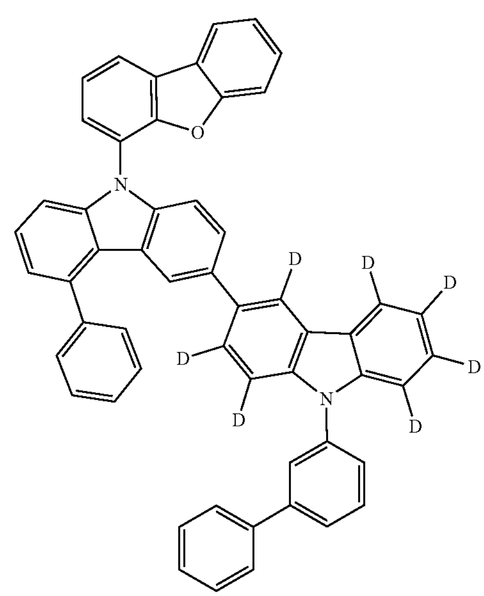

-continued
327
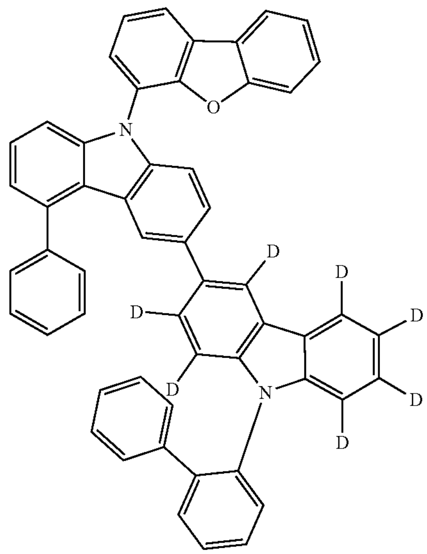
329
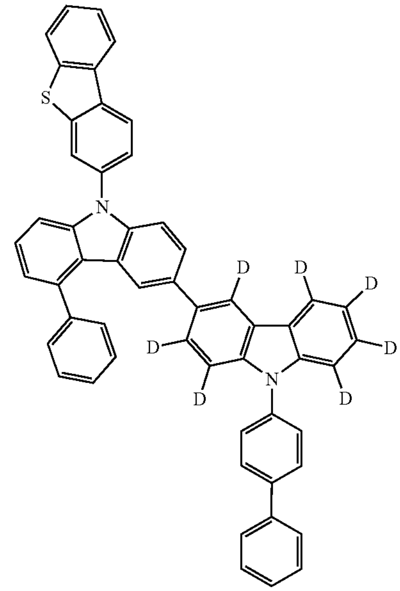
328
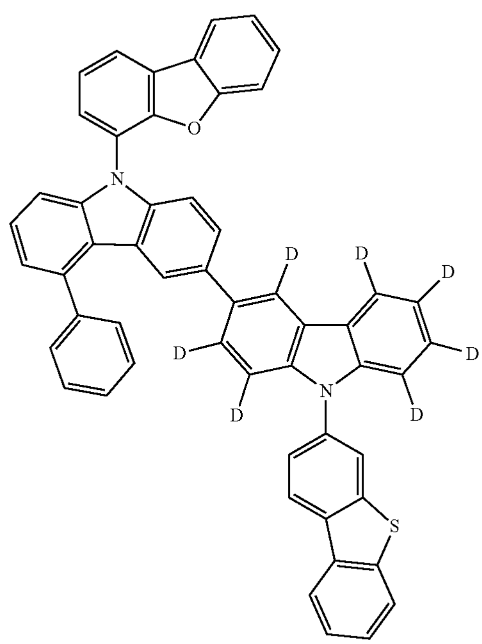
330
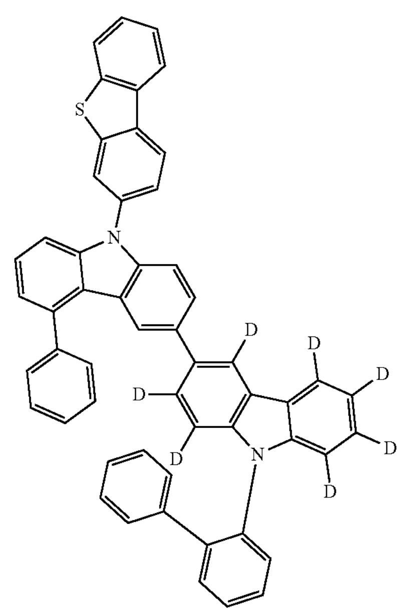

-continued
331
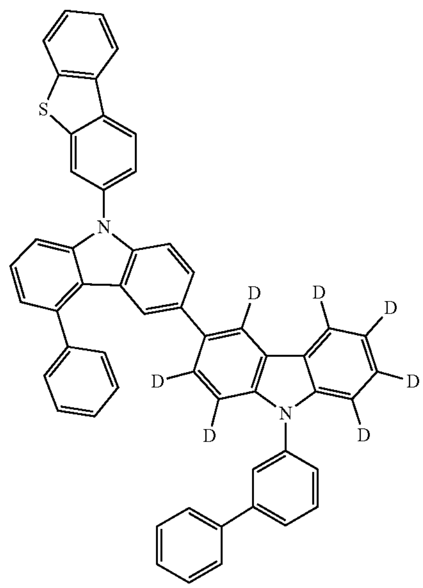
333
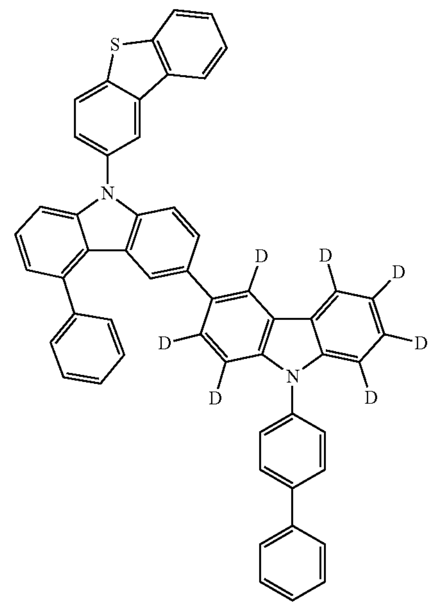
332
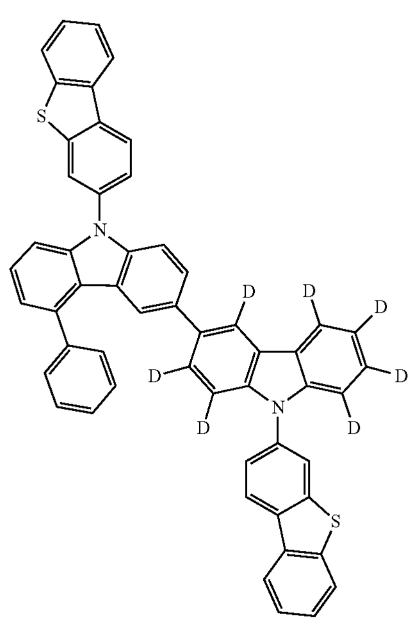
334
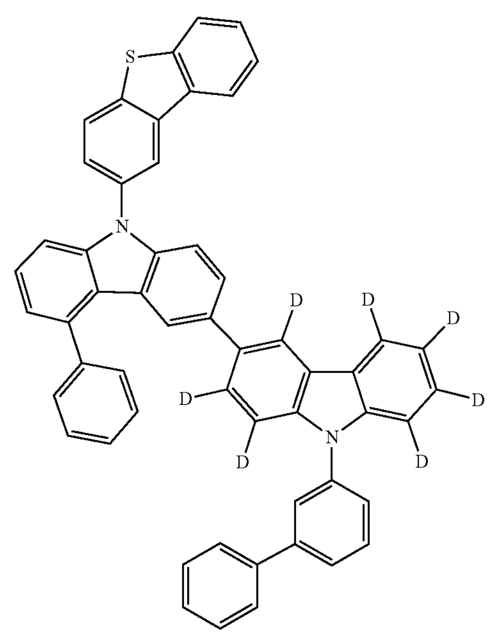

-continued
335
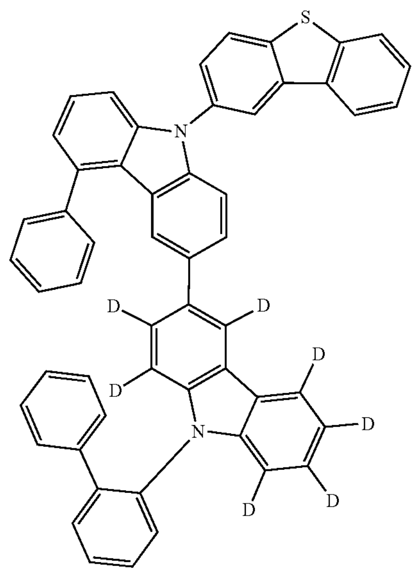
336
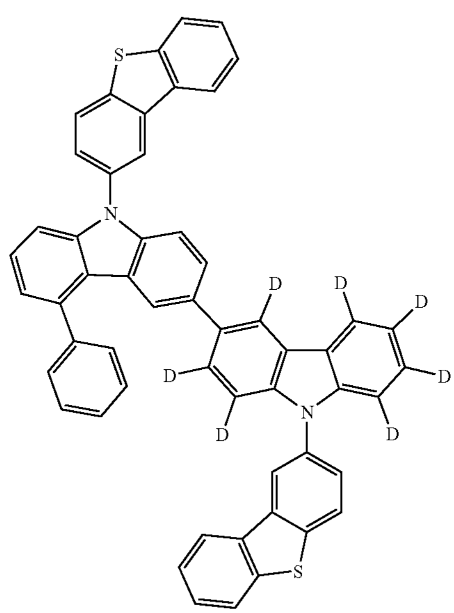
-continued
337
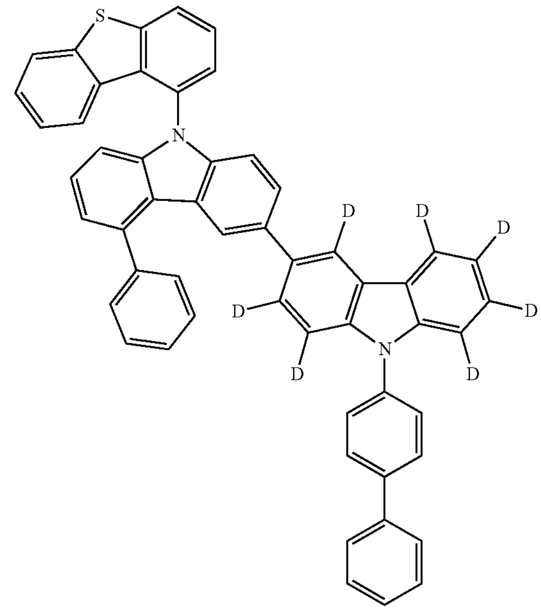
338
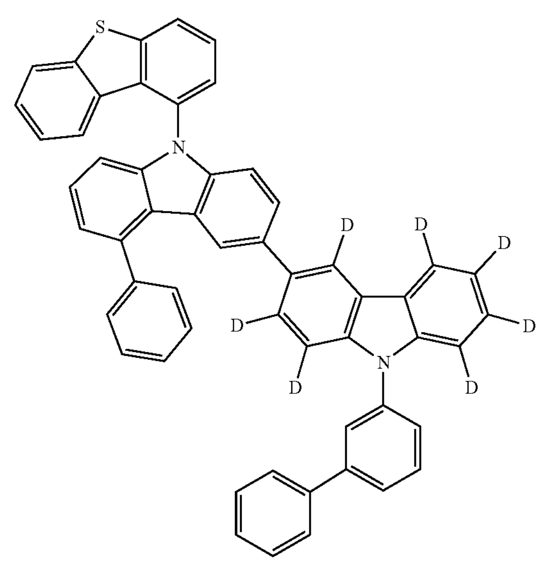

-continued
339
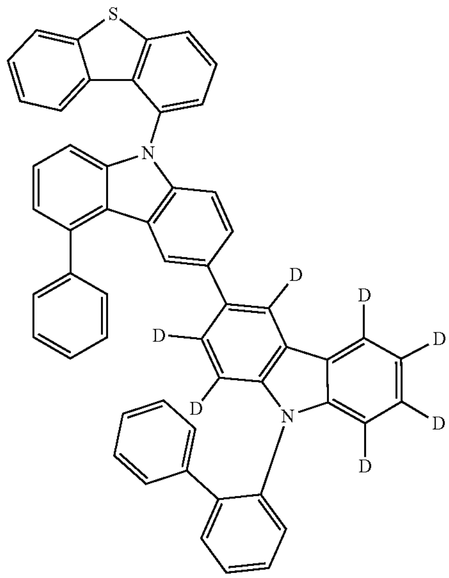
340
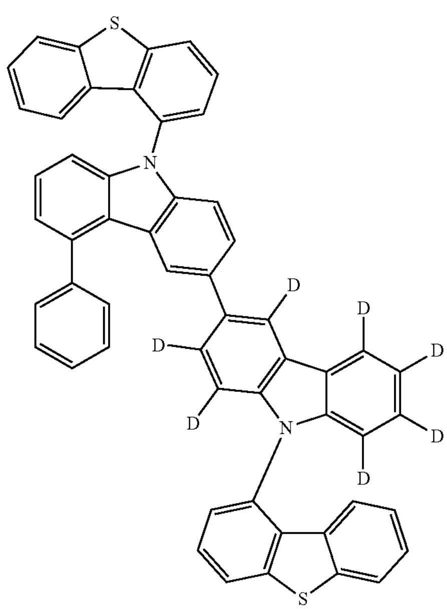
-continued
341
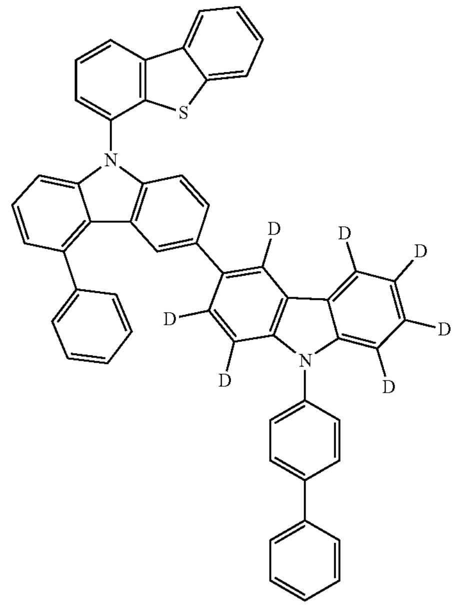
342
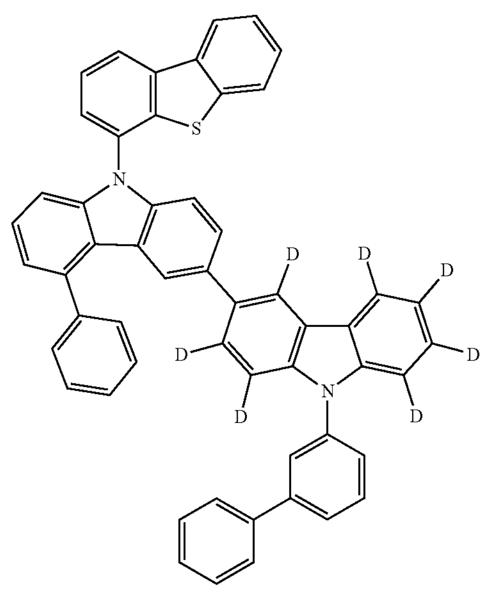

-continued
343
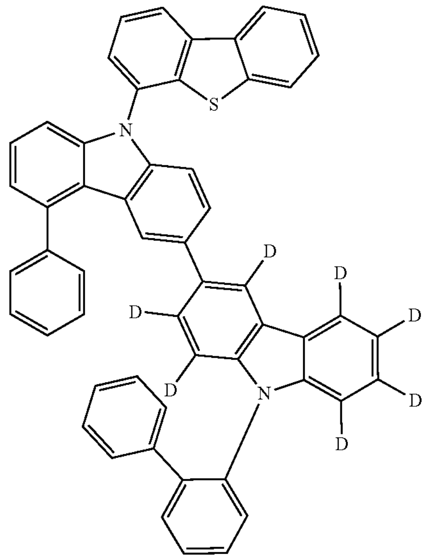
344
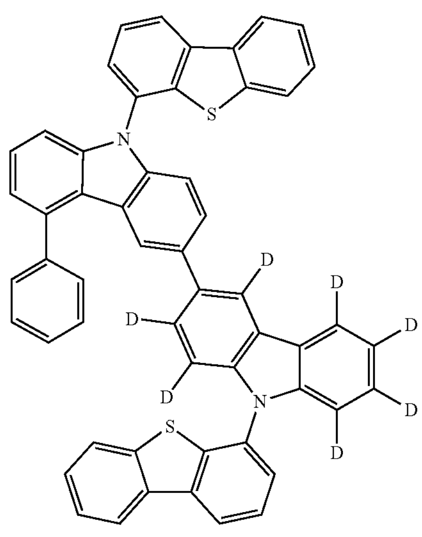
-continued
345
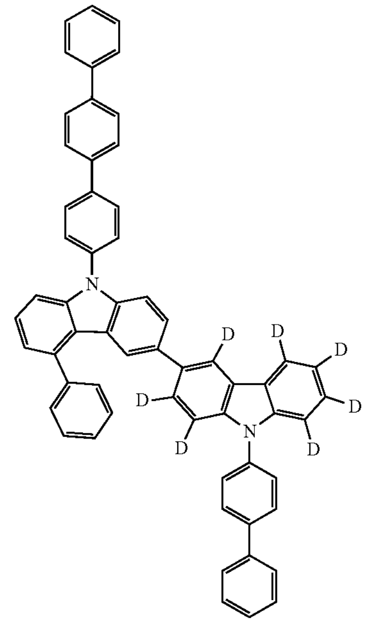
346
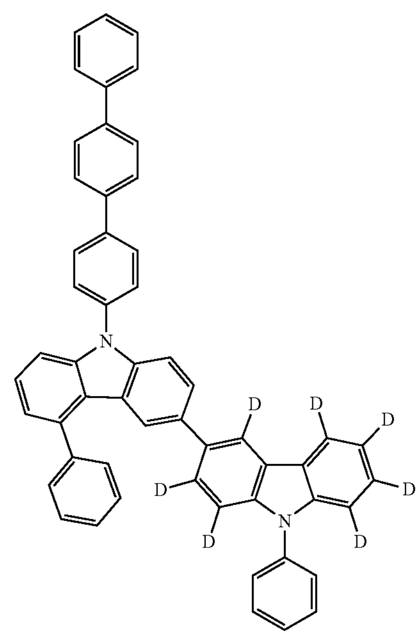

-continued
347
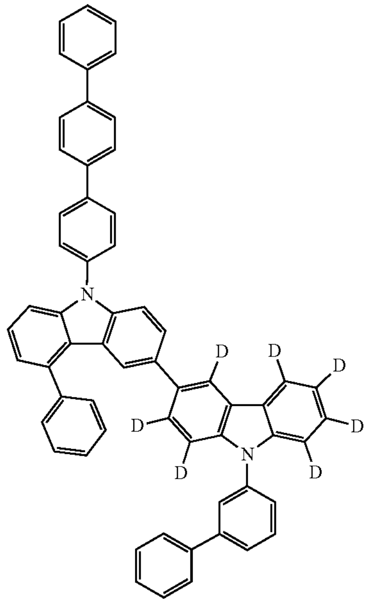
348
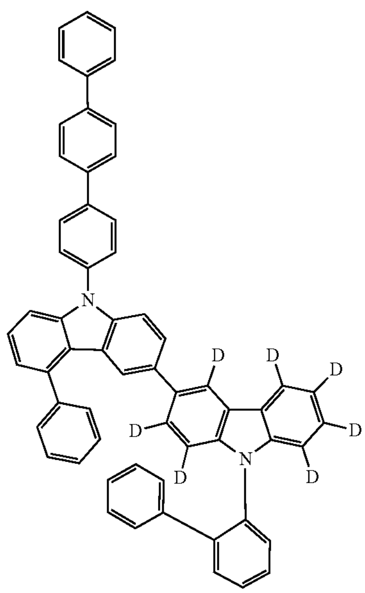
-continued
349
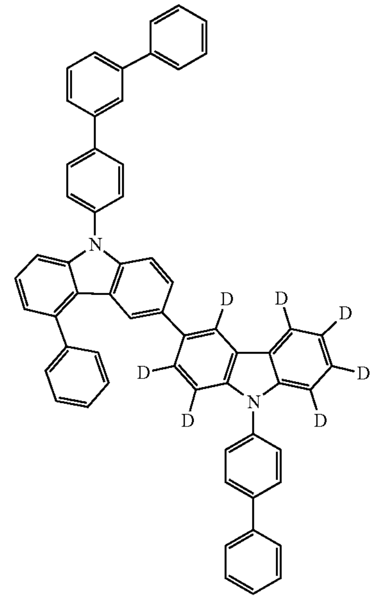
350
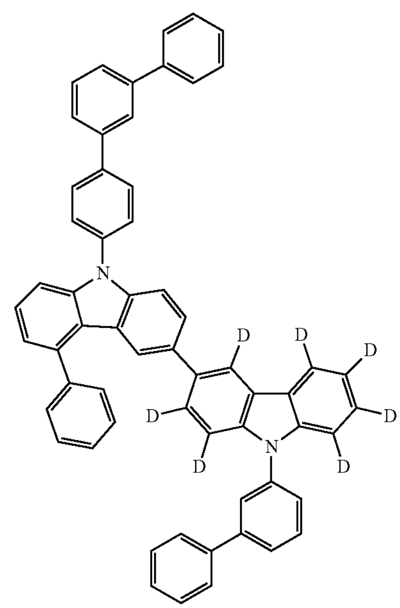

-continued
351
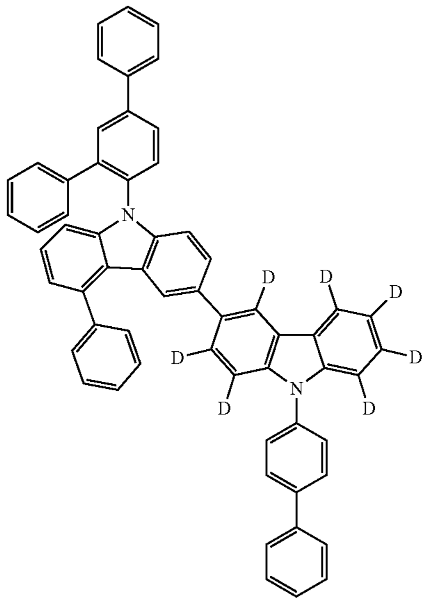
352
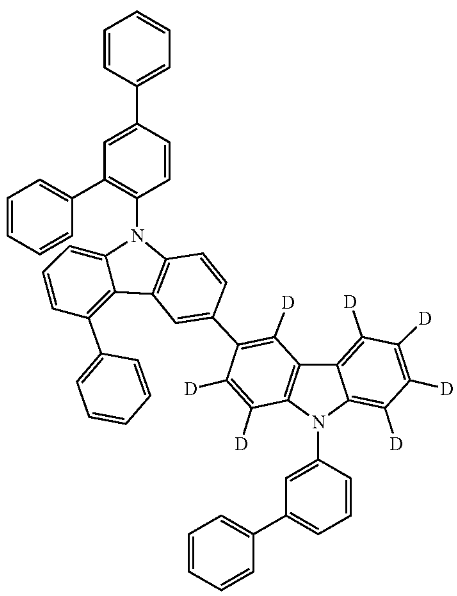
353
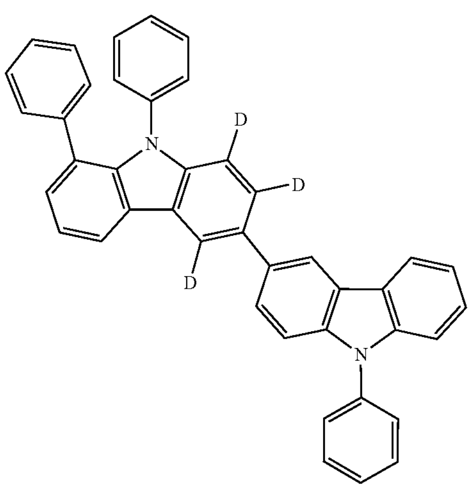
-continued
354
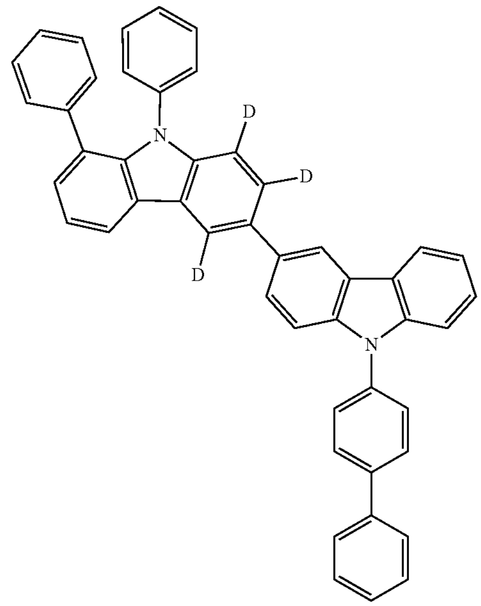
355
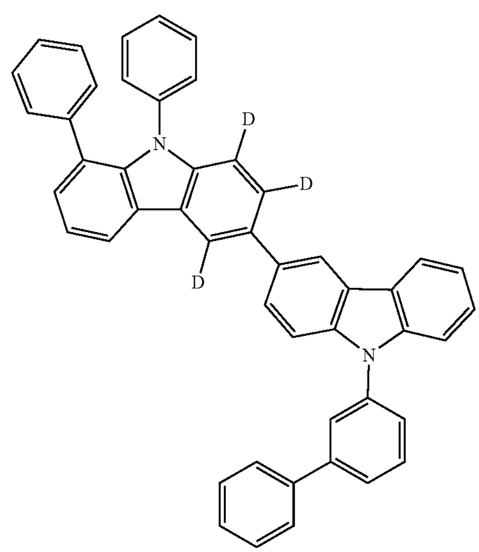

-continued
356
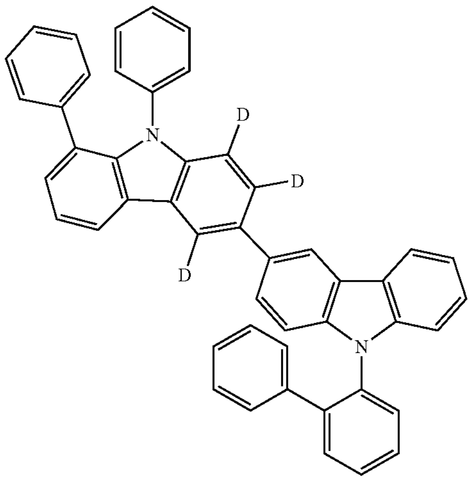
357
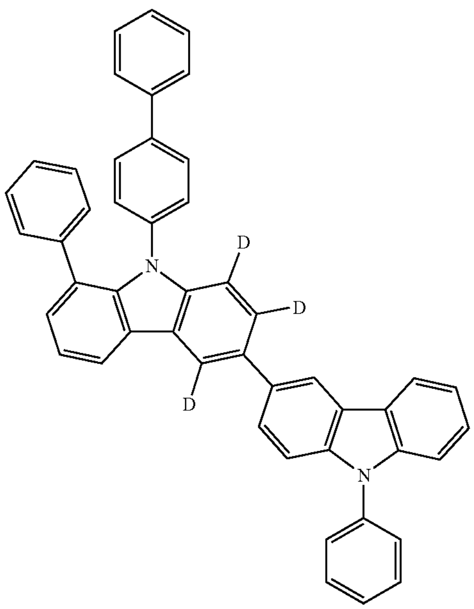
358
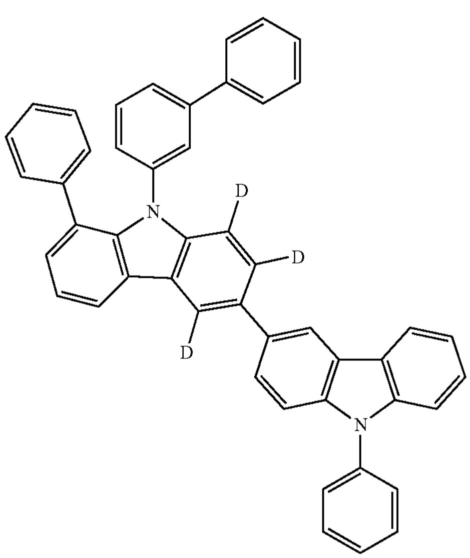
359
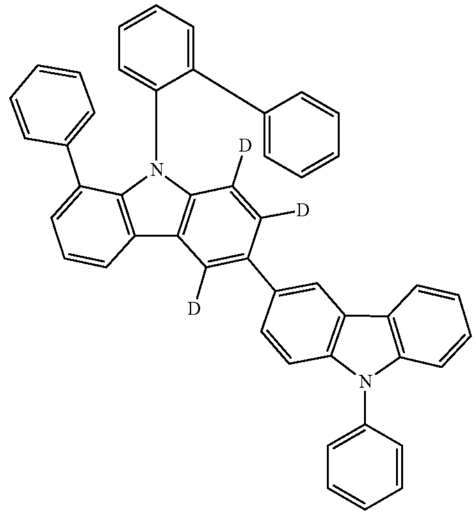
360
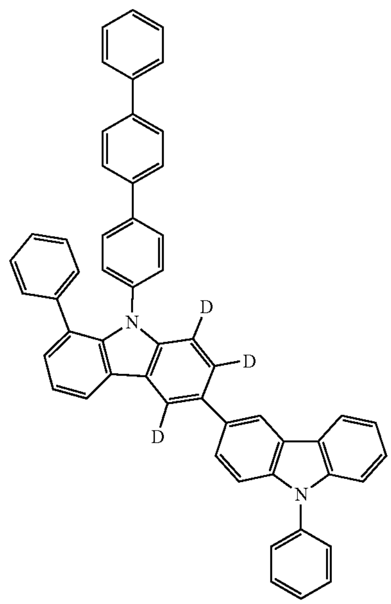
361
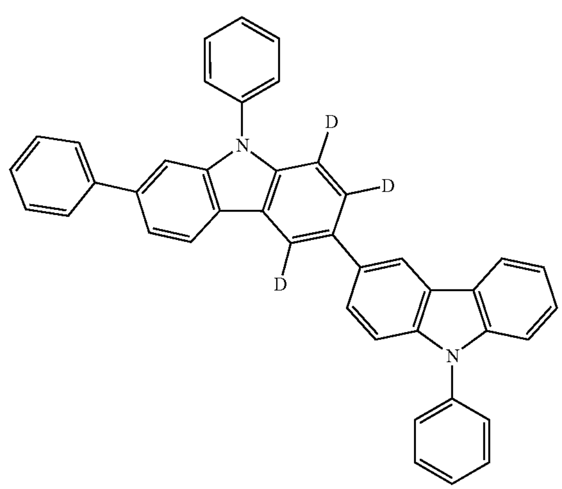

-continued
362
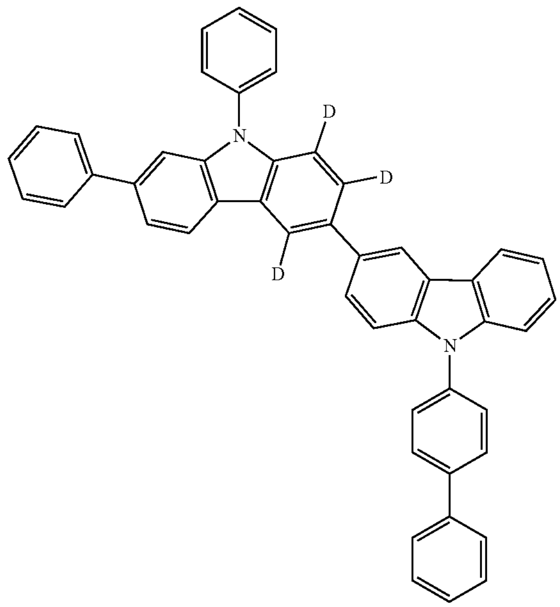
363
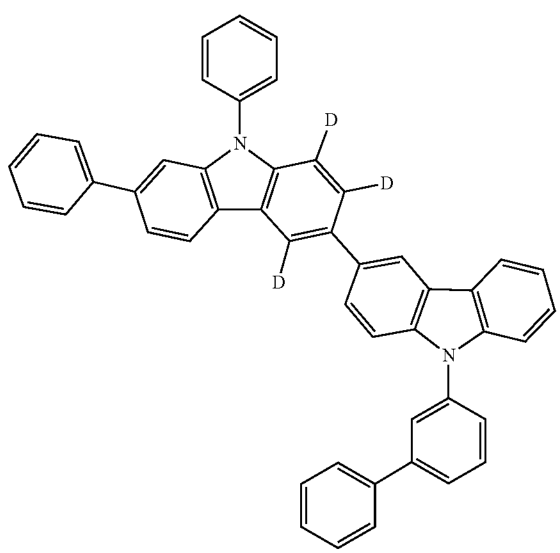
-continued
364
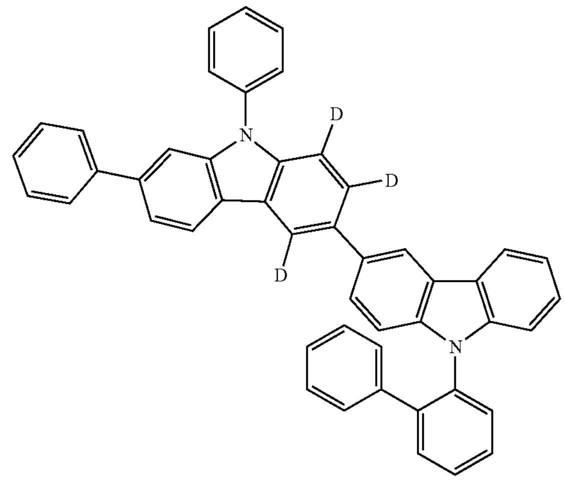
365
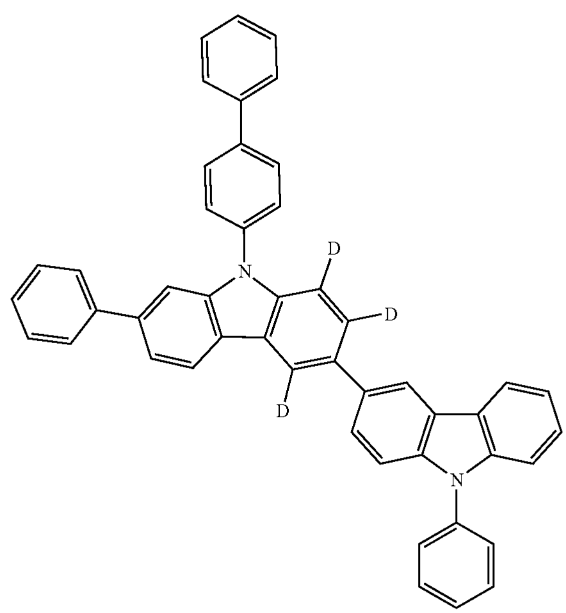

-continued
366
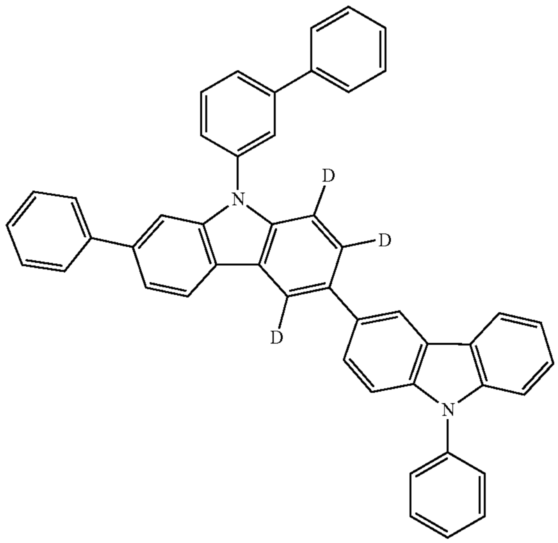
367
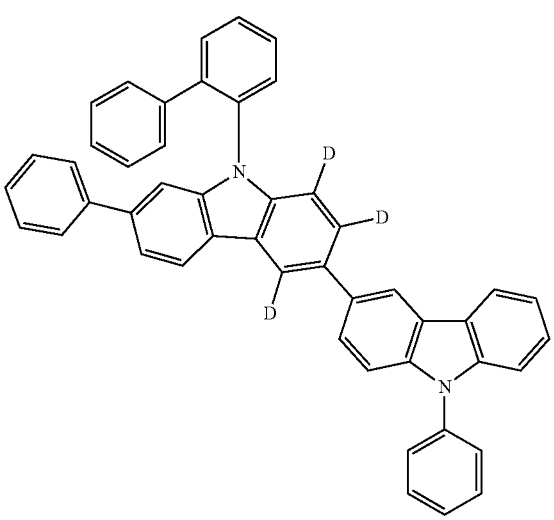
-continued
368
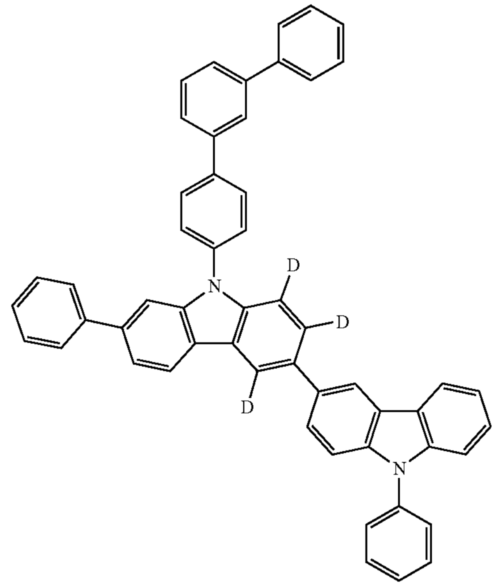
369
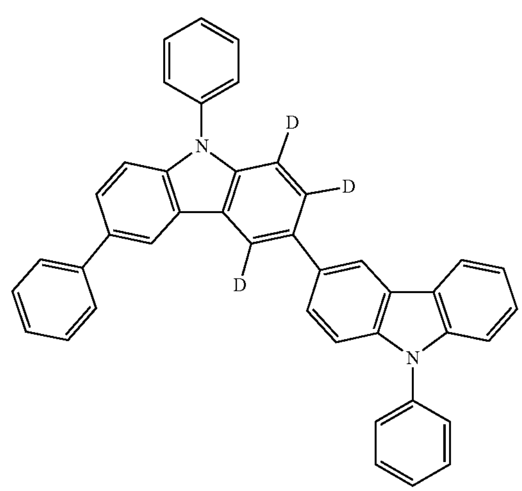

-continued
370
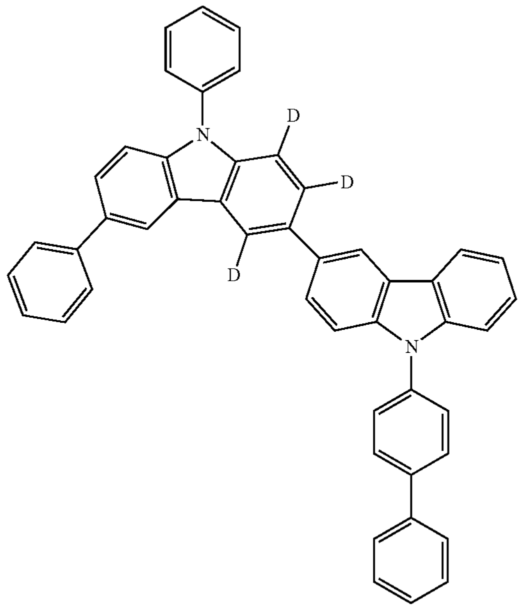
371
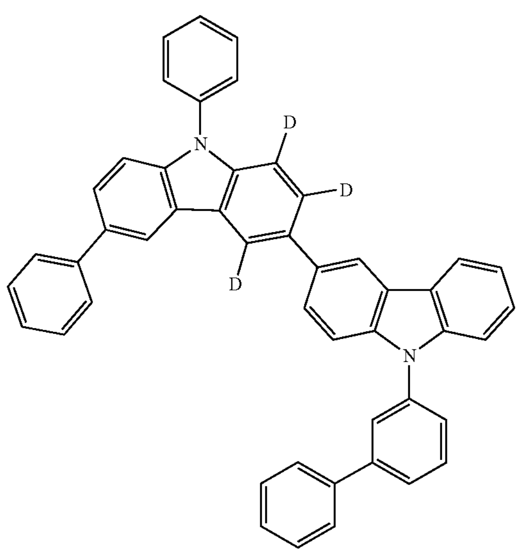
-continued
372
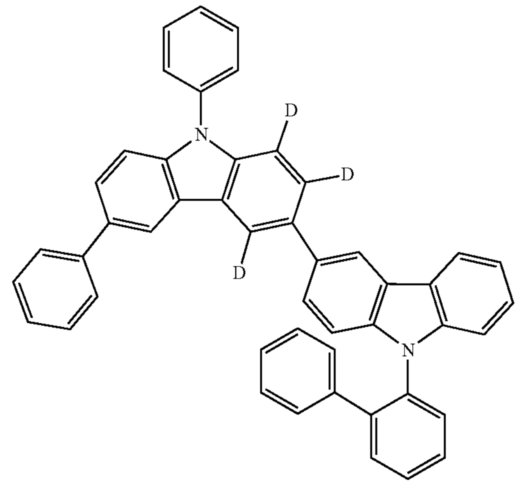
373
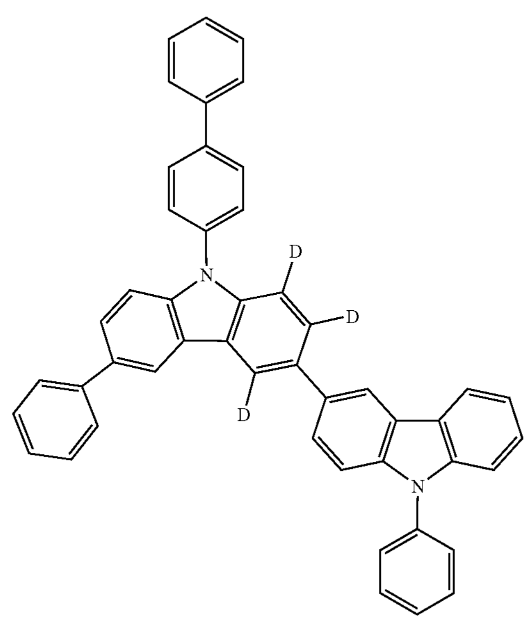

-continued
374
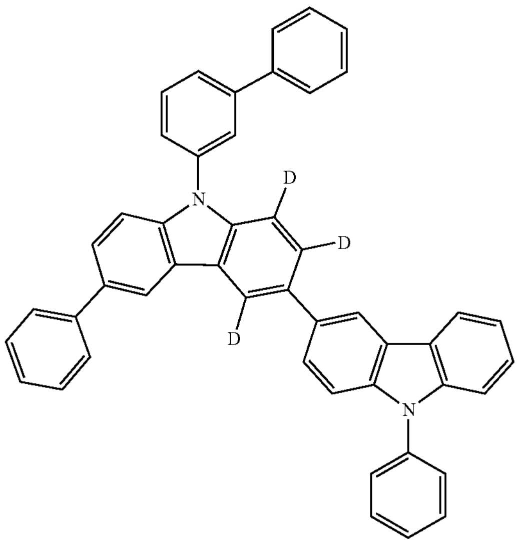
375
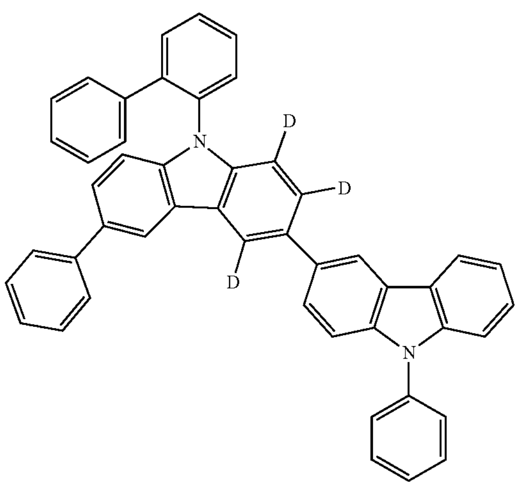
376
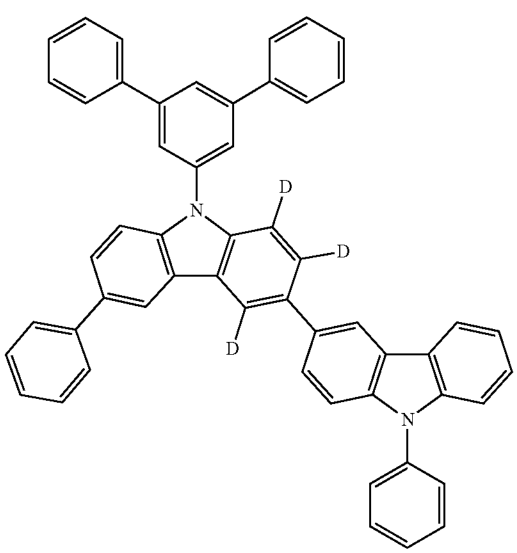
-continued
377
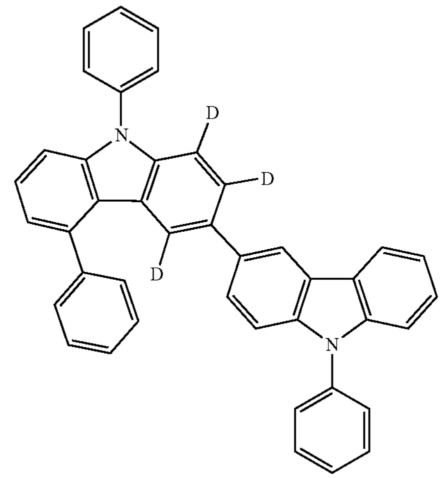
378
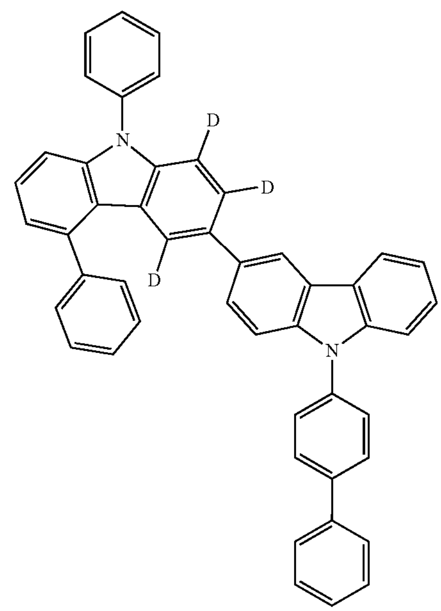
379
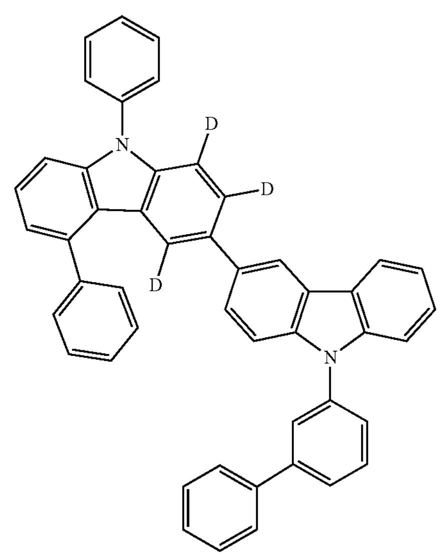

380
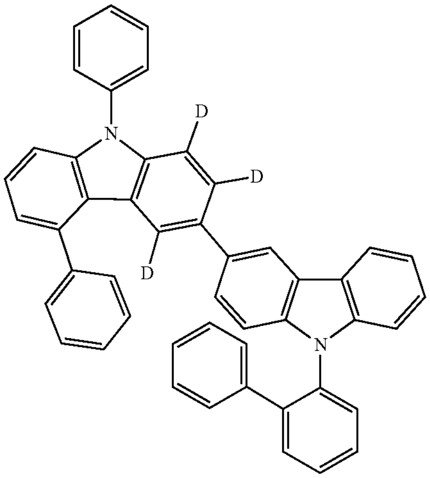
381
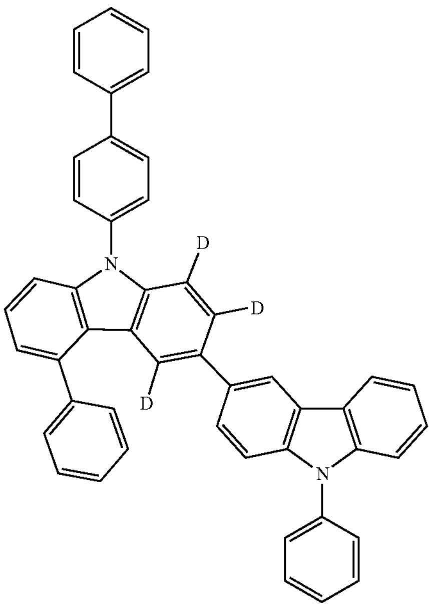
382
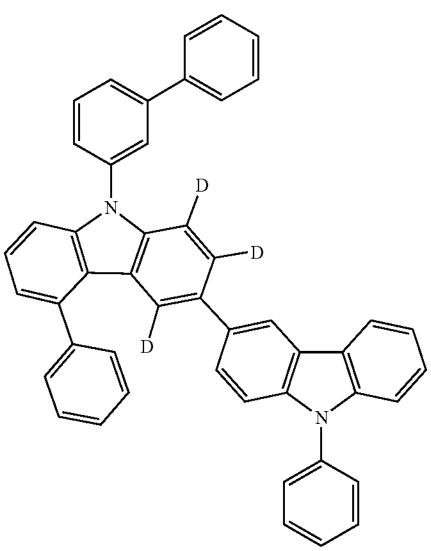
383
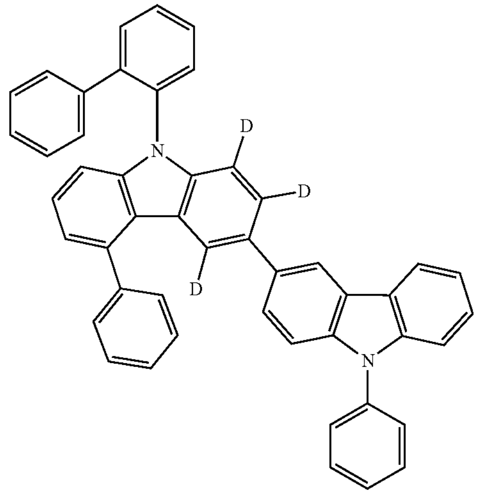
384
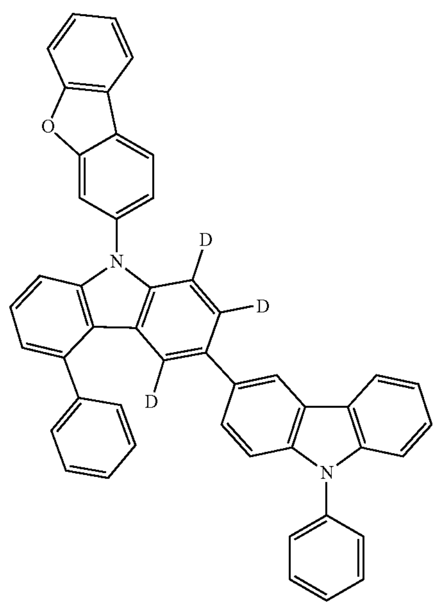

-continued
385
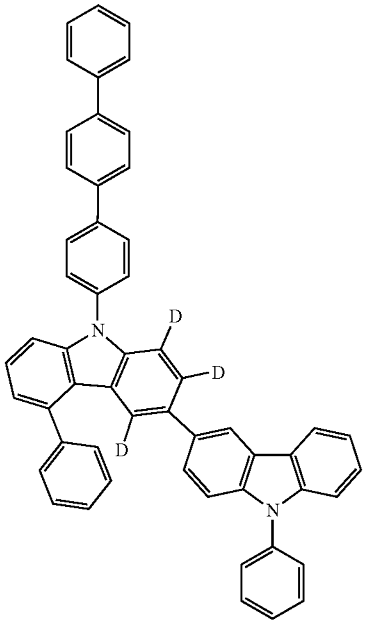
386
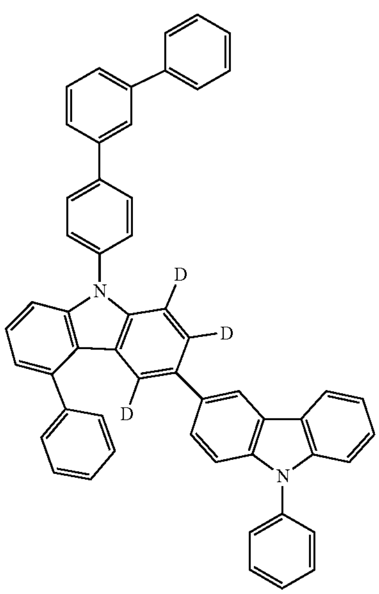
-continued
387
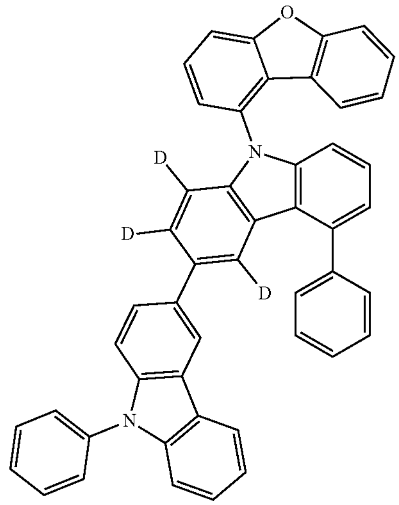
388
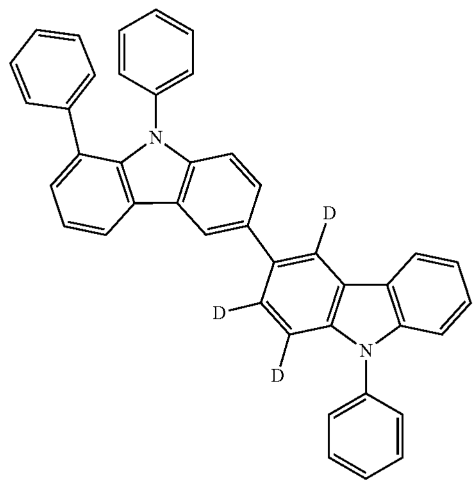
389
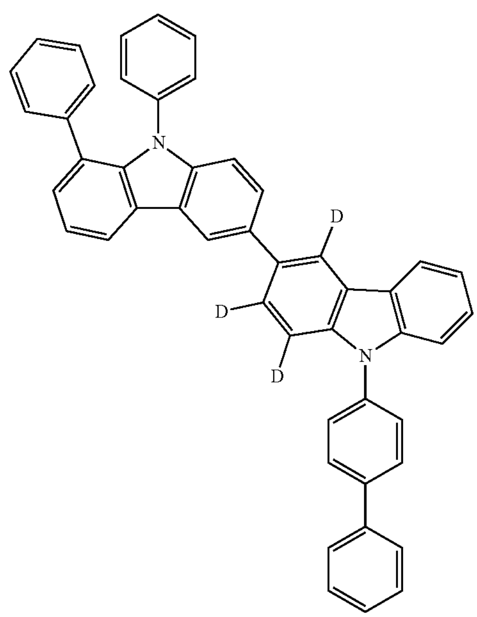

-continued
390
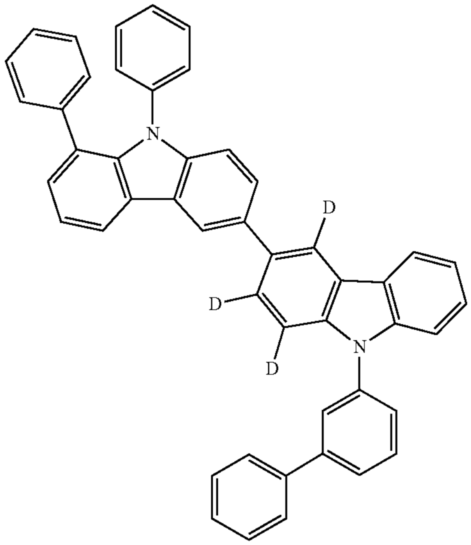
391
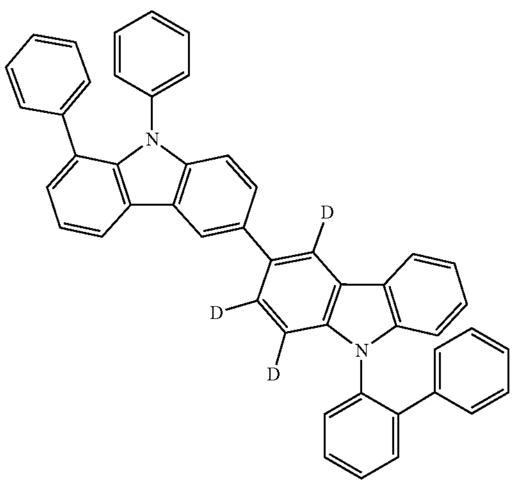
392
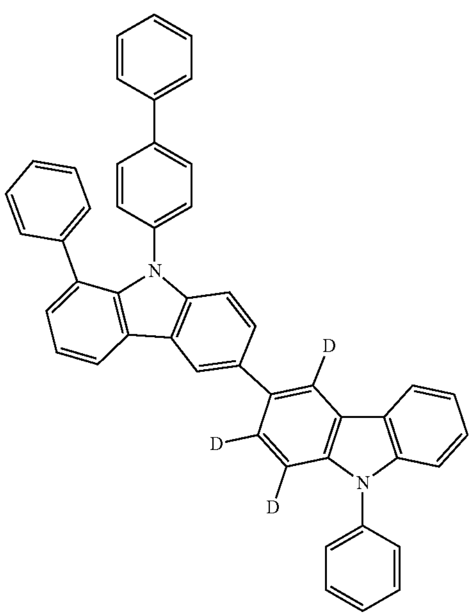
-continued
393
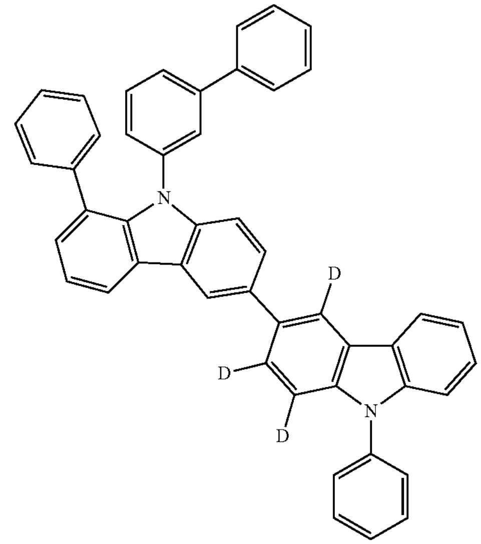
394
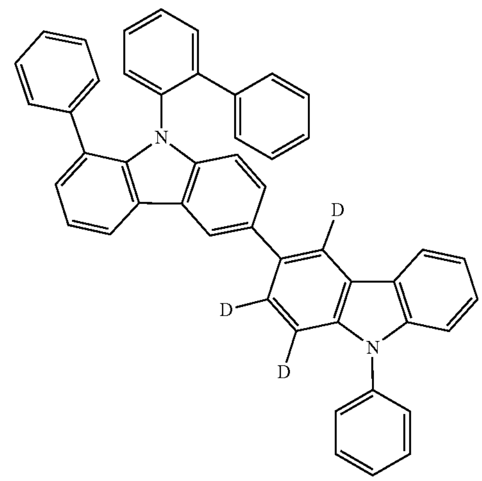
395
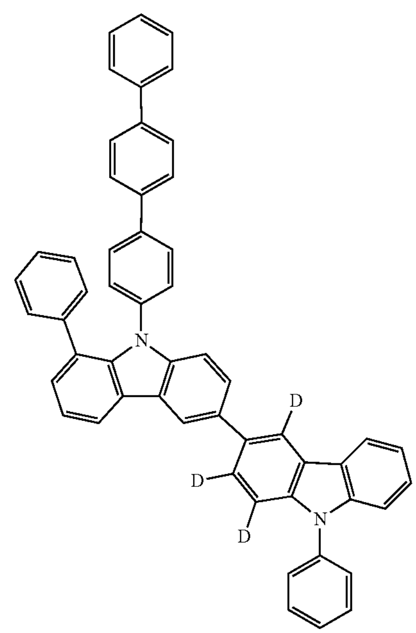

-continued
396
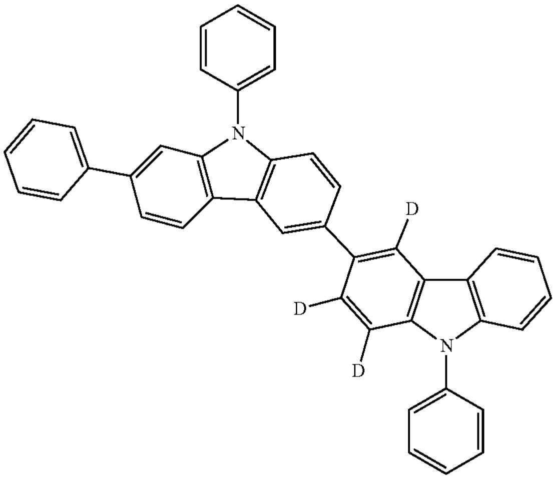
397
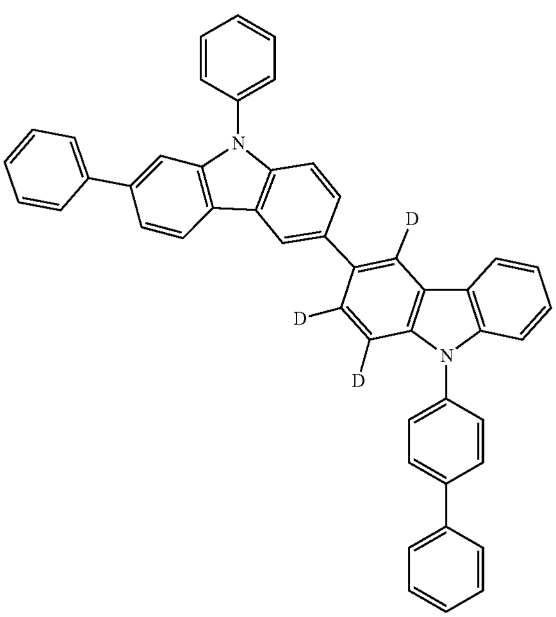
-continued
398
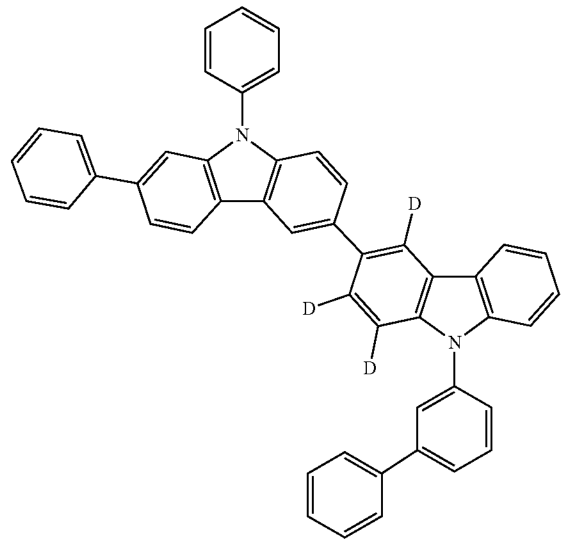
399
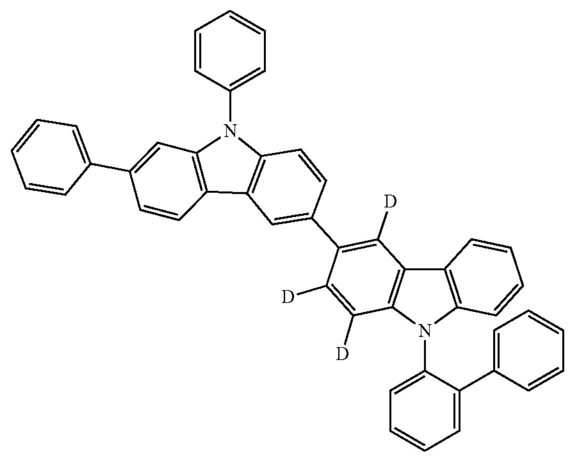
400
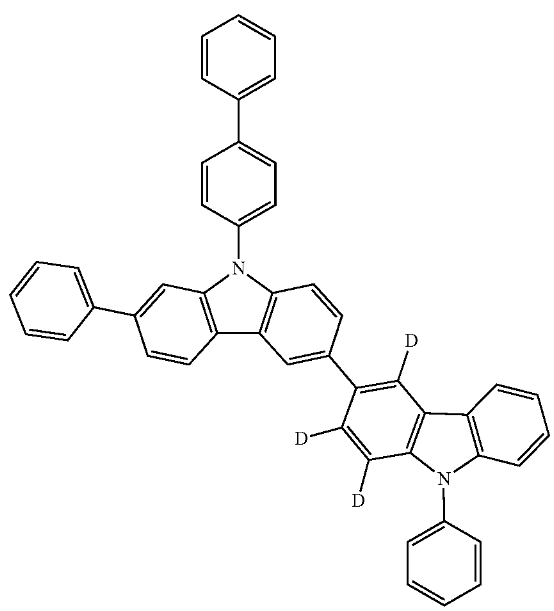

-continued
401
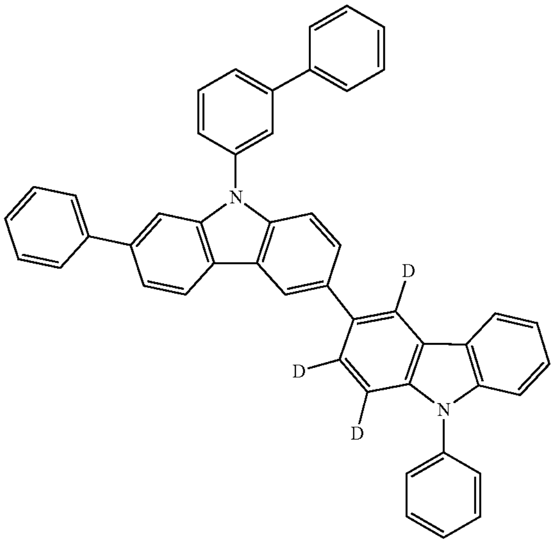
402
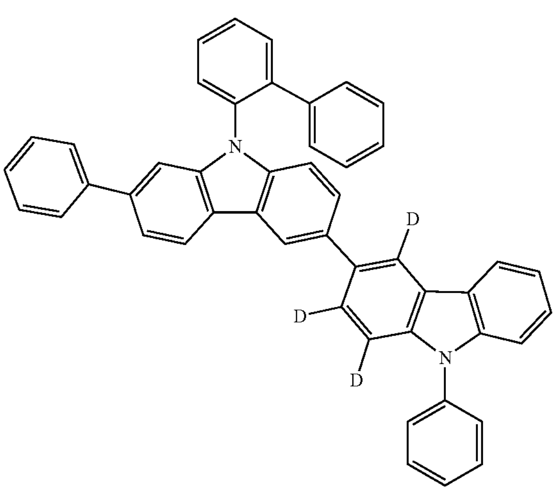
-continued
403
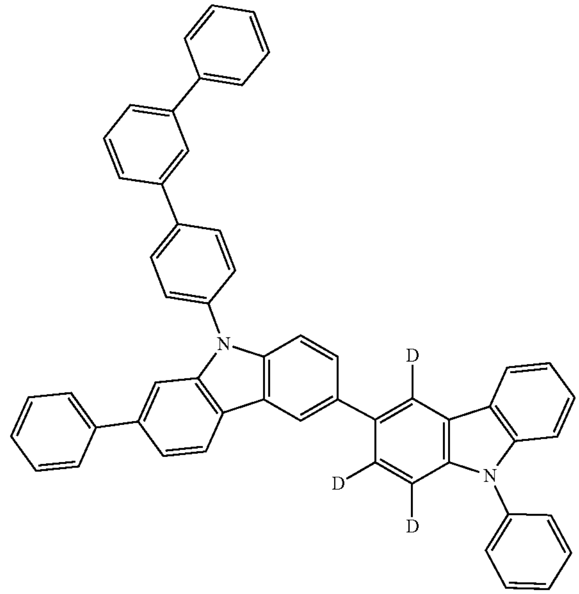
404
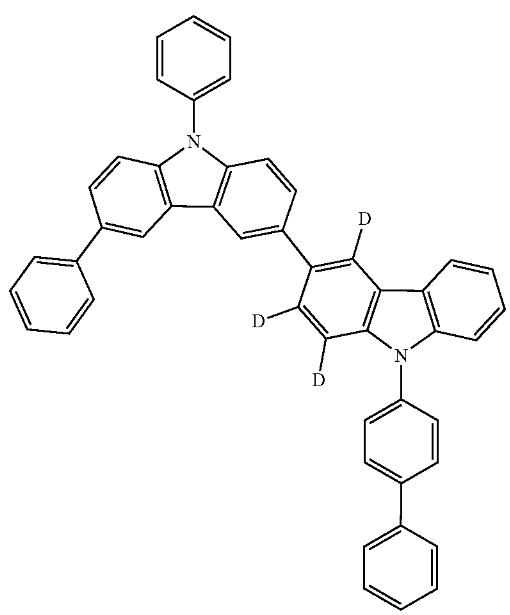

-continued
405
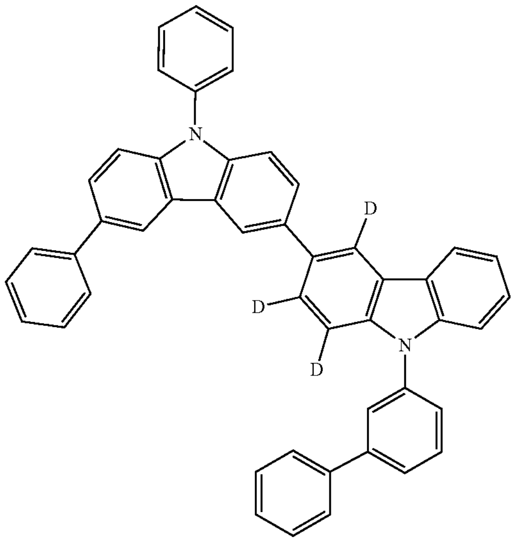
406
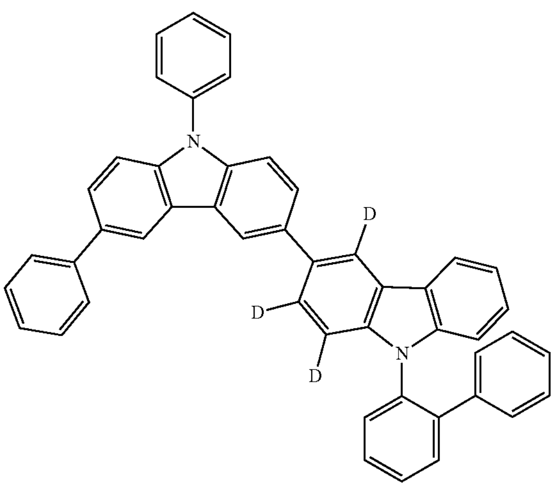
407
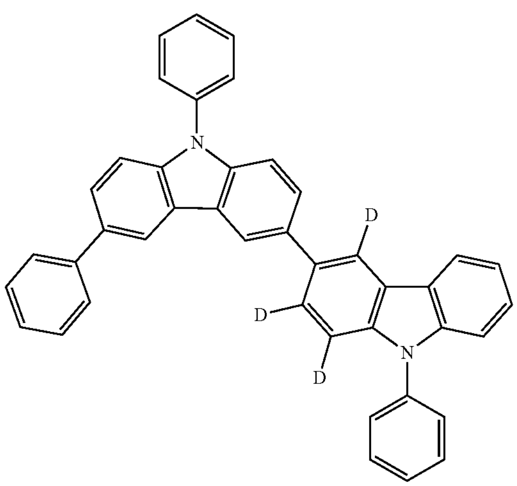
-continued
408
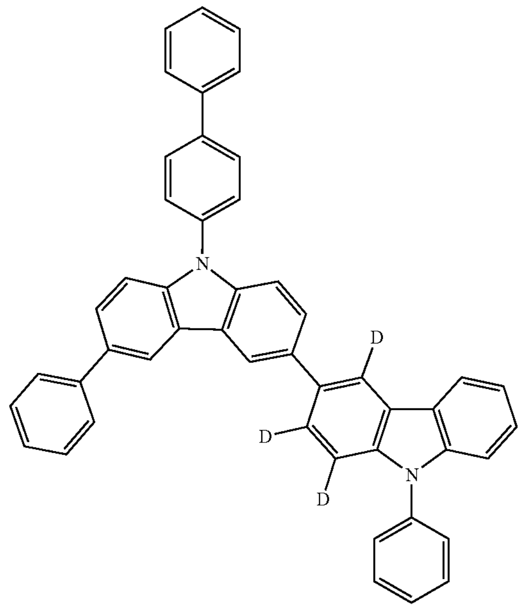
409
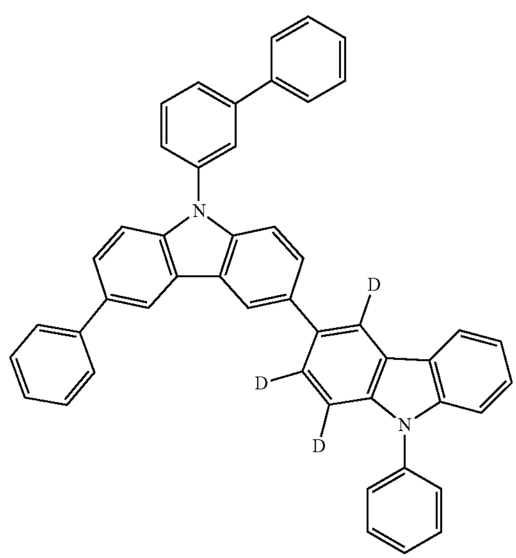

-continued
410
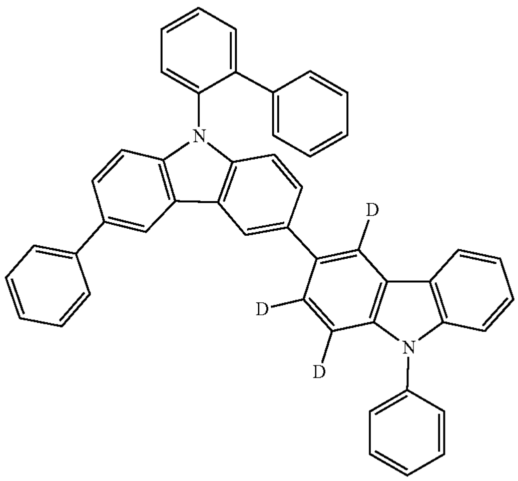
411
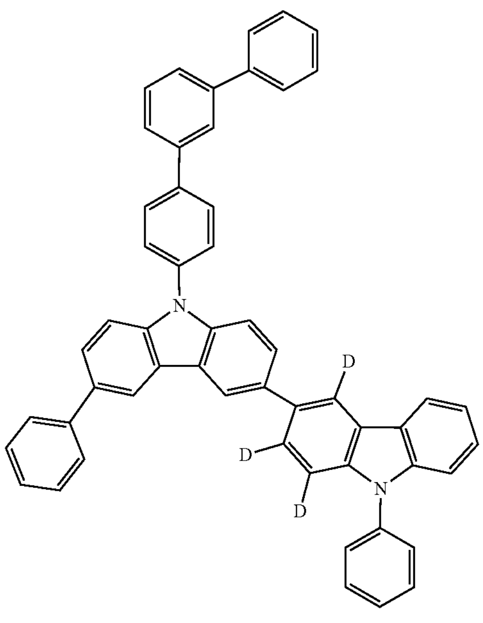
412
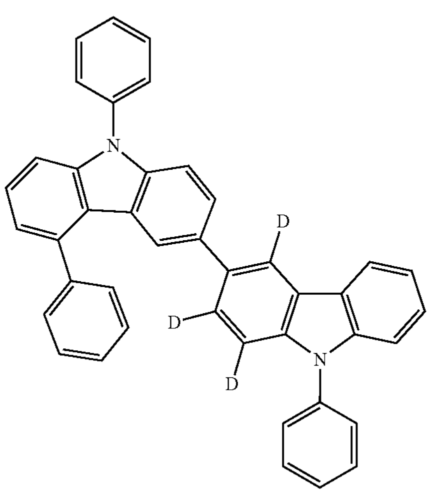
-continued
413
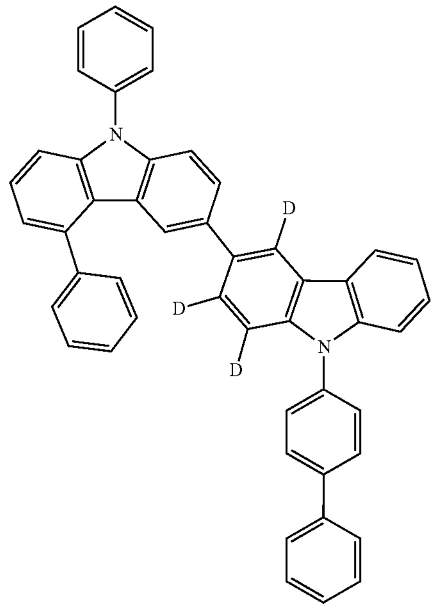
414
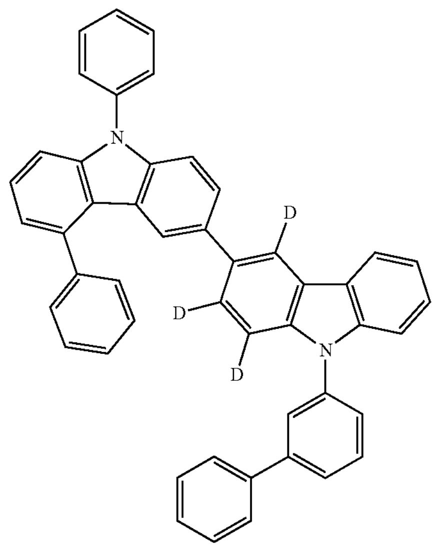
415
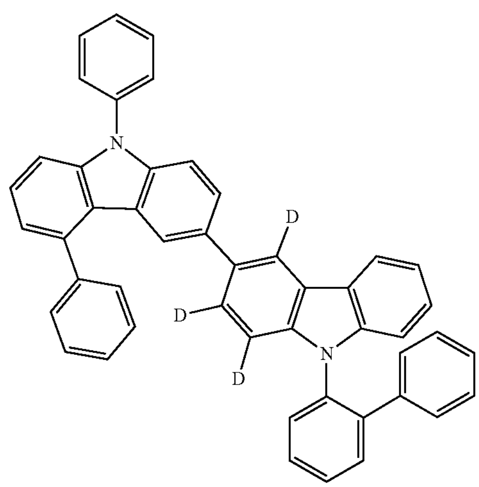

-continued
416
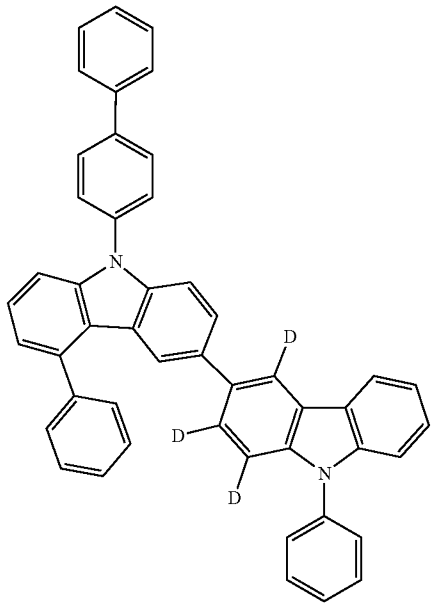
417
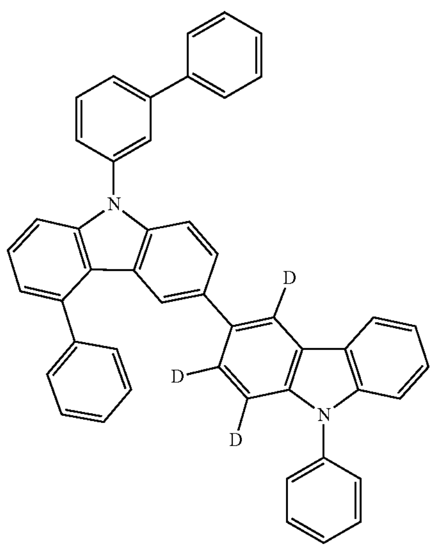
418
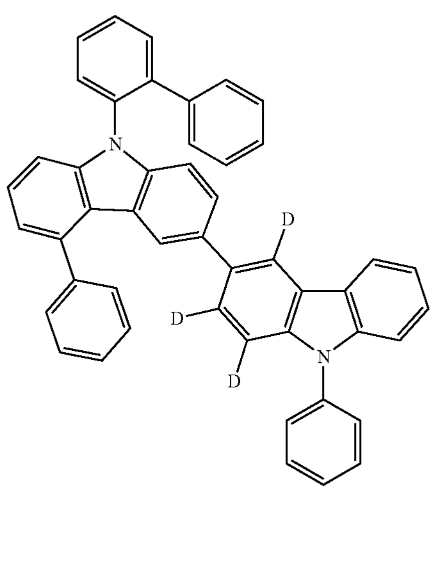
-continued
419
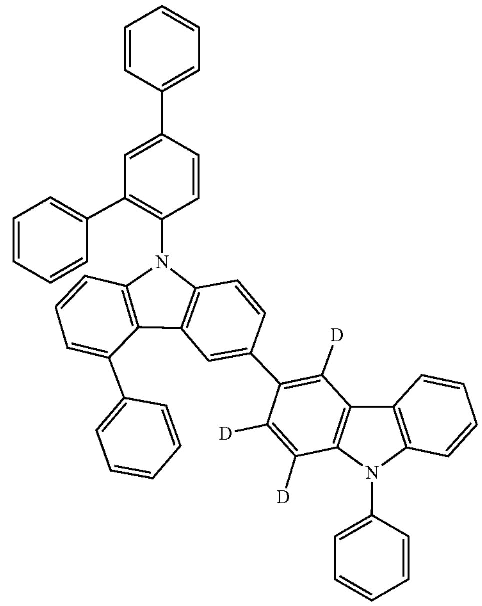
420
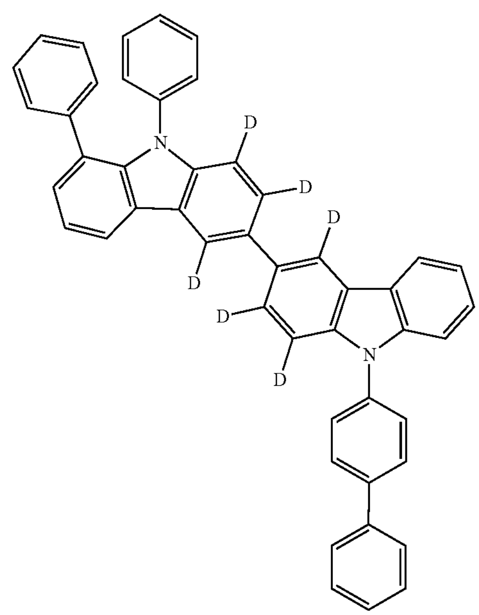

421
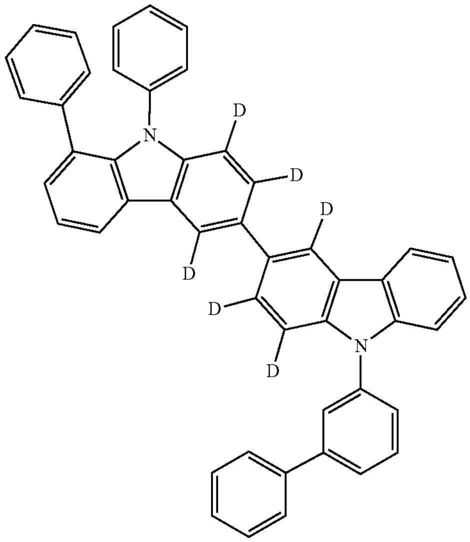
422
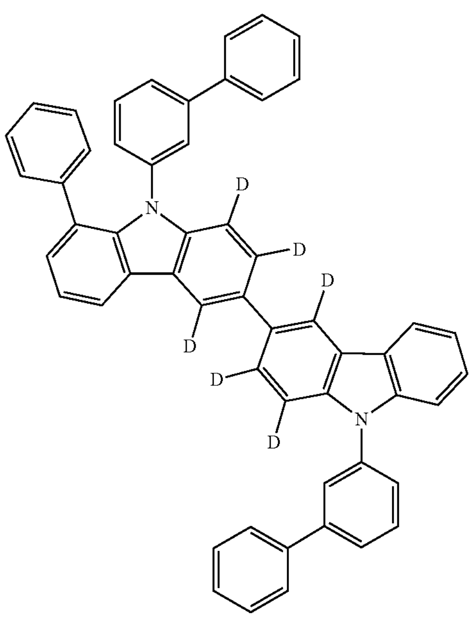
423
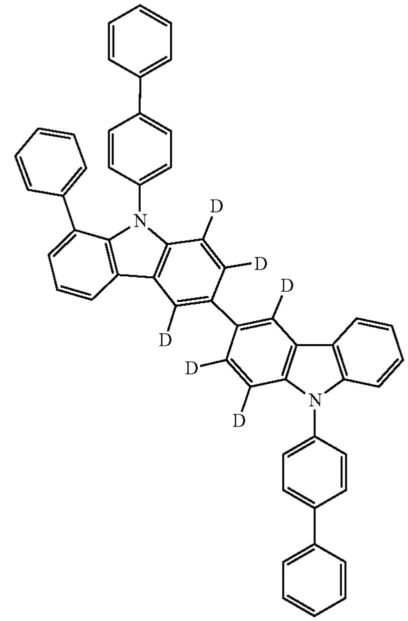
424
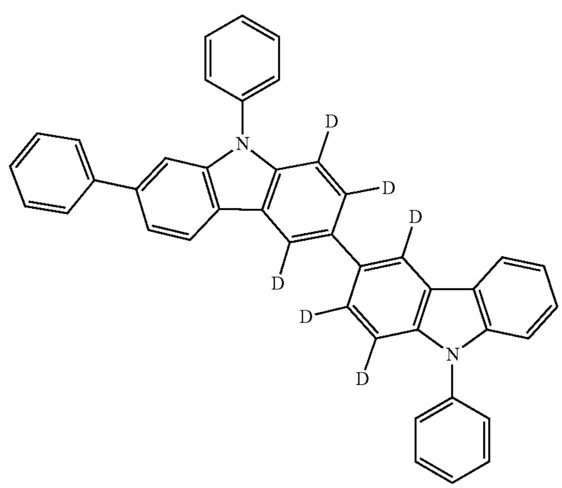

-continued
425
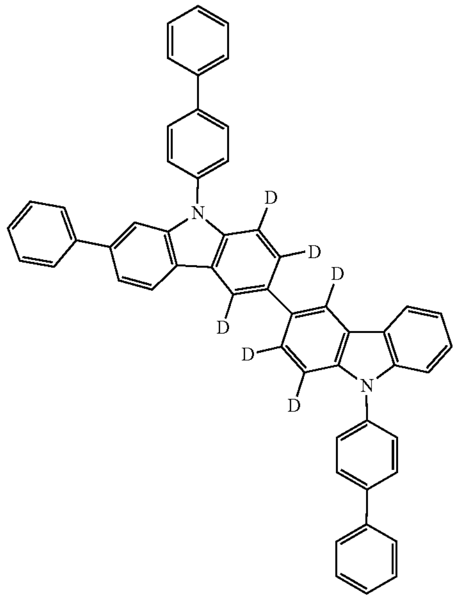
427
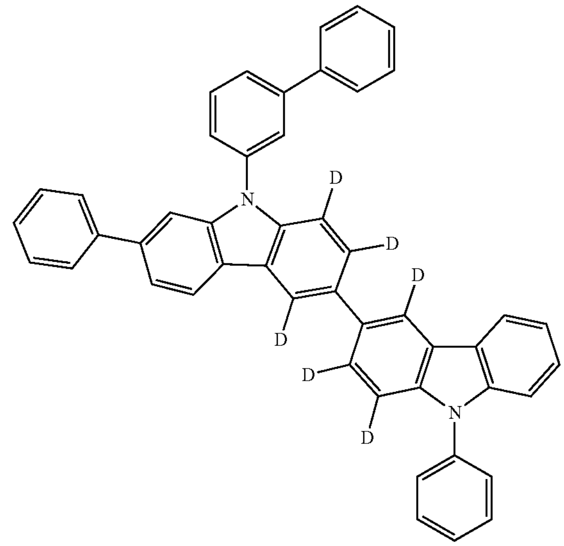
426
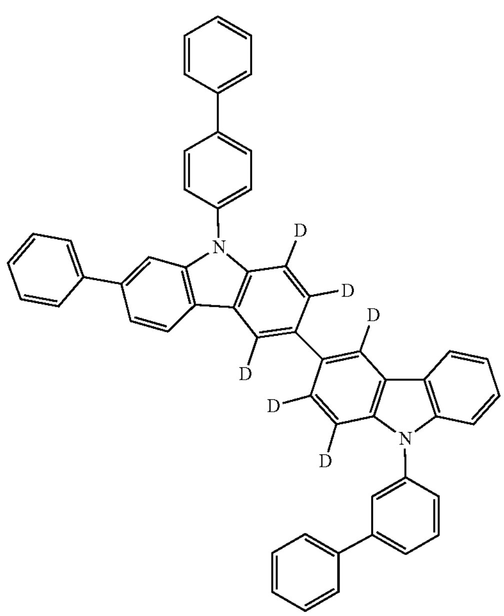
428
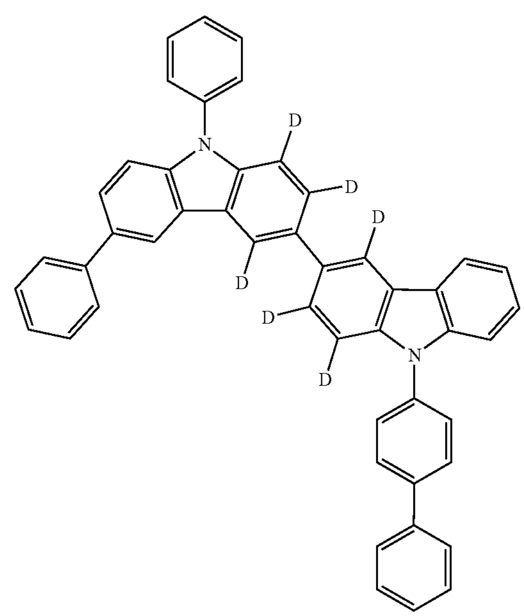

-continued
429
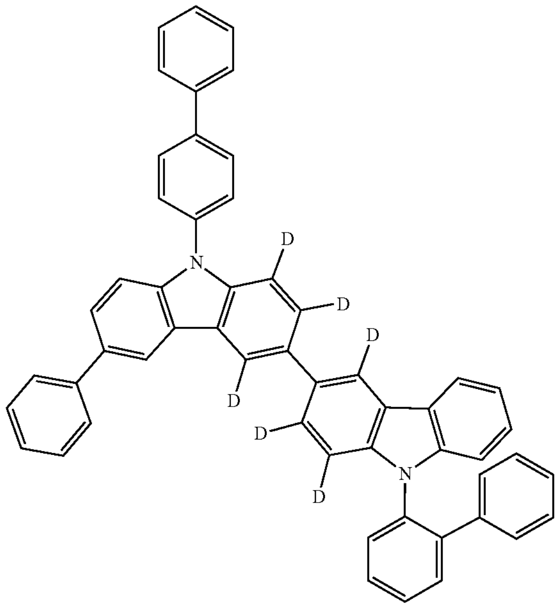
430
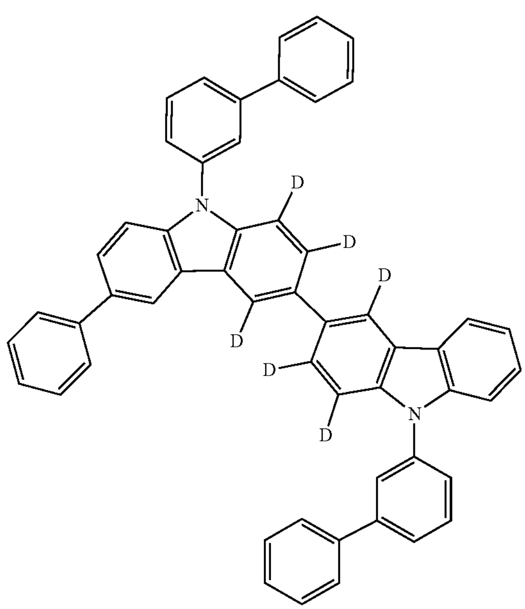
-continued
431
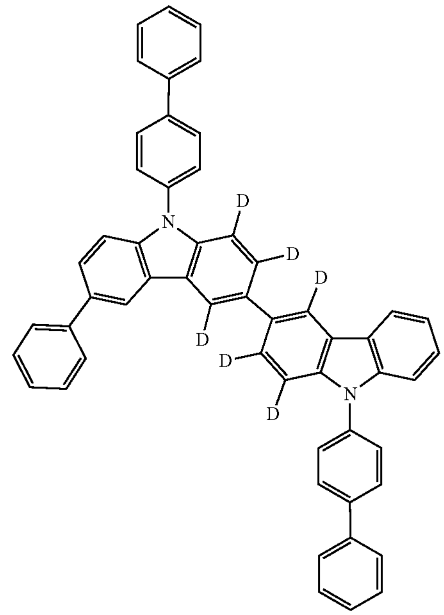
432
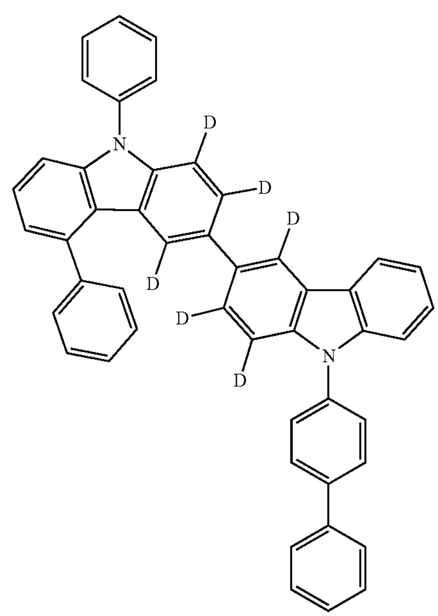

-continued
433
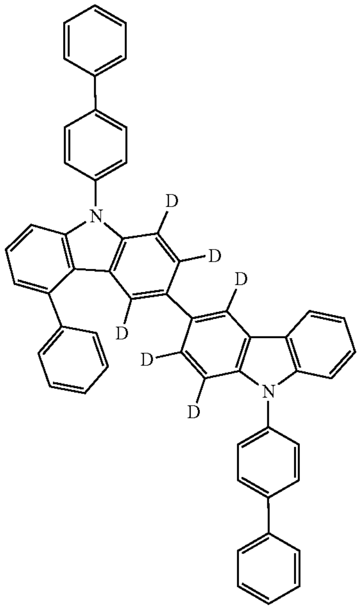
435
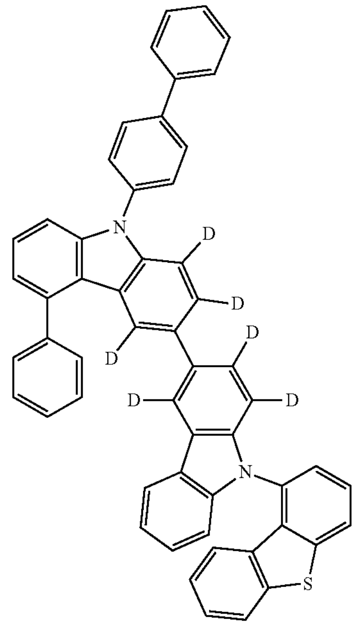
434
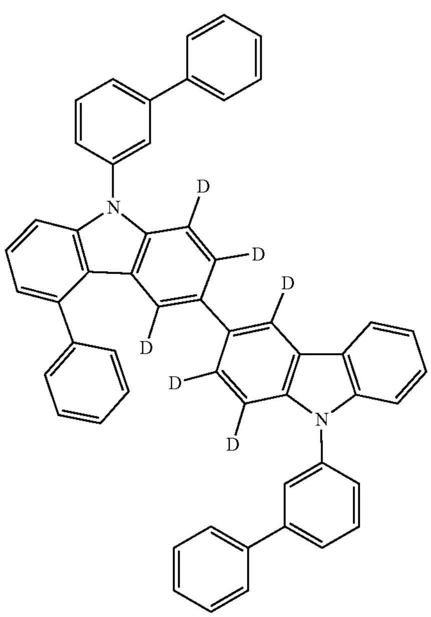
436
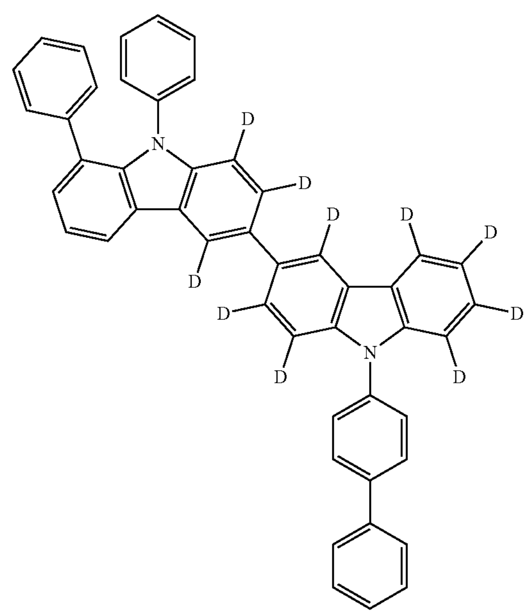

437
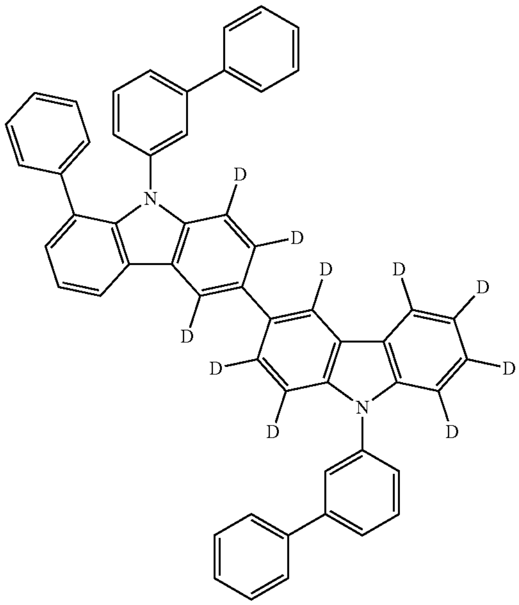
438
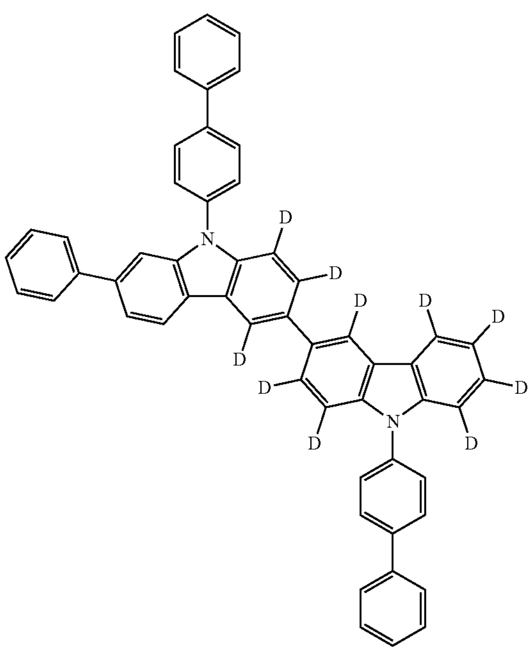
439
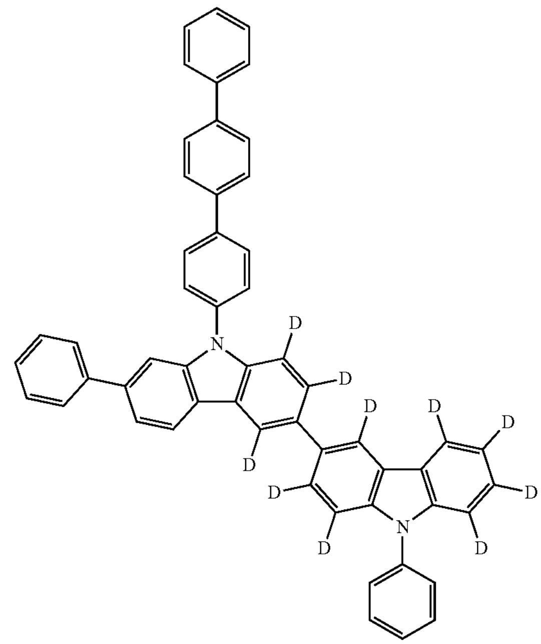
440
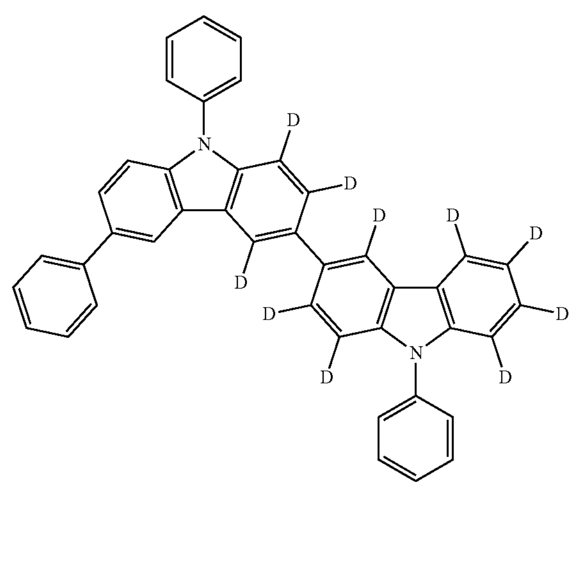

-continued
441
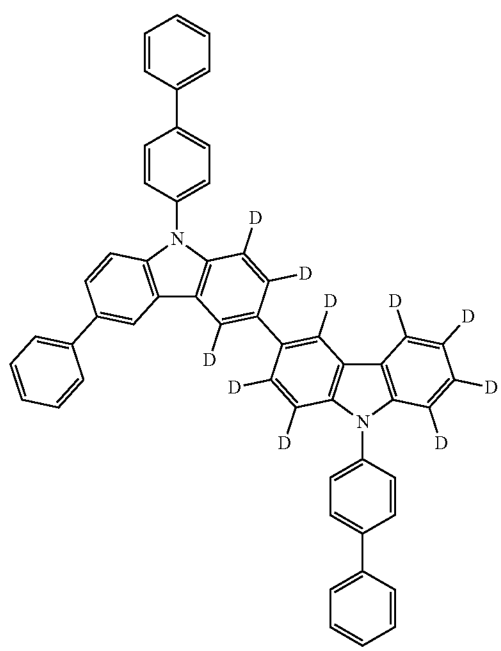
442
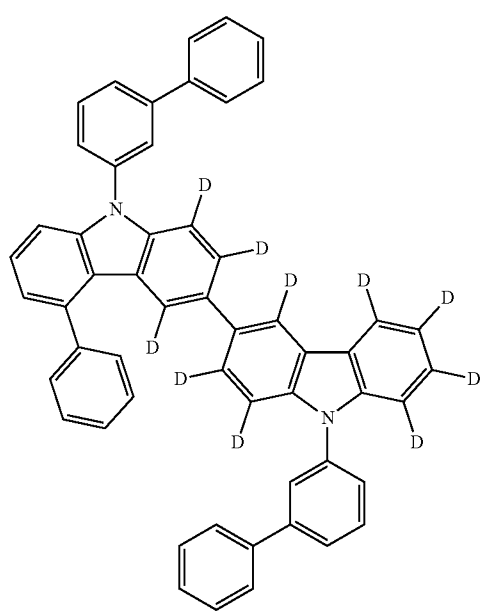
-continued
443
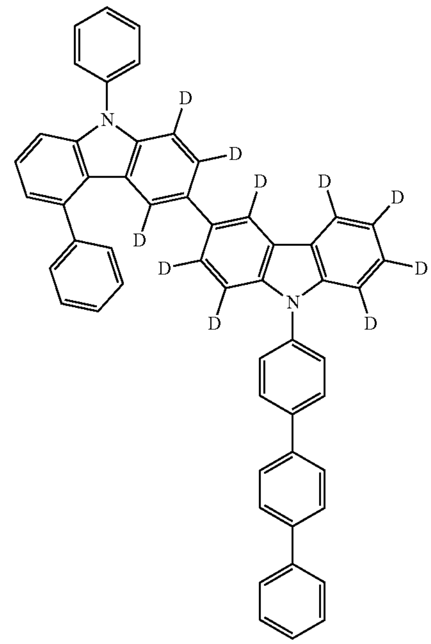
444
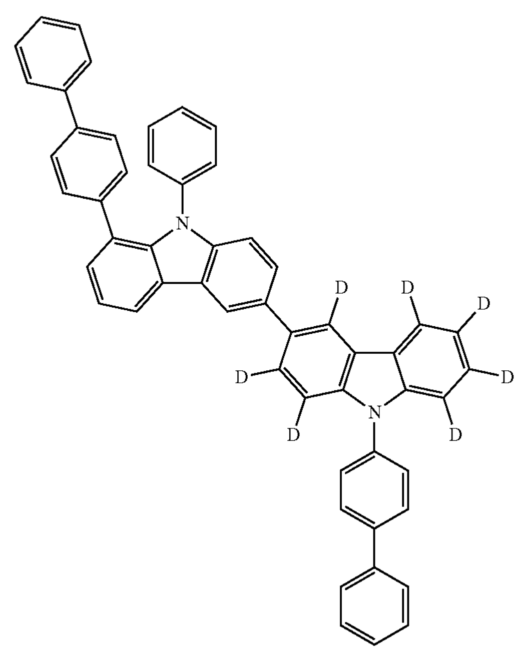

-continued
445
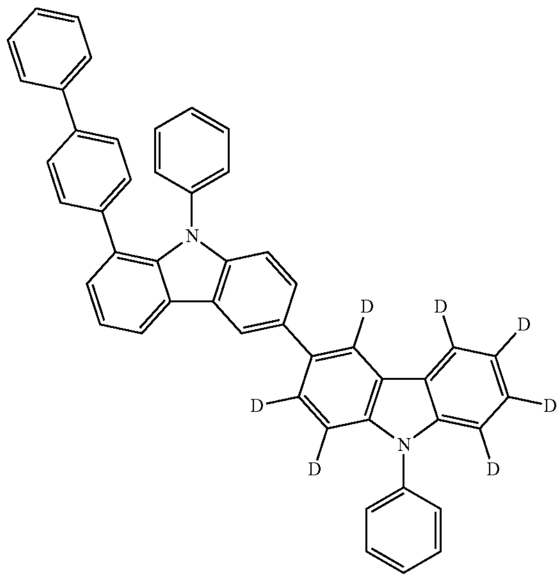
446
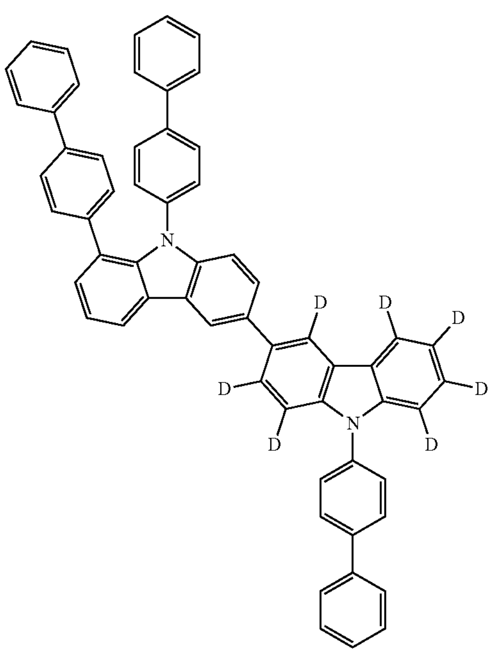
-continued
447
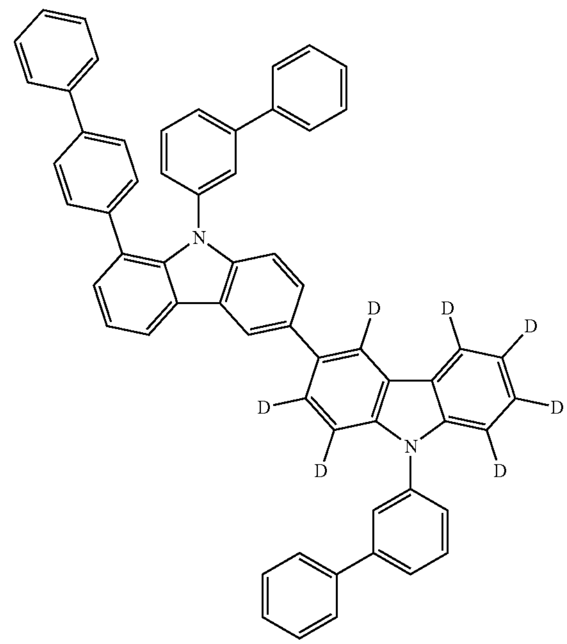
448
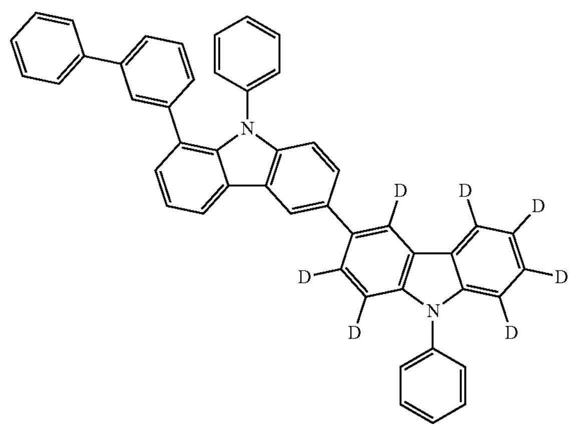
449
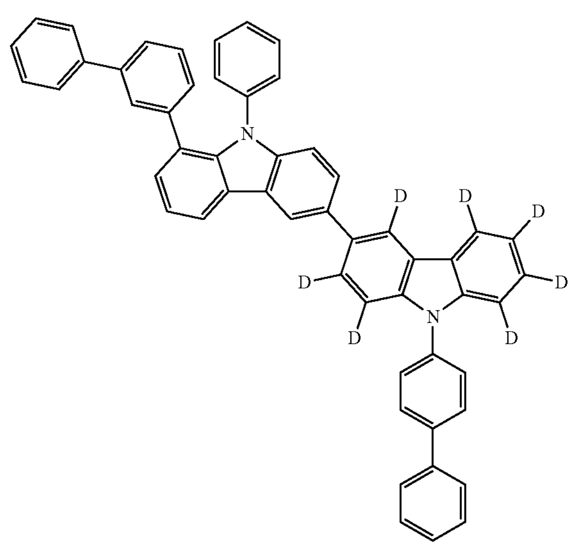

-continued
450
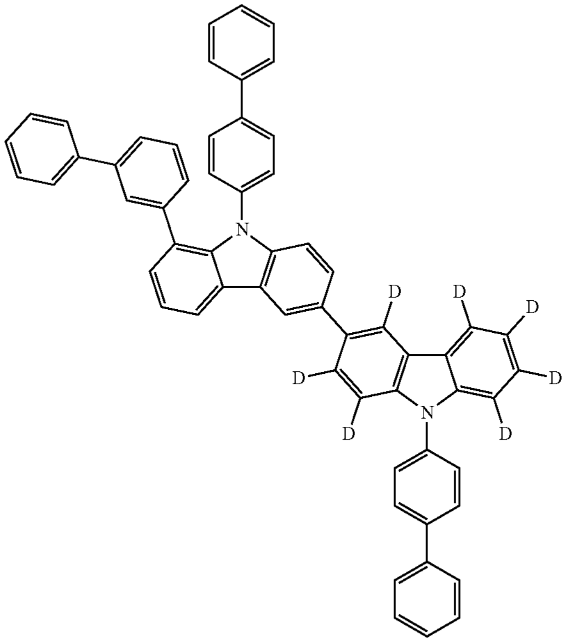
451
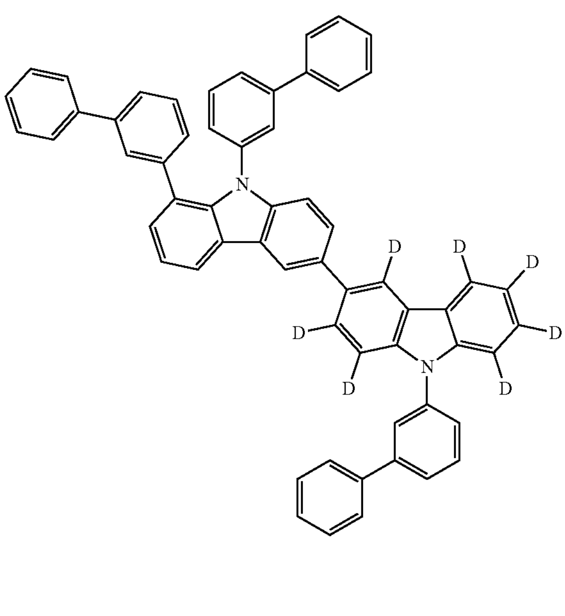
-continued
452
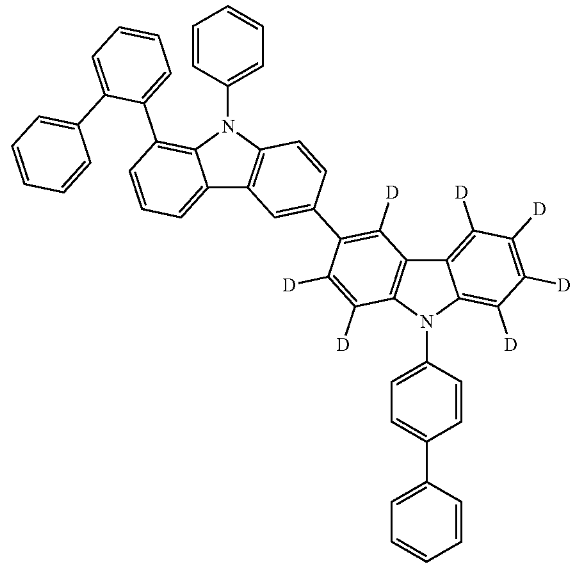
453
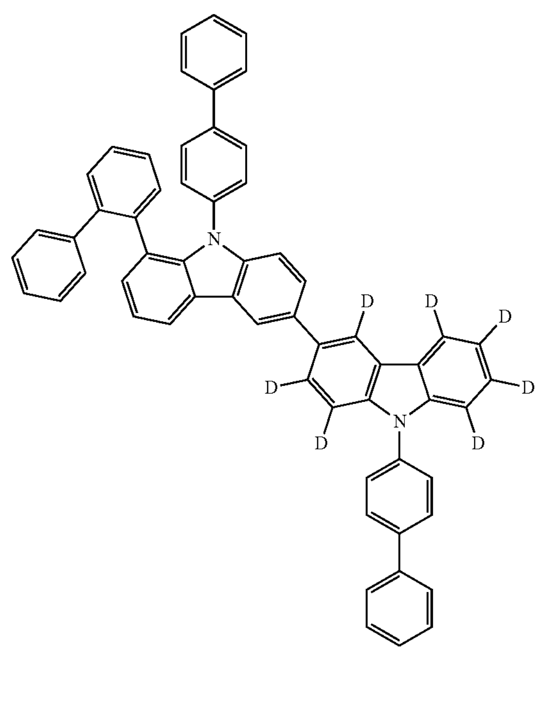

-continued
454
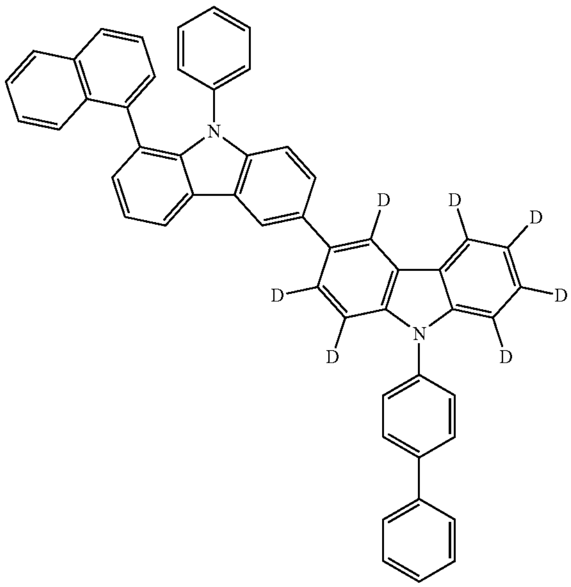
455
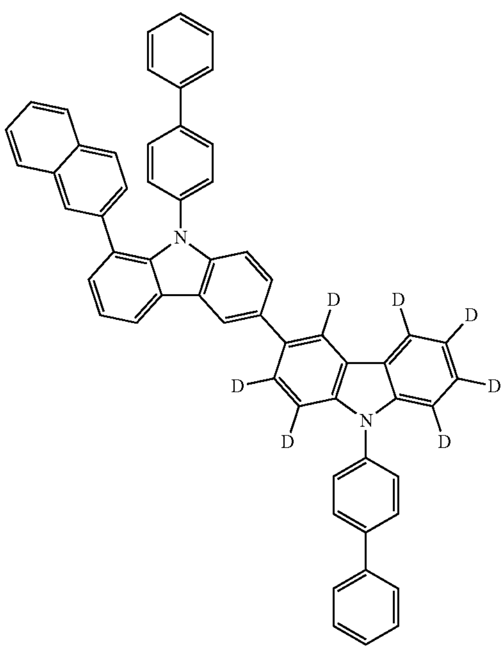
456
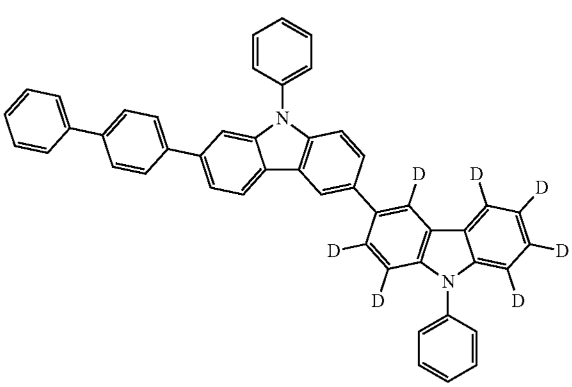
-continued
457
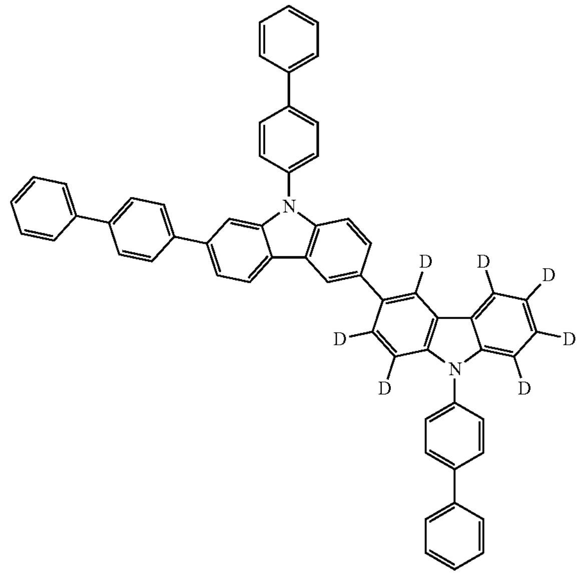
458
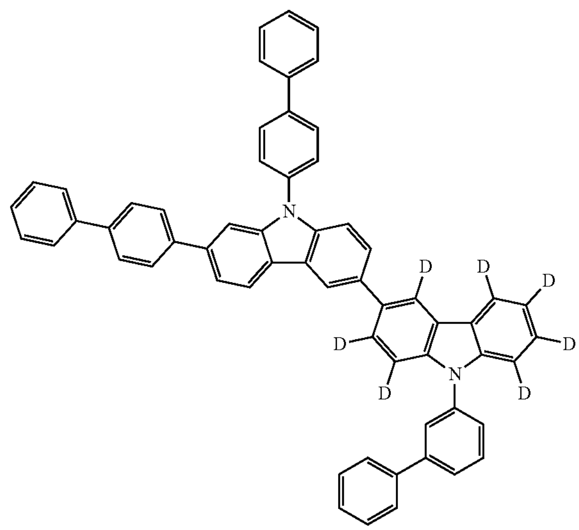
459
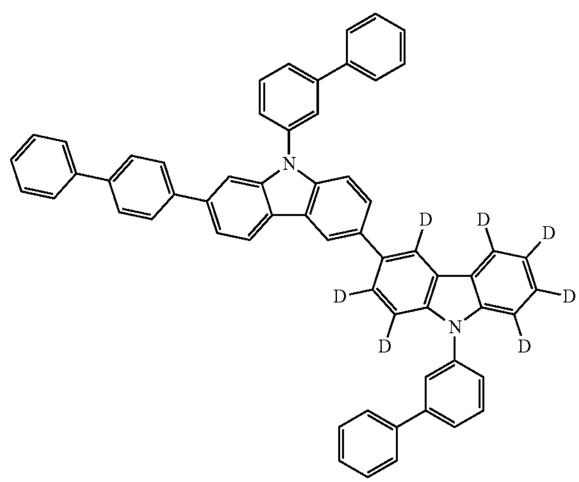

-continued
460
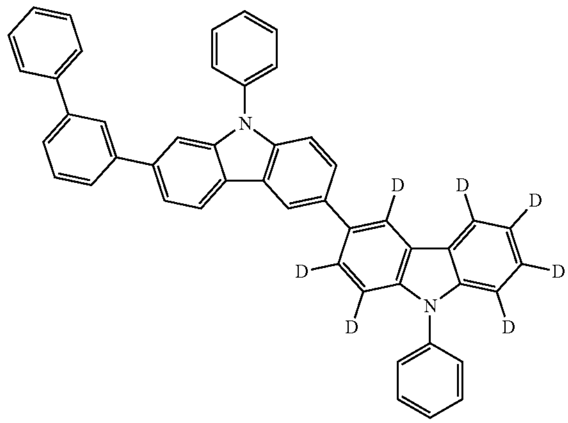
461
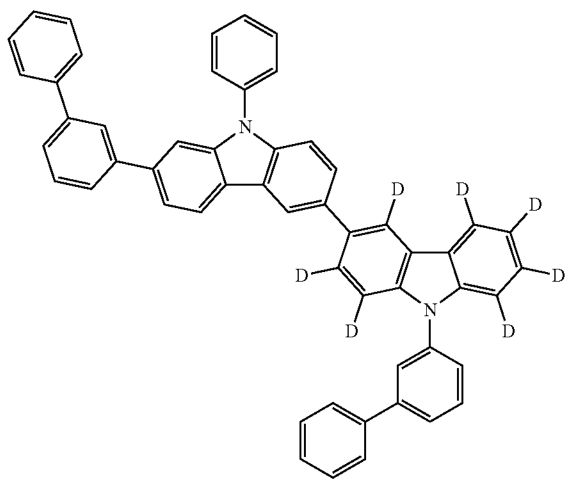
462
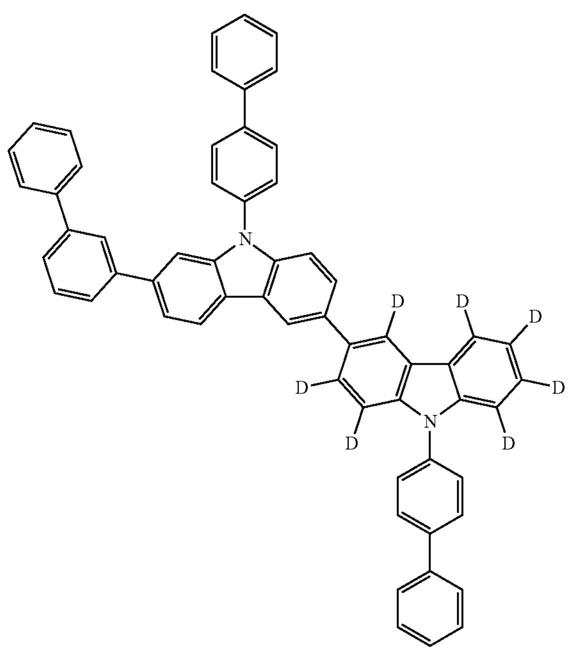
-continued
463
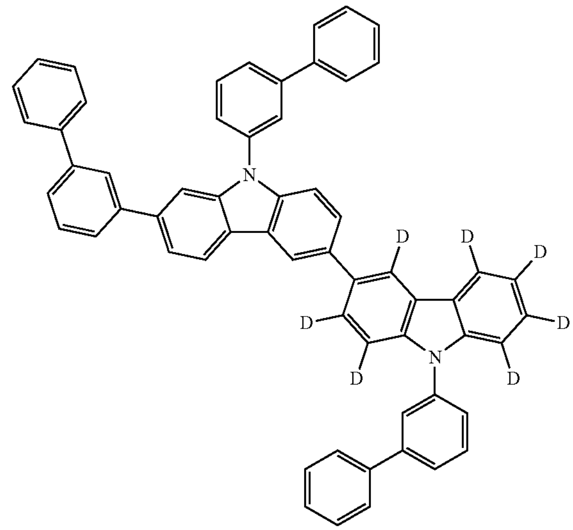
464
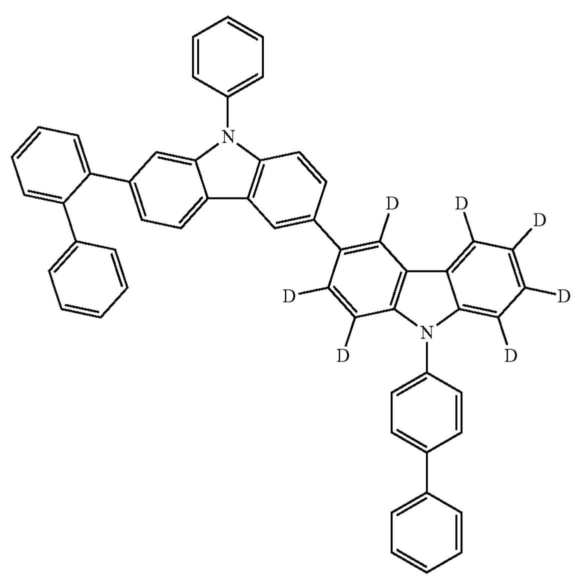

465
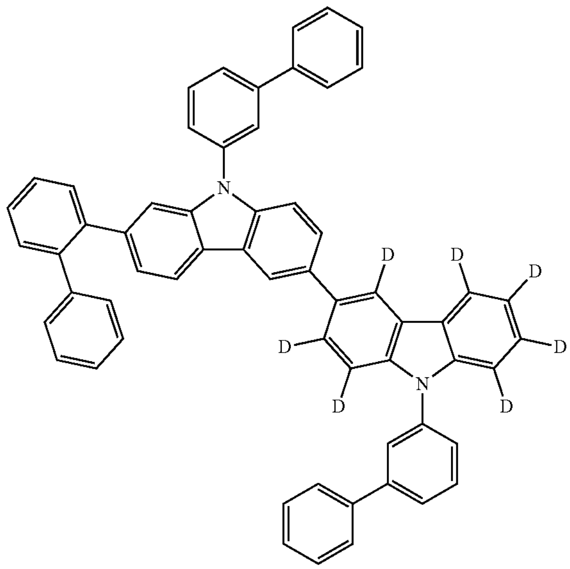
466
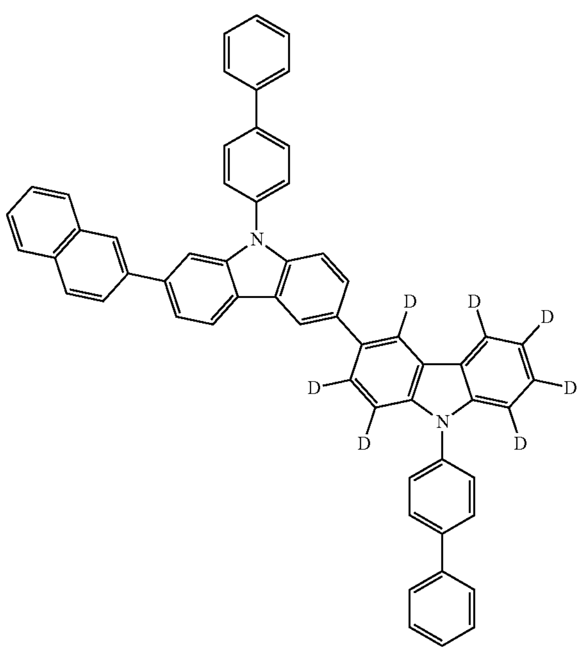
467
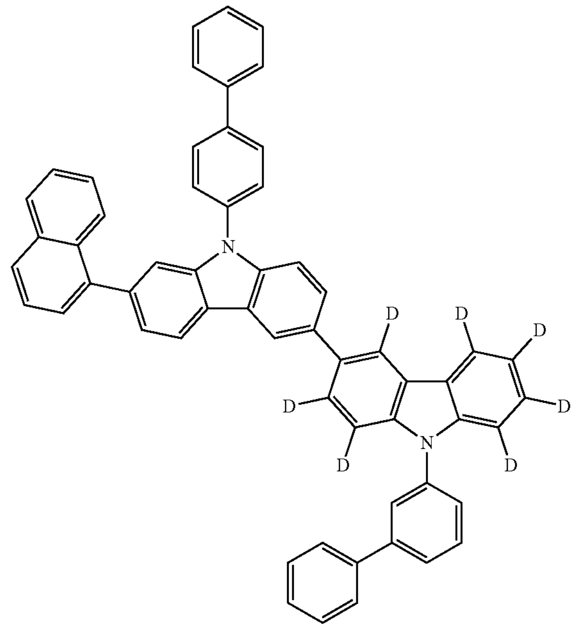
468
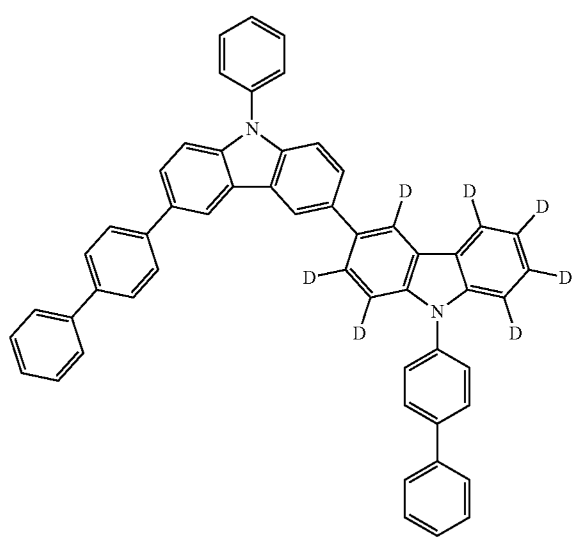

-continued
469
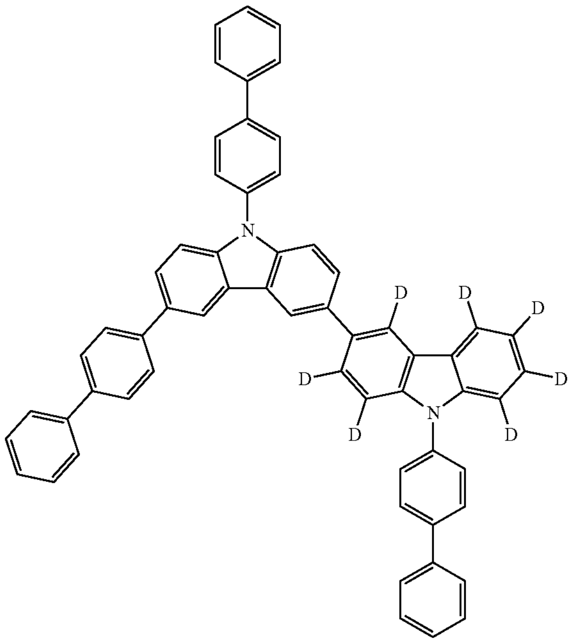
470
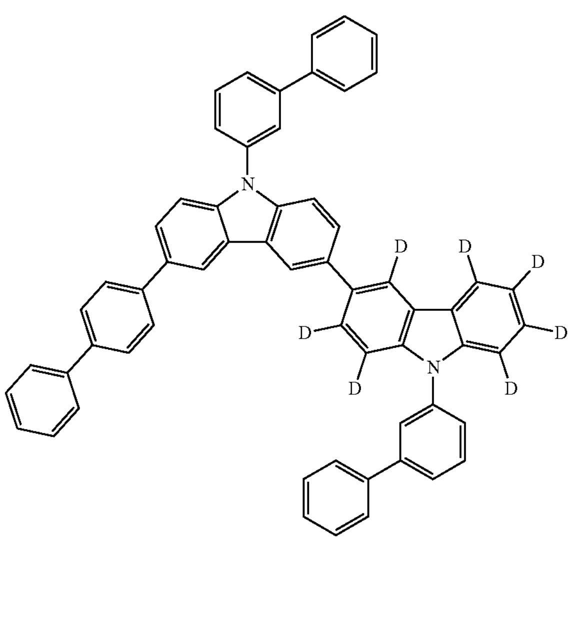
-continued
471
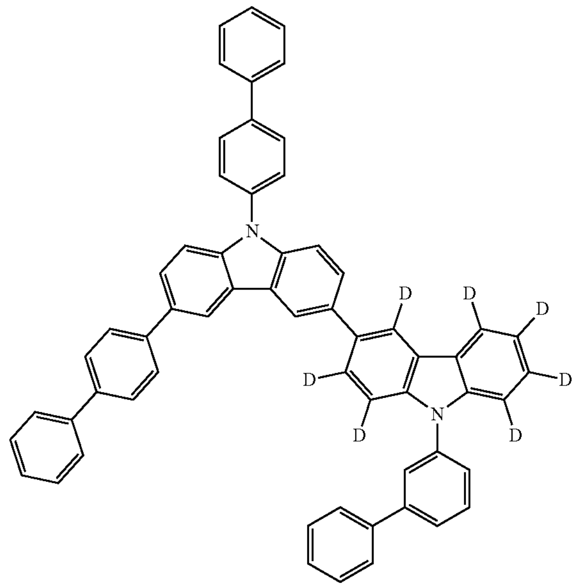
472
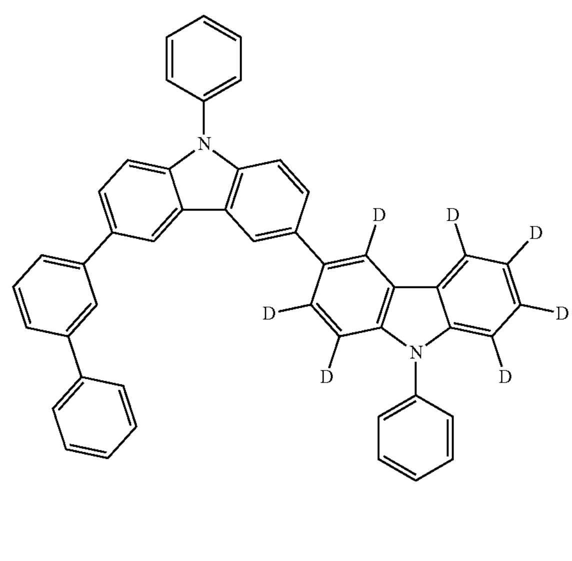

-continued
473
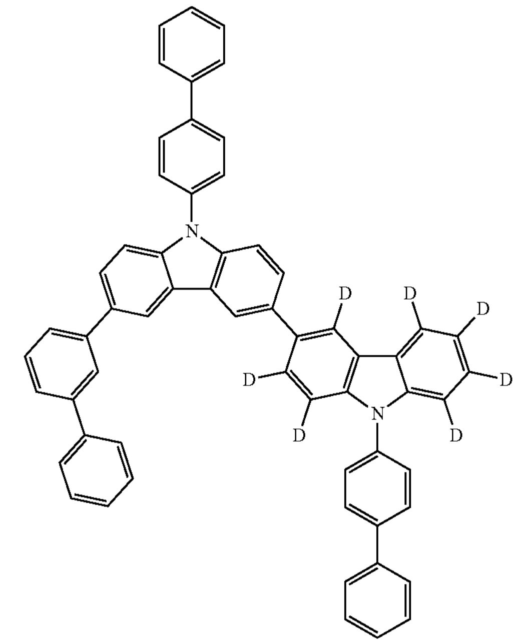
474
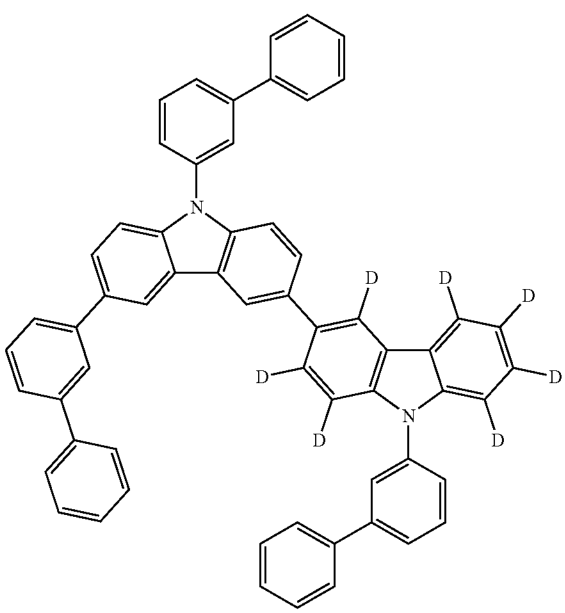
-continued
475
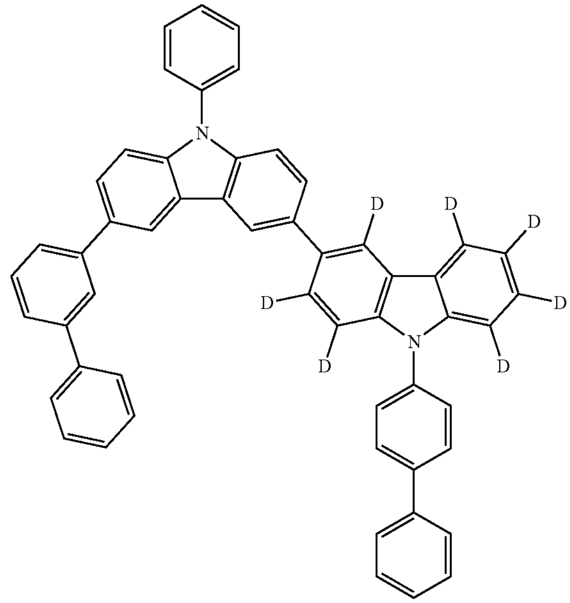
476
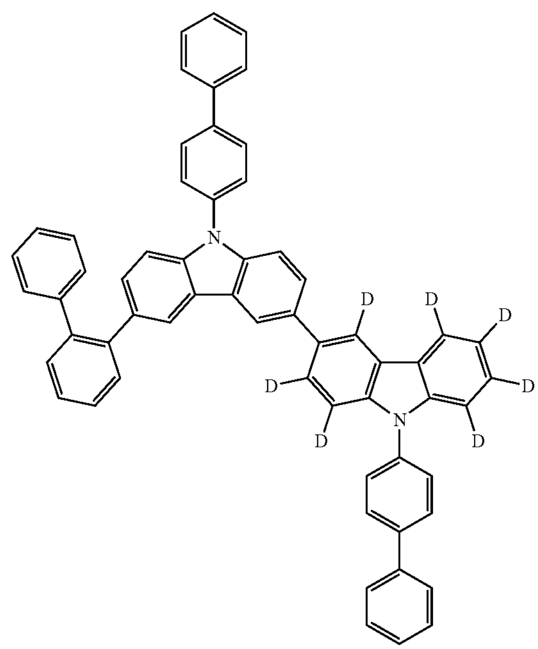

-continued
477
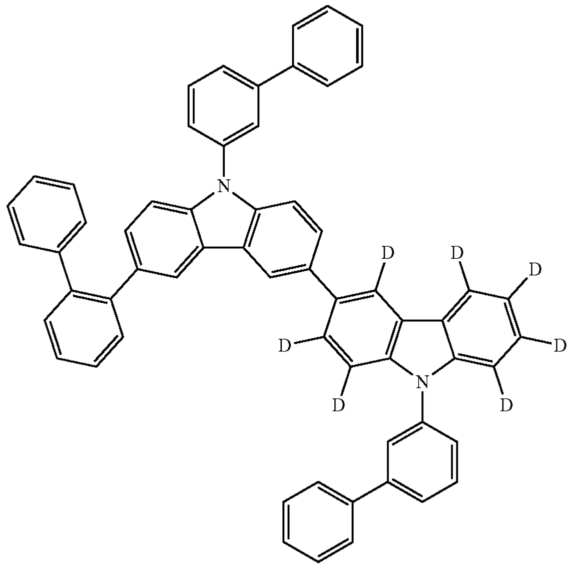
478
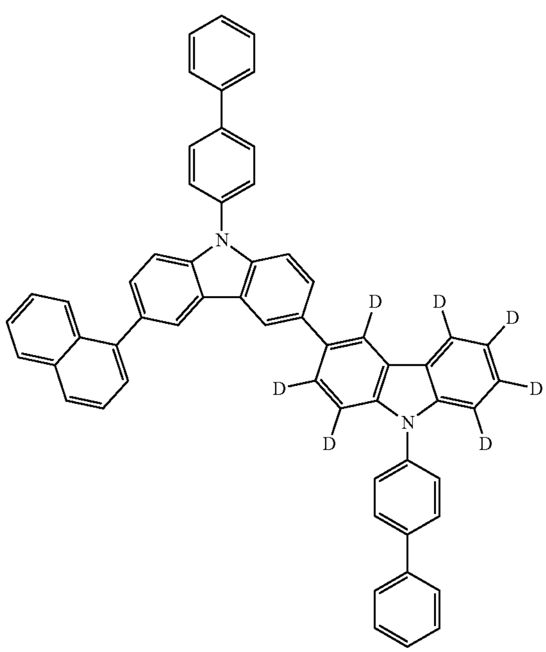
-continued
479
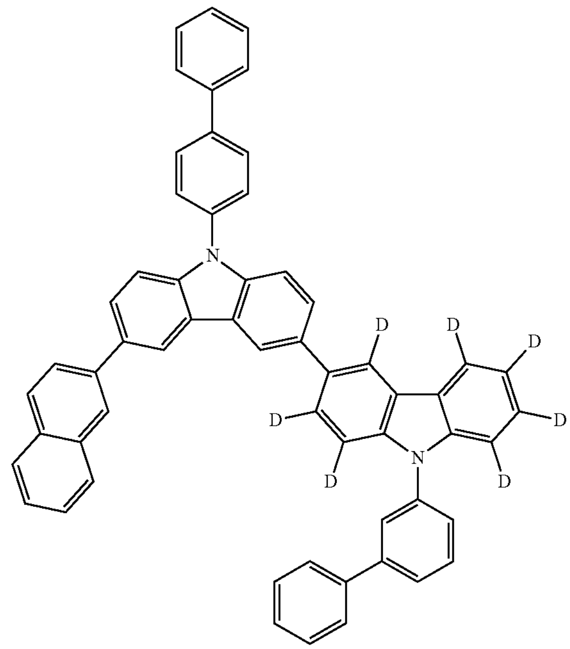
480
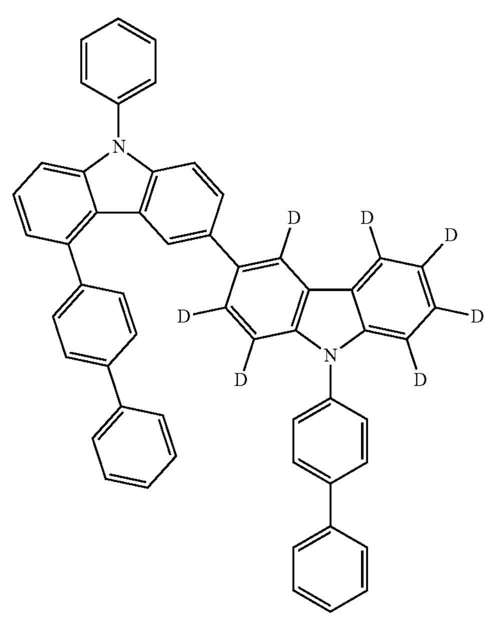

-continued
481
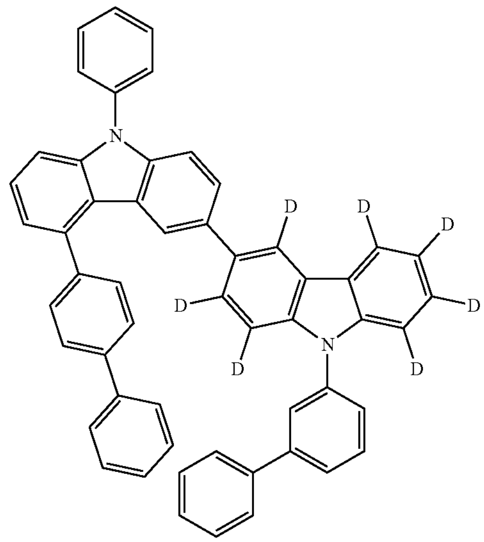
482
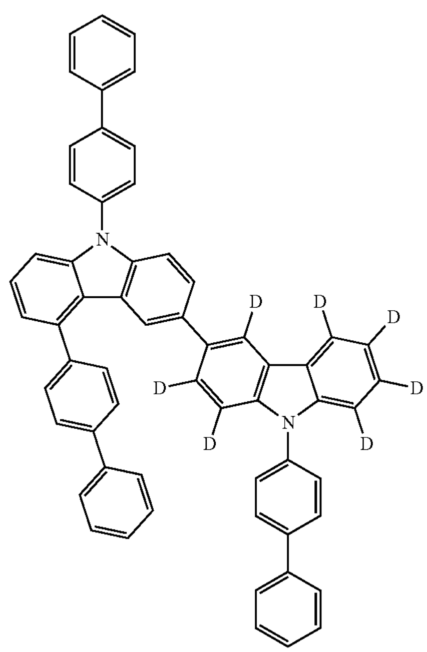
-continued
483
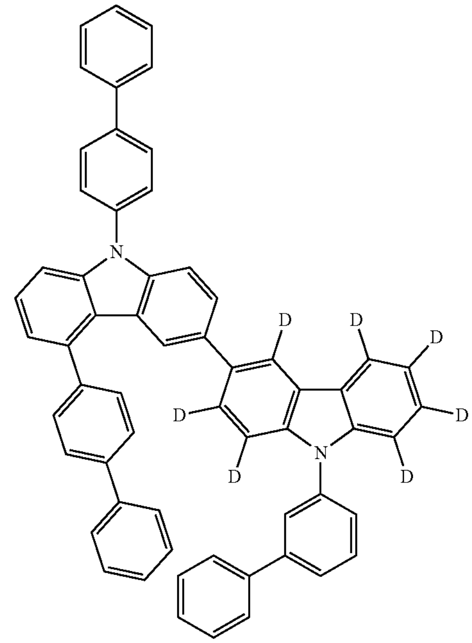
484
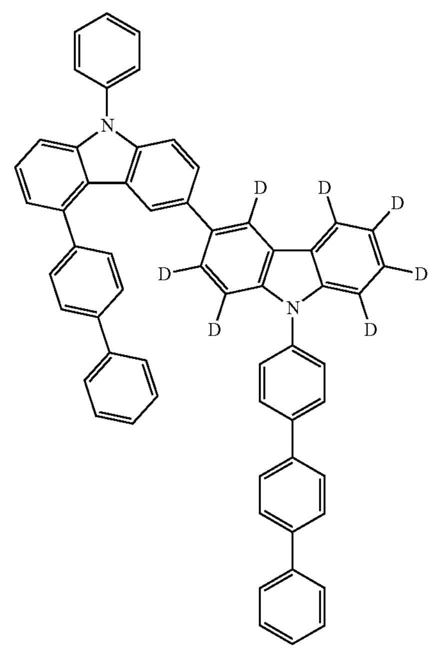

-continued
485
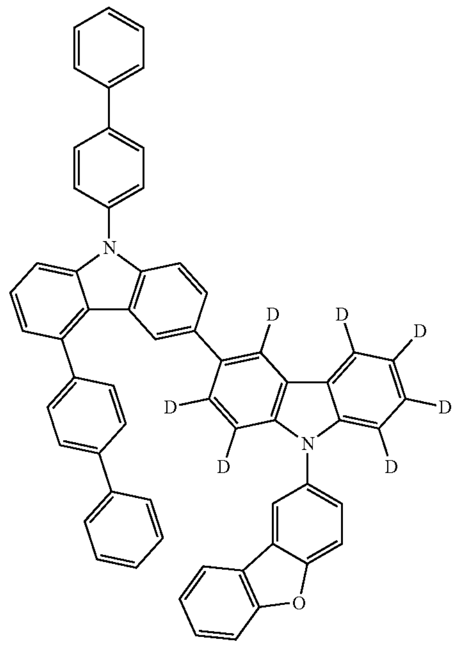
486
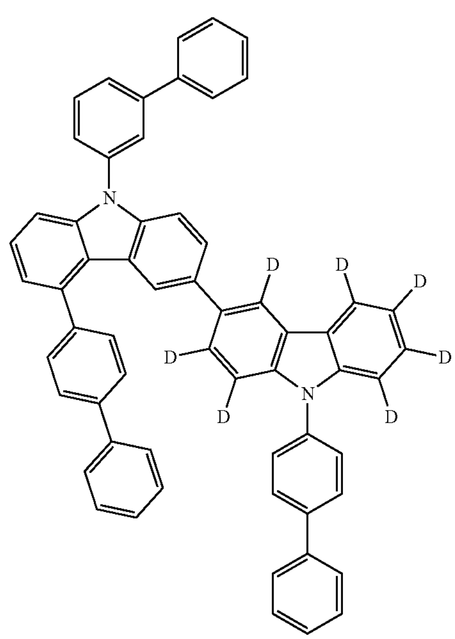
-continued
487
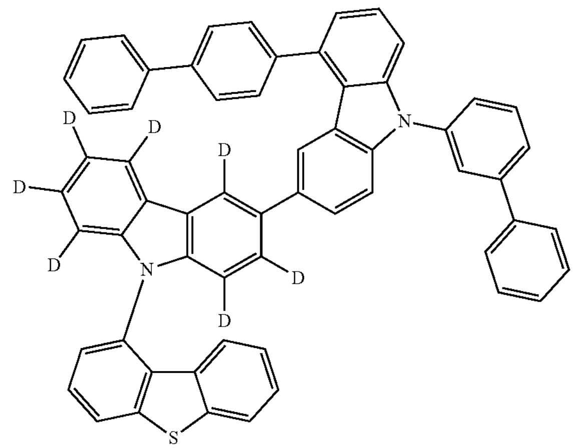
488
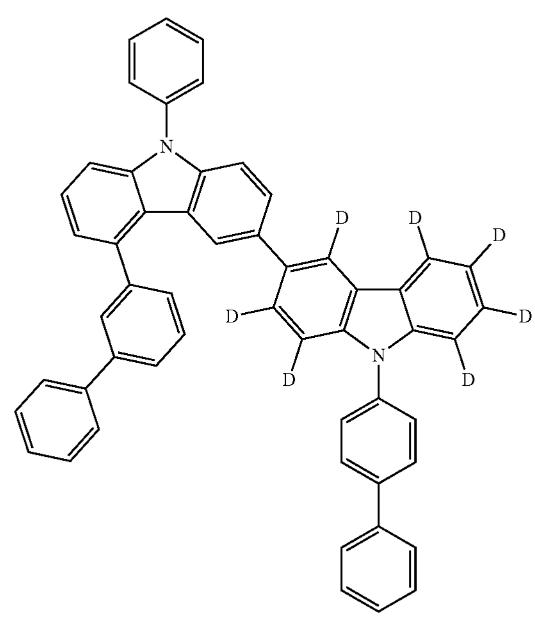

-continued
489
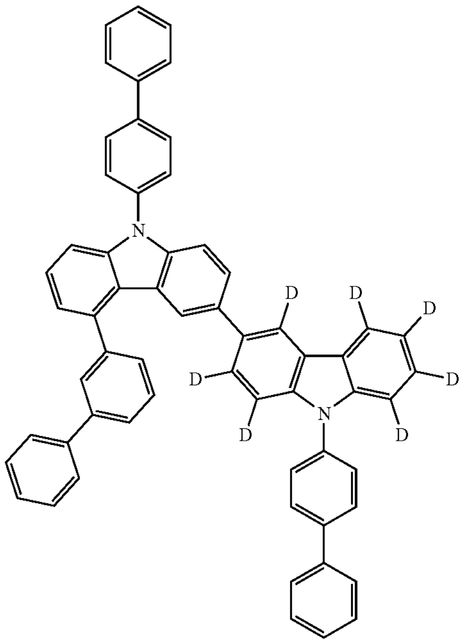
490
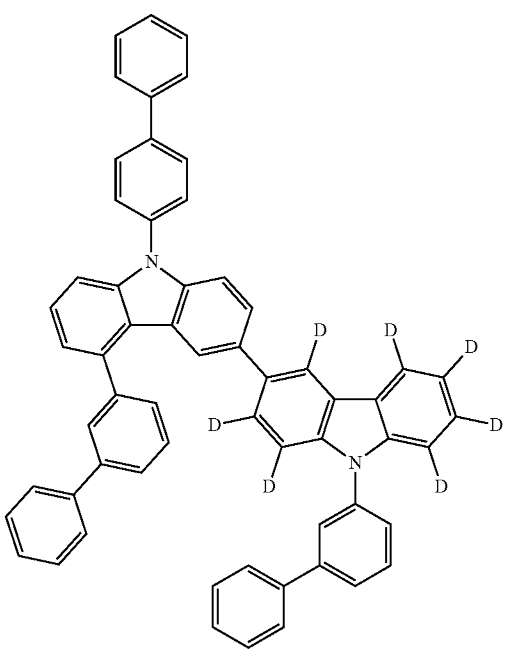
-continued
491
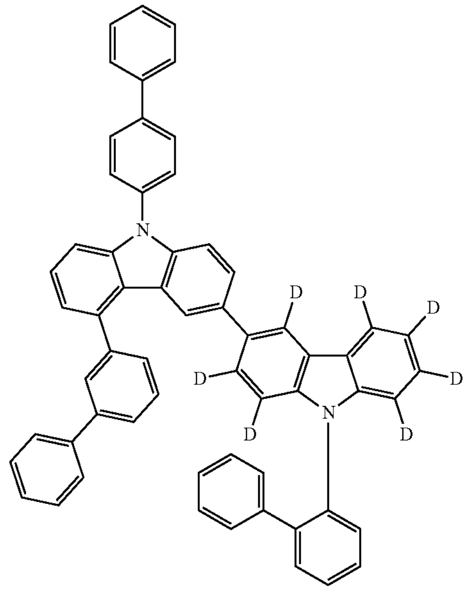
492
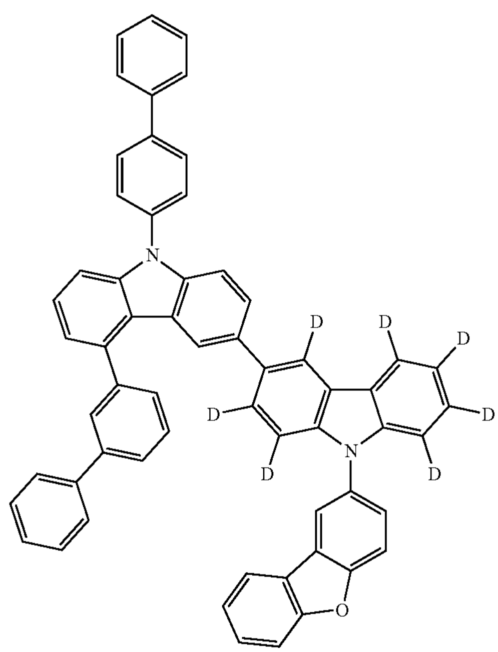

-continued
493
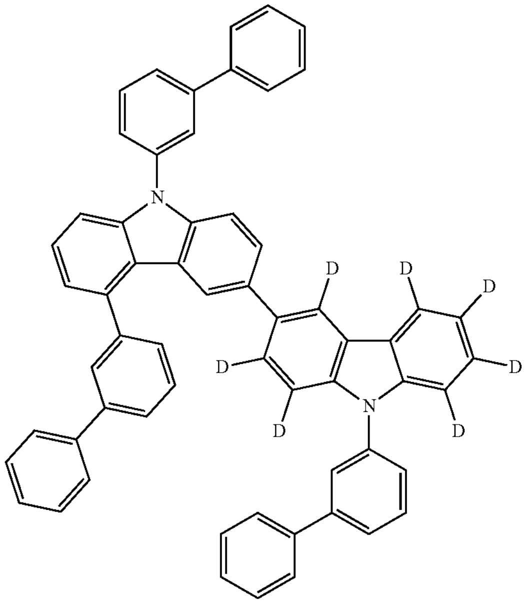
-continued
495
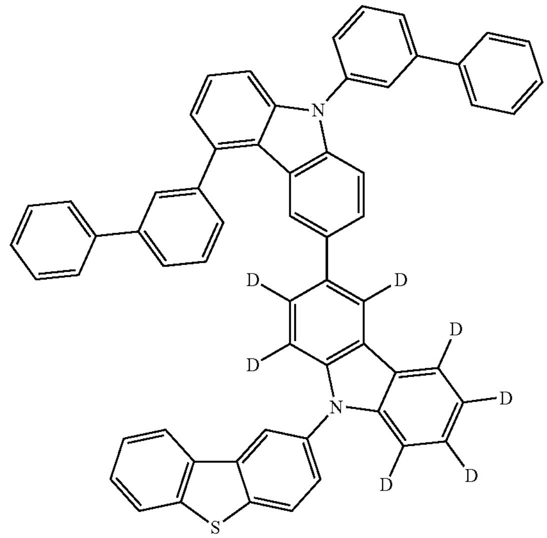
494
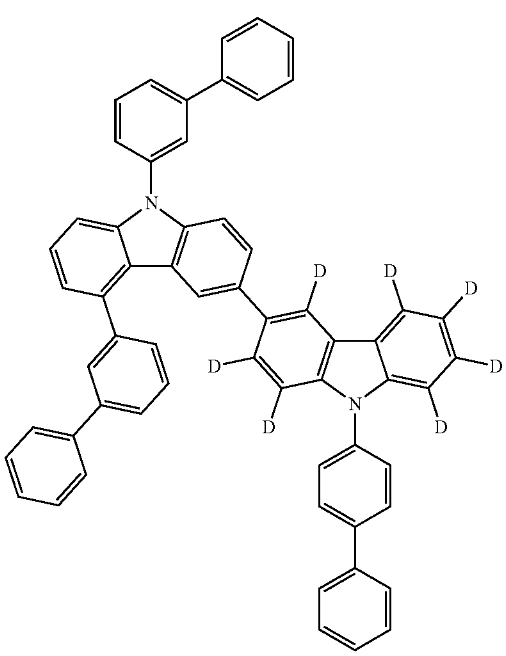
496
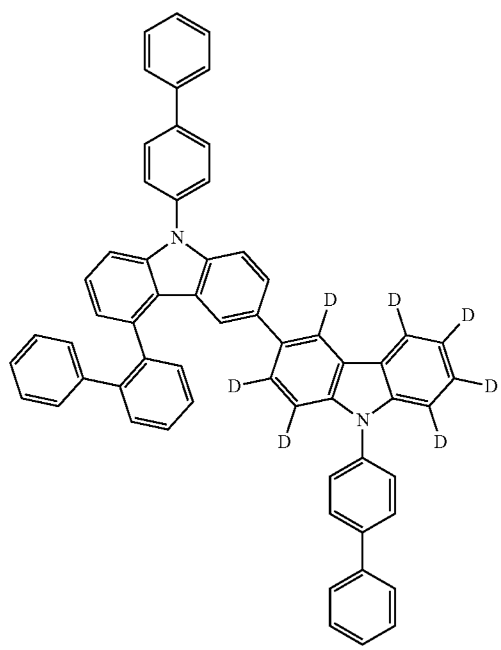

497
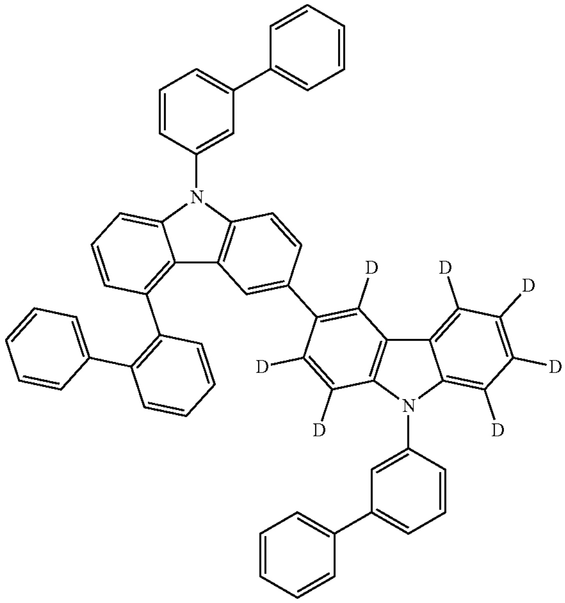
498
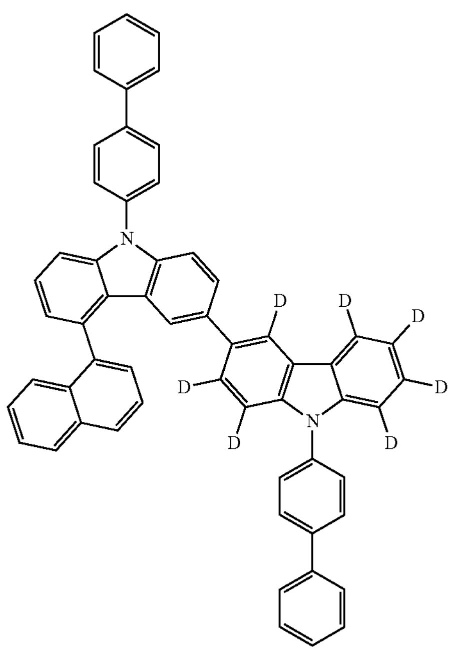
499
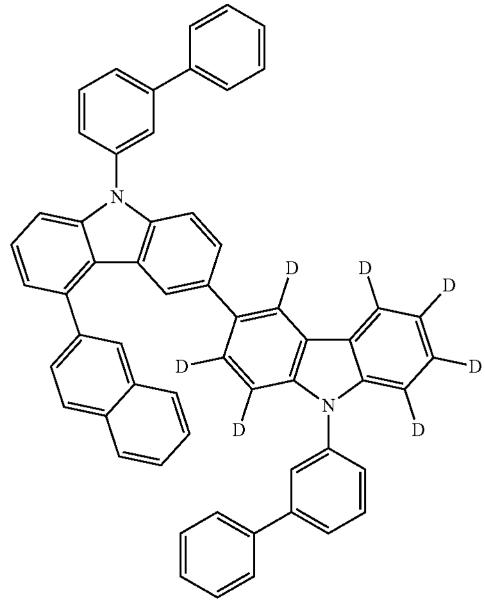
500
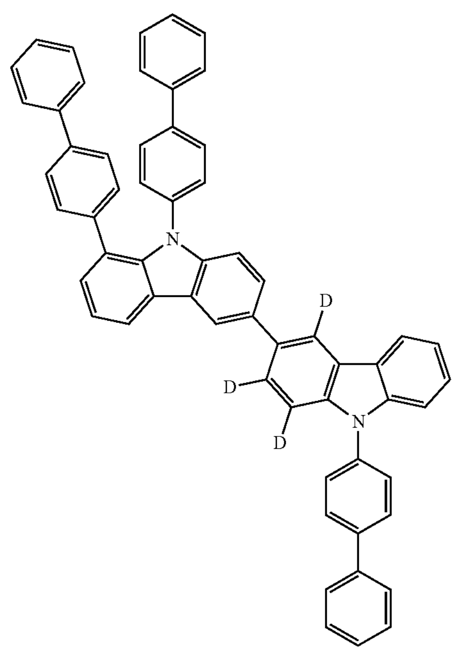

501
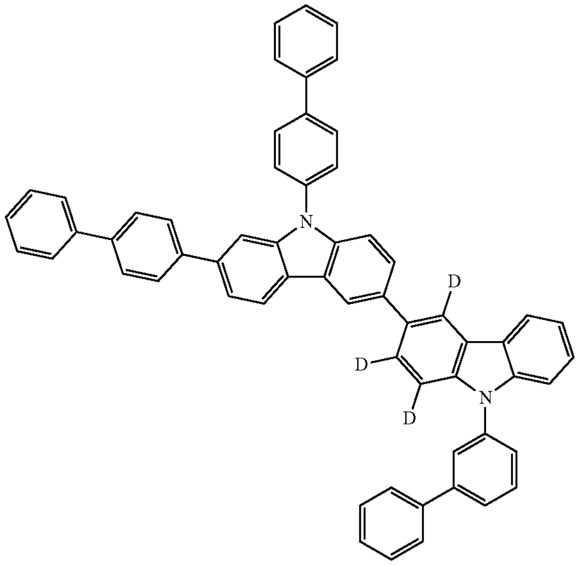
502
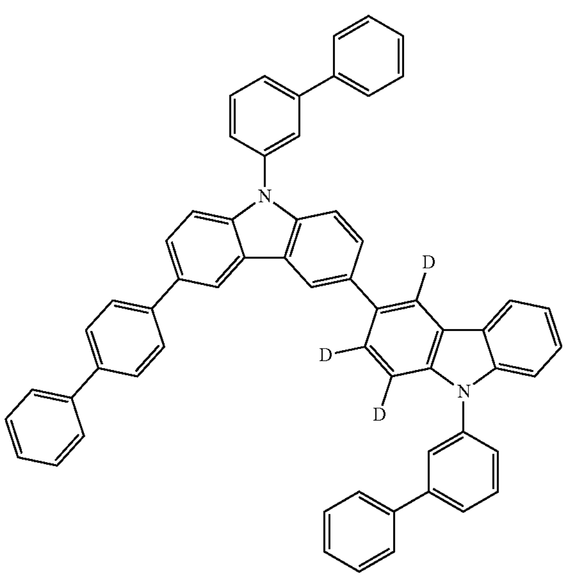
503
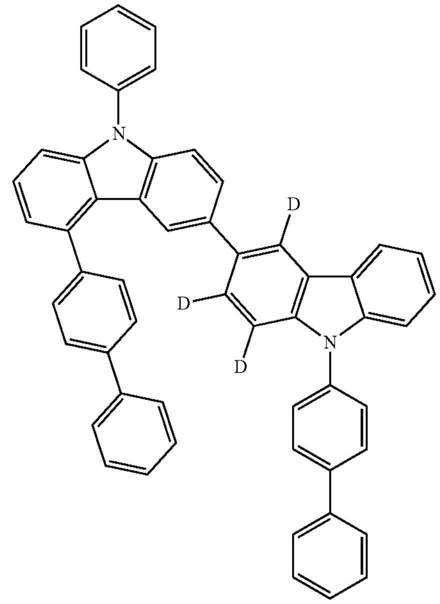
504
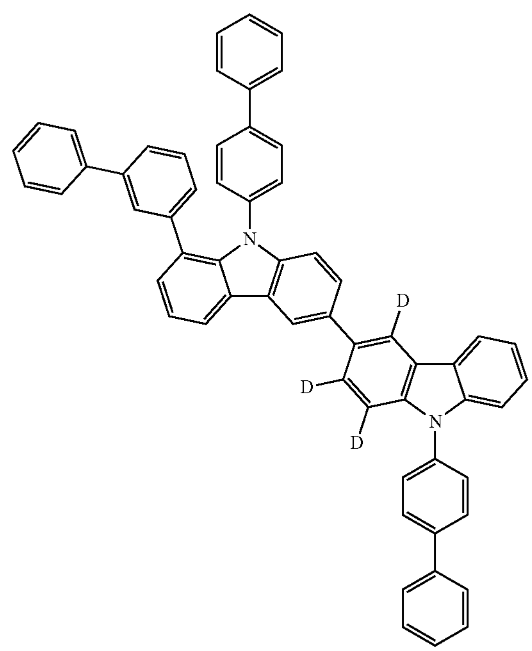

-continued
505
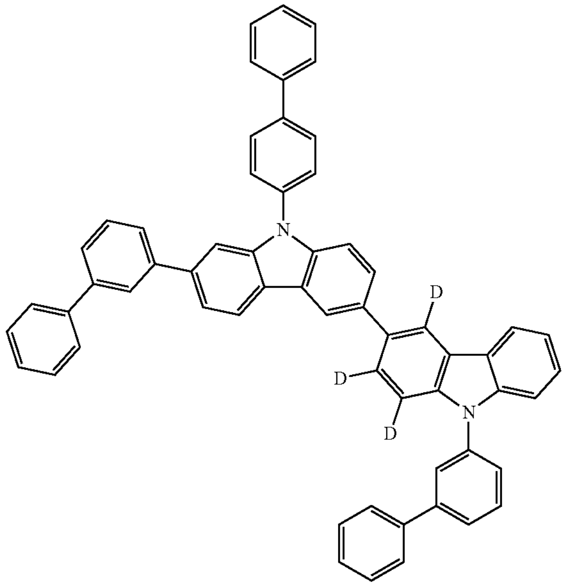
-continued
507
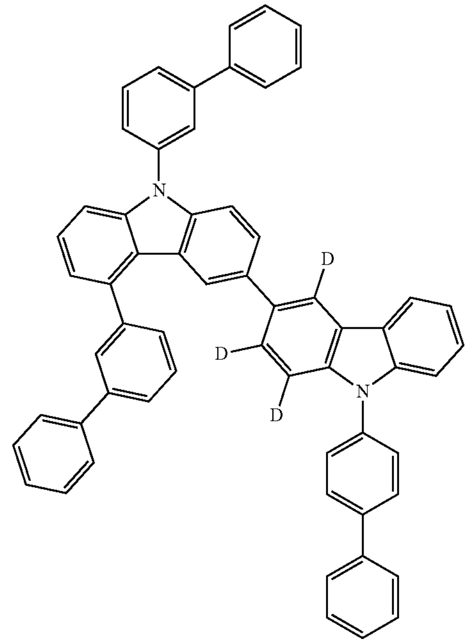
506
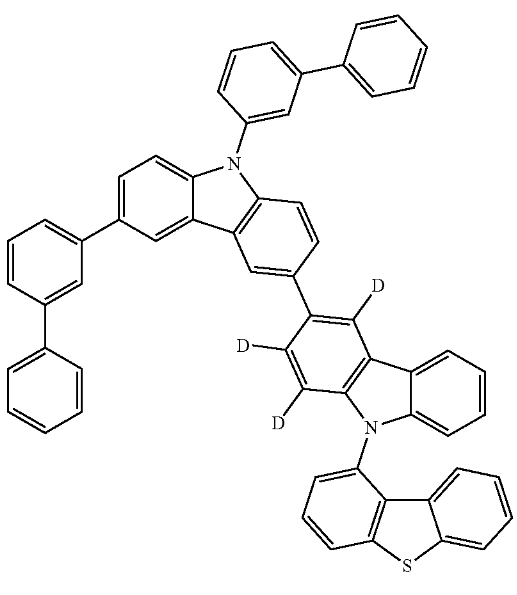
508
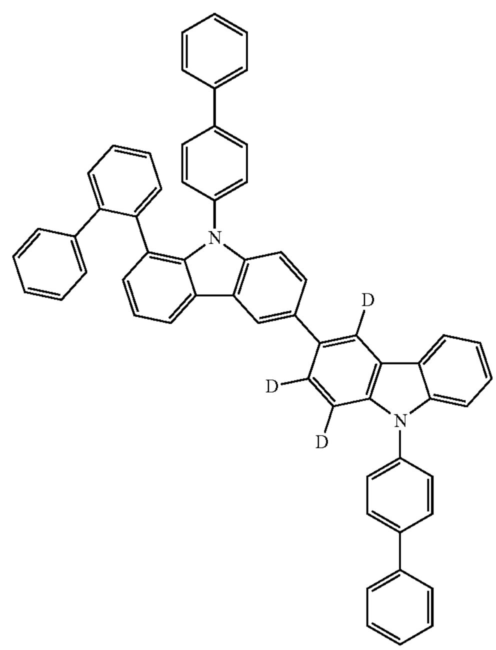

-continued
509
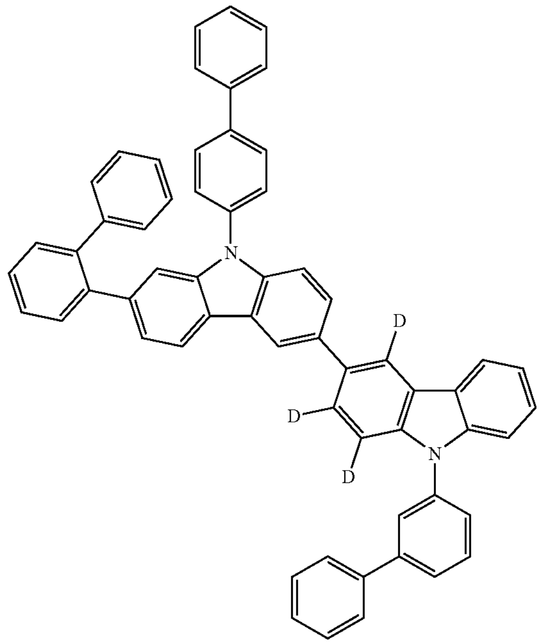
510
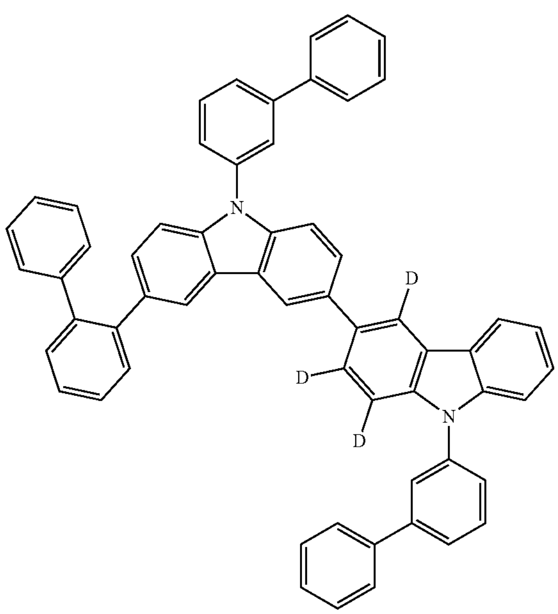
-continued
511
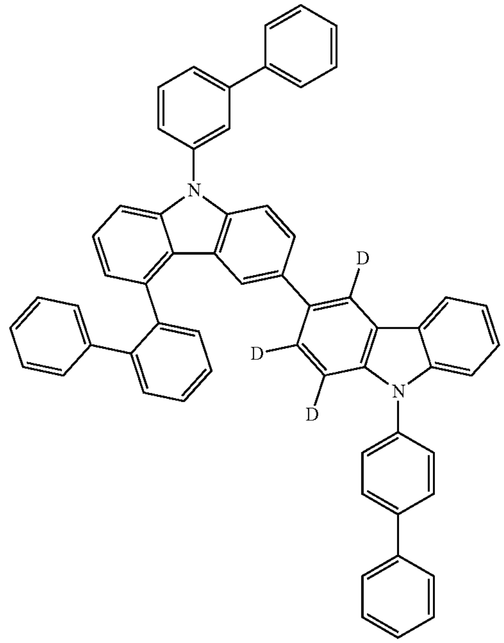
512
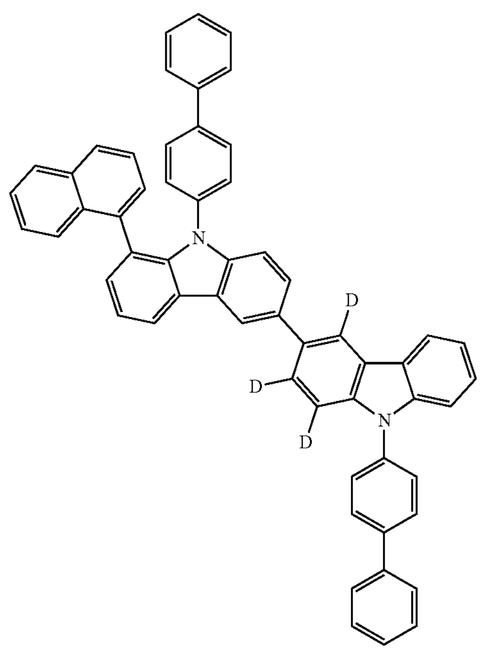

-continued
513
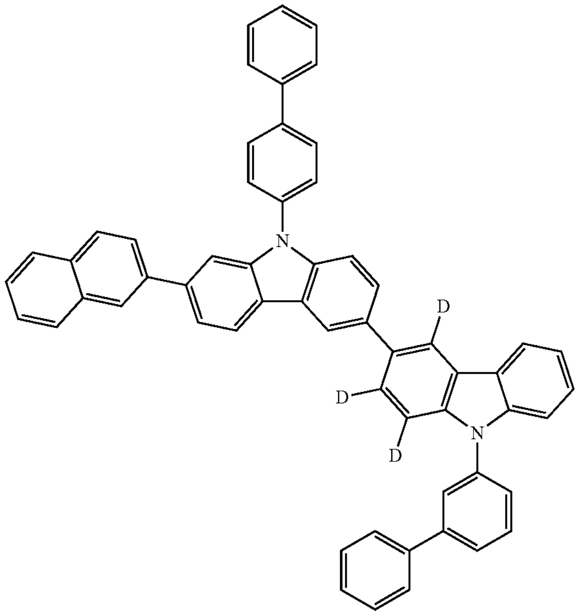
-continued
515
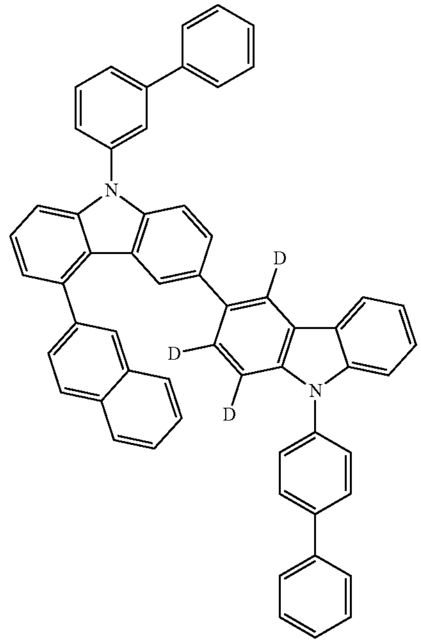
514
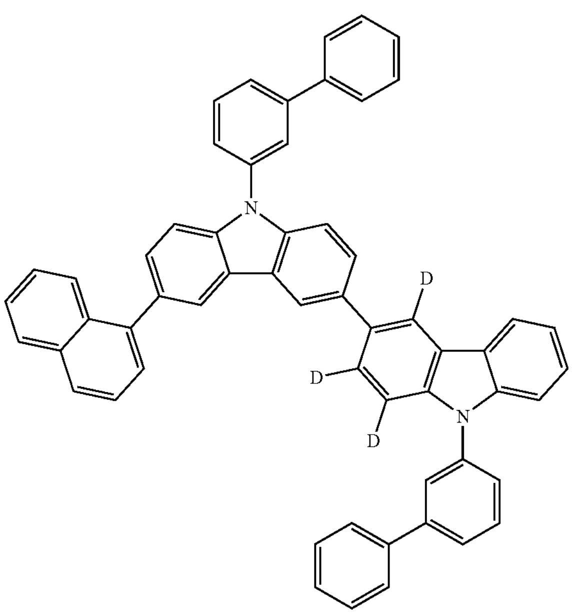
516
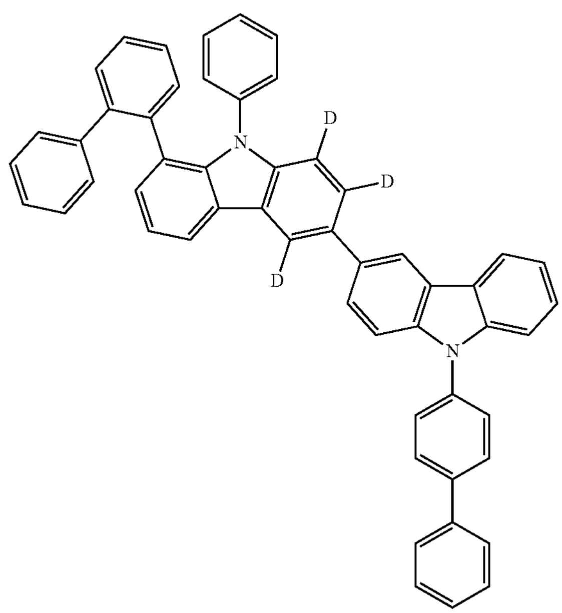

517
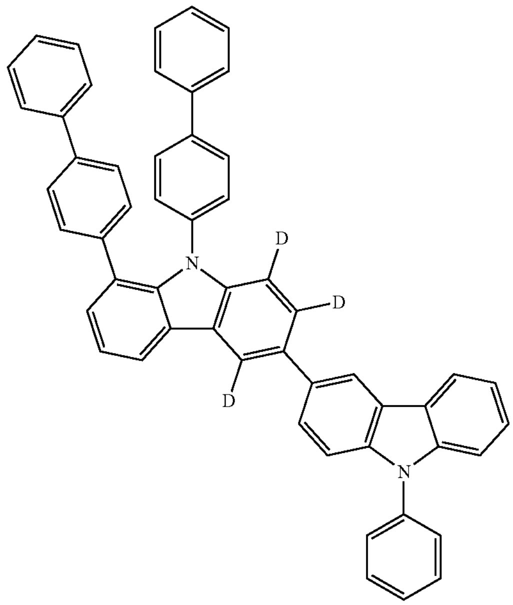
518
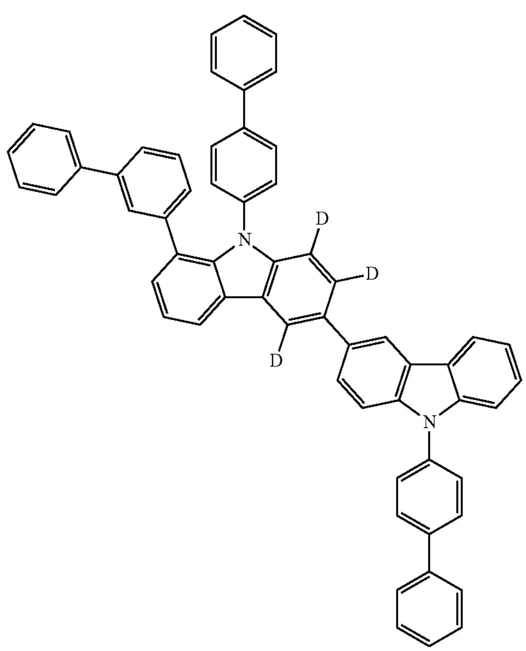
519
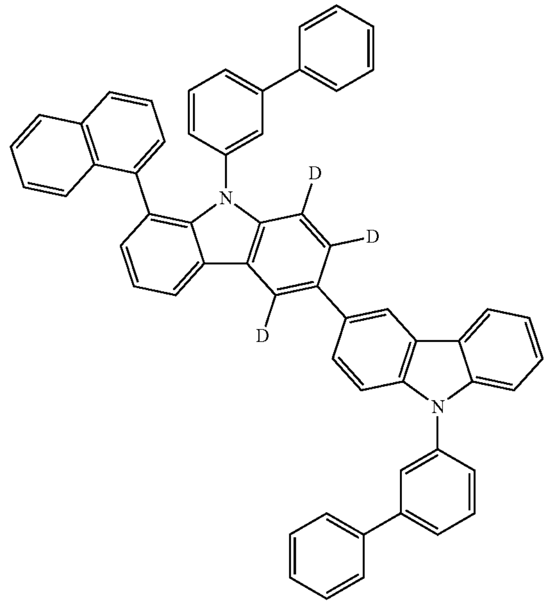
520
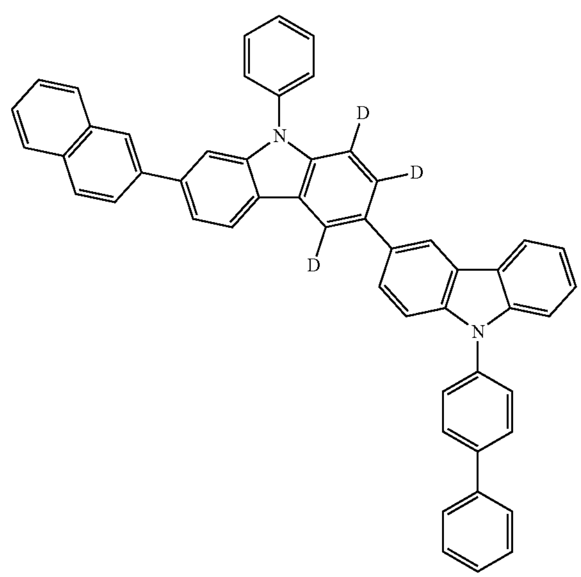

521
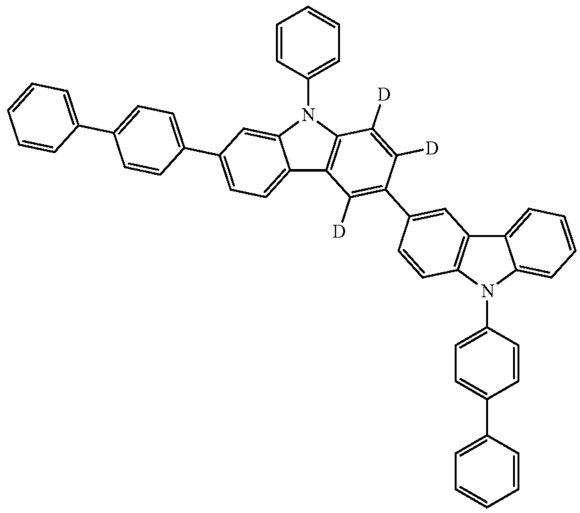
523
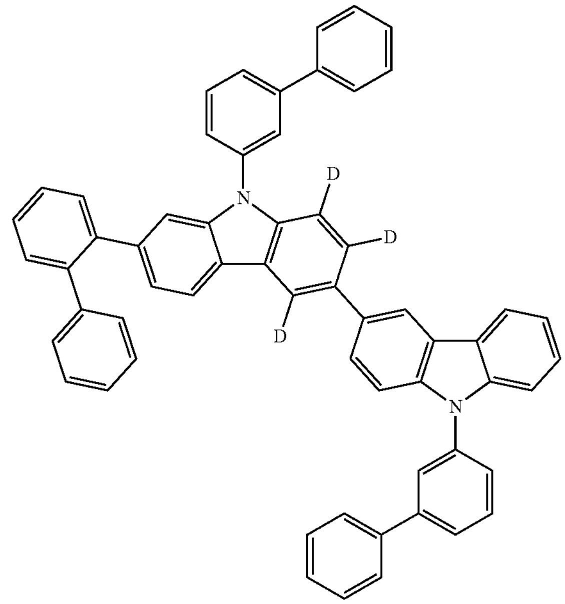
522
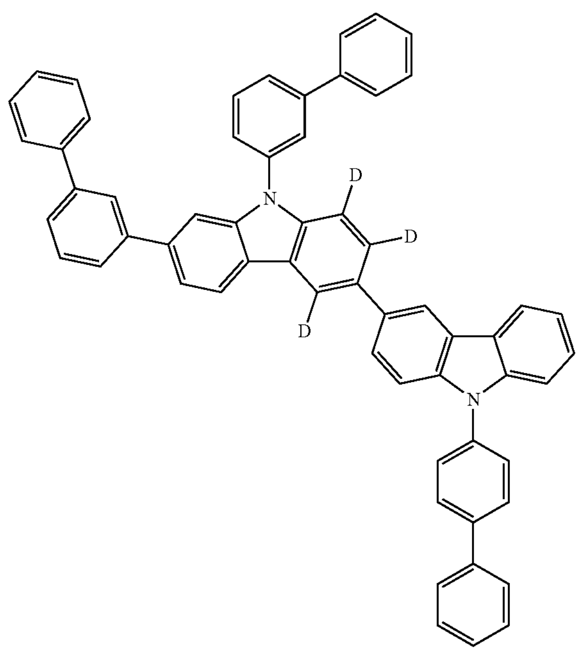
524
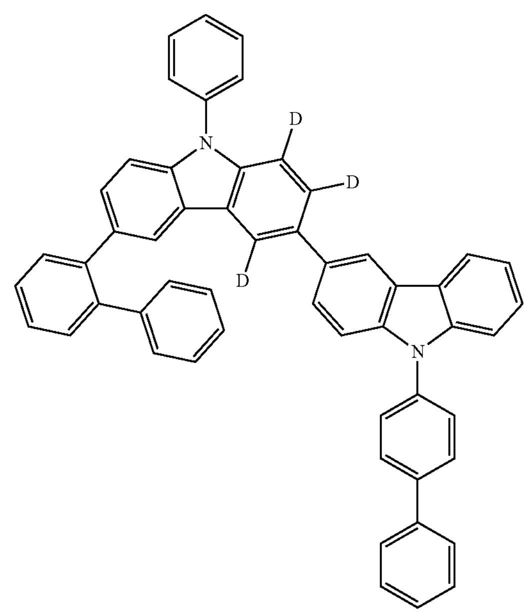

-continued
525
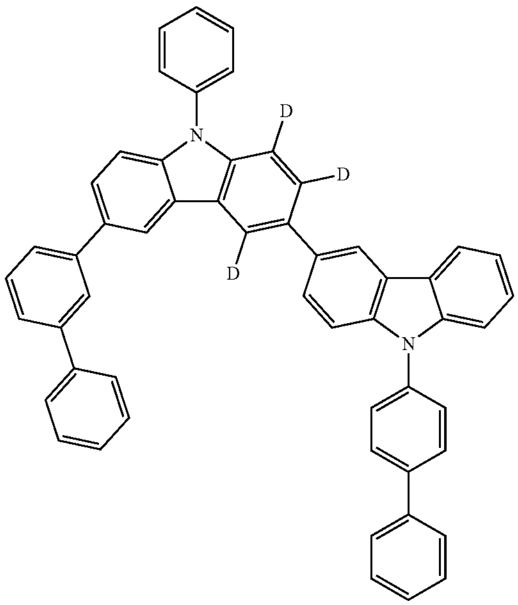
526
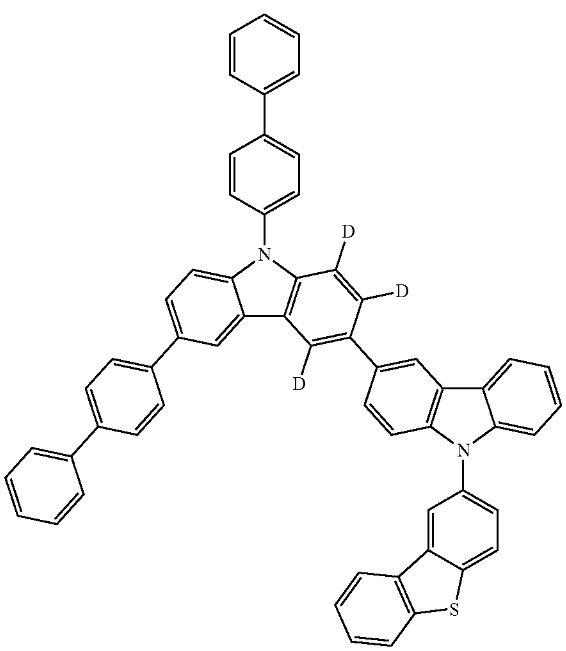
-continued
527
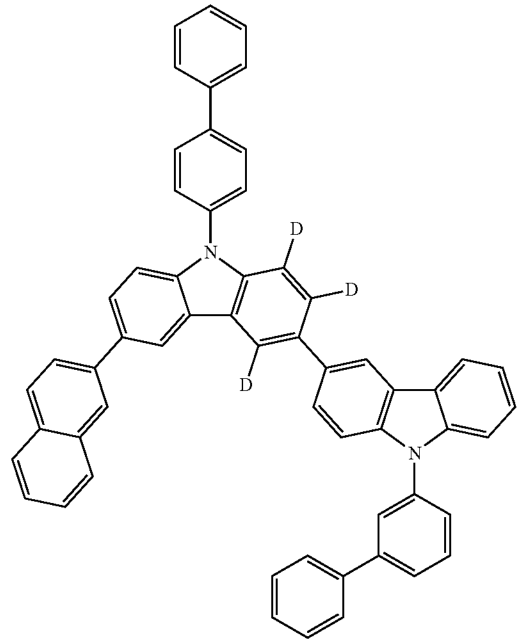
528
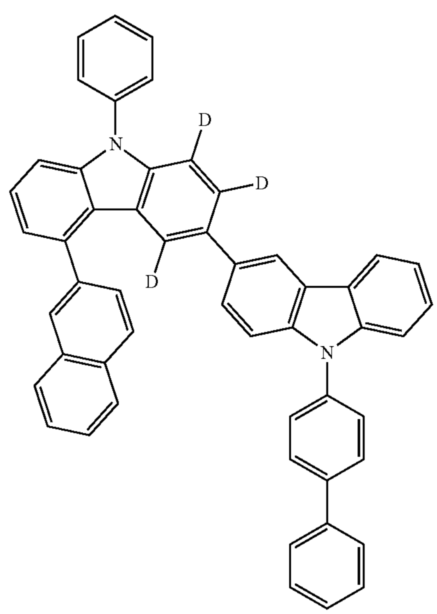

-continued
529
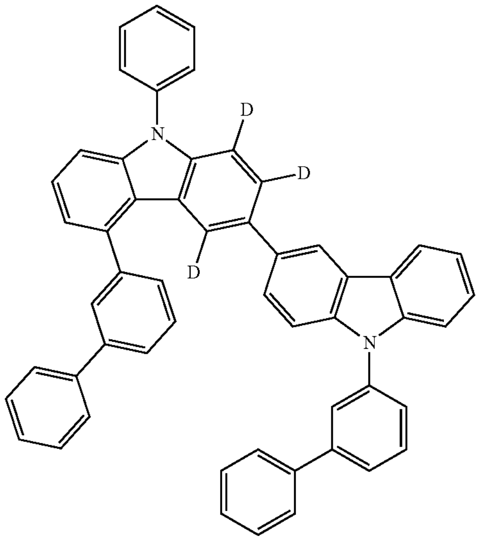
530
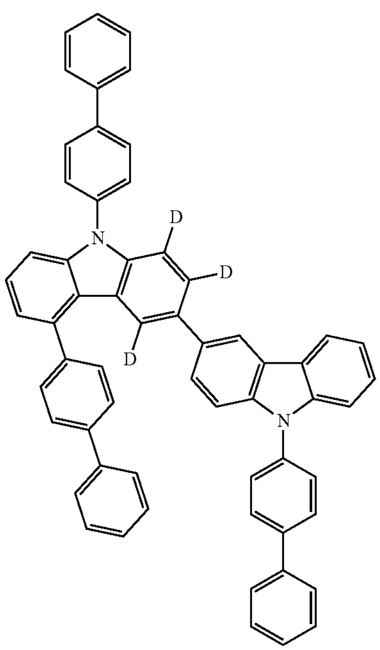
-continued
531
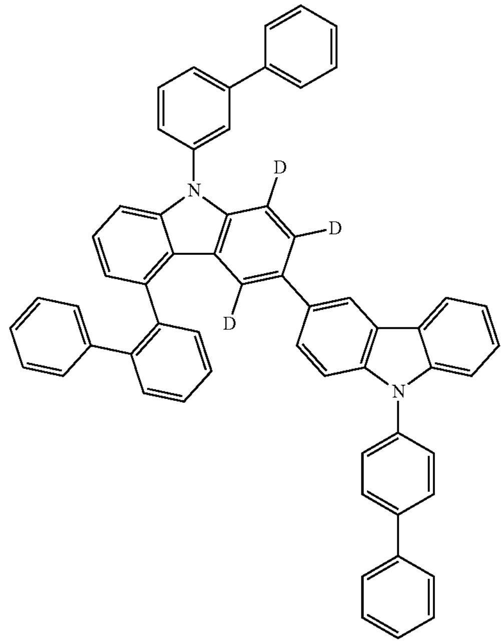
532
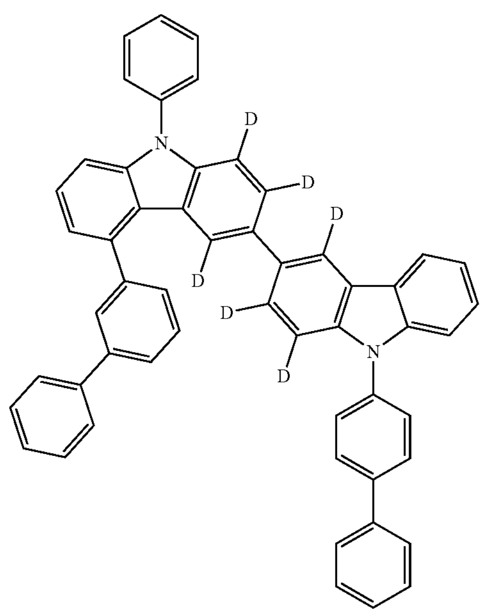

-continued
533
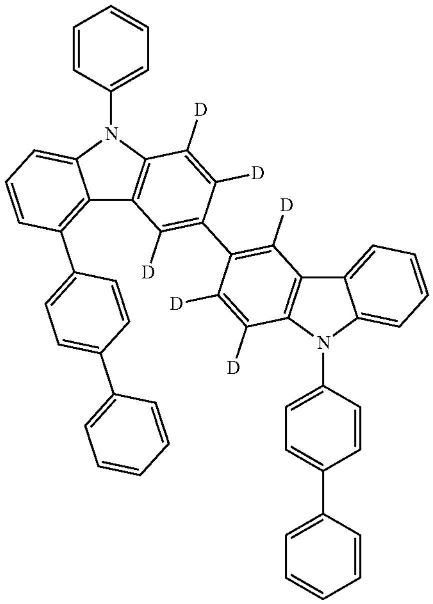
534
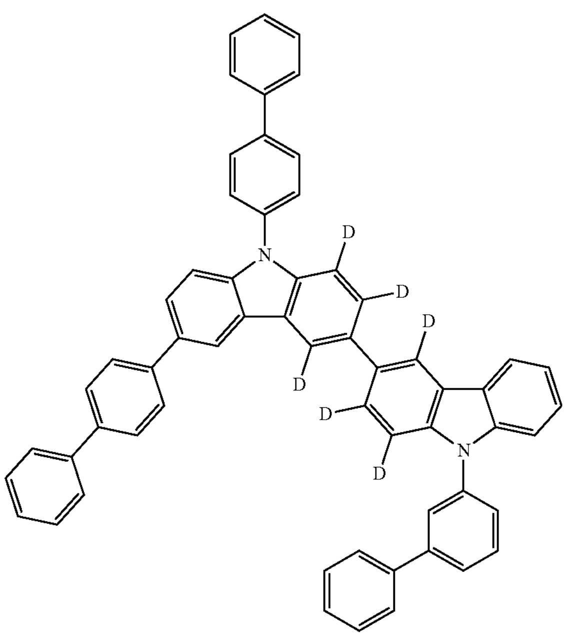
-continued
535
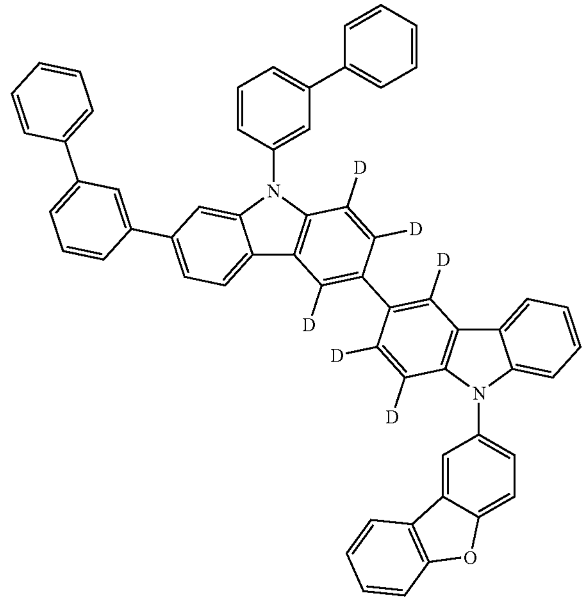
536
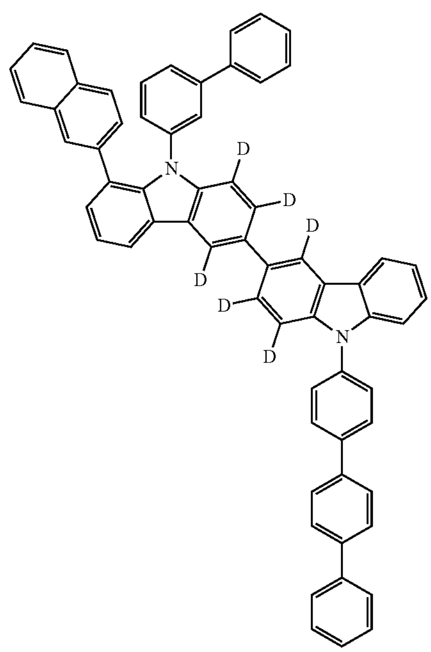

537
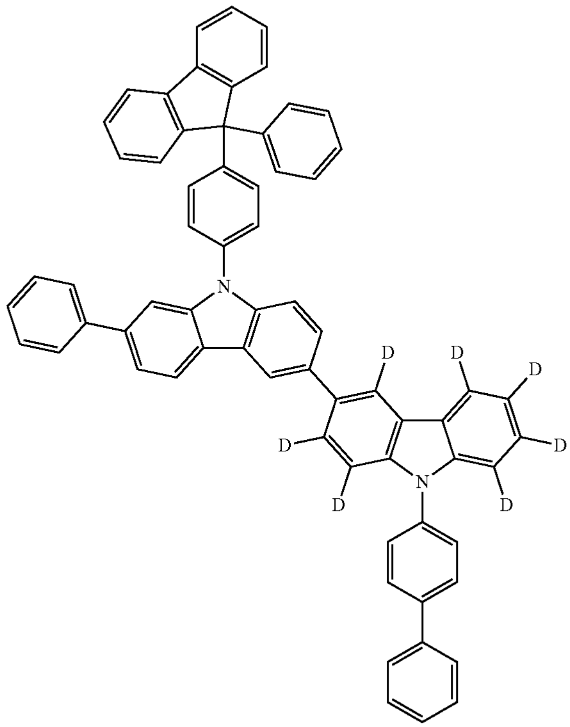
539
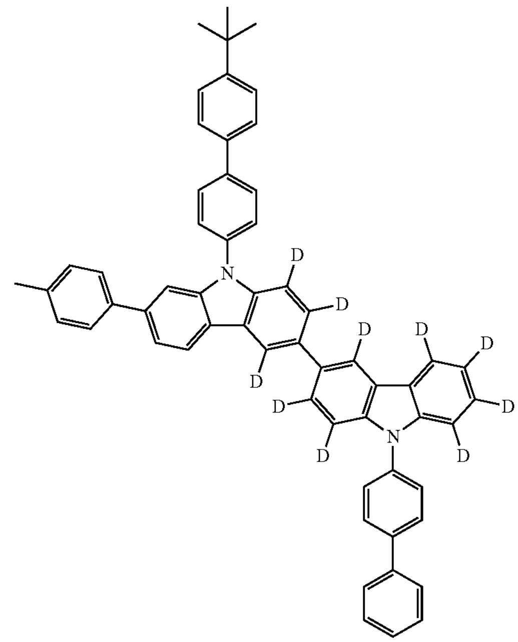
538
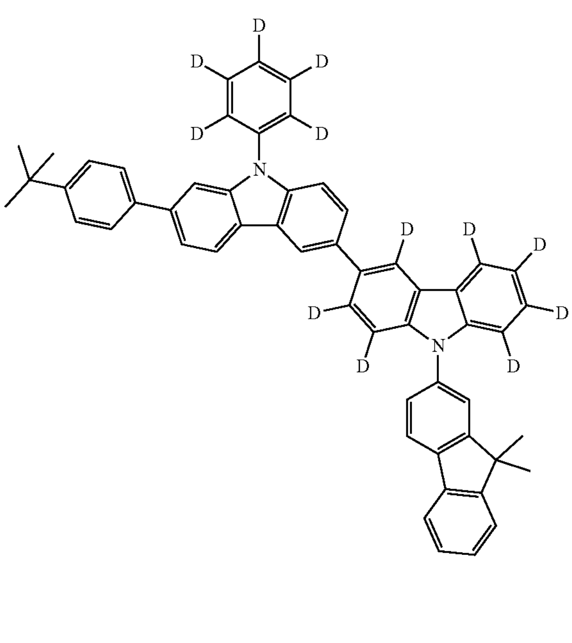
540
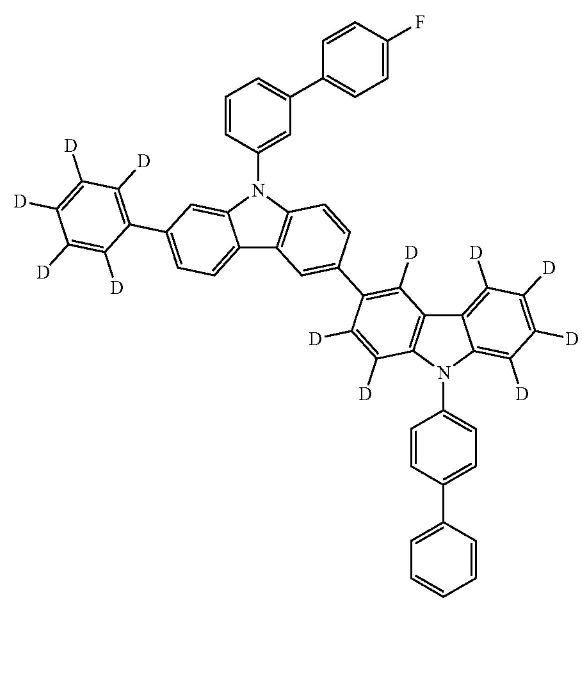

541
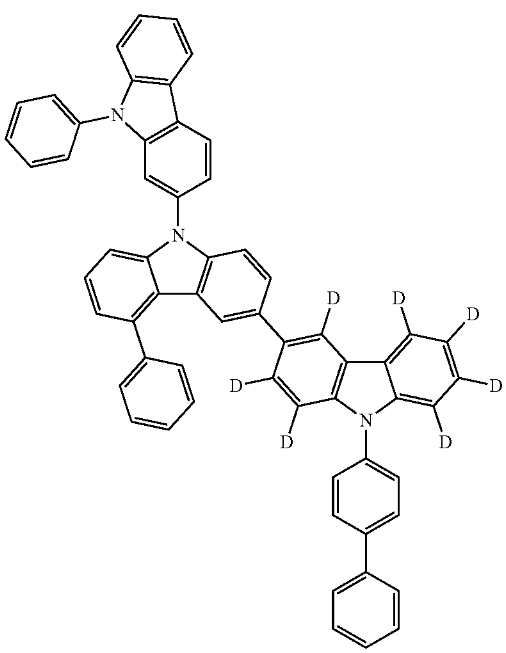
542
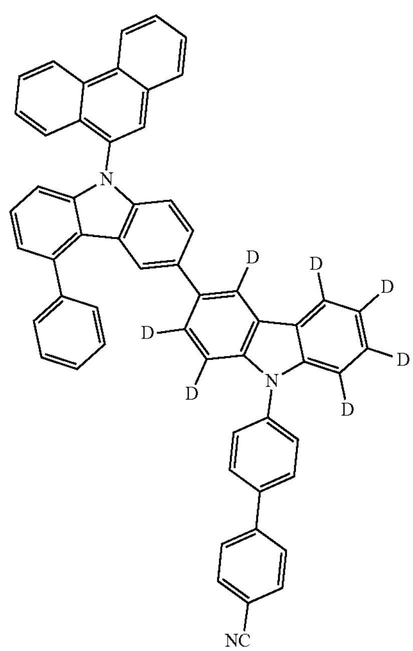
543
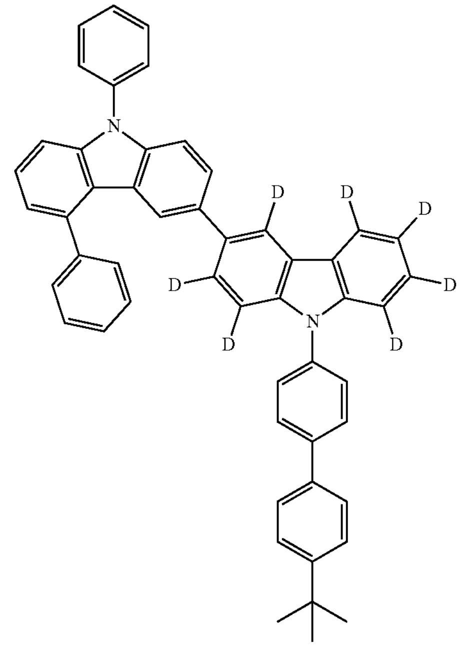
544
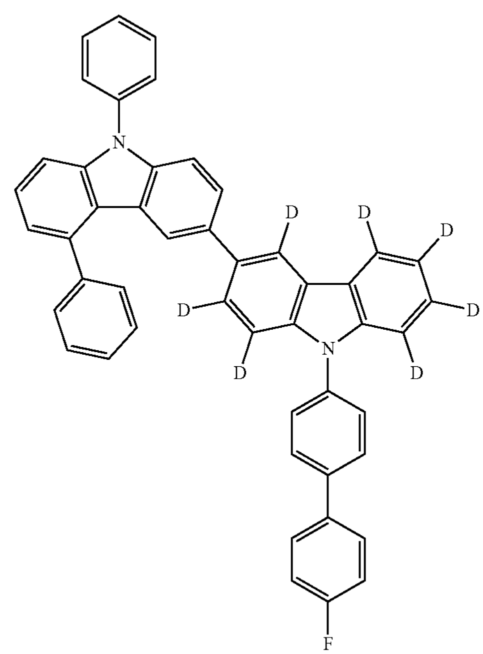

-continued
545
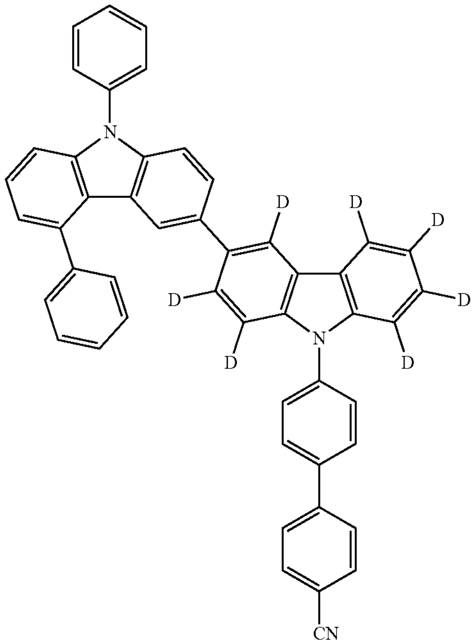
546
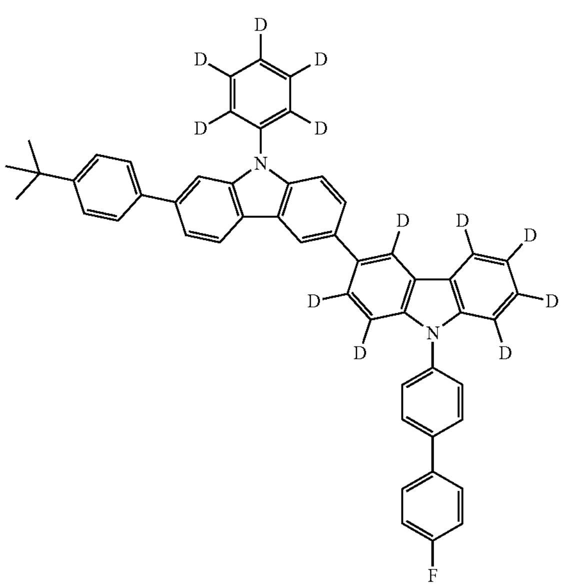
-continued
547
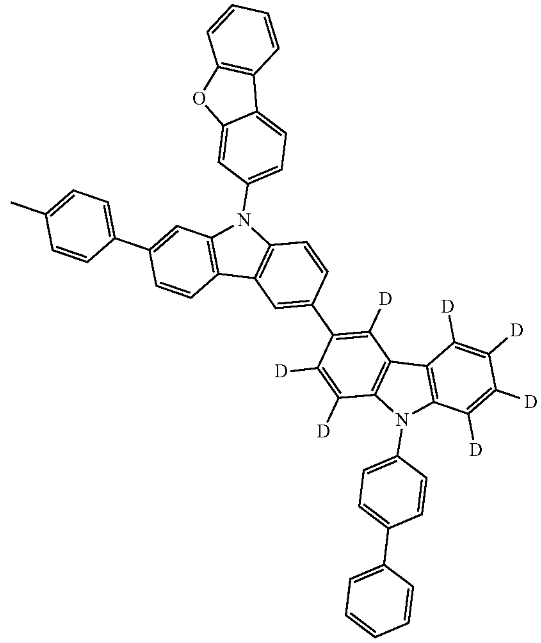
548
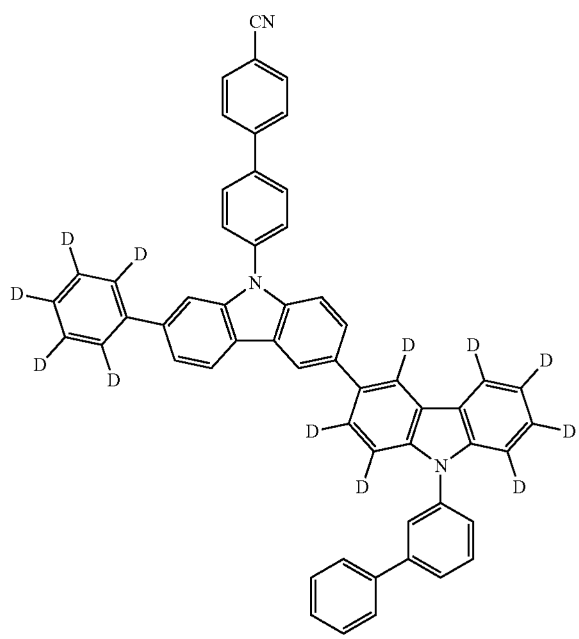

-continued
549
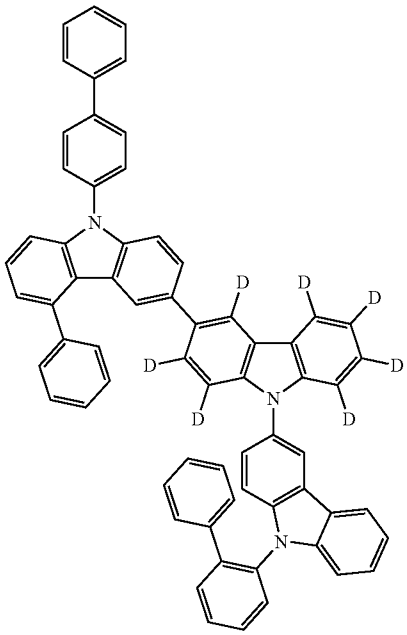
550
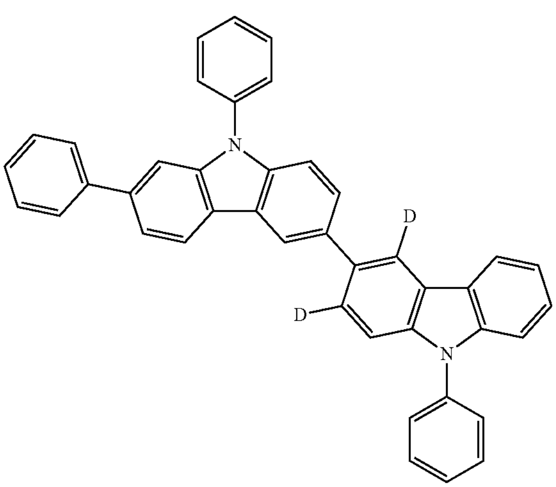
-continued
551
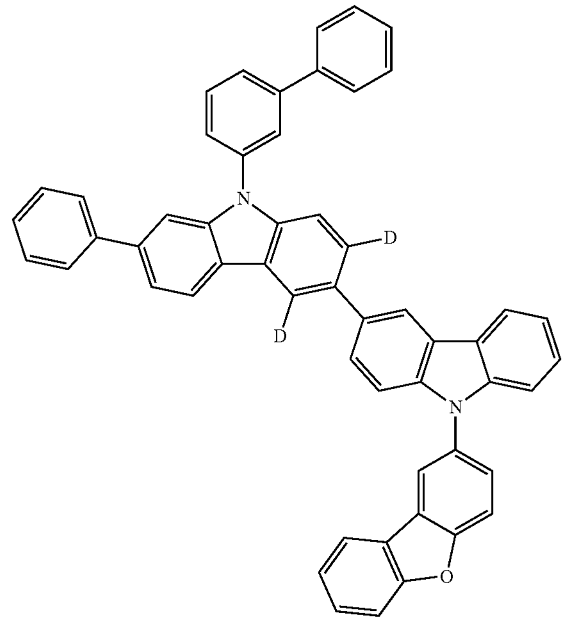
552
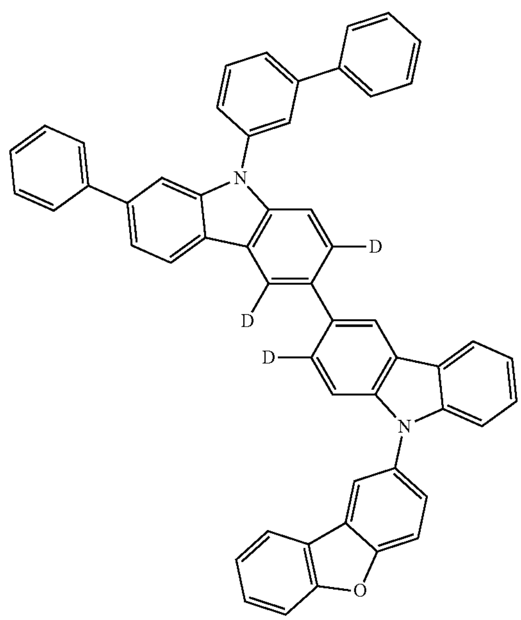

-continued
553
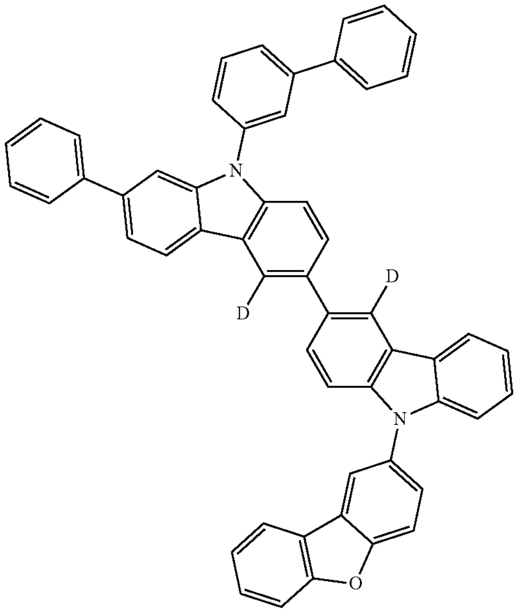
554
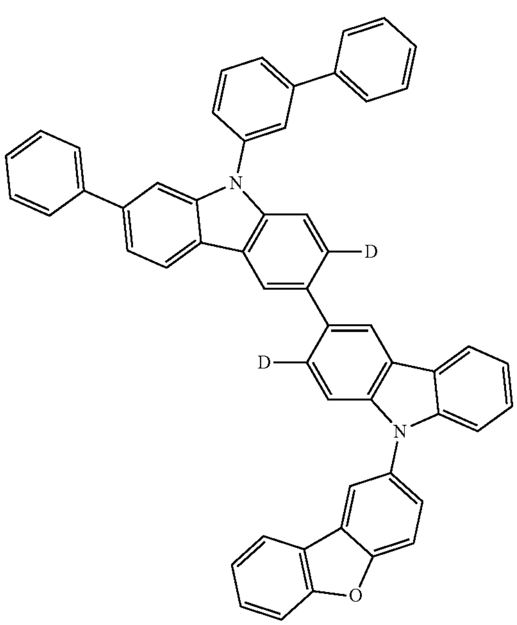
-continued
555
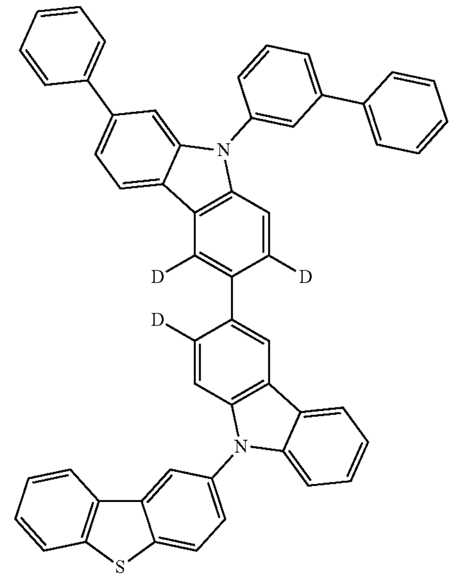
556
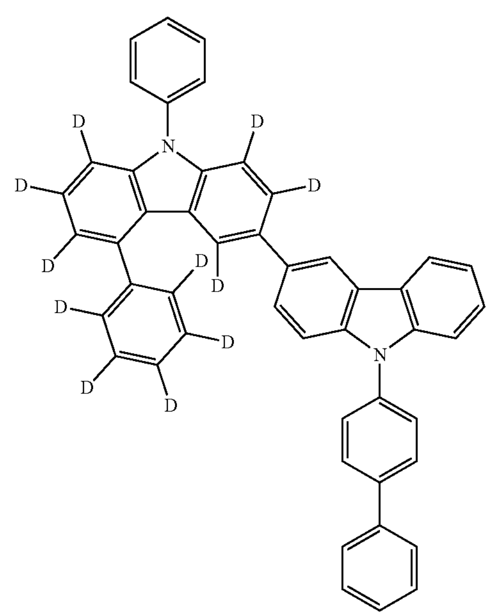

-continued
557
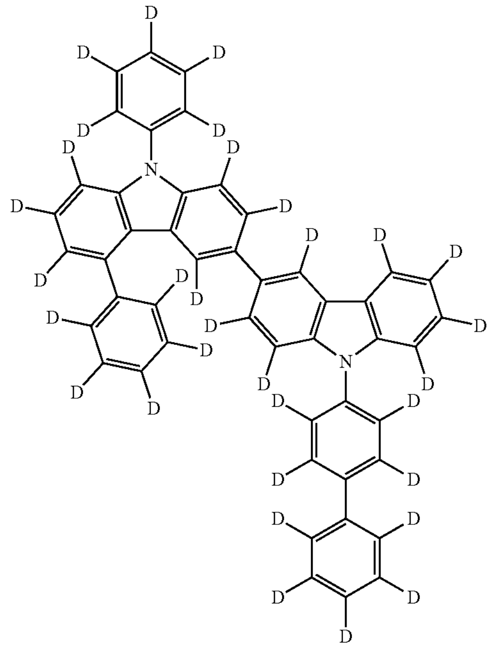
558
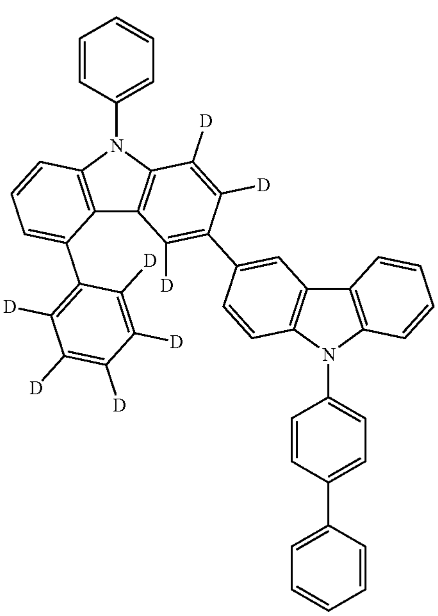
-continued
559
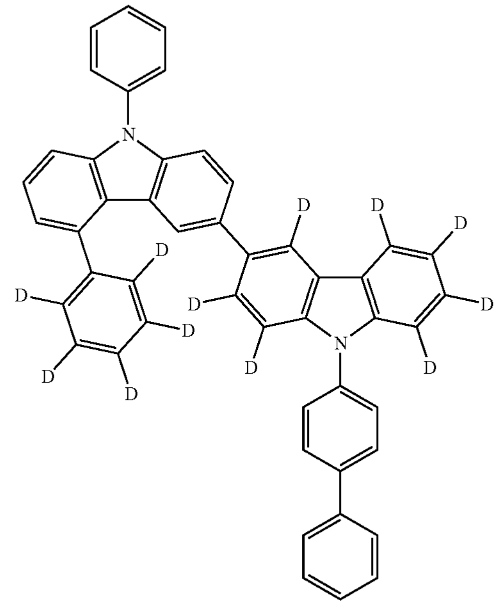
600
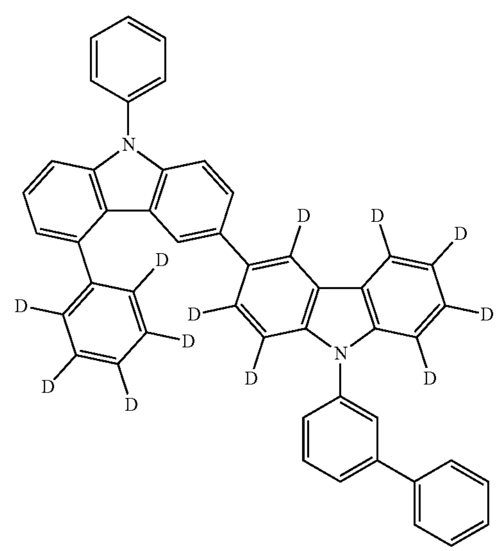

-continued
601
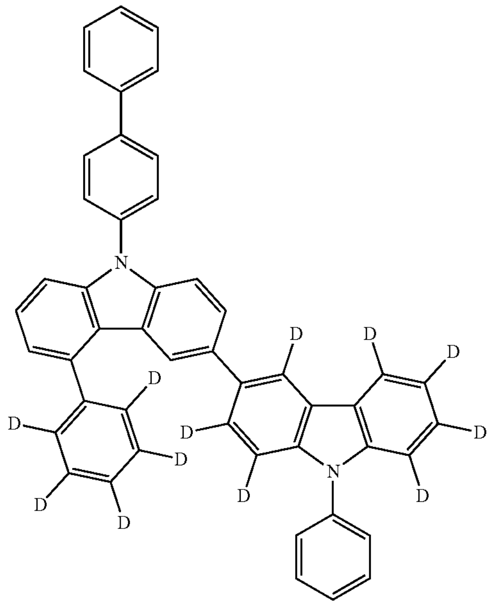
602
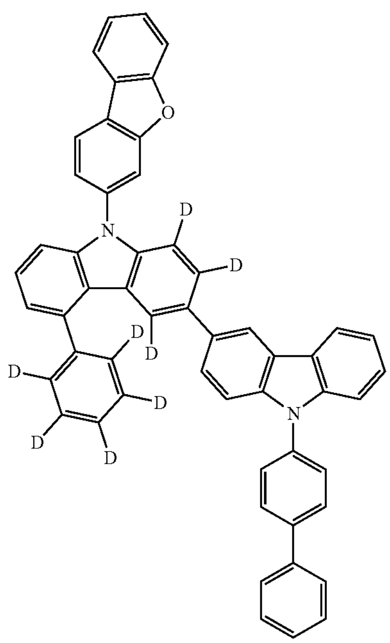
-continued
603
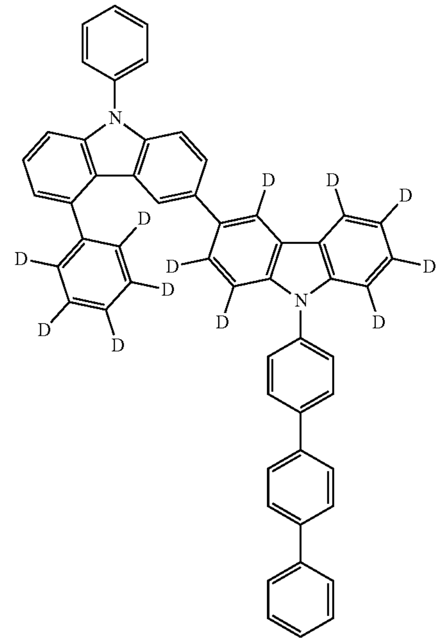
604
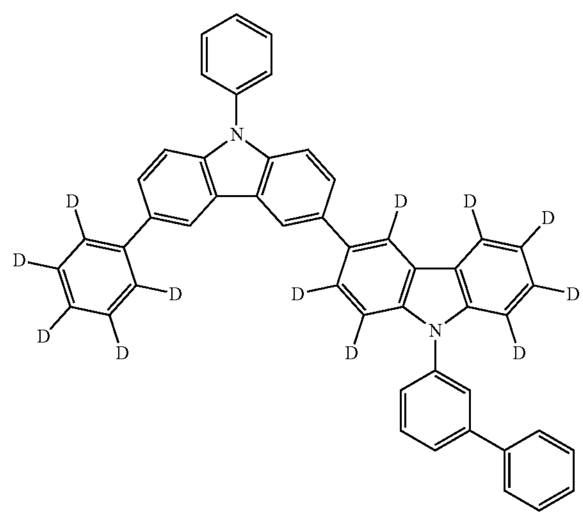

-continued
605
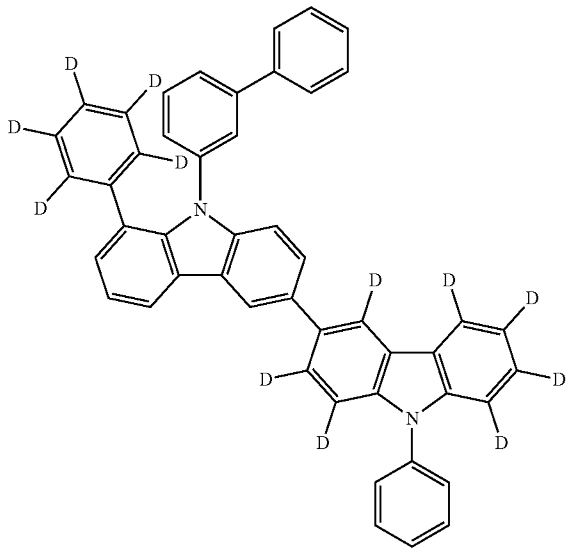
606
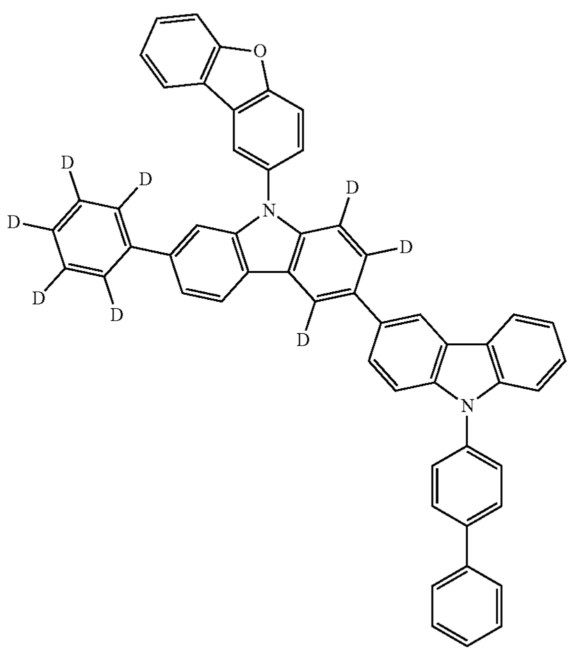
-continued
607
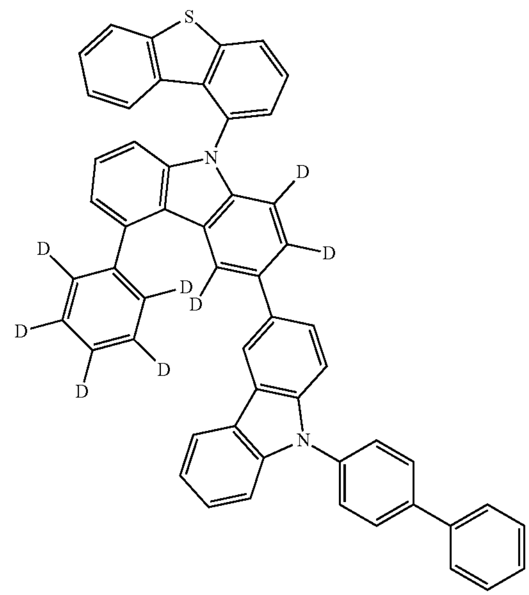
608
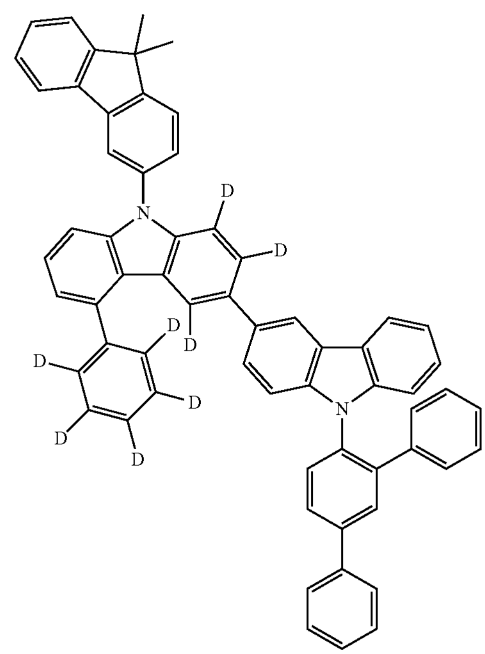

-continued

609

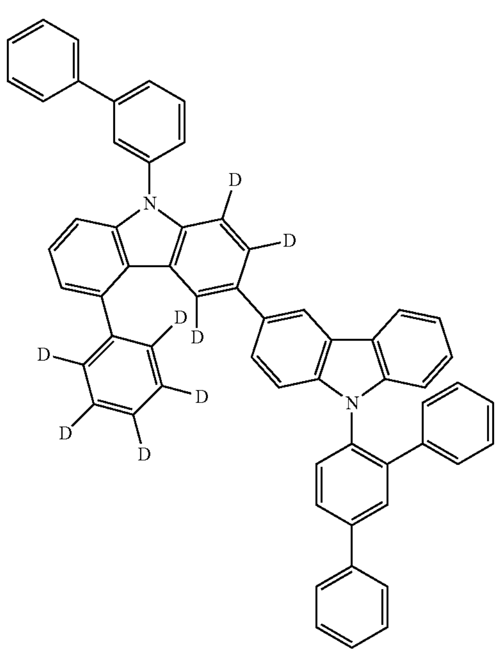

610

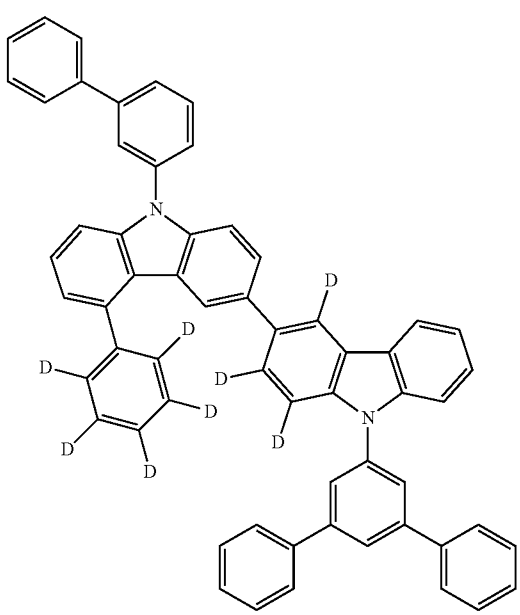

-continued

611

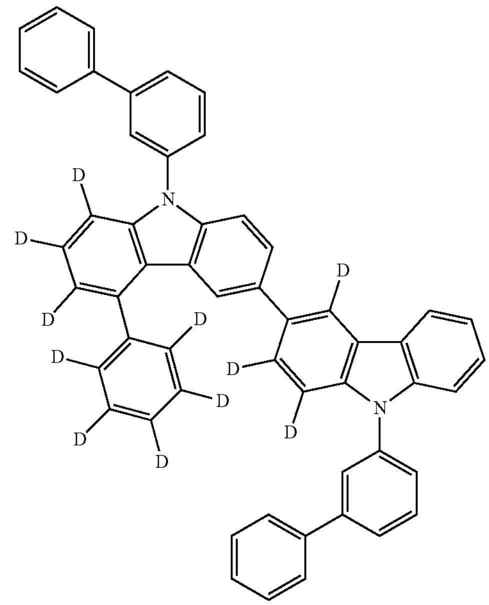

The present disclosure provides an organic electroluminescent device including a cathode and an anode which are oppositely disposed, and an organic layer. The organic layer includes an organic luminescent layer, the organic luminescent layer includes a first compound and a second compound.

In some embodiments of the present disclosure, the first compound and the second compound are used as a host material for the organic luminescent layer by mixing.

In some embodiments of the present disclosure, the relative contents of the two types of compounds in the organic luminescent layer are not particularly limited in the present disclosure, and can be selected according to the specific application of the organic electroluminescent device. Generally, the mass percentage of the first compound may be 1% to 99% and the mass percentage of the second compound may be 1% to 99%, based on the total weight of the two compounds. For example, a mass ratio of the first compound to the second compound may be 1:99, 20:80, 40:60, 45:65, 50:50, 55:45, 60:40, 70:30, 80:20, 99:1 etc.

In some embodiments of the present disclosure, the mass percentage of the first compound is 20% to 80% and the mass percentage of the second compound is 20% to 80% based on the total weight of the two compounds.

In some preferred embodiments, the mass percentage of the first compound is 30% to 60% and the mass percentage of the second compound is 40% to 70% based on the total weight of the two compounds. Preferably, the mass percentage of the first compound is 40% to 60% and the mass percentage of the second compound is 40% to 60%. More preferably, the mass percentage of the first compound is 40% to 50% and the mass percentage of the second compound is 50% to 60%.

In some embodiments of the present disclosure, the organic electroluminescent device is a phosphorescent device.

In some specific embodiments of the present disclosure, the organic electroluminescent device is a green organic electroluminescent device.

In some embodiments of the present disclosure, the organic electroluminescent device sequentially includes an anode (ITO/Ag/ITO), a hole transport layer, a hole auxiliary layer, an organic luminescent layer, an electron transport layer, an electron injection layer, a cathode (a Mg—Ag mixture), and an organic capping layer.

In one specific embodiment of the present disclosure, as shown in FIG. 1, the organic electroluminescent device of the present disclosure includes an anode 100, a cathode 200 disposed opposite to the anode 100, and at least one organic layer 300 between the anode layer and the cathode layer, where the organic layer 300 includes a hole injection layer 310, a hole transport layer 321, a hole auxiliary layer 322, an organic luminescent layer 330, an electron transport layer 350, and an electron injection layer 360 which are sequentially stacked.

Optionally, a hole blocking layer 340 may be disposed between the organic luminescent layer 330 and the electron transport layer 350. The organic luminescent layer 330 may contain organic compounds described in the first aspect of the present disclosure.

Optionally, the anode 100 includes the following anode materials which are preferably materials having a large work function that facilitate hole injection into the organic layer. Specific examples of the anode materials include metals such as nickel, platinum, vanadium, chromium, copper, zinc, and gold, or an alloy thereof; metal oxides such as zinc oxide, indium oxide, indium tin oxide (ITO) and indium zinc oxide (IZO); combined metals and oxides, such as ZnO:Al or $SnO_2$:Sb; or a conductive polymer such as poly(3-methylthiophene), poly[3,4-(ethylene-1,2-dioxy)thiophene] (PEDT), polypyrrole, and polyaniline, but are not limited thereto. In one specific embodiment of the present disclosure, ITO/Ag/ITO is selected as the anode.

Optionally, the hole transport layer 321 can include one or more hole transport materials, and the hole transport materials may be selected from a carbazole polymer, carbazole connected triarylamine compounds or other types of compounds, which are not specially limited in the present disclosure. For example, in some embodiments of the present disclosure, the hole transport layer 321 is composed of NPB.

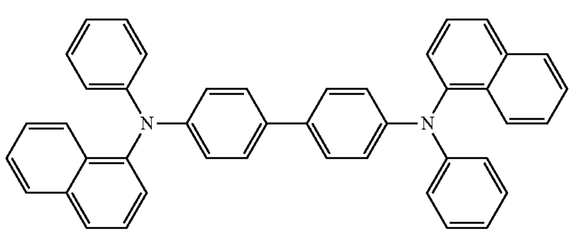

NPB

HT-2

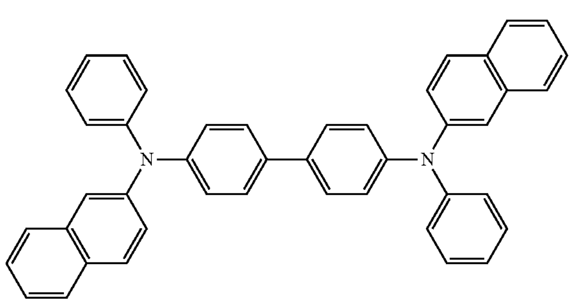

-continued

HT-3

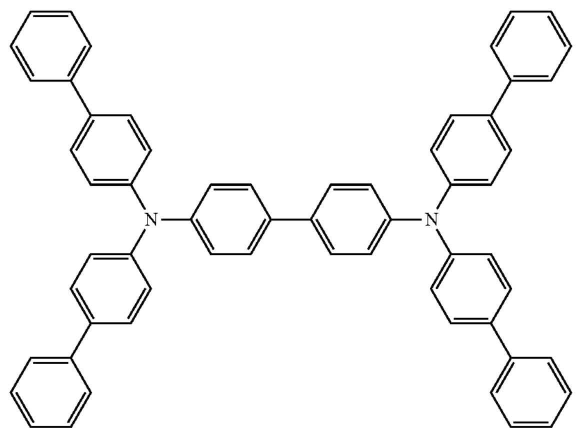

HT-4

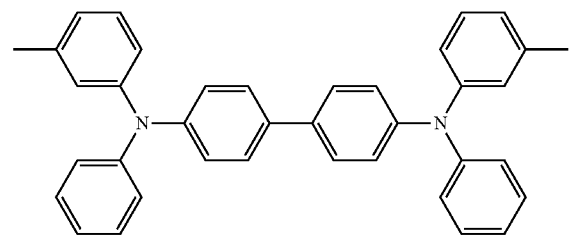

HT-5

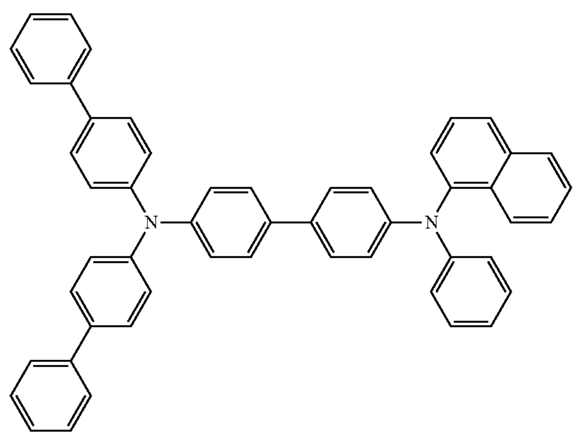

HT-6

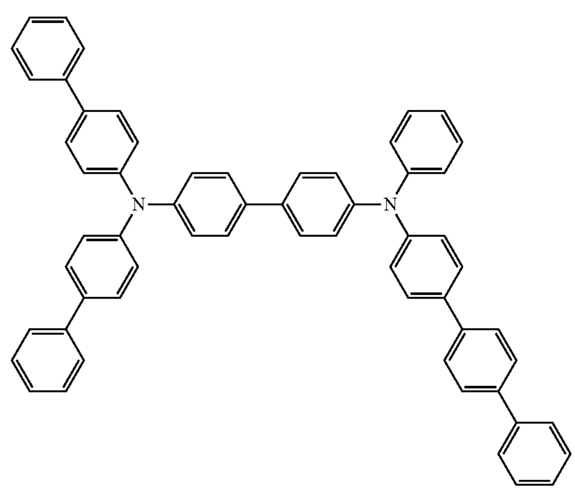

-continued
HT-7
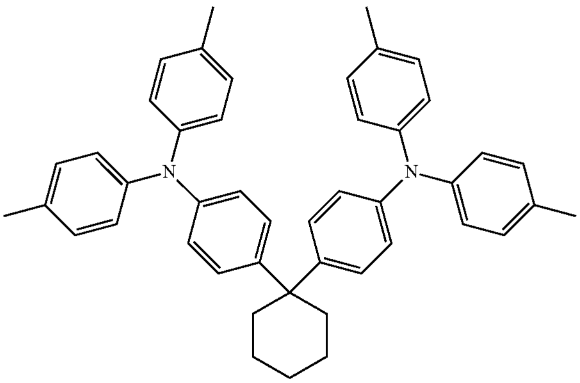
HT-8
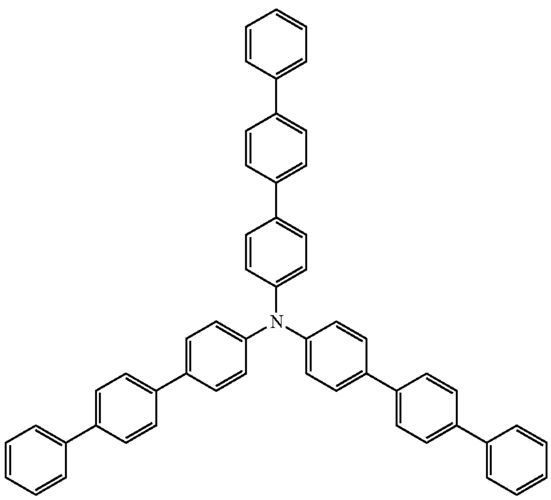
HT-9
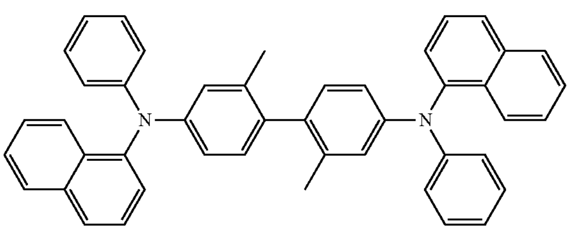
HT-10
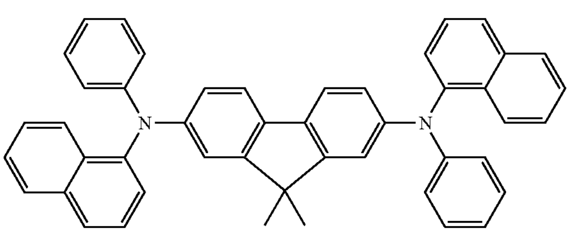
-continued
HT-11
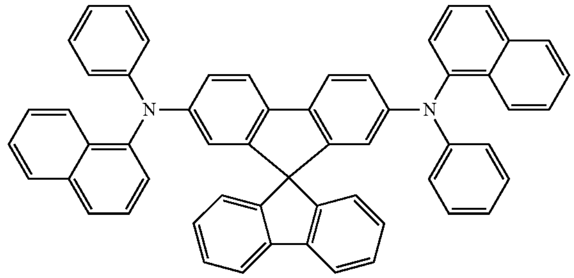
HT-12
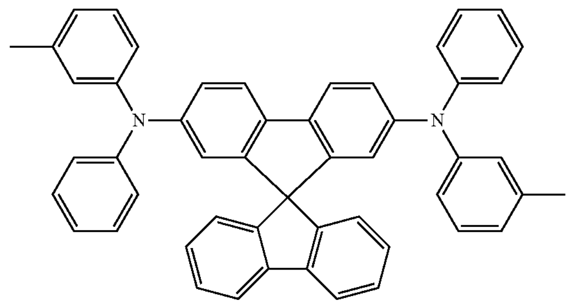
HT-13
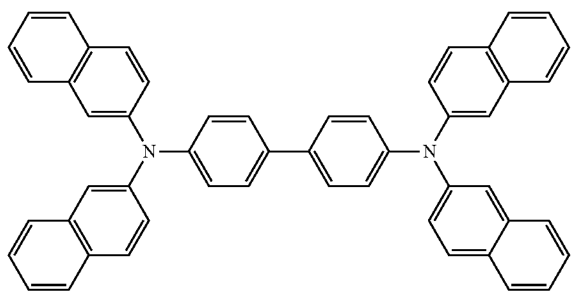
HT-14
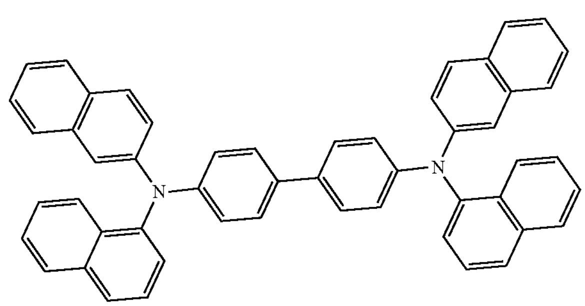

-continued

HT-1

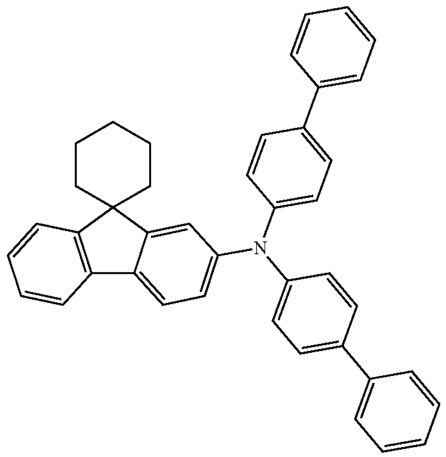

Optionally, the hole auxiliary layer 322 may include one or more hole transport materials, and the hole transport materials may be selected from a carbazole polymer, carbazole connected triarylamine compounds or other types of compounds, which are not specially limited in the present disclosure. For example, in some embodiments of the present disclosure, the hole auxiliary layer 322 is composed of HT-7.

Optionally, the hole injection layer 310 may also be disposed between the anode 100 and the hole transport layer 321 to enhance the ability to inject holes into the first hole transport layer 321. The hole injection layer 310 can be made of a benzidine derivative, a starburst arylamine compound, a phthalocyanine derivative or other materials, which is not specially limited in the present disclosure. A material of the hole injection layer 310 may be selected from, for example, the following compounds or any combination thereof;

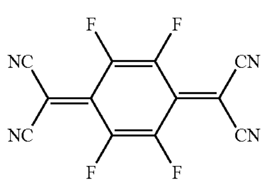

F4-TCNQ

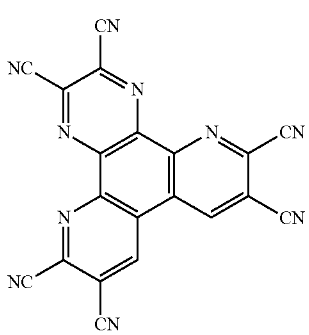

HAT-CN

-continued

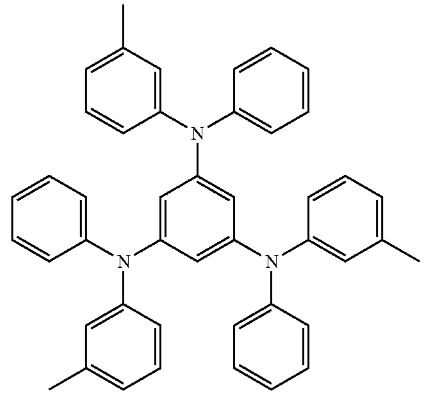

m-MTDATA

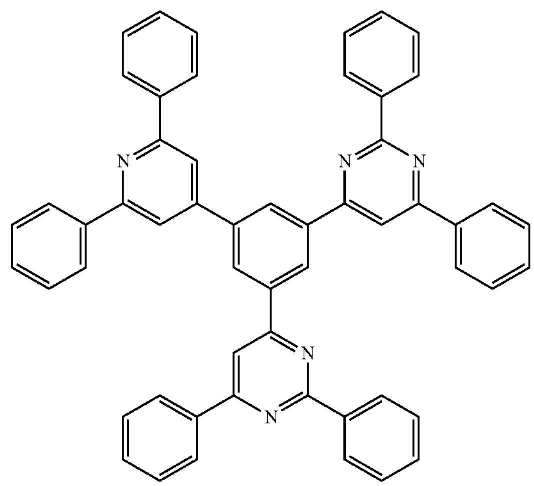

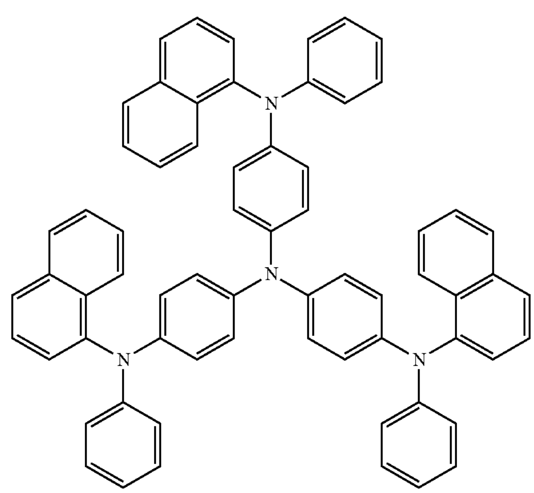

1T-NATA

-continued

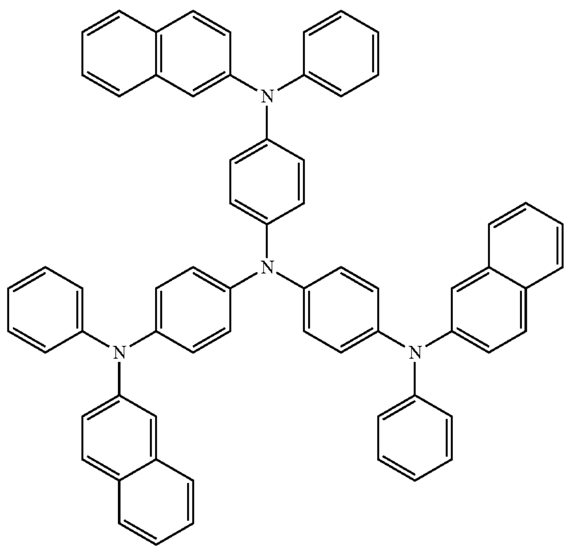

2T-NATA

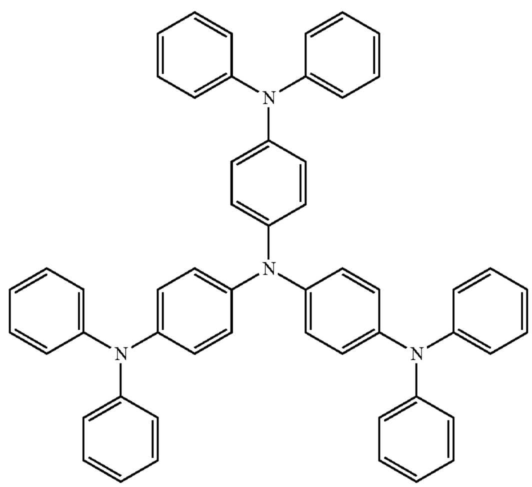

NATA

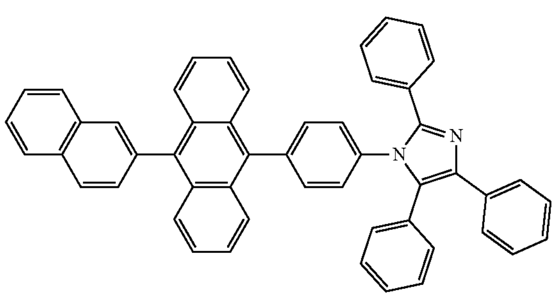

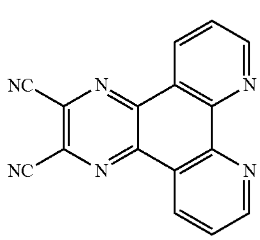

PPDN

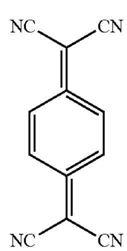

TCNQ

-continued

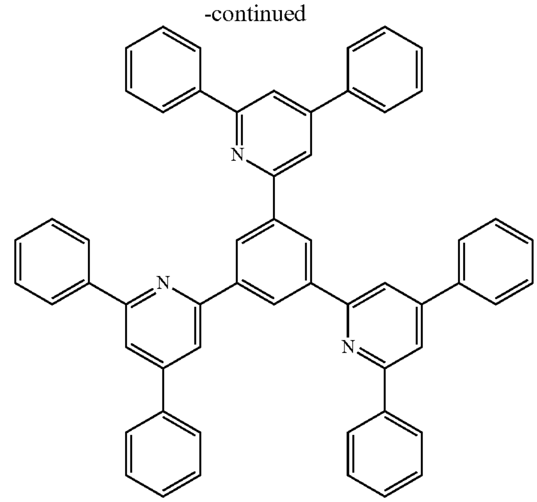

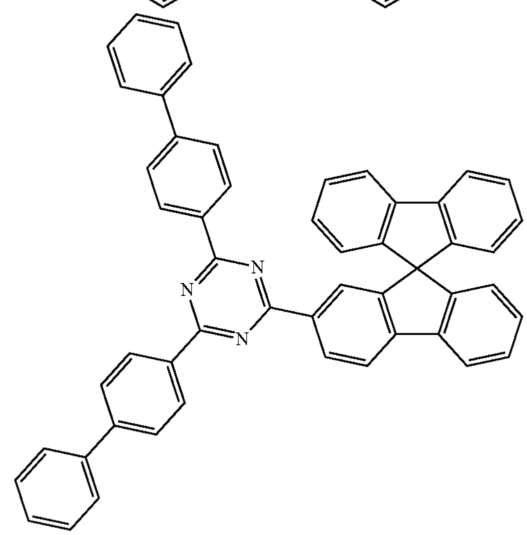

In one embodiment of the present disclosure, the hole injection layer 310 is composed of HAT-CN.

Optionally, the organic luminescent layer 330 may be composed of a single luminescent material, and may also include a host material and a guest material. Optionally, the organic luminescent layer 330 is composed of the host material and the guest material, holes injected into the organic luminescent layer 330 and electrons injected into the organic luminescent layer 330 can be recombined in the organic luminescent layer 330 to form excitons, the excitons transfer energy to the host material, the host material transfers energy to the guest material, and then the guest material can emit light.

The host material of the organic luminescent layer 330 can be a metal chelated compound, a distyryl derivative, an aromatic amine derivative, a dibenzofuran derivative or other types of materials, which is not specially limited in the present disclosure.

The guest material of the organic luminescent layer 330 may be a compound having a condensed aryl ring or a derivative thereof, a compound having a heteroaryl ring or a derivative thereof, an aromatic amine derivative, or other materials, which is not specially limited in the present disclosure. The guest material is also referred to as a dopant material or a dopant. The guest material can be divided into fluorescent dopants and phosphorescent dopants according to luminescence types. For example, specific examples of green phosphorescent dopants include, but are not limited to,
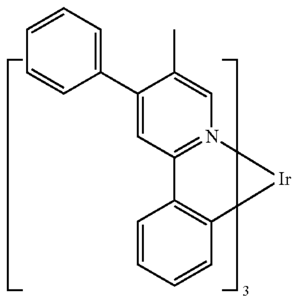
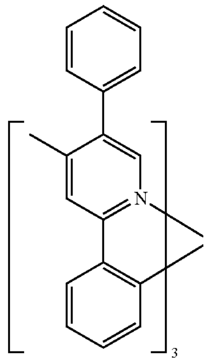
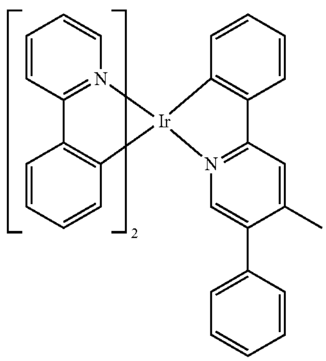
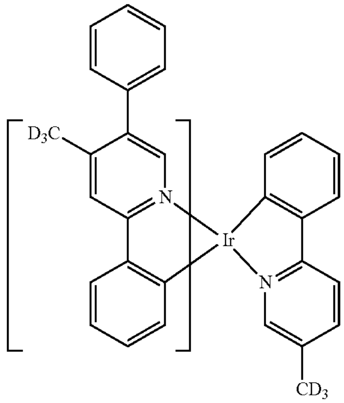
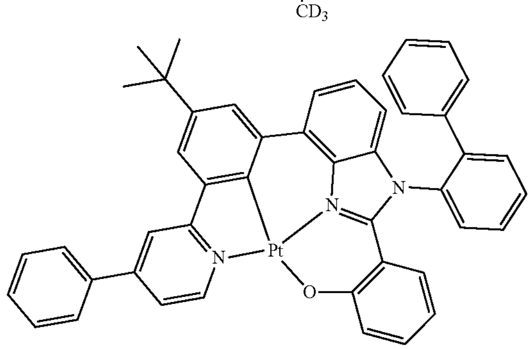
-continued
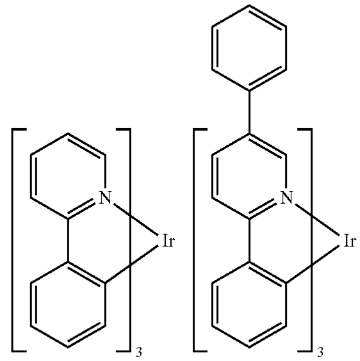
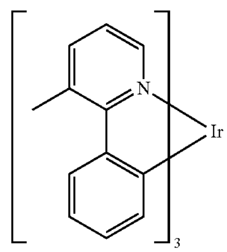
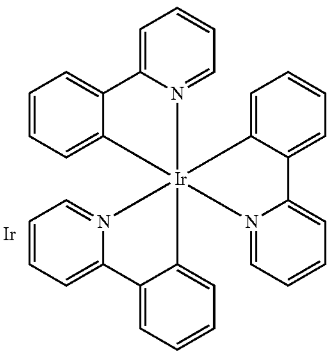
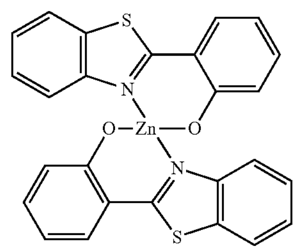
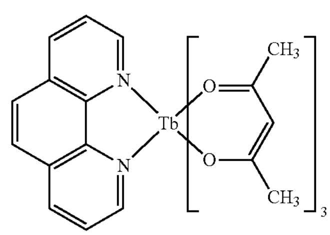
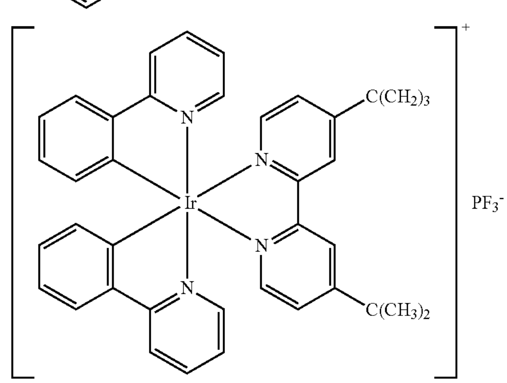

-continued

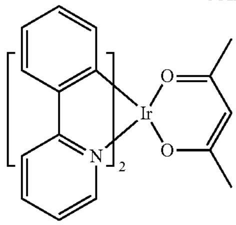

(Ir(ppy)$_2$acac).

In one embodiment of the present disclosure, the organic electroluminescent device is a green organic electroluminescent device, the host material of the organic luminescent layer 330 is the first compound and the second compound, and the guest material is Ir(ppy)$_2$acac.

The electron transport layer 350 can be of a single-layer structure or a multi-layer structure, and can include one or more electron transport materials, and the electron transport materials can be selected from a benzimidazole derivative, an oxadiazole derivative, a quinoxaline derivative or other electron transport materials, which are not specially limited in the present disclosure. For example, in some embodiments of the present disclosure, the electron transport layer 350 may be composed of ET-1 and LiQ. A material of the electron transport layer 350 includes, but is not limited to, the following compounds:

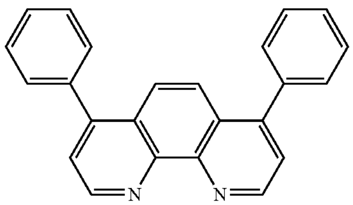

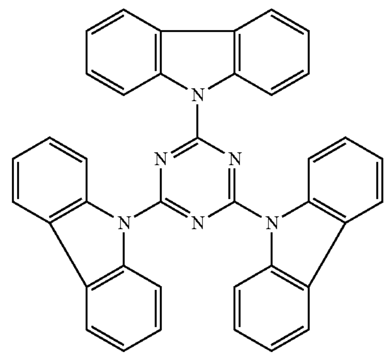

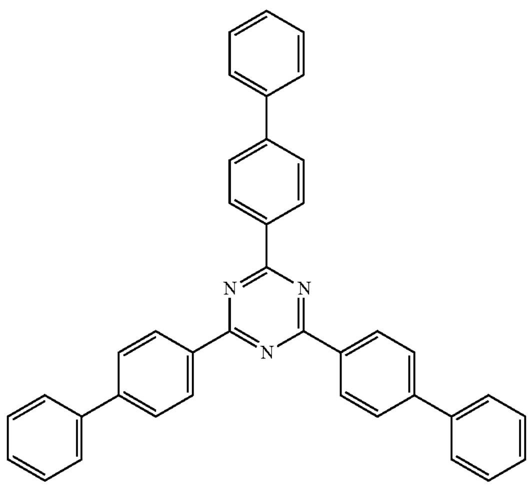

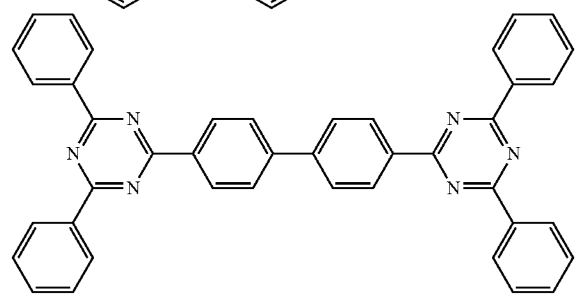

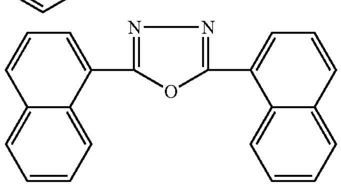

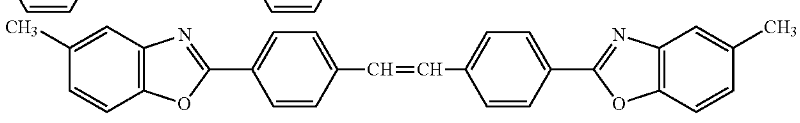

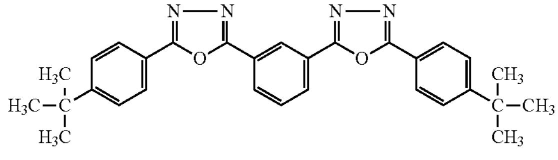

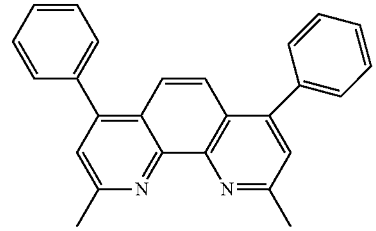

-continued

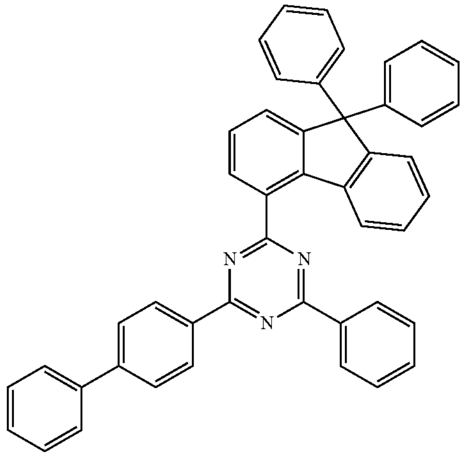

(ET-1)

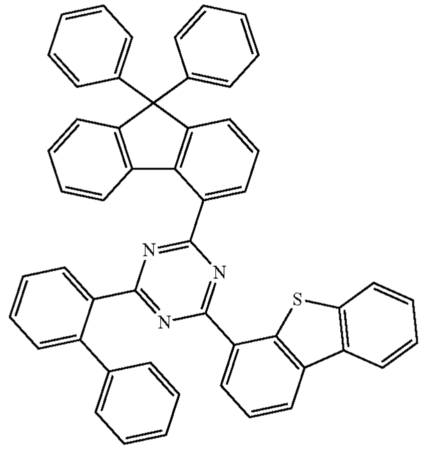

In one embodiment of the present disclosure, the electron transport layer 350 may be composed of ET-1 (having a structure shown above) and LiQ.

Optionally, the hole blocking layer 340 is disposed between the organic luminescent layer 330 and the electron transport layer 350. The hole blocking layer 340 may include one or more hole blocking materials, which are not particularly limited in the present disclosure.

Optionally, the cathode 200 includes the following cathode materials which are materials having a small work function that facilitate electron injection into the organic layer. Specific examples of the cathode materials include metals such as magnesium, calcium, sodium, potassium, titanium, indium, yttrium, lithium, gadolinium, aluminum, silver, tin and lead, or an alloy thereof; or multilayer materials such as LiF/Al, Liq/Al, $LiO_2$/Al, LiF/Ca, LiF/Al, and $BaF_2$/Ca, but are not limited thereto. A metal electrode including silver and magnesium as the cathode is preferably included.

Optionally, the electron injection layer 360 may also be disposed between the cathode 200 and the electron transport layer 350 to enhance the ability to inject electrons into the electron transport layer 350. The electron injection layer 360 may include an inorganic material such as an alkali metal sulfide and an alkali metal halide, or may include a complex of an alkali metal and an organic substance. In some embodiments of the present disclosure, the electron injection layer 360 may include ytterbium (Yb).

The present disclosure also provides an electronic apparatus, including the organic electroluminescent device described in the present disclosure.

Figure 2:
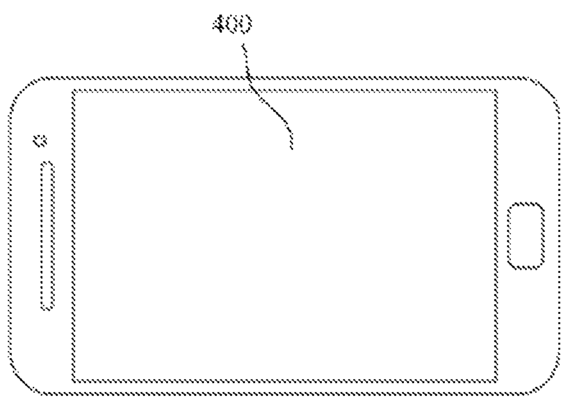
FIG. 2 is a structural schematic diagram of an electronic device according to one embodiment of the present disclosure.

For example, as shown in FIG. 2, the electronic apparatus provided by the present disclosure is a first electronic apparatus 400 including any one of the organic electroluminescent devices described in the above embodiments. The electronic apparatus can be a display apparatus, a lighting device, an optical communication apparatus or other types of electronic apparatus, and may include, for example, but is not limited to, a computer screen, a mobile phone screen, a television, electronic paper, an emergency lighting lamp, an optical module and the like. Since the first electronic apparatus 400 is provided with the above-described organic electroluminescent device, the first electronic apparatus 400 has the same beneficial effects, which will not be repeated here.

The present disclosure will be described in detail with reference to the examples, but the following description is intended to explain the present disclosure and is not intended to limit the scope of the present disclosure in any way.

SYNTHESIS EXAMPLES

Those skilled in the art will recognize that chemical reactions described in the present disclosure may be used to suitably prepare a number of organic compounds of the present disclosure, and that other methods for preparing the compounds of the present disclosure are deemed to be within the scope of the present disclosure. For example, the synthesis of those non-exemplified compounds according to the present disclosure can be successfully accomplished by those skilled in the art by modification methods such as appropriately protecting interfering groups, by utilizing other known reagents other than those described in the present disclosure, or by making some conventional modification of reaction conditions. Compounds of which synthesis methods are not mentioned in the present disclosure are all commercially available raw material products.

Synthesis of Intermediate Sub 1-A1

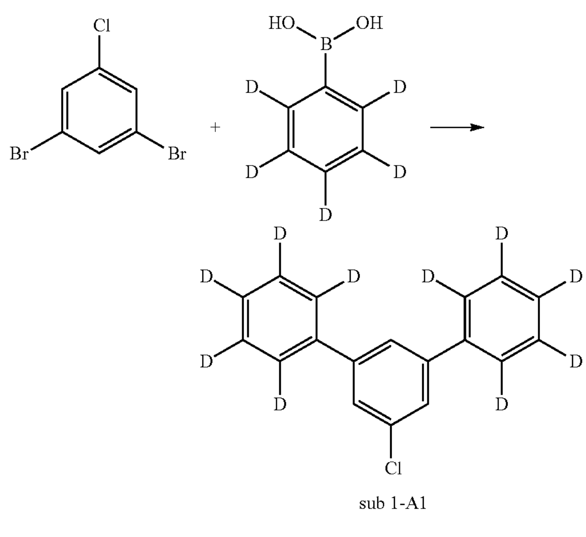

sub 1-A1

1,3-Dibromo-5-chlorobenzene (50.0 g, 184.9 mmol), deuterated phenylboronic acid (51.6 g, 406.8 mmol), tetrakis (triphenylphosphine)palladium (4.2 g, 3.6 mmol), potassium carbonate (76.6 g, 554.8 mmol), tetrabutylammonium bromide (1.1 g, 3.6 mmol), toluene (400 mL), ethanol (200 mL) and deionized water (100 mL) were added to a round bottom flask, and heated to 78° C. with stirring under nitrogen atmosphere, and a reaction was carried out for 18 h; the reaction mixture was cooled to room temperature, and washed with water, an organic phase was separated, and dried over anhydrous magnesium sulfate, filtrated, and the filtrate was concentrated in vacuum to obtain a crude product. A crude product was purified by silica gel column chromatography using n-heptane as an eluent to obtain an intermediate sub 1-A1 (39.6 g, yield: 78%) as a white solid.

Synthesis of Intermediate Sub 1-A2

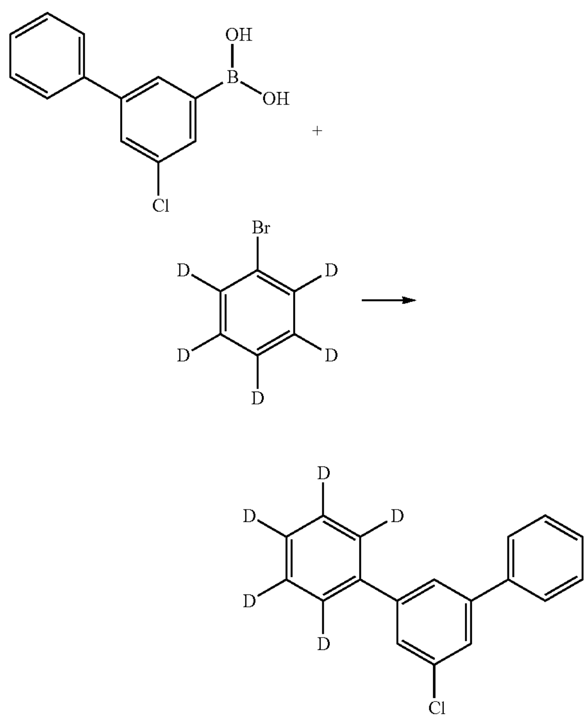

sub 1-A2

(5-Chloro-biphenyl-3-yl)boronic acid (30.0 g, 129.0 mmol), deuterated bromobenzene (23.0 g, 141.9 mmol), tetrakis(triphenylphosphine)palladium (2.9 g, 2.5 mmol), potassium carbonate (53.5 g, 387.2 mmol), tetrabutylammonium bromide (0.8 g, 2.5 mmol), toluene (240 mL), ethanol (120 mL) and deionized water (60 mL) were added to a round bottom flask, and heated to 78° C. with stirring under nitrogen atmosphere, and a reaction was carried out for 16 h; the reaction mixture was cooled to room temperature, and washed with water, an organic phase was separated, and dried over anhydrous magnesium sulfate, filtrated, and the filtrate was concentrated in vacuum to obtain a crude product. A crude product was purified by silica gel column chromatography using n-heptane as an eluent to obtain an intermediate sub 1-A2 (21.5 g, yield: 62%) as a white solid.

Synthesis of Intermediate Sub 1-A3

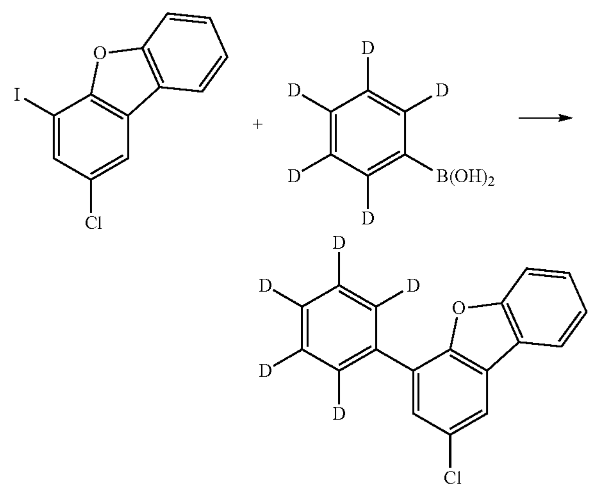

sub 1-A3

2-Chloro-4-iododibenzofuran (35.0 g, 106.5 mmol), deuterated phenylboronic acid (14.8 g, 117.1 mmol), tetrakis (triphenylphosphine)palladium (2.4 g, 2.1 mmol), potassium carbonate (32.3 g, 234.3 mmol), tetrabutylammonium bromide (0.6 g, 2.1 mmol), toluene (280 mL), water (140 mL), and ethanol (70 mL) were added to a round bottom flask, and a reaction was carried out under stirring at 78° C. for 4 h under nitrogen atmosphere; after cooling to room temperature, the resulting reaction solution was subjected to extraction and liquid separation for three times by using toluene and water, an organic phase was dried over anhydrous magnesium sulfate, filtrated, and the filtrate was concentrated in vacuum to obtain a crude product; and the crude product was purified by silica gel column chromatography using dichloromethane/n-heptane as an eluent to obtain an intermediate sub 1-A3 (22.6 g, yield: 75%) as a white solid compound.

Synthesis of Intermediate Sub 1-I-A4

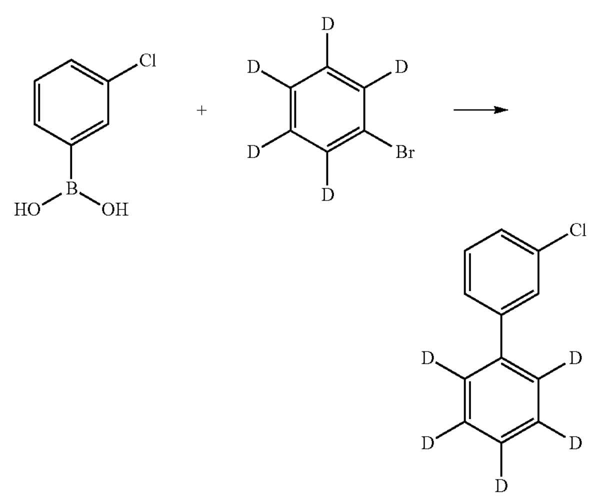

sub 1-I-A4 m-Chlorobenzeneboronic acid (42.4 g, 271.5 mmol), deuterated bromobenzene (40.0 g, 246.8 mmol), tetrakis(triphenylphosphine)palladium (2.8 g, 2.4 mmol), potassium carbonate (68.2 g, 493.7 mmol), tetrabutylammonium bromide (1.5 g, 4.9 mmol), toluene (320 mL), water (160 mL), and ethanol (80 mL) were added to a round bottom flask, and a reaction was carried out under stirring at 78° C. for 12 h under nitrogen atmosphere; after cooling to room temperature, the resulting reaction solution was subjected to extraction and liquid separation for three times by using toluene and water, an organic phase was dried over anhydrous magnesium sulfate, filtrated, and the filtrate was concentrated in vacuum to obtain a crude product; and the crude product was purified by silica gel column chromatography using n-heptane as an eluent to obtain an intermediate sub 1-I-A4 (37.2 g, yield: 78%) as white solid compound.

Synthesis of Intermediate Sub 1-II-A4

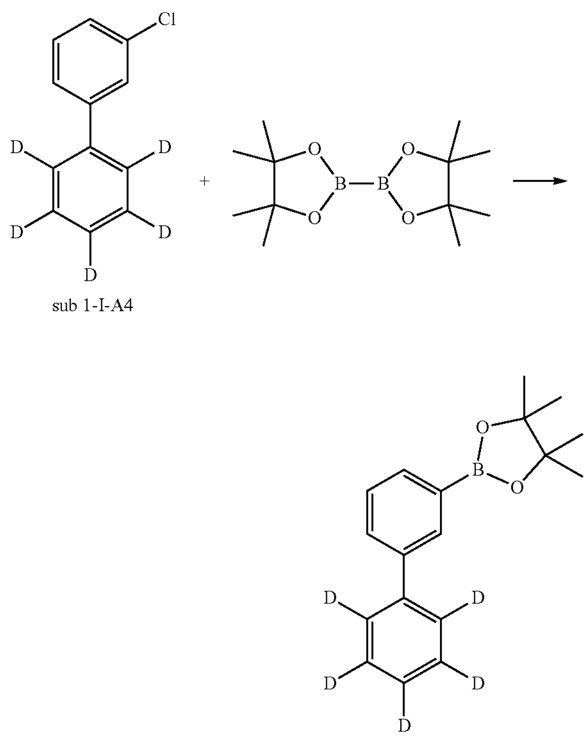

sub 1-I-A4 sub 1-II-A4

Sub 1-I-A4 (35.0 g, 180.7 mmol), bis(pinacolato)diboron (55.0 g, 216.8 mmol), Pd(dppf)$Cl_2$ (1.3 g, 1.8 mmol), and KOAc (35.4 g, 361.4 mmol), were added into 1,4-dioxane (350 mL), and a reaction was carried out under reflux at 100° C. for 12 h. When the reaction was completed, extraction was performed by using dichloromethane and water. An organic layer was dried over $MgSO_4$, filtrated, and the filtrate was concentrated in vacuum to obtain a crude product, and the crude product was purified by silica gel column chromatography using dichloromethane and n-heptane as an eluent to obtain a white solid compound, and the white solid compound was continued to be purified by recrystallization using dichloromethane and n-heptane to obtain a compound sub 1-II-A4 (39.6 g, yield: 77%).

Synthesis of Intermediate Sub 1-A4

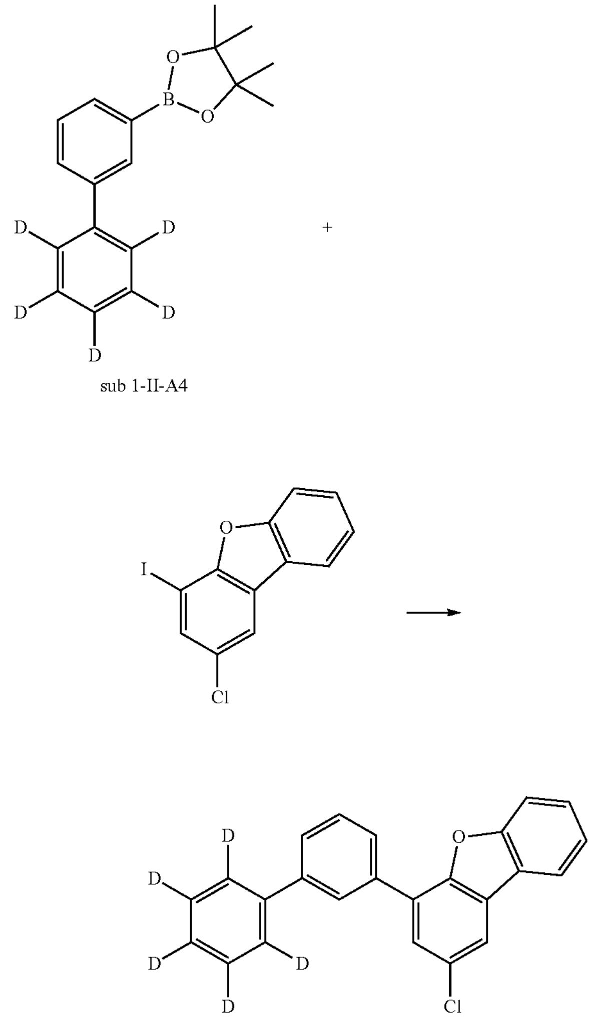

sub 1-II-A4 sub 1-A4

Sub 1-II-A4 (19.1 g, 66.9 mmol), 2-chloro-4-iododibenzofuran (20.0 g, 60.8 mmol), tetrakis(triphenylphosphine) palladium (0.7 g, 0.6 mmol), potassium carbonate (16.8 g, 121.7 mmol), tetrabutylammonium bromide (0.2 g, 0.6 mmol), toluene (160 mL), water (80 mL), and ethanol (40 mL) were added to a round bottom flask, and a reaction was carried out under stirring at 78° C. for 6 h under nitrogen atmosphere; after cooling to room temperature, the resulting reaction solution was subjected to extraction and liquid separation for three times by using toluene and water, an organic phase was dried over anhydrous magnesium sulfate, filtrated, and the filtrate was concentrated in vacuum to obtain a crude product; and the crude product was purified by silica gel column chromatography using dichloromethane/n-heptane as an eluent to obtain an intermediate sub 1-A4 (15.7 g, yield: 72%) as a white solid compound.

With reference to the synthesis method for the intermediate sub 1-A4, intermediates sub 1-AX shown in Table 1 below were synthesized by using a reactant A in Table 1 below instead of m-chlorobenzeneboronic acid and a reactant B in Table 1 below instead of 2-chloro-4-iododibenzofuran.

TABLE 1
| Intermediate sub 1-AX | Reactant A | Reactant B | Structure | Yield (%) |
|---|---|---|---|---|
| sub 1-A5 | 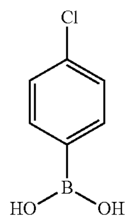 | 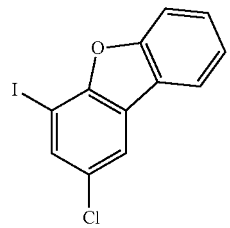 [SMILES: Clc1cc(I)c2oc3ccccc3c2c1] | 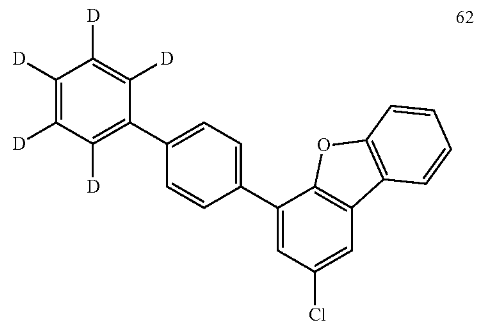 | 62 |
| sub 1-A6 | 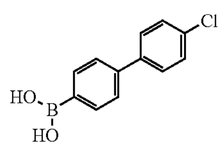 [SMILES: OB(O)c1ccc(-c2ccc(Cl)cc2)cc1] | 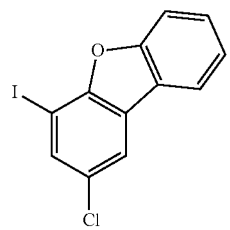 [SMILES: Clc1cc(I)c2oc3ccccc3c2c1] | 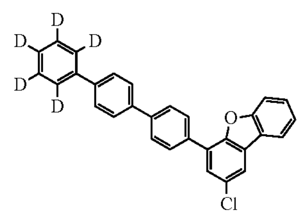 [SMILES: [2H]c1c([2H])c([2H])c(-c2ccc(-c3ccc(-c4cc(Cl)cc5c4oc4ccccc45)cc3)cc2)c([2H])c1[2H]] | 68 |
| sub 1-A7 | 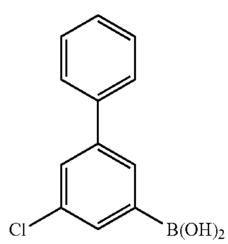 [SMILES: OB(O)c1cc(Cl)cc(-c2ccccc2)c1] | 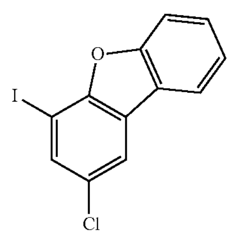 [SMILES: Clc1cc(I)c2oc3ccccc3c2c1] | 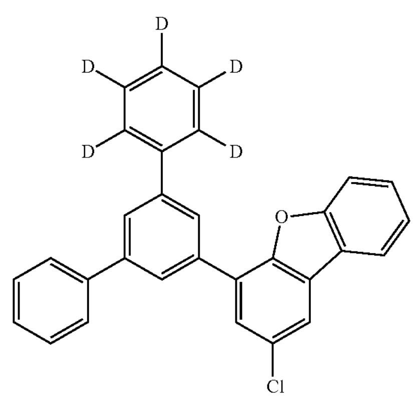 [SMILES: [2H]c1c([2H])c([2H])c(-c2cc(-c3ccccc3)cc(-c3cc(Cl)cc4c3oc3ccccc34)c2)c([2H])c1[2H]] | 71 |
| sub 1-A8 | 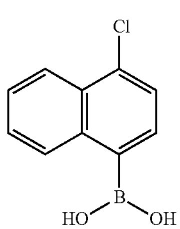 [SMILES: OB(O)c1ccc(Cl)c2ccccc12] | 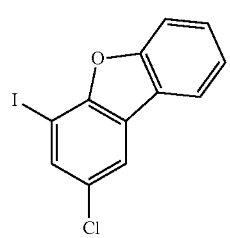 [SMILES: Clc1cc(I)c2oc3ccccc3c2c1] | 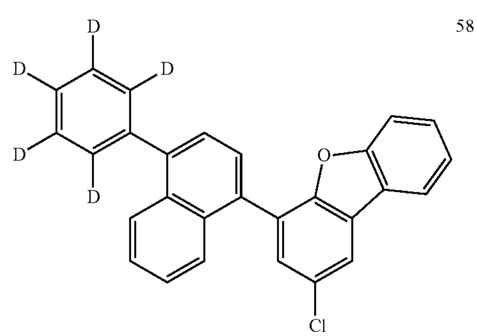 | 58 |

TABLE 1-continued
| Intermediate sub 1-AX | Reactant A | Reactant B | Structure | Yield (%) |
|---|---|---|---|---|
| sub 1-A10 | 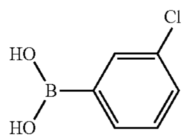 | 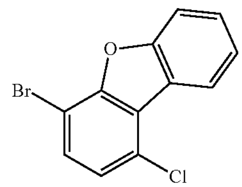 [SMILES: Clc1ccc(Br)c2oc3ccccc3c12] | 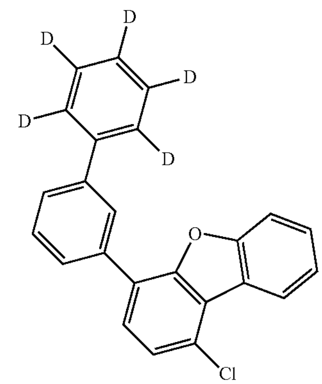 [SMILES: [2H]c1c([2H])c([2H])c(-c2cccc(-c3ccc(Cl)c4c3oc3ccccc34)c2)c([2H])c1[2H]] | 67 |
| sub 1-A11 | 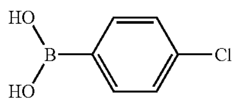 | 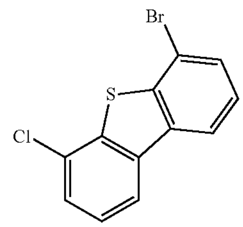 [SMILES: Clc1cccc2c1sc1c(Br)cccc12] | 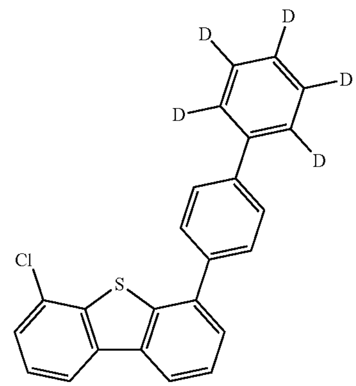 [SMILES: [2H]c1c([2H])c([2H])c(-c2ccc(-c3cccc4c3sc3c(Cl)cccc34)cc2)c([2H])c1[2H]] | 52 |
| sub 1-A12 | 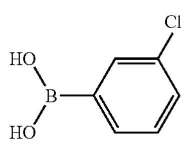 | 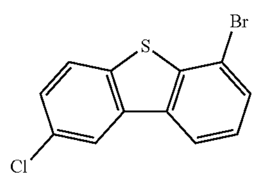 [SMILES: Clc1ccc2sc3c(Br)cccc3c2c1] | 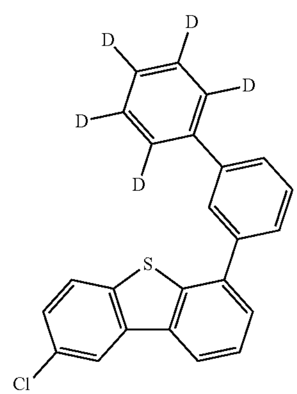 [SMILES: [2H]c1c([2H])c([2H])c(-c2cccc(-c3cccc4c3sc3ccc(Cl)cc34)c2)c([2H])c1[2H]] | 50 |
Synthesis of Intermediate Sub A-1
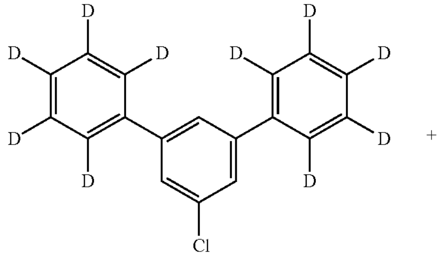
sub 1-A1
-continued
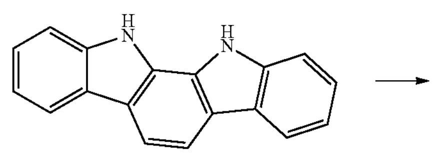

-continued

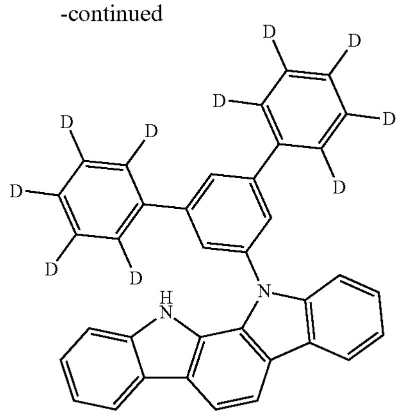

sub A-1

Sub 1-A1 (35.0 g, 127.3 mmol), indolo[2,3-A]carbazole (39.1 g, 152.8 mmol), tris(dibenzylideneacetone)dipalladium (2.3 g, 2.5 mmol), X-Phos (2.4 g, 5.0 mmol), sodium tert-butoxide (30.5 g, 318.4 mmol) and xylene (800 mL) were added to a round bottom flask, and a reaction was carried out under stirring at 140° C. for 5 h under nitrogen atmospherenitrogen atmosphere; after cooling to room temperature, the resulting reaction solution was subjected to extraction and liquid separation for three times by using toluene and water, an organic phase was dried over anhydrous magnesium sulfate, filtrated, and the filtrate was concentrated in vacuum to obtain a crude product; and the crude product was purified by silica gel column chromatography using dichloromethane/n-heptane as an eluent to obtain a yellow solid product sub A-1 (47.2 g, yield: 75%).

With reference to the synthesis method for the intermediate sub A-1, intermediates sub A-X shown in the table below were synthesized by using the intermediate sub 1-AX in Table 2 below instead of the intermediate sub 1-A1 and a reactant C in Table 2 below instead of indolo[2,3-A] carbazole.

TABLE 2

| Intermediate sub A-X | sub 1-AX | Reactant C | Structure | Yield (%) |
|---|---|---|---|---|
| sub A-2 | 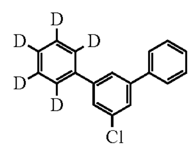 [SMILES: [2H]c1c([2H])c([2H])c(-c2cc(Cl)cc(-c3ccccc3)c2)c([2H])c1[2H]] | 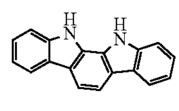 [SMILES: c1ccc2c(c1)[nH]c1c2ccc2c3ccccc3[nH]c21] | 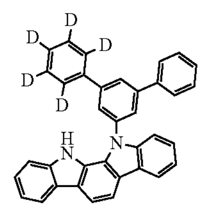 [SMILES: [2H]c1c([2H])c([2H])c(-c2cc(-c3ccccc3)cc(-n3c4ccccc4c4ccc5c6ccccc6[nH]c5c43)c2)c([2H])c1[2H]] | 66 |
| sub A-3 | 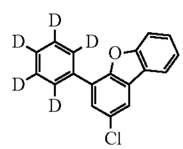 [SMILES: [2H]c1c([2H])c([2H])c(-c2cc(Cl)cc3c2oc2ccccc23)c([2H])c1[2H]] | 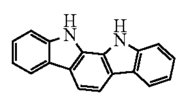 [SMILES: c1ccc2c(c1)[nH]c1c2ccc2c3ccccc3[nH]c21] | 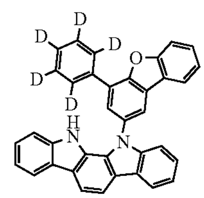 [SMILES: [2H]c1c([2H])c([2H])c(-c2cc(-n3c4ccccc4c4ccc5c6ccccc6[nH]c5c43)cc3c2oc2ccccc23)c([2H])c1[2H]] | 71 |
| sub A-4 | 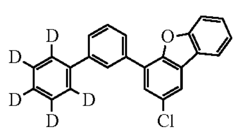 [SMILES: [2H]c1c([2H])c([2H])c(-c2cccc(-c3cc(Cl)cc4c3oc3ccccc34)c2)c([2H])c1[2H]] | 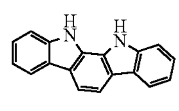 [SMILES: c1ccc2c(c1)[nH]c1c2ccc2c3ccccc3[nH]c21] | 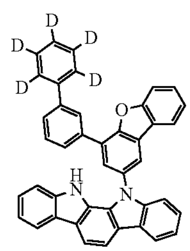 [SMILES: [2H]c1c([2H])c([2H])c(-c2cccc(-c3cc(-n4c5ccccc5c5ccc6c7ccccc7[nH]c6c54)cc4c3oc3ccccc34)c2)c([2H])c1[2H]] | 65 |
| sub A-5 | 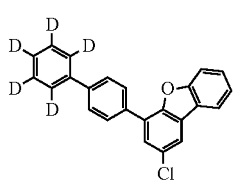 [SMILES: [2H]c1c([2H])c([2H])c(-c2ccc(-c3cc(Cl)cc4c3oc3ccccc34)cc2)c([2H])c1[2H]] | 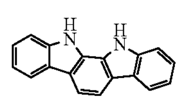 [SMILES: c1ccc2c(c1)[nH]c1c2ccc2c3ccccc3[nH]c21] | 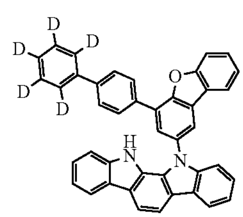 [SMILES: [2H]c1c([2H])c([2H])c(-c2ccc(-c3cc(-n4c5ccccc5c5ccc6c7ccccc7[nH]c6c54)cc4c3oc3ccccc34)cc2)c([2H])c1[2H]] | 69 |

TABLE 2-continued
| Intermediate sub A-X | sub 1-AX | Reactant C | Structure | Yield (%) |
|---|---|---|---|---|
| sub A-6 | 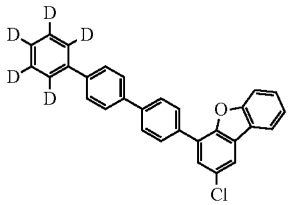 [SMILES: [2H]c1c([2H])c([2H])c(-c2ccc(-c3ccc(-c4cc(Cl)cc5c4oc4ccccc45)cc3)cc2)c([2H])c1[2H]] | 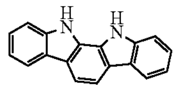 | 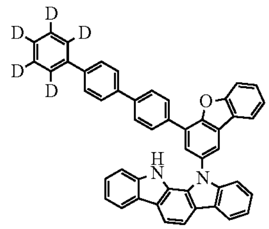 [SMILES: [2H]c1c([2H])c([2H])c(-c2ccc(-c3ccc(-c4cc(-n5c6ccccc6c6ccc7c8ccccc8[nH]c7c65)cc5c4oc4ccccc45)cc3)cc2)c([2H])c1[2H]] | 64 |
| sub A-7 | 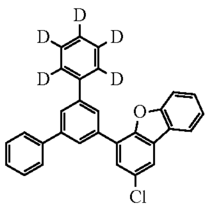 [SMILES: [2H]c1c([2H])c([2H])c(-c2cc(-c3ccccc3)cc(-c3cc(Cl)cc4c3oc3ccccc34)c2)c([2H])c1[2H]] | 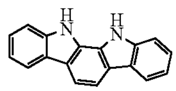 | 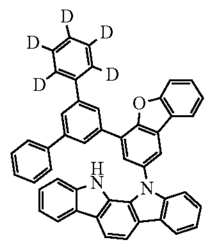 [SMILES: [2H]c1c([2H])c([2H])c(-c2cc(-c3ccccc3)cc(-c3cc(-n4c5ccccc5c5ccc6c7ccccc7[nH]c6c54)cc4c3oc3ccccc34)c2)c([2H])c1[2H]] | 54 |
| sub A-8 | 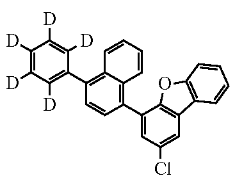 [SMILES: [2H]c1c([2H])c([2H])c(-c2ccc(-c3cc(Cl)cc4c3oc3ccccc34)c3ccccc23)c([2H])c1[2H]] | 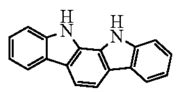 [SMILES: c1ccc2c(c1)[nH]c1c2ccc2c3ccccc3[nH]c21] | 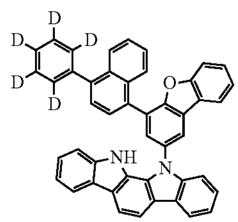 [SMILES: [2H]c1c([2H])c([2H])c(-c2ccc(-c3cc(-n4c5ccccc5c5ccc6c7ccccc7[nH]c6c54)cc4c3oc3ccccc34)c3ccccc23)c([2H])c1[2H]] | 49 |
| sub A-10 | 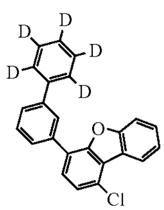 [SMILES: [2H]c1c([2H])c([2H])c(-c2cccc(-c3ccc(Cl)c4c3oc3ccccc34)c2)c([2H])c1[2H]] | 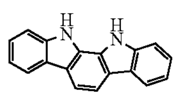 | 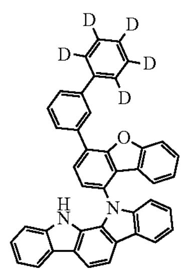 [SMILES: [2H]c1c([2H])c([2H])c(-c2cccc(-c3ccc(-n4c5ccccc5c5ccc6c7ccccc7[nH]c6c54)c4c3oc3ccccc34)c2)c([2H])c1[2H]] | 60 |
| sub A-11 | 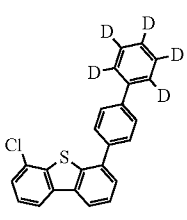 [SMILES: [2H]c1c([2H])c([2H])c(-c2ccc(-c3cccc4c3sc3c(Cl)cccc34)cc2)c([2H])c1[2H]] | 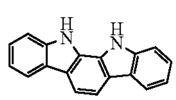 | 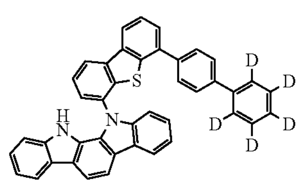 [SMILES: [2H]c1c([2H])c([2H])c(-c2ccc(-c3cccc4c3sc3c(-n5c6ccccc6c6ccc7c8ccccc8[nH]c7c65)cccc34)cc2)c([2H])c1[2H]] | 55 |
| sub A-12 | 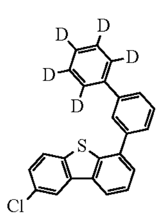 [SMILES: [2H]c1c([2H])c([2H])c(-c2cccc(-c3cccc4c3sc3ccc(Cl)cc34)c2)c([2H])c1[2H]] | 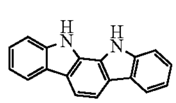 [SMILES: c1ccc2c(c1)[nH]c1c2ccc2c3ccccc3[nH]c21] | 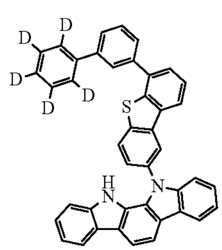 [SMILES: [2H]c1c([2H])c([2H])c(-c2cccc(-c3cccc4c3sc3ccc(-n5c6ccccc6c6ccc7c8ccccc8[nH]c7c65)cc34)c2)c([2H])c1[2H]] | 53 |

Synthesis of Compound A38

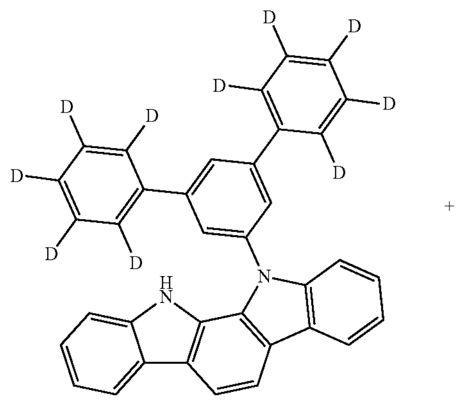

sub A-1

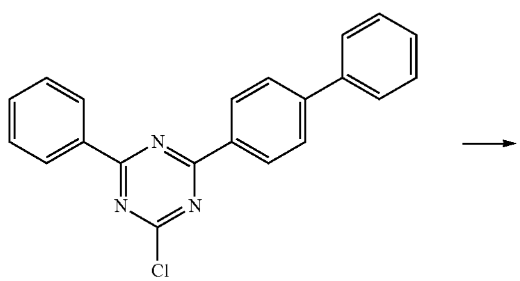

-continued

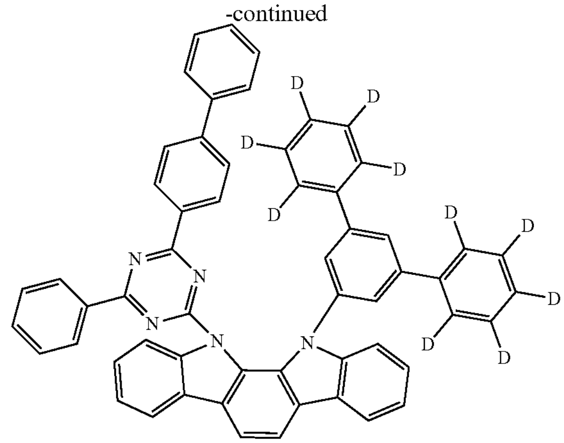

A38

The intermediate sub A-1 (6.0 g, 12.1 mmol), a reactant 2-(4-biphenyl)-4-chloro-6-phenyl-1,3,5-triazine (6.2 g, 18.1 mmol), and N,N-dimethylformamide (DMF) (90 mL) were added to a round bottom flask, the system temperature was lowered to −5° C. under nitrogen atmosphere, 60% sodium hydride (0.6 g, 14.5 mmol) was then added, and a reaction was continued to be carried out at room temperature for 12 h; after the reaction was completed, a yellow solid was precipitated, and the product was washed well with water, and drip washed with a small amount of ethanol to take away the water to obtain a crude product; and the crude product was purified by recrystallization using dichloromethane/n-heptane to obtain a compound A38 (6.5 g, yield: 67%).

With reference to the synthesis method for the compound 38, compounds shown in Table 3 below were synthesized by using a reactant D in Table 3 below instead of the intermediate sub A-1 and a reactant E in Table 3 below instead of 2-(4-biphenyl)-4-chloro-6-phenyl-1,3,5-triazine.

TABLE 3
| Compound No. | Reactant D | Reactant E | Structure | Yield (%) |
| --- | --- | --- | --- | --- |
| A2 | 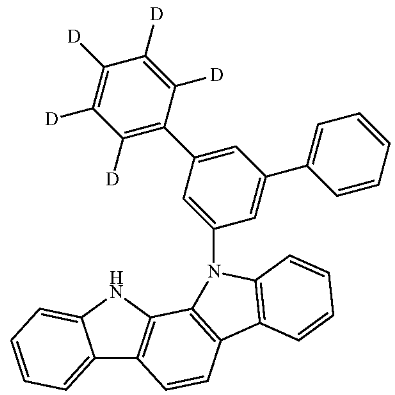 [SMILES: [2H]c1c([2H])c([2H])c(-c2cc(-c3ccccc3)cc(-n3c4ccccc4c4ccc5c6ccccc6[nH]c5c43)c2)c([2H])c1[2H]] | 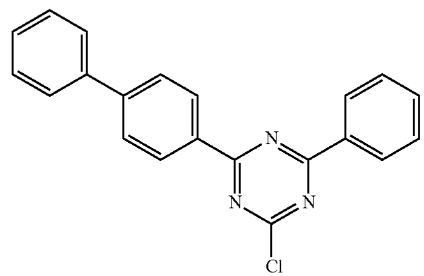 [SMILES: Clc1nc(-c2ccccc2)nc(-c2ccc(-c3ccccc3)cc2)n1] | 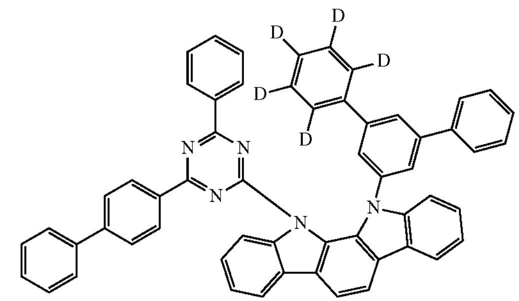 [SMILES: [2H]c1c([2H])c([2H])c(-c2cc(-c3ccccc3)cc(-n3c4ccccc4c4ccc5c6ccccc6n(-c6nc(-c7ccccc7)nc(-c7ccc(-c8ccccc8)cc7)n6)c5c43)c2)c([2H])c1[2H]] | 72 |
| A5 | 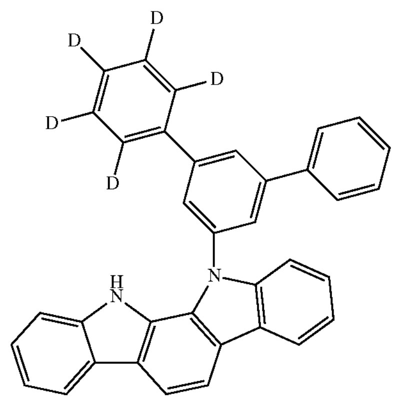 [SMILES: [2H]c1c([2H])c([2H])c(-c2cc(-c3ccccc3)cc(-n3c4ccccc4c4ccc5c6ccccc6[nH]c5c43)c2)c([2H])c1[2H]] | 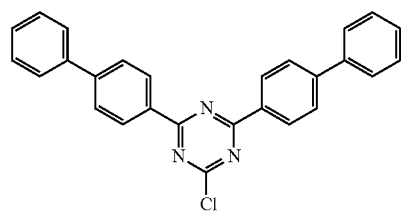 [SMILES: Clc1nc(-c2ccc(-c3ccccc3)cc2)nc(-c2ccc(-c3ccccc3)cc2)n1] | 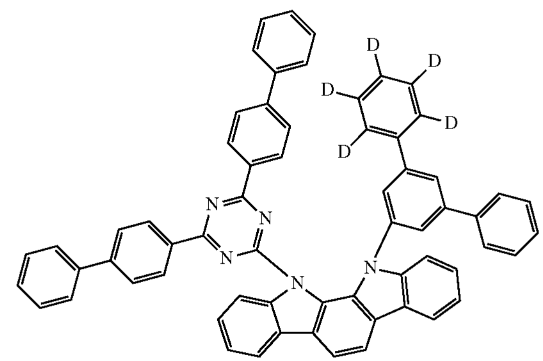 [SMILES: [2H]c1c([2H])c([2H])c(-c2cc(-c3ccccc3)cc(-n3c4ccccc4c4ccc5c6ccccc6n(-c6nc(-c7ccc(-c8ccccc8)cc7)nc(-c7ccc(-c8ccccc8)cc7)n6)c5c43)c2)c([2H])c1[2H]] | 68 |

TABLE 3-continued
| Compound No. | Reactant D | Reactant E | Structure | Yield (%) |
|---|---|---|---|---|
| A6 | 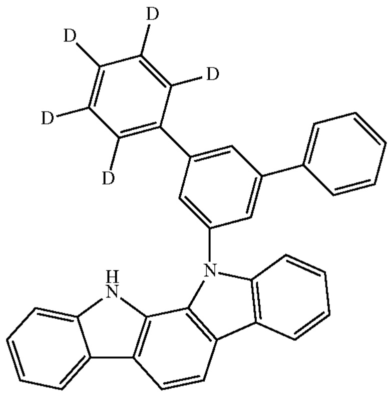 [SMILES: [2H]c1c([2H])c([2H])c(-c2cc(-c3ccccc3)cc(-n3c4ccccc4c4ccc5c6ccccc6[nH]c5c43)c2)c([2H])c1[2H]] | 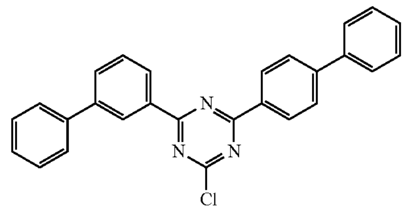 [SMILES: Clc1nc(-c2ccc(-c3ccccc3)cc2)nc(-c2cccc(-c3ccccc3)c2)n1] | 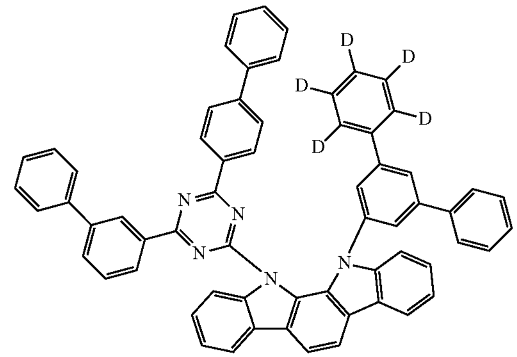 [SMILES: [2H]c1c([2H])c([2H])c(-c2cc(-c3ccccc3)cc(-n3c4ccccc4c4ccc5c6ccccc6n(-c6nc(-c7ccc(-c8ccccc8)cc7)nc(-c7cccc(-c8ccccc8)c7)n6)c5c43)c2)c([2H])c1[2H]] | 75 |
| A10 | 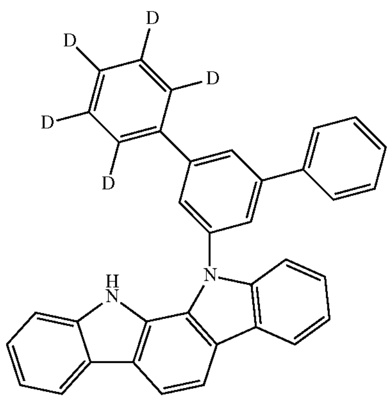 [SMILES: [2H]c1c([2H])c([2H])c(-c2cc(-c3ccccc3)cc(-n3c4ccccc4c4ccc5c6ccccc6[nH]c5c43)c2)c([2H])c1[2H]] | 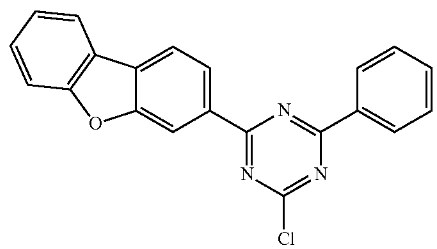 [SMILES: Clc1nc(-c2ccccc2)nc(-c2ccc3c(c2)oc2ccccc23)n1] | 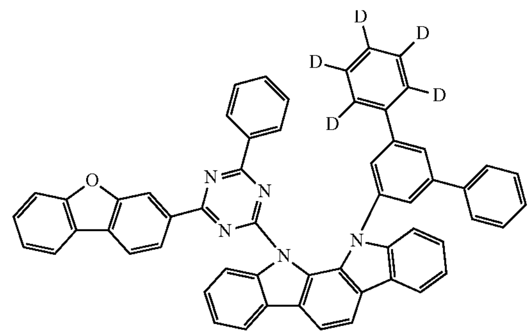 [SMILES: [2H]c1c([2H])c([2H])c(-c2cc(-c3ccccc3)cc(-n3c4ccccc4c4ccc5c6ccccc6n(-c6nc(-c7ccccc7)nc(-c7ccc8c(c7)oc7ccccc78)n6)c5c43)c2)c([2H])c1[2H]] | 81 |

TABLE 3-continued
| Compound No. | Reactant D | Reactant E | Structure | Yield (%) |
|---|---|---|---|---|
| A36 | 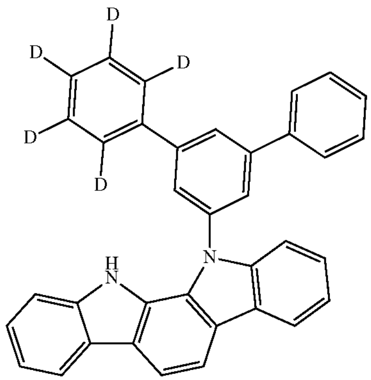 [SMILES: [2H]c1c([2H])c([2H])c(-c2cc(-c3ccccc3)cc(-n3c4ccccc4c4ccc5c6ccccc6[nH]c5c43)c2)c([2H])c1[2H]] | 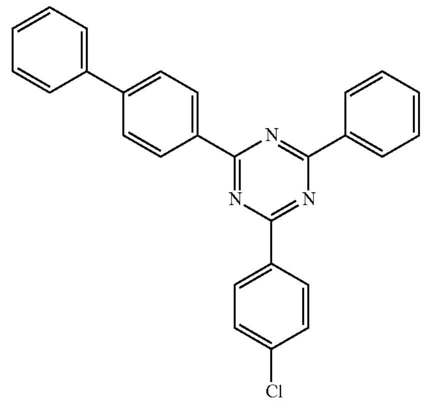 [SMILES: Clc1ccc(-c2nc(-c3ccccc3)nc(-c3ccc(-c4ccccc4)cc3)n2)cc1] | 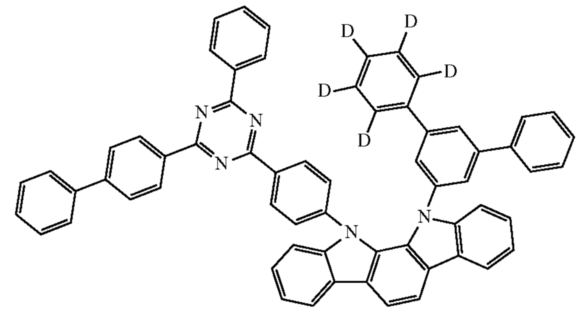 [SMILES: [2H]c1c([2H])c([2H])c(-c2cc(-c3ccccc3)cc(-n3c4ccccc4c4ccc5c6ccccc6n(-c6ccc(-c7nc(-c8ccccc8)nc(-c8ccc(-c9ccccc9)cc8)n7)cc6)c5c43)c2)c([2H])c1[2H]] | 56 |
| A35 | 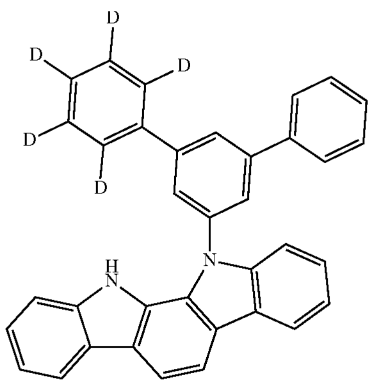 [SMILES: [2H]c1c([2H])c([2H])c(-c2cc(-c3ccccc3)cc(-n3c4ccccc4c4ccc5c6ccccc6[nH]c5c43)c2)c([2H])c1[2H]] | 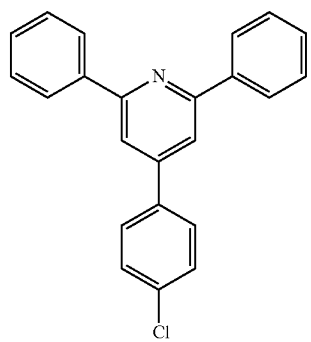 [SMILES: Clc1ccc(-c2cc(-c3ccccc3)nc(-c3ccccc3)c2)cc1] | 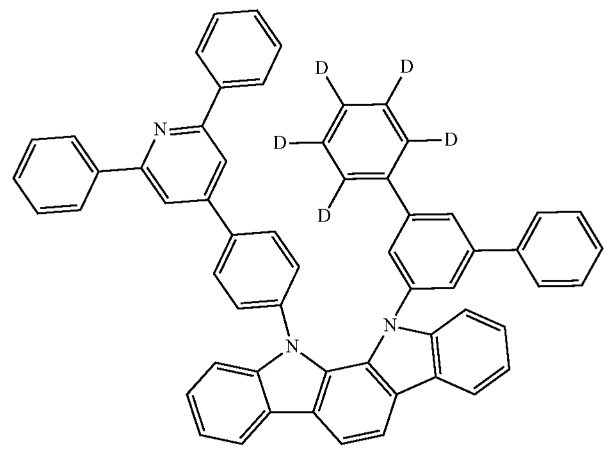 [SMILES: [2H]c1c([2H])c([2H])c(-c2cc(-c3ccccc3)cc(-n3c4ccccc4c4ccc5c6ccccc6n(-c6ccc(-c7cc(-c8ccccc8)nc(-c8ccccc8)c7)cc6)c5c43)c2)c([2H])c1[2H]] | 51 |

TABLE 3-continued
| Compound No. | Reactant D | Reactant E | Structure | Yield (%) |
| --- | --- | --- | --- | --- |
| A39 | 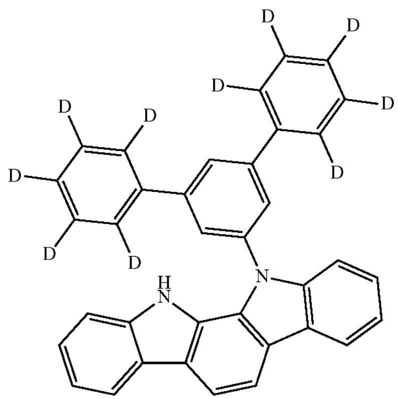 [SMILES: [2H]c1c([2H])c([2H])c(-c2cc(-c3c([2H])c([2H])c([2H])c([2H])c3[2H])cc(-n3c4ccccc4c4ccc5c6ccccc6[nH]c5c43)c2)c([2H])c1[2H]] | 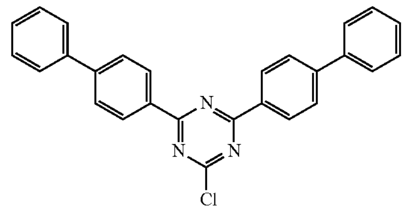 [SMILES: Clc1nc(-c2ccc(-c3ccccc3)cc2)nc(-c2ccc(-c3ccccc3)cc2)n1] | 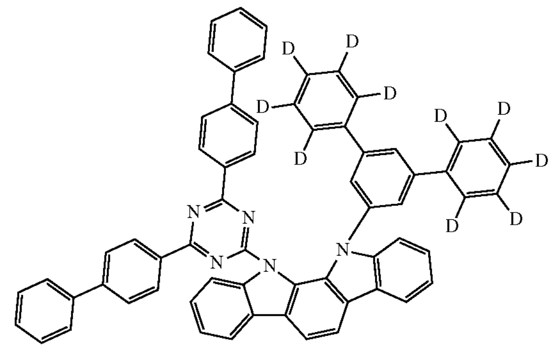 [SMILES: [2H]c1c([2H])c([2H])c(-c2cc(-c3c([2H])c([2H])c([2H])c([2H])c3[2H])cc(-n3c4ccccc4c4ccc5c6ccccc6n(-c6nc(-c7ccc(-c8ccccc8)cc7)nc(-c7ccc(-c8ccccc8)cc7)n6)c5c43)c2)c([2H])c1[2H]] | 73 |
| A40 | 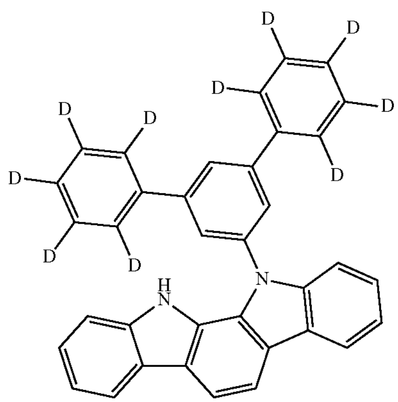 [SMILES: [2H]c1c([2H])c([2H])c(-c2cc(-c3c([2H])c([2H])c([2H])c([2H])c3[2H])cc(-n3c4ccccc4c4ccc5c6ccccc6[nH]c5c43)c2)c([2H])c1[2H]] | 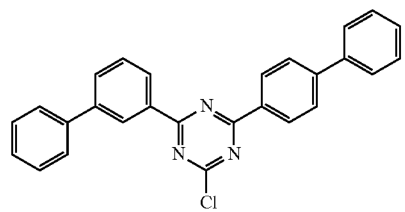 [SMILES: Clc1nc(-c2ccc(-c3ccccc3)cc2)nc(-c2cccc(-c3ccccc3)c2)n1] | 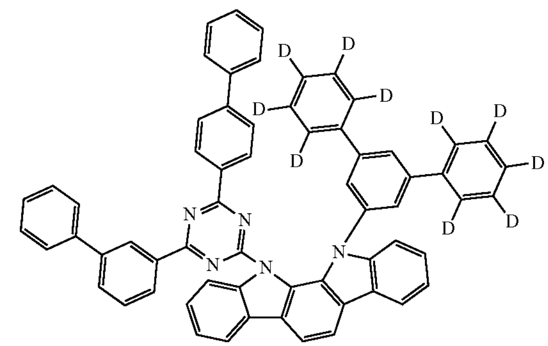 [SMILES: [2H]c1c([2H])c([2H])c(-c2cc(-c3c([2H])c([2H])c([2H])c([2H])c3[2H])cc(-n3c4ccccc4c4ccc5c6ccccc6n(-c6nc(-c7ccc(-c8ccccc8)cc7)nc(-c7cccc(-c8ccccc8)c7)n6)c5c43)c2)c([2H])c1[2H]] | 69 |

TABLE 3-continued
| Compound No. | Reactant D | Reactant E | Structure | Yield (%) |
|---|---|---|---|---|
| A48 | 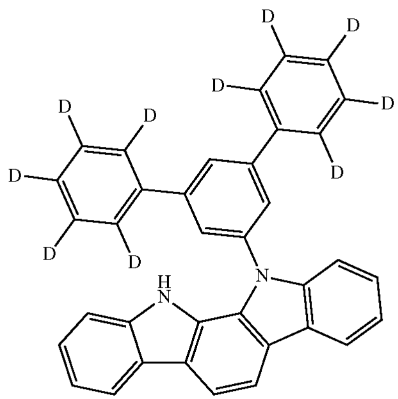 [SMILES: [2H]c1c([2H])c([2H])c(-c2cc(-c3c([2H])c([2H])c([2H])c([2H])c3[2H])cc(-n3c4ccccc4c4ccc5c6ccccc6[nH]c5c43)c2)c([2H])c1[2H]] | 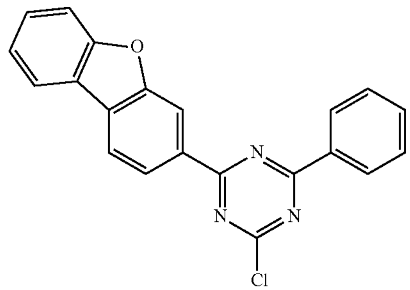 [SMILES: Clc1nc(-c2ccccc2)nc(-c2ccc3c(c2)oc2ccccc23)n1] | 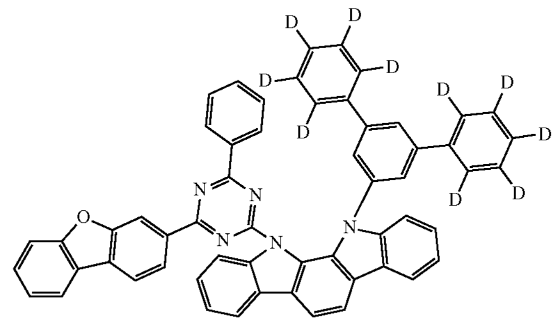 [SMILES: [2H]c1c([2H])c([2H])c(-c2cc(-c3c([2H])c([2H])c([2H])c([2H])c3[2H])cc(-n3c4ccccc4c4ccc5c6ccccc6n(-c6nc(-c7ccccc7)nc(-c7ccc8c(c7)oc7ccccc78)n6)c5c43)c2)c([2H])c1[2H]] | 81 |
| A56 | 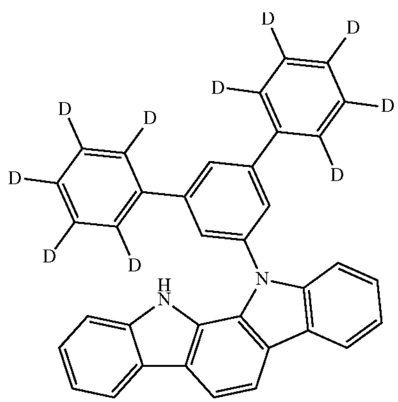 [SMILES: [2H]c1c([2H])c([2H])c(-c2cc(-c3c([2H])c([2H])c([2H])c([2H])c3[2H])cc(-n3c4ccccc4c4ccc5c6ccccc6[nH]c5c43)c2)c([2H])c1[2H]] | 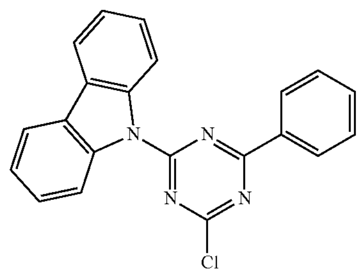 [SMILES: Clc1nc(-c2ccccc2)nc(-n2c3ccccc3c3ccccc32)n1] | 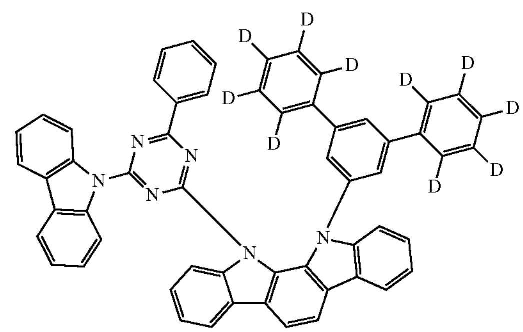 [SMILES: [2H]c1c([2H])c([2H])c(-c2cc(-c3c([2H])c([2H])c([2H])c([2H])c3[2H])cc(-n3c4ccccc4c4ccc5c6ccccc6n(-c6nc(-c7ccccc7)nc(-n7c8ccccc8c8ccccc87)n6)c5c43)c2)c([2H])c1[2H]] | 62 |

TABLE 3-continued
| Compound No. | Reactant D | Reactant E | Structure | Yield (%) |
| --- | --- | --- | --- | --- |
| A61 | 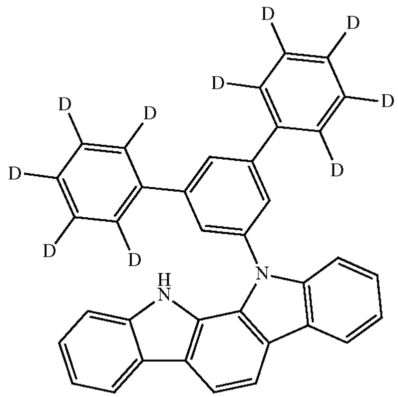 [SMILES: [2H]c1c([2H])c([2H])c(-c2cc(-c3c([2H])c([2H])c([2H])c([2H])c3[2H])cc(-n3c4ccccc4c4ccc5c6ccccc6[nH]c5c43)c2)c([2H])c1[2H]] | 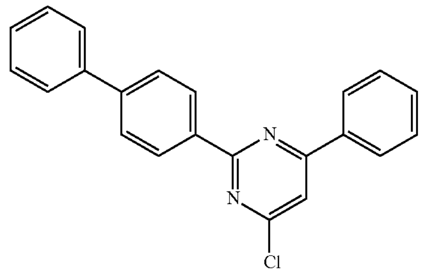 [SMILES: Clc1cc(-c2ccccc2)nc(-c2ccc(-c3ccccc3)cc2)n1] | 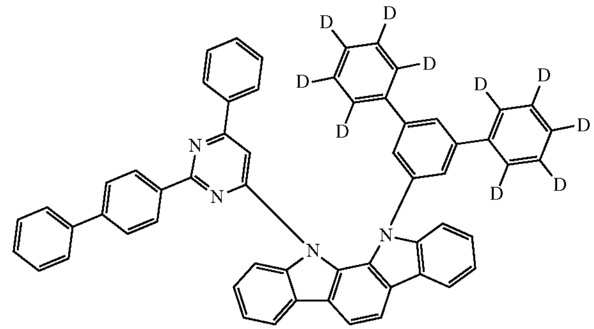 [SMILES: [2H]c1c([2H])c([2H])c(-c2cc(-c3c([2H])c([2H])c([2H])c([2H])c3[2H])cc(-n3c4ccccc4c4ccc5c6ccccc6n(-c6cc(-c7ccccc7)nc(-c7ccc(-c8ccccc8)cc7)n6)c5c43)c2)c([2H])c1[2H]] | 59 |
| B2 | 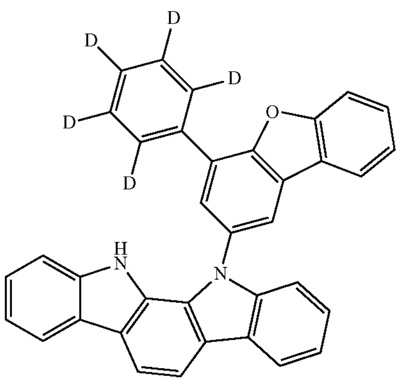 [SMILES: [2H]c1c([2H])c([2H])c(-c2cc(-n3c4ccccc4c4ccc5c6ccccc6[nH]c5c43)cc3c2oc2ccccc23)c([2H])c1[2H]] | 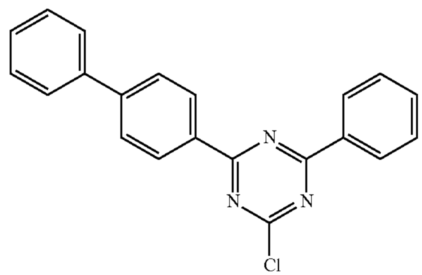 [SMILES: Clc1nc(-c2ccccc2)nc(-c2ccc(-c3ccccc3)cc2)n1] | 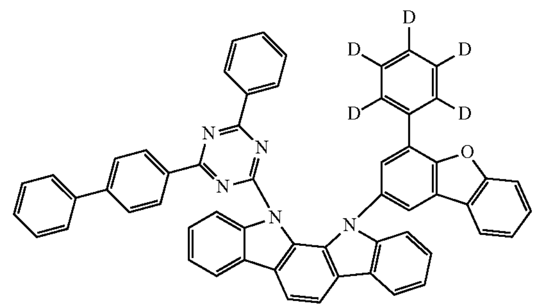 [SMILES: [2H]c1c([2H])c([2H])c(-c2cc(-n3c4ccccc4c4ccc5c6ccccc6n(-c6nc(-c7ccccc7)nc(-c7ccc(-c8ccccc8)cc7)n6)c5c43)cc3c2oc2ccccc23)c([2H])c1[2H]] | 74 |

TABLE 3-continued
| Compound No. | Reactant D | Reactant E | Structure | Yield (%) |
|---|---|---|---|---|
| B5 | 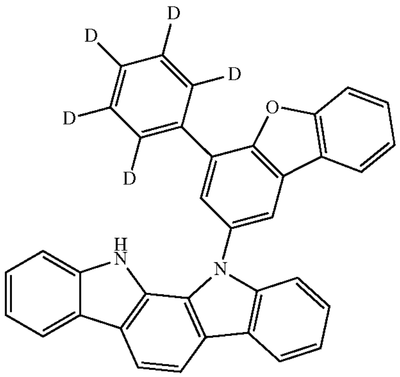 [SMILES: [2H]c1c([2H])c([2H])c(-c2cc(-n3c4ccccc4c4ccc5c6ccccc6[nH]c5c43)cc3c2oc2ccccc23)c([2H])c1[2H]] | 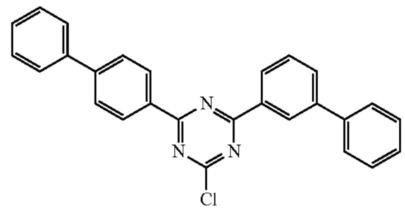 [SMILES: Clc1nc(-c2ccc(-c3ccccc3)cc2)nc(-c2cccc(-c3ccccc3)c2)n1] | 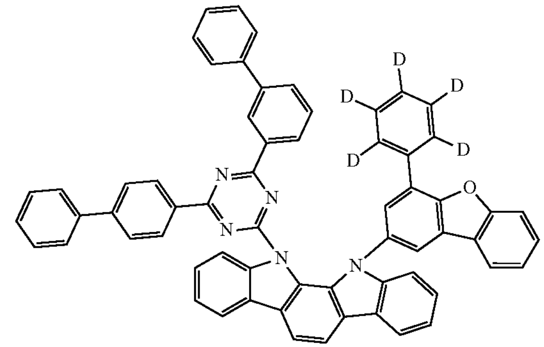 [SMILES: [2H]c1c([2H])c([2H])c(-c2cc(-n3c4ccccc4c4ccc5c6ccccc6n(-c6nc(-c7ccc(-c8ccccc8)cc7)nc(-c7cccc(-c8ccccc8)c7)n6)c5c43)cc3c2oc2ccccc23)c([2H])c1[2H]] | 69 |
| B7 | 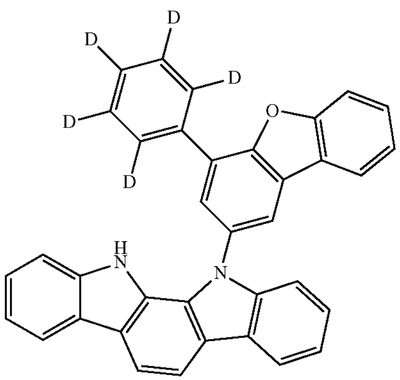 [SMILES: [2H]c1c([2H])c([2H])c(-c2cc(-n3c4ccccc4c4ccc5c6ccccc6[nH]c5c43)cc3c2oc2ccccc23)c([2H])c1[2H]] | 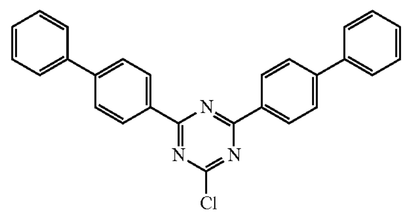 [SMILES: Clc1nc(-c2ccc(-c3ccccc3)cc2)nc(-c2ccc(-c3ccccc3)cc2)n1] | 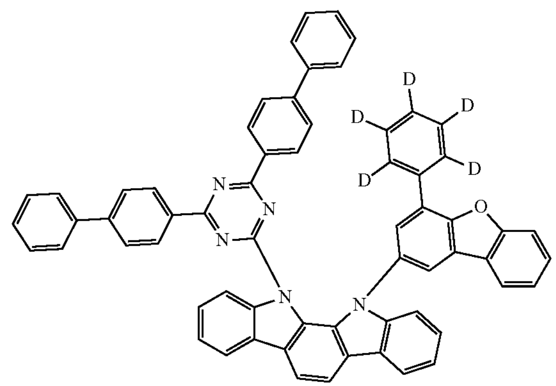 [SMILES: [2H]c1c([2H])c([2H])c(-c2cc(-n3c4ccccc4c4ccc5c6ccccc6n(-c6nc(-c7ccc(-c8ccccc8)cc7)nc(-c7ccc(-c8ccccc8)cc7)n6)c5c43)cc3c2oc2ccccc23)c([2H])c1[2H]] | 65 |

TABLE 3-continued
| Compound No. | Reactant D | Reactant E | Structure | Yield (%) |
| --- | --- | --- | --- | --- |
| B10 | 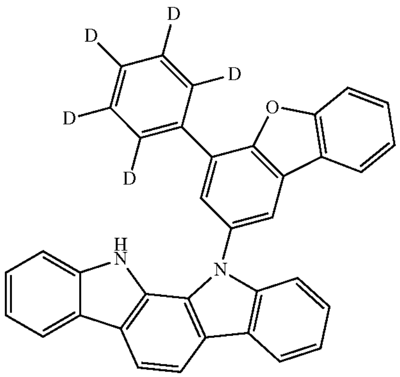 [SMILES: [2H]c1c([2H])c([2H])c(-c2cc(-n3c4ccccc4c4ccc5c6ccccc6[nH]c5c43)cc3c2oc2ccccc23)c([2H])c1[2H]] | 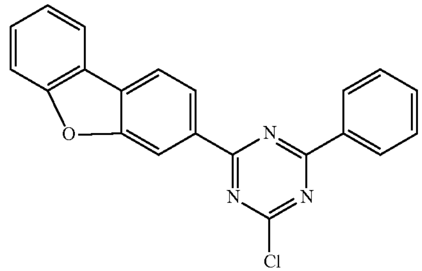 [SMILES: Clc1nc(-c2ccccc2)nc(-c2ccc3c(c2)oc2ccccc23)n1] | 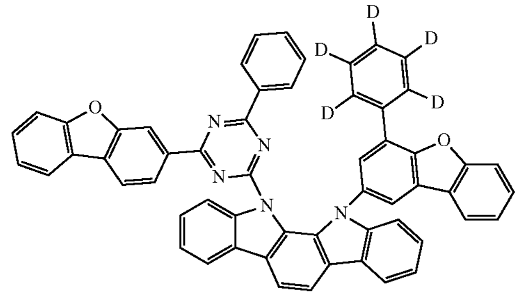 [SMILES: [2H]c1c([2H])c([2H])c(-c2cc(-n3c4ccccc4c4ccc5c6ccccc6n(-c6nc(-c7ccccc7)nc(-c7ccc8c(c7)oc7ccccc78)n6)c5c43)cc3c2oc2ccccc23)c([2H])c1[2H]] | 71 |
| B21 | 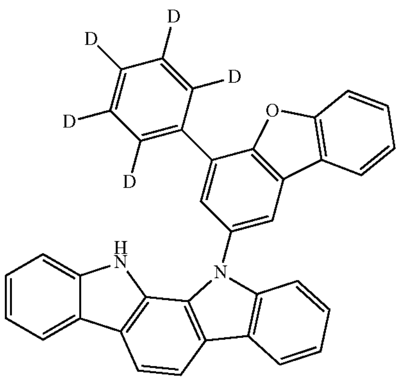 [SMILES: [2H]c1c([2H])c([2H])c(-c2cc(-n3c4ccccc4c4ccc5c6ccccc6[nH]c5c43)cc3c2oc2ccccc23)c([2H])c1[2H]] | 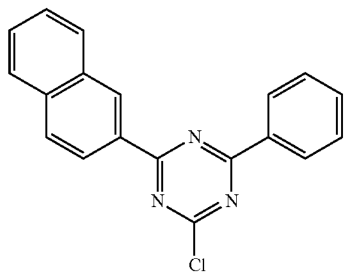 [SMILES: Clc1nc(-c2ccccc2)nc(-c2ccc3ccccc3c2)n1] | 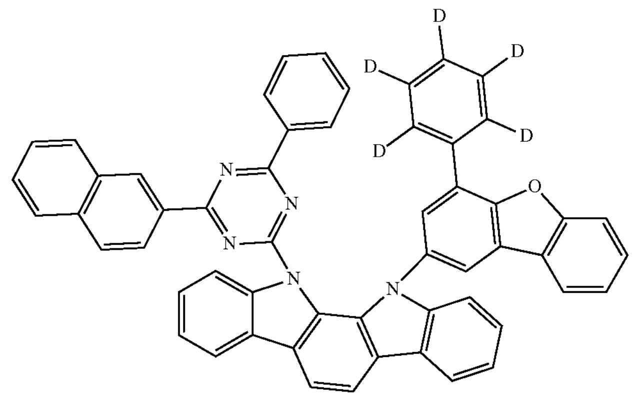 [SMILES: [2H]c1c([2H])c([2H])c(-c2cc(-n3c4ccccc4c4ccc5c6ccccc6n(-c6nc(-c7ccccc7)nc(-c7ccc8ccccc8c7)n6)c5c43)cc3c2oc2ccccc23)c([2H])c1[2H]] | 60 |

TABLE 3-continued
| Compound No. | Reactant D | Reactant E | Structure | Yield (%) |
| --- | --- | --- | --- | --- |
| B16 | 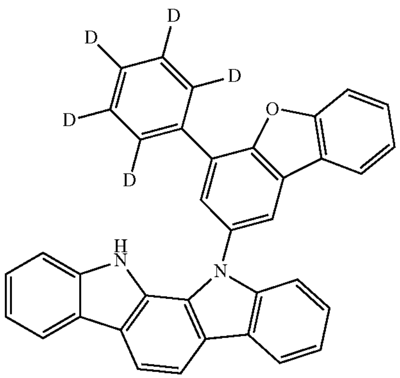 [SMILES: [2H]c1c([2H])c([2H])c(-c2cc(-n3c4ccccc4c4ccc5c6ccccc6[nH]c5c43)cc3c2oc2ccccc23)c([2H])c1[2H]] | 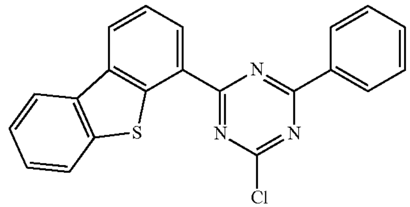 [SMILES: Clc1nc(-c2ccccc2)nc(-c2cccc3c2sc2ccccc23)n1] | 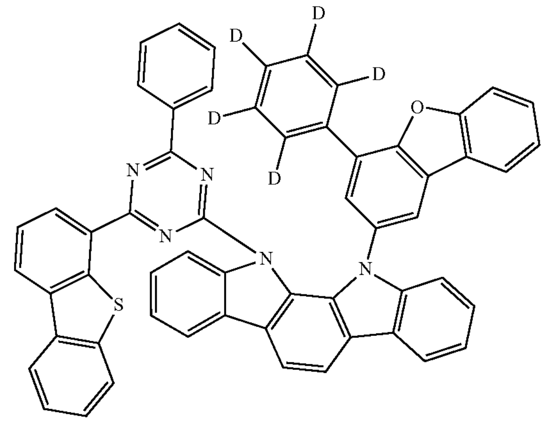 [SMILES: [2H]c1c([2H])c([2H])c(-c2cc(-n3c4ccccc4c4ccc5c6ccccc6n(-c6nc(-c7ccccc7)nc(-c7cccc8c7sc7ccccc78)n6)c5c43)cc3c2oc2ccccc23)c([2H])c1[2H]] | 67 |
| B52 | 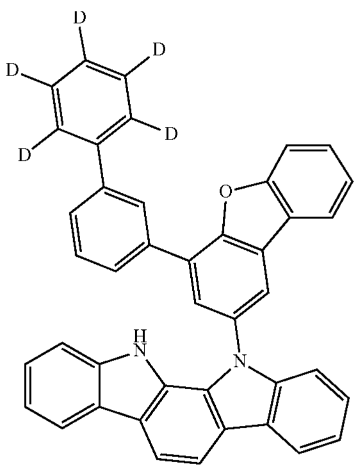 [SMILES: [2H]c1c([2H])c([2H])c(-c2cccc(-c3cc(-n4c5ccccc5c5ccc6c7ccccc7[nH]c6c54)cc4c3oc3ccccc34)c2)c([2H])c1[2H]] | 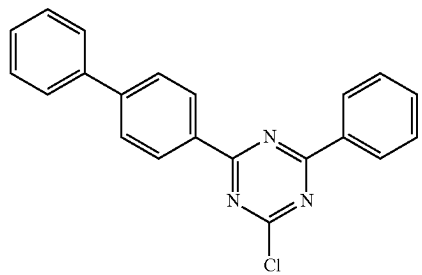 [SMILES: Clc1nc(-c2ccccc2)nc(-c2ccc(-c3ccccc3)cc2)n1] | 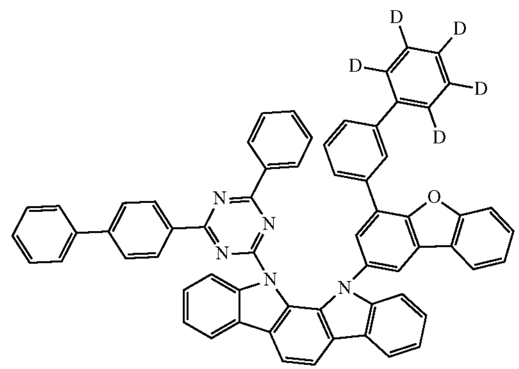 [SMILES: [2H]c1c([2H])c([2H])c(-c2cccc(-c3cc(-n4c5ccccc5c5ccc6c7ccccc7n(-c7nc(-c8ccccc8)nc(-c8ccc(-c9ccccc9)cc8)n7)c6c54)cc4c3oc3ccccc34)c2)c([2H])c1[2H]] | 72 |

TABLE 3-continued
| Compound No. | Reactant D | Reactant E | Structure | Yield (%) |
|---|---|---|---|---|
| B54 | 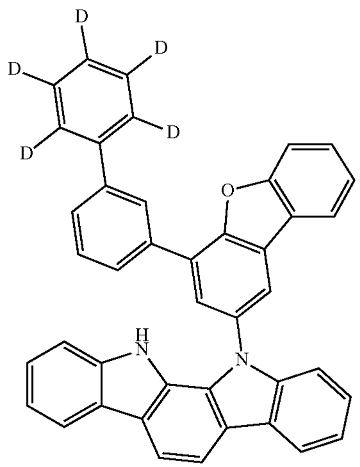 [SMILES: [2H]c1c([2H])c([2H])c(-c2cccc(-c3cc(-n4c5ccccc5c5ccc6c7ccccc7[nH]c6c54)cc4c3oc3ccccc34)c2)c([2H])c1[2H]] | 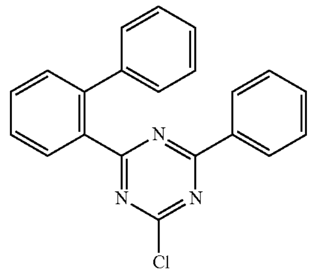 [SMILES: Clc1nc(-c2ccccc2)nc(-c2ccccc2-c2ccccc2)n1] | 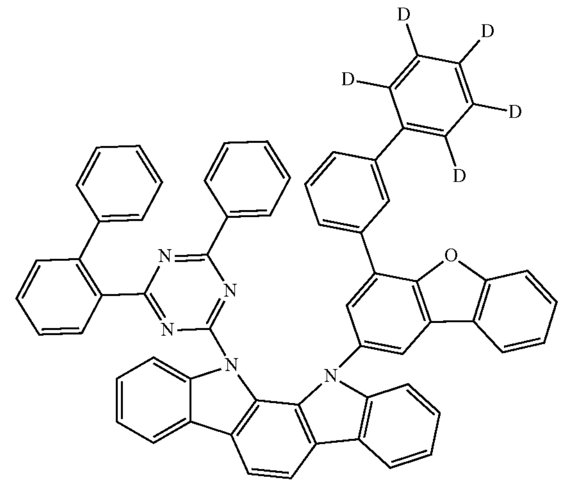 [SMILES: [2H]c1c([2H])c([2H])c(-c2cccc(-c3cc(-n4c5ccccc5c5ccc6c7ccccc7n(-c7nc(-c8ccccc8)nc(-c8ccccc8-c8ccccc8)n7)c6c54)cc4c3oc3ccccc34)c2)c([2H])c1[2H]] | 64 |
| B36 | 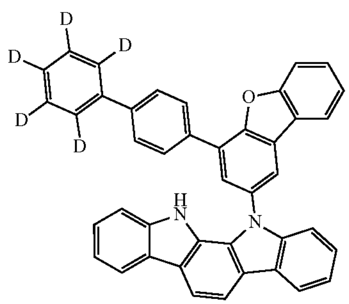 [SMILES: [2H]c1c([2H])c([2H])c(-c2ccc(-c3cc(-n4c5ccccc5c5ccc6c7ccccc7[nH]c6c54)cc4c3oc3ccccc34)cc2)c([2H])c1[2H]] | 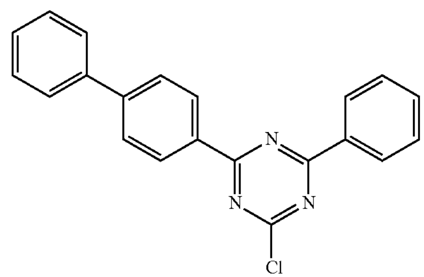 [SMILES: Clc1nc(-c2ccccc2)nc(-c2ccc(-c3ccccc3)cc2)n1] | 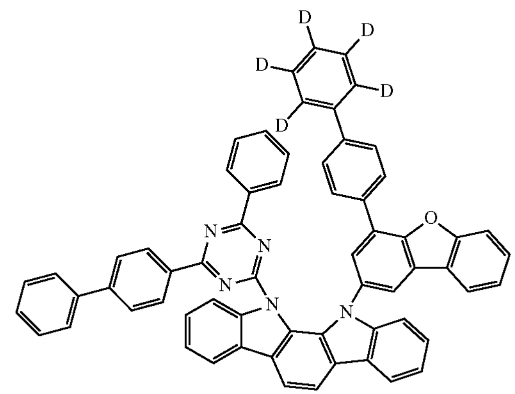 [SMILES: [2H]c1c([2H])c([2H])c(-c2ccc(-c3cc(-n4c5ccccc5c5ccc6c7ccccc7n(-c7nc(-c8ccccc8)nc(-c8ccc(-c9ccccc9)cc8)n7)c6c54)cc4c3oc3ccccc34)cc2)c([2H])c1[2H]] | 69 |

TABLE 3-continued
| Compound No. | Reactant D | Reactant E | Structure | Yield (%) |
| --- | --- | --- | --- | --- |
| B128 | 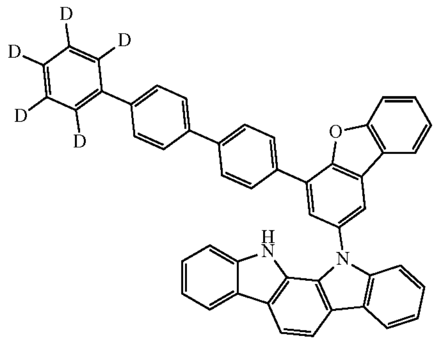 [SMILES: [2H]c1c([2H])c([2H])c(-c2ccc(-c3ccc(-c4cc(-n5c6ccccc6c6ccc7c8ccccc8[nH]c7c65)cc5c4oc4ccccc45)cc3)cc2)c([2H])c1[2H]] | 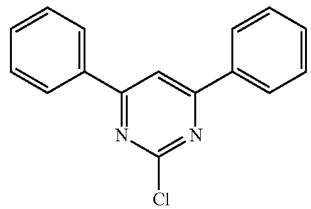 [SMILES: Clc1nc(-c2ccccc2)cc(-c2ccccc2)n1] | 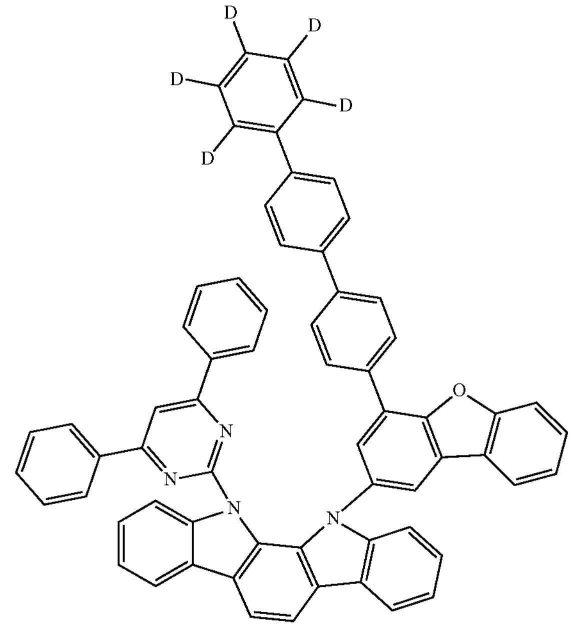 [SMILES: [2H]c1c([2H])c([2H])c(-c2ccc(-c3ccc(-c4cc(-n5c6ccccc6c6ccc7c8ccccc8n(-c8nc(-c9ccccc9)cc(-c9ccccc9)n8)c7c65)cc5c4oc4ccccc45)cc3)cc2)c([2H])c1[2H]] | 65 |

TABLE 3-continued
| Compound No. | Reactant D | Reactant E | Structure | Yield (%) |
| --- | --- | --- | --- | --- |
| B129 | 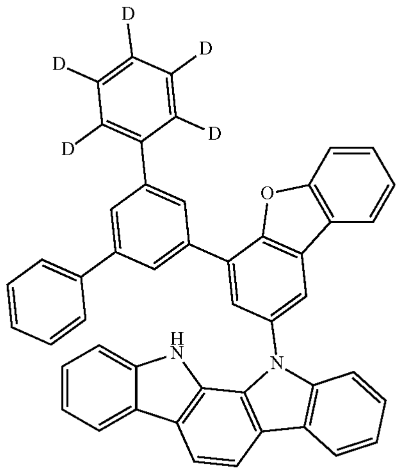 [SMILES: [2H]c1c([2H])c([2H])c(-c2cc(-c3ccccc3)cc(-c3cc(-n4c5ccccc5c5ccc6c7ccccc7[nH]c6c54)cc4c3oc3ccccc34)c2)c([2H])c1[2H]] | 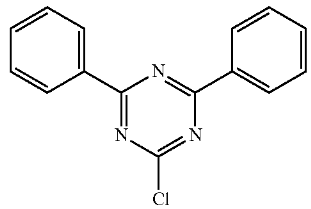 [SMILES: Clc1nc(-c2ccccc2)nc(-c2ccccc2)n1] | 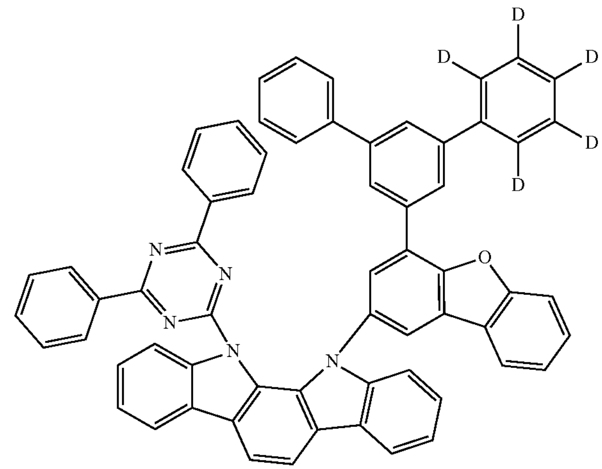 [SMILES: [2H]c1c([2H])c([2H])c(-c2cc(-c3ccccc3)cc(-c3cc(-n4c5ccccc5c5ccc6c7ccccc7n(-c7nc(-c8ccccc8)nc(-c8ccccc8)n7)c6c54)cc4c3oc3ccccc34)c2)c([2H])c1[2H]] | 58 |
| B130 | 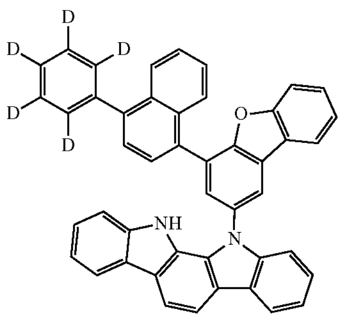 [SMILES: [2H]c1c([2H])c([2H])c(-c2ccc(-c3cc(-n4c5ccccc5c5ccc6c7ccccc7[nH]c6c54)cc4c3oc3ccccc34)c3ccccc23)c([2H])c1[2H]] | 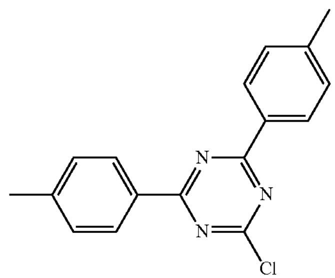 | 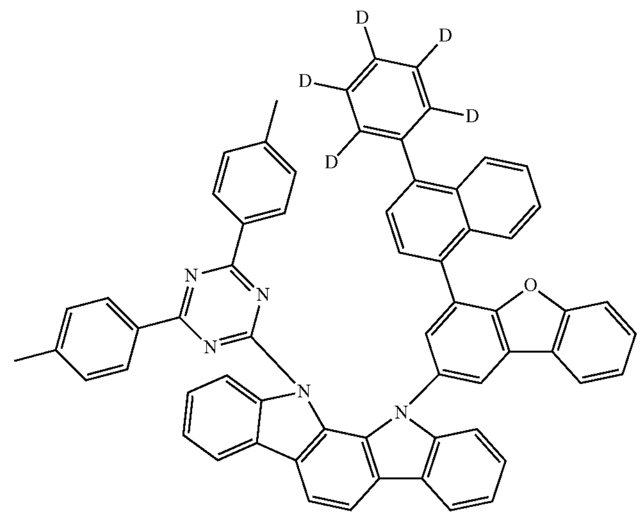 [SMILES: [2H]c1c([2H])c([2H])c(-c2ccc(-c3cc(-n4c5ccccc5c5ccc6c7ccccc7n(-c7nc(-c8ccc(C)cc8)nc(-c8ccc(C)cc8)n7)c6c54)cc4c3oc3ccccc34)c3ccccc23)c([2H])c1[2H]] | 55 |

TABLE 3-continued
| Compound No. | Reactant D | Reactant E | Structure | Yield (%) |
|---|---|---|---|---|
| B132 | 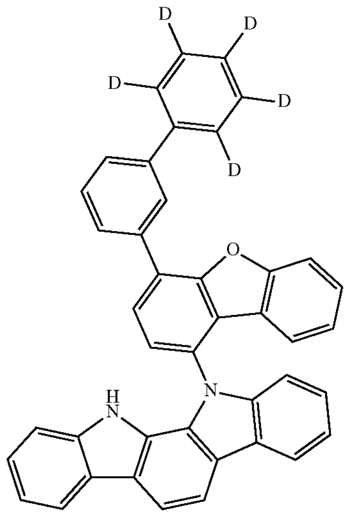 [SMILES: [2H]c1c([2H])c([2H])c(-c2cccc(-c3ccc(-n4c5ccccc5c5ccc6c7ccccc7[nH]c6c54)c4c3oc3ccccc34)c2)c([2H])c1[2H]] | 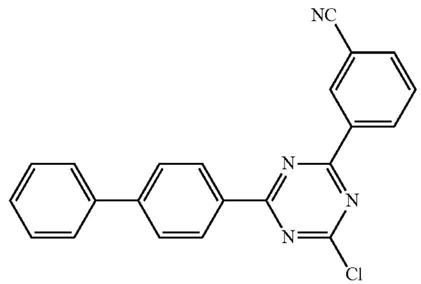 [SMILES: N#Cc1cccc(-c2nc(Cl)nc(-c3ccc(-c4ccccc4)cc3)n2)c1] | 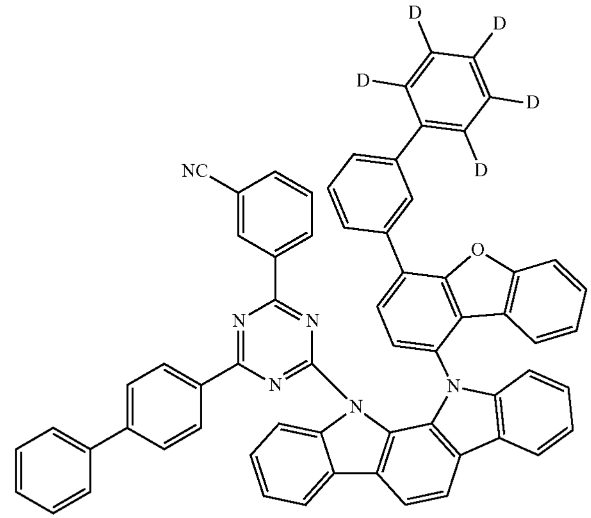 [SMILES: [2H]c1c([2H])c([2H])c(-c2cccc(-c3ccc(-n4c5ccccc5c5ccc6c7ccccc7n(-c7nc(-c8ccc(-c9ccccc9)cc8)nc(-c8cccc(C#N)c8)n7)c6c54)c4c3oc3ccccc34)c2)c([2H])c1[2H]] | 51 |
| C50 | 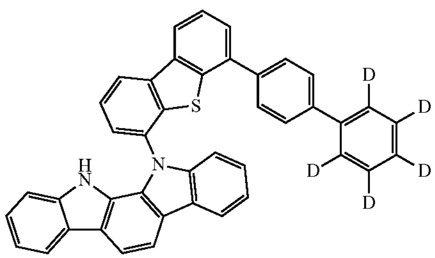 [SMILES: [2H]c1c([2H])c([2H])c(-c2ccc(-c3cccc4c3sc3c(-n5c6ccccc6c6ccc7c8ccccc8[nH]c7c65)cccc34)cc2)c([2H])c1[2H]] | 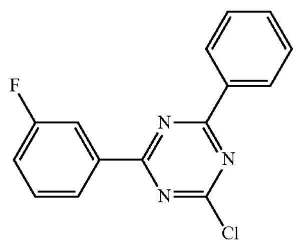 [SMILES: Fc1cccc(-c2nc(Cl)nc(-c3ccccc3)n2)c1] | 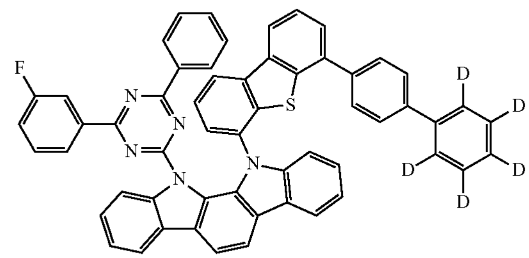 [SMILES: [2H]c1c([2H])c([2H])c(-c2ccc(-c3cccc4c3sc3c(-n5c6ccccc6c6ccc7c8ccccc8n(-c8nc(-c9ccccc9)nc(-c9cccc(F)c9)n8)c7c65)cccc34)cc2)c([2H])c1[2H]] | 48 |

TABLE 3-continued
| Compound No. | Reactant D | Reactant E | Structure | Yield (%) |
|---|---|---|---|---|
| C51 | 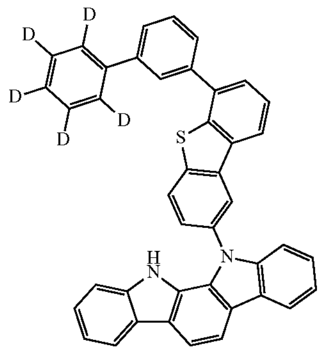 [SMILES: [2H]c1c([2H])c([2H])c(-c2cccc(-c3cccc4c3sc3ccc(-n5c6ccccc6c6ccc7c8ccccc8[nH]c7c65)cc34)c2)c([2H])c1[2H]] | 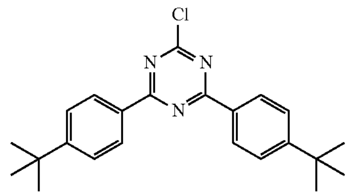 [SMILES: CC(C)(C)c1ccc(-c2nc(Cl)nc(-c3ccc(C(C)(C)C)cc3)n2)cc1] | 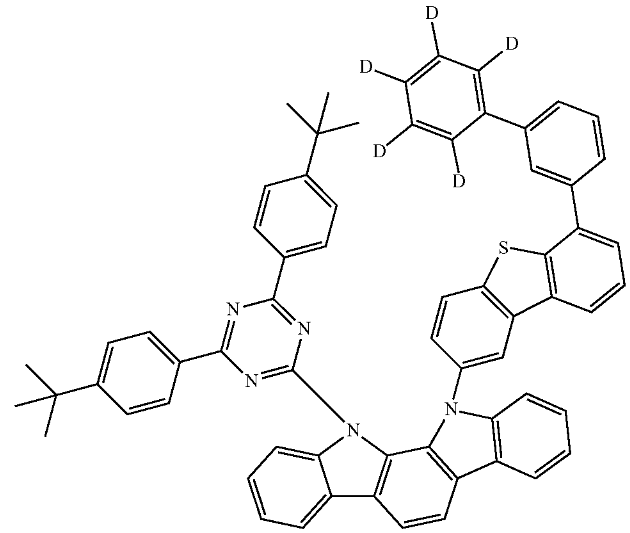 [SMILES: [2H]c1c([2H])c([2H])c(-c2cccc(-c3cccc4c3sc3ccc(-n5c6ccccc6c6ccc7c8ccccc8n(-c8nc(-c9ccc(C(C)(C)C)cc9)nc(-c9ccc(C(C)(C)C)cc9)n8)c7c65)cc34)c2)c([2H])c1[2H]] | 53 |
| A13 | 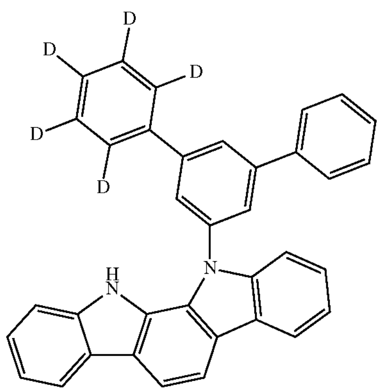 [SMILES: [2H]c1c([2H])c([2H])c(-c2cc(-c3ccccc3)cc(-n3c4ccccc4c4ccc5c6ccccc6[nH]c5c43)c2)c([2H])c1[2H]] | 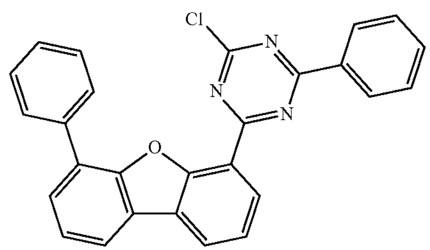 [SMILES: Clc1nc(-c2ccccc2)nc(-c2cccc3c2oc2c(-c4ccccc4)cccc23)n1] | 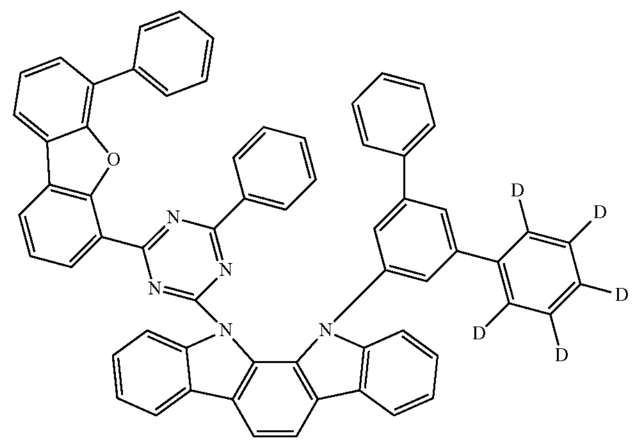 [SMILES: [2H]c1c([2H])c([2H])c(-c2cc(-c3ccccc3)cc(-n3c4ccccc4c4ccc5c6ccccc6n(-c6nc(-c7ccccc7)nc(-c7cccc8c7oc7c(-c9ccccc9)cccc78)n6)c5c43)c2)c([2H])c1[2H]] | 62 |

Mass spectrum data for the above compounds are shown in Table 4 below.

TABLE 4

| | |
|---|---|
| Compound A38 | m/z = 802.3 [M + H]$^+$ |
| Compound A2 | m/z = 797.3 [M + H]$^+$ |
| Compound A5 | m/z = 873.3 [M + H]$^+$ |
| Compound A6 | m/z = 873.3 [M + H]$^+$ |
| Compound A10 | m/z = 811.3 [M + H]$^+$ |
| Compound A36 | m/z = 873.3 [M + H]$^+$ |
| Compound A35 | m/z = 795.3 [M + H]$^+$ |
| Compound A39 | m/z = 878.3 [M + H]$^+$ |
| Compound A40 | m/z = 878.3 [M + H]$^+$ |
| Compound A48 | m/z = 816.3 [M + H]$^+$ |
| Compound A56 | m/z = 815.3 [M + H]$^+$ |
| Compound A61 | m/z = 801.3 [M + H]$^+$ |
| Compound C50 | m/z = 845.3 [M + H]$^+$ |
| Compound C51 | m/z = 939.4 [M + H]+ |
| Compound B2 | m/z = 811.3 [M + H]$^+$ |
| Compound B5 | m/z = 887.3 [M + H]$^+$ |
| Compound B7 | m/z = 887.3 [M + H]$^+$ |
| Compound B10 | m/z = 825.3 [M + H]$^+$ |
| Compound B21 | m/z = 785.3 [M + H]$^+$ |
| Compound B16 | m/z = 841.2 [M + H]$^+$ |
| Compound B52 | m/z = 887.3 [M + H]$^+$ |
| Compound B54 | m/z = 887.3 [M + H]$^+$ |
| Compound B36 | m/z = 887.3 [M + H]$^+$ |
| Compound B128 | m/z = 886.3 [M + H]$^+$ |
| Compound B129 | m/z = 887.3 [M + H]$^+$ |
| Compound B130 | m/z = 889.3 [M + H]$^+$ |
| Compound B132 | m/z = 912.3 [M + H]$^+$ |
| Compound A13 | m/z = 888.1 [M + H]$^+$ |

Synthesis of Intermediate K-1

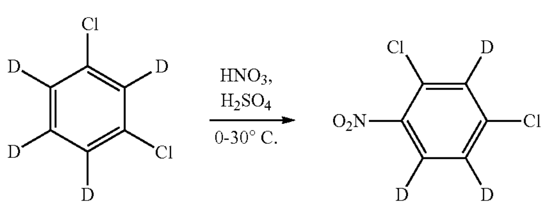

SM-K K-1

1,3-Dichlorobenzene-D4 (30.0 g, 198.65 mmol) was added to a four-necked flask, the temperature was controlled at 25° C., fuming nitric acid (13.77 g, 218.51 mmol) and concentrated sulfuric acid (19.48 g, 198.65 mmol) were sequentially added dropwise, after adding dropwise was completed, the mixture was allowed to stand for layering, an organic phase was separated, and dried over anhydrous magnesium sulfate, filtrated, and the filtrate was concentrated in vacuum to obtain an intermediate K-1 (30.99 g; yield: 80%).

Synthesis of Intermediate S-1

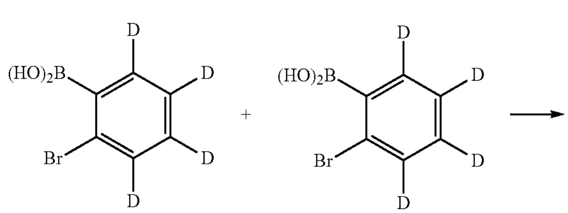

S-A S-B

-continued

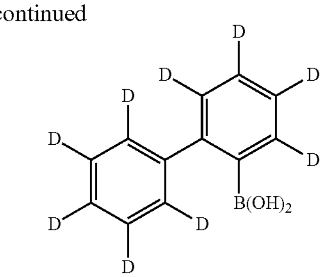

S-1

S-A (30 g, 146.41 mmol), S—B (18.59 g, 146.41 mmol), tetrakis(triphenylphosphine)palladium (8.45 g, 7.32 mmol), tetrabutylammonium bromide (2.36 g, 7.32 mmol), potassium carbonate (30.35 g, 219.62 mmol), toluene (240 mL), ethanol (120 mL), and deionized water (60 mL) were added to a dry 500 mL round bottom flask which was replaced with nitrogen, and the mixture was heated to 75° C. to 80° C. under stirring for 8 h; the reaction mixture was then cooled to room temperature, deionized water (200 mL) was added, stirring was performed for 15 min, an organic phase was separated, and dried over anhydrous magnesium sulfate, filtrated, and the filtrate was concentrated in vacuum to obtain a crude product; and the obtained crude product was purified by silica gel column chromatography using dichloromethane/n-heptane as a mobile phase to obtain an intermediate S-1 (9.1 g; yield: 30%).

Synthesis of Intermediate A-1

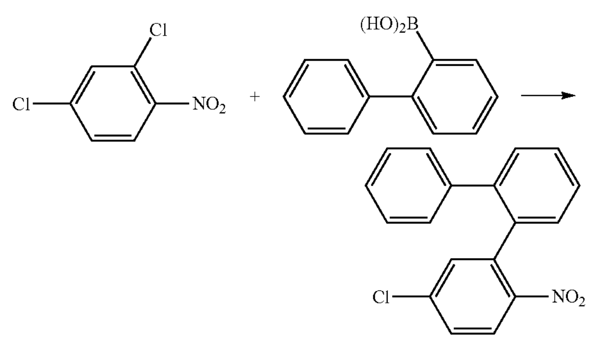

A-1

2,4-Dichloronitrobenzene (30 g, 156.26 mmol), 2-biphenylboronic acid (34.04 g, 171.88 mmol), tetrakis(triphenylphosphine)palladium (3.6 g, 3.12 mmol), tetrabutylammonium bromide (1.00 g, 3.13 mmol), potassium carbonate (64.79 g, 468.77 mmol), toluene (240 mL), ethanol (120 mL), and deionized water (60 mL) were added to a dry 500 mL round bottom flask which was replaced with nitrogen, and the mixture was heated to 75° C. to 80° C. under stirring for 8 h; the reaction mixture was then cooled to room temperature, deionized water (200 mL) was added, stirring was performed for 15 min, an organic phase was separated, and dried over anhydrous magnesium sulfate, filtrated, and the filtrate was concentrated in vacuum to obtain a crude product; and the obtained crude product was purified by silica gel column chromatography using dichloromethane/n-heptane in a ratio of 1:6 as a mobile phase to obtain an intermediate A-1 (33.87 g; yield: 70%).

With reference to the synthesis method for the intermediate A-1, intermediates A-X in Table 5 below were synthesized by using a raw material 1 in Table 5 below instead of 2,4-dichloronitrobenzene and SM-X in Table 5 below instead of 2-biphenylboronic acid.
TABLE 5
| Raw material 1 | SM-X | Intermediate A-X | Yield (%) |
|---|---|---|---|
| 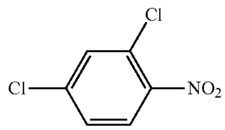 | 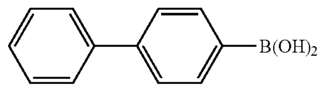 | 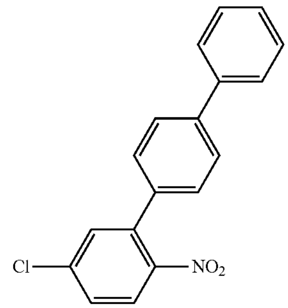 A-2 | 73 |
| | 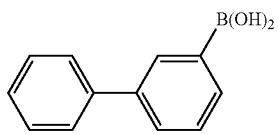 | 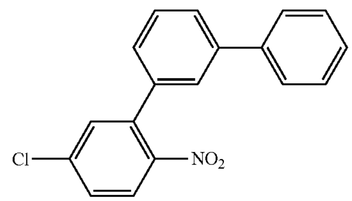 A-3 | 68 |
| 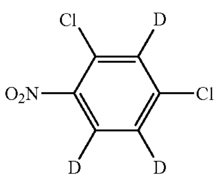 K-1 | 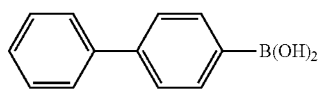 | 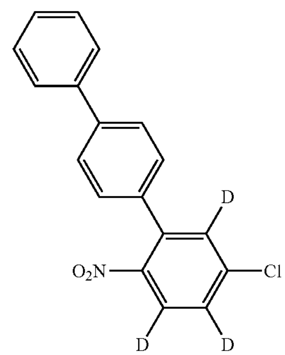 A-4 | 72 |
| 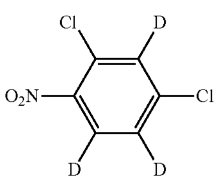 [SMILES: [2H]c1c([2H])c([N+](=O)[O-])c(Cl)c([2H])c1Cl] | 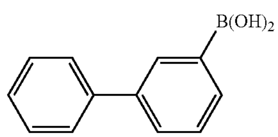 | 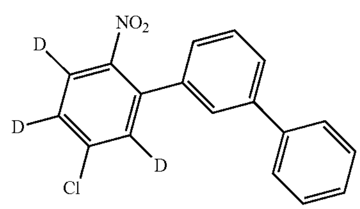 A-5 | 70 |
| 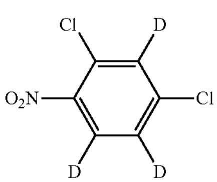 [SMILES: [2H]c1c([2H])c([N+](=O)[O-])c(Cl)c([2H])c1Cl] | 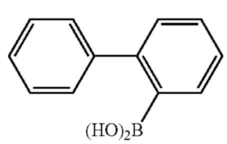 | 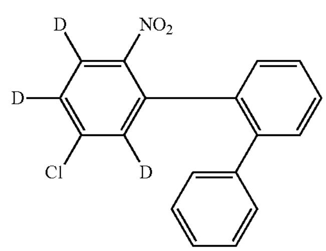 A-6 | 65 |

TABLE 5-continued
| Raw material 1 | SM-X | Intermediate A-X | Yield (%) |
|---|---|---|---|
| 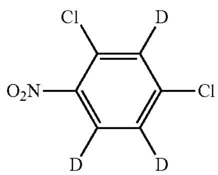 [SMILES: [2H]c1c([2H])c([N+](=O)[O-])c(Cl)c([2H])c1Cl] | 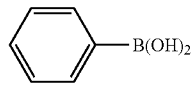 | 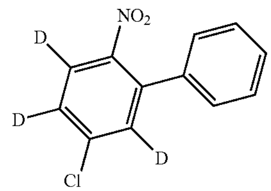 A-7 | 74 |
| 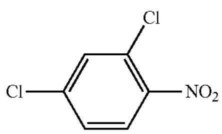 | 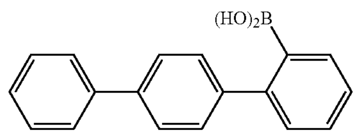 | 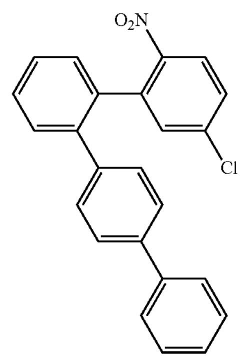 A-8 | 66 |
| 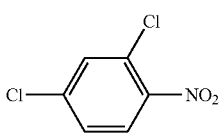 [SMILES: O=[N+]([O-])c1ccc(Cl)cc1Cl] | 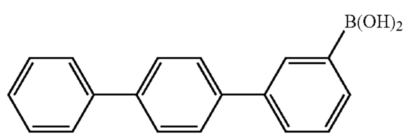 | 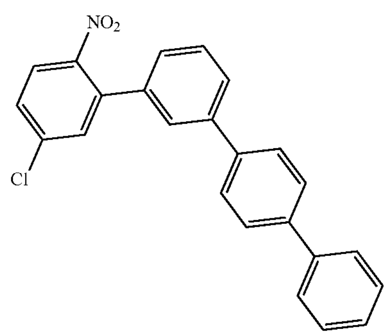 A-9 | 62 |
| 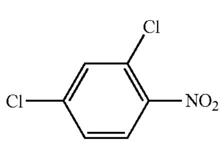 [SMILES: O=[N+]([O-])c1ccc(Cl)cc1Cl] | 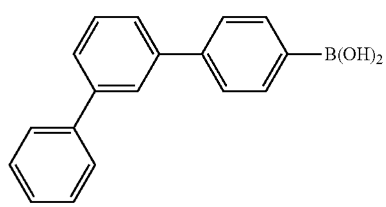 | 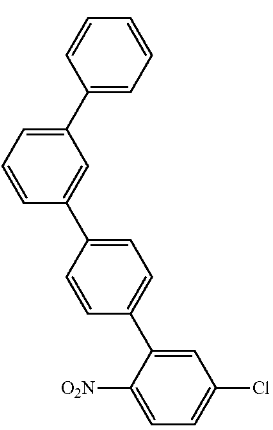 A-10 | 60 |

TABLE 5-continued
| Raw material 1 | SM-X | Intermediate A-X | Yield (%) |
| --- | --- | --- | --- |
| 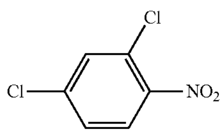 [SMILES: O=[N+]([O-])c1ccc(Cl)cc1Cl] | 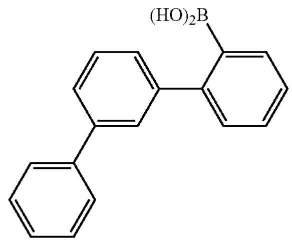 | 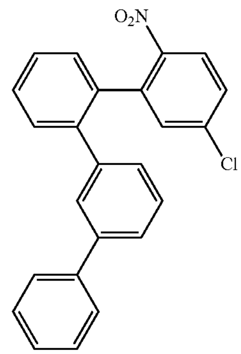 A-11 | 59 |
| 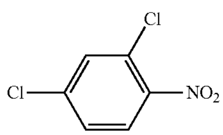 [SMILES: O=[N+]([O-])c1ccc(Cl)cc1Cl] | 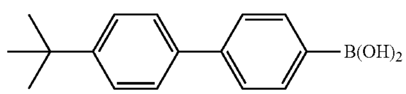 | 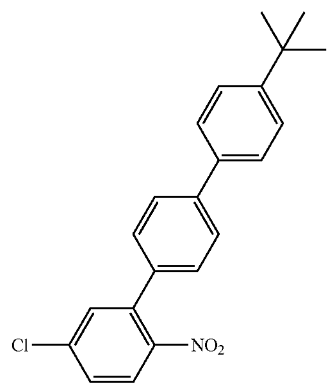 A-12 | 63 |
| 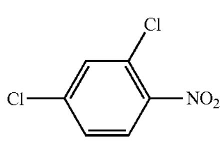 [SMILES: O=[N+]([O-])c1ccc(Cl)cc1Cl] | 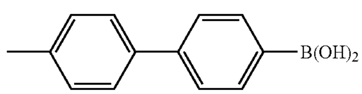 | 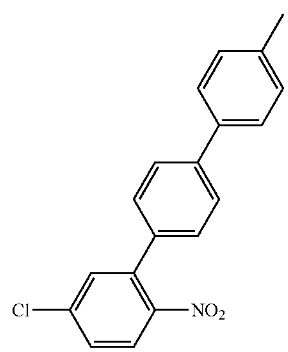 A-13 | 55 |
| 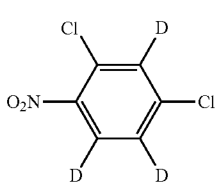 [SMILES: [2H]c1c([2H])c([N+](=O)[O-])c(Cl)c([2H])c1Cl] | 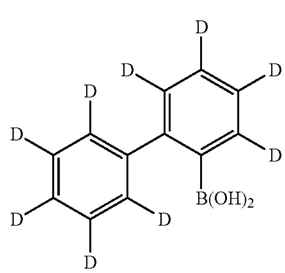 S-1 | 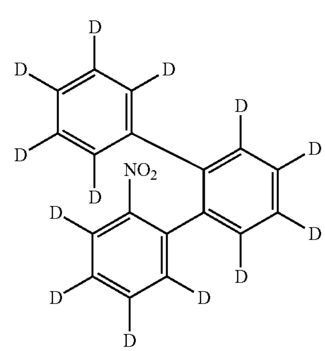 A-15 | 60 |

TABLE 5-continued

| Raw material 1 | SM-X | Intermediate A-X | Yield (%) |
|---|---|---|---|
| 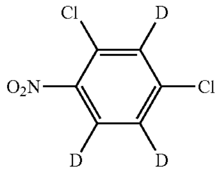 [SMILES: [2H]c1c([2H])c([N+](=O)[O-])c(Cl)c([2H])c1Cl] | 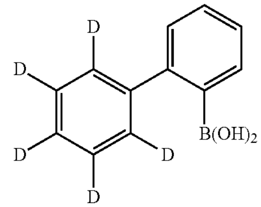 S-2 | 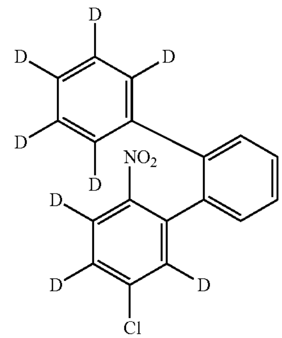 A-16 | 58 |
| 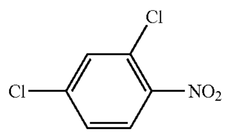 [SMILES: O=[N+]([O-])c1ccc(Cl)cc1Cl] | 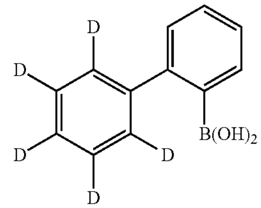 S-2 | 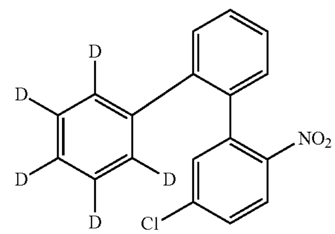 A-17 | 62 |

Synthesis of Intermediate B-1

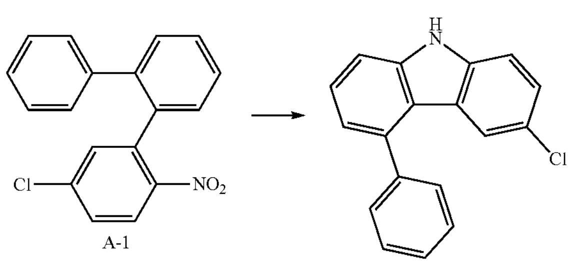

A-1 B-1

The intermediate A-1 (30 g, 96.85 mmol), triphenylphosphine (63.51 g, 242.14 mmol), and ortho-dichlorobenzene (300 mL) were added to a dry round bottom flask which was replaced with nitrogen, and the mixture was heated to 170° C. under stirring for 18 h; the reaction mixture was then cooled to room temperature, ortho-dichlorobenzene was removed by atmospheric distillation, toluene (200 mL) was added, stirring was performed for 15 min, filtrated, and the filtrate was concentrated in vacuum to obtain a crude product; and the obtained crude product was purified by silica gel column chromatography using dichloromethane/n-heptane as a mobile phase to obtain an intermediate B-1 (13.45 g; yield: 50%).

With reference to the synthesis method for the intermediate B-1, intermediates B-X in Table 6 below were synthesized by using intermediates A-X instead of the intermediate A-1.

TABLE 6

| Intermediate A-X | Intermediate B-X | Yield (%) |
|---|---|---|
| 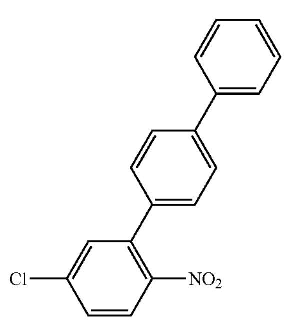 A-2 | 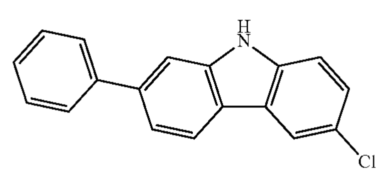 B-2 | 49 |

TABLE 6-continued
| Intermediate A-X | Intermediate B-X | Yield (%) |
|---|---|---|
| 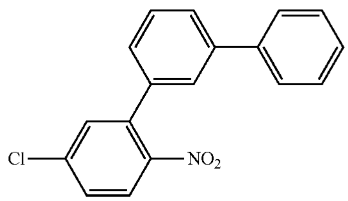 A-3 | 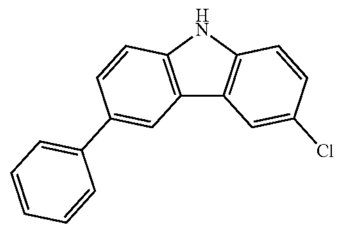 B-3 | 21 |
| | 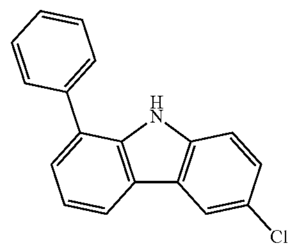 B-4 | 23 |
| 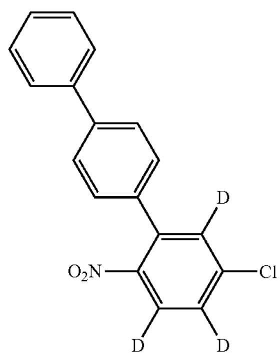 A-4 | 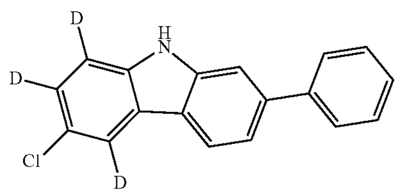 B-5 | 48 |
| 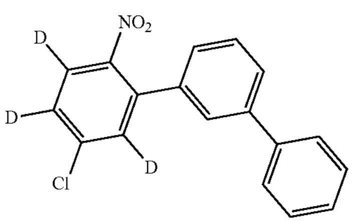 A-5 | 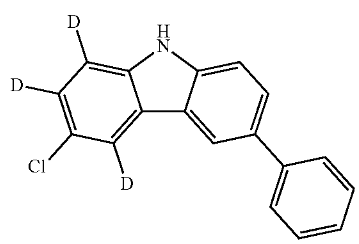 B-6 | 24 |
| 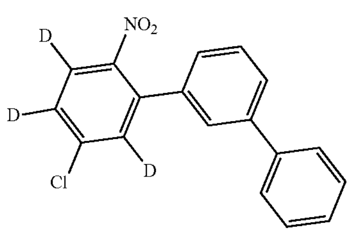 A-5 | 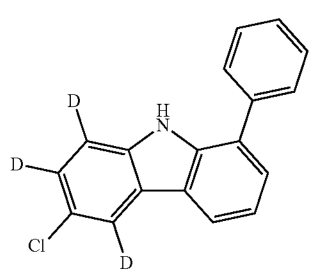 B-7 | 20 |

TABLE 6-continued
| Intermediate A-X | Intermediate B-X | Yield (%) |
|---|---|---|
| 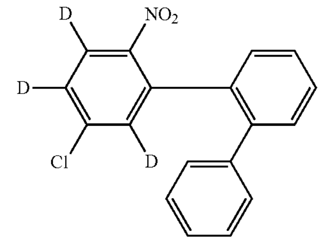 A-6 | 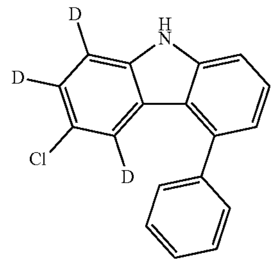 B-8 | 50 |
| 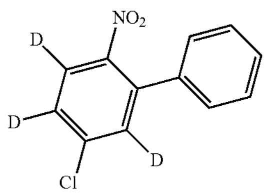 A-7 | 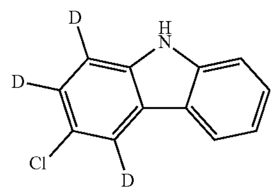 B-9 | 46 |
| 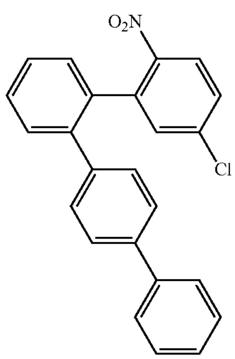 A-8 | 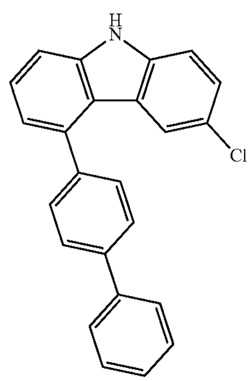 B-10 | 40 |
| 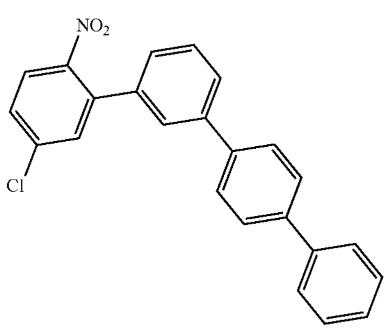 A-9 | 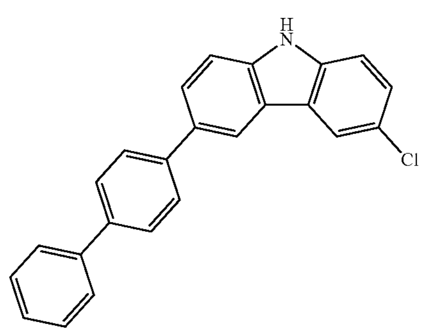 B-11 | 25 |

TABLE 6-continued
| Intermediate A-X | Intermediate B-X | Yield (%) |
|---|---|---|
| 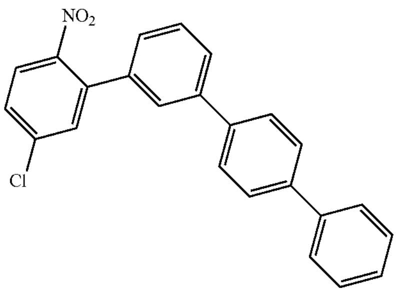 A-9 | 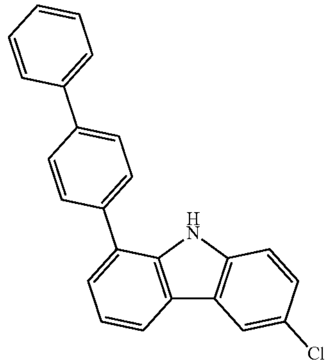 B-12 | 20 |
| 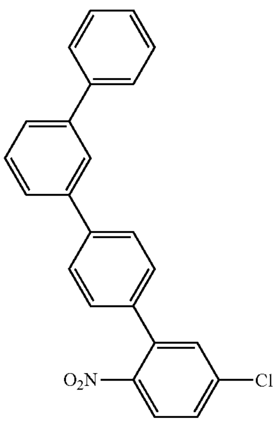 A-10 | 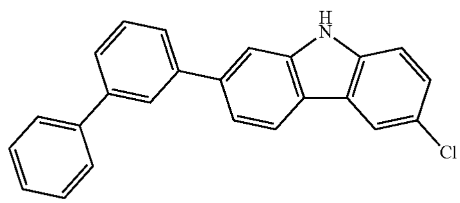 B-13 | 43 |
| 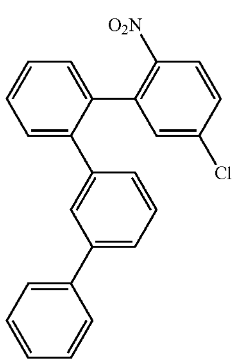 A-11 | 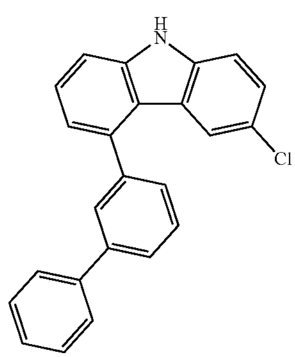 B-14 | 45 |

TABLE 6-continued
| Intermediate A-X | Intermediate B-X | Yield (%) |
|---|---|---|
| 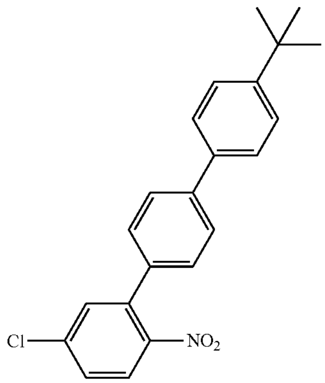 A-12 | 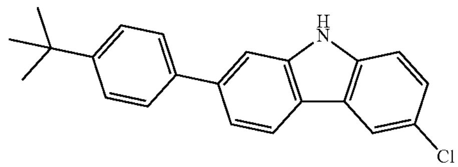 B-15 | 50 |
| 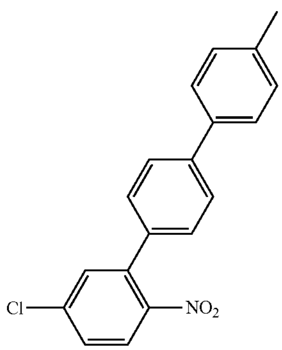 A-13 | 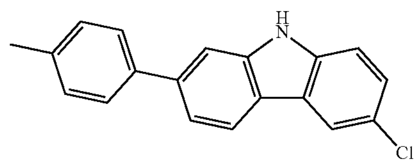 B-16 | 47 |
| 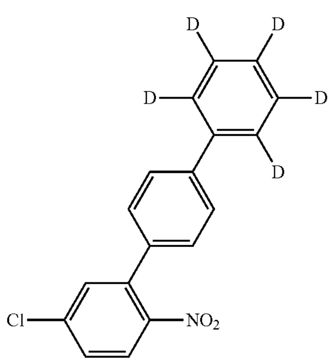 A-14 | 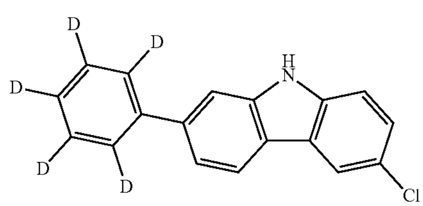 B-17 | 45 |
| 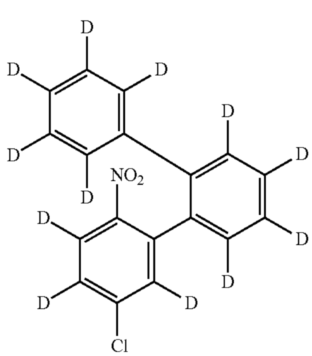 A-15 | 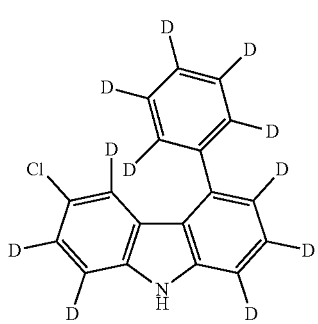 B-18 | 38 |

TABLE 6-continued

| Intermediate A-X | Intermediate B-X | Yield (%) |
| --- | --- | --- |
| 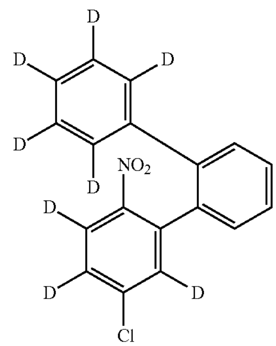 A-16 | 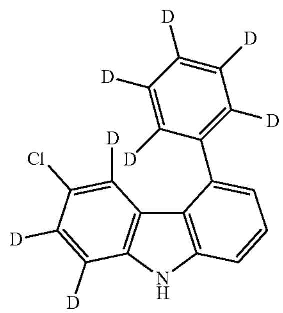 B-19 | 35 |
| 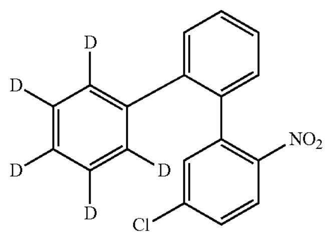 A-17 | 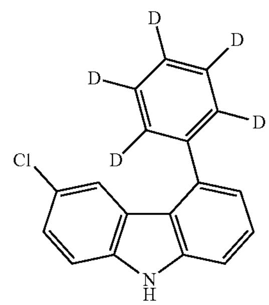 B-20 | 39 |

Synthesis of Intermediate C-1

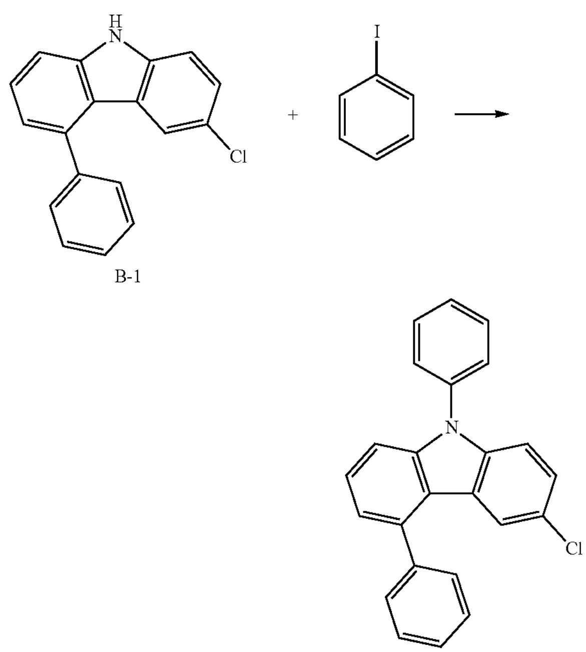

The intermediate B-1 (15 g, 54.0 mmol), iodobenzene (16.53 g, 81.0 mmol), cuprous iodide (1.03 g, 5.4 mmol), potassium carbonate (18.63 g, 135.01 mmol), o-phenanthroline (0.54 g, 2.7 mmol), 18-crown-6 (1.43 g, 5.4 mmol), and DMF (150 mL) were added to a dry round bottom flask which was replaced with nitrogen, and the mixture was heated to 150° C. under stirring for 16 h; the reaction mixture was then cooled to room temperature, ethyl acetate (200 mL) and deionized water (200 mL) were added, stirring was performed for 15 min, an organic phase was separated, and dried over anhydrous magnesium sulfate, filtrated, and the filtrate was concentrated in vacuum to obtain a crude product; and the obtained crude product was purified by silica gel column chromatography using dichloromethane/n-heptane as a mobile phase to obtain an intermediate C-1 (12.4 g; yield: 65%).

With reference to the synthesis method for the intermediate C-1, intermediates C-X in Table 7 below were synthesized by using intermediates B-X in Table 7 below instead of the intermediate B-1 and a raw material 2 in Table 7 below instead of iodobenzene.

TABLE 7
| Intermediate B-X | Raw material 2 | Intermediate C-X | Yield (%) |
| --- | --- | --- | --- |
| 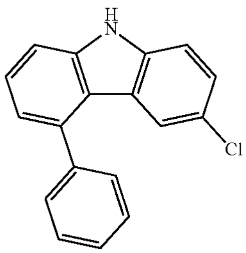 B-1 | 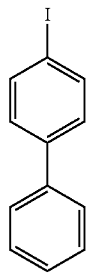 [SMILES: Ic1ccc(-c2ccccc2)cc1] | 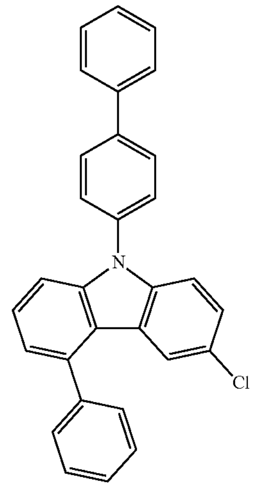 C-2 | 58 |
| 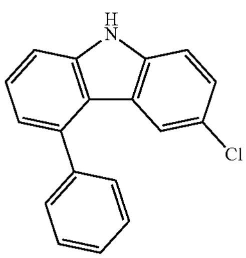 B-1 | 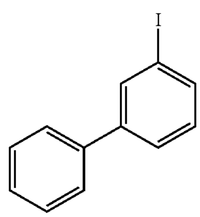 [SMILES: Ic1cccc(-c2ccccc2)c1] | 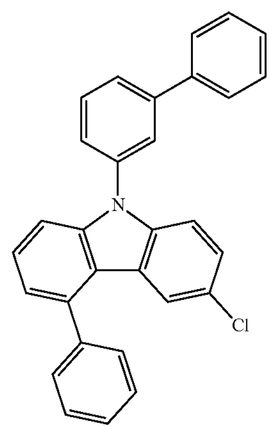 C-3 | 62 |
| 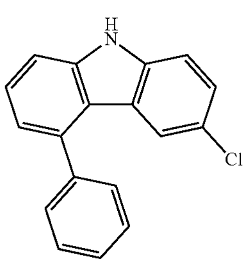 B-1 | 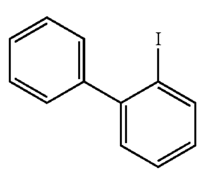 [SMILES: Ic1ccccc1-c1ccccc1] | 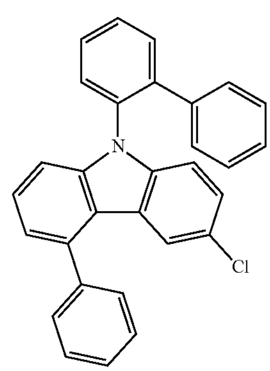 C-4 | 65 |

TABLE 7-continued
| Intermediate B-X | Raw material 2 | Intermediate C-X | Yield (%) |
|---|---|---|---|
| 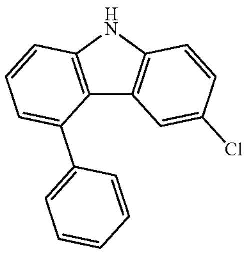 B-1 | 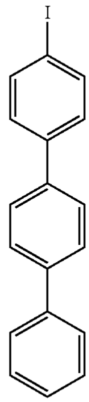 [SMILES: Ic1ccc(-c2ccc(-c3ccccc3)cc2)cc1] | 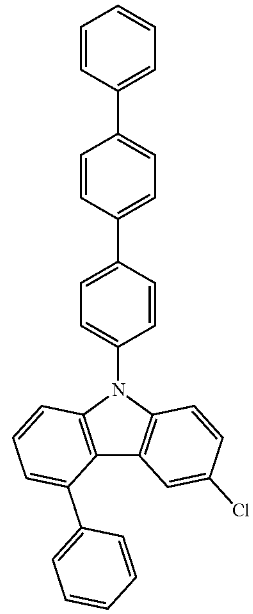 C-5 | 55 |
| 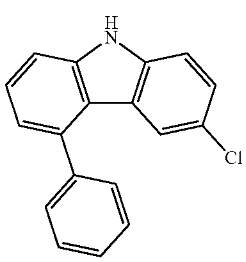 B-1 | 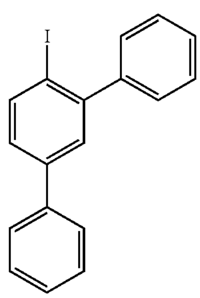 [SMILES: Ic1ccc(-c2ccccc2)cc1-c1ccccc1] | 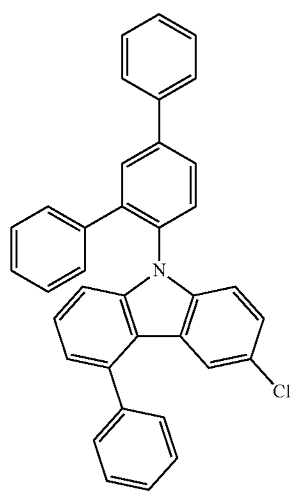 C-6 | 53 |

TABLE 7-continued
| Intermediate B-X | Raw material 2 | Intermediate C-X | Yield (%) |
| --- | --- | --- | --- |
| 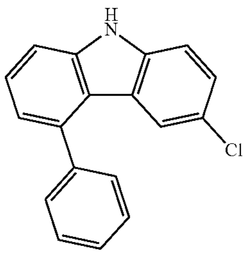 B-1 | 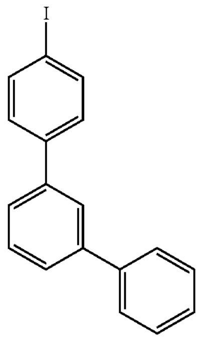 [SMILES: Ic1ccc(-c2cccc(-c3ccccc3)c2)cc1] | 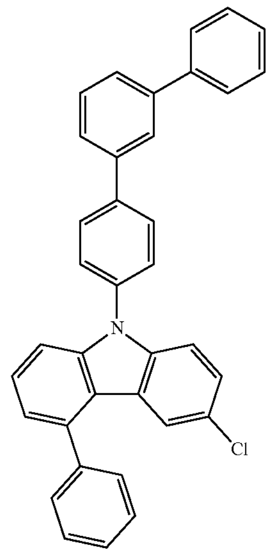 C-7 | 50 |
| 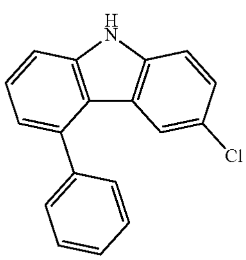 B-1 | 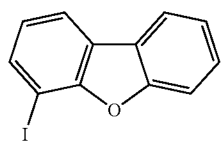 [SMILES: Ic1cccc2c1oc1ccccc12] | 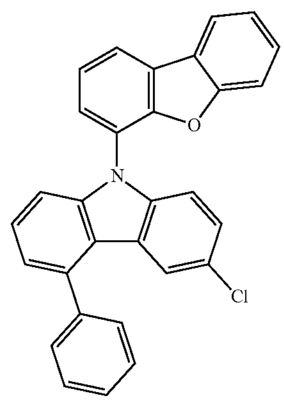 C-8 | 61 |
| 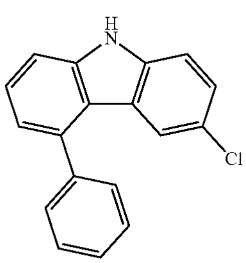 B-1 | 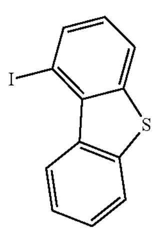 [SMILES: Ic1cccc2sc3ccccc3c12] | 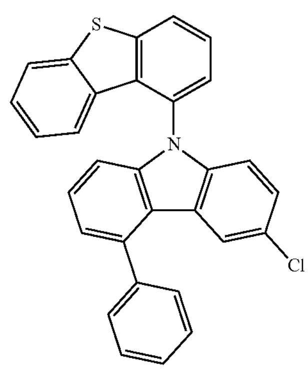 C-9 | 58 |

TABLE 7-continued
| Intermediate B-X | Raw material 2 | Intermediate C-X | Yield (%) |
|---|---|---|---|
| 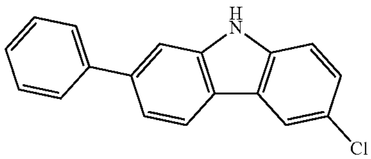 B-2 | 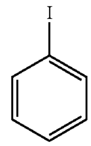 | 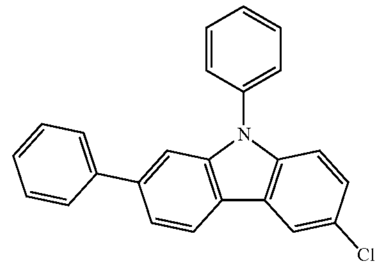 C-10 | 68 |
| 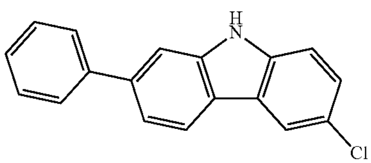 B-2 | 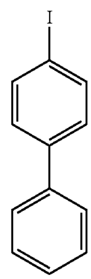 [SMILES: Ic1ccc(-c2ccccc2)cc1] | 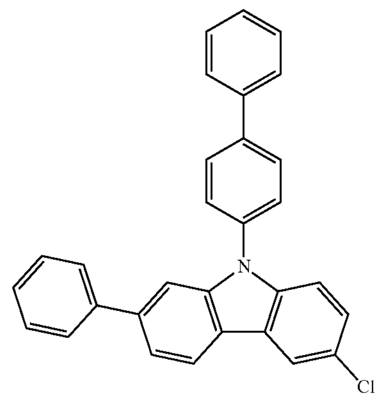 C-11 | 63 |
| 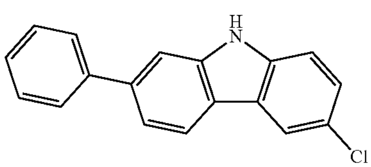 B-2 | 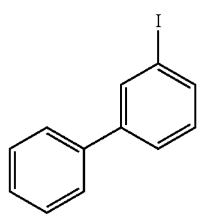 [SMILES: Ic1cccc(-c2ccccc2)c1] | 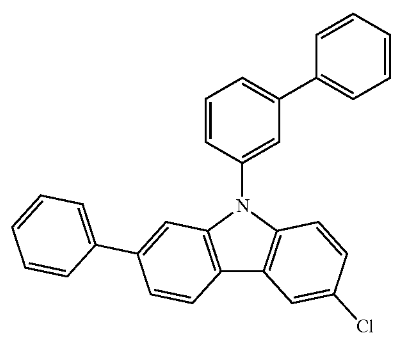 C-12 | 64 |
| 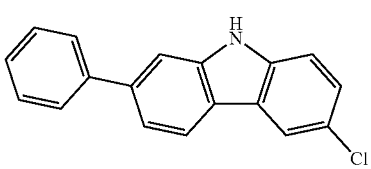 B-2 | 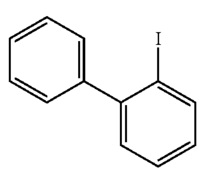 [SMILES: Ic1ccccc1-c1ccccc1] | 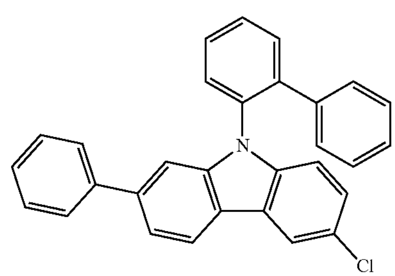 C-13 | 58 |

TABLE 7-continued
| Intermediate B-X | Raw material 2 | Intermediate C-X | Yield (%) |
|---|---|---|---|
| 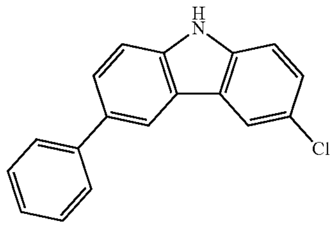 B-3 | 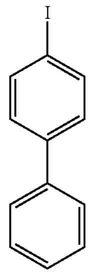 [SMILES: Ic1ccc(-c2ccccc2)cc1] | 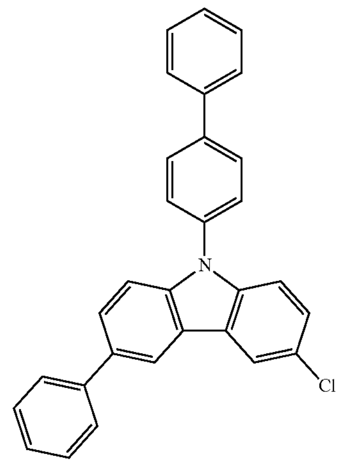 C-14 | 61 |
| 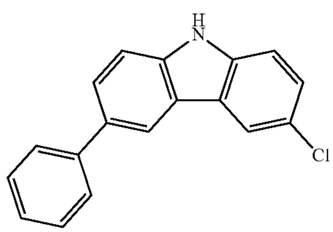 B-3 | 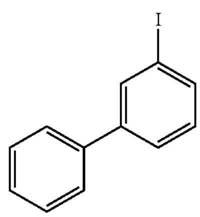 [SMILES: Ic1cccc(-c2ccccc2)c1] | 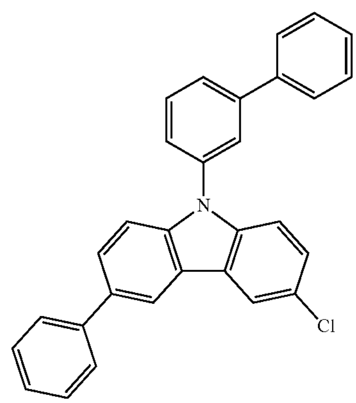 C-15 | 62 |
| 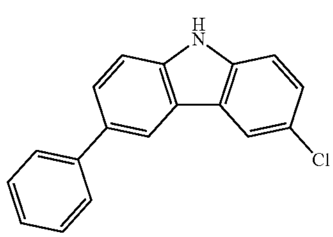 B-3 | 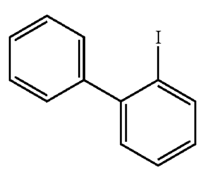 [SMILES: Ic1ccccc1-c1ccccc1] | 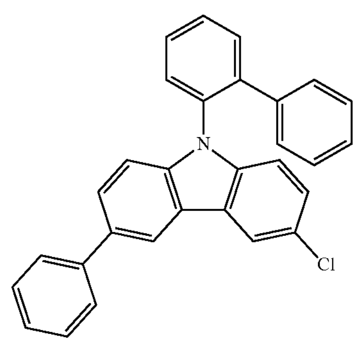 C-16 | 61 |

TABLE 7-continued
| Intermediate B-X | Raw material 2 | Intermediate C-X | Yield (%) |
|---|---|---|---|
| 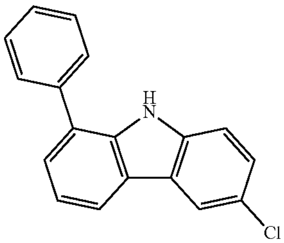 B-4 | 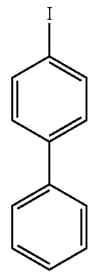 [SMILES: Ic1ccc(-c2ccccc2)cc1] | 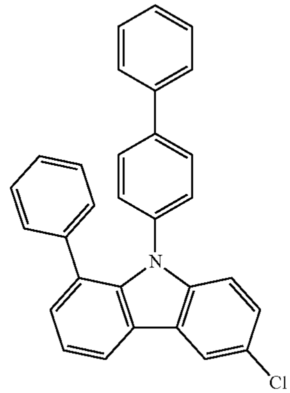 C-17 | 60 |
| 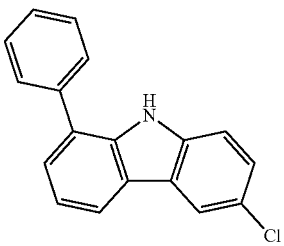 B-4 | 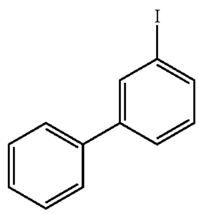 [SMILES: Ic1cccc(-c2ccccc2)c1] | 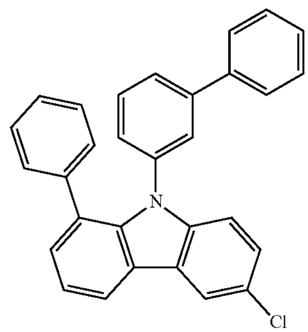 C-18 | 65 |
| 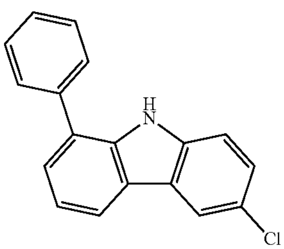 B-4 | 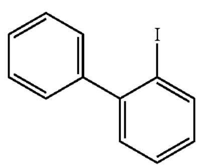 [SMILES: Ic1ccccc1-c1ccccc1] | 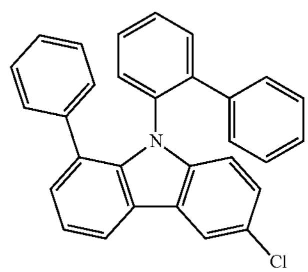 C-19 | 61 |
| 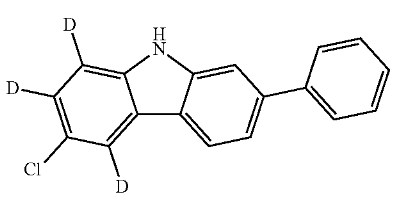 B-5 | 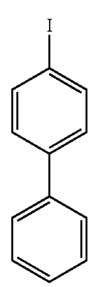 [SMILES: Ic1ccc(-c2ccccc2)cc1] | 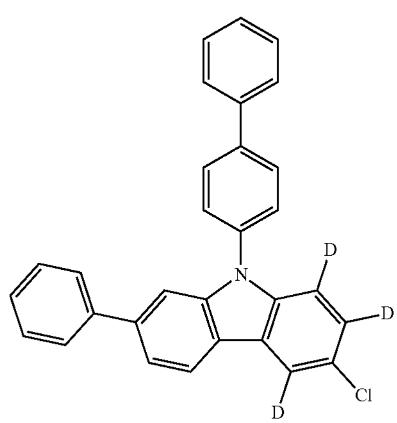 C-20 | 63 |

TABLE 7-continued
| Intermediate B-X | Raw material 2 | Intermediate C-X | Yield (%) |
|---|---|---|---|
| 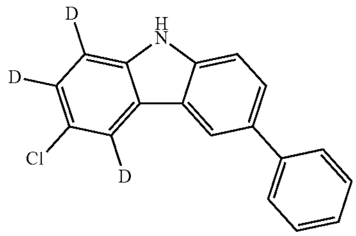 B-6 | 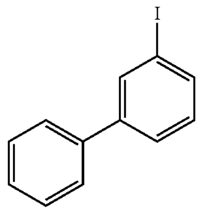 [SMILES: Ic1cccc(-c2ccccc2)c1] | 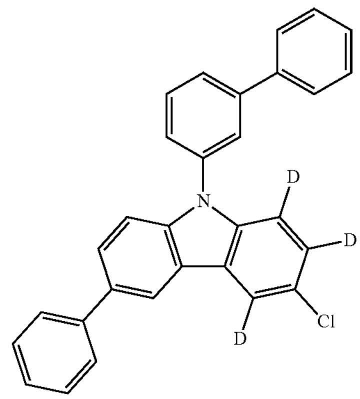 C-21 | 65 |
| 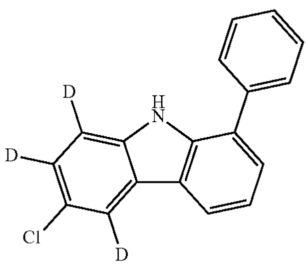 B-7 | 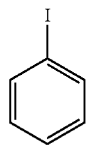 | 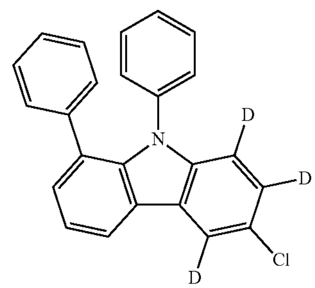 C-22 | 60 |
| 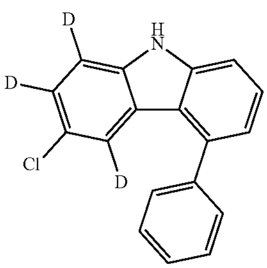 B-8 | 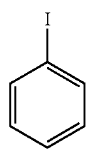 | 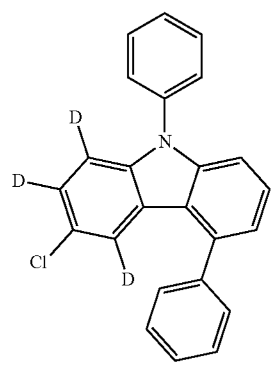 C-23 | 61 |
| 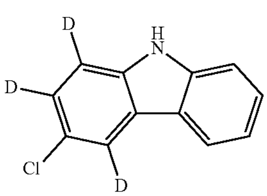 B-9 | 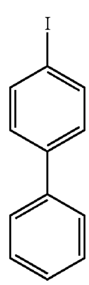 [SMILES: Ic1ccc(-c2ccccc2)cc1] | 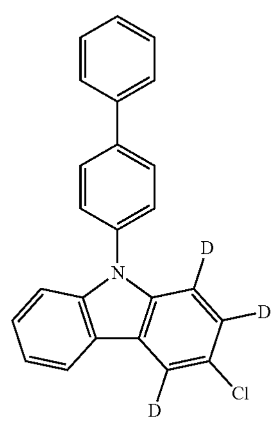 C-24 | 62 |

TABLE 7-continued
| Intermediate B-X | Raw material 2 | Intermediate C-X | Yield (%) |
| --- | --- | --- | --- |
| 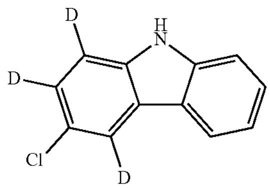 B-9 | 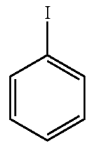 | 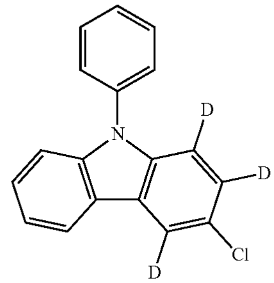 C-25 | 59 |
| 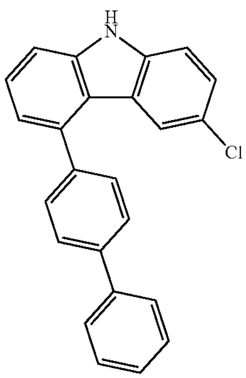 B-10 | 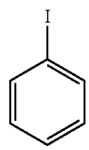 | 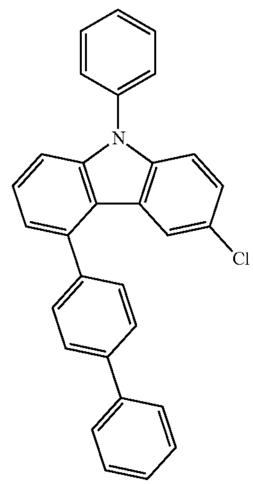 C-26 | 57 |
| 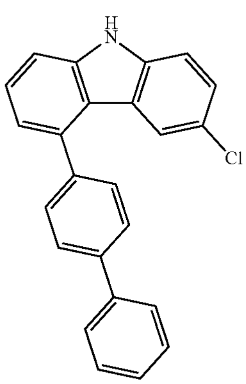 B-10 | 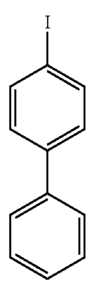 [SMILES: Ic1ccc(-c2ccccc2)cc1] | 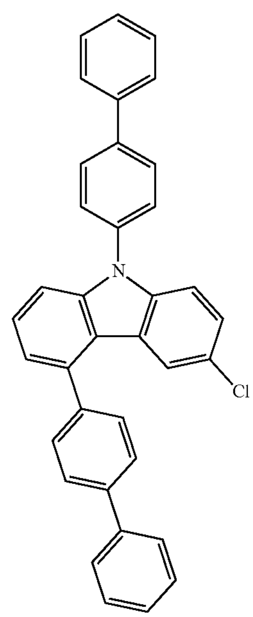 C-27 | 60 |

TABLE 7-continued
| Intermediate B-X | Raw material 2 | Intermediate C-X | Yield (%) |
|---|---|---|---|
| 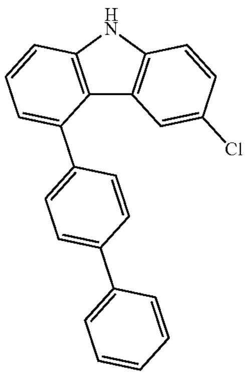 B-10 | 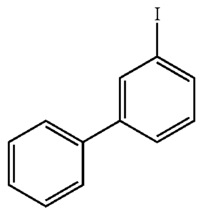 [SMILES: Ic1cccc(-c2ccccc2)c1] | 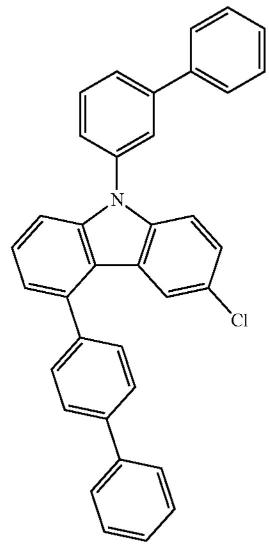 C-28 | 63 |
| 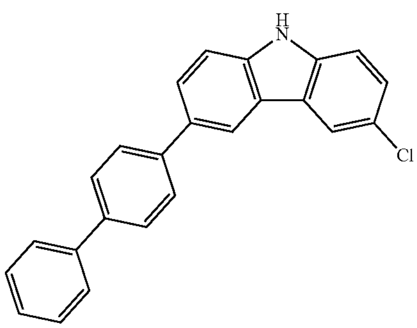 B-11 | 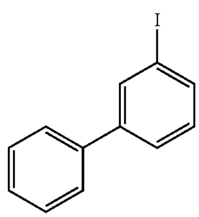 [SMILES: Ic1cccc(-c2ccccc2)c1] | 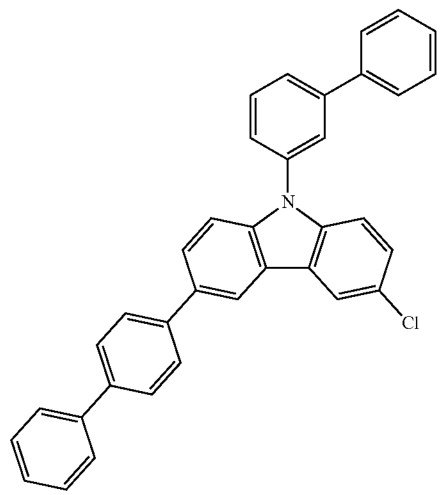 C-29 | 61 |
| 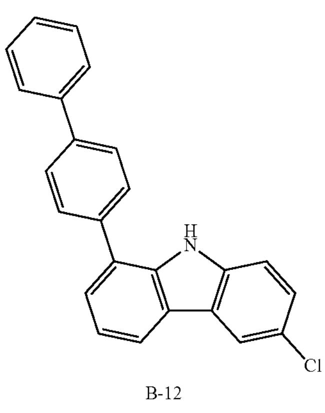 B-12 | 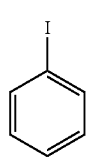 | 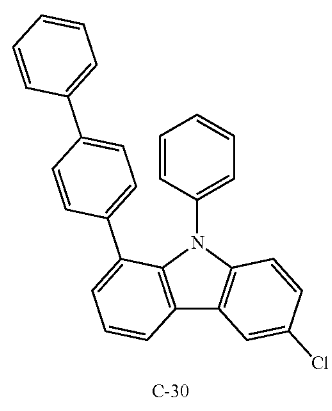 C-30 | 60 |

TABLE 7-continued
| Intermediate B-X | Raw material 2 | Intermediate C-X | Yield (%) |
|---|---|---|---|
| 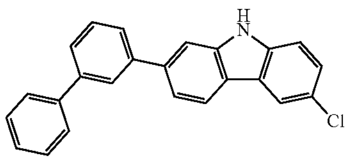 B-13 | 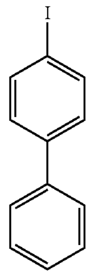 [SMILES: Ic1ccc(-c2ccccc2)cc1] | 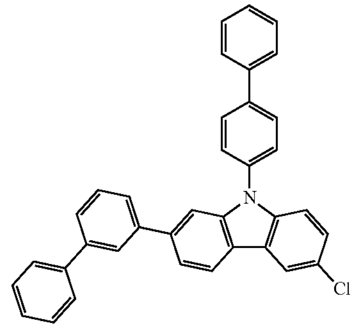 C-31 | 56 |
| 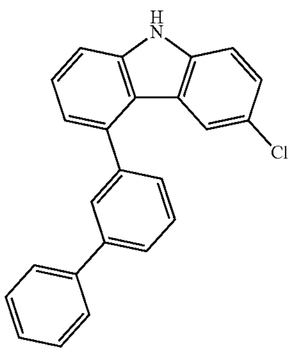 B-14 | 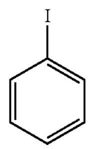 | 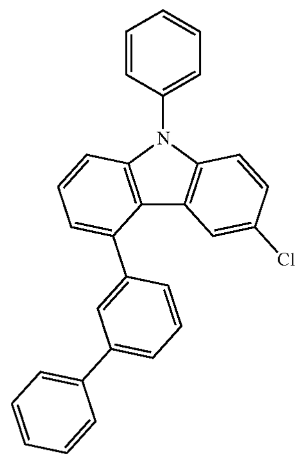 C-32 | 57 |
| 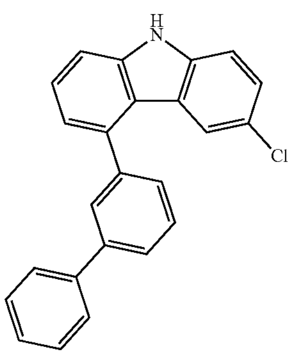 B-14 | 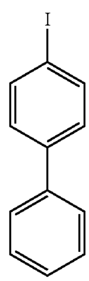 [SMILES: Ic1ccc(-c2ccccc2)cc1] | 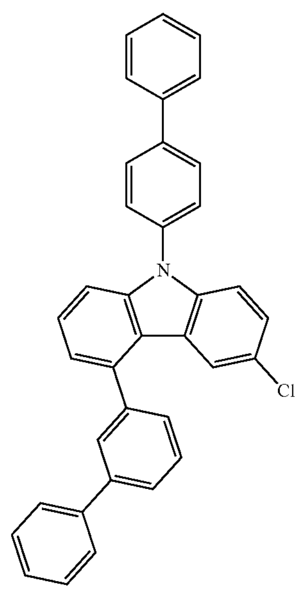 C-33 | 59 |

TABLE 7-continued
| Intermediate B-X | Raw material 2 | Intermediate C-X | Yield (%) |
|---|---|---|---|
| 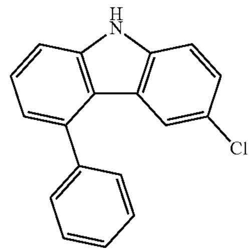 B-1 | 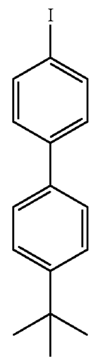 [SMILES: CC(C)(C)c1ccc(-c2ccc(I)cc2)cc1] | 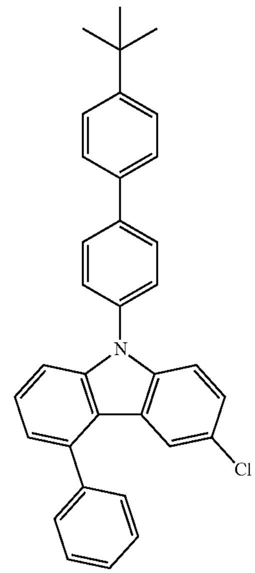 C-34 | 50 |
| 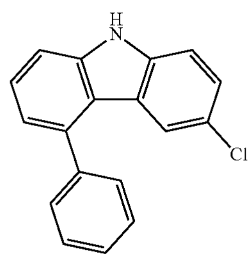 B-1 | 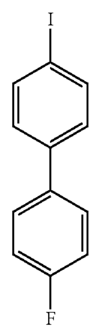 [SMILES: Fc1ccc(-c2ccc(I)cc2)cc1] | 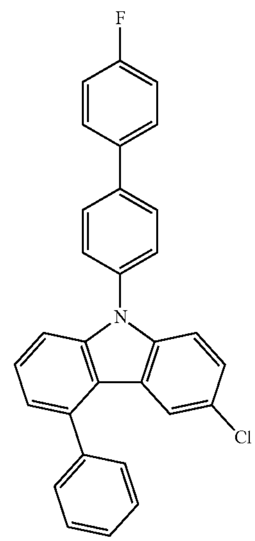 C-35 | 47 |
| 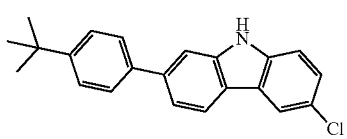 B-15 | 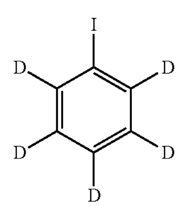 [SMILES: [2H]c1c([2H])c([2H])c(I)c([2H])c1[2H]] | 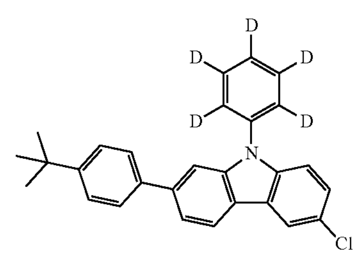 C-36 | 55 |

TABLE 7-continued
| Intermediate B-X | Raw material 2 | Intermediate C-X | Yield (%) |
| --- | --- | --- | --- |
| 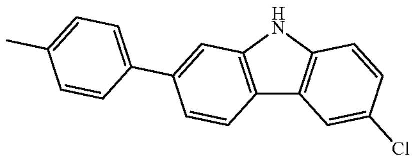 B-16 | 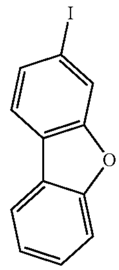 [SMILES: Ic1ccc2c(c1)oc1ccccc12] | 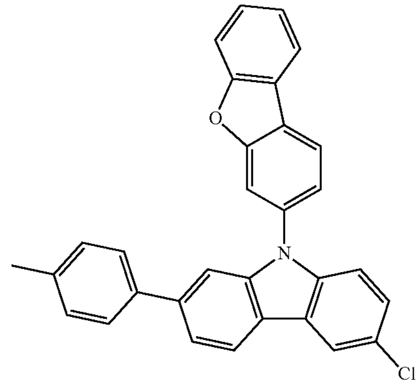 C-37 | 51 |
| 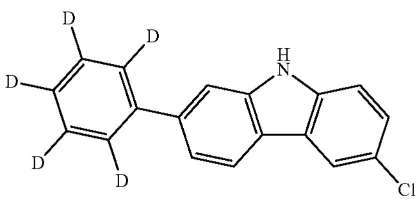 B-17 | 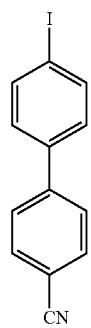 [SMILES: N#Cc1ccc(-c2ccc(I)cc2)cc1] | 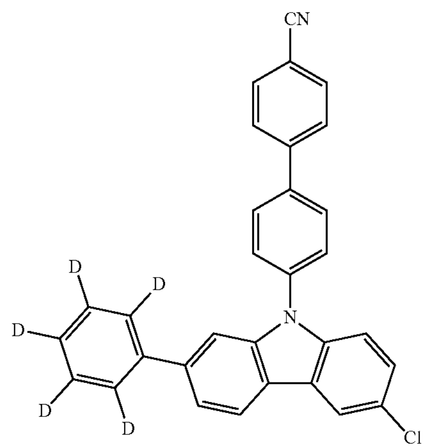 C-38 | 48 |
| 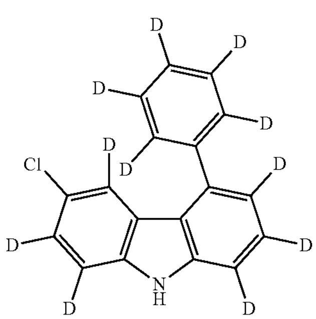 B-18 | 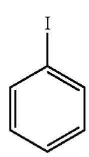 | 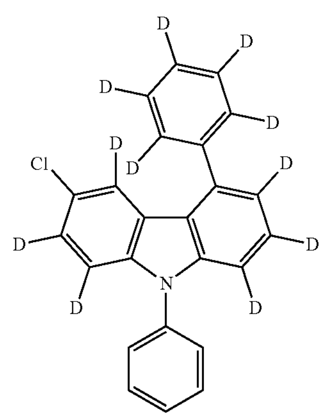 C-39 | 55 |

TABLE 7-continued
| Intermediate B-X | Raw material 2 | Intermediate C-X | Yield (%) |
|---|---|---|---|
| 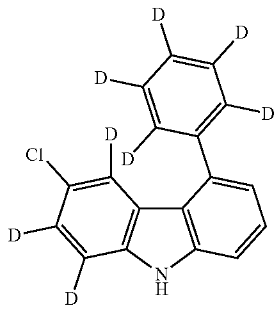 B-19 | 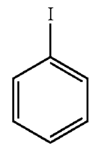 | 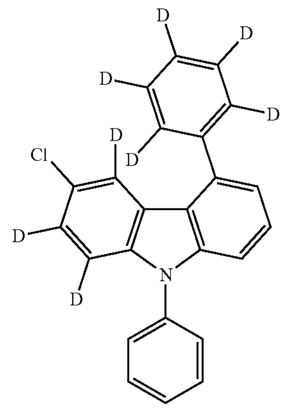 C-40 | 52 |
| 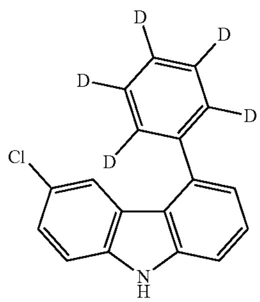 B-20 | 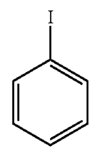 | 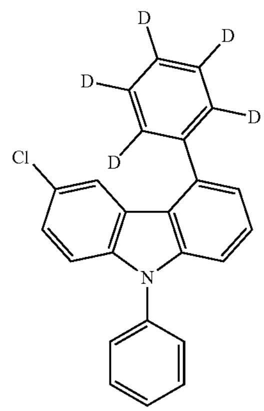 C-41 | 49 |
Synthesis of Intermediate CM-1
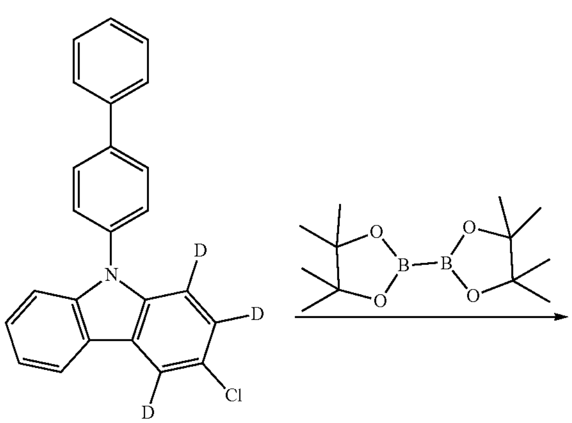
C-24
-continued
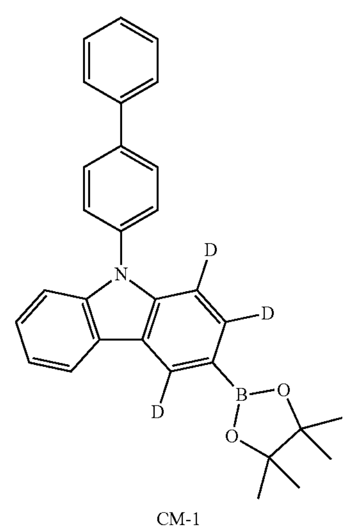
CM-1

The intermediate C-24 (20 g, 56.04 mmol), bis(pinacolato)diboron (21.35 g, 84.06 mmol), tris(dibenzylideneacetone)dipalladium (1.54 g, 1.68 mmol), potassium acetate (11.00 g, 112.09 mmol), 2-dicyclohexylphosphino-2',4',6'-triisopropylbiphenyl (1.60 g, 3.36 mmol), and 1,4-dioxane (200 mL) were added to a dry round bottom flask which was replaced with nitrogen, and the mixture was heated to 100° C. under stirring for 16 h; the reaction mixture was then cooled to room temperature, ethyl acetate (200 mL) and deionized water (200 mL) were added, stirring was performed for 15 min, an organic phase was separated, and dried over anhydrous magnesium sulfate, filtrated, and the filtrate was concentrated in vacuum to obtain a crude product; and the obtained crude product was purified by silica gel column chromatography using dichloromethane/n-heptane as a mobile phase to obtain CM-1 (17.6 g; yield: 70%).

With reference to the synthesis method for CM-1, an intermediate CM-2 in Table 8 below was synthesized by using an intermediate C-25 in Table 8 below instead of the intermediate C-24:

TABLE 8

| Intermediate C-25 | CM-2 | Yield (%) |
|---|---|---|
| 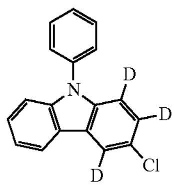 [SMILES: [2H]c1c(Cl)c([2H])c2c3ccccc3n(-c3ccccc3)c2c1[2H]] | 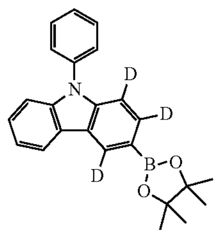 [SMILES: [2H]c1c(B2OC(C)(C)C(C)(C)O2)c([2H])c2c3ccccc3n(-c3ccccc3)c2c1[2H]] | 75 |

Synthesis of Intermediate D-1

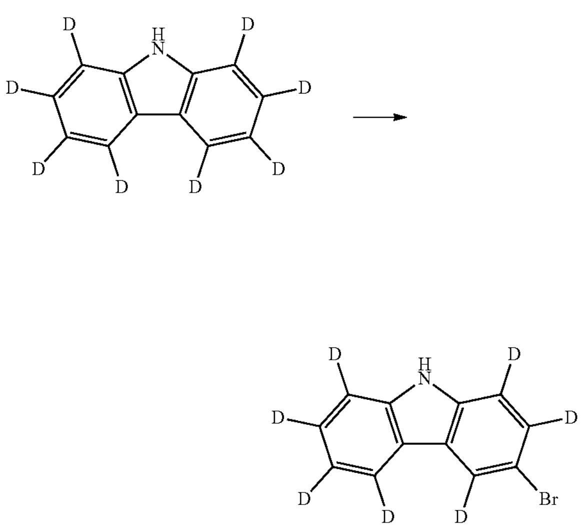

D-1

Deuterated carbazole (20 g, 114.12 mmol), N-bromosuccinimide (NBS) (50.78 g, 285.29 mmol), and DMF (200 mL) were added to a dry round bottom flask which was replaced with nitrogen, and the mixture was stirred at room temperature for 16 h; and then ethyl acetate (200 mL) and deionized water (200 mL) were added to the reaction mixture, an organic phase was separated, and dried over anhydrous magnesium sulfate, filtrated, and the filtrate was concentrated in vacuum to obtain an intermediate D-1 (12.42 g; yield: 43%).

Synthesis of Intermediate E-1

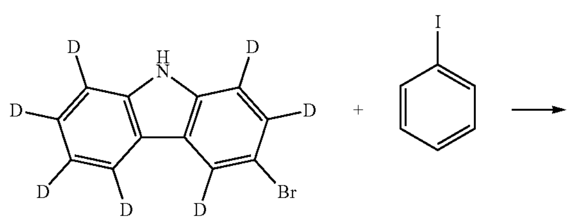

D-1

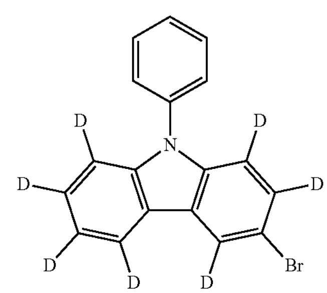

E-1

The intermediate D-1 (10 g, 39.50 mmol), iodobenzene (12.08 g, 59.25 mmol), cuprous iodide (0.75 g, 3.95 mmol), potassium carbonate (13.65 g, 98.76 mmol), o-phenanthroline (0.39 g, 1.98 mmol), 18-crown-6 (1.04 g, 3.95 mmol), and DMF (100 mL) were added to a dry round bottom flask which was replaced with nitrogen, and the mixture was heated to 150° C. under stirring for 16 h; the reaction mixture was then cooled to room temperature, ethyl acetate (200 mL) and deionized water (200 mL) were added, stirring was performed for 15 min, an organic phase was separated, and dried over anhydrous magnesium sulfate, filtrated, and the filtrate was concentrated in vacuum to obtain a crude product; and the obtained crude product was purified by silica gel column chromatography using dichloromethane/n-heptane as a mobile phase to obtain an intermediate E-1 (6.89 g; yield: 53%).

With reference to the synthesis method for the intermediate E-1, intermediates E-X in Table 9 below were synthesized by using a raw material 3 in Table 9 below instead of iodobenzene.

TABLE 9
| Intermediate D-1 | Raw material 3 | Intermediate E-X | Yield (%) |
|---|---|---|---|
| 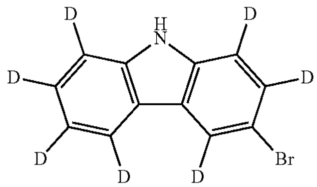 [SMILES: [2H]c1c([2H])c([2H])c2c([nH]c3c([2H])c([2H])c(Br)c([2H])c32)c1[2H]] | 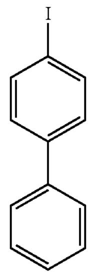 [SMILES: Ic1ccc(-c2ccccc2)cc1] | 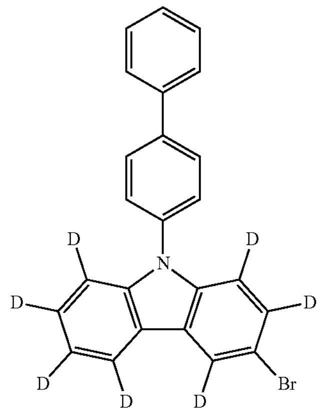 E-2 | 54 |
| 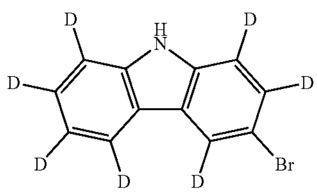 [SMILES: [2H]c1c([2H])c([2H])c2c([nH]c3c([2H])c([2H])c(Br)c([2H])c32)c1[2H]] | 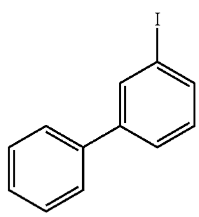 [SMILES: Ic1cccc(-c2ccccc2)c1] | 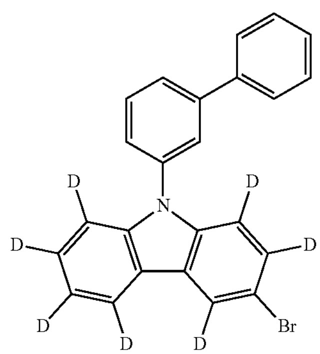 E-3 | 56 |
| 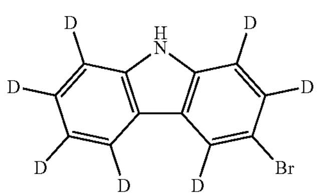 [SMILES: [2H]c1c([2H])c([2H])c2c([nH]c3c([2H])c([2H])c(Br)c([2H])c32)c1[2H]] | 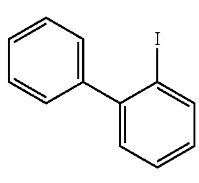 [SMILES: Ic1ccccc1-c1ccccc1] | 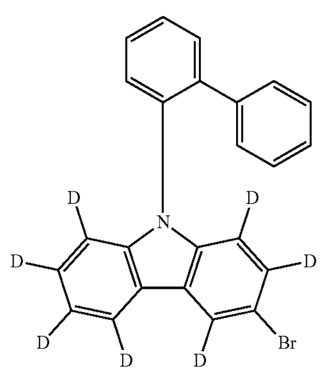 E-4 | 51 |

TABLE 9-continued
| Intermediate D-1 | Raw material 3 | Intermediate E-X | Yield (%) |
|---|---|---|---|
| 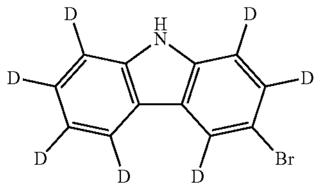 [SMILES: [2H]c1c([2H])c([2H])c2c([nH]c3c([2H])c([2H])c(Br)c([2H])c32)c1[2H]] | 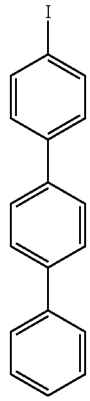 [SMILES: Ic1ccc(-c2ccc(-c3ccccc3)cc2)cc1] | 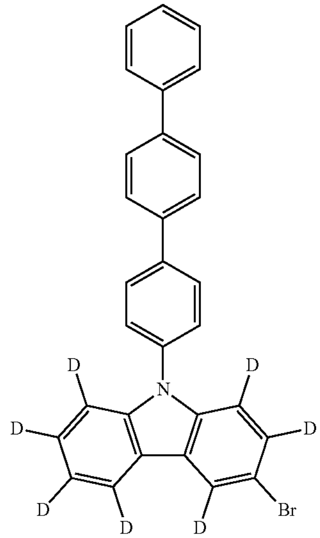 E-5 | 53 |
| 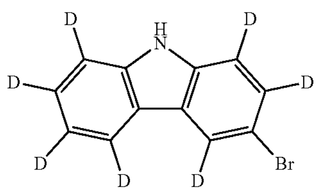 [SMILES: [2H]c1c([2H])c([2H])c2c([nH]c3c([2H])c([2H])c(Br)c([2H])c32)c1[2H]] | 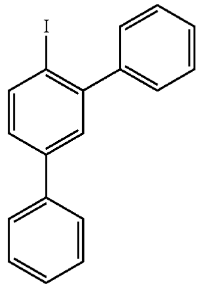 [SMILES: Ic1ccc(-c2ccccc2)cc1-c1ccccc1] | 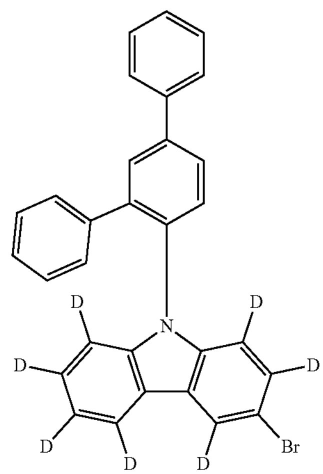 E-6 | 49 |
| 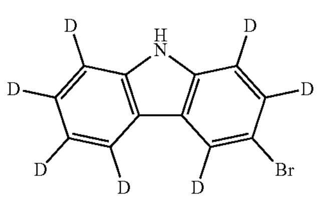 [SMILES: [2H]c1c([2H])c([2H])c2c([nH]c3c([2H])c([2H])c(Br)c([2H])c32)c1[2H]] | 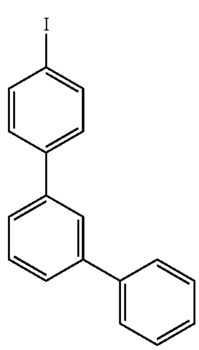 [SMILES: Ic1ccc(-c2cccc(-c3ccccc3)c2)cc1] | 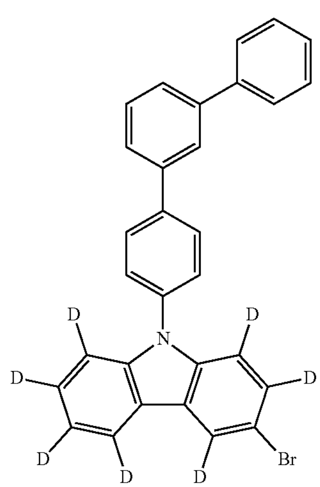 E-7 | 51 |

TABLE 9-continued
| Intermediate D-1 | Raw material 3 | Intermediate E-X | Yield (%) |
|---|---|---|---|
| 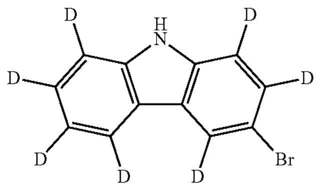 [SMILES: [2H]c1c([2H])c([2H])c2c([nH]c3c([2H])c([2H])c(Br)c([2H])c32)c1[2H]] | 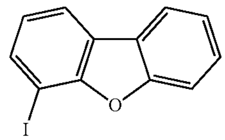 [SMILES: Ic1cccc2c1oc1ccccc12] | 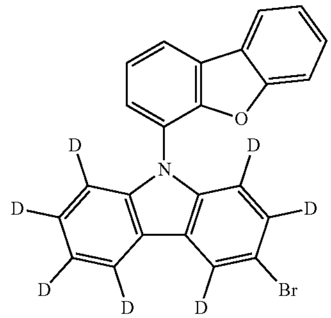 E-8 | 50 |
| 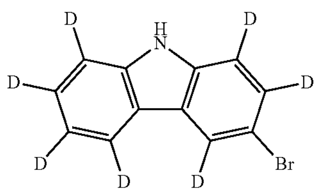 [SMILES: [2H]c1c([2H])c([2H])c2c([nH]c3c([2H])c([2H])c(Br)c([2H])c32)c1[2H]] | 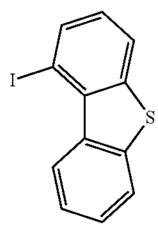 [SMILES: Ic1cccc2sc3ccccc3c12] | 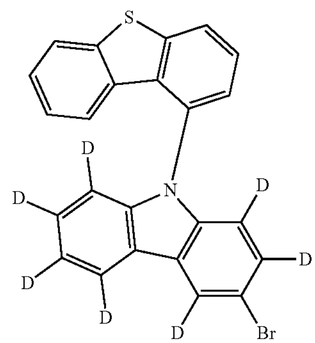 E-9 | 62 |
| 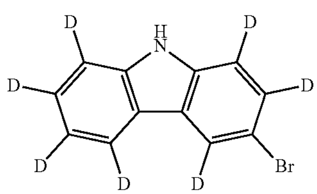 [SMILES: [2H]c1c([2H])c([2H])c2c([nH]c3c([2H])c([2H])c(Br)c([2H])c32)c1[2H]] | 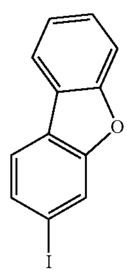 [SMILES: Ic1ccc2c(c1)oc1ccccc12] | 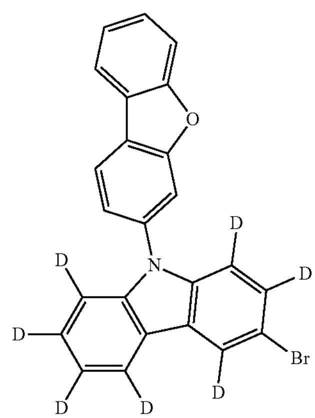 E-10 | 56 |
| 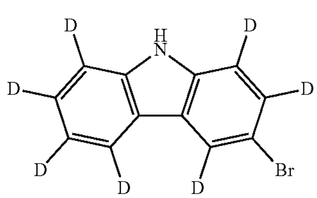 [SMILES: [2H]c1c([2H])c([2H])c2c([nH]c3c([2H])c([2H])c(Br)c([2H])c32)c1[2H]] | 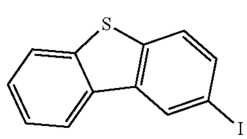 [SMILES: Ic1ccc2sc3ccccc3c2c1] | 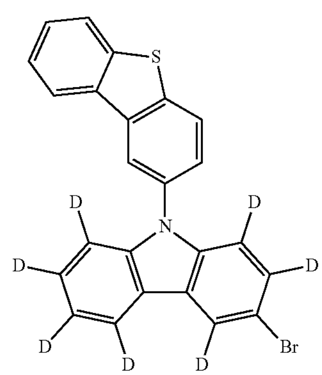 E-11 | 61 |

TABLE 9-continued
| Intermediate D-1 | Raw material 3 | Intermediate E-X | Yield (%) |
|---|---|---|---|
| 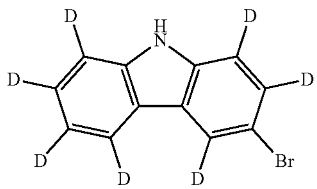 [SMILES: [2H]c1c([2H])c([2H])c2c([nH]c3c([2H])c([2H])c(Br)c([2H])c32)c1[2H]] | 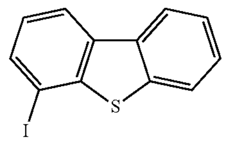 [SMILES: Ic1cccc2c1sc1ccccc12] | 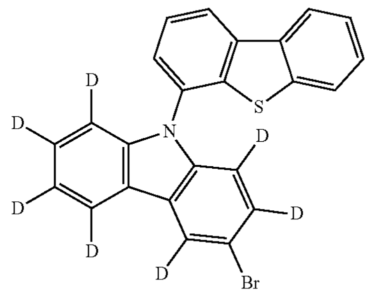 E-12 | 63 |
| 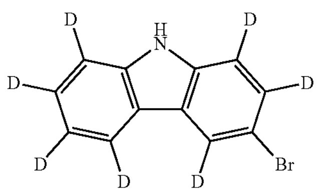 [SMILES: [2H]c1c([2H])c([2H])c2c([nH]c3c([2H])c([2H])c(Br)c([2H])c32)c1[2H]] | 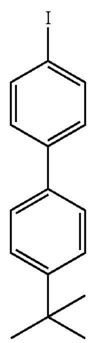 [SMILES: CC(C)(C)c1ccc(-c2ccc(I)cc2)cc1] | 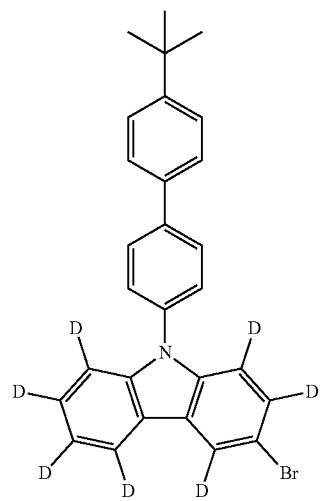 E-13 | 58 |
| 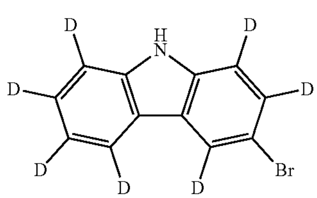 [SMILES: [2H]c1c([2H])c([2H])c2c([nH]c3c([2H])c([2H])c(Br)c([2H])c32)c1[2H]] | 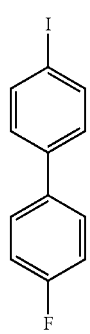 [SMILES: Fc1ccc(-c2ccc(I)cc2)cc1] | 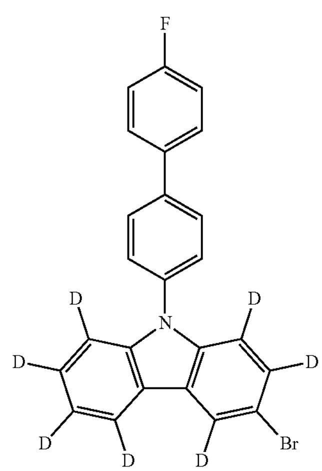 E-14 | 61 |

TABLE 9-continued
| Intermediate D-1 | Raw material 3 | Intermediate E-X | Yield (%) |
| --- | --- | --- | --- |
| 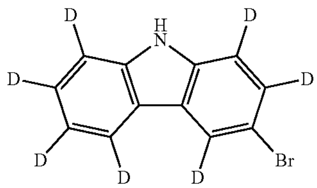 [SMILES: [2H]c1c([2H])c([2H])c2c([nH]c3c([2H])c([2H])c(Br)c([2H])c32)c1[2H]] | 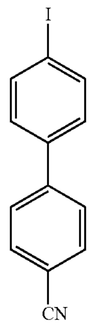 | 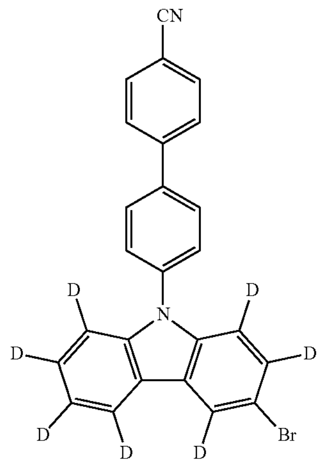 E-15 | 64 |
| 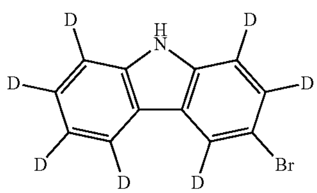 [SMILES: [2H]c1c([2H])c([2H])c2c([nH]c3c([2H])c([2H])c(Br)c([2H])c32)c1[2H]] | 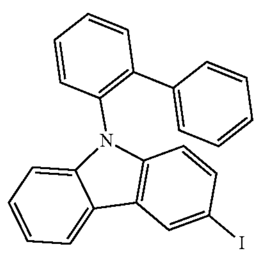 [SMILES: Ic1ccc2c(c1)c1ccccc1n2-c1ccccc1-c1ccccc1] | 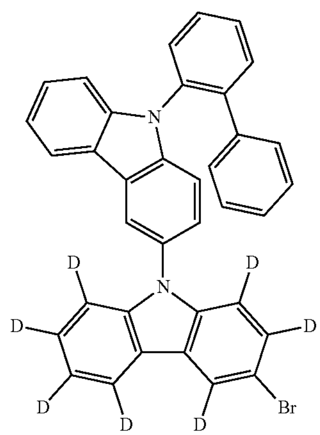 E-16 | 66 |
Synthesis of Intermediate F-1
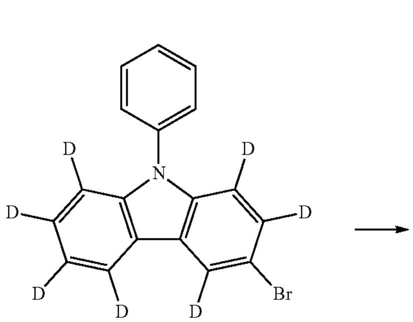
E-1
-continued
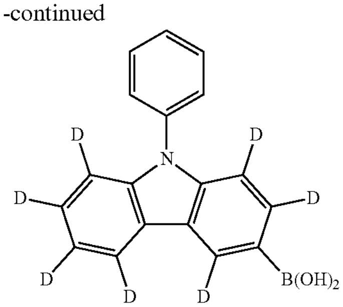
F-1
The intermediate E-1 (10 g, 30.37 mmol) was added to a three-necked flask containing THF (100 ml), n-butyllithium (2.07 g, 31.89 mmol) was added dropwise at −80° C., heat preservation was performed for 1 h after adding dropwise was completed, trimethyl borate (4.73 g, 45.56 mmol) was added dropwise, heat preservation was continued to be performed for 1 h, heating was performed to room temperature, and stirring was performed overnight. Hydrochloric acid (2 mol/L) was added to adjust a pH to be neutral, filtration was performed to obtain a white crude product, and the obtained crude product was pulped with n-heptane to obtain an intermediate F-1 (5.36 g, yield: 60%).

With reference to the synthesis method for the intermediate F-1, intermediates F-X in Table 10 below were synthesized by using a raw material 4 in Table 10 below instead of E-1.

TABLE 10

| Raw material 4 | Intermediate F-X | Yield (%) |
|---|---|---|
| 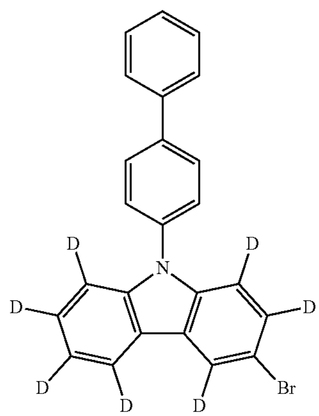 E-2 | 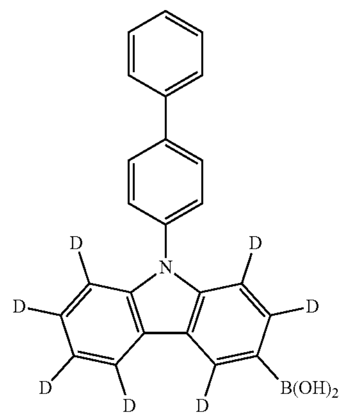 F-2 | 55 |
| 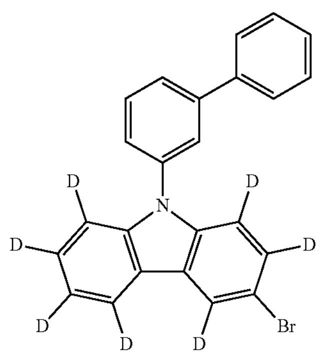 E-3 | 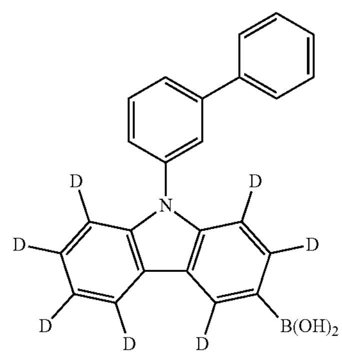 F-3 | 62 |
| 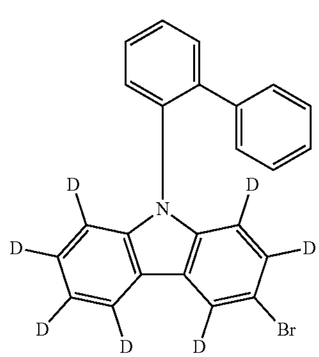 E-4 | 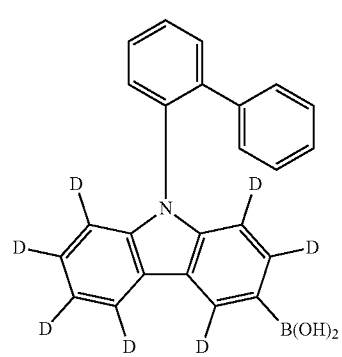 F-4 | 59 |

TABLE 10-continued
| Raw material 4 | Intermediate F-X | Yield (%) |
|---|---|---|
| 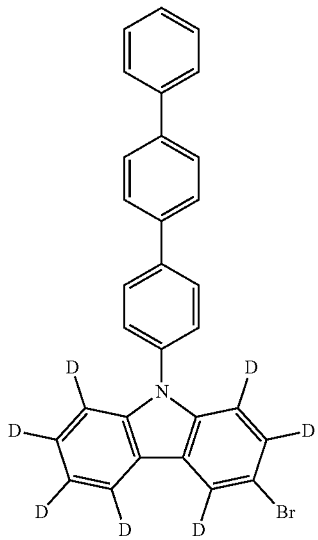 E-5 | 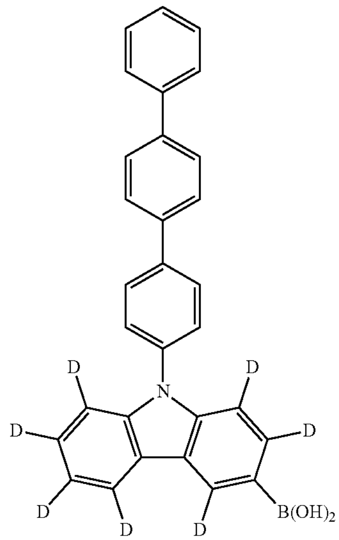 F-5 | 58 |
| 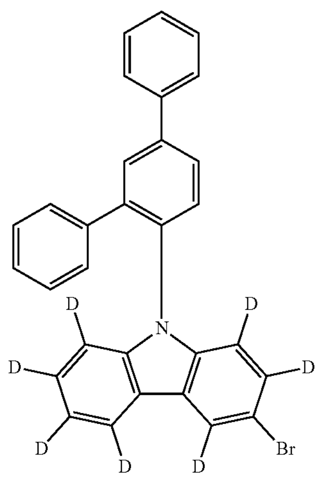 E-6 | 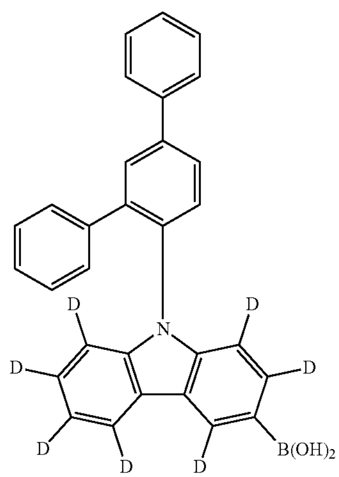 F-6 | 56 |
| 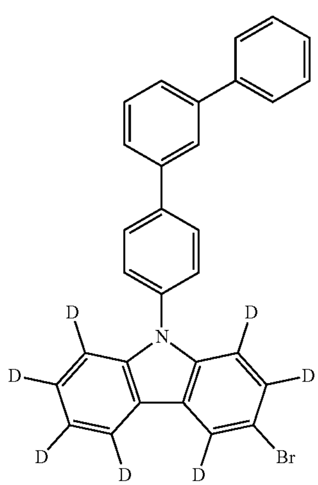 E-7 | 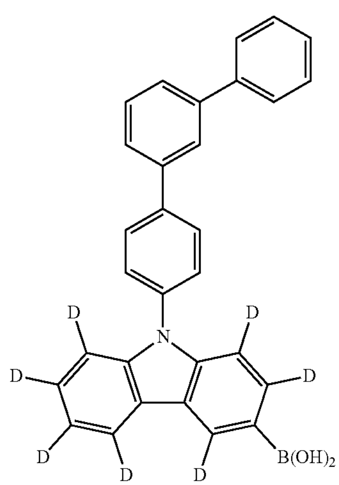 F-7 | 53 |

TABLE 10-continued
| Raw material 4 | Intermediate F-X | Yield (%) |
|---|---|---|
| 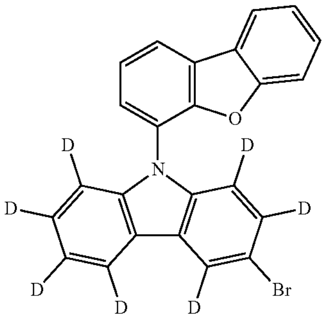 E-8 | 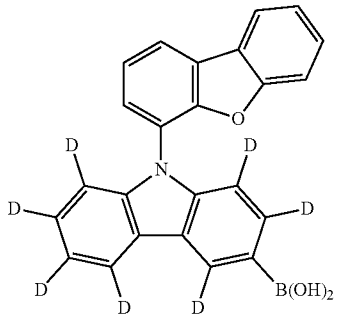 F-8 | 50 |
| 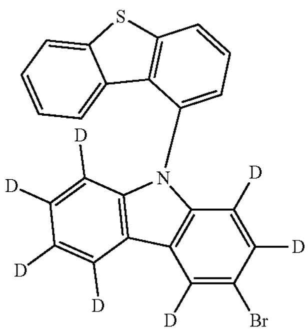 E-9 | 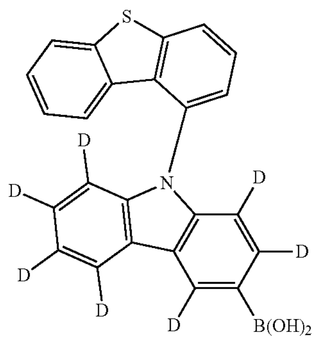 F-9 | 55 |
| 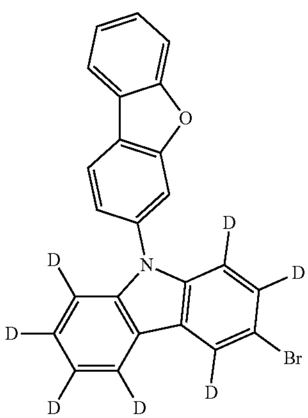 E-10 | 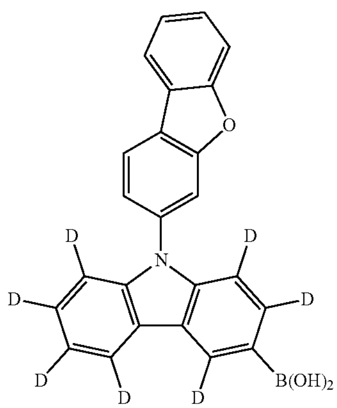 F-10 | 51 |
| 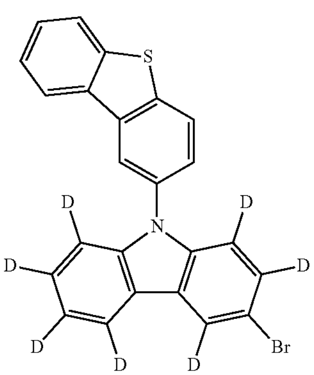 E-11 | 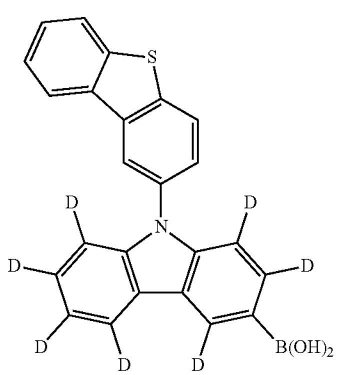 F-11 | 60 |

TABLE 10-continued
| Raw material 4 | Intermediate F-X | Yield (%) |
|---|---|---|
| 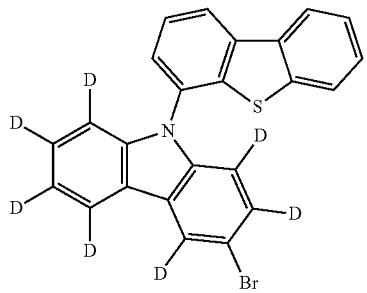 E-12 | 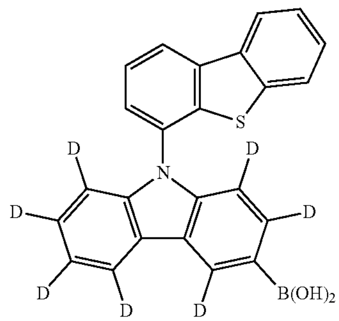 F-12 | 52 |
| 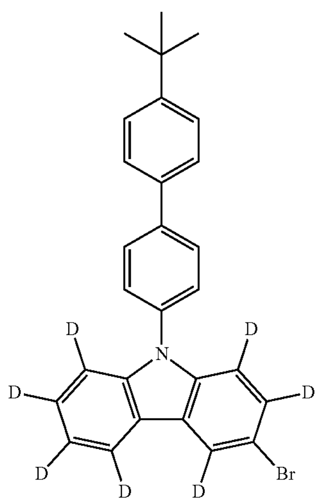 E-13 | 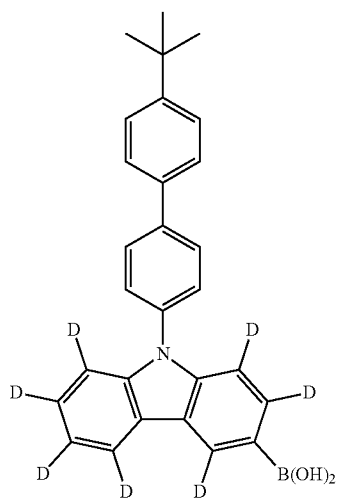 F-13 | 50 |
| 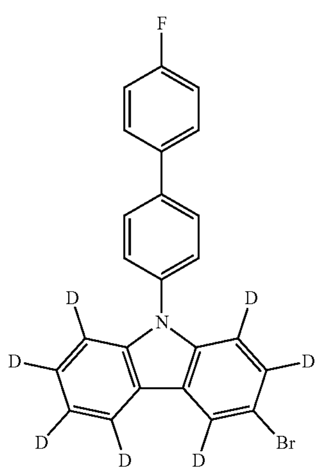 E-14 | 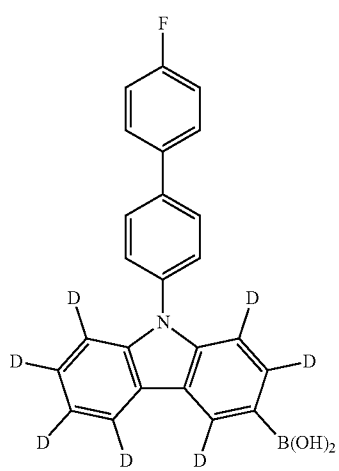 F-14 | 63 |

TABLE 10-continued
| Raw material 4 | Intermediate F-X | Yield (%) |
|---|---|---|
| 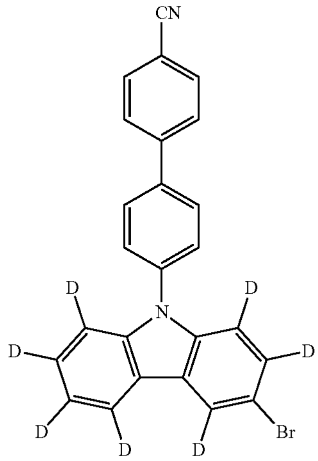 E-15 | 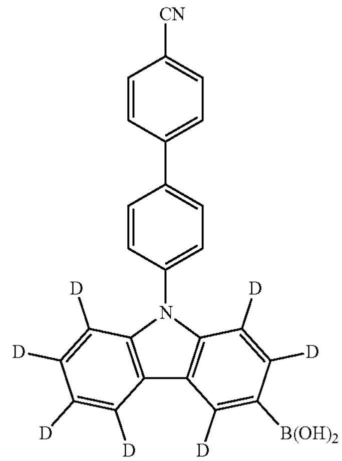 F-15 | 59 |
| 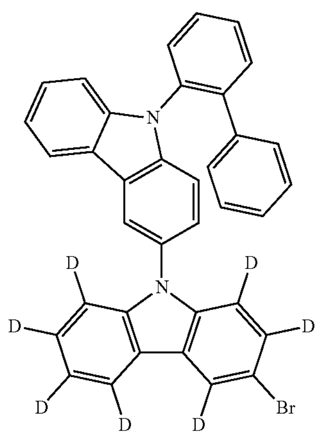 E-16 | 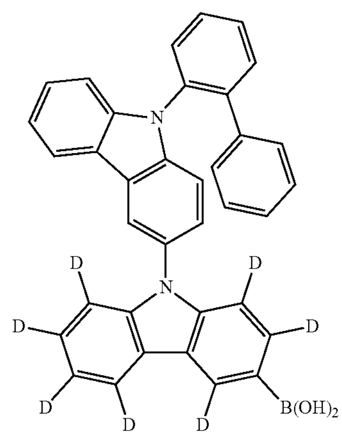 F-16 | 55 |
Synthesis of Compound 221
-continued
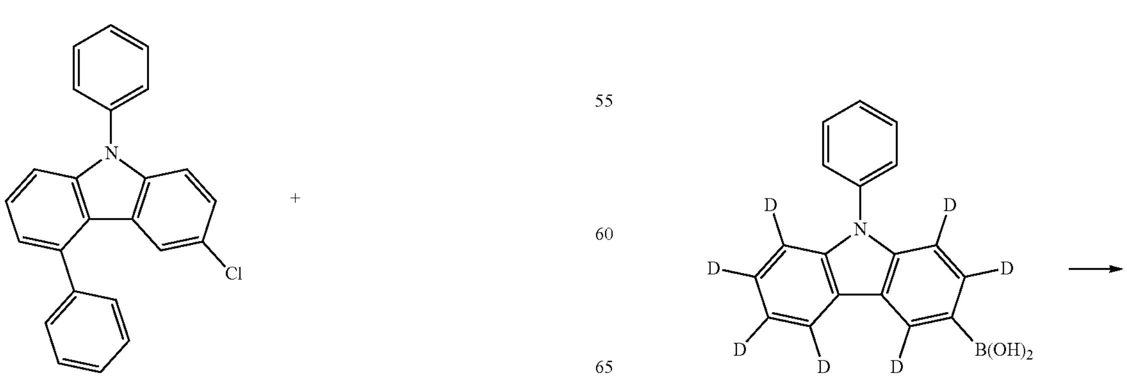
C-1 F-1

-continued

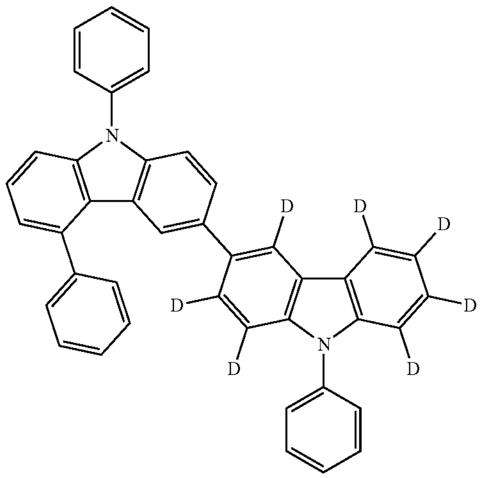

221

The intermediate C-1 (10 g, 28.26 mmol), the intermediate F-1 (8.72 g, 29.67 mmol), palladium acetate (0.06 g, 0.28 mmol), X-Phos (0.27 g, 0.56 mmol), potassium carbonate (7.81 g, 56.52 mmol), toluene (80 mL), ethanol (40 mL), and deionized water (20 mL) were added to a dry round bottom flask which was replaced with nitrogen, and the mixture was heated to 75° C. to under stirring for 8 h; the reaction mixture was then cooled to room temperature, deionized water (200 mL) was added, stirring was performed for 15 min, an organic phase was separated, and dried over anhydrous magnesium sulfate, filtrated, and the filtrate was concentrated in vacuum to obtain a crude product; and the obtained crude product was purified by silica gel column chromatography using dichloromethane/n-heptane as a mobile phase to obtain a compound 221 (12.03 g; yield: 75%).

With reference to the synthesis method for the compound 221, compounds in Table 11 below were synthesized by using a raw material C in Table 11 below instead of the intermediate C-1 and a raw material F in Table 11 below instead of the intermediate F-1.

TABLE 11

| Raw material C | Raw material F | Compound | Yield (%) |
|---|---|---|---|
| 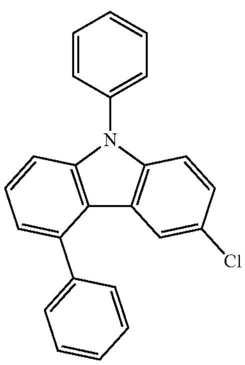 [SMILES: Clc1ccc2c(c1)c1c(-c3ccccc3)cccc1n2-c1ccccc1] C-1 | 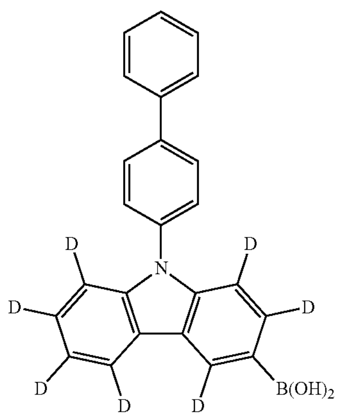 [SMILES: [2H]c1c([2H])c([2H])c2c(c1[2H])c1c([2H])c(B(O)O)c([2H])c([2H])c1n2-c1ccc(-c2ccccc2)cc1] F-2 | 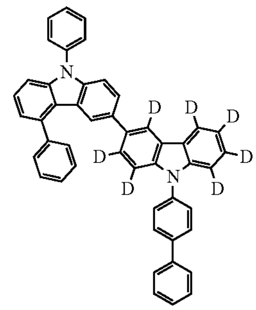 [SMILES: [2H]c1c([2H])c([2H])c2c(c1[2H])c1c([2H])c(-c3ccc4c(c3)c3c(-c5ccccc5)cccc3n4-c3ccccc3)c([2H])c([2H])c1n2-c1ccc(-c2ccccc2)cc1] 223 | 70 |
| 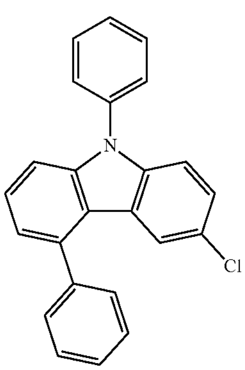 [SMILES: Clc1ccc2c(c1)c1c(-c3ccccc3)cccc1n2-c1ccccc1] | 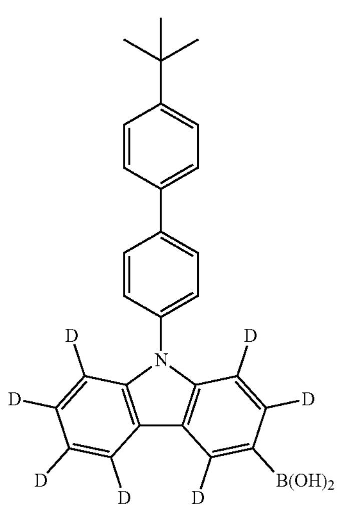 F-13 | 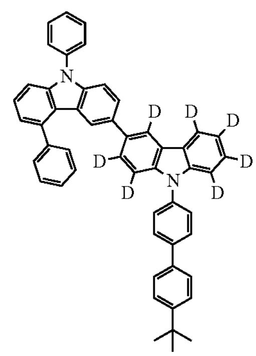 [SMILES: [2H]c1c([2H])c([2H])c2c(c1[2H])c1c([2H])c(-c3ccc4c(c3)c3c(-c5ccccc5)cccc3n4-c3ccccc3)c([2H])c([2H])c1n2-c1ccc(-c2ccc(C(C)(C)C)cc2)cc1] 543 | 68 |

TABLE 11-continued
| Raw material C | Raw material F | Compound | Yield (%) |
| --- | --- | --- | --- |
| 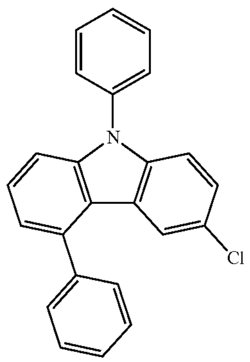 [SMILES: Clc1ccc2c(c1)c1c(-c3ccccc3)cccc1n2-c1ccccc1] | 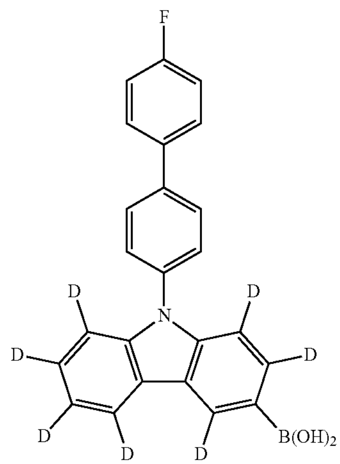 [SMILES: [2H]c1c([2H])c([2H])c2c(c1[2H])c1c([2H])c(B(O)O)c([2H])c([2H])c1n2-c1ccc(-c2ccc(F)cc2)cc1] F-14 | 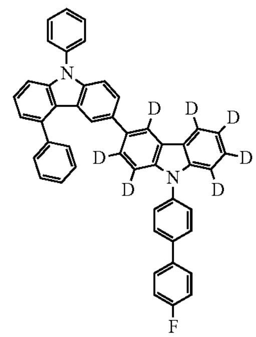 [SMILES: [2H]c1c([2H])c([2H])c2c(c1[2H])c1c([2H])c(-c3ccc4c(c3)c3c(-c5ccccc5)cccc3n4-c3ccccc3)c([2H])c([2H])c1n2-c1ccc(-c2ccc(F)cc2)cc1] 544 | 65 |
| 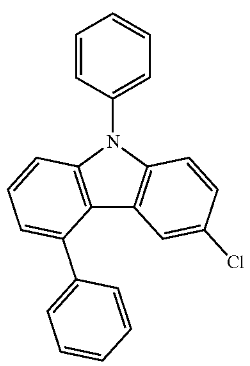 [SMILES: Clc1ccc2c(c1)c1c(-c3ccccc3)cccc1n2-c1ccccc1] | 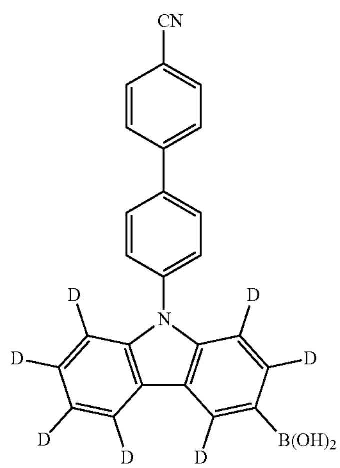 [SMILES: [2H]c1c([2H])c([2H])c2c(c1[2H])c1c([2H])c(B(O)O)c([2H])c([2H])c1n2-c1ccc(-c2ccc(C#N)cc2)cc1] F-15 | 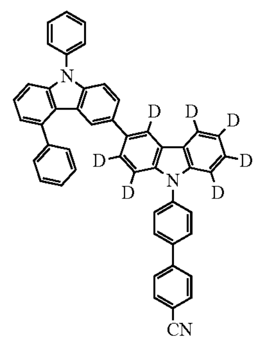 [SMILES: [2H]c1c([2H])c([2H])c2c(c1[2H])c1c([2H])c(-c3ccc4c(c3)c3c(-c5ccccc5)cccc3n4-c3ccccc3)c([2H])c([2H])c1n2-c1ccc(-c2ccc(C#N)cc2)cc1] 545 | 60 |
| 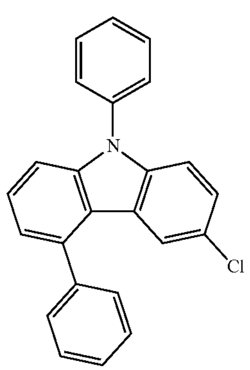 [SMILES: Clc1ccc2c(c1)c1c(-c3ccccc3)cccc1n2-c1ccccc1] C-1 | 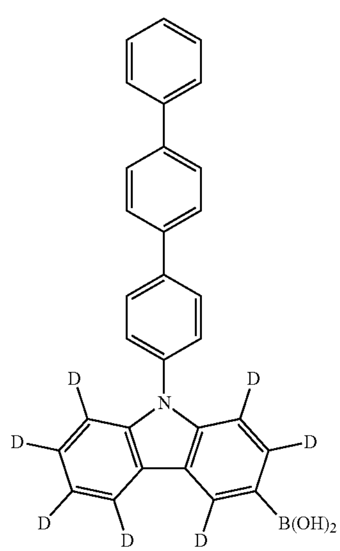 [SMILES: [2H]c1c([2H])c([2H])c2c(c1[2H])c1c([2H])c(B(O)O)c([2H])c([2H])c1n2-c1ccc(-c2ccc(-c3ccccc3)cc2)cc1] | 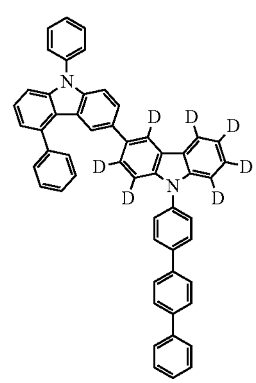 [SMILES: [2H]c1c([2H])c([2H])c2c(c1[2H])c1c([2H])c(-c3ccc4c(c3)c3c(-c5ccccc5)cccc3n4-c3ccccc3)c([2H])c([2H])c1n2-c1ccc(-c2ccc(-c3ccccc3)cc2)cc1] 237 | 71 |

TABLE 11-continued
| Raw material C | Raw material F | Compound | Yield (%) |
|---|---|---|---|
| | F-5 | | |
| 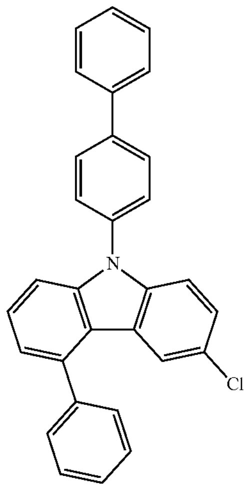 [SMILES: Clc1ccc2c(c1)c1c(-c3ccccc3)cccc1n2-c1ccc(-c2ccccc2)cc1] C-2 | 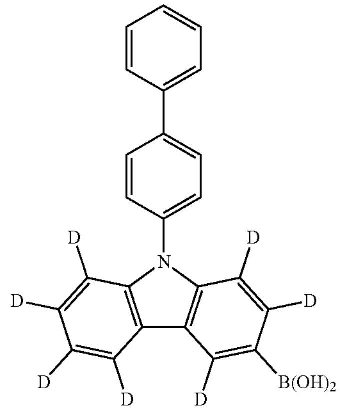 [SMILES: [2H]c1c([2H])c([2H])c2c(c1[2H])c1c([2H])c(B(O)O)c([2H])c([2H])c1n2-c1ccc(-c2ccccc2)cc1] F-2 | 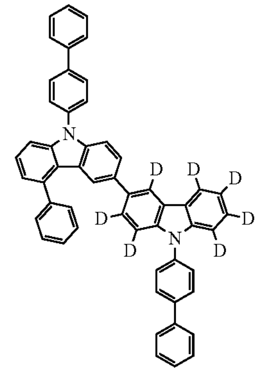 [SMILES: [2H]c1c([2H])c([2H])c2c(c1[2H])c1c([2H])c(-c3ccc4c(c3)c3c(-c5ccccc5)cccc3n4-c3ccc(-c4ccccc4)cc3)c([2H])c([2H])c1n2-c1ccc(-c2ccccc2)cc1] 243 | 73 |
| 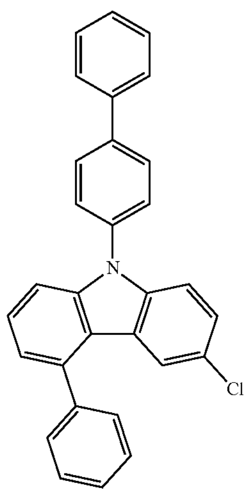 [SMILES: Clc1ccc2c(c1)c1c(-c3ccccc3)cccc1n2-c1ccc(-c2ccccc2)cc1] | 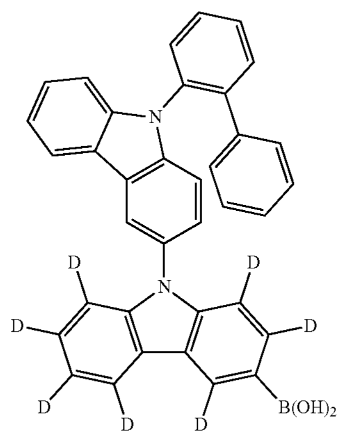 [SMILES: [2H]c1c([2H])c([2H])c2c(c1[2H])c1c([2H])c(B(O)O)c([2H])c([2H])c1n2-c1ccc2c(c1)c1ccccc1n2-c1ccccc1-c1ccccc1] F-16 | 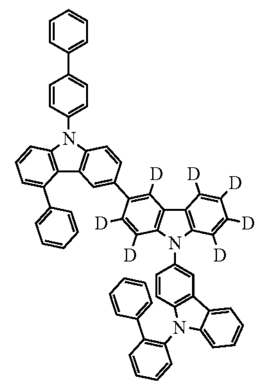 [SMILES: [2H]c1c([2H])c([2H])c2c(c1[2H])c1c([2H])c(-c3ccc4c(c3)c3c(-c5ccccc5)cccc3n4-c3ccc(-c4ccccc4)cc3)c([2H])c([2H])c1n2-c1ccc2c(c1)c1ccccc1n2-c1ccccc1-c1ccccc1] 549 | 69 |
| 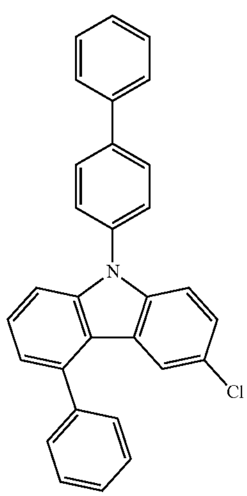 [SMILES: Clc1ccc2c(c1)c1c(-c3ccccc3)cccc1n2-c1ccc(-c2ccccc2)cc1] C-2 | 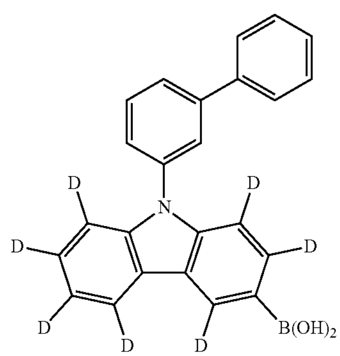 [SMILES: [2H]c1c([2H])c([2H])c2c(c1[2H])c1c([2H])c(B(O)O)c([2H])c([2H])c1n2-c1cccc(-c2ccccc2)c1] F-3 | 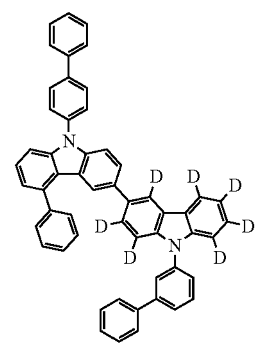 [SMILES: [2H]c1c([2H])c([2H])c2c(c1[2H])c1c([2H])c(-c3ccc4c(c3)c3c(-c5ccccc5)cccc3n4-c3ccc(-c4ccccc4)cc3)c([2H])c([2H])c1n2-c1cccc(-c2ccccc2)c1] 244 | 71 |

TABLE 11-continued
| Raw material C | Raw material F | Compound | Yield (%) |
|---|---|---|---|
| 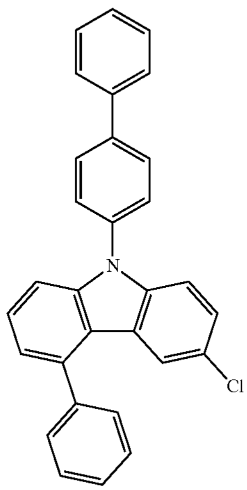 [SMILES: Clc1ccc2c(c1)c1c(-c3ccccc3)cccc1n2-c1ccc(-c2ccccc2)cc1] C-2 | 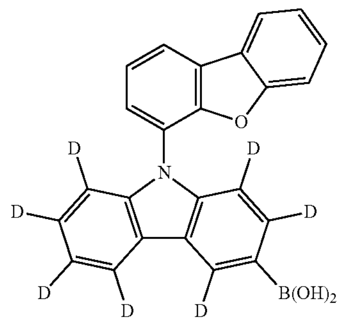 [SMILES: [2H]c1c([2H])c([2H])c2c(c1[2H])c1c([2H])c(B(O)O)c([2H])c([2H])c1n2-c1cccc2c1oc1ccccc12] F-8 | 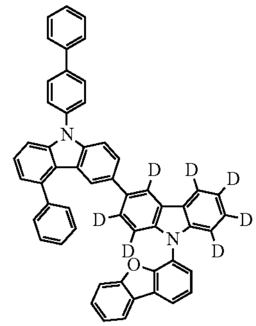 [SMILES: [2H]c1c([2H])c([2H])c2c(c1[2H])c1c([2H])c(-c3ccc4c(c3)c3c(-c5ccccc5)cccc3n4-c3ccc(-c4ccccc4)cc3)c([2H])c([2H])c1n2-c1cccc2c1oc1ccccc12] 249 | 75 |
| 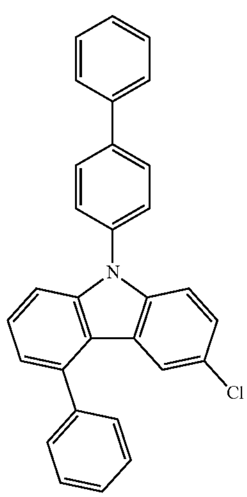 [SMILES: Clc1ccc2c(c1)c1c(-c3ccccc3)cccc1n2-c1ccc(-c2ccccc2)cc1] C-2 | 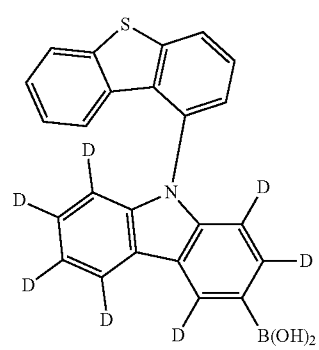 [SMILES: [2H]c1c([2H])c([2H])c2c(c1[2H])c1c([2H])c(B(O)O)c([2H])c([2H])c1n2-c1cccc2sc3ccccc3c12] F-9 | 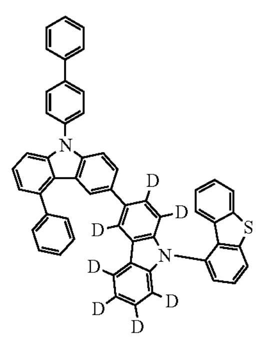 [SMILES: [2H]c1c([2H])c([2H])c2c(c1[2H])c1c([2H])c(-c3ccc4c(c3)c3c(-c5ccccc5)cccc3n4-c3ccc(-c4ccccc4)cc3)c([2H])c([2H])c1n2-c1cccc2sc3ccccc3c12] 253 | 71 |

TABLE 11-continued
| Raw material C | Raw material F | Compound | Yield (%) |
|---|---|---|---|
| 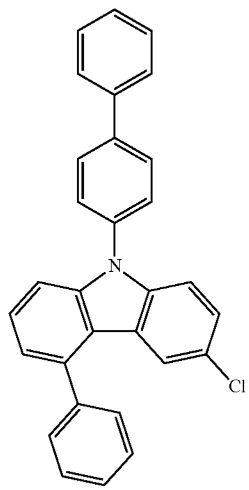 [SMILES: Clc1ccc2c(c1)c1c(-c3ccccc3)cccc1n2-c1ccc(-c2ccccc2)cc1] C-2 | 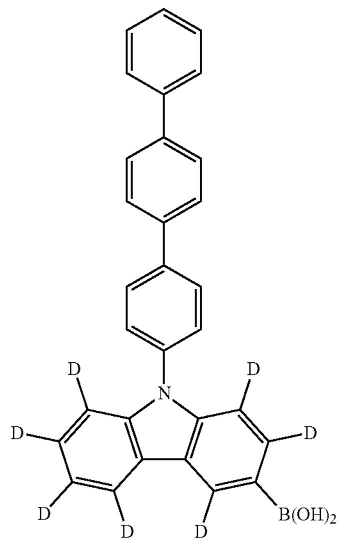 [SMILES: [2H]c1c([2H])c([2H])c2c(c1[2H])c1c([2H])c(B(O)O)c([2H])c([2H])c1n2-c1ccc(-c2ccc(-c3ccccc3)cc2)cc1] F-5 | 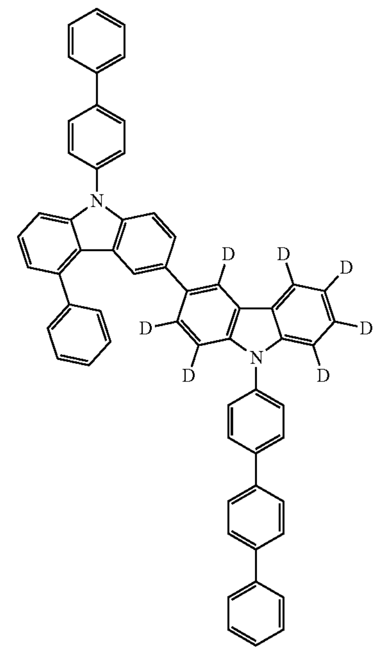 [SMILES: [2H]c1c([2H])c([2H])c2c(c1[2H])c1c([2H])c(-c3ccc4c(c3)c3c(-c5ccccc5)cccc3n4-c3ccc(-c4ccccc4)cc3)c([2H])c([2H])c1n2-c1ccc(-c2ccc(-c3ccccc3)cc2)cc1] 257 | 72 |
| 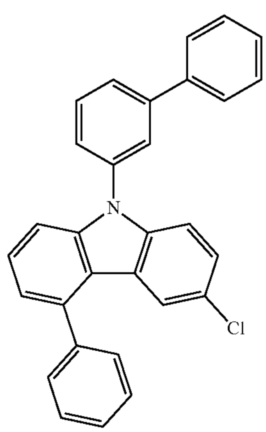 [SMILES: Clc1ccc2c(c1)c1c(-c3ccccc3)cccc1n2-c1cccc(-c2ccccc2)c1] C-3 | 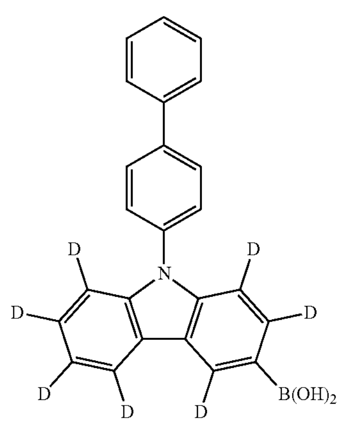 [SMILES: [2H]c1c([2H])c([2H])c2c(c1[2H])c1c([2H])c(B(O)O)c([2H])c([2H])c1n2-c1ccc(-c2ccccc2)cc1] F-2 | 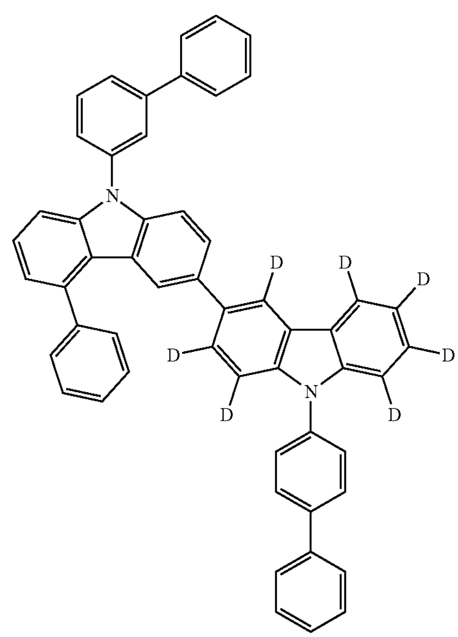 [SMILES: [2H]c1c([2H])c([2H])c2c(c1[2H])c1c([2H])c(-c3ccc4c(c3)c3c(-c5ccccc5)cccc3n4-c3cccc(-c4ccccc4)c3)c([2H])c([2H])c1n2-c1ccc(-c2ccccc2)cc1] 268 | 72 |

TABLE 11-continued
| Raw material C | Raw material F | Compound | Yield (%) |
|---|---|---|---|
| 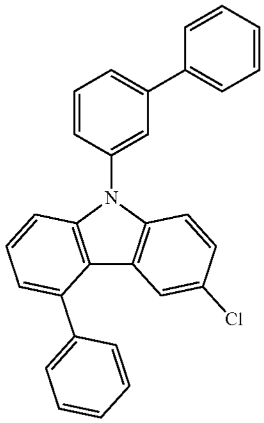 [SMILES: Clc1ccc2c(c1)c1c(-c3ccccc3)cccc1n2-c1cccc(-c2ccccc2)c1] C-3 | 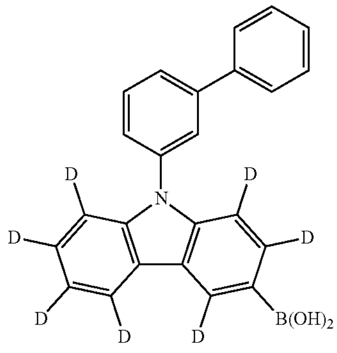 [SMILES: [2H]c1c([2H])c([2H])c2c(c1[2H])c1c([2H])c(B(O)O)c([2H])c([2H])c1n2-c1cccc(-c2ccccc2)c1] F-3 | 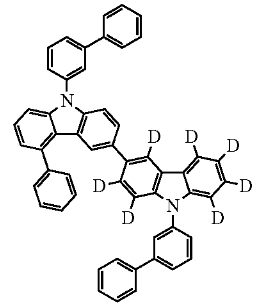 [SMILES: [2H]c1c([2H])c([2H])c2c(c1[2H])c1c([2H])c(-c3ccc4c(c3)c3c(-c5ccccc5)cccc3n4-c3cccc(-c4ccccc4)c3)c([2H])c([2H])c1n2-c1cccc(-c2ccccc2)c1] 269 | 70 |
| 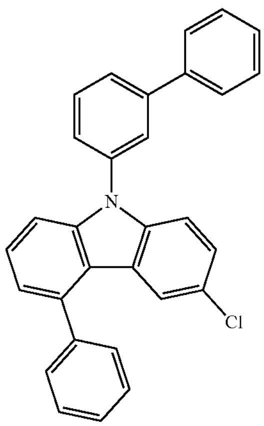 [SMILES: Clc1ccc2c(c1)c1c(-c3ccccc3)cccc1n2-c1cccc(-c2ccccc2)c1] C-3 | 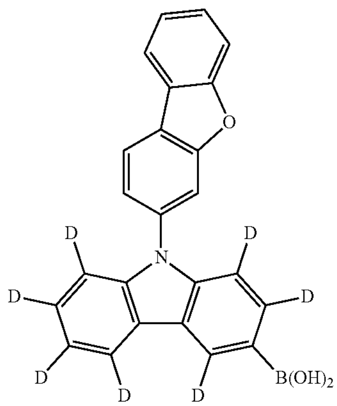 [SMILES: [2H]c1c([2H])c([2H])c2c(c1[2H])c1c([2H])c(B(O)O)c([2H])c([2H])c1n2-c1ccc2c(c1)oc1ccccc12] F-10 | 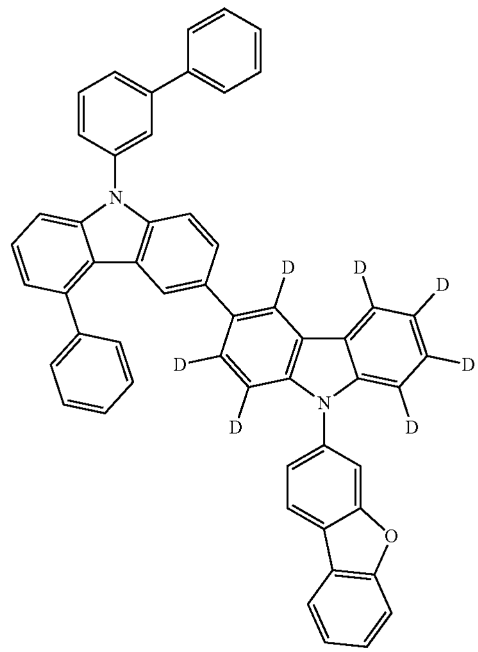 [SMILES: [2H]c1c([2H])c([2H])c2c(c1[2H])c1c([2H])c(-c3ccc4c(c3)c3c(-c5ccccc5)cccc3n4-c3cccc(-c4ccccc4)c3)c([2H])c([2H])c1n2-c1ccc2c(c1)oc1ccccc12] 270 | 74 |
| 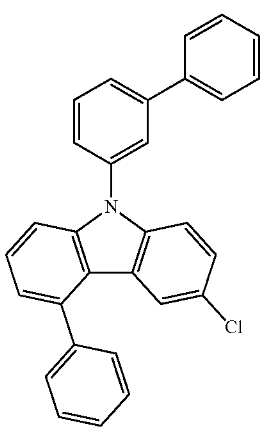 [SMILES: Clc1ccc2c(c1)c1c(-c3ccccc3)cccc1n2-c1cccc(-c2ccccc2)c1] | 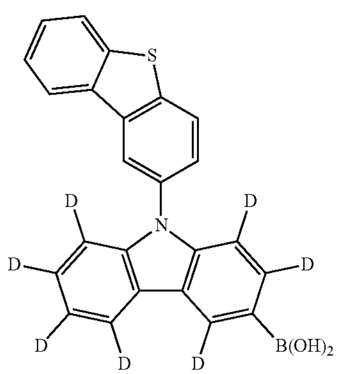 [SMILES: [2H]c1c([2H])c([2H])c2c(c1[2H])c1c([2H])c(B(O)O)c([2H])c([2H])c1n2-c1ccc2sc3ccccc3c2c1] F-11 | 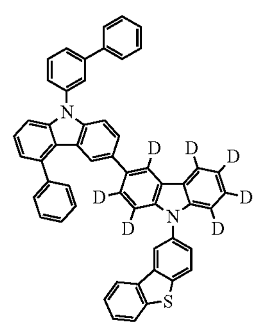 [SMILES: [2H]c1c([2H])c([2H])c2c(c1[2H])c1c([2H])c(-c3ccc4c(c3)c3c(-c5ccccc5)cccc3n4-c3cccc(-c4ccccc4)c3)c([2H])c([2H])c1n2-c1ccc2sc3ccccc3c2c1] 276 | 70 |

TABLE 11-continued
| Raw material C | Raw material F | Compound | Yield (%) |
|---|---|---|---|
| C-3 | | | |
| 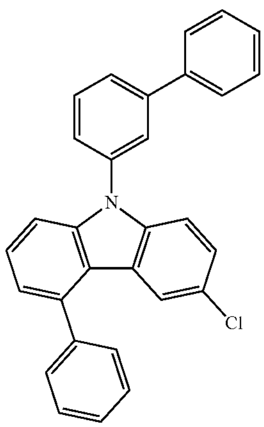 [SMILES: Clc1ccc2c(c1)c1c(-c3ccccc3)cccc1n2-c1cccc(-c2ccccc2)c1] C-3 | 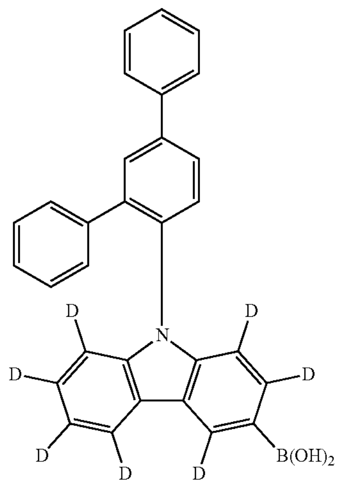 [SMILES: [2H]c1c([2H])c([2H])c2c(c1[2H])c1c([2H])c(B(O)O)c([2H])c([2H])c1n2-c1ccc(-c2ccccc2)cc1-c1ccccc1] F-6 | 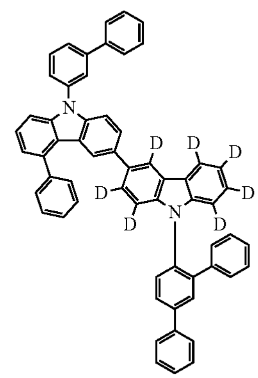 [SMILES: [2H]c1c([2H])c([2H])c2c(c1[2H])c1c([2H])c(-c3ccc4c(c3)c3c(-c5ccccc5)cccc3n4-c3cccc(-c4ccccc4)c3)c([2H])c([2H])c1n2-c1ccc(-c2ccccc2)cc1-c1ccccc1] 285 | 69 |
| 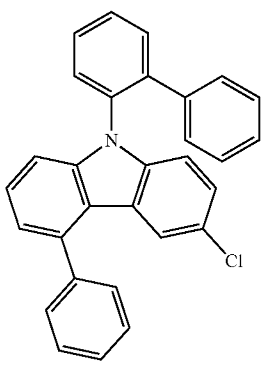 [SMILES: Clc1ccc2c(c1)c1c(-c3ccccc3)cccc1n2-c1ccccc1-c1ccccc1] C-4 | 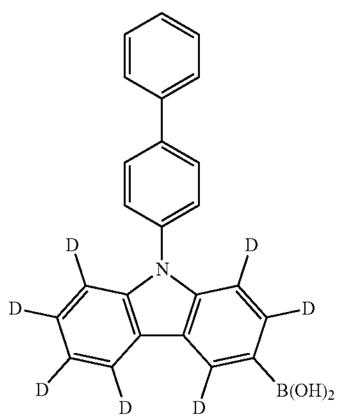 [SMILES: [2H]c1c([2H])c([2H])c2c(c1[2H])c1c([2H])c(B(O)O)c([2H])c([2H])c1n2-c1ccc(-c2ccccc2)cc1] F-2 | 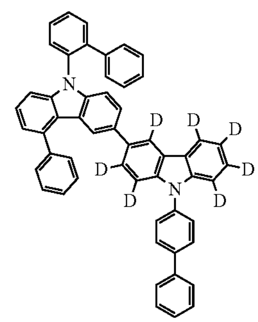 [SMILES: [2H]c1c([2H])c([2H])c2c(c1[2H])c1c([2H])c(-c3ccc4c(c3)c3c(-c5ccccc5)cccc3n4-c3ccccc3-c3ccccc3)c([2H])c([2H])c1n2-c1ccc(-c2ccccc2)cc1] 290 | 70 |
| 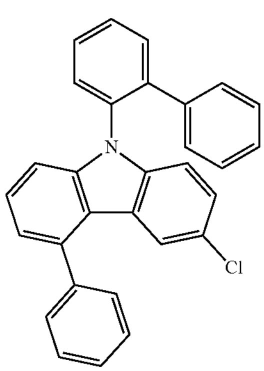 [SMILES: Clc1ccc2c(c1)c1c(-c3ccccc3)cccc1n2-c1ccccc1-c1ccccc1] C-4 | 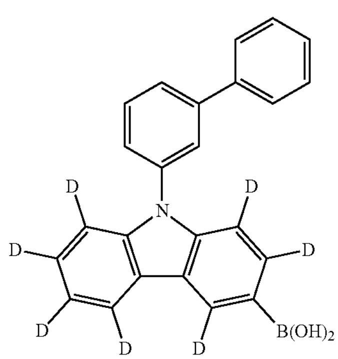 [SMILES: [2H]c1c([2H])c([2H])c2c(c1[2H])c1c([2H])c(B(O)O)c([2H])c([2H])c1n2-c1cccc(-c2ccccc2)c1] F-3 | 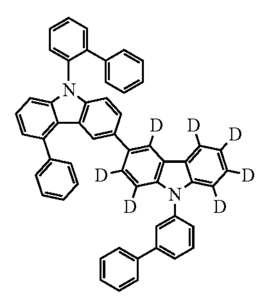 [SMILES: [2H]c1c([2H])c([2H])c2c(c1[2H])c1c([2H])c(-c3ccc4c(c3)c3c(-c5ccccc5)cccc3n4-c3ccccc3-c3ccccc3)c([2H])c([2H])c1n2-c1cccc(-c2ccccc2)c1] 291 | 74 |

TABLE 11-continued
| Raw material C | Raw material F | Compound | Yield (%) |
|---|---|---|---|
| 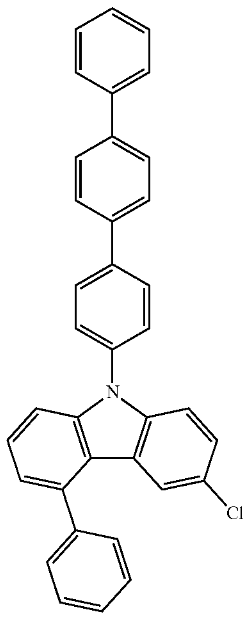 C-5 | 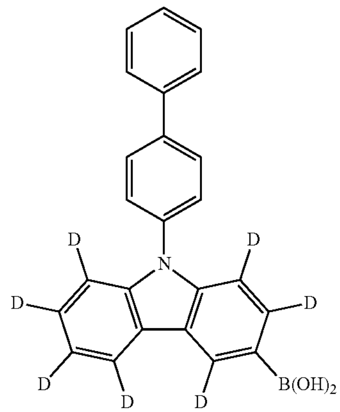 [SMILES: [2H]c1c([2H])c([2H])c2c(c1[2H])c1c([2H])c(B(O)O)c([2H])c([2H])c1n2-c1ccc(-c2ccccc2)cc1] F-2 | 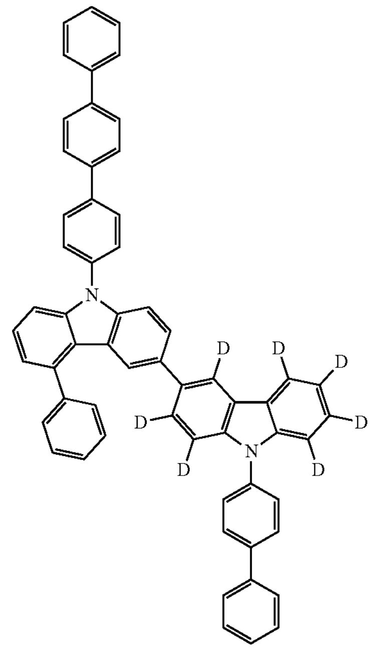 [SMILES: [2H]c1c([2H])c([2H])c2c(c1[2H])c1c([2H])c(-c3ccc4c(c3)c3c(-c5ccccc5)cccc3n4-c3ccc(-c4ccc(-c5ccccc5)cc4)cc3)c([2H])c([2H])c1n2-c1ccc(-c2ccccc2)cc1] 345 | 78 |
| 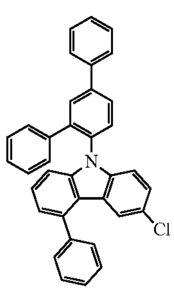 [SMILES: Clc1ccc2c(c1)c1c(-c3ccccc3)cccc1n2-c1ccc(-c2ccccc2)cc1-c1ccccc1] C-6 | 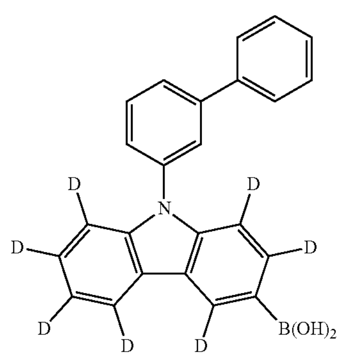 [SMILES: [2H]c1c([2H])c([2H])c2c(c1[2H])c1c([2H])c(B(O)O)c([2H])c([2H])c1n2-c1cccc(-c2ccccc2)c1] F-3 | 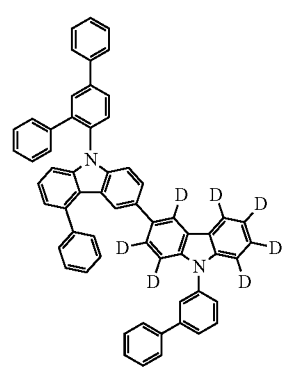 [SMILES: [2H]c1c([2H])c([2H])c2c(c1[2H])c1c([2H])c(-c3ccc4c(c3)c3c(-c5ccccc5)cccc3n4-c3ccc(-c4ccccc4)cc3-c3ccccc3)c([2H])c([2H])c1n2-c1cccc(-c2ccccc2)c1] 352 | 73 |

TABLE 11-continued
| Raw material C | Raw material F | Compound | Yield (%) |
|---|---|---|---|
| 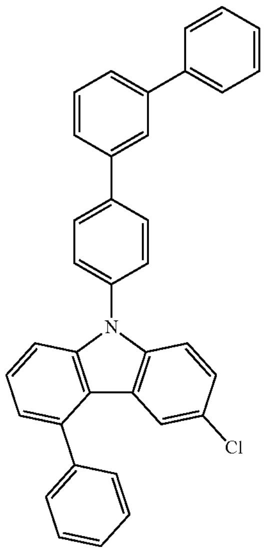 [SMILES: Clc1ccc2c(c1)c1c(-c3ccccc3)cccc1n2-c1ccc(-c2cccc(-c3ccccc3)c2)cc1] C-7 | 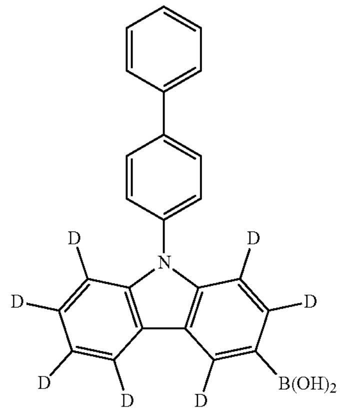 [SMILES: [2H]c1c([2H])c([2H])c2c(c1[2H])c1c([2H])c(B(O)O)c([2H])c([2H])c1n2-c1ccc(-c2ccccc2)cc1] F-2 | 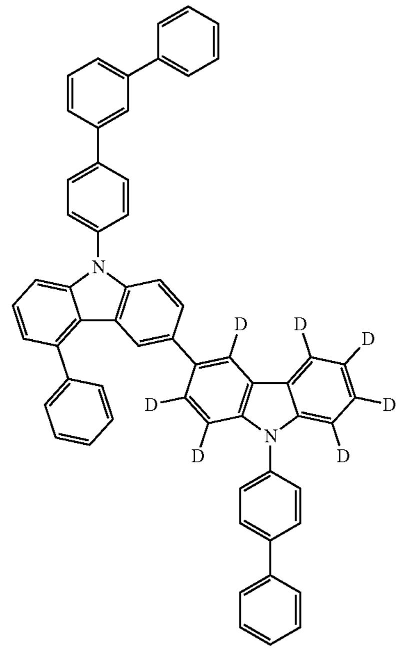 [SMILES: [2H]c1c([2H])c([2H])c2c(c1[2H])c1c([2H])c(-c3ccc4c(c3)c3c(-c5ccccc5)cccc3n4-c3ccc(-c4cccc(-c5ccccc5)c4)cc3)c([2H])c([2H])c1n2-c1ccc(-c2ccccc2)cc1] 349 | 75 |
| 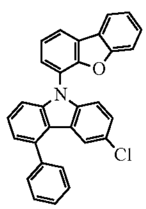 [SMILES: Clc1ccc2c(c1)c1c(-c3ccccc3)cccc1n2-c1cccc2c1oc1ccccc12] C-8 | 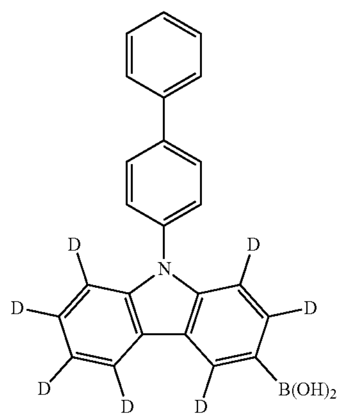 [SMILES: [2H]c1c([2H])c([2H])c2c(c1[2H])c1c([2H])c(B(O)O)c([2H])c([2H])c1n2-c1ccc(-c2ccccc2)cc1] F-2 | 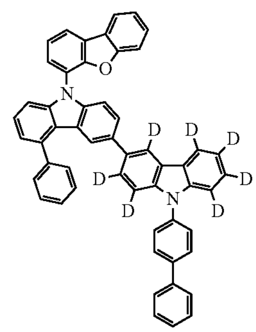 [SMILES: [2H]c1c([2H])c([2H])c2c(c1[2H])c1c([2H])c(-c3ccc4c(c3)c3c(-c5ccccc5)cccc3n4-c3cccc4c3oc3ccccc34)c([2H])c([2H])c1n2-c1ccc(-c2ccccc2)cc1] 325 | 73 |
| 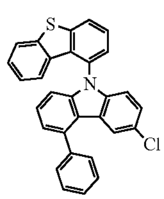 [SMILES: Clc1ccc2c(c1)c1c(-c3ccccc3)cccc1n2-c1cccc2sc3ccccc3c12] C-9 | 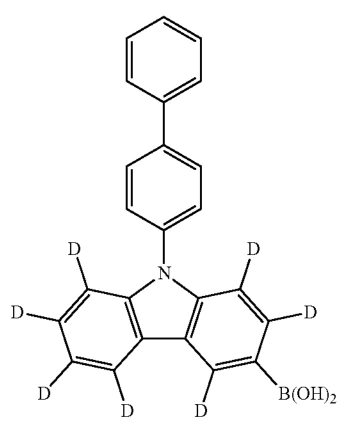 [SMILES: [2H]c1c([2H])c([2H])c2c(c1[2H])c1c([2H])c(B(O)O)c([2H])c([2H])c1n2-c1ccc(-c2ccccc2)cc1] F-2 | 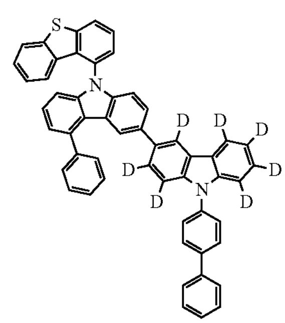 [SMILES: [2H]c1c([2H])c([2H])c2c(c1[2H])c1c([2H])c(-c3ccc4c(c3)c3c(-c5ccccc5)cccc3n4-c3cccc4sc5ccccc5c34)c([2H])c([2H])c1n2-c1ccc(-c2ccccc2)cc1] 337 | 78 |

TABLE 11-continued
| Raw material C | Raw material F | Compound | Yield (%) |
|---|---|---|---|
| 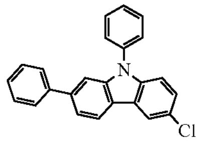 [SMILES: Clc1ccc2c(c1)c1ccc(-c3ccccc3)cc1n2-c1ccccc1] C-10 | 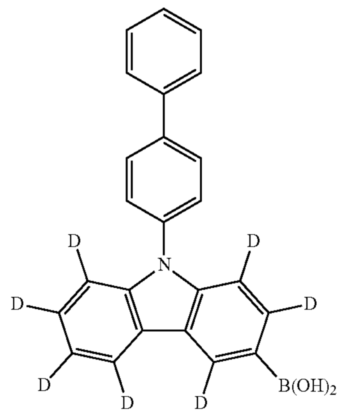 [SMILES: [2H]c1c([2H])c([2H])c2c(c1[2H])c1c([2H])c(B(O)O)c([2H])c([2H])c1n2-c1ccc(-c2ccccc2)cc1] F-2 | 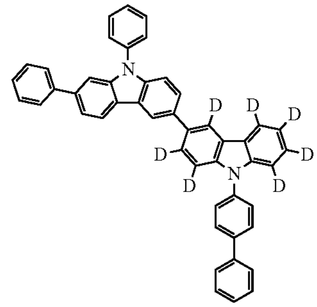 [SMILES: [2H]c1c([2H])c([2H])c2c(c1[2H])c1c([2H])c(-c3ccc4c(c3)c3ccc(-c5ccccc5)cc3n4-c3ccccc3)c([2H])c([2H])c1n2-c1ccc(-c2ccccc2)cc1] 74 | 77 |
| 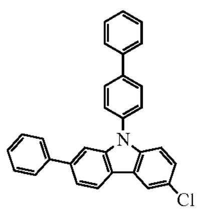 [SMILES: Clc1ccc2c(c1)c1ccc(-c3ccccc3)cc1n2-c1ccc(-c2ccccc2)cc1] C-11 | 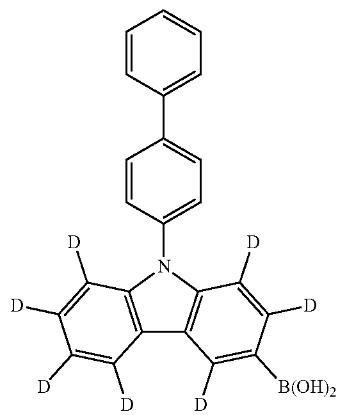 [SMILES: [2H]c1c([2H])c([2H])c2c(c1[2H])c1c([2H])c(B(O)O)c([2H])c([2H])c1n2-c1ccc(-c2ccccc2)cc1] F-2 | 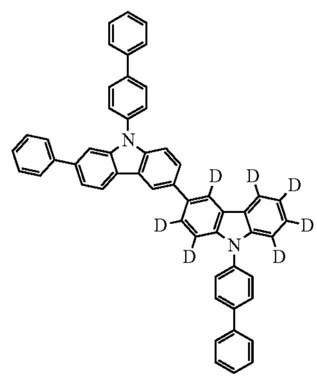 [SMILES: [2H]c1c([2H])c([2H])c2c(c1[2H])c1c([2H])c(-c3ccc4c(c3)c3ccc(-c5ccccc5)cc3n4-c3ccc(-c4ccccc4)cc3)c([2H])c([2H])c1n2-c1ccc(-c2ccccc2)cc1] 99 | 74 |
| 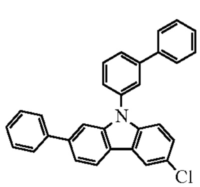 [SMILES: Clc1ccc2c(c1)c1ccc(-c3ccccc3)cc1n2-c1cccc(-c2ccccc2)c1] C-12 | 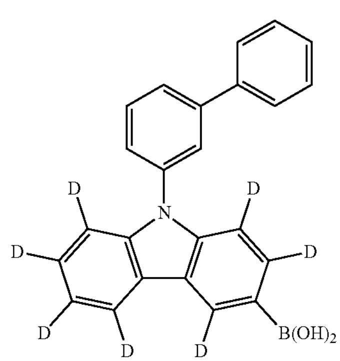 [SMILES: [2H]c1c([2H])c([2H])c2c(c1[2H])c1c([2H])c(B(O)O)c([2H])c([2H])c1n2-c1cccc(-c2ccccc2)c1] F-3 | 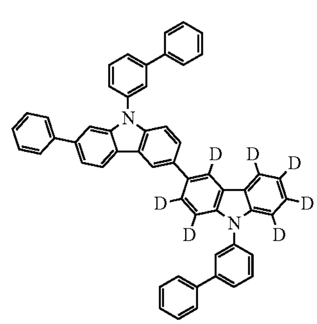 [SMILES: [2H]c1c([2H])c([2H])c2c(c1[2H])c1c([2H])c(-c3ccc4c(c3)c3ccc(-c5ccccc5)cc3n4-c3cccc(-c4ccccc4)c3)c([2H])c([2H])c1n2-c1cccc(-c2ccccc2)c1] 120 | 70 |

TABLE 11-continued
| Raw material C | Raw material F | Compound | Yield (%) |
|---|---|---|---|
| 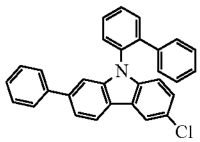 [SMILES: Clc1ccc2c(c1)c1ccc(-c3ccccc3)cc1n2-c1ccccc1-c1ccccc1] C-13 | 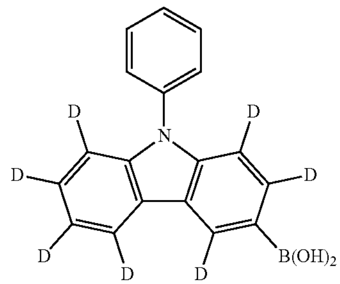 [SMILES: [2H]c1c([2H])c([2H])c2c(c1[2H])c1c([2H])c(B(O)O)c([2H])c([2H])c1n2-c1ccccc1] 615 | 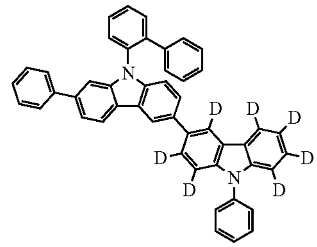 [SMILES: [2H]c1c([2H])c([2H])c2c(c1[2H])c1c([2H])c(-c3ccc4c(c3)c3ccc(-c5ccccc5)cc3n4-c3ccccc3-c3ccccc3)c([2H])c([2H])c1n2-c1ccccc1] 133 | 71 |
| 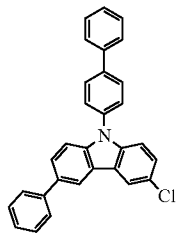 [SMILES: Clc1ccc2c(c1)c1cc(-c3ccccc3)ccc1n2-c1ccc(-c2ccccc2)cc1] C-14 | 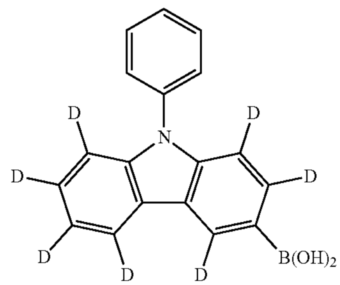 [SMILES: [2H]c1c([2H])c([2H])c2c(c1[2H])c1c([2H])c(B(O)O)c([2H])c([2H])c1n2-c1ccccc1] F-1 | 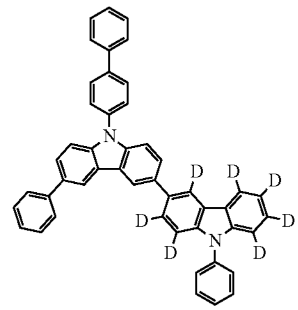 [SMILES: [2H]c1c([2H])c([2H])c2c(c1[2H])c1c([2H])c(-c3ccc4c(c3)c3cc(-c5ccccc5)ccc3n4-c3ccc(-c4ccccc4)cc3)c([2H])c([2H])c1n2-c1ccccc1] 169 | 78 |
| 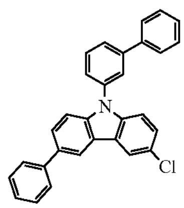 [SMILES: Clc1ccc2c(c1)c1cc(-c3ccccc3)ccc1n2-c1cccc(-c2ccccc2)c1] C-15 | 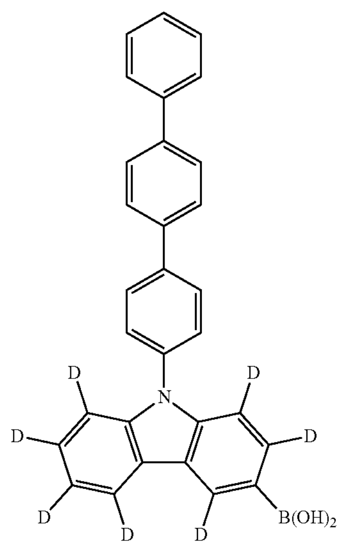 [SMILES: [2H]c1c([2H])c([2H])c2c(c1[2H])c1c([2H])c(B(O)O)c([2H])c([2H])c1n2-c1ccc(-c2ccc(-c3ccccc3)cc2)cc1] F-5 | 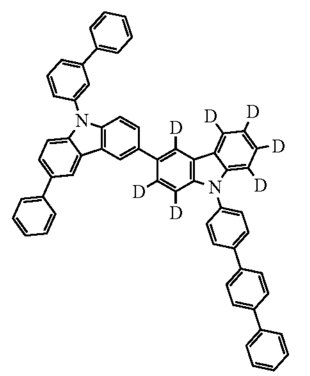 [SMILES: [2H]c1c([2H])c([2H])c2c(c1[2H])c1c([2H])c(-c3ccc4c(c3)c3cc(-c5ccccc5)ccc3n4-c3cccc(-c4ccccc4)c3)c([2H])c([2H])c1n2-c1ccc(-c2ccc(-c3ccccc3)cc2)cc1] 197 | 76 |
| 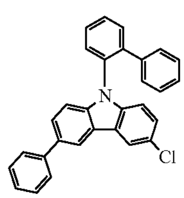 [SMILES: Clc1ccc2c(c1)c1cc(-c3ccccc3)ccc1n2-c1ccccc1-c1ccccc1] C-16 | 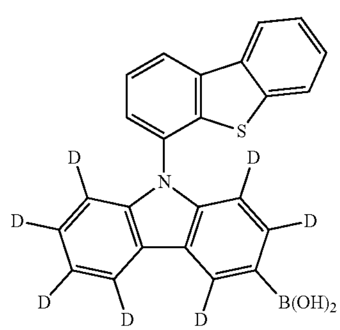 [SMILES: [2H]c1c([2H])c([2H])c2c(c1[2H])c1c([2H])c(B(O)O)c([2H])c([2H])c1n2-c1cccc2c1sc1ccccc12] | 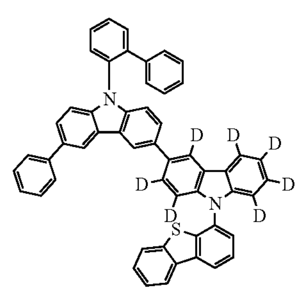 [SMILES: [2H]c1c([2H])c([2H])c2c(c1[2H])c1c([2H])c(-c3ccc4c(c3)c3cc(-c5ccccc5)ccc3n4-c3ccccc3-c3ccccc3)c([2H])c([2H])c1n2-c1cccc2c1sc1ccccc12] 213 | 72 |

TABLE 11-continued
| Raw material C | Raw material F | Compound | Yield (%) |
|---|---|---|---|
| | F-12 | | |
| 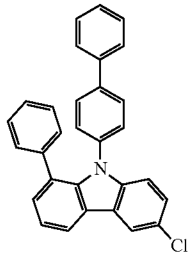 [SMILES: Clc1ccc2c(c1)c1cccc(-c3ccccc3)c1n2-c1ccc(-c2ccccc2)cc1] C-17 | 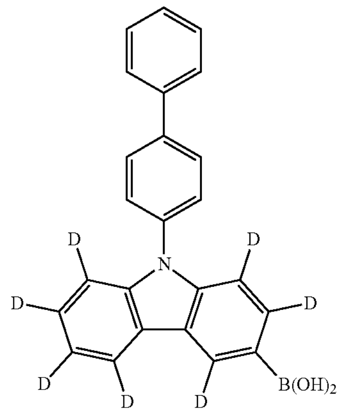 [SMILES: [2H]c1c([2H])c([2H])c2c(c1[2H])c1c([2H])c(B(O)O)c([2H])c([2H])c1n2-c1ccc(-c2ccccc2)cc1] F-2 | 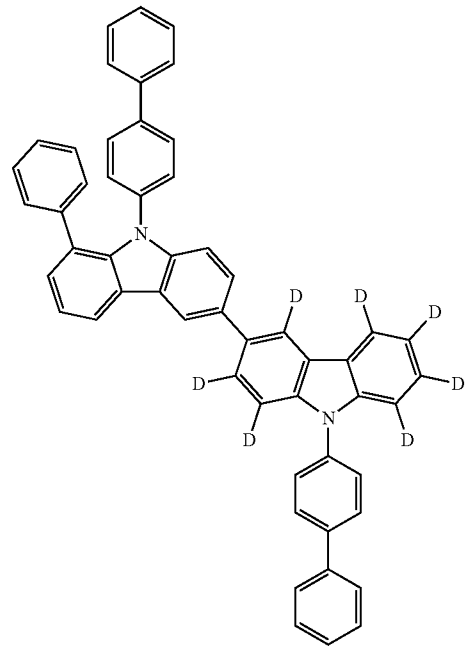 [SMILES: [2H]c1c([2H])c([2H])c2c(c1[2H])c1c([2H])c(-c3ccc4c(c3)c3cccc(-c5ccccc5)c3n4-c3ccc(-c4ccccc4)cc3)c([2H])c([2H])c1n2-c1ccc(-c2ccccc2)cc1] 22 | 76 |
| 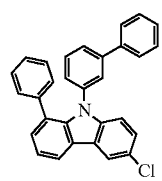 [SMILES: Clc1ccc2c(c1)c1cccc(-c3ccccc3)c1n2-c1cccc(-c2ccccc2)c1] C-18 | 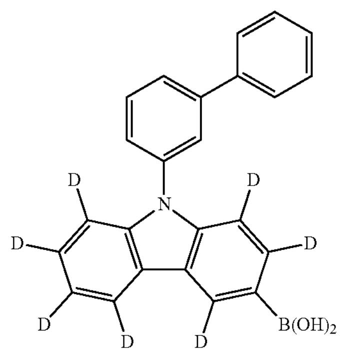 [SMILES: [2H]c1c([2H])c([2H])c2c(c1[2H])c1c([2H])c(B(O)O)c([2H])c([2H])c1n2-c1cccc(-c2ccccc2)c1] F-3 | 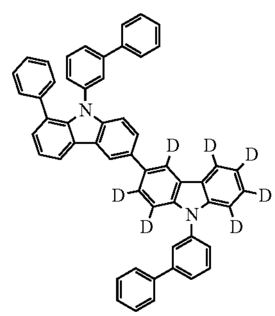 [SMILES: [2H]c1c([2H])c([2H])c2c(c1[2H])c1c([2H])c(-c3ccc4c(c3)c3cccc(-c5ccccc5)c3n4-c3cccc(-c4ccccc4)c3)c([2H])c([2H])c1n2-c1cccc(-c2ccccc2)c1] 40 | 73 |
| 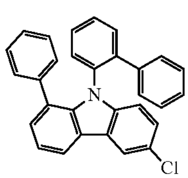 [SMILES: Clc1ccc2c(c1)c1cccc(-c3ccccc3)c1n2-c1ccccc1-c1ccccc1] C-19 | 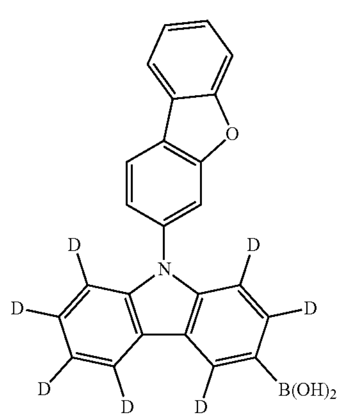 [SMILES: [2H]c1c([2H])c([2H])c2c(c1[2H])c1c([2H])c(B(O)O)c([2H])c([2H])c1n2-c1ccc2c(c1)oc1ccccc12] F-10 | 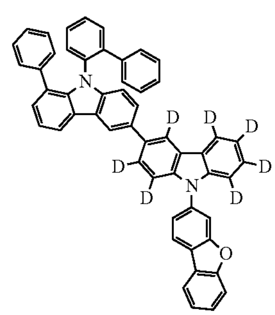 [SMILES: [2H]c1c([2H])c([2H])c2c(c1[2H])c1c([2H])c(-c3ccc4c(c3)c3cccc(-c5ccccc5)c3n4-c3ccccc3-c3ccccc3)c([2H])c([2H])c1n2-c1ccc2c(c1)oc1ccccc12] 54 | 71 |

TABLE 11-continued
| Raw material C | Raw material F | Compound | Yield (%) |
|---|---|---|---|
| 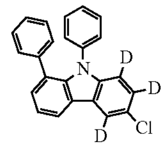 [SMILES: [2H]c1c(Cl)c([2H])c2c3cccc(-c4ccccc4)c3n(-c3ccccc3)c2c1[2H]] C-22 | 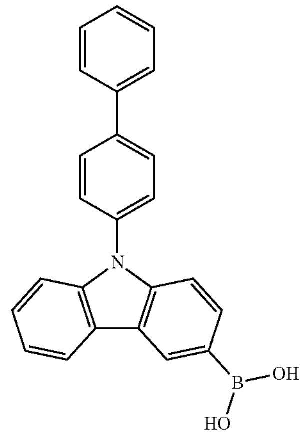 [SMILES: OB(O)c1ccc2c(c1)c1ccccc1n2-c1ccc(-c2ccccc2)cc1] | 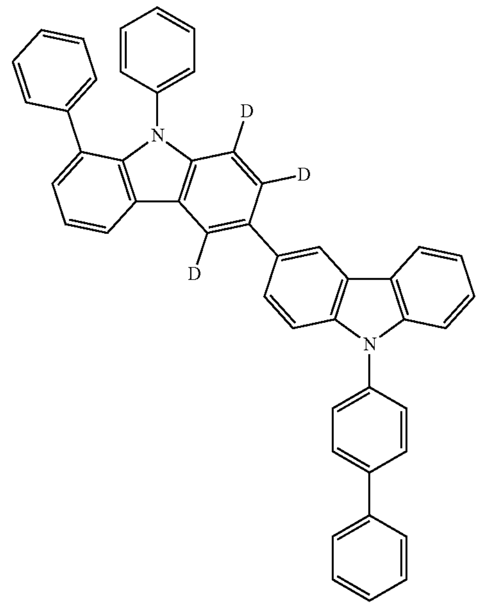 [SMILES: [2H]c1c(-c2ccc3c(c2)c2ccccc2n3-c2ccc(-c3ccccc3)cc2)c([2H])c2c3cccc(-c4ccccc4)c3n(-c3ccccc3)c2c1[2H]] 354 | 70 |
| 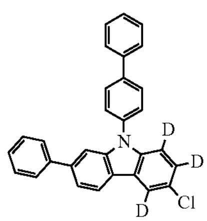 [SMILES: [2H]c1c(Cl)c([2H])c2c3ccc(-c4ccccc4)cc3n(-c3ccc(-c4ccccc4)cc3)c2c1[2H]] C-20 | 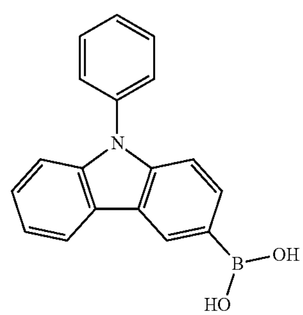 [SMILES: OB(O)c1ccc2c(c1)c1ccccc1n2-c1ccccc1] | 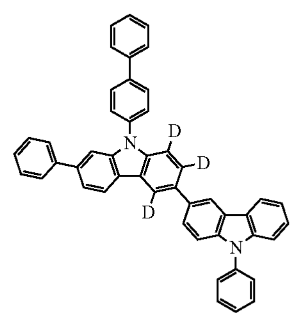 [SMILES: [2H]c1c(-c2ccc3c(c2)c2ccccc2n3-c2ccccc2)c([2H])c2c3ccc(-c4ccccc4)cc3n(-c3ccc(-c4ccccc4)cc3)c2c1[2H]] 365 | 73 |
| 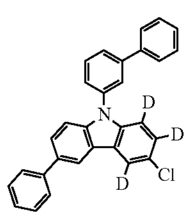 [SMILES: [2H]c1c(Cl)c([2H])c2c3cc(-c4ccccc4)ccc3n(-c3cccc(-c4ccccc4)c3)c2c1[2H]] C-21 | 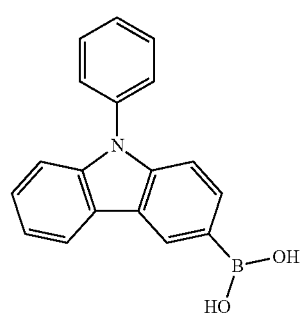 [SMILES: OB(O)c1ccc2c(c1)c1ccccc1n2-c1ccccc1] | 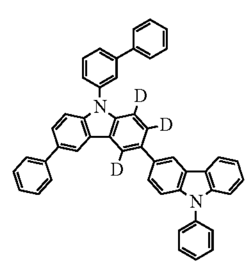 [SMILES: [2H]c1c(-c2ccc3c(c2)c2ccccc2n3-c2ccccc2)c([2H])c2c3cc(-c4ccccc4)ccc3n(-c3cccc(-c4ccccc4)c3)c2c1[2H]] 374 | 72 |

TABLE 11-continued
| Raw material C | Raw material F | Compound | Yield (%) |
| --- | --- | --- | --- |
| 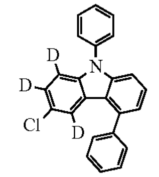 [SMILES: [2H]c1c(Cl)c([2H])c2c3c(-c4ccccc4)cccc3n(-c3ccccc3)c2c1[2H]] C-23 | 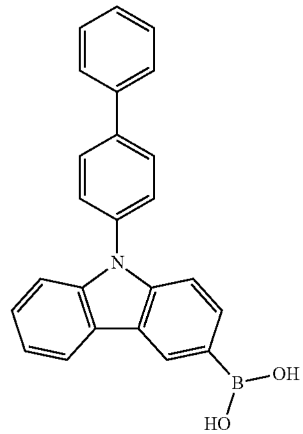 [SMILES: OB(O)c1ccc2c(c1)c1ccccc1n2-c1ccc(-c2ccccc2)cc1] | 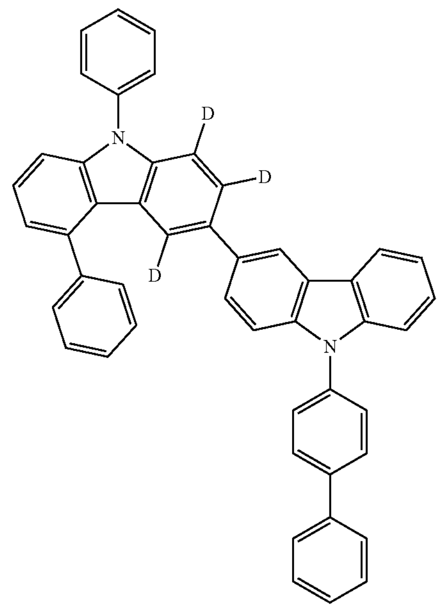 [SMILES: [2H]c1c(-c2ccc3c(c2)c2ccccc2n3-c2ccc(-c3ccccc3)cc2)c([2H])c2c3c(-c4ccccc4)cccc3n(-c3ccccc3)c2c1[2H]] 378 | 71 |
| 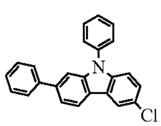 [SMILES: Clc1ccc2c(c1)c1ccc(-c3ccccc3)cc1n2-c1ccccc1] C-10 | 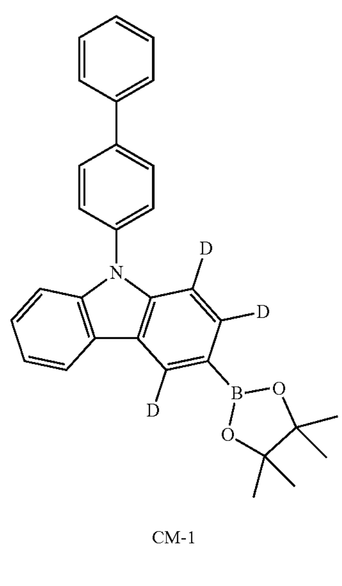 CM-1 | 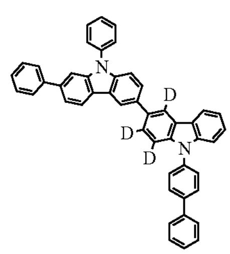 [SMILES: [2H]c1c(-c2ccc3c(c2)c2ccc(-c4ccccc4)cc2n3-c2ccccc2)c([2H])c2c3ccccc3n(-c3ccc(-c4ccccc4)cc3)c2c1[2H]] 397 | 73 |

TABLE 11-continued
| Raw material C | Raw material F | Compound | Yield (%) |
|---|---|---|---|
| 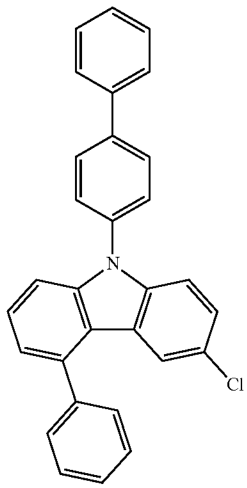 [SMILES: Clc1ccc2c(c1)c1c(-c3ccccc3)cccc1n2-c1ccc(-c2ccccc2)cc1] C-2 | 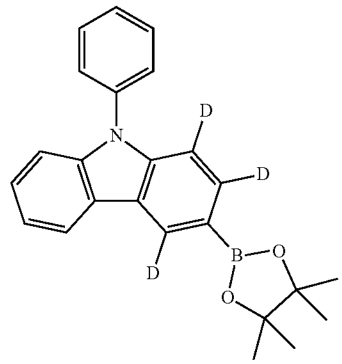 [SMILES: [2H]c1c(B2OC(C)(C)C(C)(C)O2)c([2H])c2c3ccccc3n(-c3ccccc3)c2c1[2H]] CM-2 | 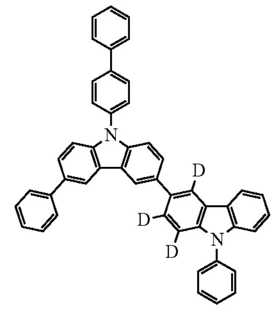 [SMILES: [2H]c1c(-c2ccc3c(c2)c2cc(-c4ccccc4)ccc2n3-c2ccc(-c3ccccc3)cc2)c([2H])c2c3ccccc3n(-c3ccccc3)c2c1[2H]] 408 | 71 |
| 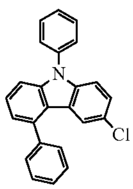 [SMILES: Clc1ccc2c(c1)c1c(-c3ccccc3)cccc1n2-c1ccccc1] C-1 | 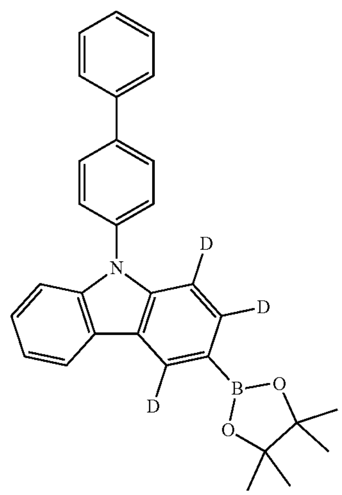 [SMILES: [2H]c1c(B2OC(C)(C)C(C)(C)O2)c([2H])c2c3ccccc3n(-c3ccc(-c4ccccc4)cc3)c2c1[2H]] CM-1 | 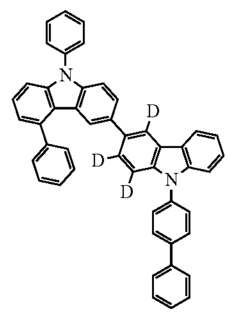 [SMILES: [2H]c1c(-c2ccc3c(c2)c2c(-c4ccccc4)cccc2n3-c2ccccc2)c([2H])c2c3ccccc3n(-c3ccc(-c4ccccc4)cc3)c2c1[2H]] 413 | 75 |
| 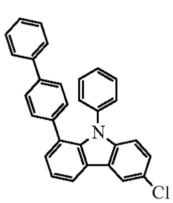 [SMILES: Clc1ccc2c(c1)c1cccc(-c3ccc(-c4ccccc4)cc3)c1n2-c1ccccc1] C-30 | 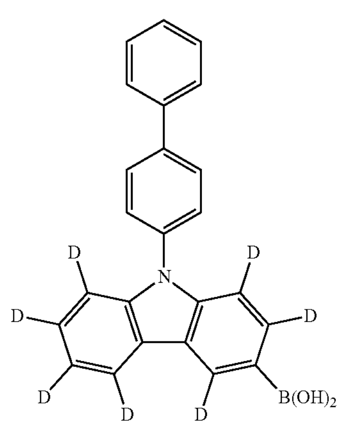 [SMILES: [2H]c1c([2H])c([2H])c2c(c1[2H])c1c([2H])c(B(O)O)c([2H])c([2H])c1n2-c1ccc(-c2ccccc2)cc1] | 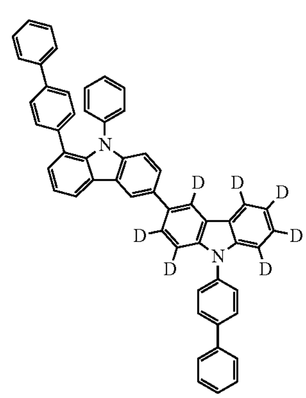 [SMILES: [2H]c1c([2H])c([2H])c2c(c1[2H])c1c([2H])c(-c3ccc4c(c3)c3cccc(-c5ccc(-c6ccccc6)cc5)c3n4-c3ccccc3)c([2H])c([2H])c1n2-c1ccc(-c2ccccc2)cc1] 444 | 70 |

TABLE 11-continued
| Raw material C | Raw material F | Compound | Yield (%) |
|---|---|---|---|
| 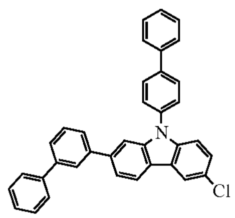 [SMILES: Clc1ccc2c(c1)c1ccc(-c3cccc(-c4ccccc4)c3)cc1n2-c1ccc(-c2ccccc2)cc1] C-31 | 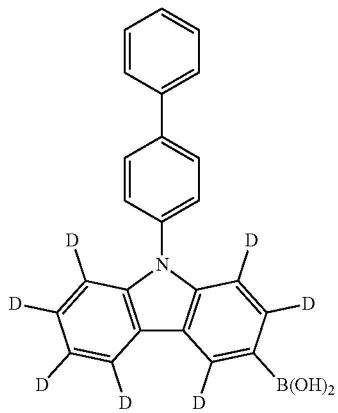 [SMILES: [2H]c1c([2H])c([2H])c2c(c1[2H])c1c([2H])c(B(O)O)c([2H])c([2H])c1n2-c1ccc(-c2ccccc2)cc1] F-2 | 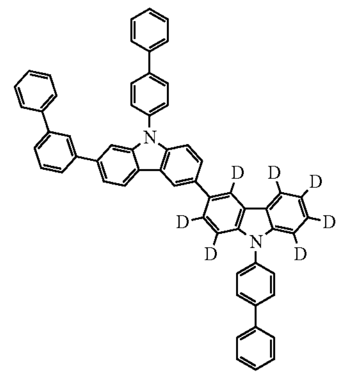 [SMILES: [2H]c1c([2H])c([2H])c2c(c1[2H])c1c([2H])c(-c3ccc4c(c3)c3ccc(-c5cccc(-c6ccccc6)c5)cc3n4-c3ccc(-c4ccccc4)cc3)c([2H])c([2H])c1n2-c1ccc(-c2ccccc2)cc1] 462 | 73 |
| 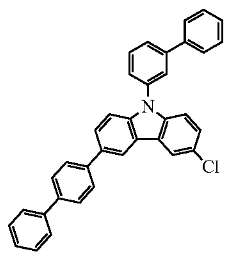 [SMILES: Clc1ccc2c(c1)c1cc(-c3ccc(-c4ccccc4)cc3)ccc1n2-c1cccc(-c2ccccc2)c1] C-29 | 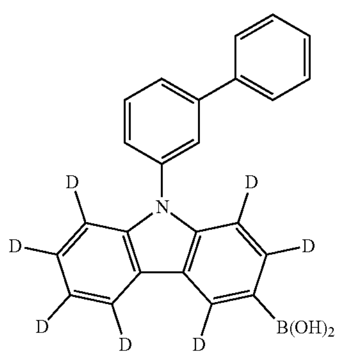 [SMILES: [2H]c1c([2H])c([2H])c2c(c1[2H])c1c([2H])c(B(O)O)c([2H])c([2H])c1n2-c1cccc(-c2ccccc2)c1] | 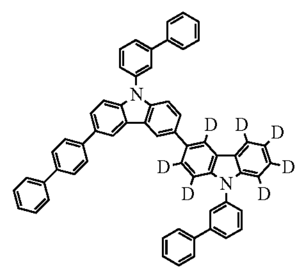 [SMILES: [2H]c1c([2H])c([2H])c2c(c1[2H])c1c([2H])c(-c3ccc4c(c3)c3cc(-c5ccc(-c6ccccc6)cc5)ccc3n4-c3cccc(-c4ccccc4)c3)c([2H])c([2H])c1n2-c1cccc(-c2ccccc2)c1] 470 | 71 |
| 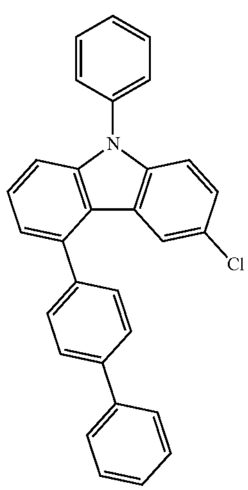 [SMILES: Clc1ccc2c(c1)c1c(-c3ccc(-c4ccccc4)cc3)cccc1n2-c1ccccc1] C-26 | 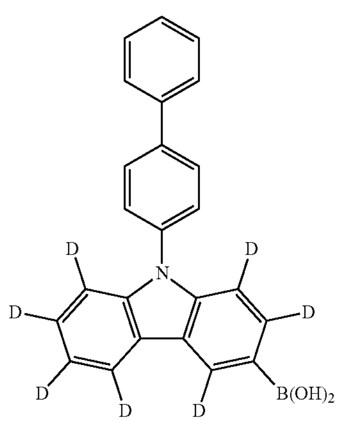 [SMILES: [2H]c1c([2H])c([2H])c2c(c1[2H])c1c([2H])c(B(O)O)c([2H])c([2H])c1n2-c1ccc(-c2ccccc2)cc1] F-2 | 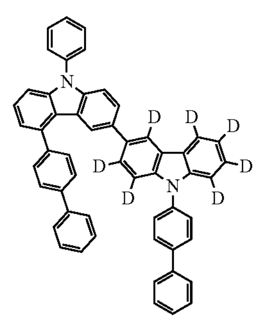 [SMILES: [2H]c1c([2H])c([2H])c2c(c1[2H])c1c([2H])c(-c3ccc4c(c3)c3c(-c5ccc(-c6ccccc6)cc5)cccc3n4-c3ccccc3)c([2H])c([2H])c1n2-c1ccc(-c2ccccc2)cc1] 480 | 74 |

TABLE 11-continued
| Raw material C | Raw material F | Compound | Yield (%) |
|---|---|---|---|
| 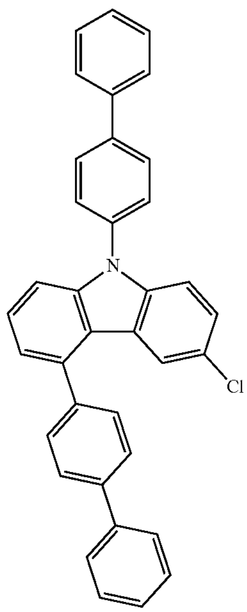 [SMILES: Clc1ccc2c(c1)c1c(-c3ccc(-c4ccccc4)cc3)cccc1n2-c1ccc(-c2ccccc2)cc1] C-27 | 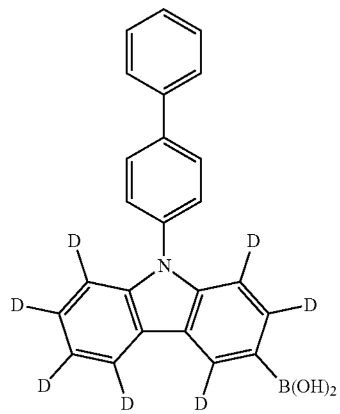 [SMILES: [2H]c1c([2H])c([2H])c2c(c1[2H])c1c([2H])c(B(O)O)c([2H])c([2H])c1n2-c1ccc(-c2ccccc2)cc1] F-2 | 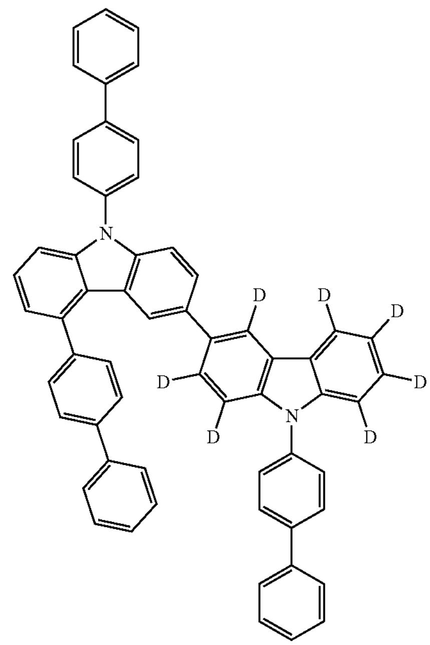 [SMILES: [2H]c1c([2H])c([2H])c2c(c1[2H])c1c([2H])c(-c3ccc4c(c3)c3c(-c5ccc(-c6ccccc6)cc5)cccc3n4-c3ccc(-c4ccccc4)cc3)c([2H])c([2H])c1n2-c1ccc(-c2ccccc2)cc1] 482 | 70 |
| 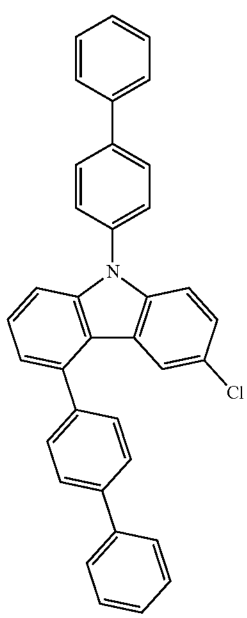 [SMILES: Clc1ccc2c(c1)c1c(-c3ccc(-c4ccccc4)cc3)cccc1n2-c1ccc(-c2ccccc2)cc1] C-27 | 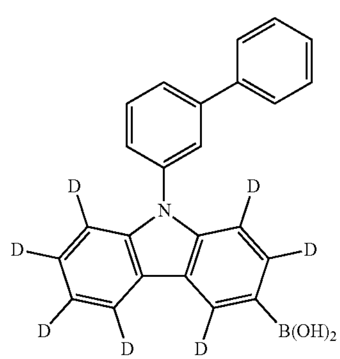 [SMILES: [2H]c1c([2H])c([2H])c2c(c1[2H])c1c([2H])c(B(O)O)c([2H])c([2H])c1n2-c1cccc(-c2ccccc2)c1] F-3 | 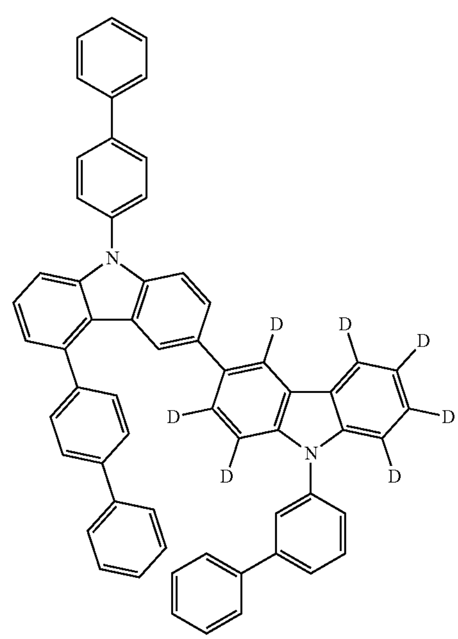 [SMILES: [2H]c1c([2H])c([2H])c2c(c1[2H])c1c([2H])c(-c3ccc4c(c3)c3c(-c5ccc(-c6ccccc6)cc5)cccc3n4-c3ccc(-c4ccccc4)cc3)c([2H])c([2H])c1n2-c1cccc(-c2ccccc2)c1] 483 | 73 |

TABLE 11-continued
| Raw material C | Raw material F | Compound | Yield (%) |
|---|---|---|---|
| 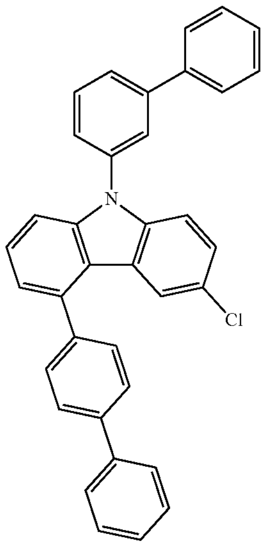 [SMILES: Clc1ccc2c(c1)c1c(-c3ccc(-c4ccccc4)cc3)cccc1n2-c1cccc(-c2ccccc2)c1] C-28 | 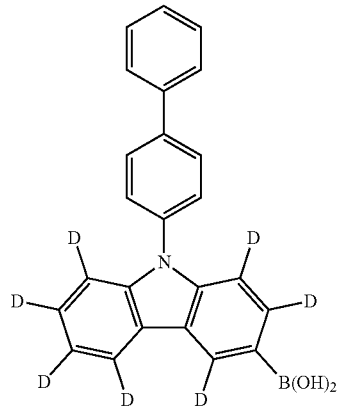 [SMILES: [2H]c1c([2H])c([2H])c2c(c1[2H])c1c([2H])c(B(O)O)c([2H])c([2H])c1n2-c1ccc(-c2ccccc2)cc1] F-2 | 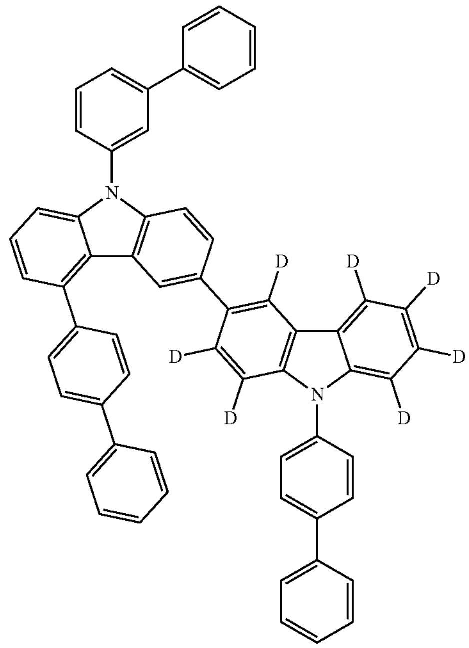 [SMILES: [2H]c1c([2H])c([2H])c2c(c1[2H])c1c([2H])c(-c3ccc4c(c3)c3c(-c5ccc(-c6ccccc6)cc5)cccc3n4-c3cccc(-c4ccccc4)c3)c([2H])c([2H])c1n2-c1ccc(-c2ccccc2)cc1] 486 | 71 |
| 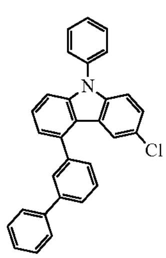 [SMILES: Clc1ccc2c(c1)c1c(-c3cccc(-c4ccccc4)c3)cccc1n2-c1ccccc1] C-32 | 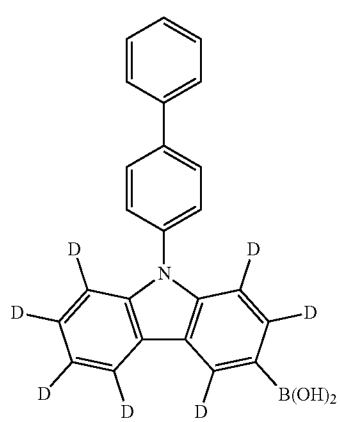 [SMILES: [2H]c1c([2H])c([2H])c2c(c1[2H])c1c([2H])c(B(O)O)c([2H])c([2H])c1n2-c1ccc(-c2ccccc2)cc1] F-2 | 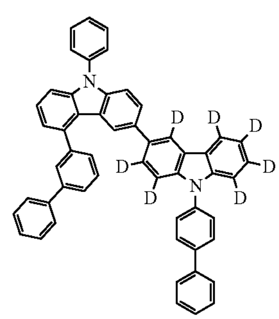 [SMILES: [2H]c1c([2H])c([2H])c2c(c1[2H])c1c([2H])c(-c3ccc4c(c3)c3c(-c5cccc(-c6ccccc6)c5)cccc3n4-c3ccccc3)c([2H])c([2H])c1n2-c1ccc(-c2ccccc2)cc1] 488 | 70 |

TABLE 11-continued
| Raw material C | Raw material F | Compound | Yield (%) |
|---|---|---|---|
| 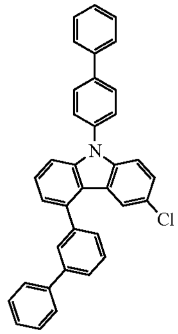 [SMILES: Clc1ccc2c(c1)c1c(-c3cccc(-c4ccccc4)c3)cccc1n2-c1ccc(-c2ccccc2)cc1] C-33 | 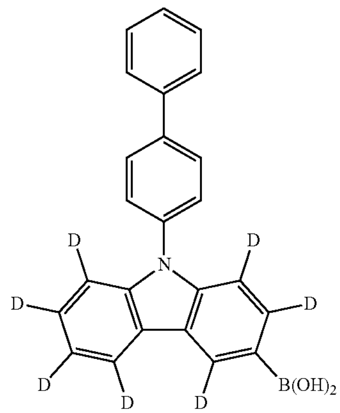 [SMILES: [2H]c1c([2H])c([2H])c2c(c1[2H])c1c([2H])c(B(O)O)c([2H])c([2H])c1n2-c1ccc(-c2ccccc2)cc1] F-2 | 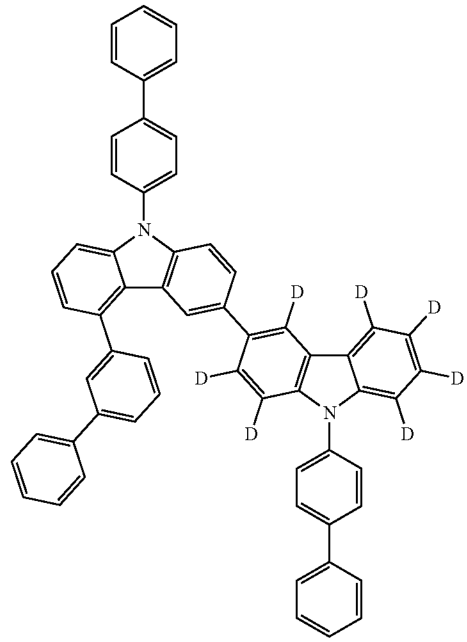 [SMILES: [2H]c1c([2H])c([2H])c2c(c1[2H])c1c([2H])c(-c3ccc4c(c3)c3c(-c5cccc(-c6ccccc6)c5)cccc3n4-c3ccc(-c4ccccc4)cc3)c([2H])c([2H])c1n2-c1ccc(-c2ccccc2)cc1] 489 | 74 |
| 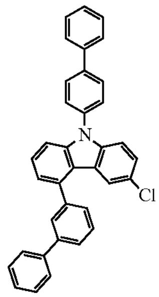 [SMILES: Clc1ccc2c(c1)c1c(-c3cccc(-c4ccccc4)c3)cccc1n2-c1ccc(-c2ccccc2)cc1] C-33 | 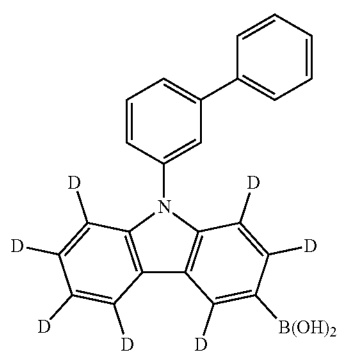 [SMILES: [2H]c1c([2H])c([2H])c2c(c1[2H])c1c([2H])c(B(O)O)c([2H])c([2H])c1n2-c1cccc(-c2ccccc2)c1] F-3 | 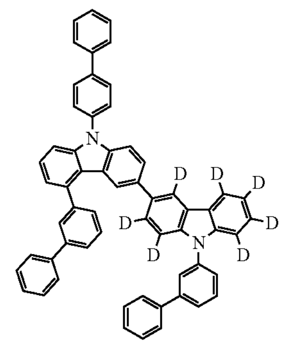 [SMILES: [2H]c1c([2H])c([2H])c2c(c1[2H])c1c([2H])c(-c3ccc4c(c3)c3c(-c5cccc(-c6ccccc6)c5)cccc3n4-c3ccc(-c4ccccc4)cc3)c([2H])c([2H])c1n2-c1cccc(-c2ccccc2)c1] 490 | 71 |
| 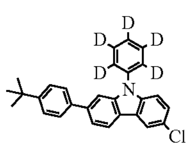 [SMILES: [2H]c1c([2H])c([2H])c(-n2c3ccc(Cl)cc3c3ccc(-c4ccc(C(C)(C)C)cc4)cc32)c([2H])c1[2H]] C-36 | 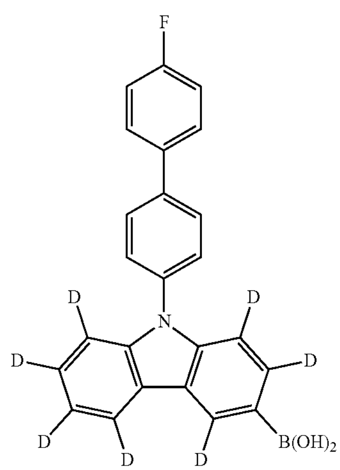 [SMILES: [2H]c1c([2H])c([2H])c2c(c1[2H])c1c([2H])c(B(O)O)c([2H])c([2H])c1n2-c1ccc(-c2ccc(F)cc2)cc1] F-13 | 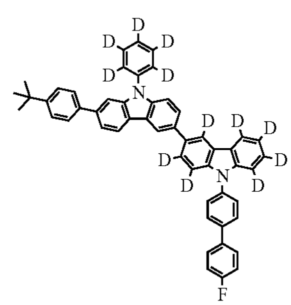 [SMILES: [2H]c1c([2H])c([2H])c(-n2c3ccc(-c4c([2H])c([2H])c5c(c4[2H])c4c([2H])c([2H])c([2H])c([2H])c4n5-c4ccc(-c5ccc(F)cc5)cc4)cc3c3ccc(-c4ccc(C(C)(C)C)cc4)cc32)c([2H])c1[2H]] 546 | 65 |

TABLE 11-continued
| Raw material C | Raw material F | Compound | Yield (%) |
|---|---|---|---|
| 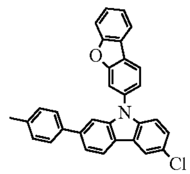 [SMILES: Cc1ccc(-c2ccc3c4cc(Cl)ccc4n(-c4ccc5c(c4)oc4ccccc45)c3c2)cc1] C-37 | 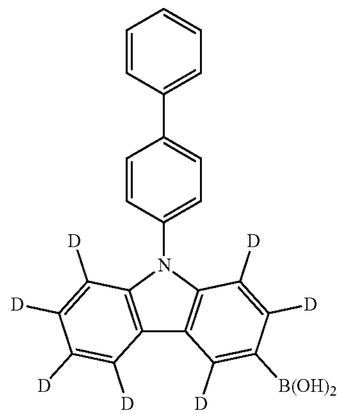 [SMILES: [2H]c1c([2H])c([2H])c2c(c1[2H])c1c([2H])c(B(O)O)c([2H])c([2H])c1n2-c1ccc(-c2ccccc2)cc1] F-2 | 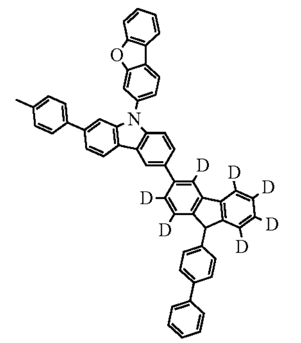 [SMILES: [2H]c1c([2H])c([2H])c2c(c1[2H])-c1c([2H])c(-c3ccc4c(c3)c3ccc(-c5ccc(C)cc5)cc3n4-c3ccc4c(c3)oc3ccccc34)c([2H])c([2H])c1C2c1ccc(-c2ccccc2)cc1] 547 | 55 |
| 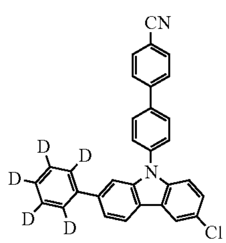 [SMILES: [2H]c1c([2H])c([2H])c(-c2ccc3c4cc(Cl)ccc4n(-c4ccc(-c5ccc(C#N)cc5)cc4)c3c2)c([2H])c1[2H]] C-38 | 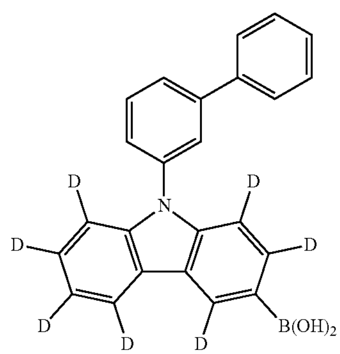 [SMILES: [2H]c1c([2H])c([2H])c2c(c1[2H])c1c([2H])c(B(O)O)c([2H])c([2H])c1n2-c1cccc(-c2ccccc2)c1] F-3 | 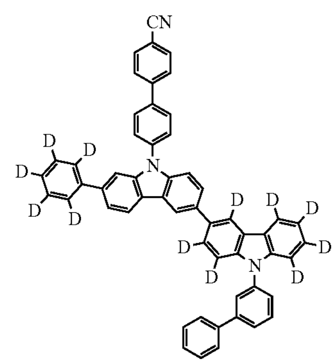 [SMILES: [2H]c1c([2H])c([2H])c(-c2ccc3c4cc(-c5c([2H])c([2H])c6c(c5[2H])c5c([2H])c([2H])c([2H])c([2H])c5n6-c5cccc(-c6ccccc6)c5)ccc4n(-c4ccc(-c5ccc(C#N)cc5)cc4)c3c2)c([2H])c1[2H]] 548 | 57 |
| 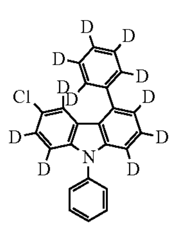 [SMILES: [2H]c1c([2H])c([2H])c(-c2c([2H])c([2H])c([2H])c3c2c2c([2H])c(Cl)c([2H])c([2H])c2n3-c2ccccc2)c([2H])c1[2H]] C-39 | 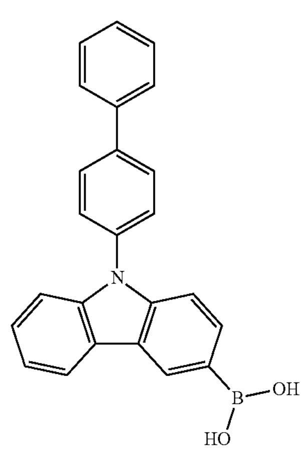 [SMILES: OB(O)c1ccc2c(c1)c1ccccc1n2-c1ccc(-c2ccccc2)cc1] | 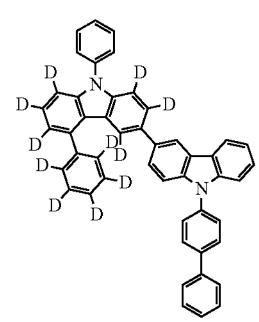 [SMILES: [2H]c1c([2H])c([2H])c(-c2c([2H])c([2H])c([2H])c3c2c2c([2H])c(-c4ccc5c(c4)c4ccccc4n5-c4ccc(-c5ccccc5)cc4)c([2H])c([2H])c2n3-c2ccccc2)c([2H])c1[2H]] 556 | 51 |

TABLE 11-continued
| Raw material C | Raw material F | Compound | Yield (%) |
|---|---|---|---|
| 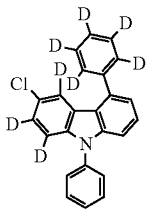 C-40 | 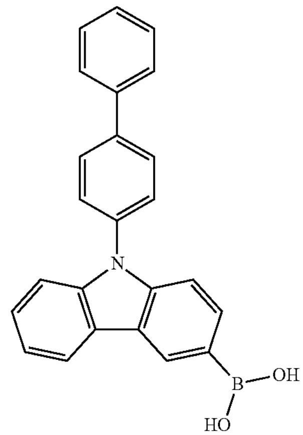 [SMILES: OB(O)c1ccc2c(c1)c1ccccc1n2-c1ccc(-c2ccccc2)cc1] | 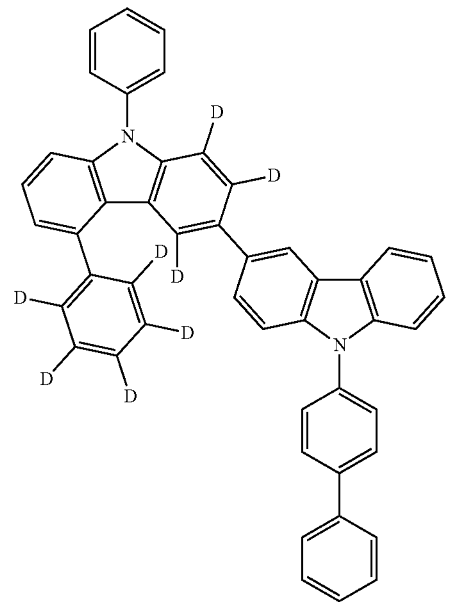 [SMILES: [2H]c1c([2H])c([2H])c(-c2cccc3c2c2c([2H])c(-c4ccc5c(c4)c4ccccc4n5-c4ccc(-c5ccccc5)cc4)c([2H])c([2H])c2n3-c2ccccc2)c([2H])c1[2H]] 558 | 48 |
| 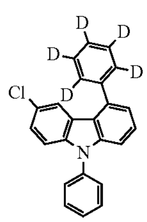 [SMILES: [2H]c1c([2H])c([2H])c(-c2cccc3c2c2cc(Cl)ccc2n3-c2ccccc2)c([2H])c1[2H]] C-41 | 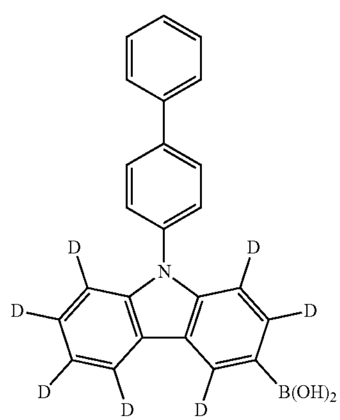 [SMILES: [2H]c1c([2H])c([2H])c2c(c1[2H])c1c([2H])c(B(O)O)c([2H])c([2H])c1n2-c1ccc(-c2ccccc2)cc1] F-2 | 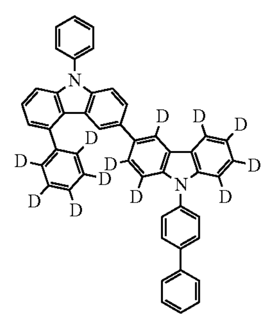 [SMILES: [2H]c1c([2H])c([2H])c(-c2cccc3c2c2cc(-c4c([2H])c([2H])c5c(c4[2H])c4c([2H])c([2H])c([2H])c([2H])c4n5-c4ccc(-c5ccccc5)cc4)ccc2n3-c2ccccc2)c([2H])c1[2H]] 559 | 53 |
The compounds synthesized above were subjected to mass spectrometry and the data obtained are shown in Table 12 below.
TABLE 12
| Compound No. | Mass spectrum ([M + H]$^+$) |
|---|---|
| 221 | 568.3 |
| 223 | 644.3 |
| 237 | 720.3 |
| 243 | 720.3 |
TABLE 12-continued
| Compound No. | Mass spectrum ([M + H]$^+$) |
|---|---|
| 244 | 720.2 |
| 249 | 734.3 |
| 253 | 750.3 |
| 257 | 796.3 |
| 268 | 720.4 |
| 269 | 720.3 |
| 270 | 734.3 |
| 276 | 750.3 |
| 285 | 796.4 |

TABLE 12-continued

| Compound No. | Mass spectrum ($[M + H]^+$) |
|---|---|
| 290 | 720.3 |
| 291 | 720.3 |
| 345 | 796.4 |
| 352 | 796.4 |
| 349 | 796.4 |
| 325 | 734.3 |
| 337 | 750.3 |
| 74 | 644.3 |
| 99 | 720.3 |
| 120 | 720.3 |
| 133 | 644.3 |
| 169 | 644.3 |
| 197 | 796.4 |
| 213 | 750.3 |
| 22 | 720.3 |
| 40 | 720.3 |
| 54 | 734.3 |
| 354 | 640.3 |
| 365 | 640.3 |
| 374 | 640.4 |
| 378 | 640.2 |
| 397 | 640.2 |
| 408 | 640.3 |
| 413 | 640.3 |
| 444 | 720.3 |
| 462 | 796.4 |
| 470 | 796.4 |
| 480 | 720.3 |
| 482 | 796.3 |
| 483 | 796.3 |
| 486 | 796.5 |
| 488 | 720.2 |
| 489 | 796.2 |
| 490 | 796.4 |
| 543 | 700.3 |
| 544 | 662.3 |
| 545 | 669.3 |
| 546 | 723.3 |
| 547 | 748.3 |
| 548 | 750.3 |
| 549 | 885.3 |
| 556 | 648.3 |
| 558 | 645.3 |
| 559 | 649.3 |

NMR data of some compounds are shown in Table 13 below:

TABLE 13

| Compound | NMR data |
|---|---|
| Compound 223 | $^1$HNMR (400 MHZ, $CD_2Cl_2$): δ7.82-7.88 (d, 2H), δ7.78-7.82 (s, 1H), δ7.58-7.78 (m, 13H), δ7.35-7.58 (m, 7H), δ7.07-7.25 (d, 2H). |
| Compound 268 | $^1$HNMR (400 MHZ, $CD_2Cl_2$): δ7.83-7.91 (m, 3H), δ7.79-7.83 (s, 1H), δ7.57-7.79 (m, 14H), δ7.43-7.57 (m, 8H), δ7.35-7.42 (t, 2H), δ7.15-7.24 (m, 1H). |
| Compound A38 | $^1$HNMR (400 MHZ, $CD_2Cl_2$): δ8.59-8.66 (d, 1H), δ8.33-8.39 (d, 1H), δ8.22-8.33 (m, 5H), δ8.17-8.22 (d, 1H), δ8.10-8.17 (d, 1H), δ7.58-7.68 (m, 3H), δ7.43-7.58 (m, 7H), δ7.31-7.43 (m, 5H), δ7.17-7.31 (m, 3H). |

Manufacture and Evaluation of Organic Electroluminescent Device

Example 1: Green Organic Electroluminescent Device

An anode was prepared by the following process: an ITO substrate of ITO (100 Å)/Ag (1000 Å)/ITO (100 Å) having a total thickness of 1200 Å was cut into a size of 40 mm (length)×40 mm (width)×0.7 mm (thickness) to be prepared into an experimental substrate with cathode, anode and insulating layer patterns by adopting a photoetching process, and surface treatment was performed by utilizing ultraviolet ozone and $O_2$:$N_2$ plasma to increase the work function of the anode, and the surface of the ITO substrate can be cleaned with an organic solvent to remove impurities and oil on the surface of the ITO substrate.

HAT-CN was vacuum evaporated on the experimental substrate (the anode) to form a hole injection layer (HIL) having a thickness of 100 Å, and then NPB was vacuum evaporated on the hole injection layer to form a hole transport layer having a thickness of 1120 Å.

TAPC was vacuum evaporated on the hole transport layer to form a hole auxiliary layer having a thickness of 380 Å.

Next, a compound 285 (the second compound) and a compound A6 (the first compound) were co-evaporated on the hole auxiliary layer at a mass percentage of 60%:40% as a host material for a luminescent layer, while the host material was mixed with a guest material $Ir(ppy)_2acac$ at a doping ratio of 8% to be co-evaporated to form a green luminescent layer (EML) having a thickness of 340 Å.

A compound ET-1 and LiQ were mixed in a weight ratio of 1:1 and evaporated on the luminescent layer to form an electron transport layer (ETL) having a thickness of 320 Å, Yb was evaporated on the electron transport layer to form an electron injection layer (EIL) having a thickness of 15 Å, and then magnesium (Mg) and silver (Ag) were mixed and vacuum evaporated on the electron injection layer at an evaporation rate of 1:9 to form a cathode having a thickness of 120 Å.

In addition, CP-1 having a thickness of 600 Å was vacuum evaporated on the above cathode, thereby completing the manufacture of the green organic electroluminescent device.

Examples 2 to 56

An organic electroluminescent device was manufactured by the same method as that in Example 1 except that a compound combination in Table 14 was used instead of the luminescent layer host compound combination in Example 1 when the luminescent layer was manufactured.

Comparative Examples 1 to 4

An organic electroluminescent device was manufactured by the same method as that in Example 1 except that a compound combination in Table 15 was used instead of the luminescent layer host compound combination in Example 1 when the luminescent layer was manufactured.

When the organic electroluminescent device was manufactured, the structures of materials used in the comparative examples and the examples are as follows.

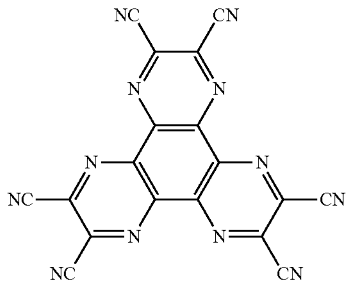
HAT-CN
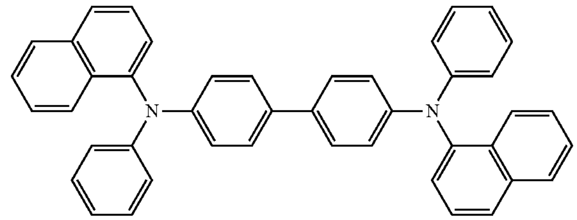
NPB
HT-7
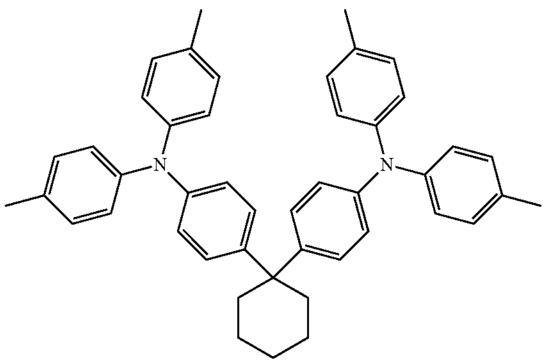
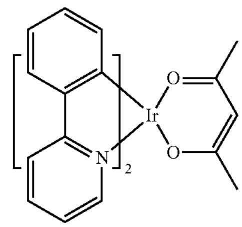
Ir(ppy)$_2$acac
ET-1
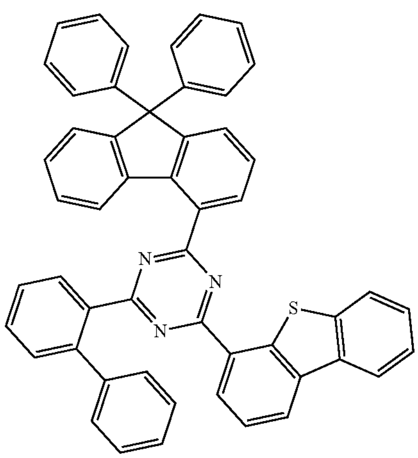
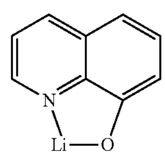
LiQ
CP-1
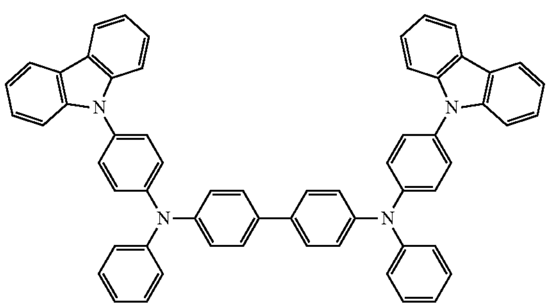
Compound GHN1
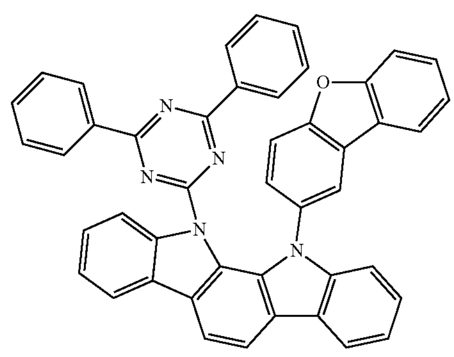

-continued
Compound GHN2
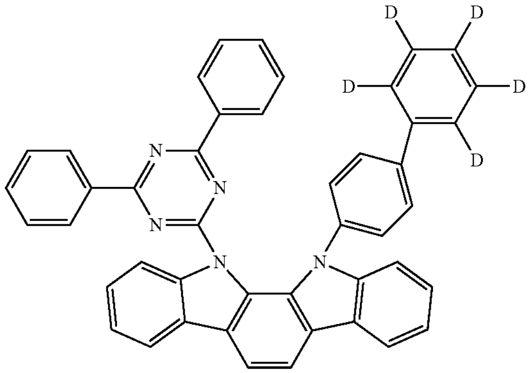
Compound GHN3
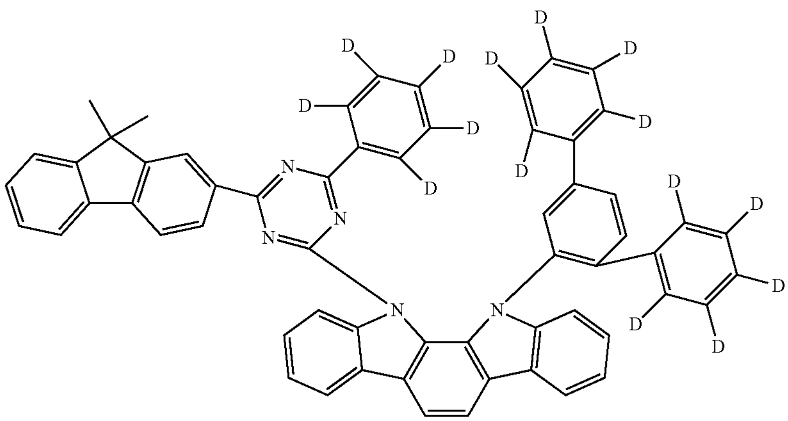
Compound GHN4
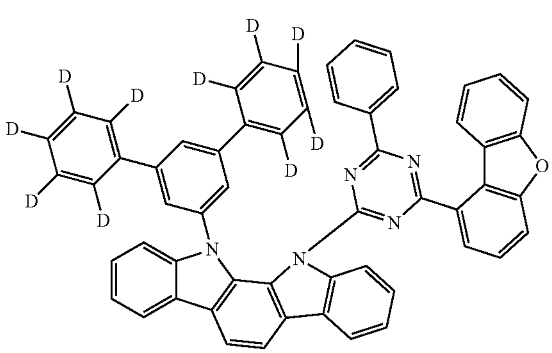
Compound GHP1
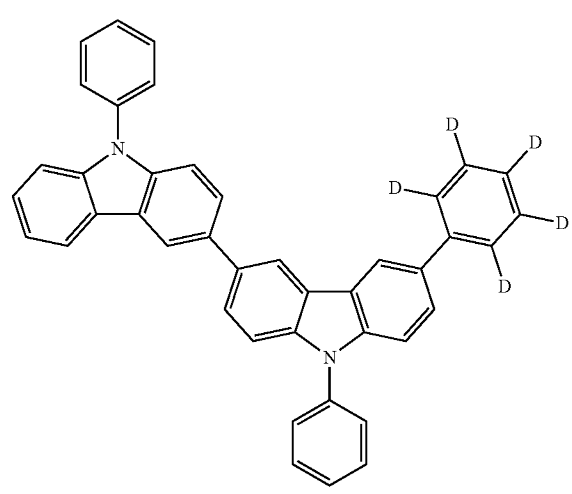

-continued

Compound GHP2

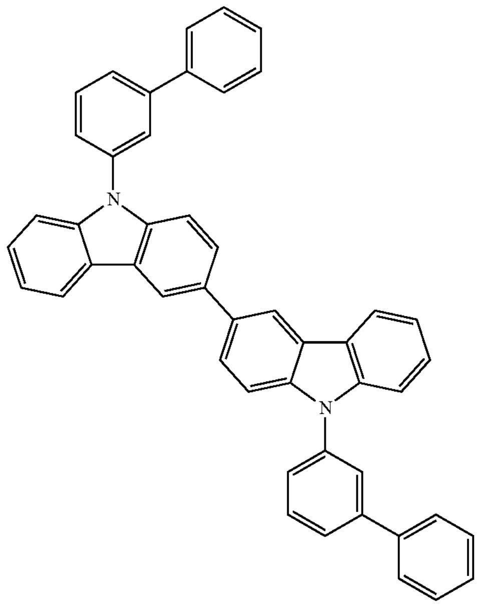

Compound GHP3

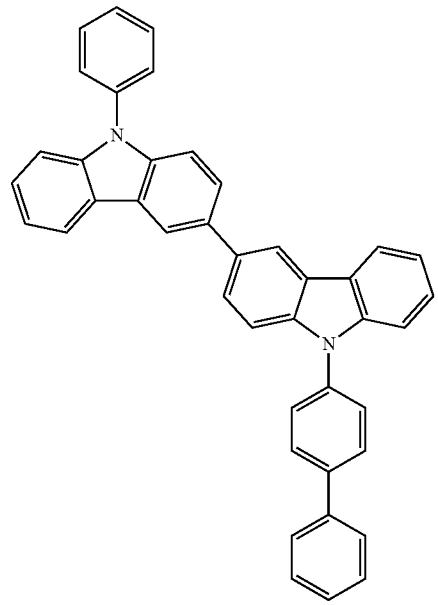

The green organic electroluminescent devices manufactured in Examples 1 to 56 and Comparative examples 1 to 4 were subjected to performance test, specifically the current-voltage-brightness (IVL) performance of the devices was tested under the condition of 10 $mA/cm^2$, and the T95 device service life was tested under the condition of 20 $mA/cm^2$, and the test results are shown in Table 14 below.

TABLE 14

| Example | Second compound | First compound | Operating voltage (V) | Current efficiency (Cd/A) | Chromaticity coordinate CIEx, CIEy | T95 service life (h) |
|---|---|---|---|---|---|---|
| Example 1 | Compound 285 | Compound A6 | 3.85 | 79.11 | 0.251, 0.696 | 308 |
| Example 2 | Compound 221 | Compound A5 | 3.82 | 80.72 | 0.251, 0.696 | 306 |
| Example 3 | Compound 223 | Compound A38 | 3.83 | 81.63 | 0.248, 0.699 | 305 |
| Example 4 | Compound 237 | Compound A2 | 3.90 | 79.84 | 0.258, 0.699 | 291 |
| Example 5 | Compound 243 | Compound A36 | 3.89 | 79.55 | 0.248, 0.696 | 304 |
| Example 6 | Compound 244 | Compound A35 | 3.86 | 79.00 | 0.246, 0.693 | 293 |
| Example 7 | Compound 257 | Compound A39 | 3.84 | 81.52 | 0.245, 0.692 | 305 |
| Example 8 | Compound 268 | Compound A40 | 3.91 | 80.03 | 0.247, 0.694 | 293 |
| Example 9 | Compound 269 | Compound A56 | 3.86 | 79.60 | 0.253, 0.696 | 284 |
| Example 10 | Compound 290 | Compound A61 | 3.89 | 80.05 | 0.257, 0.691 | 288 |
| Example 11 | Compound 291 | Compound A13 | 3.87 | 78.22 | 0.253, 0.696 | 297 |
| Example 12 | Compound 345 | Compound B2 | 3.87 | 64.92 | 0.248, 0.699 | 288 |
| Example 13 | Compound 352 | Compound B5 | 3.83 | 64.89 | 0.254, 0.693 | 298 |
| Example 14 | Compound 349 | Compound A10 | 3.85 | 71.21 | 0.248, 0.692 | 287 |
| Example 15 | Compound 325 | Compound A48 | 3.93 | 71.32 | 0.252, 0.698 | 300 |
| Example 16 | Compound 74 | Compound A40 | 3.99 | 75.56 | 0.252, 0.698 | 298 |
| Example 17 | Compound 99 | Compound B7 | 3.91 | 64.30 | 0.252, 0.694 | 310 |
| Example 18 | Compound 120 | Compound B10 | 3.93 | 64.78 | 0.248, 0.699 | 307 |

TABLE 14-continued

| Example | Second compound | First compound | Operating voltage (V) | Current efficiency (Cd/A) | Chromaticity coordinate CIEx, CIEy | T95 service life (h) |
|---|---|---|---|---|---|---|
| Example 19 | Compound 133 | Compound B21 | 3.95 | 63.66 | 0.257, 0.698 | 295 |
| Example 20 | Compound 169 | Compound B16 | 3.87 | 64.31 | 0.253, 0.696 | 296 |
| Example 21 | Compound 197 | Compound B52 | 3.91 | 64.60 | 0.248, 0.698 | 290 |
| Example 22 | Compound 22 | Compound B54 | 3.96 | 64.10 | 0.252, 0.696 | 284 |
| Example 23 | Compound 40 | Compound B36 | 3.98 | 64.50 | 0.254, 0.699 | 285 |
| Example 24 | Compound 354 | Compound B128 | 3.86 | 59.72 | 0.246, 0.697 | 266 |
| Example 25 | Compound 365 | Compound B129 | 3.91 | 60.10 | 0.256, 0.698 | 264 |
| Example 26 | Compound 374 | Compound B130 | 3.99 | 59.31 | 0.252, 0.692 | 268 |
| Example 27 | Compound 27 | Compound B21 | 3.97 | 58.83 | 0.258, 0.695 | 266 |
| Example 28 | Compound 397 | Compound B132 | 3.86 | 59.53 | 0.247, 0.692 | 270 |
| Example 29 | Compound 408 | Compound C50 | 3.92 | 58.80 | 0.254, 0.694 | 264 |
| Example 30 | Compound 413 | Compound C51 | 3.93 | 59.87 | 0.259, 0.696 | 265 |
| Example 31 | Compound 444 | Compound A2 | 3.88 | 75.12 | 0.256, 0.694 | 287 |
| Example 32 | Compound 462 | Compound A35 | 3.87 | 74.36 | 0.252, 0.699 | 296 |
| Example 33 | Compound 480 | Compound A10 | 3.88 | 75.62 | 0.254, 0.696 | 301 |
| Example 34 | Compound 482 | Compound A48 | 3.99 | 76.45 | 0.248, 0.696 | 297 |
| Example 35 | Compound 483 | Compound A39 | 3.97 | 72.34 | 0.255, 0.696 | 302 |
| Example 36 | Compound 486 | Compound A5 | 3.89 | 71.52 | 0.252, 0.697 | 294 |
| Example 37 | Compound 488 | Compound B21 | 3.93 | 63.89 | 0.254, 0.696 | 285 |
| Example 38 | Compound 489 | Compound B52 | 3.97 | 64.50 | 0.255, 0.691 | 309 |
| Example 39 | Compound 490 | Compound B130 | 3.96 | 64.20 | 0.249, 0.691 | 296 |
| Example 40 | Compound 249 | Compound B2 | 3.98 | 65.00 | 0.246, 0.699 | 291 |
| Example 41 | Compound 253 | Compound B16 | 3.93 | 63.79 | 0.258, 0.695 | 304 |
| Example 42 | Compound 270 | Compound B36 | 3.91 | 64.30 | 0.259, 0.692 | 292 |
| Example 43 | Compound 276 | Compound B128 | 3.89 | 63.70 | 0.247, 0.693 | 304 |
| Example 44 | Compound 44 | Compound B132 | 3.92 | 64.97 | 0.245, 0.692 | 302 |
| Example 45 | Compound 213 | Compound B7 | 3.92 | 63.62 | 0.245, 0.692 | 285 |
| Example 46 | Compound 54 | Compound C51 | 3.99 | 64.65 | 0.251, 0.696 | 301 |
| Example 47 | Compound 543 | Compound A2 | 3.85 | 81.09 | 0.246, 0.692 | 289 |
| Example 48 | Compound 544 | Compound A35 | 3.91 | 75.36 | 0.245, 0.694 | 298 |
| Example 49 | Compound 545 | Compound A10 | 3.88 | 77.91 | 0.247, 0.694 | 300 |
| Example 50 | Compound 546 | Compound A48 | 3.86 | 77.46 | 0.253, 0.696 | 302 |
| Example 51 | Compound 547 | Compound A39 | 3.90 | 79.58 | 0.257, 0.693 | 290 |
| Example 52 | Compound 548 | Compound A5 | 3.92 | 79.04 | 0.253, 0.695 | 303 |
| Example 53 | Compound 549 | Compound A40 | 3.89 | 79.62 | 0.252, 0.697 | 297 |
| Example 54 | Compound 556 | Compound A56 | 3.86 | 64.29 | 0.258, 0.696 | 292 |
| Example 55 | Compound 558 | Compound A61 | 3.85 | 64.49 | 0.246, 0.695 | 288 |
| Example 56 | Compound 559 | Compound A13 | 3.84 | 72.16 | 0.250, 0.693 | 301 |

TABLE 14-continued

| Example | Second compound | First compound | Operating voltage (V) | Current efficiency (Cd/A) | Chromaticity coordinate CIEx, CIEy | T95 service life (h) |
|---|---|---|---|---|---|---|
| Comparative example 1 | Compound GHP1 | Compound GHN1 | 4.53 | 45.10 | 0.250, 0.692 | 180 |
| Comparative example 2 | Compound GHP2 | Compound GHN2 | 4.47 | 50.60 | 0.253, 0.697 | 215 |
| Comparative example 3 | Compound GHP3 | Compound GHN3 | 4.49 | 49.82 | 0.251, 0.698 | 200 |
| Comparative example 4 | Compound GHP3 | Compound GHN4 | 4.50 | 50.06 | 0.249, 0.695 | 212 |

It can be seen from the results in Table 14 that the examples of the present disclosure have the advantages that the current efficiency (Cd/A) was improved by at least 16.2% and the service life was improved by at least 22.8% compared with Comparative examples 1 to 4.

It can be seen from the above results that the present disclosure provides an organic electroluminescent device adopting a specific luminescent layer host material combination, and the device performance was significantly improved compared with Comparative examples 1 to 4.

Examples 57 to 58

An organic electroluminescent device was manufactured by the same method as that in Example 1 except that a luminescent layer host compound mixing ratio (mass percent) in Table was used instead of the luminescent layer host compound mixing ratio in Example 1 when the luminescent layer was manufactured.

Examples 59 to 60

An organic electroluminescent device was manufactured by the same method as that in Example 2 except that a luminescent layer host compound mixing ratio (mass percent) in Table was used instead of the luminescent layer host compound mixing ratio in Example 2 when the luminescent layer was manufactured.

TABLE 15

| Example | luminescent layer host compound | Mixing ratio | Operating voltage (V) | Current efficiency (Cd/A) | Chromaticity coordinate CIEx, CIEy | T95 service life (h) |
|---|---|---|---|---|---|---|
| Example 1 | Compound 285:compound A6 | 60:40 | 3.85 | 79.11 | 0.251, 0.696 | 308 |
| Example 57 | Compound 285:compound A6 | 50:50 | 4.02 | 73.60 | 0.249, 0.690 | 304 |
| Example 58 | Compound 285:compound A6 | 70:30 | 3.72 | 68.93 | 0.253, 0.695 | 275 |
| Example 2 | Compound 221:compound A5 | 60:40 | 3.82 | 80.72 | 0.251, 0.696 | 306 |
| Example 59 | Compound 221:compound A5 | 50:50 | 3.96 | 74.21 | 0.247, 0.692 | 300 |
| Example 60 | Compound 221:compound A5 | 70:30 | 3.70 | 69.00 | 0.252, 0.699 | 270 |

Referring to Table 15 above, compared with Examples 1 and 2, the performance of the devices was also changed when the luminescent layer host compound mixing ratio was different in Examples 57-60. Specifically, the current efficiency was improved by at least 7.5% in Example 1 compared with Examples 57 and 58, and similarly, the current efficiency was improved by at least 8.8% in Example 2 compared with Examples 59 and 60. Therefore, when the mass ratio of the second compound to the first compound in the present disclosure is 60%:40%, the device performance is optimal.

The organic electroluminescent device of the present disclosure is composed of the first compound having strong electron properties and the second compound having relatively strong hole properties to adjust charge balance so that the organic electroluminescent device has excellent properties. According to the second compound for the organic electroluminescent device, specific 3,3-bicarbazole is used as a parent core, deuteration is performed in at least two ortho positions of a connecting bond of bicarbazole, and aryl is connected to one carbazole ring, and an electron donating group is connected to biscarbazole, and such a specific combination reduces the twist angle between two carbazole rings, and improves the conjugation, thereby improving the hole mobility and charge transport balance of a host material.

Second, the simultaneous introduction of deuterated groups on both types of materials used in the present disclosure can reduce the molecular volume of the compounds, reduce the molecular spacing between the two compounds, improve the carrier transport efficiency, and thus significantly improve the stacking characteristics and chemical stability of the materials; and using the above two materials as a mixed host material for the green organic electroluminescent device can reduce the operating voltage of the organic electroluminescent device and improve the luminous efficiency as well as the service life of the device.

What is claimed is:

1. An organic electroluminescent device, comprising a cathode, an anode and an organic layer;

wherein the cathode and the anode are oppositely disposed;

the organic layer is located between the cathode and the anode;

the organic layer includes an organic luminescent layer;

the organic luminescent layer includes a first compound and a second compound;

the first compound is selected from compounds represented by a formula 1:

Formula 1

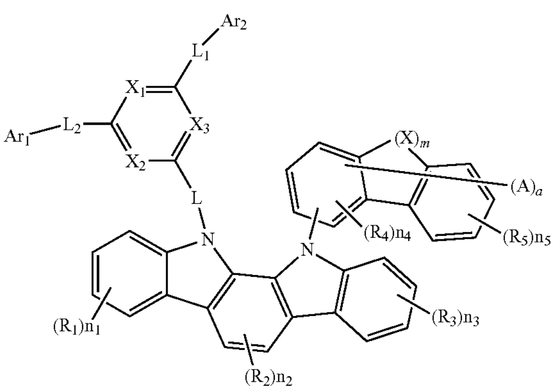

Formula 1-A

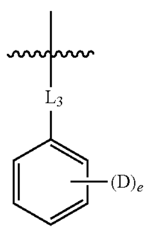

$X_1$, $X_2$ and $X_3$ are each independently selected from C(H) or N, and at least one is selected from N;

each group A is independently selected from hydrogen or a formula 1-A, and e is the number of D, and is selected from 0, 1, 2, 3, 4 or 5; and at least one group A is selected from the formula 1-A;

a is the number of the group A, and is selected from 1, 2, 3, 4, 5, 6 or 7;

each $R_1$, each $R_2$, each $R_3$, each $R_4$, and each $R_5$ are each independently selected from deuterium, a halogen group, cyano, or alkyl with 1 to 10 carbon atoms;

$n_1$ represents the number of $R_1$, and is selected from 0, 1, 2, 3 or 4, and when $n_1$ is greater than 1, any two $R_1$ are the same or different;

$n_2$ represents the number of $R_2$, and is selected from 0, 1 or 2, and when $n_2$ is greater than 1, any two $R_2$ are the same or different;

$n_3$ represents the number of $R_3$, and is selected from 0, 1, 2, 3 or 4, and when $n_3$ is greater than 1, any two $R_3$ are the same or different;

$n_4$ represents the number of $R_4$, and is selected from 0, 1, 2, 3 or 4, and when $n_4$ is greater than 1, any two $R_4$ are the same or different;

$n_5$ represents the number of $R_5$, and is selected from 0, 1, 2, 3, 4 or 5, and when $n_5$ is greater than 1, any two $R_5$ are the same or different;

D is deuterium;

L is selected from a single bond or phenylene;

each $L_3$, $L_1$, and $L_2$ are each independently selected from a single bond, substituted or unsubstituted phenylene, substituted or unsubstituted naphthylene, substituted or unsubstituted biphenylene, substituted or unsubstituted carbazolylene, substituted or unsubstituted dibenzothienylene, or substituted or unsubstituted dibenzofurylene;

substituents in each $L_3$, the $L_1$ and the $L_2$ are each independently selected from deuterium, fluorine, cyano, methyl, ethyl, n-propyl, isopropyl, tert-butyl, or phenyl;

$Ar_1$ and $Ar_2$ are each independently selected from substituted or unsubstituted phenyl, substituted or unsubstituted naphthyl, substituted or unsubstituted phenanthryl, substituted or unsubstituted biphenyl, substituted or unsubstituted fluorenyl, substituted or unsubstituted terphenyl, substituted or unsubstituted pyridyl, substituted or unsubstituted carbazolyl, substituted or unsubstituted dibenzofuranyl, or substituted or unsubstituted dibenzothienyl;

substituents in the $Ar_1$ and the $Ar_2$ are each independently selected from deuterium, fluorine, cyano, methyl, ethyl, n-propyl, isopropyl, tert-butyl, phenyl, naphthyl, biphenyl, triphenylsilyl, cyclohexyl, or adamantyl;

X is selected from O or S;

m is selected from 0 or 1;

the second compound is selected from compounds represented by a formula 2:

Formula 2

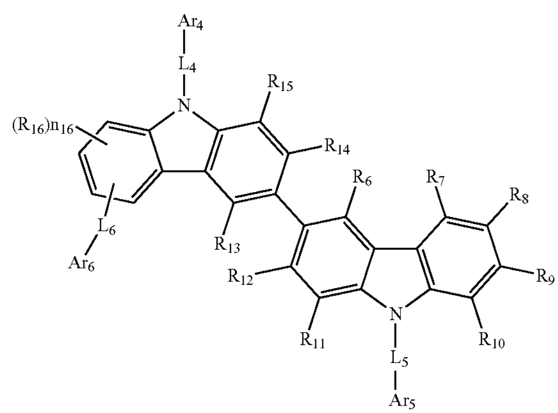

wherein $L_4$ and $L_5$ are each independently selected from a single bond, substituted or unsubstituted phenylene, substituted or unsubstituted naphthylene, substituted or unsubstituted biphenylene, substituted or unsubstituted carbazolylene, substituted or unsubstituted dibenzofurylene, or substituted or unsubstituted dibenzothienylene;

substituents in $L_4$ and $L_5$ are the same or different, and are each independently selected from deuterium, fluorine, cyano, methyl, ethyl, n-propyl, isopropyl, tert-butyl or phenyl;

$L_6$ is selected from a single bond, or phenylene;

$Ar_4$ and $Ar_5$ are each independently selected from a substituted or unsubstituted group W, wherein the unsubstituted group W is selected from the group consisting of:

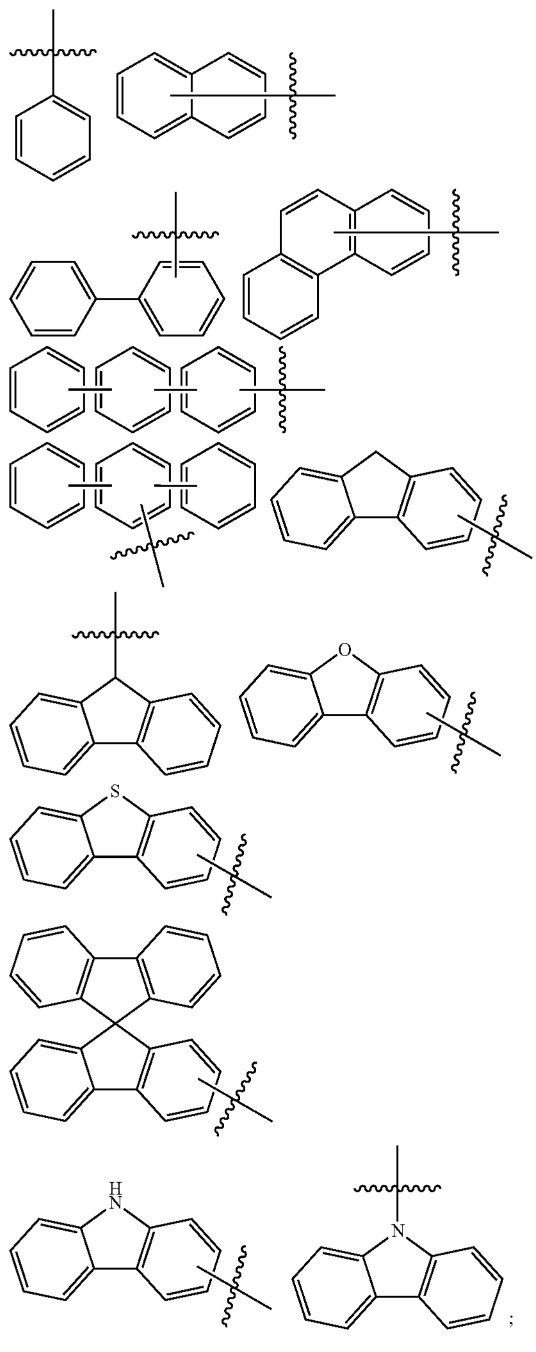

wherein ⌇ represents a chemical bond; the substituted group W contains one or more substituents selected from deuterium, fluorine, cyano, methyl, ethyl, n-propyl, isopropyl, tert-butyl, phenyl or naphthyl; and when the substituted group W contains a plurality of substituents, the substituents are the same or different;

$Ar_6$ is selected from substituted or unsubstituted phenyl, substituted or unsubstituted naphthyl, or substituted or unsubstituted biphenyl;

$R_6$, $R_7$, $R_8$, $R_9$, $R_{10}$, $R_{11}$, $R_{12}$, $R_{13}$, $R_{14}$, and $R_{15}$ are each independently selected from hydrogen or deuterium, and at least two of $R_6$, $R_{12}$, $R_{13}$, and $R_{14}$ are deuterium;

each $R_{16}$ is independently selected from hydrogen or deuterium;

$n_{16}$ is the number of $R_{16}$, and is selected from 1, 2 or 3, and when $n_{16}$ is greater than 1, any two $R_{16}$ are the same or different;

substituents in $Ar_6$ are the same or different, and are each independently selected from deuterium, fluorine, cyano, methyl, ethyl, n-propyl, isopropyl, tert-butyl or phenyl.

2. The organic electroluminescent device according to claim 1, wherein in the first compound, $Ar_1$ and $Ar_2$ are each independently selected from a substituted or unsubstituted group $G_1$, wherein the unsubstituted group $G_1$ is selected from the group consisting of:

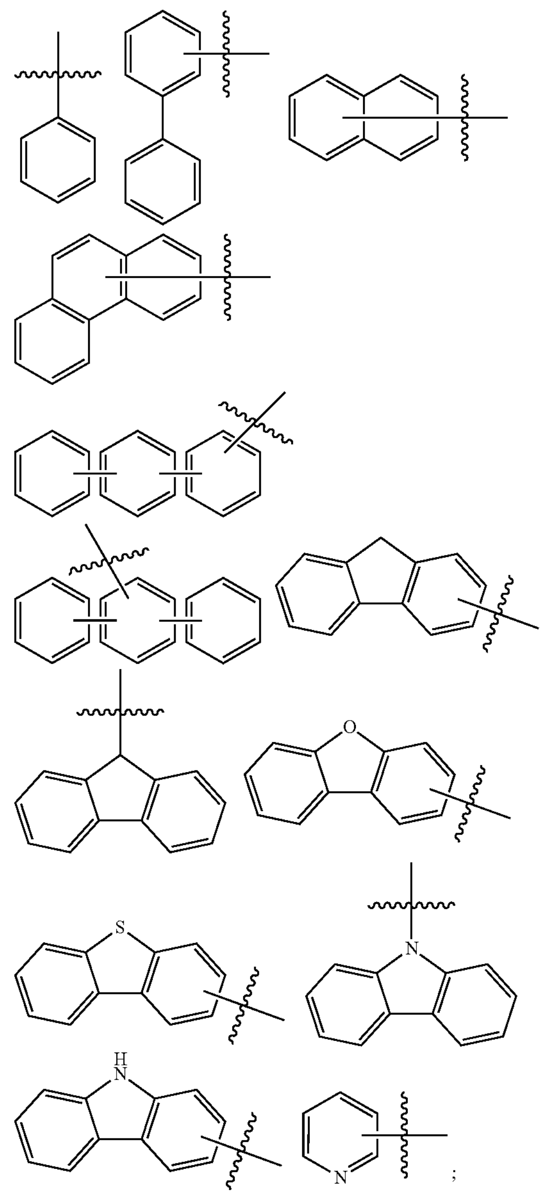

wherein ⌇ represents a chemical bond; the substituted group $G_1$ contains one or more substituents each independently selected from deuterium, fluorine, cyano, methyl, ethyl, n-propyl, isopropyl, tert-butyl, phenyl, naphthyl, biphenyl, triphenylsilyl, cyclohexyl or adamantyl; and when the substituted group $G_1$ contains a plurality of substituents, the substituents are the same or different.
3. The organic electroluminescent device according to claim 1, wherein the first compound is selected from the group consisting of:
A1
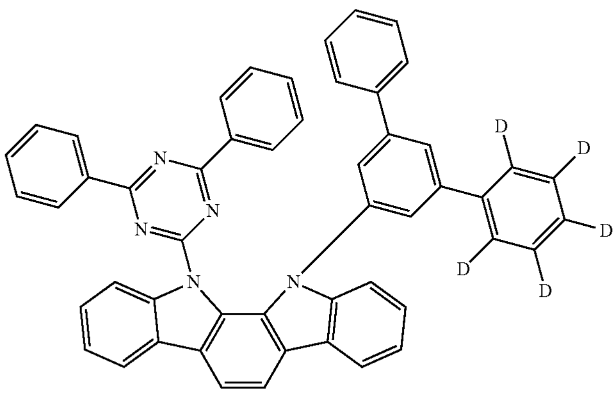
A2
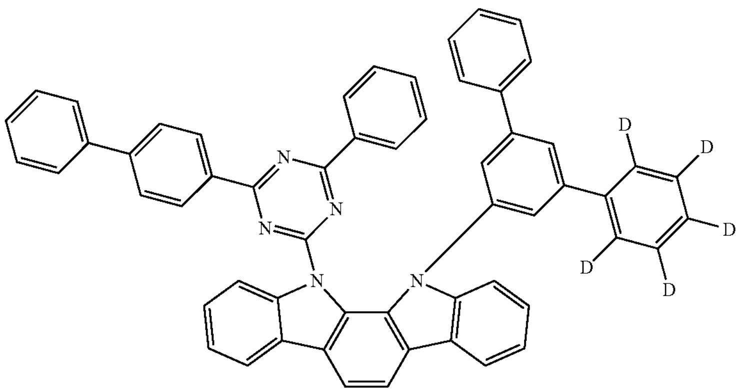
A3
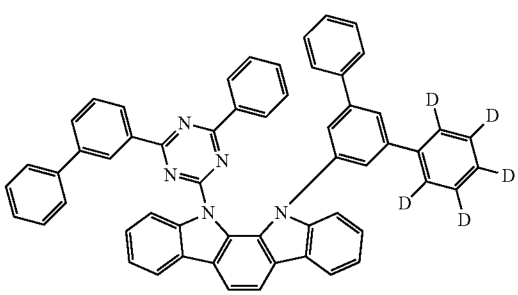
A4
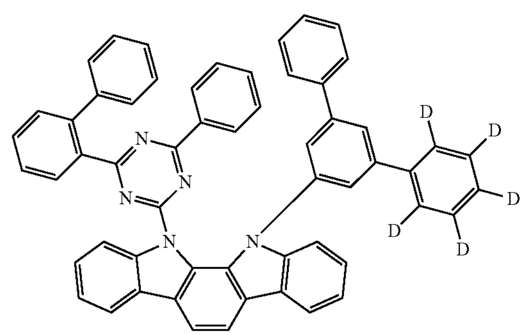
A5
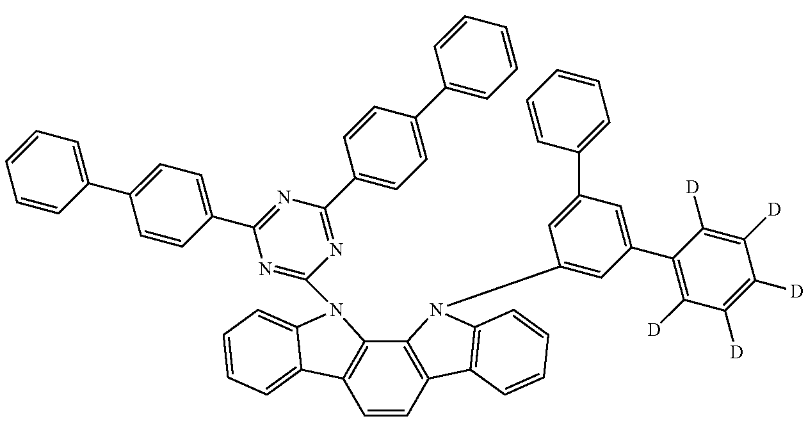

-continued
A6
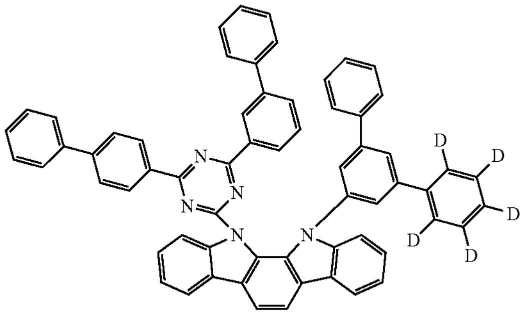
A7
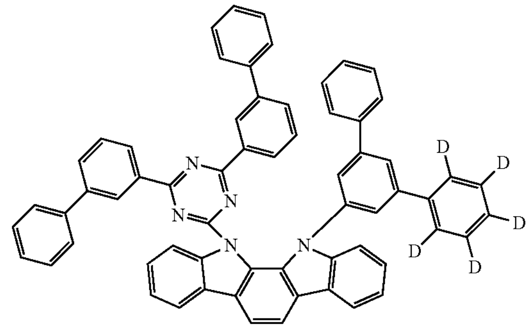
A8
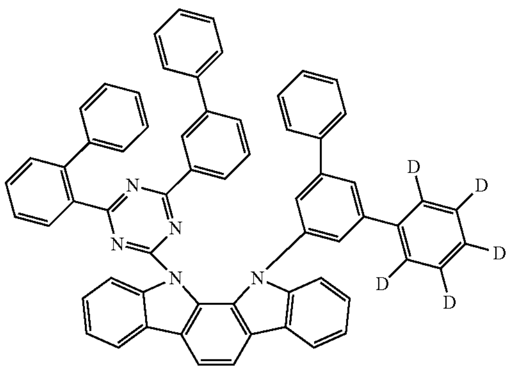
A9
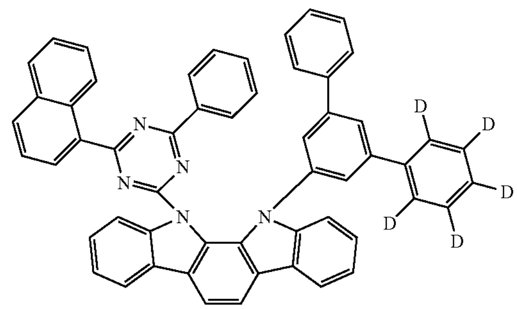
A10
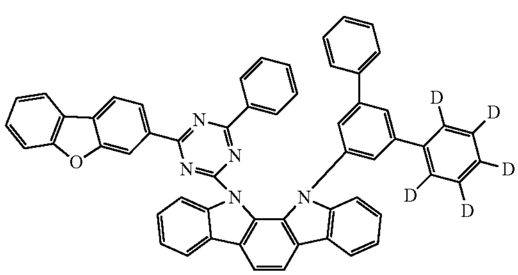
A11
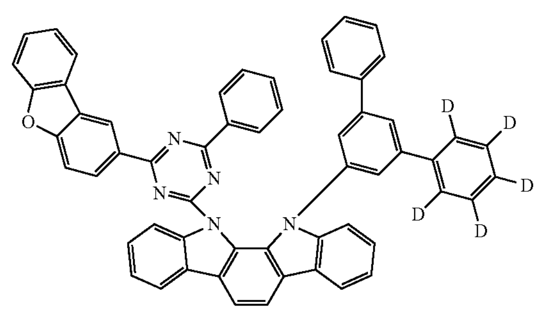
A12
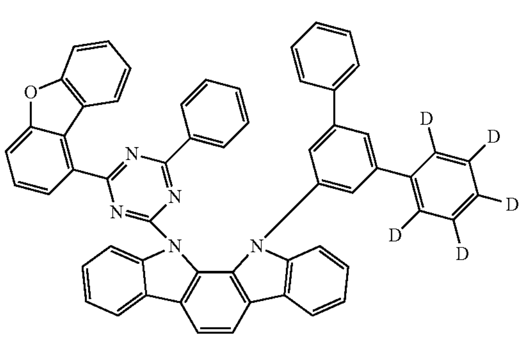
A13
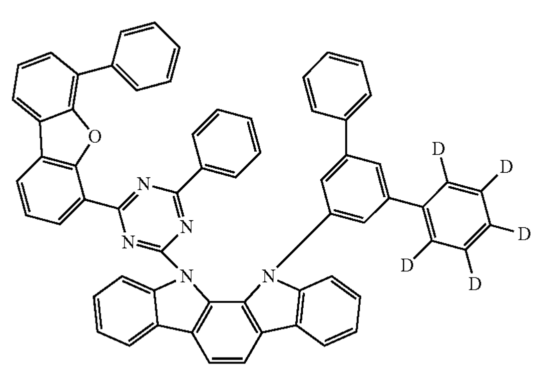

-continued
A14
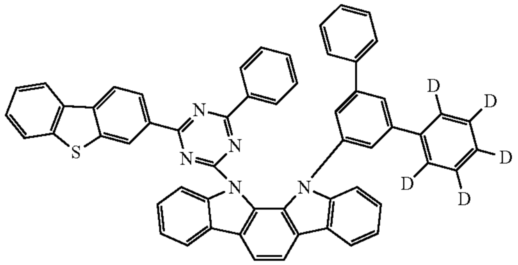
A15
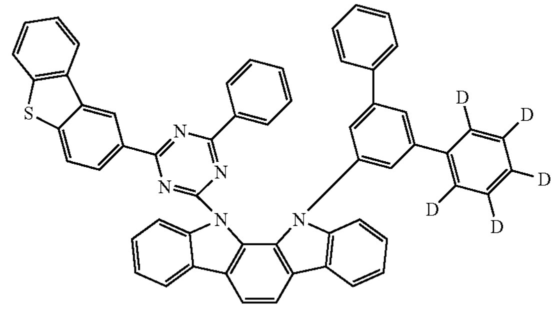
A16
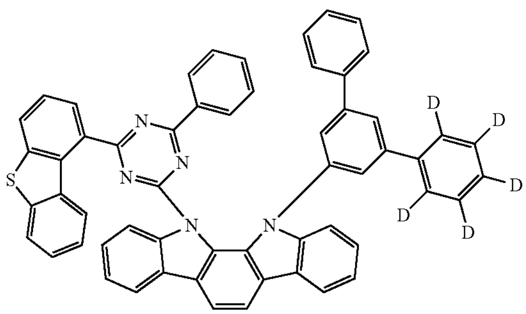
A17
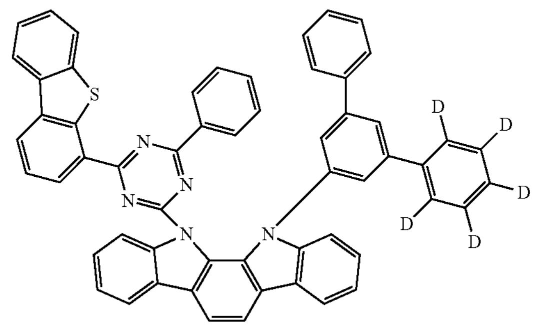
A18
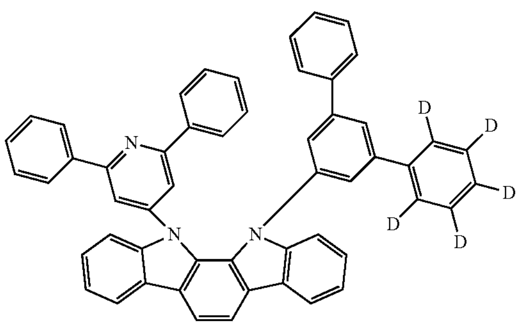
A19
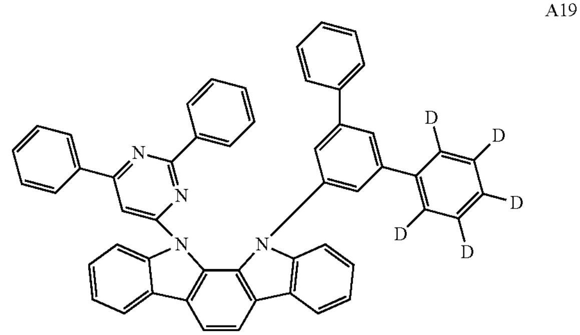
A20
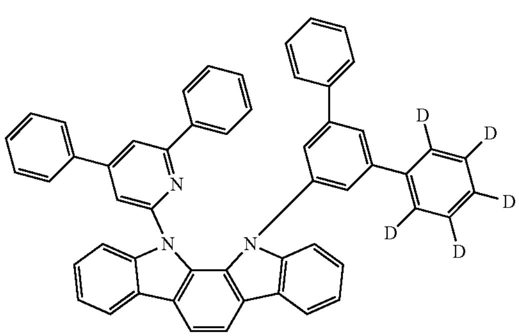
A21
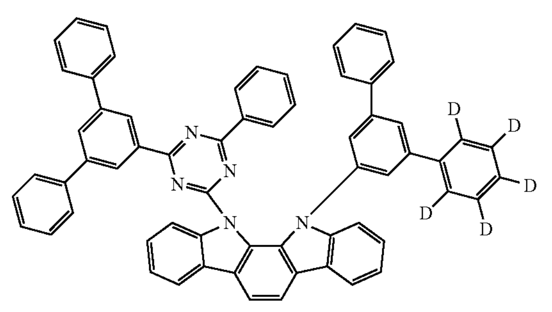

-continued
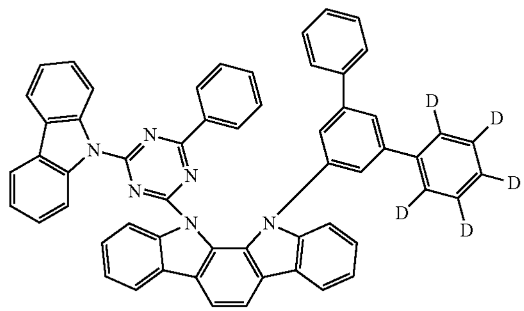
A22
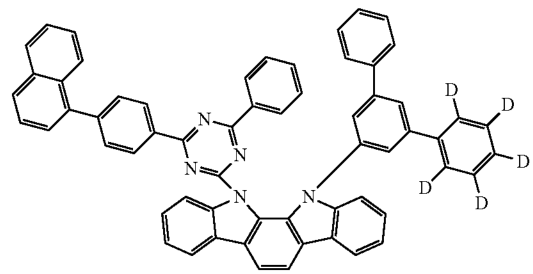
A23
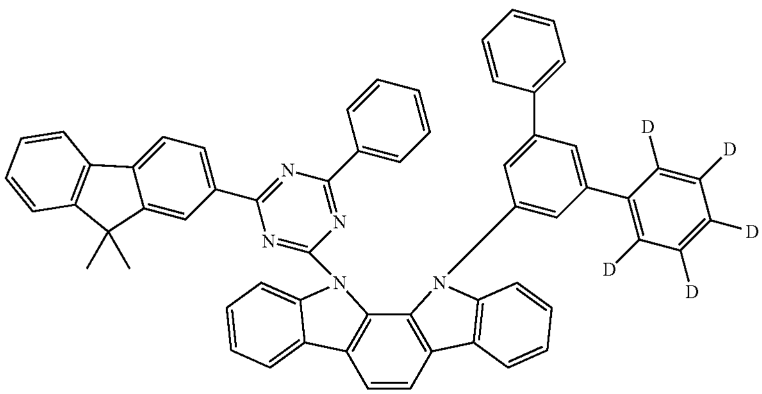
A24
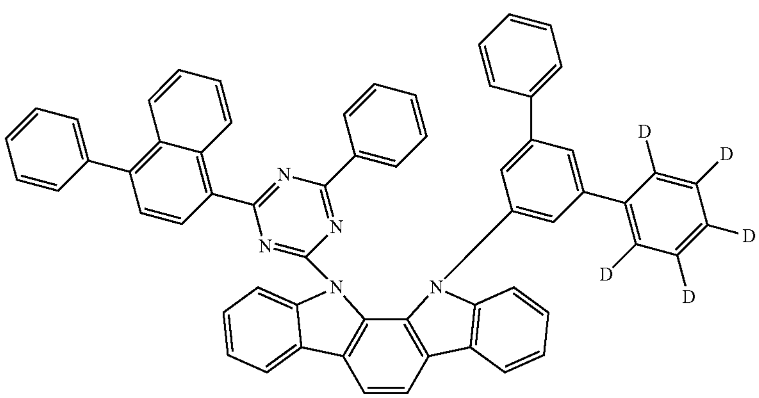
A25
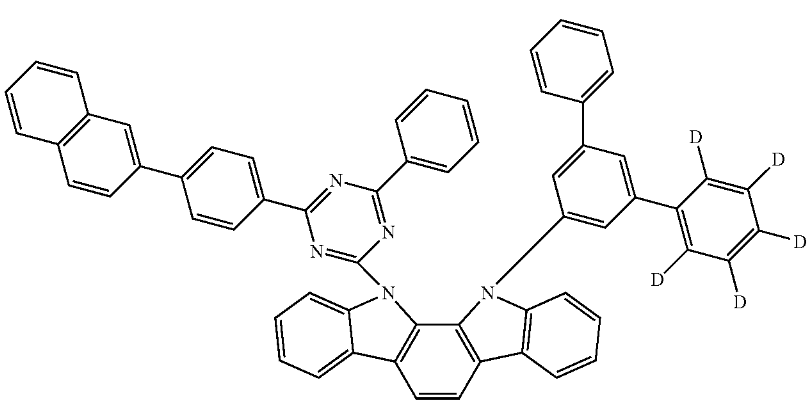
A26

-continued
A27
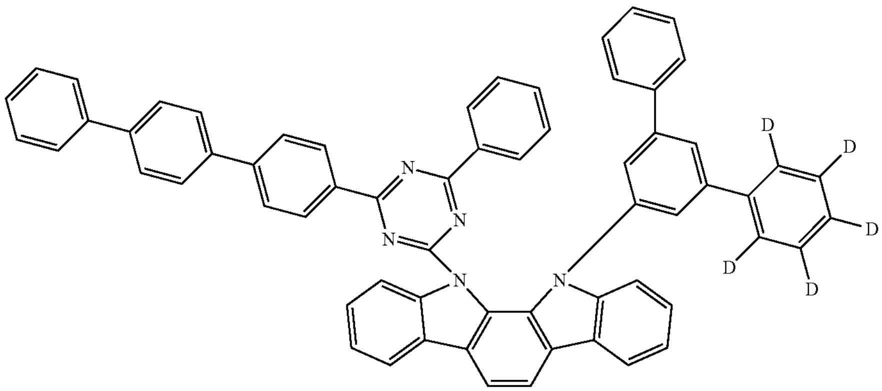
A28
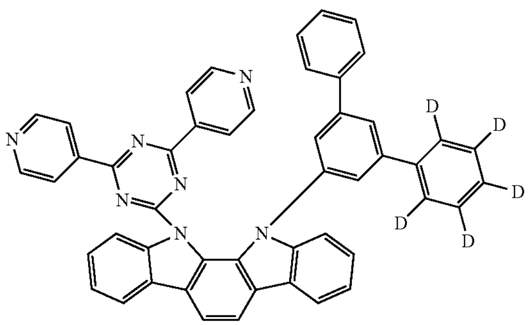
A29
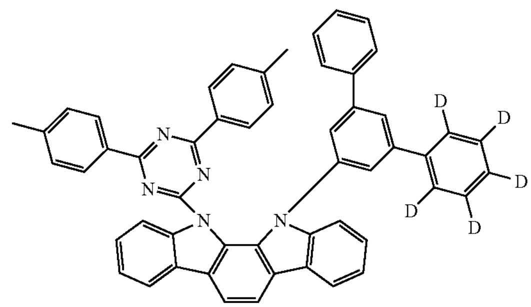
A30
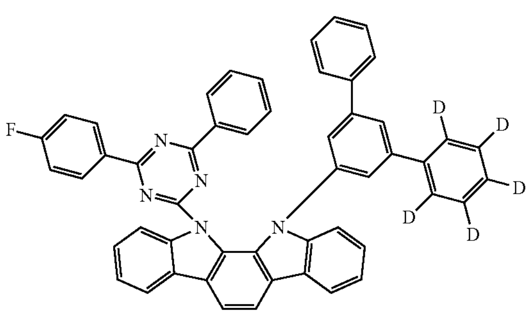
A31
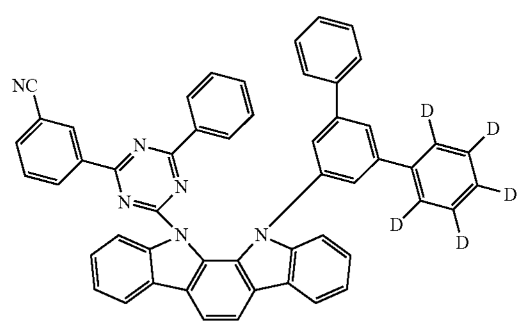
A32
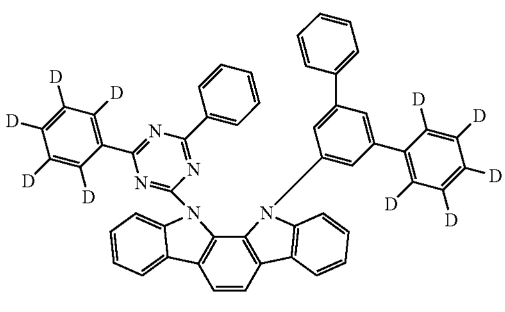
A33
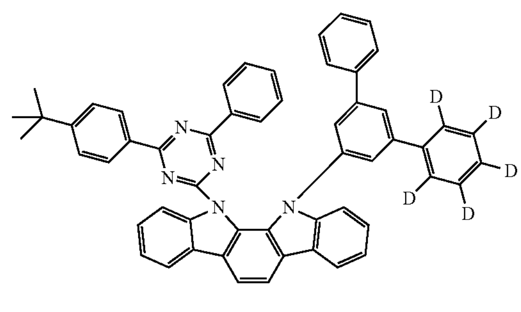

-continued
A34
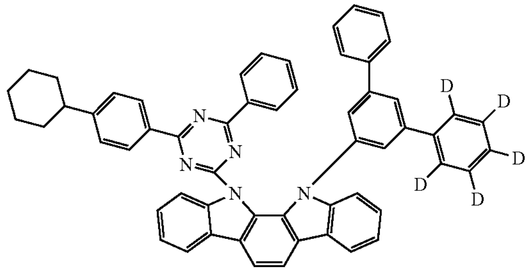
A35
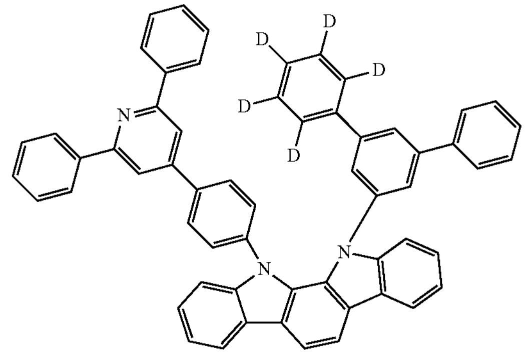
A36
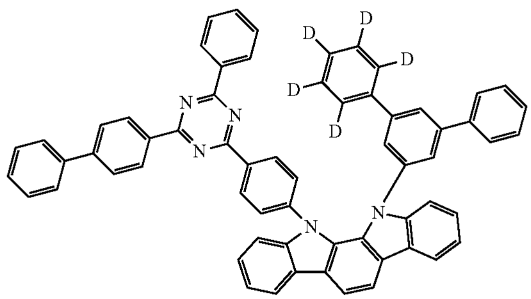
A37
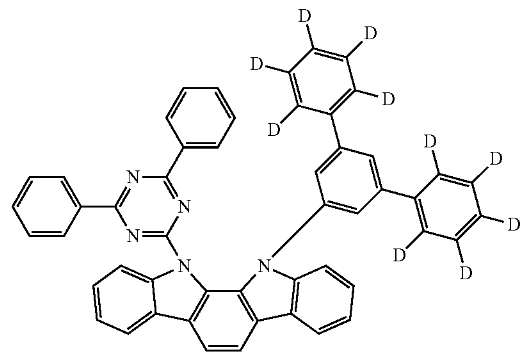
A38
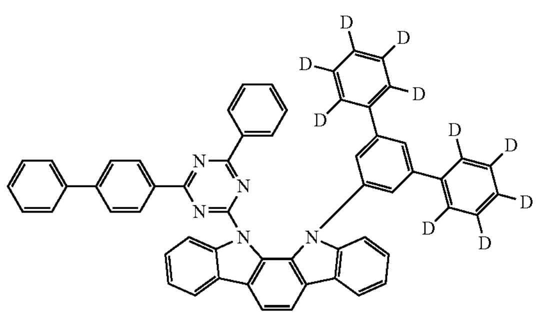
A39
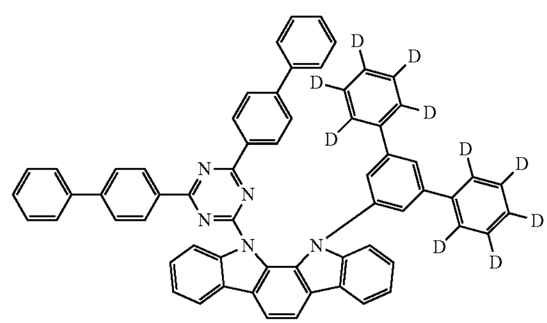
A40
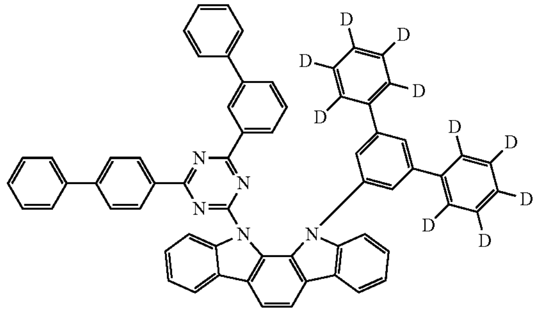
A41
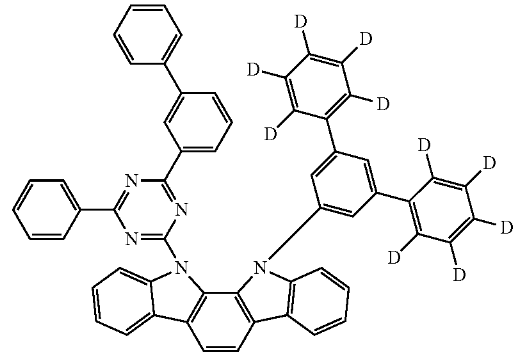

-continued
A42
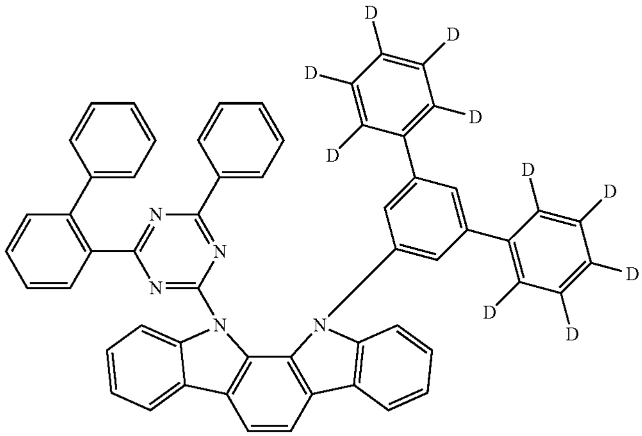
A43
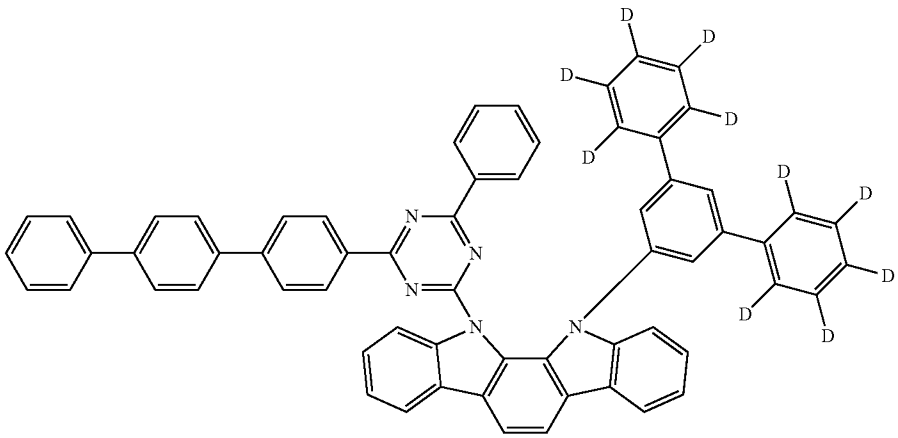
A44
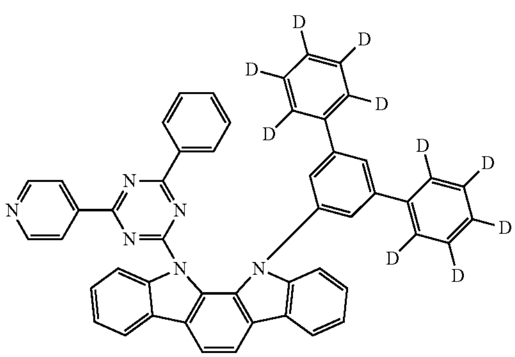
A45
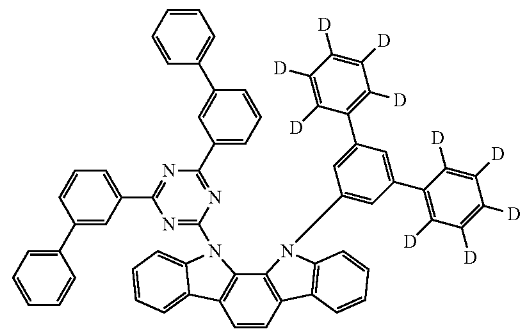
A46
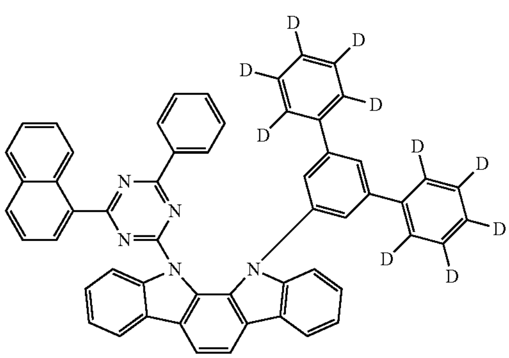
A47
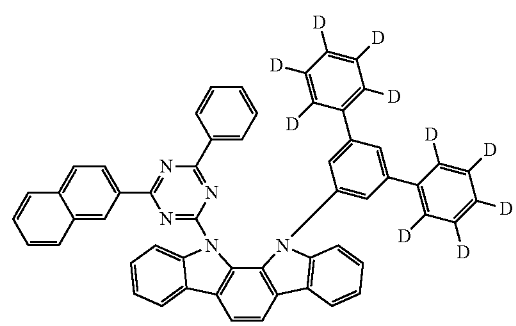

-continued
A48
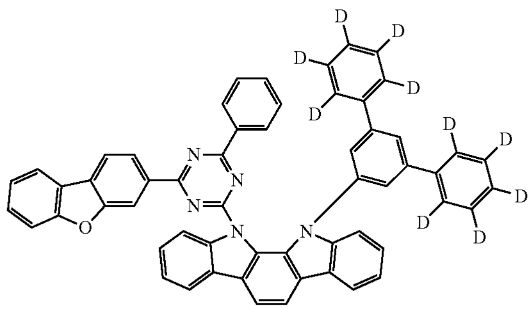
A49
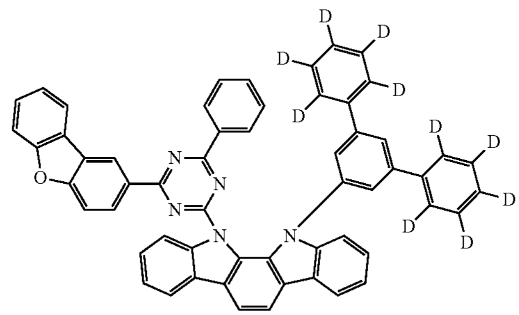
A50
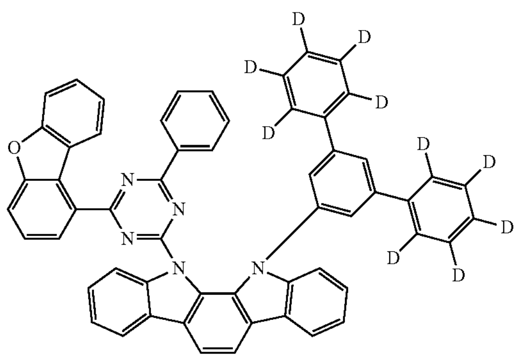
A51
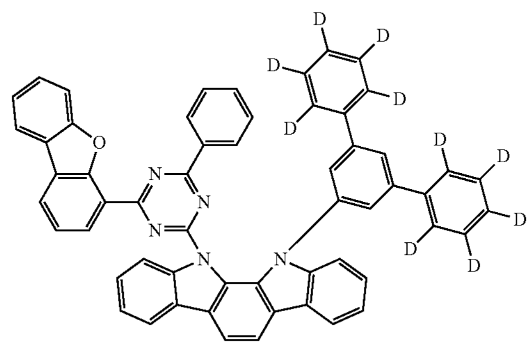
A52
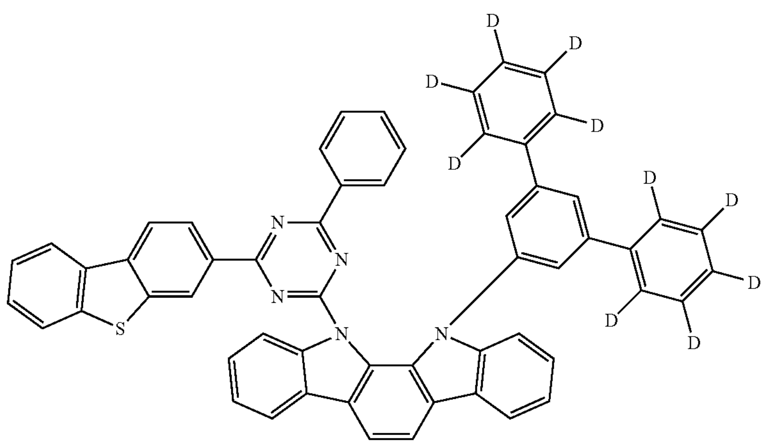
A53
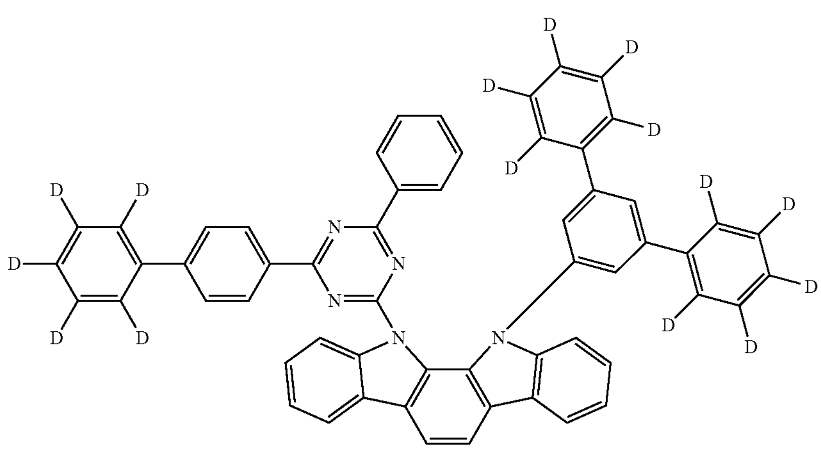

-continued
A54
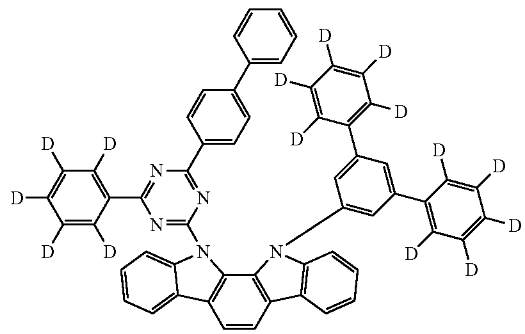
A55
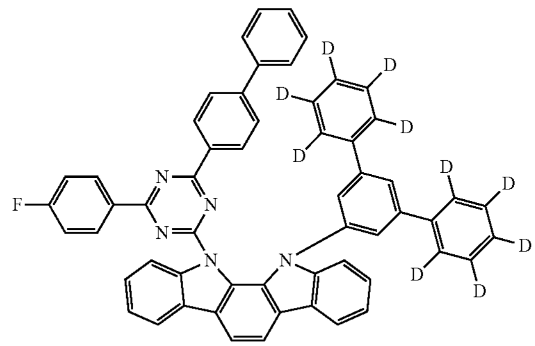
A56
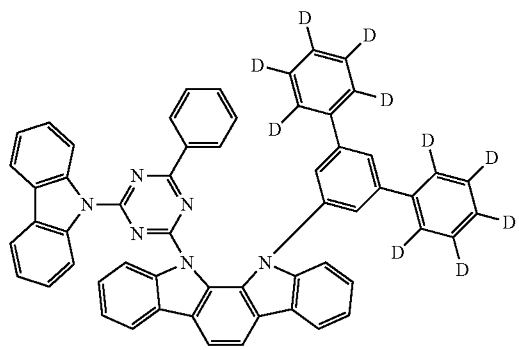
A57
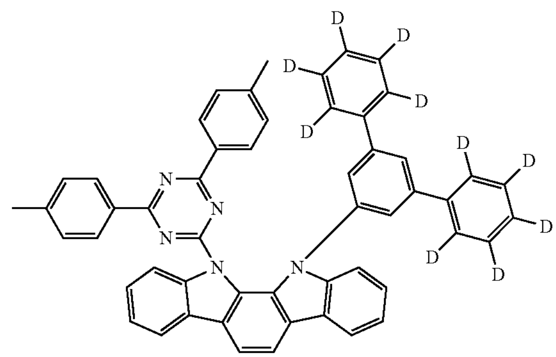
A58
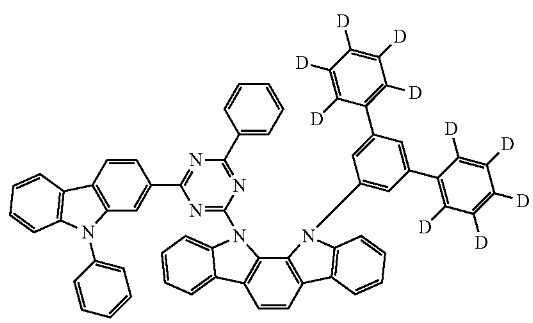
A59
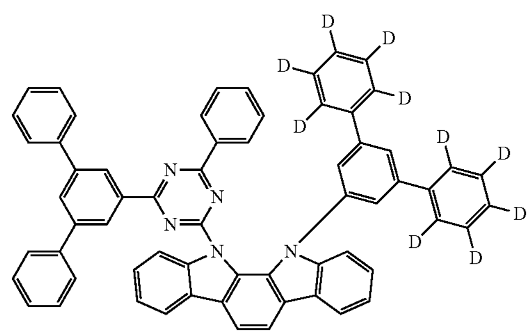
A60
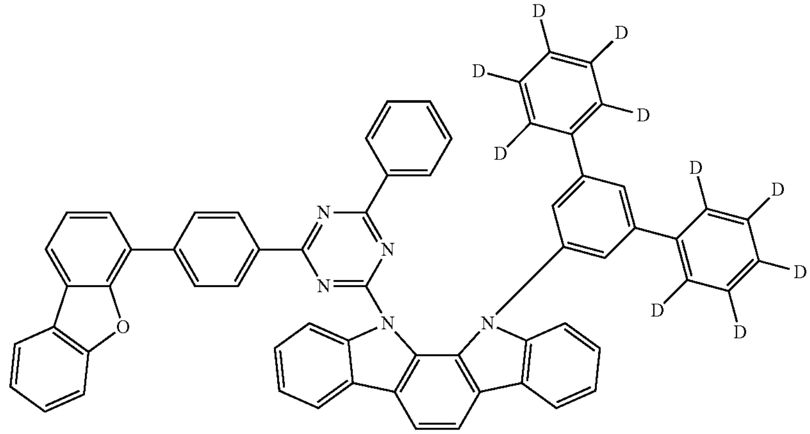

-continued
A61
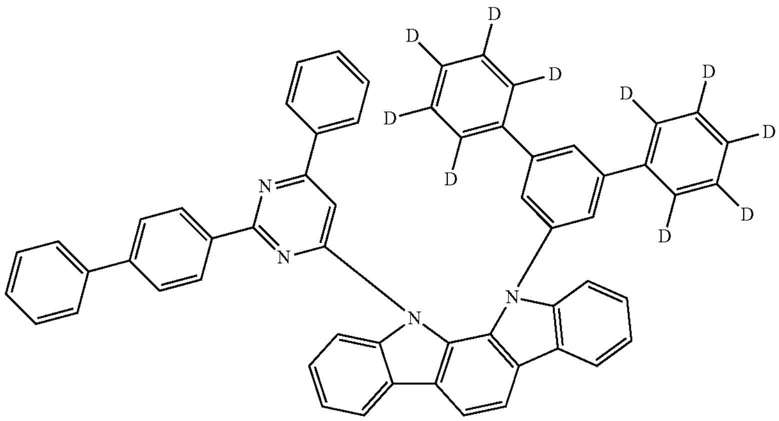
A62
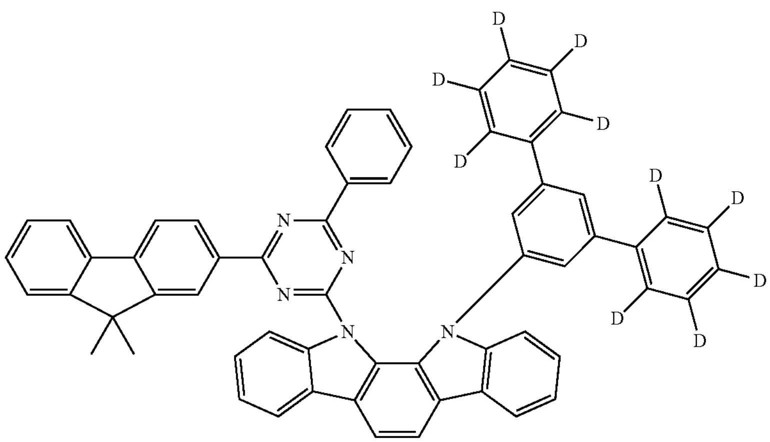
A63
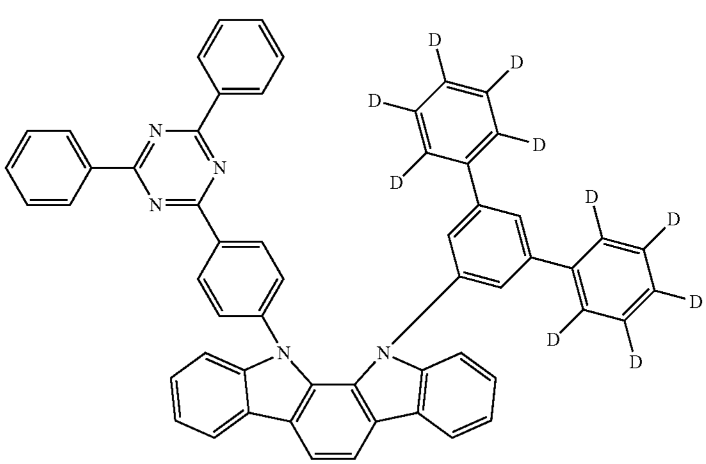

-continued
A64
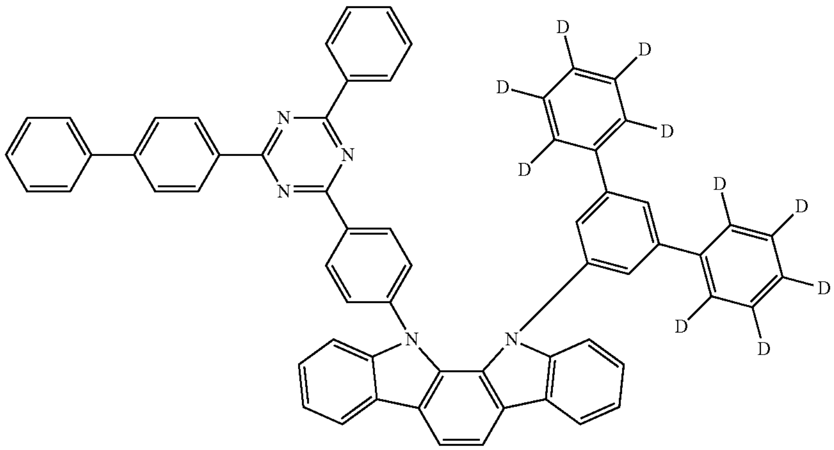
A65
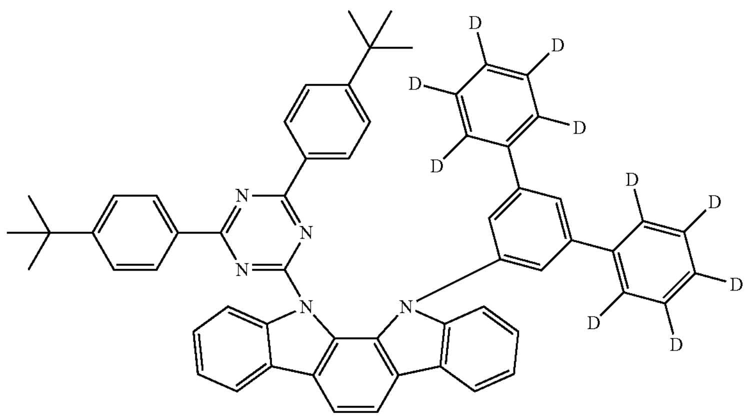
A66
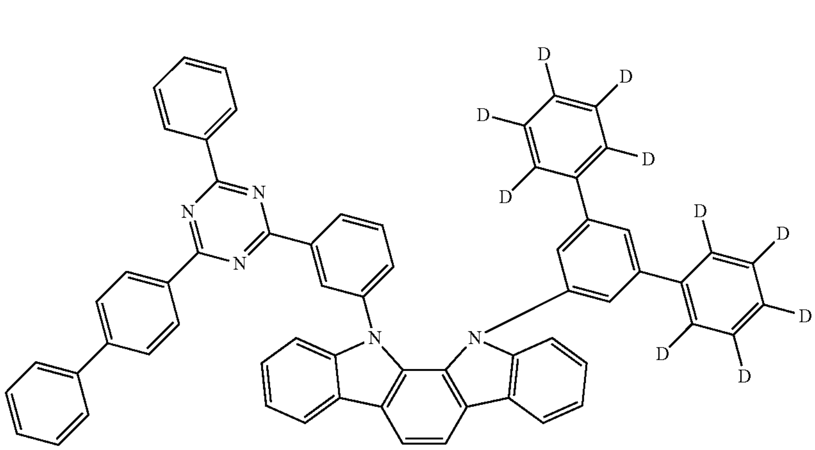

-continued
A67
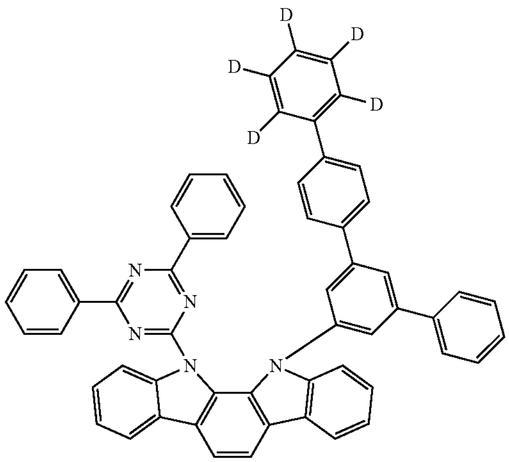
A68
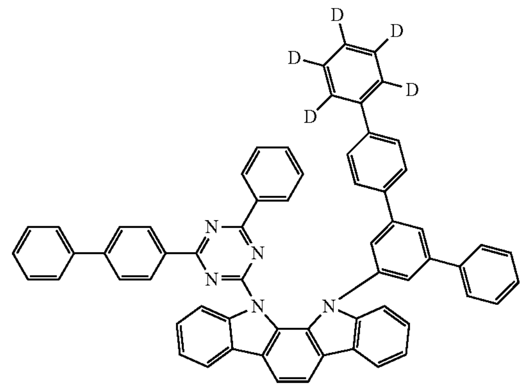
A69
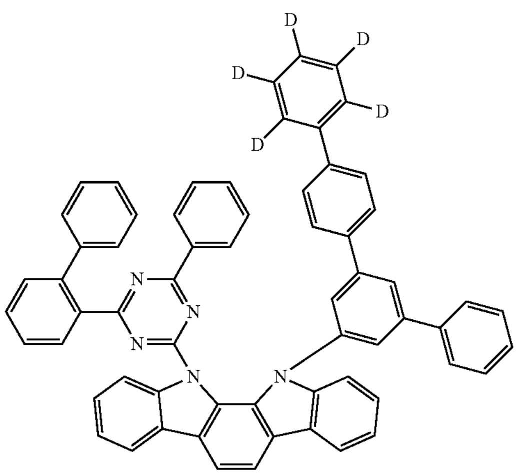
A70
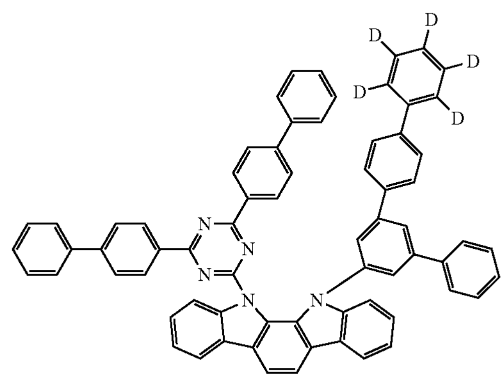
A71
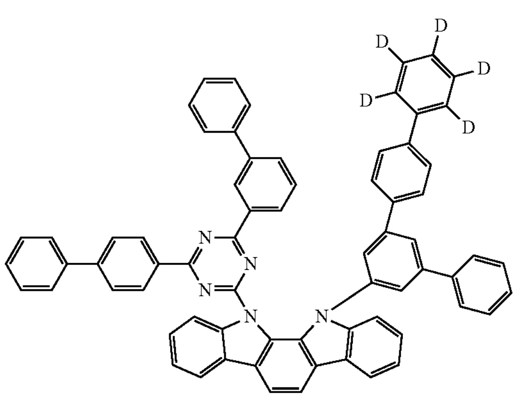
A72
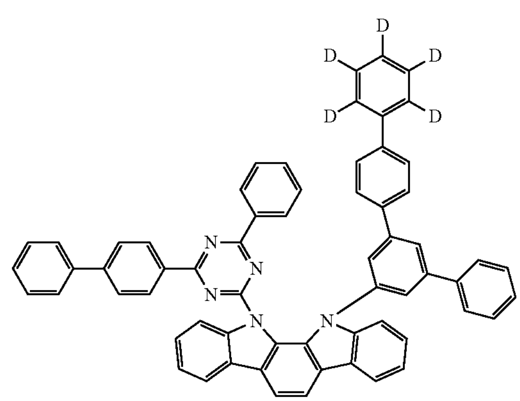

-continued
A73
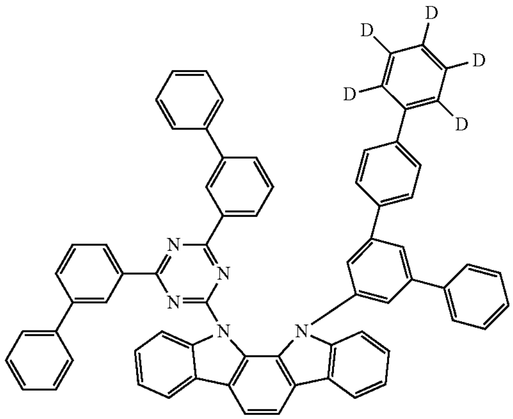
A74
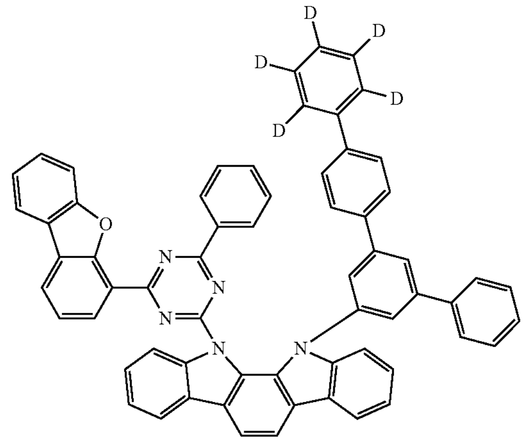
A75
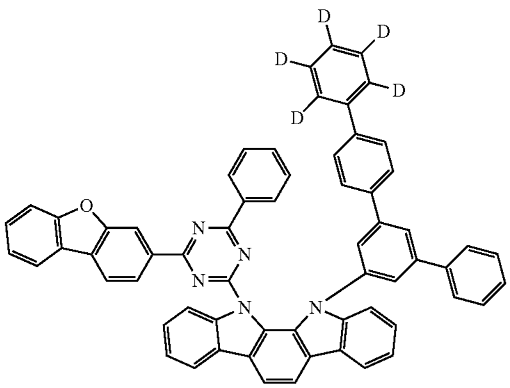
A76
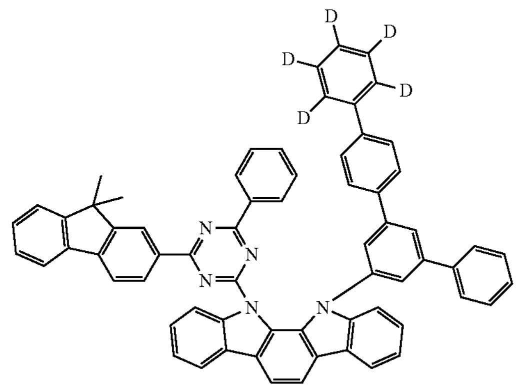
A77
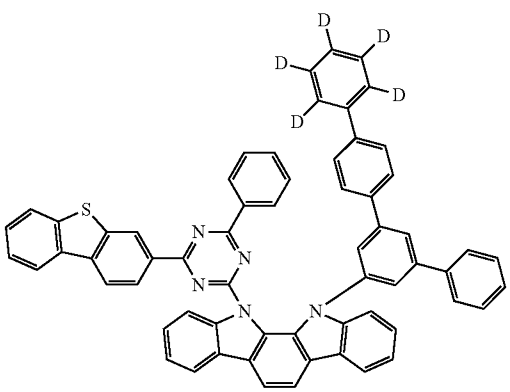
A78
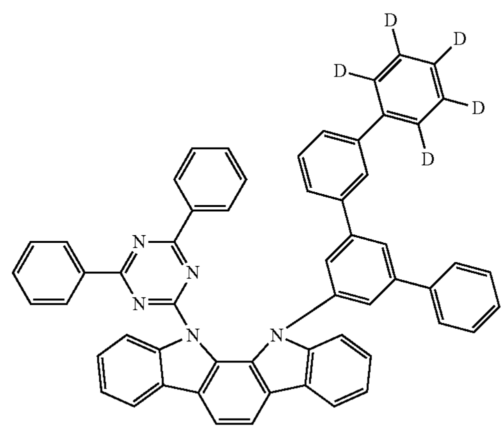
A79
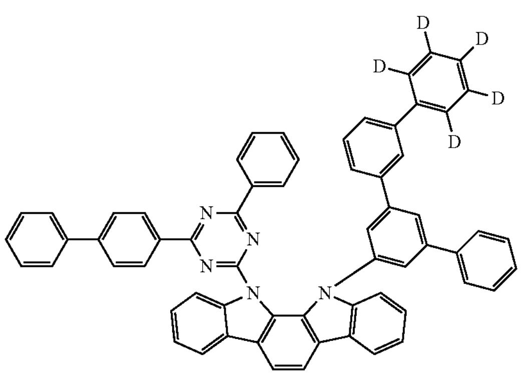
A80
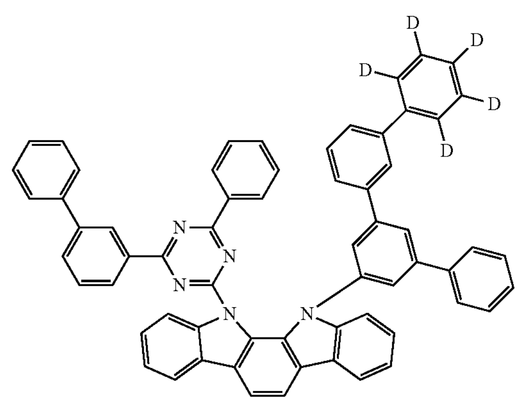

-continued
A81
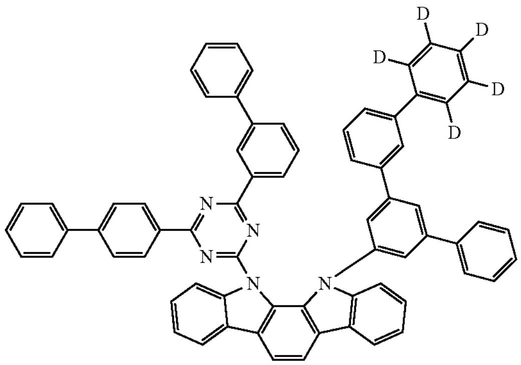
A82
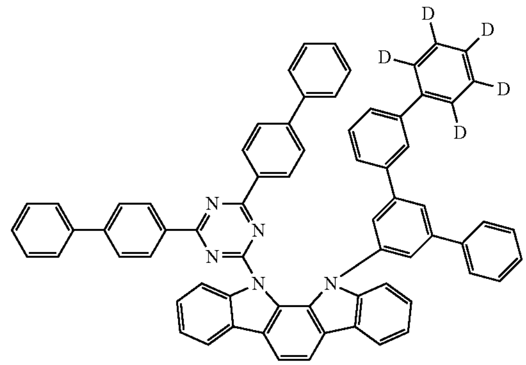
A83
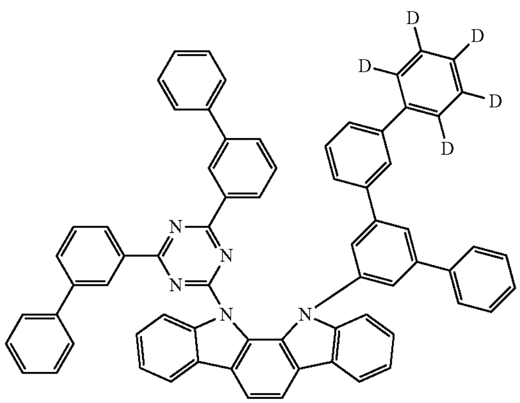
A84
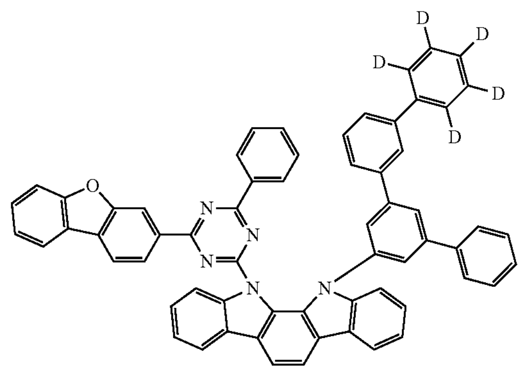
A85
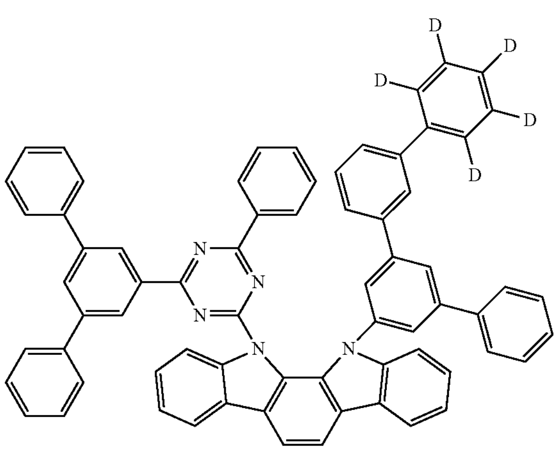
A86
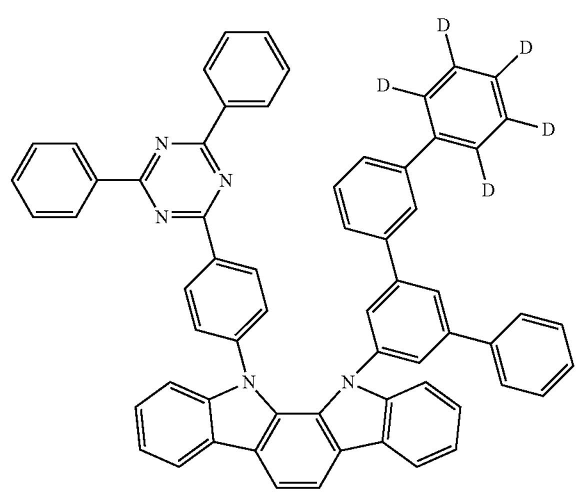

-continued
A87
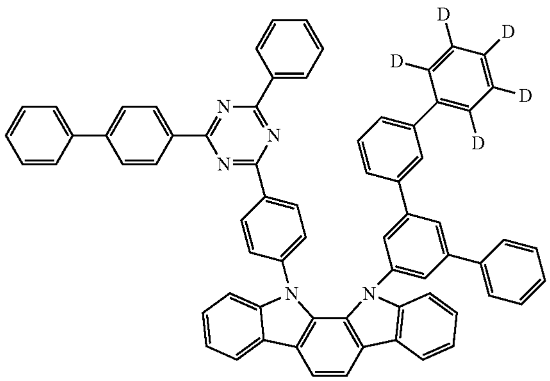
A88
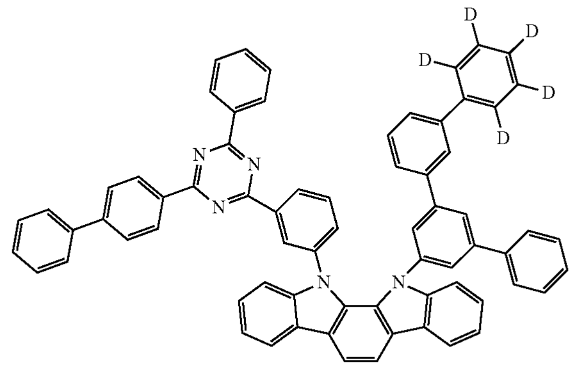
A89
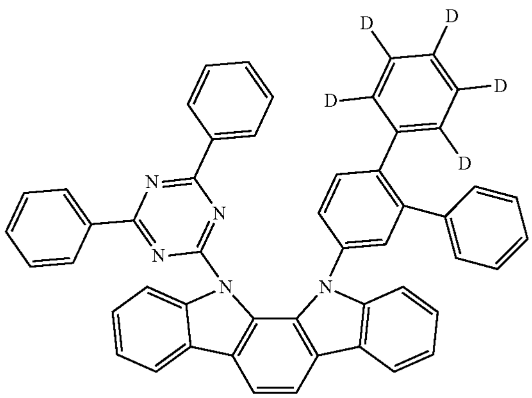
A90
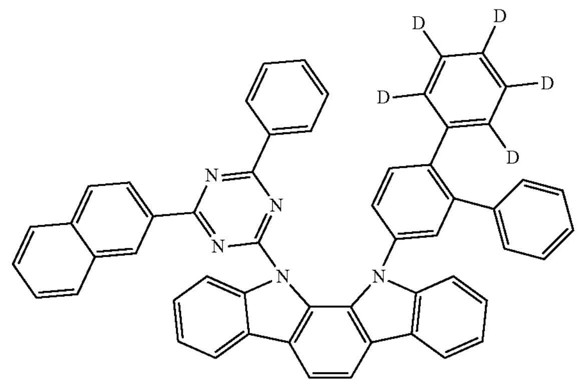
A91
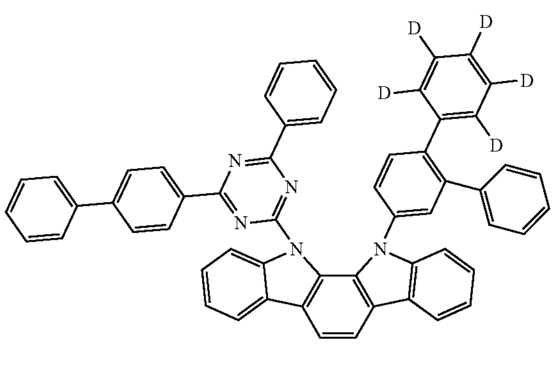
A92
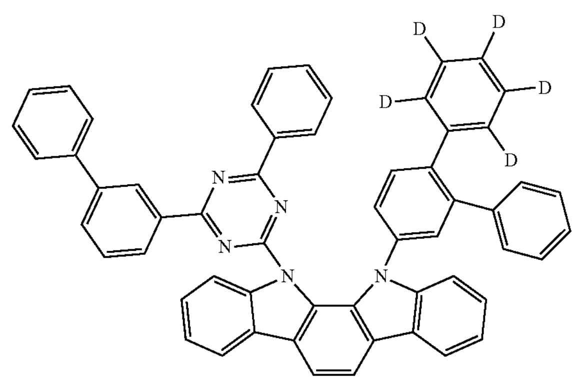
A93
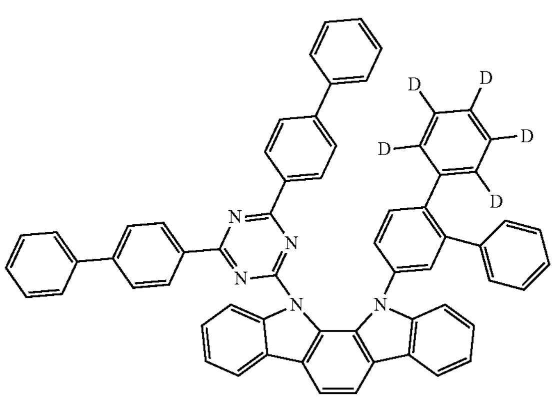
A94
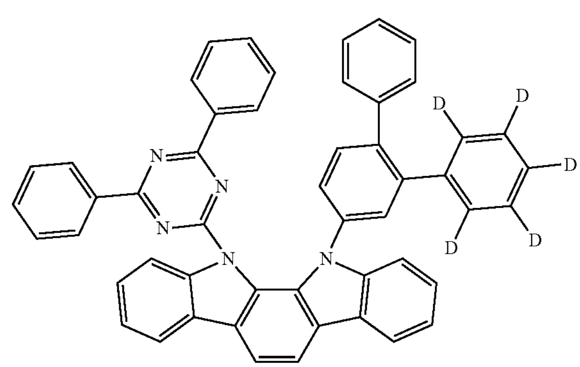

-continued
A95
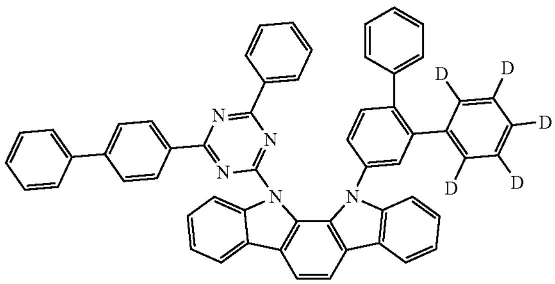
A96
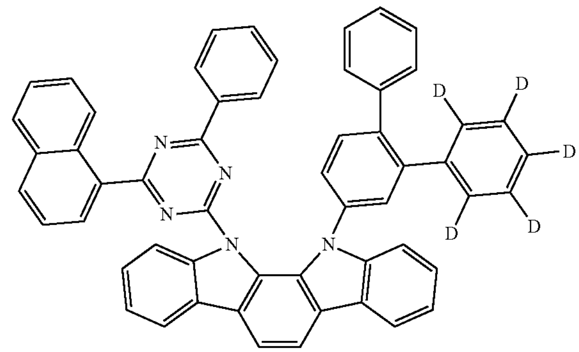
A97
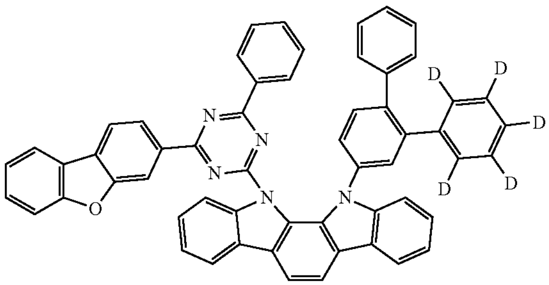
A98
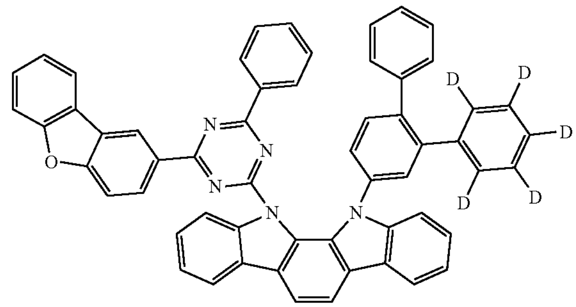
A99
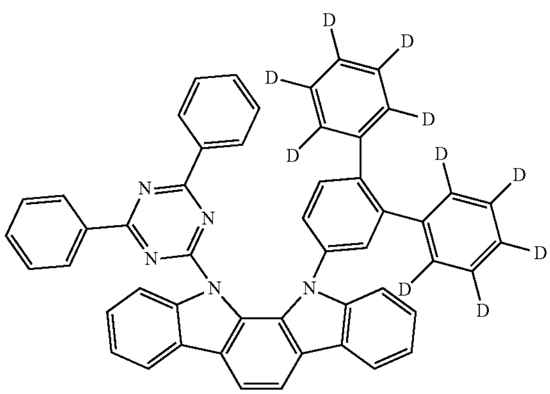
A100
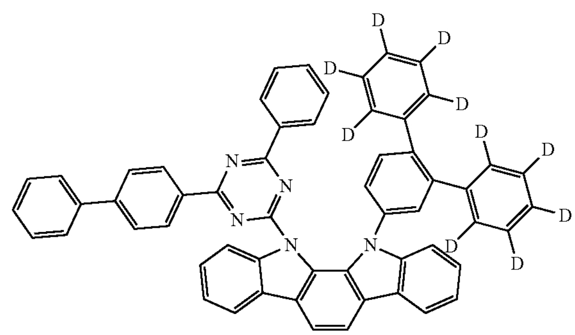
A101
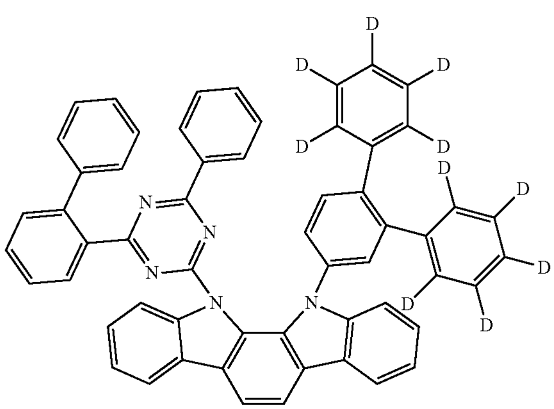
A102
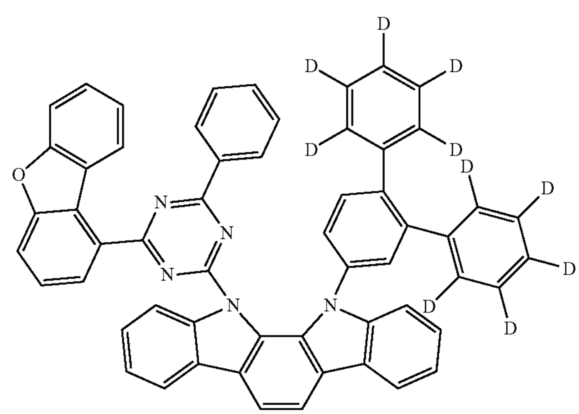

-continued
A103
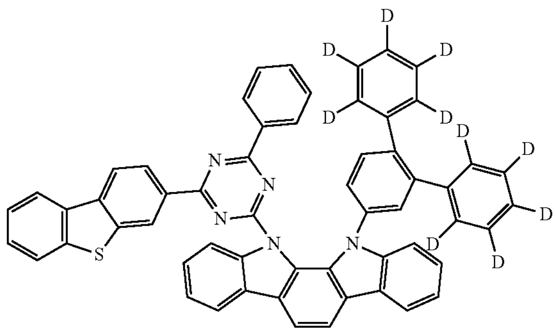
A104
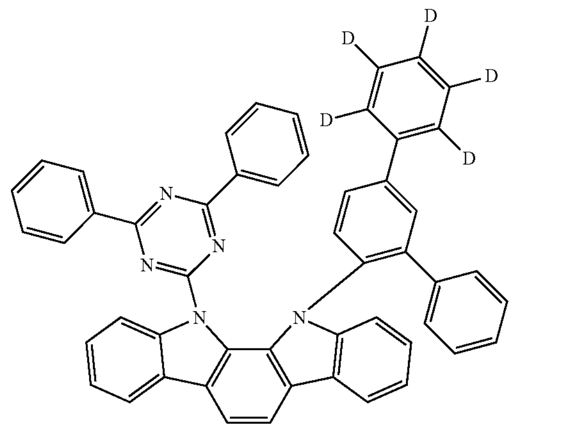
A105
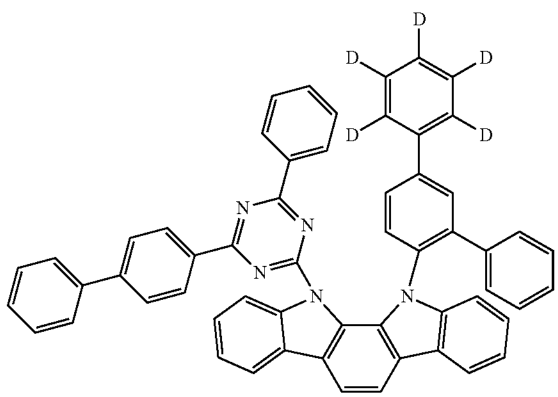
A106
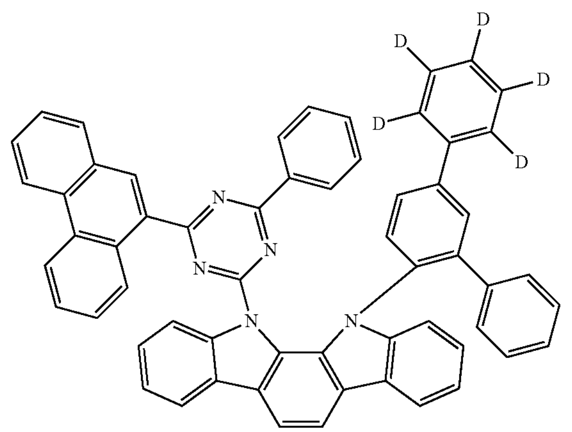
A107
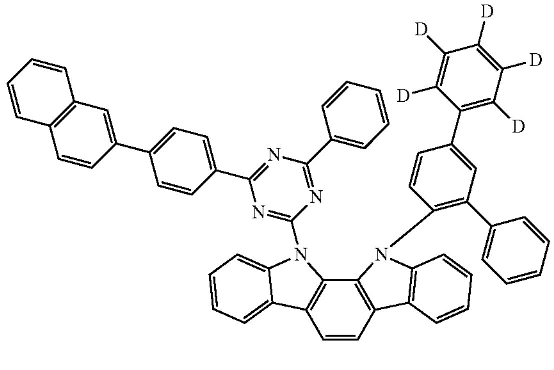
A108
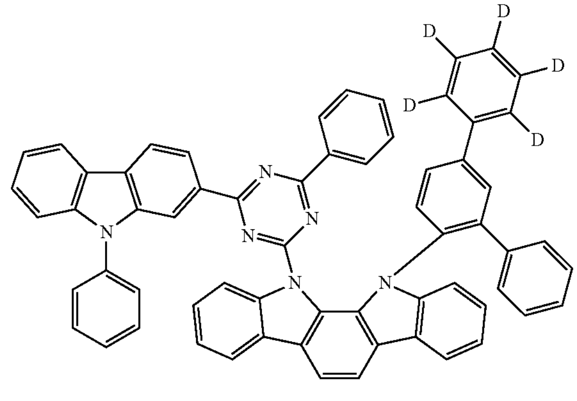

-continued
A109
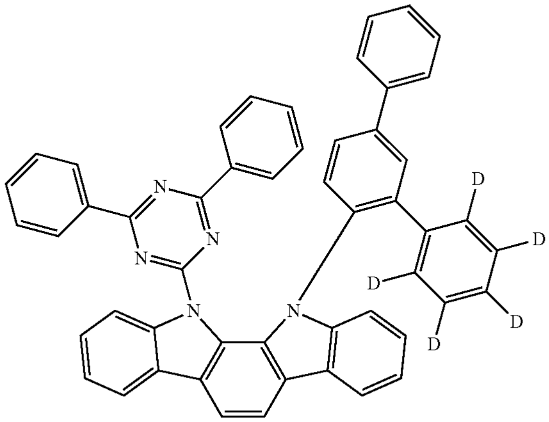
A110
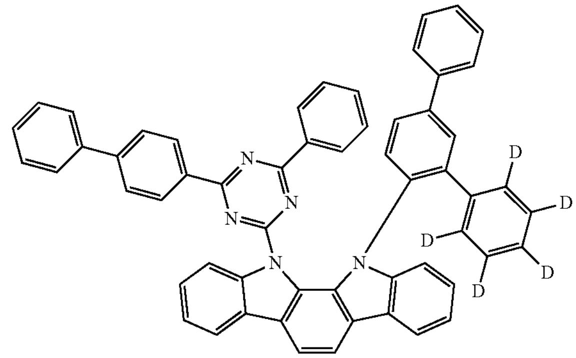
A111
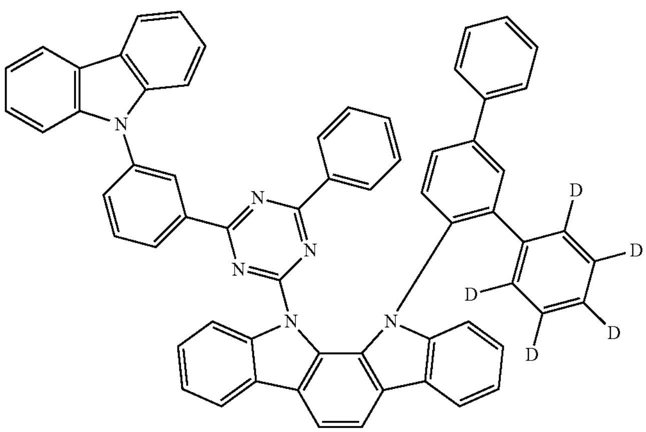
A112
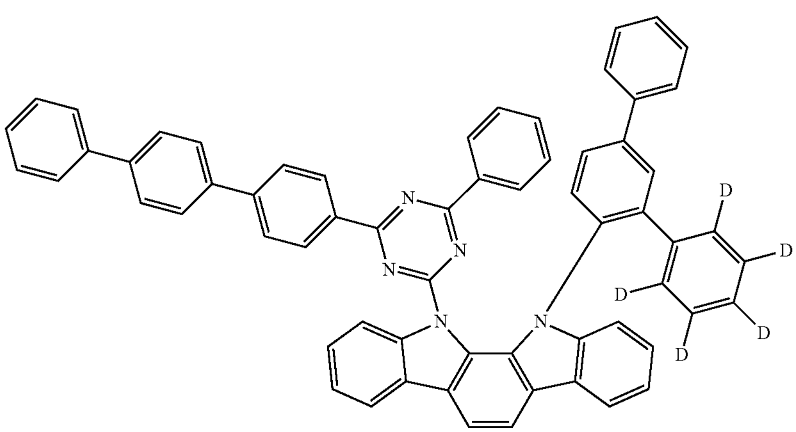

-continued
A113
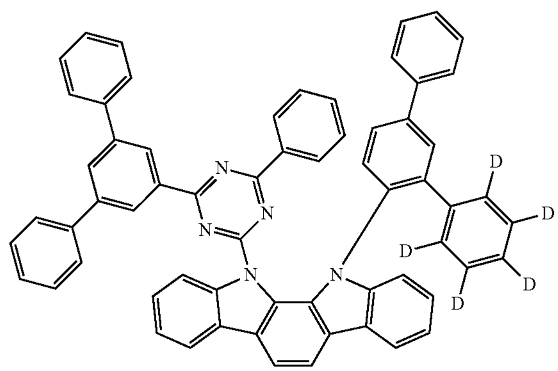
A114
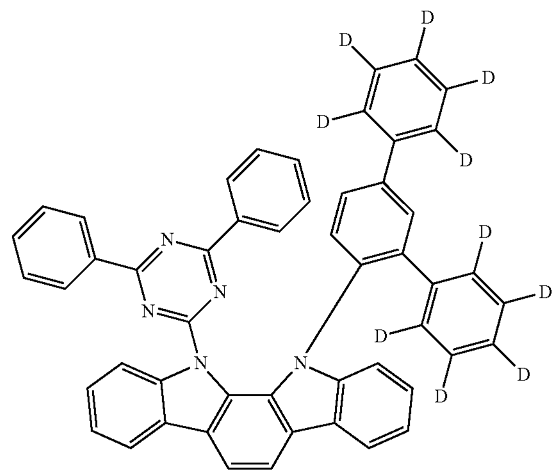
A115
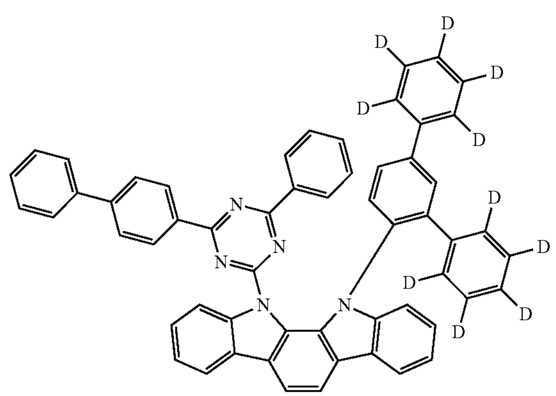
A116
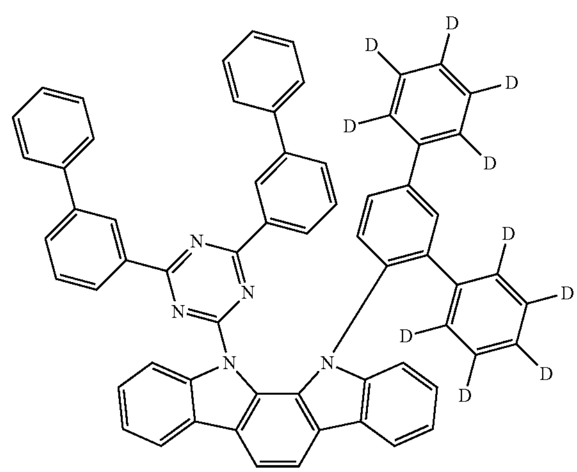
A117
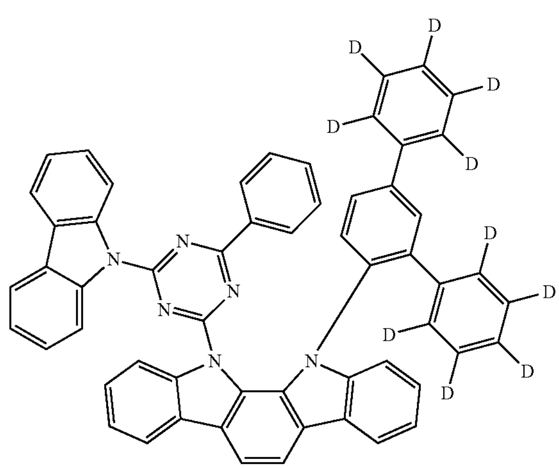
A118
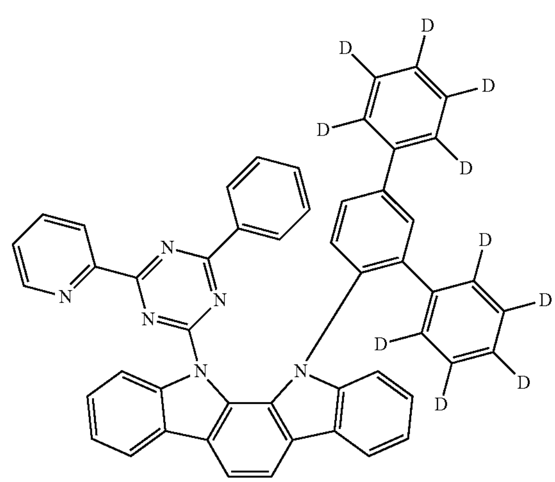

-continued
A119
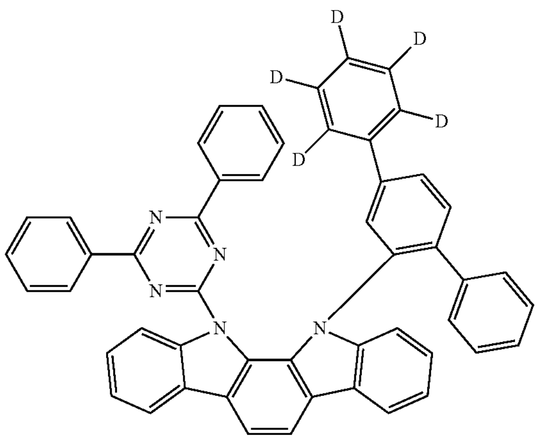
A120
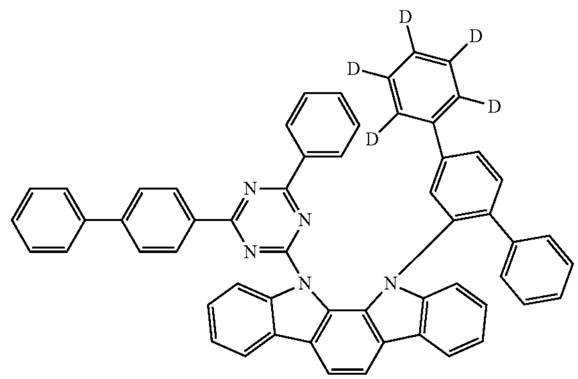
A121
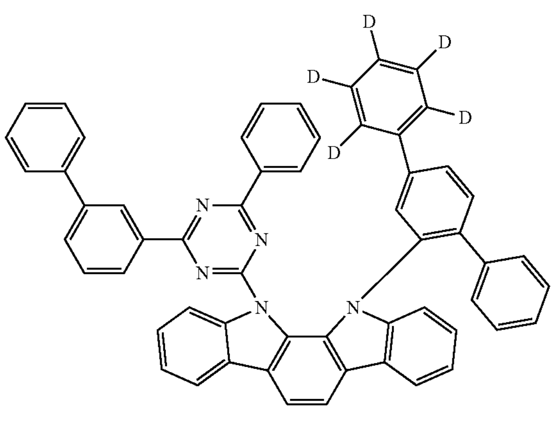
A122
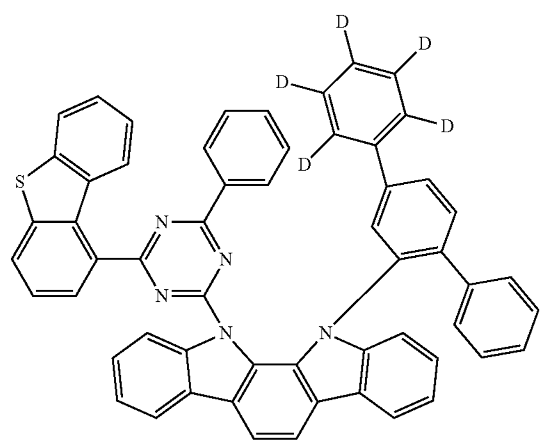
A123
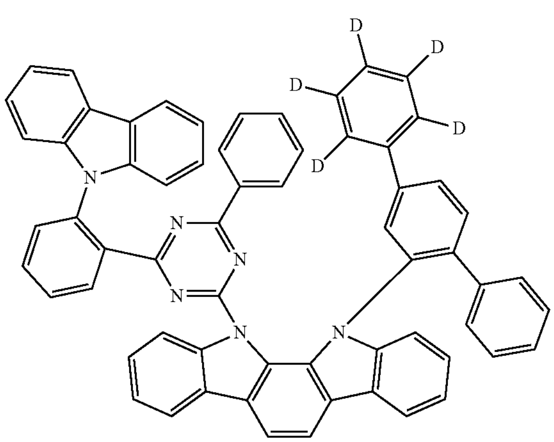
A124
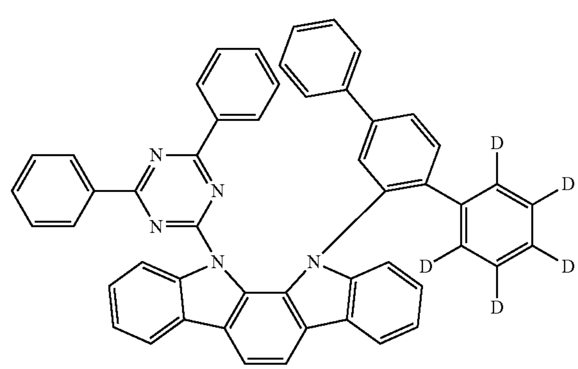

-continued
A125
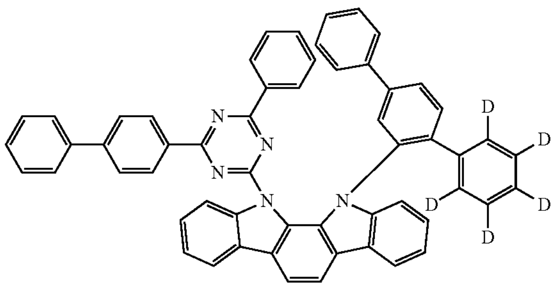
A126
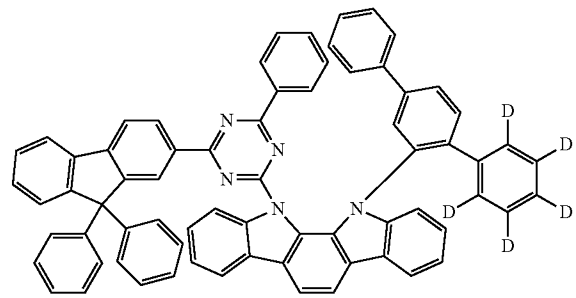
A127
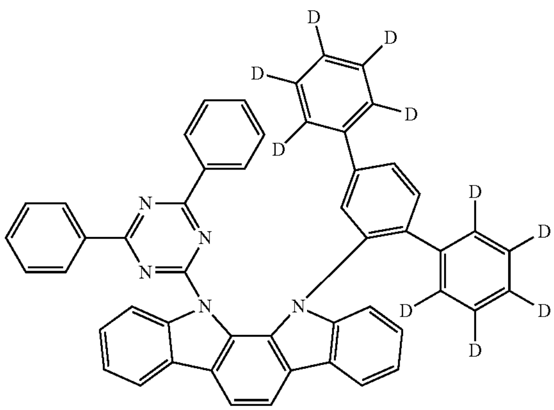
A128
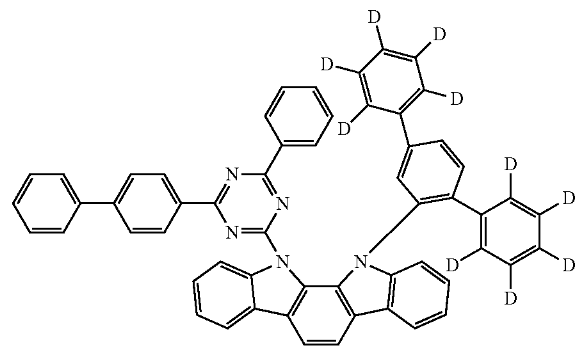
A129
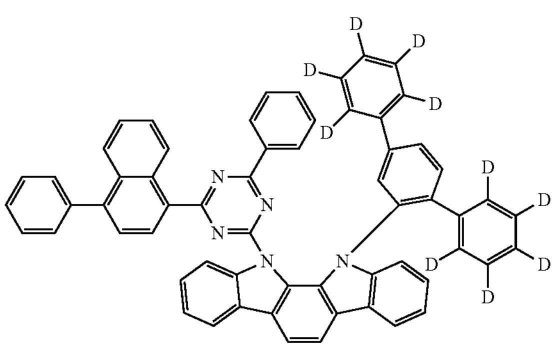
A130
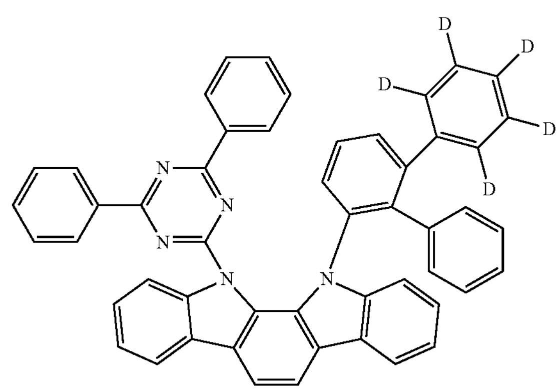
A131
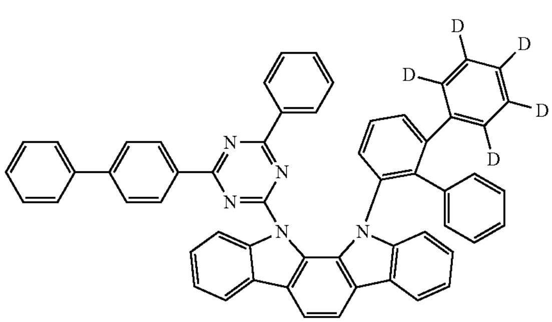
A132
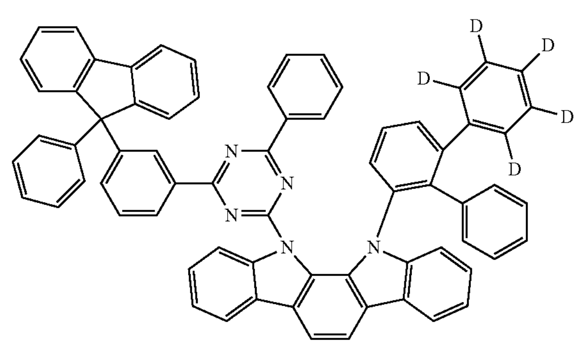

-continued
A133
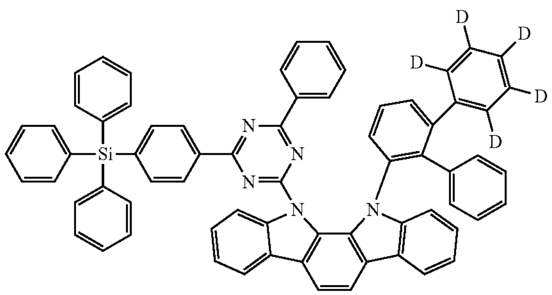
A134
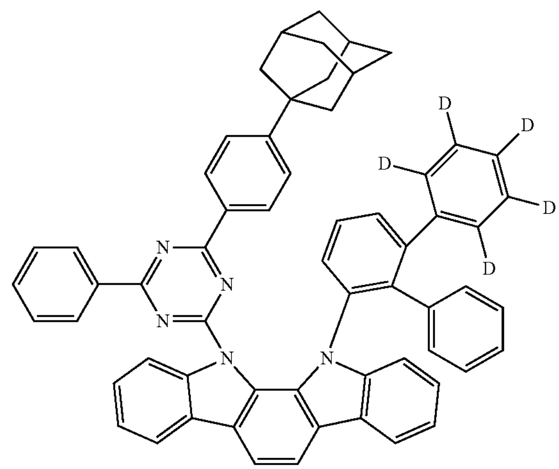
A135
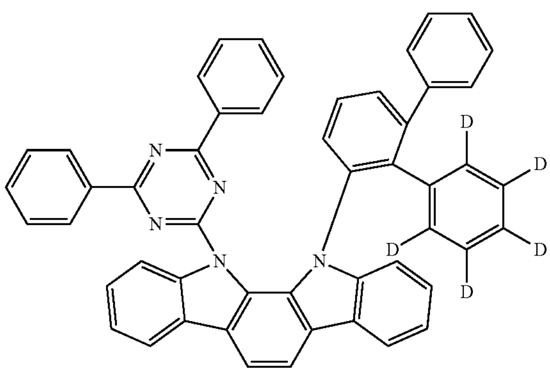
A136
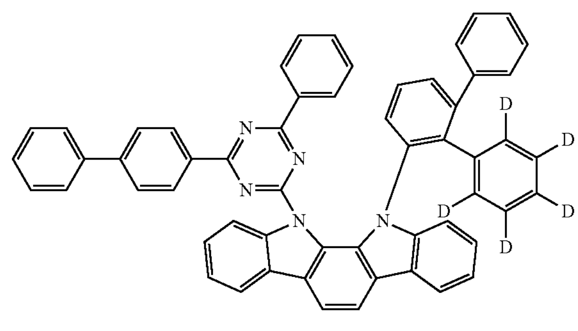
A137
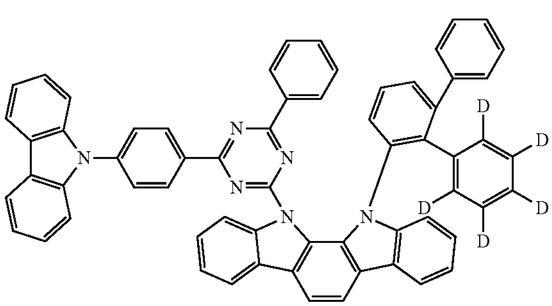
A138
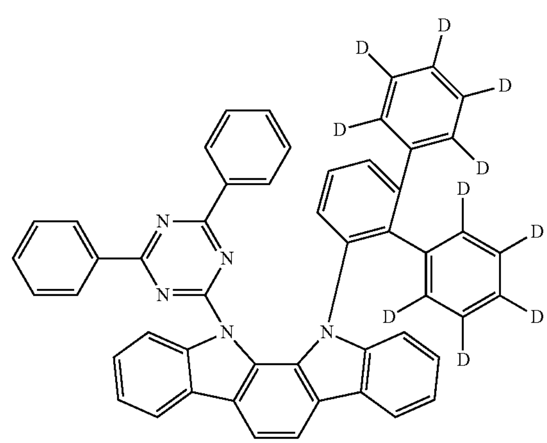

-continued
A139
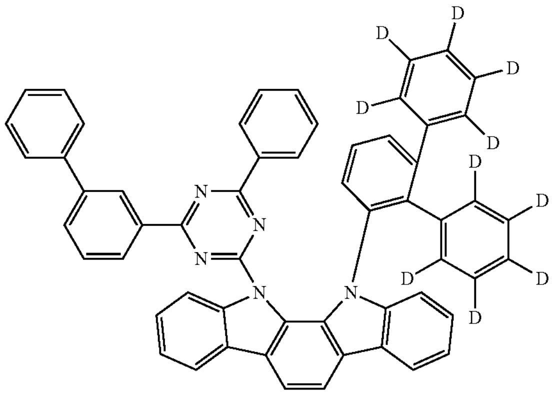
A141
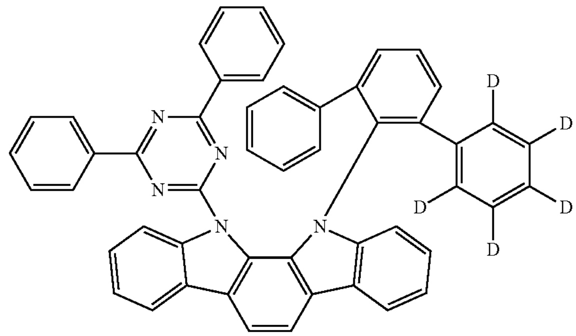
A142
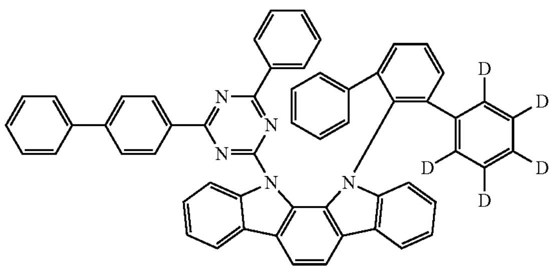
A143
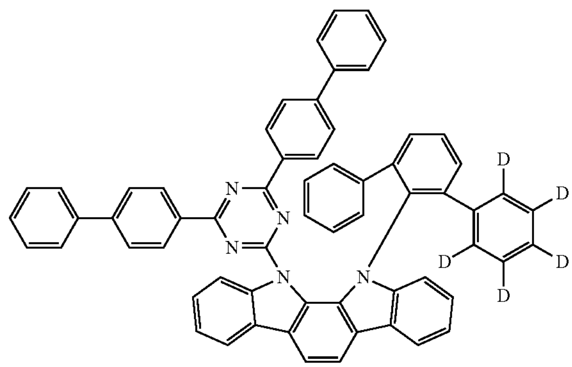
A144
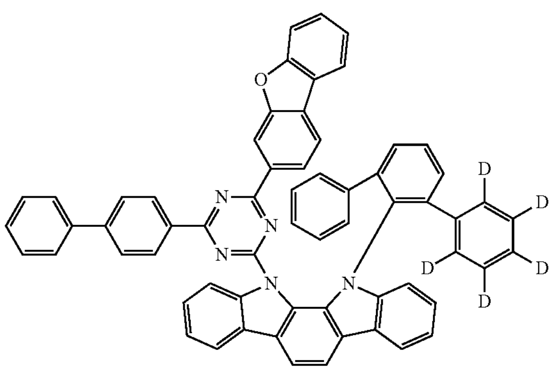
A145
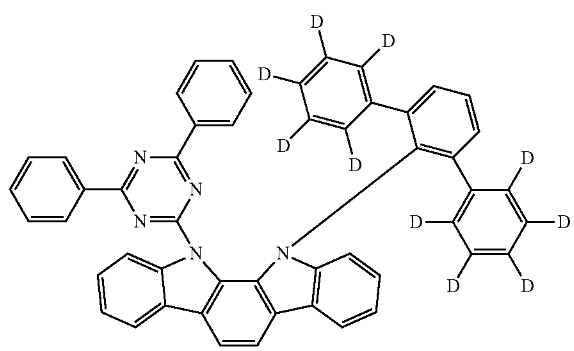
A146
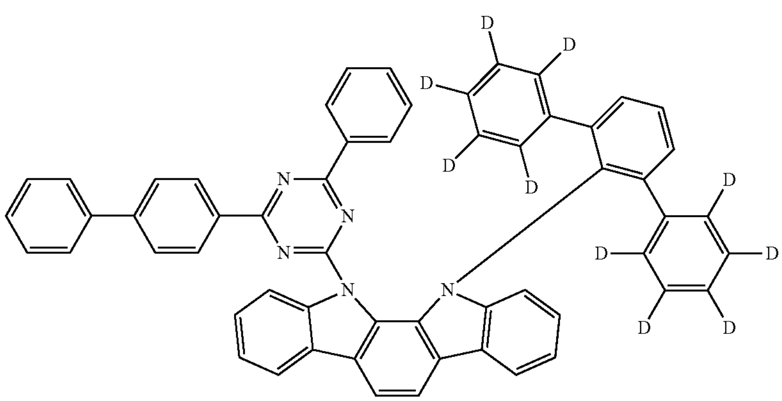

-continued
A147
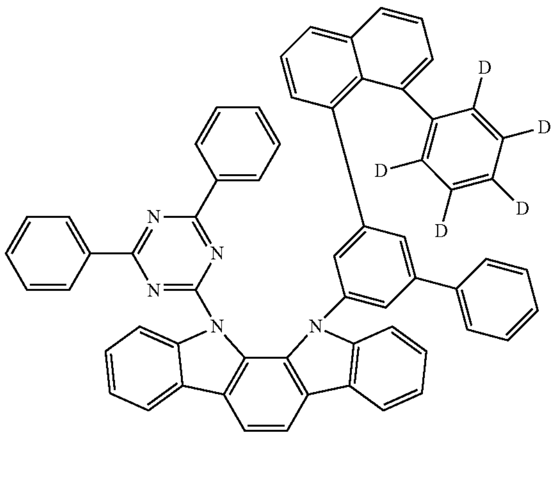
A148
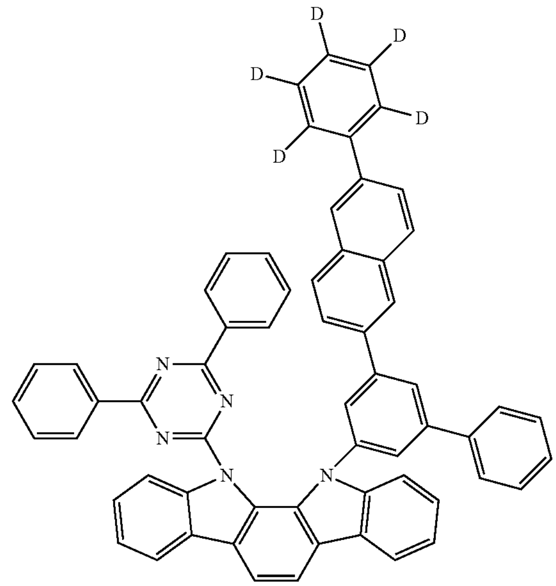
A149
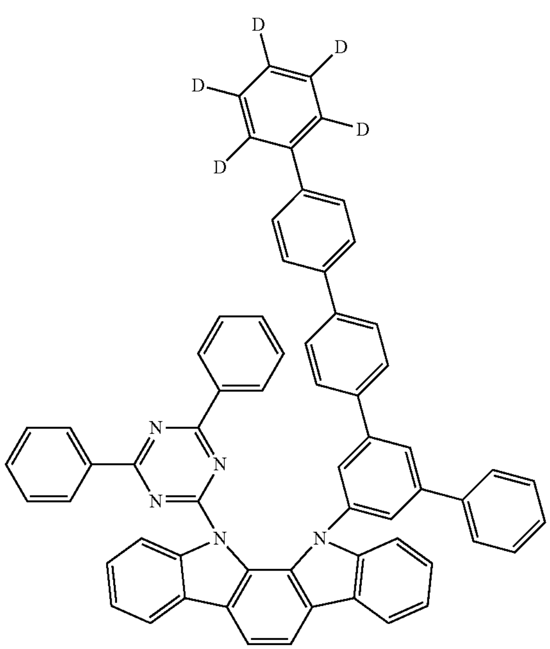
A150
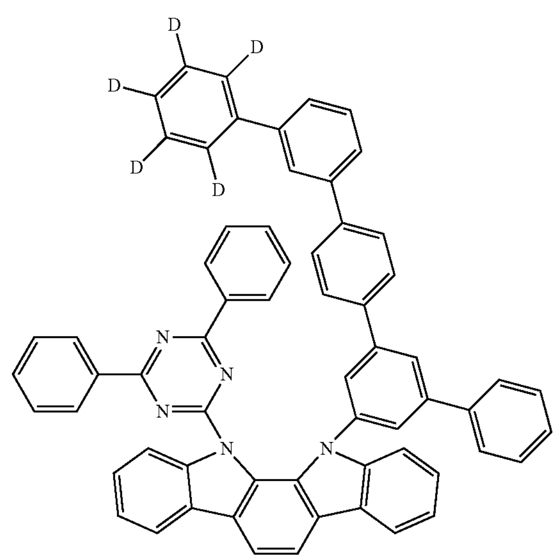

-continued
A151
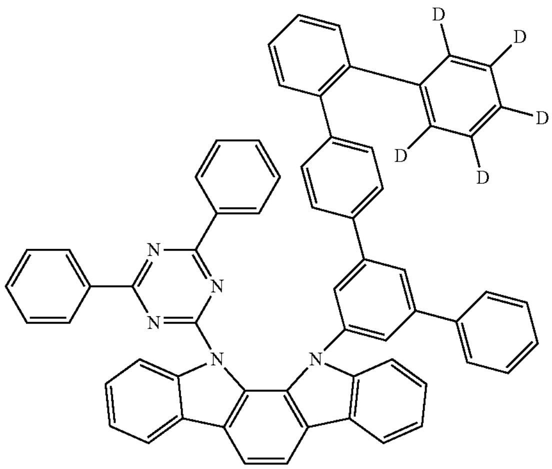
B1
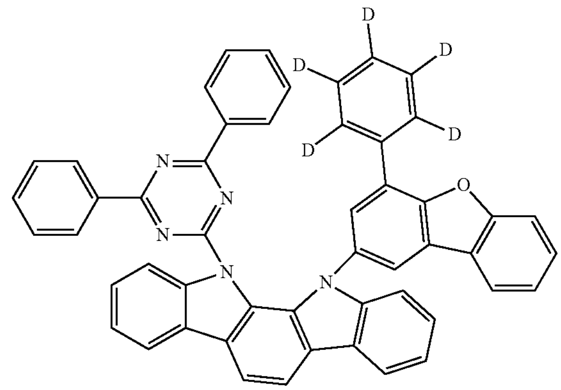
B2
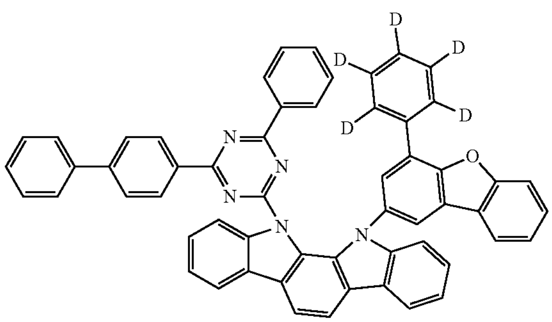
B3
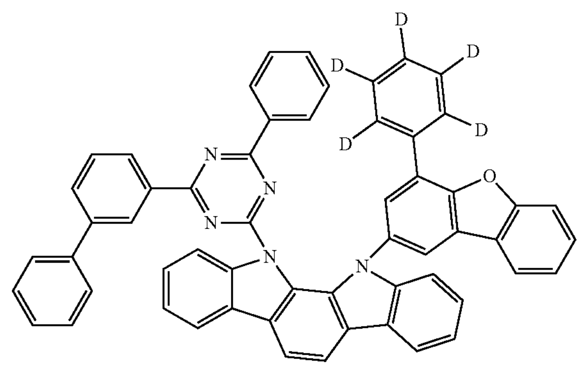
B4
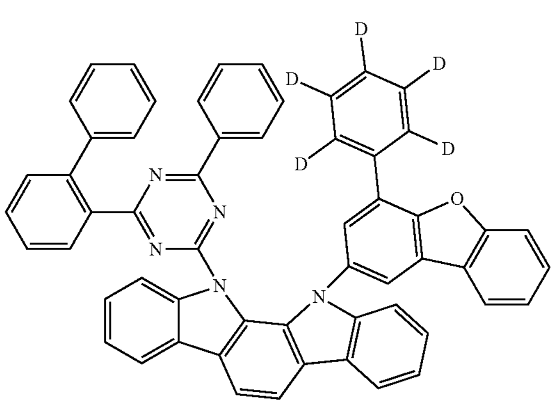
B5
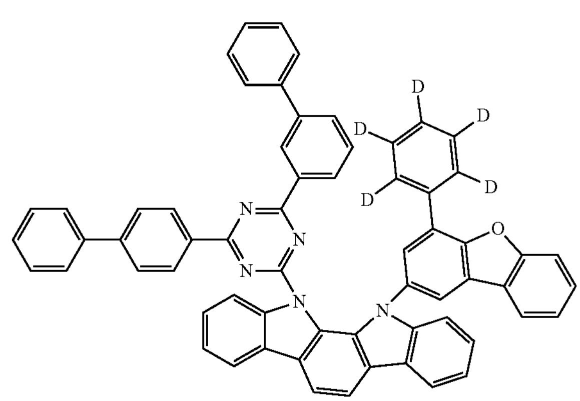

-continued
B6
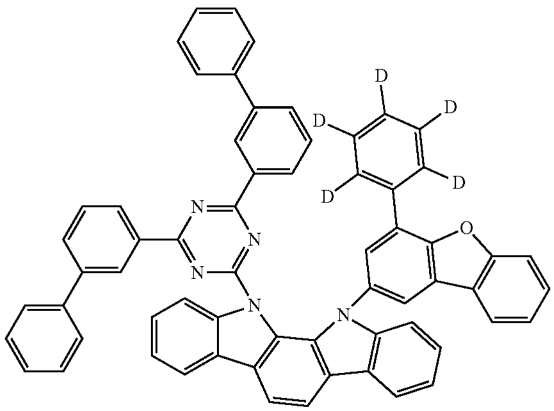
B7
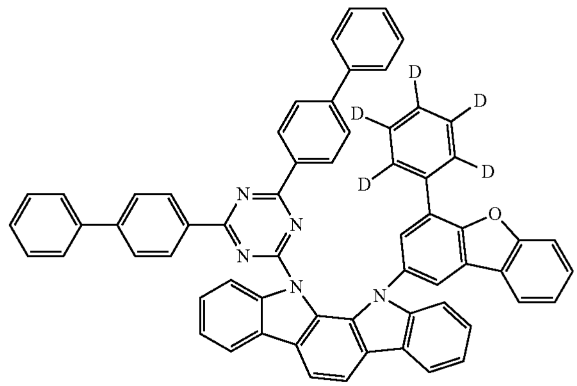
B8
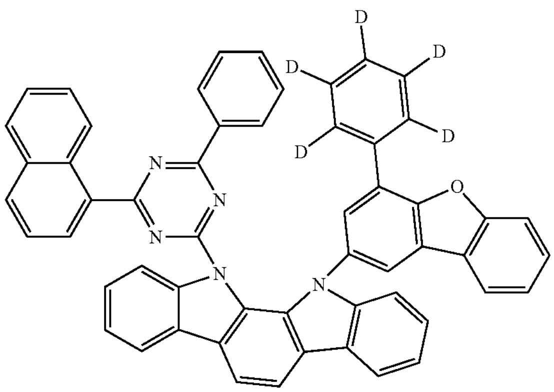
B9
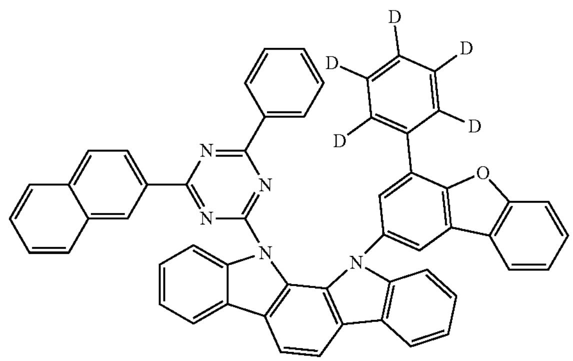
B10
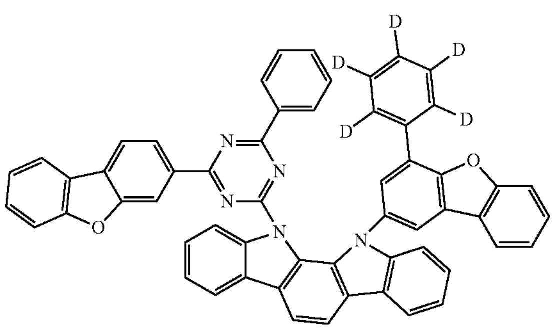
B11
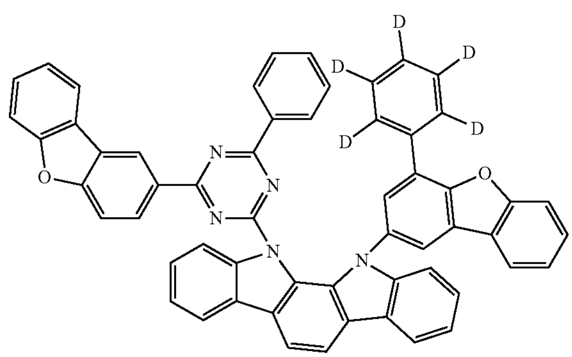
B12
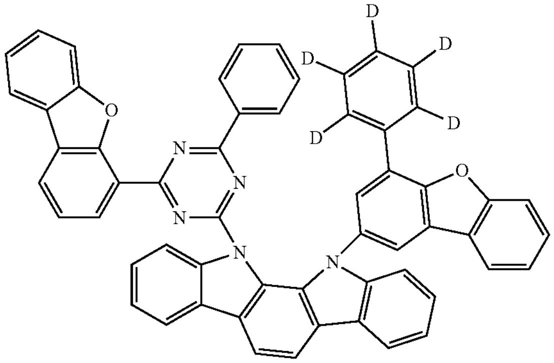

B13
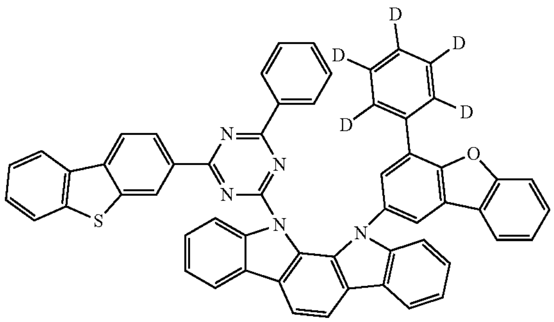
B14
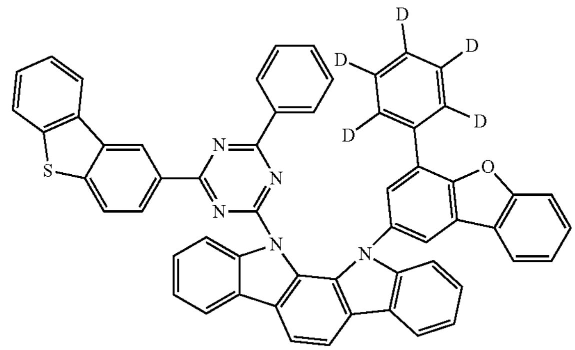
B15
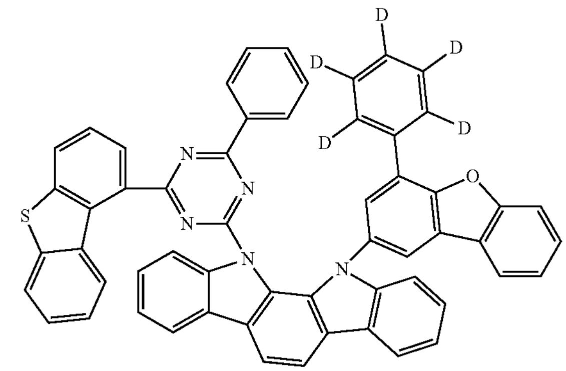
B16
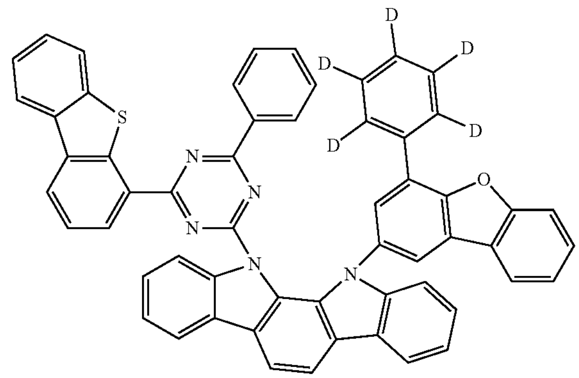
B17
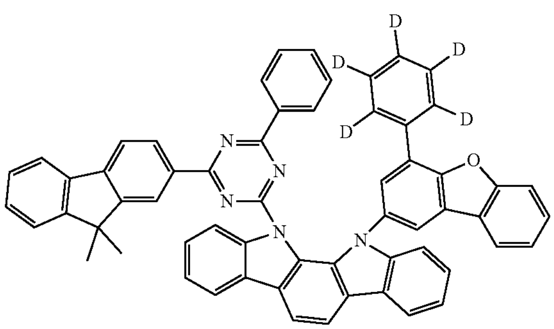
B18
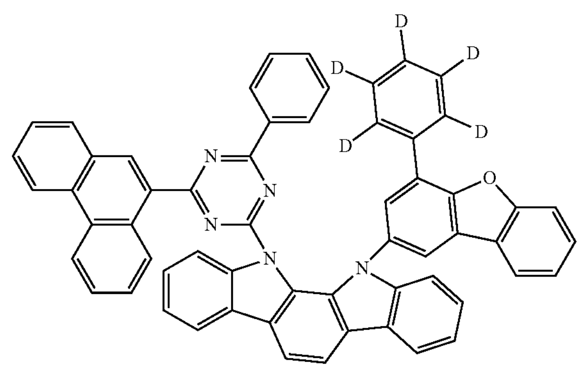
B19
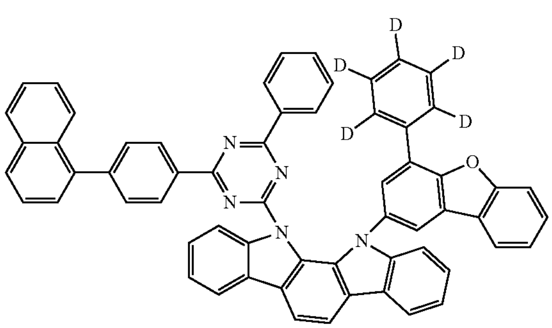
B20
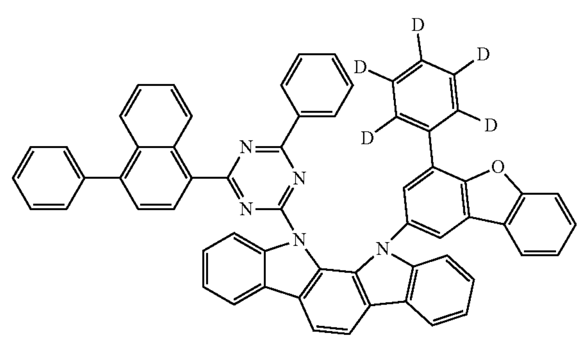

-continued
B21
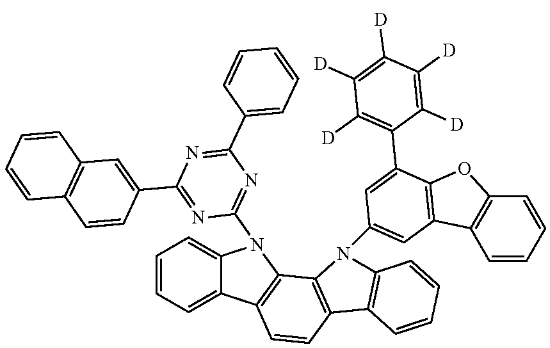
B22
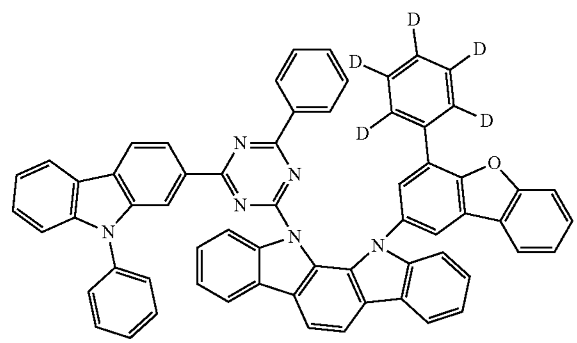
B23
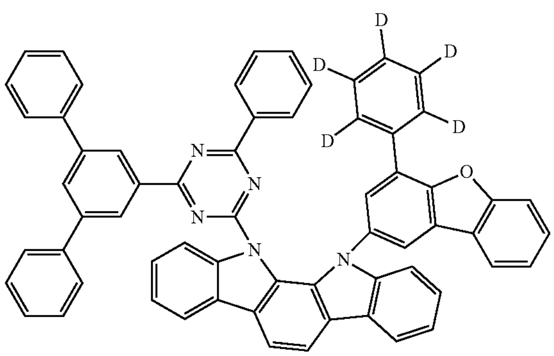
B24
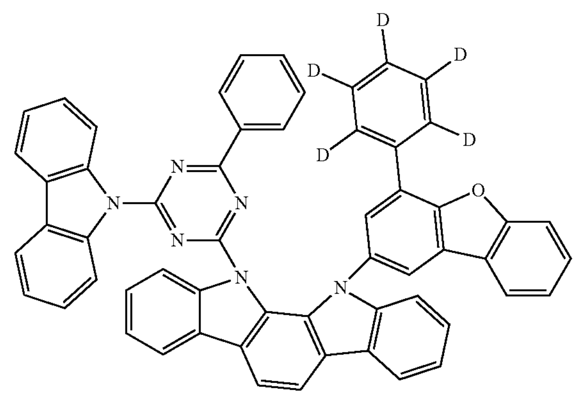
B25
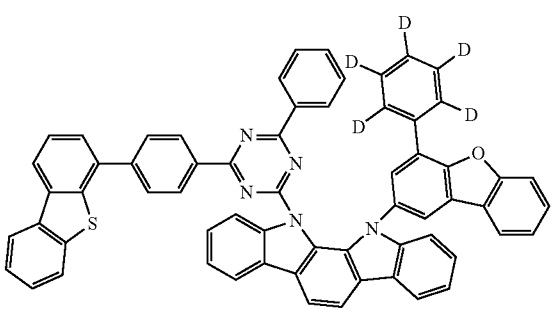
B26
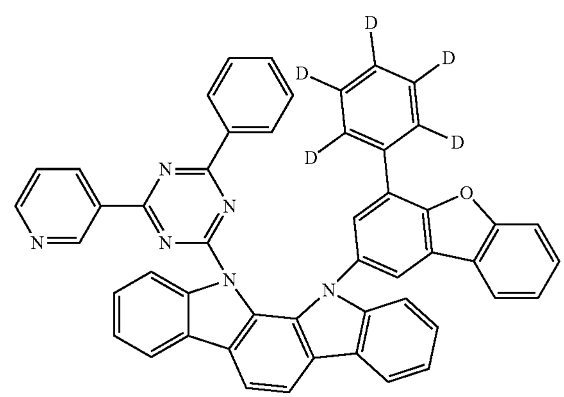
B27
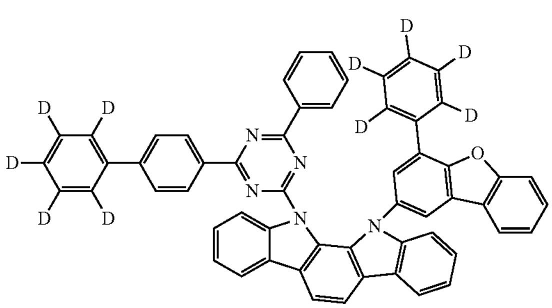
B28
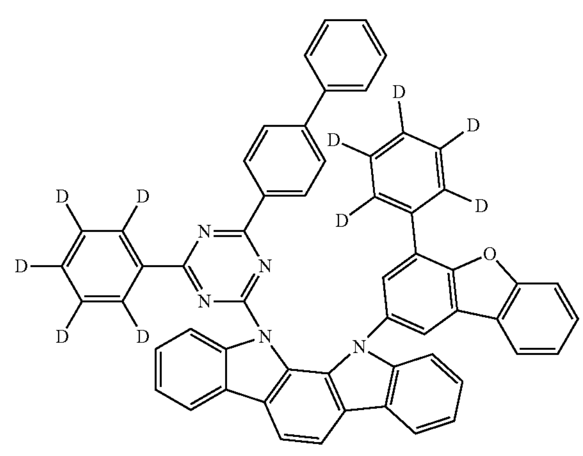

-continued
B29
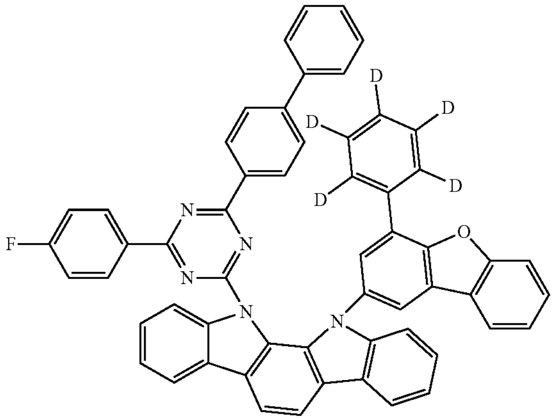
B30
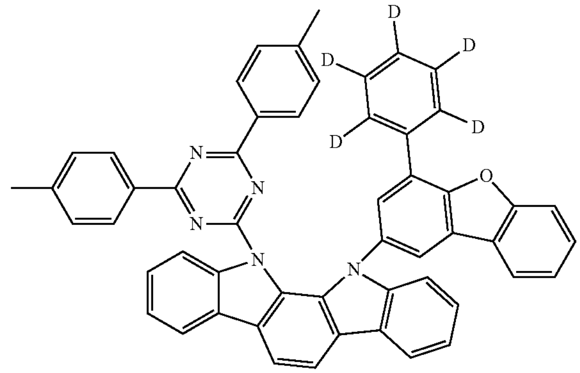
B31
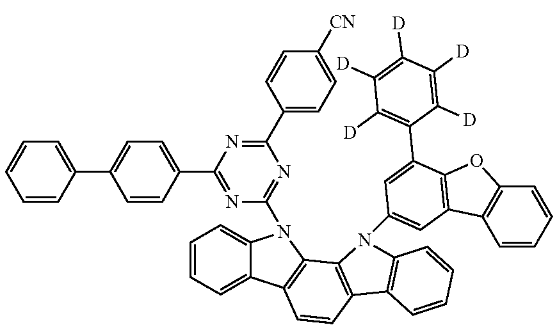
B32
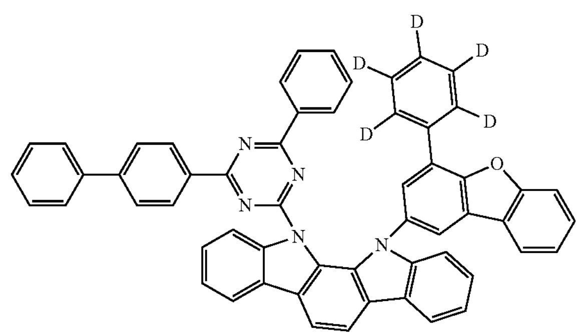
B33
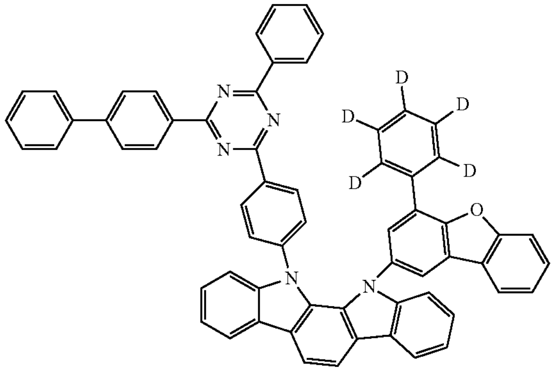
B34
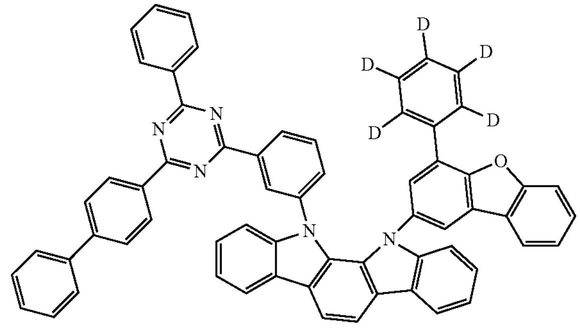

-continued
B35
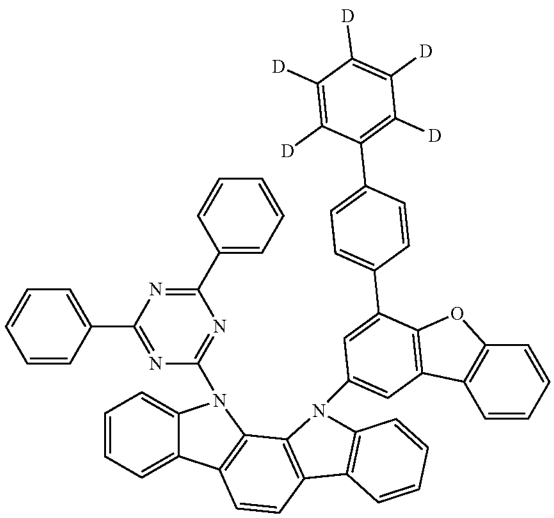
B36
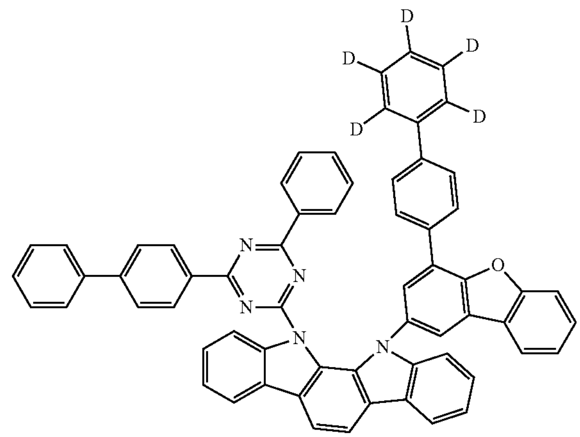
B37
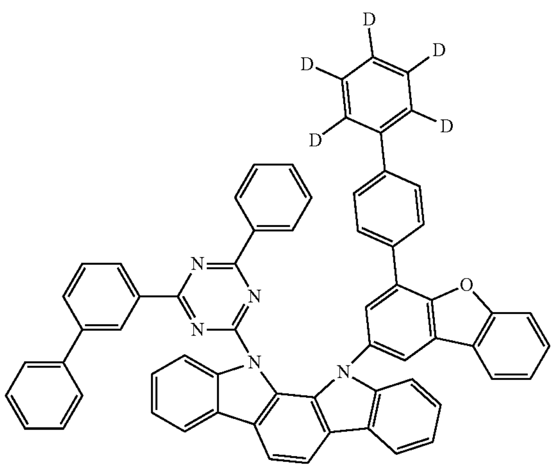
B38
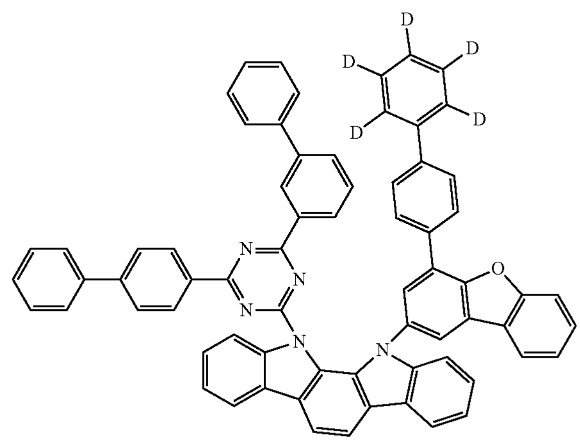
B39
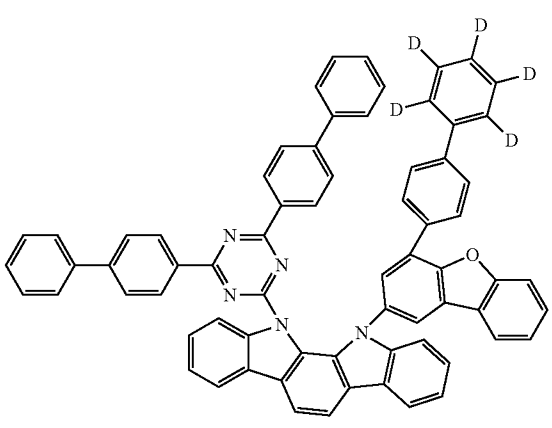
B40
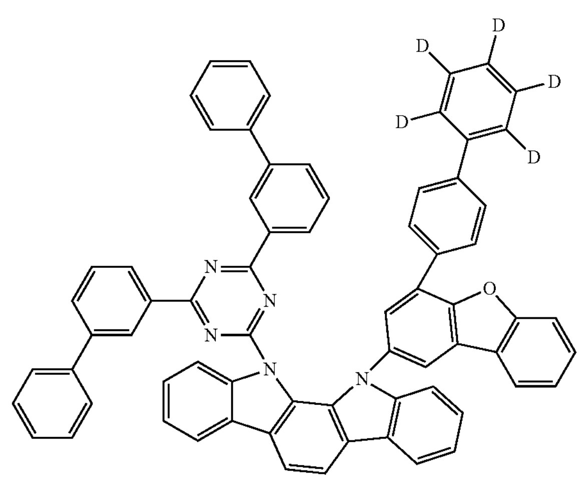

-continued
B41
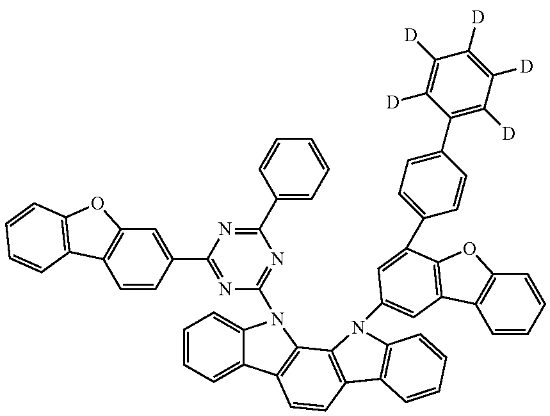
B42
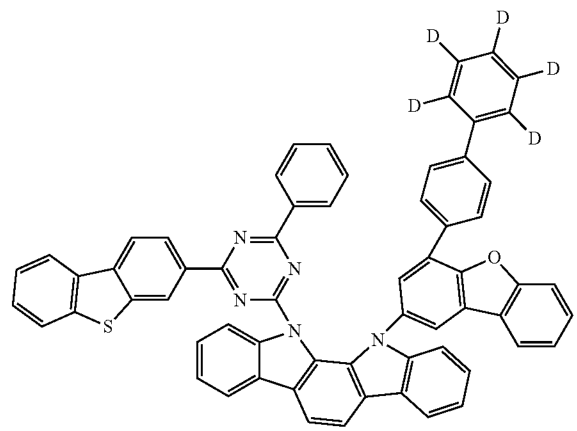
B43
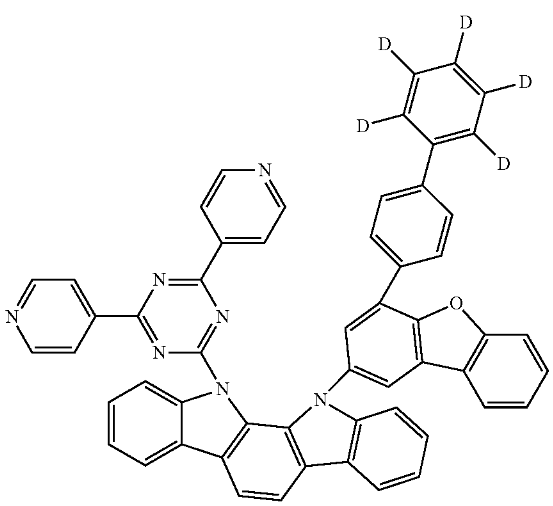
B44
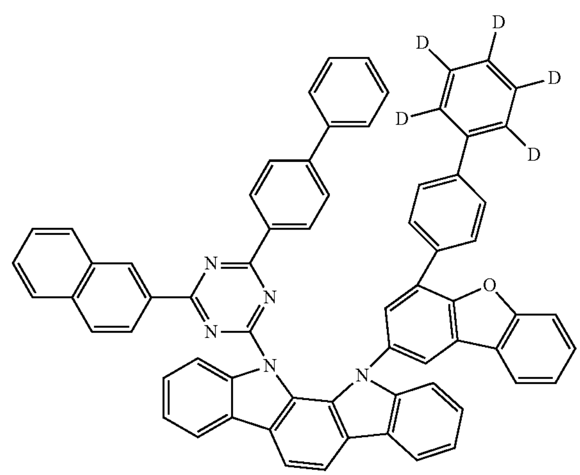
B45
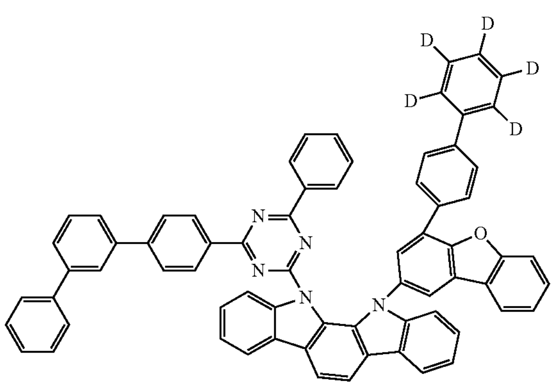
B46
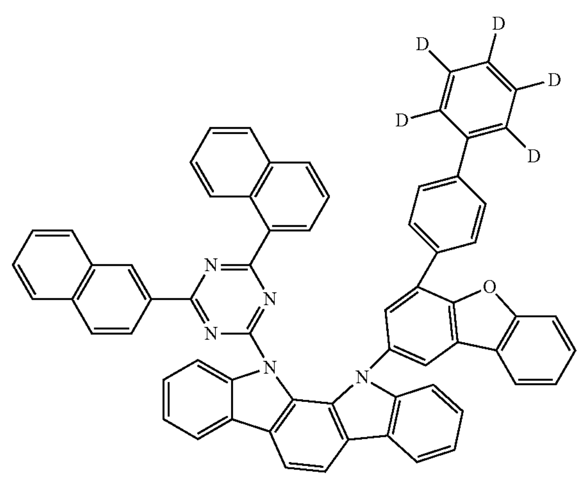

-continued
B47
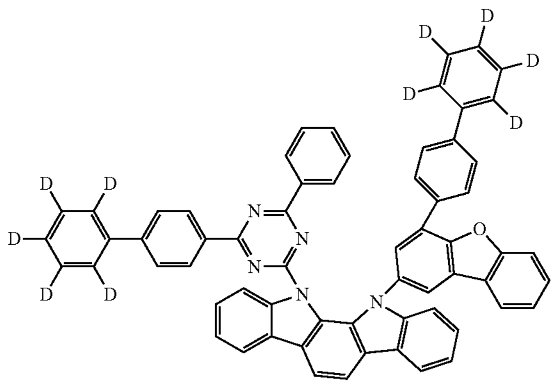
B48
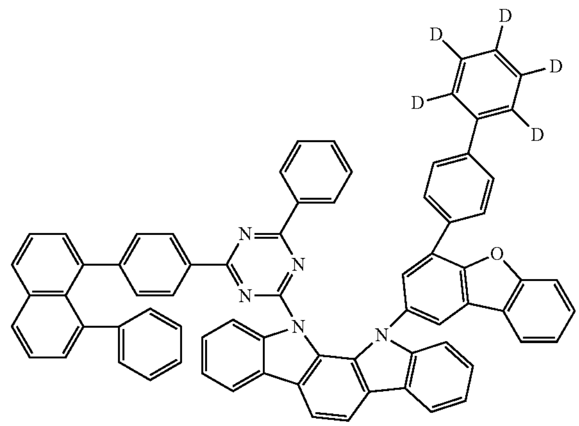
B49
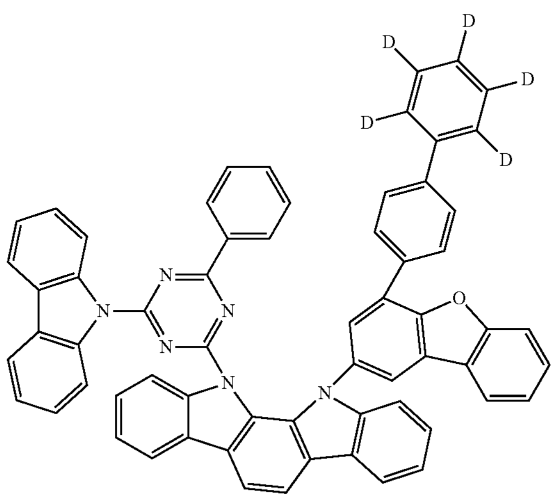
B50
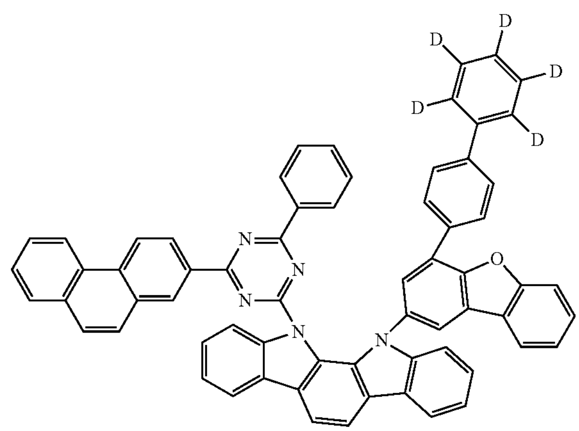
B51
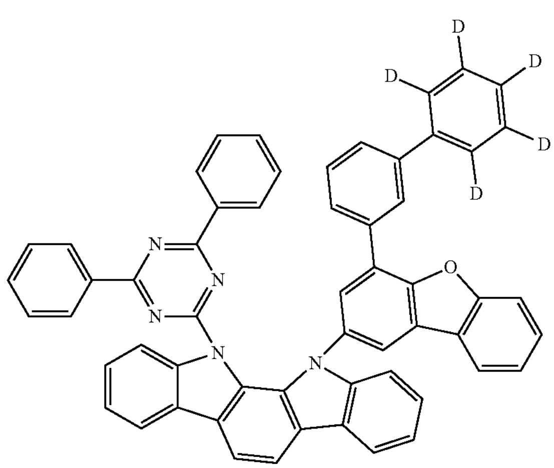
B52
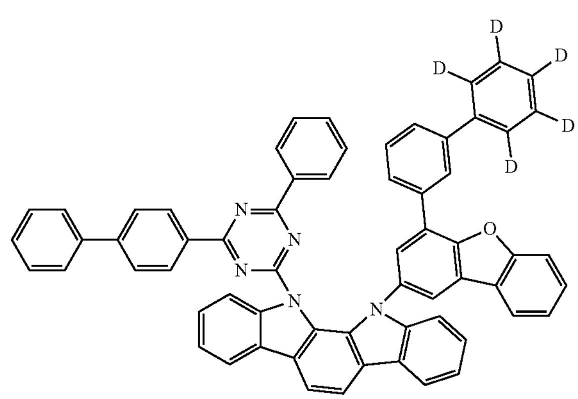

-continued
B53
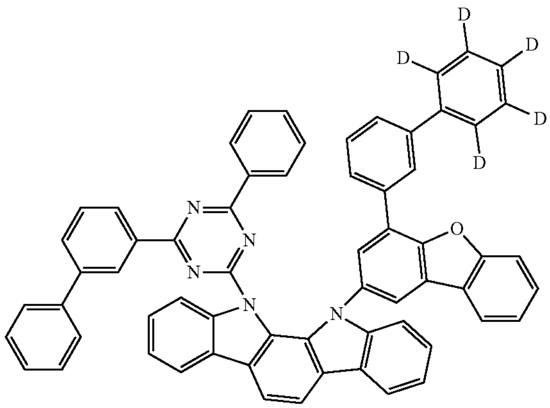
B54
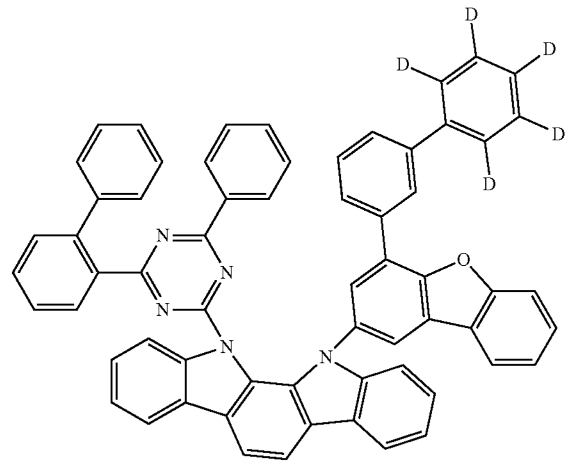
B55
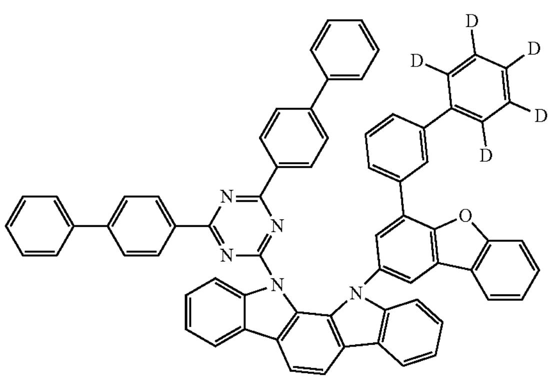
B56
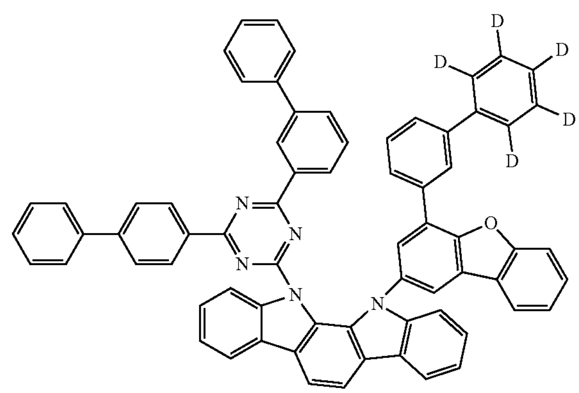
B57
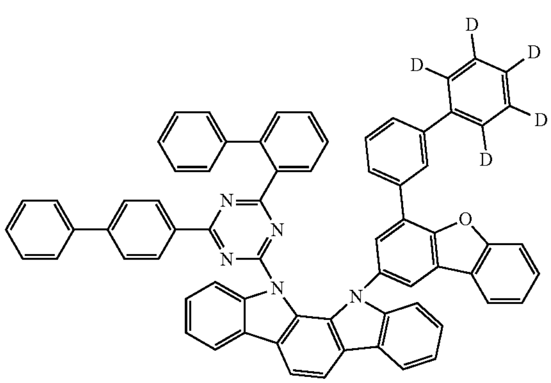
B58
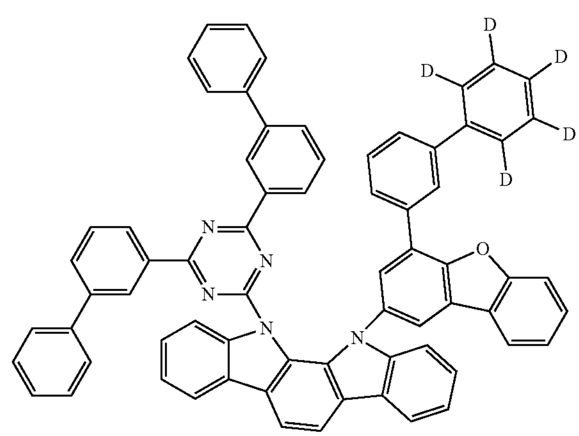

-continued
B59
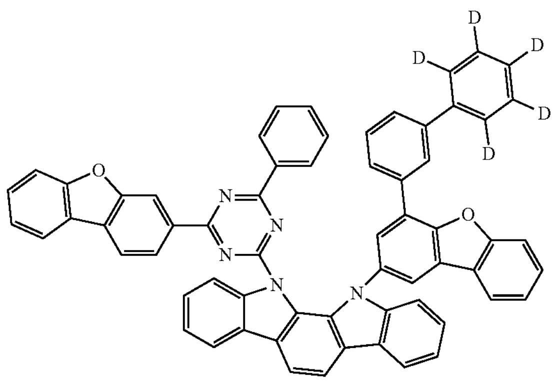
B60
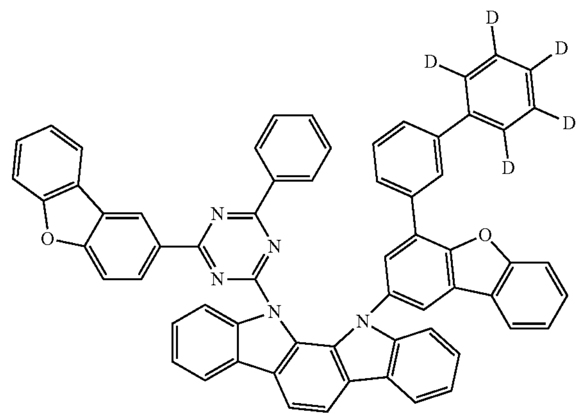
B61
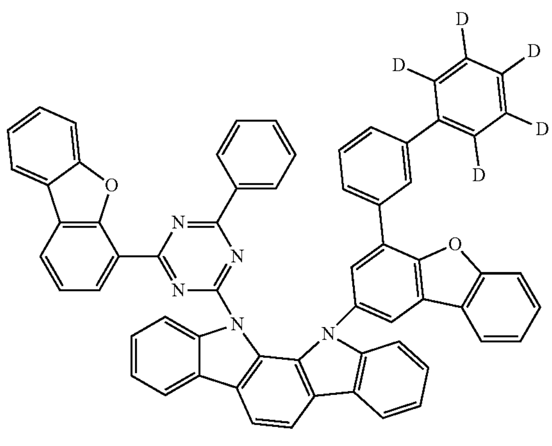
B62
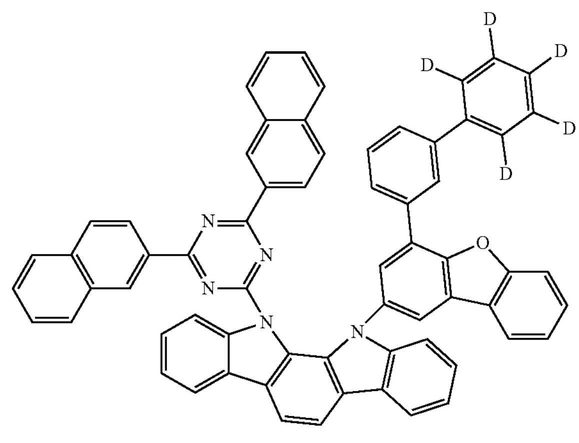
B63
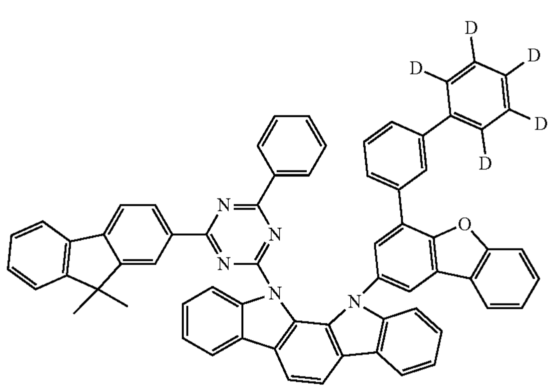
B64
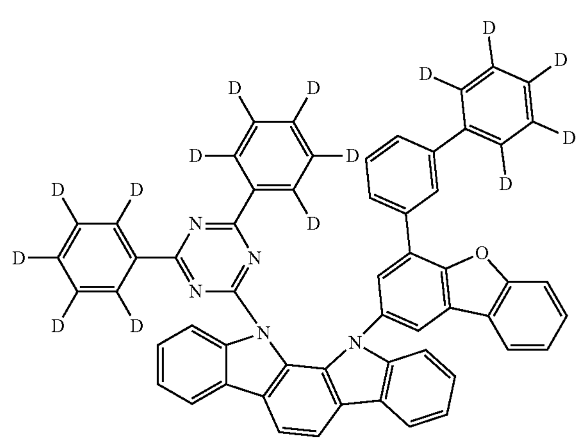

-continued
B65
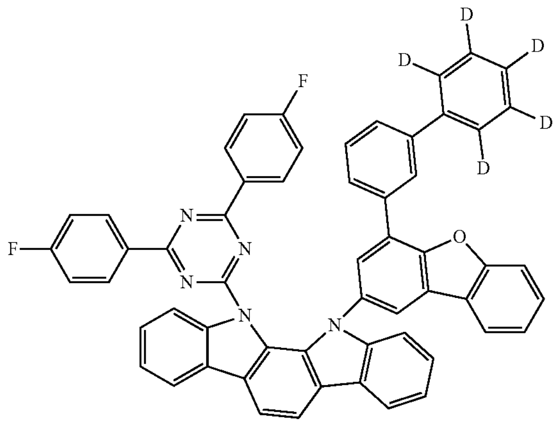
B66
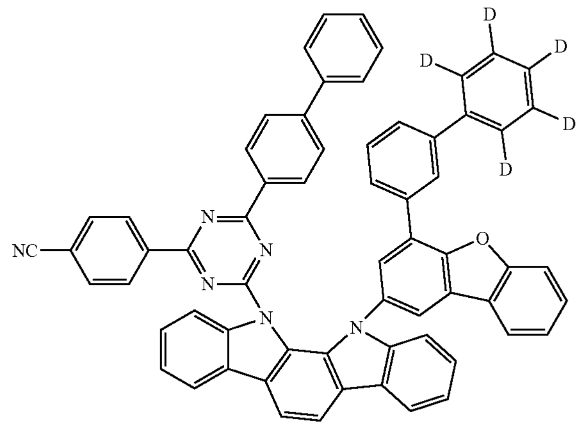
B67
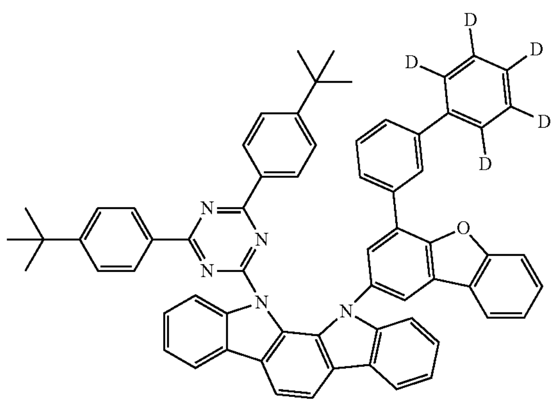
B68
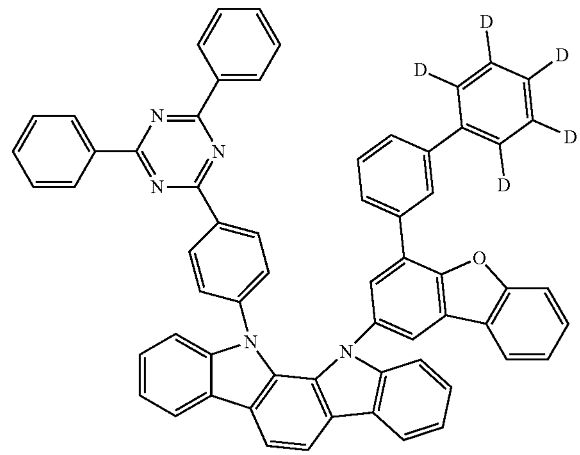
B69
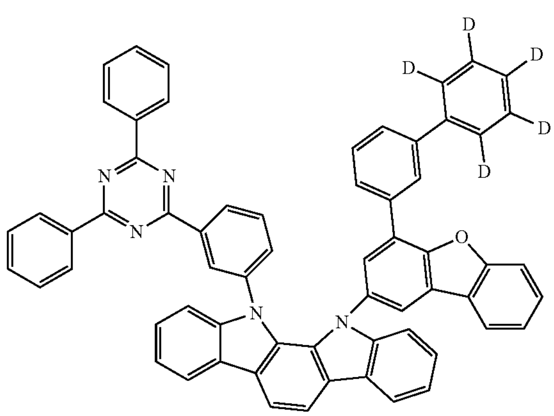
B70
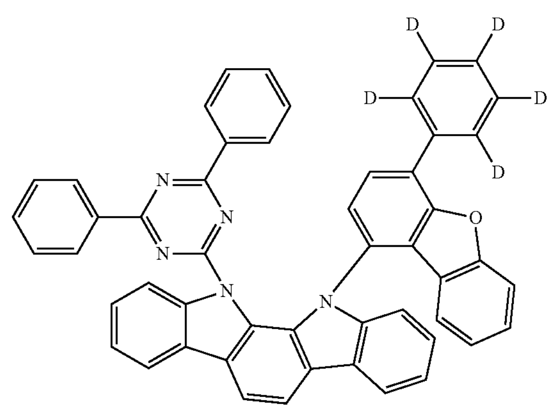

-continued
B71
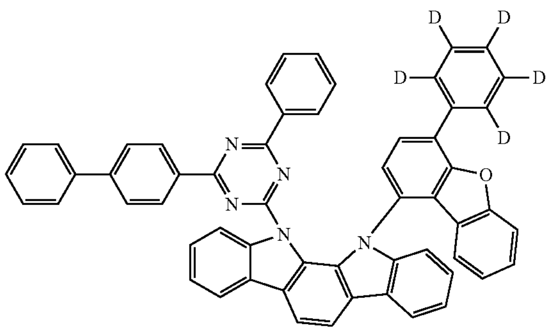
B72
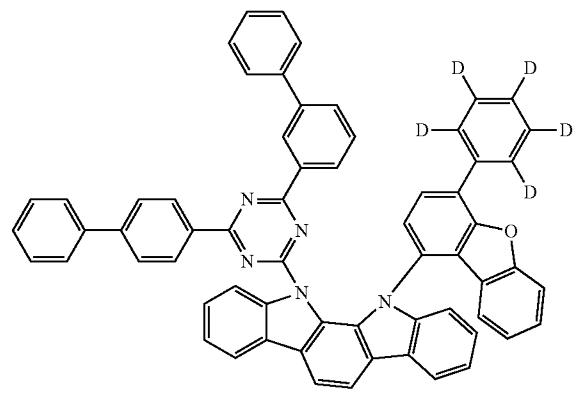
B73
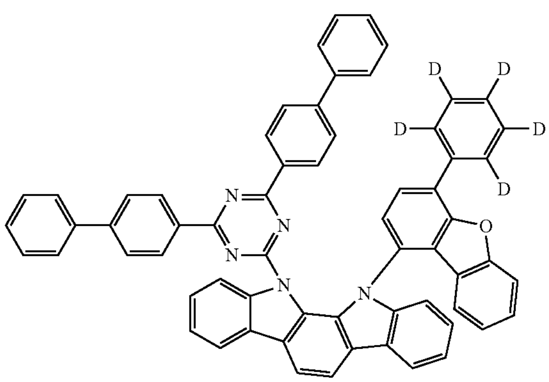
B74
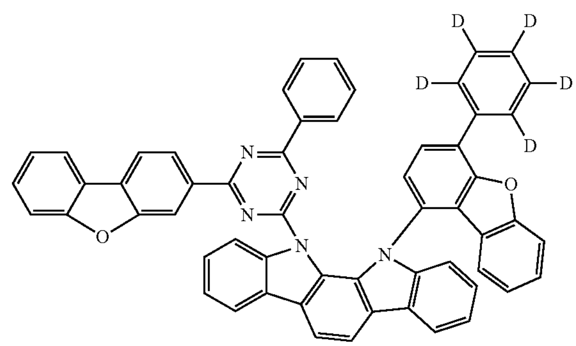
B75
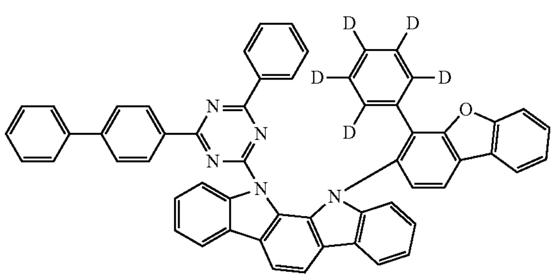
B76
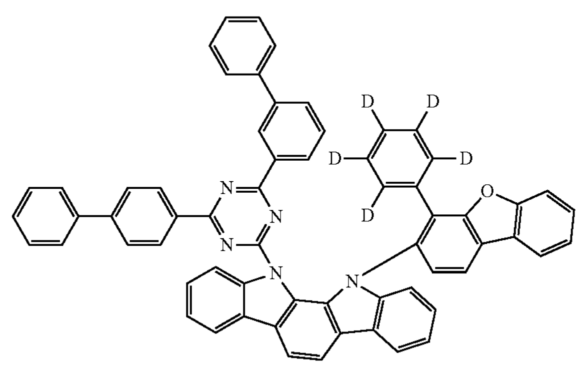
B77
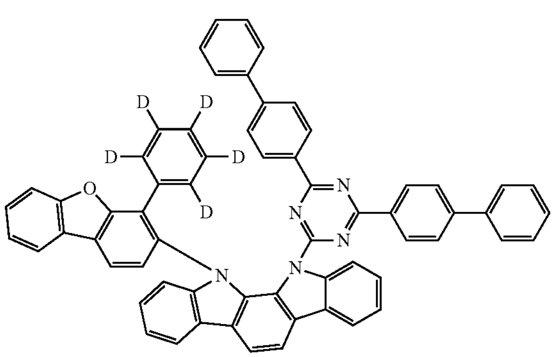
B78
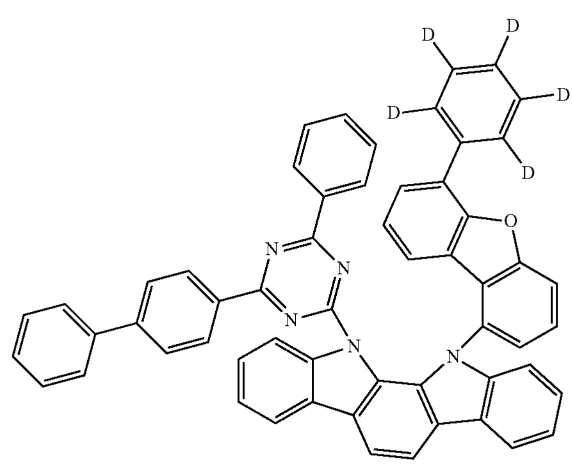

-continued
B79
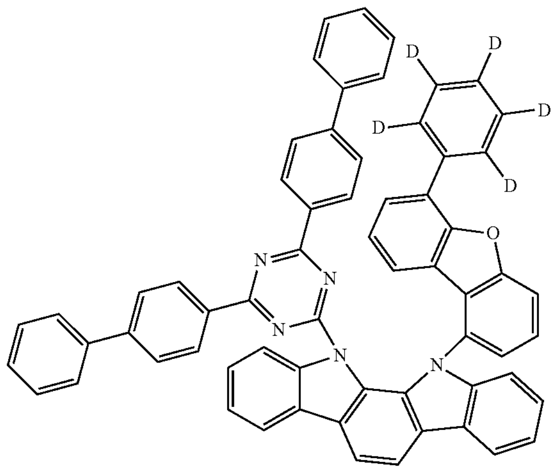
B80
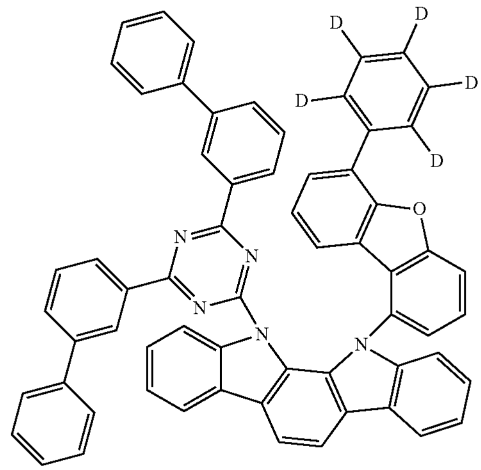
B81
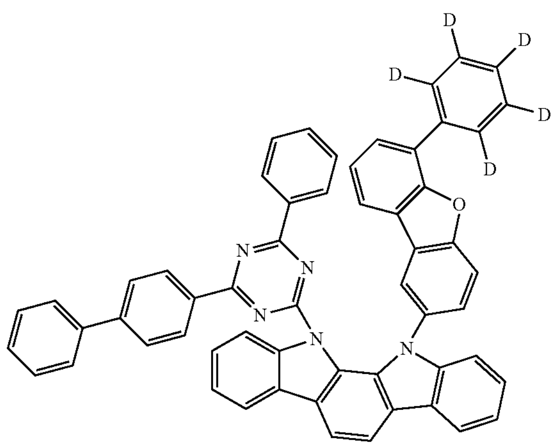
B82
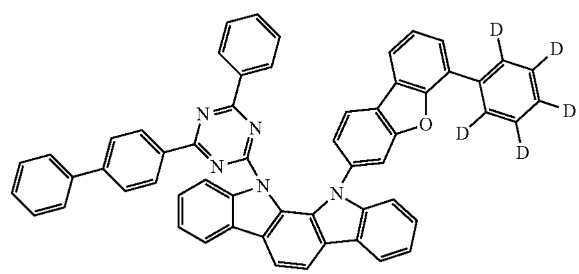
B83
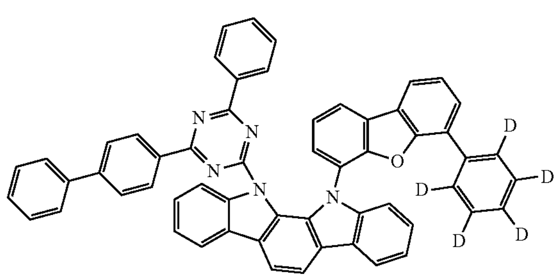
B84
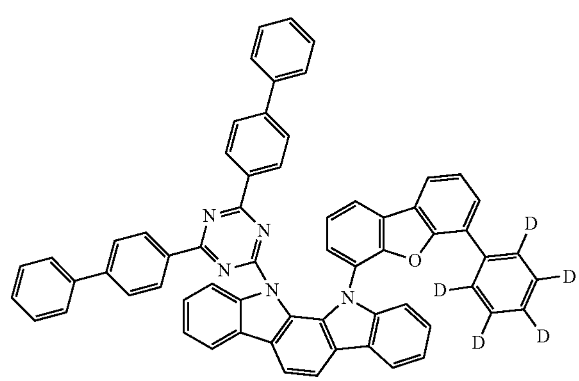

-continued
B85
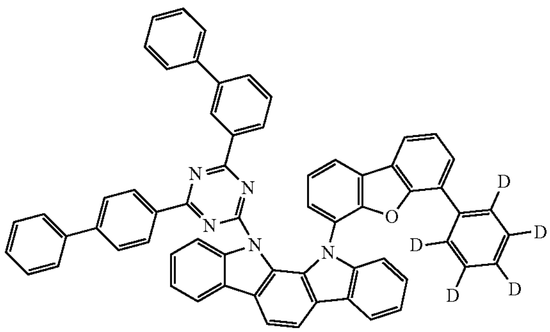
B86
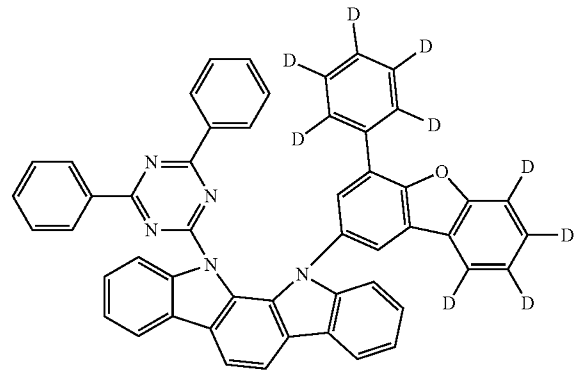
B87
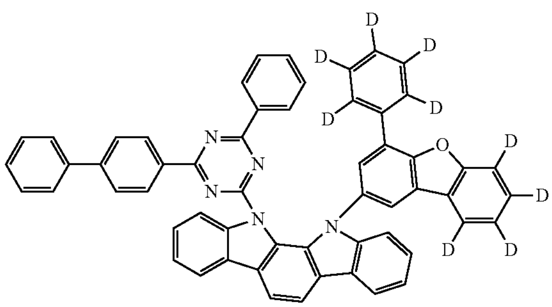
B88
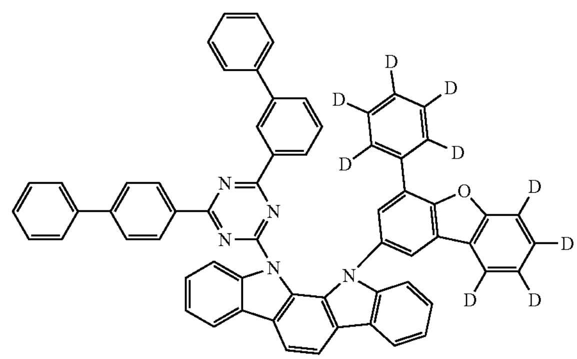
B89
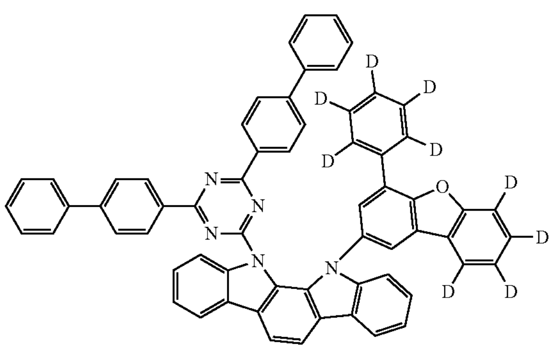
B90
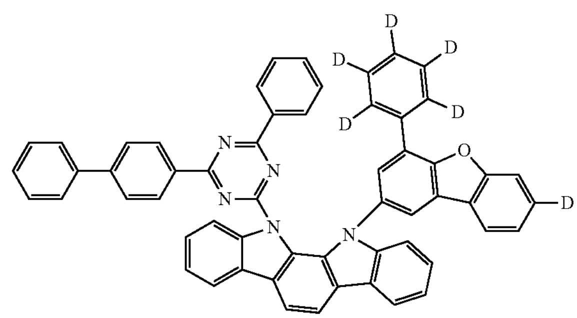
B91
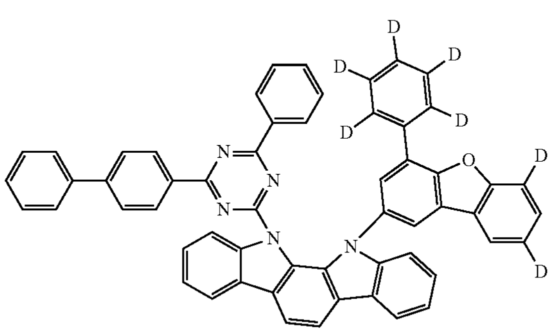
B92
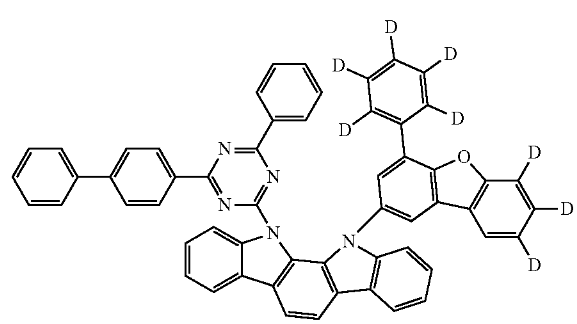

-continued
B93
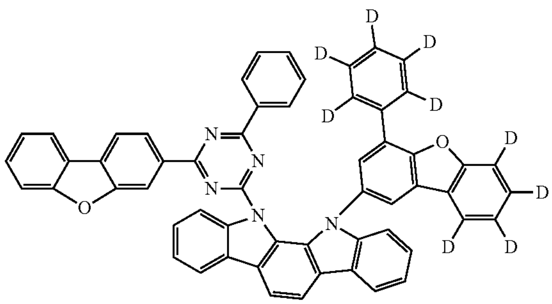
B94
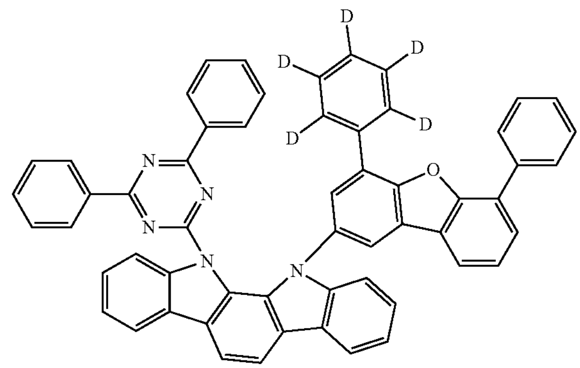
B95
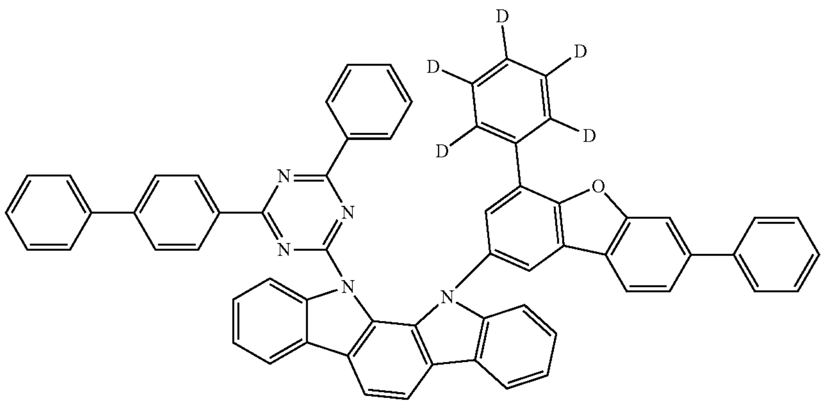
B96
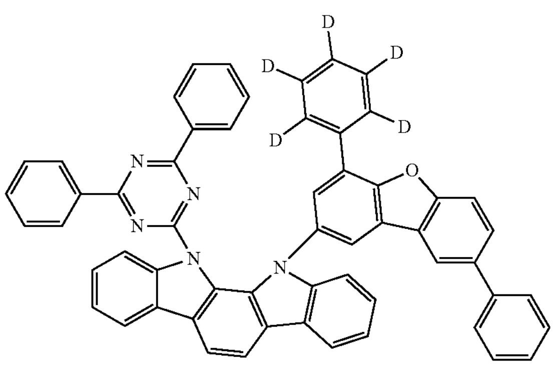
B97
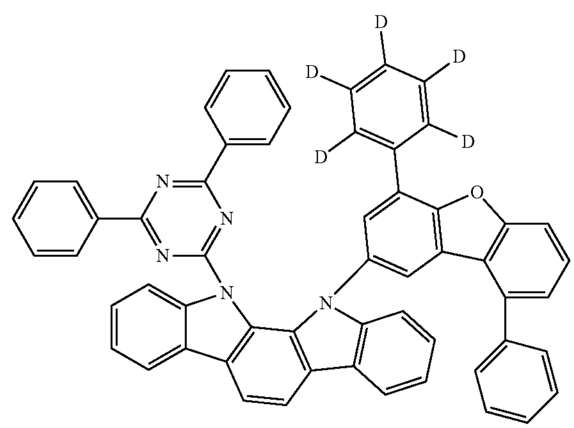
B98
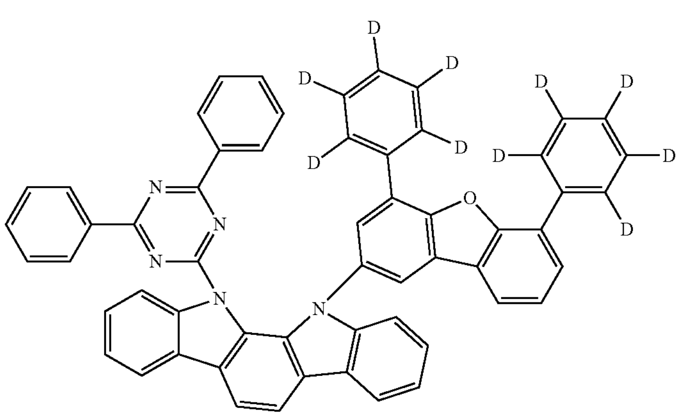

-continued
B99
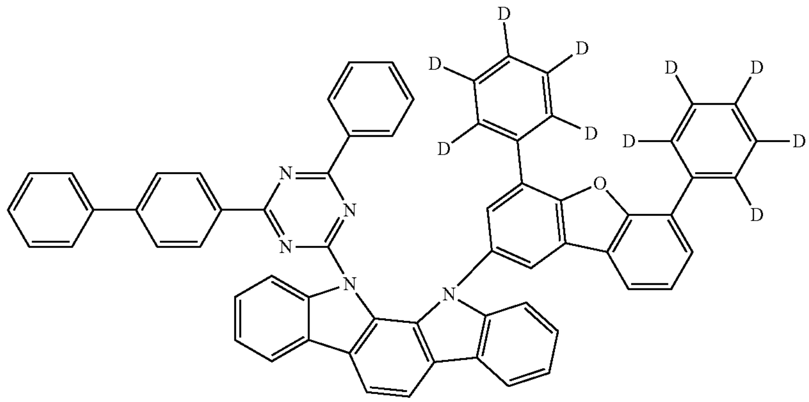
B100
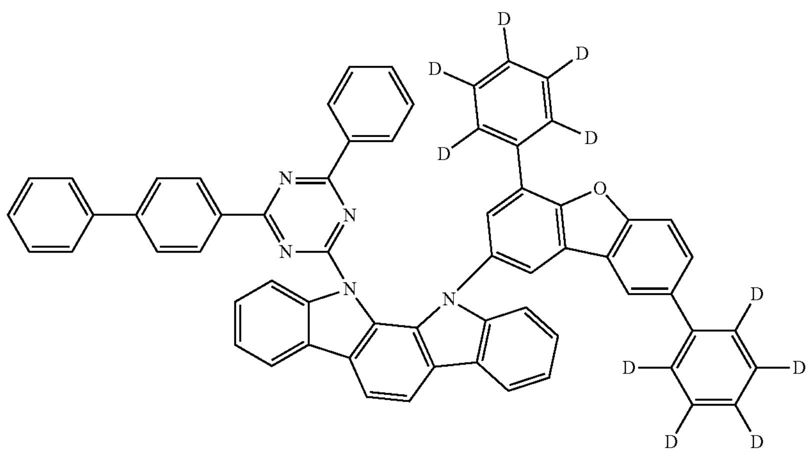
B101
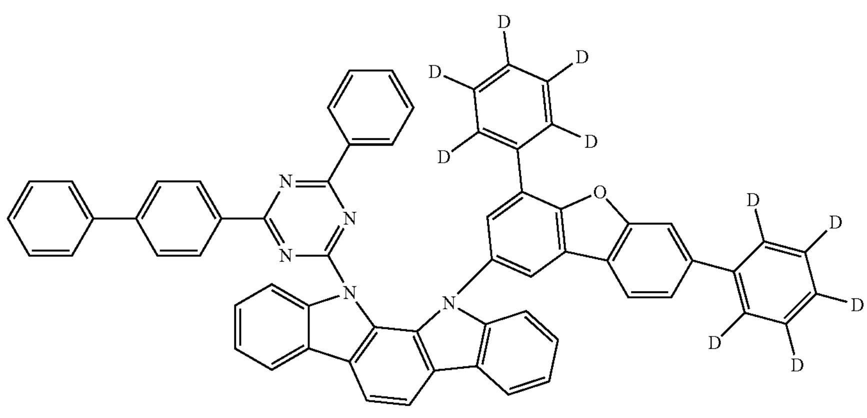

-continued
B102
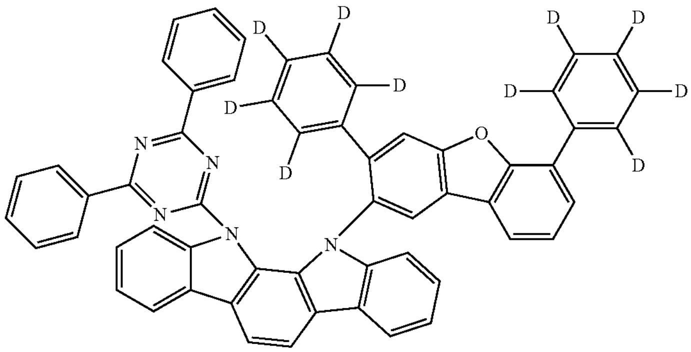
B103
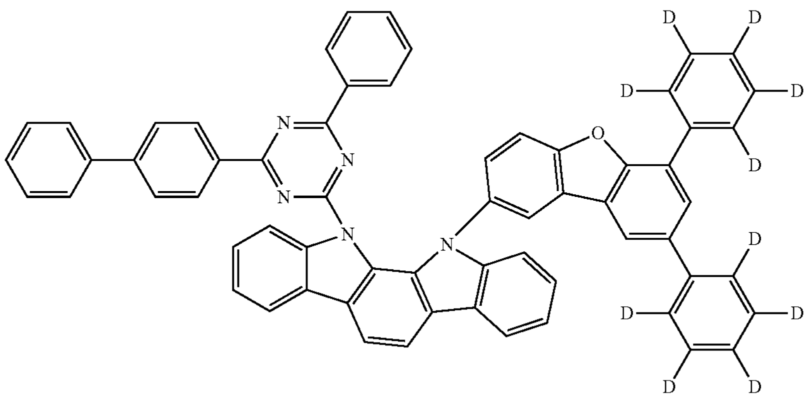
B104
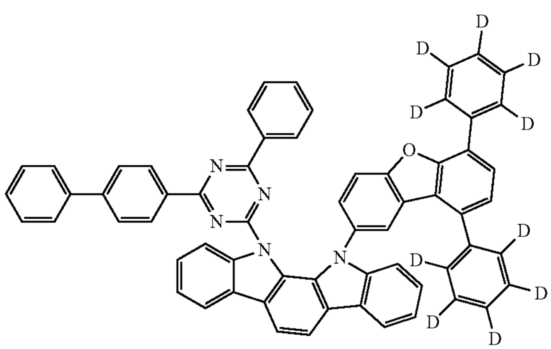
B105
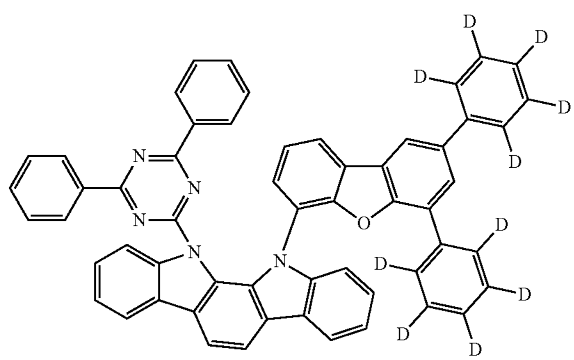
B106
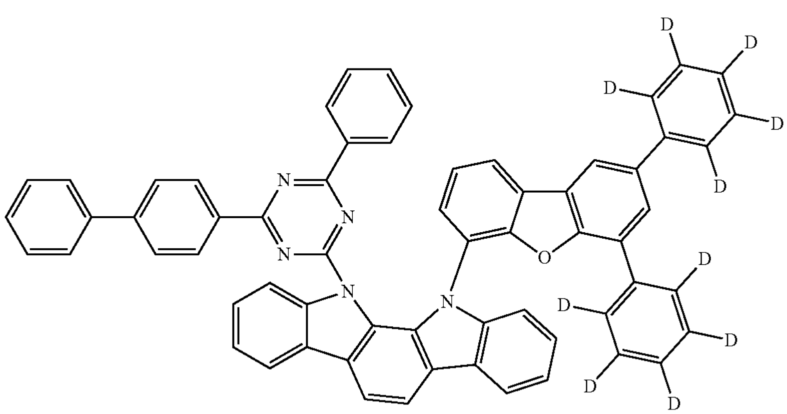

-continued
B107
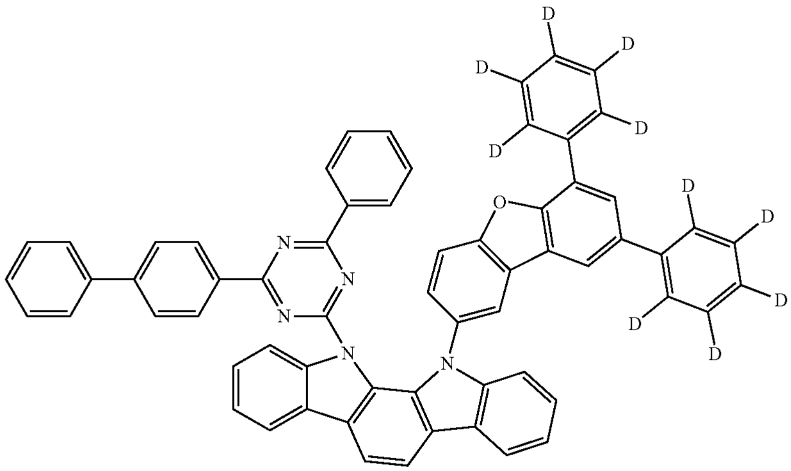
B108
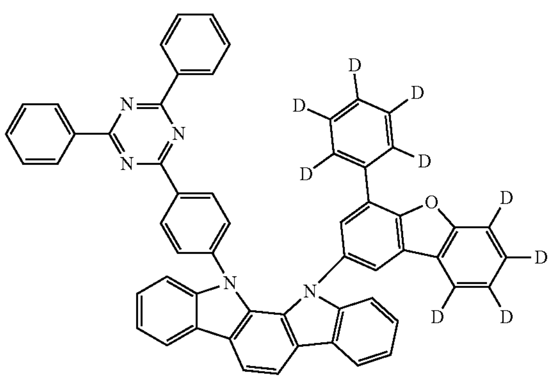
B109
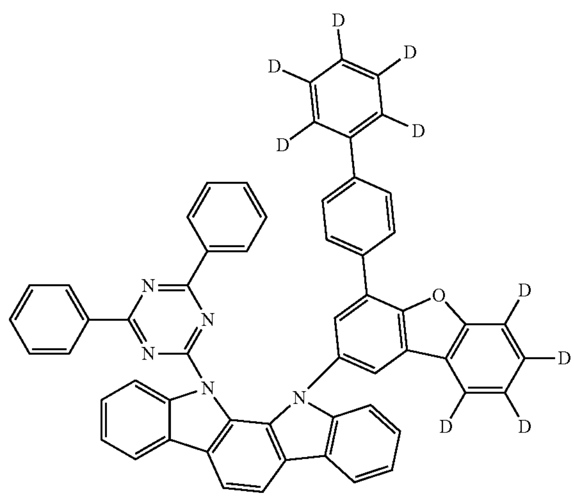
B110
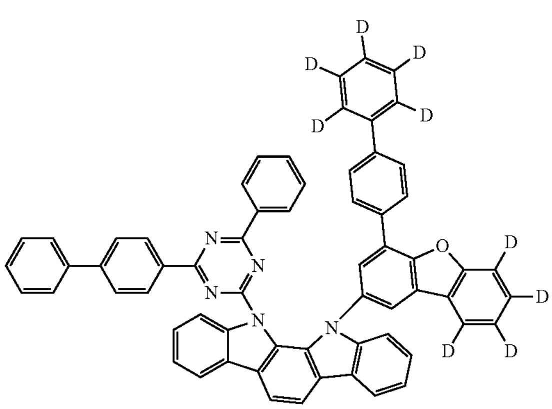
B111
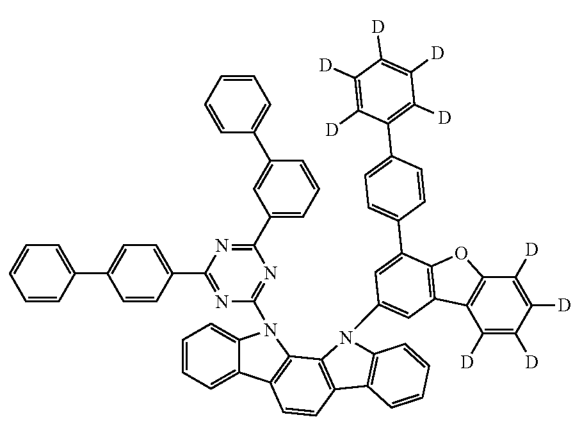

-continued
B112
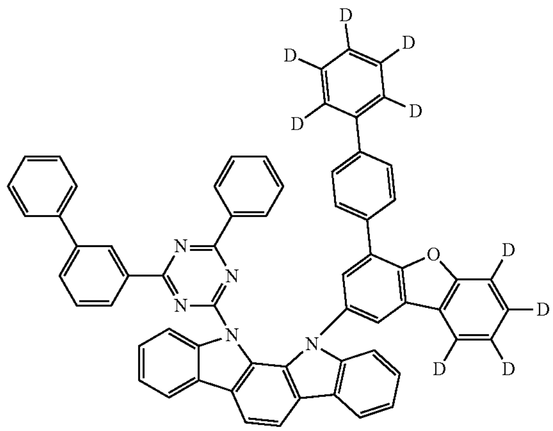
B113
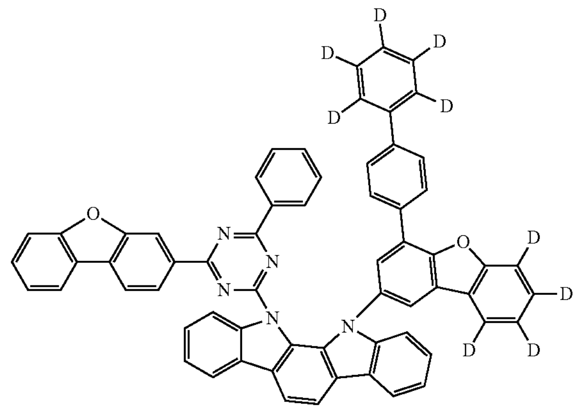
B114
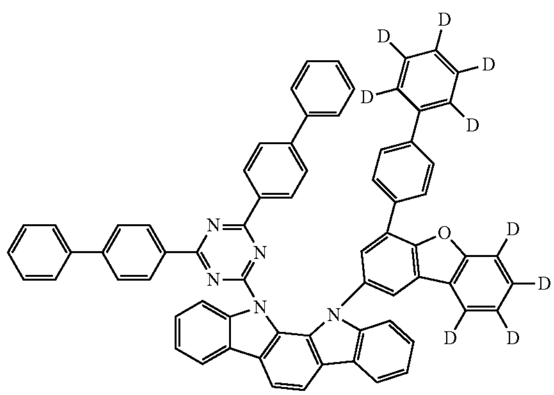
B115
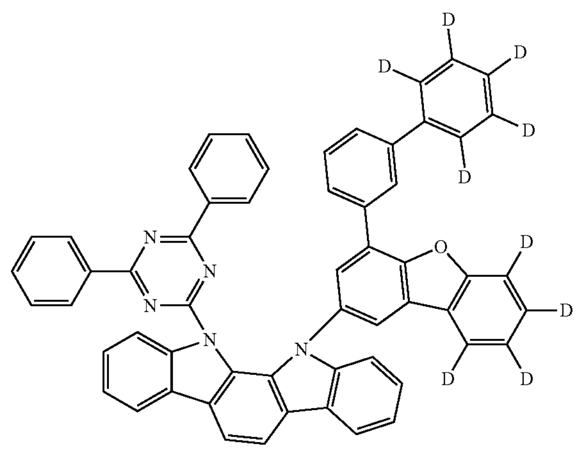
B116
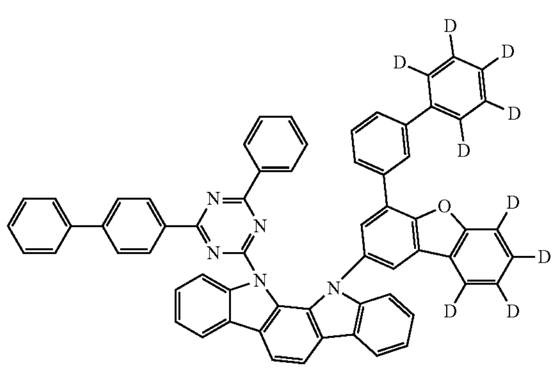
B117
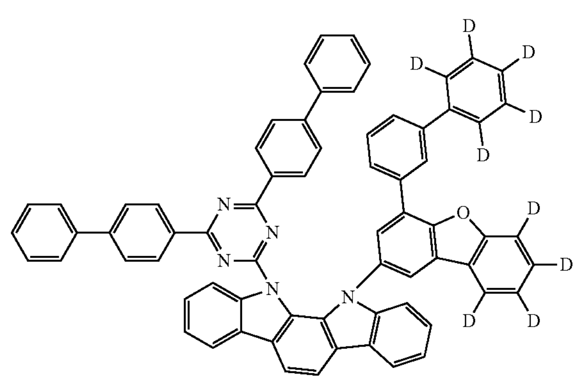

-continued
B118
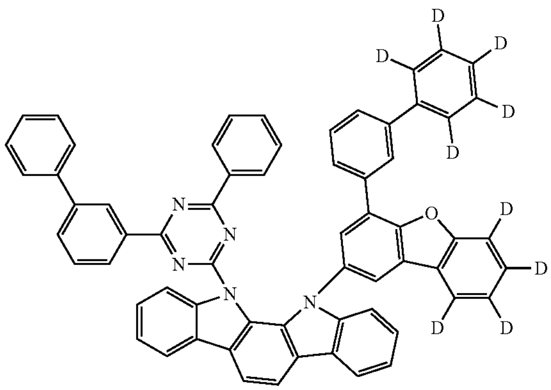
B119
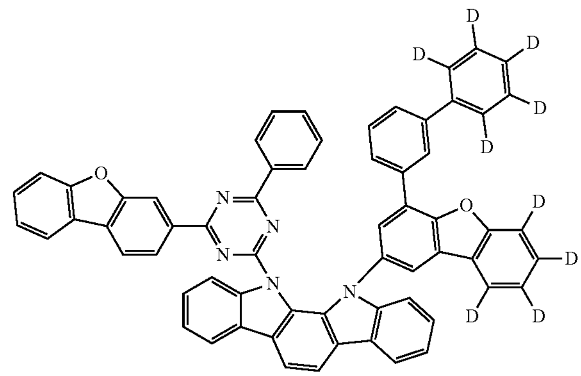
B120
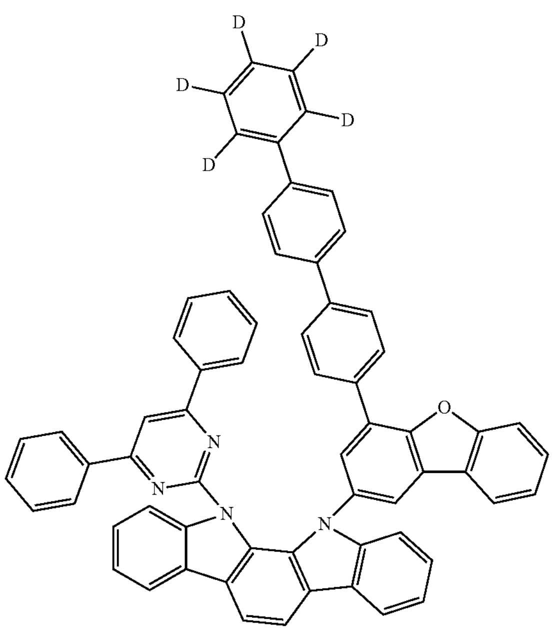
B121
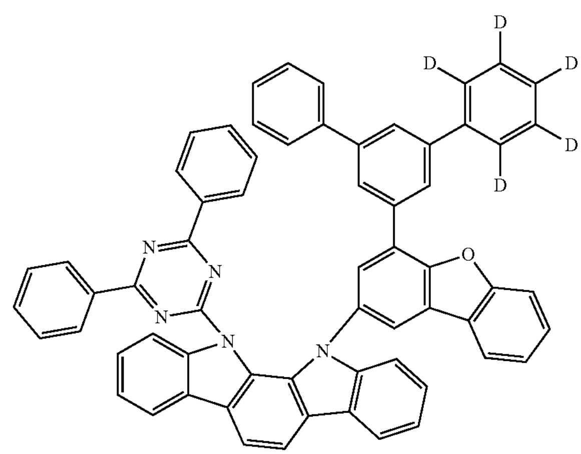
B122
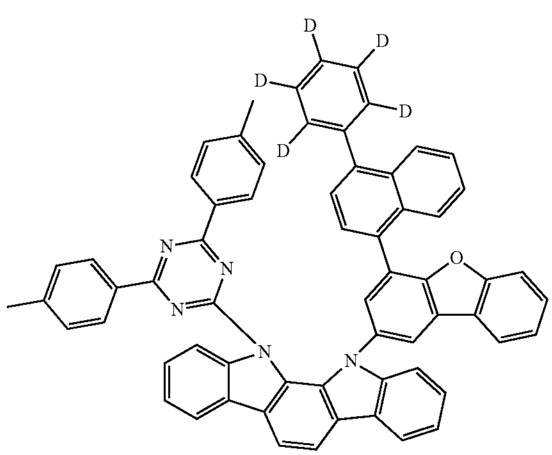
B123
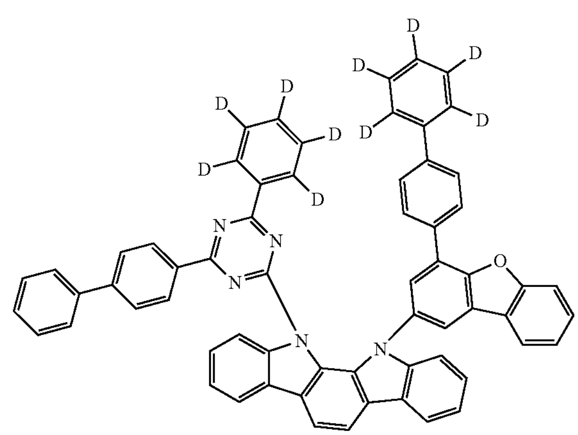

-continued
B124
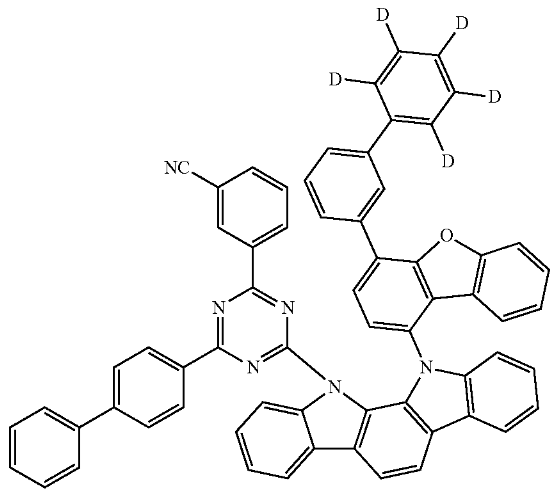
C1
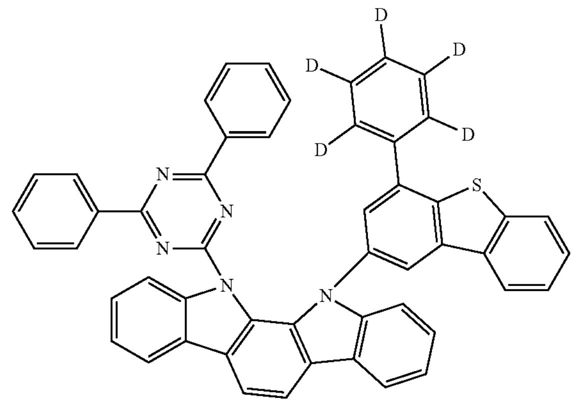
C2
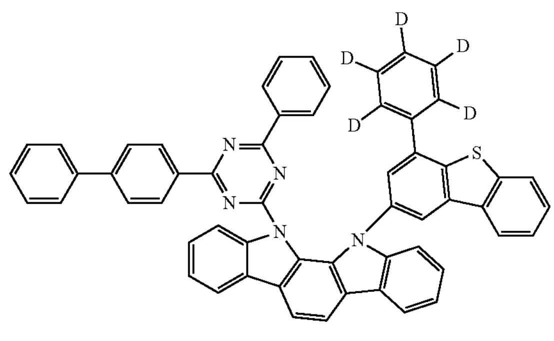
C3
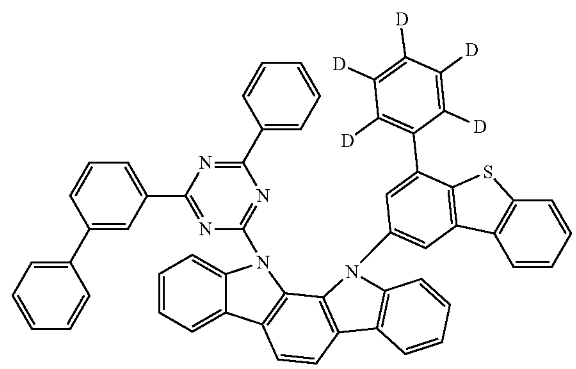
C4
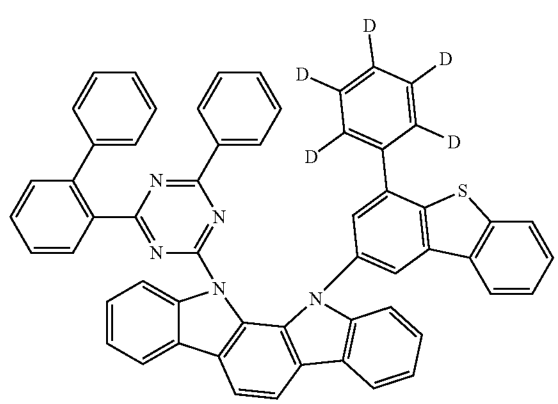
C5
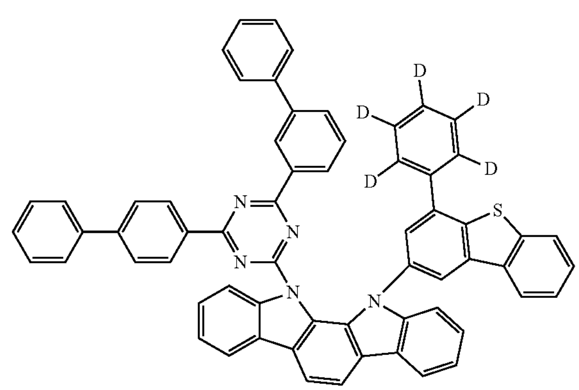

-continued
C6
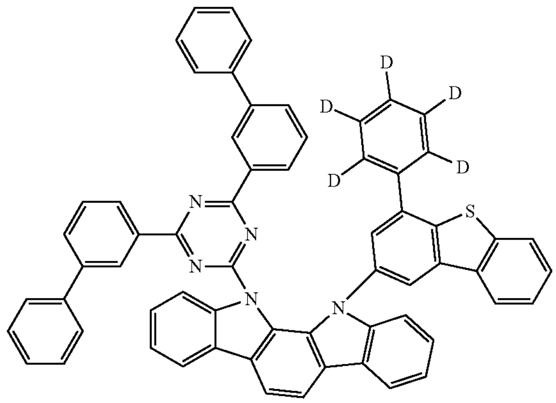
C7
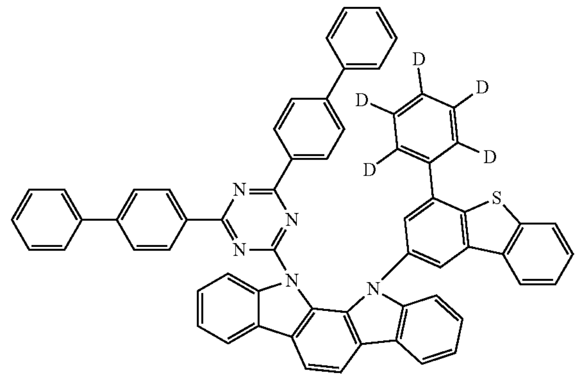
C8
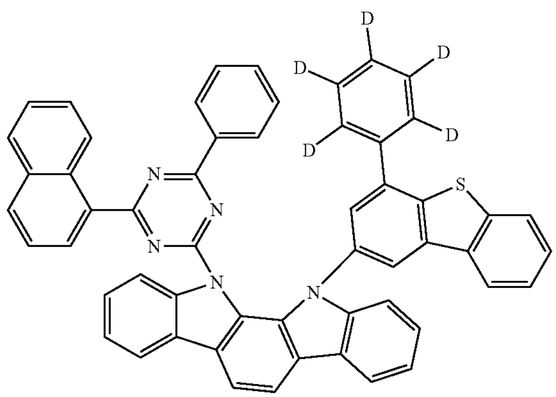
C9
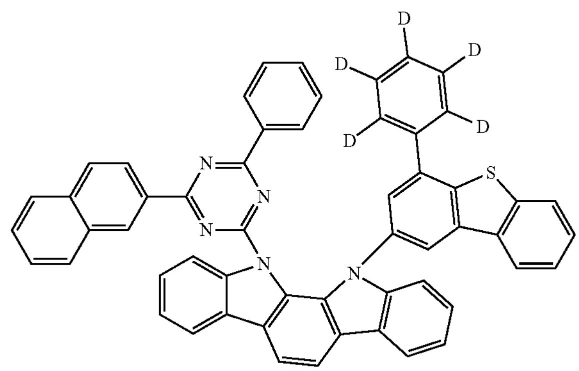
C10
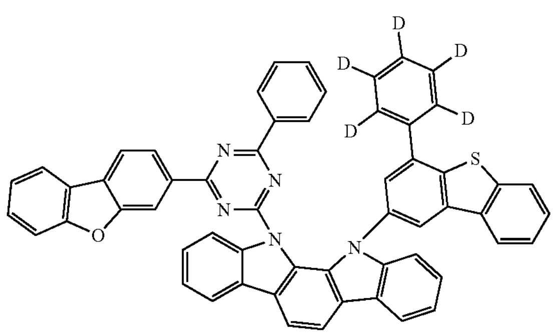
C11
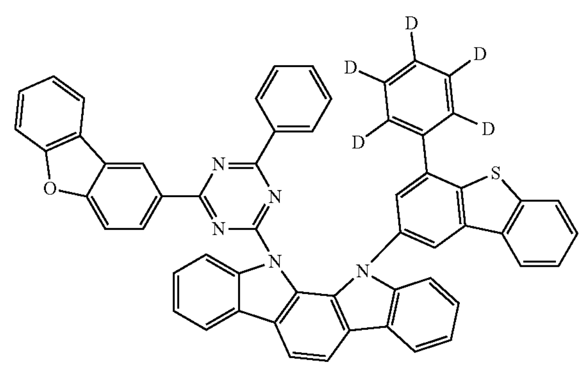
C12
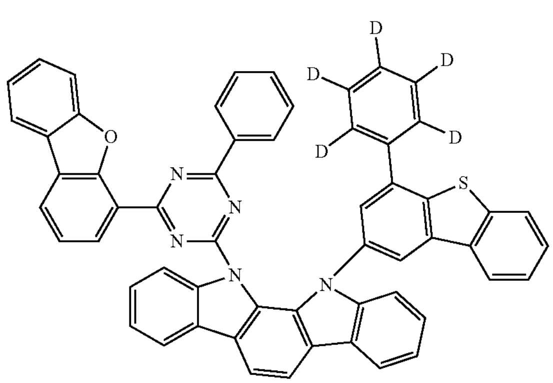
C13
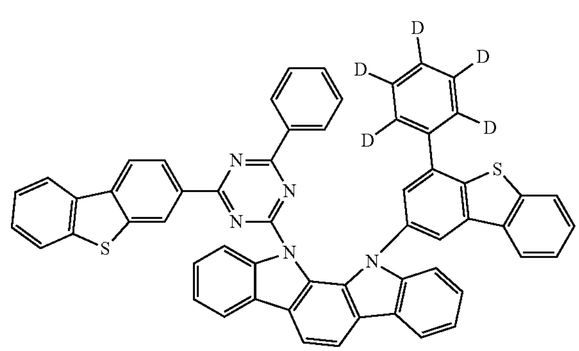

-continued
C14
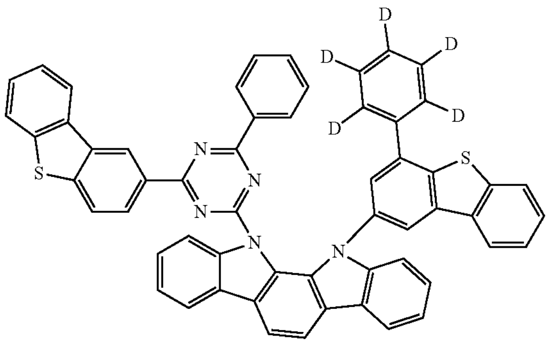
C15
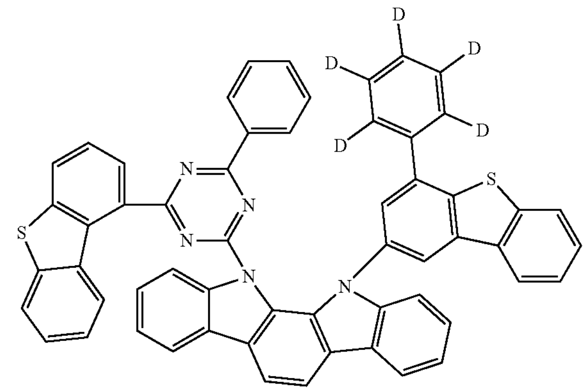
C16
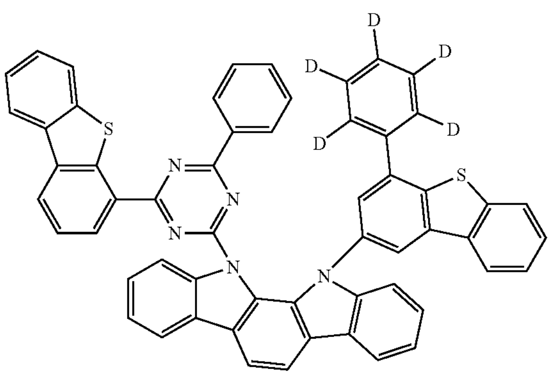
C17
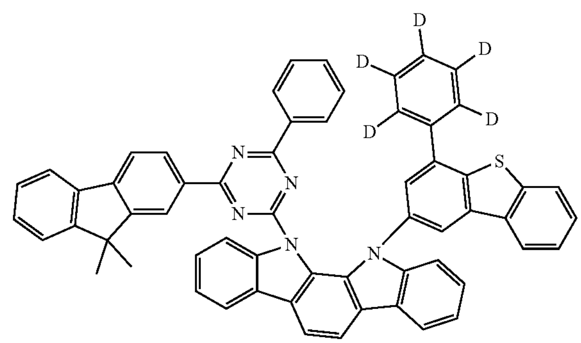
C18
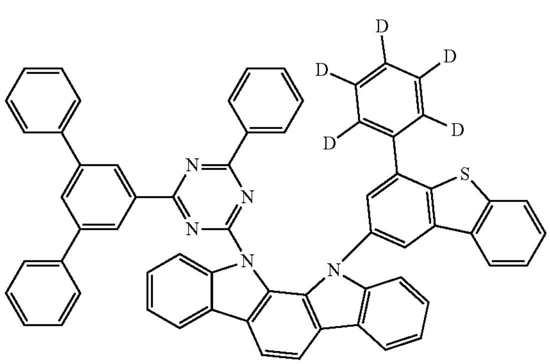
C19
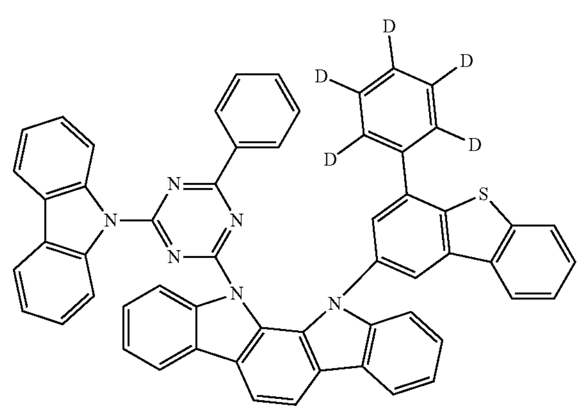

-continued
C20
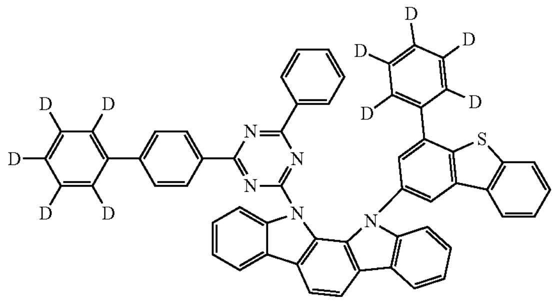
C21
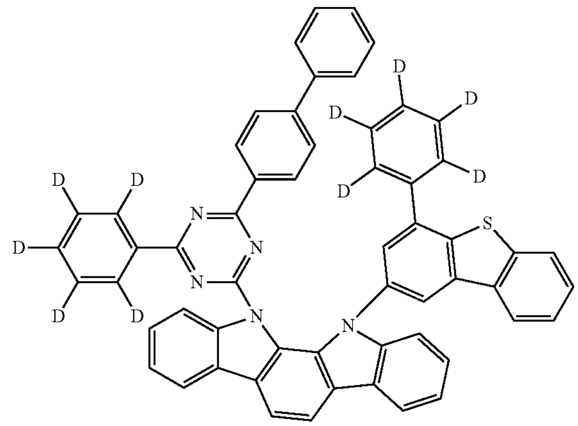
C22
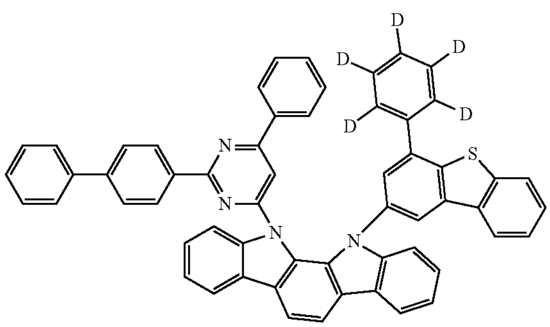
C23
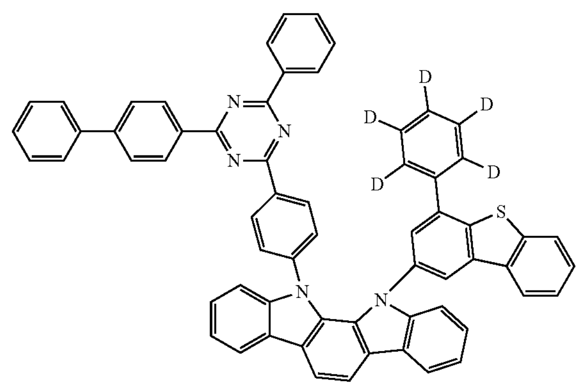
C24
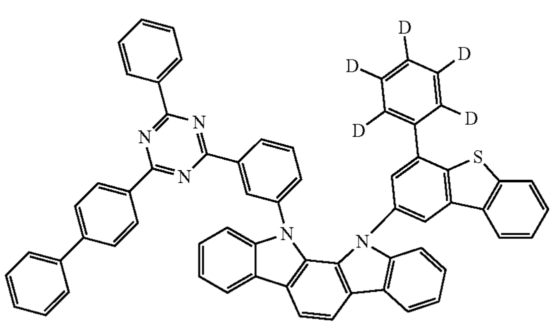
C25
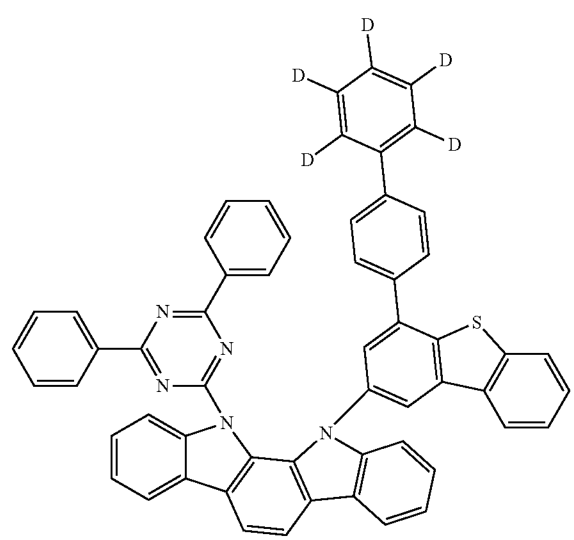

-continued
C26
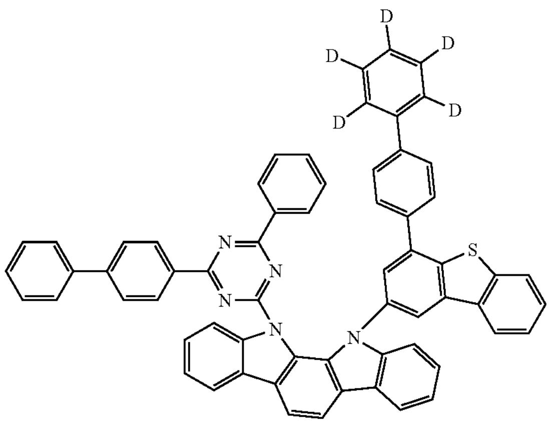
C27
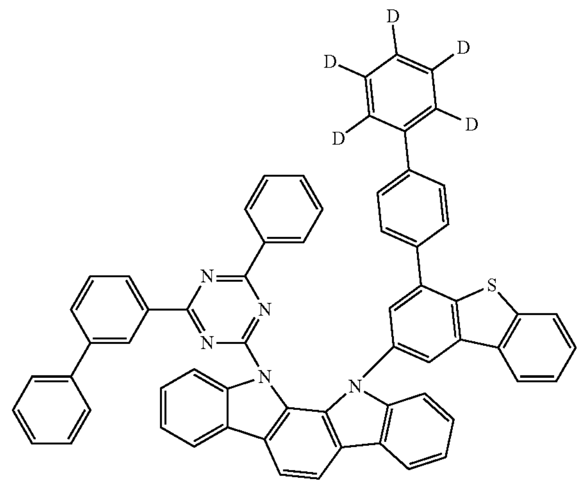
C28
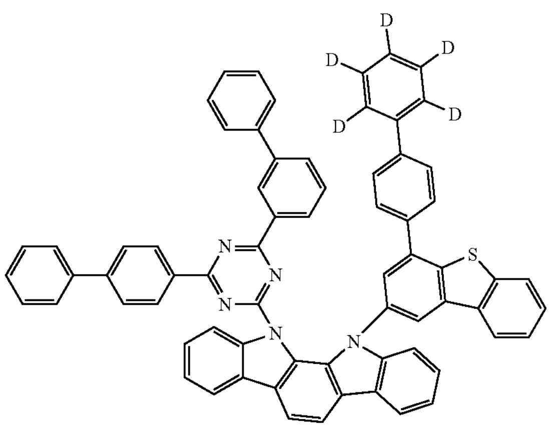
C29
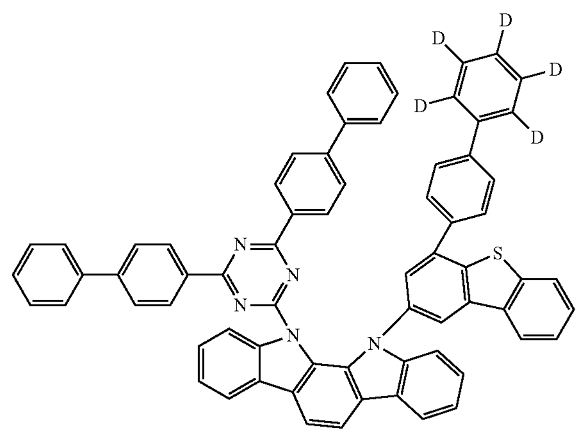
C30
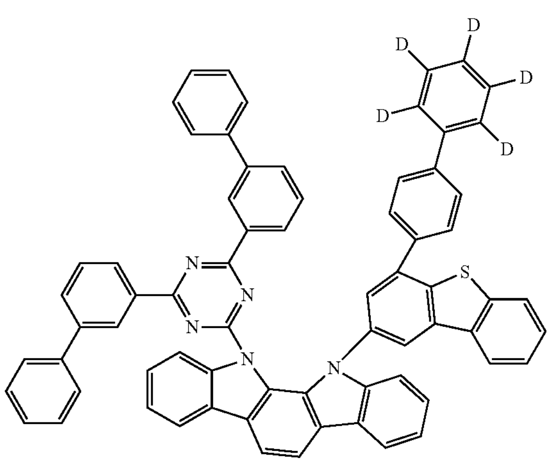
C31
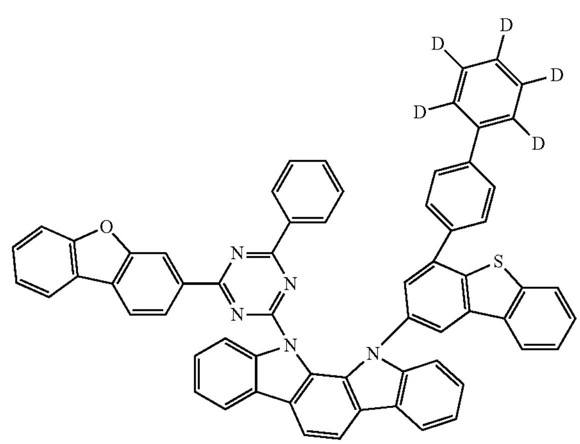

-continued
C32
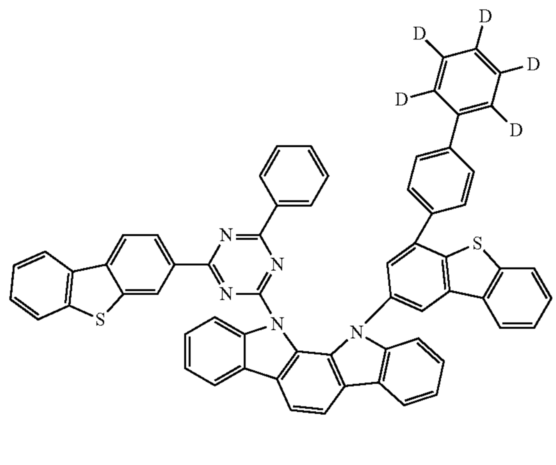
C33
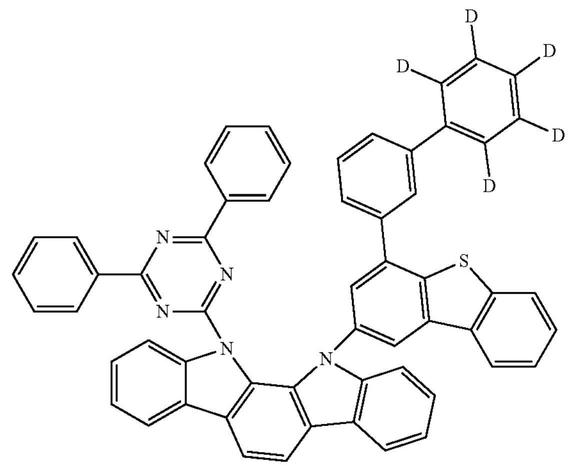
C34
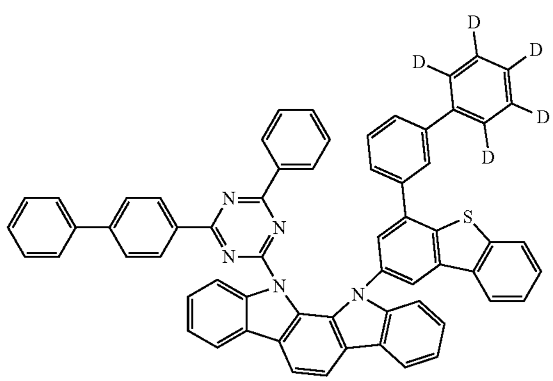
C35
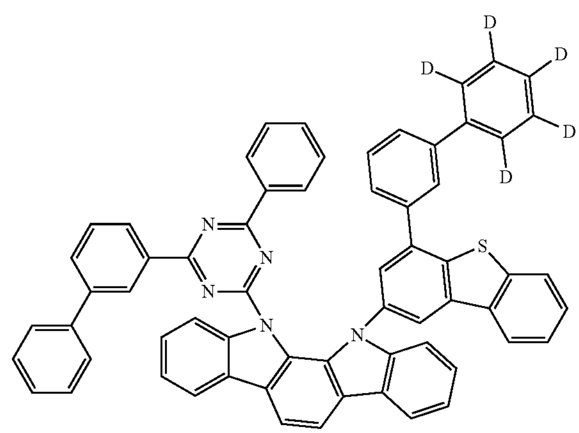
C36
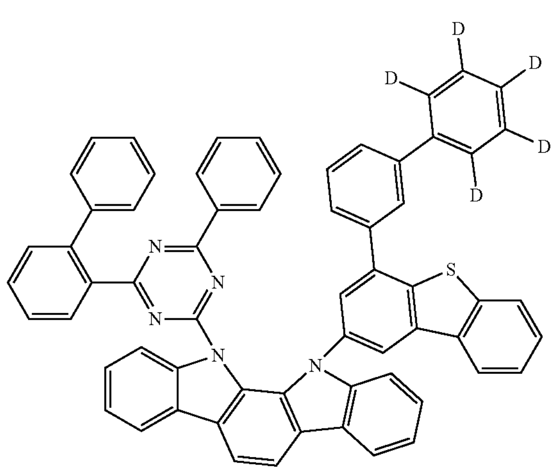
C37
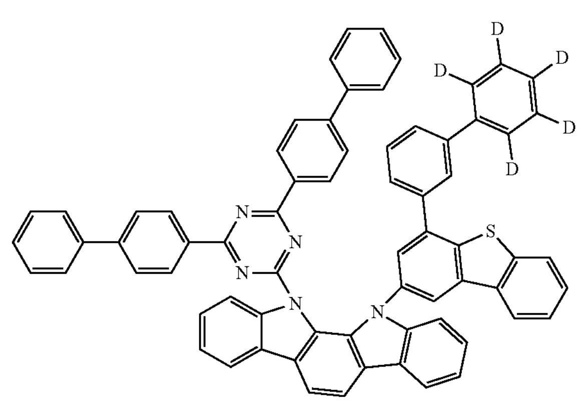

-continued
C38
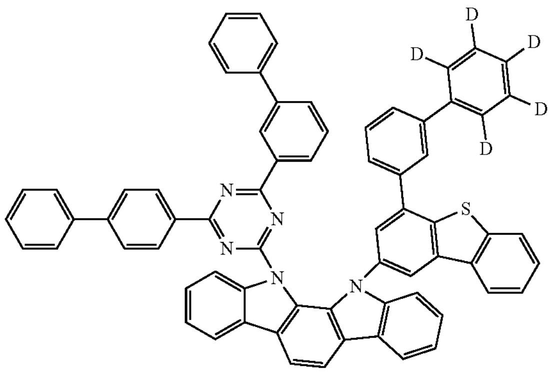
C39
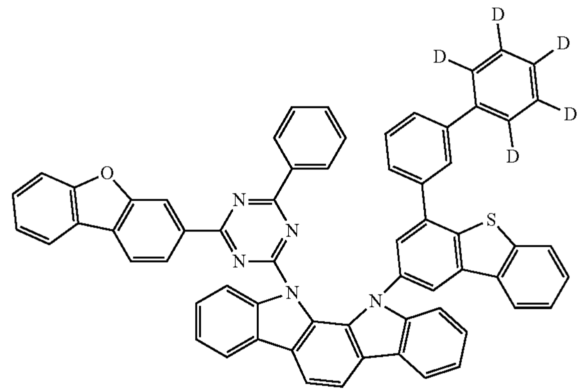
C40
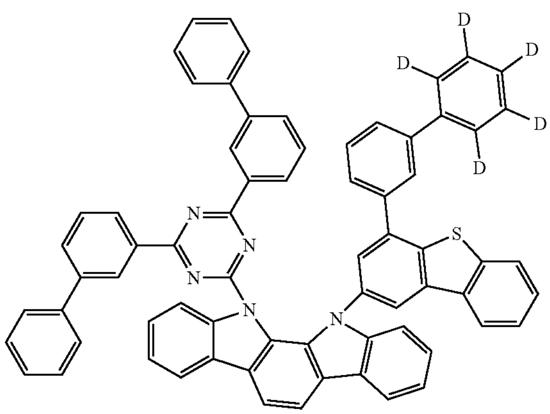
C41
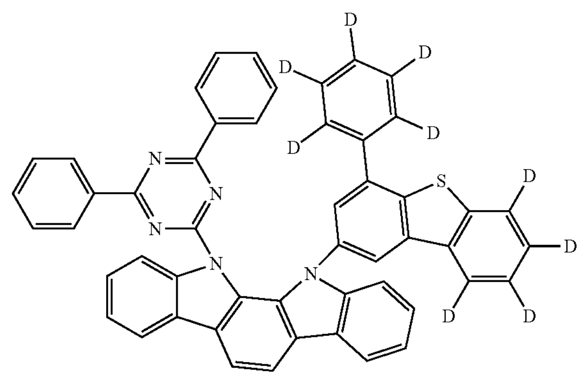
C42
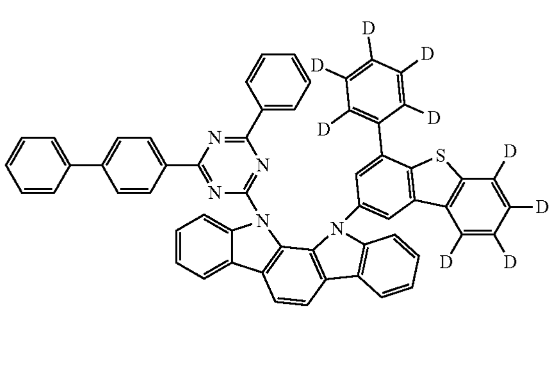
C43
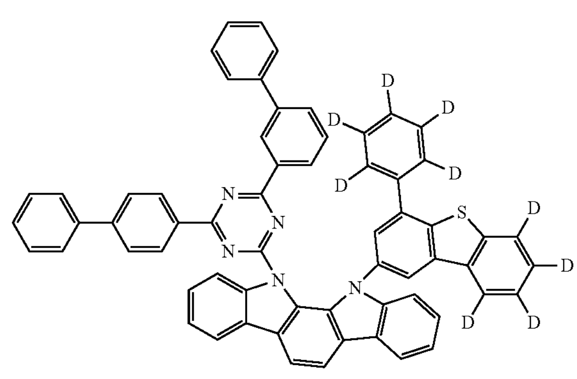

-continued
C44
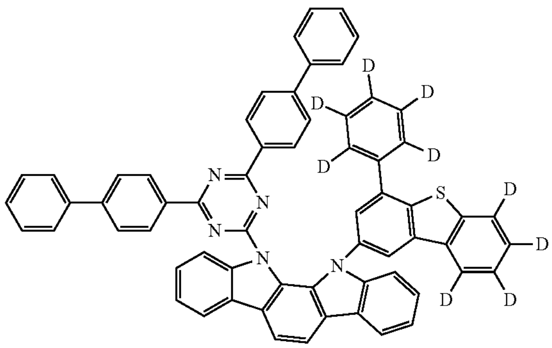
C45
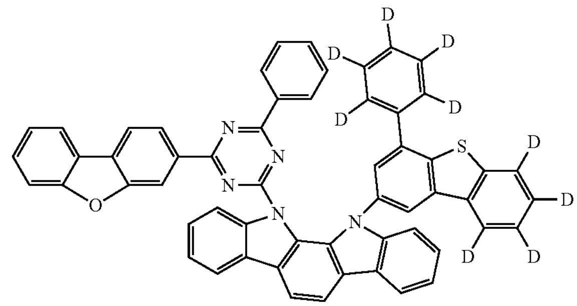
C46
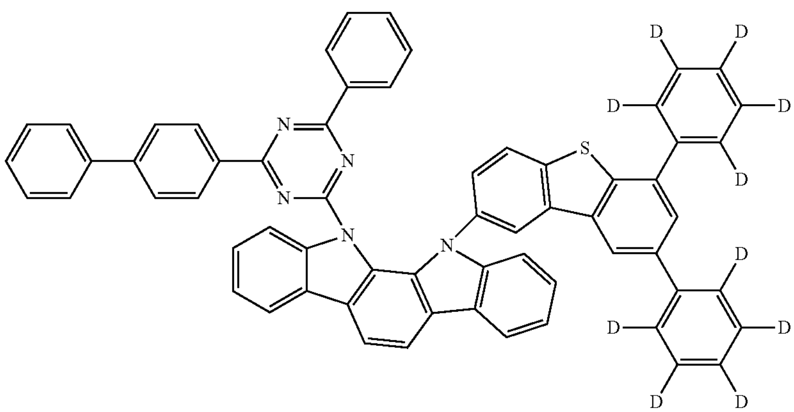
C47
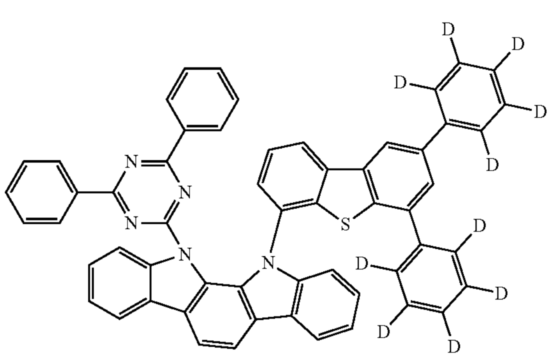
C48
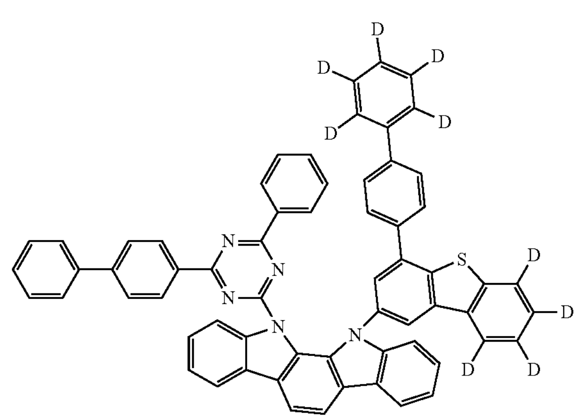

-continued

C49

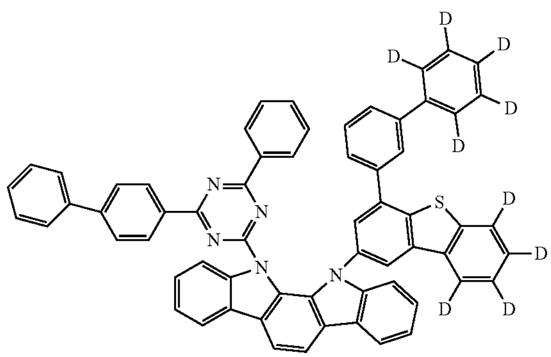

C50

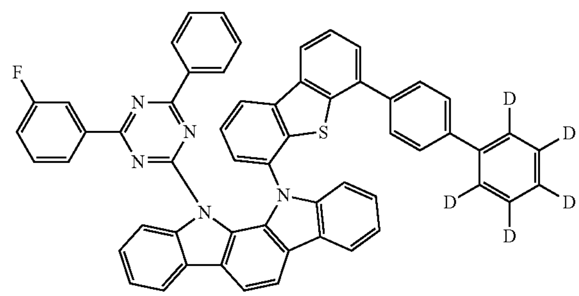

C51

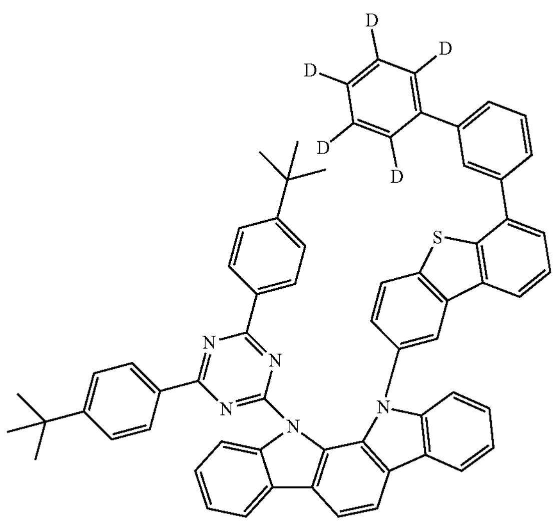

C52

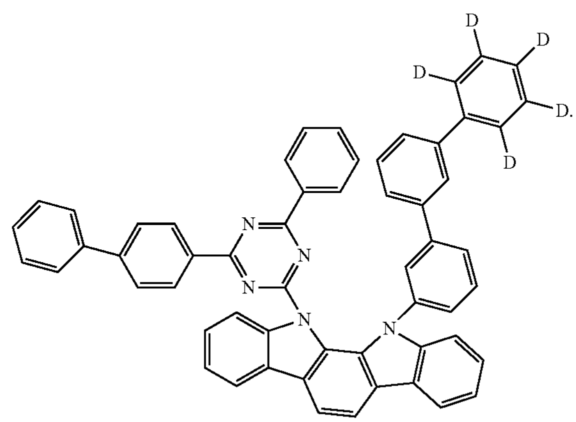

4. The organic electroluminescent device according to claim 1, wherein in the second compound, $Ar_4$ and $Ar_5$ are each independently selected from substituted or unsubstituted phenyl, substituted or unsubstituted naphthyl, substituted or unsubstituted biphenyl, substituted or unsubstituted terphenyl, substituted or unsubstituted phenanthryl, substituted or unsubstituted fluorenyl, substituted or unsubstituted dibenzofuranyl, substituted or unsubstituted carbazolyl, or substituted or unsubstituted dibenzothienyl wherein substituents in $Ar_4$ and $Ar_5$ are the same or different, and are each independently selected from deuterium, fluorine, cyano, methyl, ethyl, n-propyl, isopropyl, tert-butyl, phenyl, or naphthyl.

5. The organic electroluminescent device according to claim 1, wherein in the second compound, $R_{13}$, $R_{14}$, and $R_{15}$ are all deuterium; or $R_6$, $R_{11}$, and $R_{12}$ are all deuterium;

or, in the second compound, $R_6$, $R_7$, $R_8$, $R_9$, $R_{10}$, $R_{11}$, and $R_{12}$ are all deuterium.

6. The organic electroluminescent device according to claim 1, wherein the second compound is selected from the group consisting of:

1

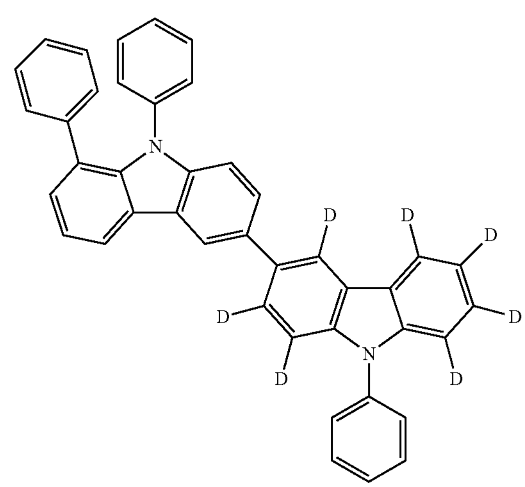

-continued
4
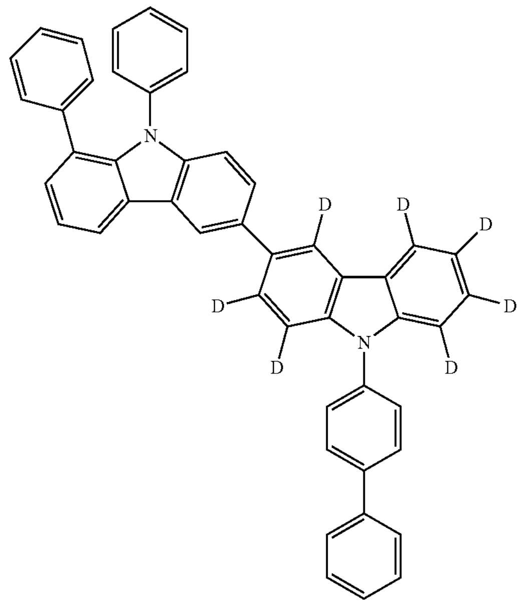
6
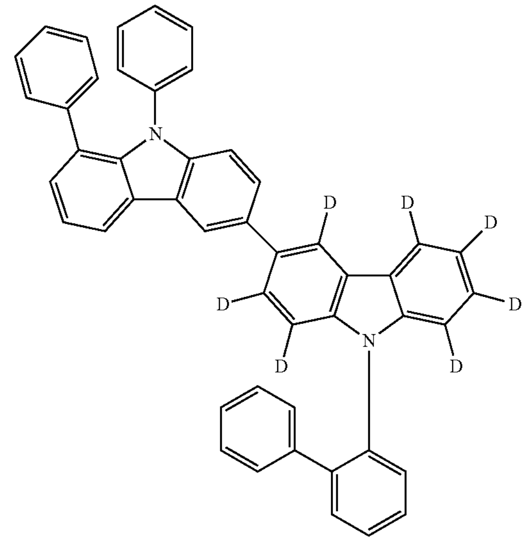
5
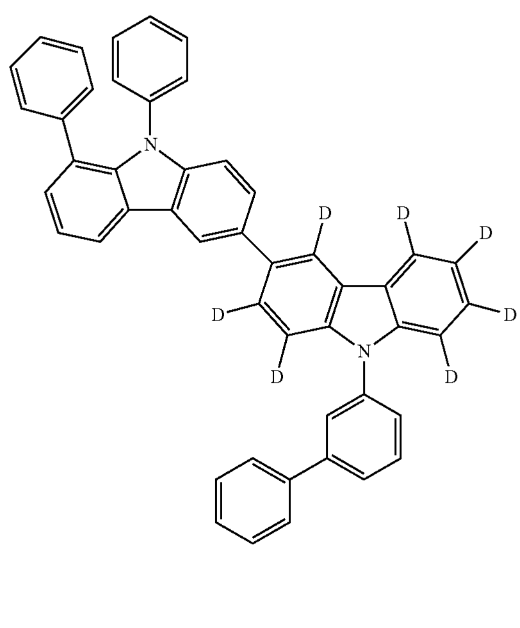
7
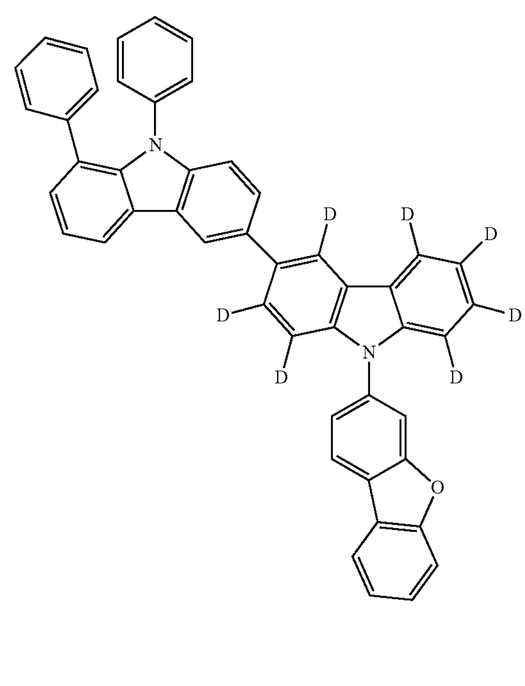

8
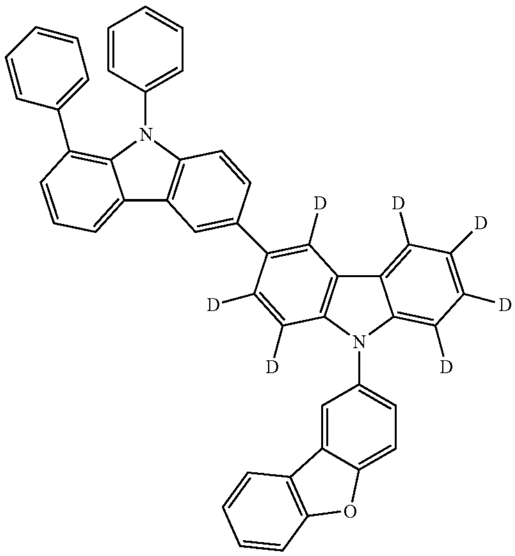
9
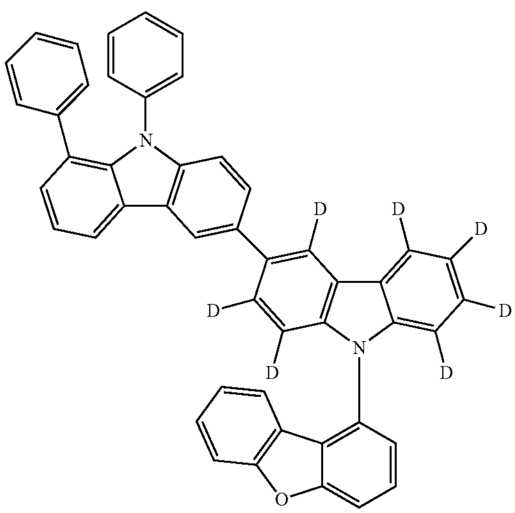
10
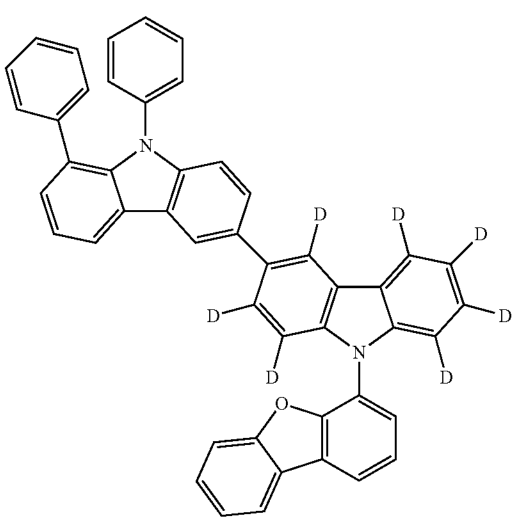
11
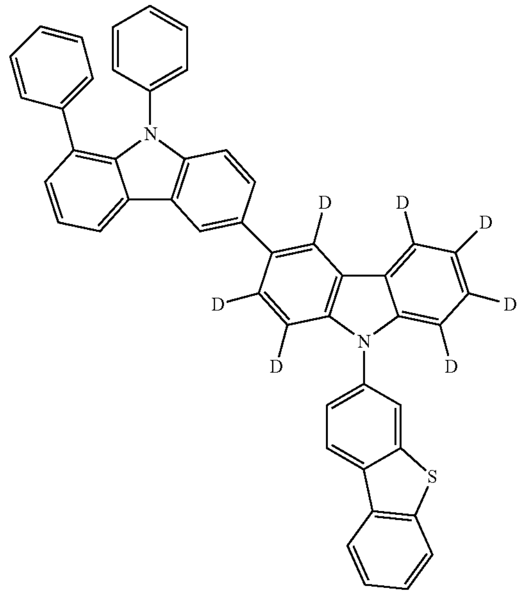
12
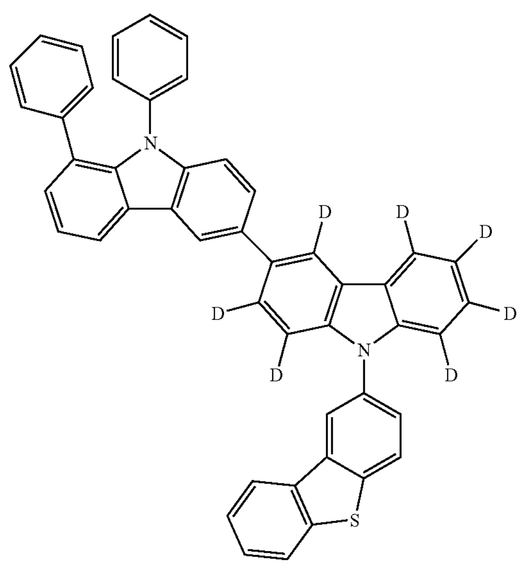

-continued
13
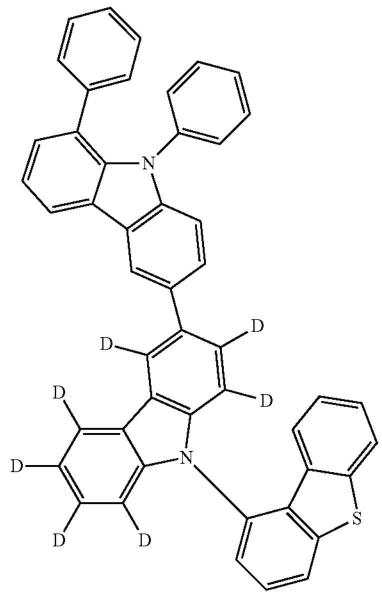
14
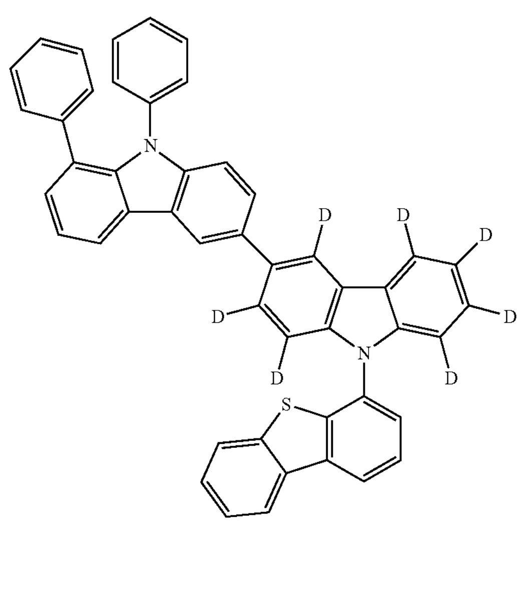
-continued
15
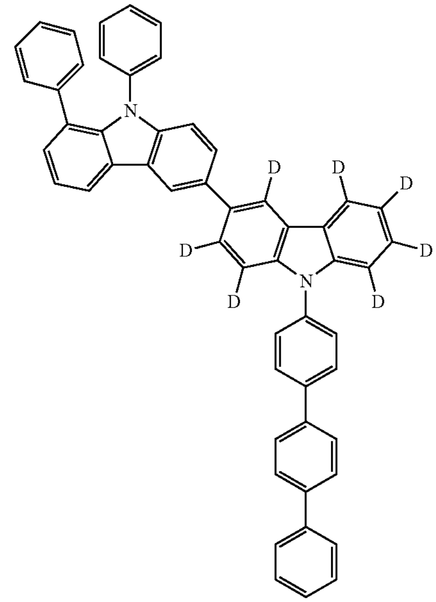
16
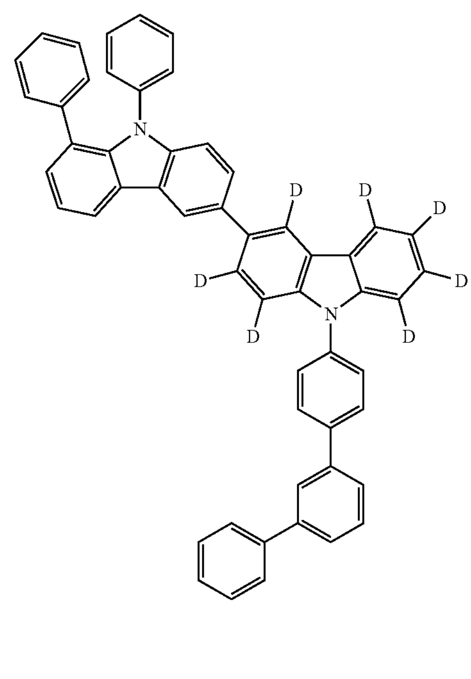

-continued
17
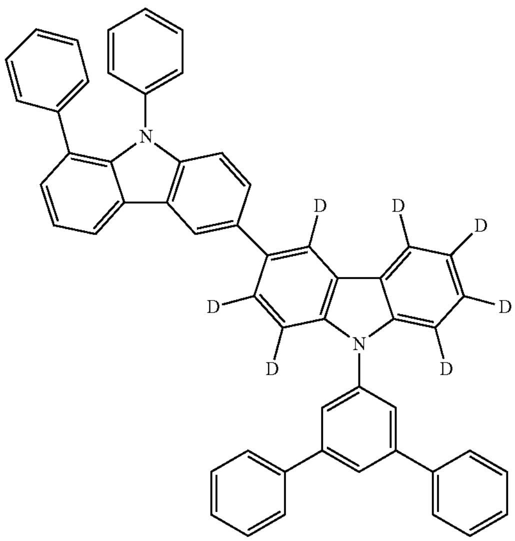
19
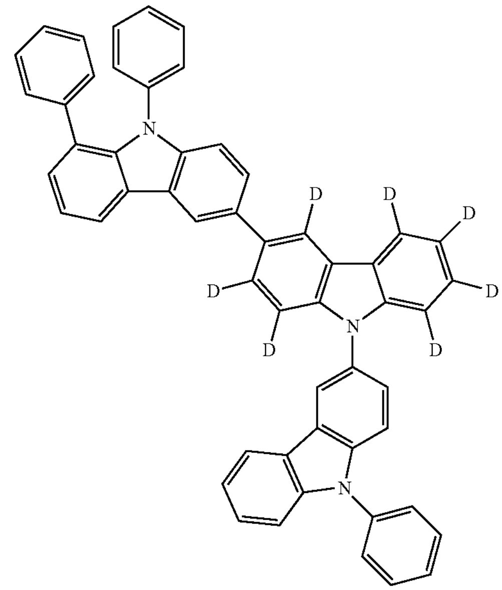
18
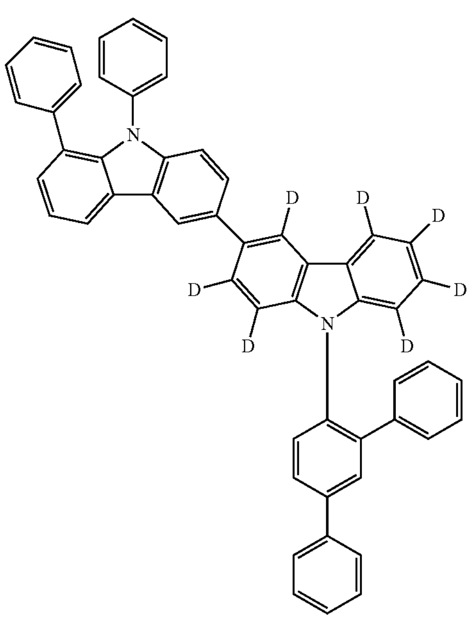
21
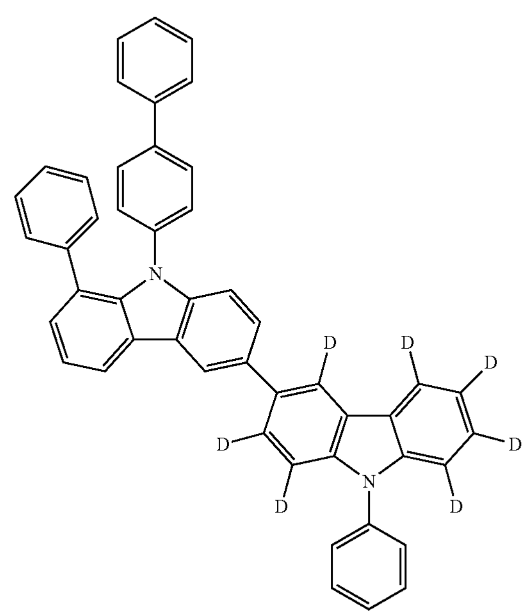

-continued
22
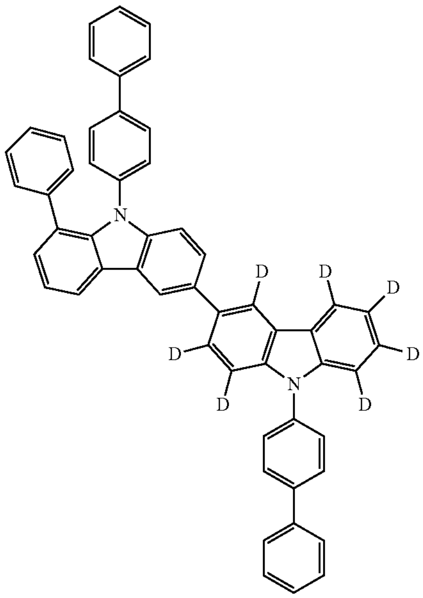
23
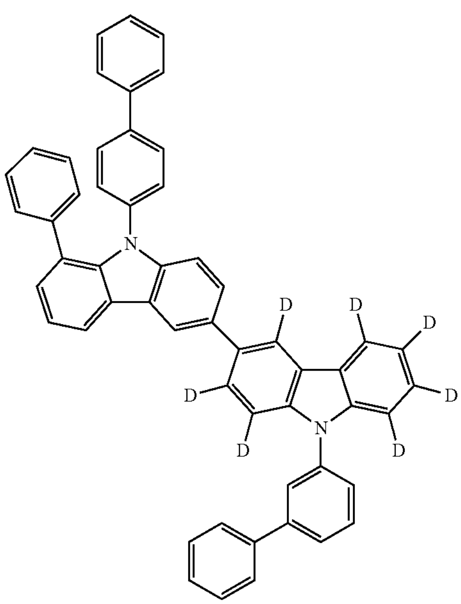
-continued
24
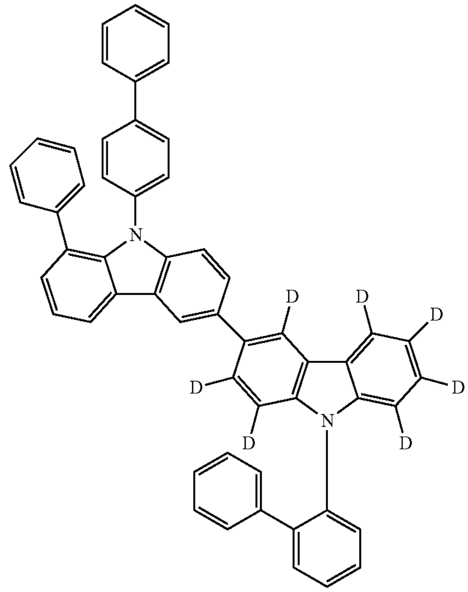
25
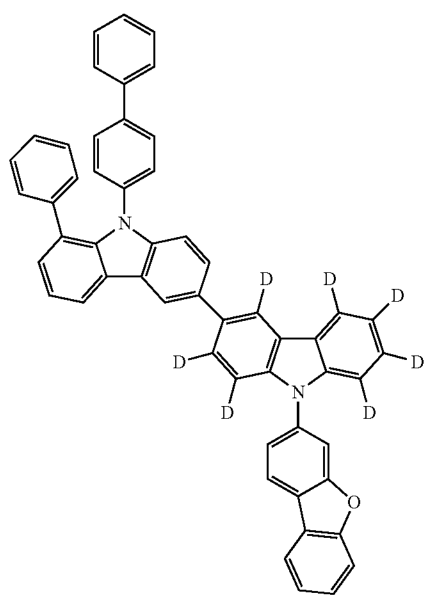

-continued
26
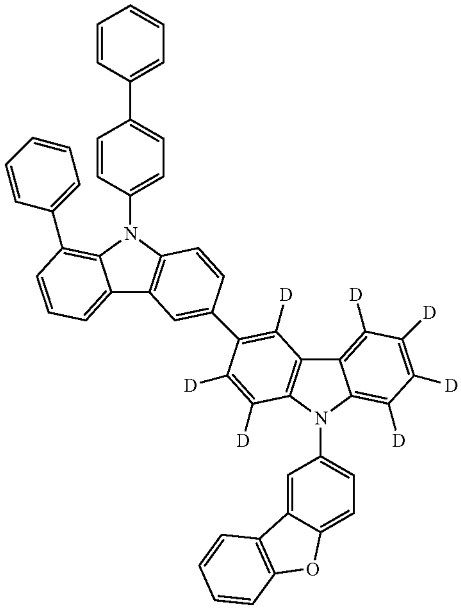
27
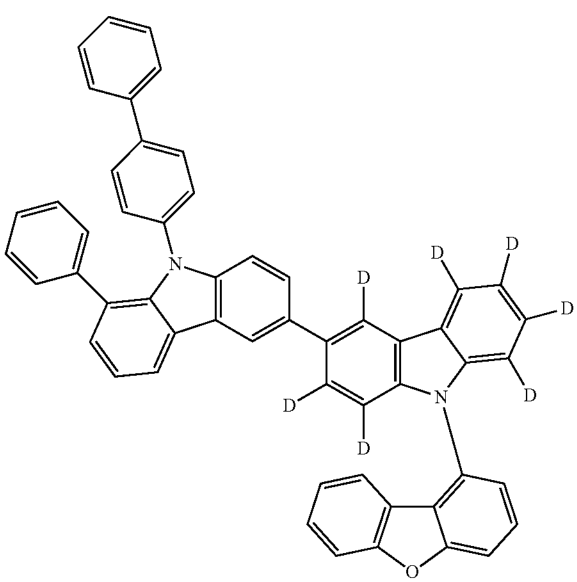
-continued
28
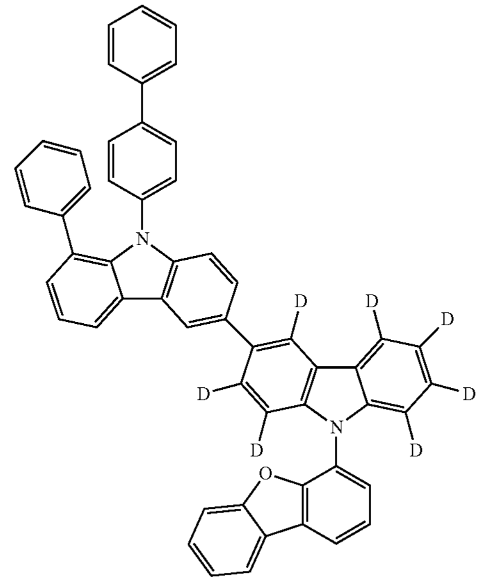
29
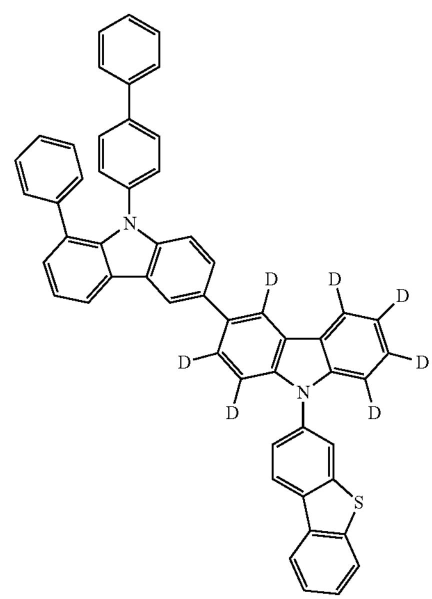

-continued
30
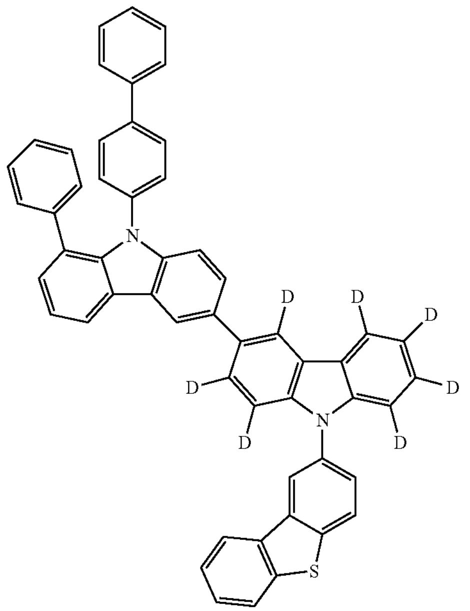
31
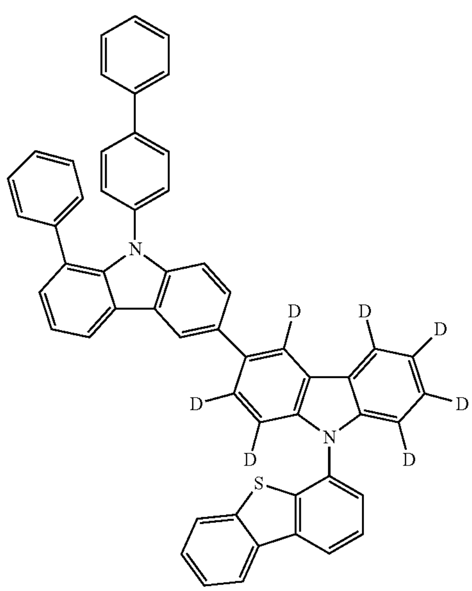
-continued
34
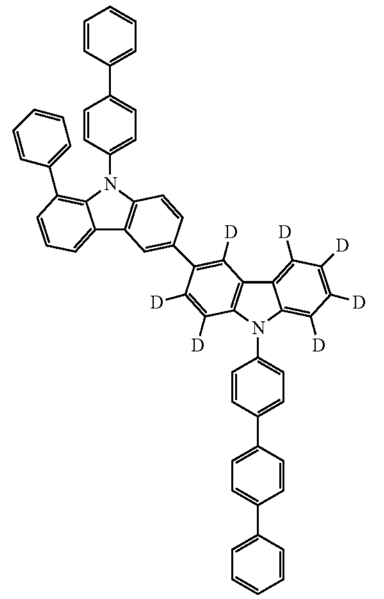
35
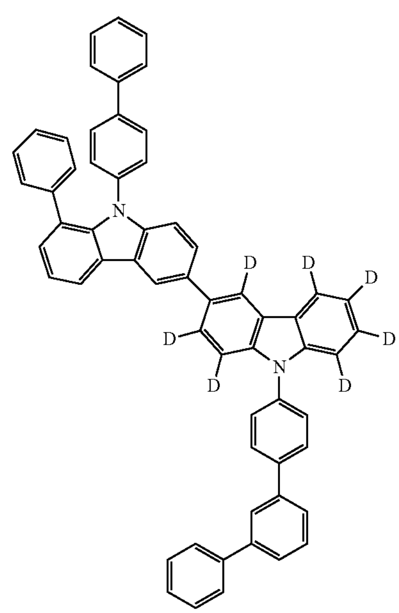

-continued
36
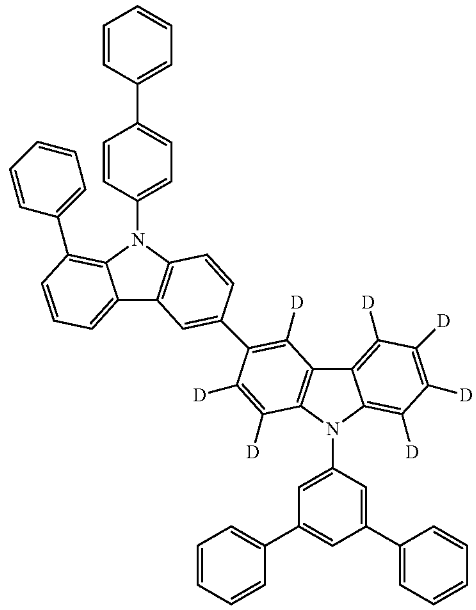
37
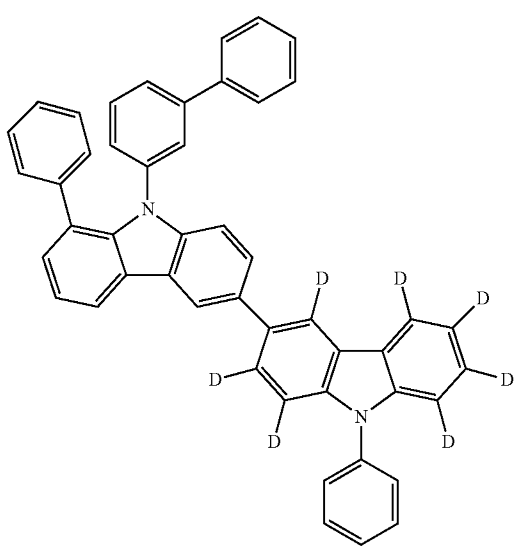
-continued
39
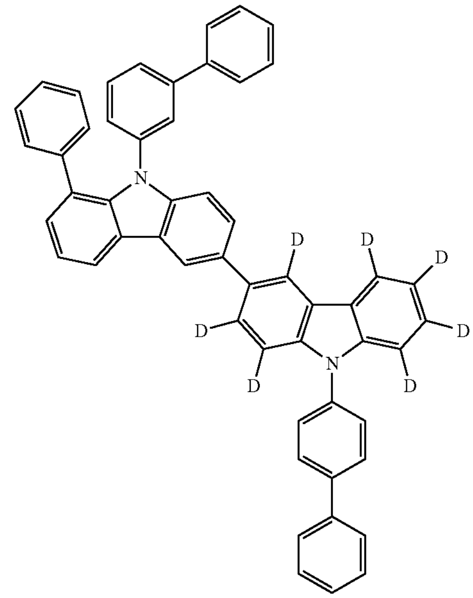
40
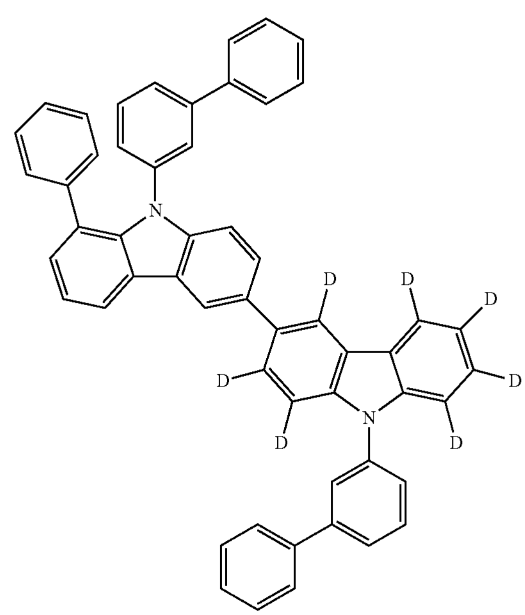

-continued
41
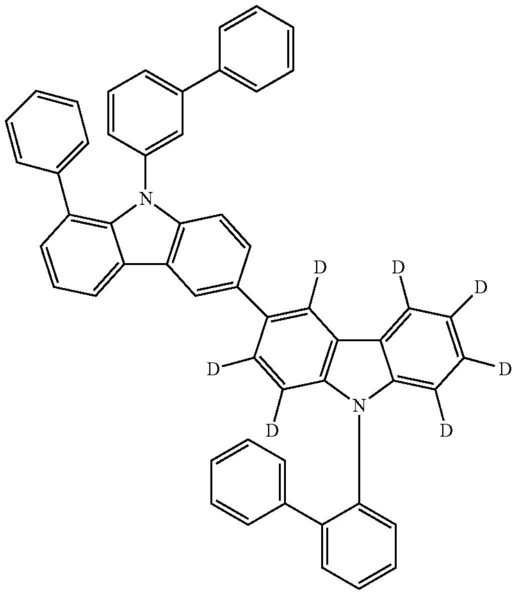
42
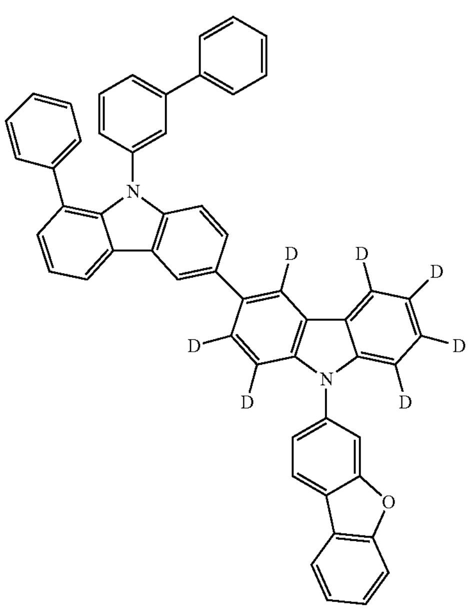
-continued
43
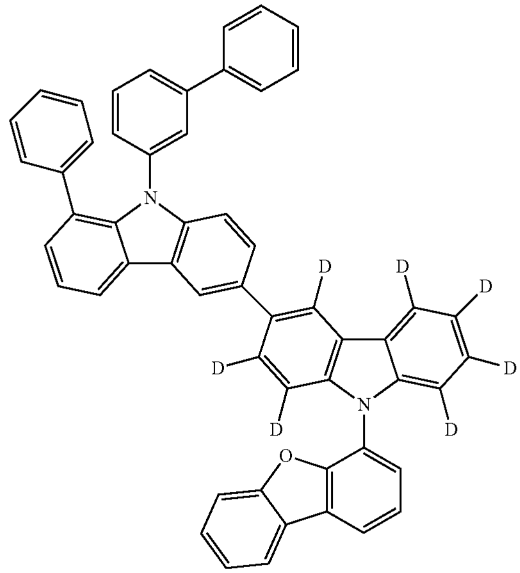
44
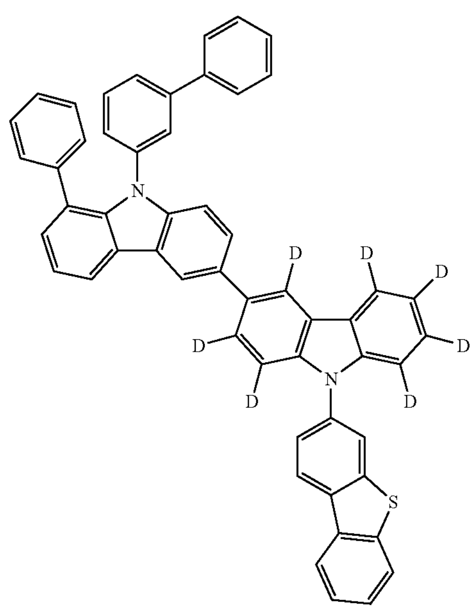

-continued
45
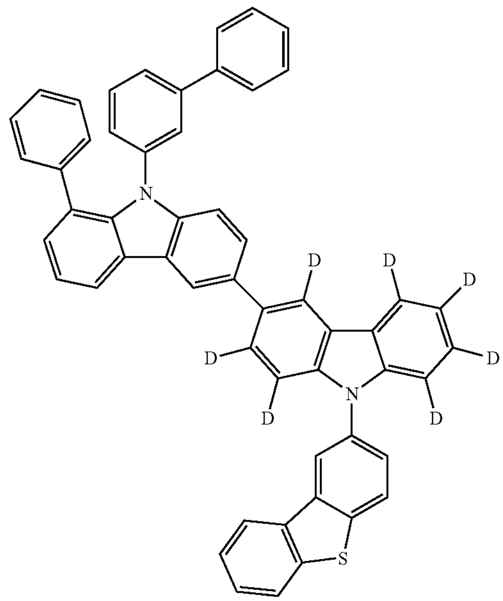
47
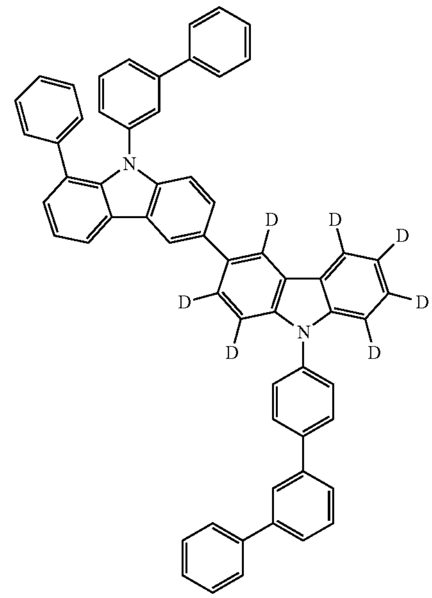
46
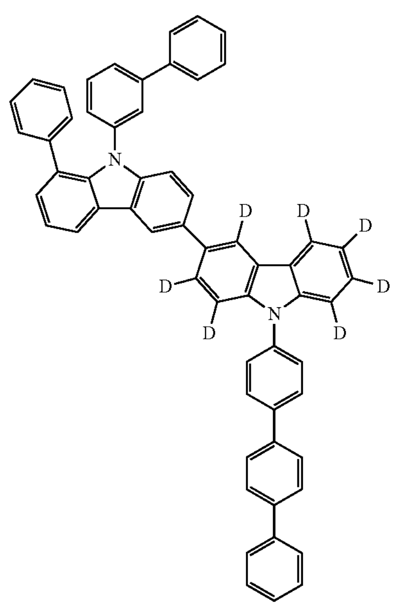
48
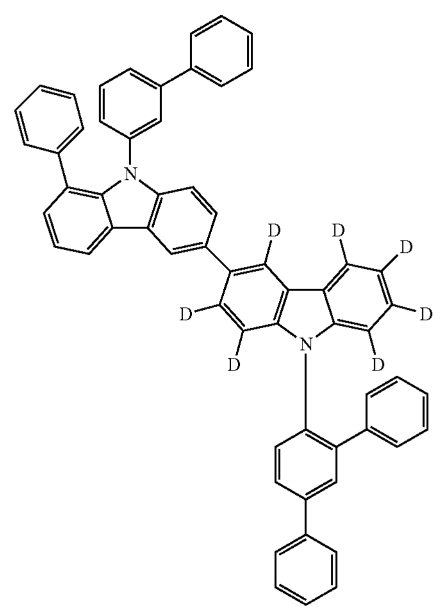

-continued
49
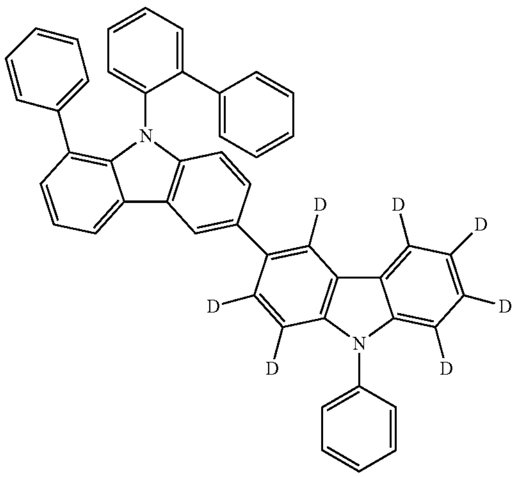
51
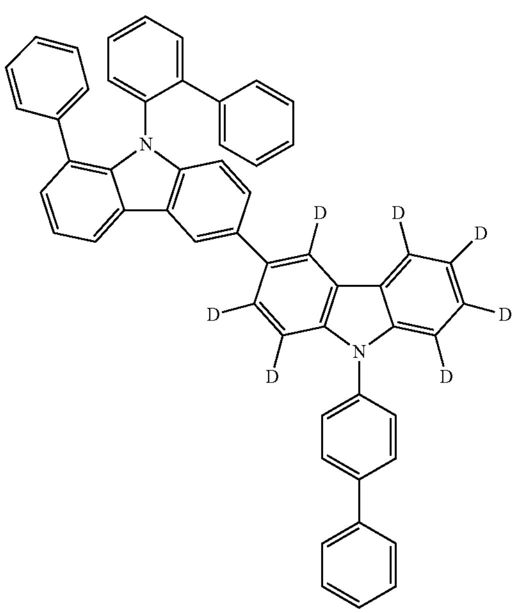
-continued
52
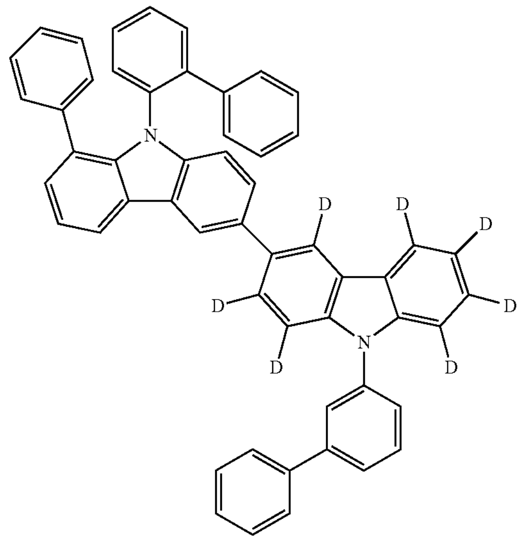
53
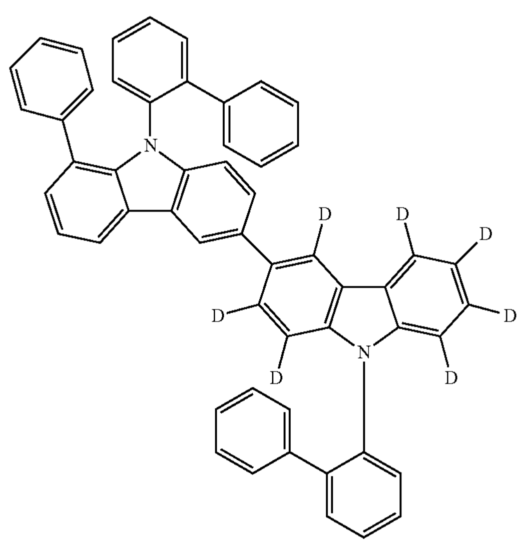

-continued
54
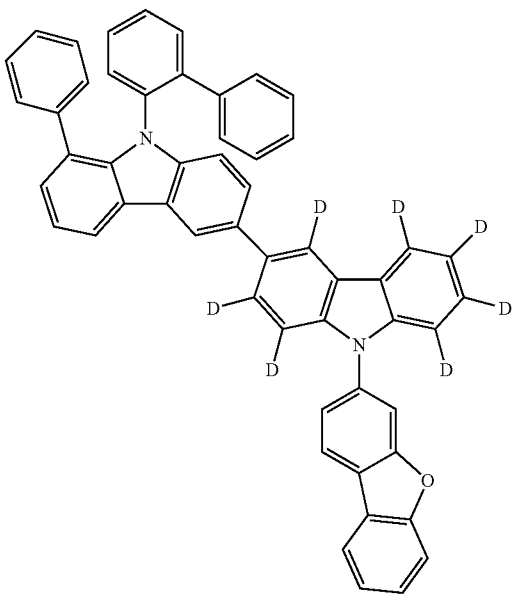
55
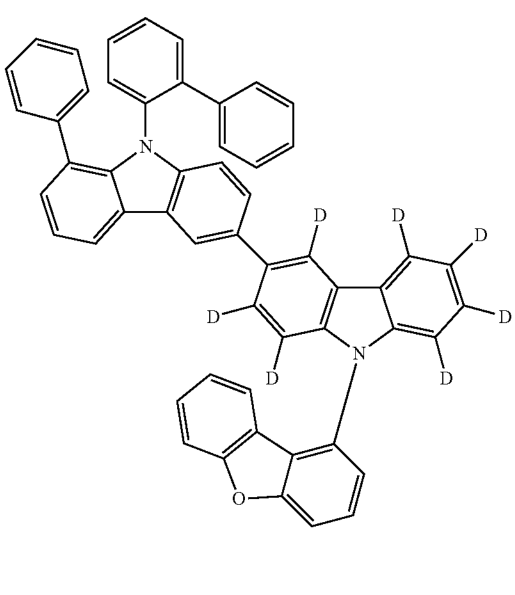
-continued
56
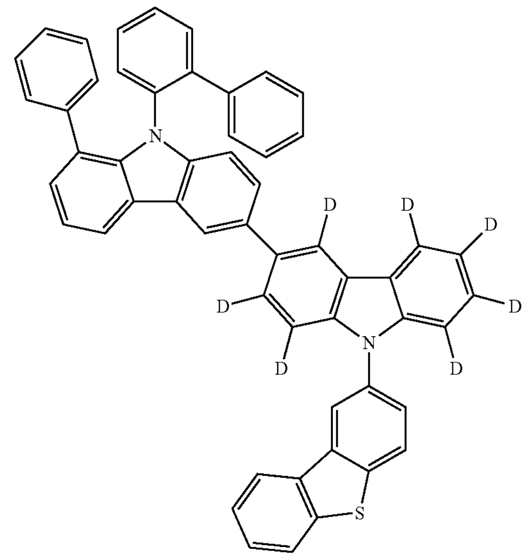
57
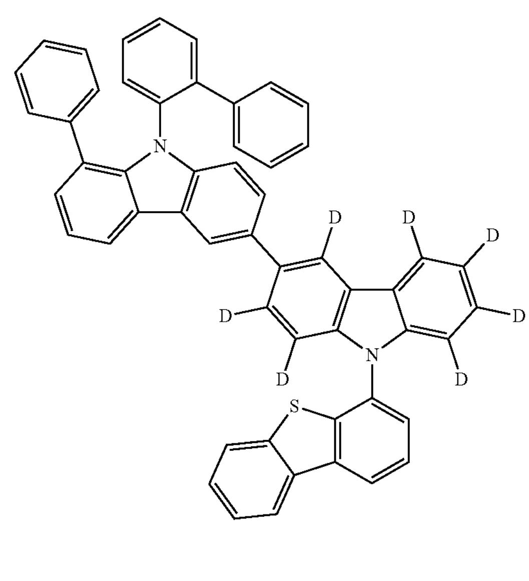

59
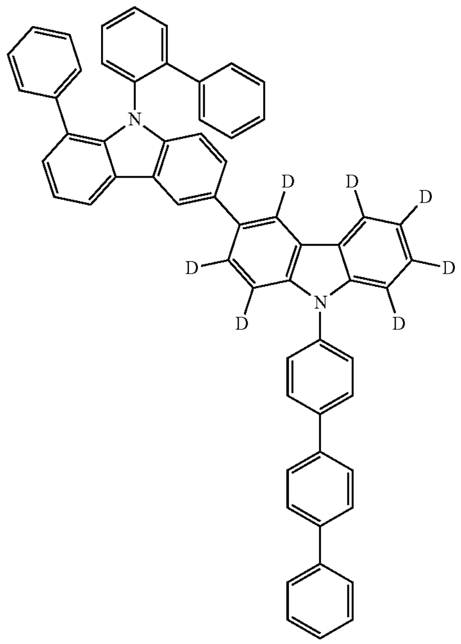
60
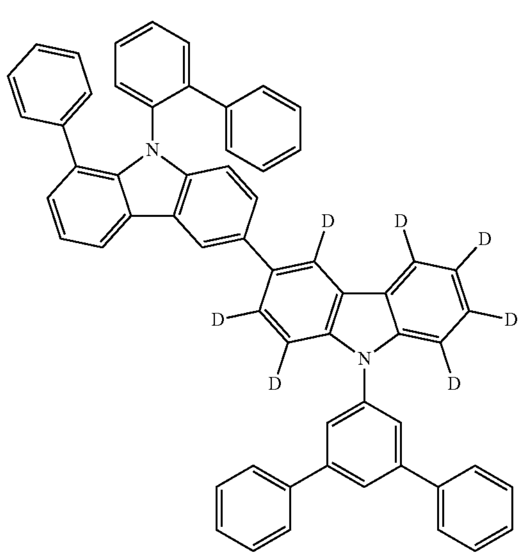
61
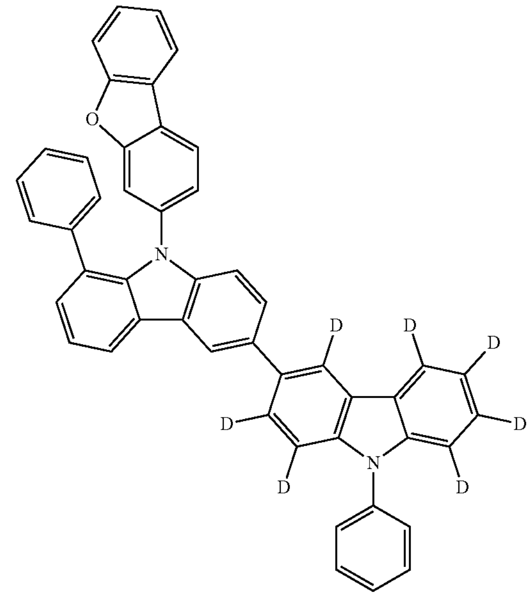
62
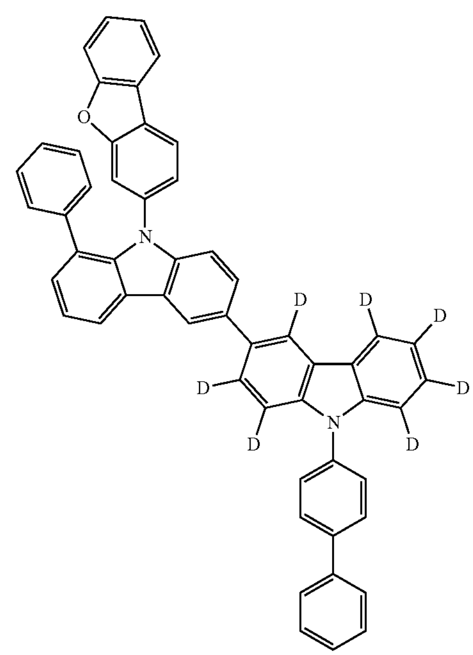

-continued
63
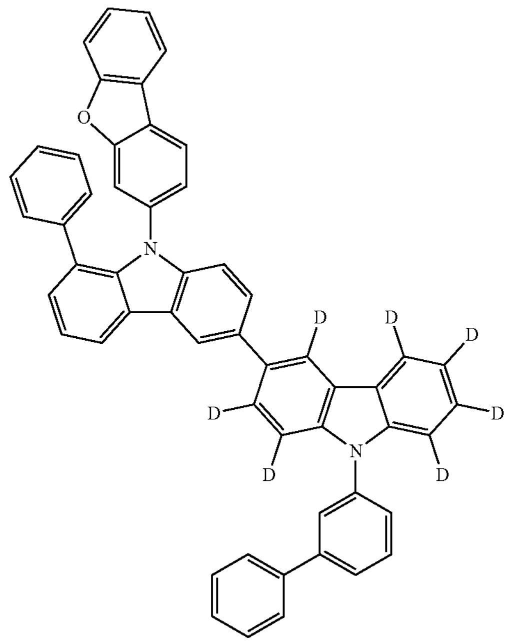
64
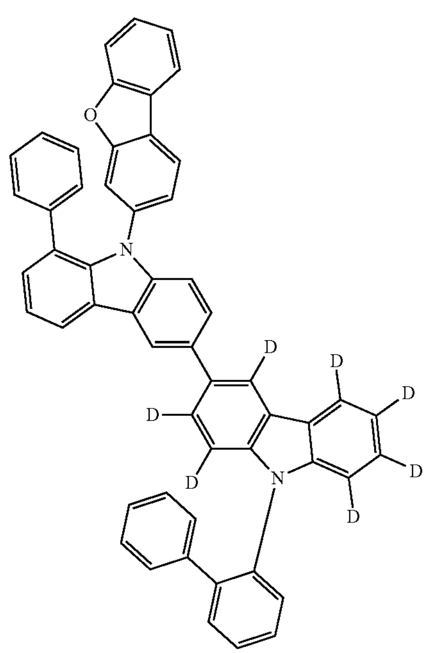
-continued
65
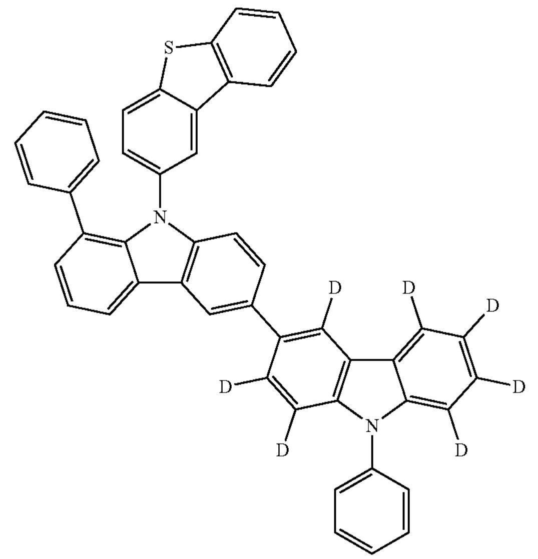
66
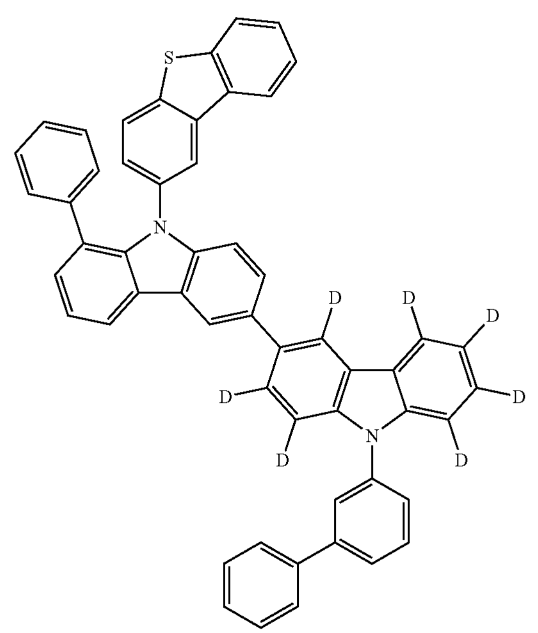

-continued
67
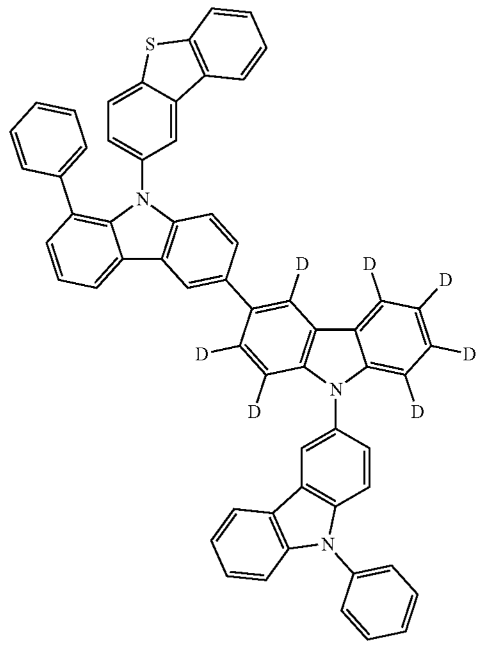
68
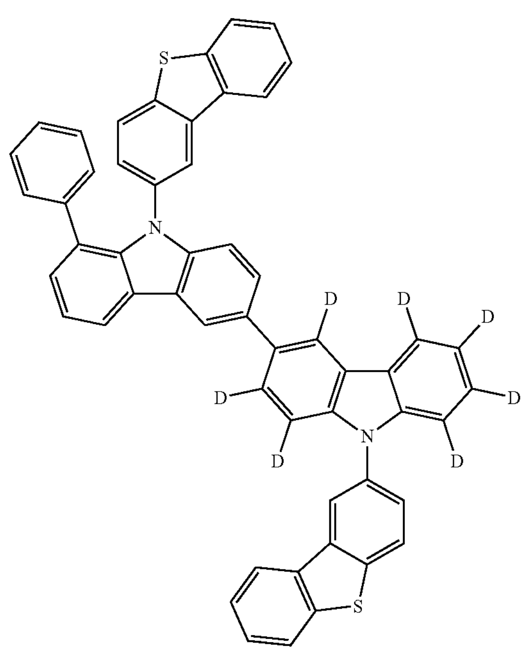
-continued
69
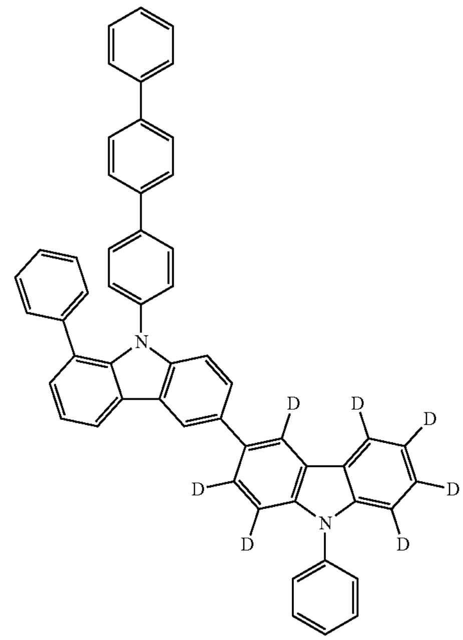
70
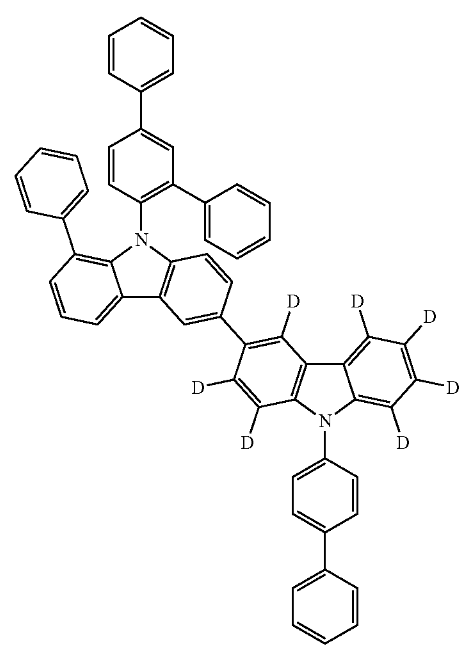

-continued
73
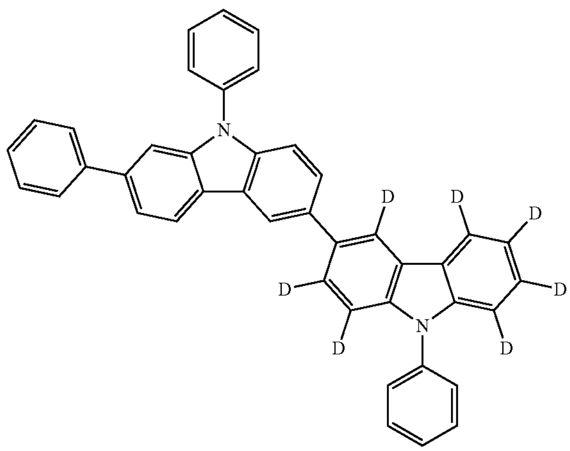
74
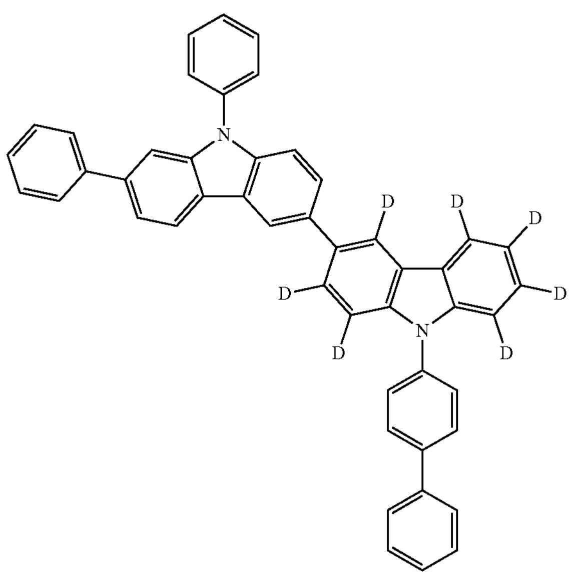
75
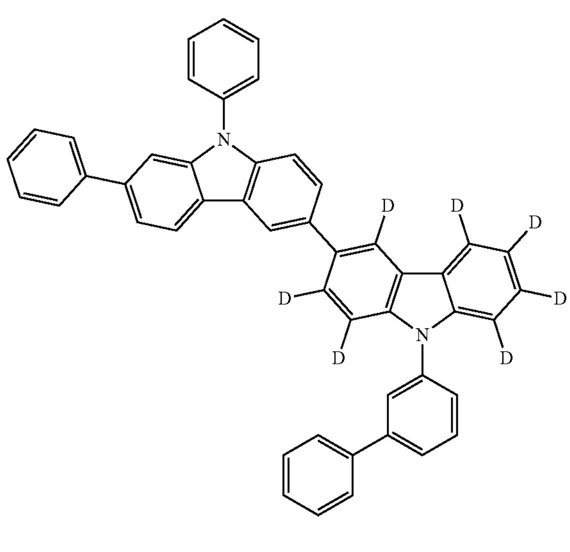
-continued
76
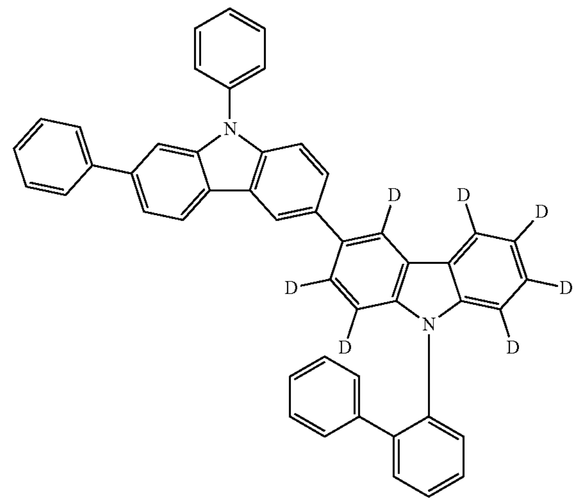
77
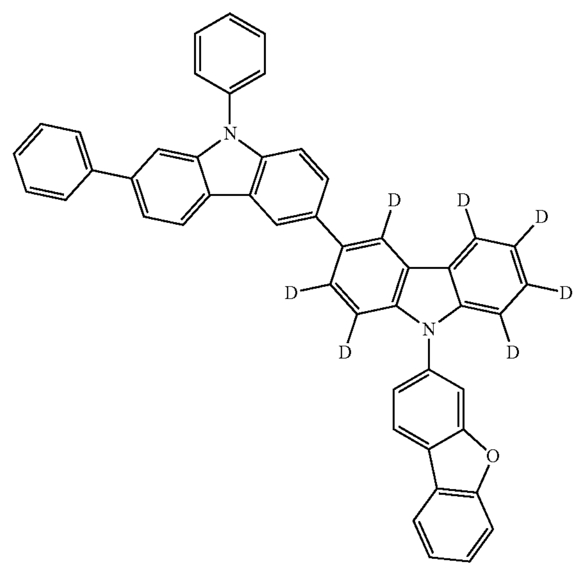
78
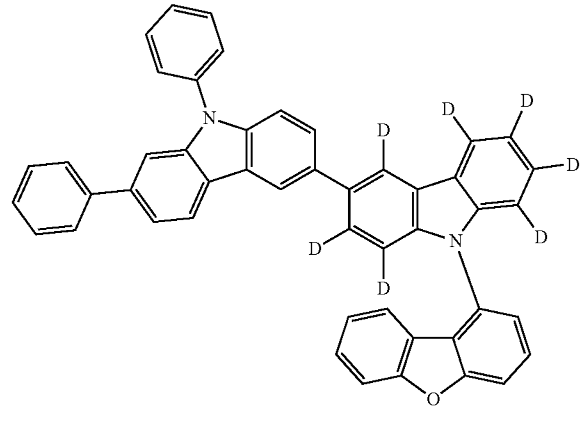

-continued
79
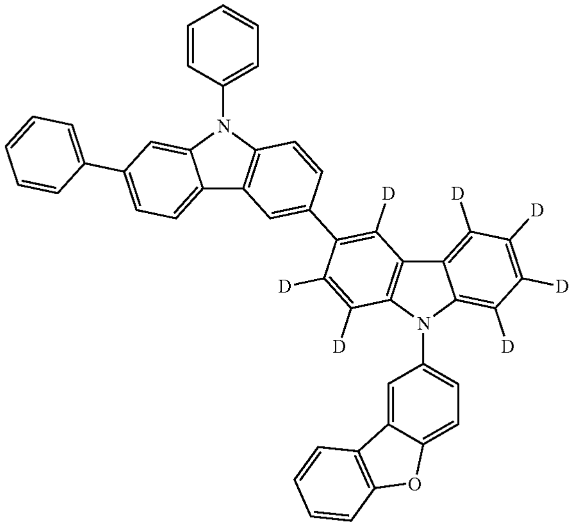
80
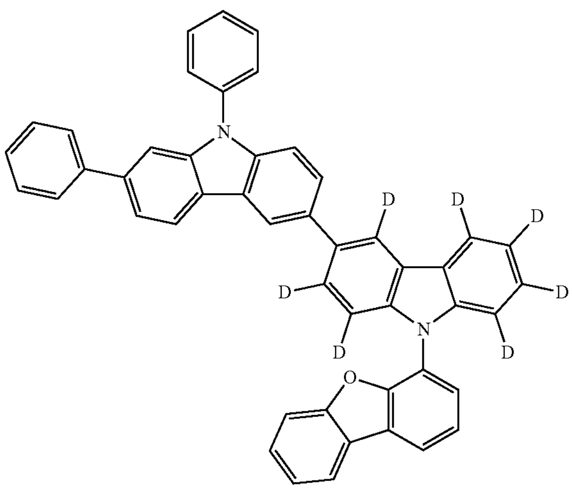
81
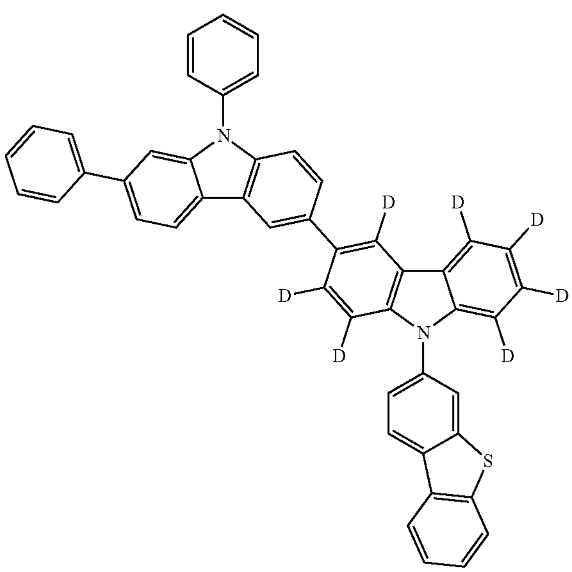
-continued
82
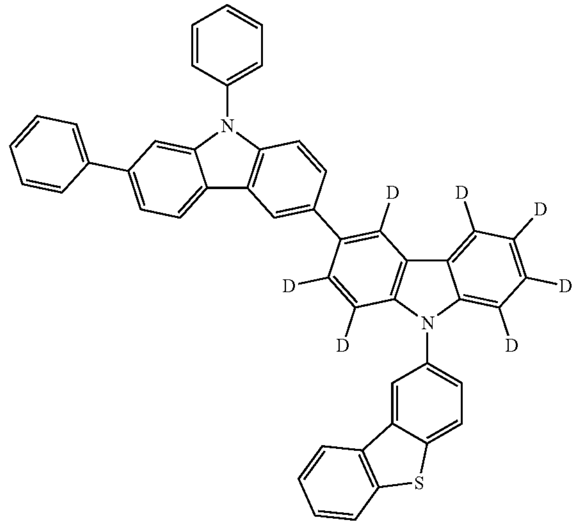
83
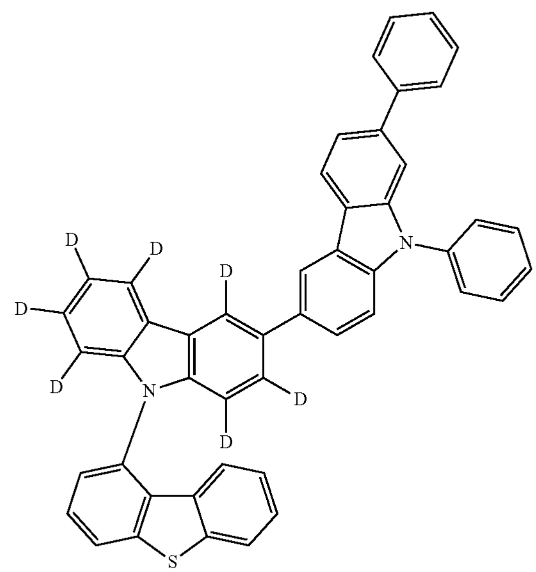
84
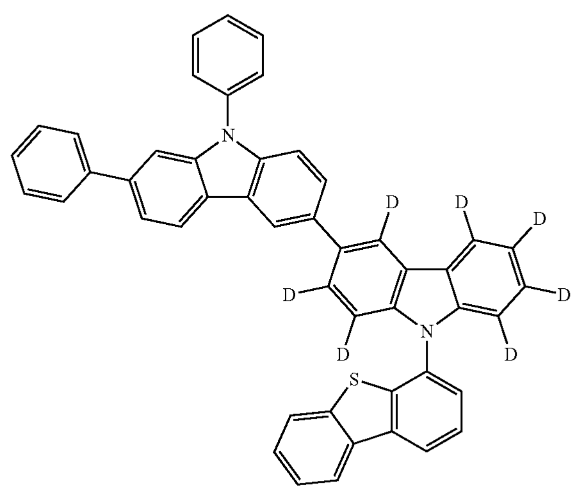

-continued
88
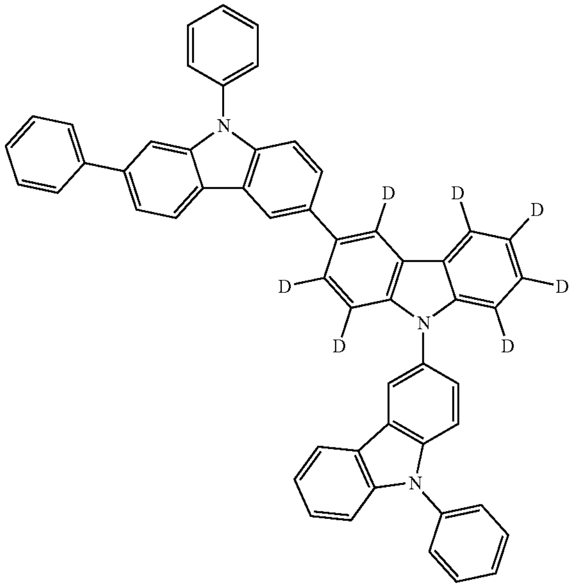
89
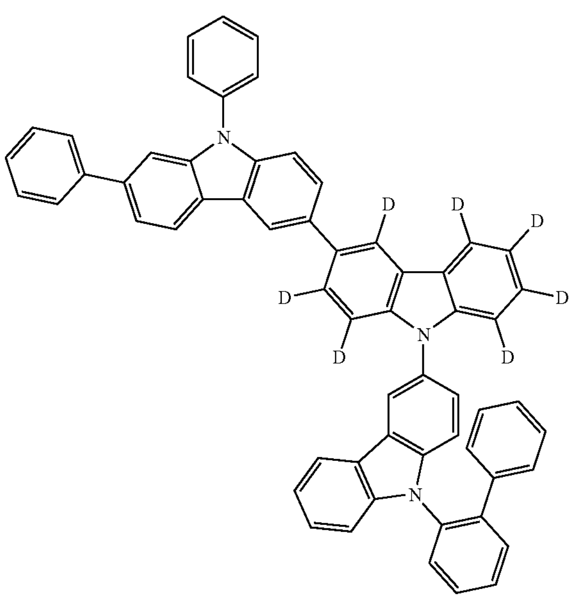
-continued
90
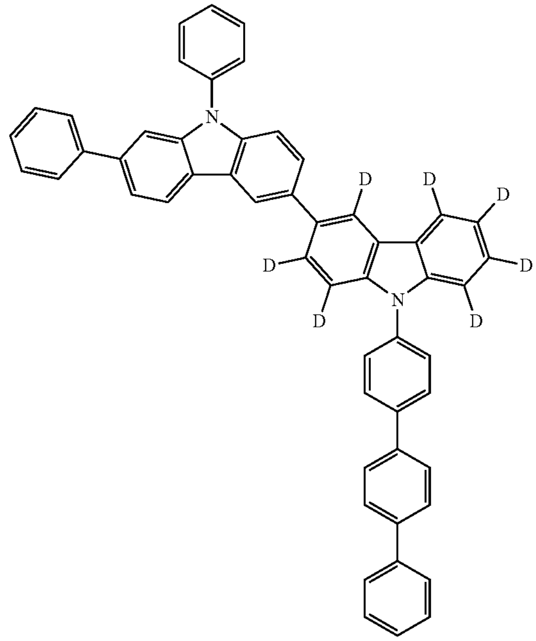
91
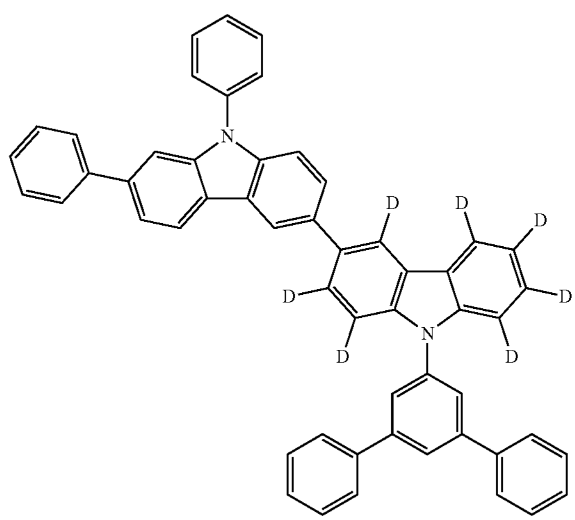

-continued
92
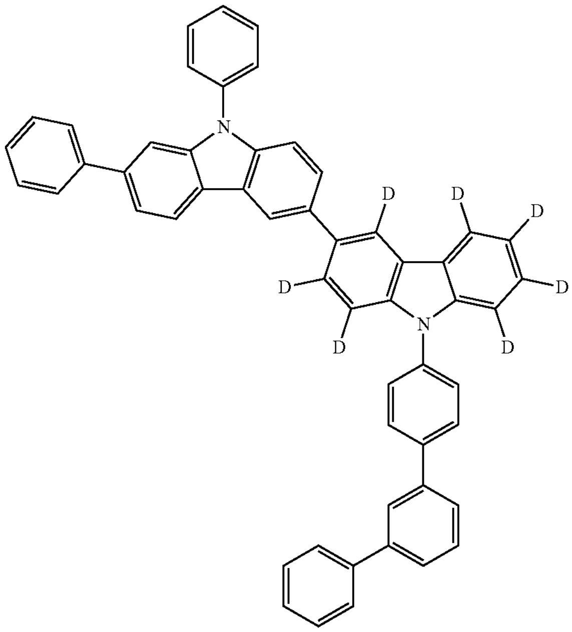
93
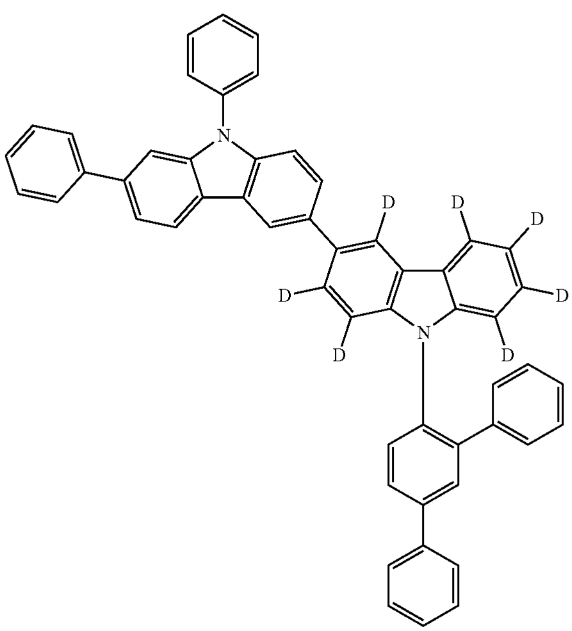
-continued
97
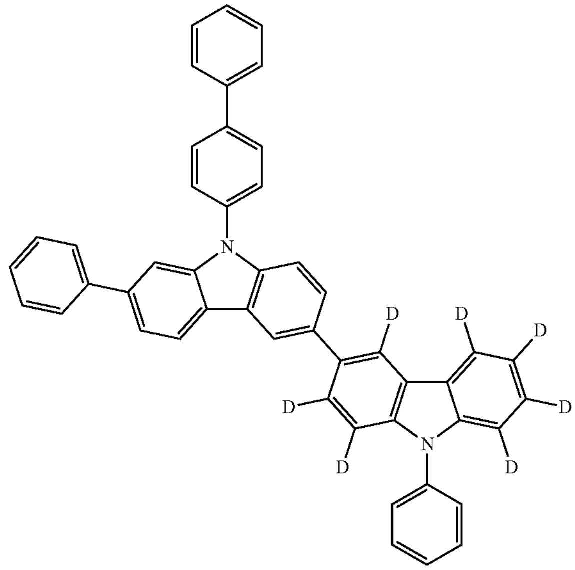
99
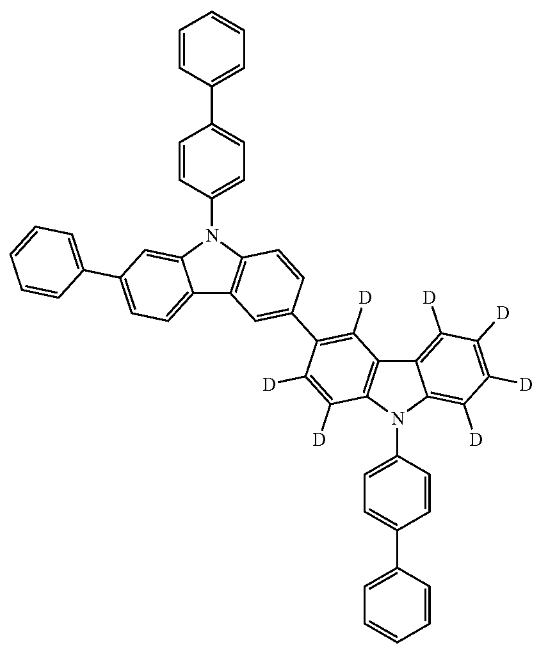

-continued
100
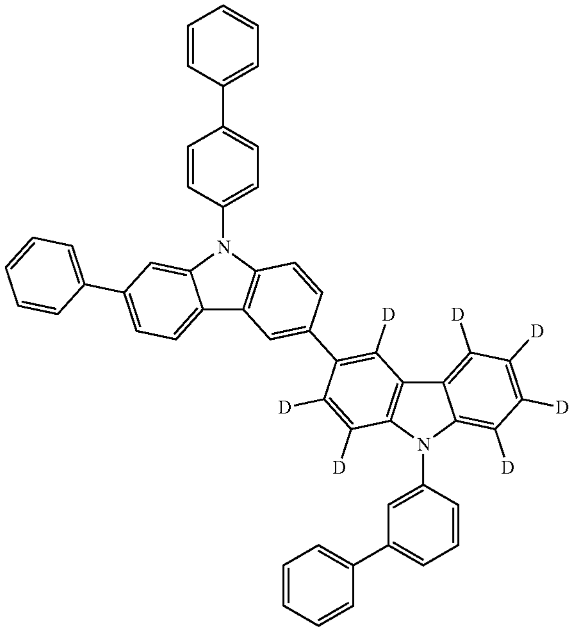
101
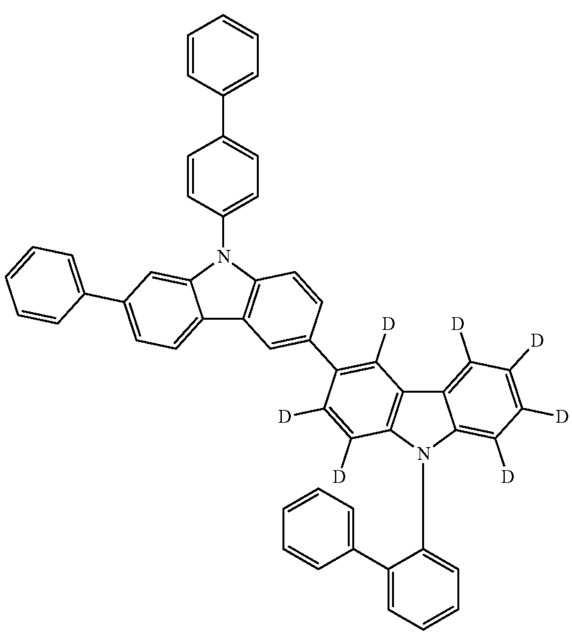
-continued
102
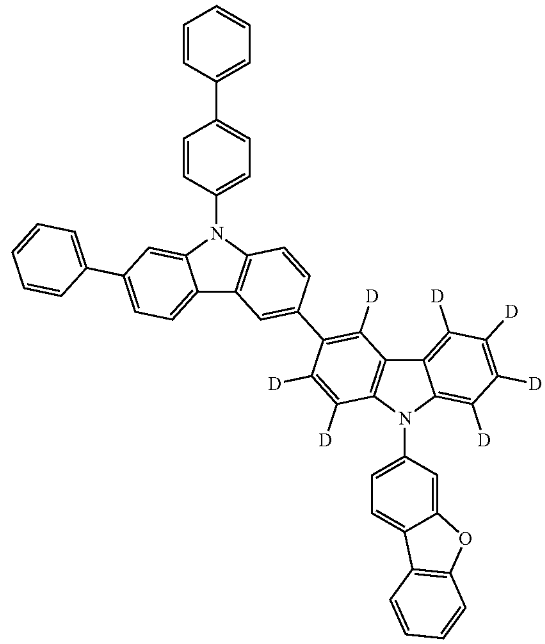
103
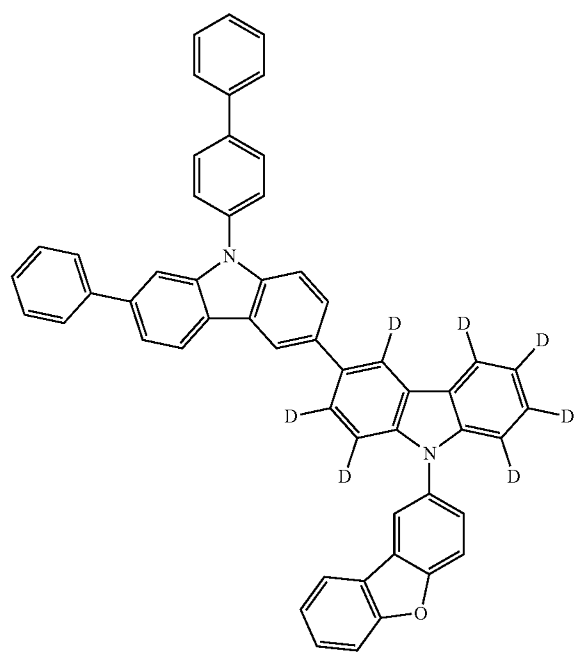

-continued
104
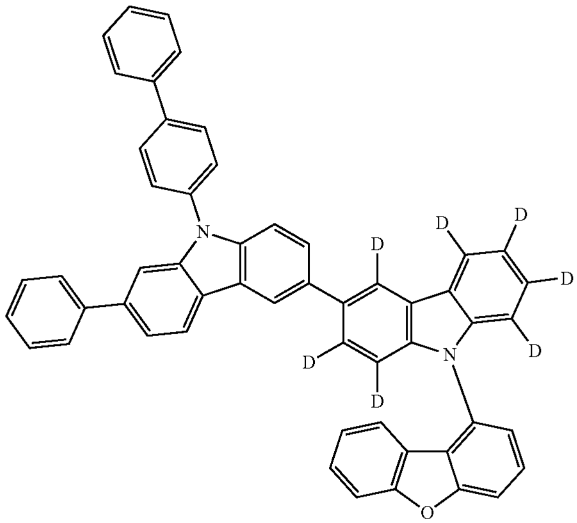
105
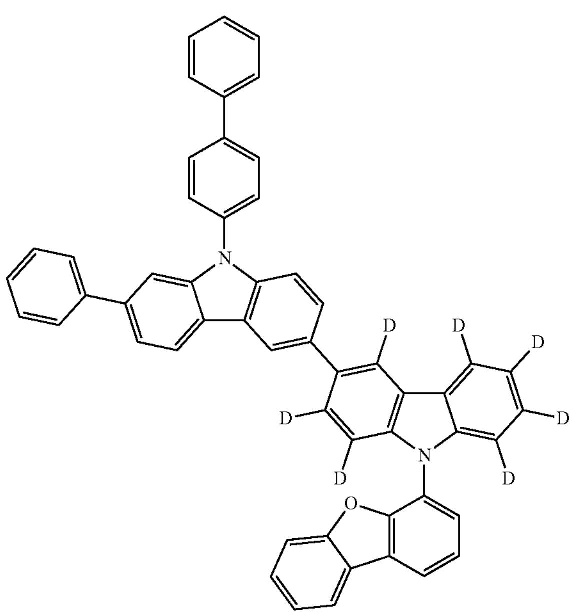
-continued
106
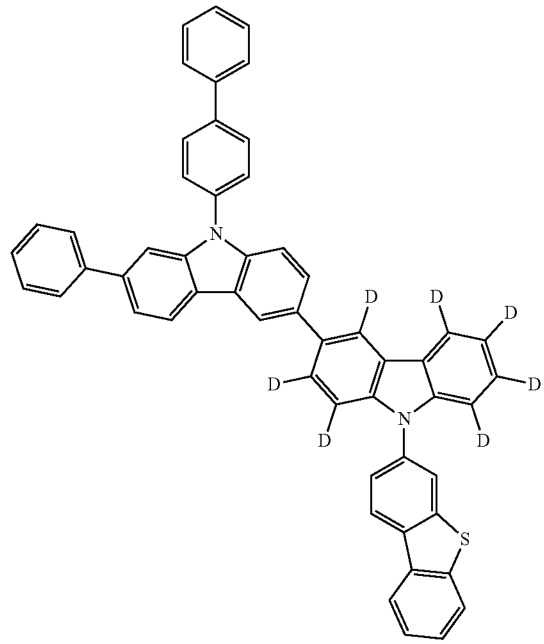
107
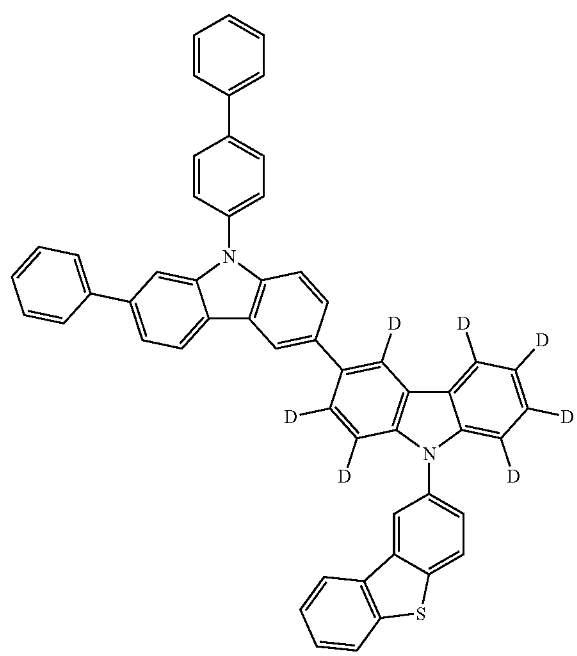

-continued
108
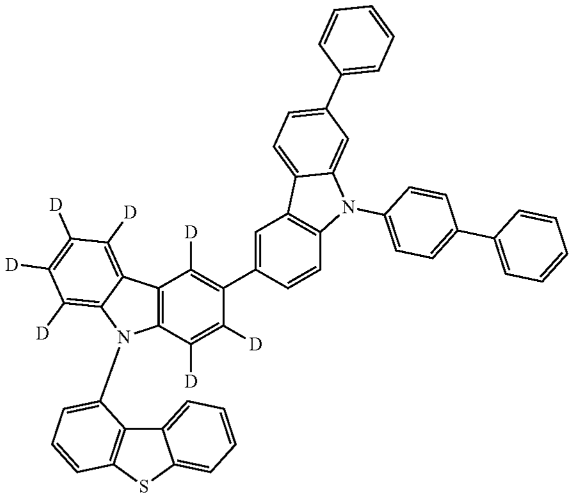
109
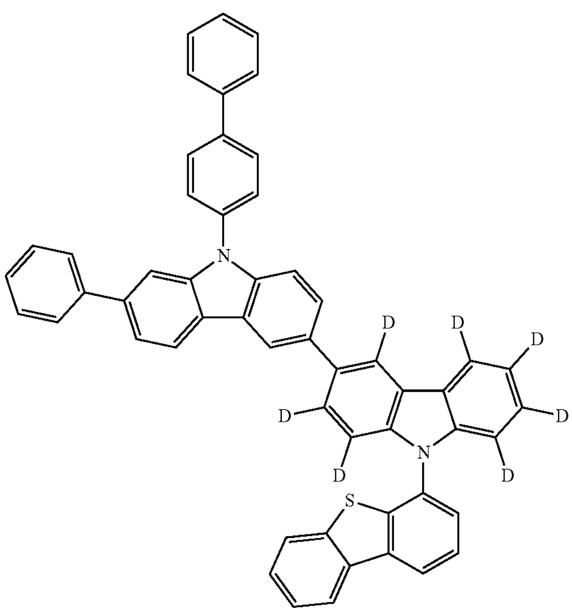
-continued
111
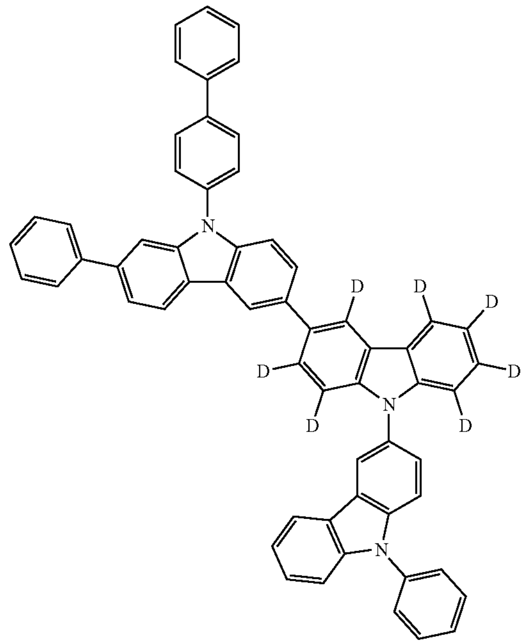
112
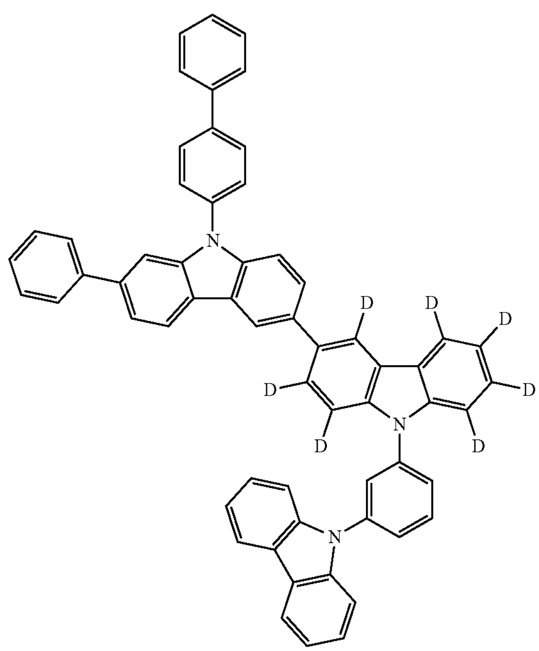

-continued
113
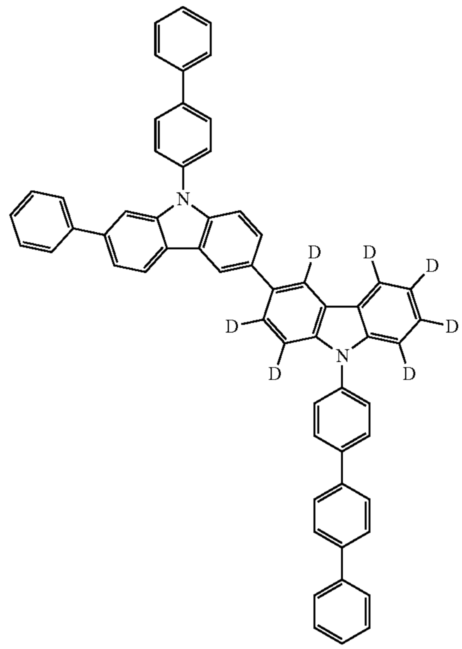
114
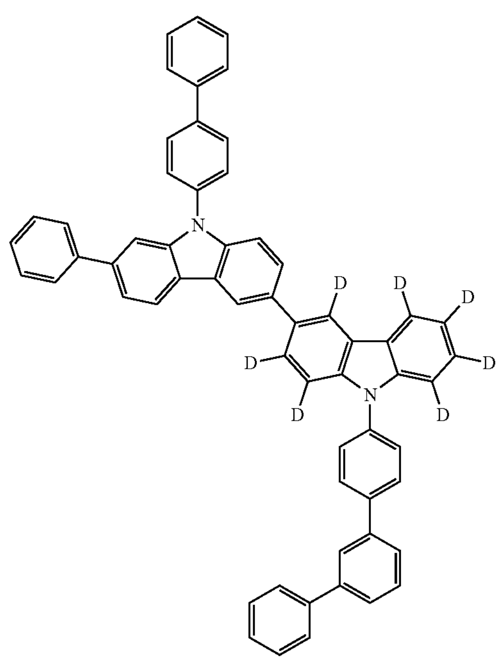
-continued
115
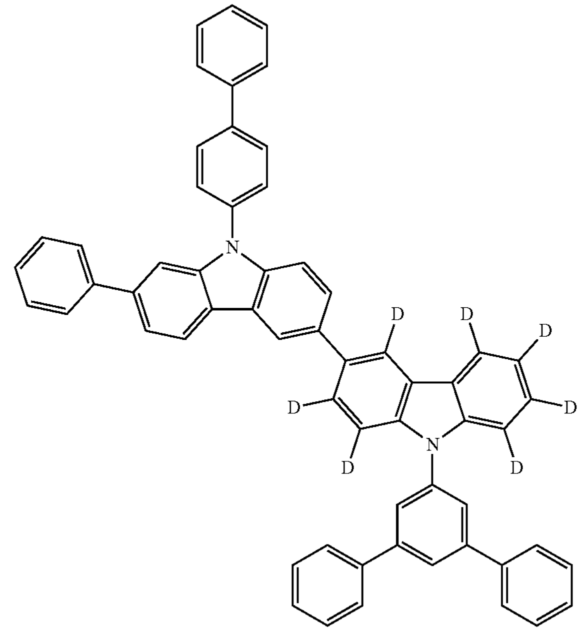
116
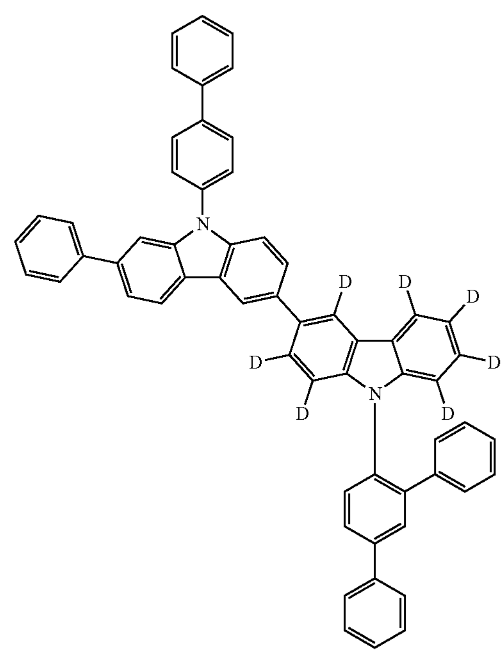

-continued
117
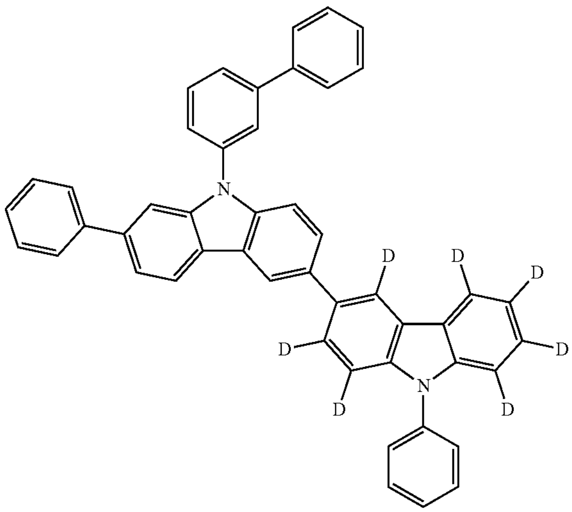
119
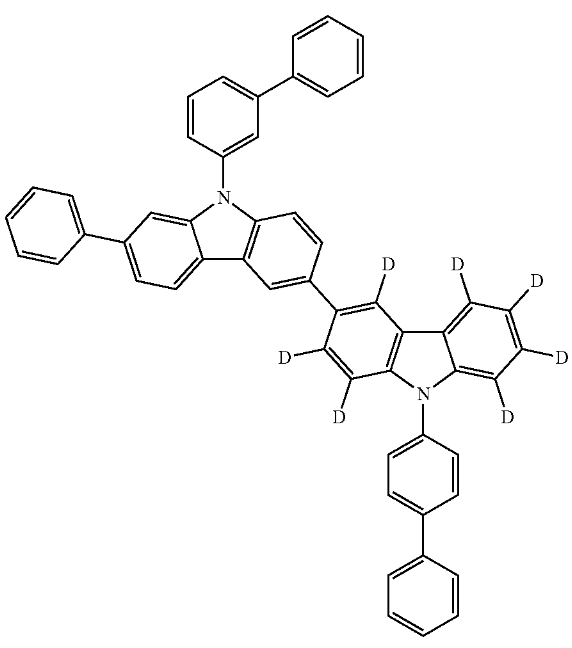
-continued
120
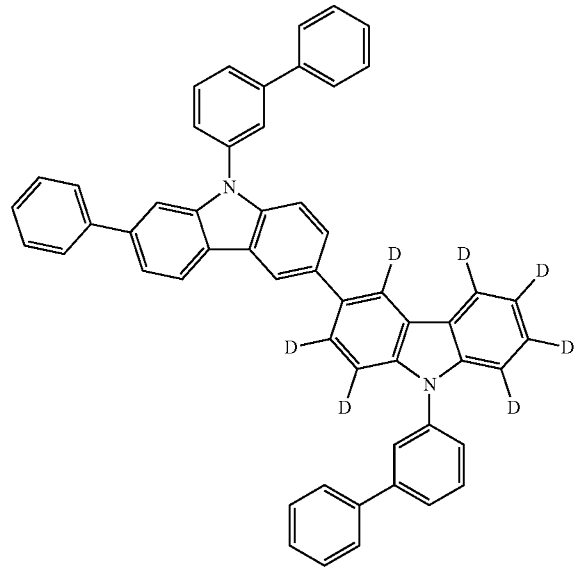
121
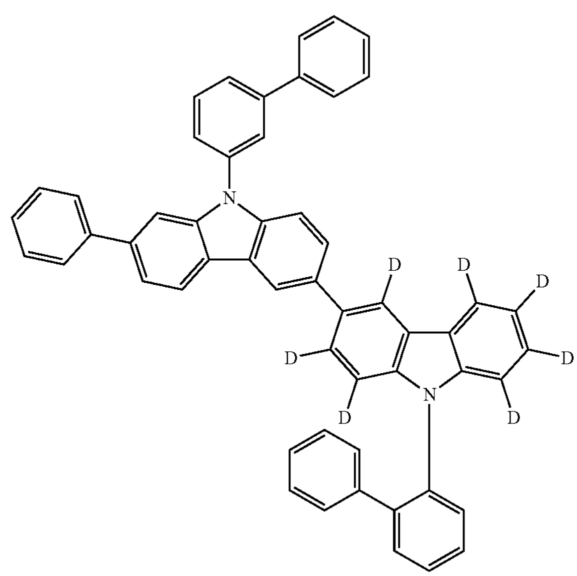

-continued
122
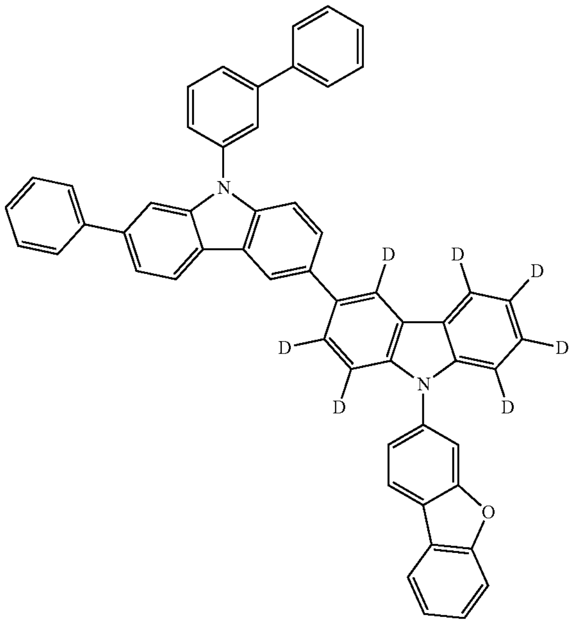
123
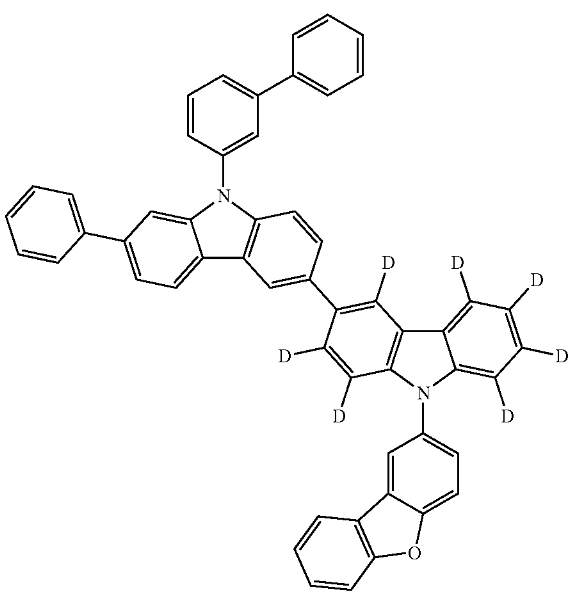
-continued
124
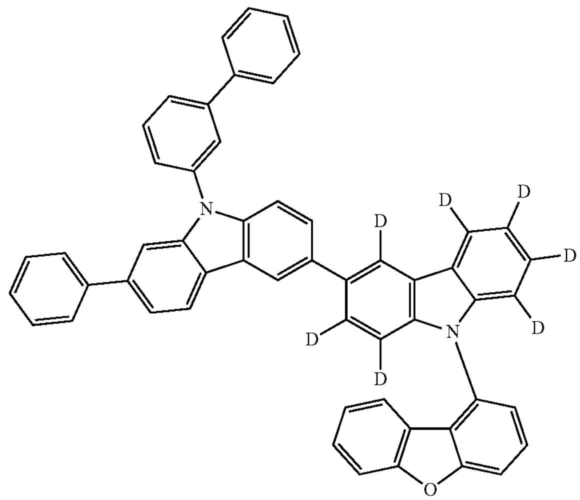
125
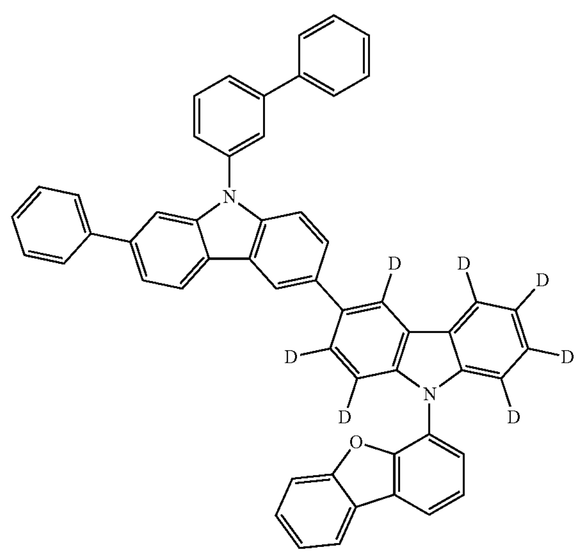

126
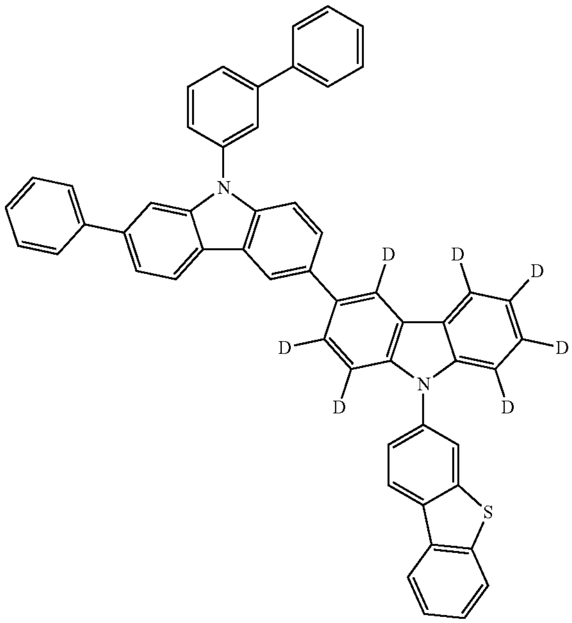
127
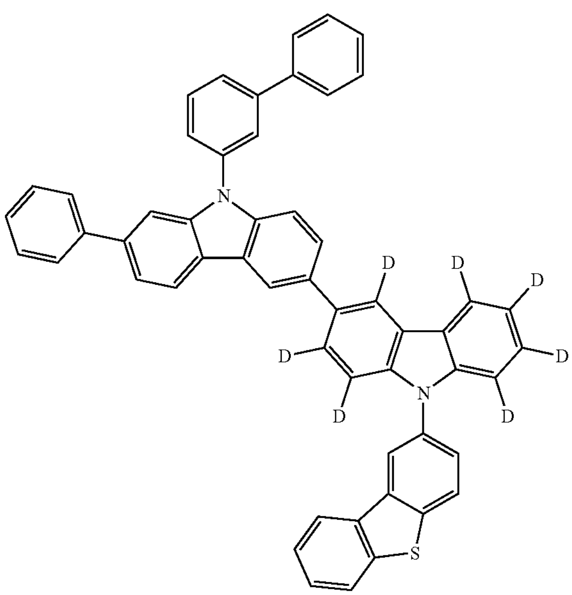
129
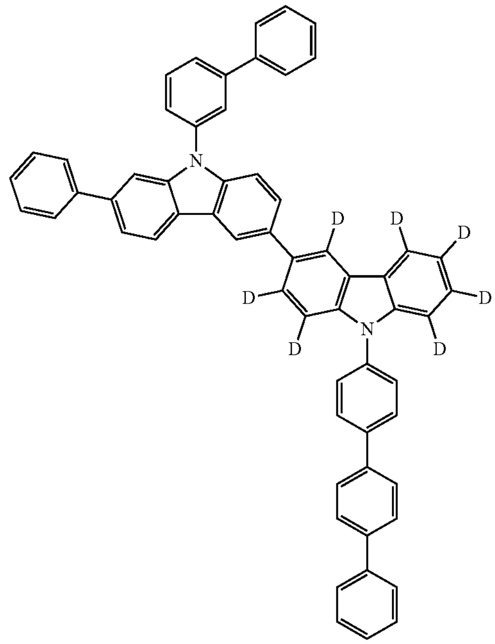
130
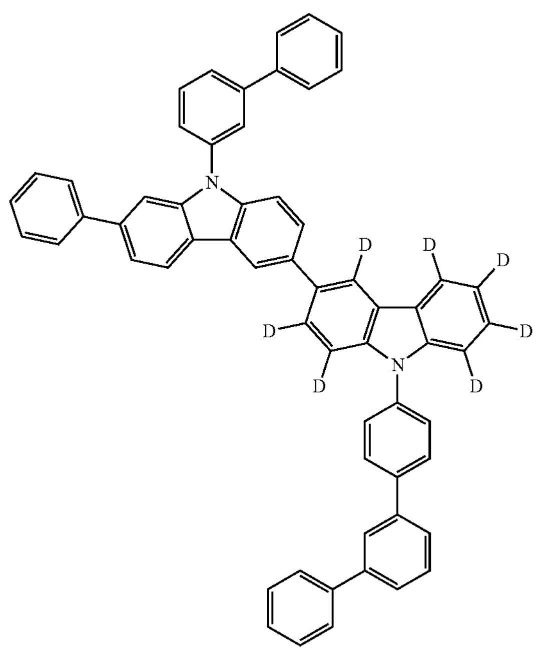

-continued
131
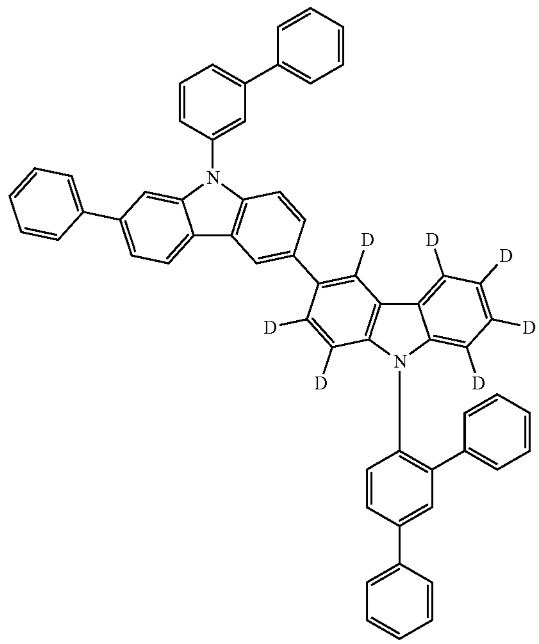
132
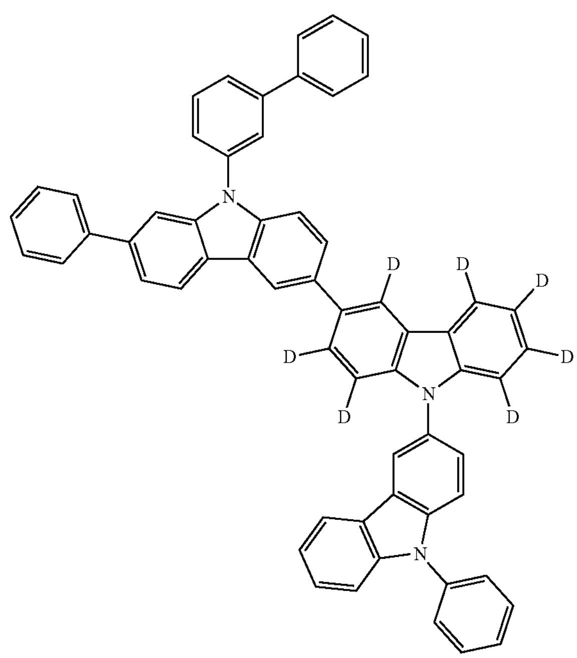
-continued
133
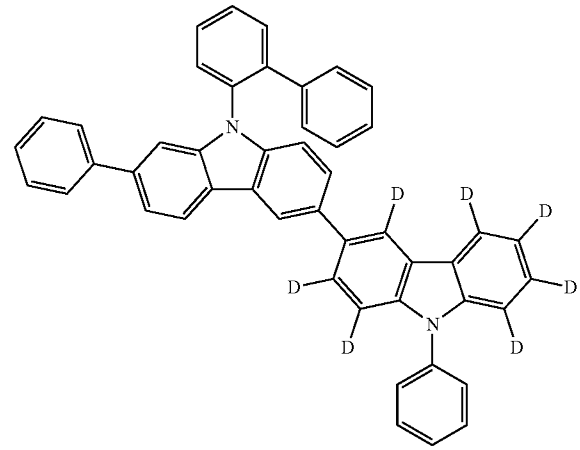
134
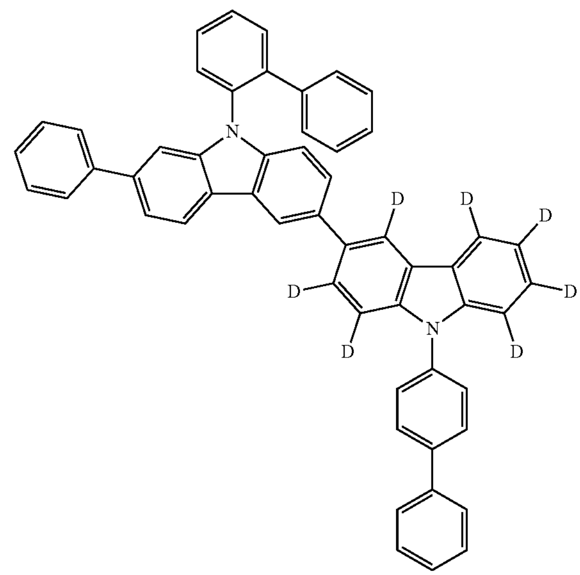
135
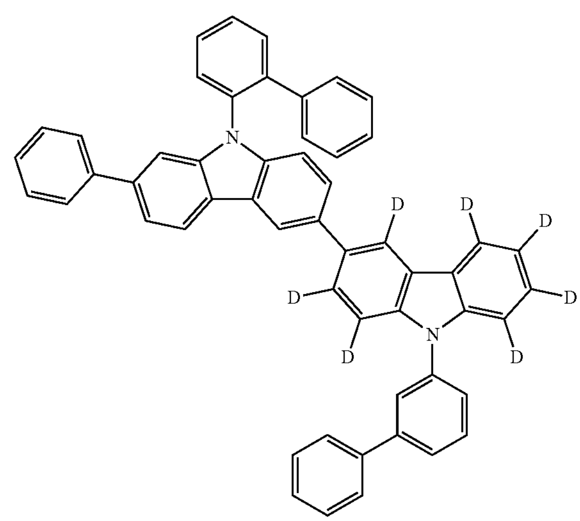

-continued
136
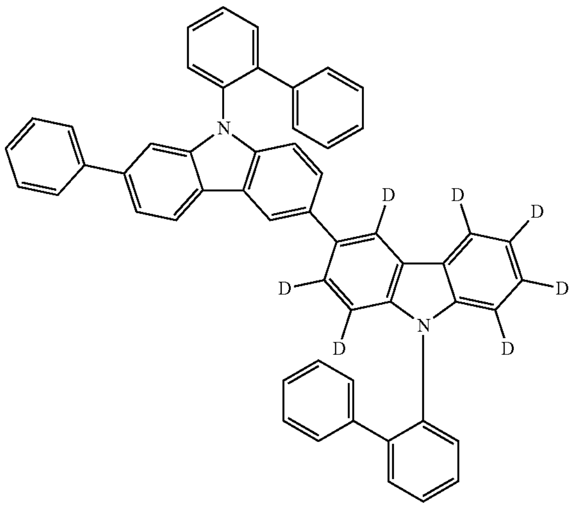
137
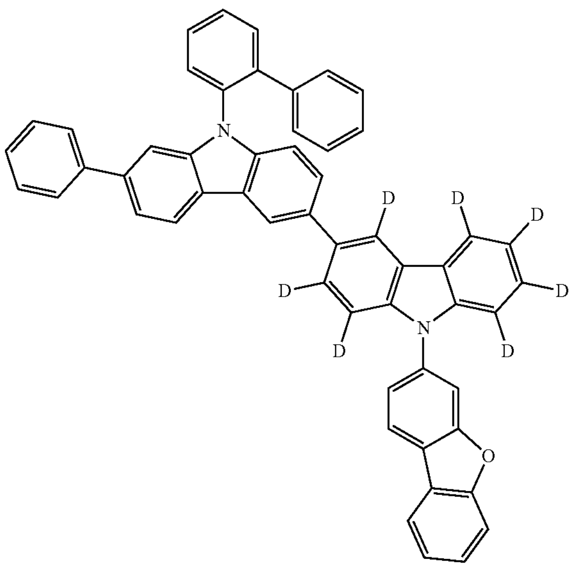
138
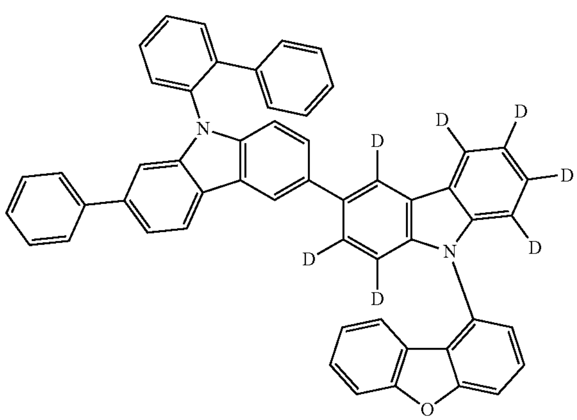
-continued
139
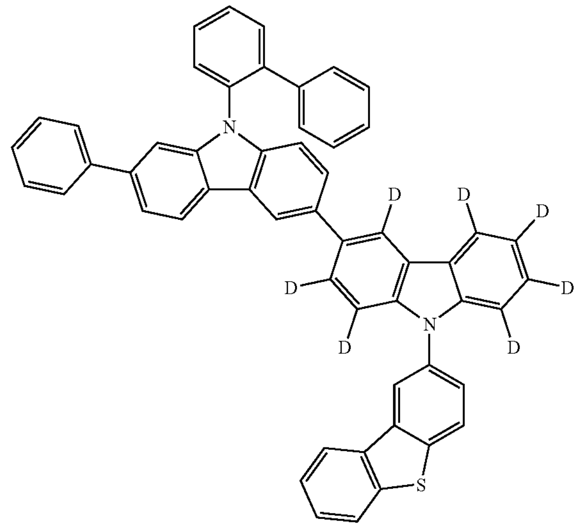
140
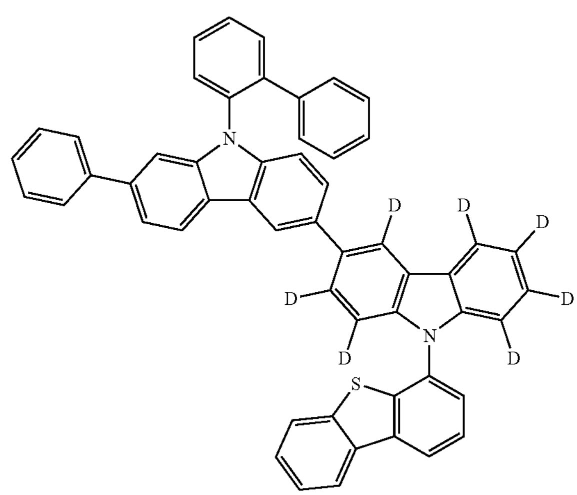

-continued
141
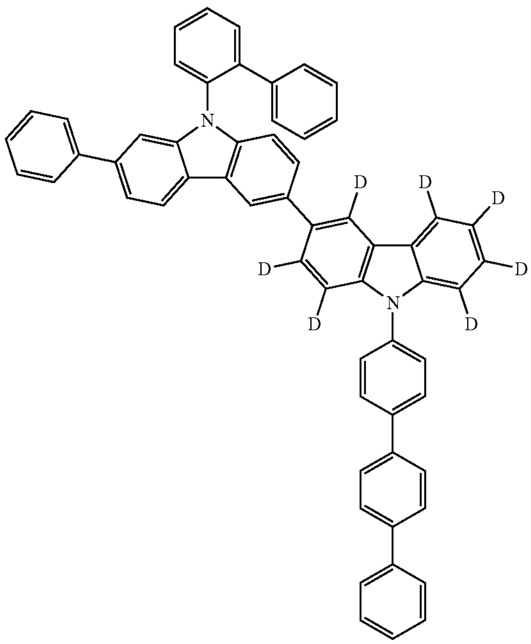
142
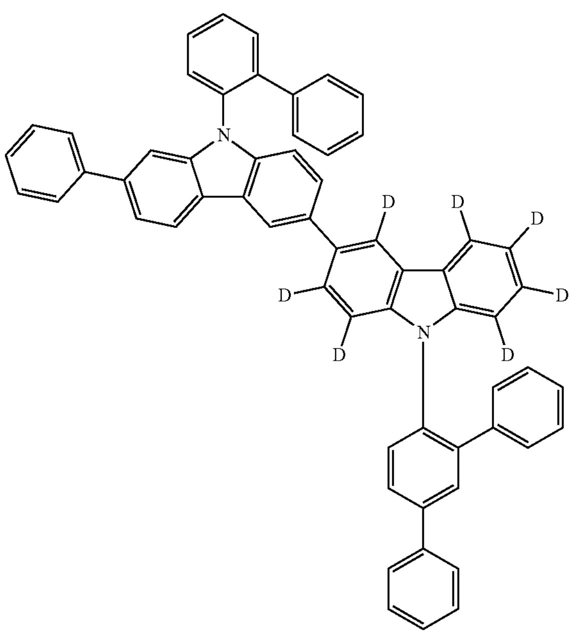
-continued
143
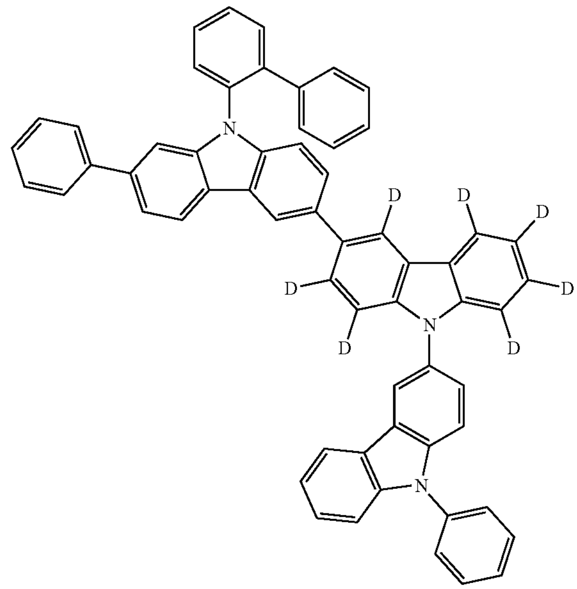
145
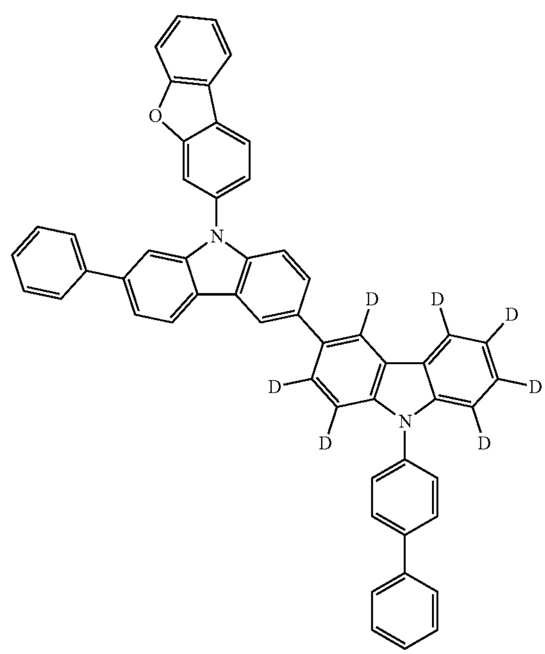

-continued
146
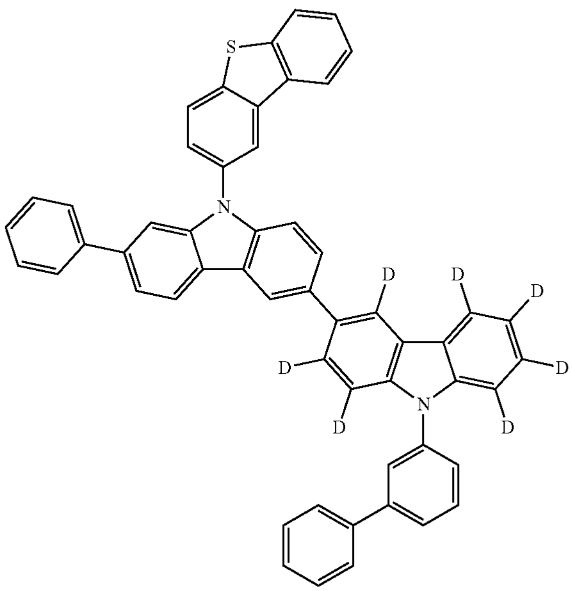
147
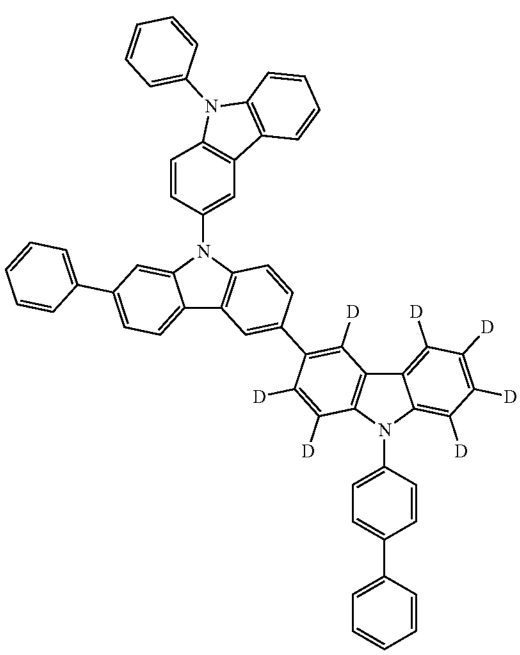
-continued
148
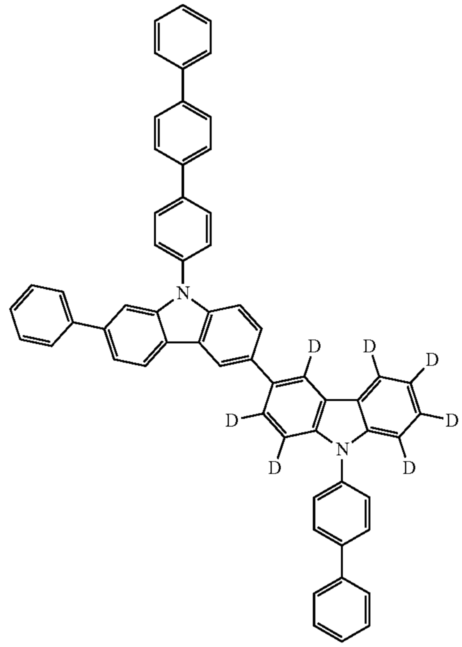
149
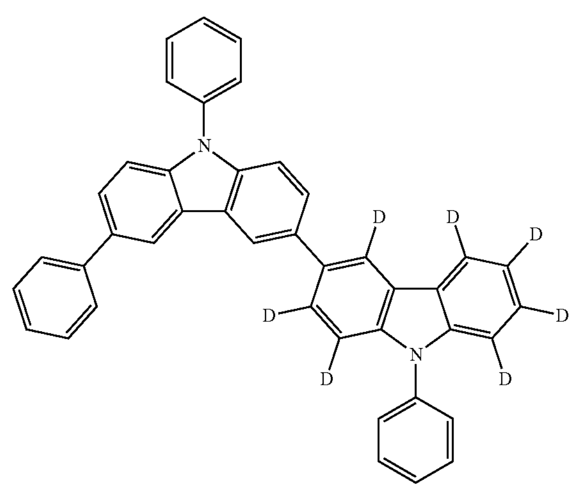

-continued
151
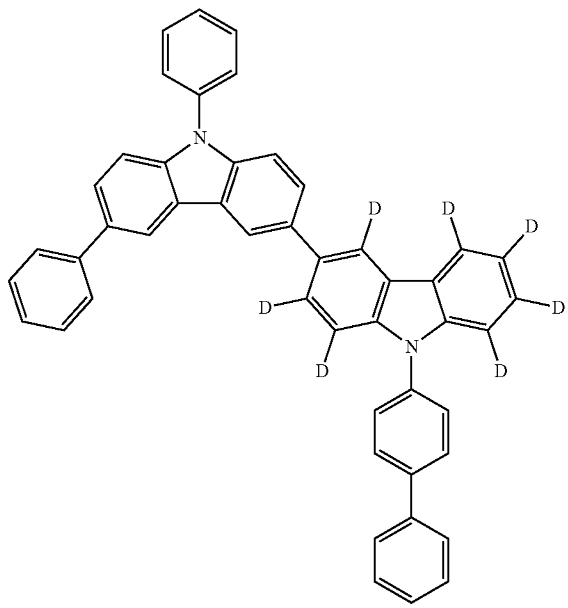
152
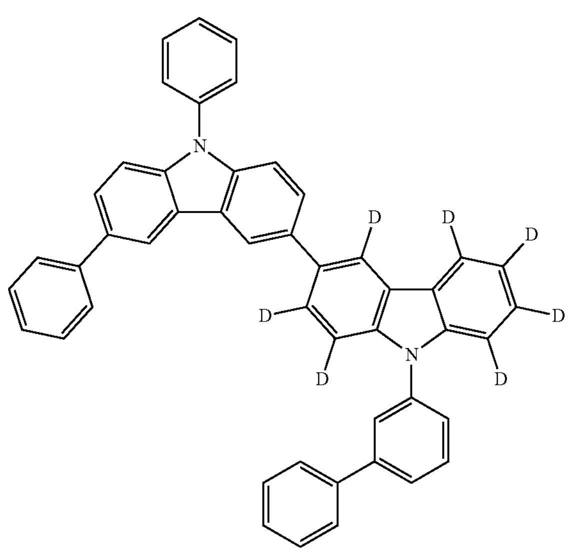
-continued
153
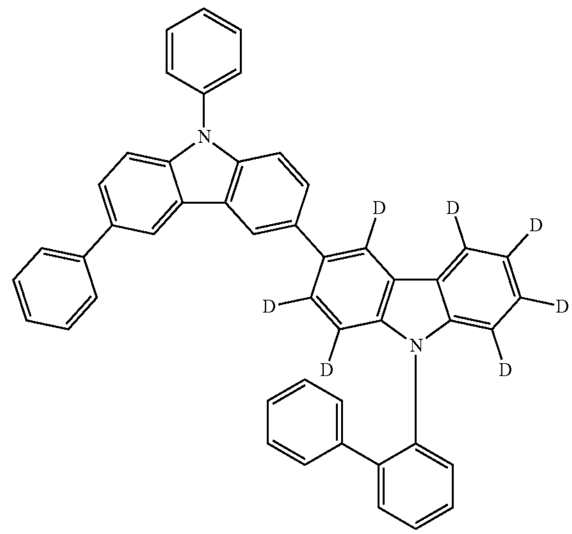
154
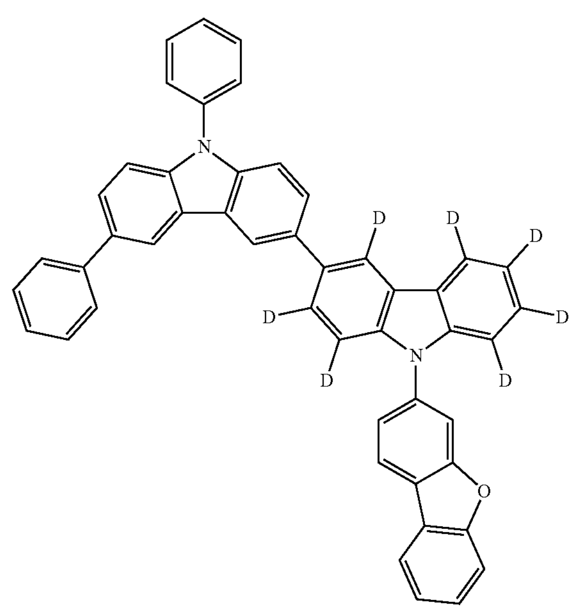

-continued
155
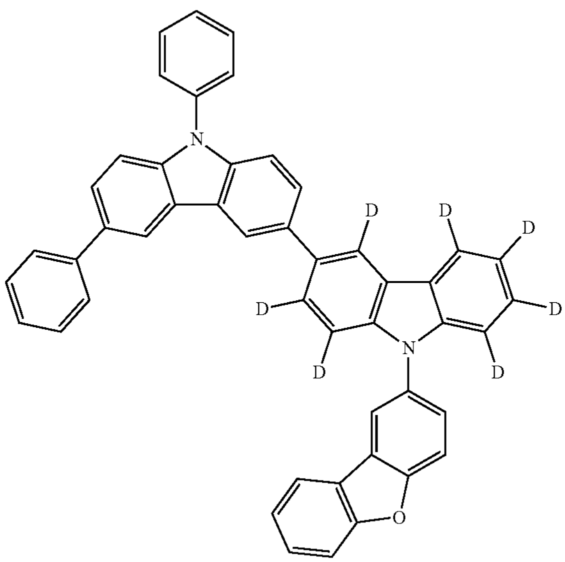
156
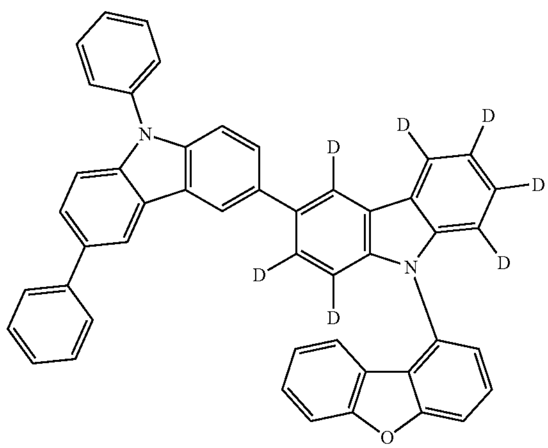
157
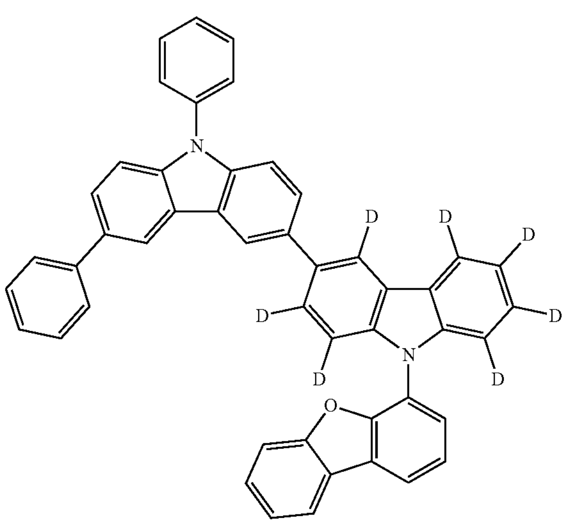
-continued
158
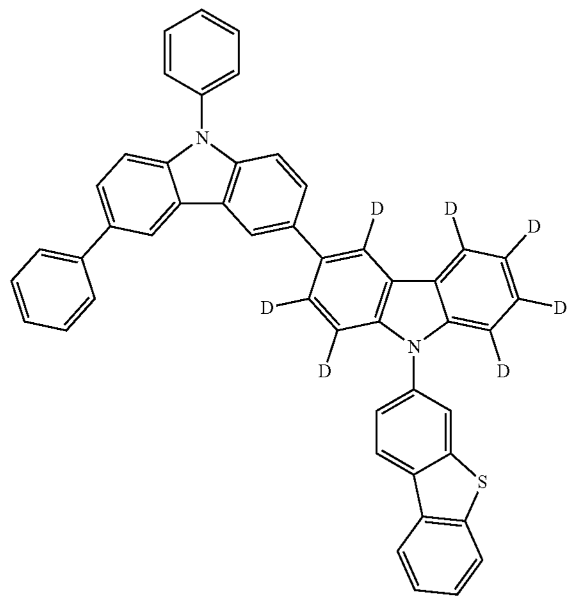
159
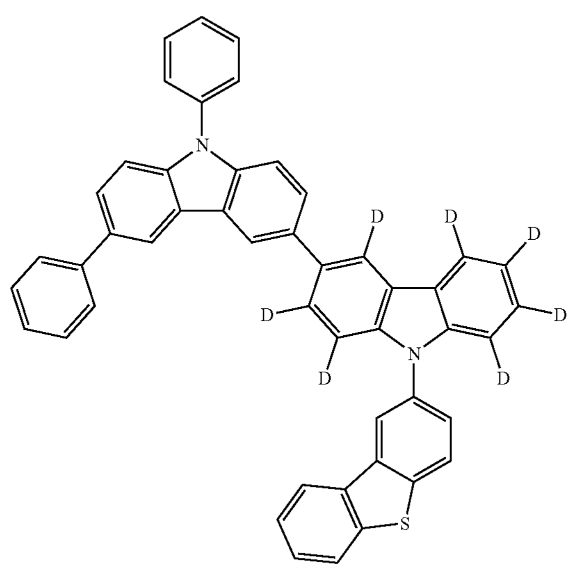

-continued
160
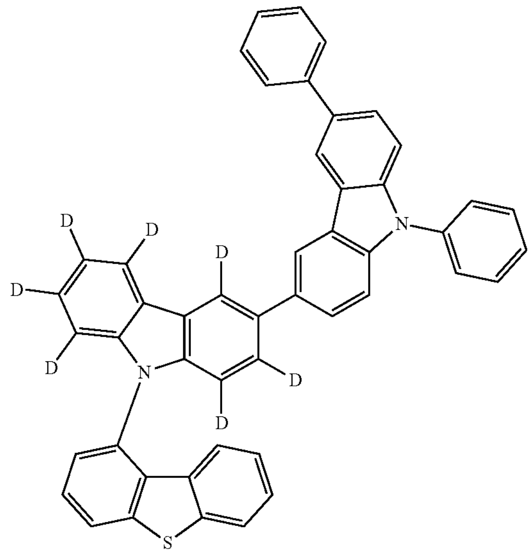
161
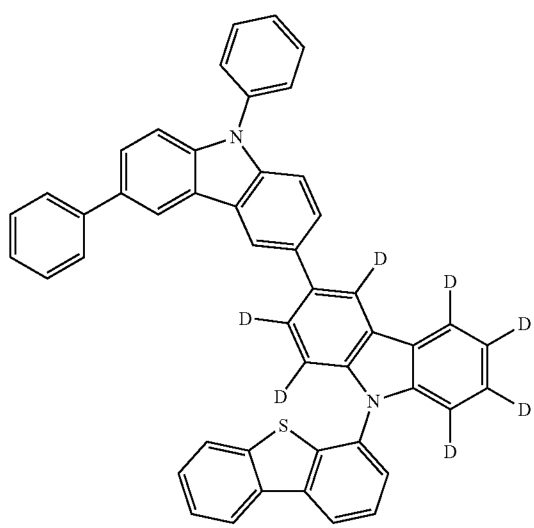
-continued
163
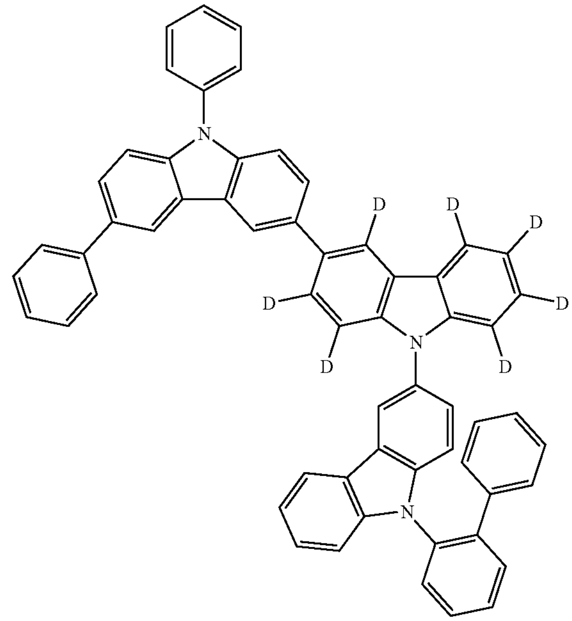
164
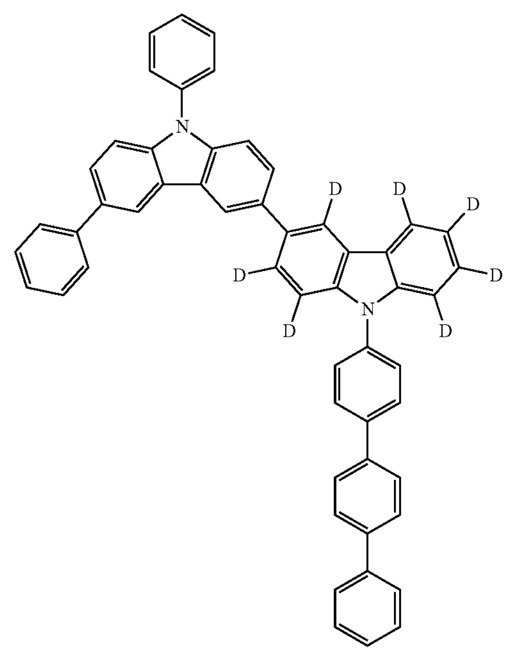

-continued
165
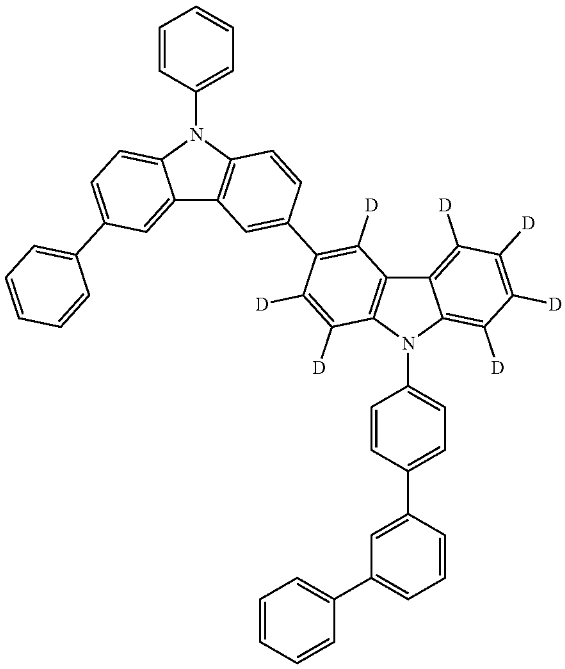
166
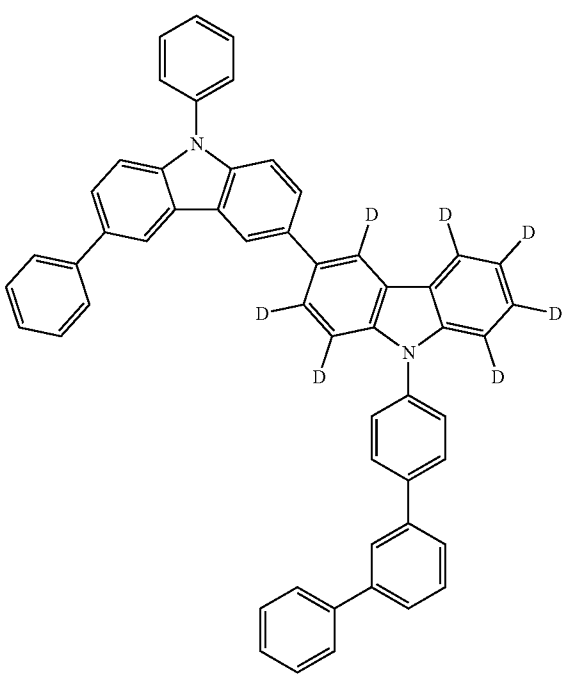
-continued
167
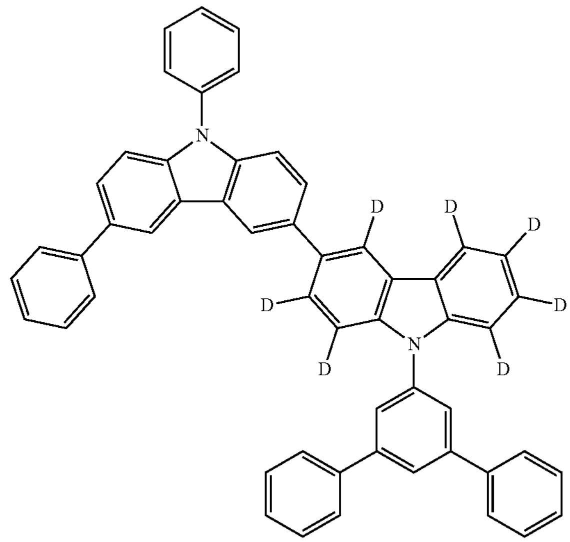
167'
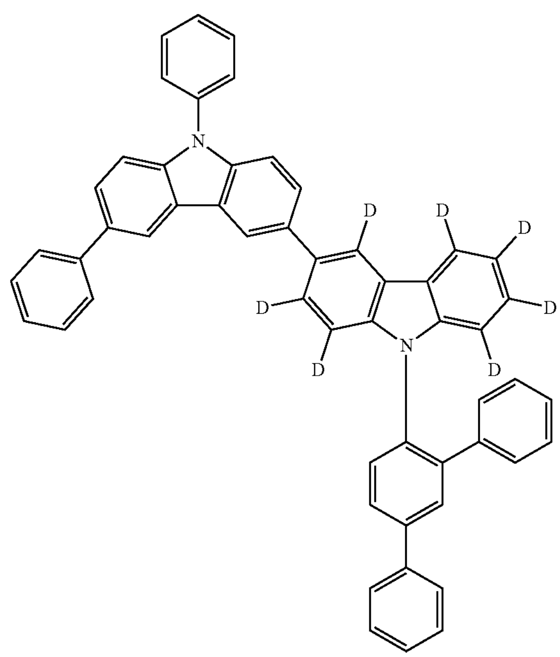

-continued
169
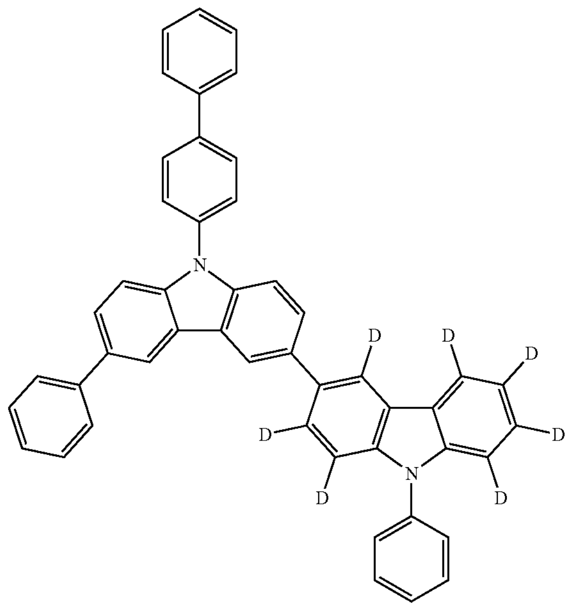
170
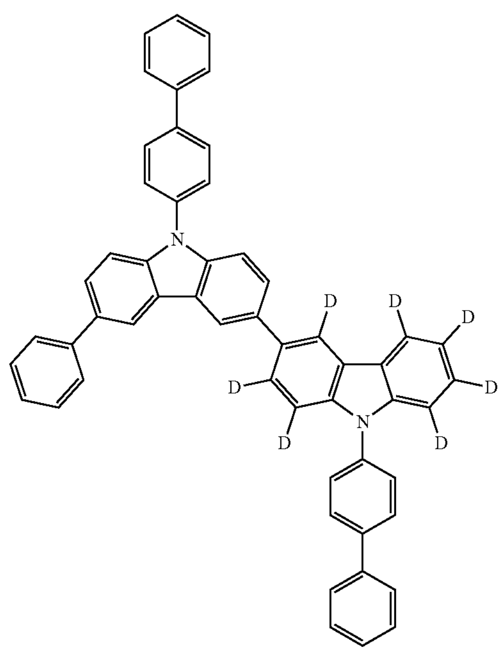
-continued
171
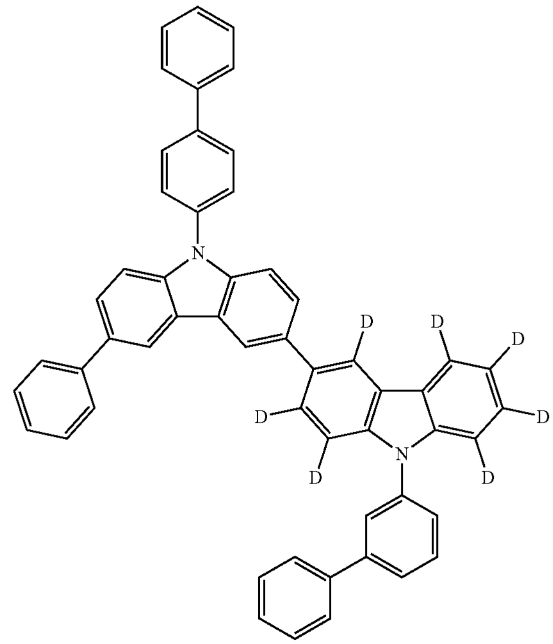
172
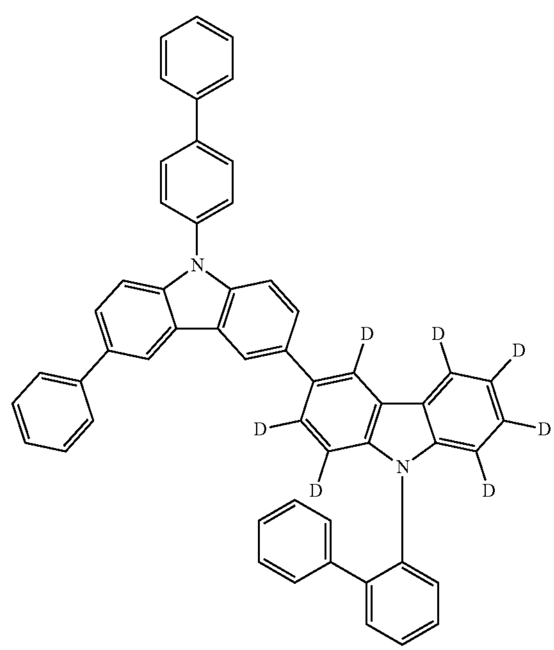

-continued
173
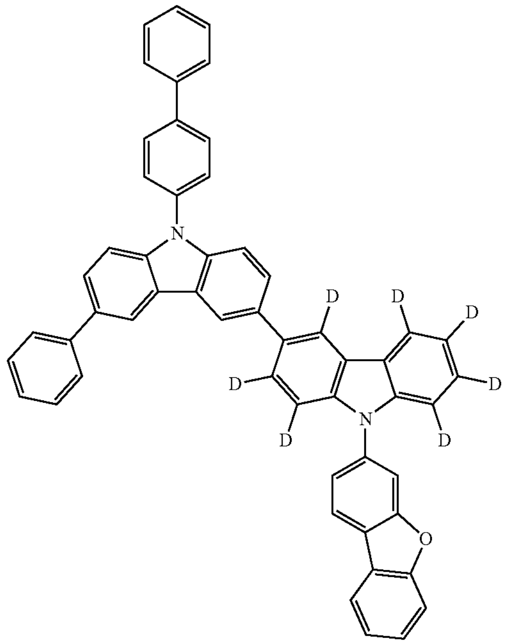
174
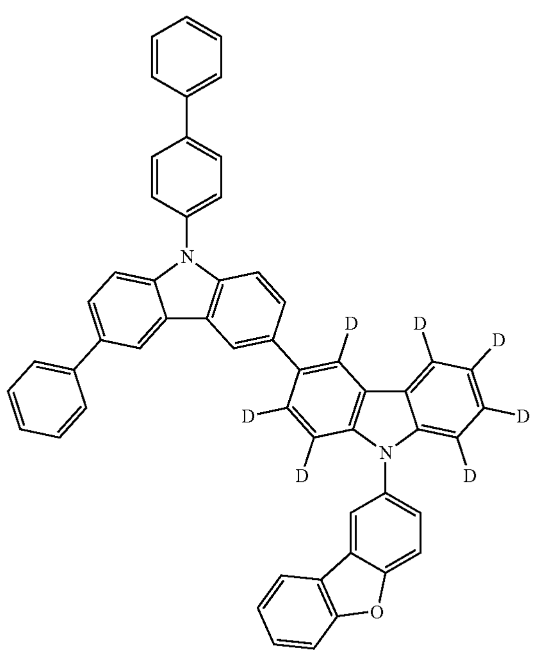
-continued
175
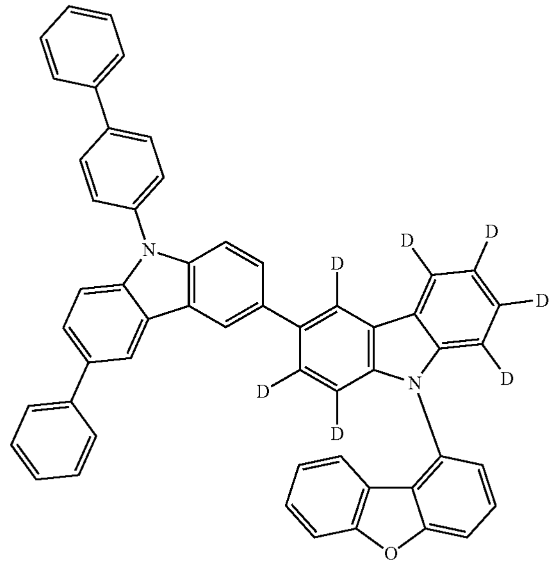
176
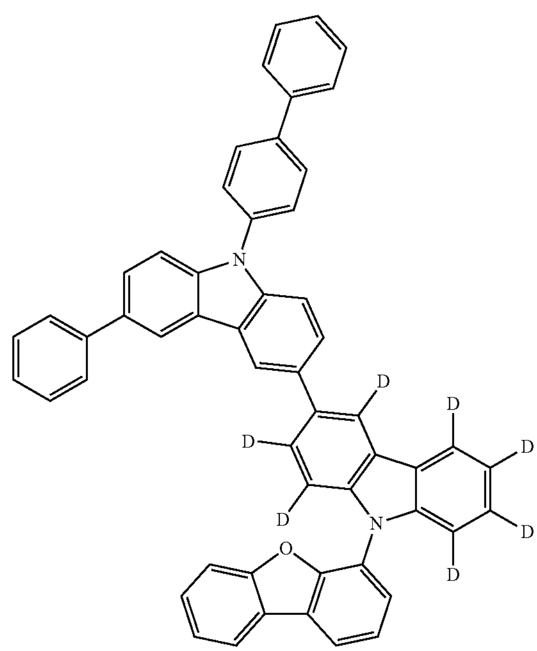

-continued
177
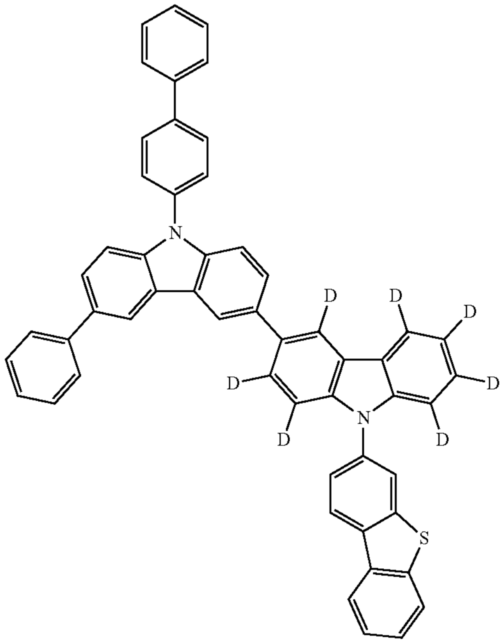
178
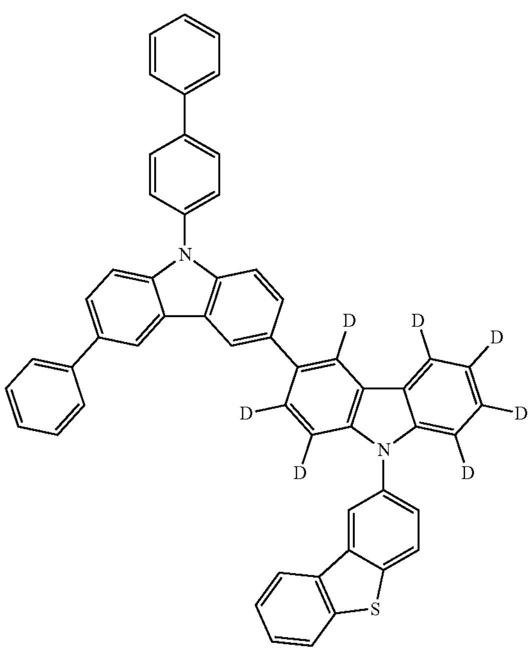
-continued
179
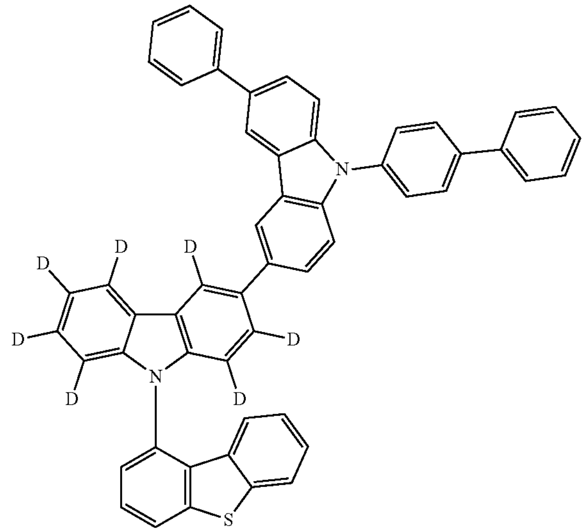
181
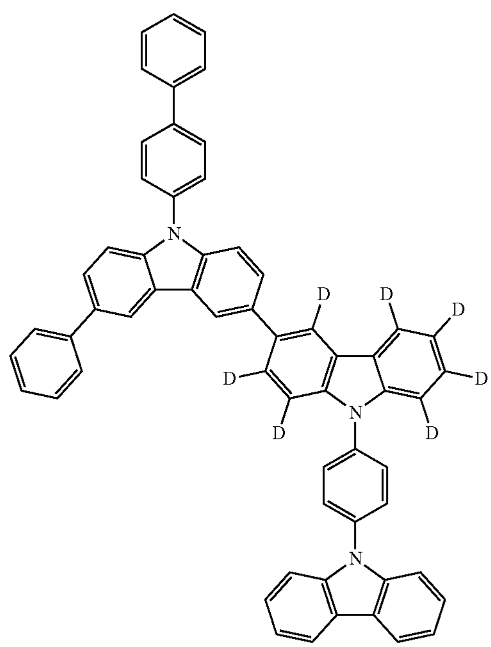

-continued
182
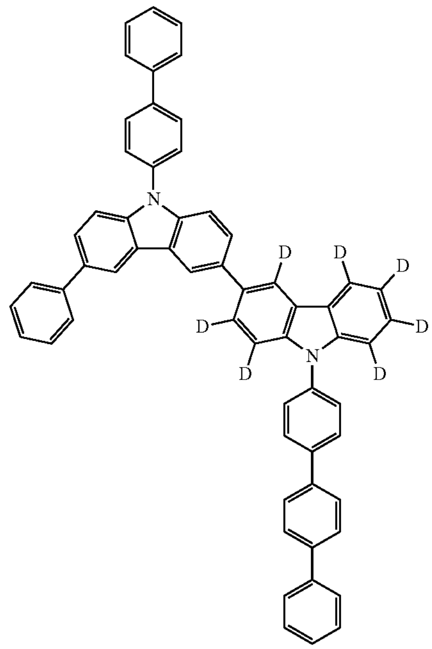
183
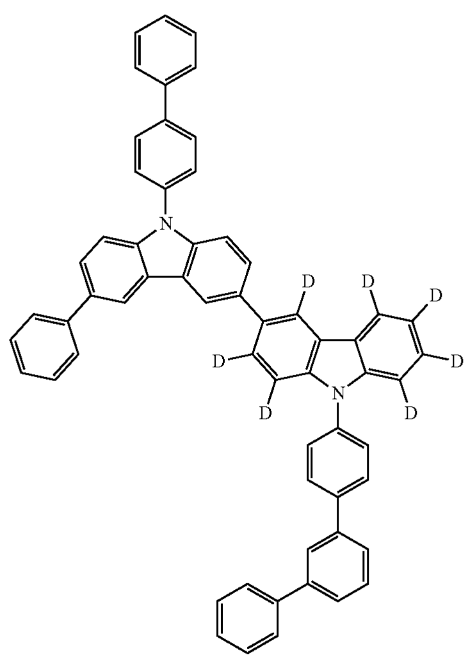
184
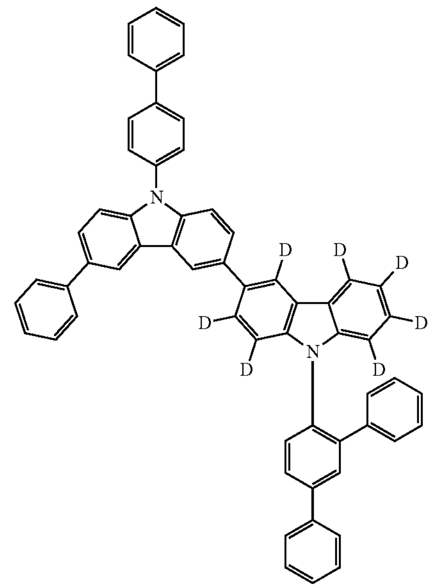
185
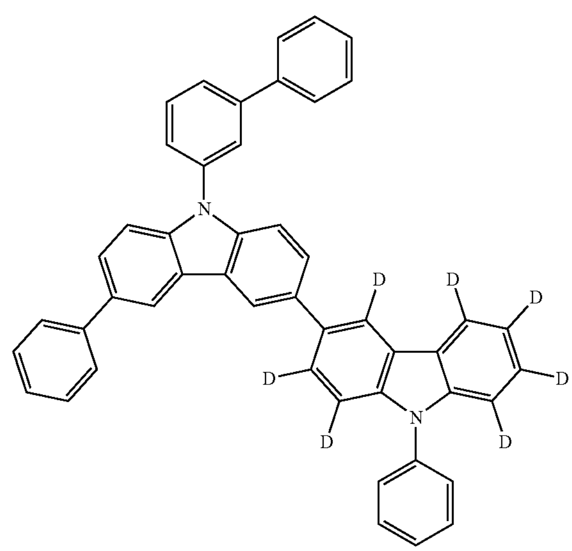

187
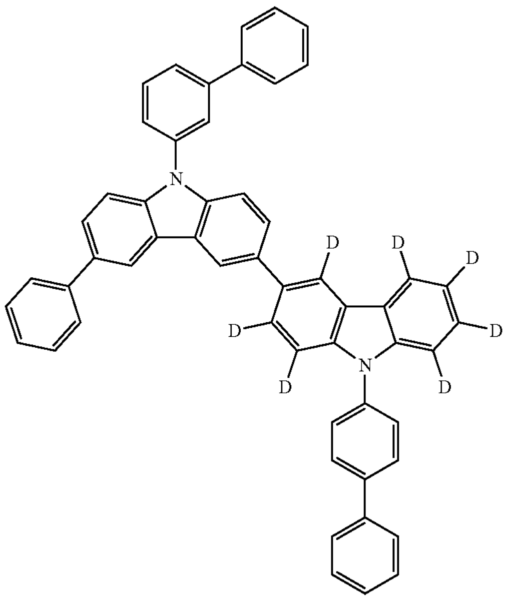
188
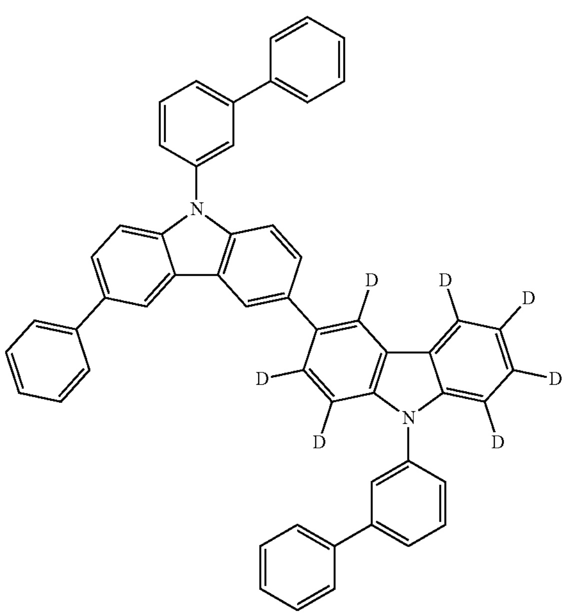
189
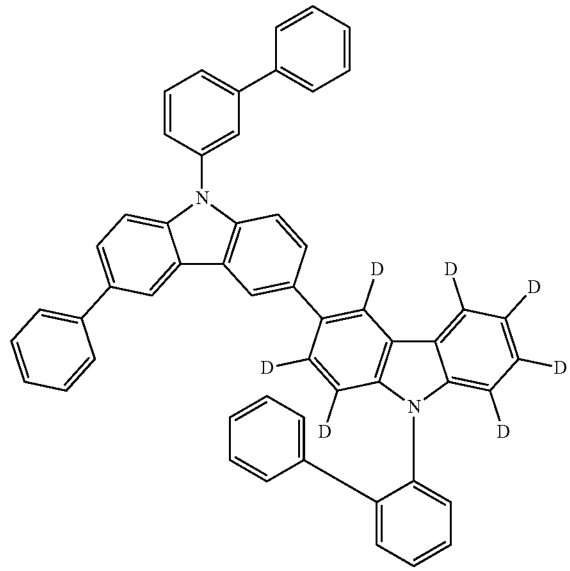
190
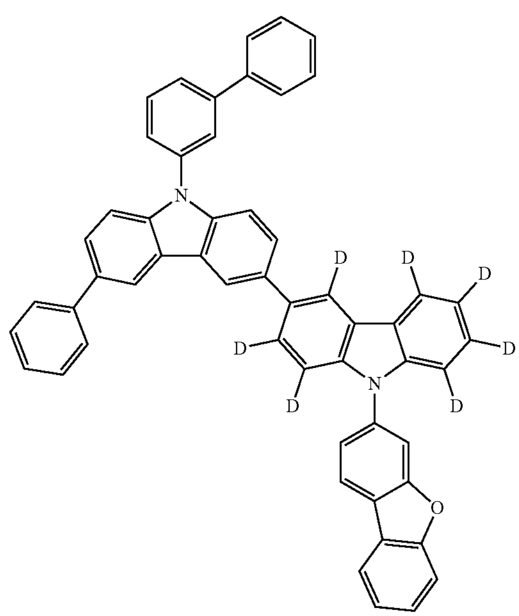

-continued
191
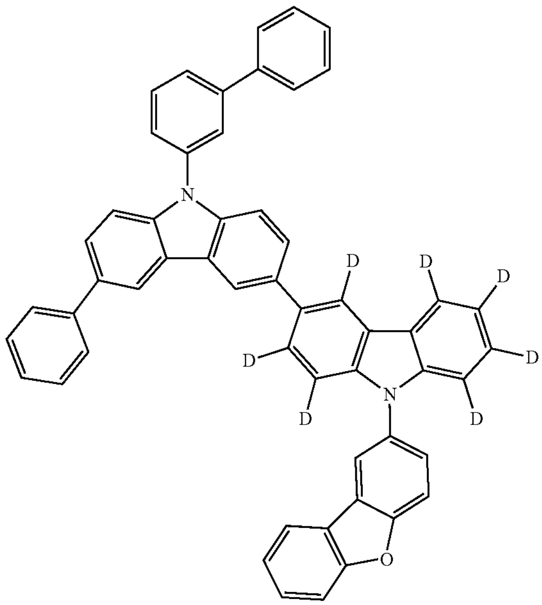
192
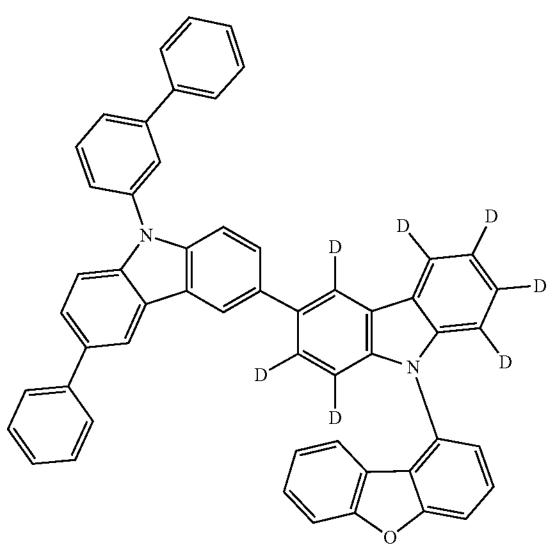
-continued
193
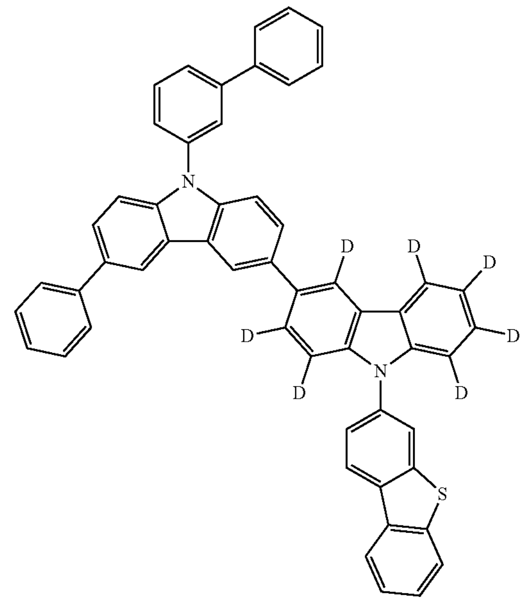
194
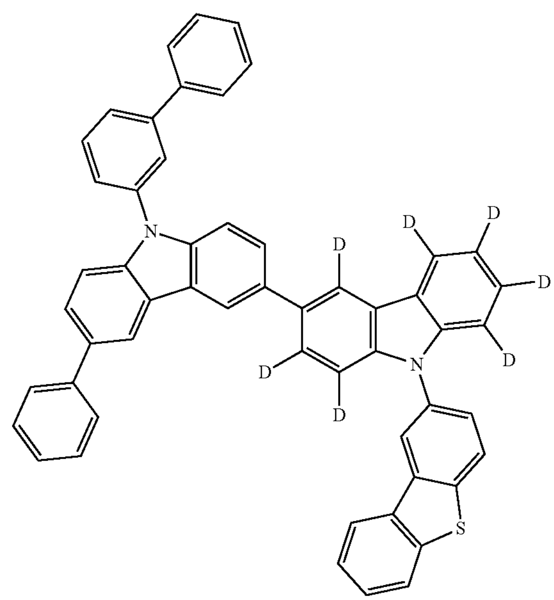

195
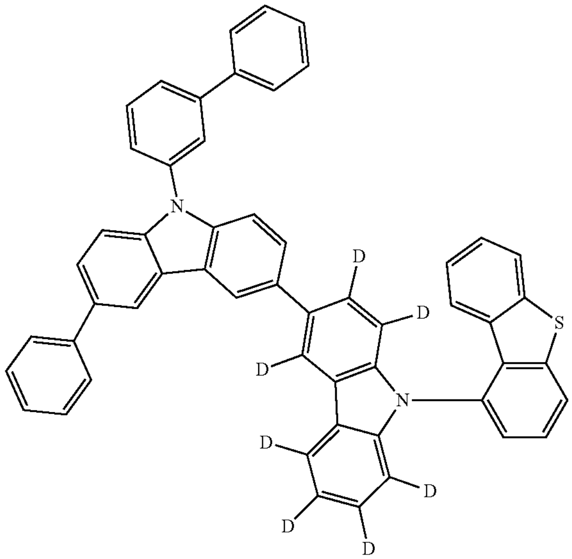
198
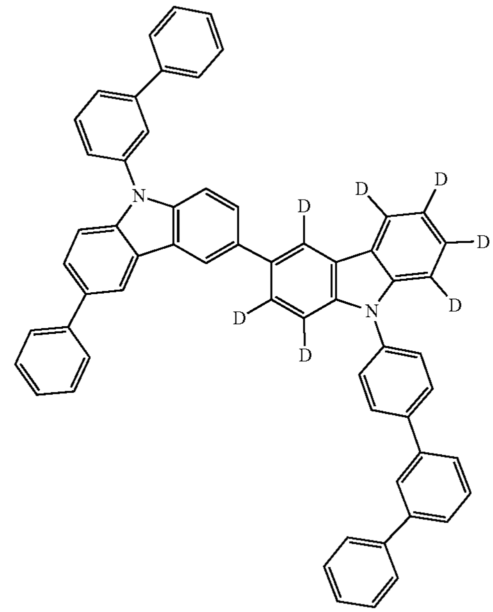
197
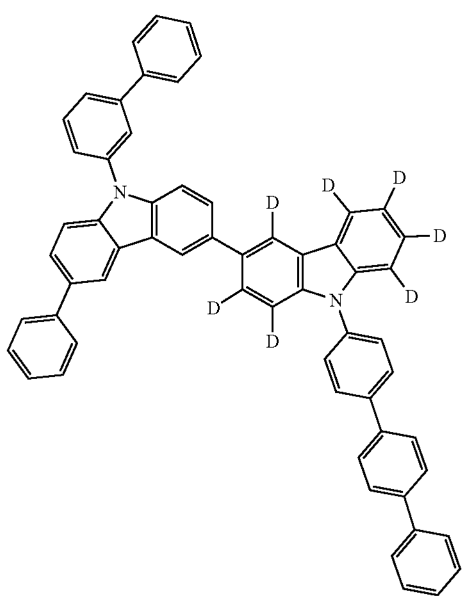
199
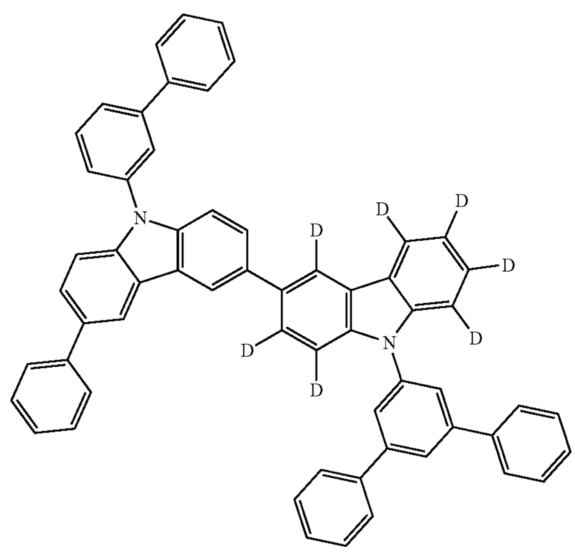

-continued
200
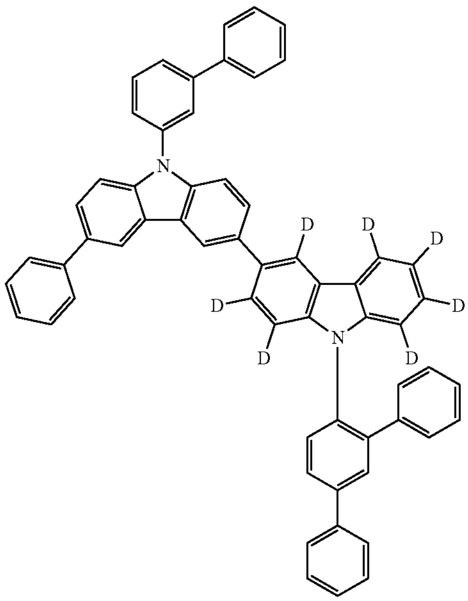
201
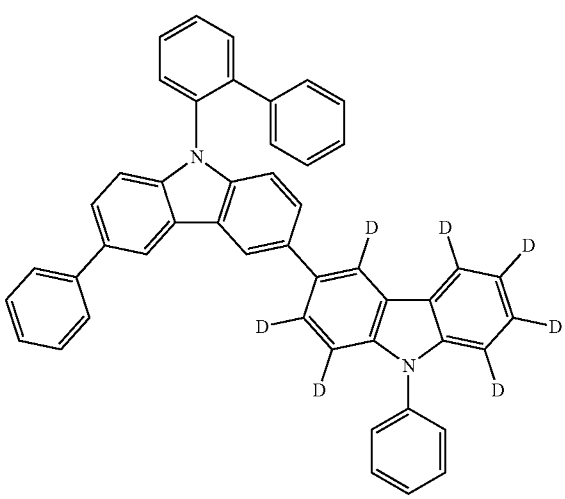
-continued
203
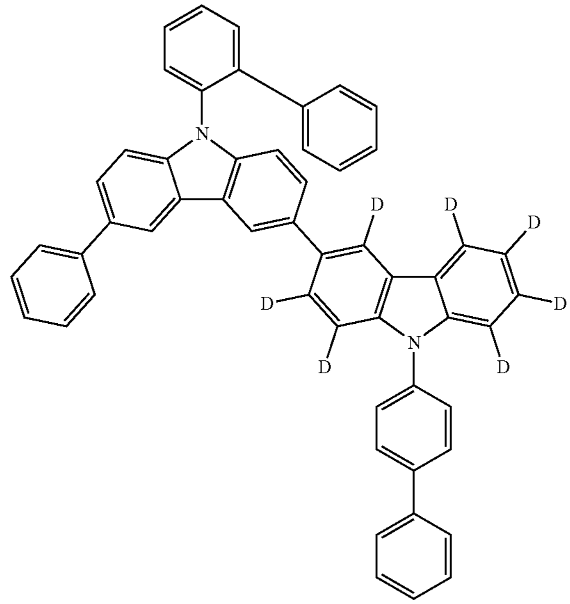
204
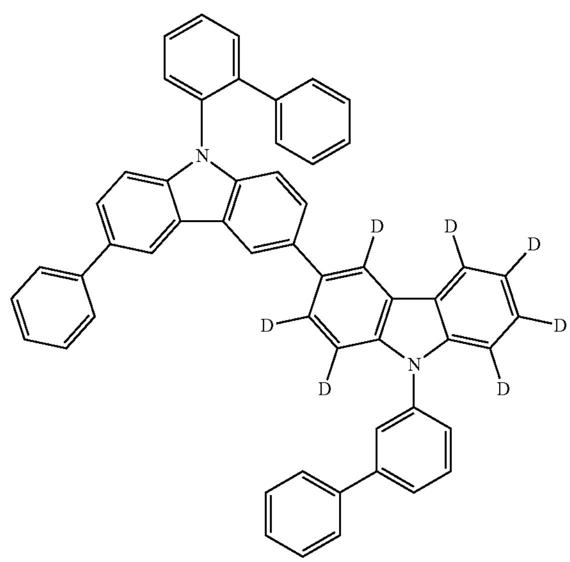

205
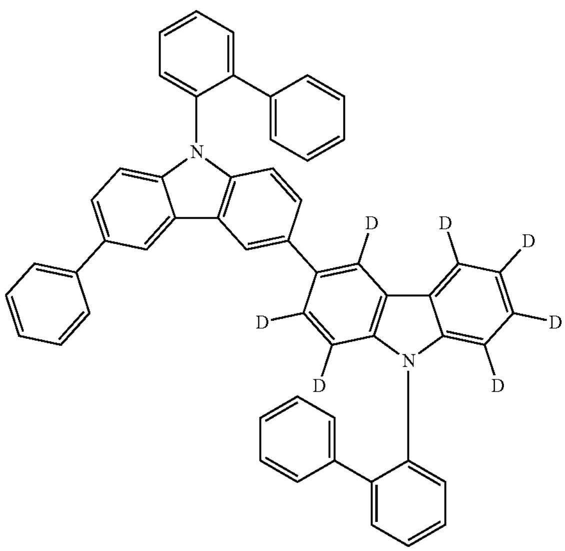
206
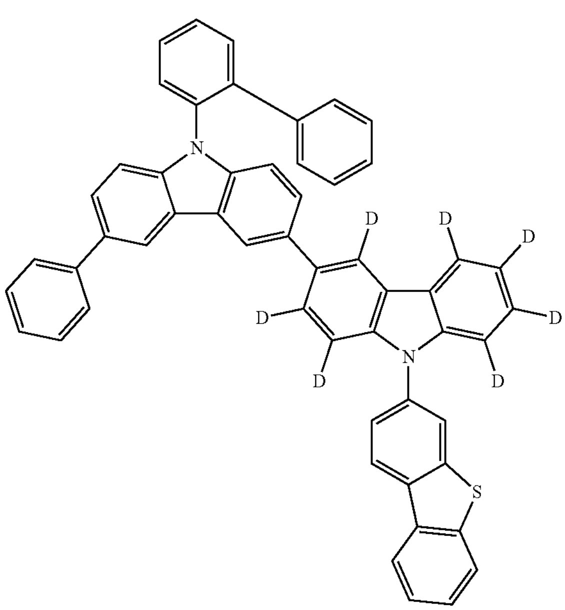
207
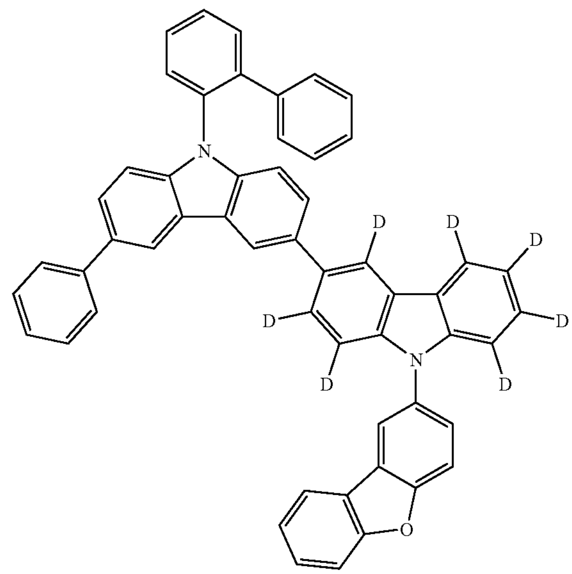
208
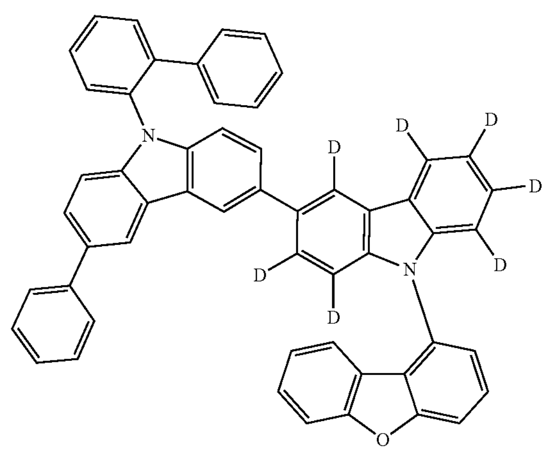
209
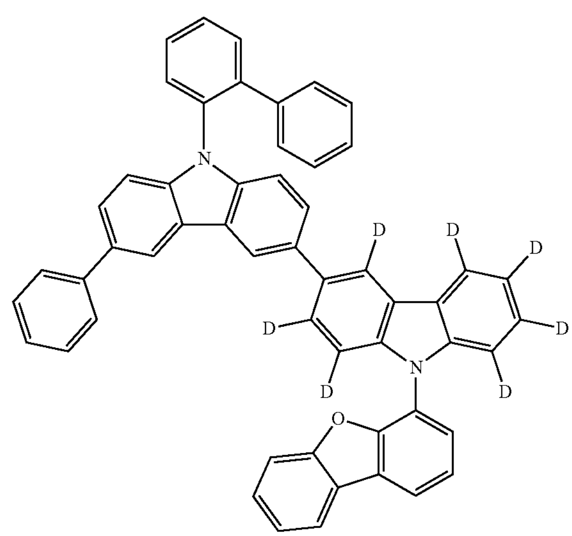

-continued
210
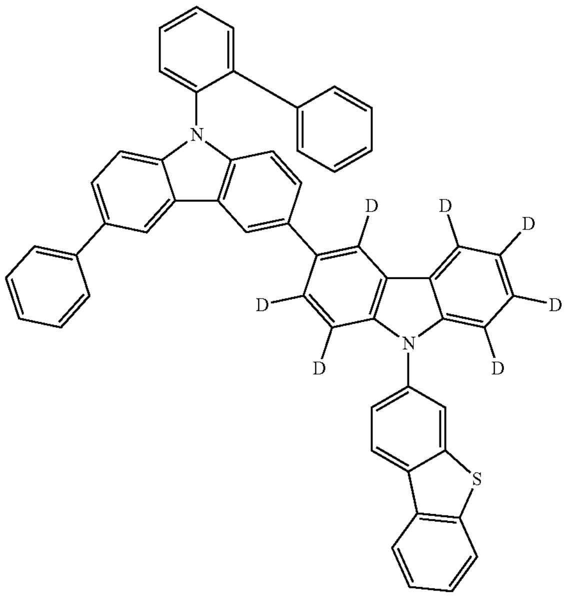
211
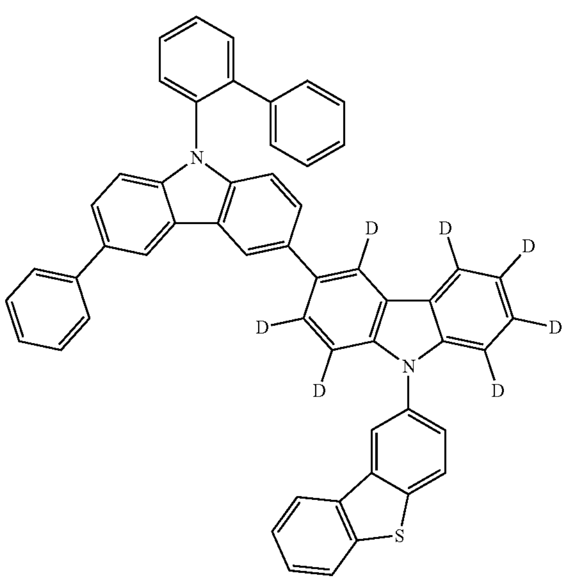
-continued
212
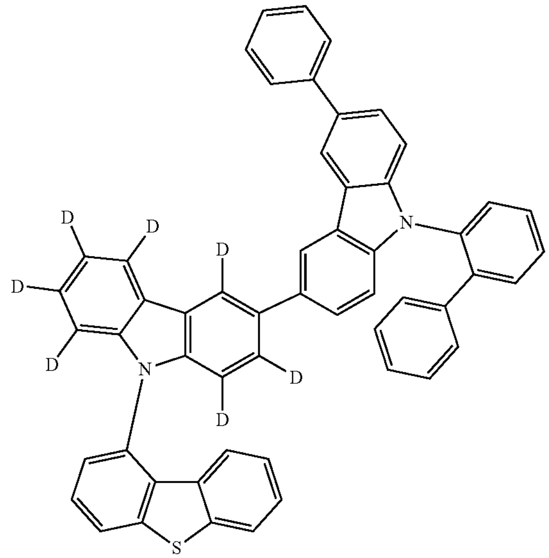
213
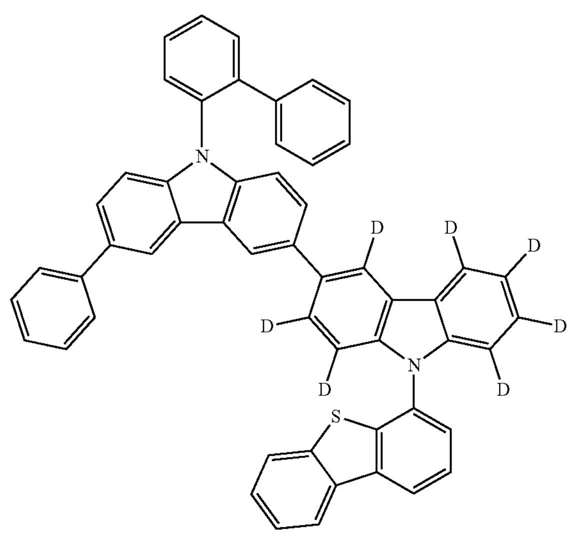

-continued
214
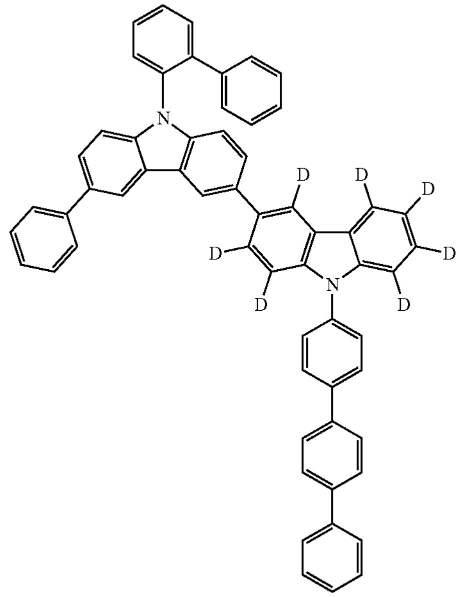
215
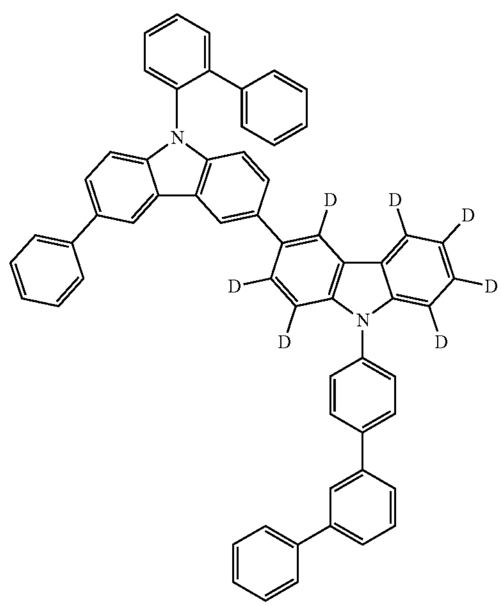
-continued
216
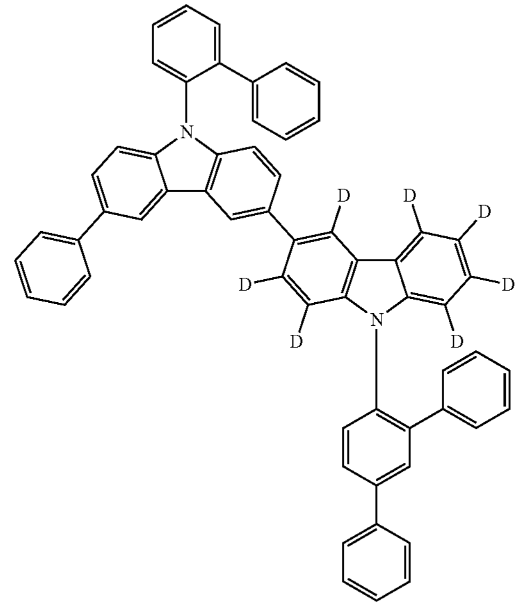
217
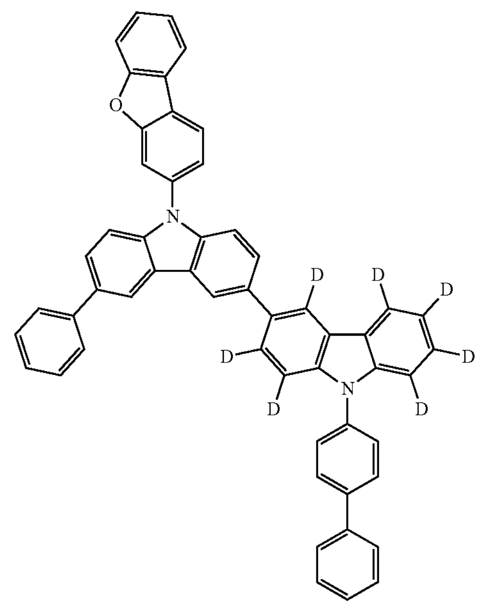

-continued
218
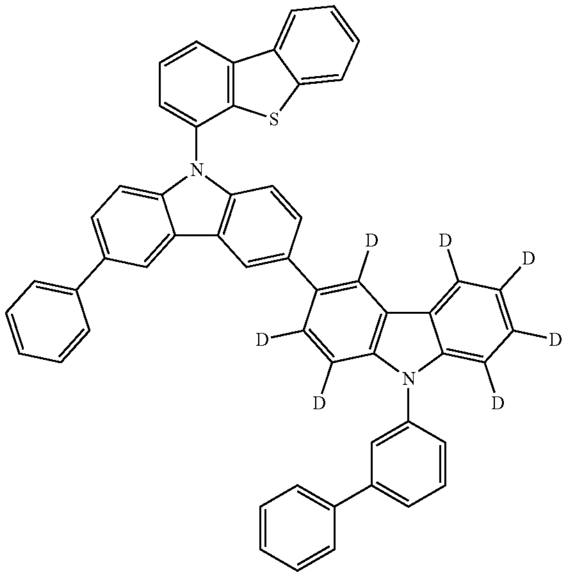
219
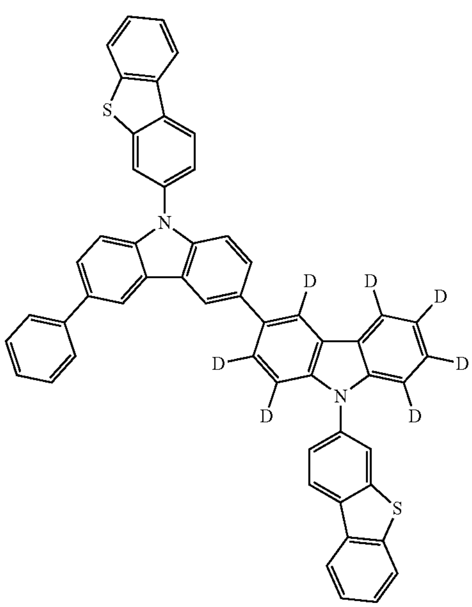
-continued
220
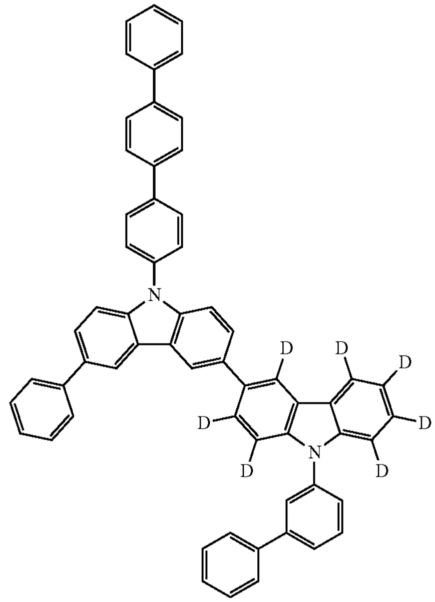
221
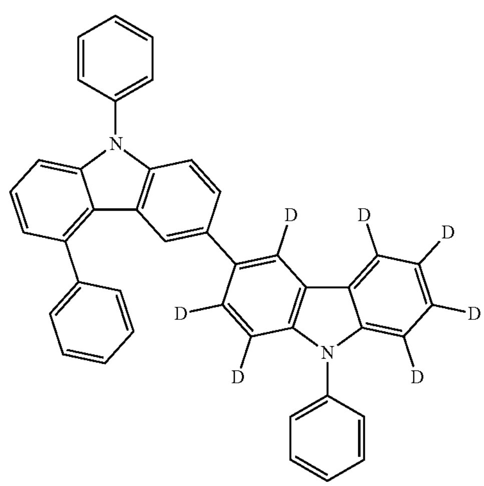

-continued
223
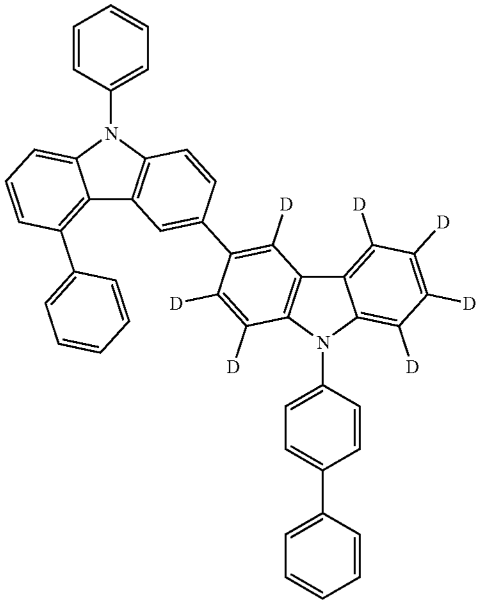
224
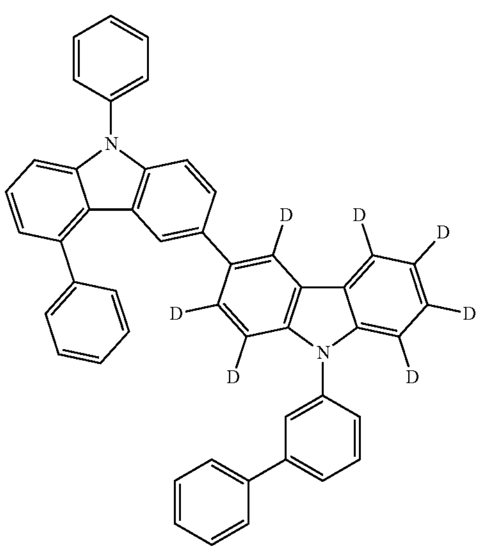
-continued
225
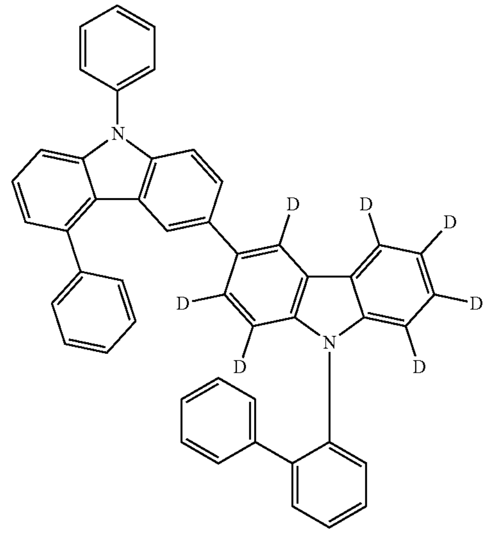
226
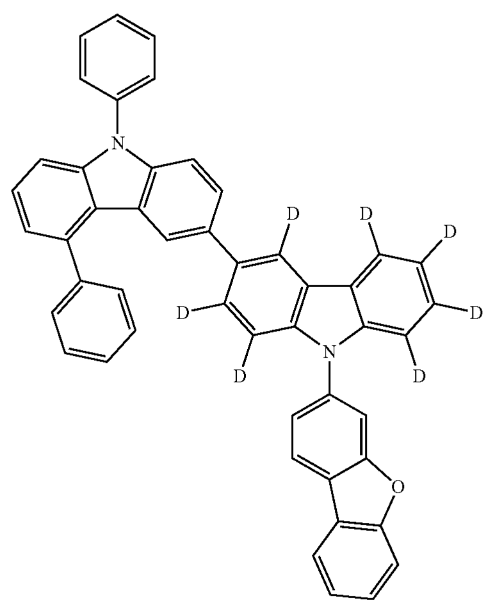

227
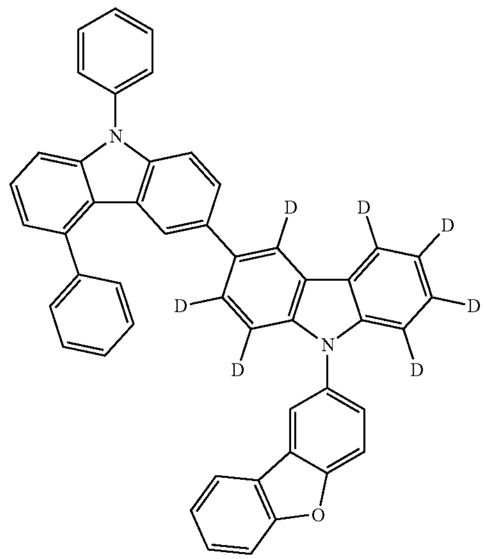
228
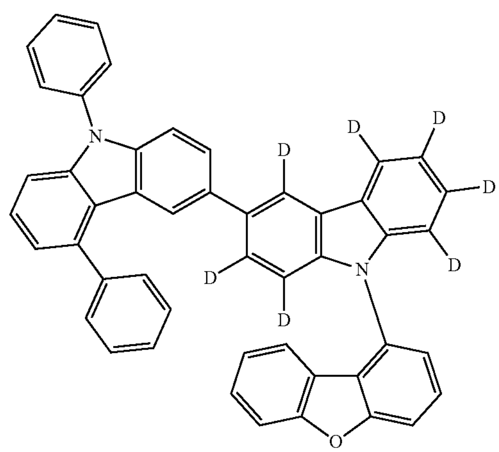
229
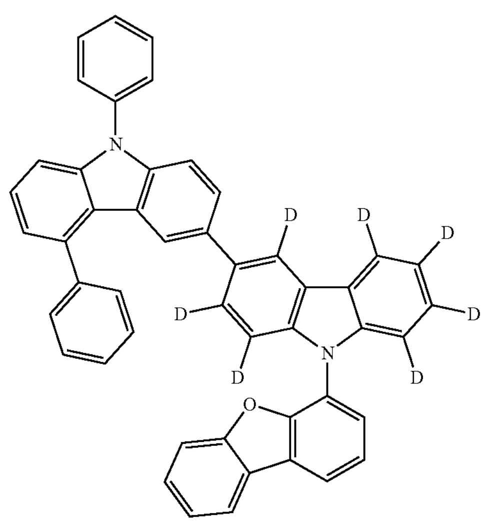
230
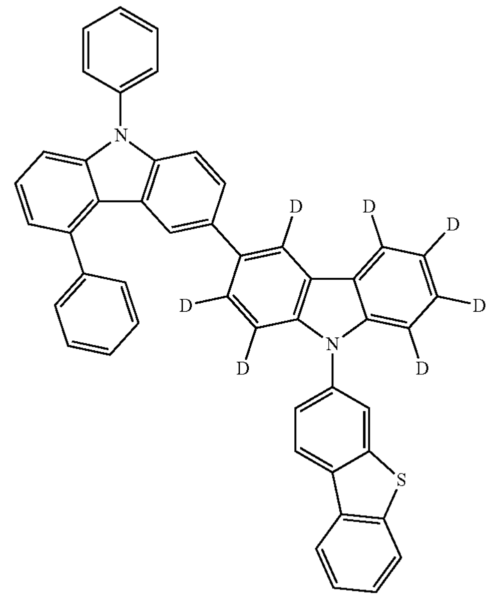
231
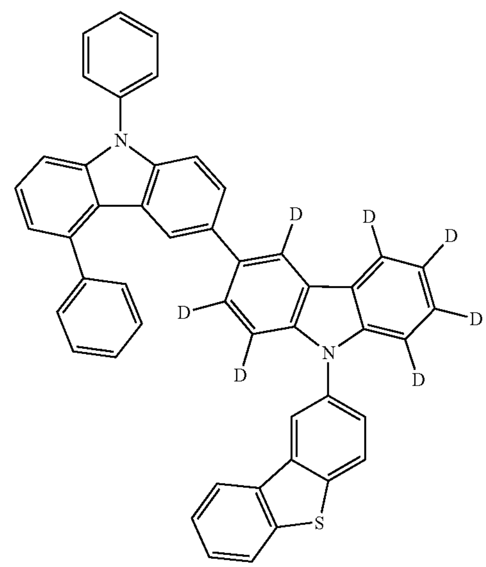
232
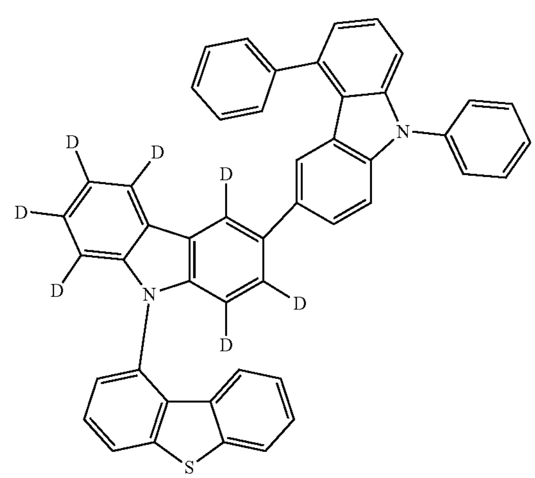

-continued
233
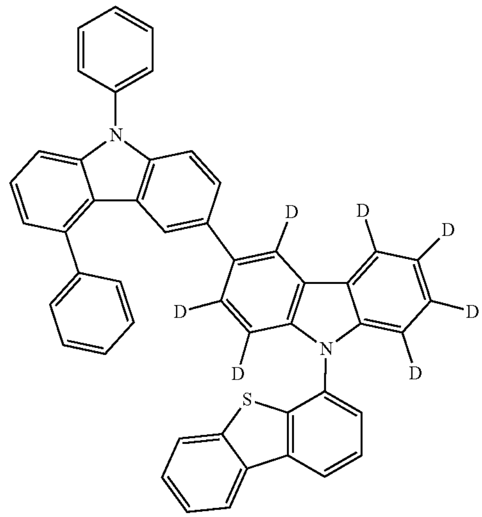
236
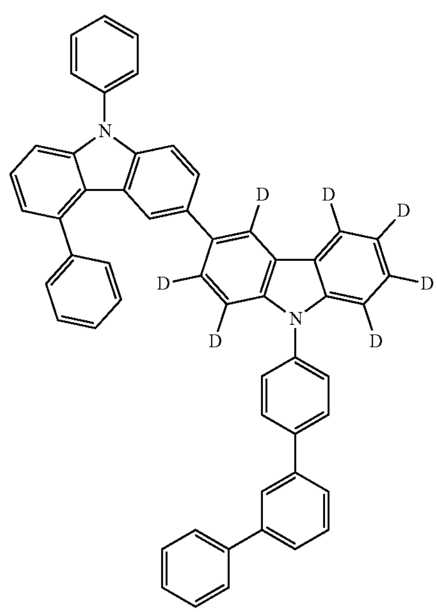
-continued
237
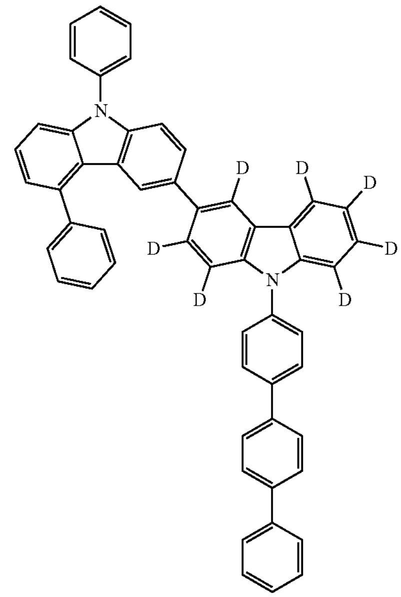
238
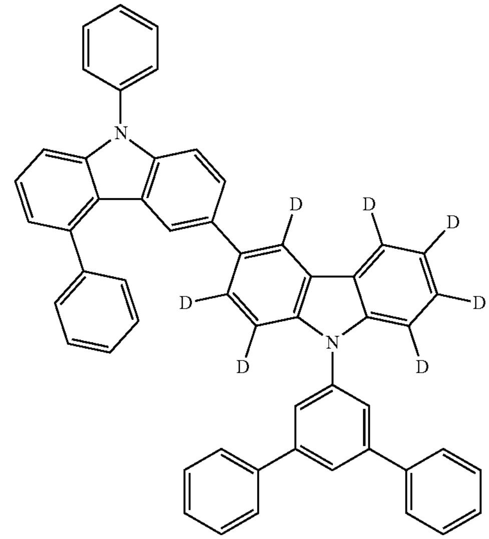

239
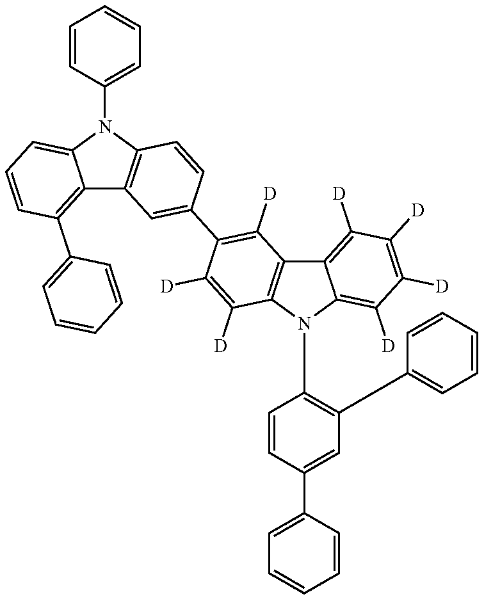
240
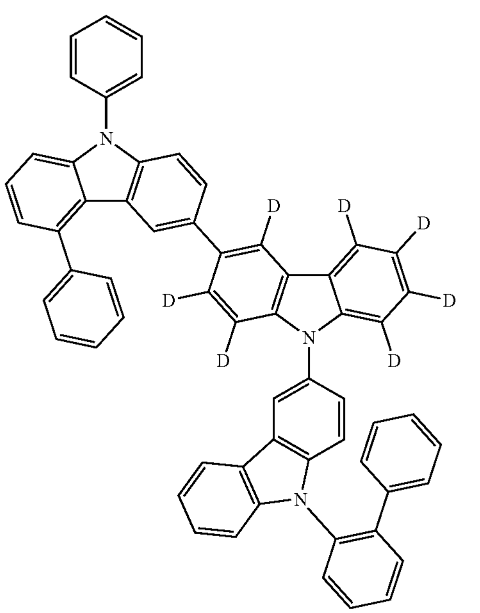
241
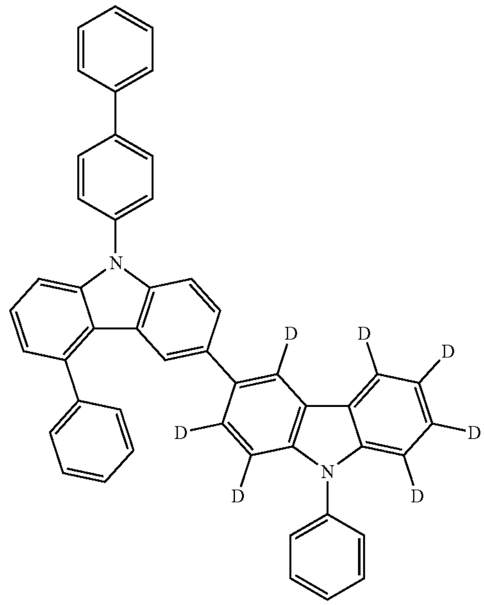
243
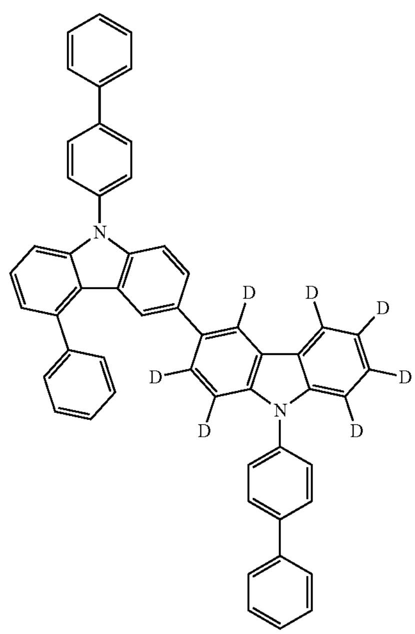

-continued
244
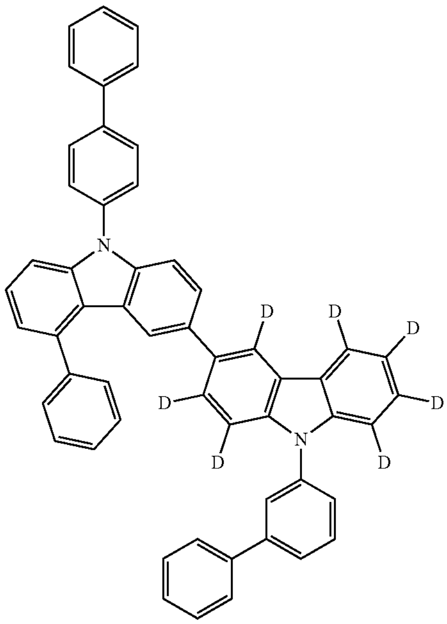
245
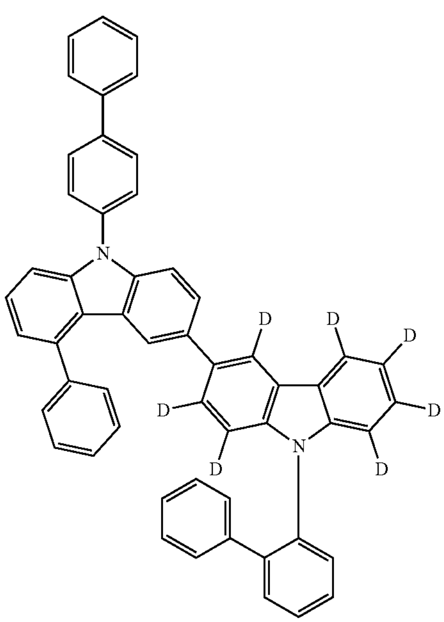
-continued
246
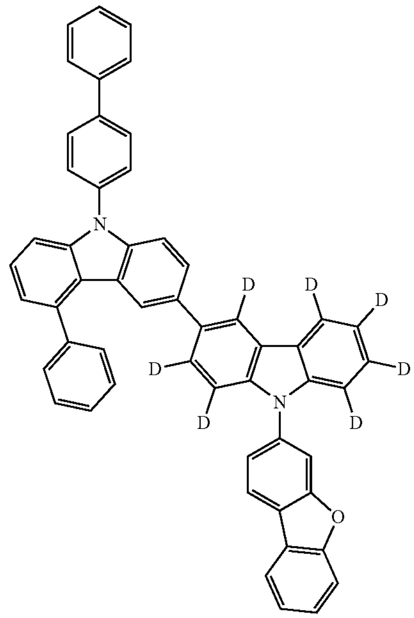
247
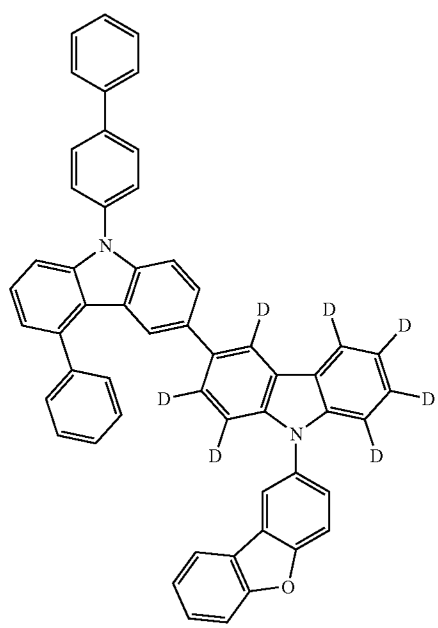

-continued
248
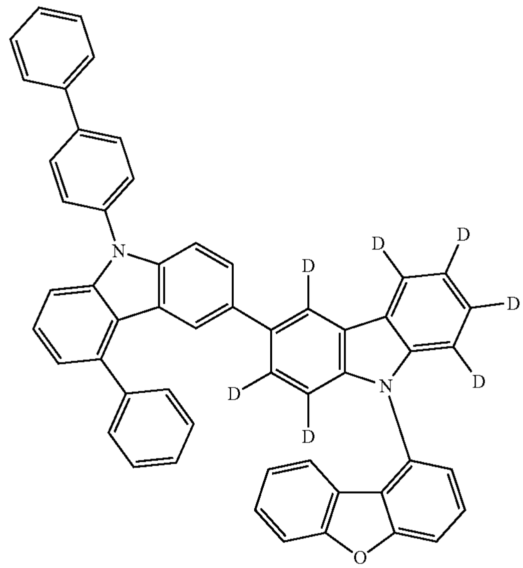
250
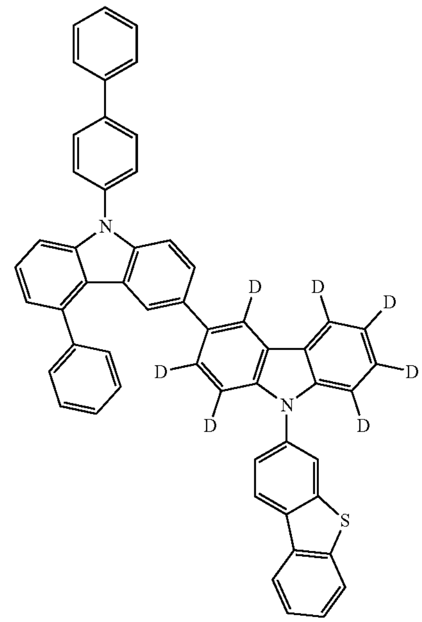
249
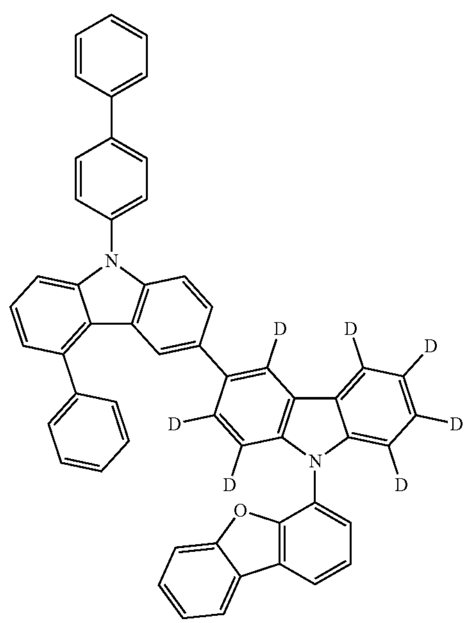
251
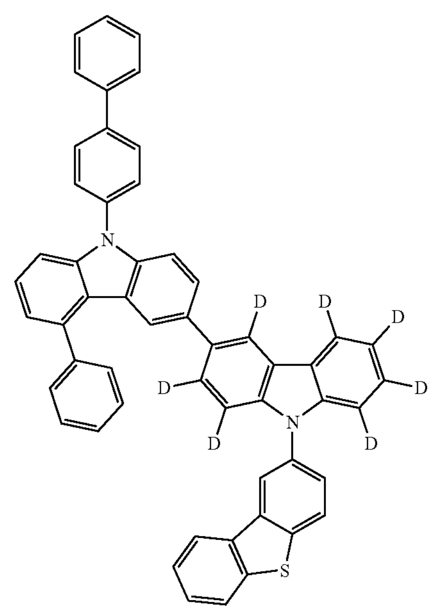

-continued
252
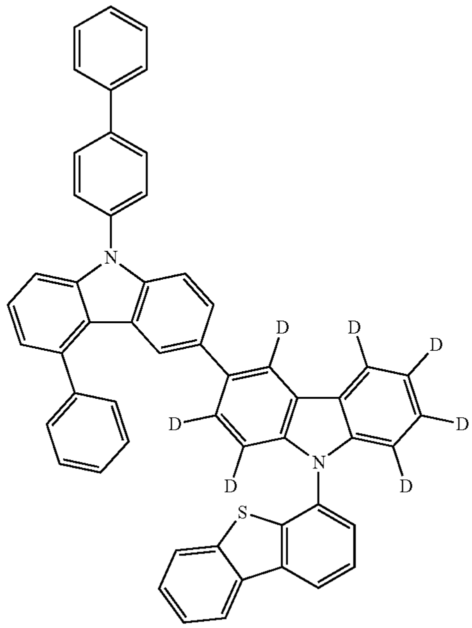
253
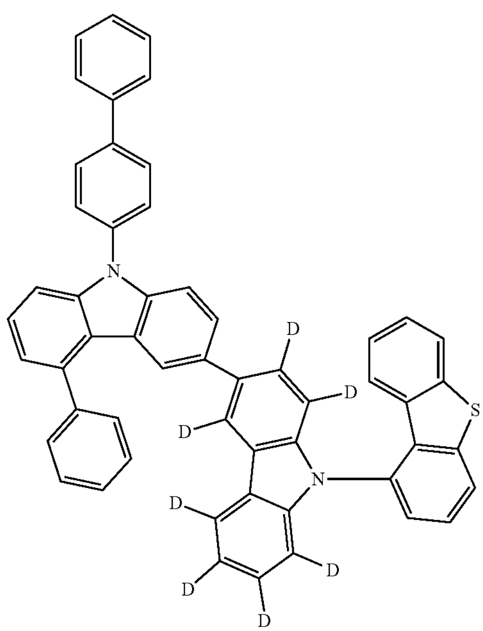
-continued
257
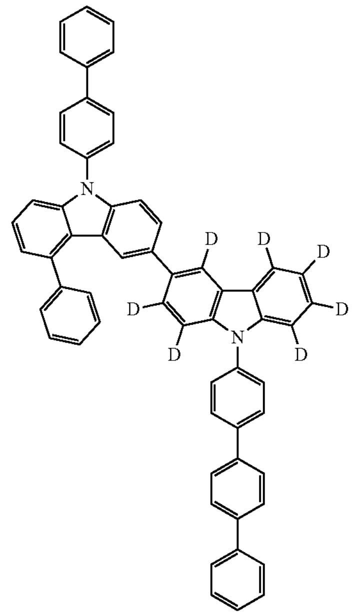
258
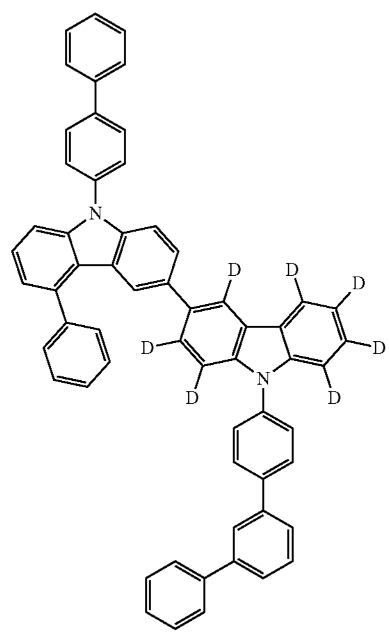

259
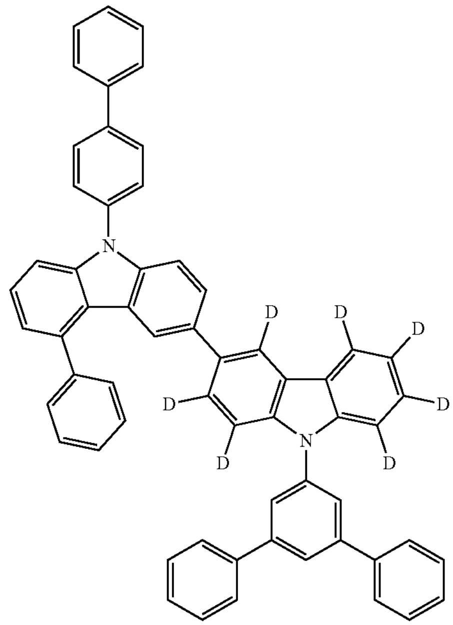
261
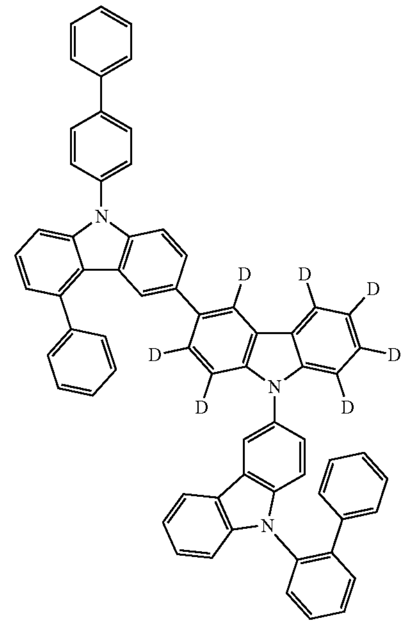
260
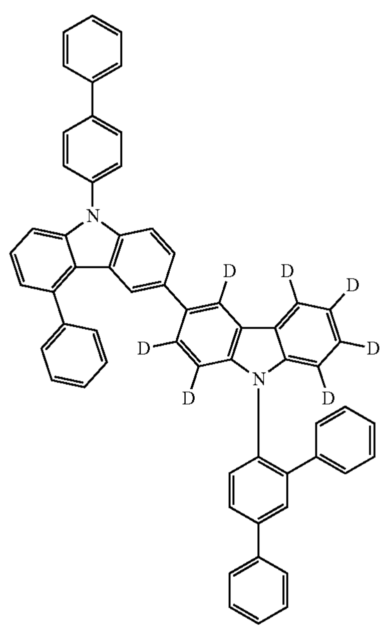
264
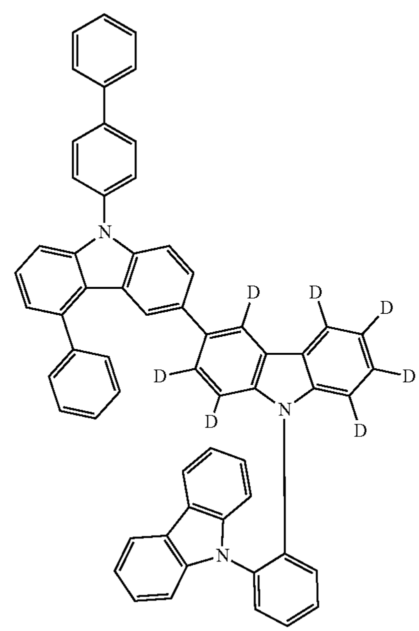

-continued
265
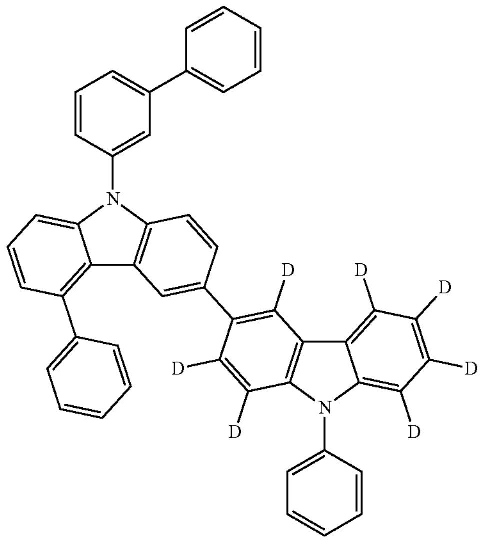
269
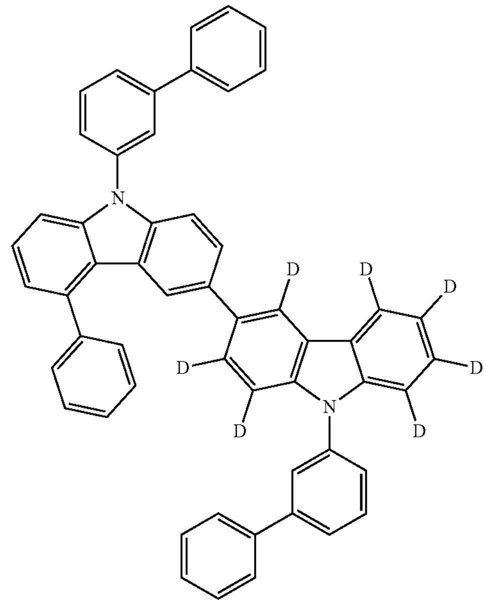
268
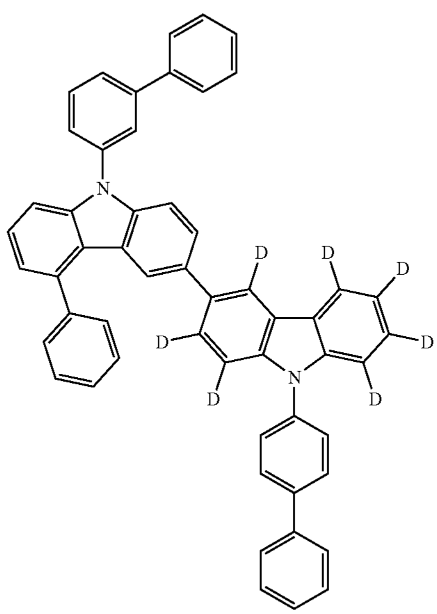
270
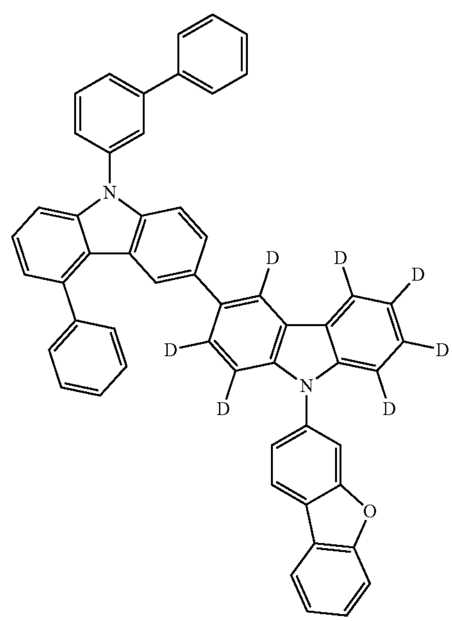

-continued
271
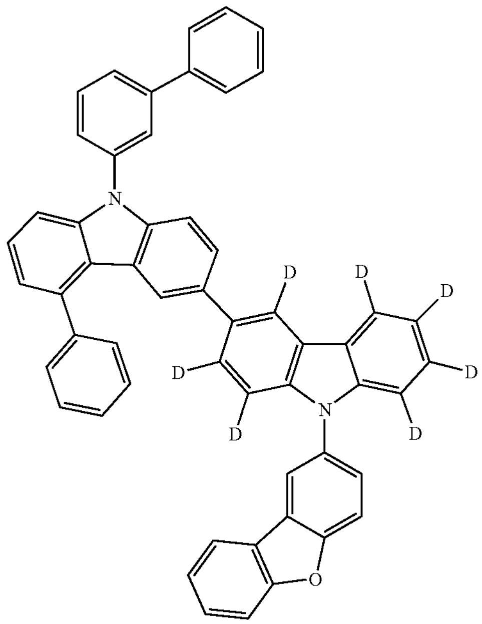
272
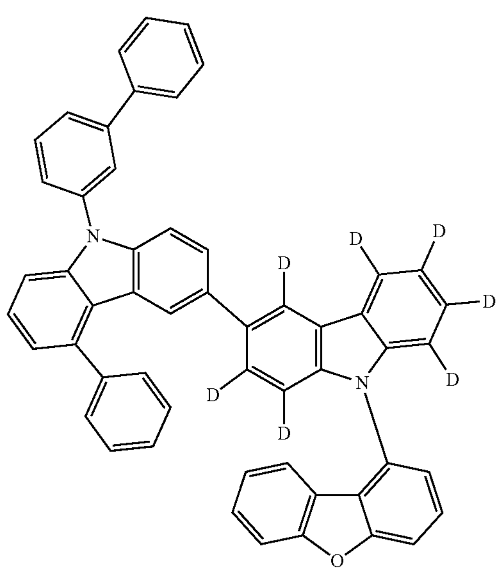
-continued
273
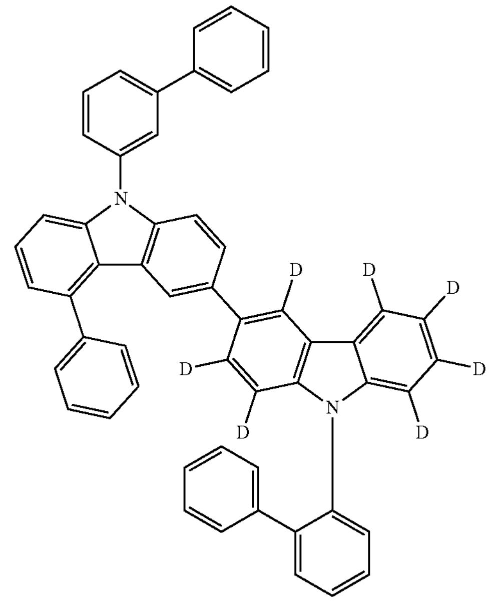
274
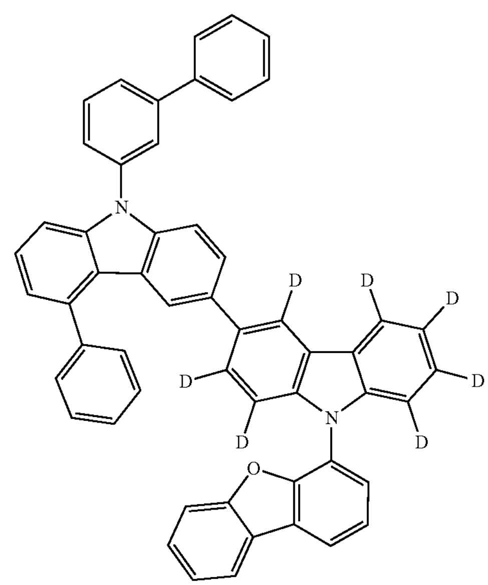

-continued
275
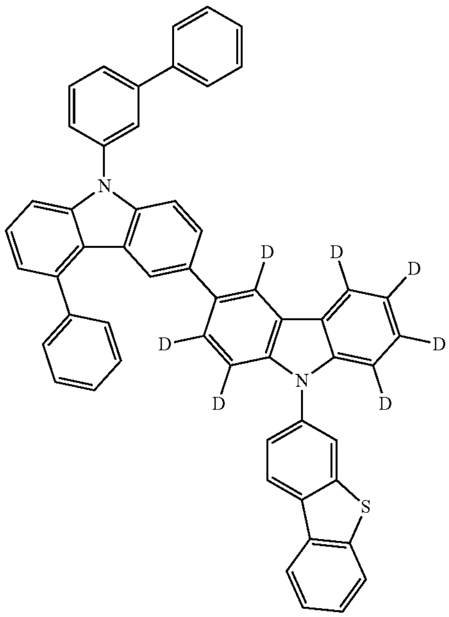
276
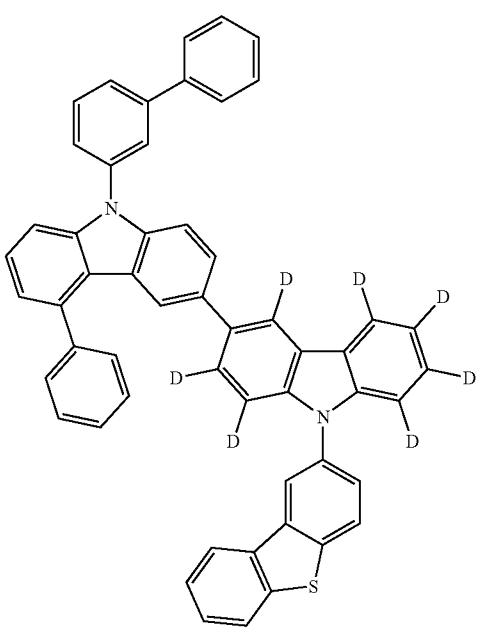
-continued
277
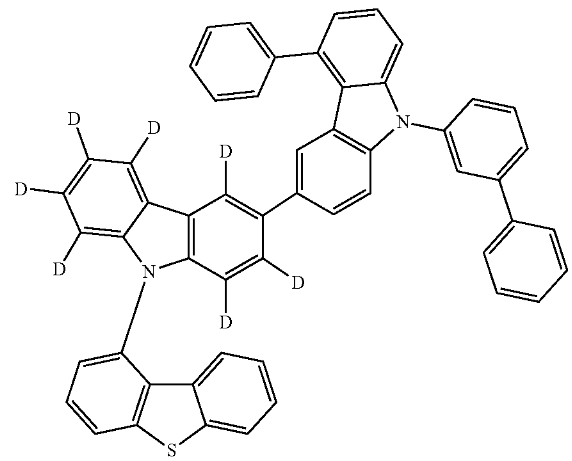
278
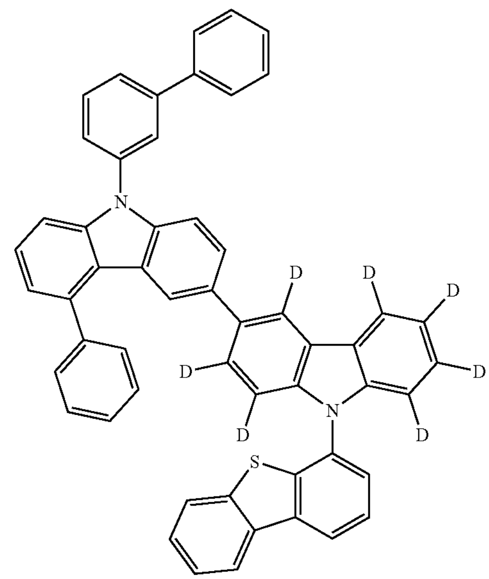
282
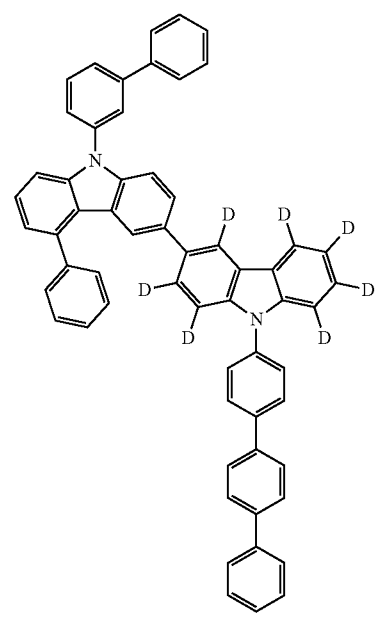

-continued
283
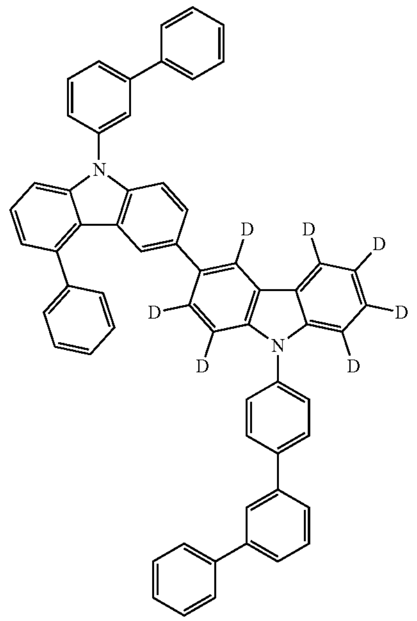
284
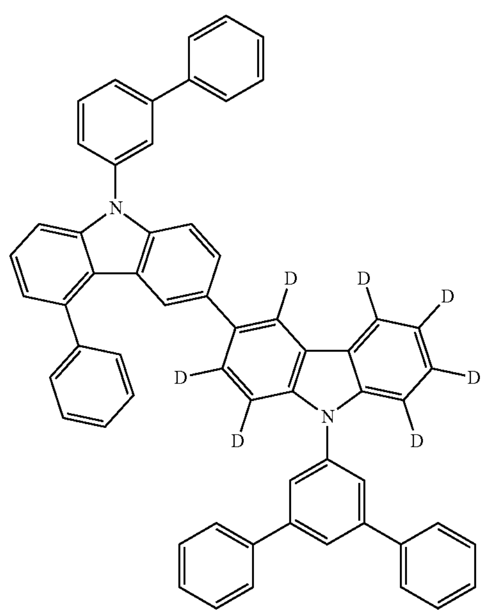
-continued
285
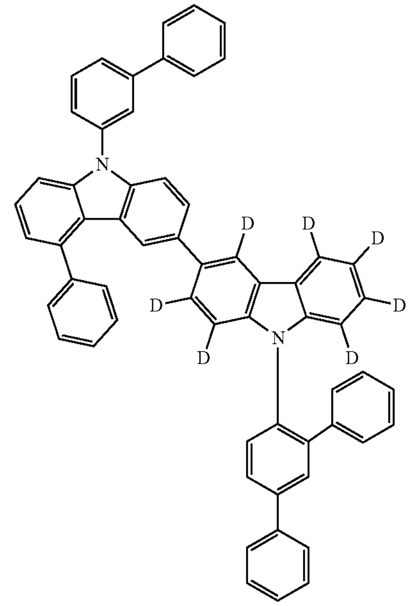
286
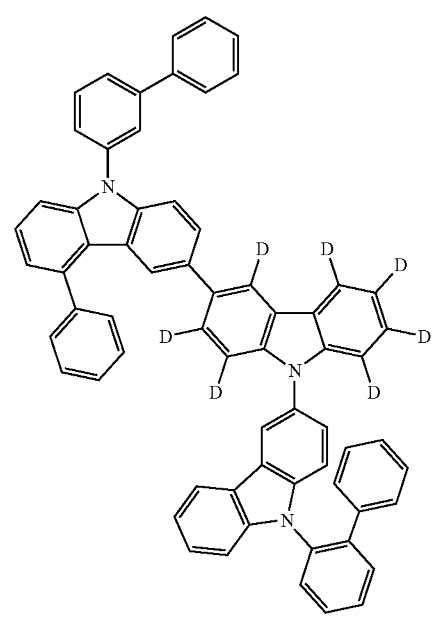

-continued
287
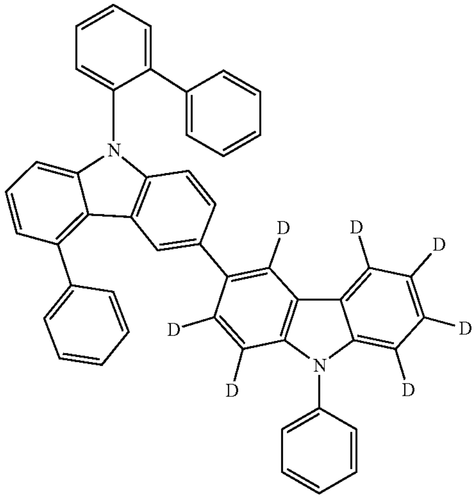
290
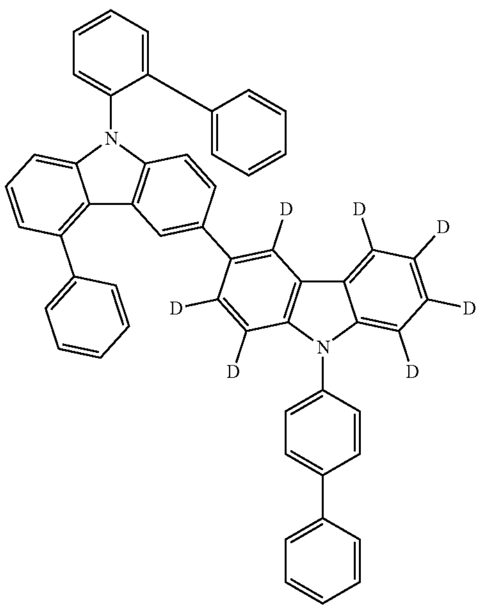
291
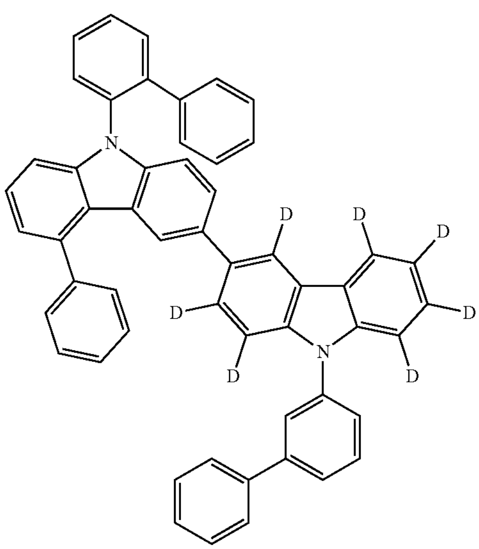
-continued
292
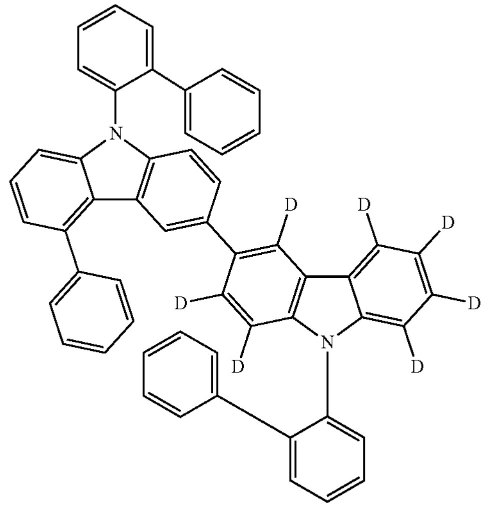
293
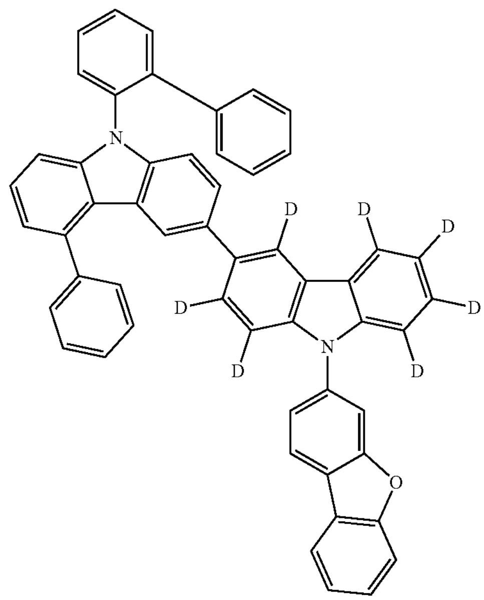
294
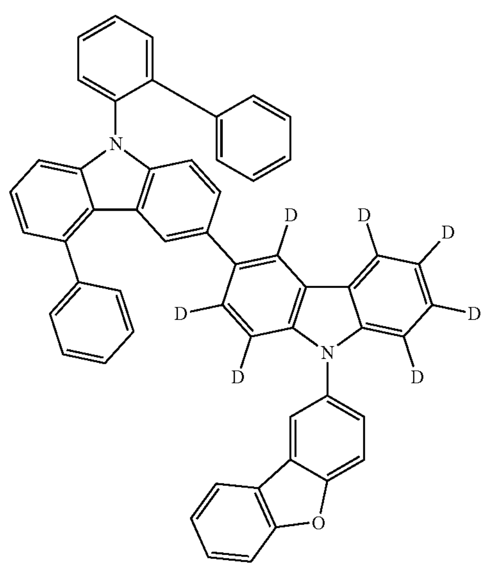

-continued
295
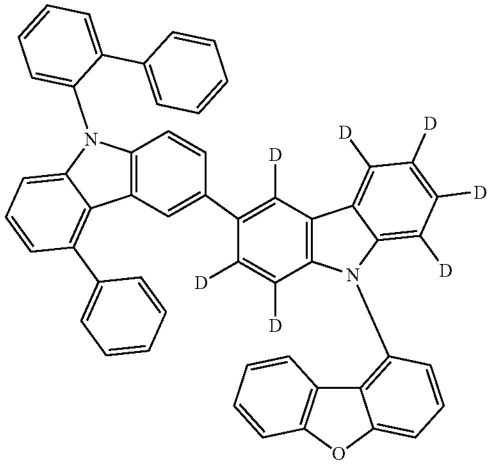
296
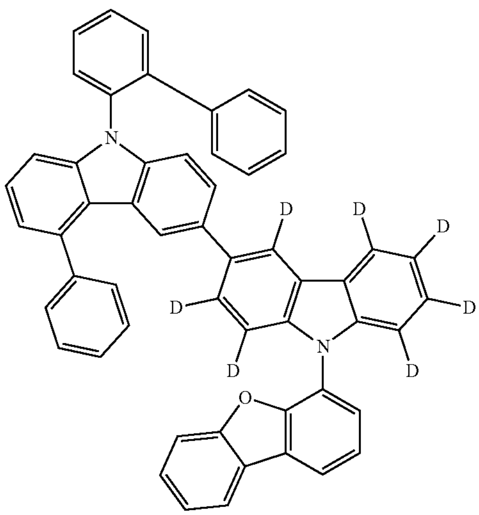
297
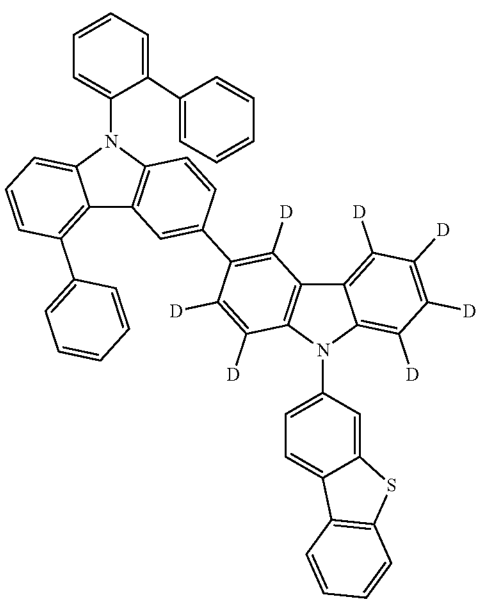
-continued
298
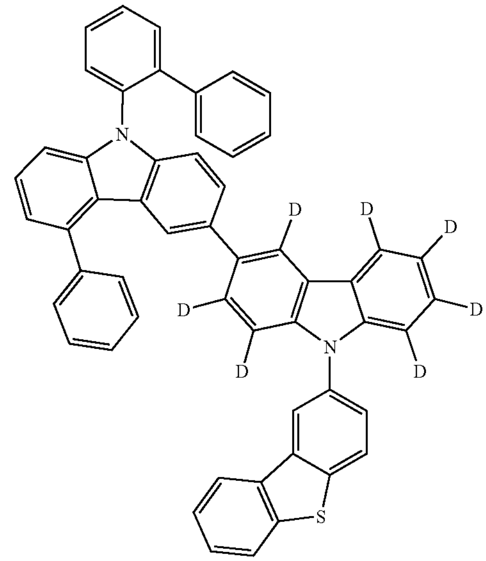
299
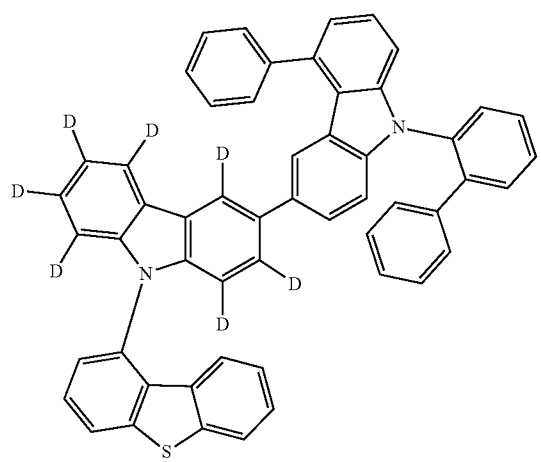
300
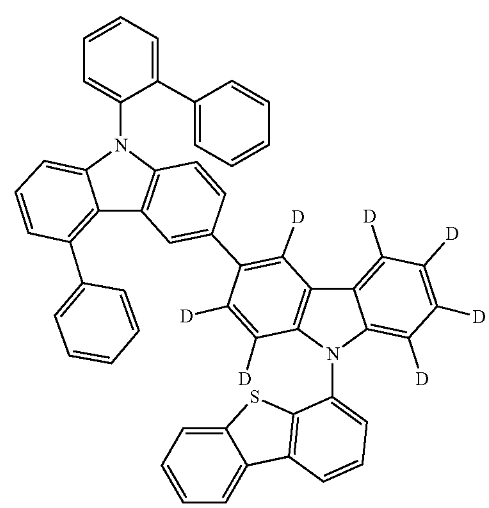

-continued
304
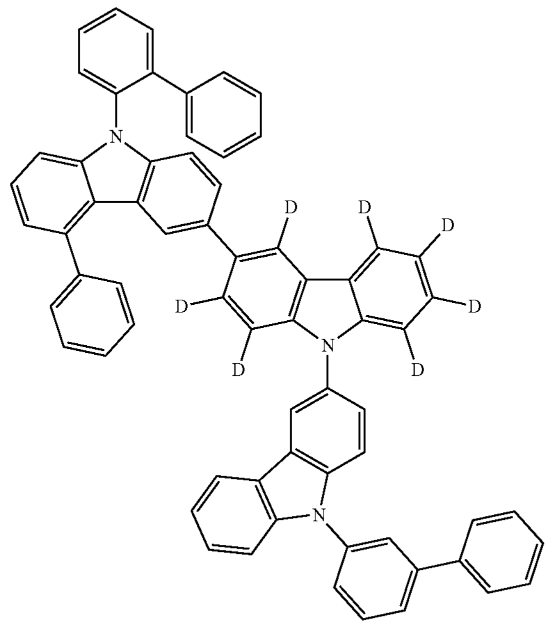
305
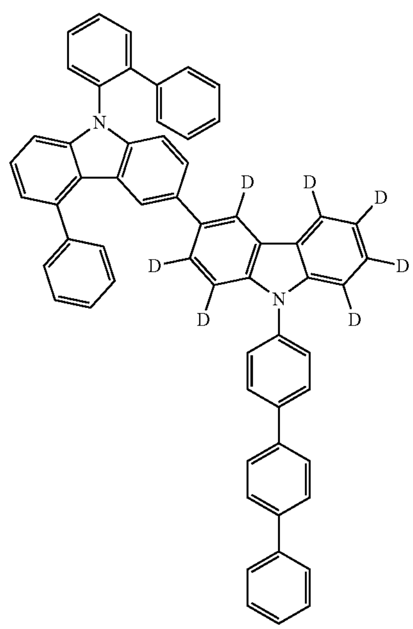
306
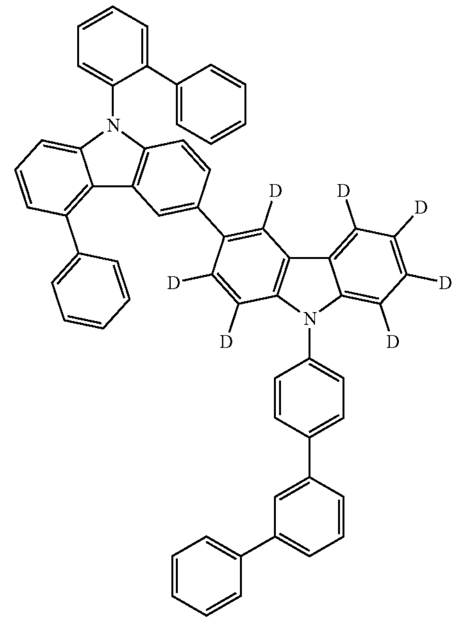
307
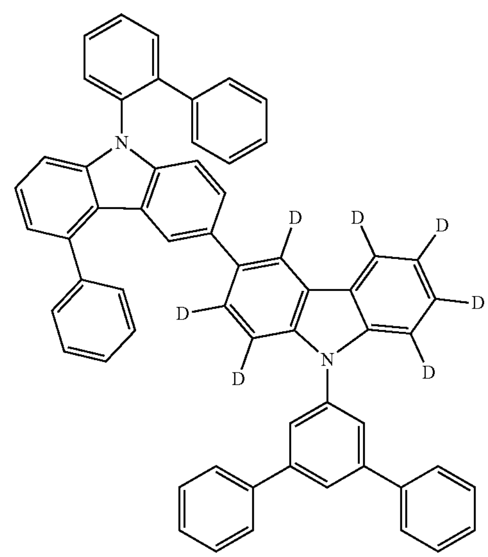

-continued
308
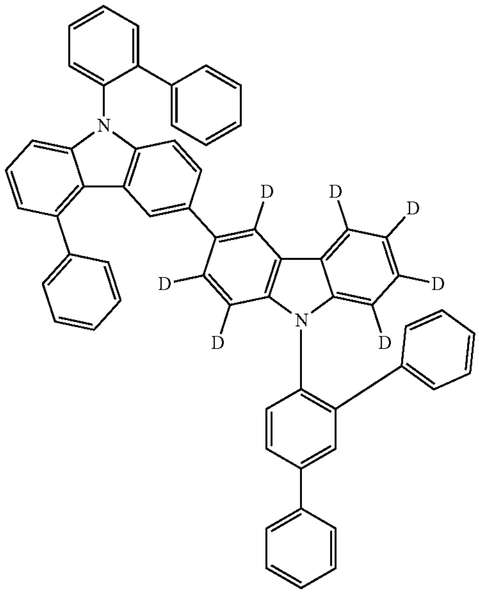
311
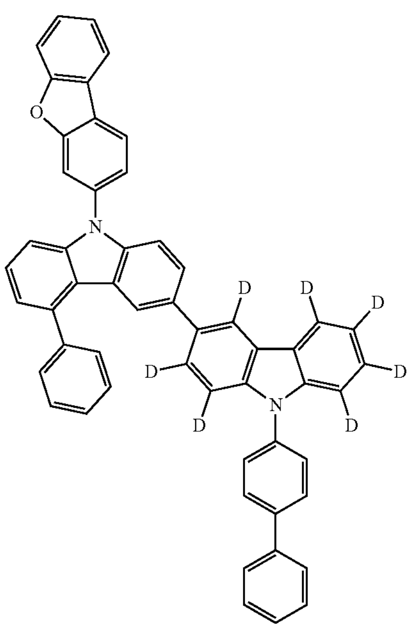
312
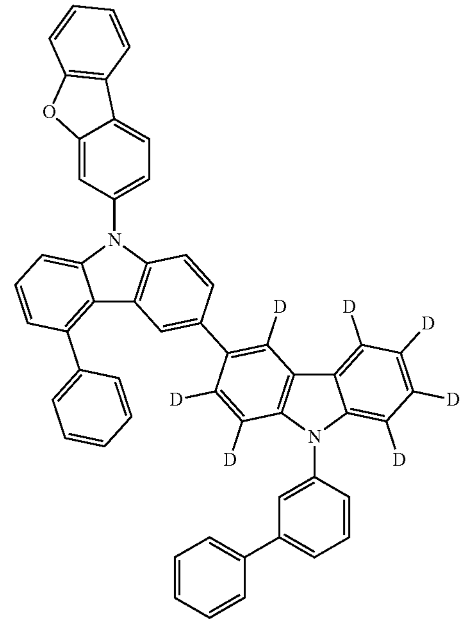
313
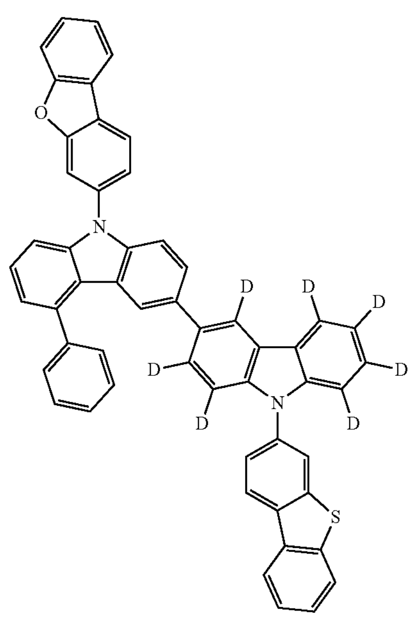

-continued
314
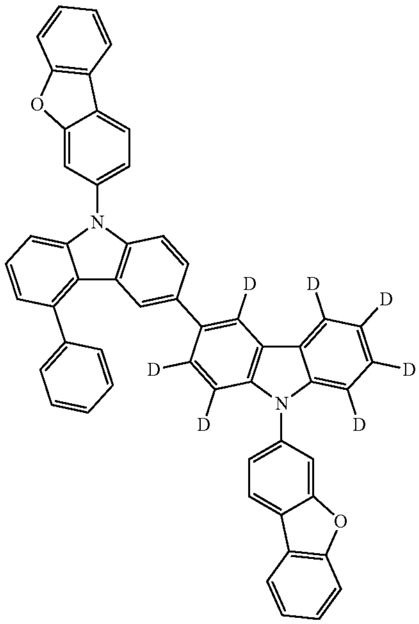
315
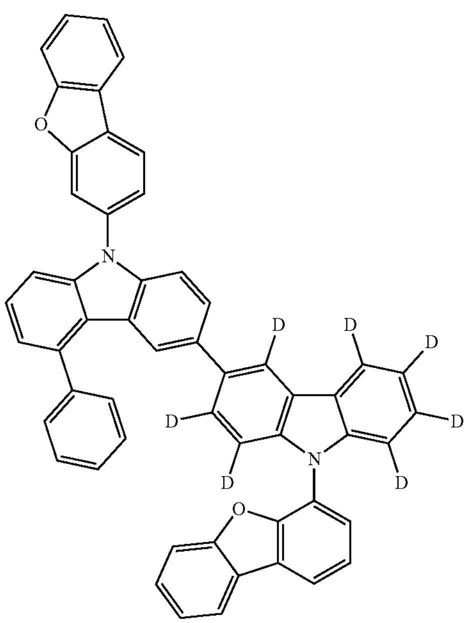
-continued
316
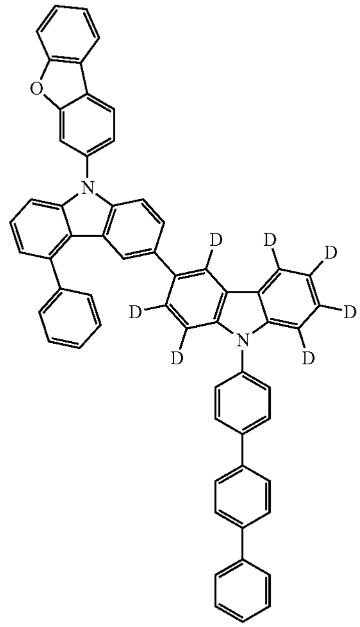
317
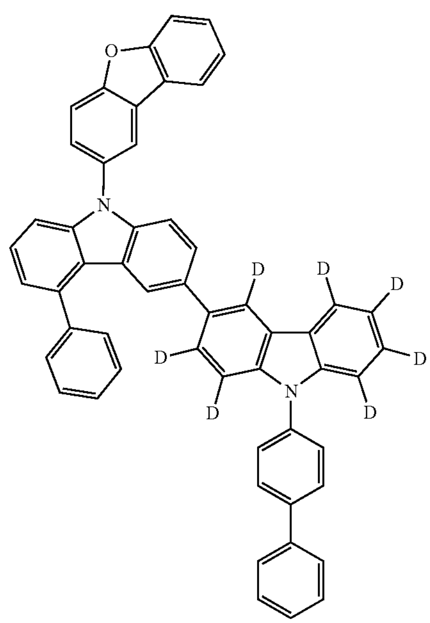

-continued
318
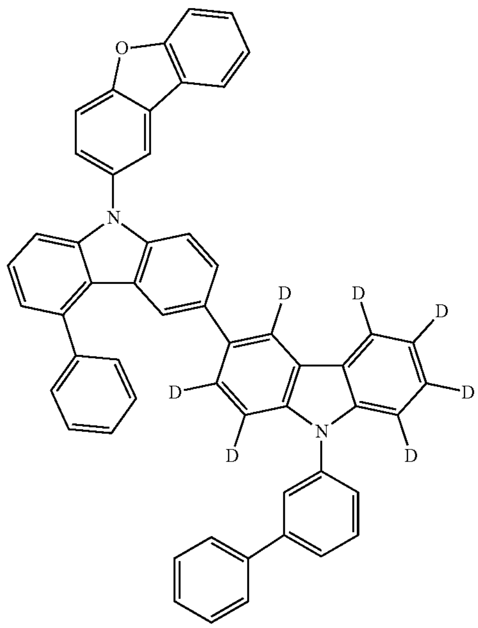
319
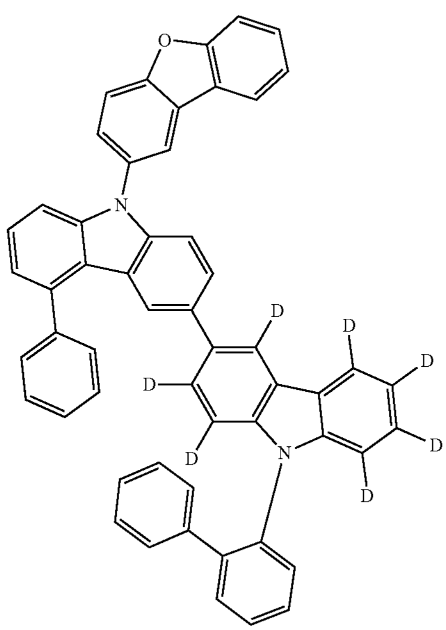
-continued
320
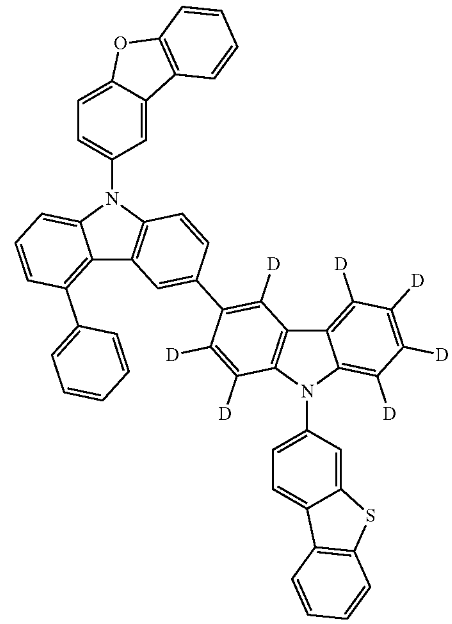
321
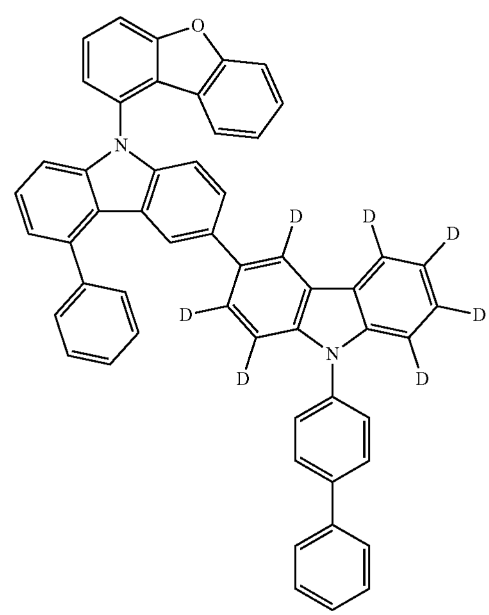

-continued
322
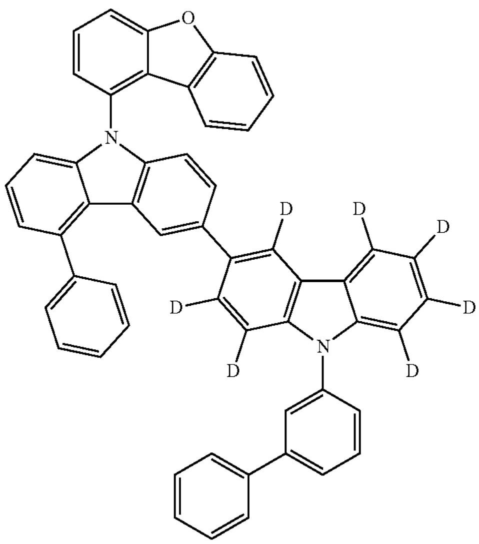
323
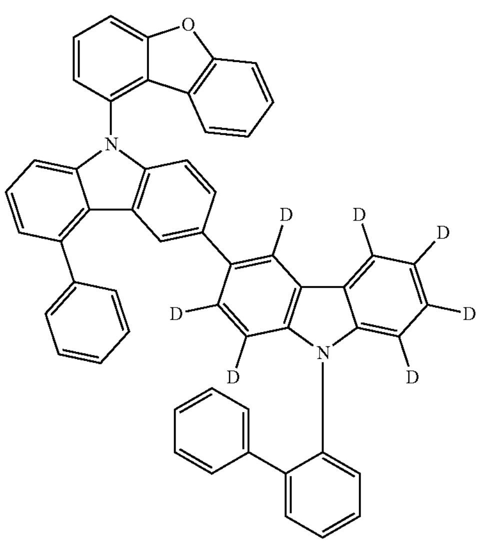
-continued
324
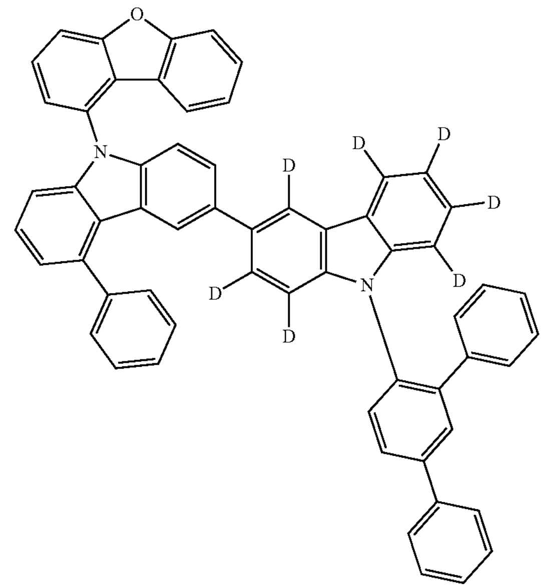
325
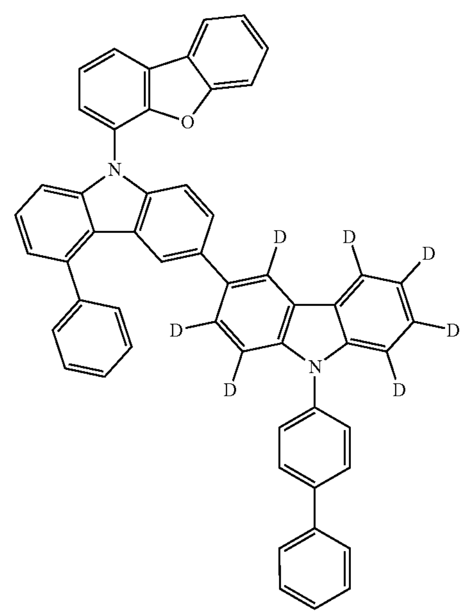

-continued
326
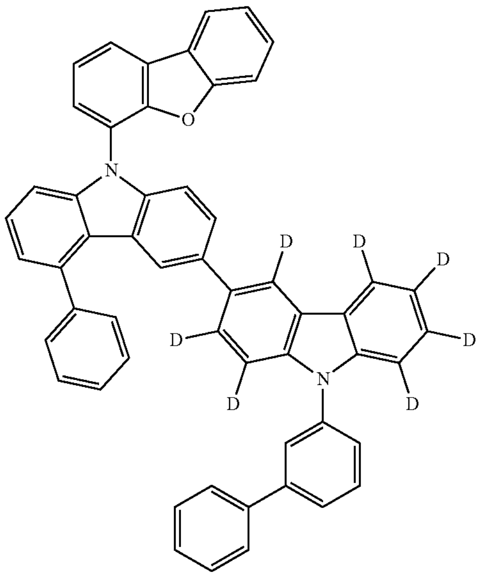
327
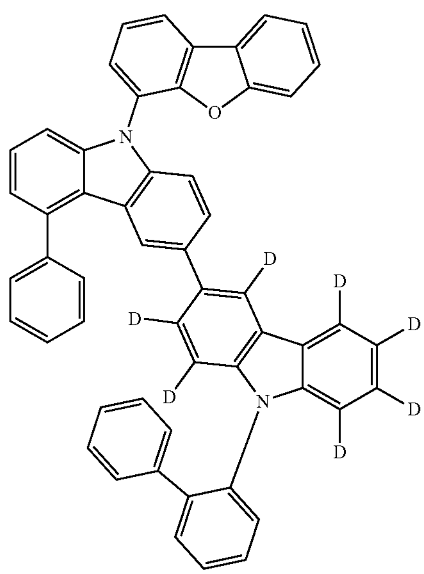
-continued
328
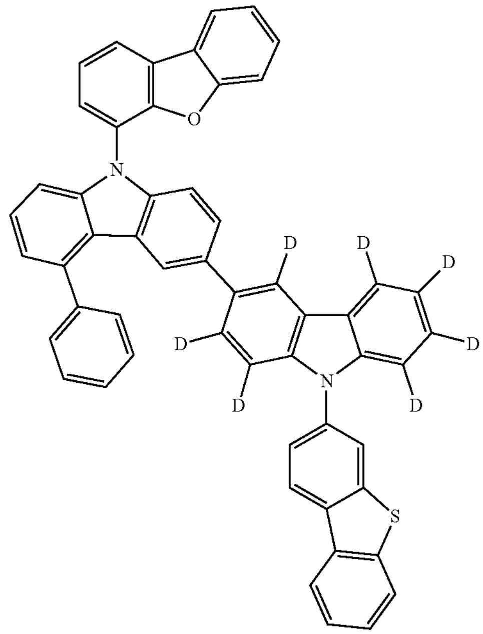
329
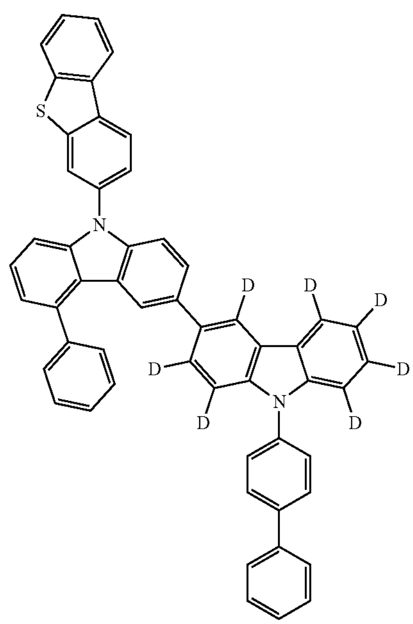

-continued
330
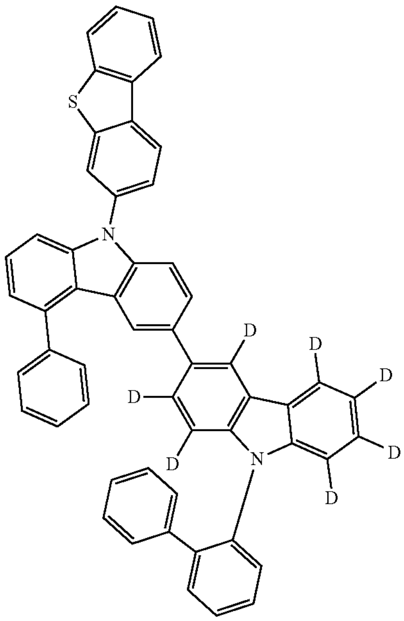
331
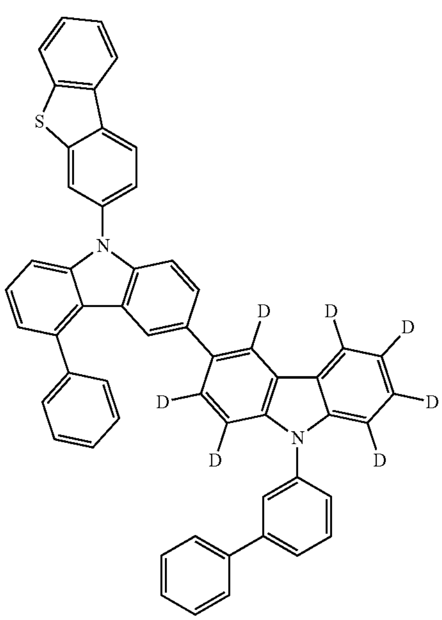
-continued
332
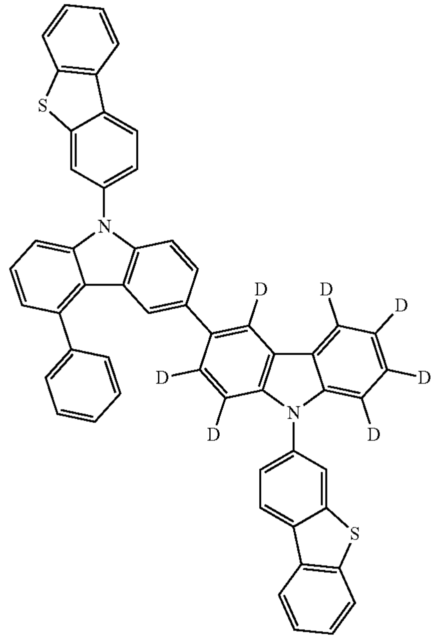
333
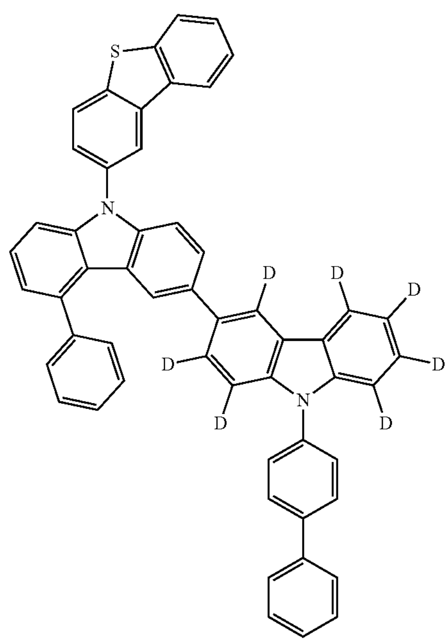

-continued
334
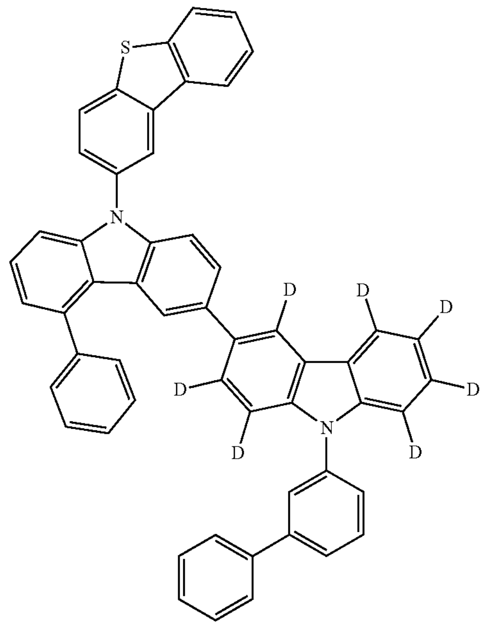
335
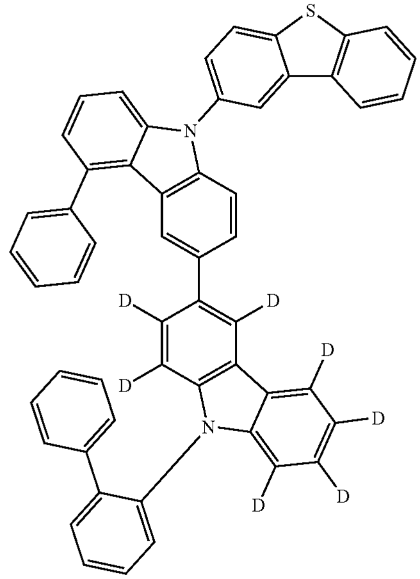
-continued
336
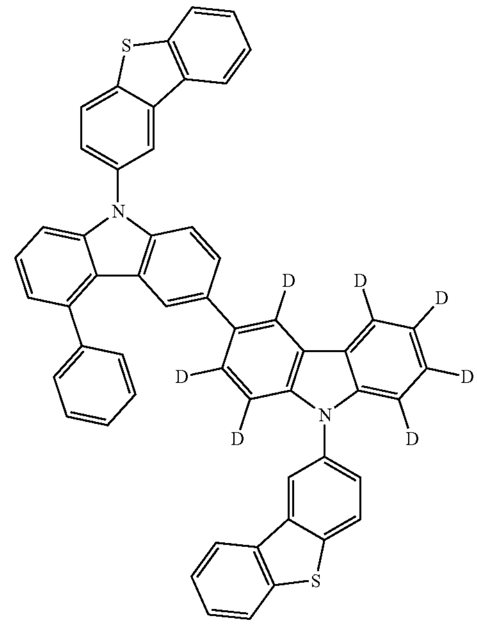
337
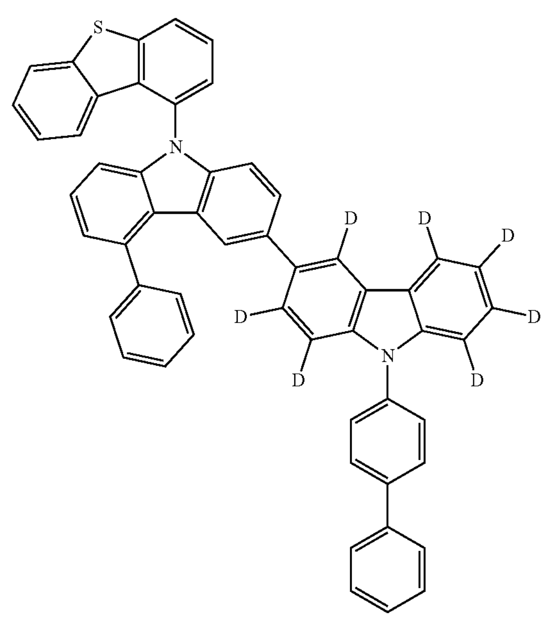

-continued
338
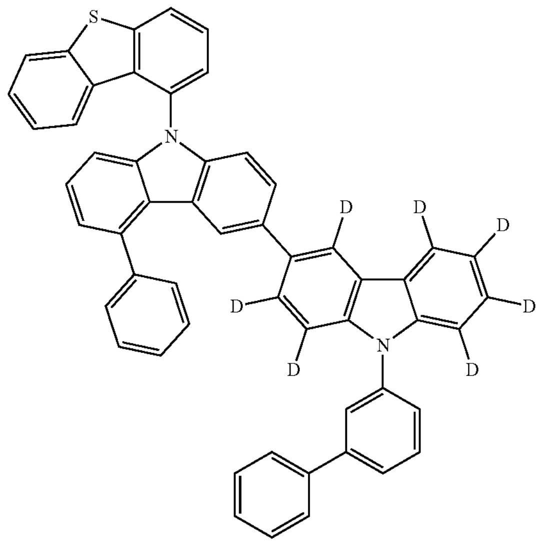
339
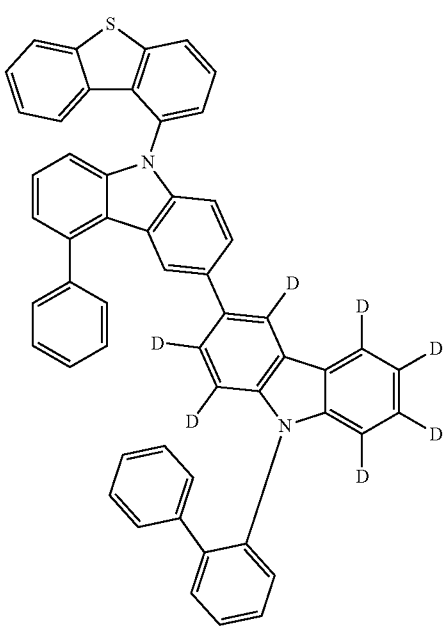
-continued
340
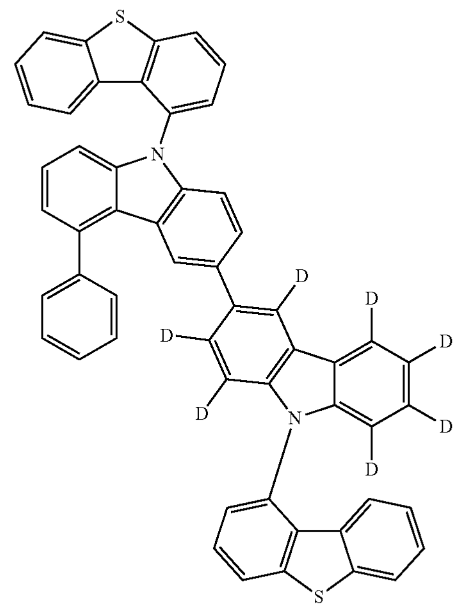
341
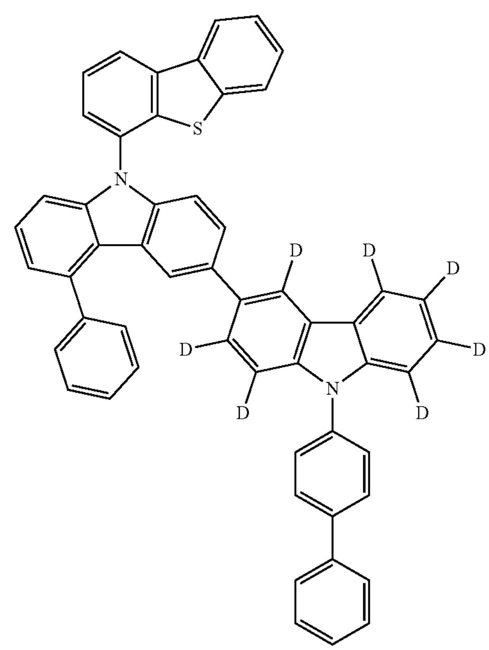

342
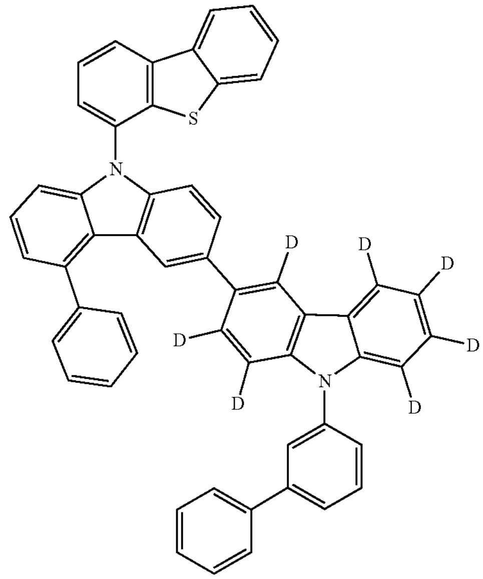
343
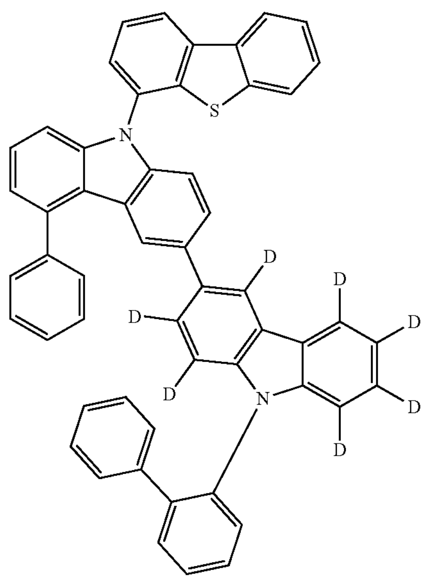
344
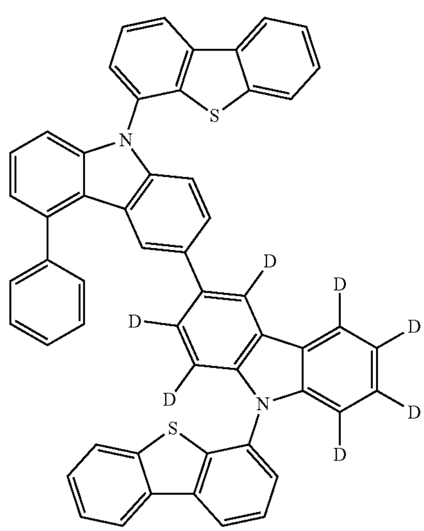
345
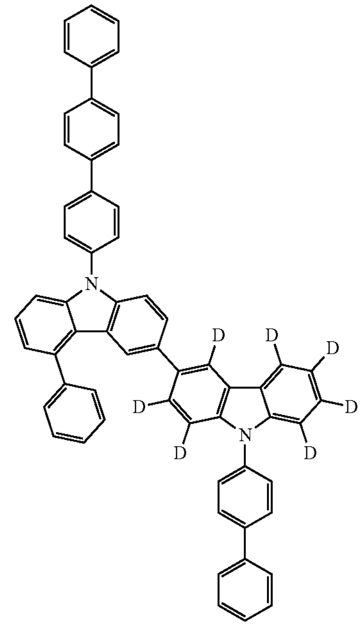
346
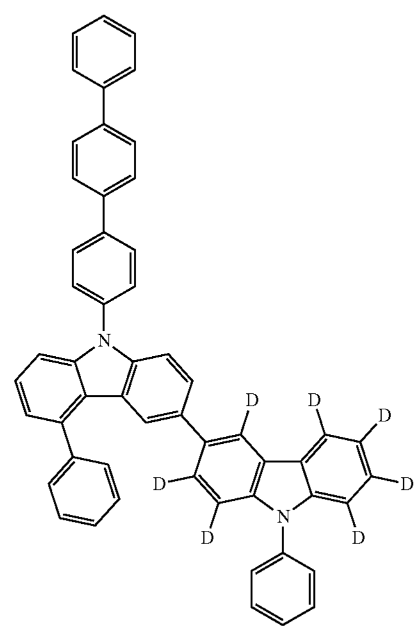

-continued
347
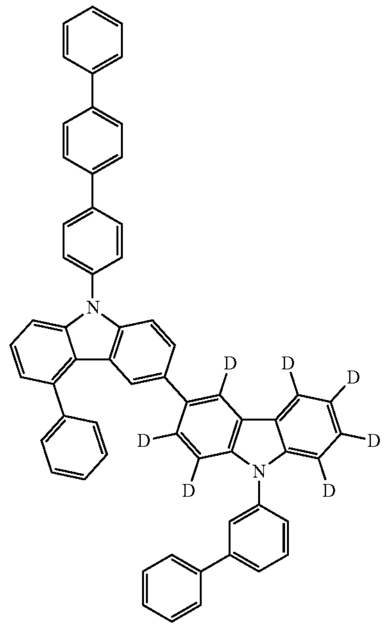
349
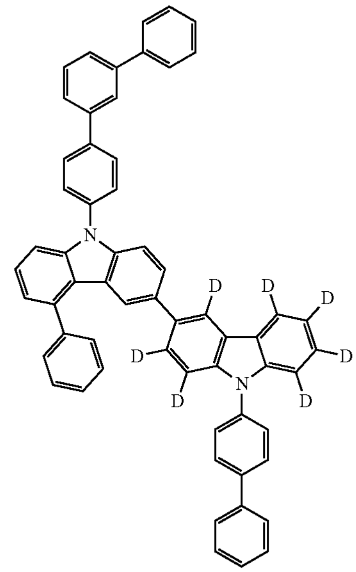
348
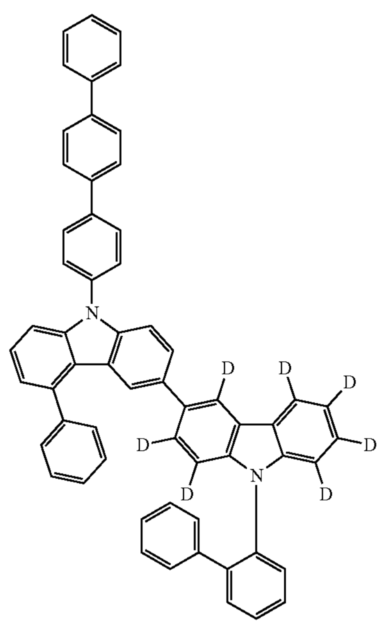
350
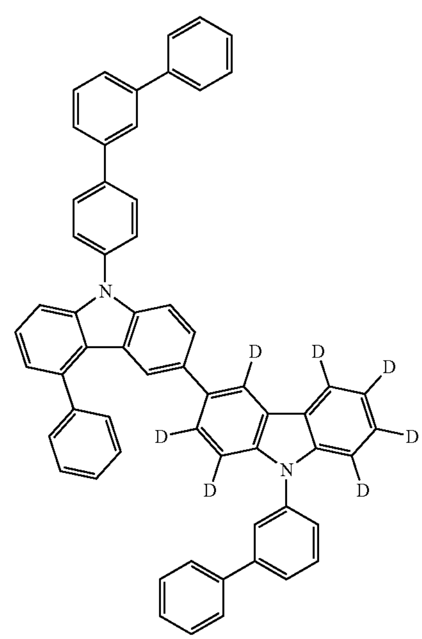

-continued
351
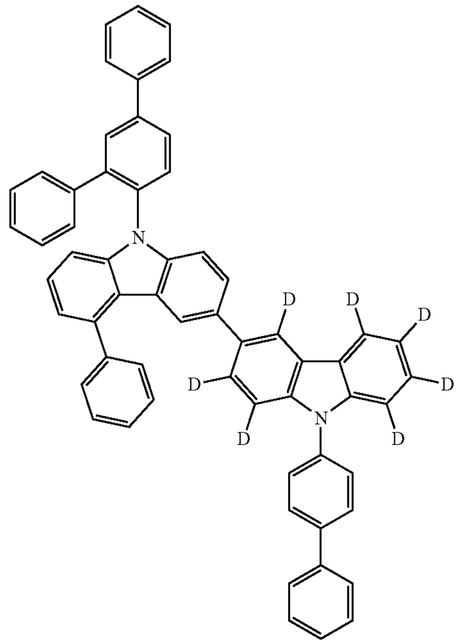
352
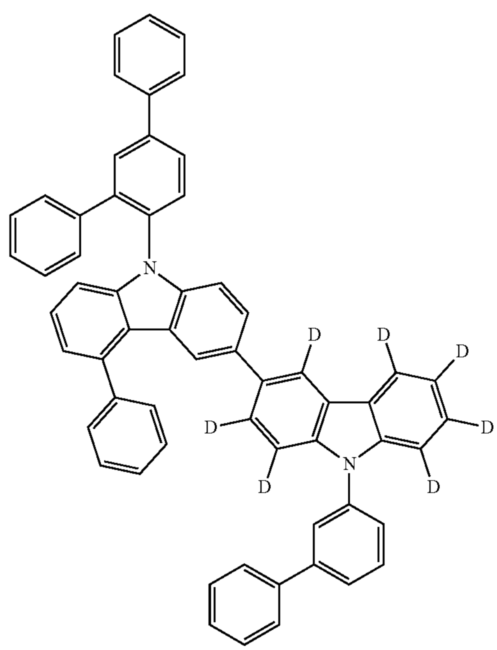
-continued
353
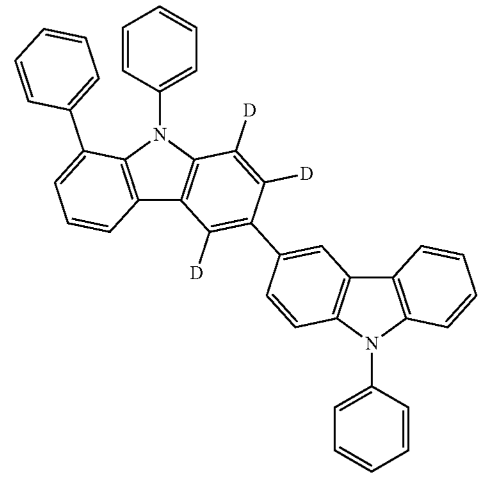
354
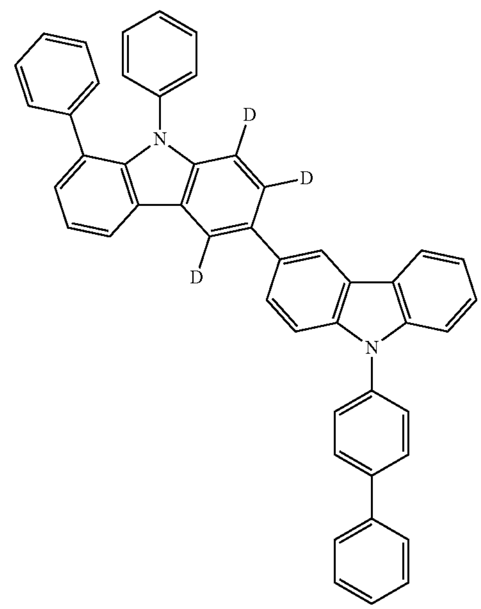
355
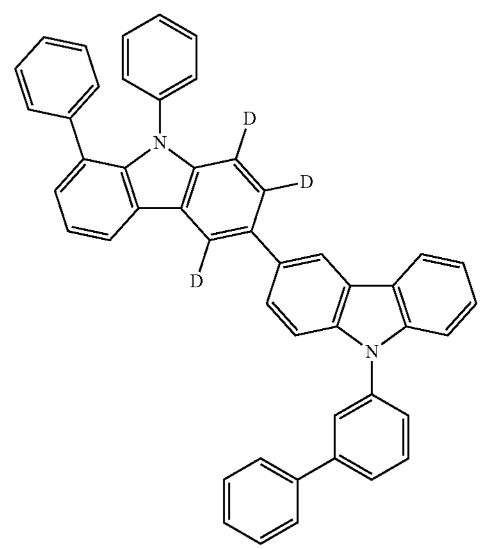

-continued
356
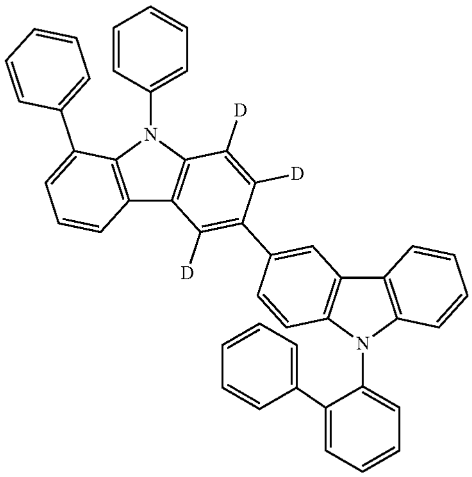
357
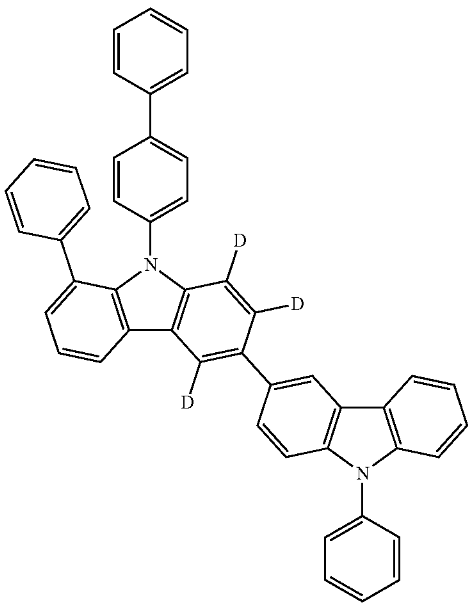
358
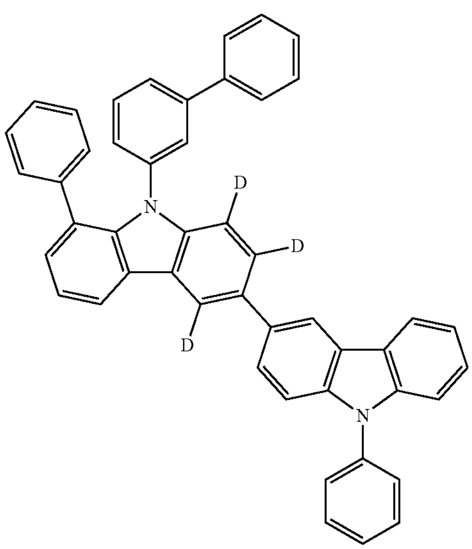
-continued
359
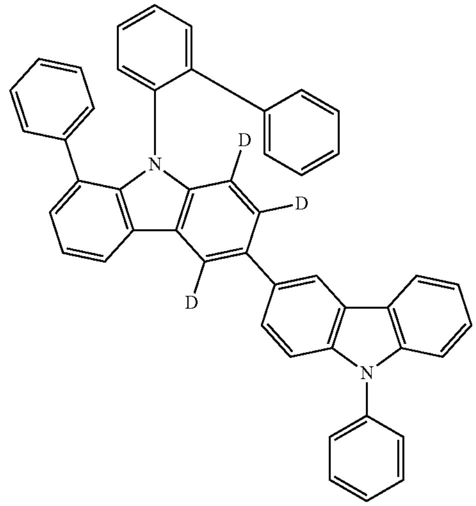
360
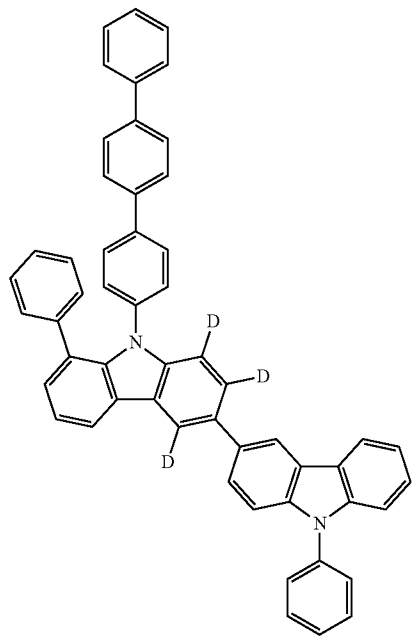
361
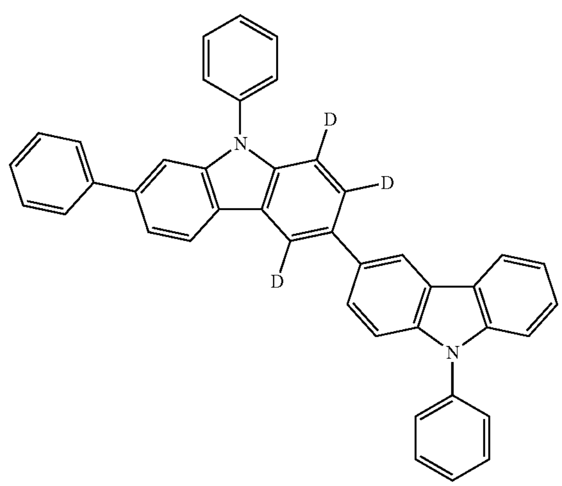

362
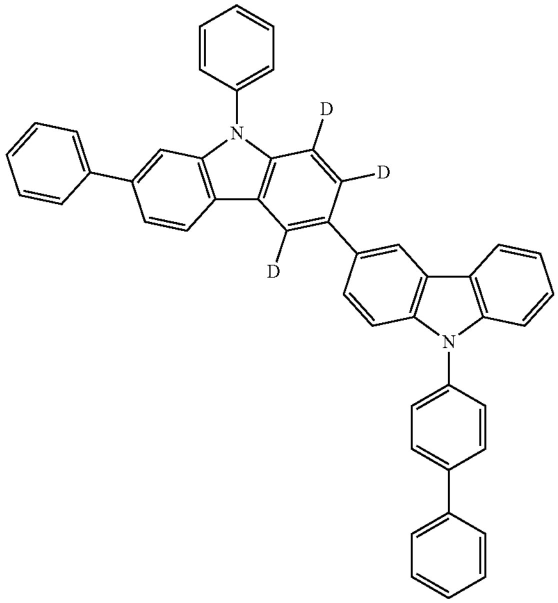
363
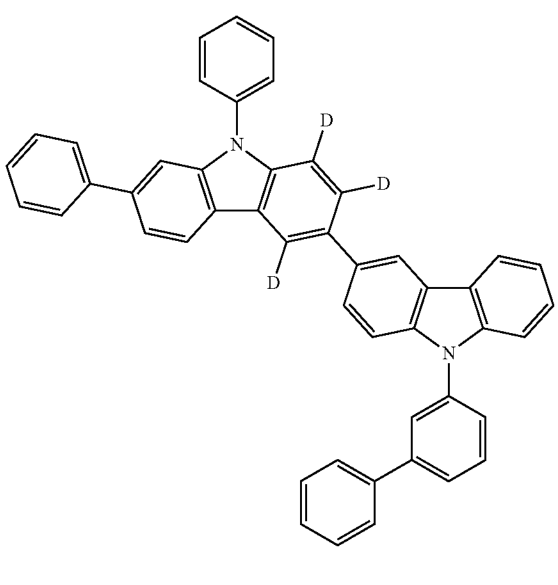
364
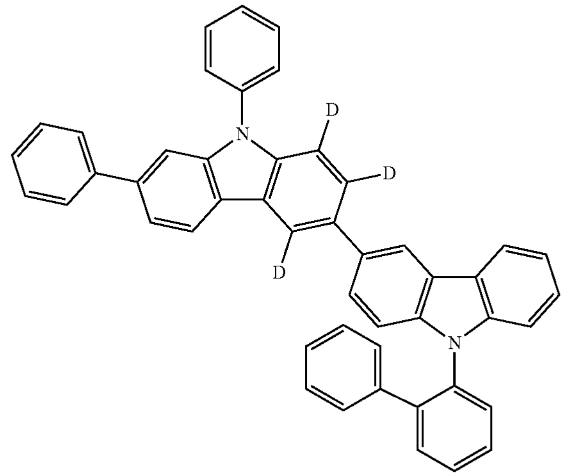
365
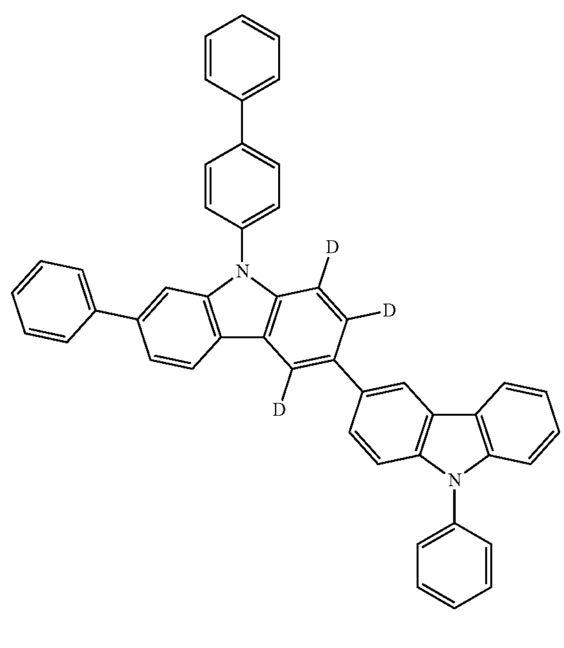

-continued
366
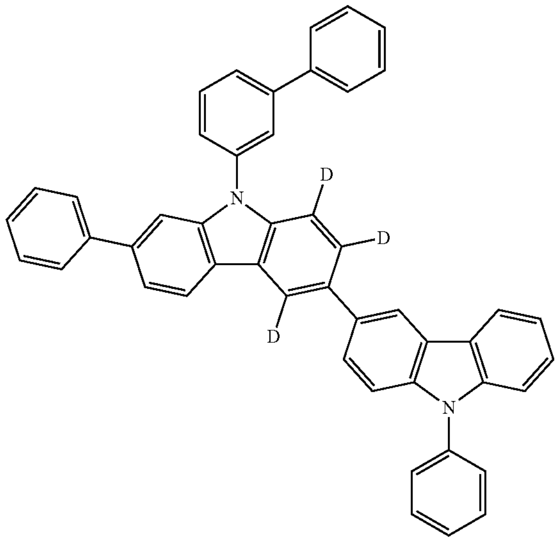
368
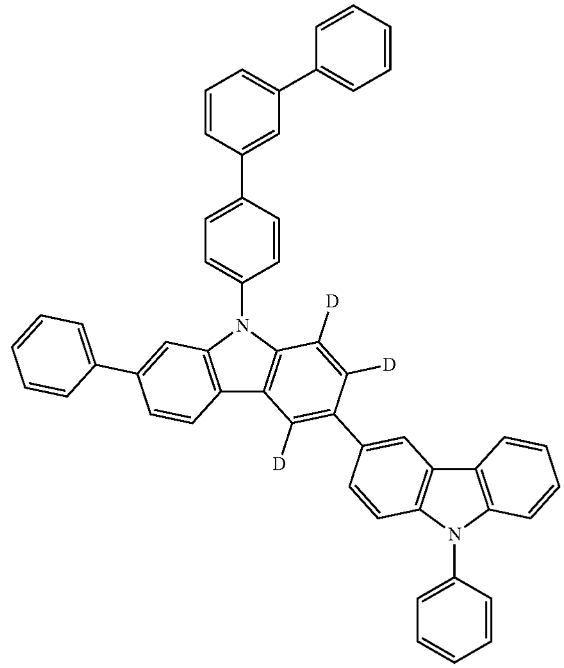
367
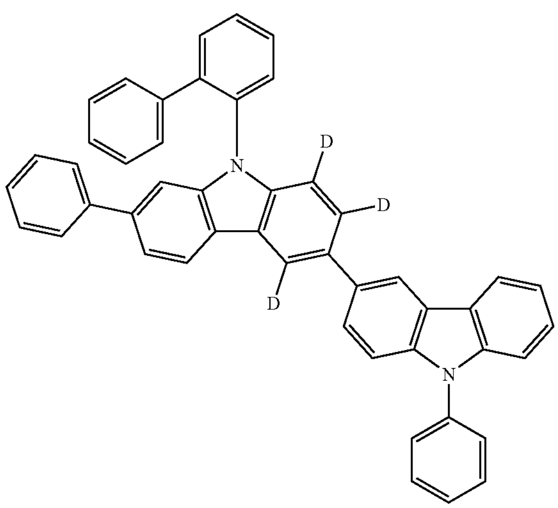
369
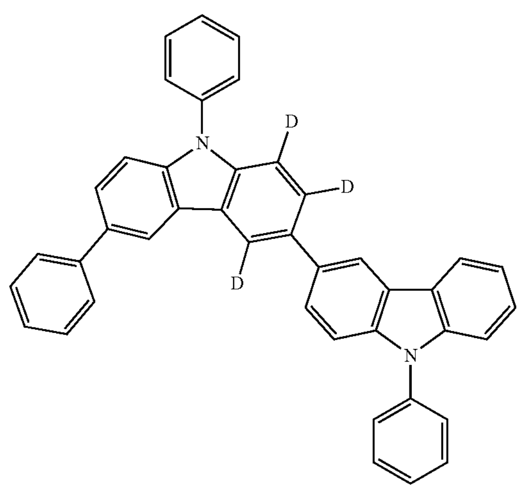

-continued
370
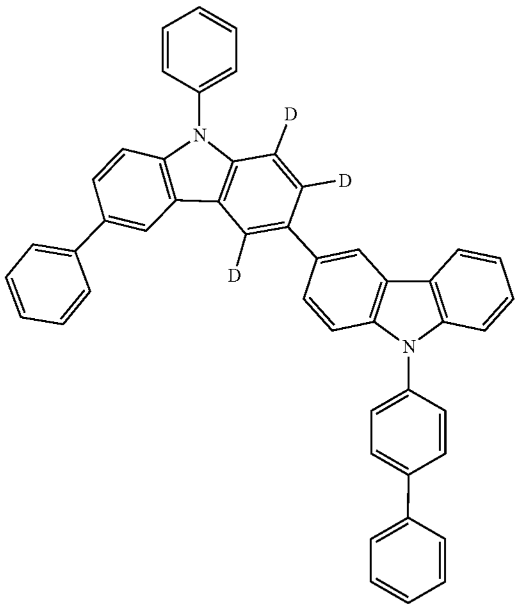
371
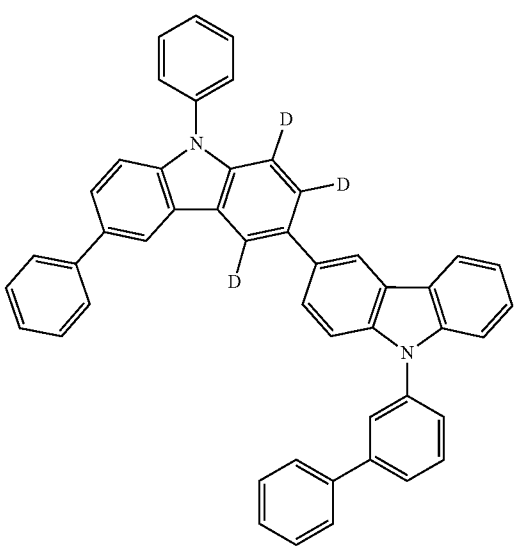
-continued
372
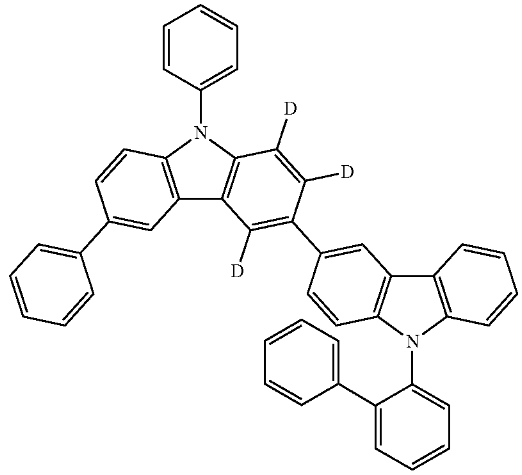
373
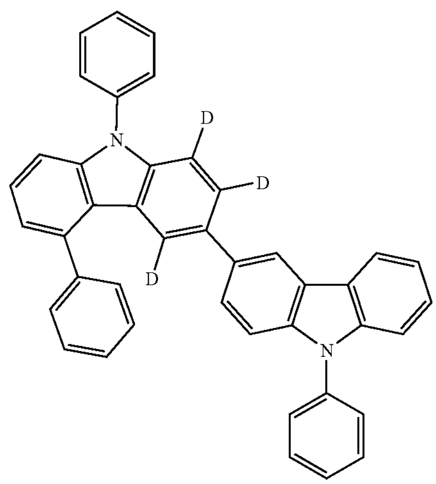
374
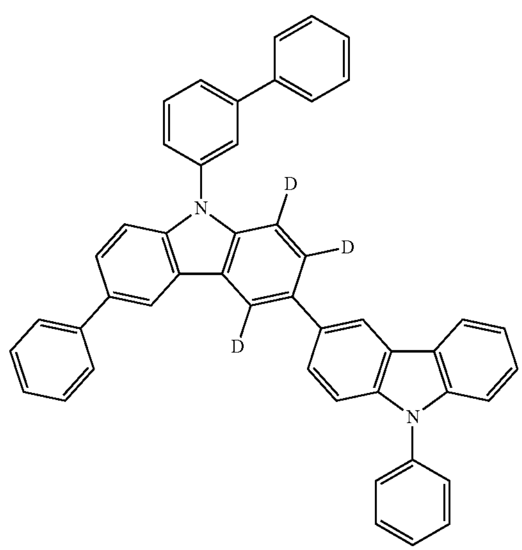

-continued
375
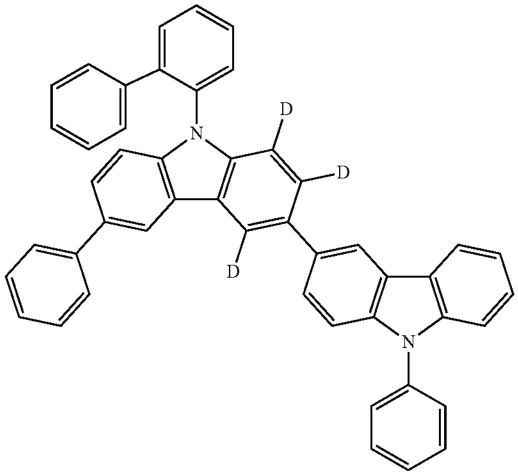
376
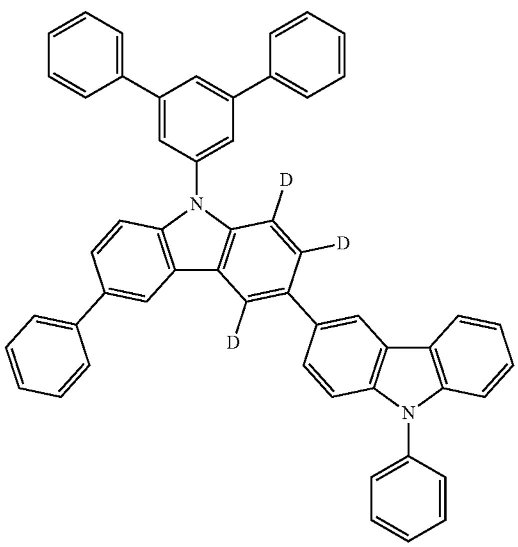
377
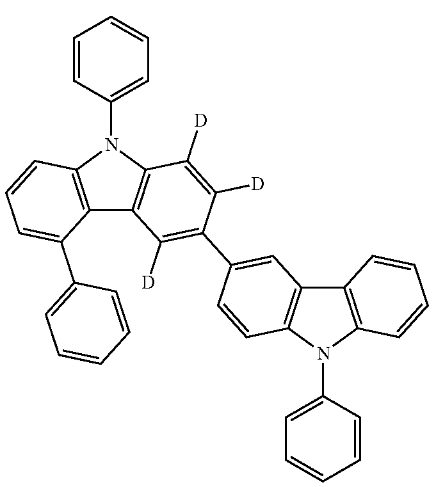
-continued
378
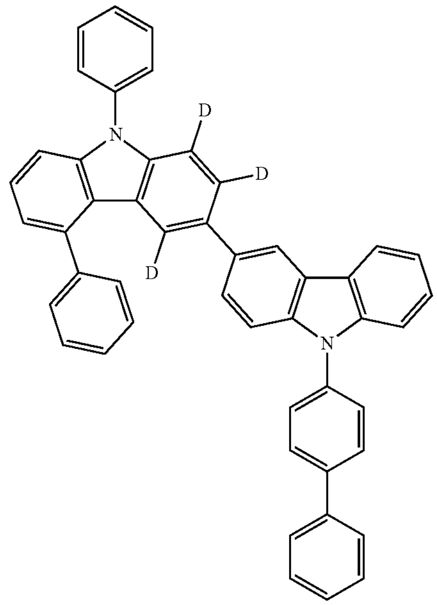
379
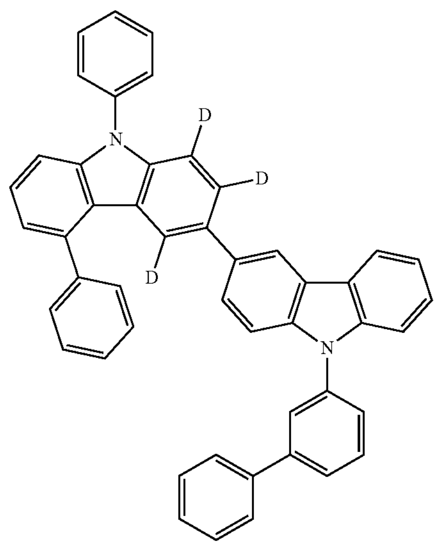
380
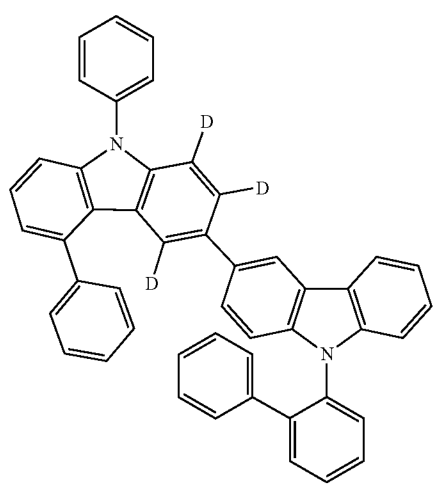

-continued
381
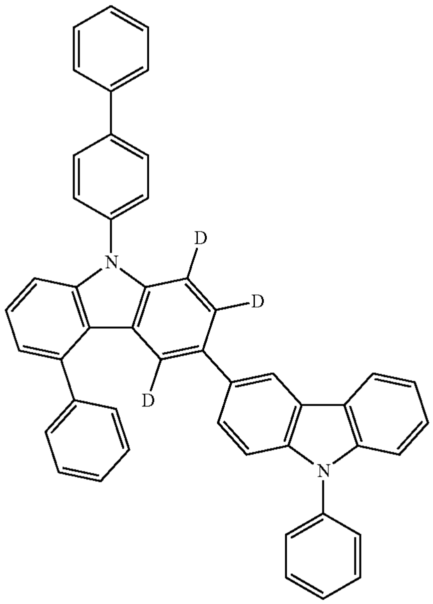
382
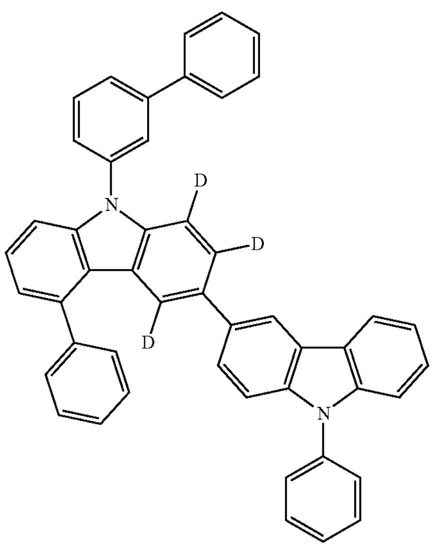
383
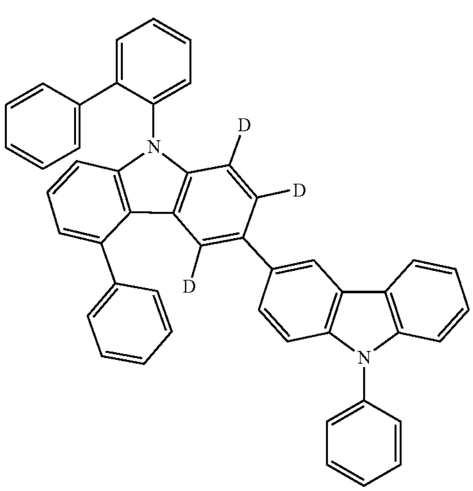
-continued
384
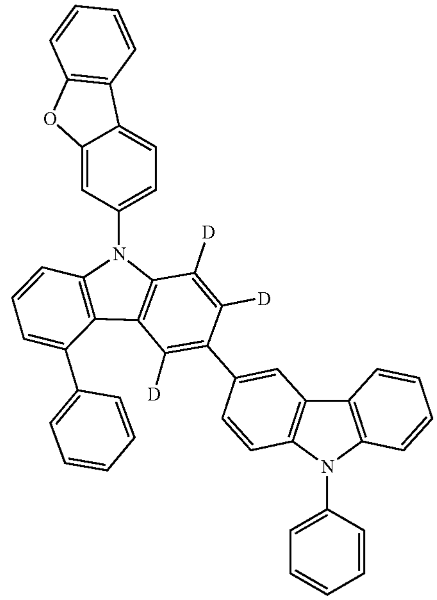
385
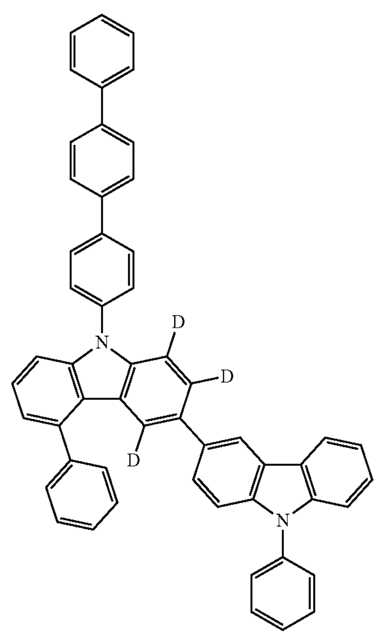

-continued
386
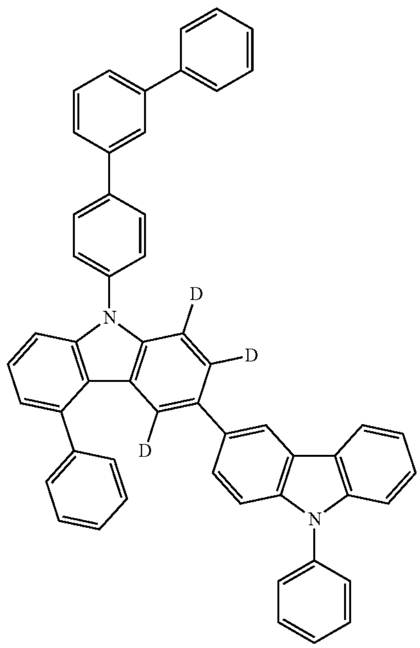
387
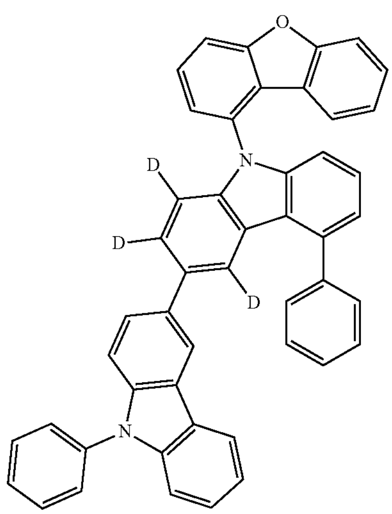
388
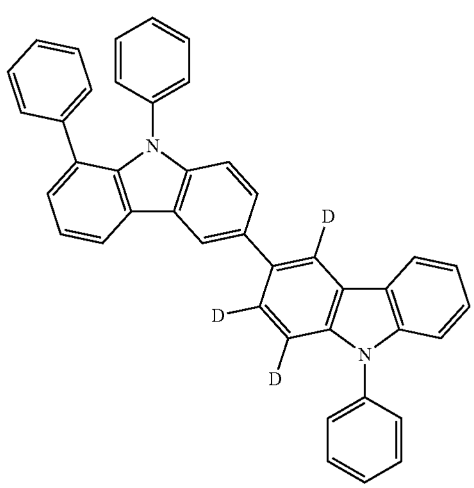
-continued
389
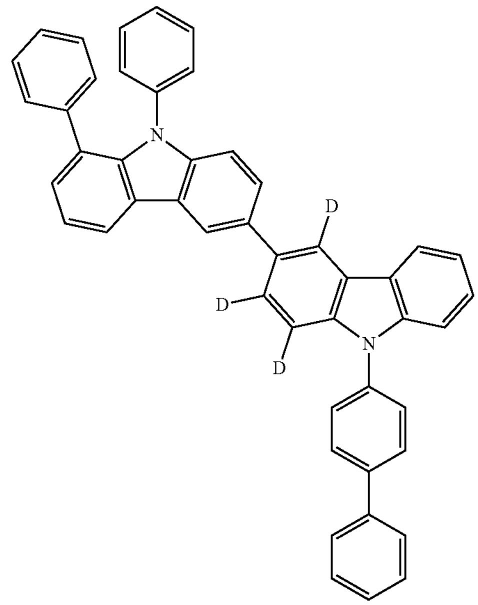
390
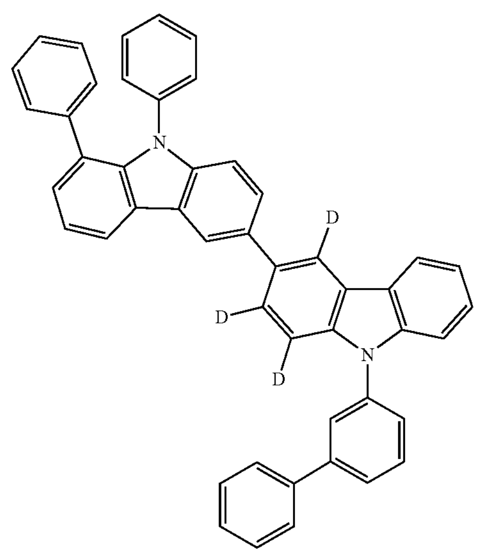
391
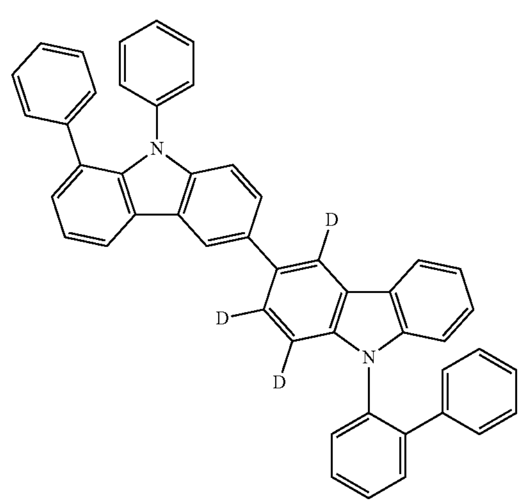

-continued
392
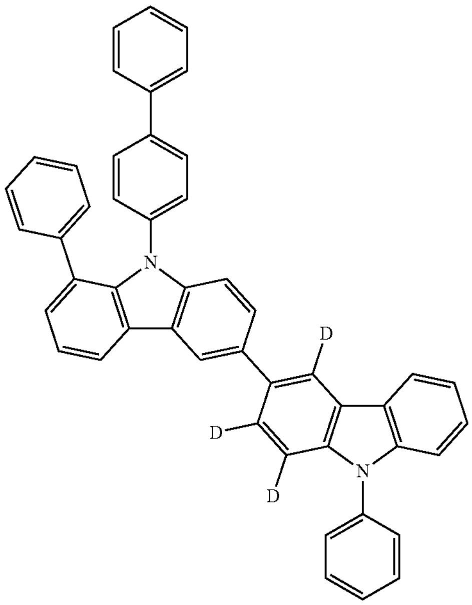
393
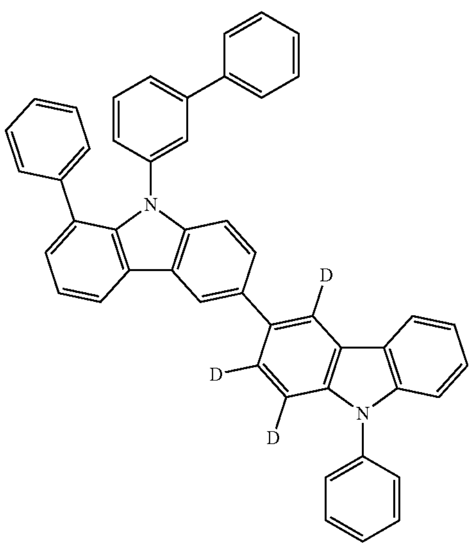
394
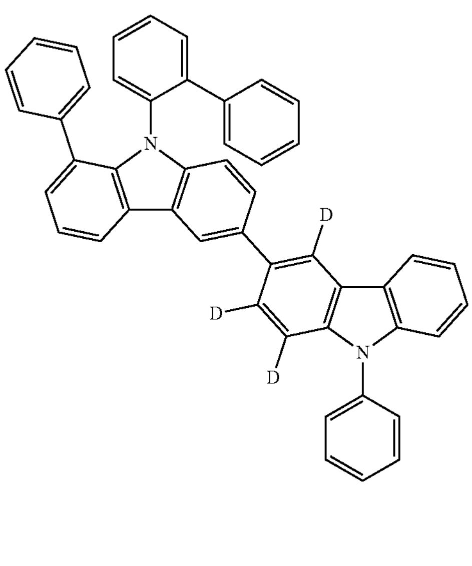
-continued
395
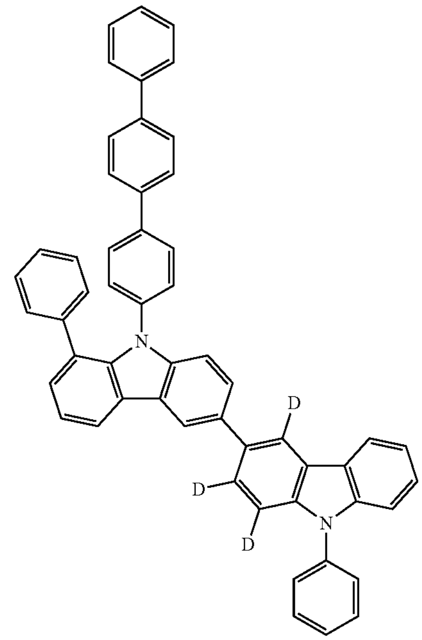
396
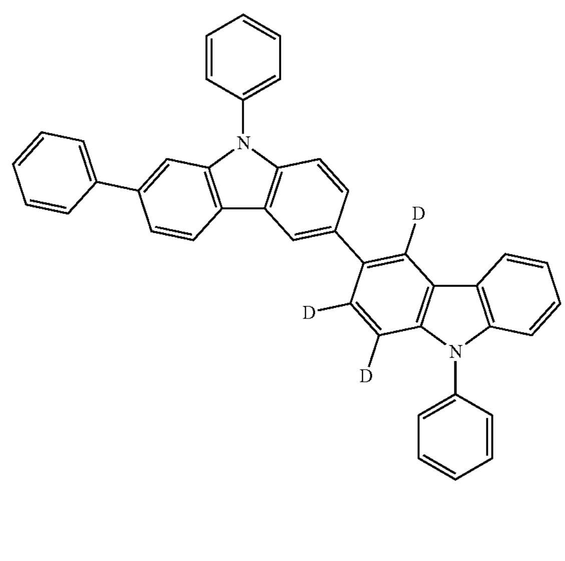

-continued
397
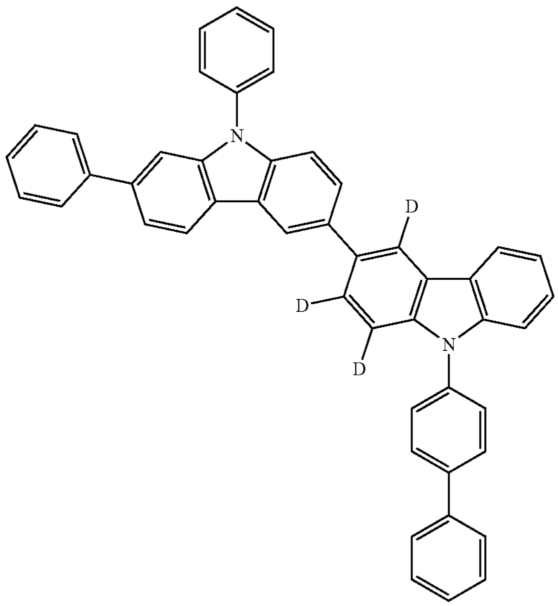
398
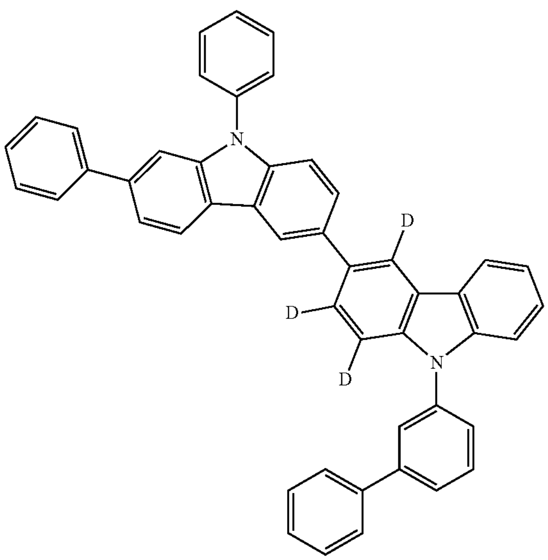
399
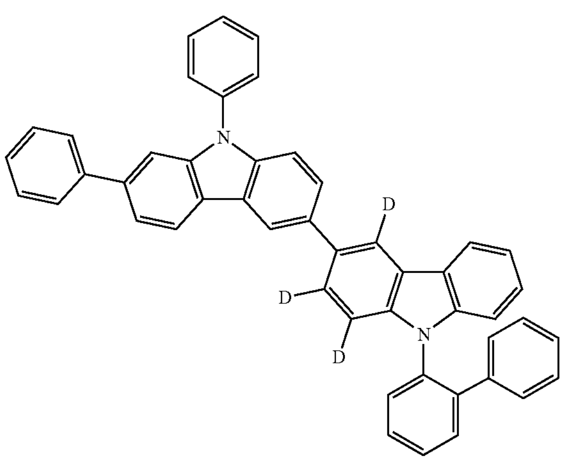
-continued
400
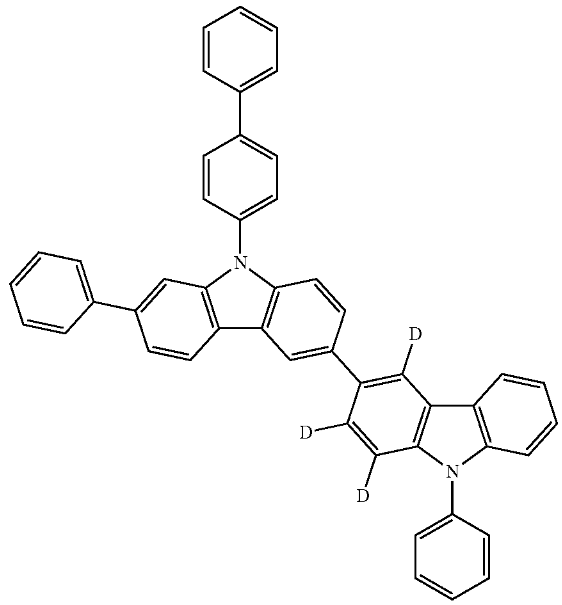
401
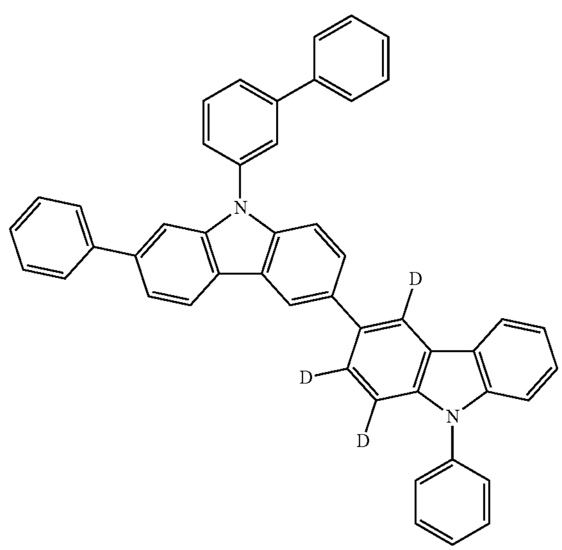

-continued
402
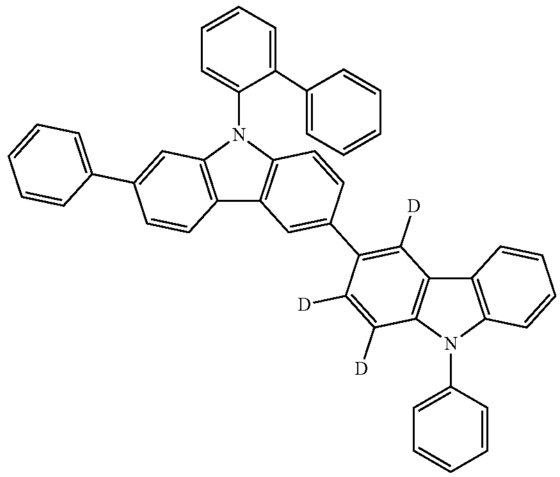
403
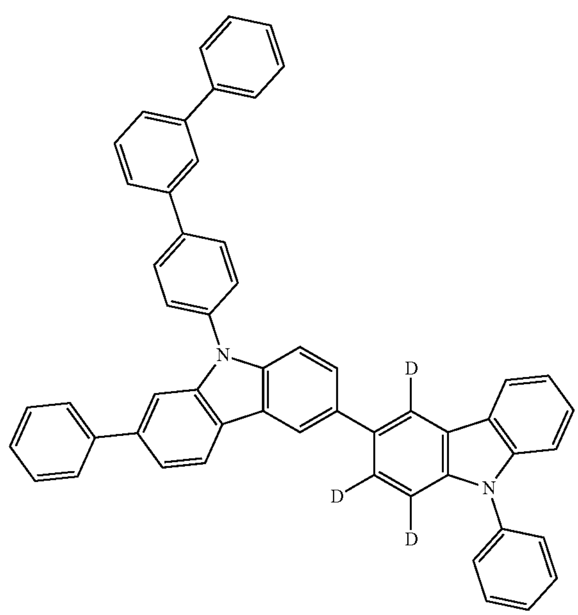
-continued
404
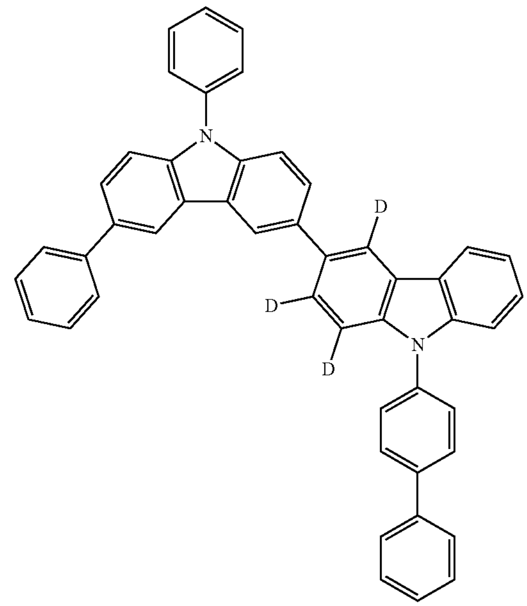
405
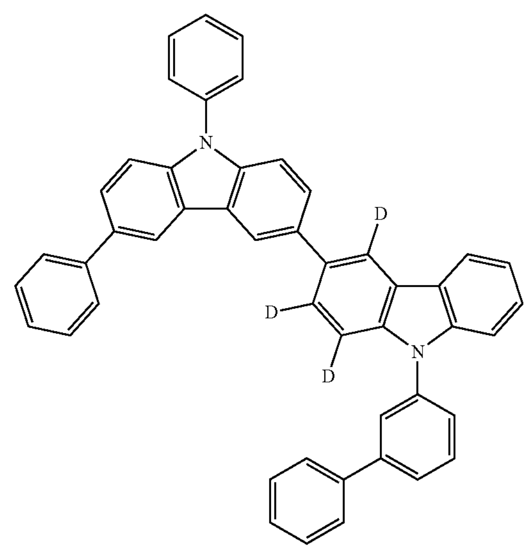

-continued
406
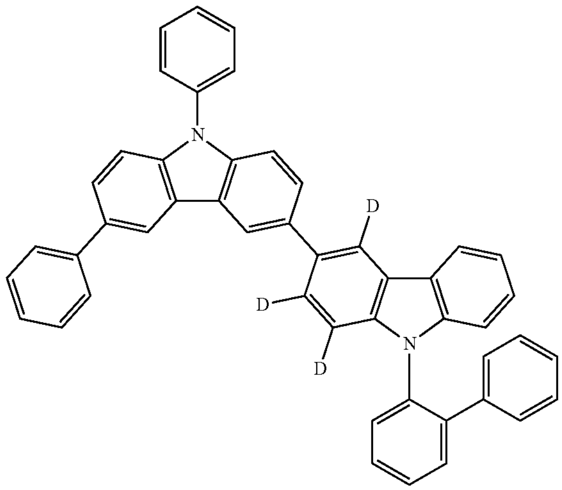
407
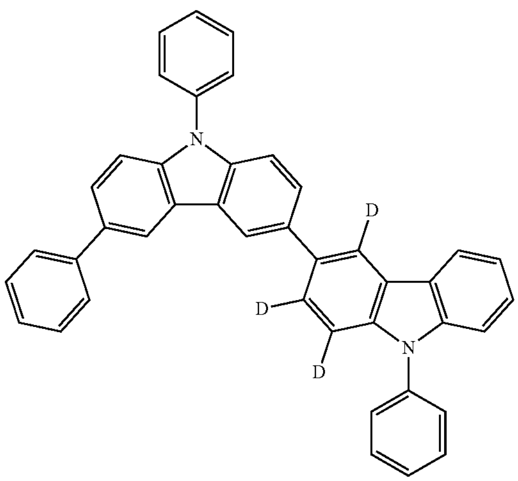
408
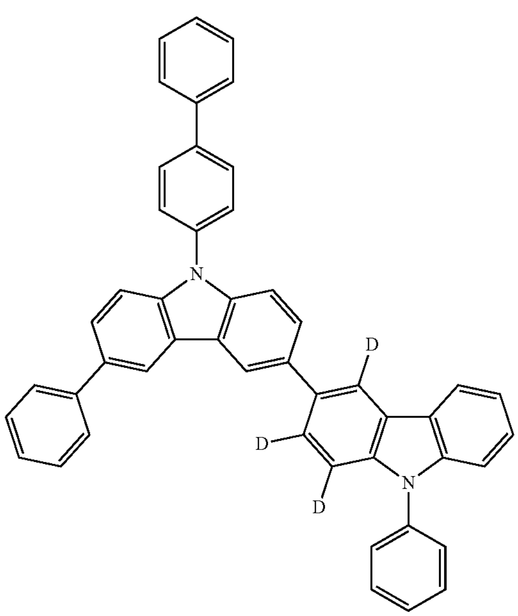
-continued
409
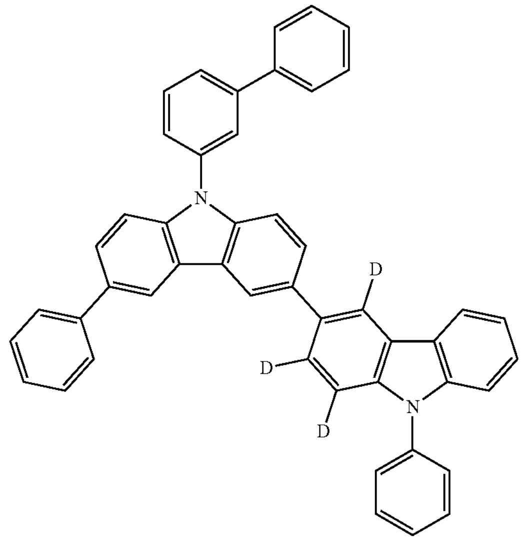
410
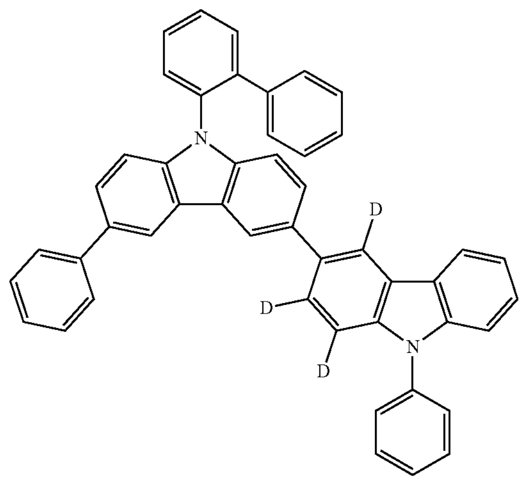
411
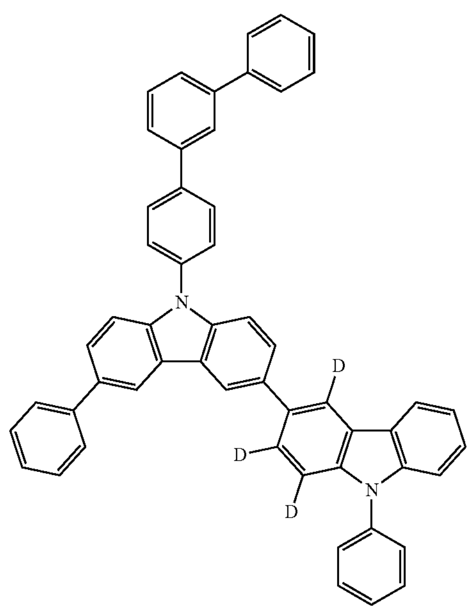

-continued
412
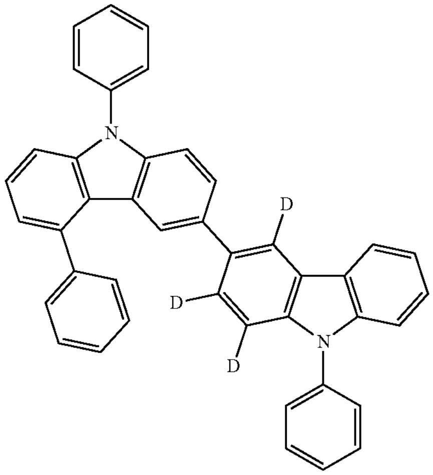
413
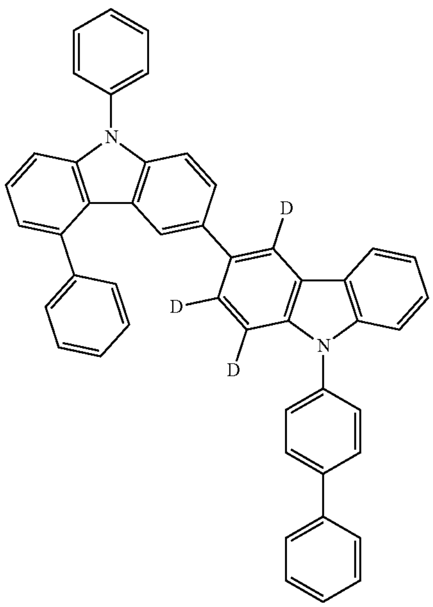
414
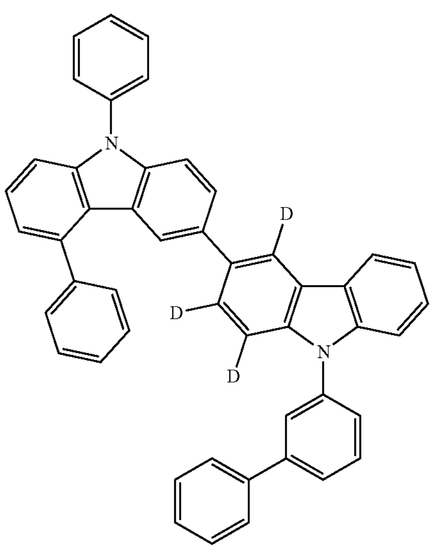
-continued
415
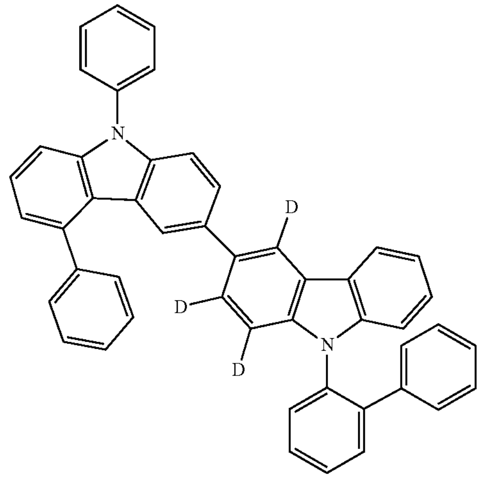
416
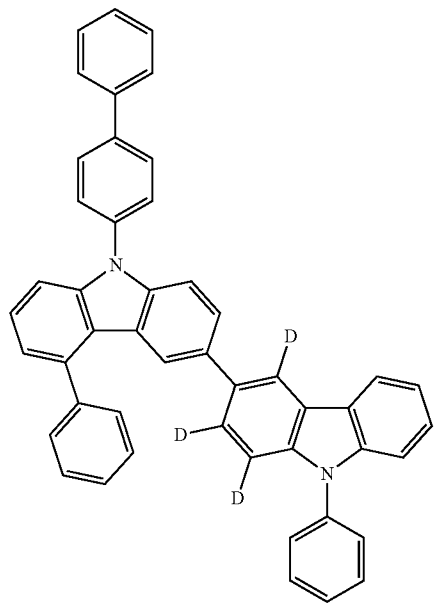
417
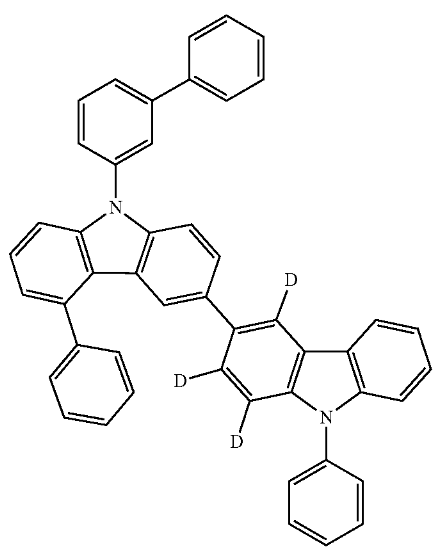

-continued
418
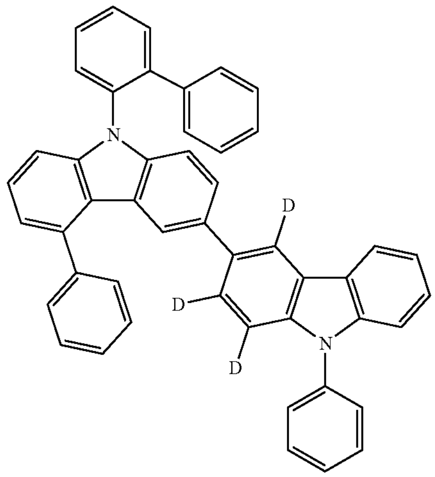
419
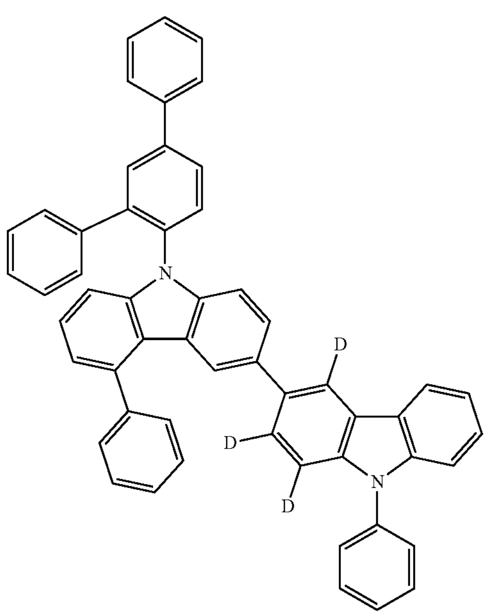
-continued
420
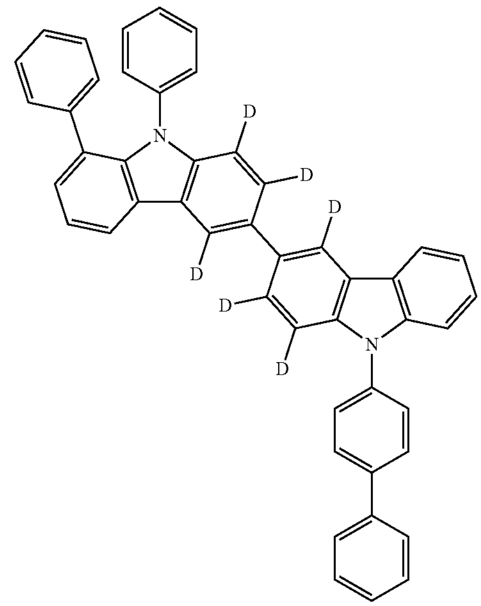
421
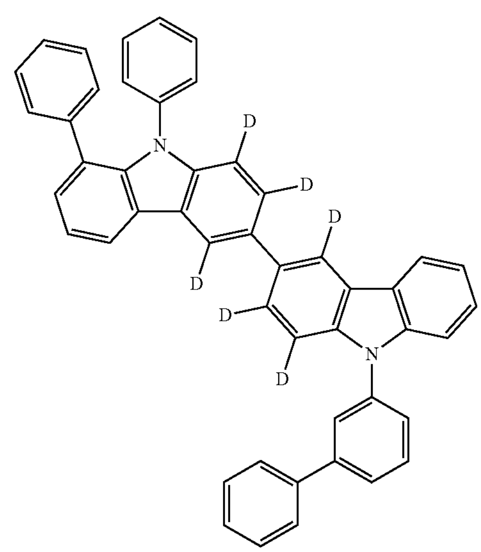

-continued
422
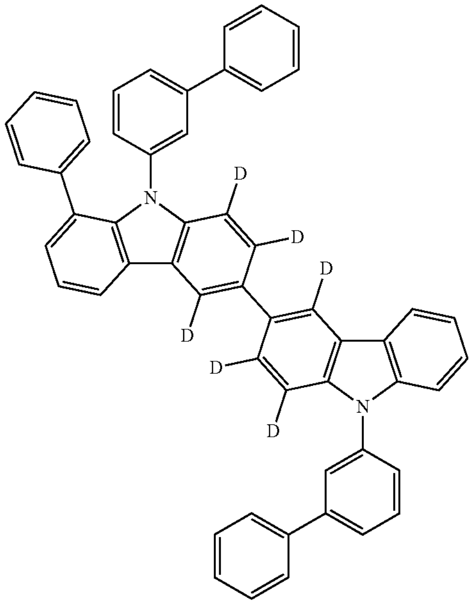
423
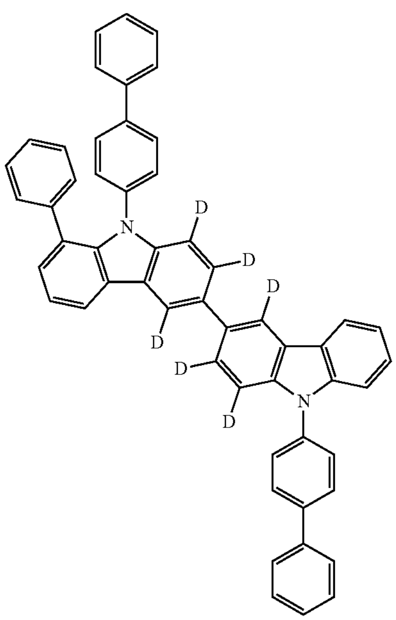
-continued
424
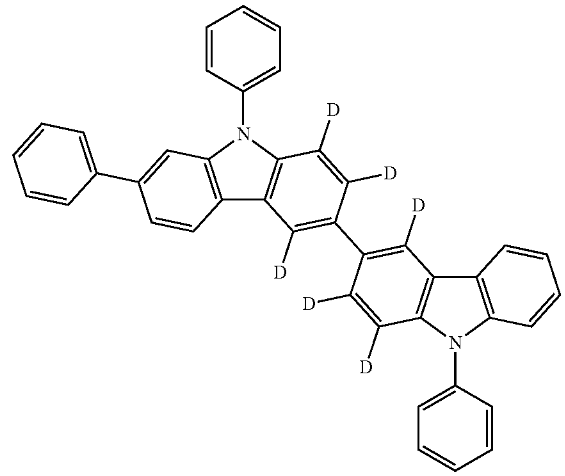
425
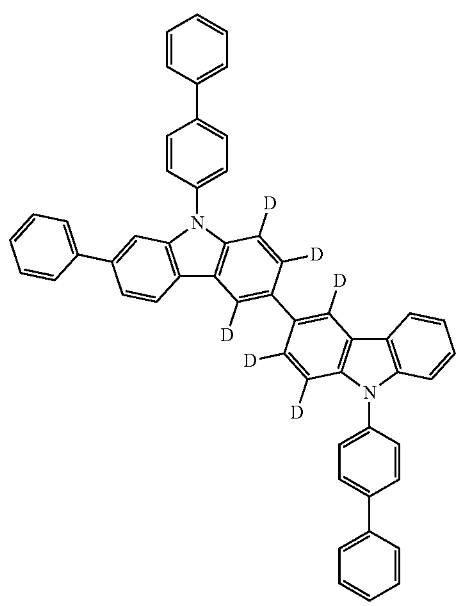

-continued
426
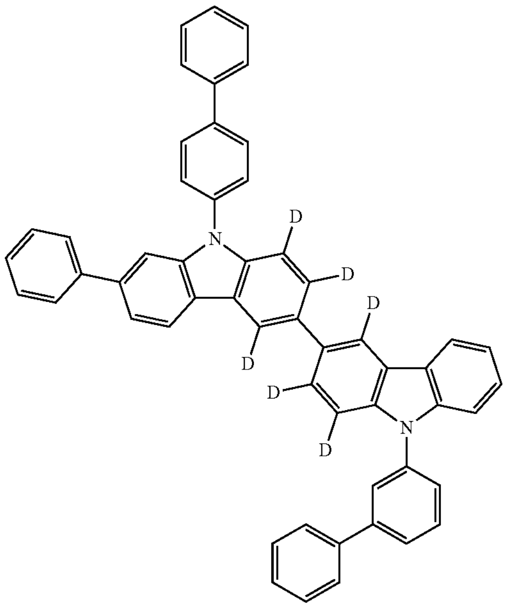
427
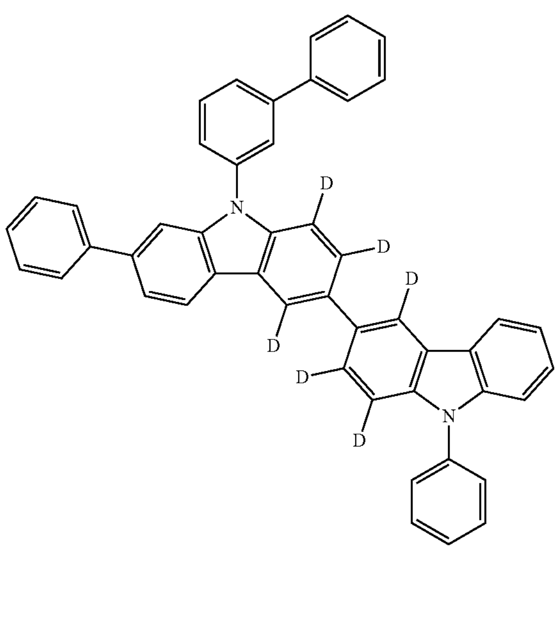
-continued
428
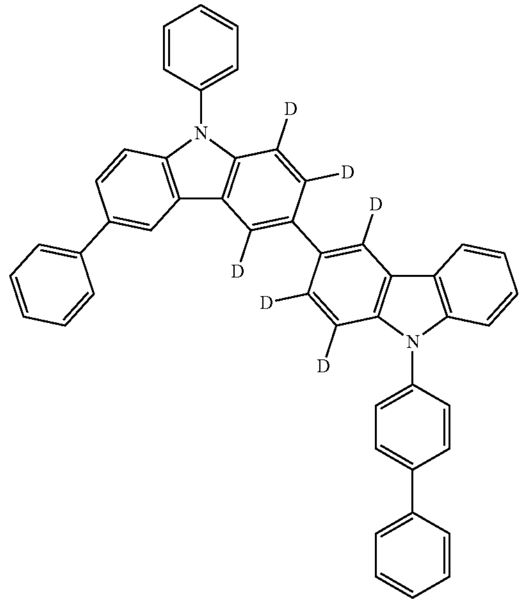
429
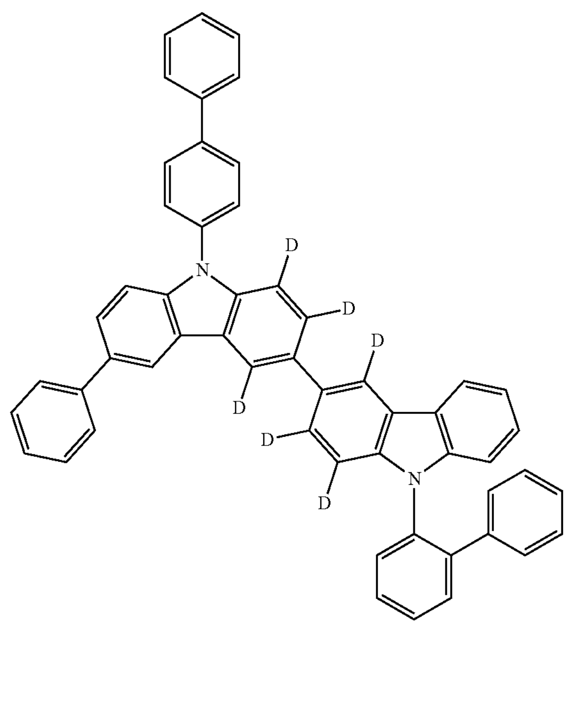

-continued
430
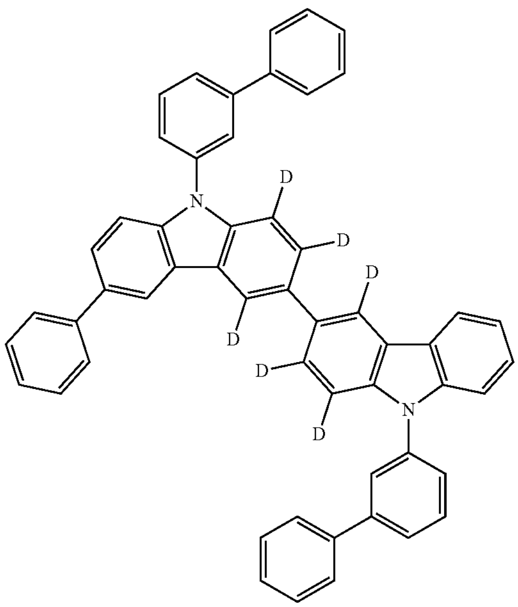
432
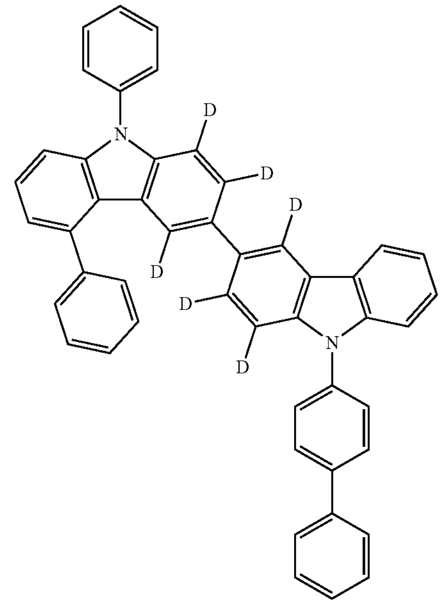
431
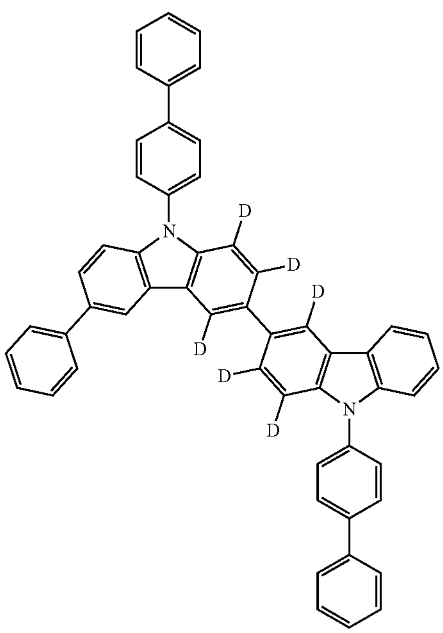
433
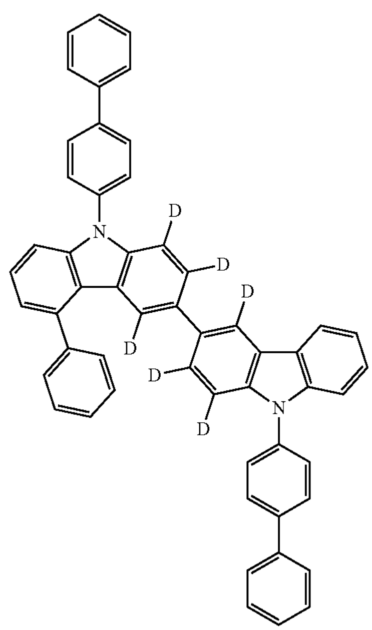

-continued
434
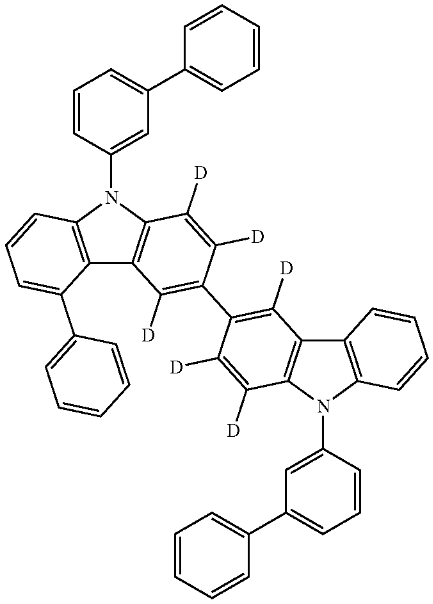
435
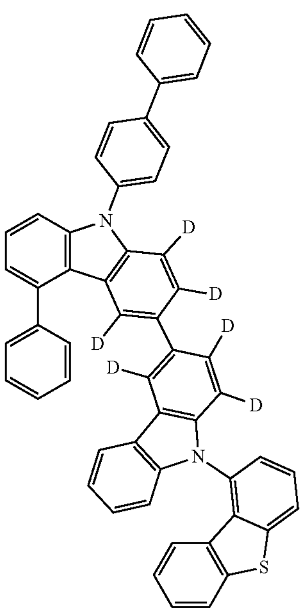
-continued
436
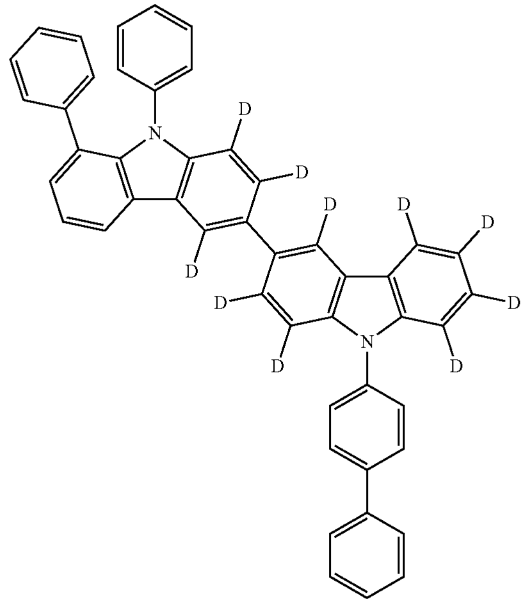
437
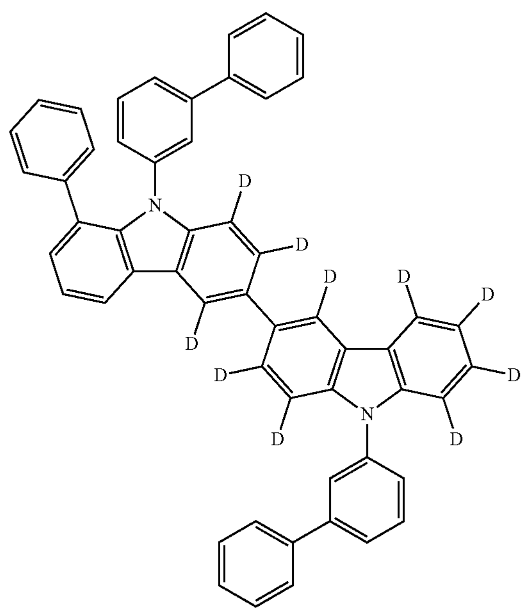

-continued
438
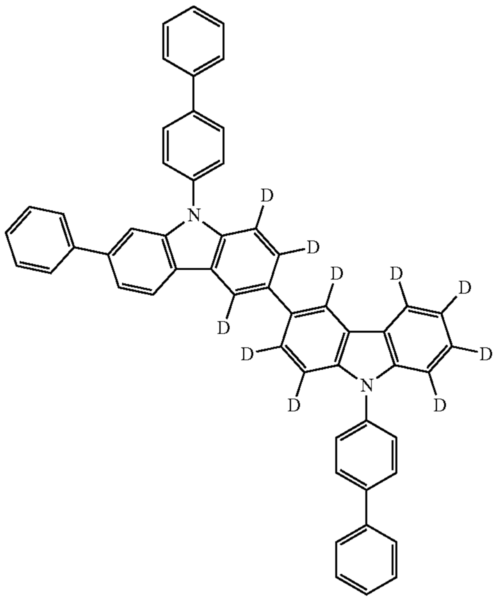
439
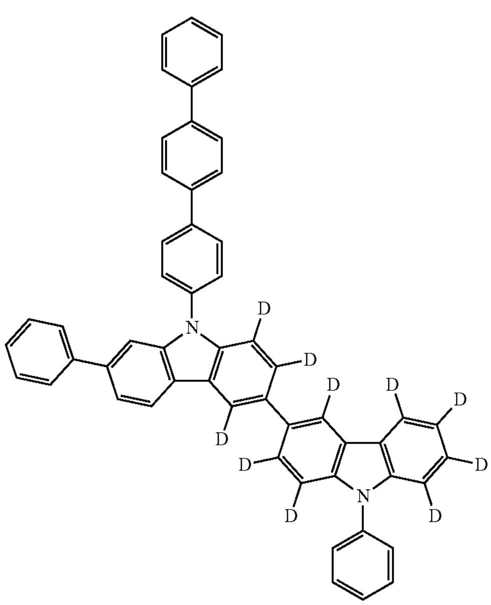
-continued
440
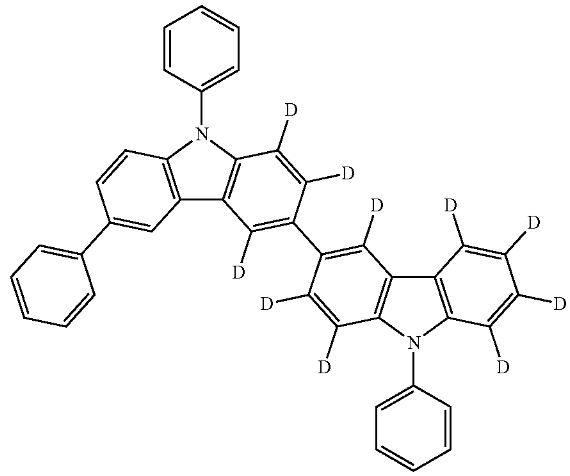
441
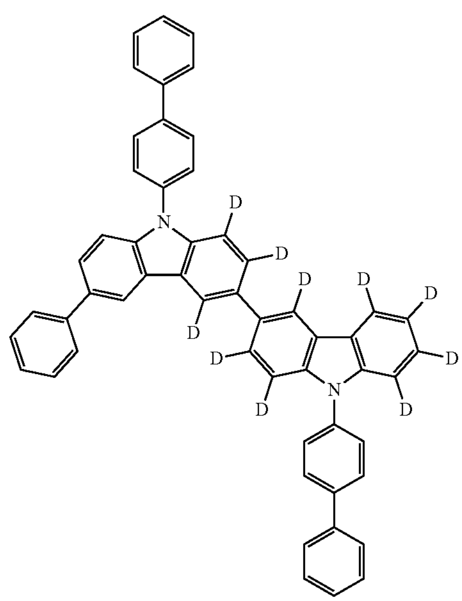

-continued
442
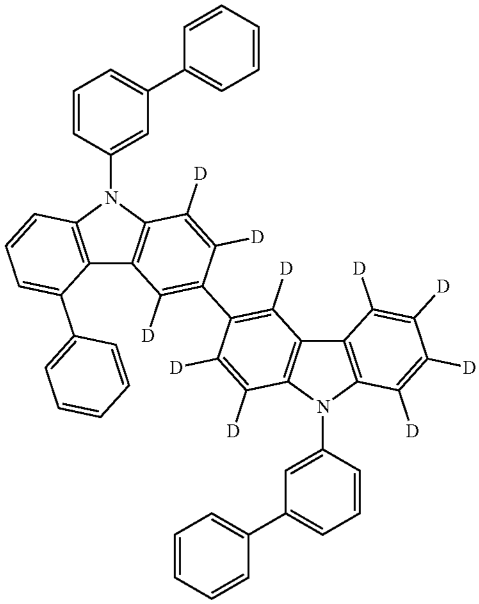
443
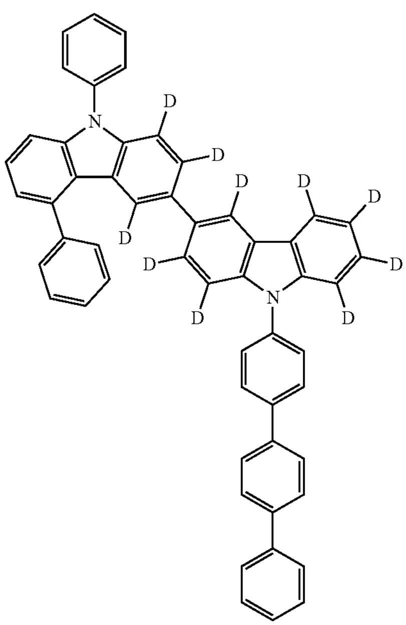
-continued
444
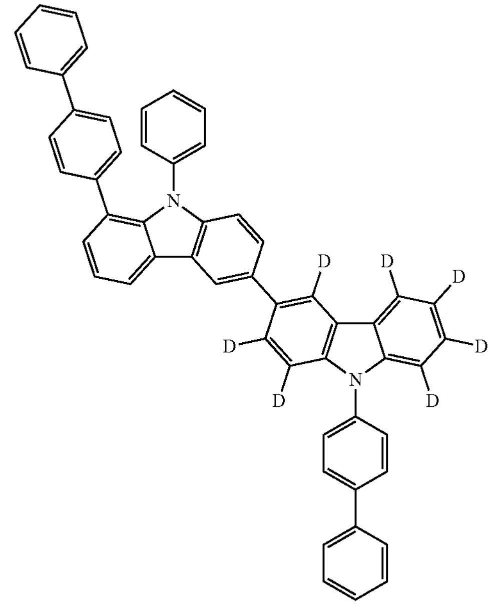
445
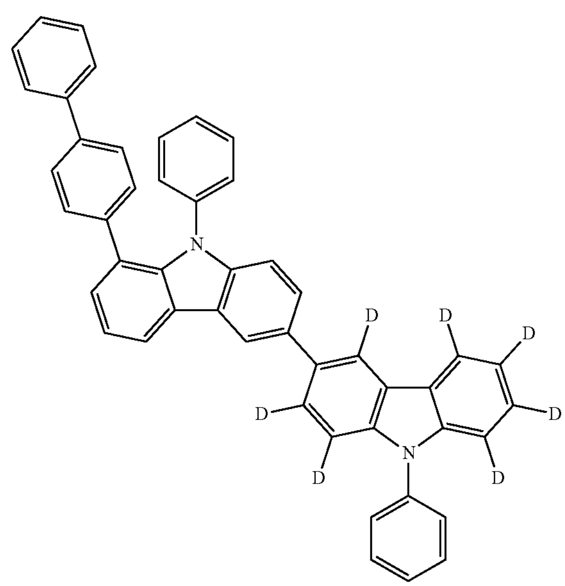

-continued
446
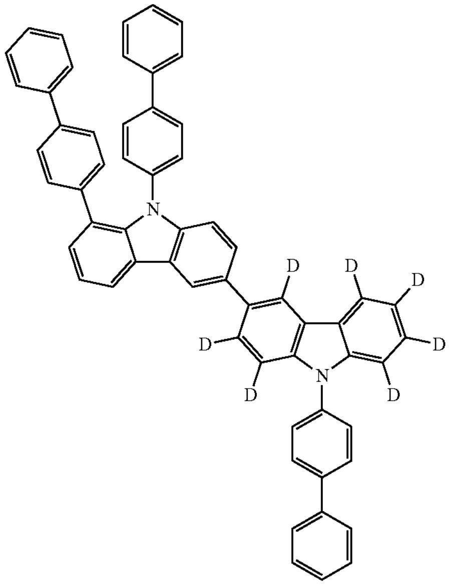
447
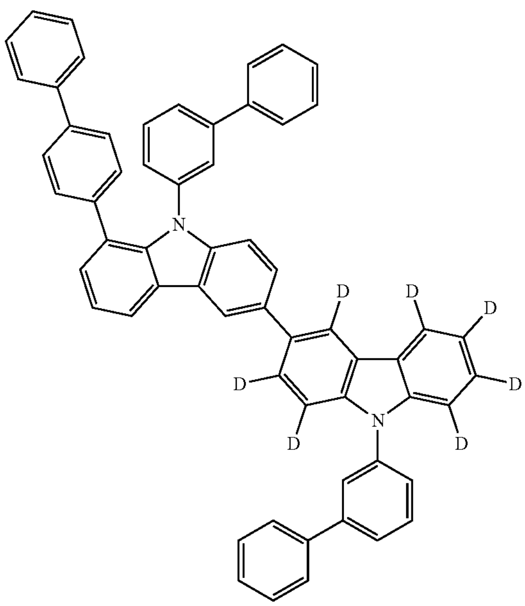
448
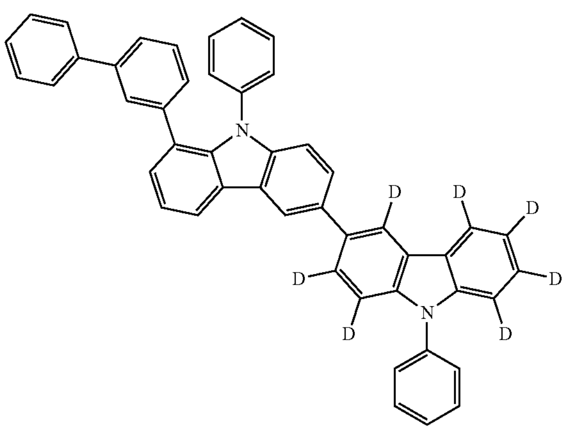
-continued
449
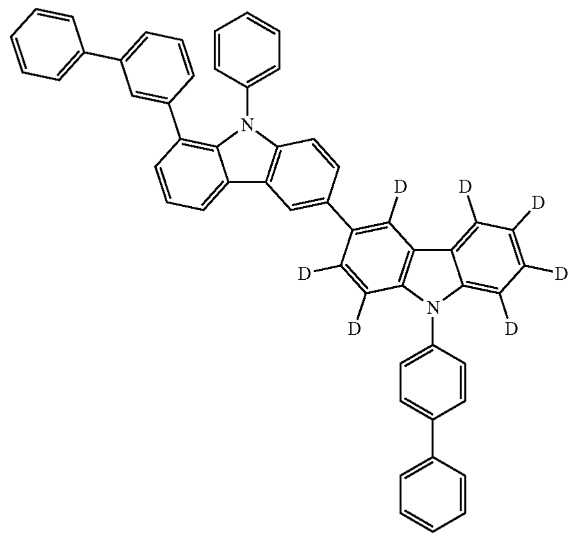
450
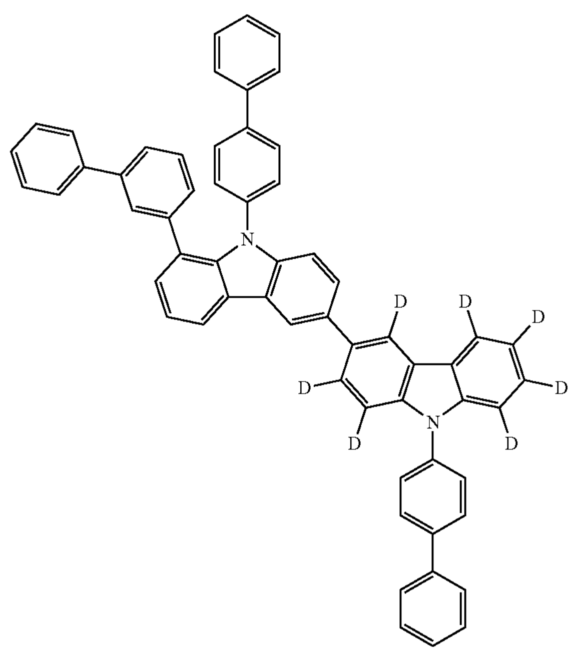

-continued
451
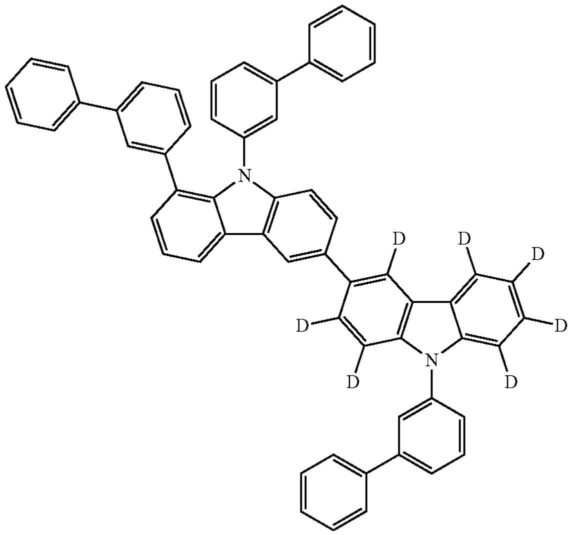
452
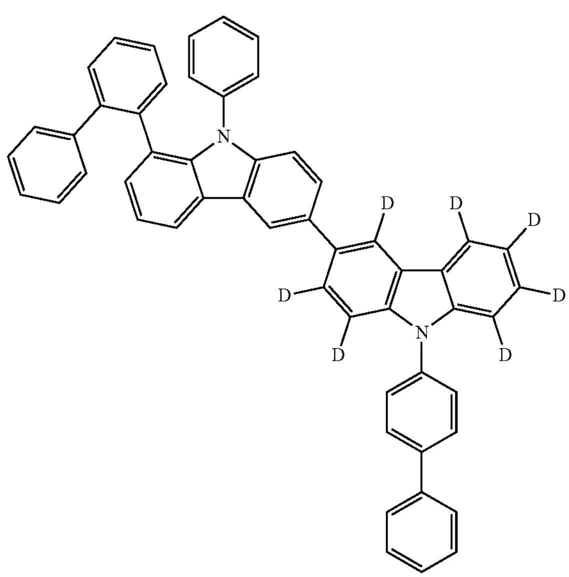
-continued
453
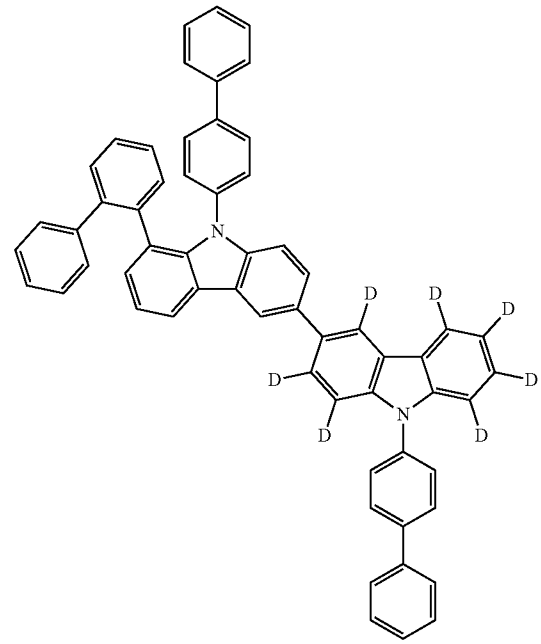
453
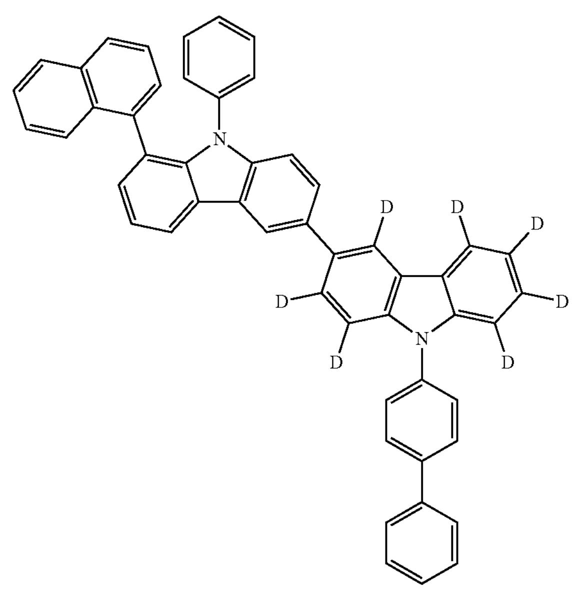

-continued
454
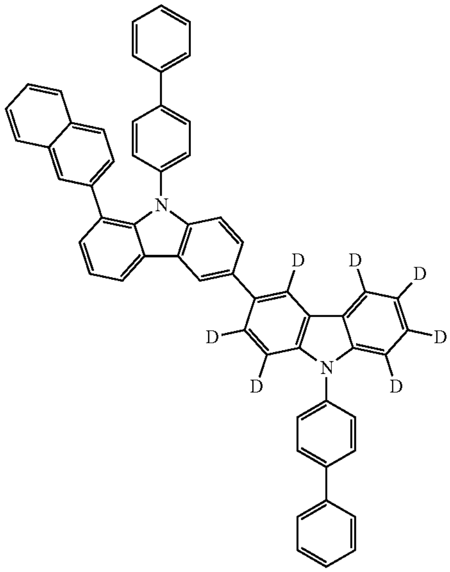
455
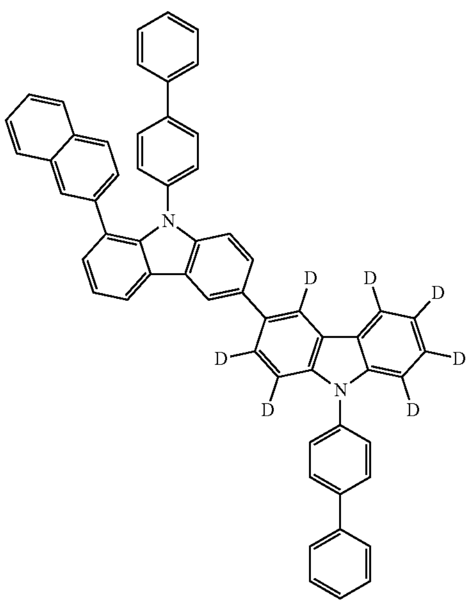
456
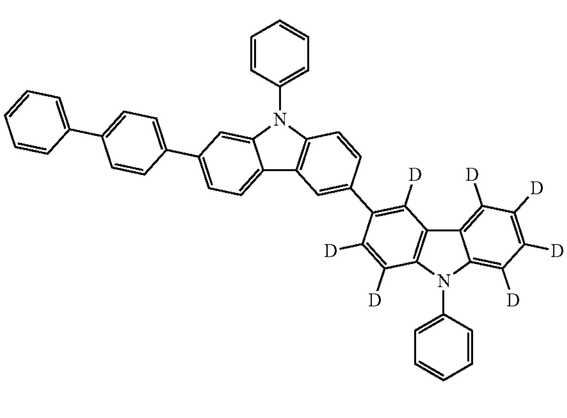
-continued
457
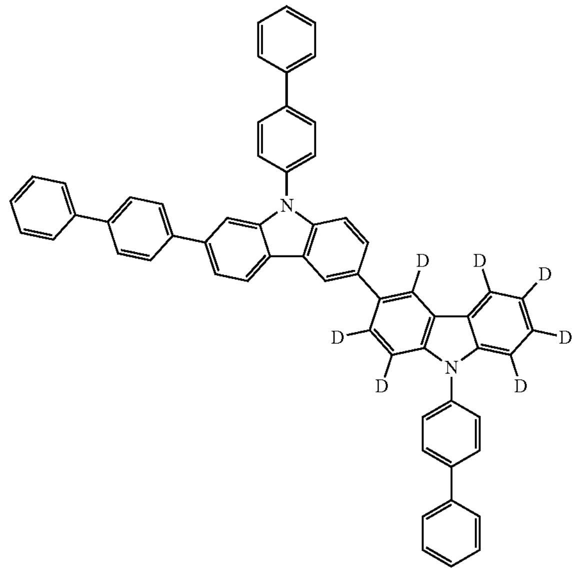
458
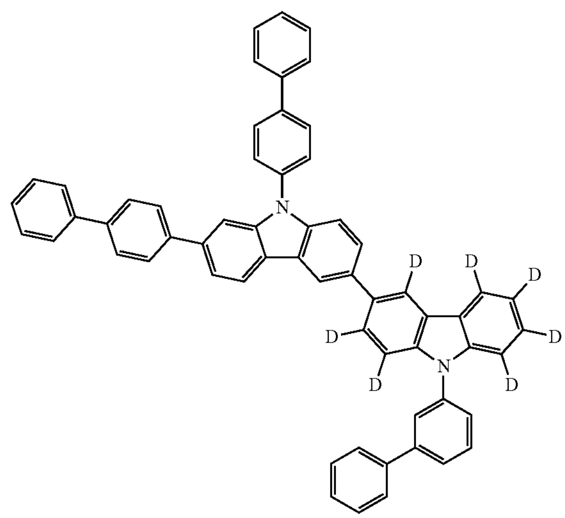
459
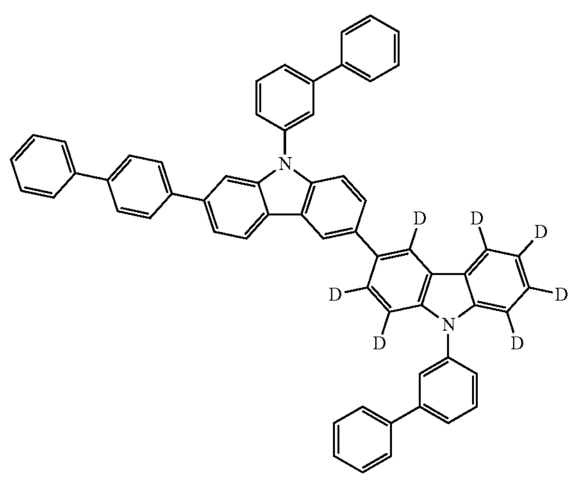

-continued
460
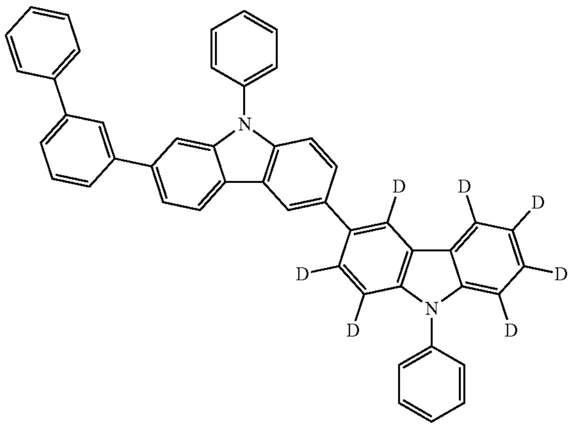
461
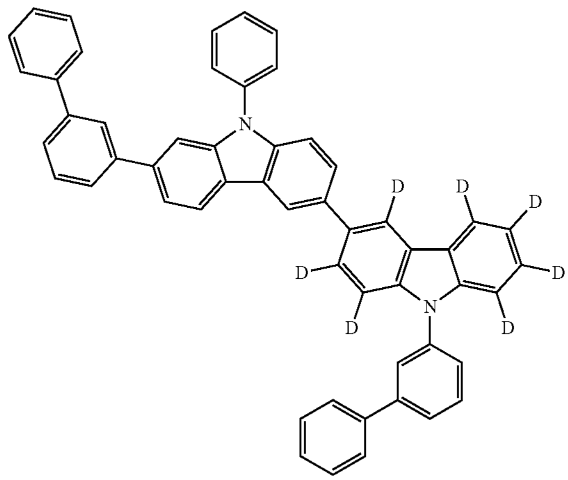
462
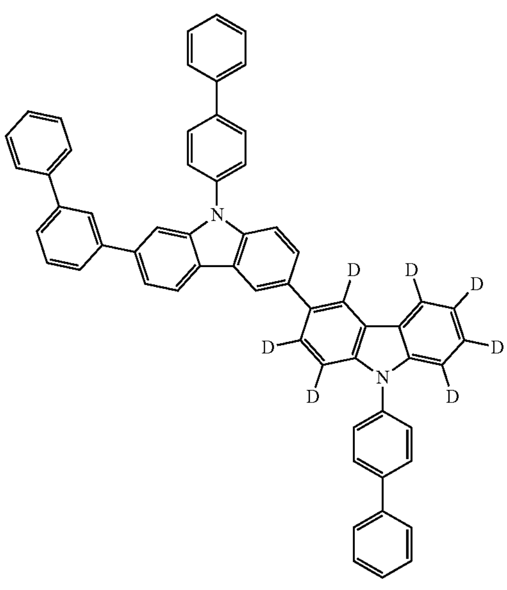
-continued
463
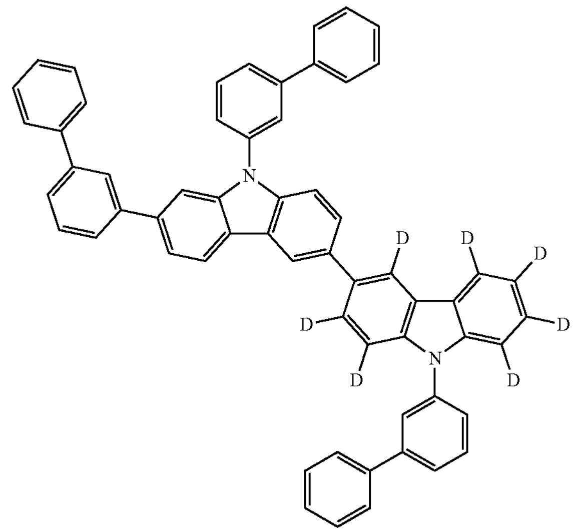
464
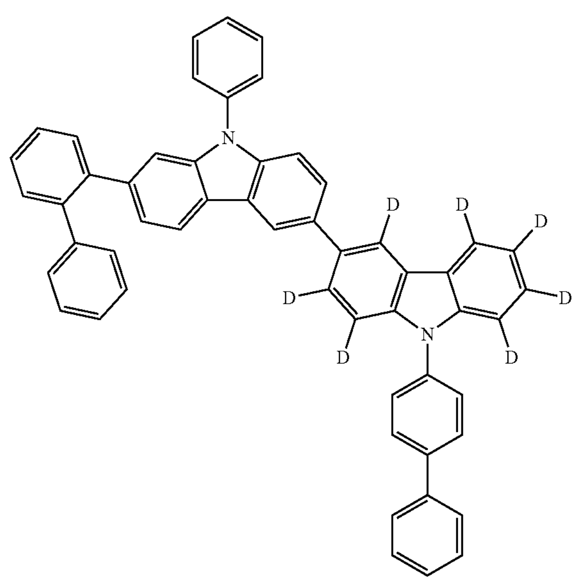

-continued
465
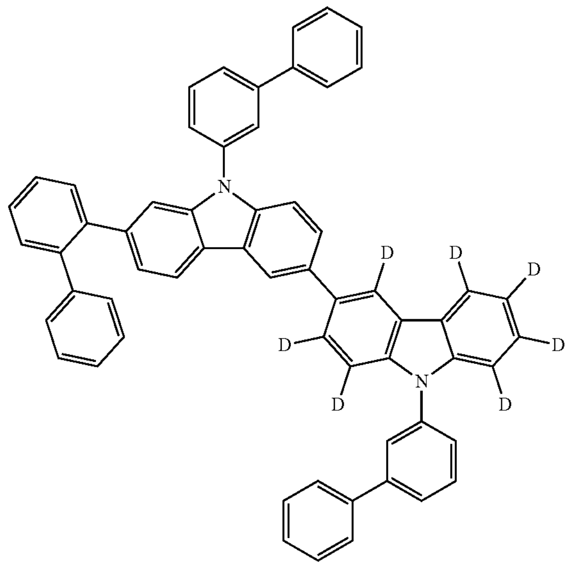
468
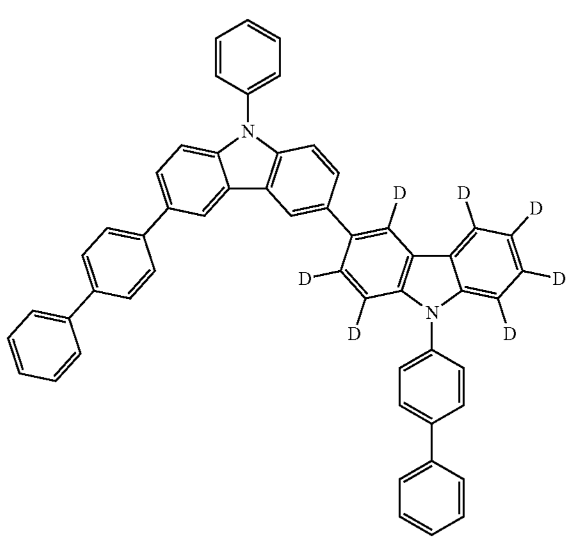
-continued
469
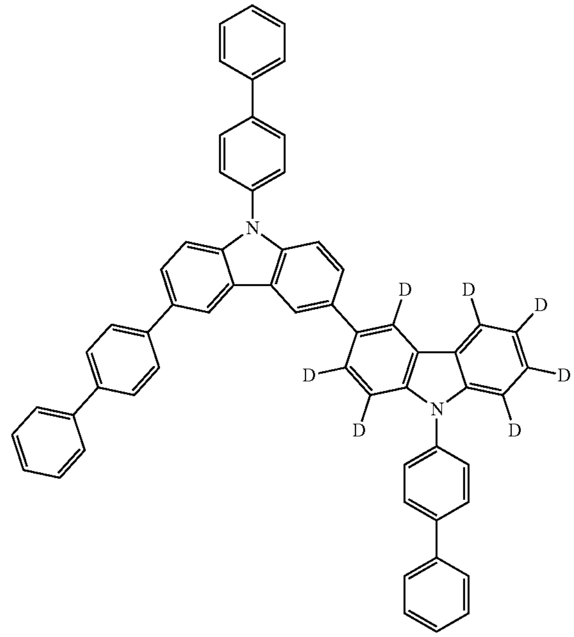
470
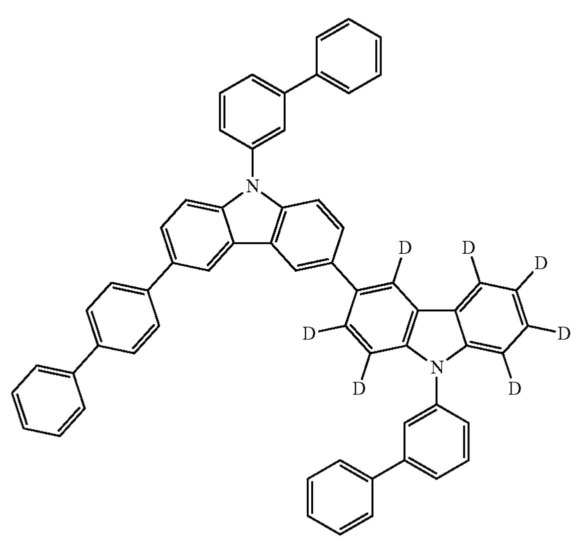

-continued
471
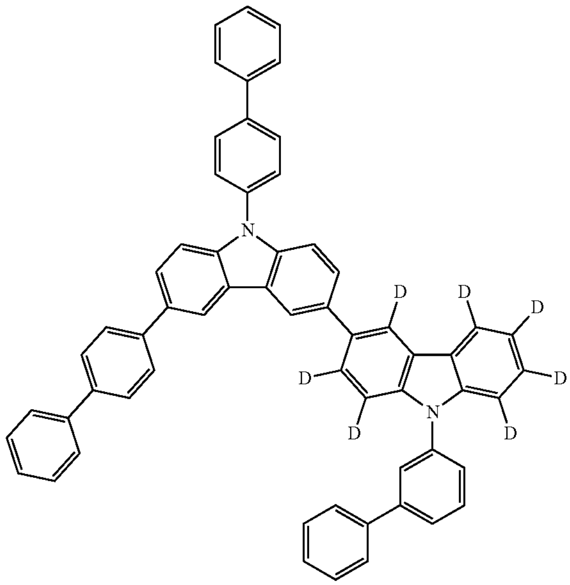
472
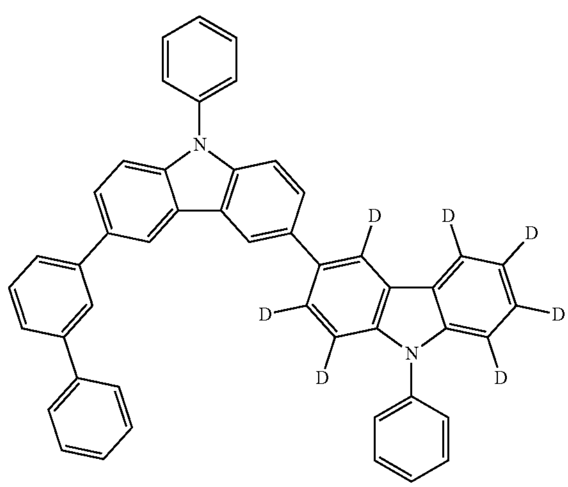
-continued
473
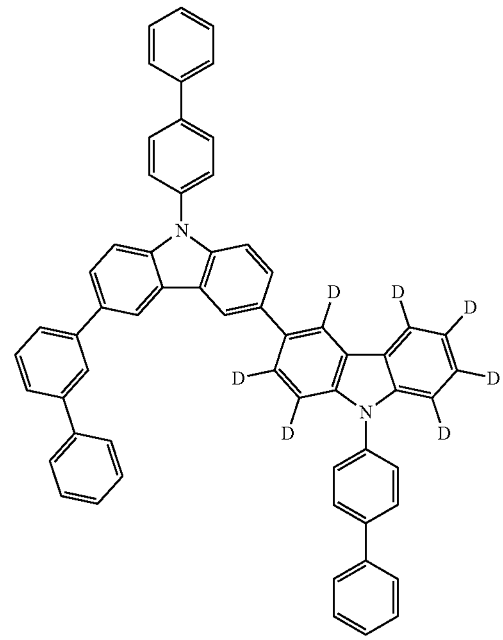
474
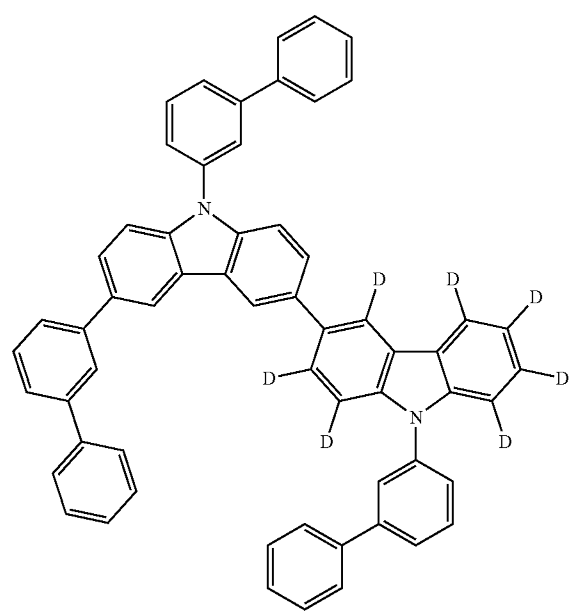

-continued
475
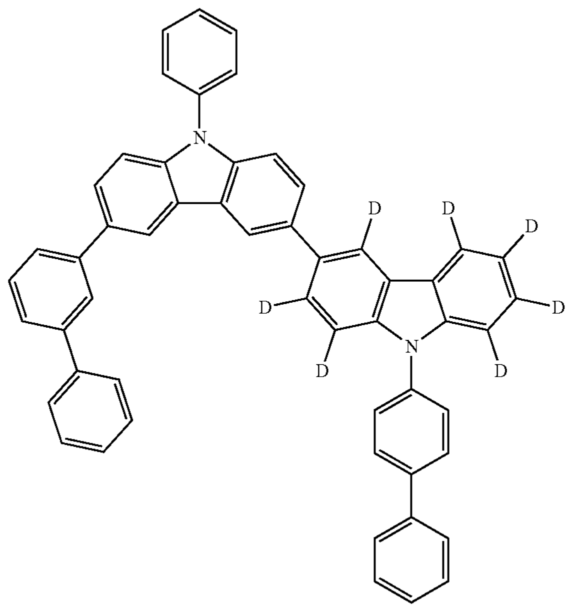
476
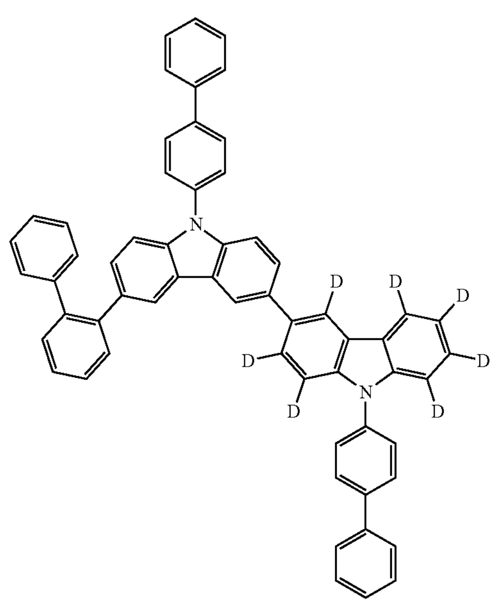
-continued
477
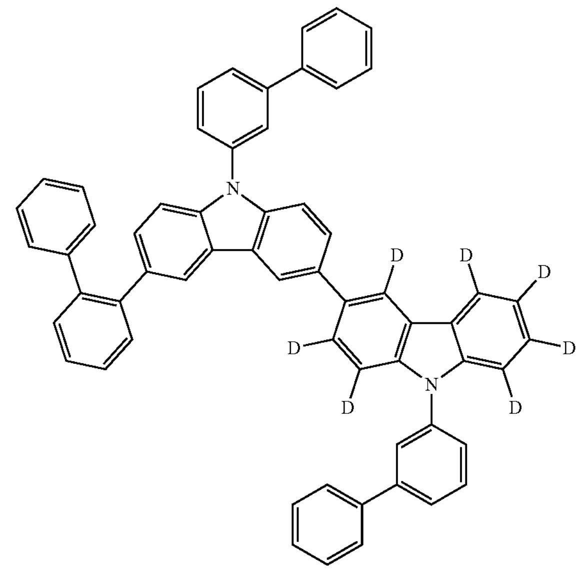
480
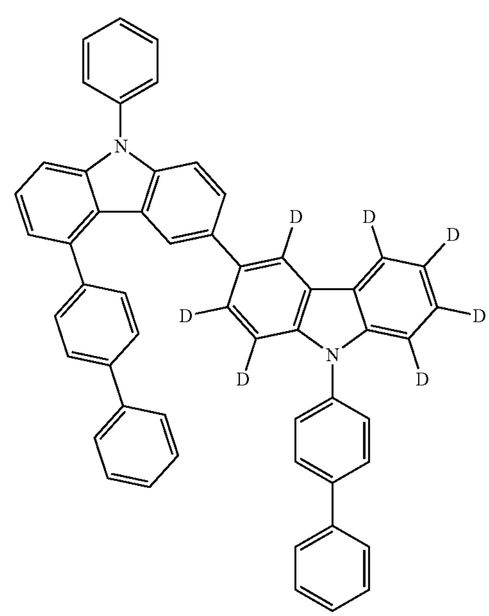

-continued
481
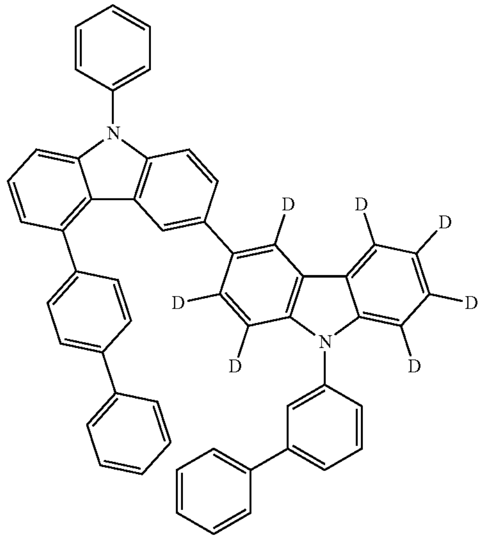
482
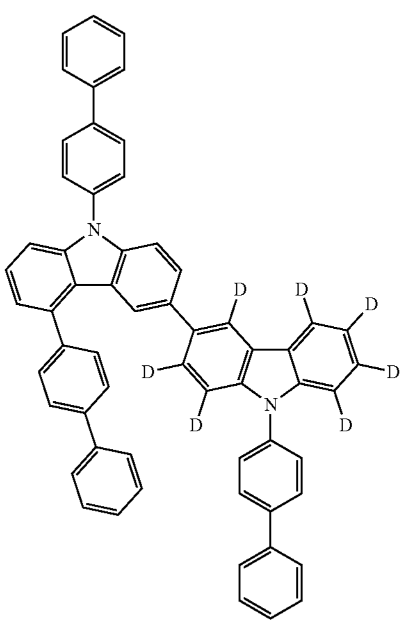
-continued
483
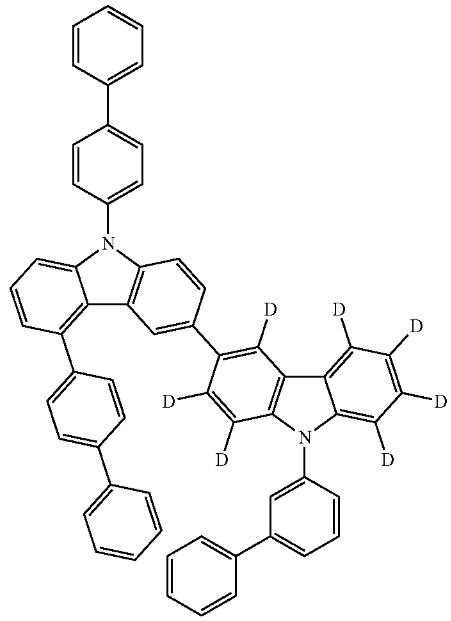
484
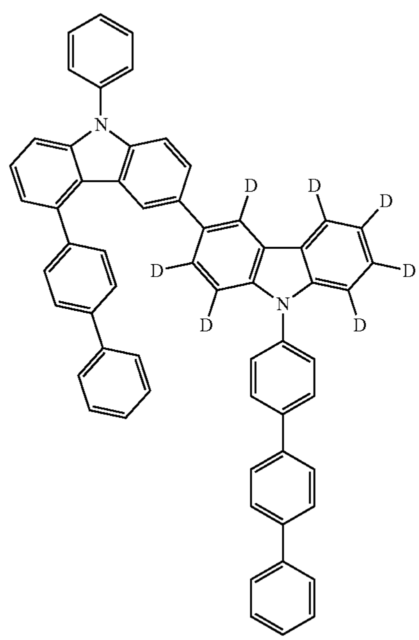

485
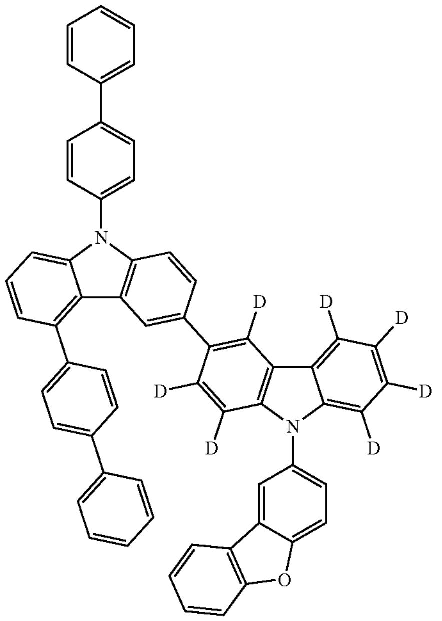
486
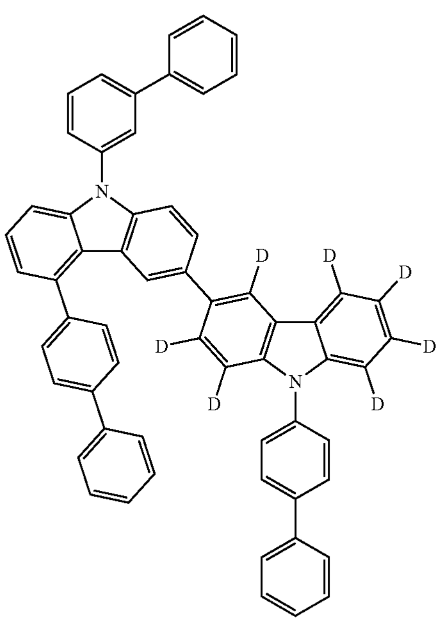
487
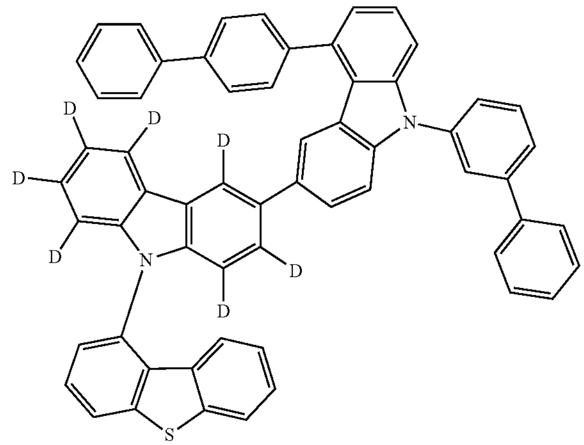
488
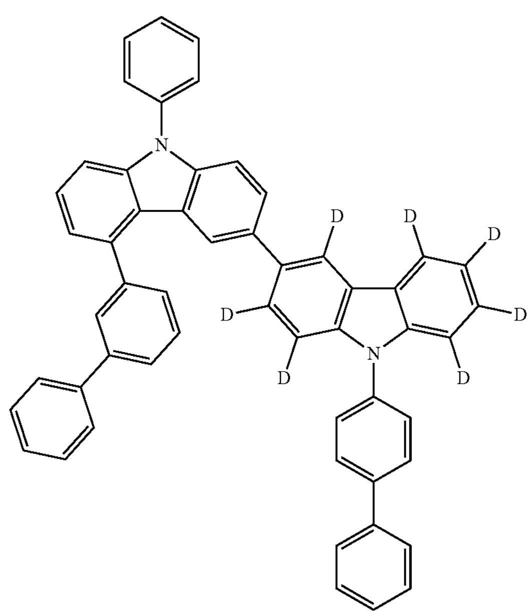

-continued
489
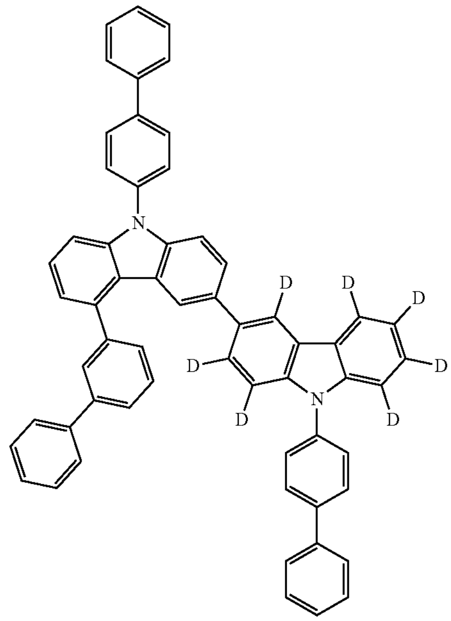
491
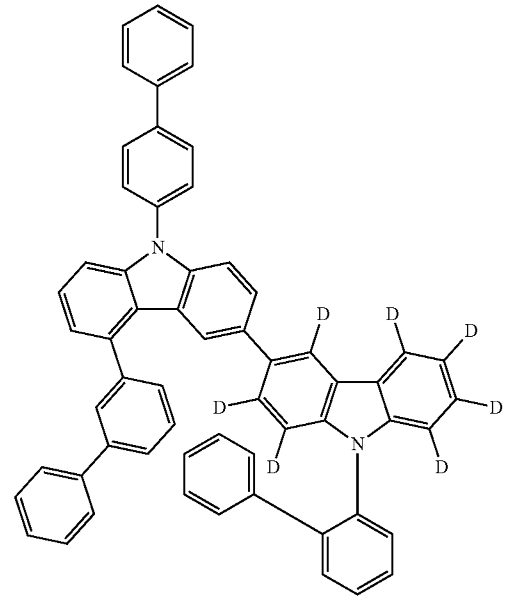
490
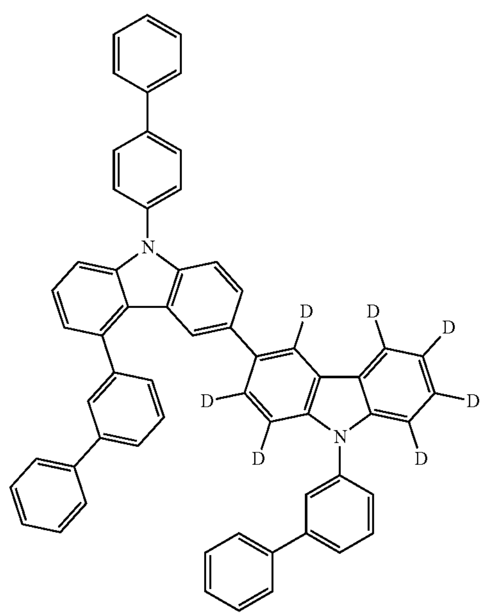
492
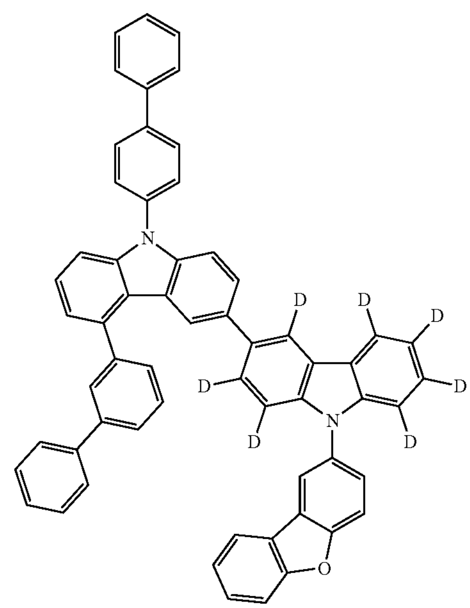

-continued
493
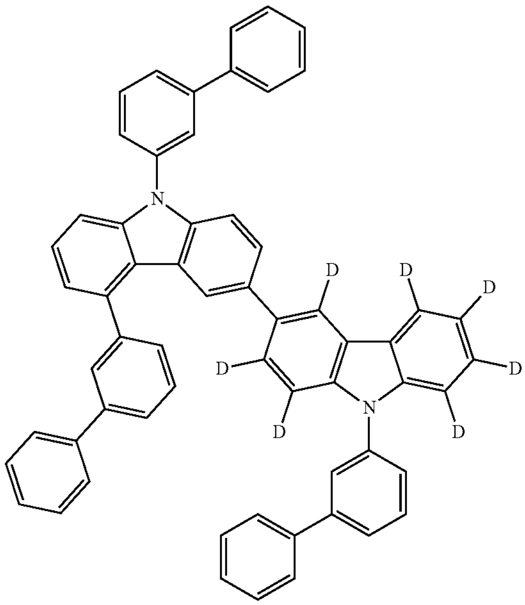
494
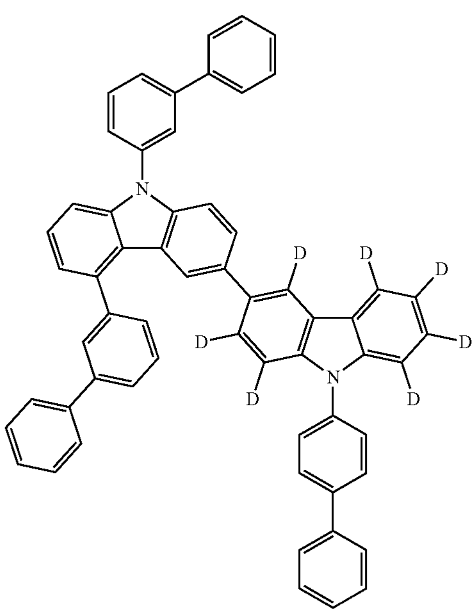
-continued
495
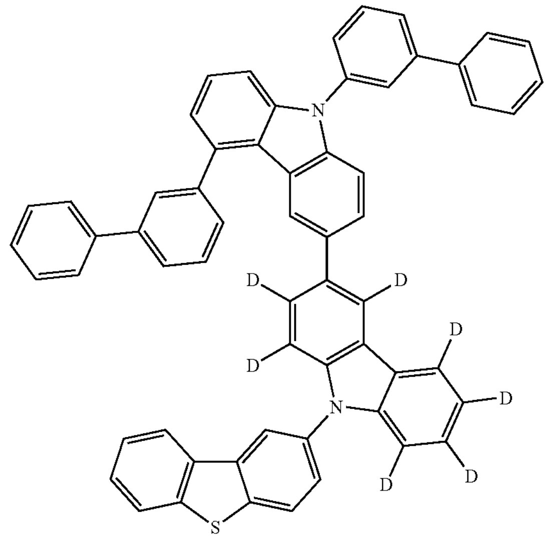
496
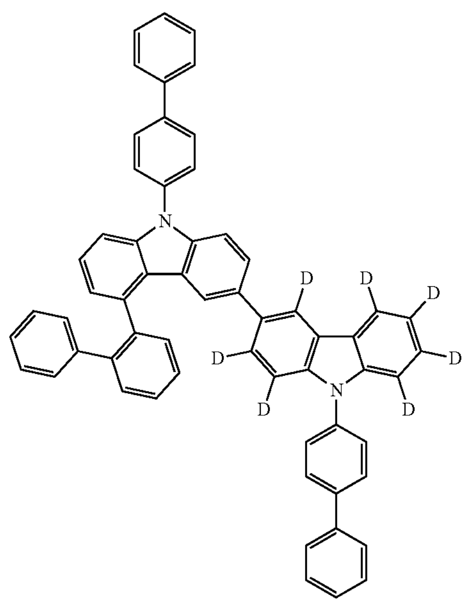

-continued
497
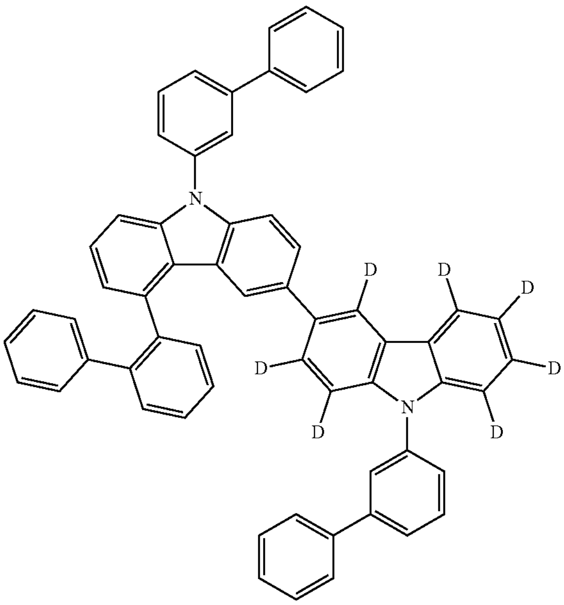
500
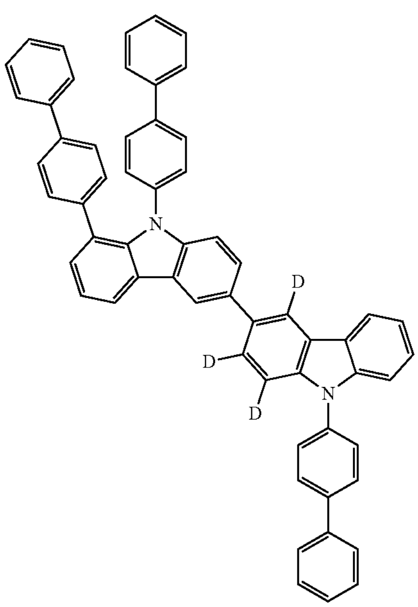
-continued
501
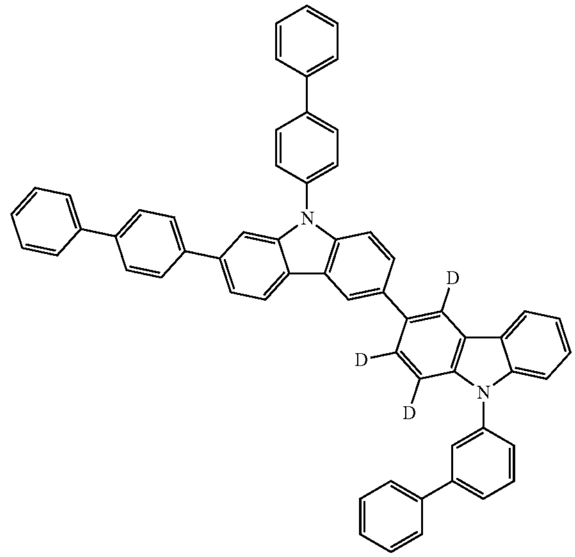
502
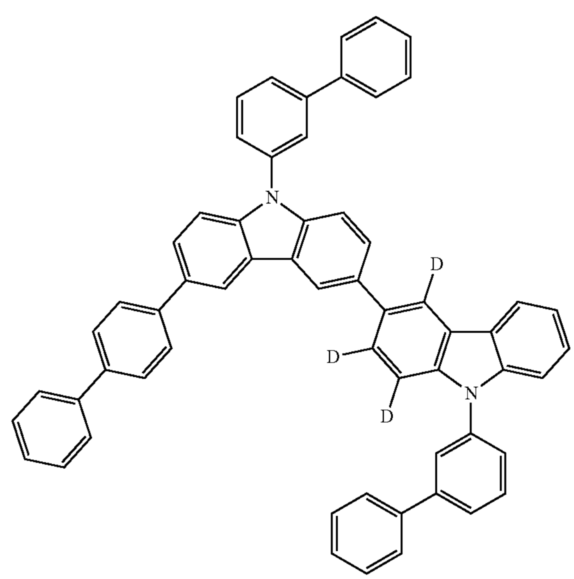

-continued
503
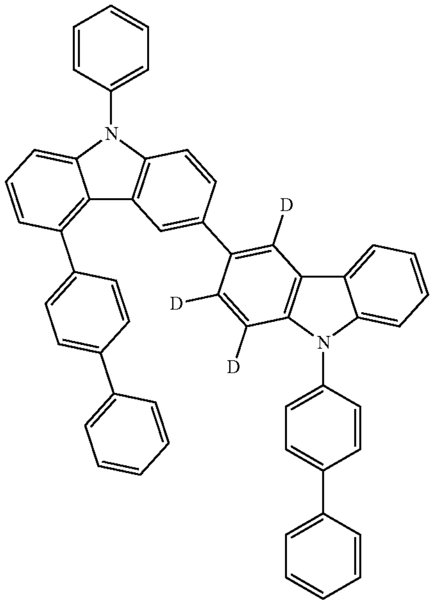
505
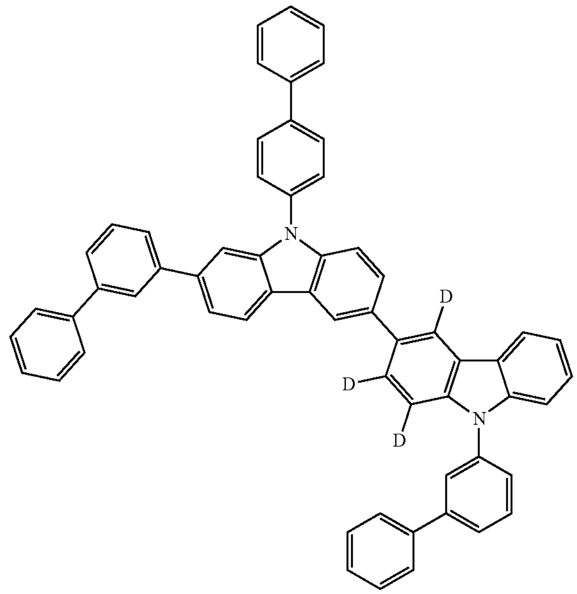
504
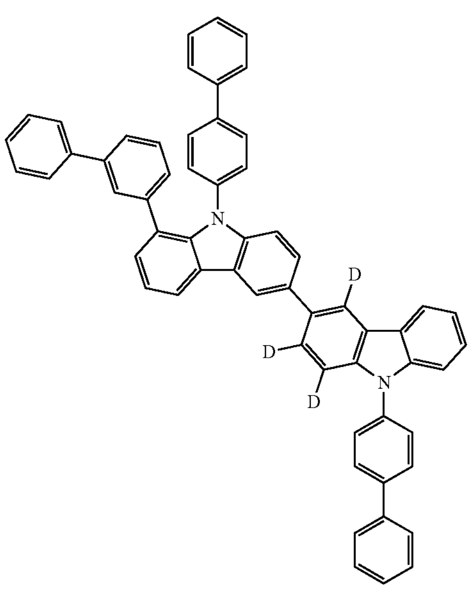
506
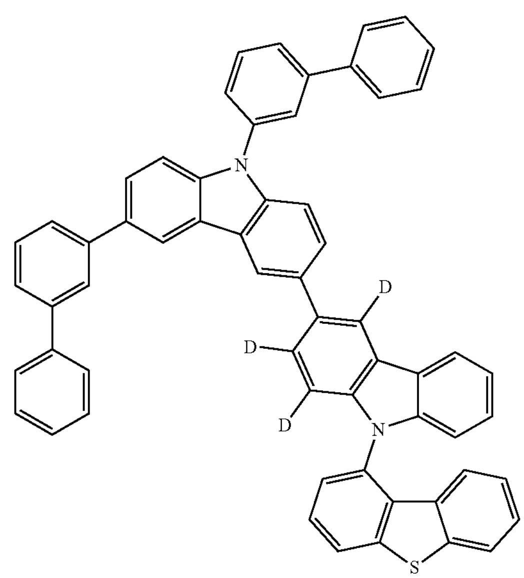

-continued
507
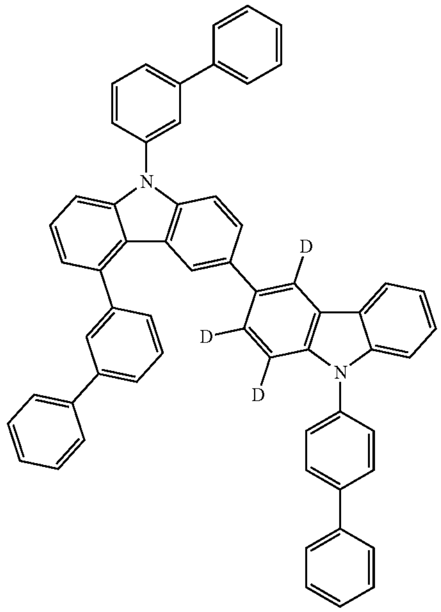
509
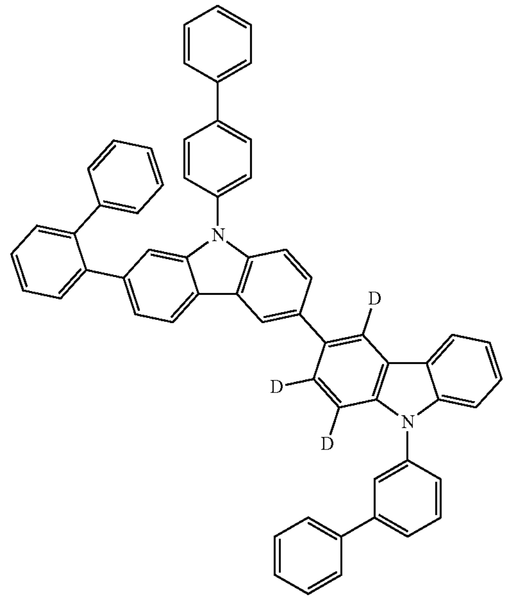
508
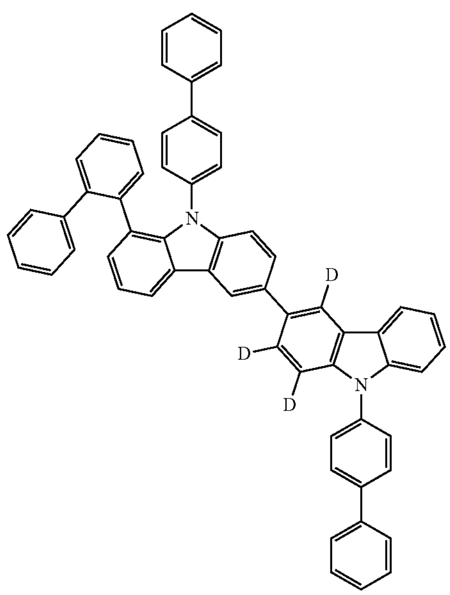
510
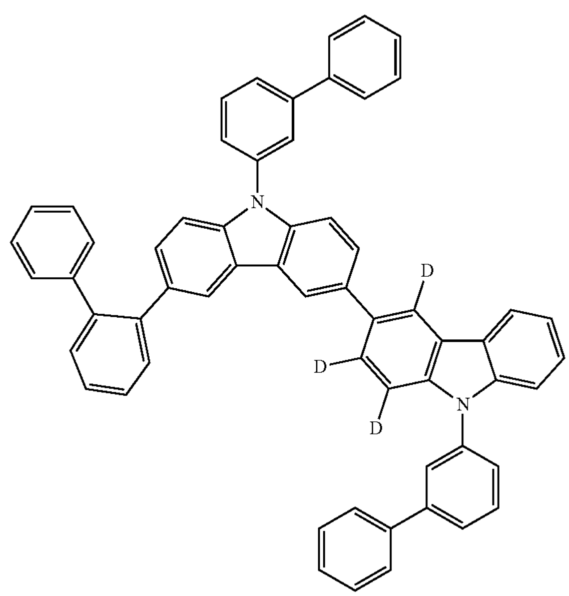

511
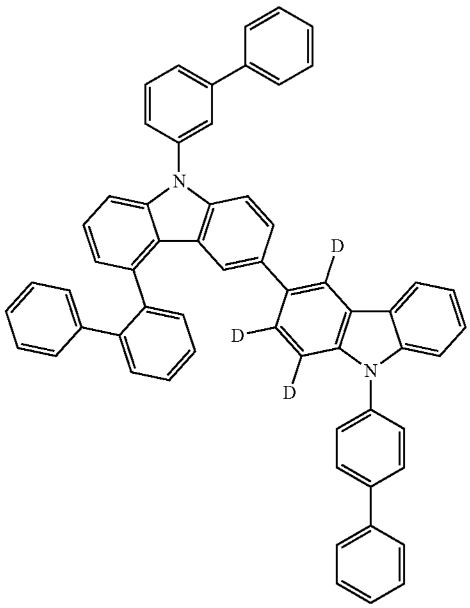
516
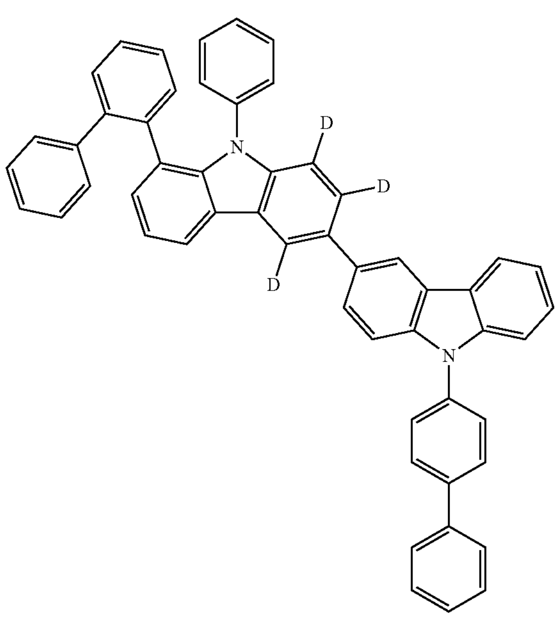
517
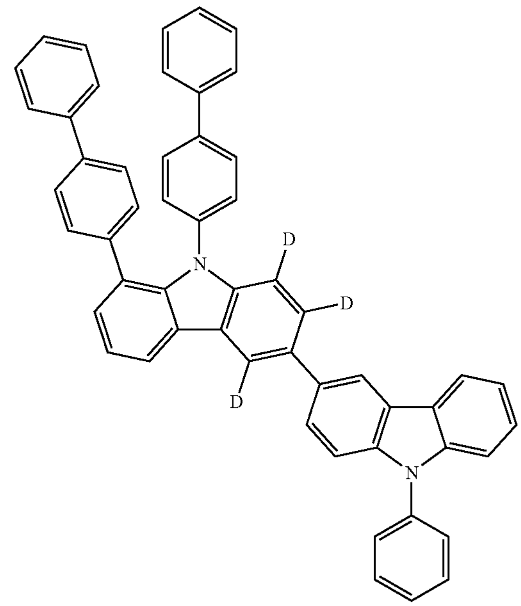
518
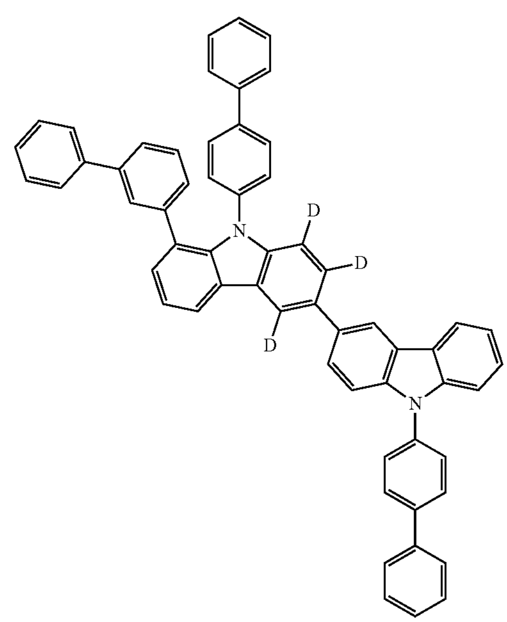

-continued
521
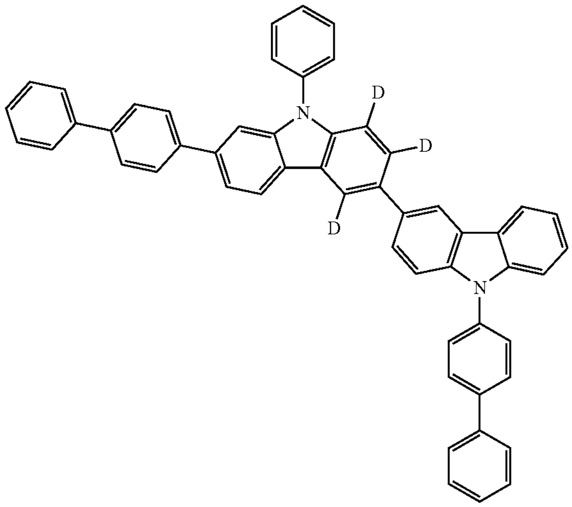
-continued
523
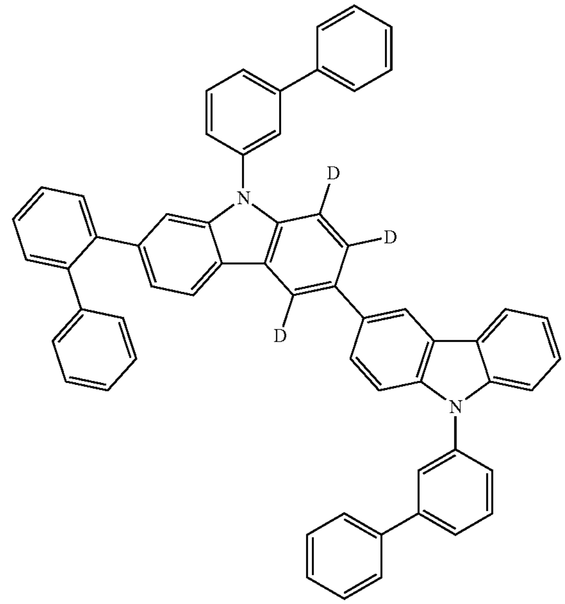
522
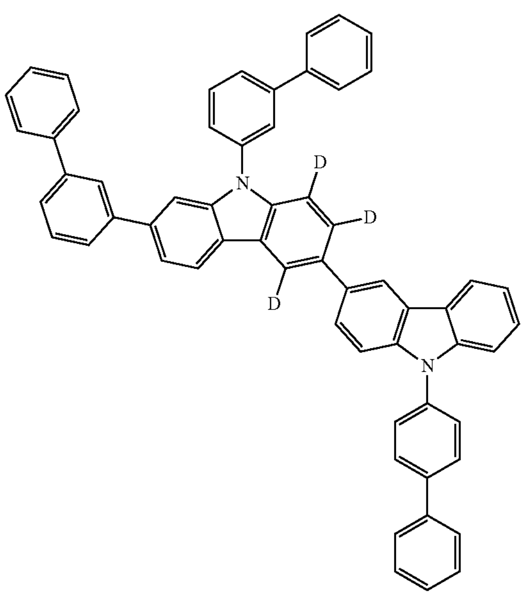
524
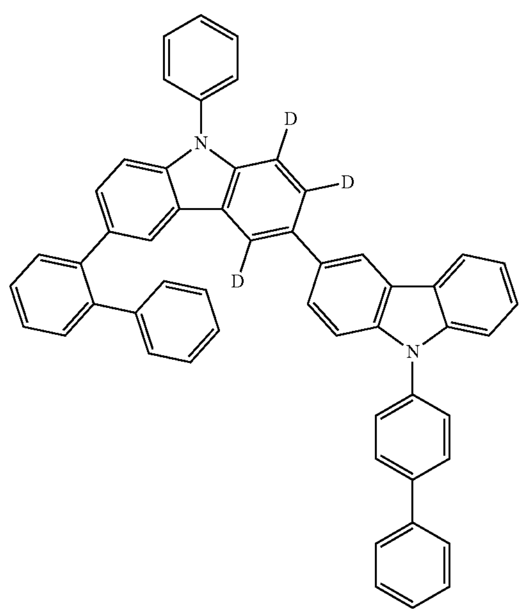

-continued
525
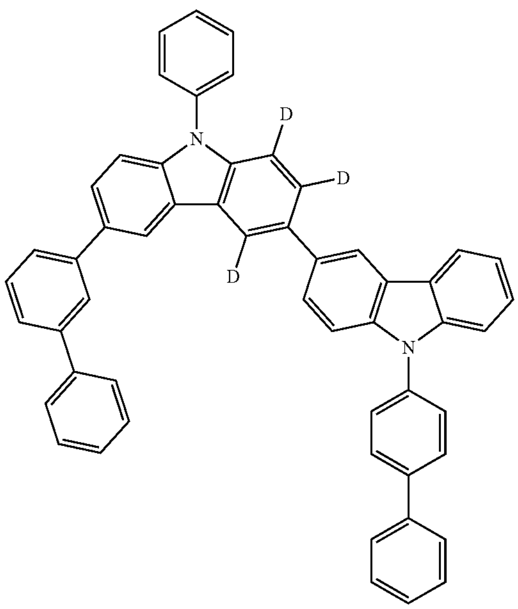
526
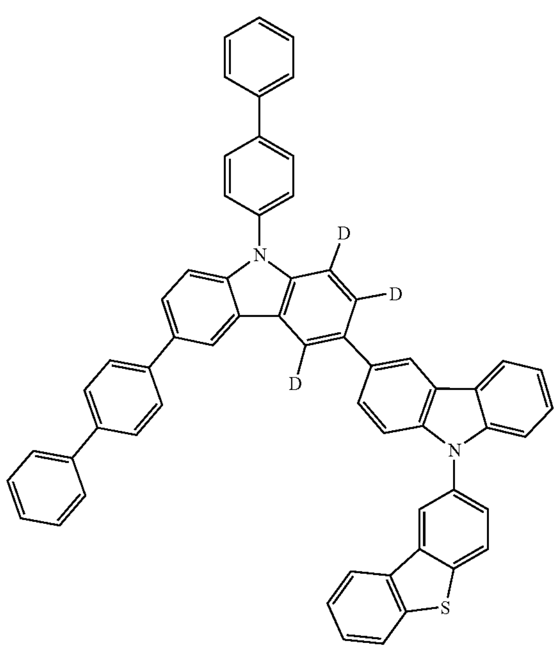
-continued
529
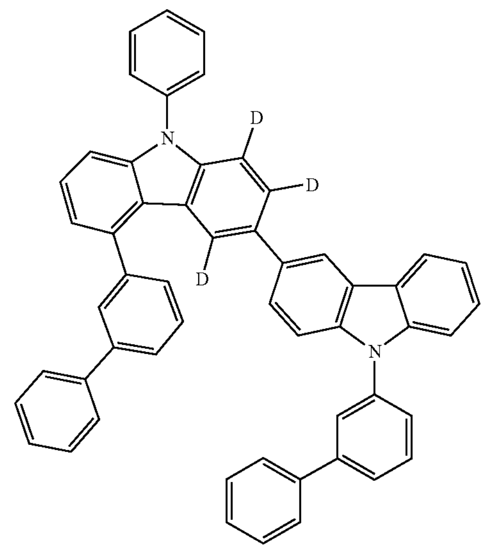
530
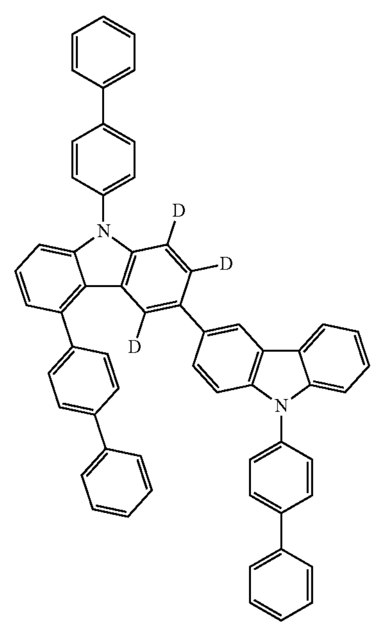

531
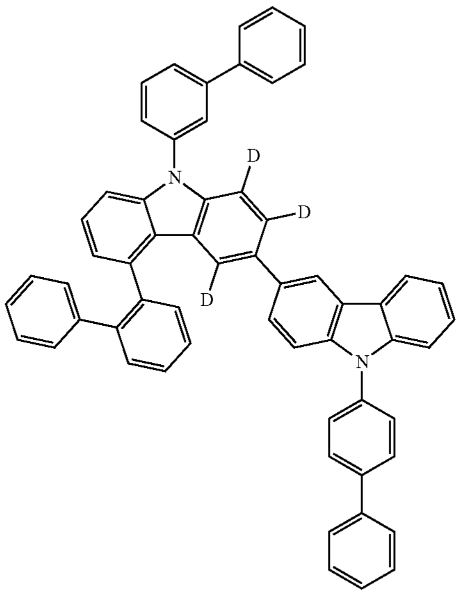
533
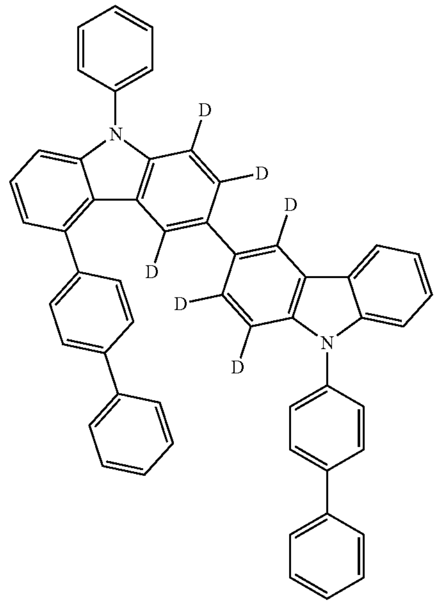
532
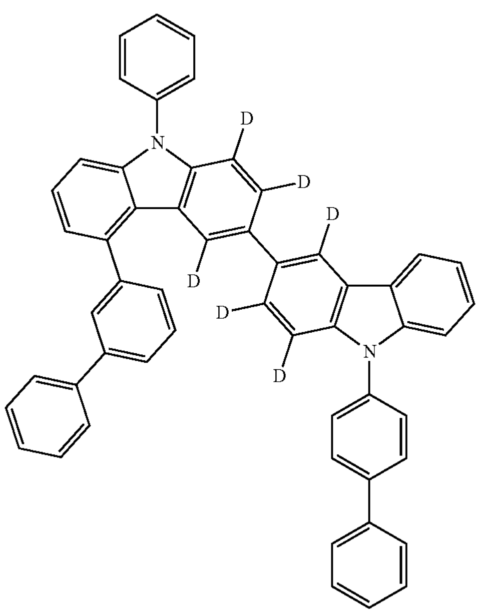
534
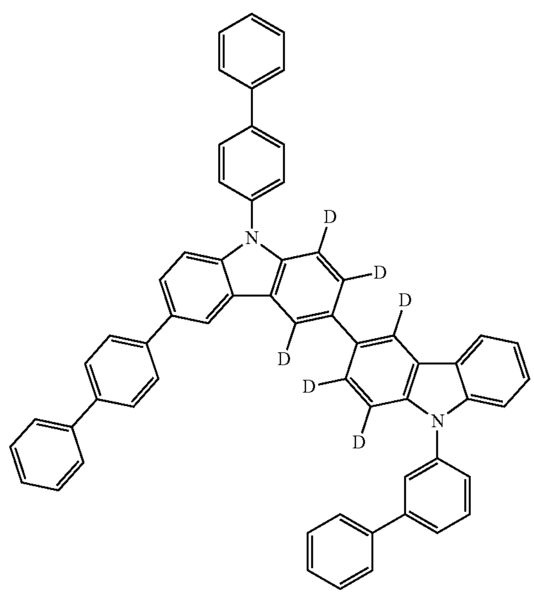

-continued
535
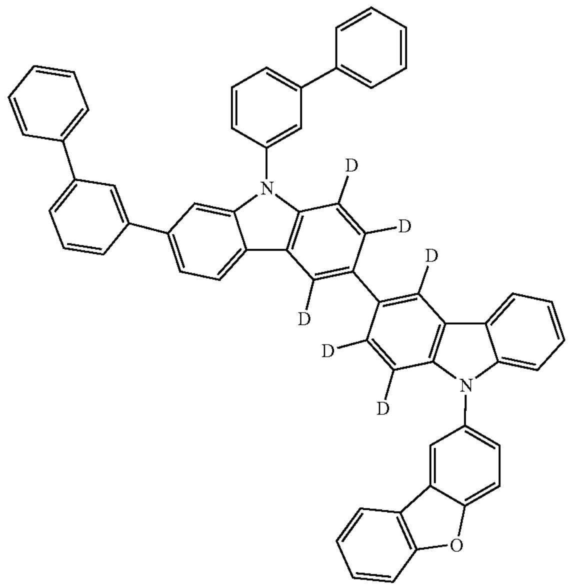
539
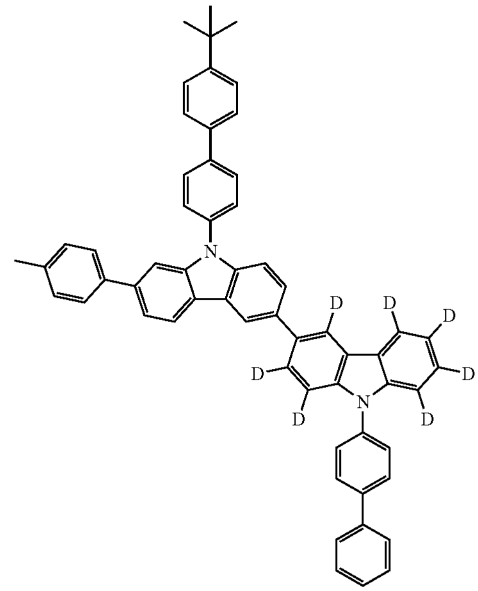
538
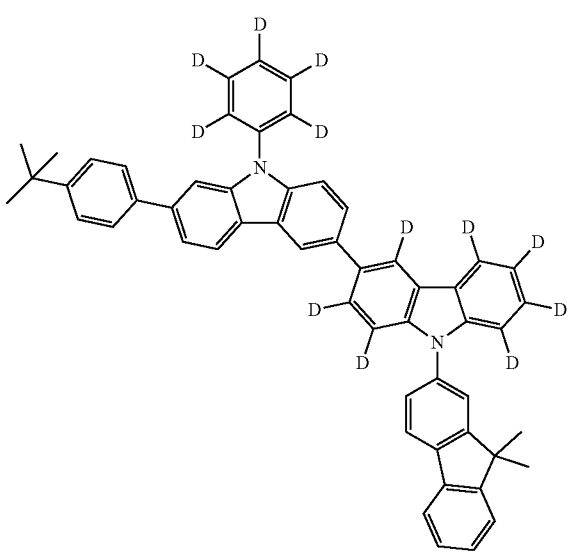
540
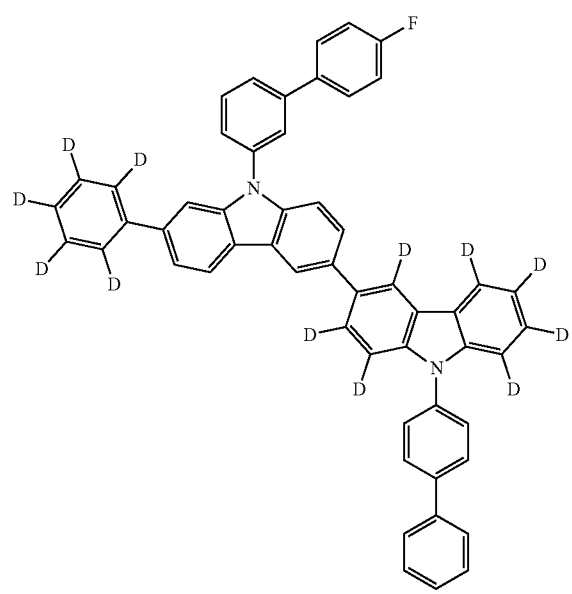

-continued
541
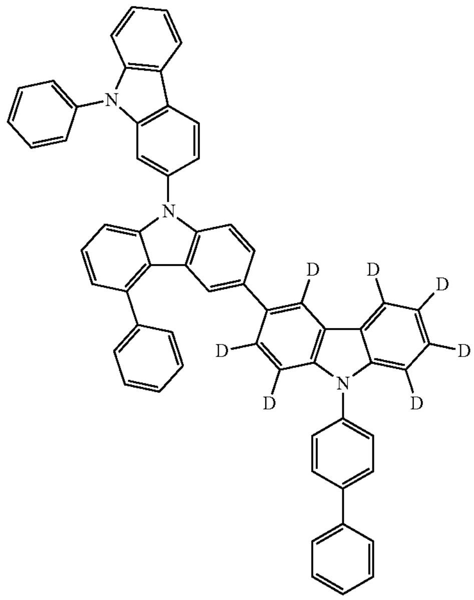
543
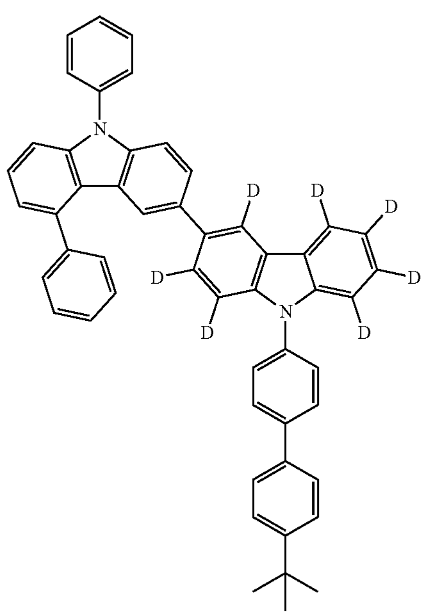
-continued
544
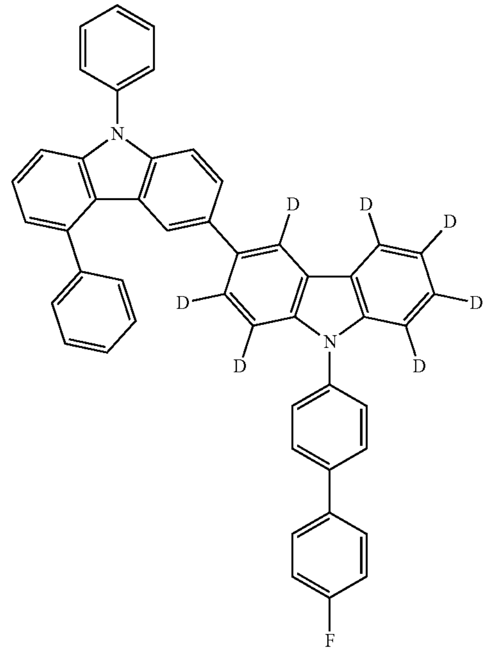
545
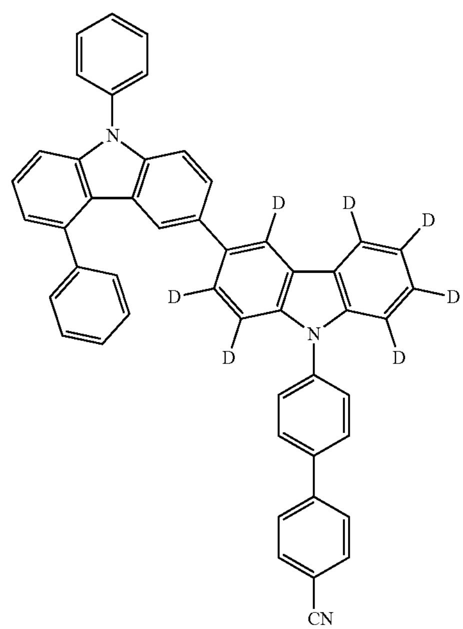

-continued
546
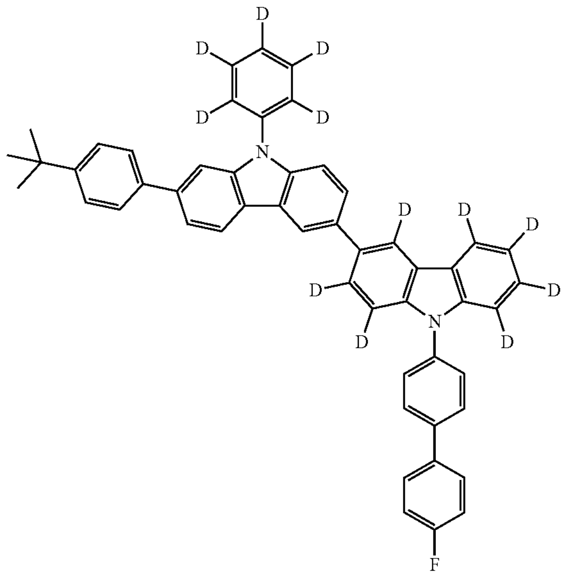
-continued
548
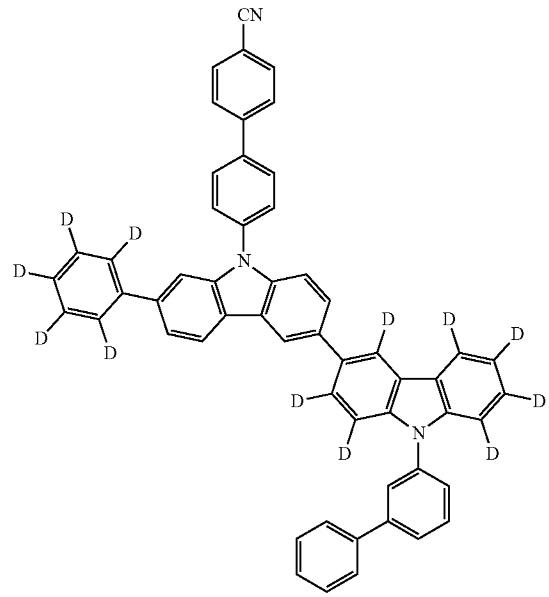
547
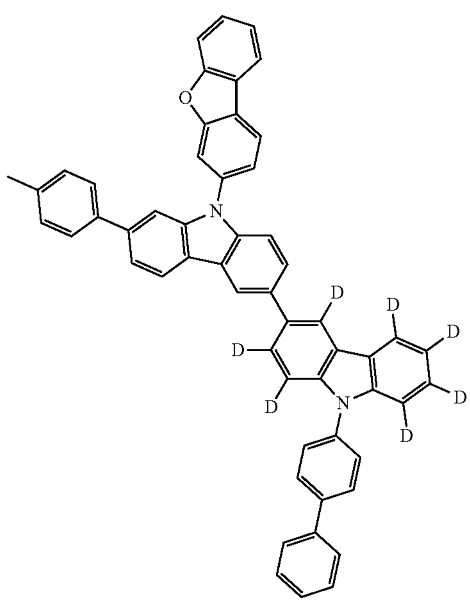
549
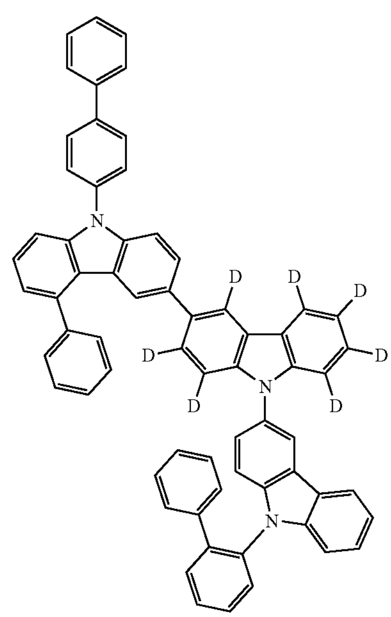

-continued
550
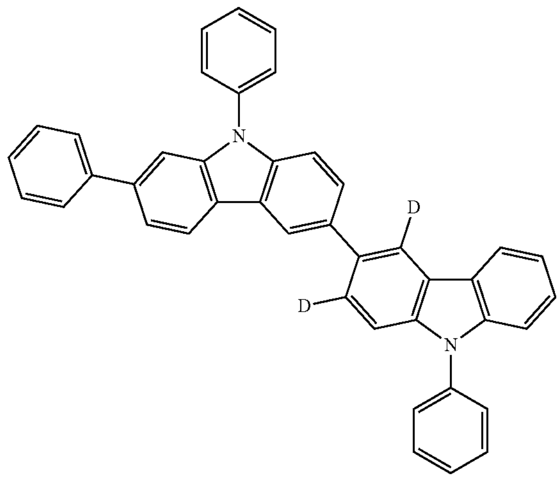
551
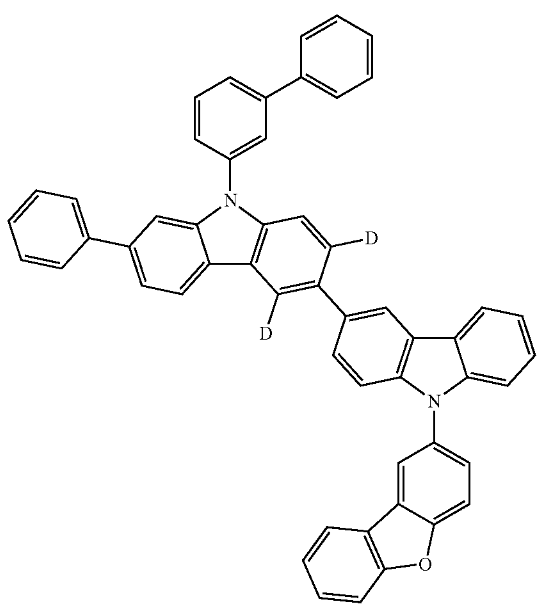
-continued
552
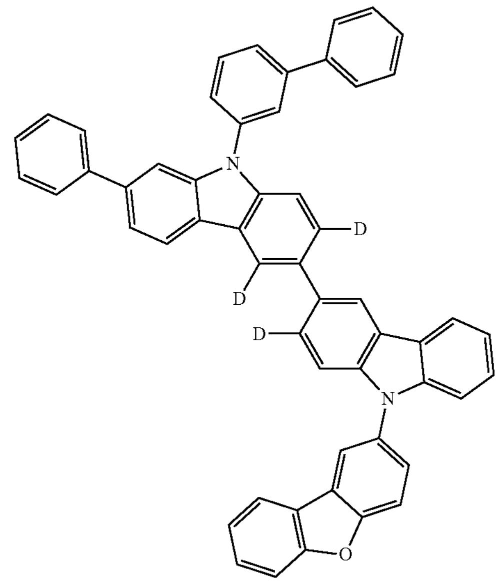
553
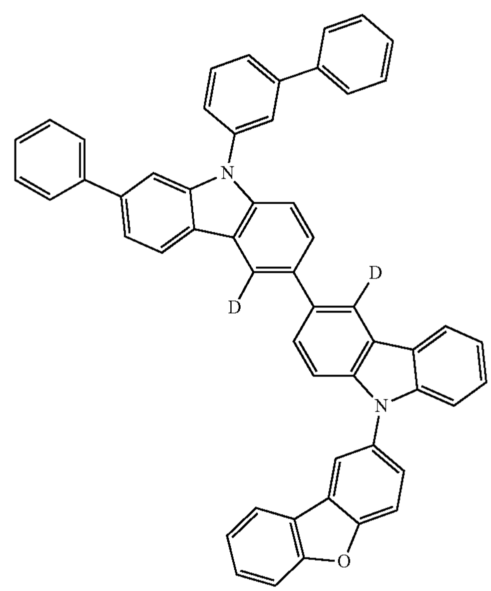

554
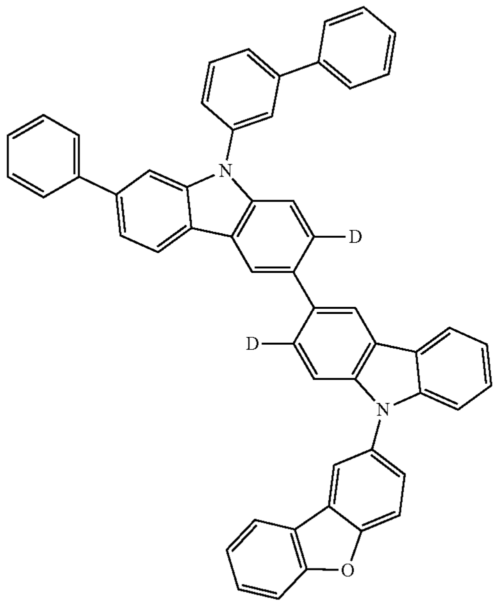
555
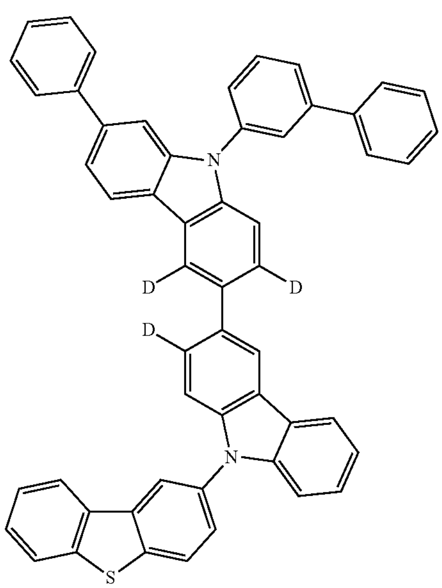
556
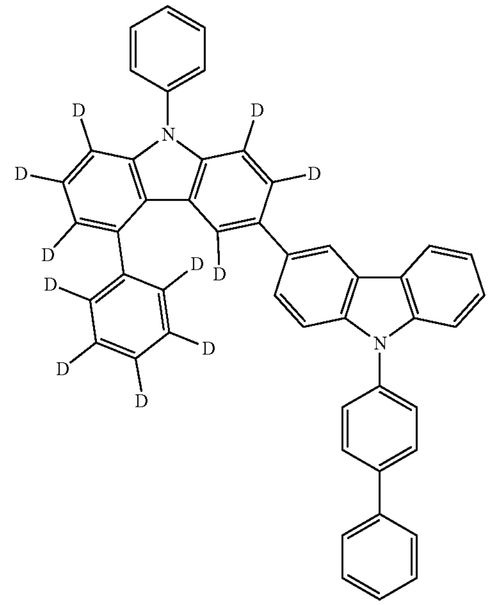
557
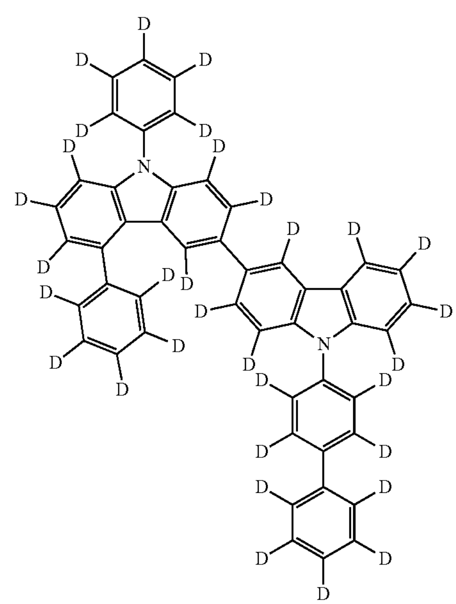

-continued
558
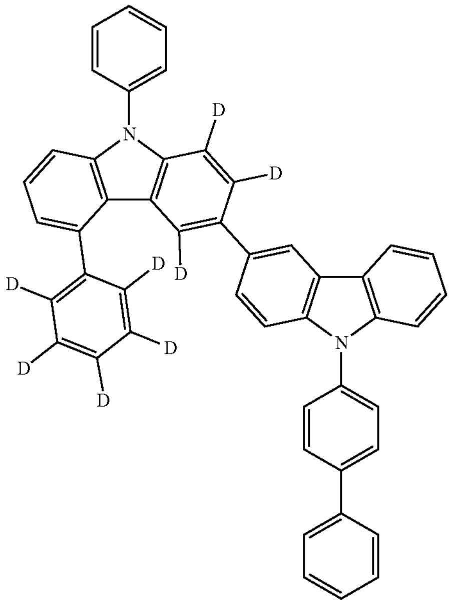
600
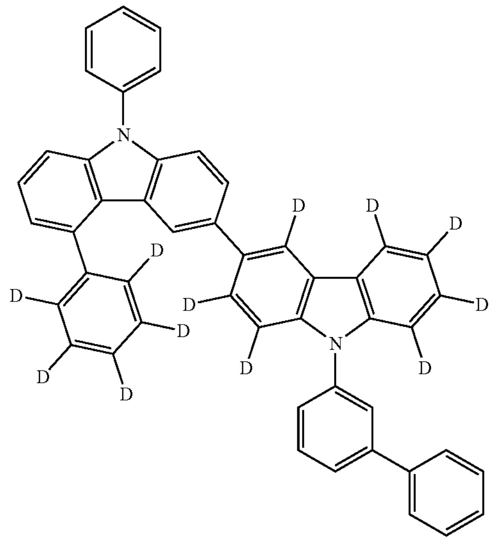
559
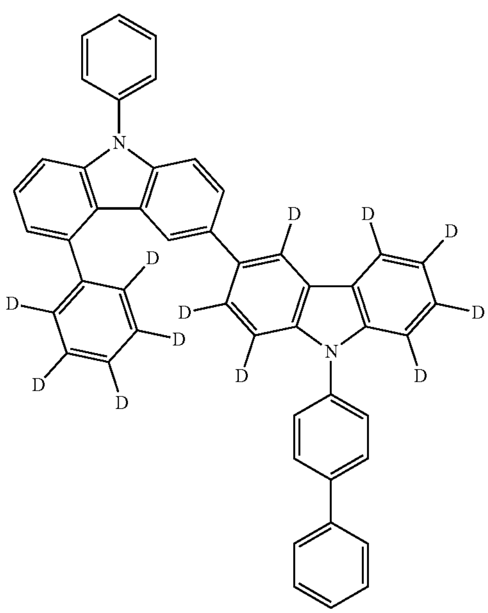
601
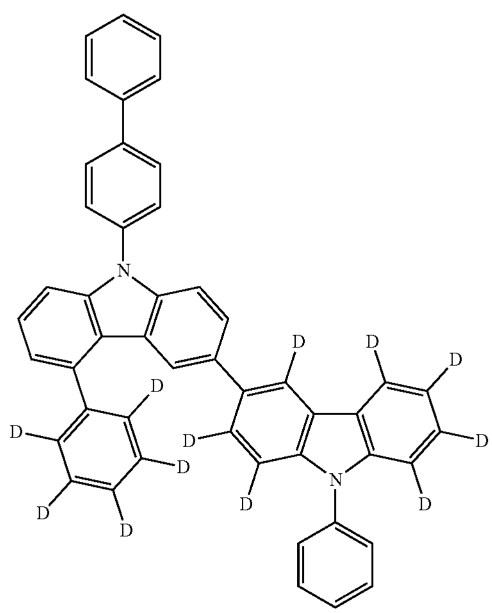

-continued
602
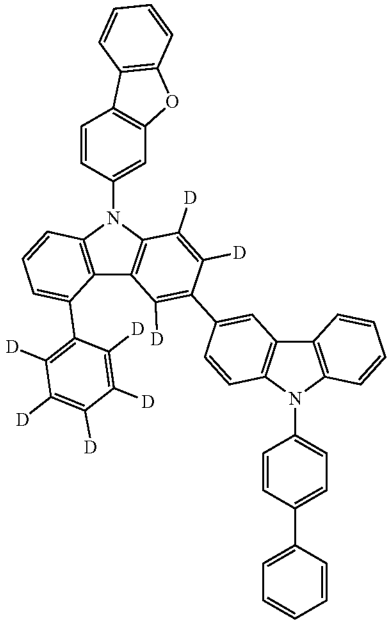
603
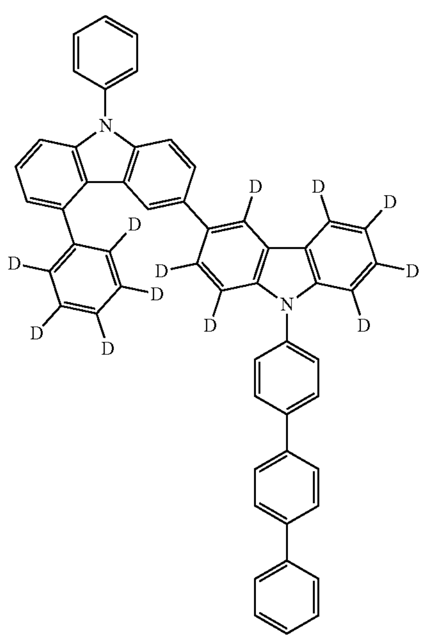
-continued
604
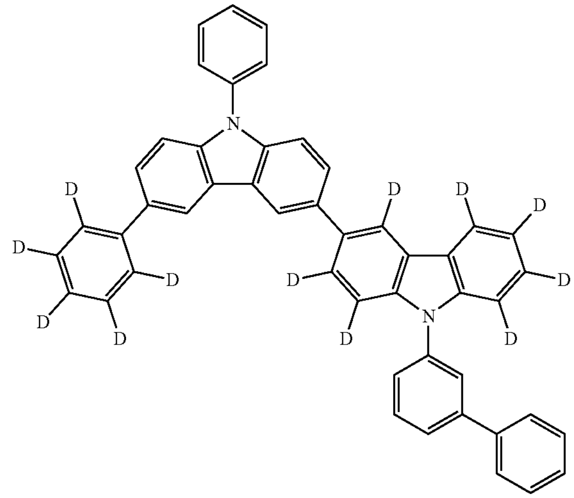
605
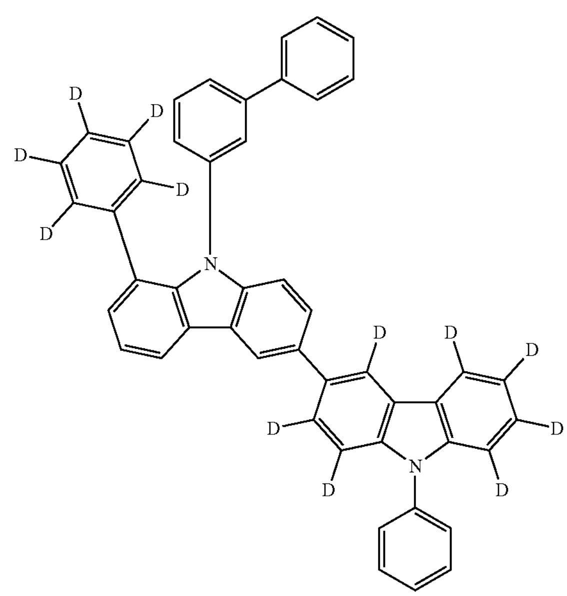

606
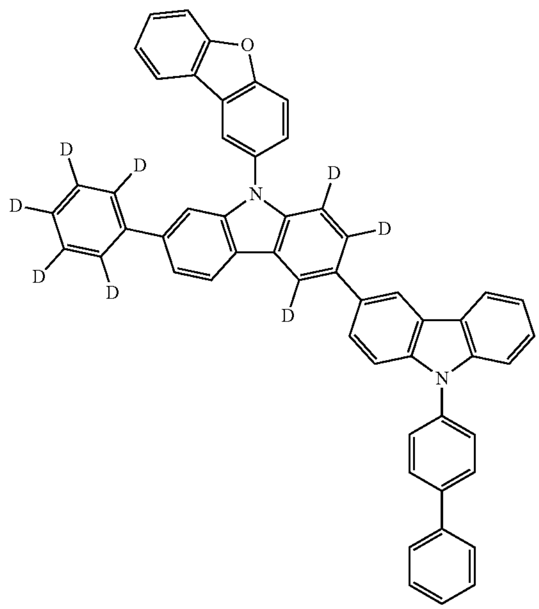
607
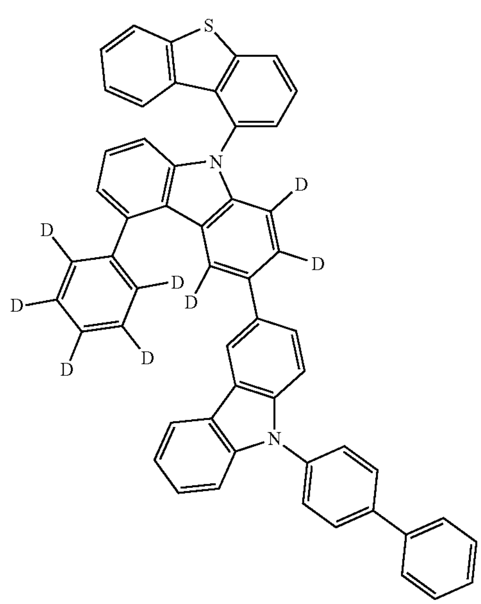
608
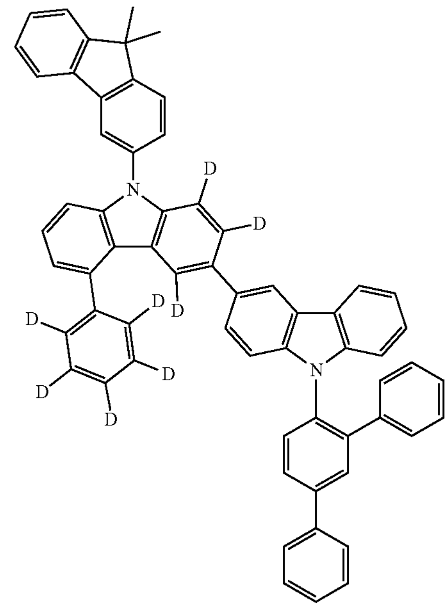
609
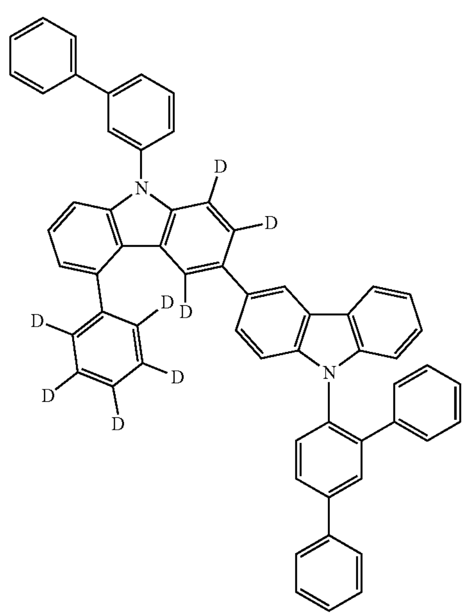

-continued
610
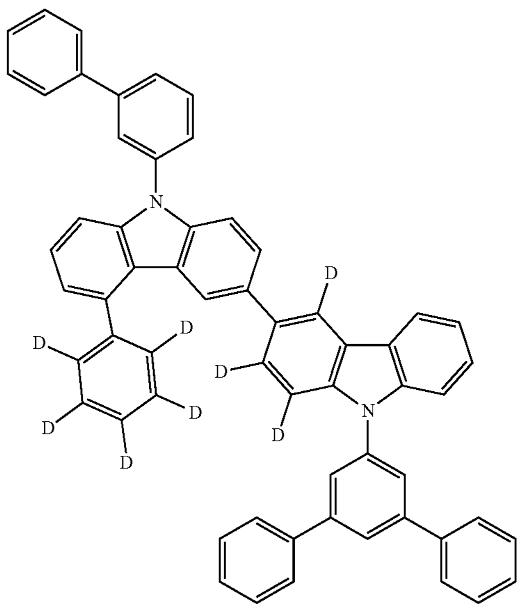
-continued
611
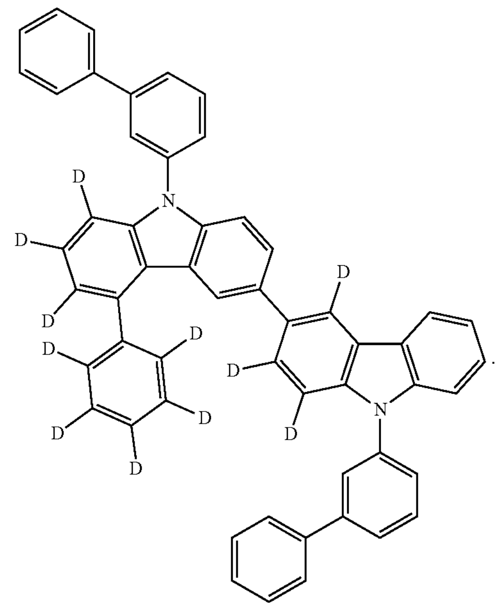
7. An electronic apparatus, comprising the organic electroluminescent device according to claim 1.
* * * * *

UNITED STATES PATENT AND TRADEMARK OFFICE

CERTIFICATE OF CORRECTION

PATENT NO. : 12,102,003 B2
APPLICATION NO. : 18/039931
DATED : September 24, 2024
INVENTOR(S) : Tiantian Ma et al.

It is certified that error appears in the above-identified patent and that said Letters Patent is hereby corrected as shown below:

In the Specification

Column 206, Lines 5-20, compound 133, 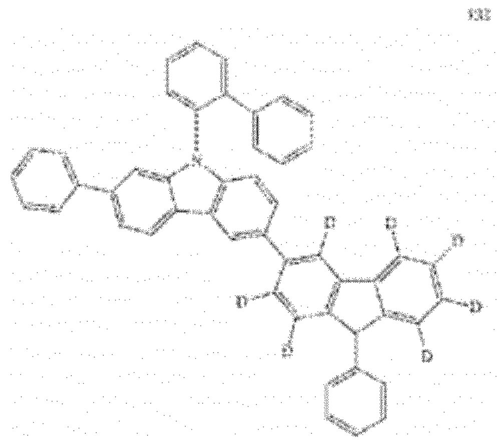 should be

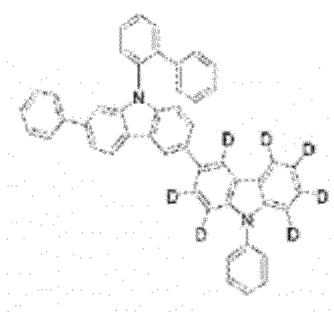

133 .

Signed and Sealed this
Eleventh Day of February, 2025

Coke Morgan Stewart
*Acting Director of the United States Patent and Trademark Office*

Column 260, Lines 5-25, compound 250 should be deleted as being a repetition of the compound 249 appearing at Column 259, Lines 40-65 and the proper compound 250 shown at Column 260, Lines 40-65.
Column 420, Lines 53-65, 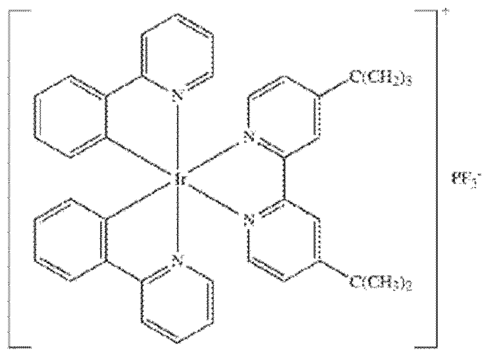 should be
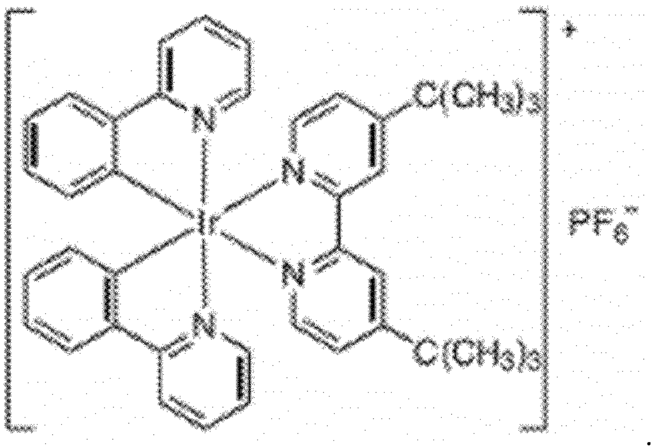
Column 650, compound B32 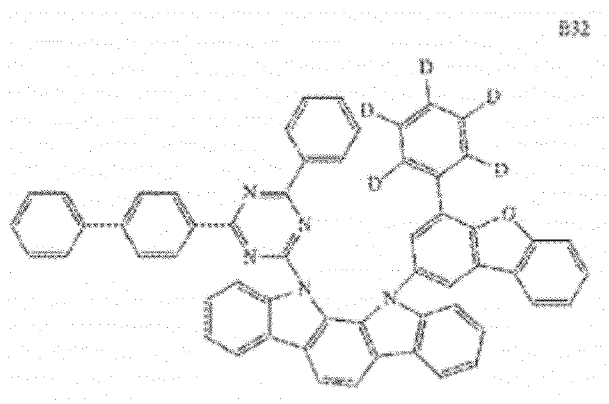 should be

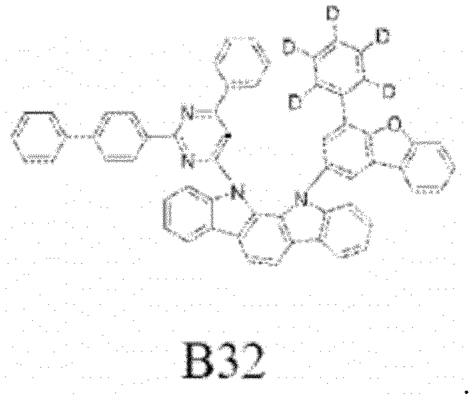
B32
.
In the Claims
Claim 6, Column 850, Lines 25-45, compound 373
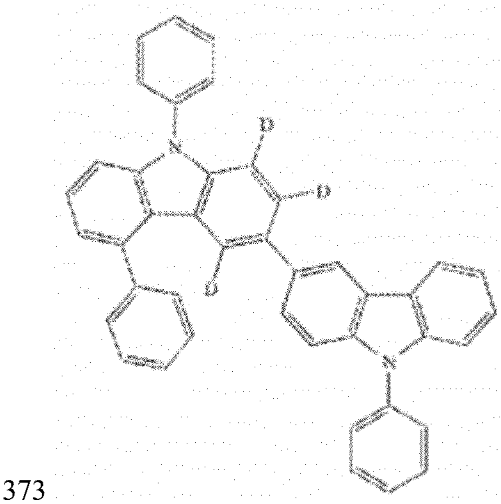
373
should be
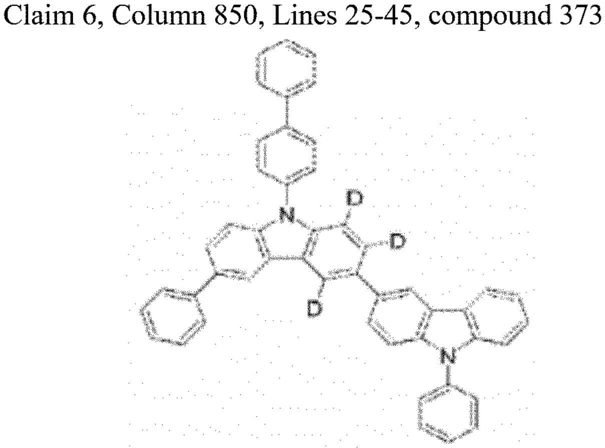
373
.